US012637482B2

(12) United States Patent
Kim et al.

(10) Patent No.: US 12,637,482 B2
(45) Date of Patent: May 26, 2026

(54) COMPOUND AND ORGANIC LIGHT EMITTING DEVICE COMPRISING SAME

(71) Applicant: LG CHEM, LTD., Seoul (KR)

(72) Inventors: Moung Gon Kim, Daejeon (KR); Tae Yoon Park, Daejeon (KR); Wanpyo Hong, Daejeon (KR); Sujeong Geum, Daejeon (KR); Kyunghee Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 910 days.

(21) Appl. No.: 17/437,500

(22) PCT Filed: Jul. 31, 2020

(86) PCT No.: PCT/KR2020/010125

§ 371 (c)(1),
(2) Date: Sep. 9, 2021

(87) PCT Pub. No.: WO2021/020929

PCT Pub. Date: Feb. 4, 2021

(65) Prior Publication Data

US 2022/0153758 A1 May 19, 2022

(30) Foreign Application Priority Data

Aug. 1, 2019 (KR) ........................ 10-2019-0093740

(51) Int. Cl.
*H01L 51/50* (2006.01)
*C07F 5/02* (2006.01)
(Continued)

(52) U.S. Cl.
CPC ................ *C07F 5/027* (2013.01); *C07F 5/02* (2013.01); *H10K 85/626* (2023.02);
(Continued)

(58) Field of Classification Search
None
See application file for complete search history.

(56) References Cited

U.S. PATENT DOCUMENTS

2018/0069182 A1 3/2018 Hatakeyama et al.
2020/0058885 A1 2/2020 Hong et al.
(Continued)

FOREIGN PATENT DOCUMENTS

CA 3016789 3/2019
CN 107417715 12/2017
(Continued)

OTHER PUBLICATIONS

Chen et al., "Theoretical Studies on the Substitution Patterns in Heterofullerenes $C_{70-x}N_x$ and $C_{70-x}B_x$ (x = 2-10)," J. Phys. Chem. A 105:8105-8110 (2001).
(Continued)

*Primary Examiner* — Gregory D Clark
(74) *Attorney, Agent, or Firm* — Bryan Cave Leighton Paisner LLP

(57) ABSTRACT

Provided is a compound of Formula 1:

(Continued)

wherein:

Y is NR, CRxRy, O, or S;

R, Rx, Ry, A1 and A2 are each independently hydrogen, deuterium, or a substituted or unsubstituted: alkyl, cycloalkyl, aryl, silyl, heteroaryl, alkoxy, aryloxy, aralkyl, alkenyl, or alkynyl group, or are bonded to an adjacent group to form a substituted or unsubstituted ring;

R1 to R3 are each independently hydrogen, deuterium, or a substituted or unsubstituted: alkyl, cycloalkyl, aryl, silyl, heteroaryl, alkoxy, aryloxy, aralkyl, amine, alkenyl, or alkynyl group, or are bonded to an adjacent group to form a substituted or unsubstituted ring;

R3 is optionally bonded to Y to form a substituted or unsubstituted ring, a and b are each an integer from 0 to 3; and c is an integer from 0 to 4, and an organic light emitting device including the same.

14 Claims, 1 Drawing Sheet

(51) Int. Cl.

| | |
|---|---|
| ***H10K 85/60*** | (2023.01) |
| *H10K 50/16* | (2023.01) |
| *H10K 50/17* | (2023.01) |
| *H10K 50/18* | (2023.01) |

(52) U.S. Cl.

CPC ......... *H10K 85/633* (2023.02); *H10K 85/636* (2023.02); *H10K 85/6572* (2023.02); *H10K 85/6574* (2023.02); *H10K 85/6576* (2023.02); *H10K 85/658* (2023.02); *H10K 50/16* (2023.02); *H10K 50/171* (2023.02); *H10K 50/18* (2023.02)

(56) References Cited

U.S. PATENT DOCUMENTS

| | | | | |
|---|---|---|---|---|
| 2020/0066997 | A1 | 2/2020 | Huang et al. | |
| 2020/0190115 | A1 | 6/2020 | Hatakeyama et al. | |
| 2021/0408390 | A1* | 12/2021 | Lee | H10K 85/615 |
| 2022/0002319 | A1* | 1/2022 | Lee | G09F 9/301 |

FOREIGN PATENT DOCUMENTS

| | | | | |
|---|---|---|---|---|
| CN | 107417715 A | * 12/2017 | | H01L 51/54 |
| CN | 107501311 | 12/2017 | | |
| CN | 108409761 | 8/2018 | | |
| CN | 109575059 | 4/2019 | | |
| CN | 110407858 | 11/2019 | | |
| JP | 2012-234873 | 11/2012 | | |
| KR | 10-2018-0122298 | 11/2018 | | |
| KR | 10-2019-0078541 | 7/2019 | | |
| WO | 2018-095397 | 5/2018 | | |
| WO | 2018-212169 | 11/2018 | | |
| WO | 2018203666 | 11/2018 | | |

OTHER PUBLICATIONS

International Search Report and the Written Opinion of PCT/KR2020/010125, mailed Nov. 19, 2020.

* cited by examiner

[Figure 1]
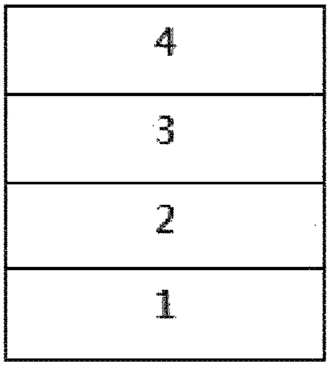
[Figure 2]
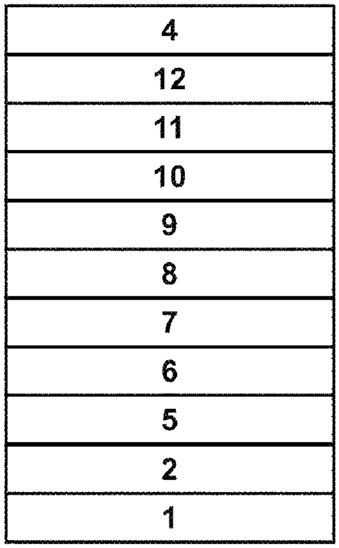

COMPOUND AND ORGANIC LIGHT EMITTING DEVICE COMPRISING SAME

CROSS-REFERENCE TO RELATED APPLICATIONS

This application is a National Stage Application of International Application No. PCT/KR2020/010125 filed on Jul. 31, 2020, which claims priority to and the benefit of Korean Patent No. 10-2019-0093740 filed in the Korean Intellectual Property Office on Aug. 1, 2019, the entire contents of which are incorporated herein by reference.

TECHNICAL FIELD

The present specification relates to a compound and an organic light emitting device including the same.

BACKGROUND

In general, an organic light emitting phenomenon refers to a phenomenon in which electric energy is converted into light energy by using an organic material. An organic light emitting device using the organic light emitting phenomenon usually has a structure including a positive electrode, a negative electrode, and an organic material layer interposed therebetween. Here, the organic material layer has in many cases a multi-layered structure composed of different materials in order to improve the efficiency and stability of the organic light emitting device, and for example, can be composed of a hole injection layer, a hole transport layer, a light emitting layer, an electron transport layer, an electron injection layer, and the like. In such a structure of the organic light emitting device, if a voltage is applied between the two electrodes, holes are injected from the positive electrode into the organic material layer and electrons are injected from the negative electrode into the organic material layer, and when the injected holes and electrons meet each other, an exciton is formed, and light is emitted when the exciton falls down again to a ground state.

There is a continuous need for developing a new material for the aforementioned organic light emitting device.

BRIEF DESCRIPTION

Technical Problem

The present specification provides a compound and an organic light emitting device including the same.

Technical Solution

The present invention provides a compound of the following Formula 1:

<Formula 1>

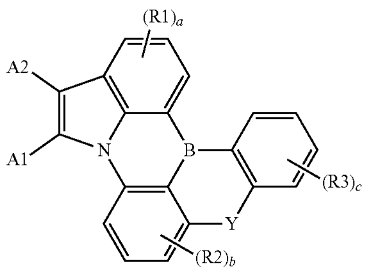

wherein in Formula 1:

Y is NR, CRxRy, O, or S;

R, Rx, and Ry are the same as or different from each other, and are each independently hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted heteroaryl group, a substituted or unsubstituted alkoxy group, a substituted or unsubstituted aryloxy group, a substituted or unsubstituted aralkyl group, a substituted or unsubstituted alkenyl group, or a substituted or unsubstituted alkynyl group, or are bonded to an adjacent group to form a substituted or unsubstituted ring;

A1 and A2 are the same as or different from each other, and are each independently hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted heteroaryl group, a substituted or unsubstituted alkoxy group, a substituted or unsubstituted aryloxy group, a substituted or unsubstituted aralkyl group, a substituted or unsubstituted alkenyl group, or a substituted or unsubstituted alkynyl group, or are bonded to each other to form a substituted or unsubstituted ring;

R1 to R3 are the same as or different from each other, and are each independently hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted heteroaryl group, a substituted or unsubstituted alkoxy group, a substituted or unsubstituted aryloxy group, a substituted or unsubstituted aralkyl group, a substituted or unsubstituted amine group, a substituted or unsubstituted alkenyl group, or a substituted or unsubstituted alkynyl group, or are bonded to an adjacent group to form a substituted or unsubstituted ring;

R3 can be bonded to Y to form a substituted or unsubstituted ring;

a and b are each an integer from 0 to 3;

c is an integer from 0 to 4;

when a is 2 or higher, two or more R1s are the same as or different from each other;

when b is 2 or higher, two or more R2s are the same as or different from each other; and when c is 2 or higher, two or more R3s are the same as or different from each other.

Further, the present invention provides an organic light emitting device including: a first electrode; a second electrode provided to face the first electrode; and one, two or more organic material layers provided between the first electrode and the second electrode, in which one or more layers of the organic material layer include the compound.

Advantageous Effects

The compound according to an exemplary embodiment of the present specification can be used as a material for an organic material layer of an organic light emitting device, and it is possible to improve efficiency, achieve a low driving voltage, and/or improve service life characteristics, in the organic light emitting device by using the compound.

BRIEF DESCRIPTION OF THE DRAWINGS

FIG. 1 illustrates an organic light emitting device according to an exemplary embodiment of the present specification.

FIG. 2 illustrates an organic light emitting device according to an exemplary embodiment of the present specification.

EXPLANATION OF REFERENCE NUMERALS AND SYMBOLS

1: Substrate
2: First electrode
3: Organic material layer
4: Second electrode
5: First hole injection layer
6: Second hole injection layer
7: Hole transport layer
8: Electron blocking layer
9: Light emitting layer
10: First electron transport layer
11: Second electron transport layer
12: Electron injection layer

DETAILED DESCRIPTION

Hereinafter, the present specification will be described in more detail.

The present specification provides the compound of Formula 1.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent can be substituted, and when two or more are substituted, the two or more substituents can be the same as or different from each other.

In the present specification, the term "substituted or unsubstituted" means being substituted with one or two or more substituents selected from the group consisting of deuterium, a nitrile group, a substituted or unsubstituted alkyl group, a substituted or unsubstituted cycloalkyl group, a substituted or unsubstituted silyl group, a substituted or unsubstituted alkoxy group, a substituted or unsubstituted arylamine group, a substituted or unsubstituted aryl group, and a substituted or unsubstituted heterocyclic group or being substituted with a substituent to which two or more substituents are linked among the substituents exemplified above, or having no substituent. For example, "the substituent to which two or more substituents are linked" can be an aryl group substituted with an aryl group, an aryl group substituted with a heteroaryl group, a heterocyclic group substituted with an aryl group, an aryl group substituted with an alkyl group, and the like.

In the present specification, "the ring formed by bonding adjacent groups" means a hydrocarbon ring or a hetero ring.

In the present specification, "a five-membered or six-membered ring formed by bonding adjacent groups" means that a ring including a substituent participating in the ring formation is five-membered or six-membered. It is possible to include an additional ring fused to the ring including the substituent participating in the ring formation.

In the present specification, a halogen group can be F, Cl, Br, I, and the like.

In the present specification, an alkyl group can be straight-chained or branched, and the number of carbon atoms thereof is not particularly limited, but is preferably 1 to 30. Specifically, the number of carbon atoms thereof is preferably 1 to 20. More specifically, the number of carbon atoms thereof is preferably 1 to 10. Specific examples thereof include a methyl group, an ethyl group, a propyl group, an n-propyl group, an isopropyl group, a butyl group, an n-butyl group, an isobutyl group, a tert-butyl group (hereinafter, referred to as a terbutyl group), a sec-butyl group, a 1-methylbutyl group, a 1-ethylbutyl group, a pentyl group, an n-pentyl group, an isopentyl group, a neopentyl group, a tert-pentyl group, a hexyl group, an n-hexyl group, a 1-methylpentyl group, a 2-methylpentyl group, a 4-methyl-2-pentyl group, a 3,3-dimethylbutyl group, a 2-ethylbutyl group, a heptyl group, an n-heptyl group, a 1-methylhexyl group, a cyclopentylmethyl group, a cyclohexylmethyl group, an octyl group, an n-octyl group, a tert-octyl group, a 1-methylheptyl group, a 2-ethylhexyl group, a 2-propylpentyl group, an n-nonyl group, a 2,2-dimethylheptyl group, a 1-ethylpropyl group, a 1,1-dimethylpropyl group, an isohexyl group, a 2-methylpentyl group, a 4-methylhexyl group, a 5-methylhexyl group, and the like, but are not limited thereto.

In the present specification, a cycloalkyl group is not particularly limited, but has preferably 3 to 30 carbon atoms, and more preferably 3 to 20 carbon atoms. Specific examples thereof include a cyclopropyl group, a cyclobutyl group, a cyclopentyl group, a 3-methylcyclopentyl group, a 2,3-dimethylcyclopentyl group, a cyclohexyl group, a 3-methylcyclohexyl group, a 4-methylcyclohexyl group, a 2,3-dimethylcyclohexyl group, a 3,4,5-trimethylcyclohexyl group, a 4-tert-butylcyclohexyl group, a cycloheptyl group, a cyclooctyl group, and the like, but are not limited thereto.

In the present specification, an alkoxy group can be straight-chained, branched, or cyclic. The number of carbon atoms of the alkoxy group is not particularly limited, but is preferably 1 to 30. Specifically, the number of carbon atoms thereof is preferably 1 to 20. More specifically, the number of carbon atoms thereof is preferably 1 to 10. Specific examples thereof include a methoxy group, an ethoxy group, an n-propoxy group, an isopropoxy group, an i-propyloxy group, an n-butoxy group, an isobutoxy group, a tert-butoxy group, a sec-butoxy group, an n-pentyloxy group, a neopentyloxy group, an isopentyloxy group, an n-hexyloxy group, a 3,3-dimethylbutyloxy group, a 2-ethylbutyloxy group, an n-octyloxy group, an n-nonyloxy group, an n-decyloxy group, a benzyloxy group, a p-methylbenzyloxy group, and the like, but are not limited thereto.

In the present specification, an alkenyl group can be straight-chained or branched, and the number of carbon atoms thereof is not particularly limited, but is preferably 2 to 30. More specifically, the number of carbon atoms thereof is preferably 2 to 20. Specific examples thereof include a vinyl group, a 1-propenyl group, an isopropenyl group, a 1-butenyl group, a 2-butenyl group, a 3-butenyl group, a 1-pentenyl group, a 2-pentenyl group, a 3-pentenyl group, a 3-methyl-1-butenyl group, a 1,3-butadienyl group, an allyl group, a 1-phenylvinyl-1-yl group, a 2-phenylvinyl-1-yl group, a 2,2-diphenylvinyl-1-yl group, a 2-phenyl-2-(naphthyl-1-yl)vinyl-1-yl group, a 2,2-bis(diphenyl-1-yl)vinyl-1-yl group, a stilbenyl group, a styrenyl group, and the like, but are not limited thereto.

In the present specification, an alkynyl group can be straight-chained or branched, and the number of carbon atoms thereof is not particularly limited, but is preferably 2 to 30.

In the present specification, a silyl group can be —SiRaRbRc, and Ra, Rb, and Rc are the same as or different from each other, and can be each independently hydrogen, a substituted or unsubstituted alkyl group, or a substituted or unsubstituted aryl group. Specific examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, specific examples of a phosphine oxide group include a diphenylphosphine oxide group, a dinaphthylphosphine oxide group, and the like, but are not limited thereto.

In the present specification, an aryl group is not particularly limited, but has preferably 6 to 30 carbon atoms, and more preferably 6 to 20 carbon atoms. The aryl group can be monocyclic or polycyclic. When the aryl group is a monocyclic aryl group, the number of carbon atoms thereof is not particularly limited, but is preferably 6 to 30. More specifically, the number of carbon atoms thereof is preferably 6 to 20. Specific examples of the monocyclic aryl group include a phenyl group, a biphenyl group, a terphenyl group, and the like, but are not limited thereto. When the aryl group is a polycyclic aryl group, the number of carbon atoms thereof is not particularly limited, but is preferably 10 to 30, and more specifically, preferably 10 to 20 carbon atoms. Specific examples of the polycyclic aryl group include a naphthyl group, an anthracenyl group, a phenanthryl group, a triphenyl group, a pyrenyl group, a phenalenyl group, a perylenyl group, a chrysenyl group, a fluorenyl group, and the like, but are not limited thereto.

In the present specification, the substituted aryl group can also include a form in which an aliphatic ring is fused to the aryl group. For example, a tetrahydronaphthalene group having the following structure is included in the substituted aryl group. In the following structure, one of the carbons of a benzene ring can be linked to another position:

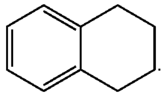

In the present specification, the "adjacent" group can mean a substituent substituted with an atom directly linked to an atom in which the corresponding substituent is substituted, a substituent disposed to be sterically closest to the corresponding substituent, or another substituent substituted with an atom in which the corresponding substituent is substituted. For example, two substituents substituted at the ortho position in a benzene ring and two substituents substituted with the same carbon in an aliphatic ring can be interpreted as groups which are "adjacent" to each other.

In the present specification, a heterocyclic group is a ring group including one or more of N, O, S, and Si as a heteroatom, and the number of carbon atoms thereof is not particularly limited, but is 2 to 60, or 2 to 30. Examples of the heterocyclic group include a pyridyl group, a quinoline group, a thiophene group, a dibenzothiophene group, a furan group, a dibenzofuran group, a naphthobenzofuran group, a carbazole group, a benzocarbazole group, a naphthobenzothiophene group, a hexahydrocarbazole group; dihydroacridine group, a dihydrodibenzoazasiline group, a phenoxazine group, a phenothiazine group, a dihydrodibenzoazasiline group, a spiro(dibenzosilole-dibenzoazasiline) group, a spiro(acridine-fluorene) group, and the like, but are not limited thereto:

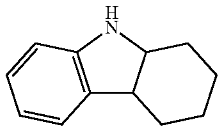

hexahydrocarbazole

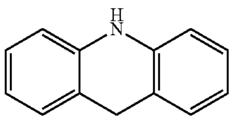

dihydroacridine

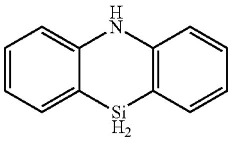

dibenzoazastline

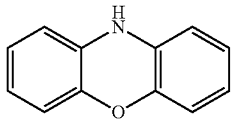

phenoxazine

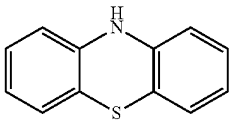

phenothiazine

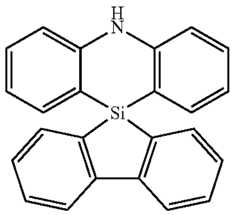

spiro[dibenzosilole-dibenzoazasiline]

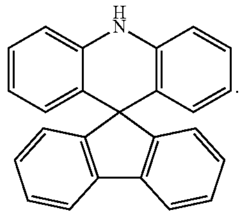

spiro[acridine-fluorene]

In the present specification, a hydrocarbon ring can be an aromatic ring, an aliphatic ring, or a fused ring of an aromatic ring and an aliphatic ring, the above-described description on the aryl group can be applied to the aromatic hydrocarbon ring except that the aromatic hydrocarbon ring is not monovalent, and the above-described description on the cycloalkyl group can be applied to the aliphatic hydrocarbon ring except that the aliphatic hydrocarbon ring is not monovalent. Examples of the fused ring of the aromatic ring and the aliphatic ring include a 1,2,3,4-tetrahydronaphthalene group, a 2,3-dihydro-1H-indene group, and the like, but are not limited thereto.

In the present specification, the description on the heterocyclic group can be applied to a hetero ring except that the hetero ring is not monovalent.

In the present specification, an aromatic hydrocarbon ring means a planar ring in which pi electrons are completely conjugated, and the above-described description on the aryl group can be applied to an aromatic hydrocarbon ring except for a divalent aromatic hydrocarbon ring.

In the present specification, an aliphatic hydrocarbon ring means all hydrocarbon rings except for aromatic hydrocarbon rings, and can include a cycloalkyl ring. The above-described description on the cycloalkyl group can be applied to the cycloalkyl ring except for a divalent cycloalkyl ring. A substituted aliphatic hydrocarbon ring also includes an aliphatic hydrocarbon ring in which aromatic rings are fused.

In the present specification, the above-described description on the aryl group can be applied to an arylene group except for a divalent arylene group.

In the present specification, the above-described description on the cycloalkyl group can be applied to a cycloalkylene group except for a divalent cycloalkylene group.

In the present specification, a heteroaryl group includes one or more atoms other than carbon, that is, one or more heteroatoms, and specifically, the heteroatom can include one or more atoms selected from the group consisting of O, N, Se, S, and the like. The number of carbon atoms thereof is not particularly limited, but is preferably 2 to 30, and more preferably 2 to 20, and the heteroaryl group can be monocyclic or polycyclic. Examples of the heteroaryl group include a thiophene group, a furanyl group, a pyrrole group, an imidazolyl group, a thiazolyl group, an oxazolyl group, an oxadiazolyl group, a pyridyl group, a bipyridyl group, a pyrimidyl group, a triazinyl group, a triazolyl group, an acridyl group, a pyridazinyl group, a pyrazinyl group, a quinolinyl group, a quinazolinyl group, a quinoxalinyl group, a phthalazinyl group, a pyridopyrimidyl group, a pyridopyrazinyl group, a pyrazinopyrazinyl group, an isoquinolinyl group, an indolyl group, a carbazolyl group, a benzoxazolyl group, a benzimidazolyl group, a benzothiazolyl group, a benzocarbazolyl group, a benzothiophene group, a dibenzothiophene group, a benzofuranyl group, a phenanthrolinyl group, an isoxazolyl group, a thiadiazolyl group, a phenothiazinyl group, a dibenzofuranyl group, and the like, but are not limited thereto.

In the present specification, the above-described description on the heterocyclic group can be applied to a heteroaryl group except for an aromatic heteroaryl group.

In the present specification, cycloalkene is a ring group in which a double bond is present in a hydrocarbon ring, but is a non-aromatic ring group, and the number of carbon atoms thereof is not particularly limited, but is 3 to 60, 3 to 30, 3 to 20, or 3 to 10. The cycloalkene includes not only a single ring group, but also a double ring group such as a bridgehead, a fused ring, and a spiro ring. Examples of the cycloalkene include cyclopropene, cyclobutene, cyclopentene, cyclohexene, and the like, but are not limited thereto.

In the present specification, an amine group can be —NRdRe, and Rd and Re are the same as or different from each other, and each independently hydrogen, a substituted or unsubstituted alkyl group, a substituted or unsubstituted aryl group, or a substituted or unsubstituted heteroaryl group, but are not limited thereto. The amine group can be selected from the group consisting of an alkylamine group, an alkylarylamine group, an arylamine group, a heteroarylamine group, an alkylheteroarylamine group, and an arylheteroarylamine group, depending on the type of substituent (Rd, Re) to be bonded.

In the present specification, an alkylamine group means an amine group substituted with an alkyl group, and the number of carbon atoms thereof is not particularly limited, but can be 1 to 40, or 1 to 20. Specific examples of the alkylamine group include a methylamine group, a dimethylamine group, an ethylamine group, a diethylamine group, and the like, but are not limited thereto.

In the present specification, examples of an arylamine group include a substituted or unsubstituted monoarylamine group, a substituted or unsubstituted diarylamine group, or a substituted or unsubstituted arylheteroarylamine group. The aryl group in the arylamine group can be a monocyclic or polycyclic aryl group. Specific examples of the arylamine group include a phenylamine group, a naphthylamine group, a biphenylamine group, an anthracenylamine group, a diphenylamine group, a phenylnaphthylamine group, a bis(tert-butylphenyl)amine group, and the like, but are not limited thereto.

In the present specification, examples of a heteroarylamine group include a substituted or unsubstituted monoheteroarylamine group, a substituted or unsubstituted diheteroarylamine group, or a substituted or unsubstituted arylheteroarylamine group.

In the present specification, the arylheteroarylamine group means an amine group substituted with an aryl group and a heteroaryl group, and a description on the aryl group and the heteroaryl group to be described below can be applied.

In an exemplary embodiment of the present specification, Y is NR.

In an exemplary embodiment of the present specification, Y is CRxRy.

In an exemplary embodiment of the present specification, Y is O.

In an exemplary embodiment of the present specification, Y is S.

In an exemplary embodiment of the present specification, R is hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted heteroaryl group, a substituted or unsubstituted alkoxy group, a substituted or unsubstituted aryloxy group, a substituted or unsubstituted aralkyl group, a substituted or unsubstituted alkenyl group, or a substituted or unsubstituted alkynyl group.

In an exemplary embodiment of the present specification, R is hydrogen, deuterium, a substituted or unsubstituted alkyl group, a substituted or unsubstituted cycloalkyl group, a substituted or unsubstituted aryl group, or a substituted or unsubstituted heteroaryl group.

In an exemplary embodiment of the present specification, R is hydrogen, an aryl group, or a heteroaryl group.

In an exemplary embodiment of the present specification, R is hydrogen, an aryl group having 6 to 30 carbon atoms, or a heteroaryl group having 2 to 30 carbon atoms.

In an exemplary embodiment of the present specification, R is hydrogen, a phenyl group, a biphenyl group, a terphenyl group, an anthracene group, a phenanthrene group, a triphenylene group, a tetrahydronaphthalene group, a thiophene group, a dibenzothiophene group, a furan group, a dibenzofuran group, a carbazole group, or a hexahydrocarbazole group.

In an exemplary embodiment of the present specification, R is an aryl group which is substituted with deuterium or an alkyl group, or a heteroaryl group which is substituted with deuterium or an alkyl group.

In an exemplary embodiment of the present specification, R is an aryl group which is substituted with deuterium, a methyl group, or a terbutyl group; or a heteroaryl group which is substituted with deuterium, a methyl group, or a terbutyl group.

In an exemplary embodiment of the present specification, R is a biphenyl group which is unsubstituted or substituted with a terbutyl group; a hexahydrocarbazole group which is unsubstituted or substituted with a methyl group; a dibenzofuran group which is unsubstituted or substituted with a terbutyl group; or a dibenzothiophene group which is unsubstituted or substituted with a terbutyl group.

In an exemplary embodiment of the present specification, R is a phenyl group.

In an exemplary embodiment of the present specification, A1 and A2 are the same as or different from each other, and are each independently hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted heteroaryl group, a substituted or unsubstituted alkoxy group, a substituted or unsubstituted aryloxy group, a substituted or unsubstituted aralkyl group, a substituted or unsubstituted alkenyl group, or a substituted or unsubstituted alkynyl group.

In an exemplary embodiment of the present specification, A1 and A2 are the same as or different from each other, and are each independently hydrogen, deuterium, a substituted or unsubstituted alkyl group, a substituted or unsubstituted cycloalkyl group, or a substituted or unsubstituted aryl group.

In an exemplary embodiment of the present specification, A1 and A2 are the same as or different from each other, and are each independently hydrogen, deuterium, a substituted or unsubstituted alkyl group having 1 to 10 carbon atoms, a substituted or unsubstituted cycloalkyl group having 3 to 10 carbon atoms, or a substituted or unsubstituted aryl group having 6 to 30 carbon atoms.

In an exemplary embodiment of the present specification, A1 and A2 are the same as or different from each other, and are each independently hydrogen, deuterium, an alkyl group having 1 to 10 carbon atoms, a cycloalkyl group having 3 to 10 carbon atoms, or an aryl group having 6 to 30 carbon atoms.

In an exemplary embodiment of the present specification, A1 and A2 are the same as or different from each other, and are each independently hydrogen, deuterium, a methyl group, an ethyl group, a propyl group, an isopropyl group, a butyl group, a terbutyl group, a pentyl group, a hexyl group, a cyclopentyl group, a cyclohexyl group, a phenyl group, a biphenyl group, a terphenyl group, an anthracene group, a phenanthrene group, a fluorene group, or a triphenylene group.

In an exemplary embodiment of the present specification, A1 and A2 are the same as or different from each other, and are each independently hydrogen, a methyl group, a terbutyl group, or a phenyl group.

In an exemplary embodiment of the present specification, R1 to R3 are the same as or different from each other, and are each independently hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted heteroaryl group, a substituted or unsubstituted alkoxy group, a substituted or unsubstituted aryloxy group, a substituted or unsubstituted aralkyl group, a substituted or unsubstituted amine group, a substituted or unsubstituted alkenyl group, or a substituted or unsubstituted alkynyl group, or are bonded to an adjacent group to form a substituted or unsubstituted ring.

In an exemplary embodiment of the present specification, R1 to R3 are the same as or different from each other, and are each independently hydrogen, a substituted or unsubstituted alkyl group having 1 to 10 carbon atoms, a substituted or unsubstituted cycloalkyl group having 3 to 10 carbon atoms, a substituted or unsubstituted aryl group having 6 to 30 carbon atoms, a silyl group which is unsubstituted or substituted with an alkyl group, a substituted or unsubstituted amine group, or a substituted or unsubstituted heteroaryl group having 3 to 30 carbon atoms, or are bonded to an adjacent group to form a substituted or unsubstituted cycloalkene having 3 to 10 carbon atoms.

In an exemplary embodiment of the present specification, R1 to R3 are the same as or different from each other, and are each independently hydrogen, a substituted or unsubstituted alkyl group having 1 to 10 carbon atoms, a substituted or unsubstituted aryl group having 6 to 30 carbon atoms, an amine group which is unsubstituted or substituted with an aryl group, or a substituted or unsubstituted heteroaryl group having 3 to 30 carbon atoms, or are bonded to an adjacent group to form a cycloalkene having 3 to 10 carbon atoms, which is unsubstituted or substituted with an alkyl group.

In an exemplary embodiment of the present specification, R1 to R3 are the same as or different from each other, and are each independently hydrogen, a substituted or unsubstituted alkyl group having 1 to 10 carbon atoms, a substituted or unsubstituted aryl group having 6 to 30 carbon atoms, an amine group which is substituted with an aryl group having 6 to 30 carbon atoms, or a substituted or unsubstituted heteroaryl group having 3 to 30 carbon atoms, or are bonded to an adjacent group to form a cycloalkene having 3 to 10 carbon atoms, which is unsubstituted or substituted with an alkyl group having 1 to 4 carbon atoms.

In an exemplary embodiment of the present specification, R1 to R3 are the same as or different from each other, and are each independently hydrogen; a substituted or unsubstituted alkyl group having 1 to 10 carbon atoms; a substituted or unsubstituted aryl group having 6 to 30 carbon atoms; or an amine group which is substituted with an aryl group having 6 to 30 carbon atoms, or are bonded to an adjacent group to form a cycloalkene having 3 to 10 carbon atoms, which is unsubstituted or substituted with an alkyl group having 1 to 4 carbon atoms.

In an exemplary embodiment of the present specification, R1 is hydrogen, or a substituted or unsubstituted alkyl group.

In an exemplary embodiment of the present specification, R1 is hydrogen, or an alkyl group.

In an exemplary embodiment of the present specification, R1 is hydrogen, or a substituted or unsubstituted alkyl group having 1 to 10 carbon atoms.

In an exemplary embodiment of the present specification, R1 is hydrogen, or an alkyl group having 1 to 10 carbon atoms.

In an exemplary embodiment of the present specification, R1 is hydrogen, or a terbutyl group.

In an exemplary embodiment of the present specification, R2 is hydrogen.

In an exemplary embodiment of the present specification, R2 is a substituted amine group.

In an exemplary embodiment of the present specification, R2 is an amine group which is substituted with an aryl group.

In an exemplary embodiment of the present specification, R2 is an amine group which is substituted with an alkylaryl group.

In an exemplary embodiment of the present specification, R2 is an amine group which is substituted with an aryl group having 6 to 30 carbon atoms, which is unsubstituted or substituted with an alkyl group having 1 to 10 carbon atoms.

In an exemplary embodiment of the present specification, R2 is an amine group which is substituted with a phenyl group which is unsubstituted or substituted with a methyl group or a terbutyl group.

In an exemplary embodiment of the present specification, R2 is hydrogen, deuterium, a substituted or unsubstituted alkyl group, a substituted or unsubstituted aryl group, a substituted or unsubstituted heteroaryl group, or a substituted or unsubstituted amine group.

In an exemplary embodiment of the present specification, R2 is hydrogen, deuterium, a substituted or unsubstituted alkyl group, or an unsubstituted heteroaryl group; or a substituted or unsubstituted amine group.

In an exemplary embodiment of the present specification, R2 is a substituted or unsubstituted alkyl group, a substituted or unsubstituted heteroaryl group, or a substituted or unsubstituted amine group.

In an exemplary embodiment of the present specification, R2 is hydrogen, deuterium, a substituted or unsubstituted alkyl group having 1 to 10 carbon atoms, a substituted or unsubstituted aryl group having 6 to 18 carbon atoms, a substituted or unsubstituted heteroaryl group having 2 to 30 carbon atoms, or a substituted or unsubstituted amine group.

In an exemplary embodiment of the present specification, R2 is a substituted or unsubstituted alkyl group having 1 to 10 carbon atoms, a substituted or unsubstituted heteroaryl group having 2 to 30 carbon atoms, or a substituted or unsubstituted amine group.

In an exemplary embodiment of the present specification, R2 is an alkyl group having 1 to 10 carbon atoms, a heteroaryl group having 2 to 30 carbon atoms, or an amine group.

In an exemplary embodiment of the present specification, R2 is an alkyl group having 1 to 10 carbon atoms; a heteroaryl group having 2 to 30 carbon atoms, which is unsubstituted or substituted with at least one of deuterium, an alkyl group, and an aryl group; or an amine group which is unsubstituted or substituted with an alkyl group.

In an exemplary embodiment of the present specification, R2 is an alkyl group having 1 to 10 carbon atoms; a heteroaryl group having 2 to 30 carbon atoms, which is unsubstituted or substituted with at least one of deuterium, an alkyl group having 1 to 10 carbon atoms, and an aryl group having 6 to 18 carbon atoms; or an amine group which is unsubstituted or substituted with an alkyl group having 1 to 10 carbon atoms.

In an exemplary embodiment of the present specification, R2 is a substituted or unsubstituted methyl group; a substituted or unsubstituted terbutyl group; a substituted or unsubstituted hexahydrocarbazole group; or an amine group which is unsubstituted or substituted with an alkyl group having 1 to 10 carbon atoms, the amine group can be —NDAr1DAr2, and DAr1 and DAr2 are the same as or different from each other, and are each independently a substituted or unsubstituted aryl group; or a substituted or unsubstituted heteroaryl group.

In an exemplary embodiment of the present specification, R2 is a substituted or unsubstituted methyl group; a substituted or unsubstituted terbutyl group; a substituted or unsubstituted hexahydrocarbazole group; or an amine group which is unsubstituted or substituted with an alkyl group having 1 to 10 carbon atoms, the amine group can be —NDAr1DAr2, and DAr1 and DAr2 are the same as or different from each other, and are each independently a substituted or unsubstituted aryl group having 6 to 18 carbon atoms; or a substituted or unsubstituted heteroaryl group having 2 to 30 carbon atoms.

In an exemplary embodiment of the present specification, R2 is a substituted or unsubstituted methyl group; a substituted or unsubstituted terbutyl group; a substituted or unsubstituted hexahydrocarbazole group; or an amine group which is unsubstituted or substituted with an alkyl group having 1 to 10 carbon atoms, the amine group can be —NDAr1DAr2, and DAr1 and DAr2 are the same as or different from each other, and are each independently an aryl group having 6 to 18 carbon atoms, which is unsubstituted or substituted with an alkyl group; or a heteroaryl group having 2 to 30 carbon atoms, which is unsubstituted or substituted with an alkyl group.

In an exemplary embodiment of the present specification, R2 is a substituted or unsubstituted methyl group; a substituted or unsubstituted terbutyl group; a substituted or unsubstituted hexahydrocarbazole group; or an amine group which is unsubstituted or substituted with an alkyl group having 1 to 10 carbon atoms, the amine group can be —NDAr1DAr2, and DAr1 and DAr2 are the same as or different from each other, and are each independently an aryl group having 6 to 18 carbon atoms, which is unsubstituted or substituted with an alkyl group having 1 to 10 carbon atoms; or a heteroaryl group having 2 to 30 carbon atoms, which is unsubstituted or substituted with an alkyl group having 1 to 10 carbon atoms.

In an exemplary embodiment of the present specification, R2 is a substituted or unsubstituted methyl group; a substituted or unsubstituted terbutyl group; a substituted or unsubstituted hexahydrocarbazole group; or an amine group which is unsubstituted or substituted with an alkyl group having 1 to 10 carbon atoms, the amine group can be —NDAr1DAr2, and DAr1 and DAr2 are the same as or different from each other, and are each independently an aryl group having 6 to 18 carbon atoms; or a heteroaryl group having 2 to 30 carbon atoms.

In an exemplary embodiment of the present specification, R2 is a substituted or unsubstituted methyl group; a substituted or unsubstituted terbutyl group; a substituted or unsubstituted hexahydrocarbazole group; or an amine group which is unsubstituted or substituted with an alkyl group having 1 to 10 carbon atoms, the amine group can be —NDAr1DAr2, and DAr1 and DAr2 are the same as or different from each other, and are each independently an aryl group having 6 to 18 carbon atoms, which is unsubstituted or substituted with a methyl group or a terbutyl group; or a heteroaryl group having 2 to 30 carbon atoms, which is unsubstituted or substituted with a methyl group or a terbutyl group.

In an exemplary embodiment of the present specification, R2 is a substituted or unsubstituted methyl group; a substituted or unsubstituted terbutyl group; a substituted or unsubstituted hexahydrocarbazole group; or an amine group which is unsubstituted or substituted with an alkyl group having 1 to 10 carbon atoms, the amine group can be —NDAr1DAr2, and DAr1 and DAr2 are the same as or different from each other, and are each independently a phenyl group which is unsubstituted or substituted with a methyl group or a terbutyl group; a biphenyl group which is unsubstituted with a methyl group or a terbutyl group; a terphenyl group which is unsubstituted or substituted with a methyl group or a terbutyl group; a tetrahydronaphthyl group which is unsubstituted or substituted with a methyl group or a terbutyl group; a dibenzothiophene group which is unsubstituted or substituted with a methyl group or a terbutyl group; or a dibenzofuran group which is unsubstituted or substituted with a methyl group or a terbutyl group.

In an exemplary embodiment of the present specification, R2 is a methyl group; a terbutyl group; a hexahydrocarbazole group which is unsubstituted or substituted with at least one of deuterium, a methyl group, a terbutyl group, and a phenyl group; or a substituted or unsubstituted amine group, the amine group can be —NDAr1DAr2, and DAr1 and DAr2 are the same as or different from each other, and are each independently a phenyl group which is unsubstituted or substituted with a methyl group or a terbutyl group; a biphenyl group which is unsubstituted or substituted with a terbutyl group; a terphenyl group; a tetrahydronaphthyl group which is unsubstituted or substituted with a methyl group or a terbutyl group; a dibenzothiophene group which is unsubstituted or substituted with a methyl group or a terbutyl group; or a dibenzofuran group which is unsubstituted or substituted with a methyl group or a terbutyl group.

In an exemplary embodiment of the present specification, R2 is a methyl group; a terbutyl group; a hexahydrocarbazole group which is unsubstituted or substituted with at least one of deuterium, a methyl group, a terbutyl group, and a phenyl group; or a substituted or unsubstituted amine group, the amine group can be —NDAr1DAr2, and DAr1 and DAr2 are the same as or different from each other, and are each independently a phenyl group which is unsubstituted or substituted with a methyl group or a terbutyl group; a biphenyl group which is unsubstituted or substituted with a terbutyl group; a terphenyl group; a tetrahydronaphthyl group which is unsubstituted or substituted with a methyl group or a terbutyl group; a dibenzothiophene group which is unsubstituted or substituted with a terbutyl group; or a dibenzofuran group which is unsubstituted or substituted with a terbutyl group.

In an exemplary embodiment of the present specification, R3 is hydrogen, deuterium, a substituted or unsubstituted alkyl group, a substituted or unsubstituted aryl group, a substituted or unsubstituted heteroaryl group, or a substituted or unsubstituted amine group, or is bonded to an adjacent group to form a substituted or unsubstituted ring.

In an exemplary embodiment of the present specification, R3 is hydrogen, deuterium, a substituted or unsubstituted alkyl group having 1 to 10 carbon atoms, a substituted or unsubstituted aryl group having 6 to 18 carbon atoms, a substituted or unsubstituted heteroaryl group having 2 to 30 carbon atoms, or a substituted or unsubstituted amine group, or is bonded to an adjacent group to form a substituted or unsubstituted ring.

In an exemplary embodiment of the present specification, R3 is hydrogen, deuterium, an alkyl group having 1 to 10 carbon atoms, an aryl group having 6 to 18 carbon atoms, a heteroaryl group having 2 to 30 carbon atoms, or an amine group, or is bonded to an adjacent group to form a ring.

In an exemplary embodiment of the present specification, R3 is hydrogen, deuterium, a substituted or unsubstituted alkyl group having 1 to 10 carbon atoms, a substituted or unsubstituted aryl group having 6 to 18 carbon atoms, a substituted or unsubstituted heteroaryl group having 2 to 30 carbon atoms, or a substituted or unsubstituted amine group, or is bonded to an adjacent group to form a substituted or unsubstituted ring.

In an exemplary embodiment of the present specification, R3 is hydrogen; deuterium; a substituted or unsubstituted alkyl group having 1 to 10 carbon atoms; an aryl group having 6 to 18 carbon atoms, which is unsubstituted or substituted with deuterium or an alkyl group; a heteroaryl group having 2 to 30 carbon atoms, which is unsubstituted or substituted with an alkyl group; or a substituted or unsubstituted amine group, or is bonded to an adjacent group to form a substituted or unsubstituted ring.

In an exemplary embodiment of the present specification, R3 is hydrogen; deuterium; a substituted or unsubstituted alkyl group having 1 to 10 carbon atoms; an aryl group having 6 to 18 carbon atoms, which is unsubstituted or substituted with deuterium or an alkyl group having 1 to 10 carbon atoms; a heteroaryl group having 2 to 30 carbon atom, which is unsubstituted or substituted with an alkyl group having 1 to 10 carbon atoms; or a substituted or unsubstituted amine group, or is bonded to an adjacent group to form a substituted or unsubstituted ring.

In an exemplary embodiment of the present specification, R3 is hydrogen; deuterium; a terbutyl group which is unsubstituted or substituted with deuterium or an alkyl group; a phenyl group which is unsubstituted or substituted with deuterium or an alkyl group; a naphthyl group which is unsubstituted or substituted with deuterium or an alkyl group; a terphenyl group which is unsubstituted or substituted with deuterium or an alkyl group; a fluorenyl group which is unsubstituted or substituted with deuterium or an alkyl group; a dibenzothiophene group which is unsubstituted or substituted with an alkyl group; a dibenzofuran group which is unsubstituted or substituted with an alkyl group; a hexahydrocarbazole group which is unsubstituted or substituted with an alkyl group; or a diphenylamine group which is unsubstituted or substituted with an alkyl group, or is bonded to an adjacent group to form a cycloalkene which is unsubstituted or substituted with an alkyl group.

In an exemplary embodiment of the present specification, R3 is hydrogen; deuterium; a terbutyl group; a phenyl group which is unsubstituted or substituted with deuterium or an alkyl group; a naphthyl group; a terphenyl group; a fluorenyl group; a dibenzothiophene group; a dibenzofuran group; a hexahydrocarbazole group which is unsubstituted or substituted with an alkyl group; or a diphenylamine group which is substituted with an alkyl group, or is bonded to an adjacent group to form a cycloalkene which is unsubstituted or substituted with an alkyl group.

In an exemplary embodiment of the present specification, R3 is hydrogen; deuterium; a terbutyl group; a phenyl group which is unsubstituted or substituted with deuterium or an alkyl group; a naphthyl group; a terphenyl group; a fluorenyl group; a dibenzothiophene group; a dibenzofuran group; a hexahydrocarbazole group which is substituted with an alkyl group; or a diphenylamine group which is substituted with an alkyl group, or is bonded to an adjacent group to form a cyclohexene which is substituted with an alkyl group.

In an exemplary embodiment of the present specification, R3 is hydrogen; deuterium; a terbutyl group; a phenyl group which is unsubstituted or substituted with at least one of deuterium, a methyl group, and a terbutyl group; a naphthyl group; a terphenyl group; a fluorenyl group; a dibenzothiophene group; a dibenzofuran group; a hexahydrocarbazole group which is substituted with a methyl group or a terbutyl group; or a diphenylamine group which is substituted with a methyl group or a terbutyl group, or is bonded to an adjacent group to form a cyclohexene which is substituted with a methyl group.

In an exemplary embodiment of the present specification, R3 is hydrogen.

In an exemplary embodiment of the present specification, a is an integer from 0 to 3.

In an exemplary embodiment of the present specification, b is an integer from 0 to 3.

In an exemplary embodiment of the present specification, c is an integer from 0 to 4.

In an exemplary embodiment of the present specification, Y and R3 are bonded to each other to form a substituted or unsubstituted ring.

In an exemplary embodiment of the present specification, Y and R3 are bonded to each other to form a substituted or unsubstituted aliphatic ring.

In an exemplary embodiment of the present specification, Y and R3 are bonded to each other to form a substituted or unsubstituted aromatic ring.

In an exemplary embodiment of the present specification, Y and R3 are bonded to each other to form an aliphatic ring.

In an exemplary embodiment of the present specification, Y and R3 are bonded to each other to form an aromatic ring.

In an exemplary embodiment of the present specification, Formula 1 is any one of the following Formulae 2 to 4:

<Formula 2>

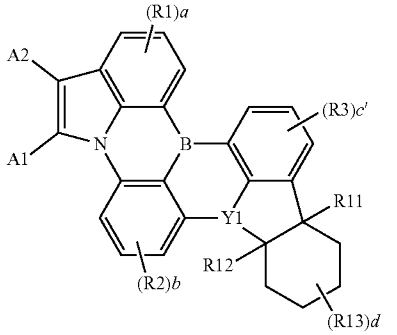

<Formula 3>

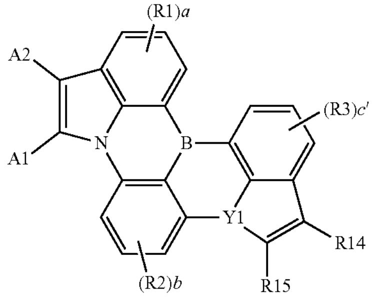

<Formula 4>

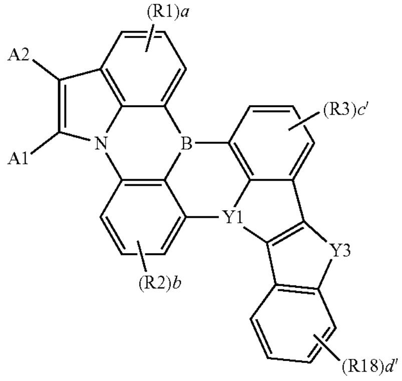

wherein in Formulae 2 to 4, R1 to R3, A1, A2, a, and b are the same as those defined in Formula 1;

Y1 is CRz or N;

Y3 is CR16 R17, NR19, O, or S;

Rz, R16, R17, and R19 are hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted heteroaryl group, a substituted or unsubstituted alkoxy group, a substituted or unsubstituted aryloxy group, a substituted or unsubstituted aralkyl group, a substituted or unsubstituted alkenyl group, or a substituted or unsubstituted alkynyl group, or are bonded to an adjacent group to form a substituted or unsubstituted ring;

R11 and R12 are the same as or different from each other, and are each independently hydrogen, a substituted or unsubstituted alkyl group, a substituted or unsubstituted aryl group, or a substituted or unsubstituted heteroaryl group;

R13 is hydrogen, deuterium, a substituted or unsubstituted alkyl group, a substituted or unsubstituted cycloalkyl group, or a substituted or unsubstituted aryl group;

R14, R15, and R18 are the same as or different from each other, and are each independently hydrogen, a substituted or unsubstituted alkyl group, or a substituted or unsubstituted aryl group, or are bonded to an adjacent group to form a substituted or unsubstituted ring;

c' is an integer from 0 to 3;

d is an integer from 0 to 8;

d' is an integer from 0 to 4;

when c' is 2 or higher, two or more R3s are the same as or different from each other;

when d is 2 or higher, two or more R13s are the same as or different from each other; and when d' is 2 or higher, two or more R18s are the same as or different from each other.

In an exemplary embodiment of the present specification, R14 and R15 are the same as or different from each other, and are each independently hydrogen, an alkyl group having 1 to 10 carbon atoms, or an aryl group having 6 to 30 carbon atoms, or are bonded to each other to form a substituted or unsubstituted ring.

In an exemplary embodiment of the present specification, R14 and R15 are the same as or different from each other, and are each independently hydrogen, a methyl group, a terbutyl group, or a phenyl group, or are bonded to each other to form a substituted or unsubstituted ring.

In an exemplary embodiment of the present specification, R14 and R15 are bonded to each other to form a substituted or unsubstituted ring.

In an exemplary embodiment of the present specification, R14 and R15 are bonded to each other to form a hydrocarbon ring.

In an exemplary embodiment of the present specification, R14 and R15 are bonded to each other to form an aromatic ring.

In an exemplary embodiment of the present specification, R16 and R17 are the same as or different from each other, and are each independently hydrogen, an alkyl group having 1 to 10 carbon atoms, or an aryl group having 6 to 30 carbon atoms, or are bonded to each other to form a substituted or unsubstituted ring.

In an exemplary embodiment of the present specification, R16 and R17 are the same as or different from each other, and are each independently hydrogen, a methyl group, or a phenyl group, or are bonded to each other to form a substituted or unsubstituted ring.

In an exemplary embodiment of the present specification, R16 and R17 are the same as or different from each other, and are each independently a methyl group or a phenyl group.

In an exemplary embodiment of the present specification, R16 and R17 are bonded to each other to form a substituted or unsubstituted ring.

In an exemplary embodiment of the present specification, R16 and R17 are bonded to each other to form a hydrocarbon ring.

In an exemplary embodiment of the present specification, R16 and R17 are bonded to each other to form an aromatic ring.

In an exemplary embodiment of the present specification, A1 and A2 are bonded to each other to form a substituted or unsubstituted ring.

In an exemplary embodiment of the present specification, A1 and A2 are bonded to each other to form an aromatic ring.

In an exemplary embodiment of the present specification, A1 and A2 are bonded to each other to form a hydrocarbon ring.

In an exemplary embodiment of the present specification, Formula 1 is any one of the following Formulae 5 to 10:

<Formula 5>

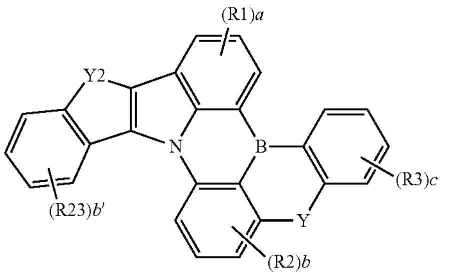

<Formula 6>

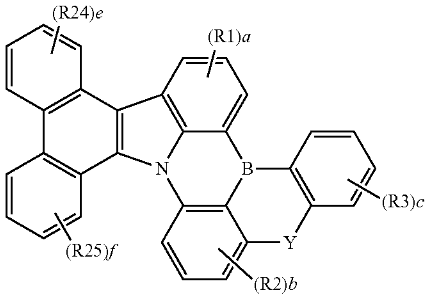

<Formula 7>

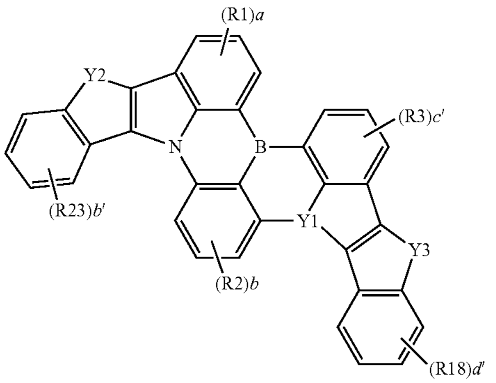

<Formula 8>

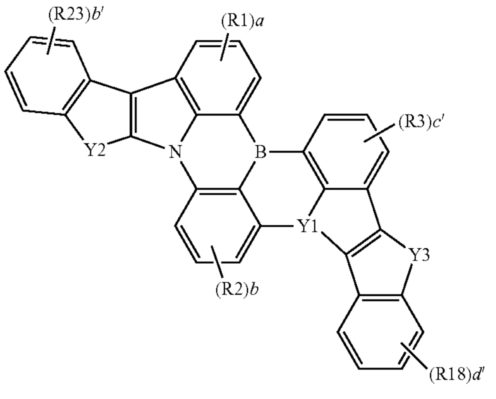

-continued

<Formula 9>

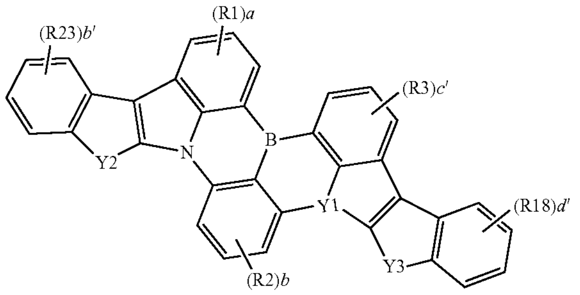

<Formula 10>

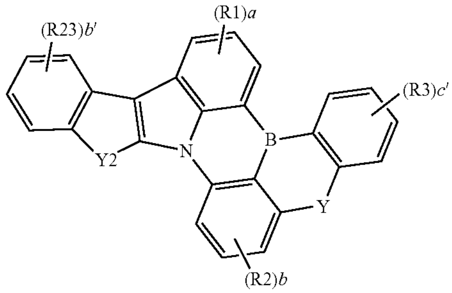

wherein in Formulae 5 to 10, R1 to R3, Y, and a to c are the same as those defined in Formula 1;

Y1 is CRz or N;

Y2 is NR20, CR21R22, 0, or S;

Y3 is CR16 R17, NR19, O, or S;

Rz, CR16, R17, and R19 are the same as or different from each other, and are each independently hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted heteroaryl group, a substituted or unsubstituted alkoxy group, a substituted or unsubstituted aryloxy group, a substituted or unsubstituted aralkyl group, a substituted or unsubstituted alkenyl group, or a substituted or unsubstituted alkynyl group, or are bonded to an adjacent group to form a substituted or unsubstituted ring;

R18 is hydrogen, a substituted or unsubstituted alkyl group, or a substituted or unsubstituted aryl group, or is bonded to an adjacent group to form a substituted or unsubstituted ring;

R20 to R22 are the same as or different from each other, and are each independently hydrogen, a substituted or unsubstituted alkyl group, or a substituted or unsubstituted aryl group, or are bonded to an adjacent group to form a substituted or unsubstituted ring;

R23 to R25 are the same as or different from each other, and are each independently hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted amine group, or a substituted or unsubstituted heteroaryl group;

b', d', e, and f are each an integer from 0 to 4;

c' is an integer from 0 to 3;

when b' is 2 or higher, two or more R23s are the same as or different from each other;

when c' is 2 or higher, two or more R3s are the same as or different from each other;

when d' is 2 or higher, two or more R18s are the same as or different from each other;

when e is 2 or higher, two or more R24s are the same as or different from each other; and when f is 2 or higher, two or more R25s are the same as or different from each other.

In an exemplary embodiment of the present specification, R18 is hydrogen; or a substituted or unsubstituted alkyl group.

In an exemplary embodiment of the present specification, R18 is hydrogen.

In an exemplary embodiment of the present specification, R19 is hydrogen, deuterium, a substituted or unsubstituted aryl group, or a substituted or unsubstituted heteroaryl group.

In an exemplary embodiment of the present specification, R19 is hydrogen, deuterium, or a substituted or unsubstituted aryl group having 6 to 12 carbon atoms.

In an exemplary embodiment of the present specification, R19 is hydrogen, deuterium, or an aryl group having 6 to 12 carbon atoms.

In an exemplary embodiment of the present specification, R19 is hydrogen or a phenyl group.

In an exemplary embodiment of the present specification, R21 and R22 are the same as or different from each other, and are each independently hydrogen, a methyl group, or a phenyl group, or are bonded to each other to form a substituted or unsubstituted ring.

In an exemplary embodiment of the specification, R21 and R22 are the same as or different from each other, and are each independently a methyl group or a phenyl group.

In an exemplary embodiment of the specification, R21 and R22 are bonded to each other to form a substituted or unsubstituted ring.

In an exemplary embodiment of the present specification, R21 and R22 are bonded to each other to form a hydrocarbon ring.

In an exemplary embodiment of the present specification, R21 and R22 are bonded to each other to form an aromatic ring.

In an exemplary embodiment of the present specification, R23 to R25 are hydrogen.

In an exemplary embodiment of the present specification, Formula 5 is the following Formula 51:

<Formula 51>

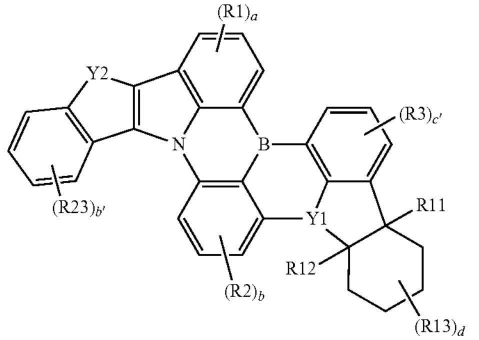

wherein in Formula 51, R1 to R3, a, and b are the same as those defined in Formula 1;

Y1 is CRz or N;

Y2 is NR20, CR21R22, 0, or S;

Rz is hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted heteroaryl group, a substituted or unsubstituted alkoxy group, a substituted or unsubstituted aryloxy group, a substituted or unsubstituted aralkyl group, a substituted or unsubstituted alkenyl group, or a substituted or unsubstituted alkynyl group;

R11 and R12 are the same as or different from each other, and are each independently hydrogen, a substituted or unsubstituted alkyl group, a substituted or unsubstituted aryl group, or a substituted or unsubstituted heteroaryl group;

R13 is hydrogen, deuterium, a substituted or unsubstituted alkyl group, a substituted or unsubstituted cycloalkyl group, or a substituted or unsubstituted aryl group;

R20 to R22 are the same as or different from each other, and are each independently hydrogen, a substituted or unsubstituted alkyl group, or a substituted or unsubstituted aryl group, or are bonded to an adjacent group to form a substituted or unsubstituted ring;

R23 is hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted amine group, or a substituted or unsubstituted heteroaryl group;

b' is an integer from 0 to 4;

c' is an integer from 0 to 3;

d is an integer from 0 to 8;

when b' is 2 or higher, two or more R23s are the same as or different from each other;

when c' is 2 or higher, two or more R3s are the same as or different from each other; and when d is 2 or higher, two or more R13s are the same as or different from each other.

In an exemplary embodiment of the present specification, Formula 10 is the following Formula 101:

<Formula 101>

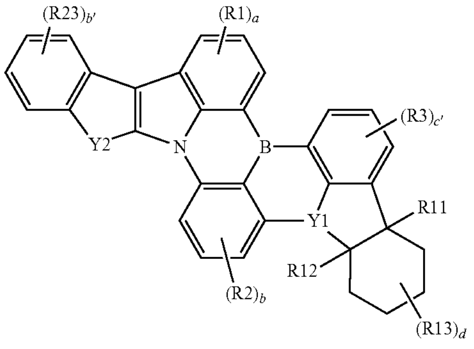

wherein in Formula 101, R1 to R3, a, and b are the same as those defined in Formula 1;

Y1 is CRz or N;

Y2 is NR20, CR21R22, 0, or S;

Rz is hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted heteroaryl group, a substituted or unsubstituted alkoxy group, a substituted or unsubstituted aryloxy group, a substituted or unsubstituted aralkyl group, a substituted or unsubstituted alkenyl group, or a substituted or unsubstituted alkynyl group;

R11 and R12 are the same as or different from each other, and are each independently hydrogen, a substituted or unsubstituted alkyl group, a substituted or unsubstituted aryl group, or a substituted or unsubstituted heteroaryl group;

R13 is hydrogen, deuterium, a substituted or unsubstituted alkyl group, a substituted or unsubstituted cycloalkyl group, or a substituted or unsubstituted aryl group;

R20 to R22 are the same as or different from each other, and are each independently hydrogen, a substituted or unsubstituted alkyl group, or a substituted or unsubstituted aryl group, or are bonded to an adjacent group to form a substituted or unsubstituted ring;

R23 is hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted amine group, or a substituted or unsubstituted heteroaryl group, b' is an integer from 0 to 4;

c' is an integer from 0 to 3;

d is an integer from 0 to 8;

when b' is 2 or higher, two or more R23s are the same as or different from each other;

when c' is 2 or higher, two or more R3s are the same as or different from each other; and when d is 2 or higher, two or more R13s are the same as or different from each other.

In an exemplary embodiment of the present specification, Y1 is N.

In an exemplary embodiment of the present specification, Y2 is CR21R22, 0, or S.

In an exemplary embodiment of the present specification, R11 and R12 are the same as or different from each other, and are each independently hydrogen; or a substituted or unsubstituted alkyl group.

In an exemplary embodiment of the present specification, R11 and R12 are the same as or different from each other, and are each independently an alkyl group having 1 to 10 carbon atoms.

In an exemplary embodiment of the present specification, R11 and R12 are a substituted or unsubstituted methyl group.

In an exemplary embodiment of the present specification, R11 and R12 are a methyl group.

In an exemplary embodiment of the present specification, R21 and R22 are the same as or different from each other, and are each independently hydrogen; a substituted or unsubstituted alkyl group having 1 to 10 carbon atoms; or a substituted or unsubstituted aryl group having 6 to 12 carbon atoms.

In an exemplary embodiment of the present specification, R21 and R22 are the same as or different from each other, and are each independently hydrogen or a methyl group.

In an exemplary embodiment of the present specification, R21 and R22 are a methyl group.

In an exemplary embodiment of the present specification, R23 is hydrogen, deuterium, or a substituted or unsubstituted alkyl group.

In an exemplary embodiment of the present specification, R23 is hydrogen or deuterium.

In an exemplary embodiment of the present specification, R23 is hydrogen.

In an exemplary embodiment of the present specification, the compound of Formula 1 is selected from among the following compounds:

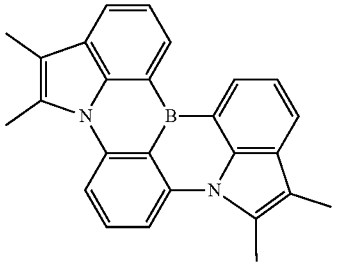

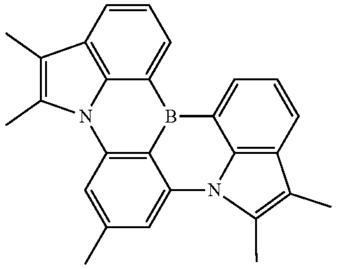

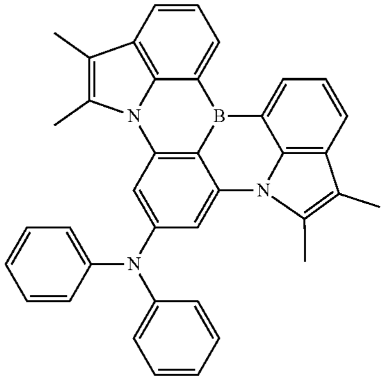

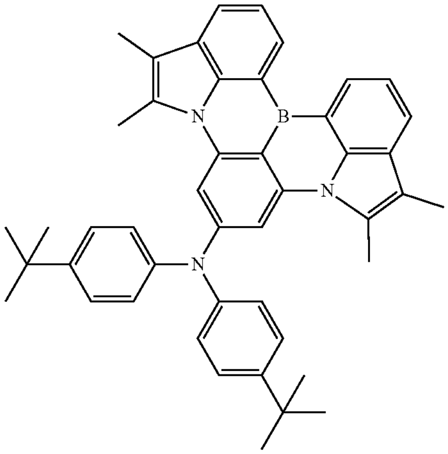

-continued
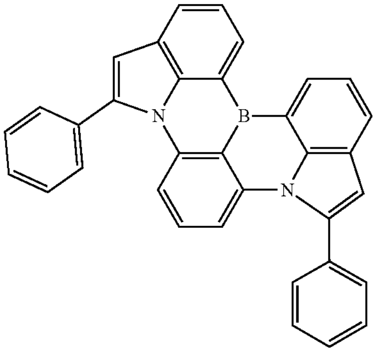
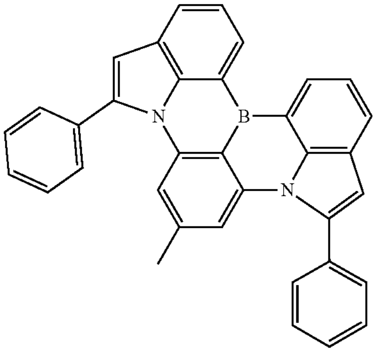
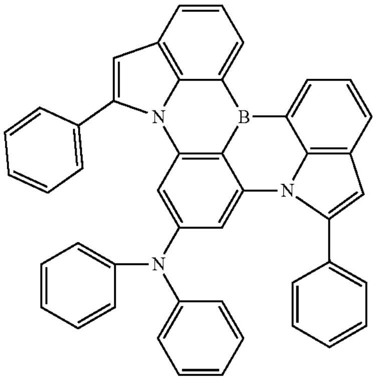
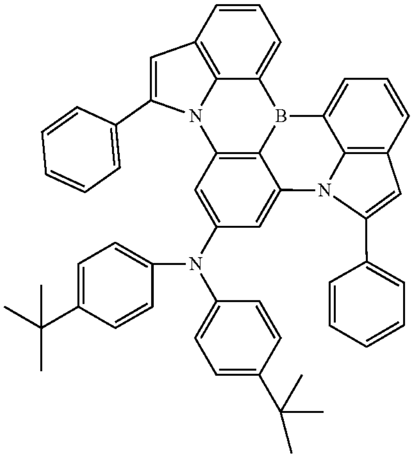
-continued
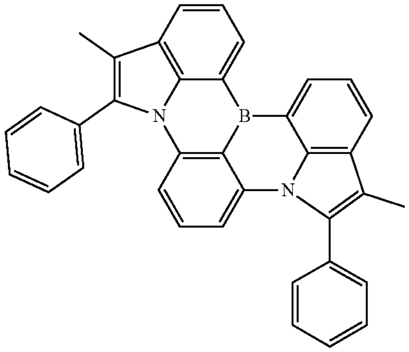
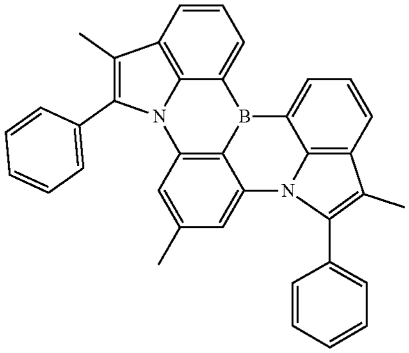
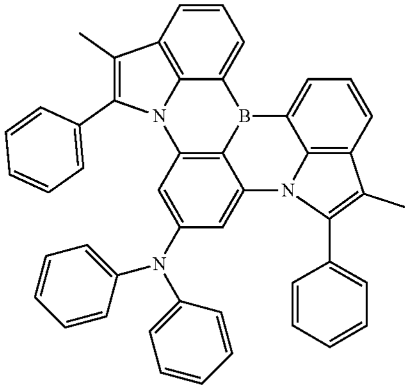
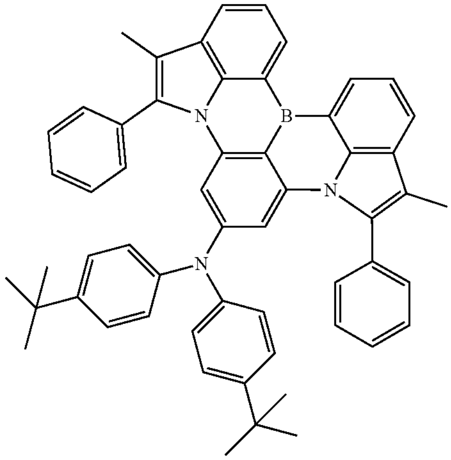

-continued
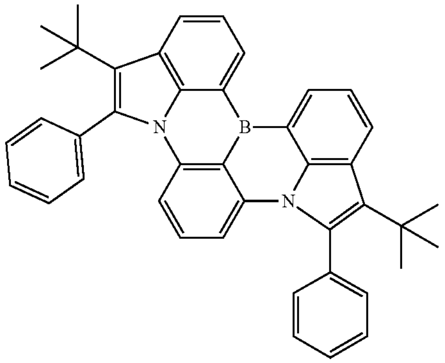
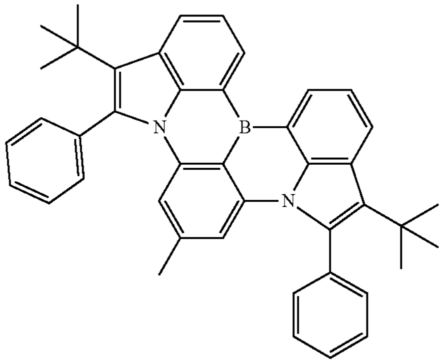
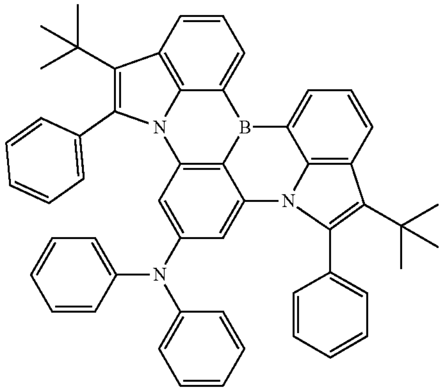
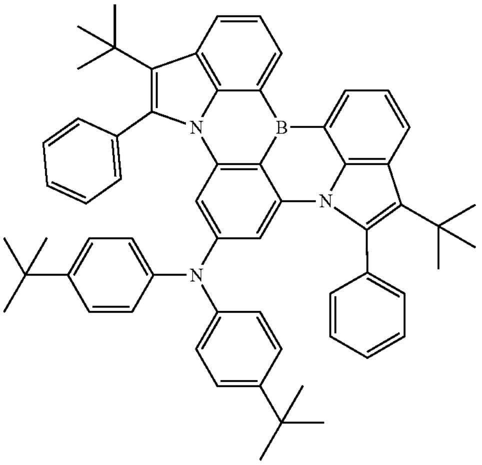
-continued
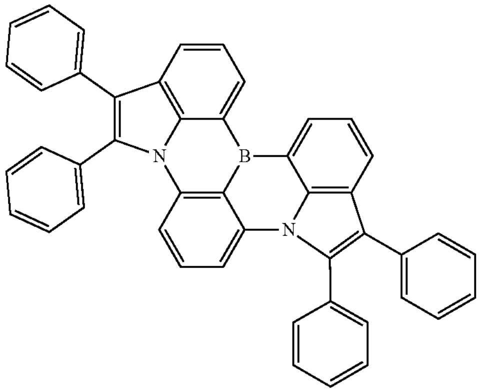
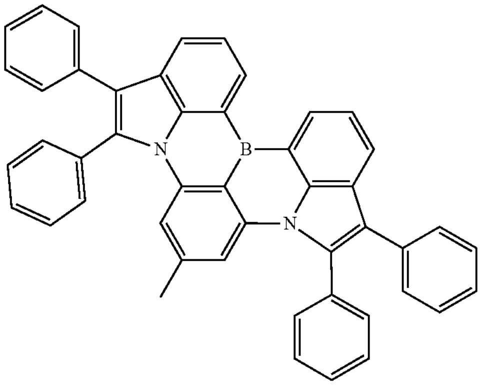
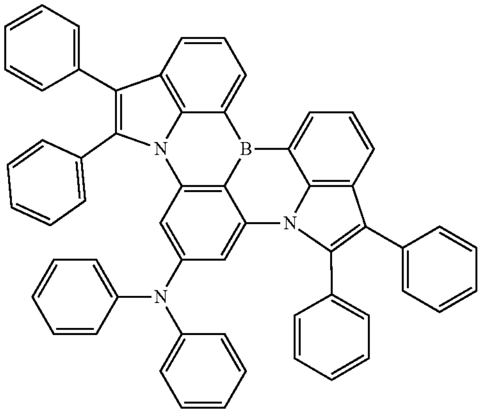
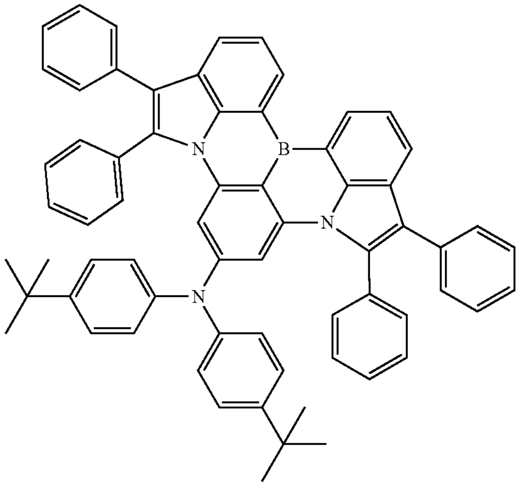

-continued
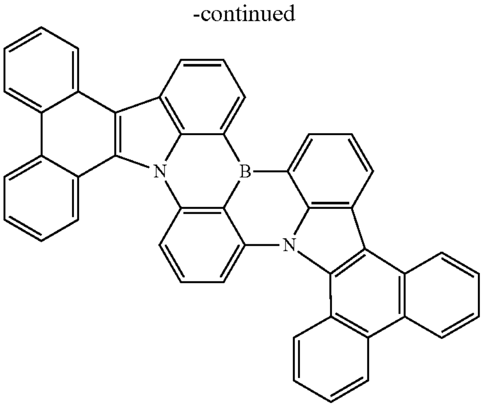
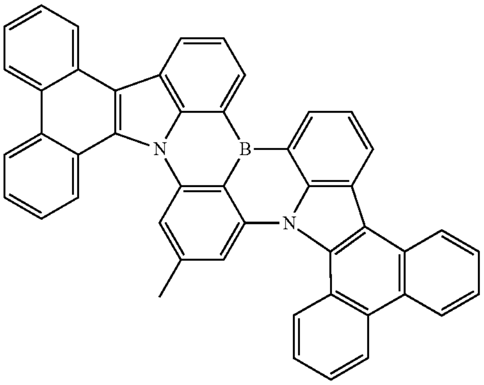
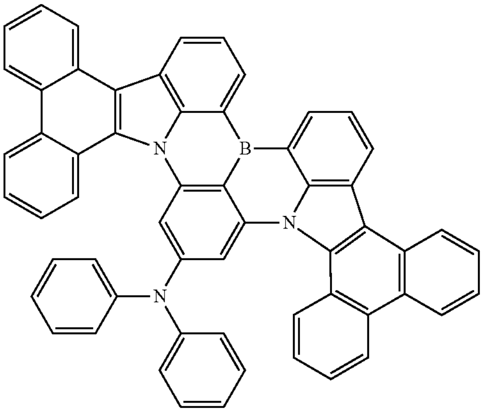
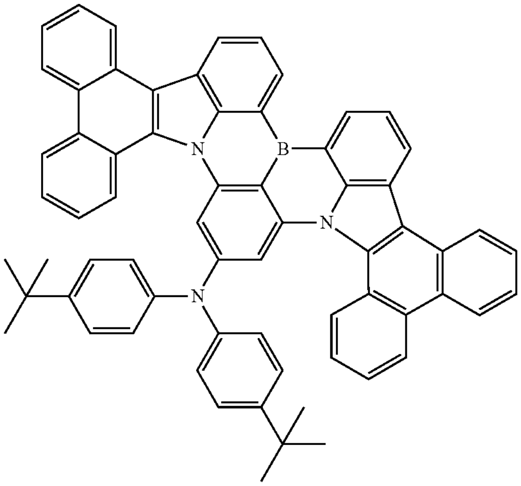
-continued
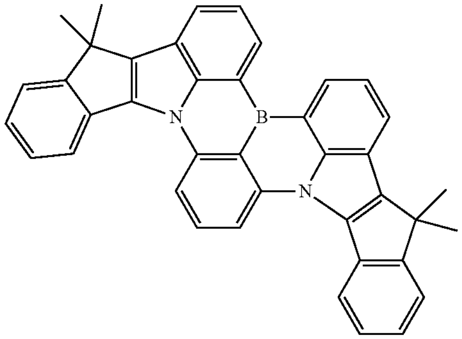
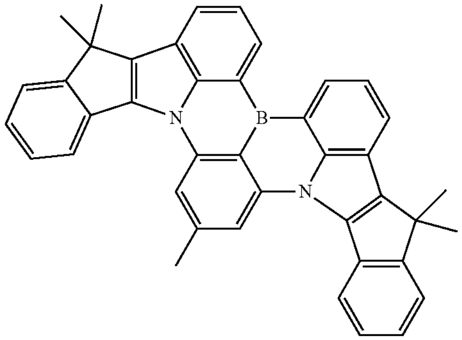
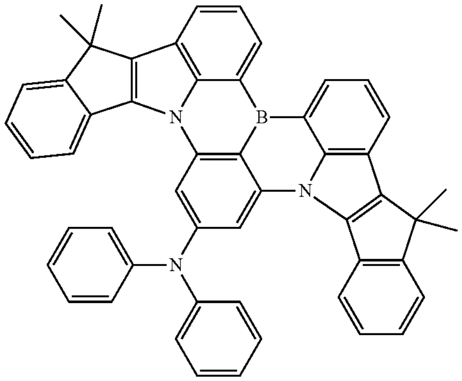
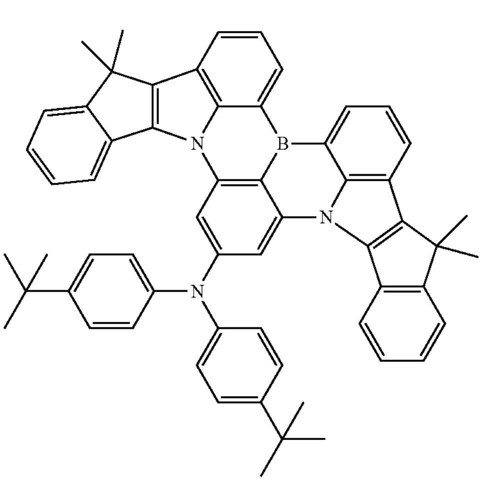

-continued
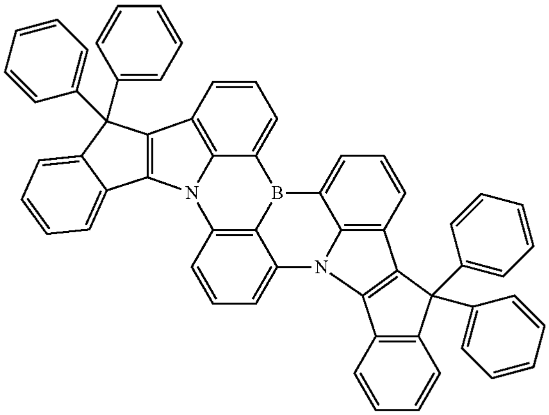
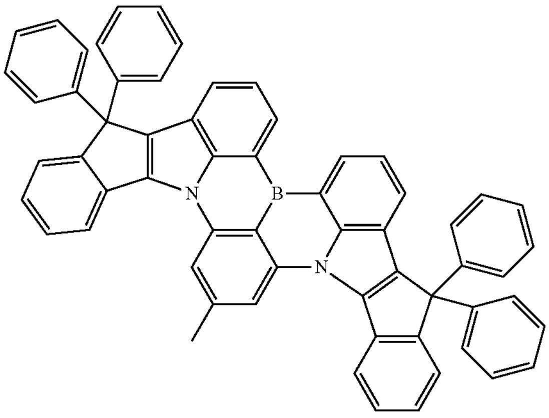
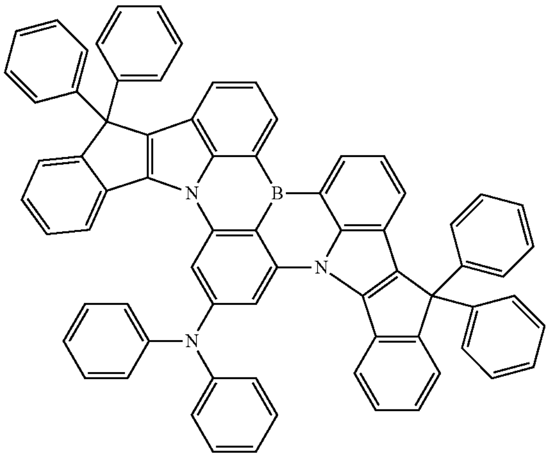
-continued
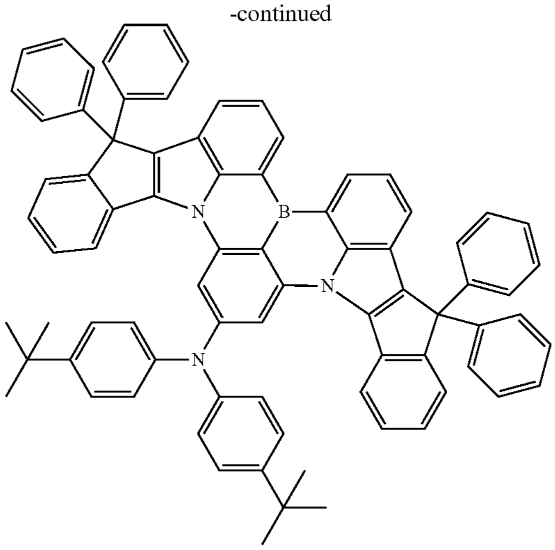
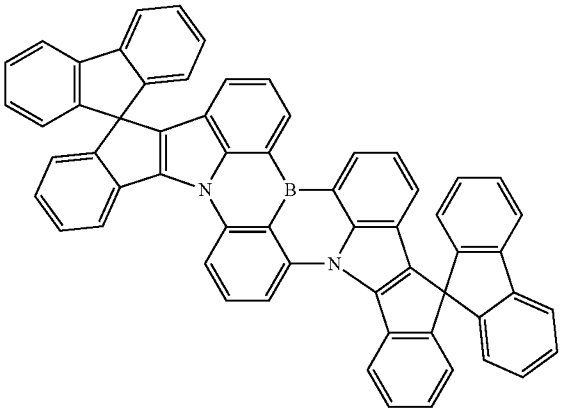
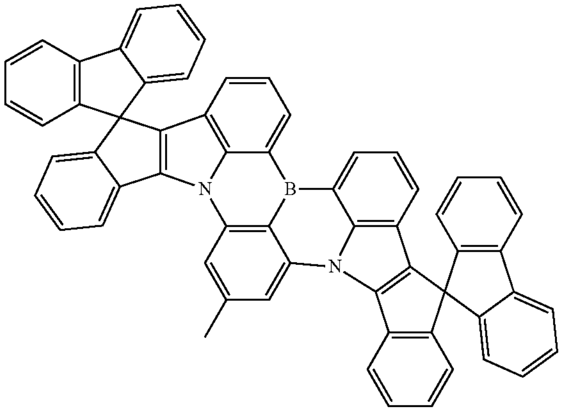

-continued
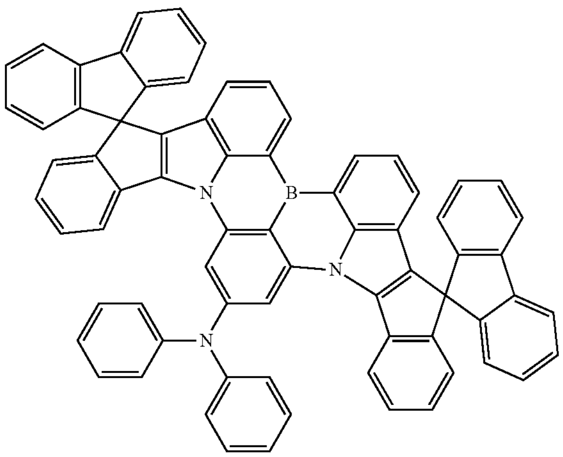
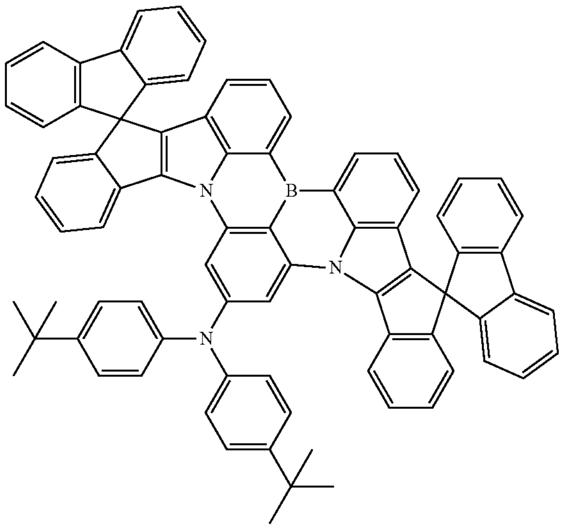
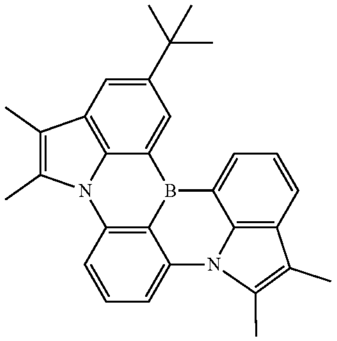
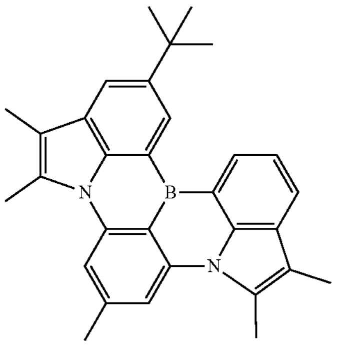
-continued
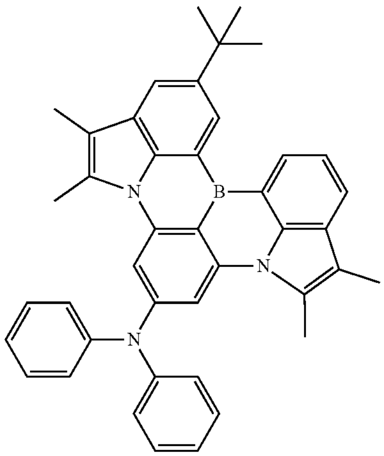
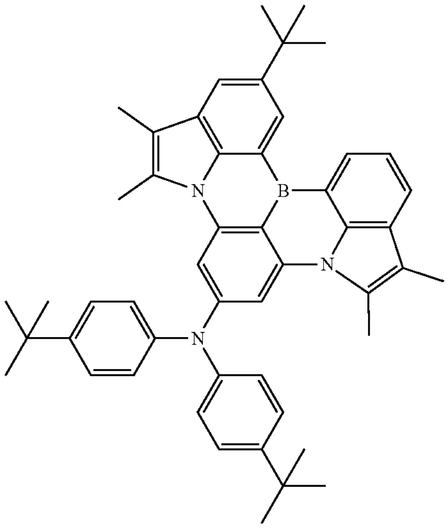
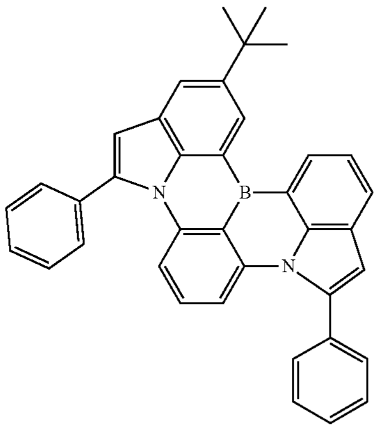

-continued
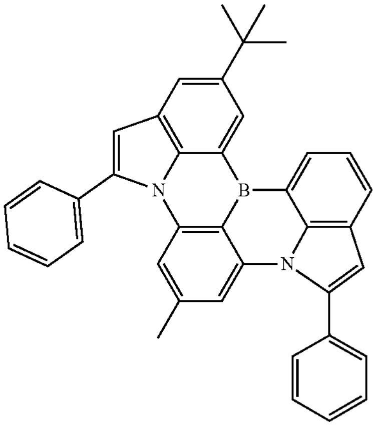
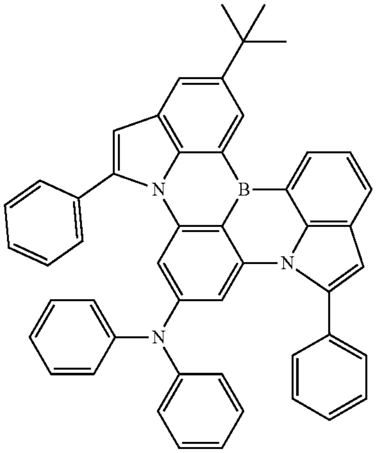
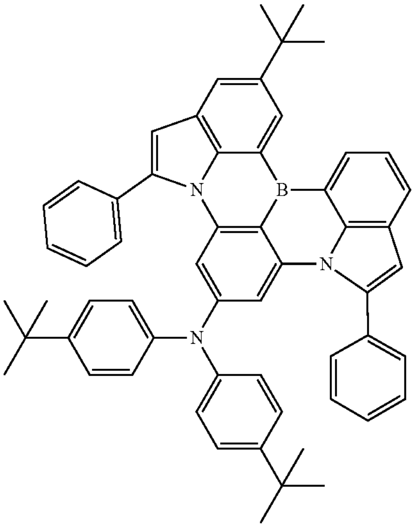
-continued
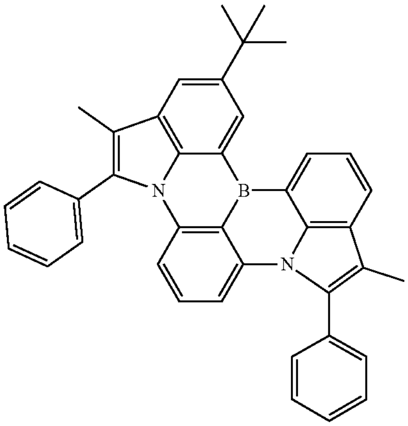
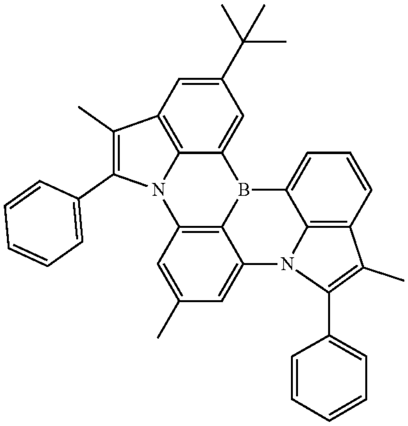
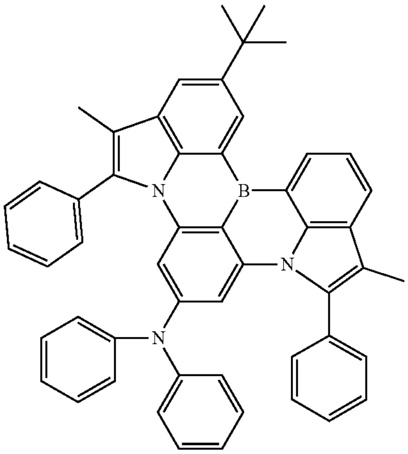

-continued
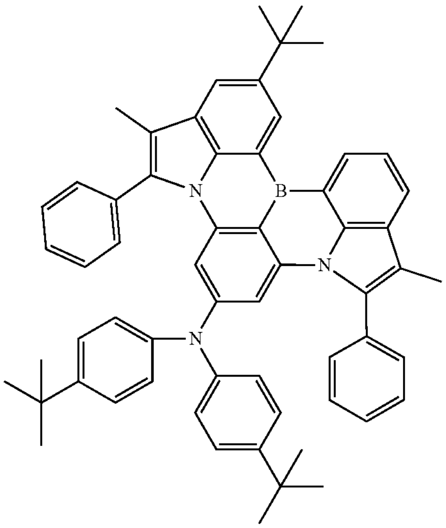
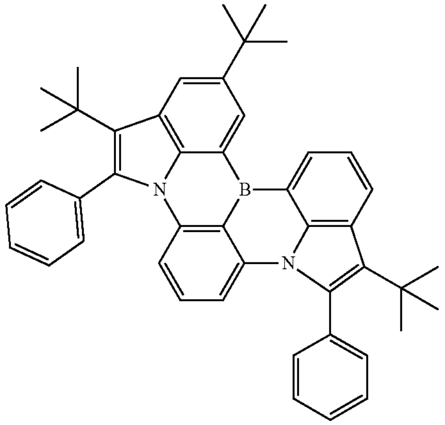
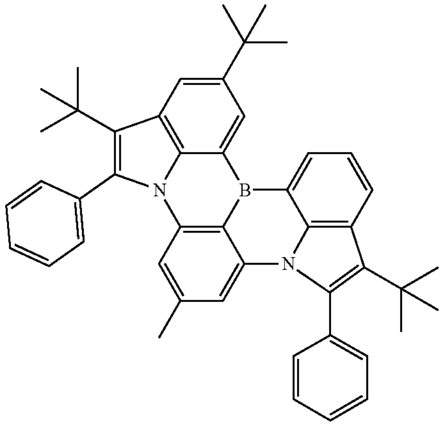
-continued
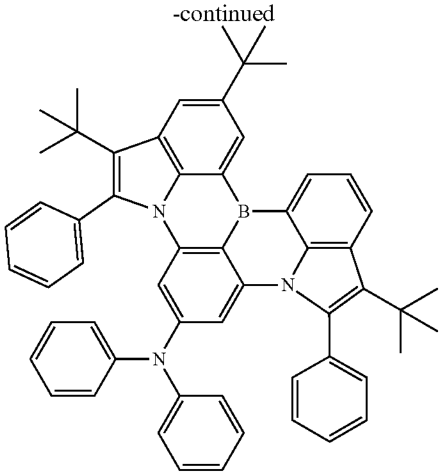
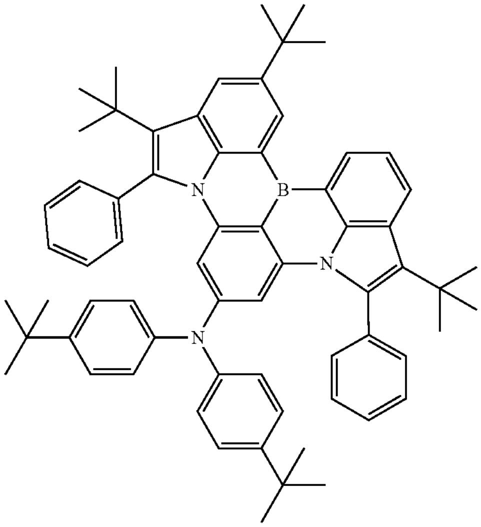
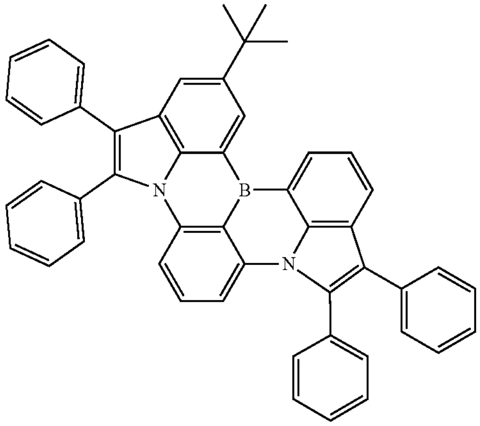

-continued
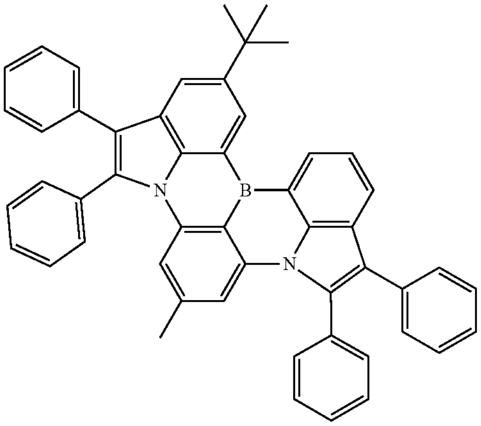
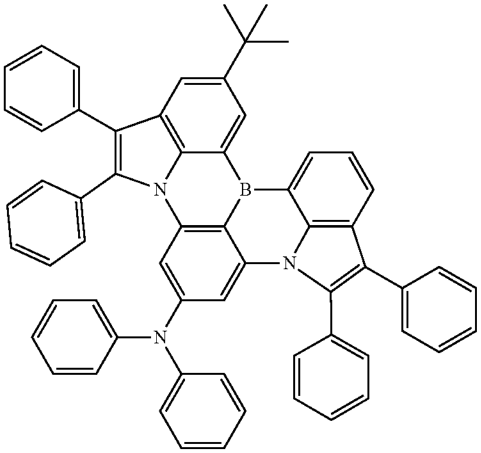
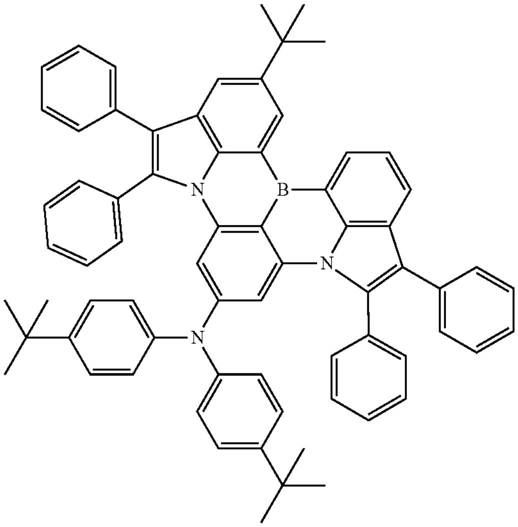
-continued
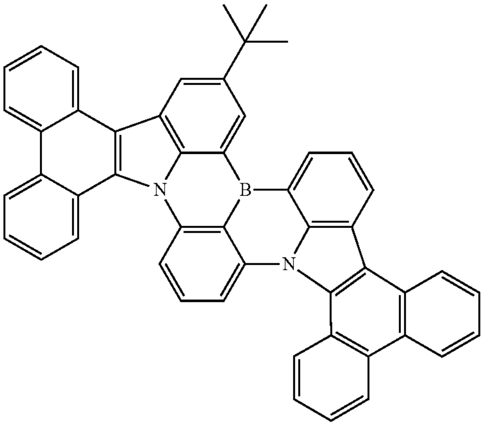
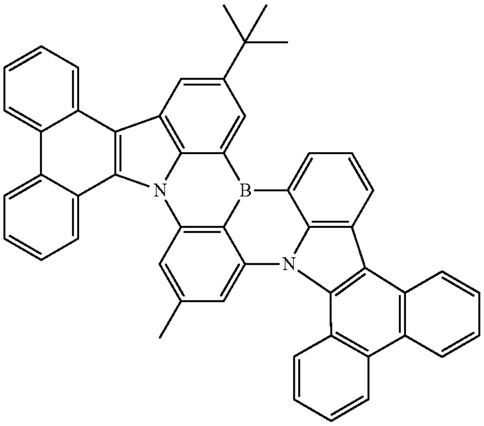
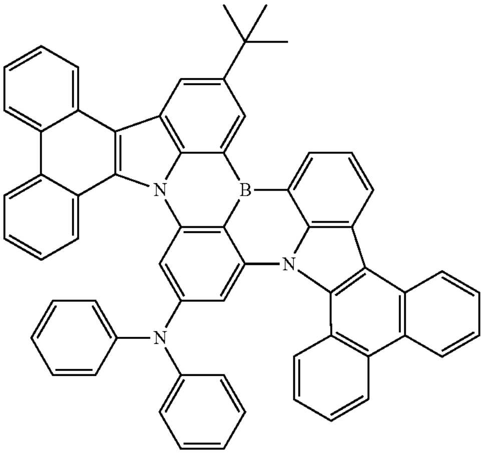

-continued
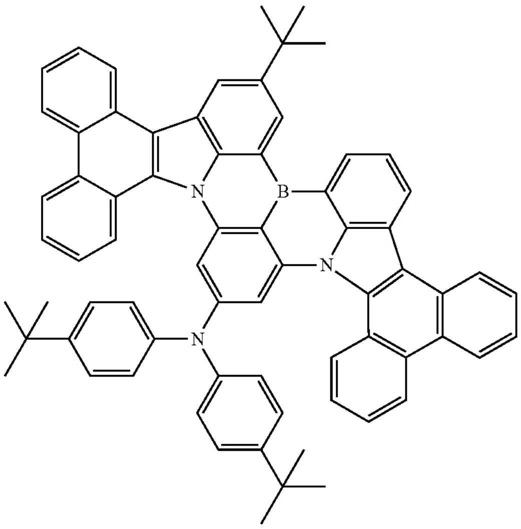
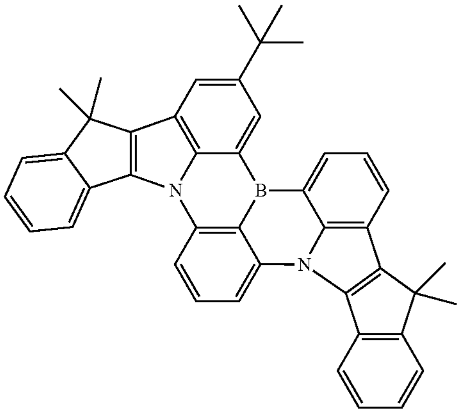
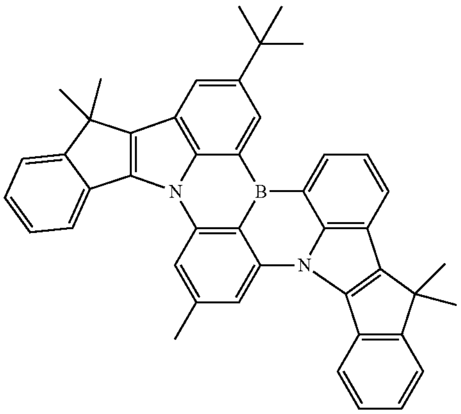
-continued
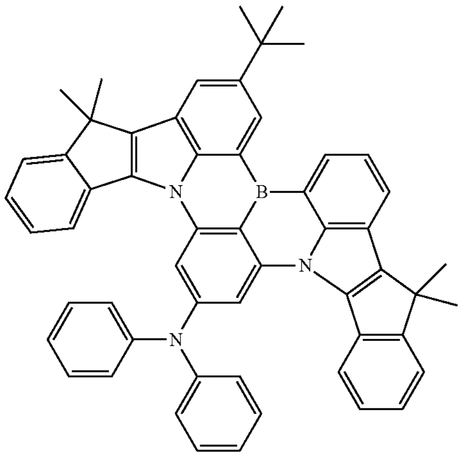
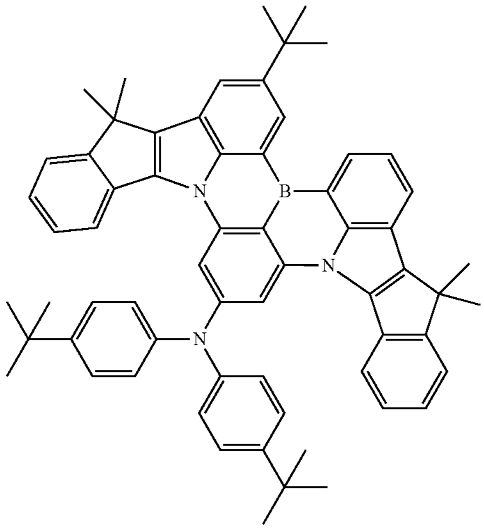
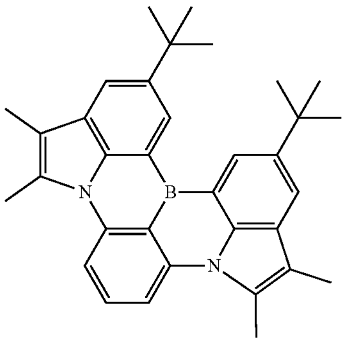
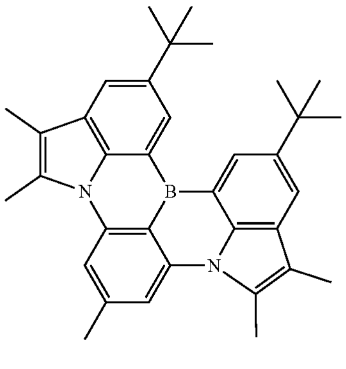

-continued
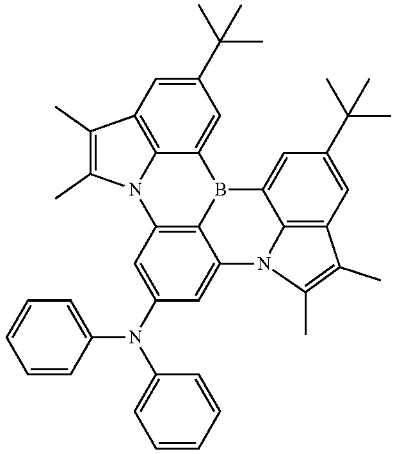
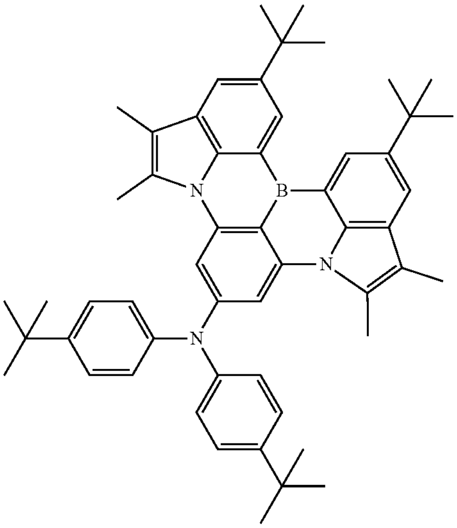
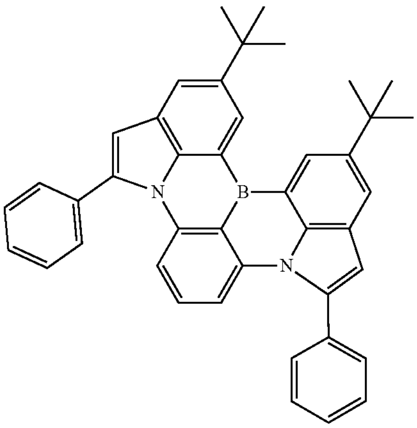
-continued
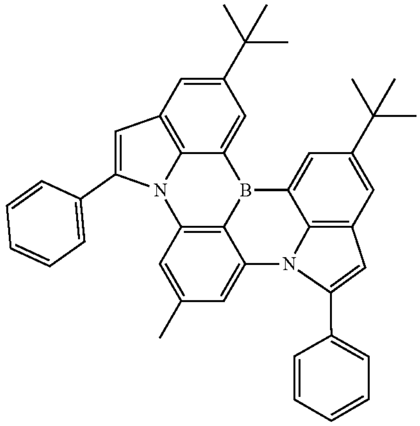
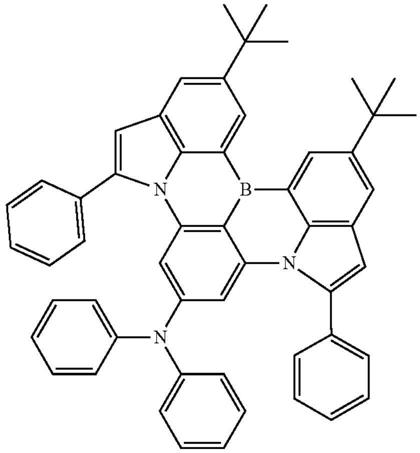
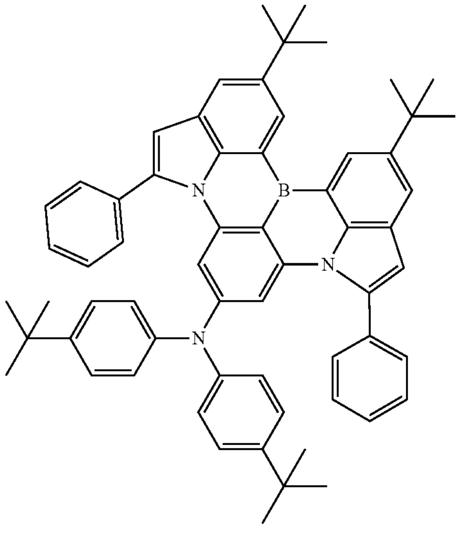

-continued
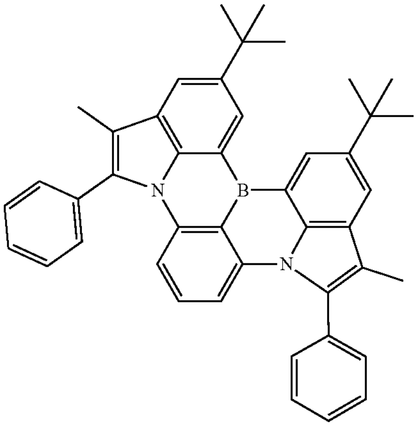
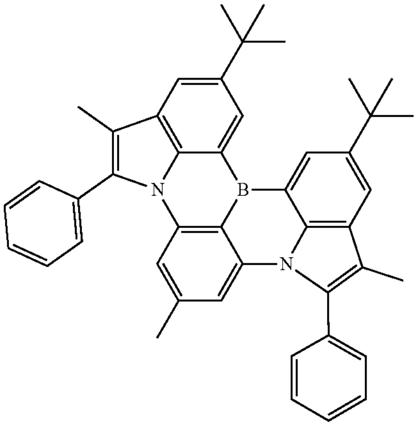
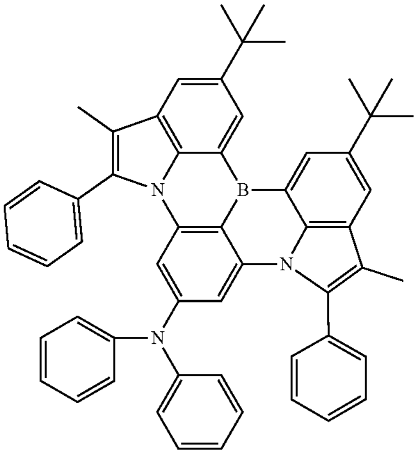
-continued
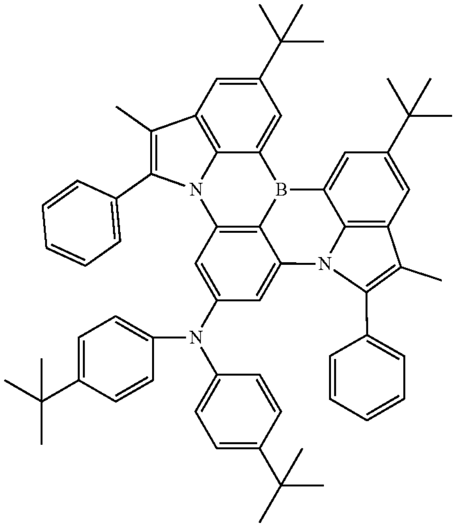
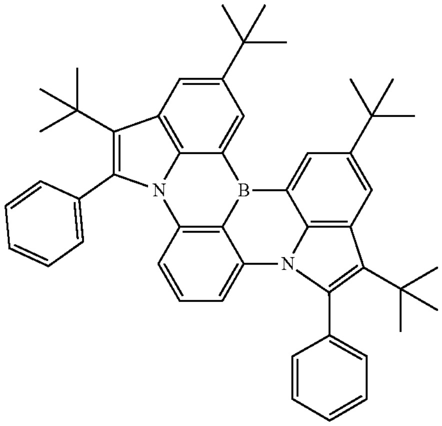
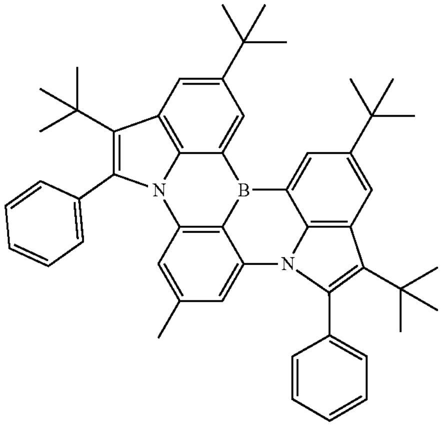

-continued
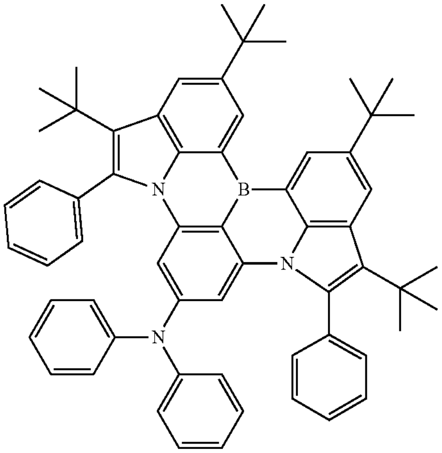
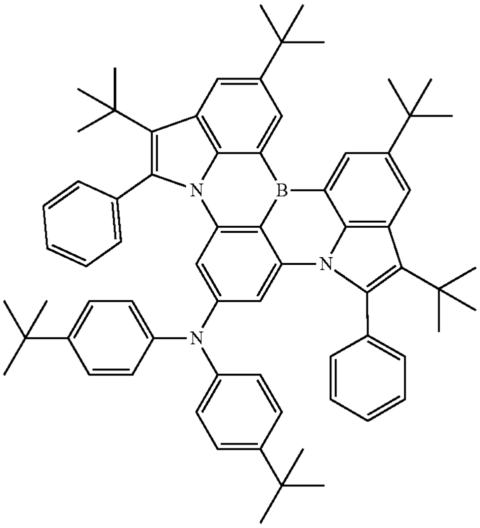
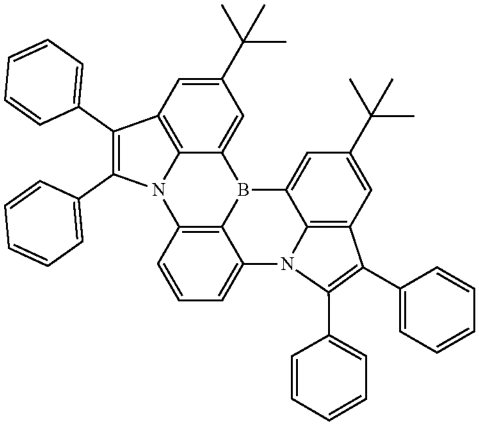
-continued
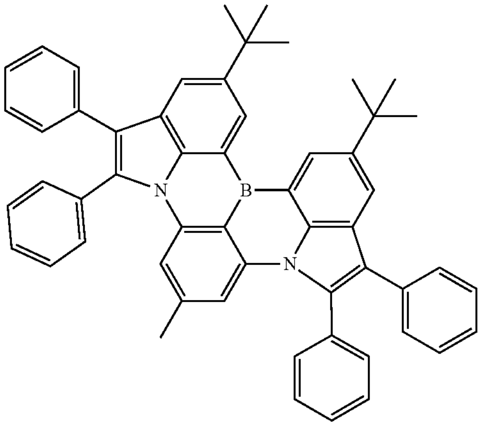
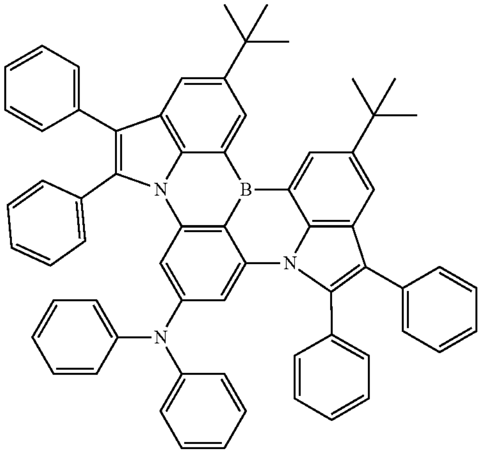
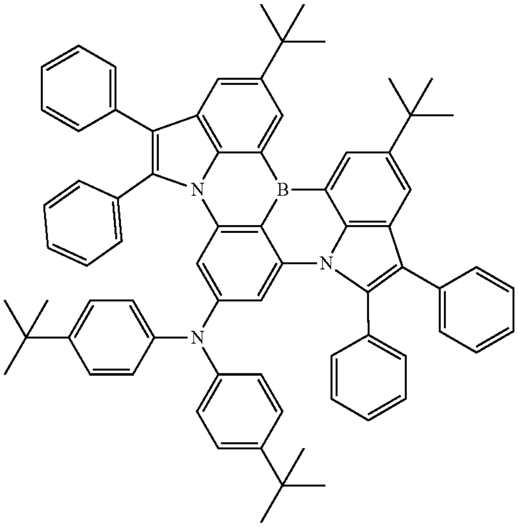

-continued
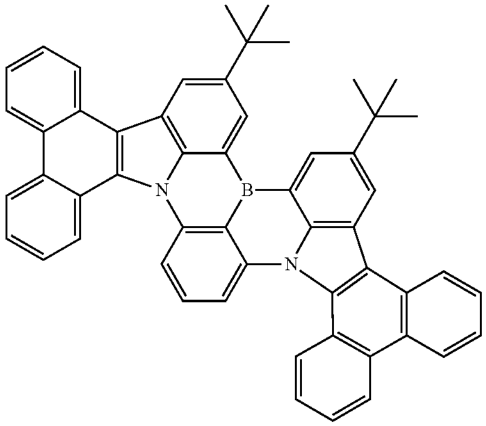
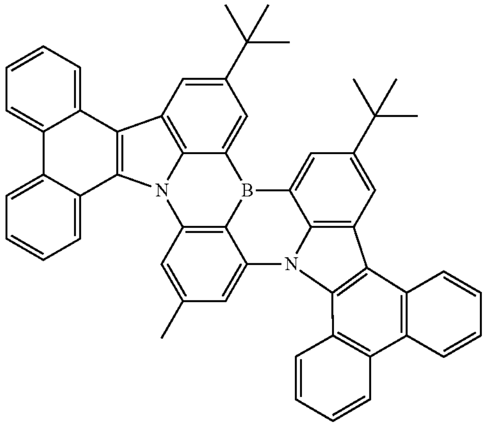
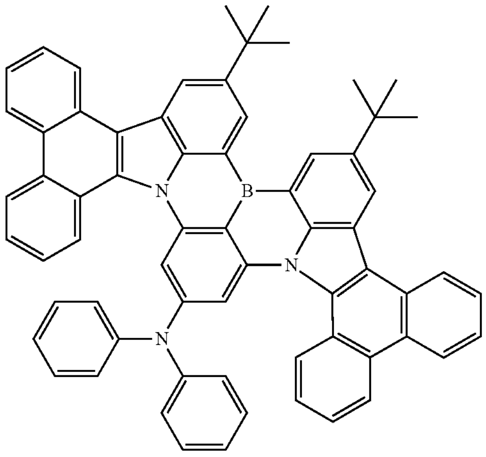
-continued
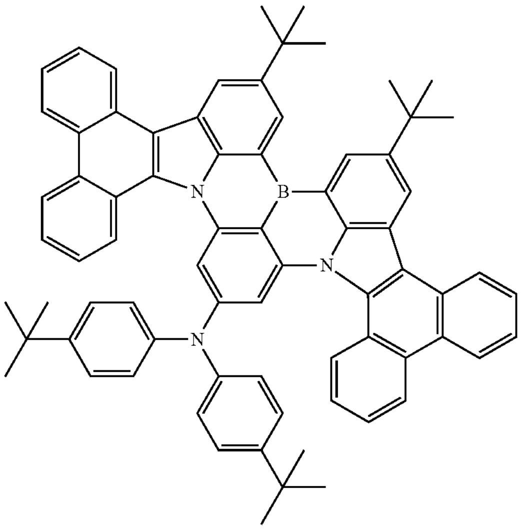
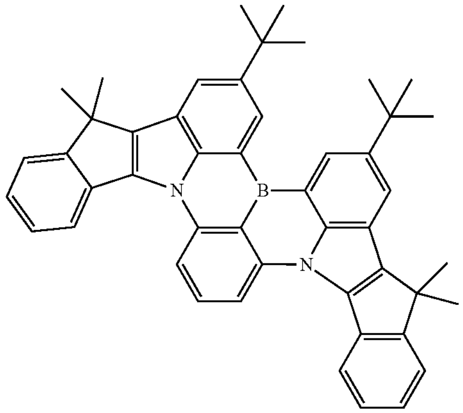
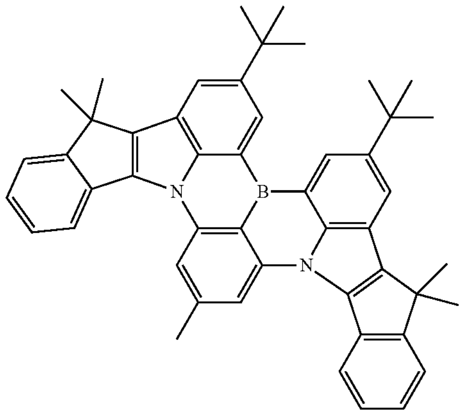

-continued
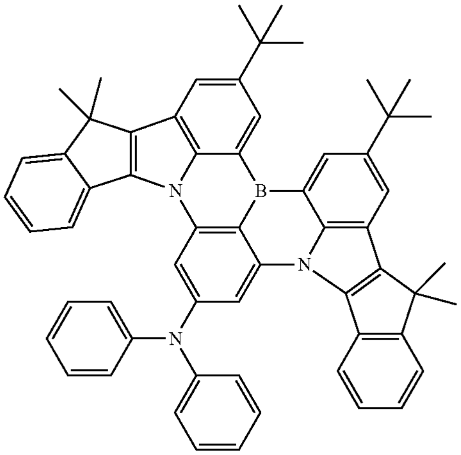
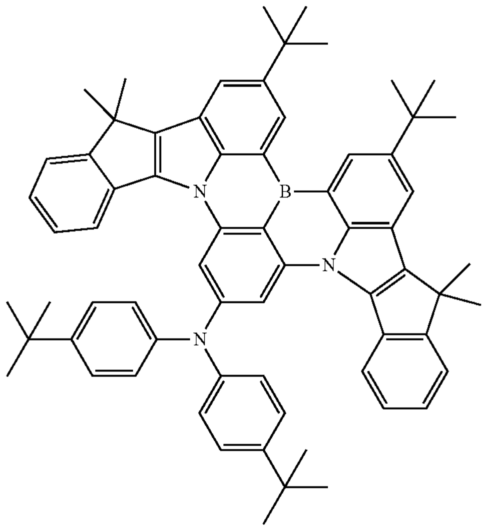
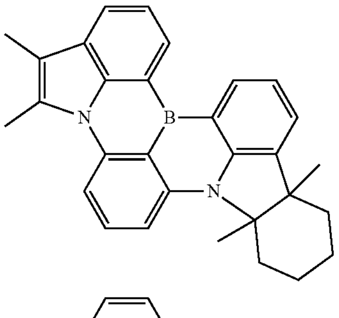
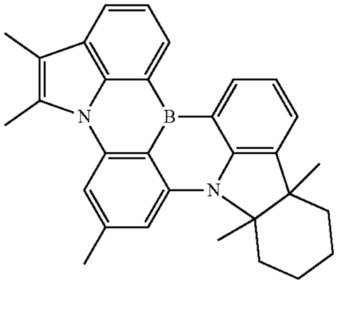
-continued
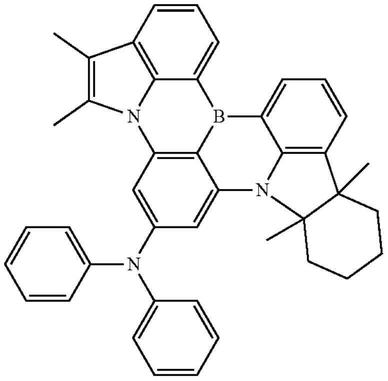
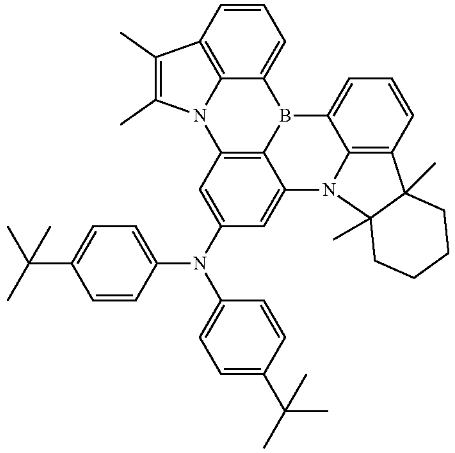
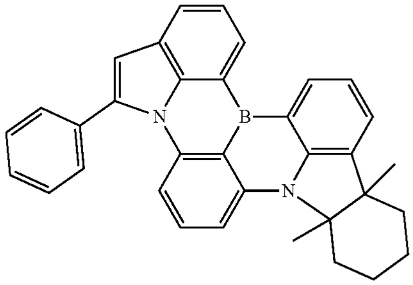
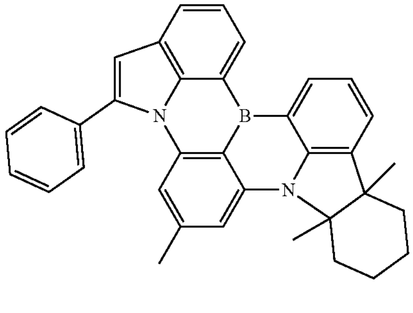

-continued
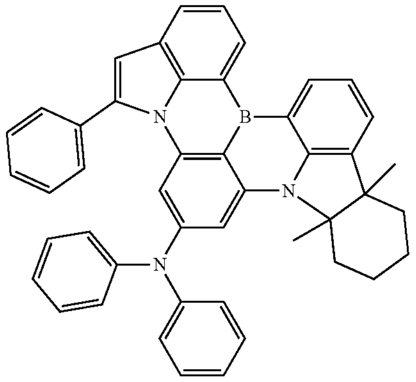
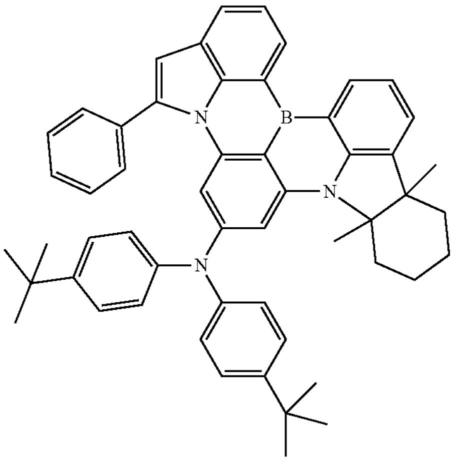
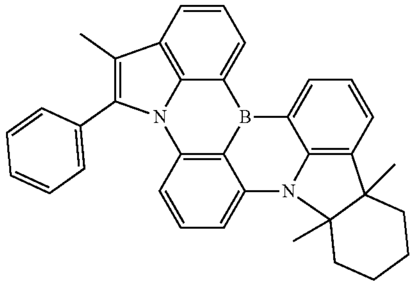
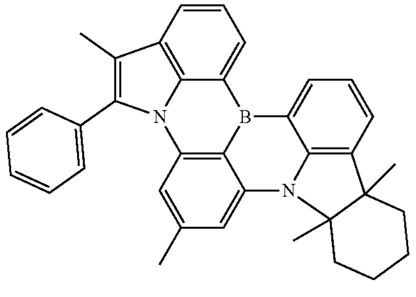
-continued
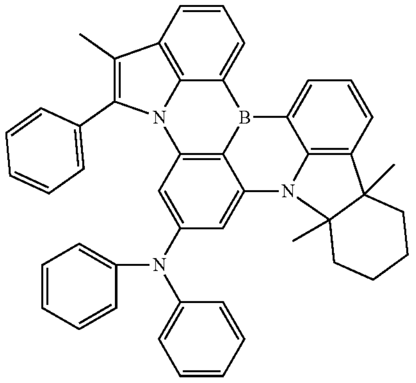
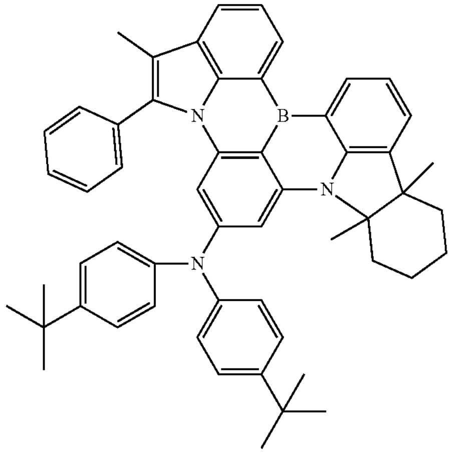
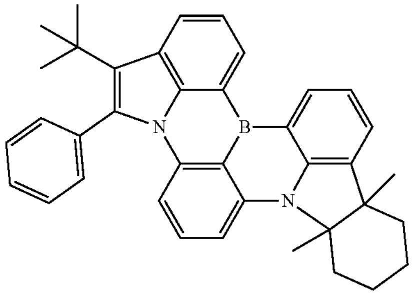
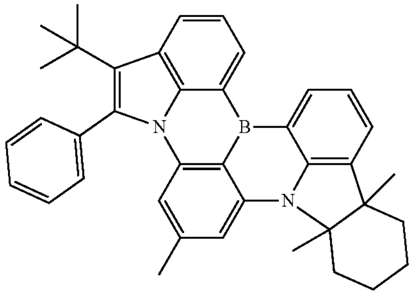

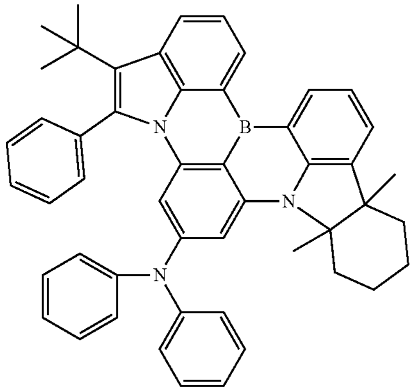
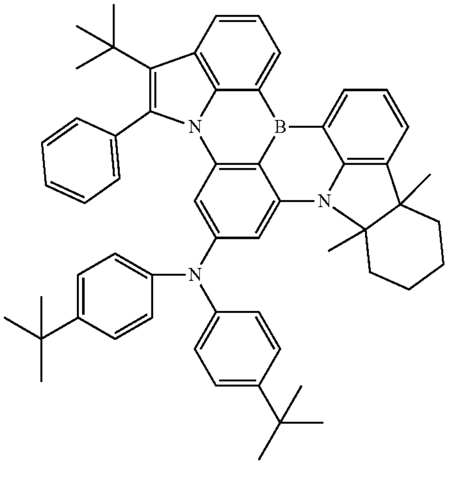
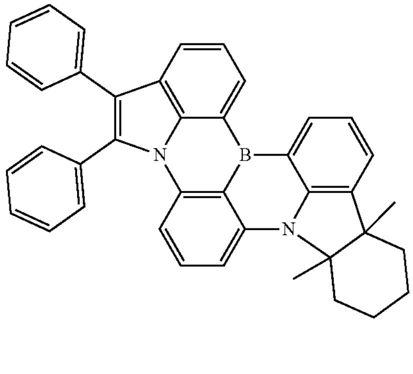
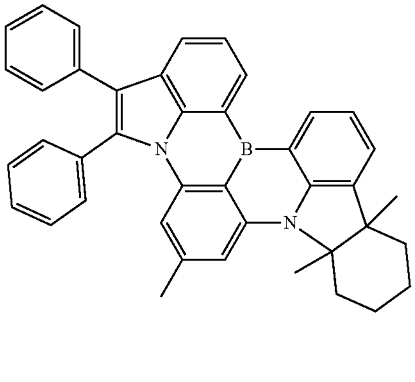
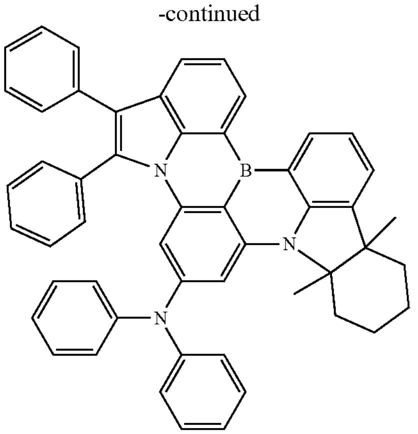
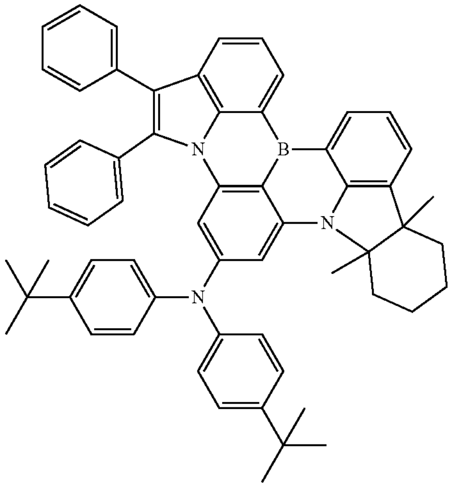
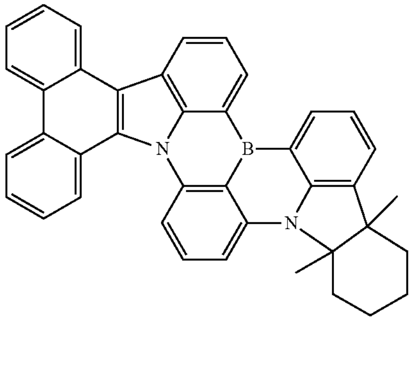
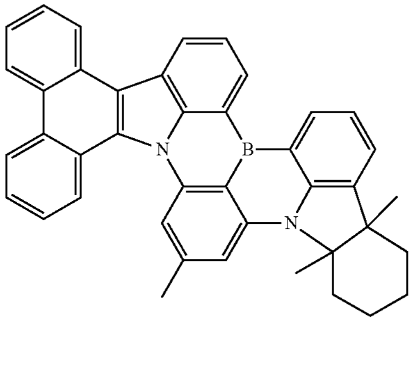

-continued
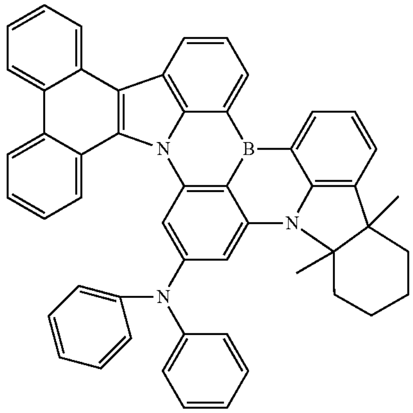
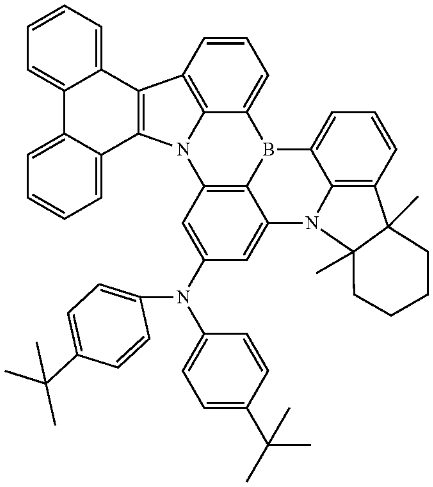
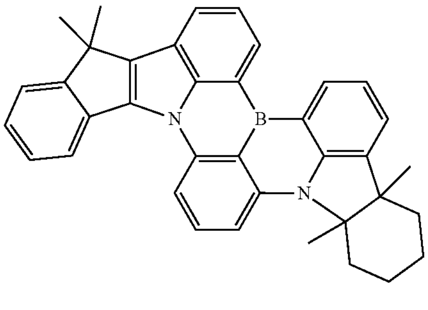
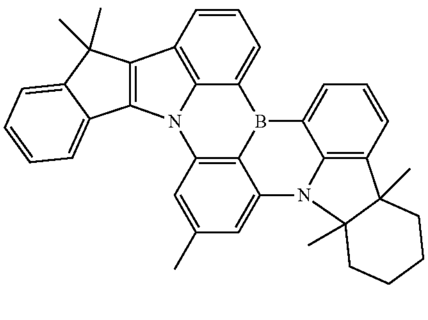
-continued
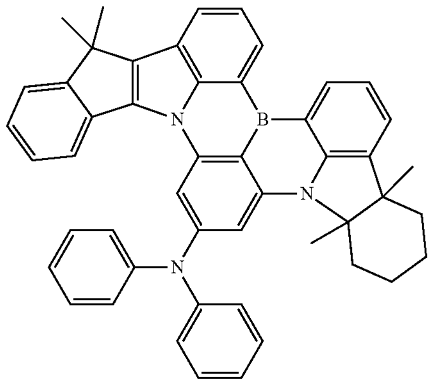
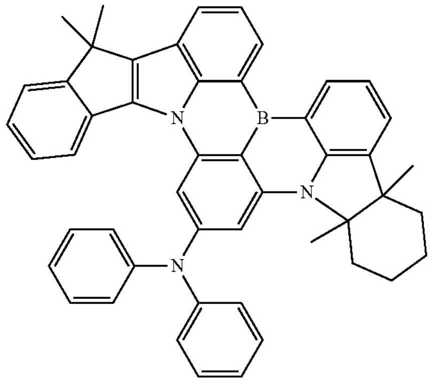
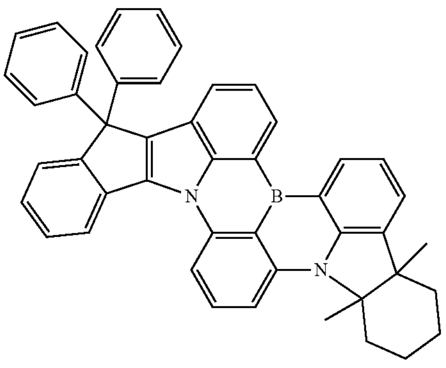
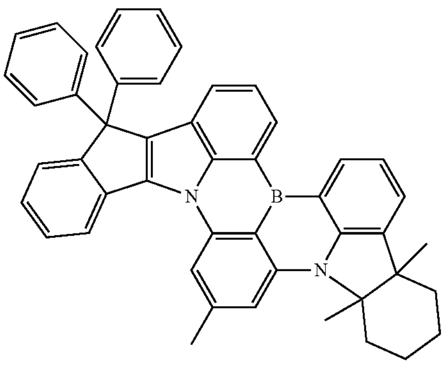

-continued
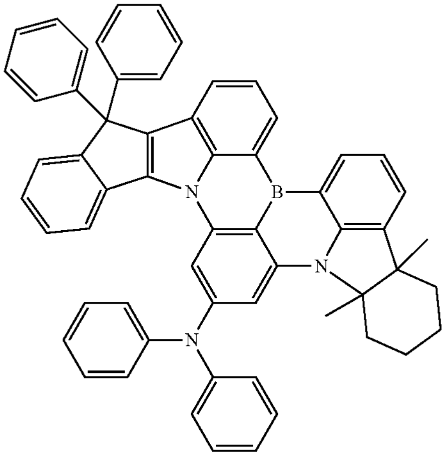
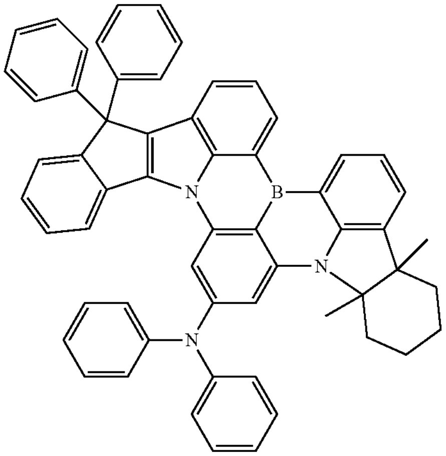
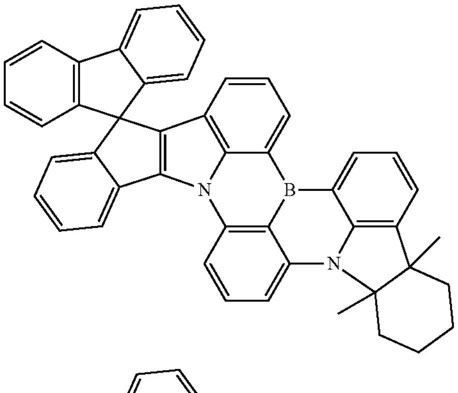
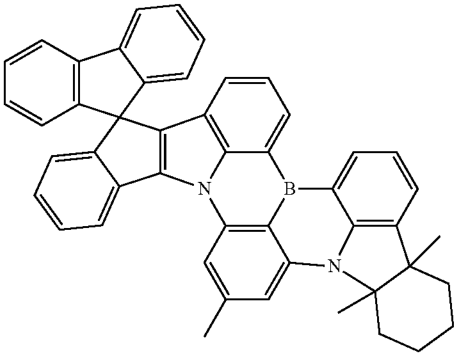
-continued
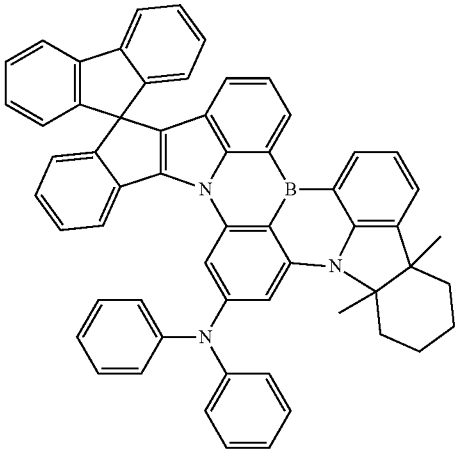
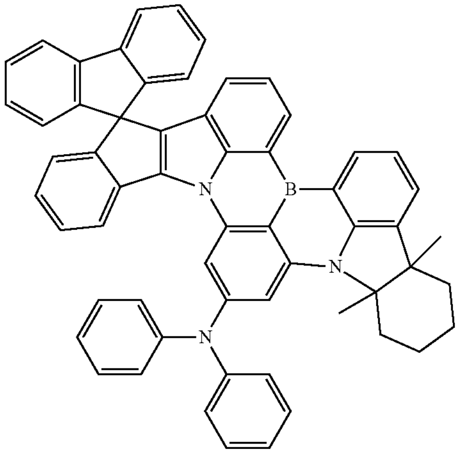
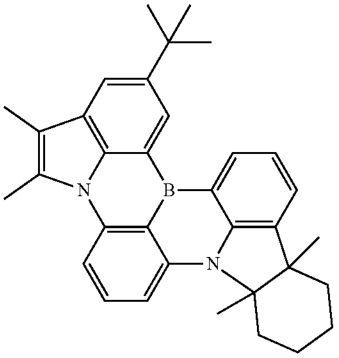
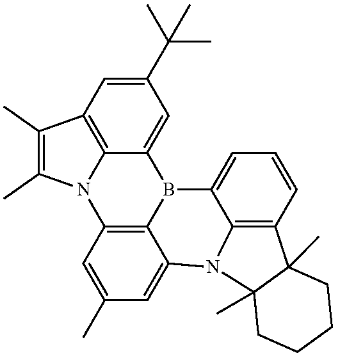

-continued
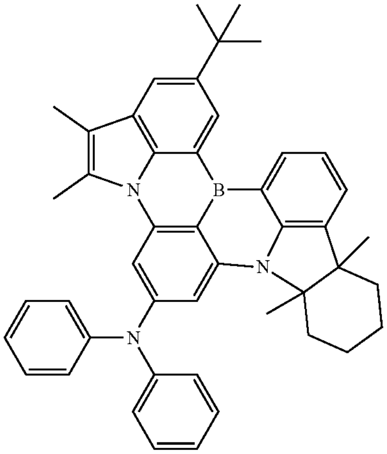
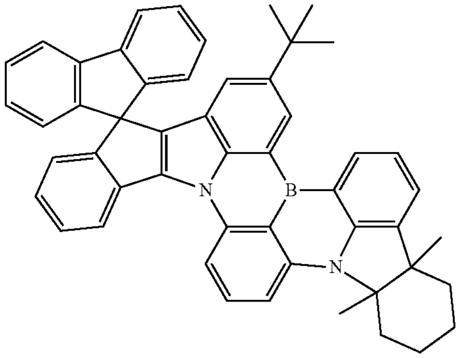
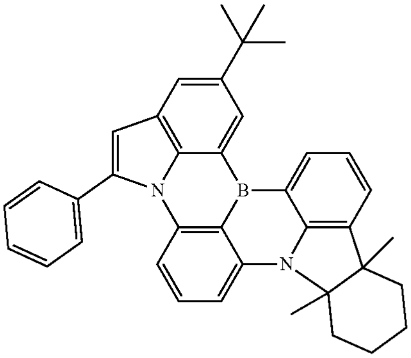
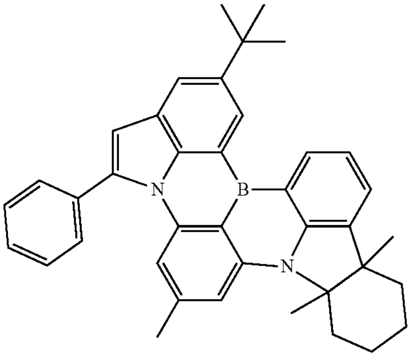
-continued
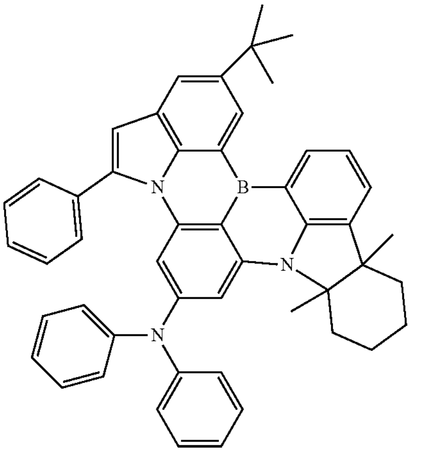
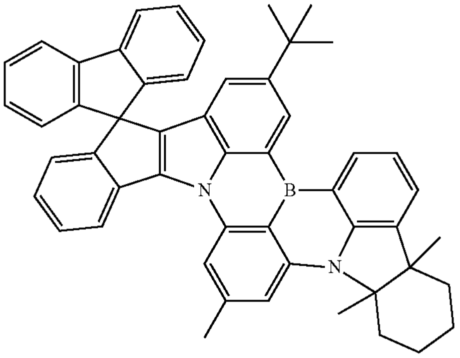
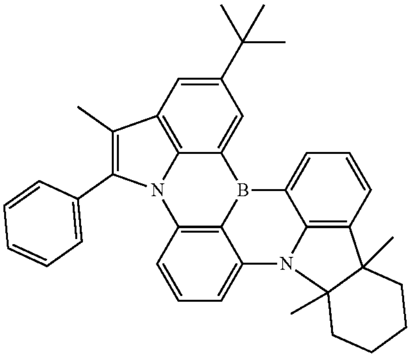
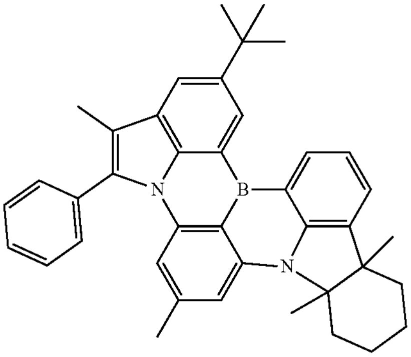

-continued
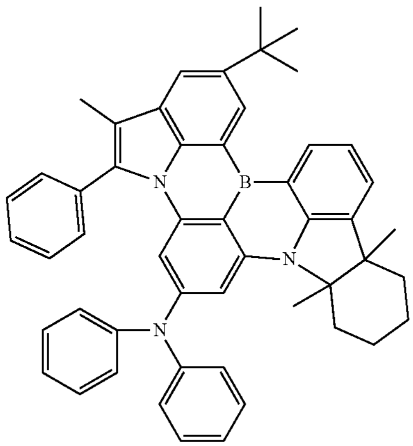
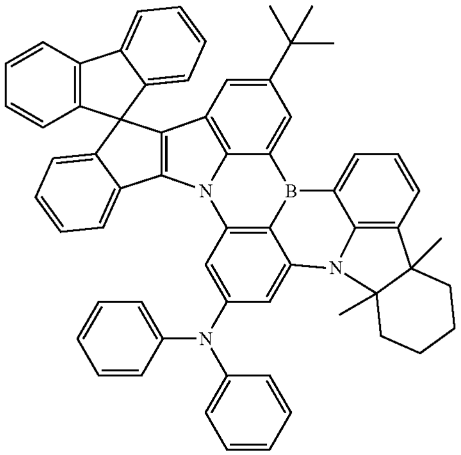
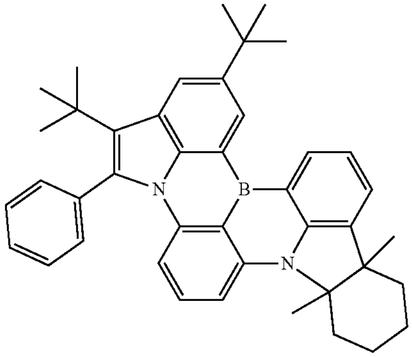
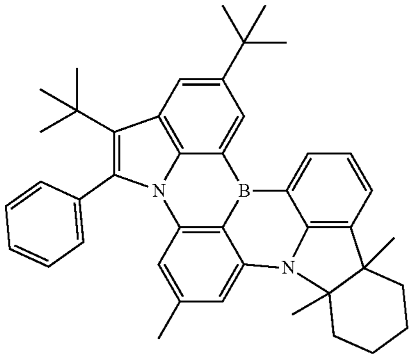
-continued
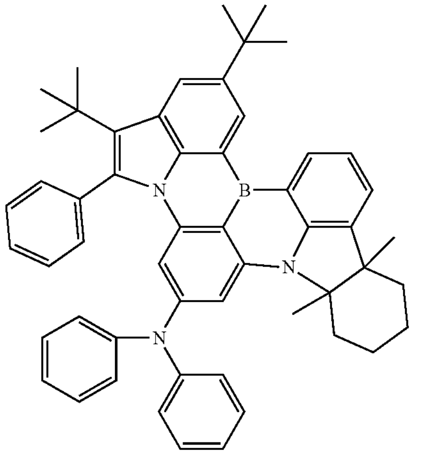
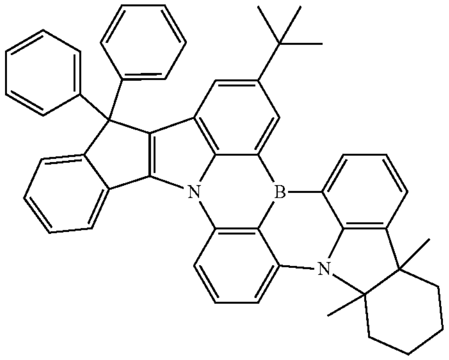
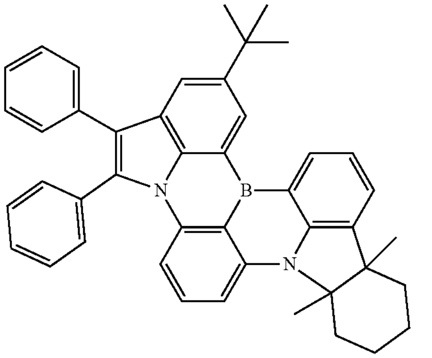
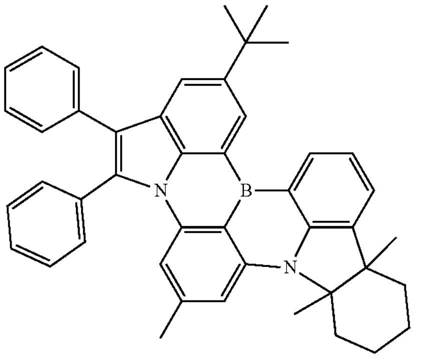

-continued
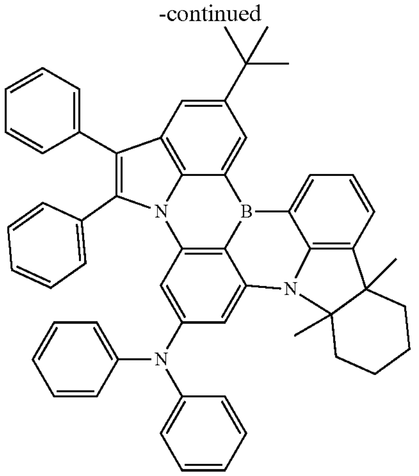
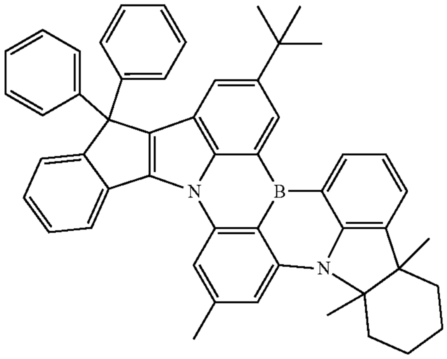
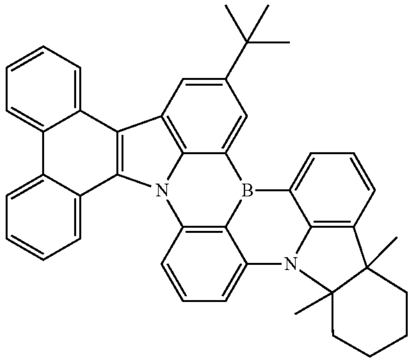
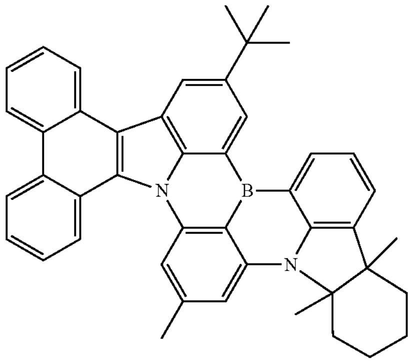
-continued
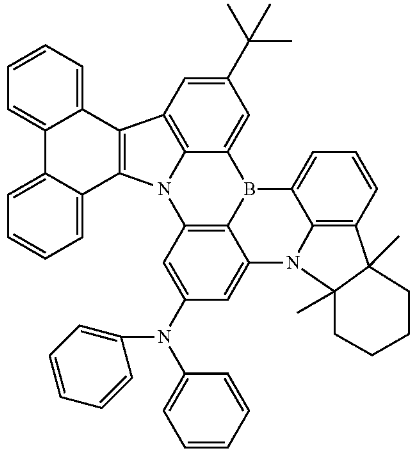
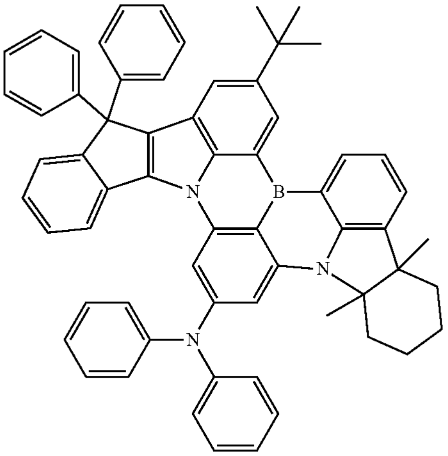
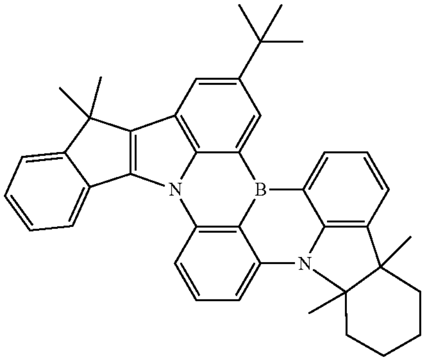
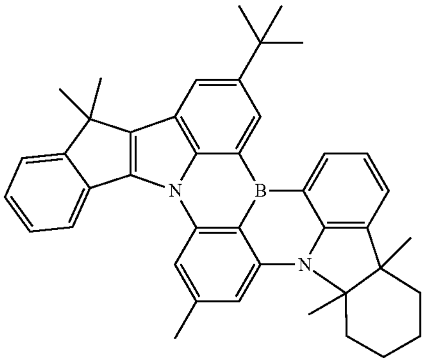

-continued
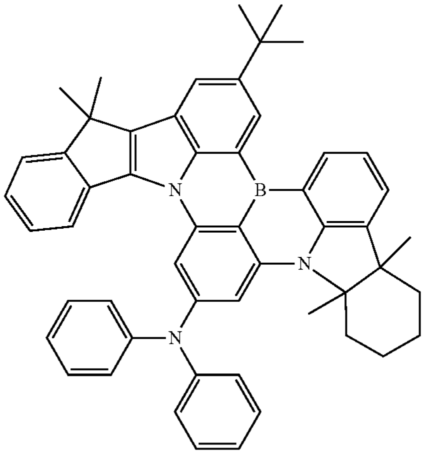
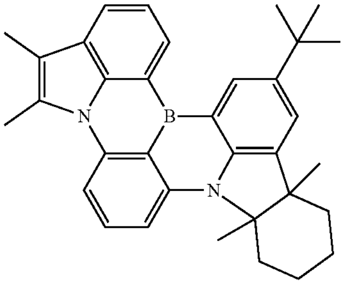
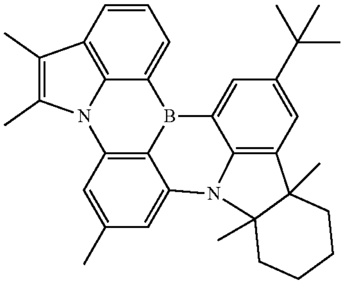
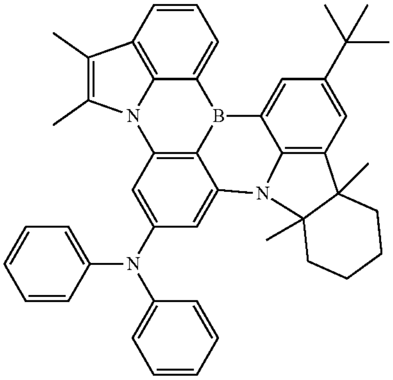
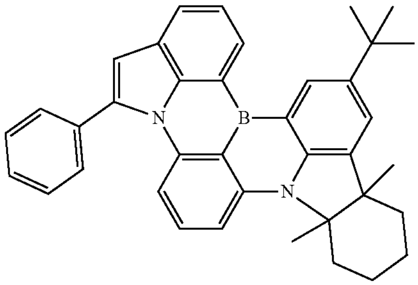
-continued
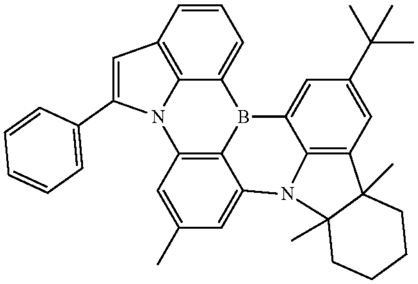
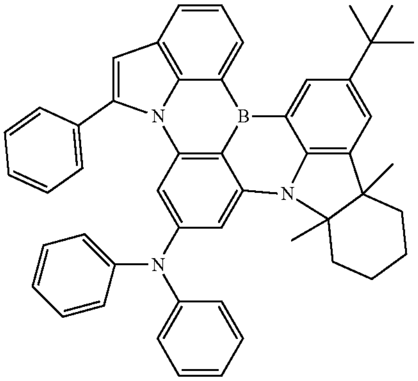
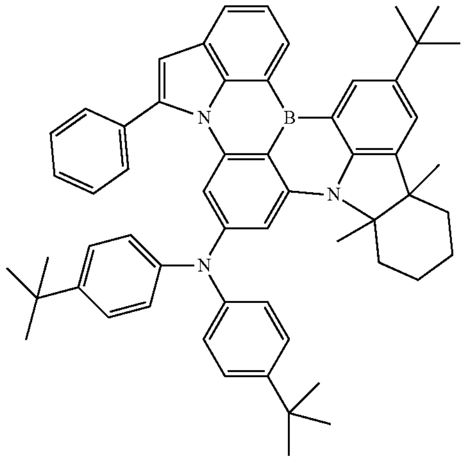
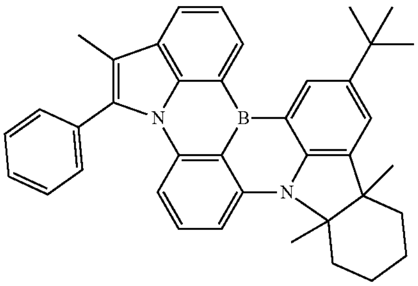
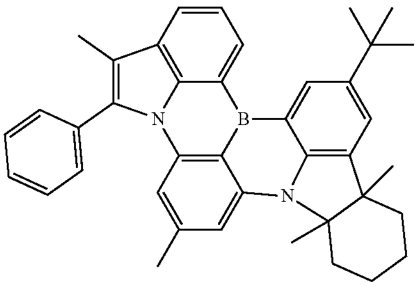

-continued
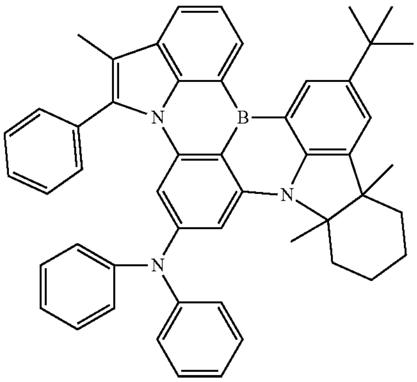
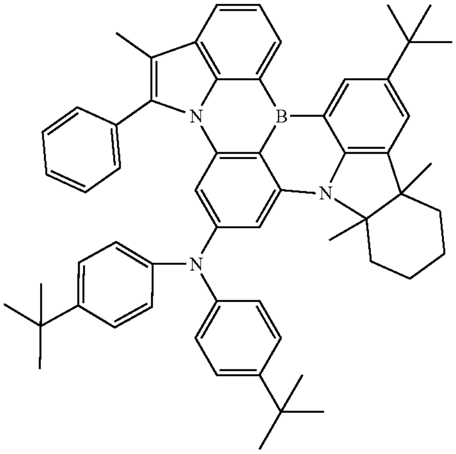
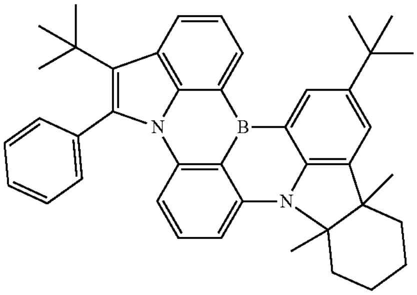
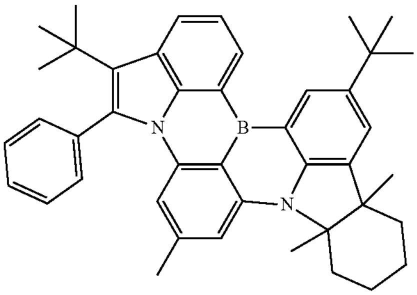
-continued
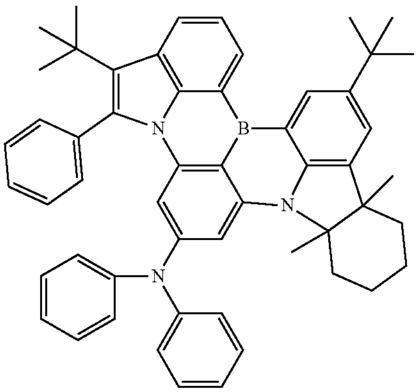
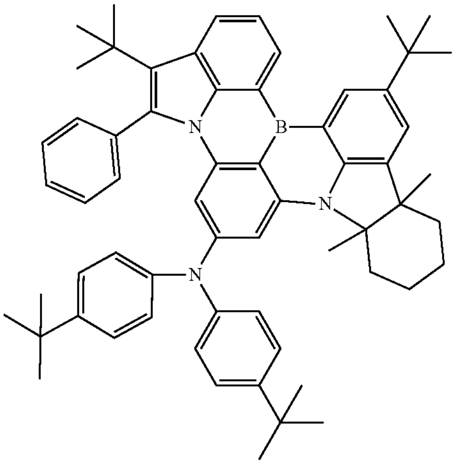
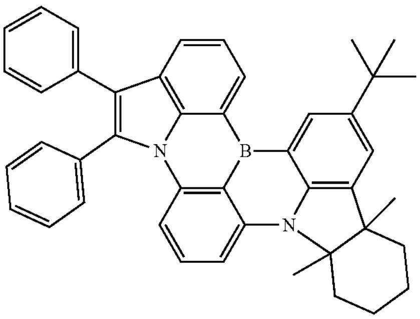
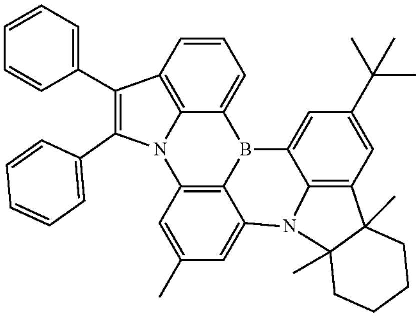

-continued
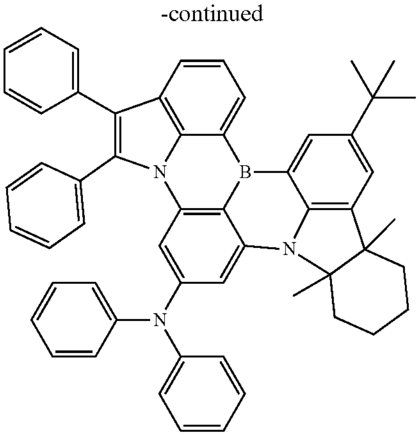
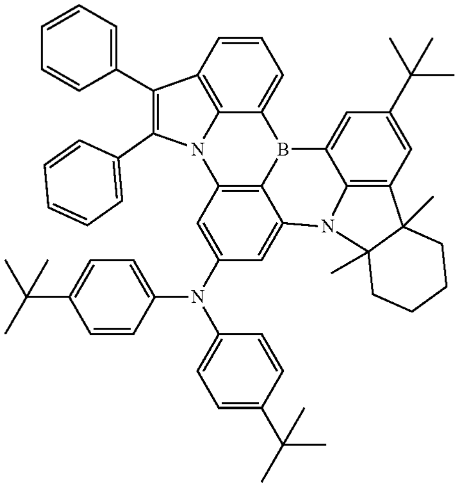
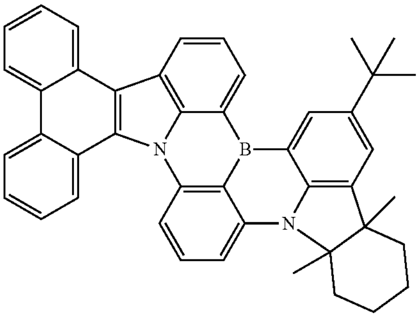
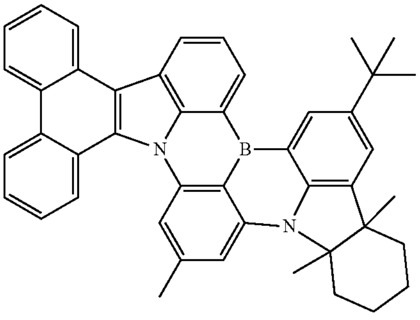
-continued
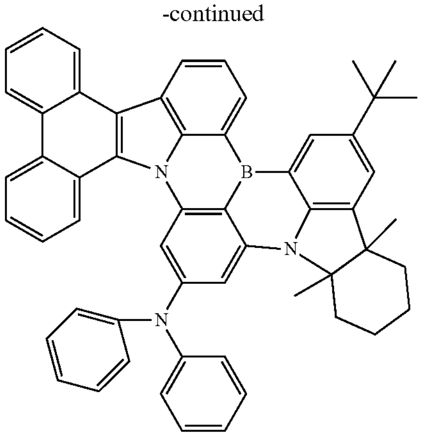
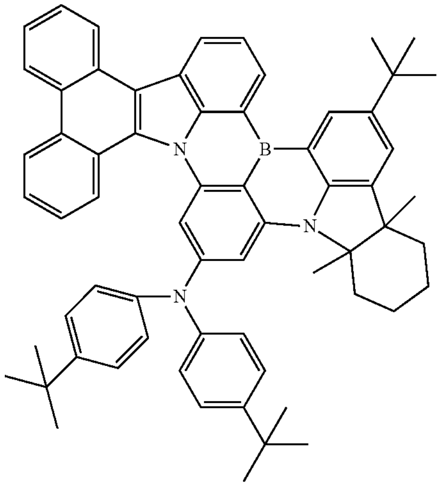
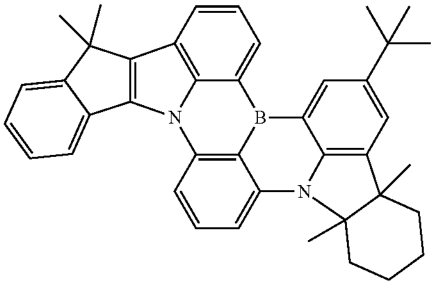
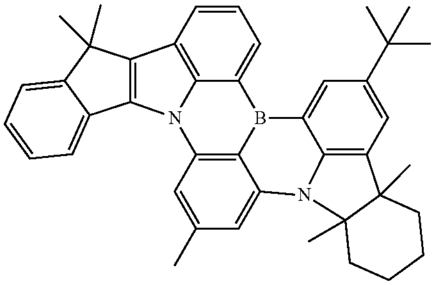

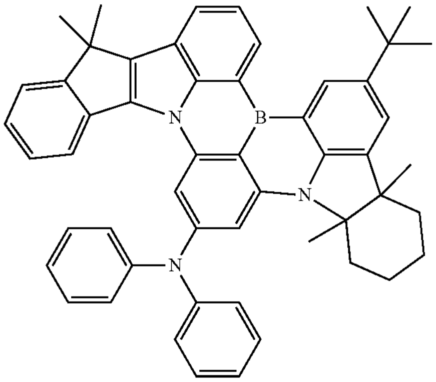
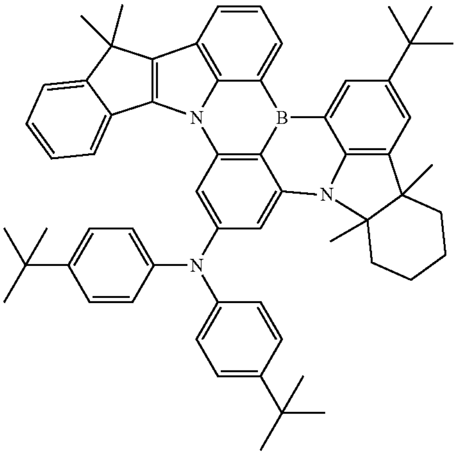
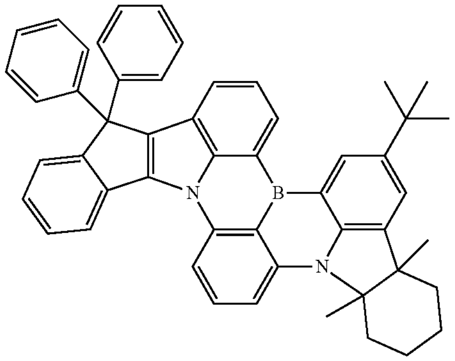
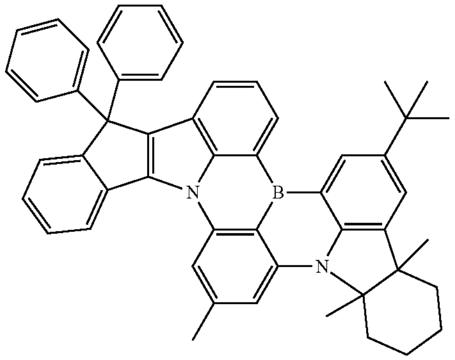
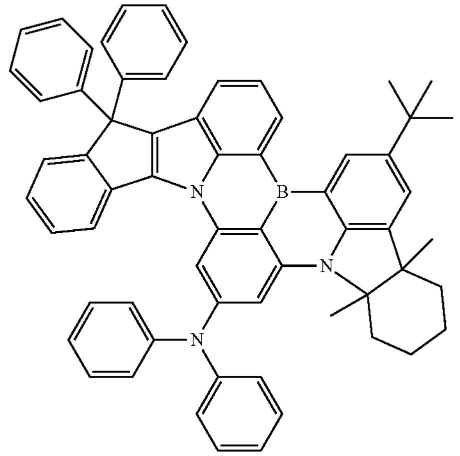
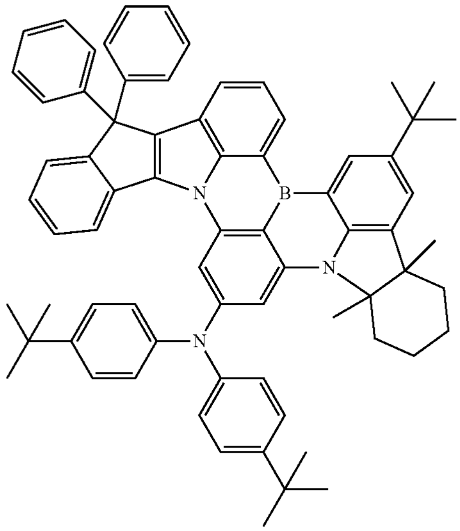
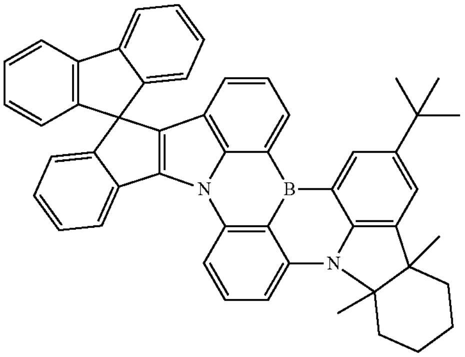
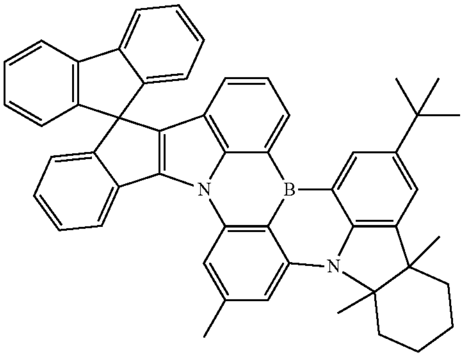

-continued
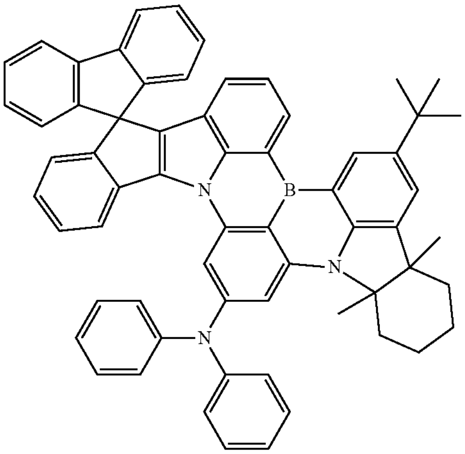
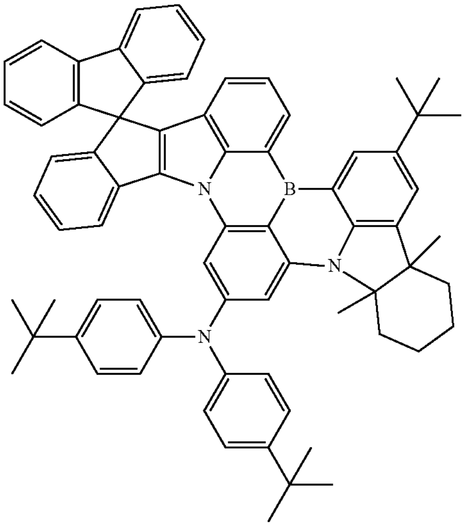
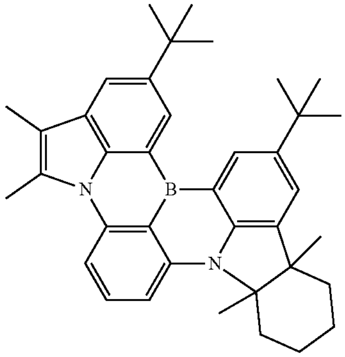
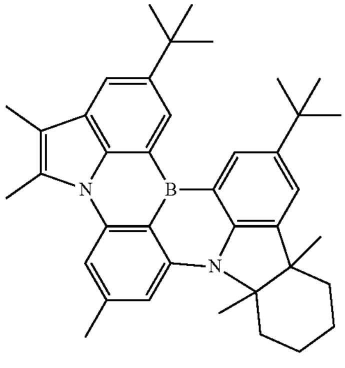
-continued
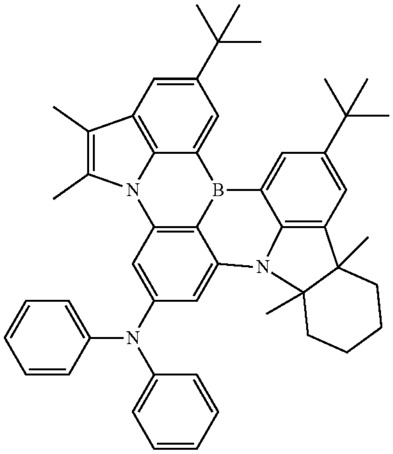
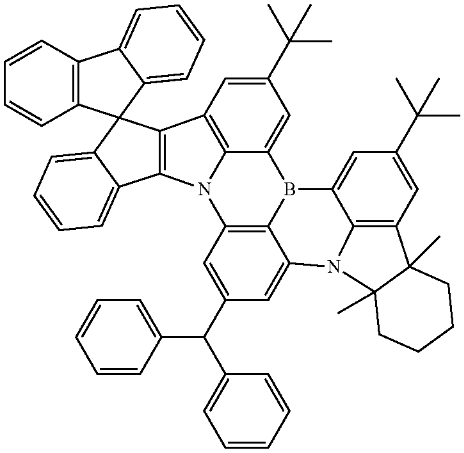
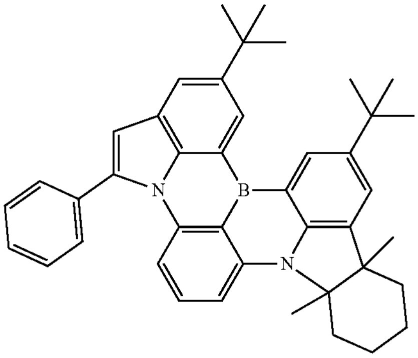
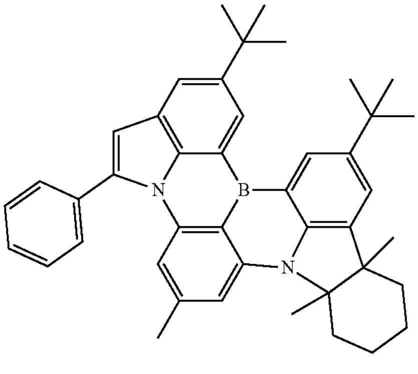

-continued
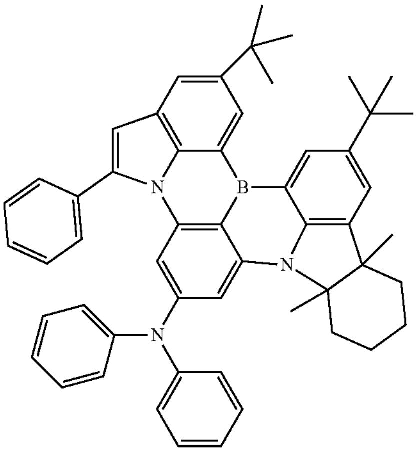
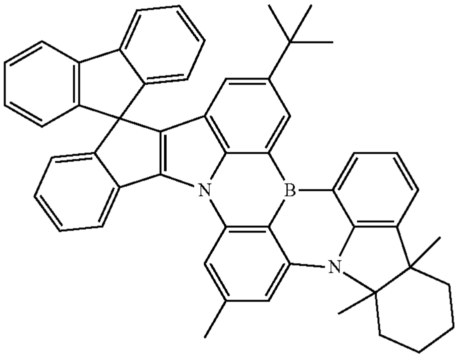
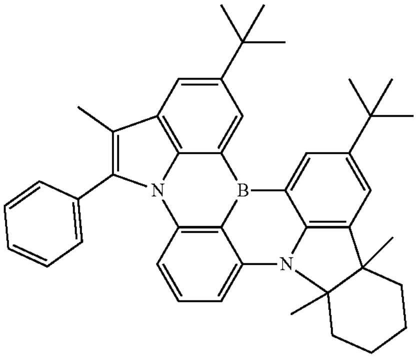
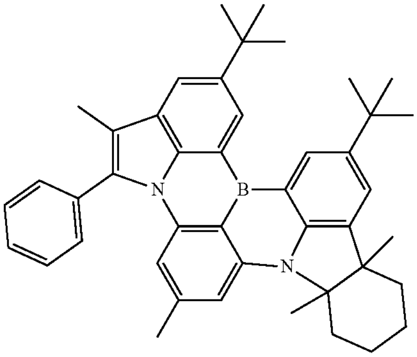
-continued
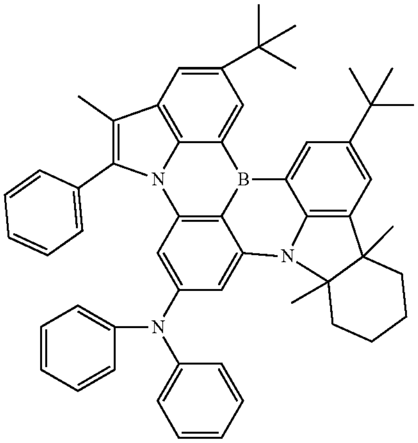
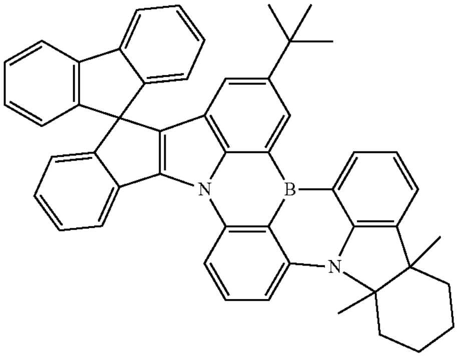
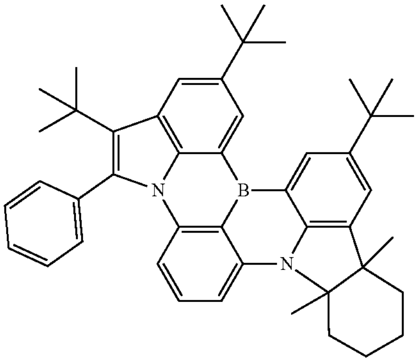
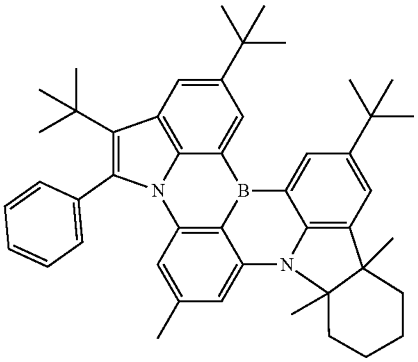

-continued
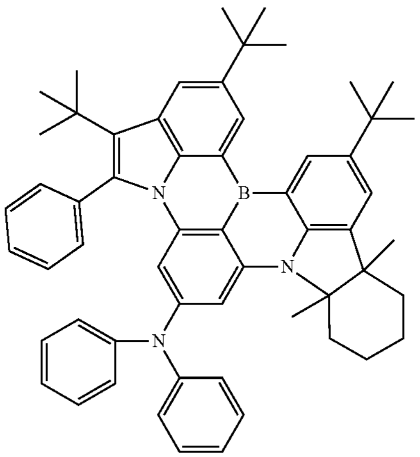
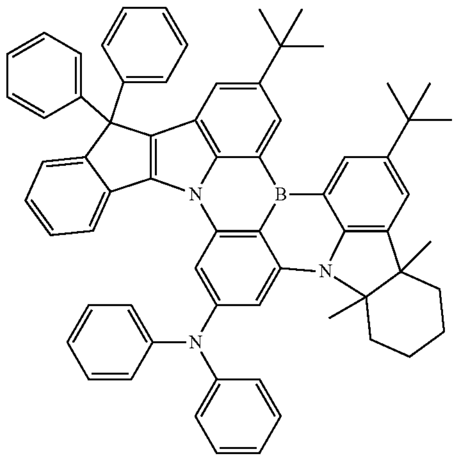
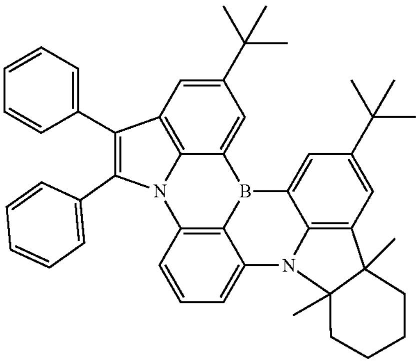
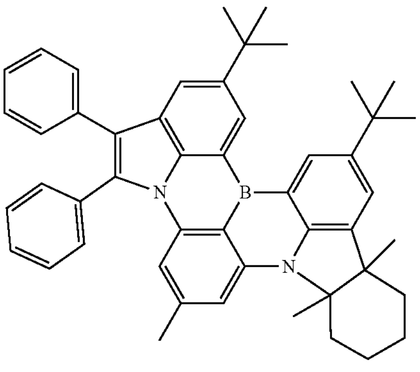
-continued
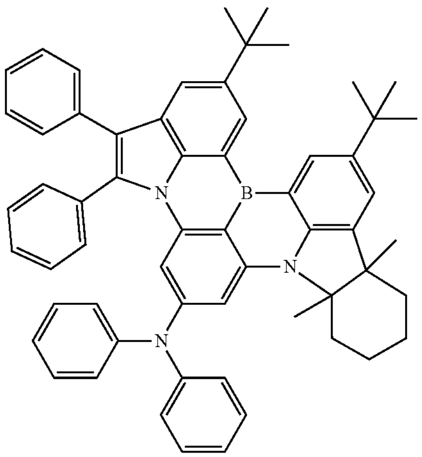
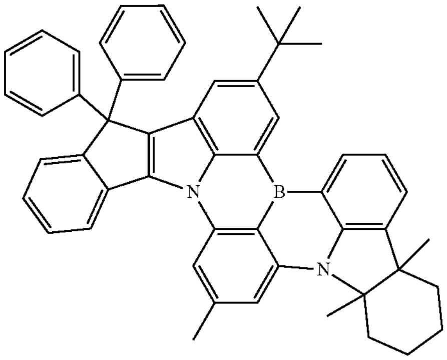
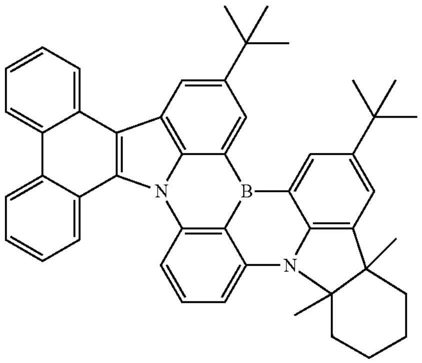
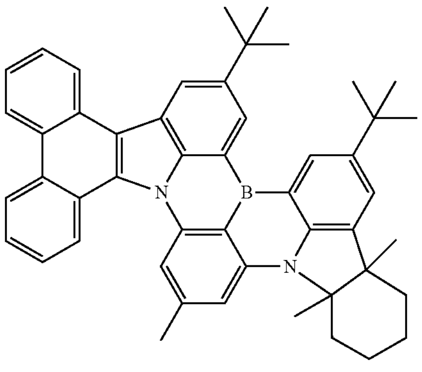

-continued
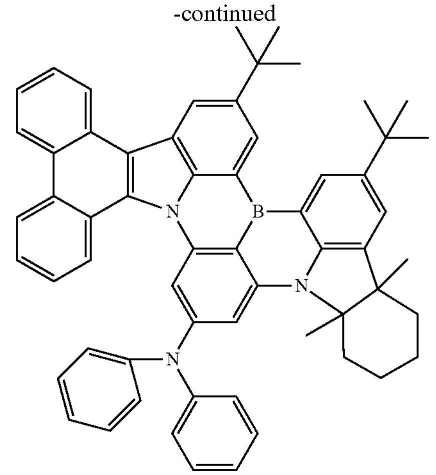
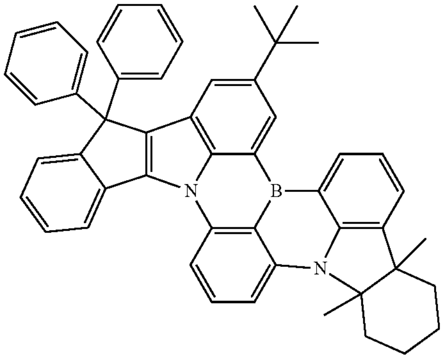
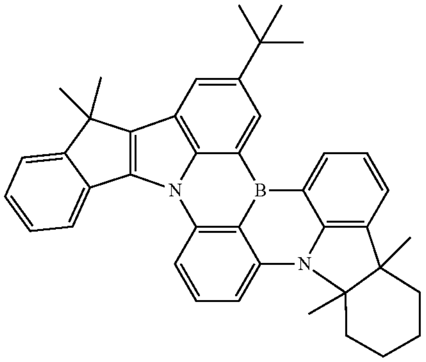
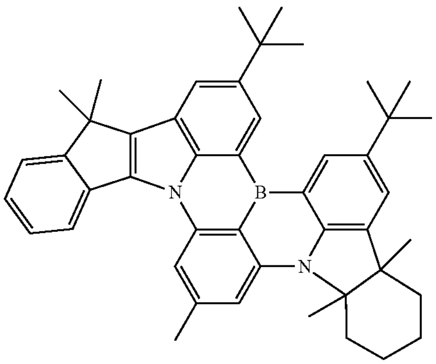
-continued
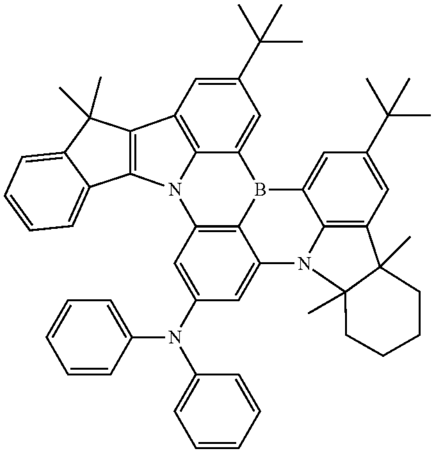
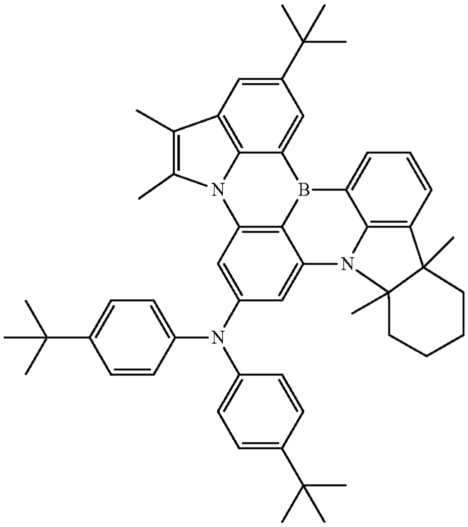
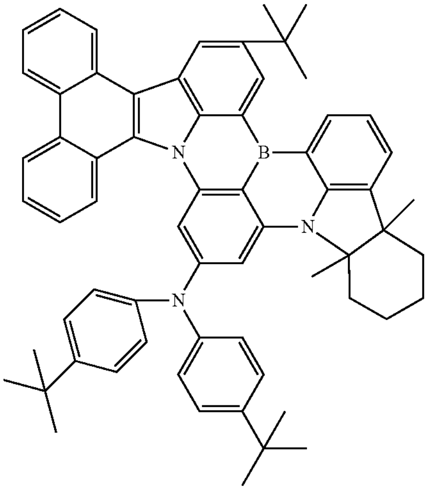

-continued
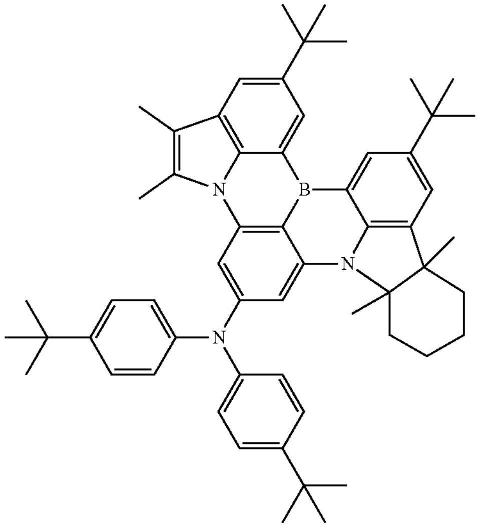
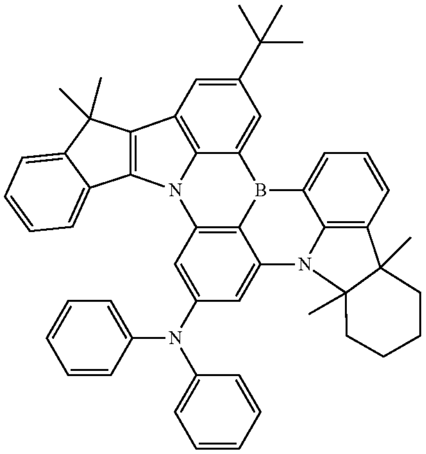
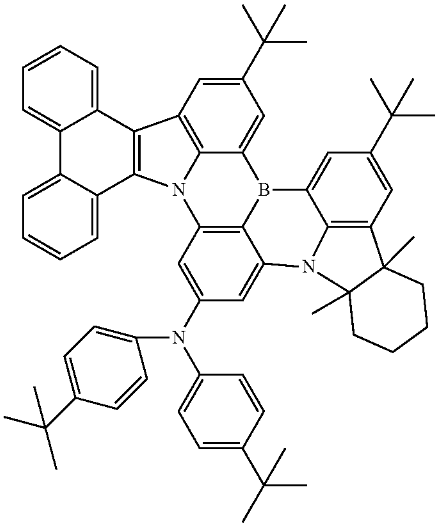
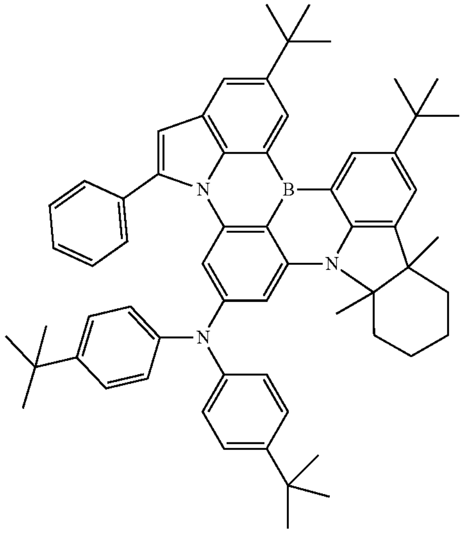
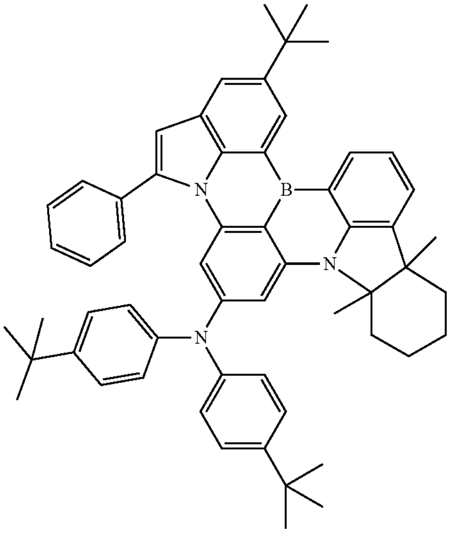
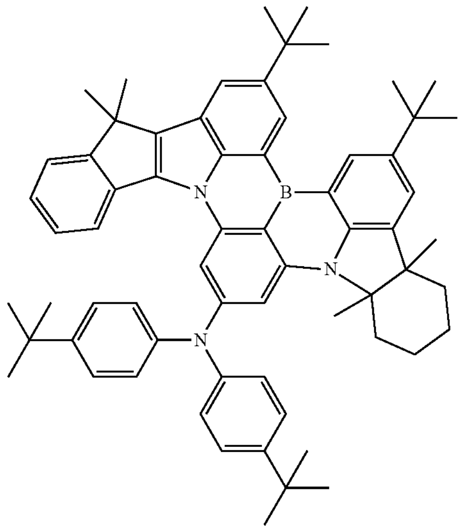

-continued
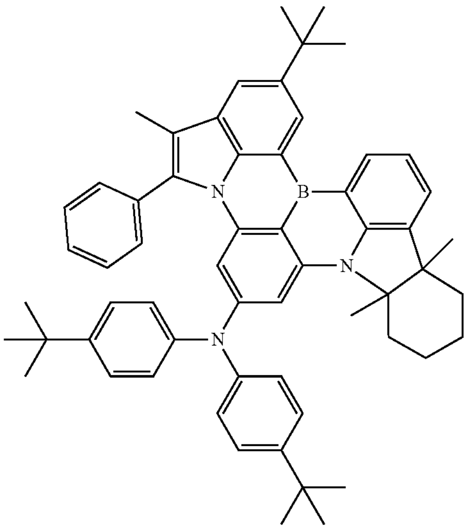
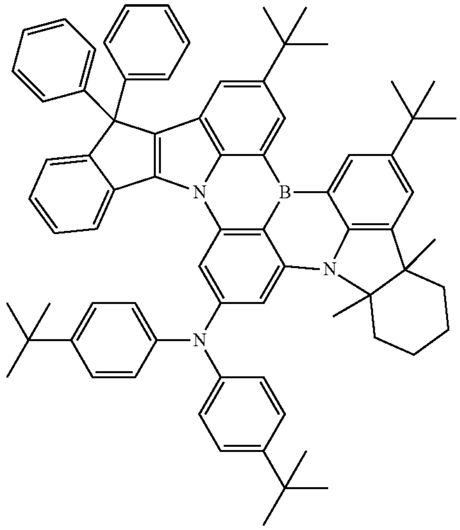
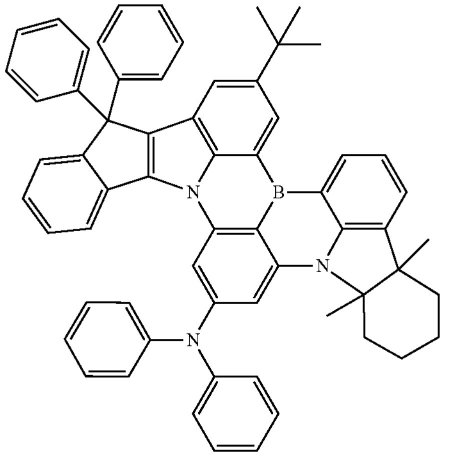
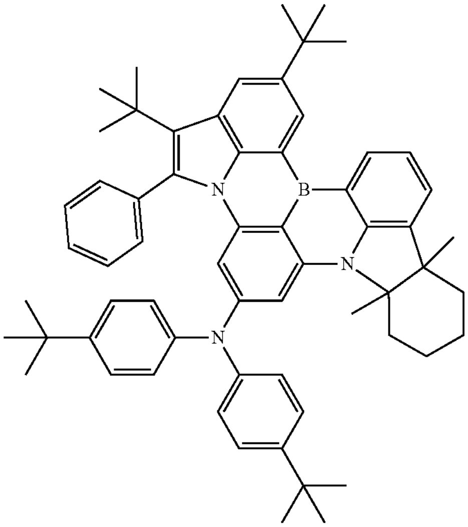
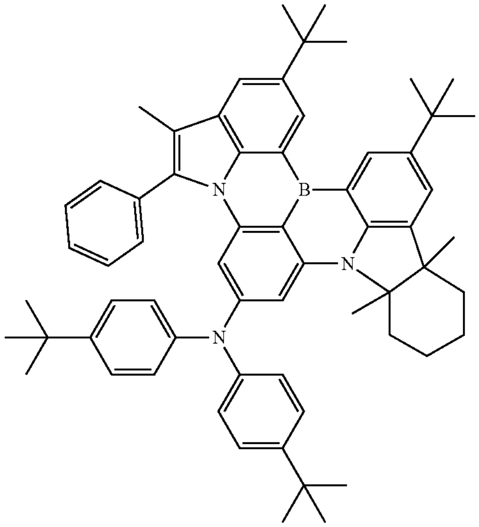
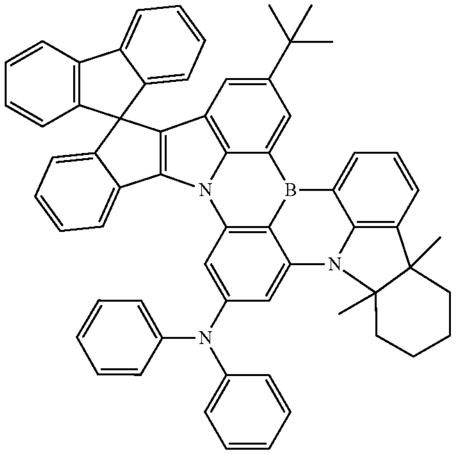
-continued -continued
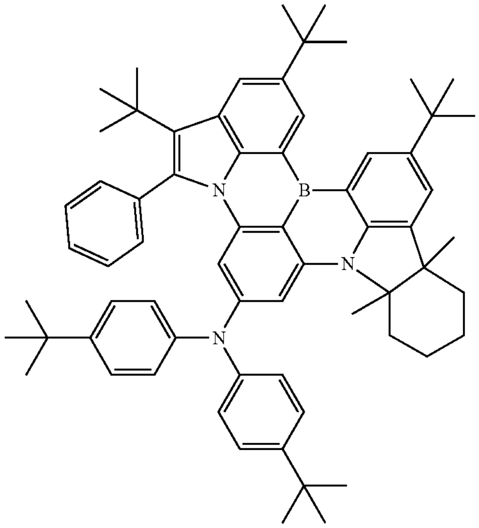
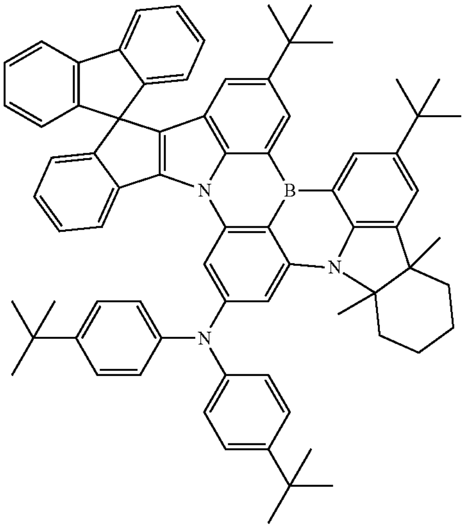
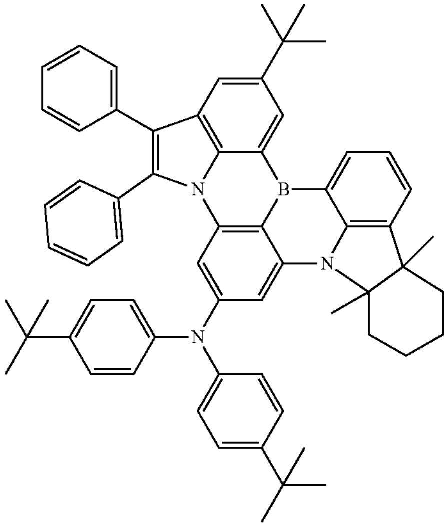
-continued
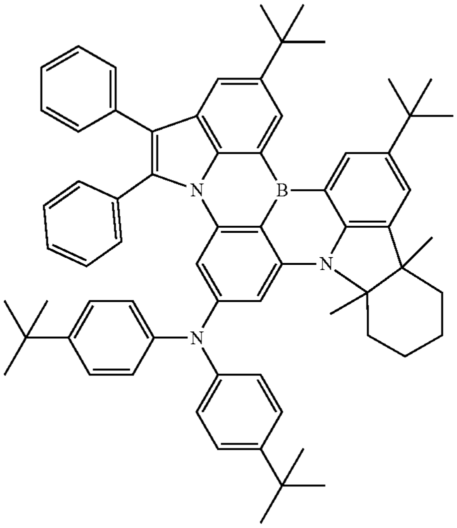
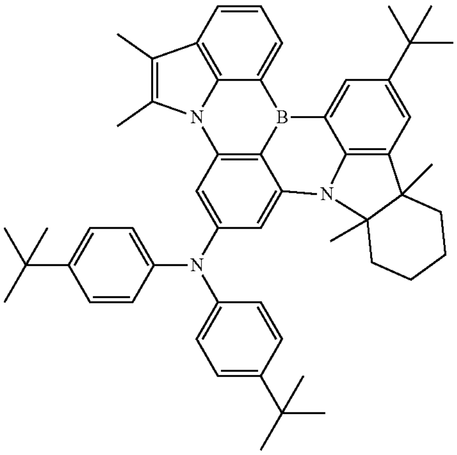
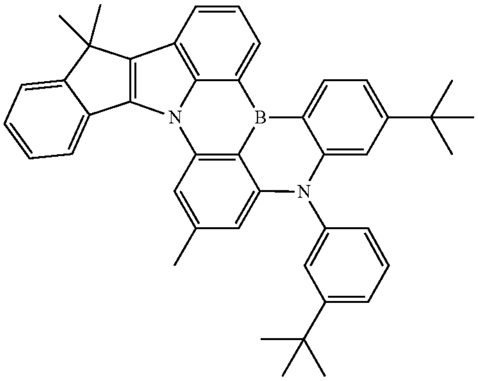

-continued
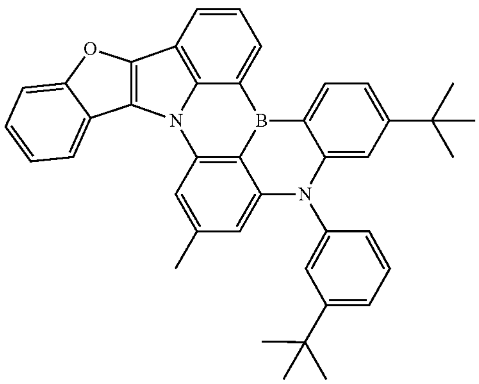
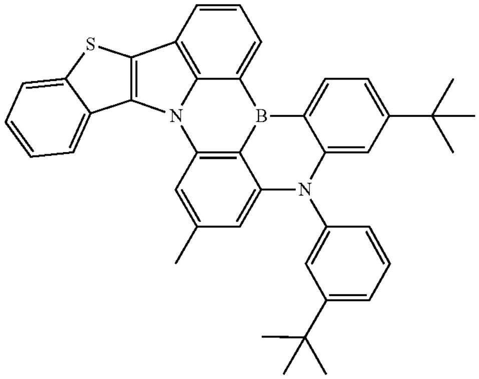
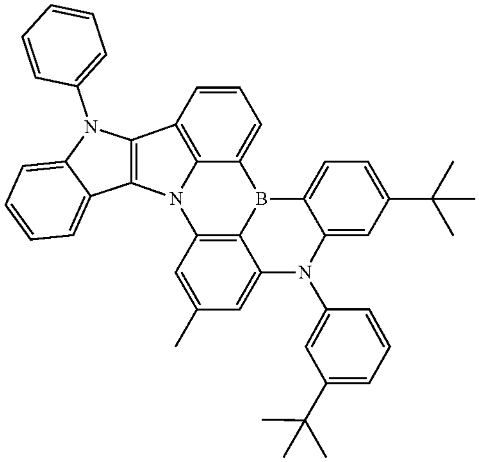
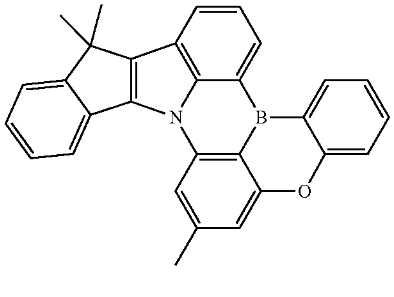
-continued
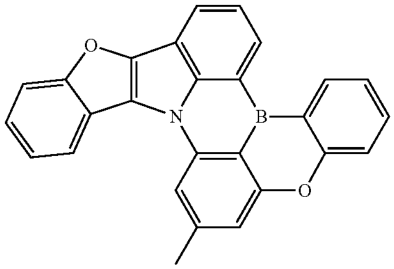
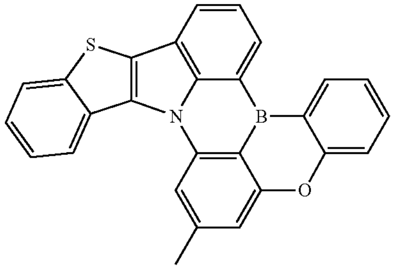
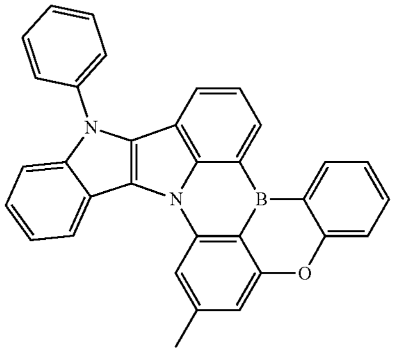
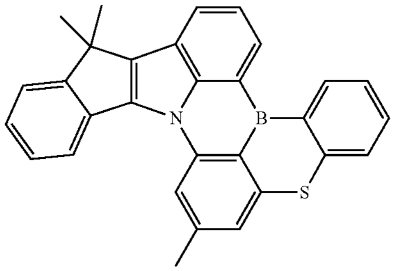
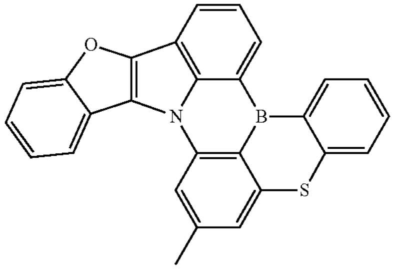
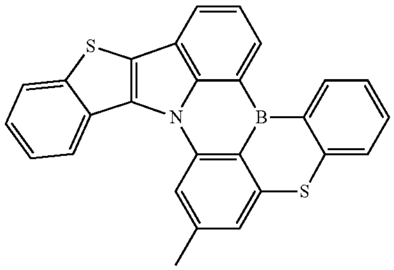

-continued
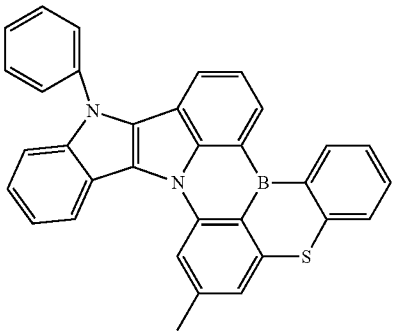
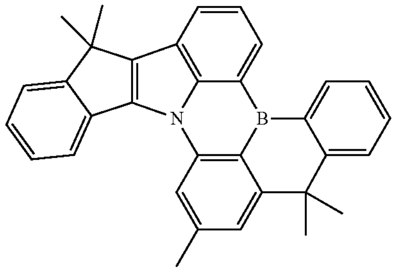
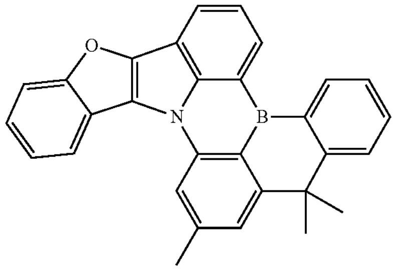
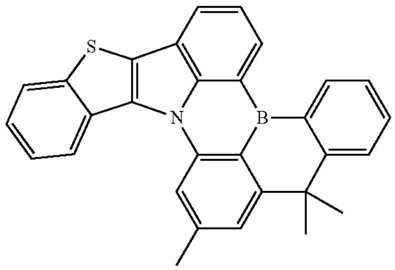
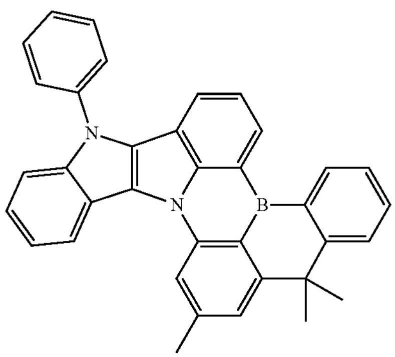
-continued
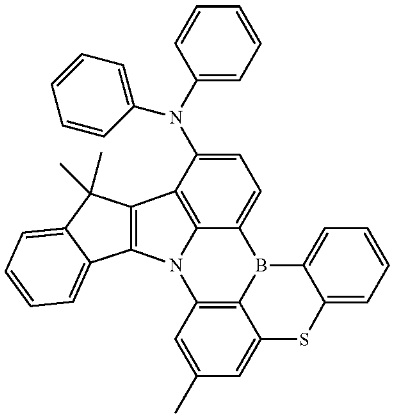
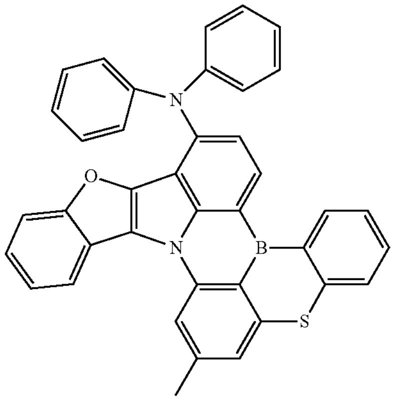
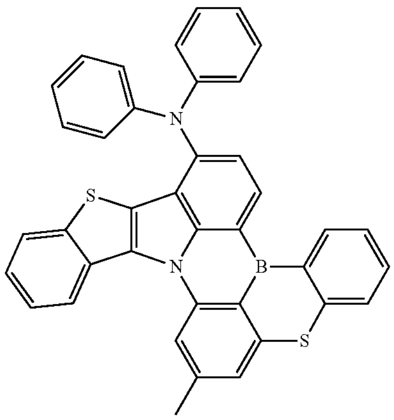

-continued
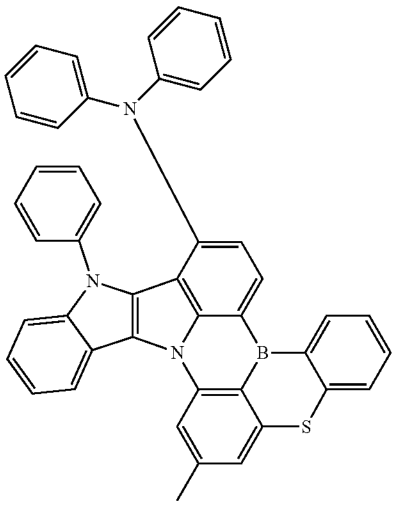
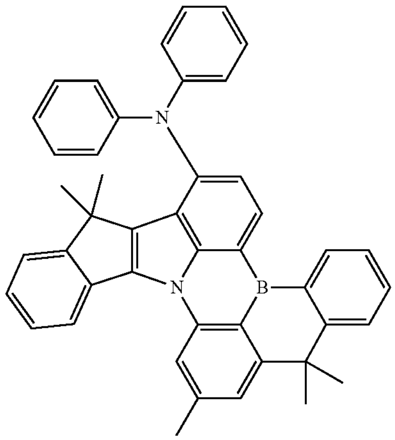
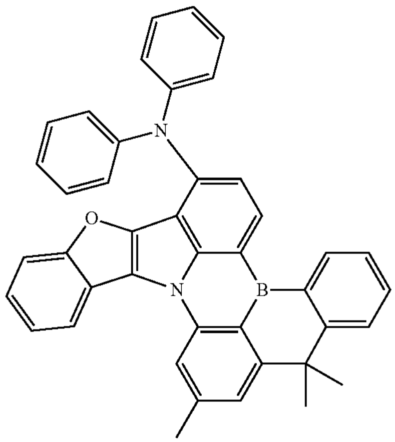
-continued
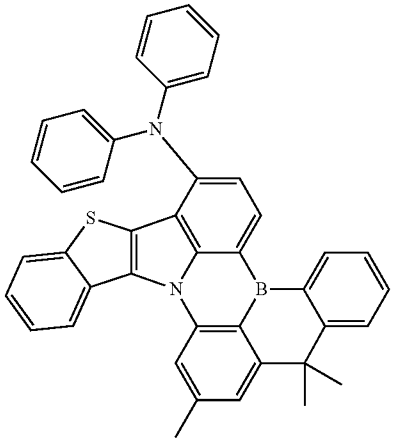
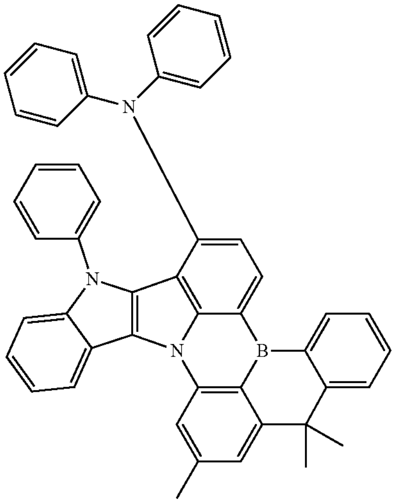
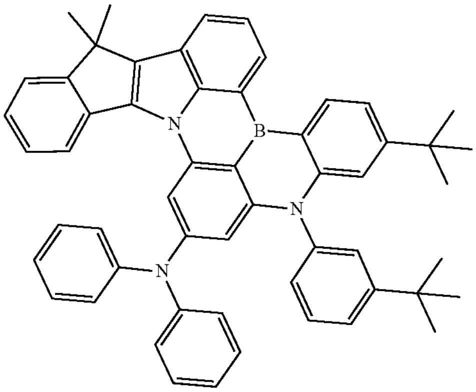
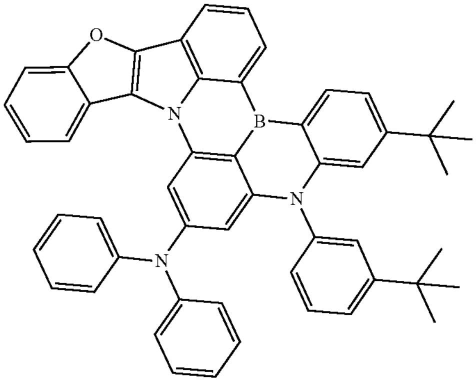

-continued
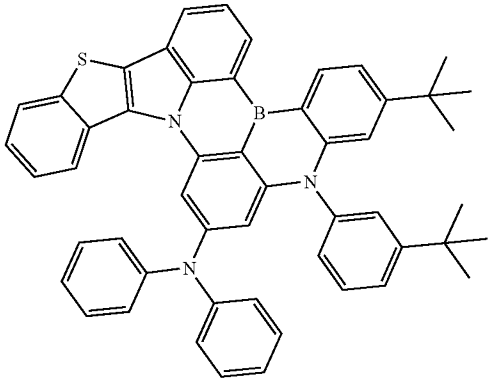
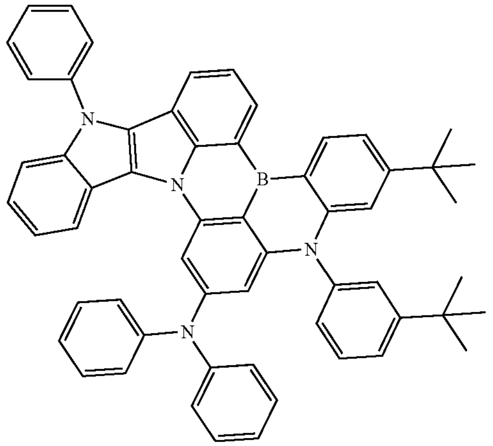
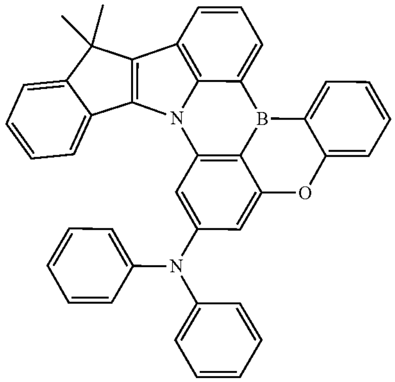
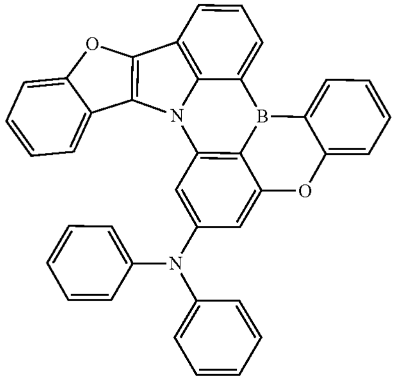
-continued
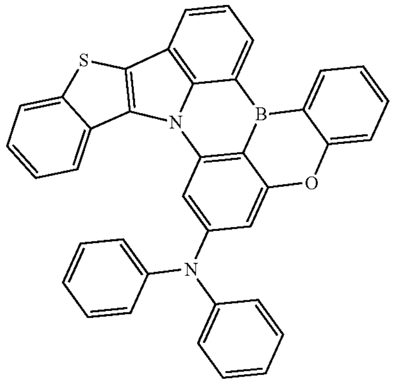
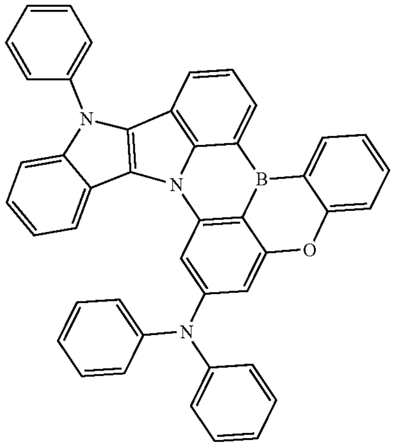
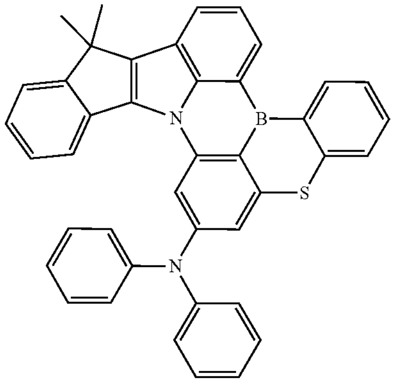
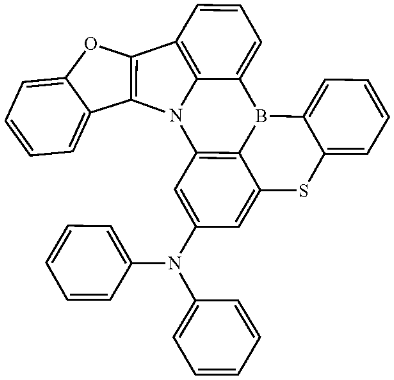

-continued
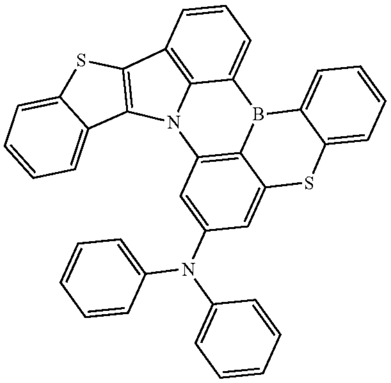
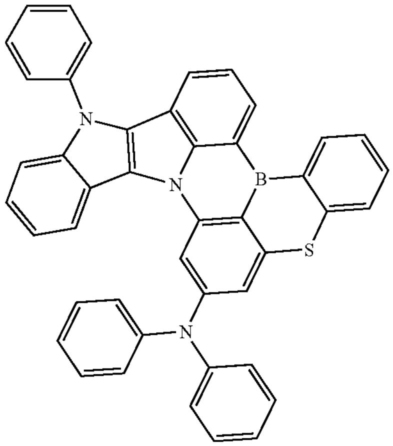
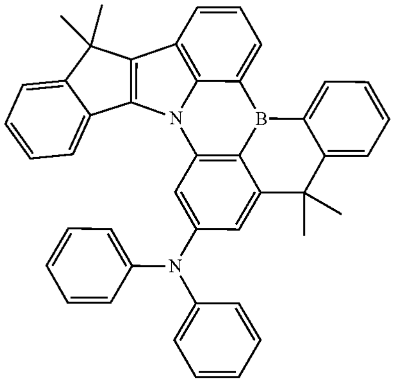
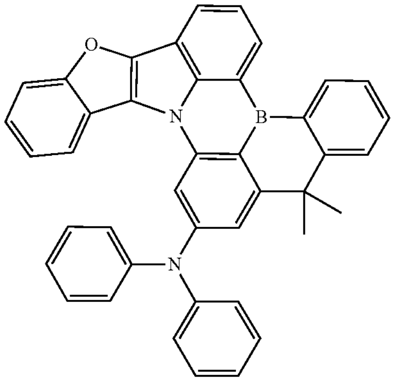
-continued
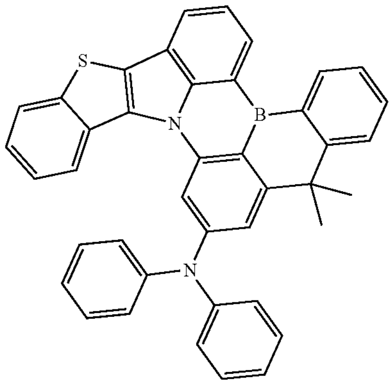
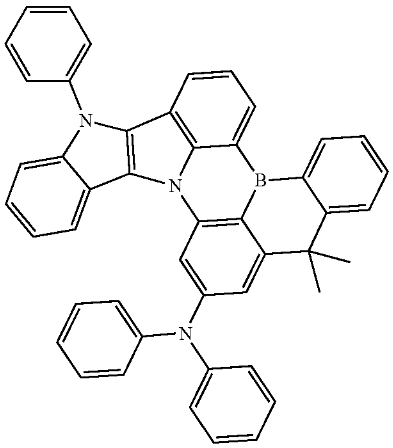
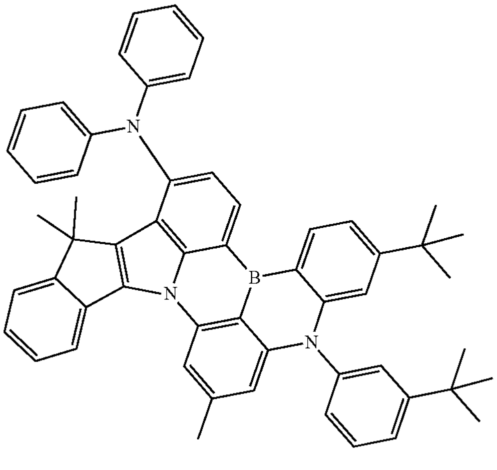

-continued
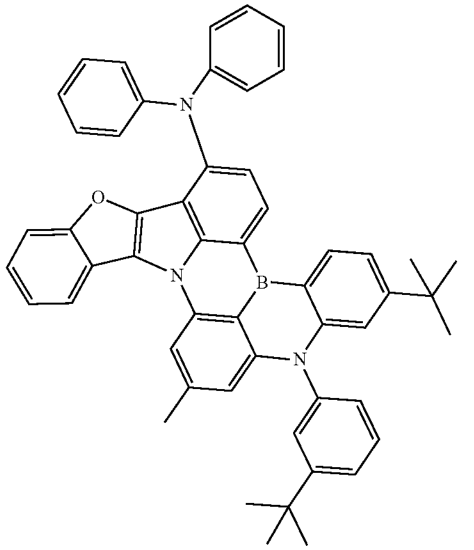
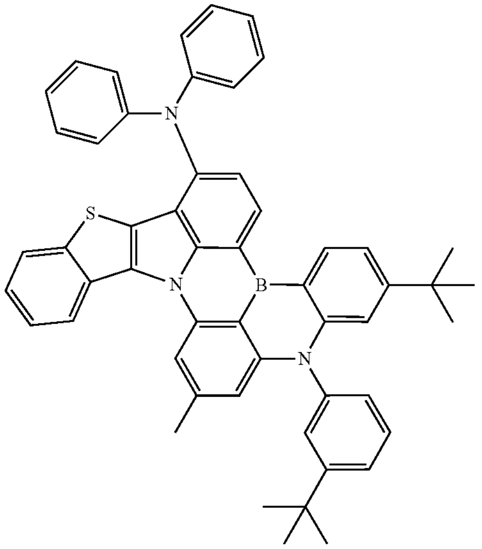
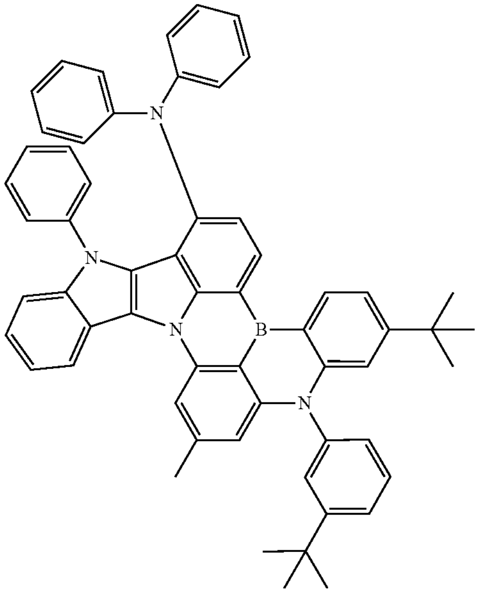
-continued
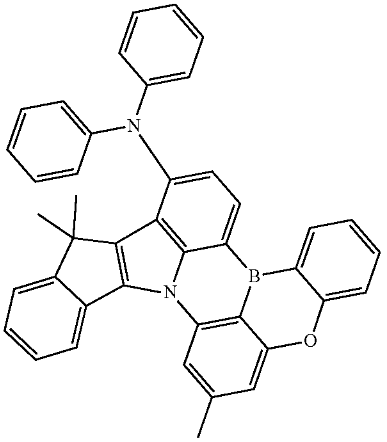
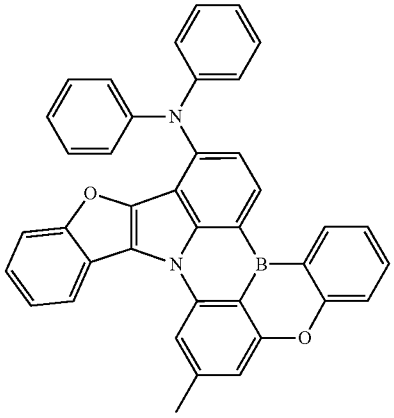
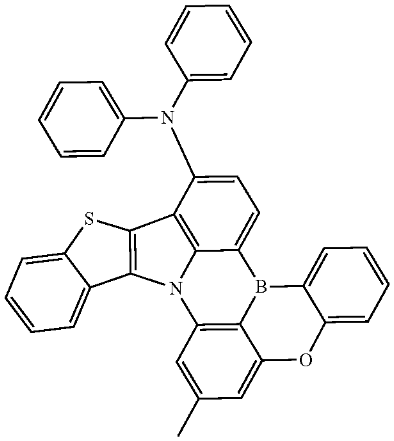

-continued
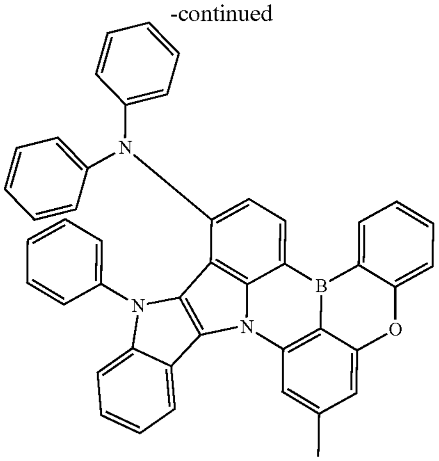
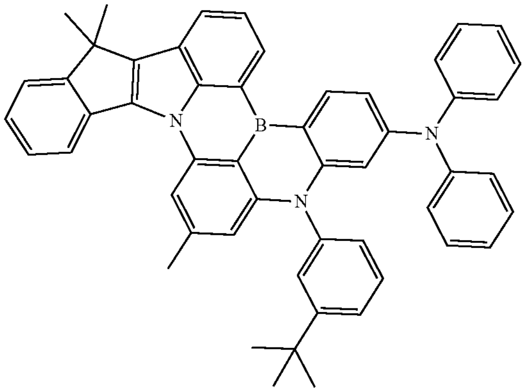
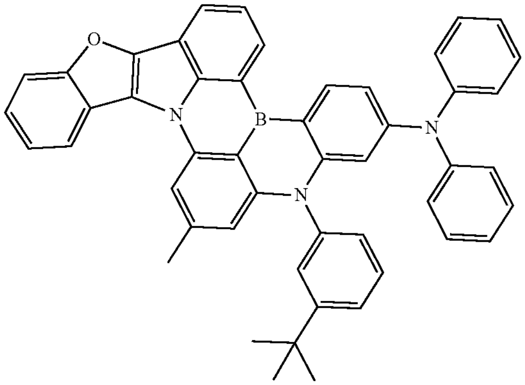
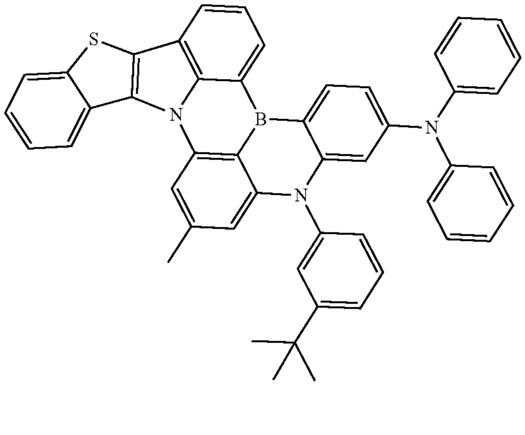
-continued
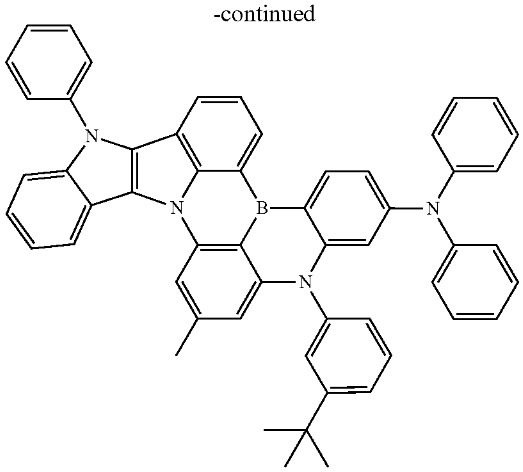
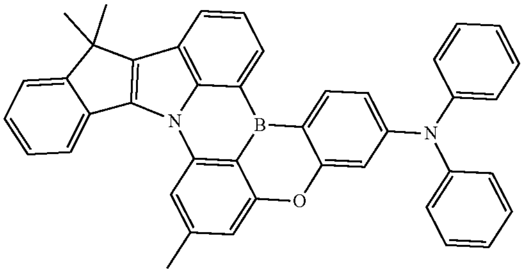
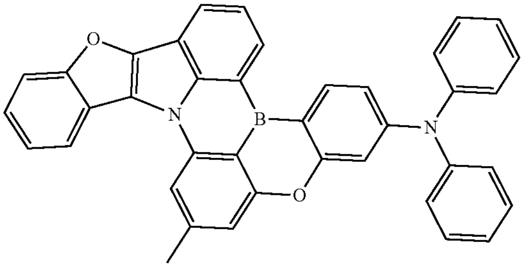
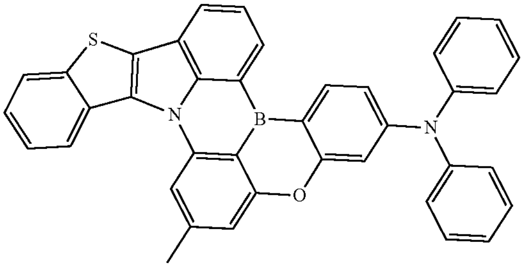
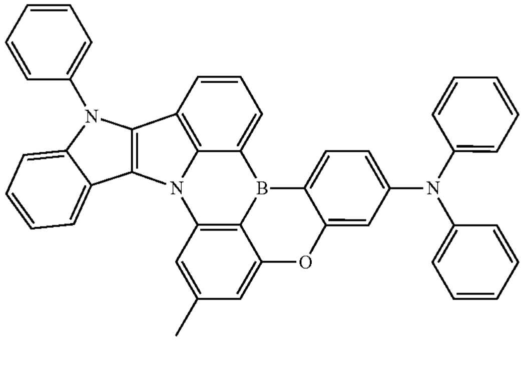

-continued
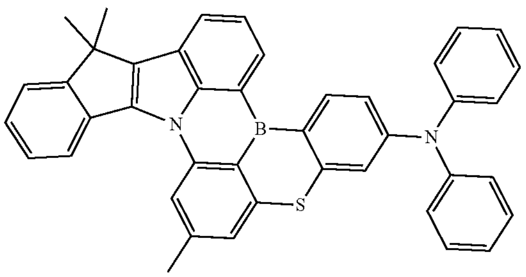
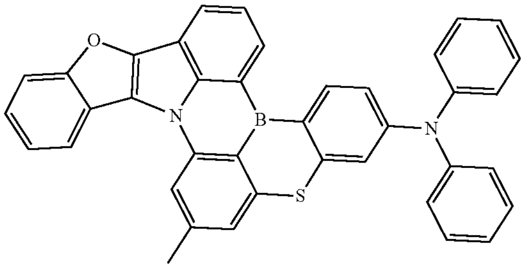
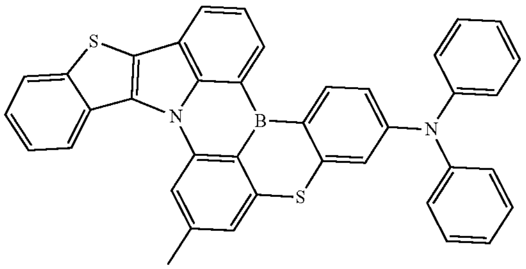
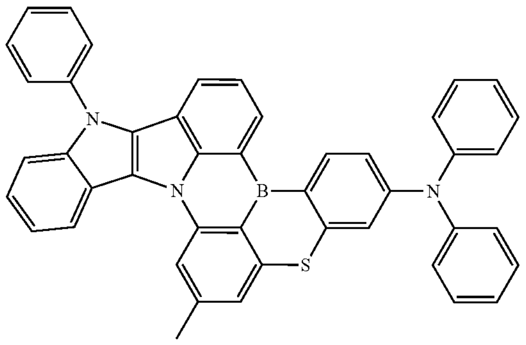
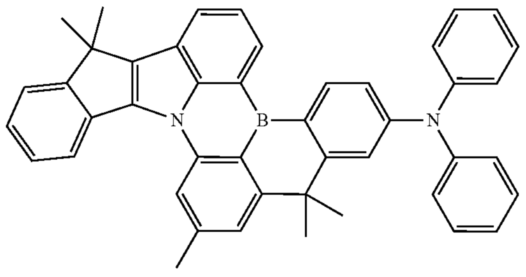
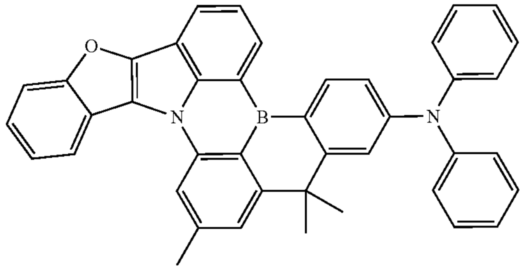
-continued
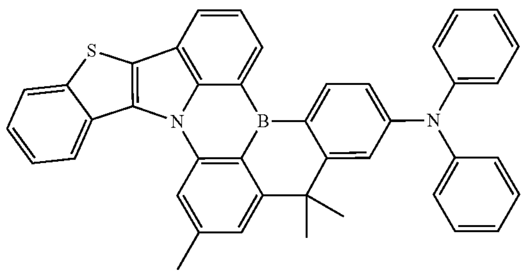
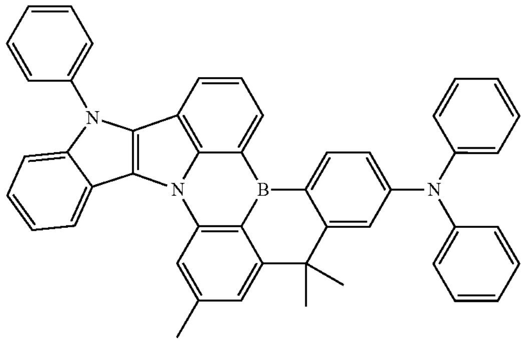
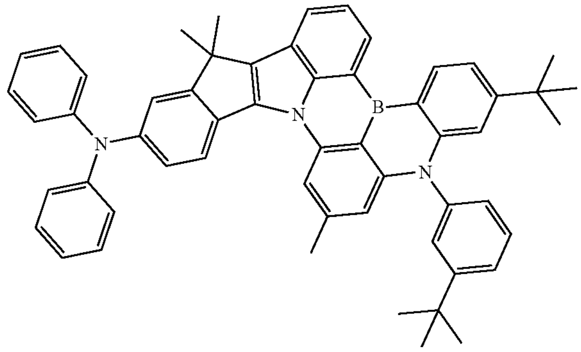
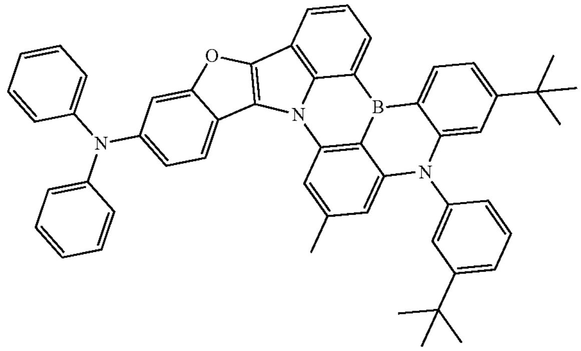
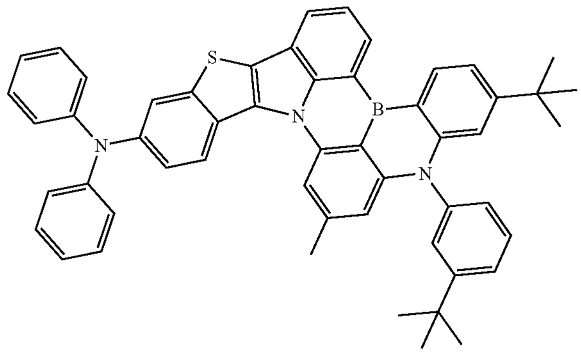

-continued
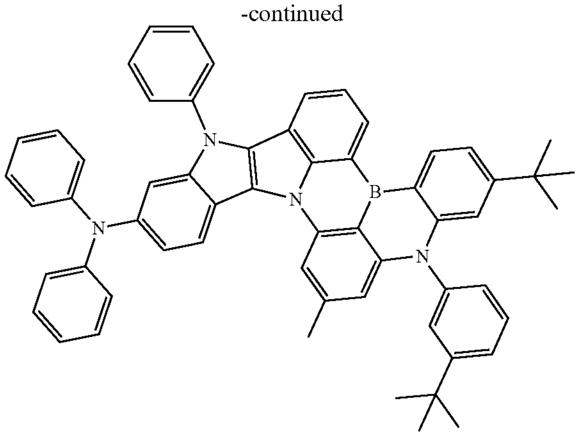
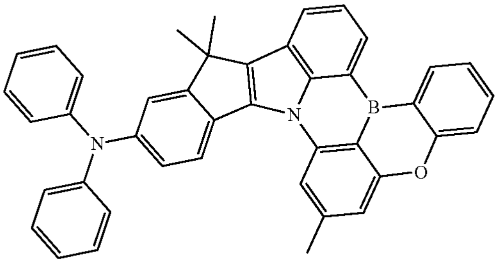
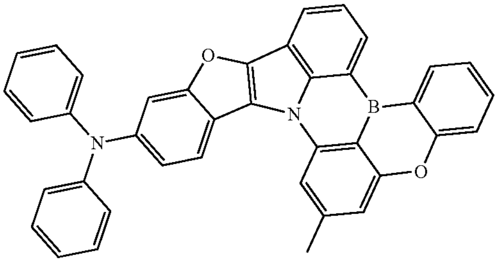
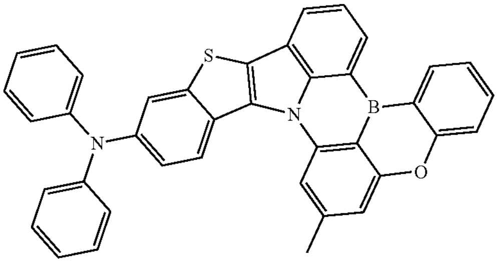
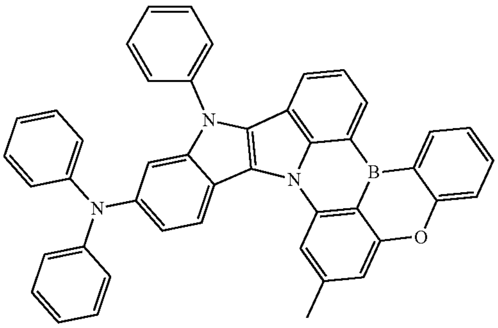
-continued
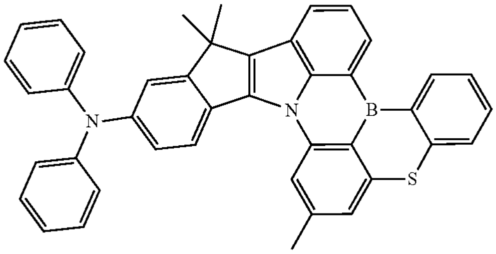
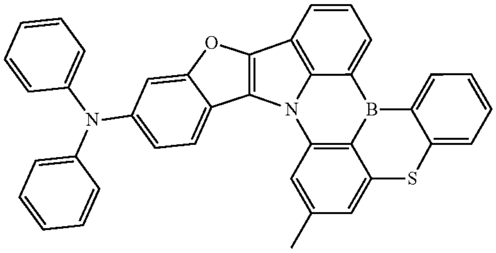
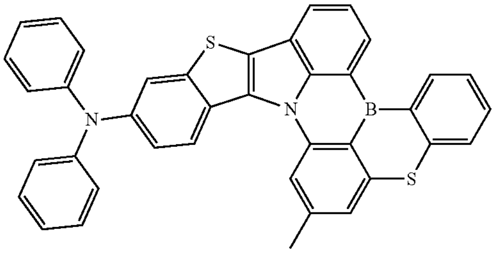
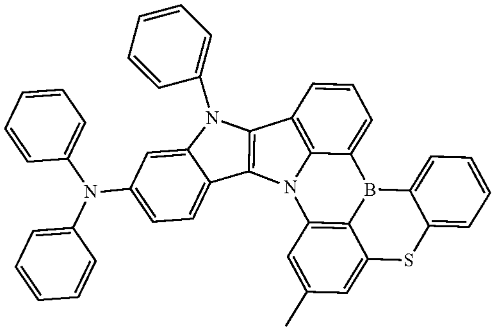
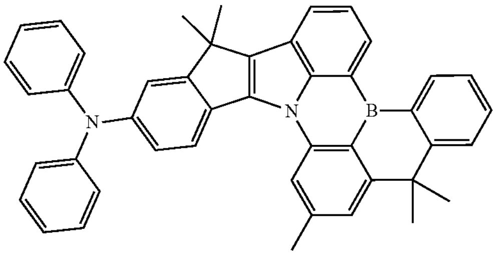
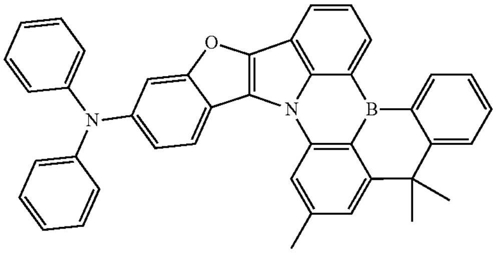

-continued
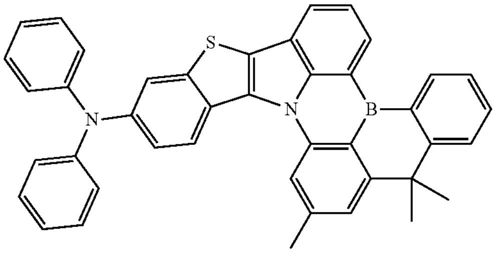
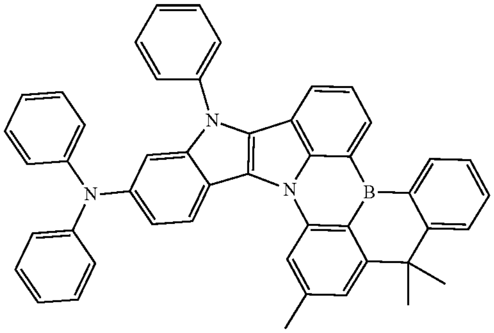
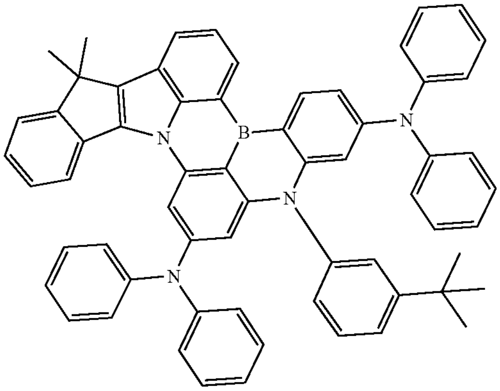
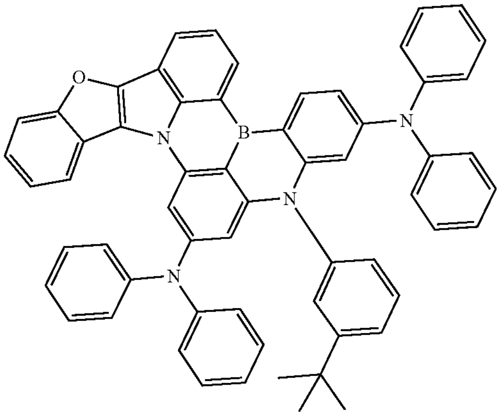
-continued
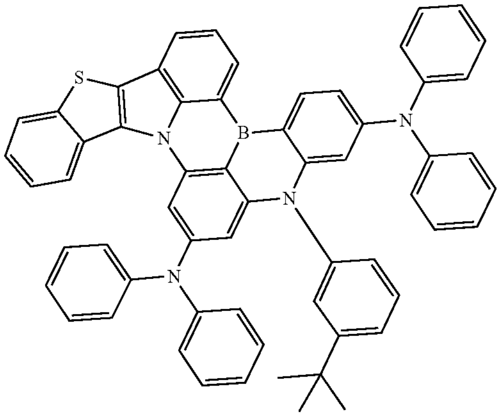
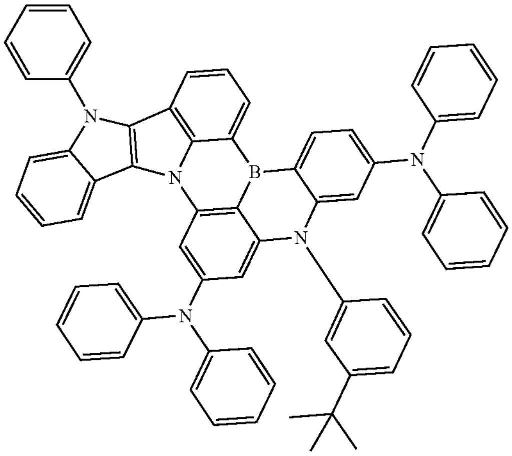
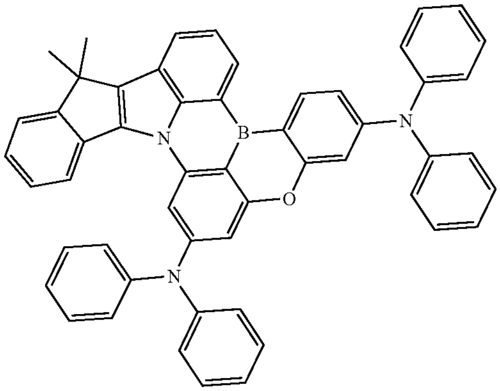
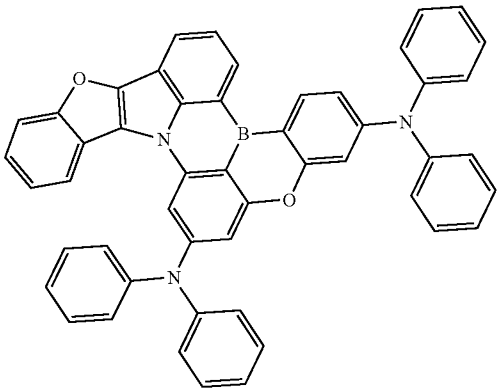

-continued
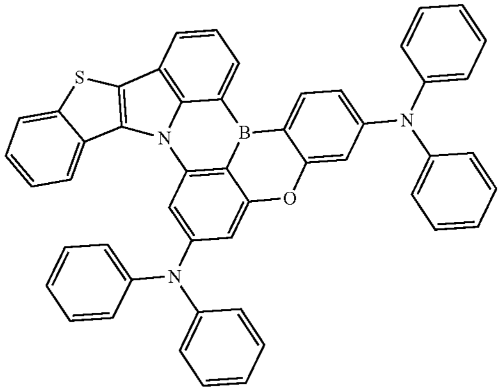
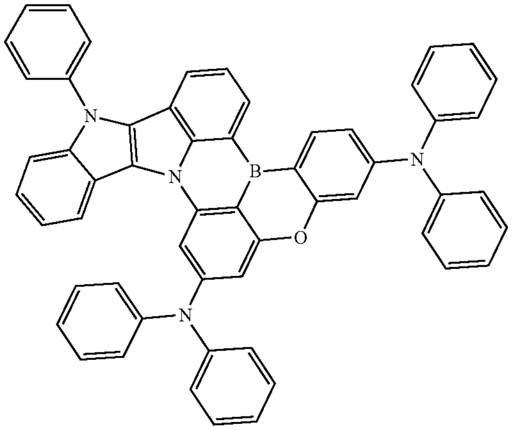
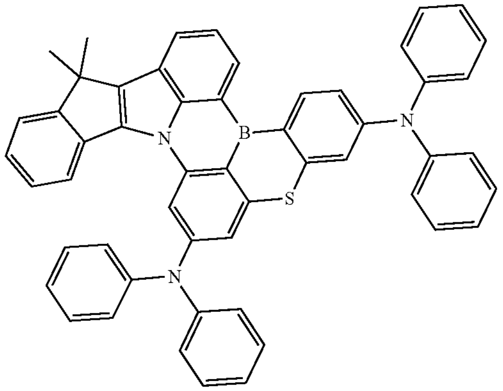
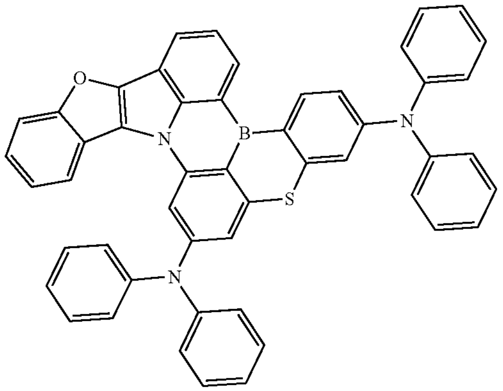
-continued
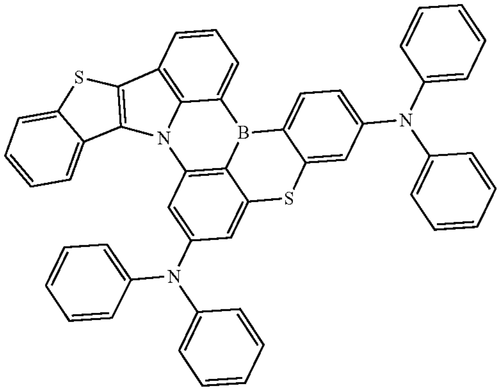
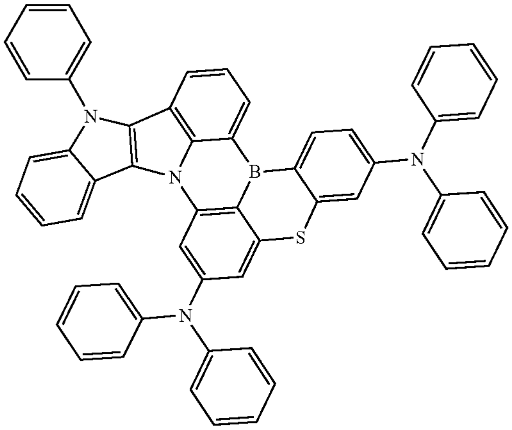
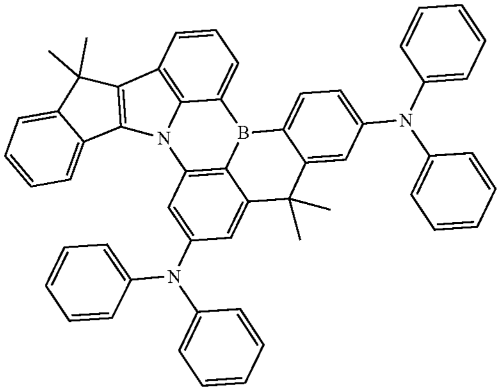
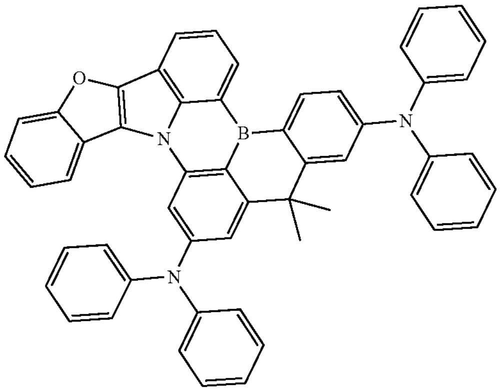

-continued
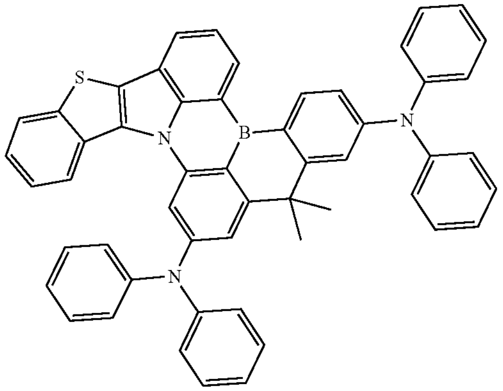
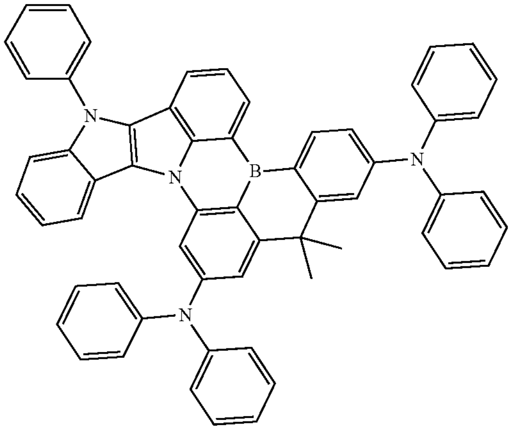
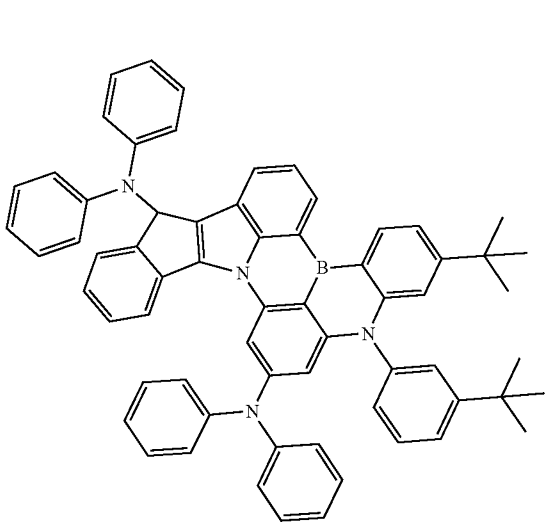
-continued
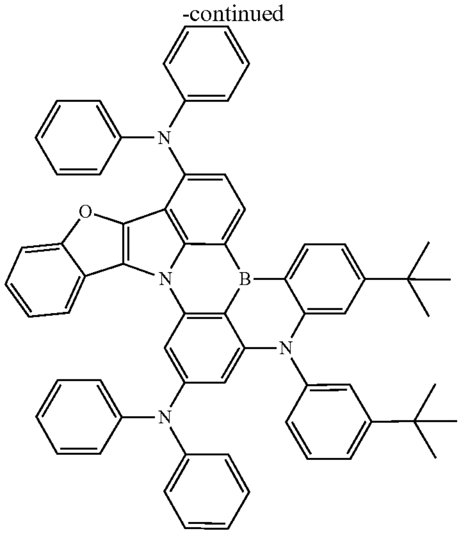
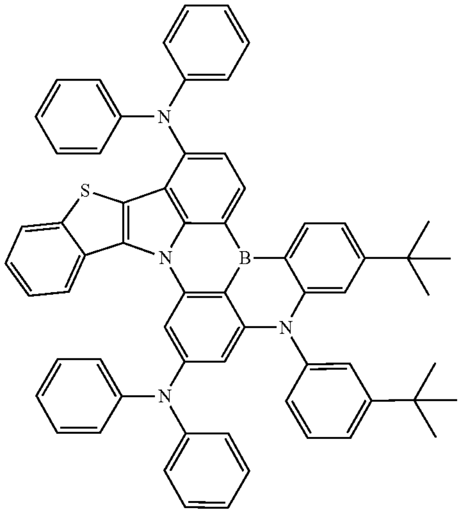
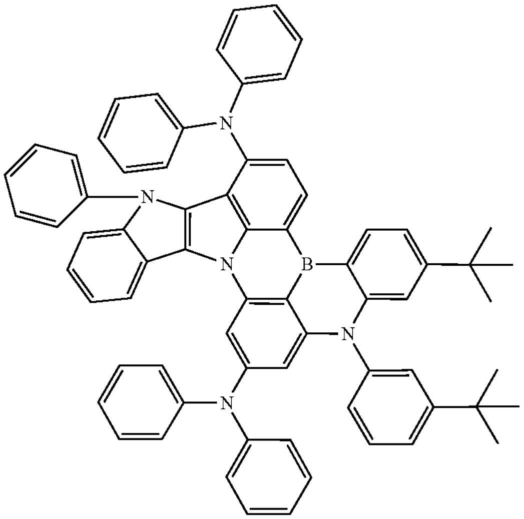

-continued
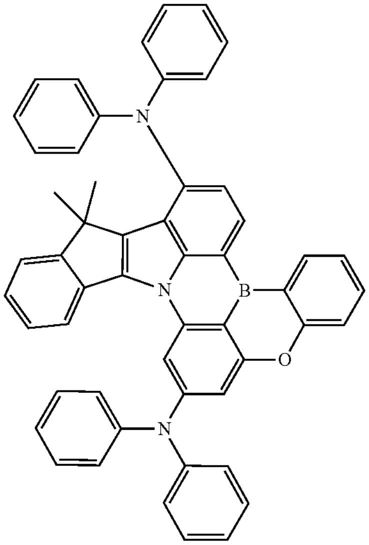
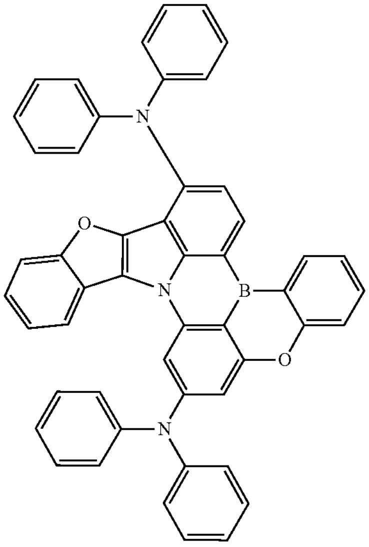
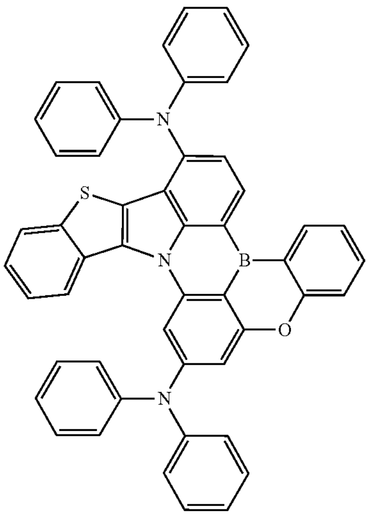
-continued
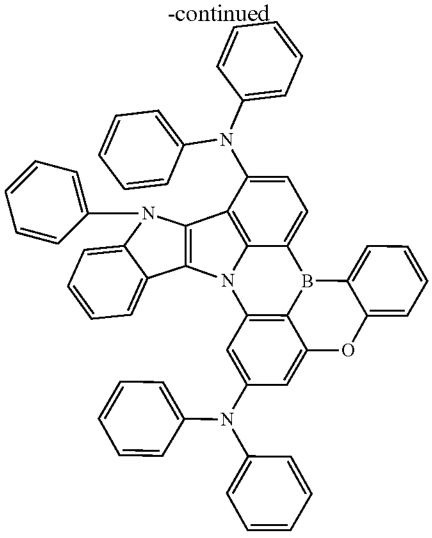
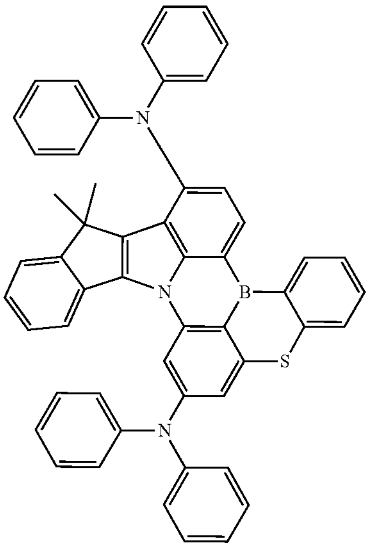
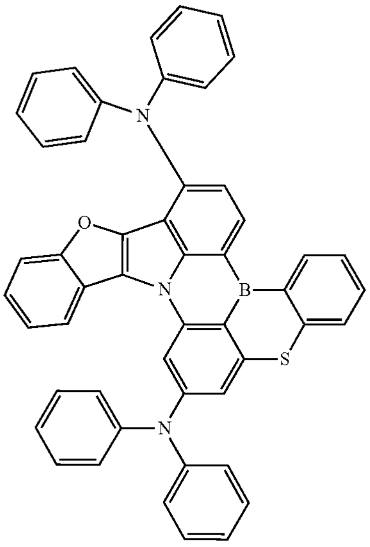

-continued
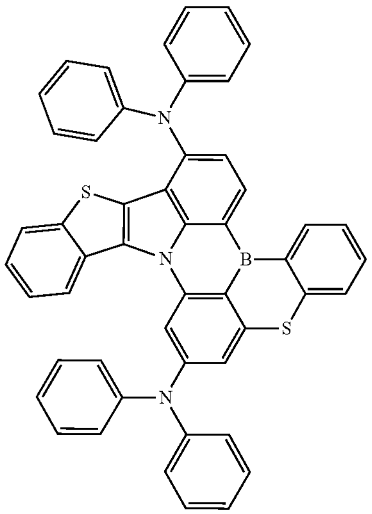
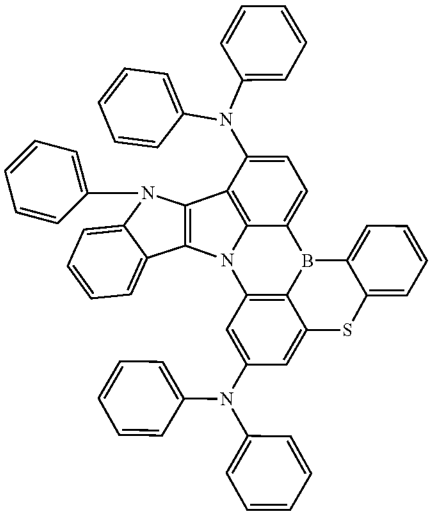
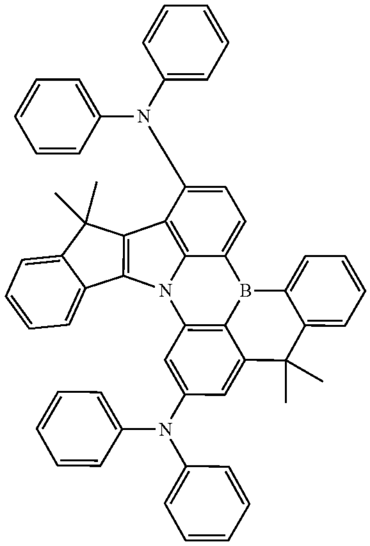
-continued
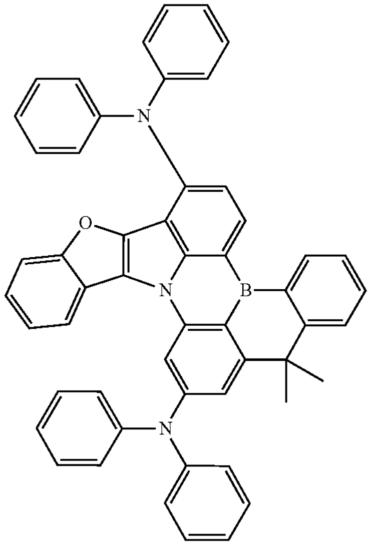
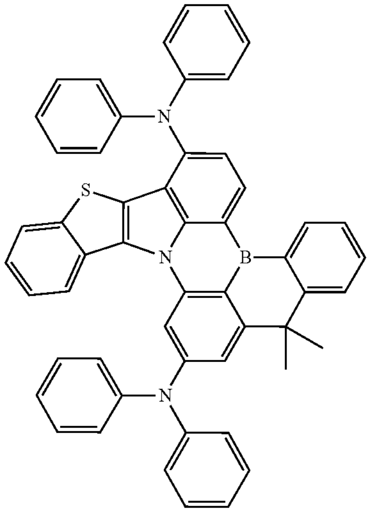
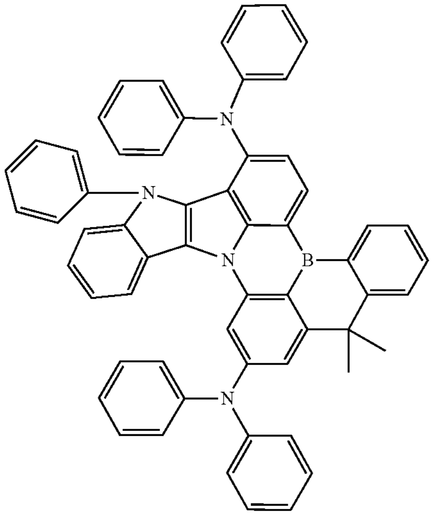

-continued
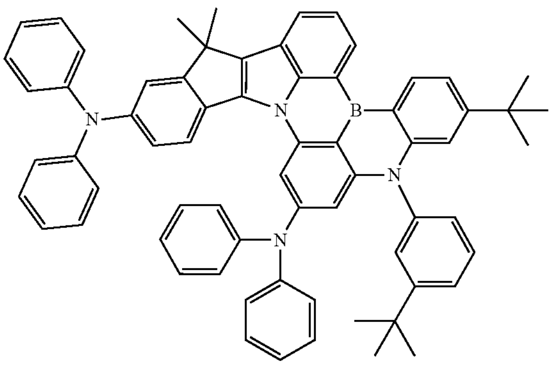
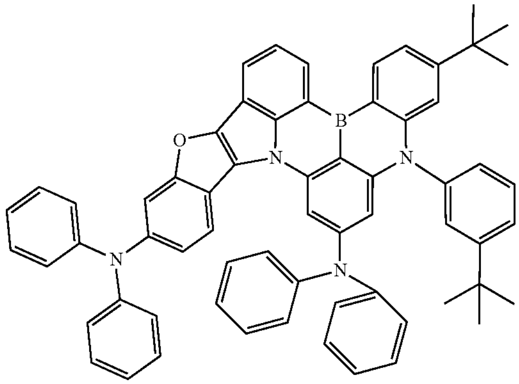
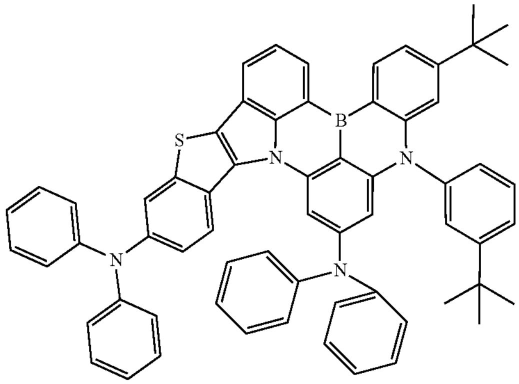
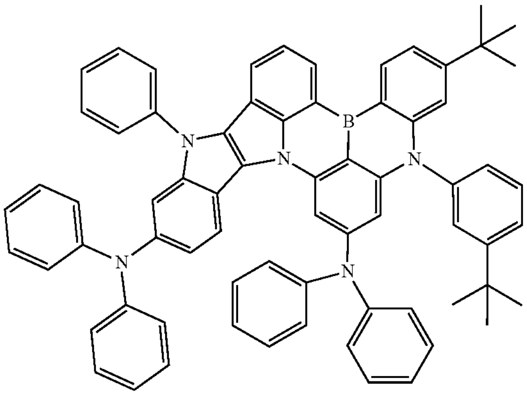
-continued
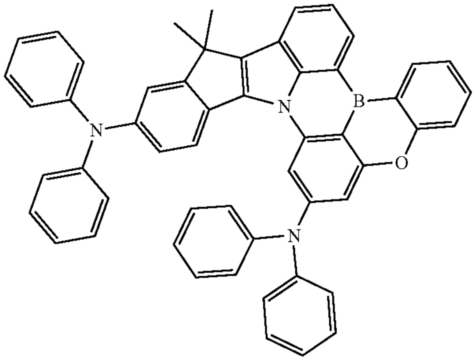
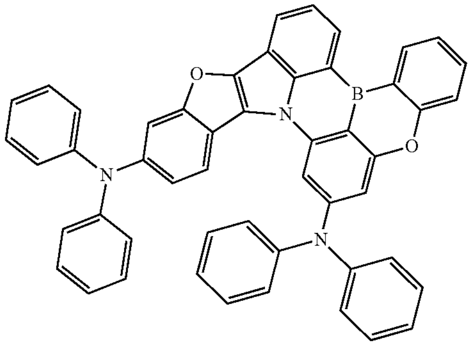
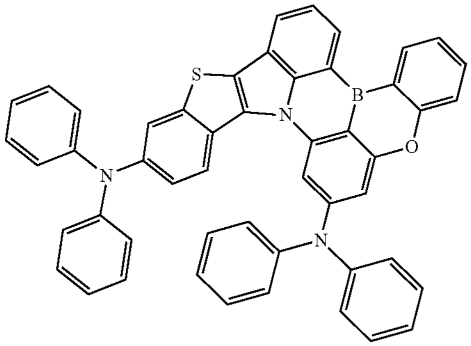
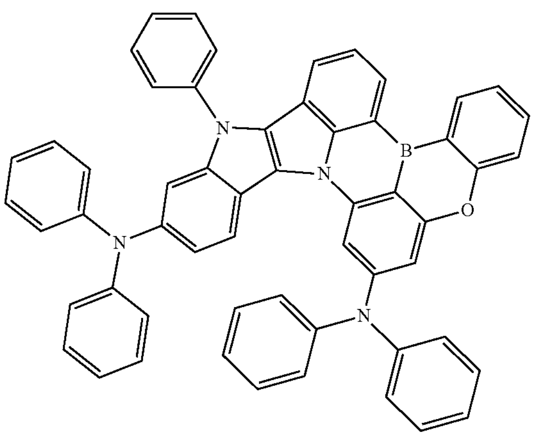

-continued
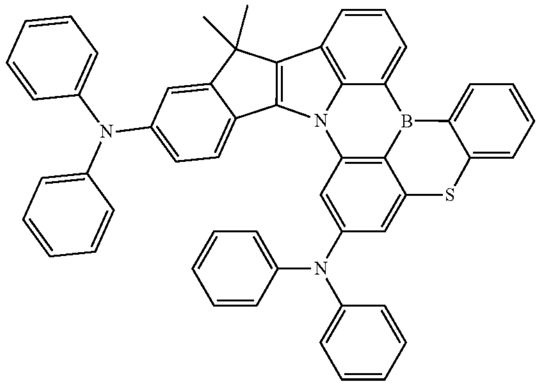
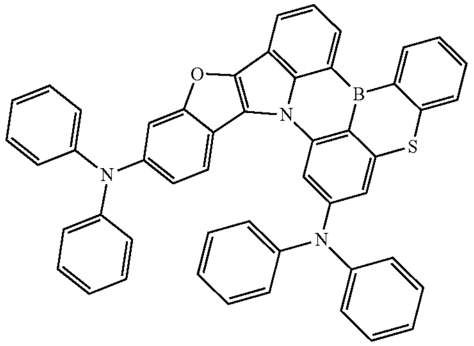
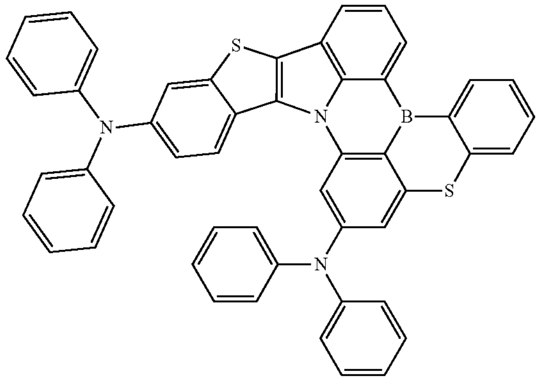
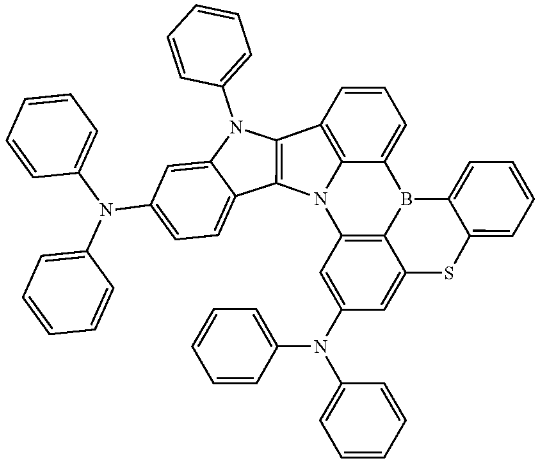
-continued
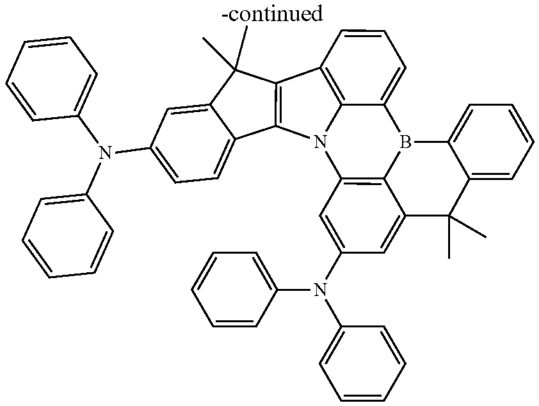
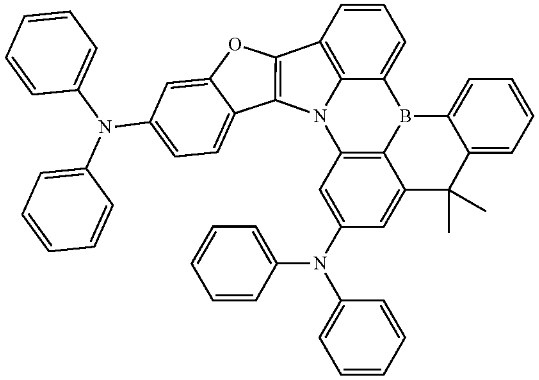
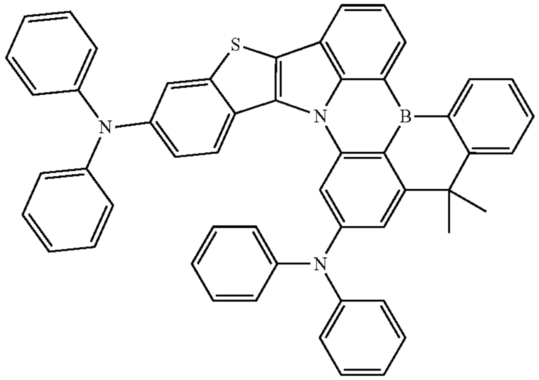
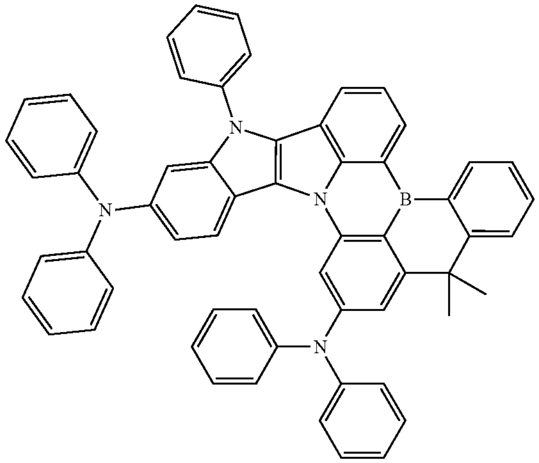

-continued
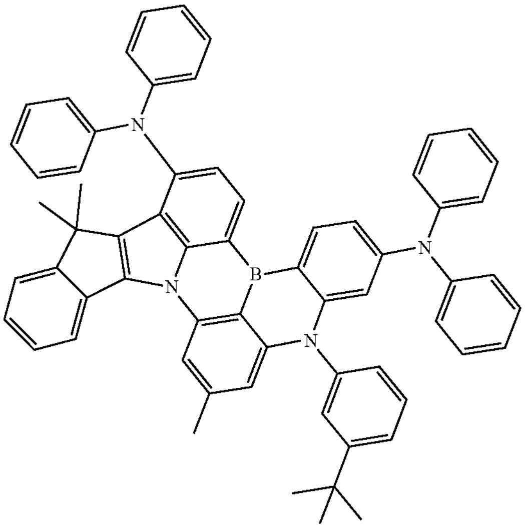
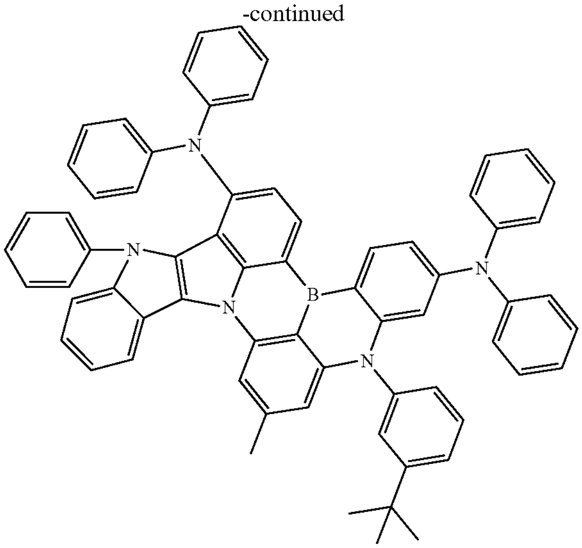
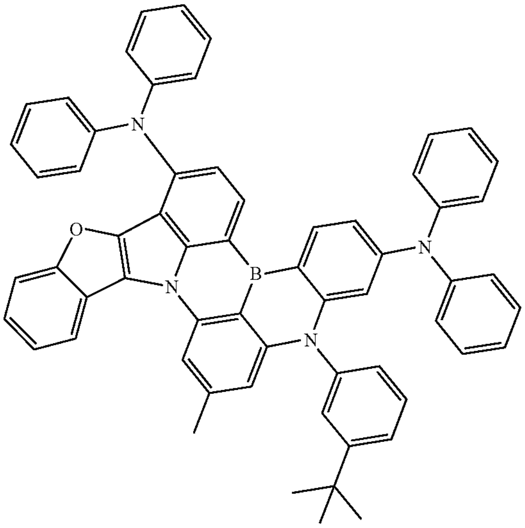
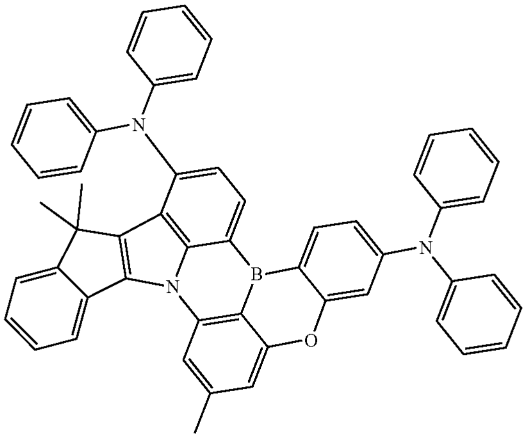
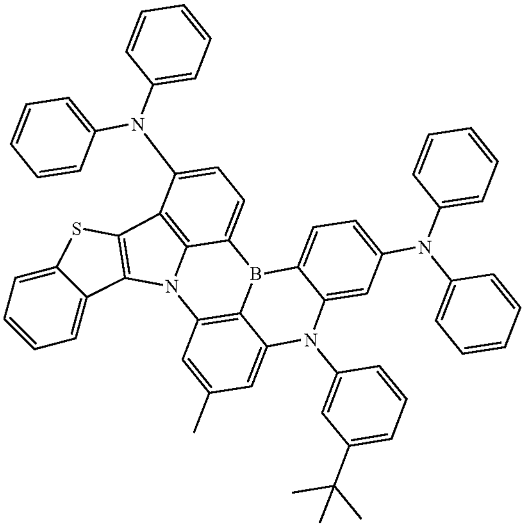
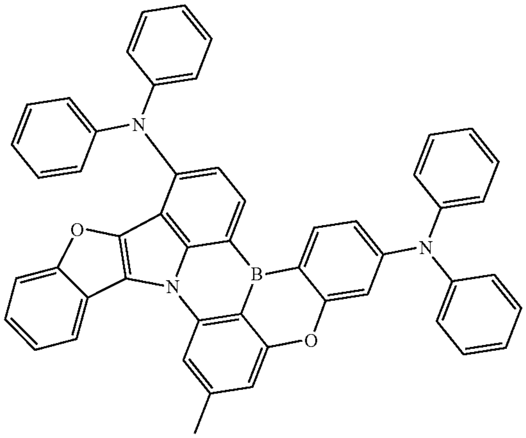
-continued -continued
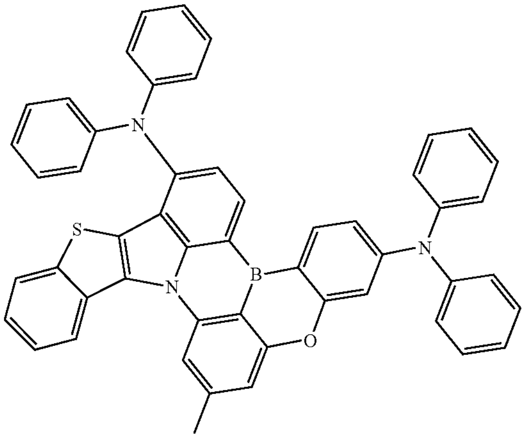
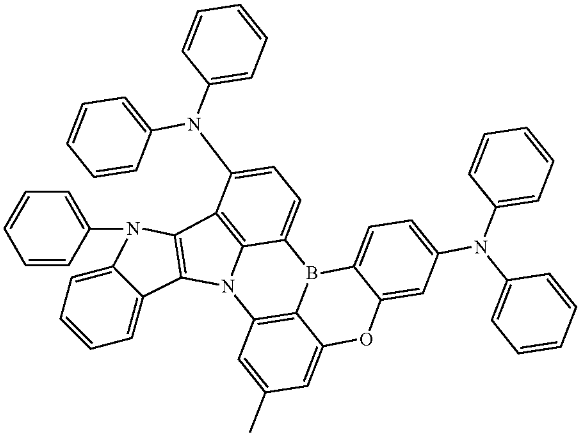
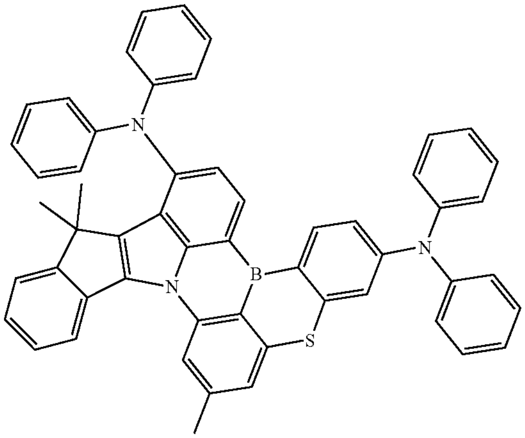
-continued
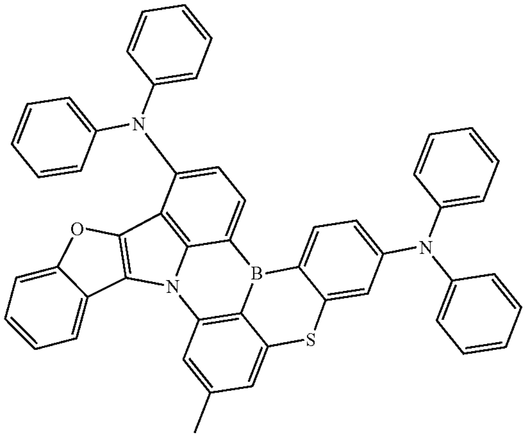
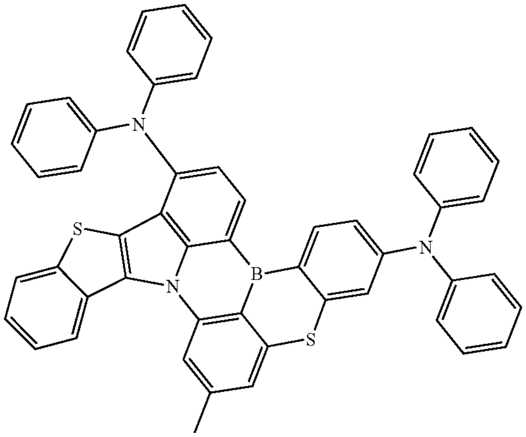
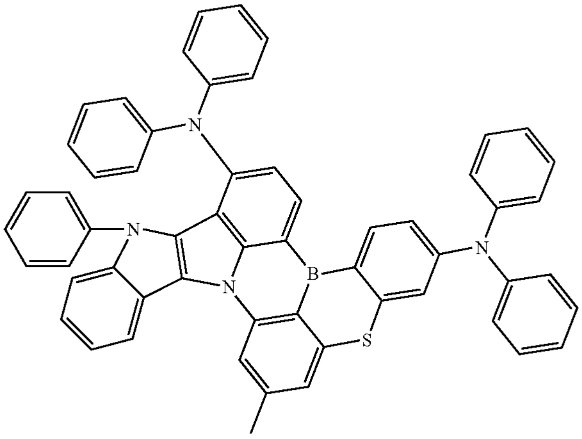

-continued
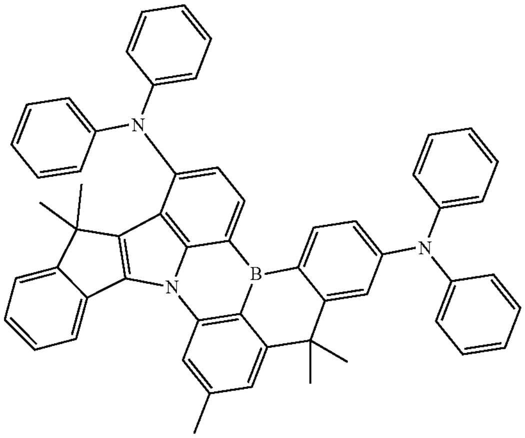
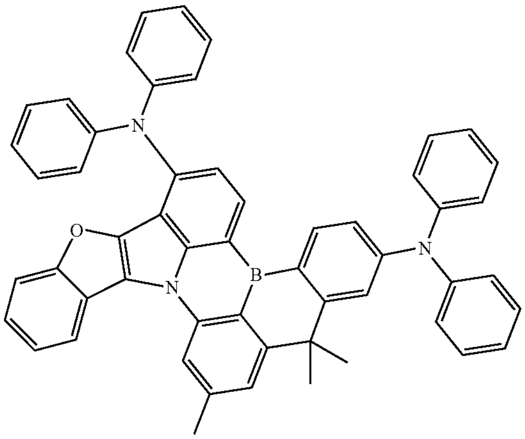
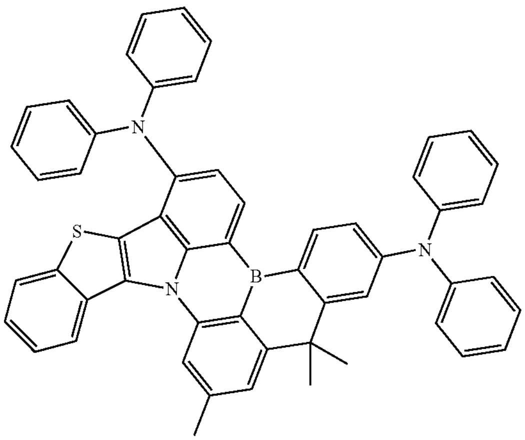
-continued
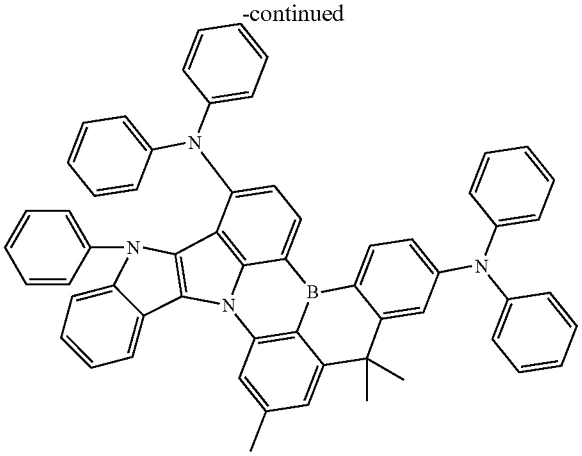
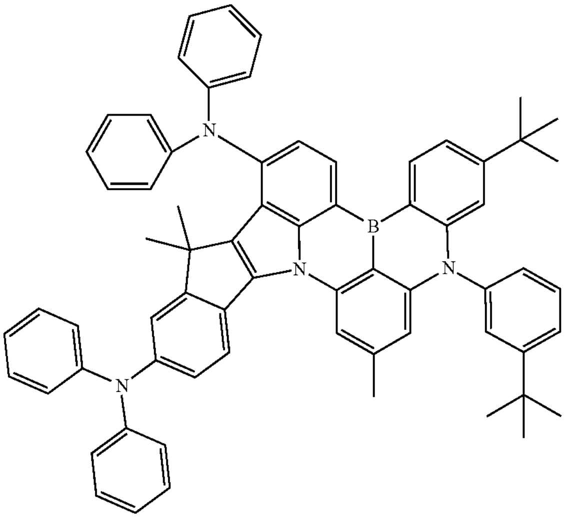
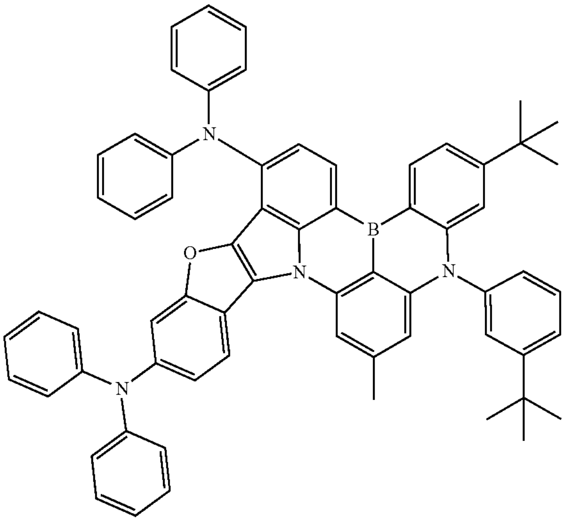

-continued
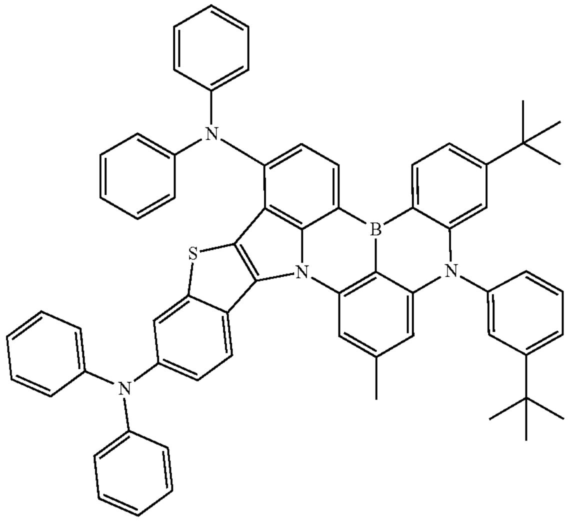
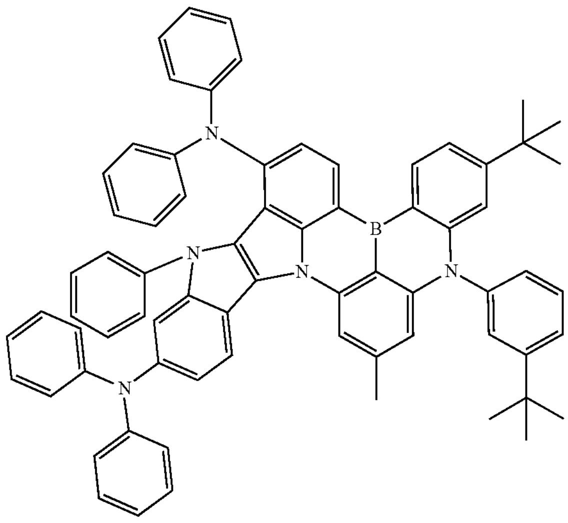
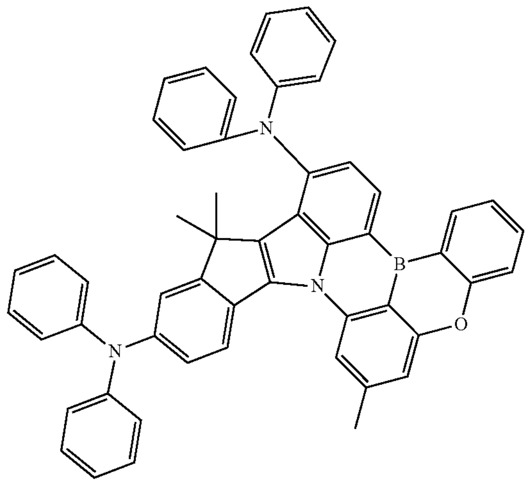
-continued
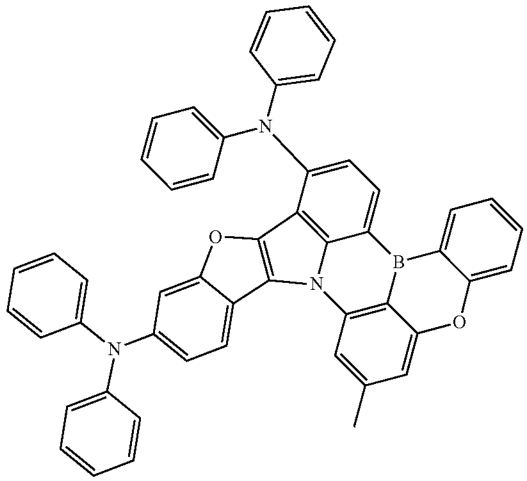
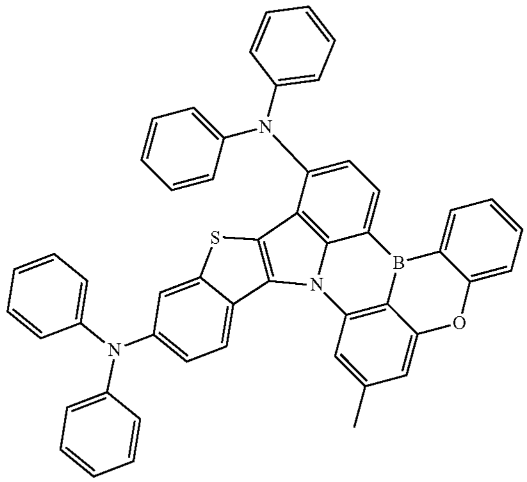
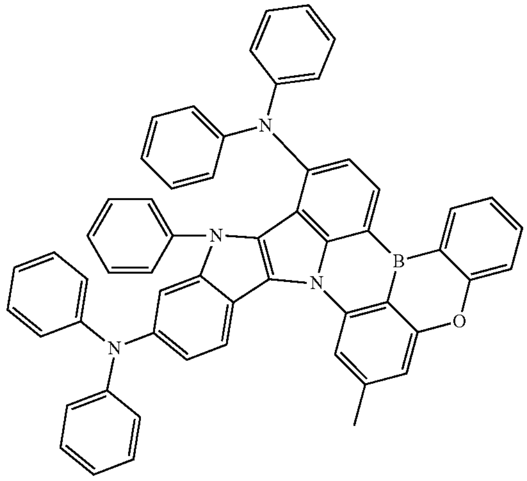

-continued
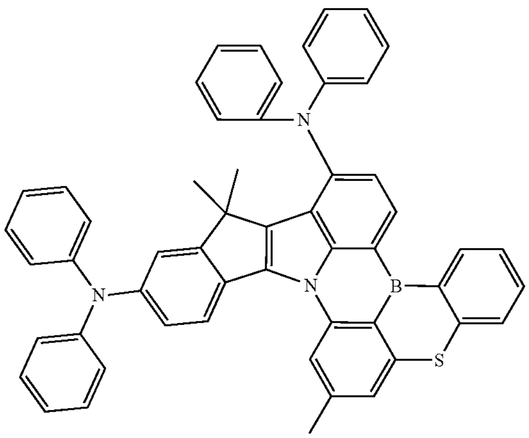
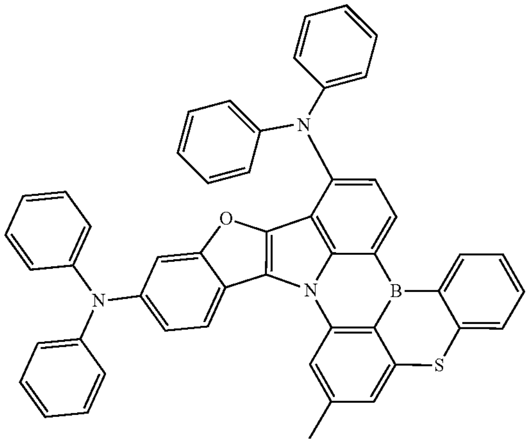
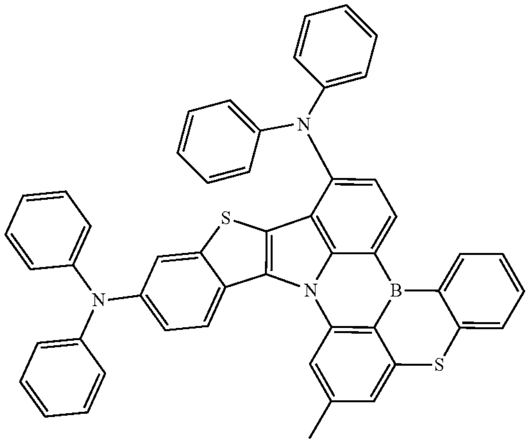
-continued
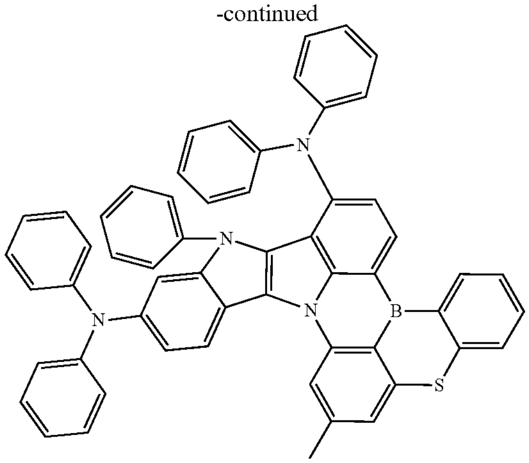
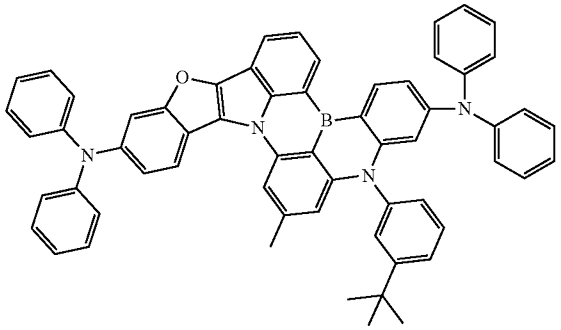
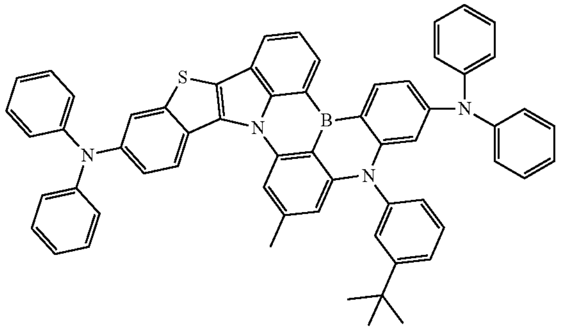
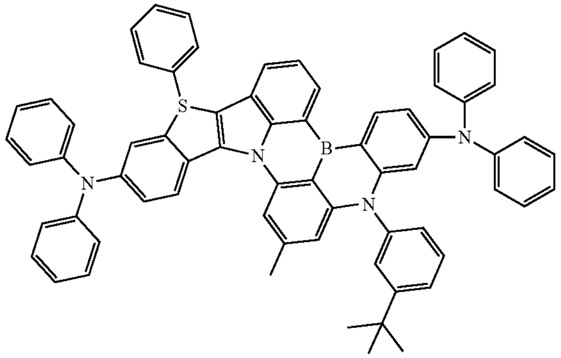
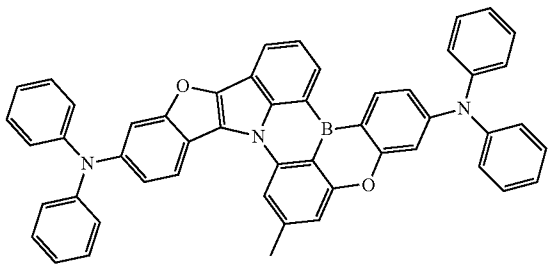

-continued
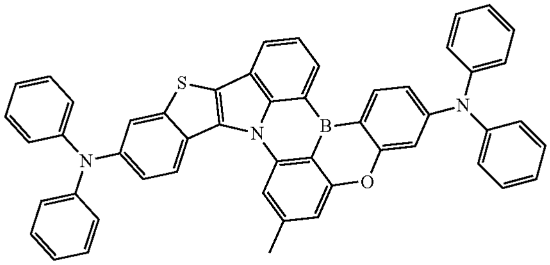
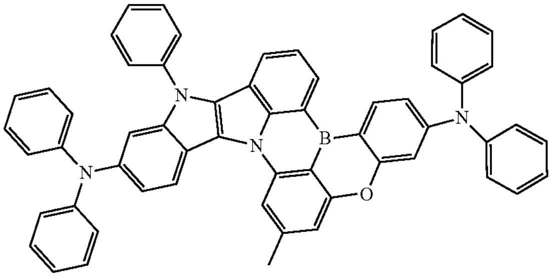
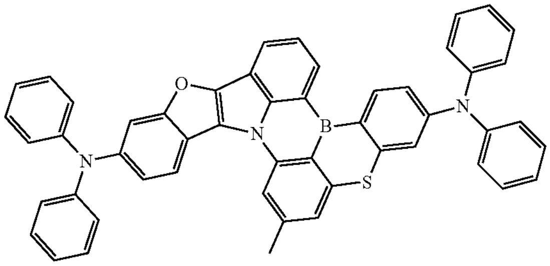
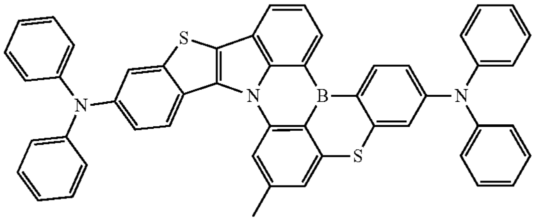
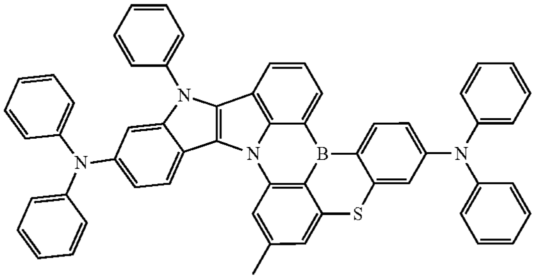
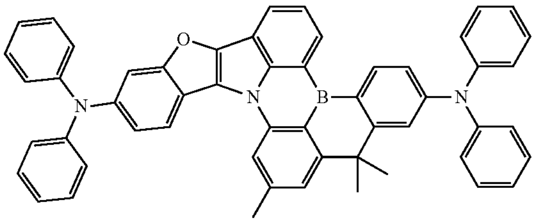
-continued
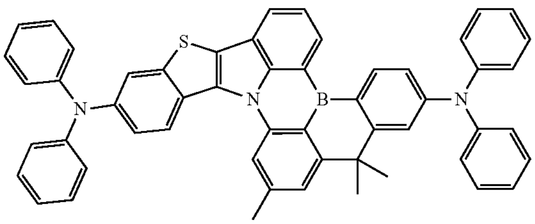
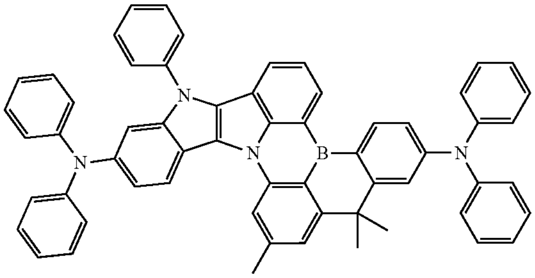
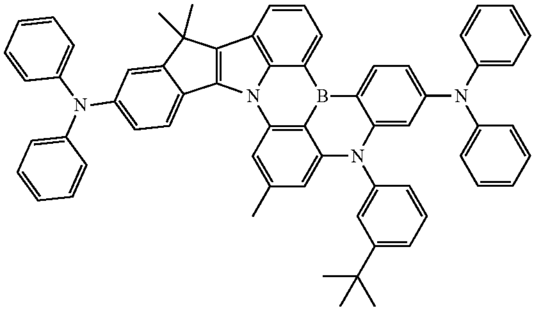
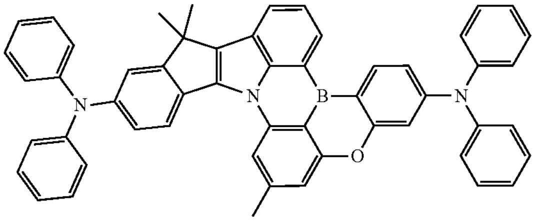
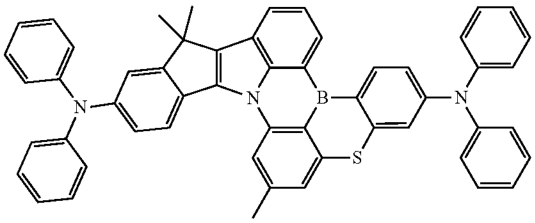
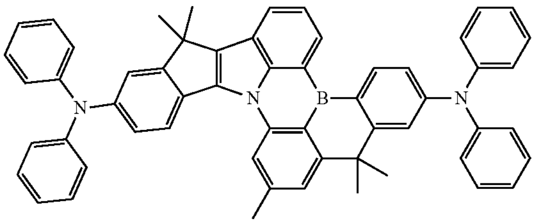

-continued
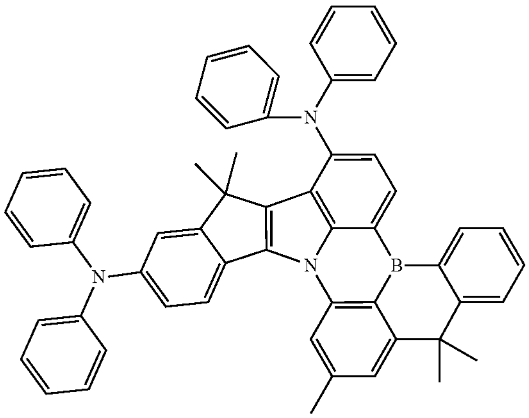
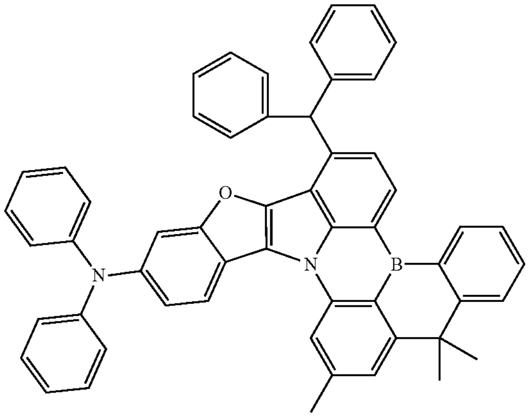
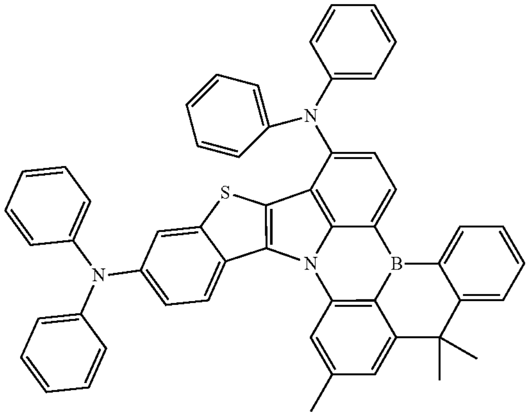
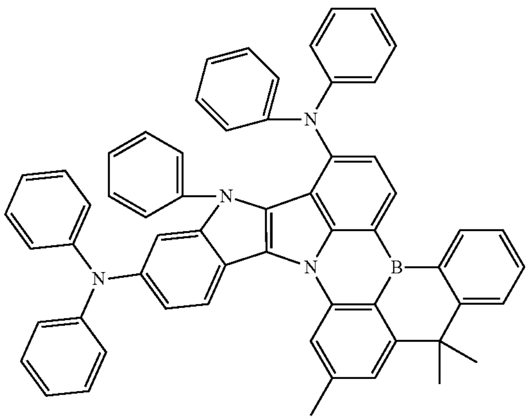
-continued
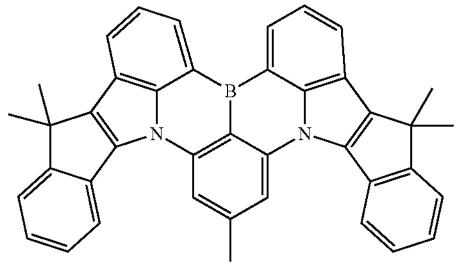
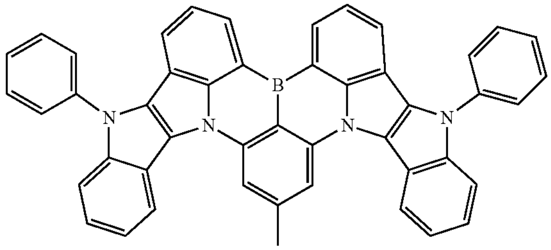
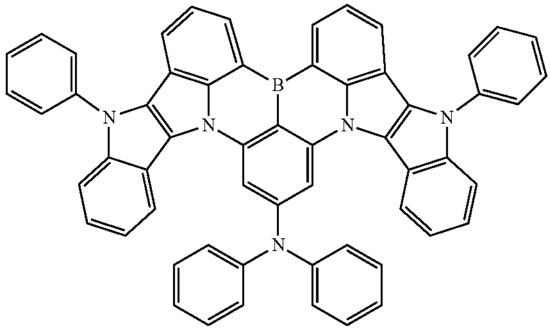
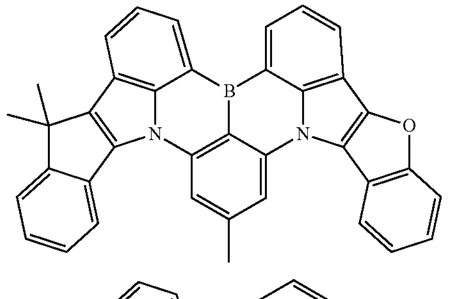
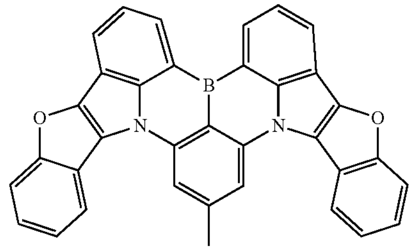
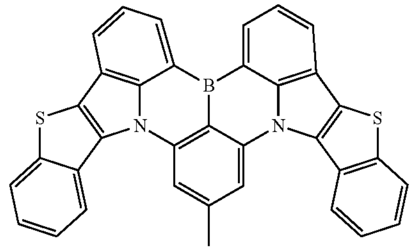

-continued
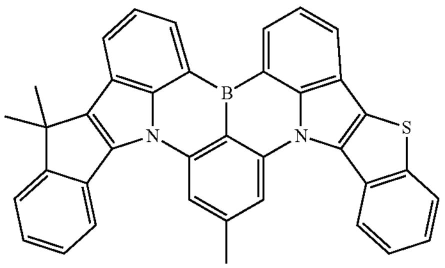
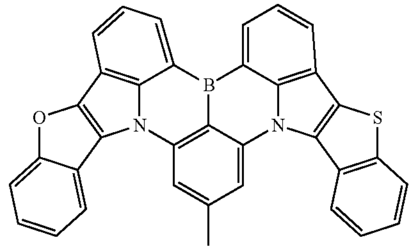
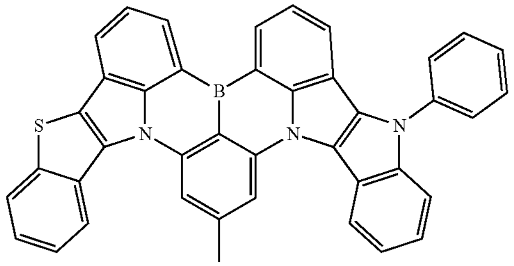
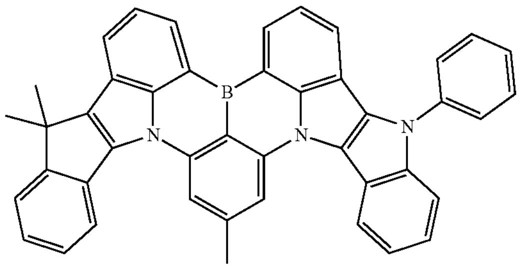
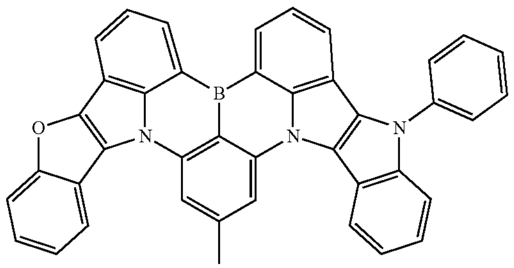
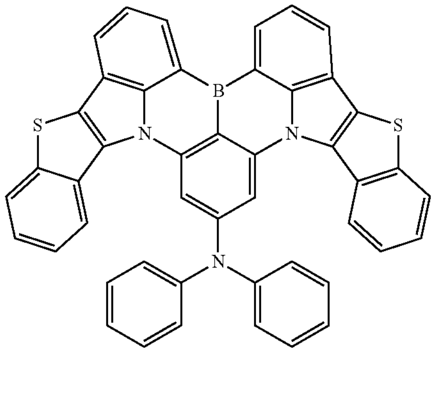
-continued
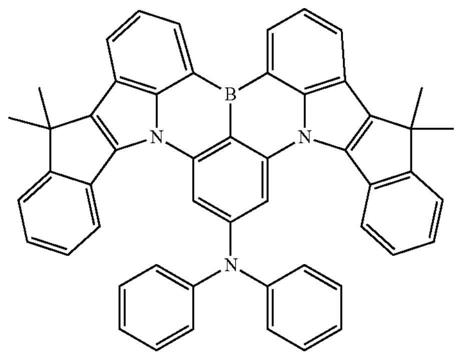
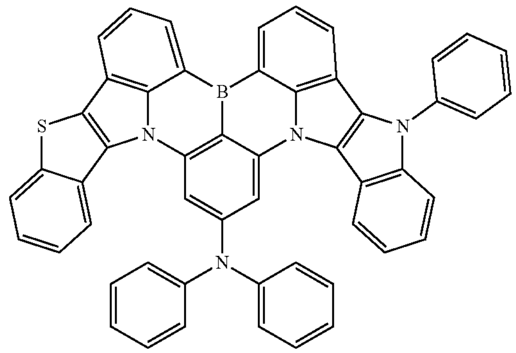
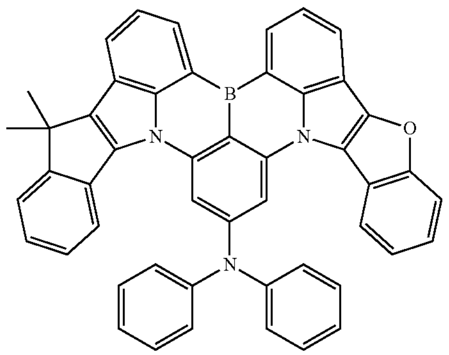
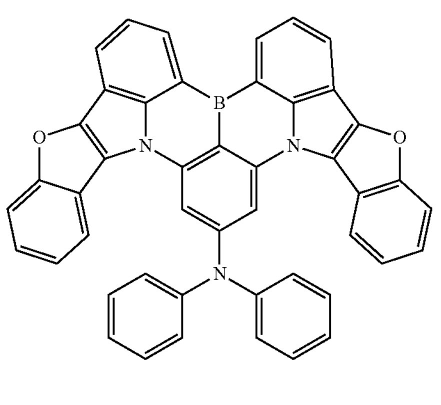

-continued
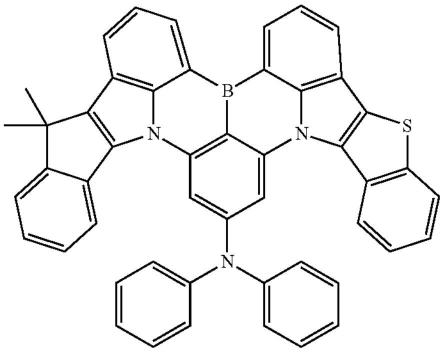
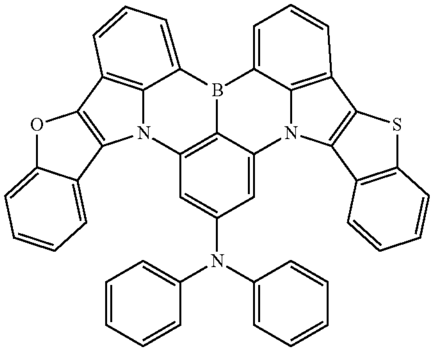
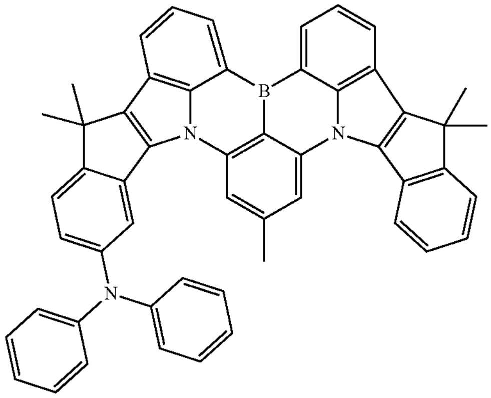
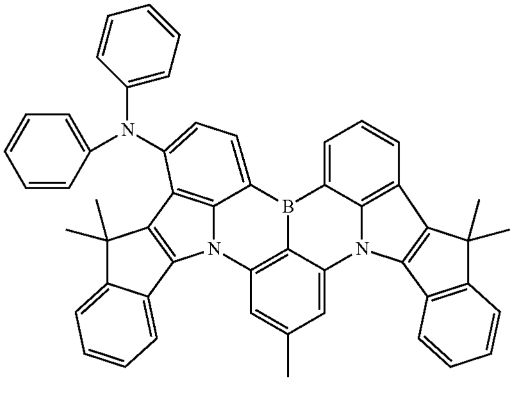
-continued
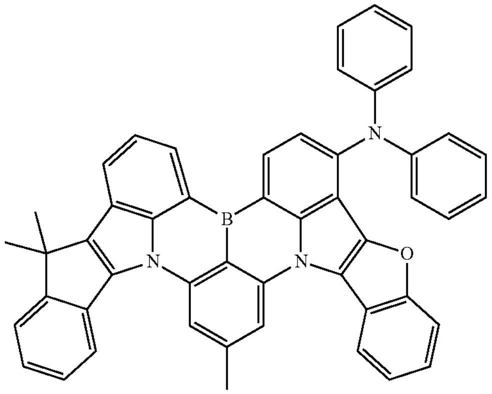
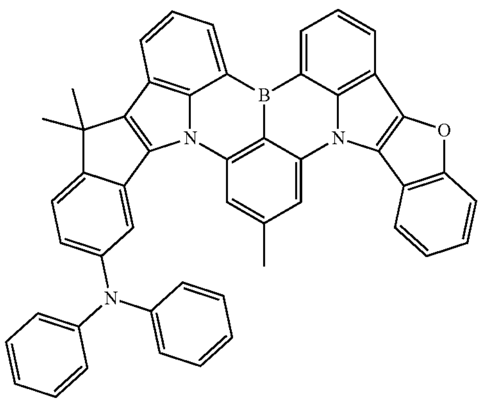
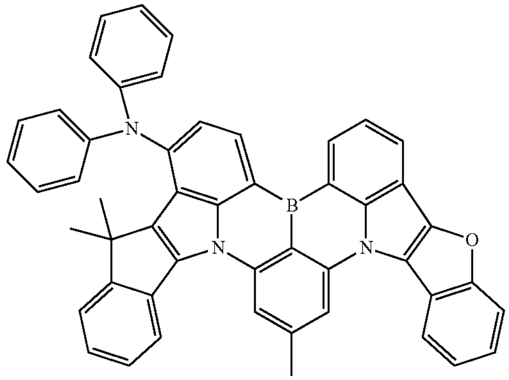
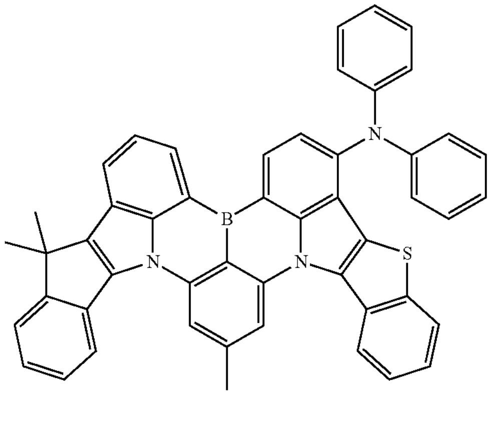

-continued
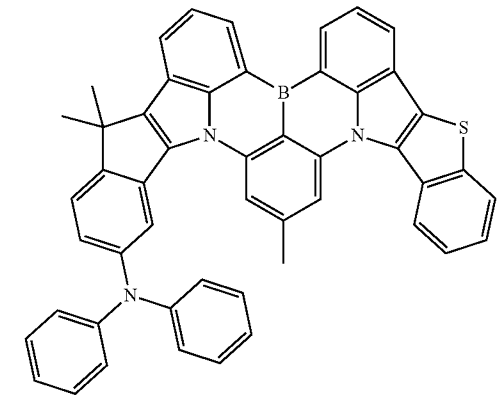
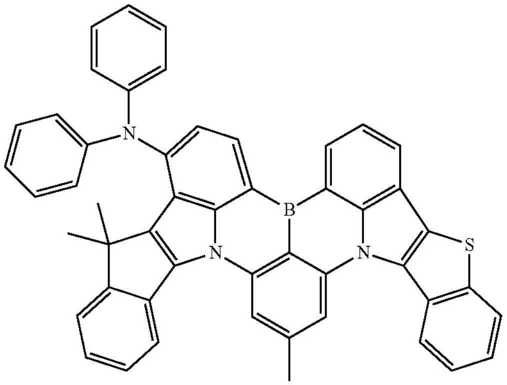
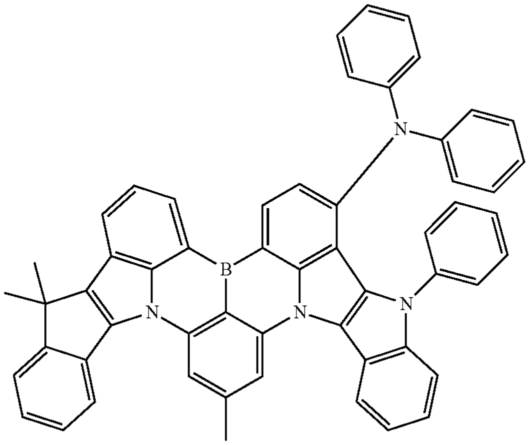
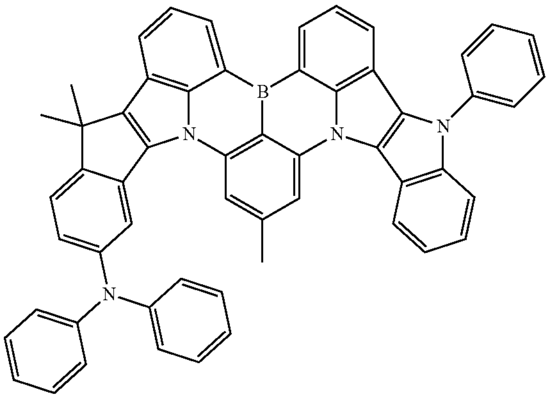
-continued
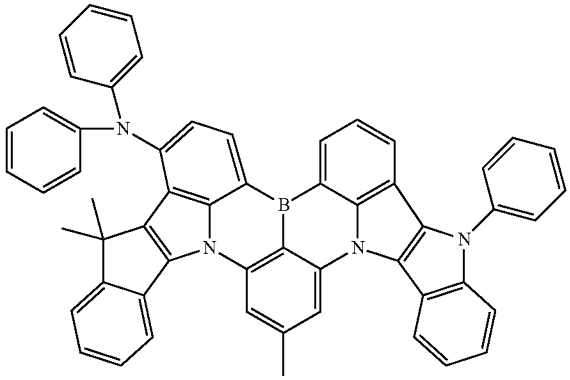
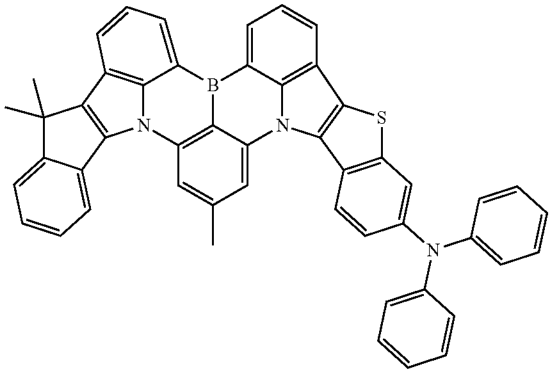
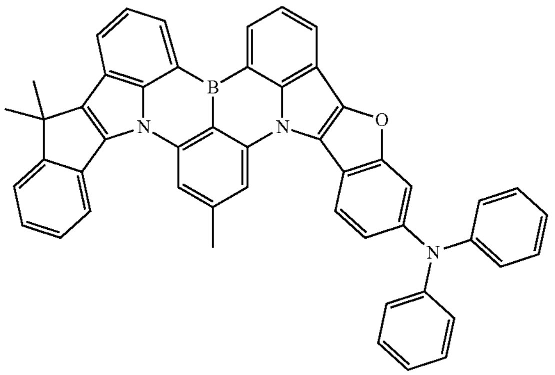
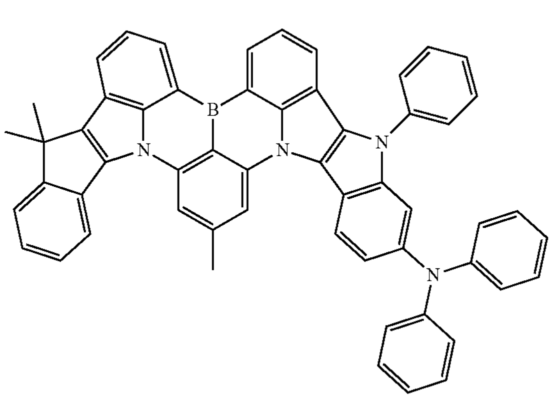

-continued
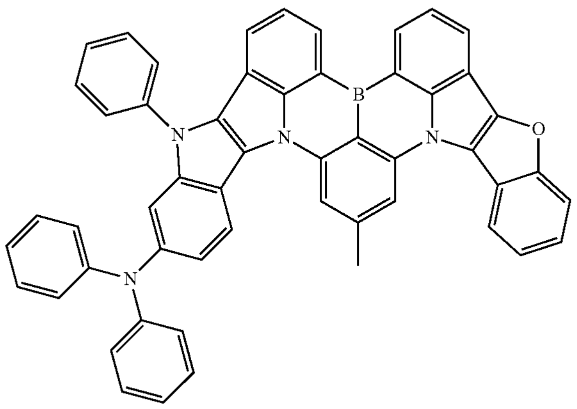
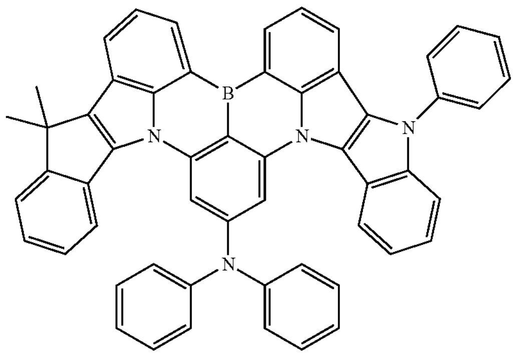
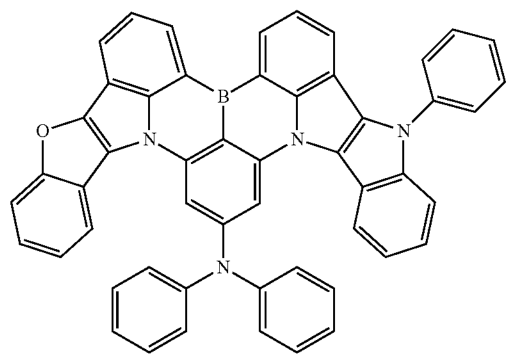
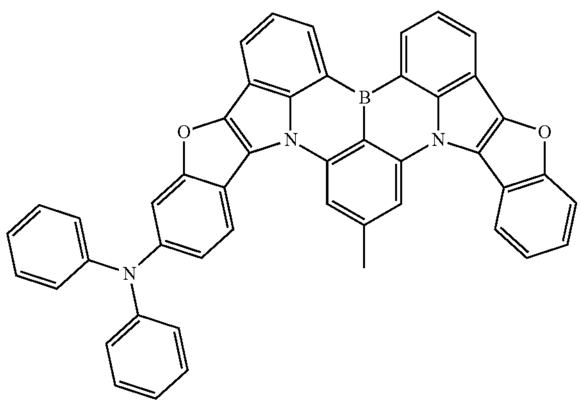
-continued
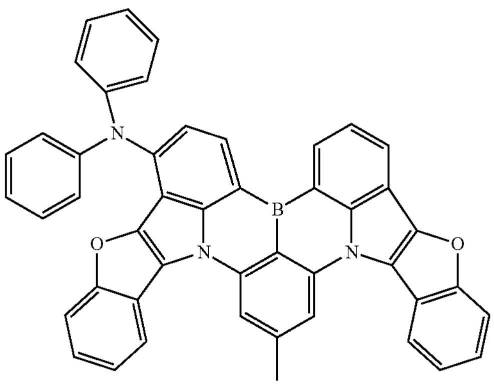
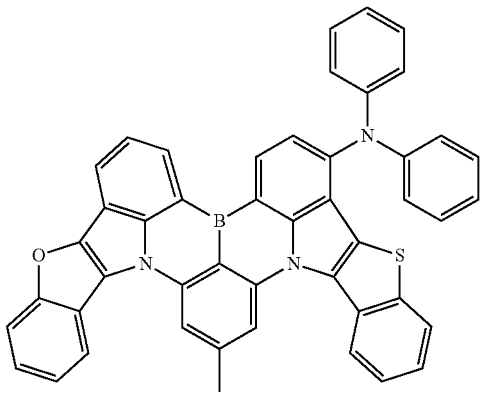
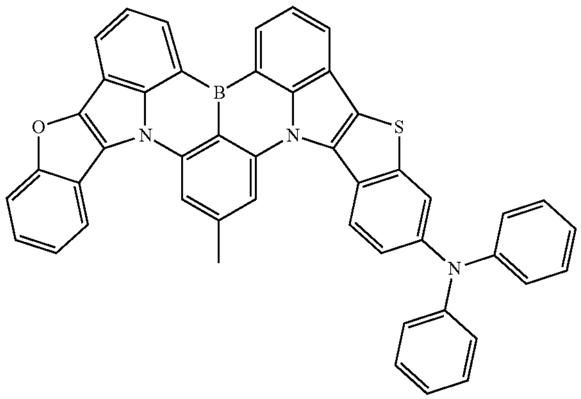
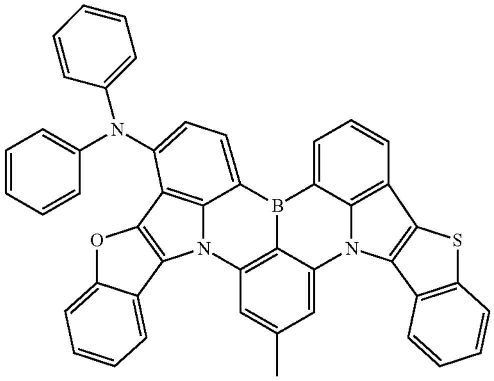

-continued
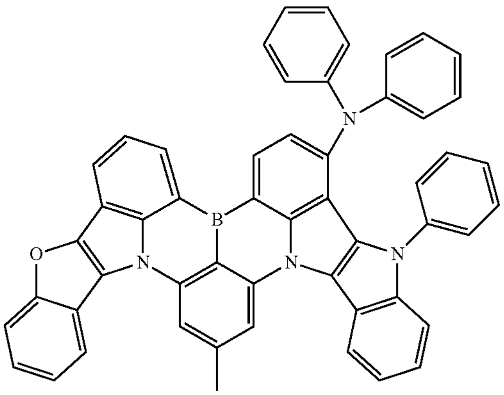
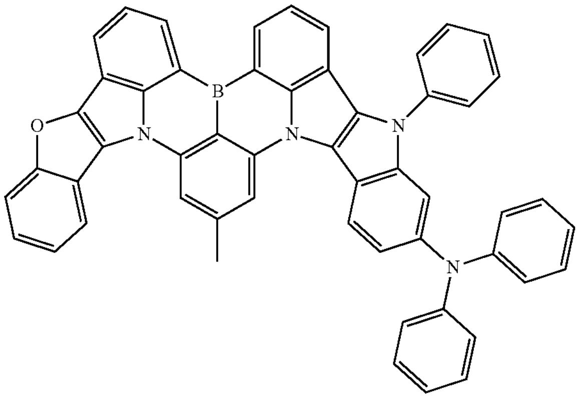
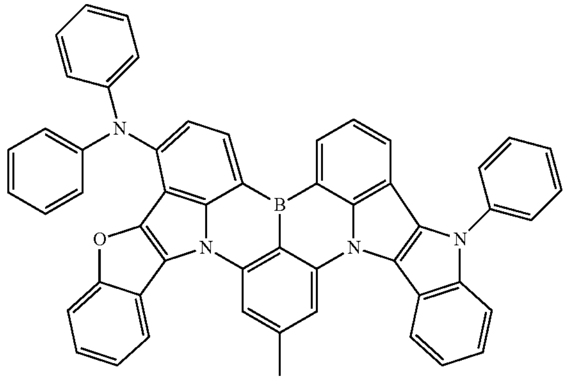
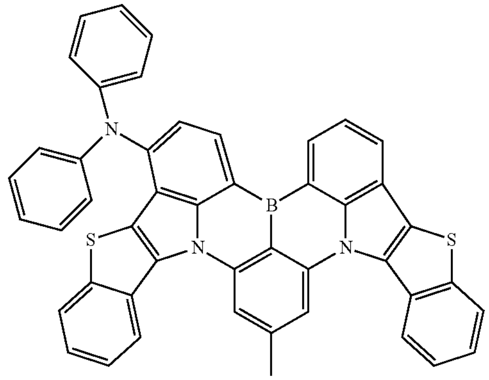
-continued
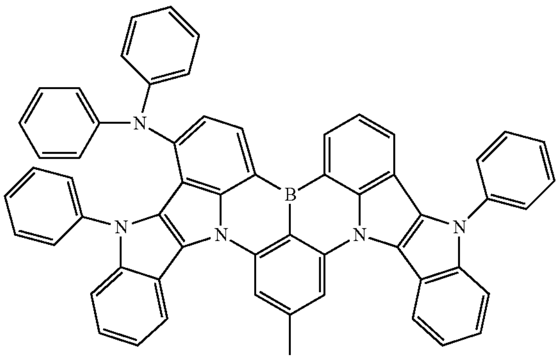
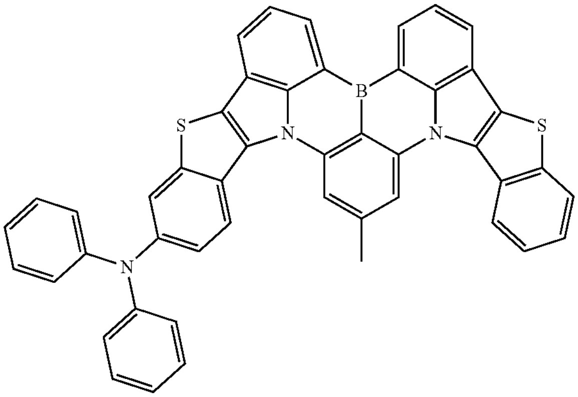
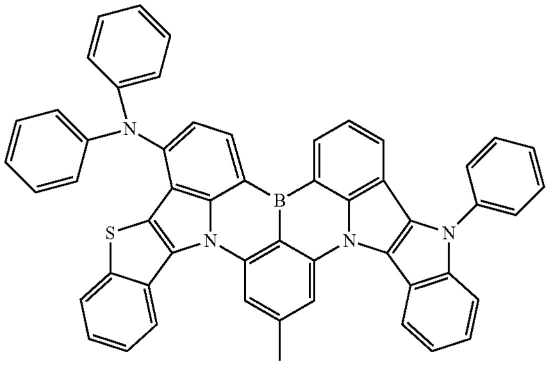
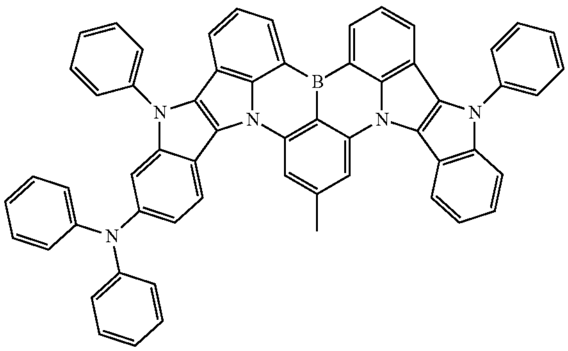

-continued
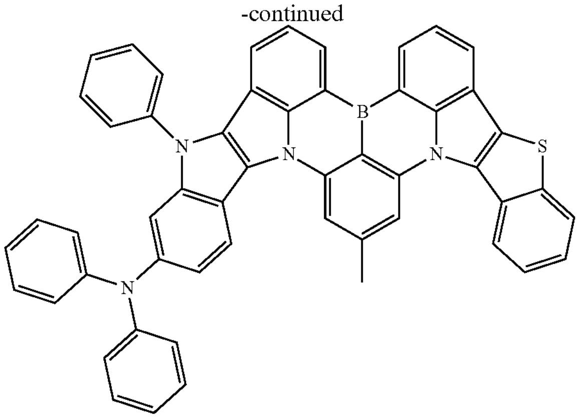
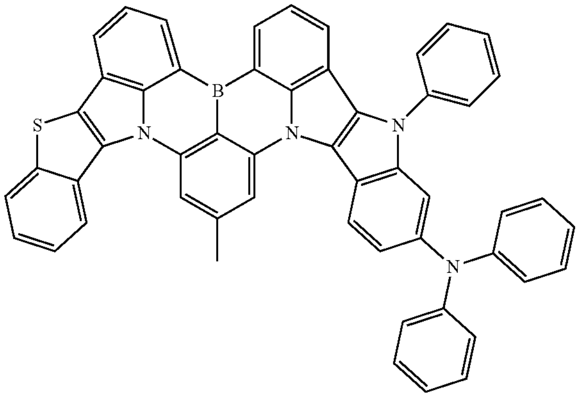
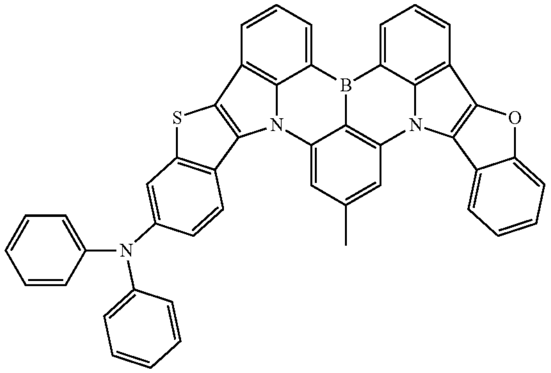
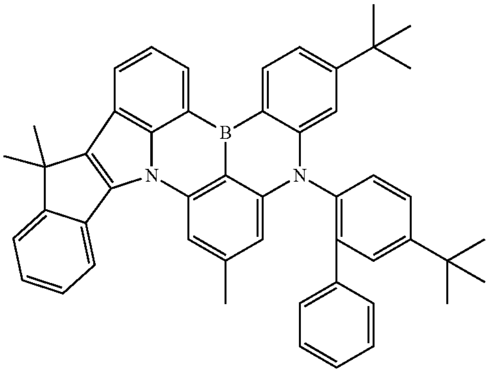
-continued
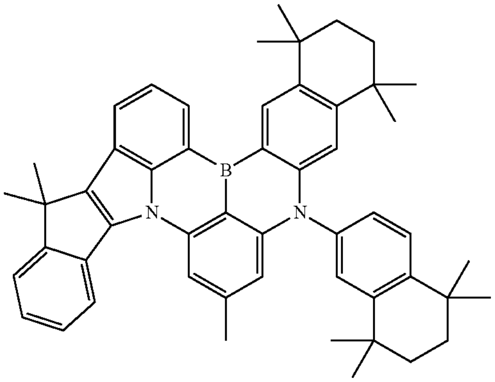
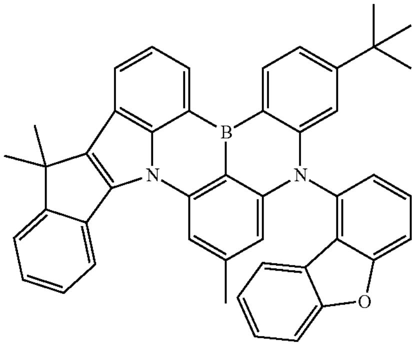
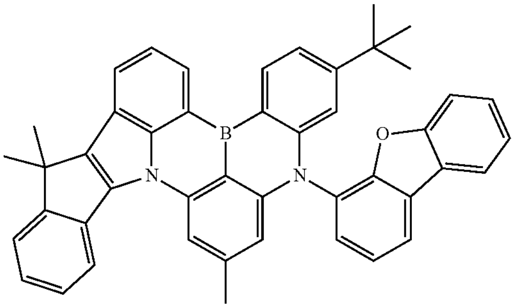
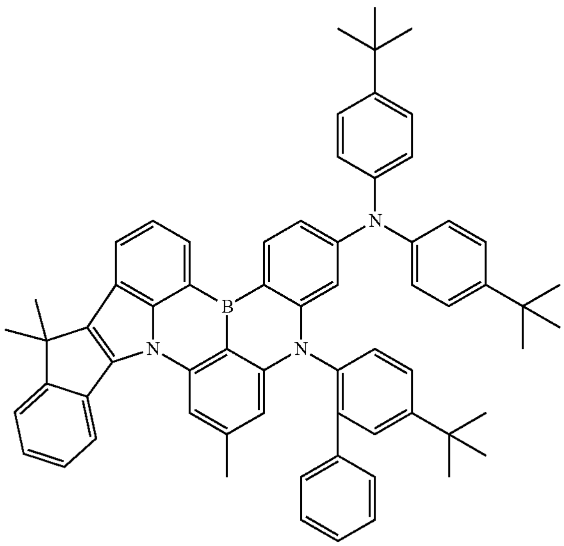

-continued
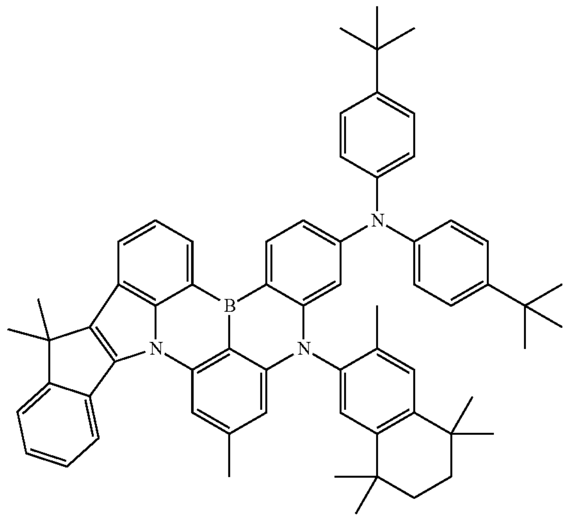
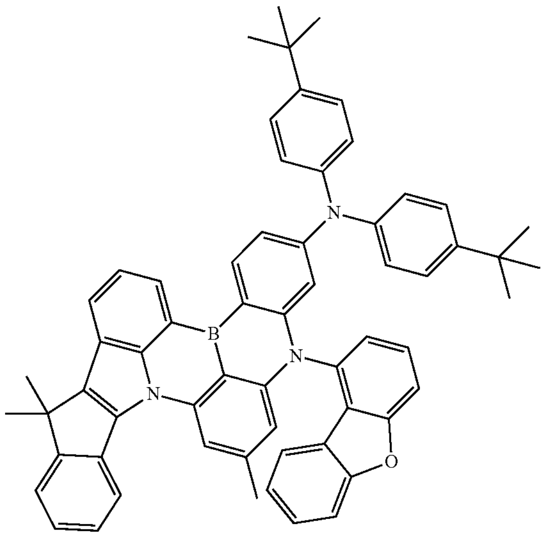
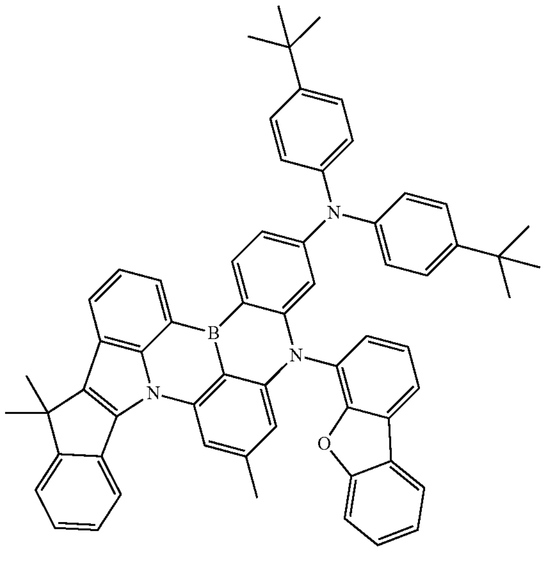
-continued
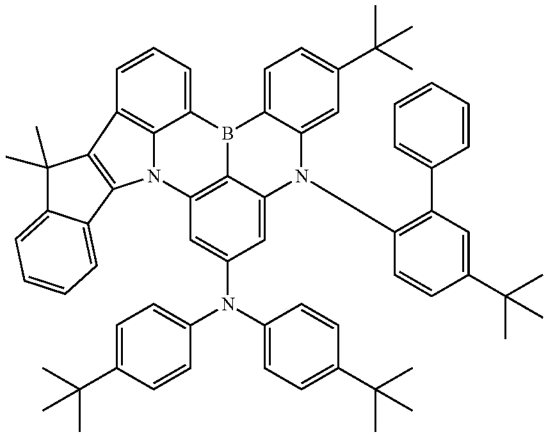
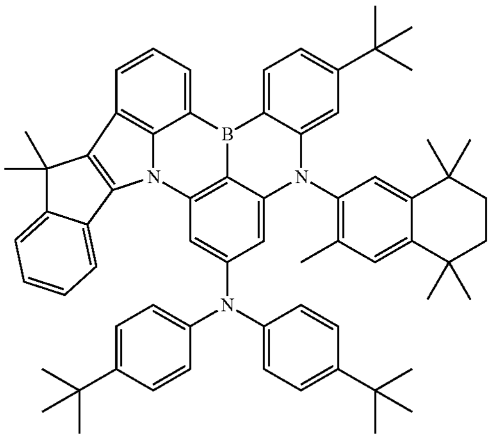
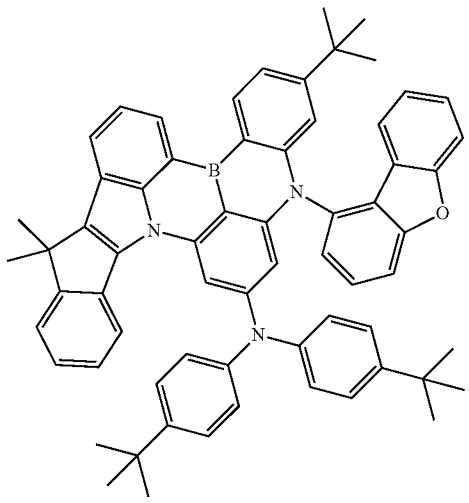

-continued
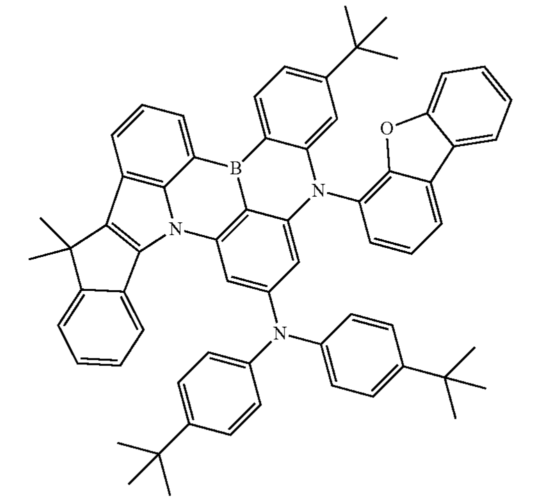
-continued
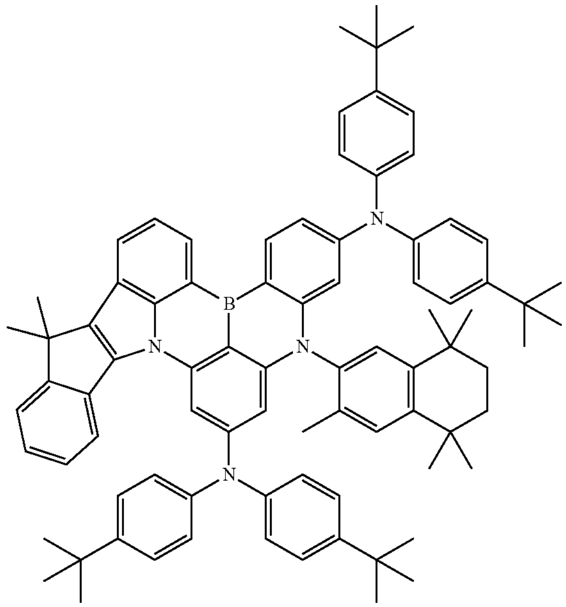
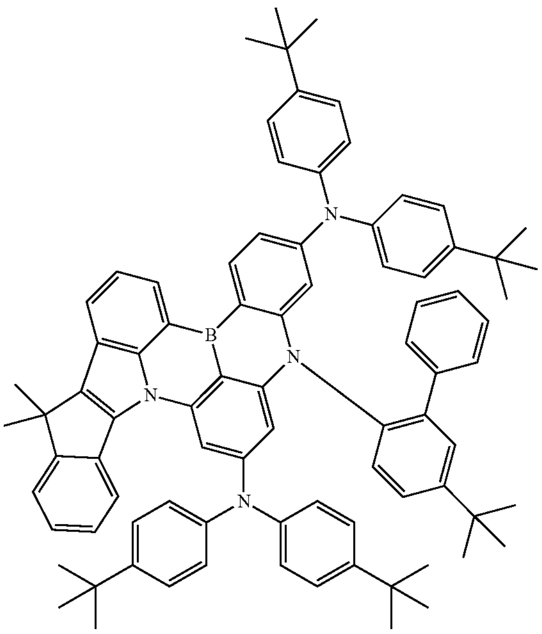
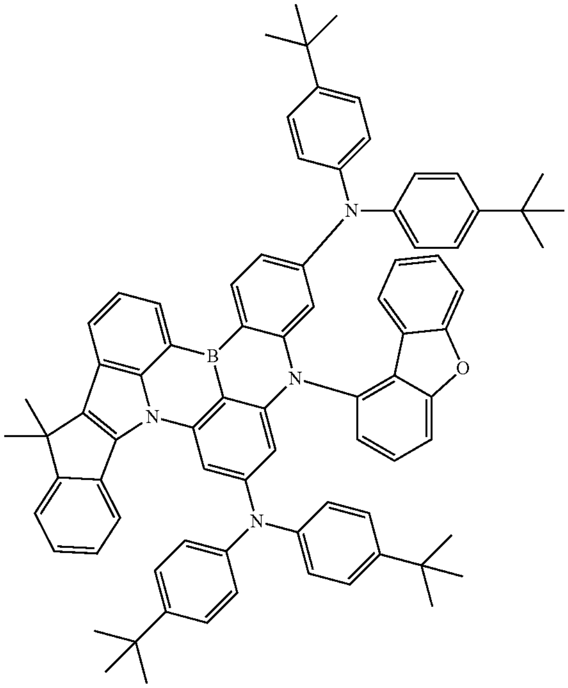

-continued
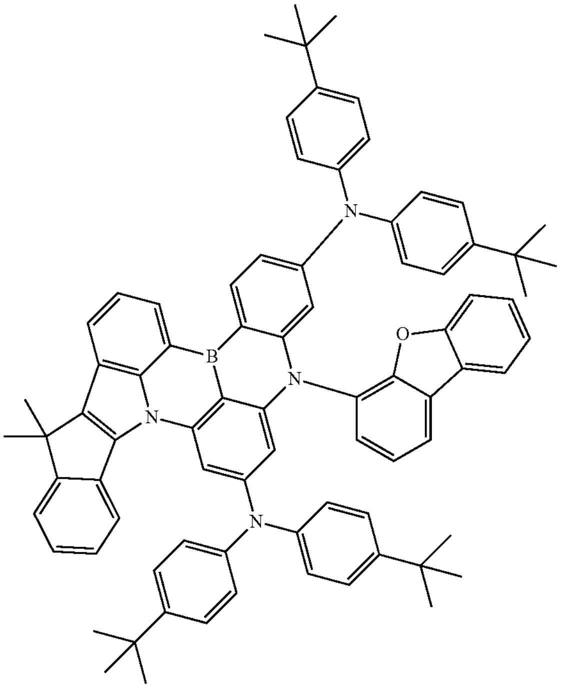
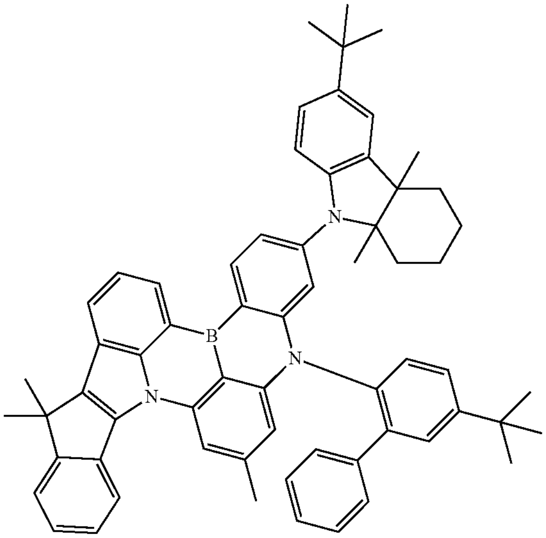
-continued
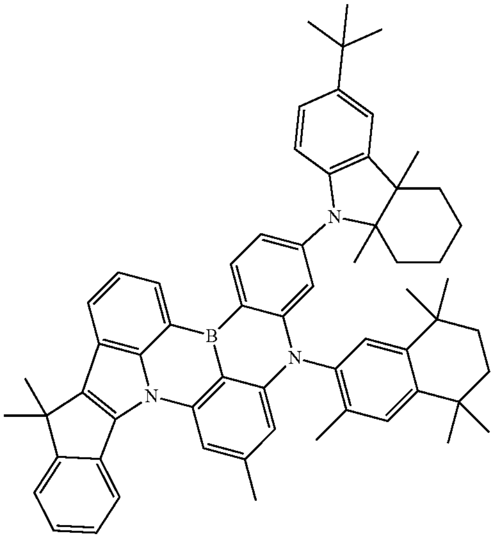
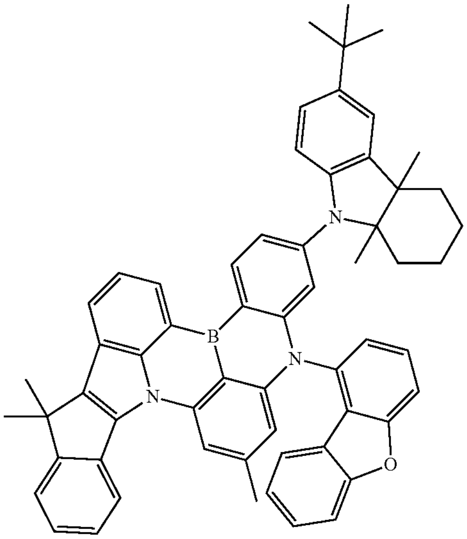
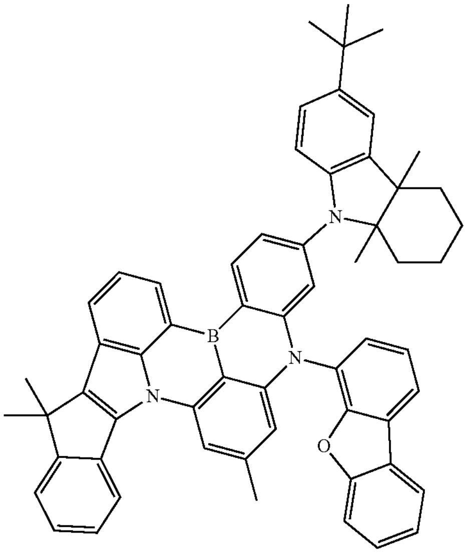

-continued
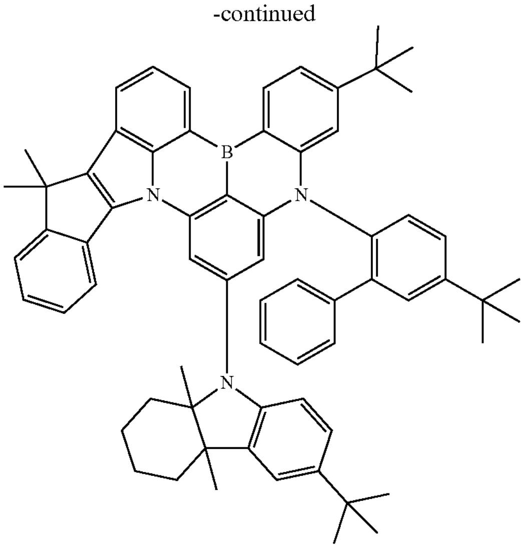
-continued
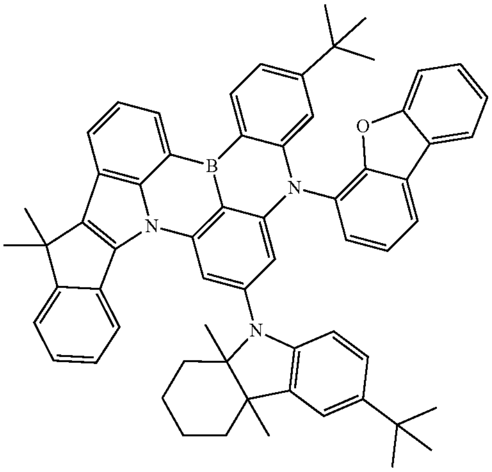
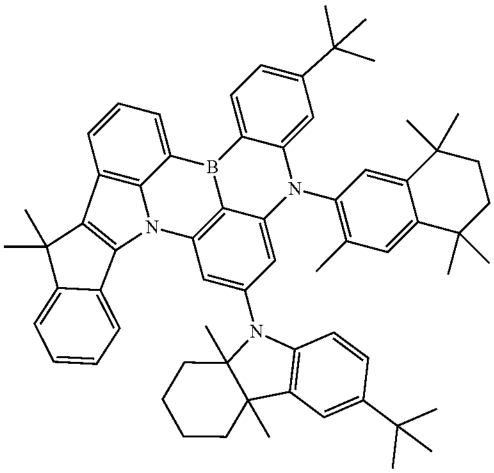
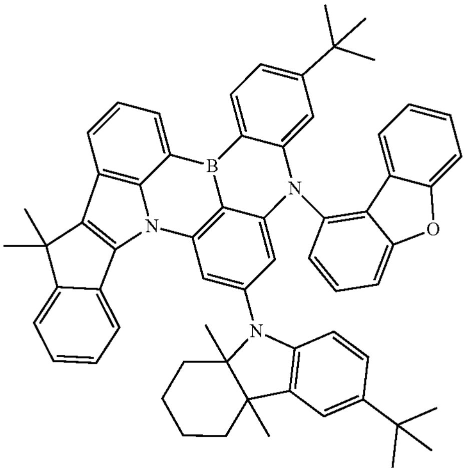
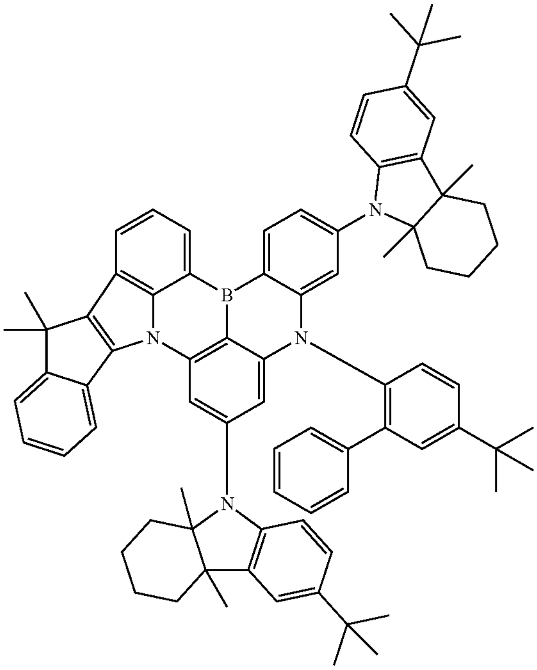

-continued
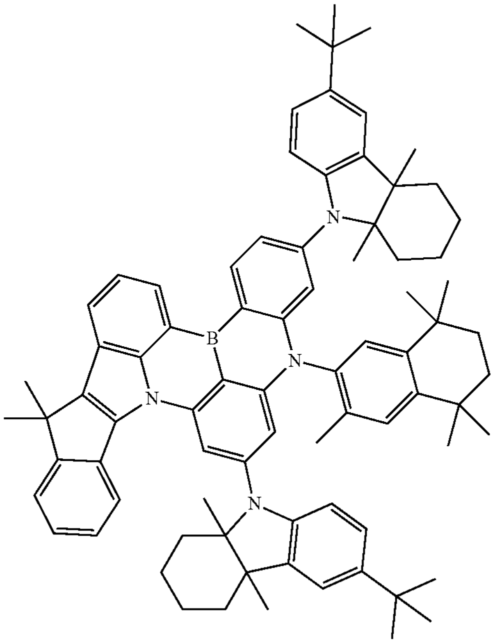
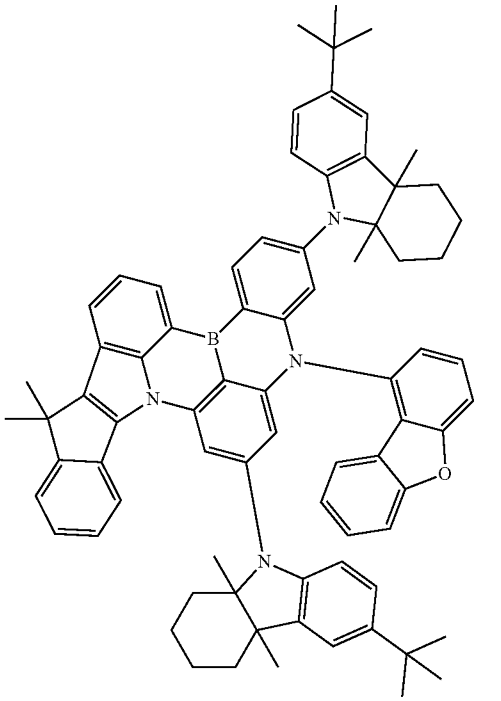
-continued
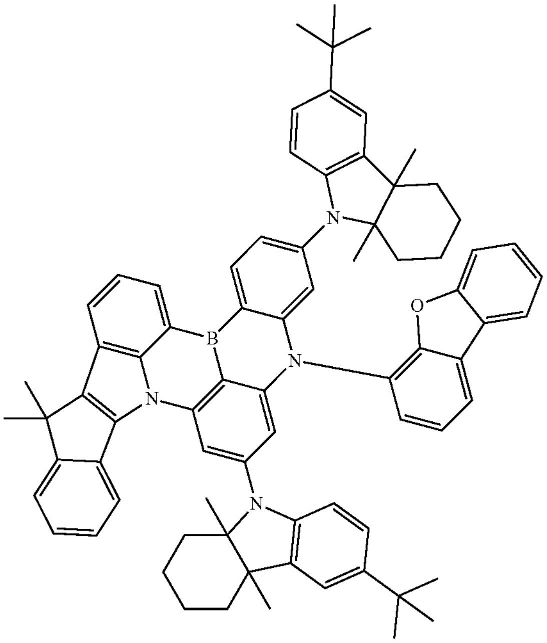
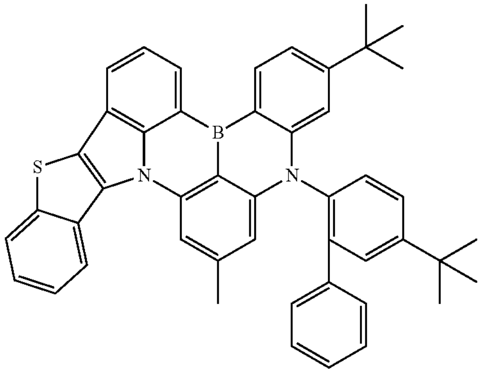
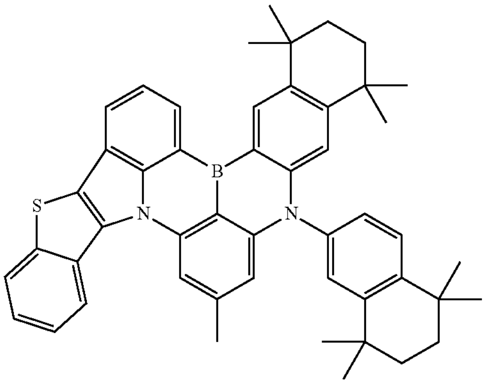

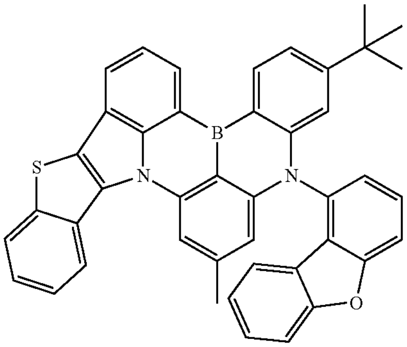
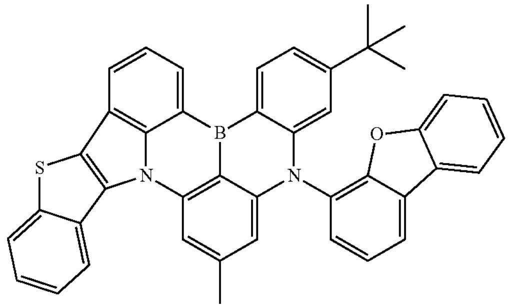
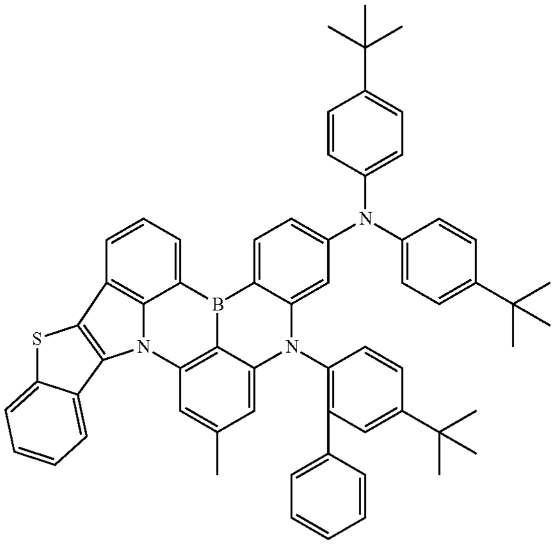
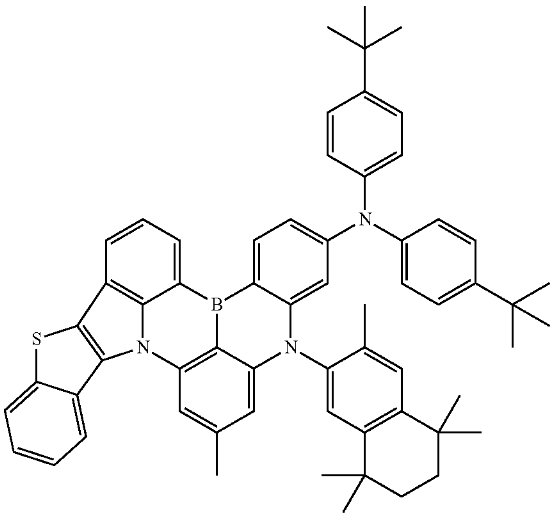
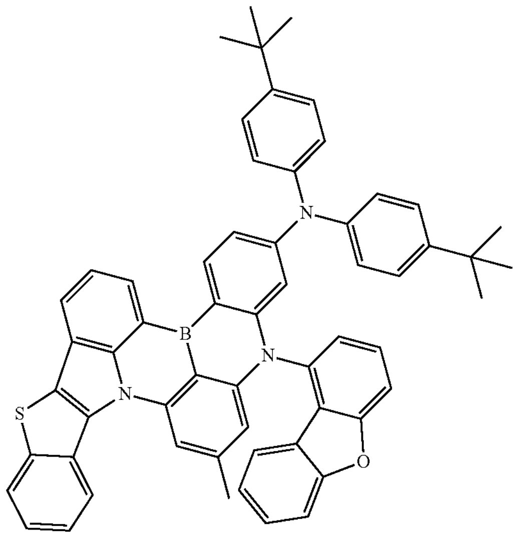
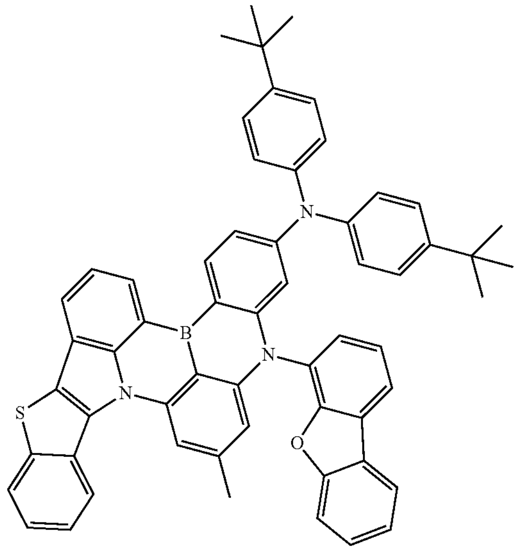
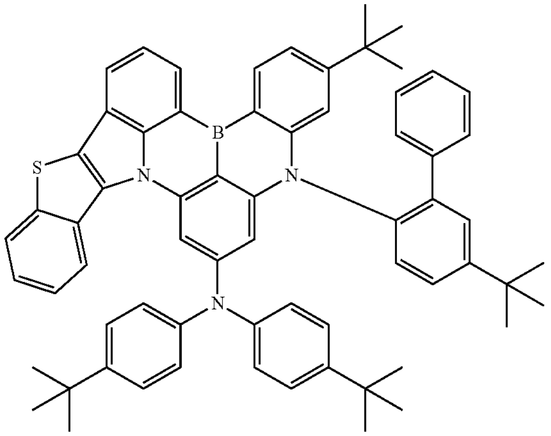

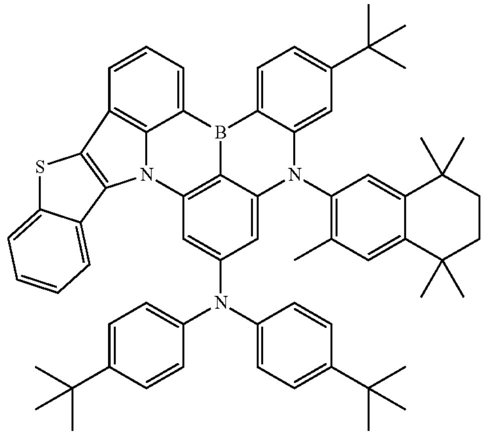
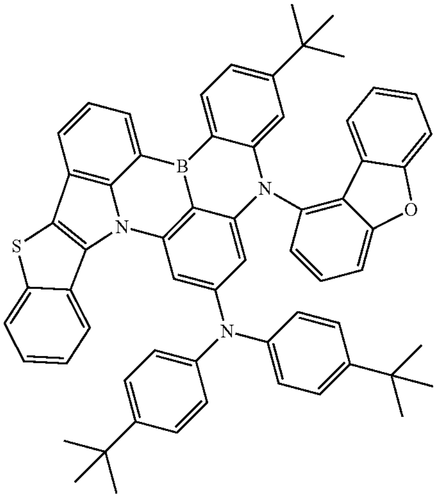
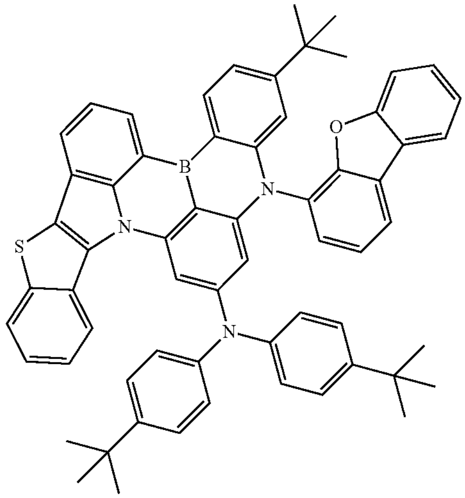
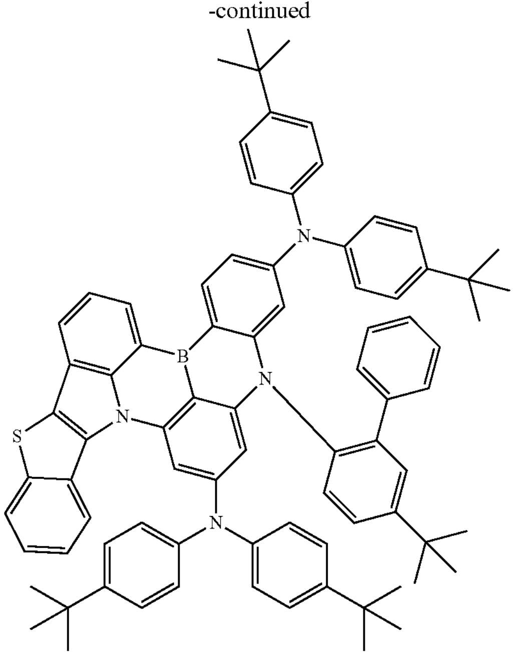
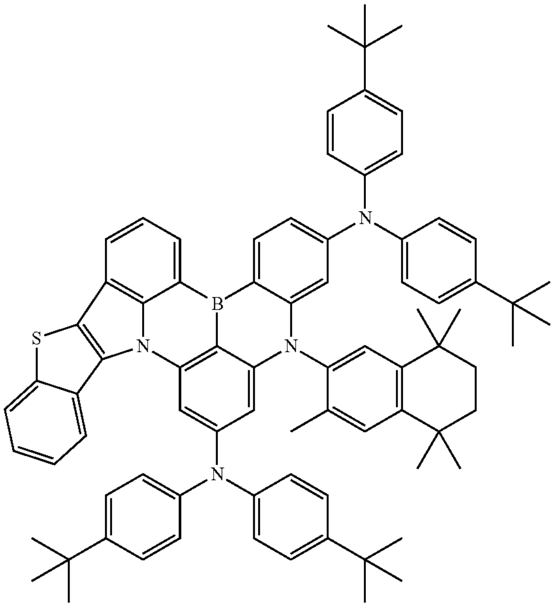

-continued
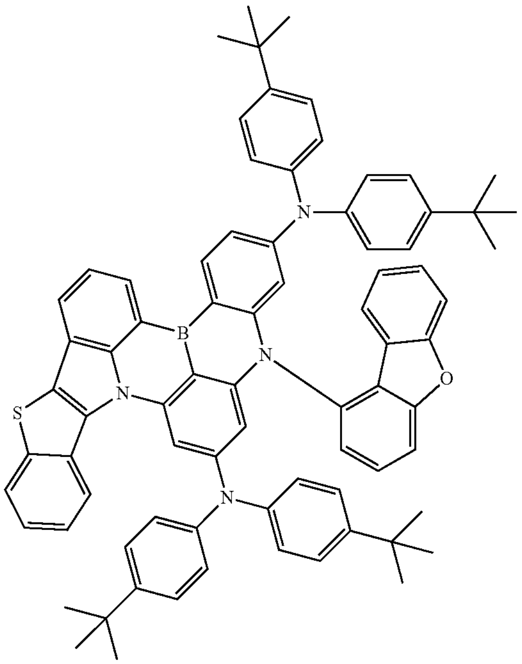
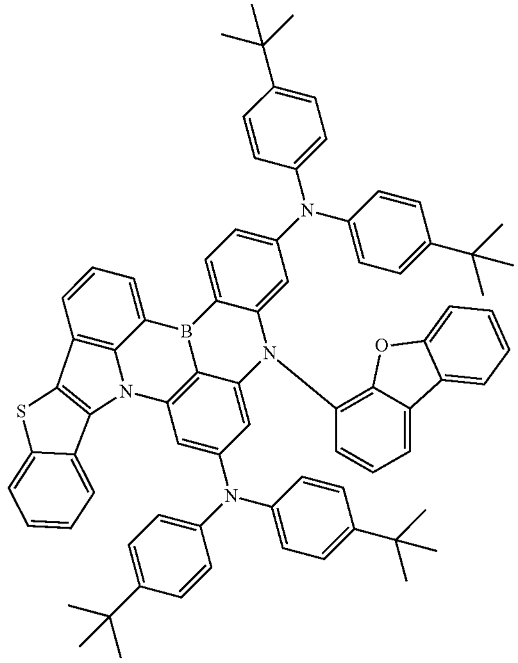
-continued
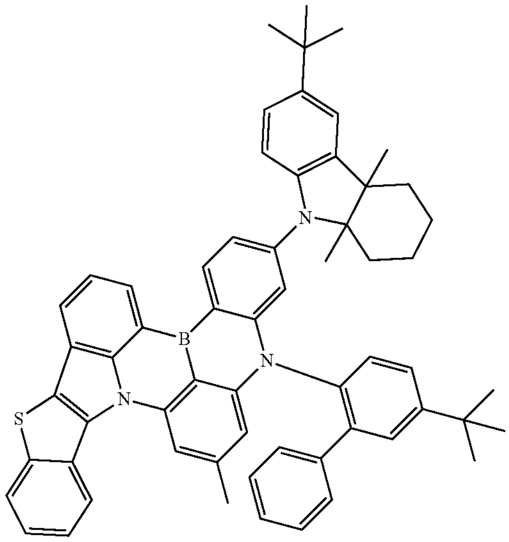
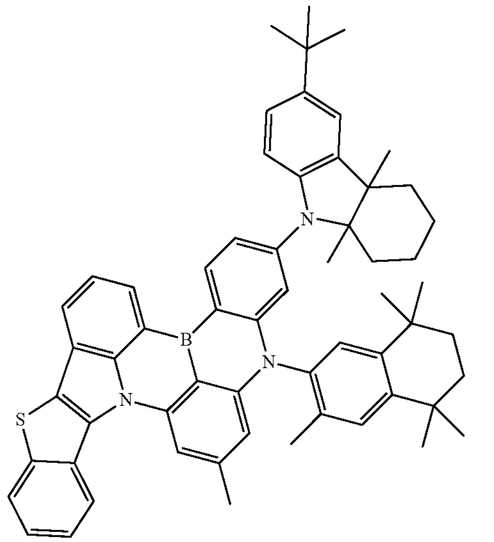
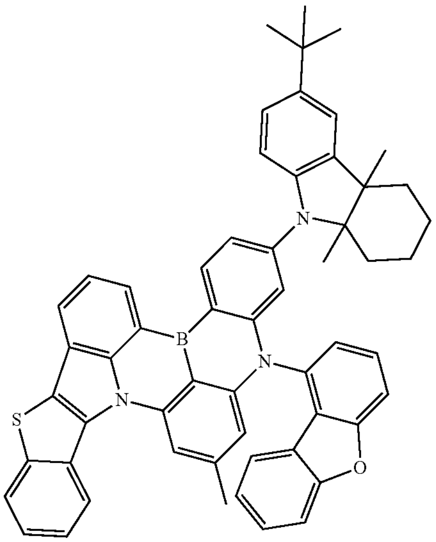

-continued
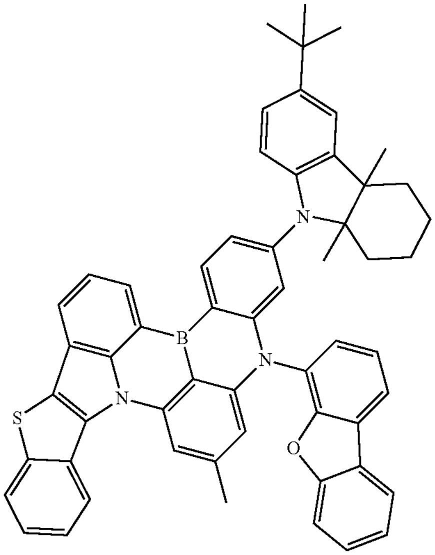
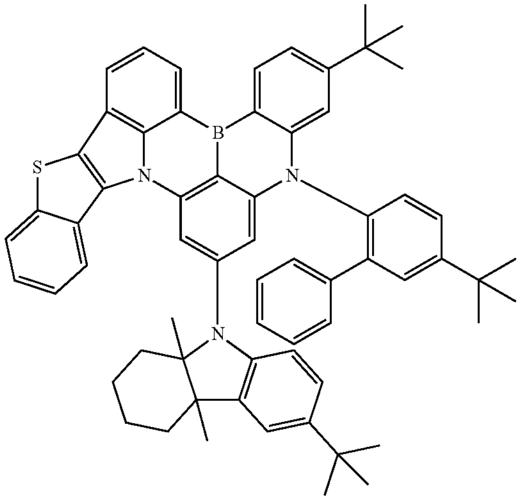
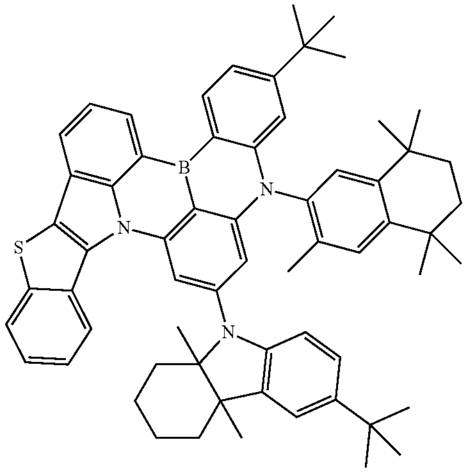
-continued
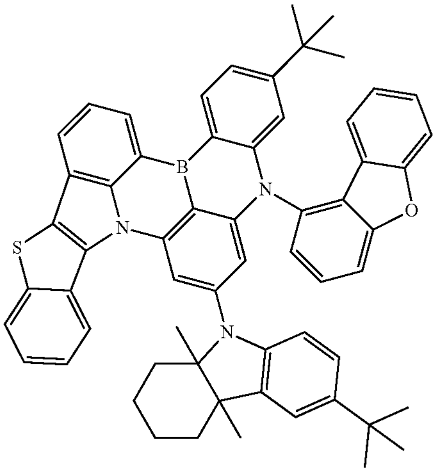
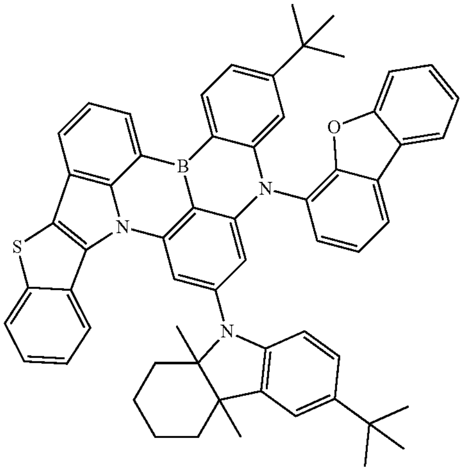
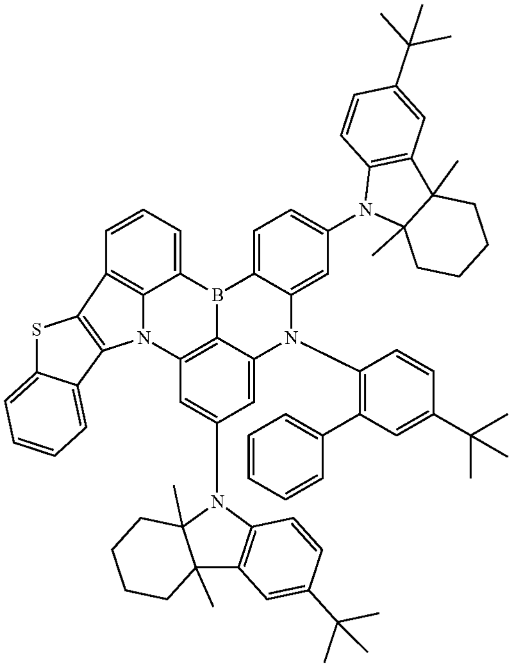

-continued
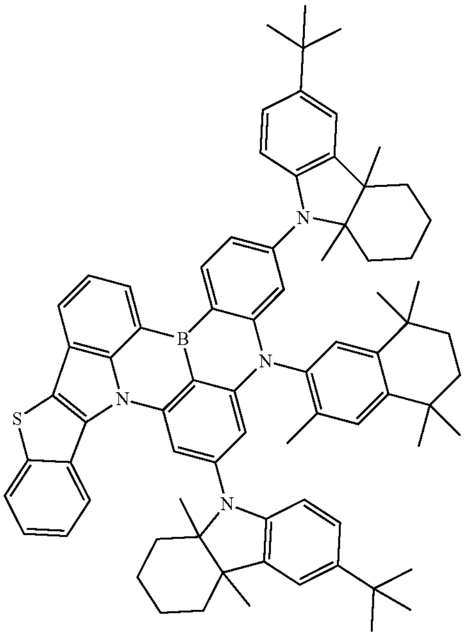
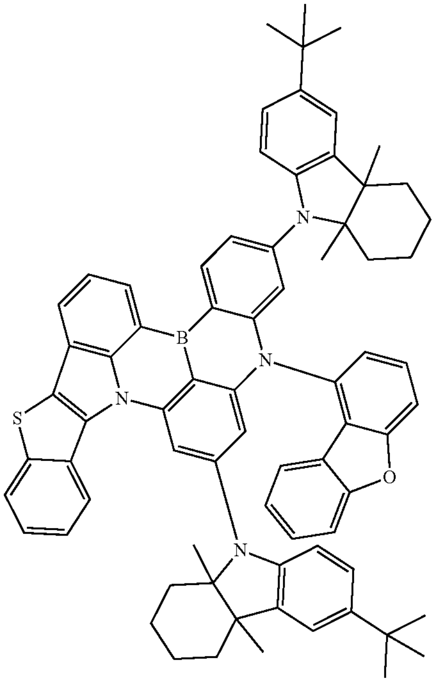
-continued
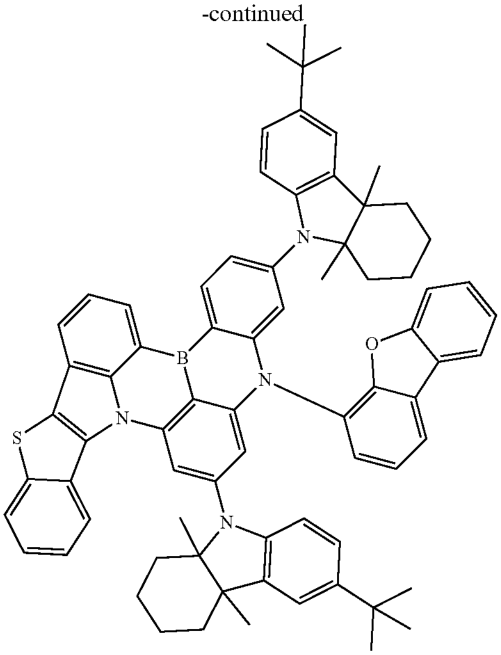
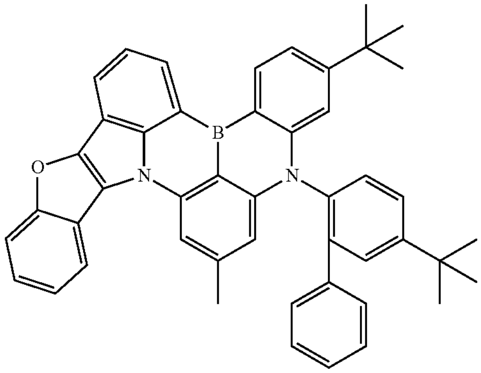
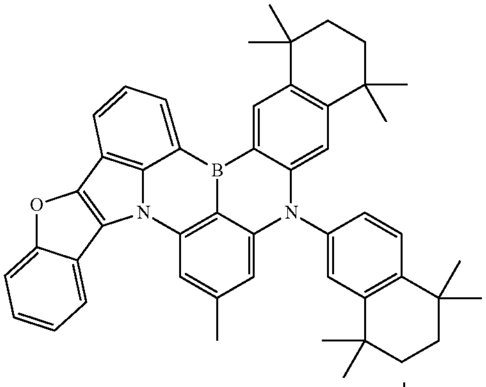
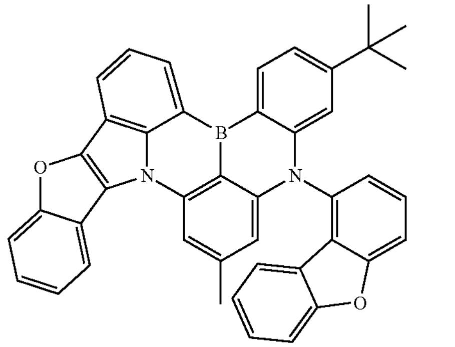

-continued
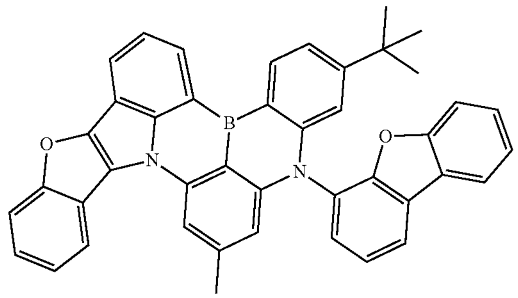
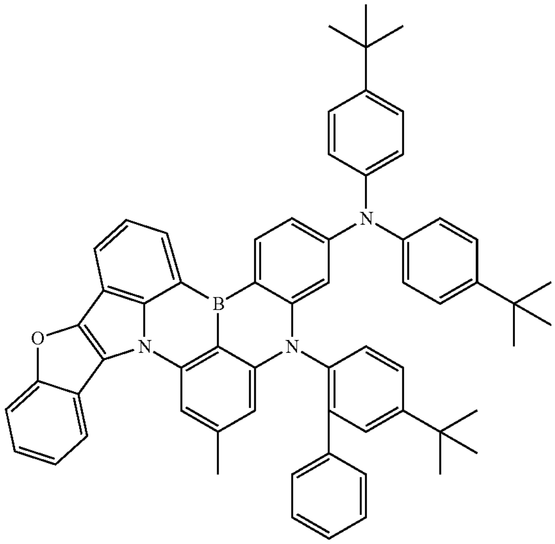
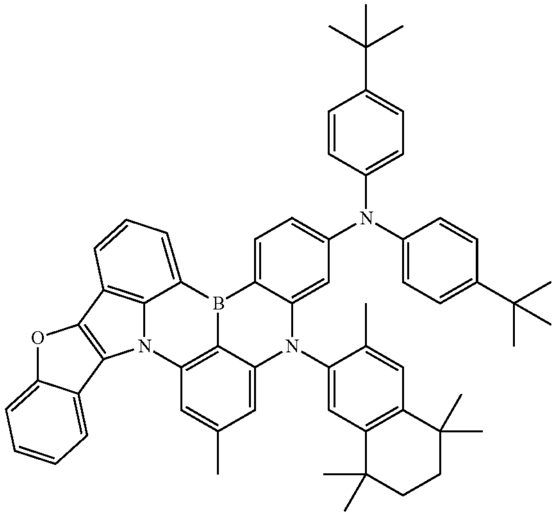
-continued
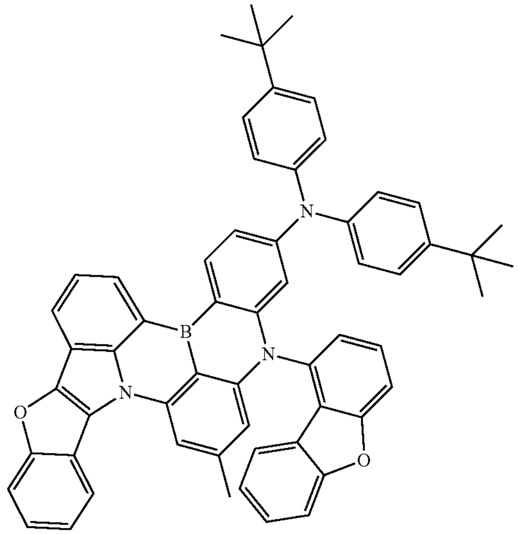
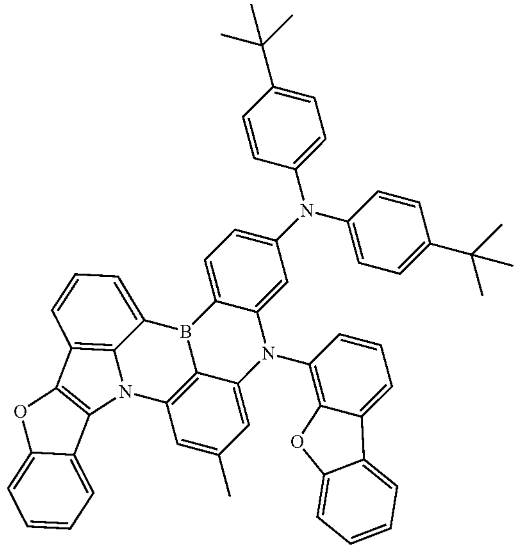
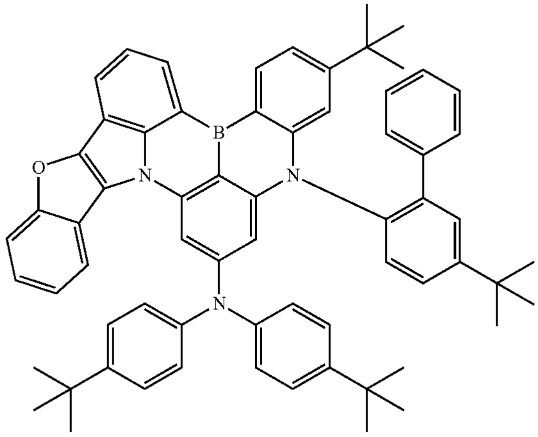

-continued
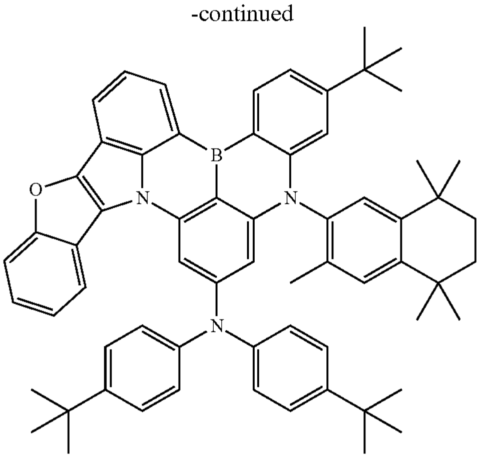
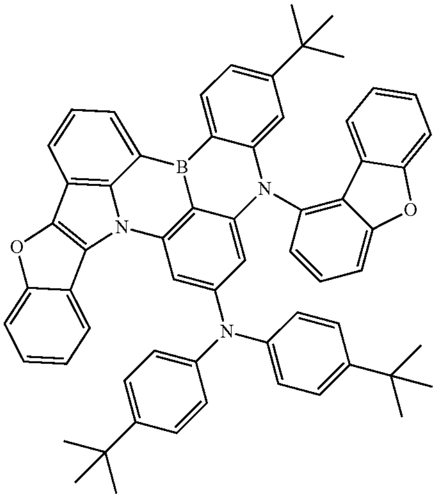
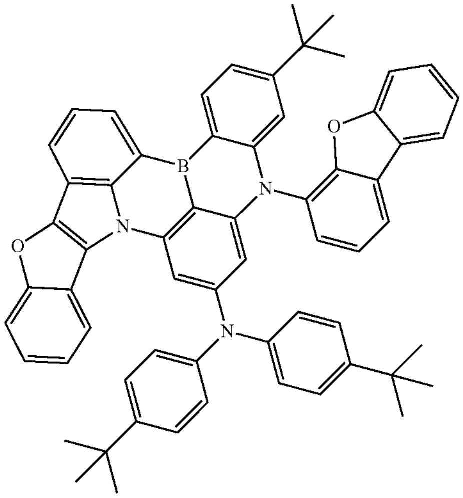
-continued
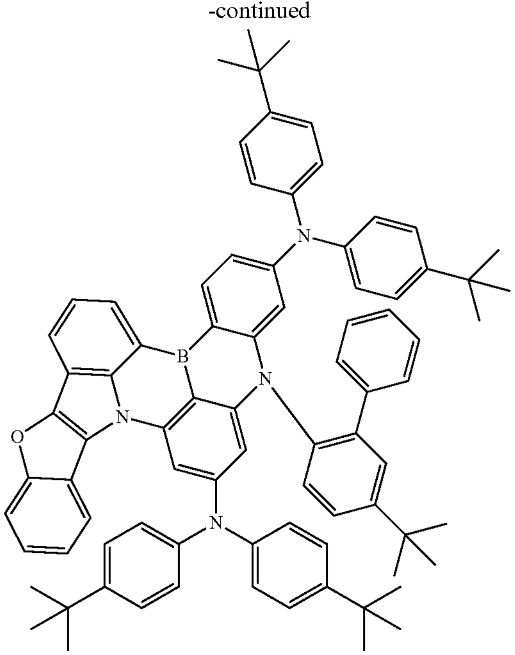
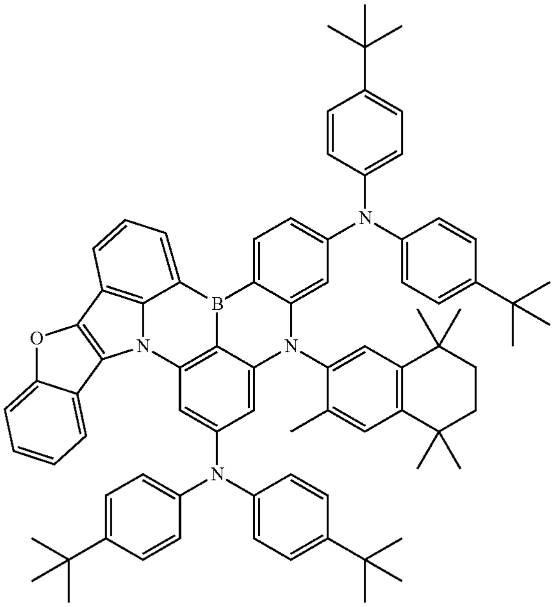

-continued
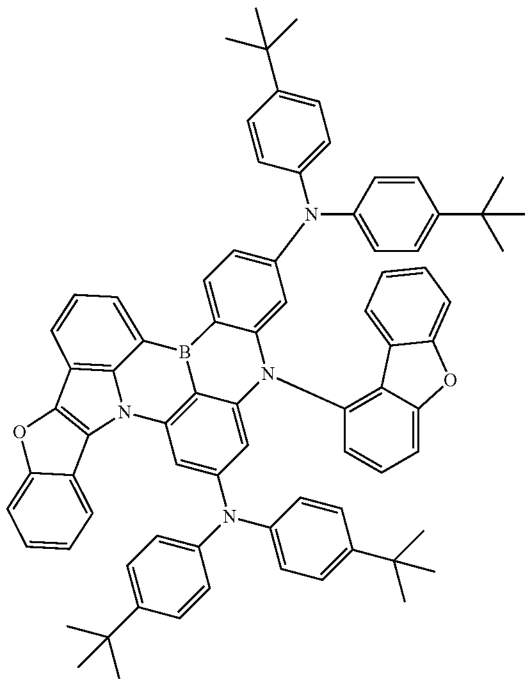
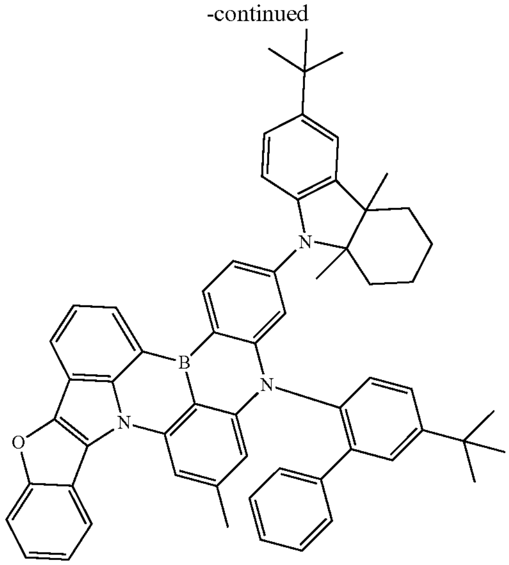
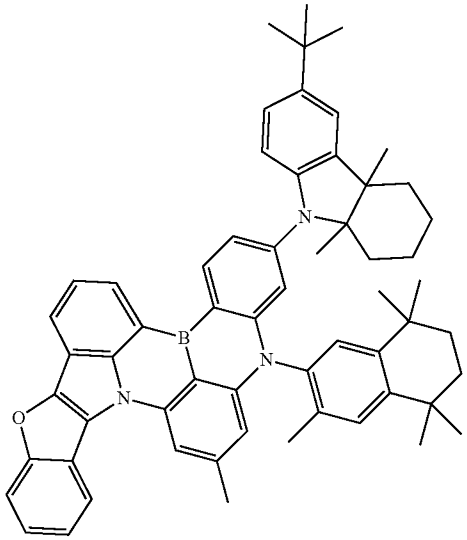
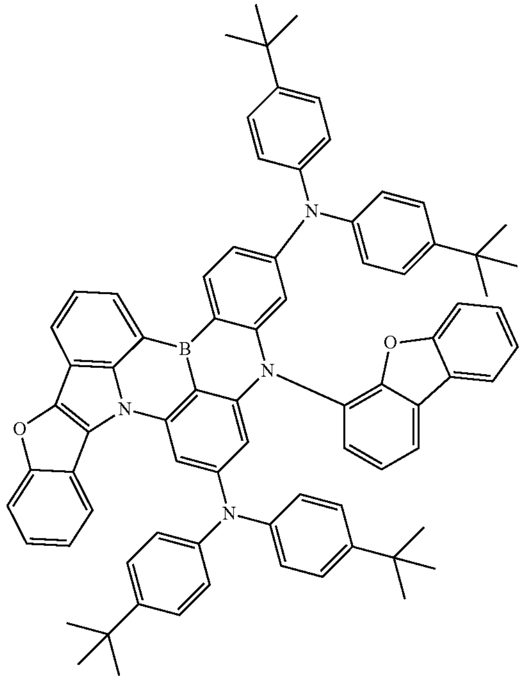
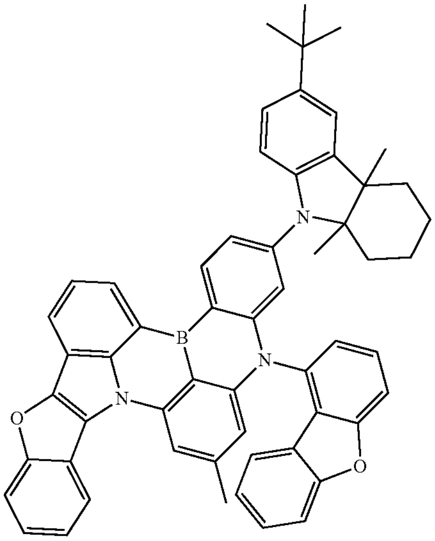

-continued
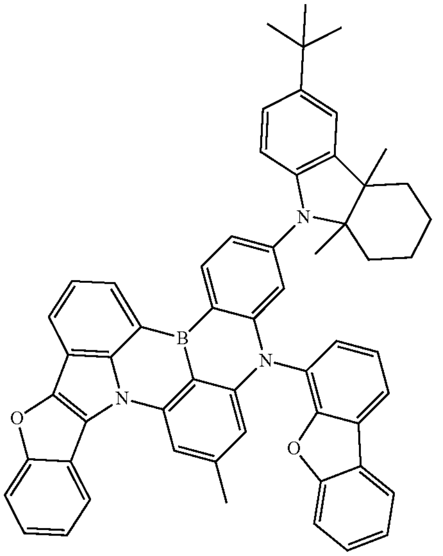
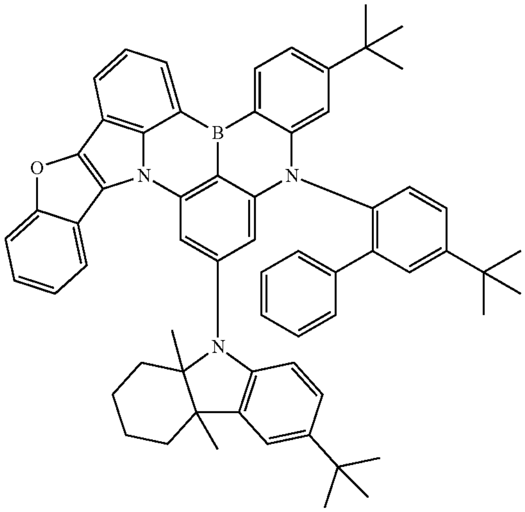
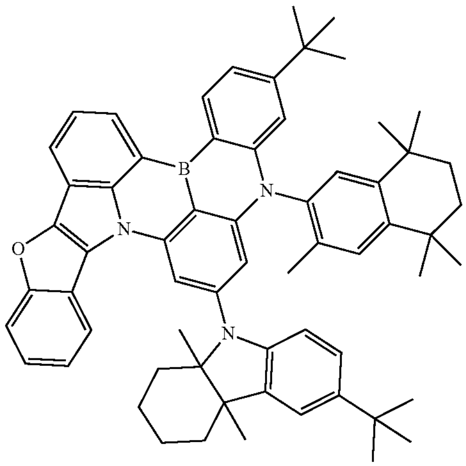
-continued
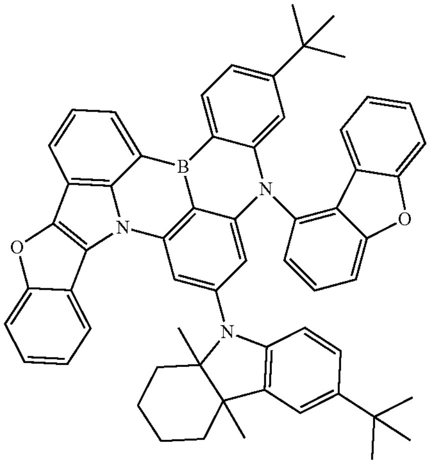
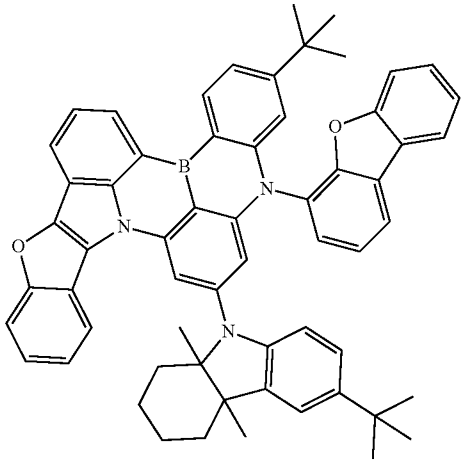
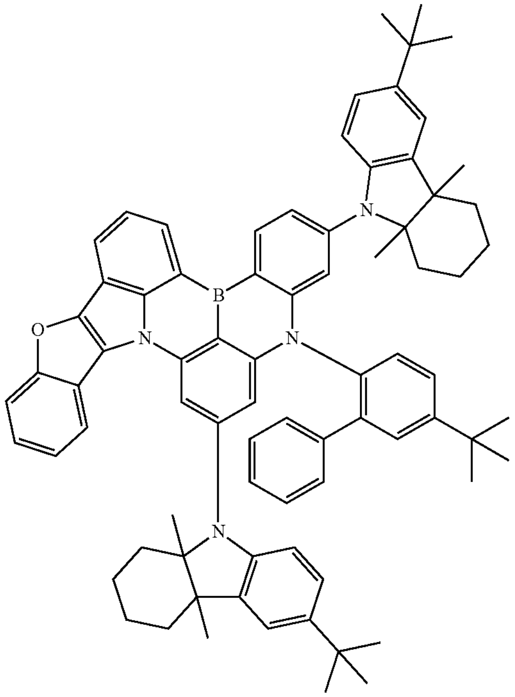

-continued
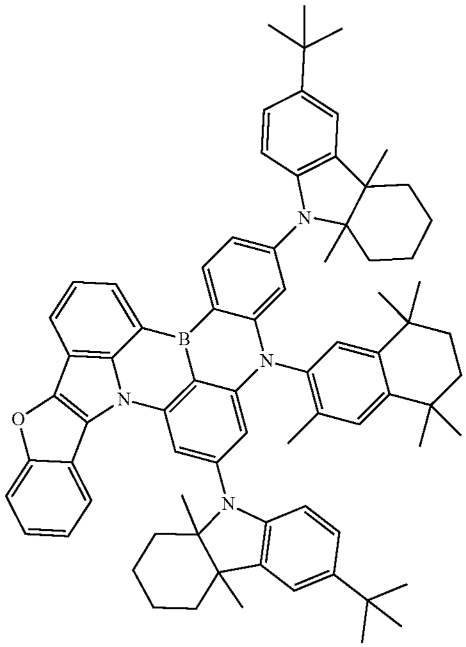
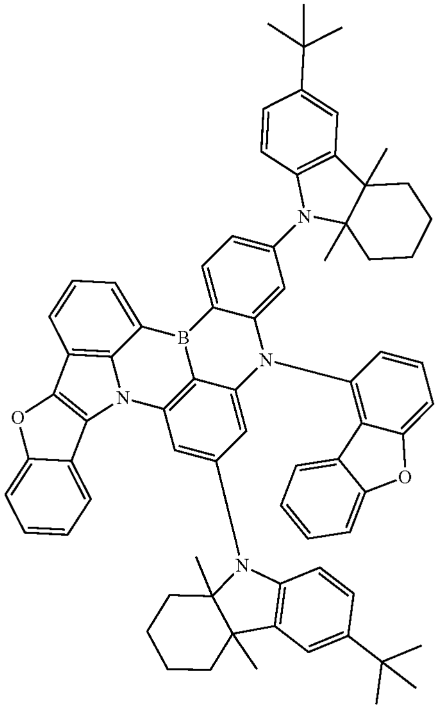
-continued
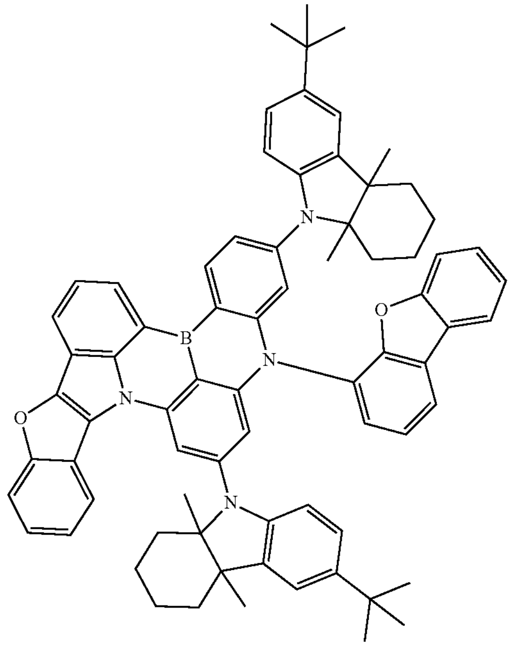
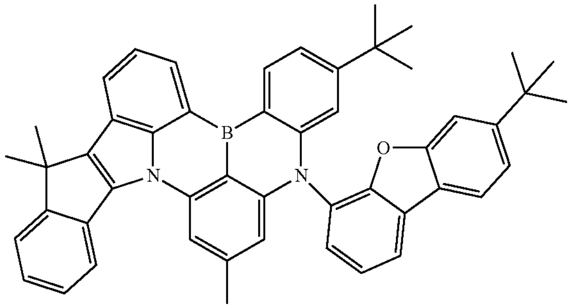
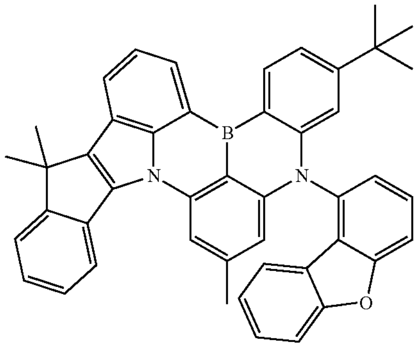
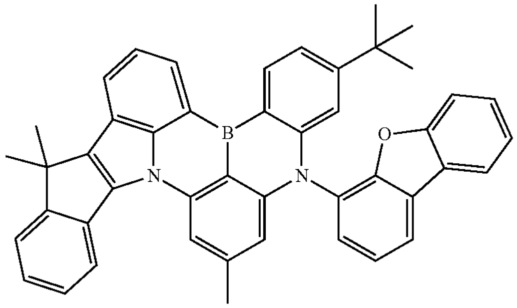

-continued
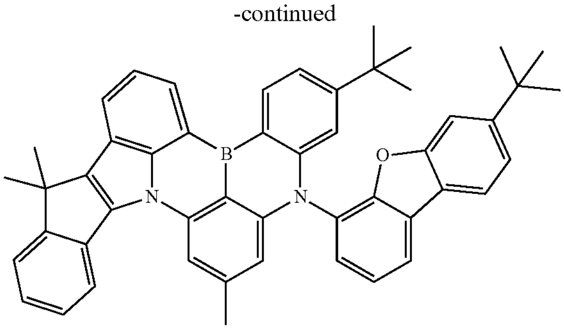
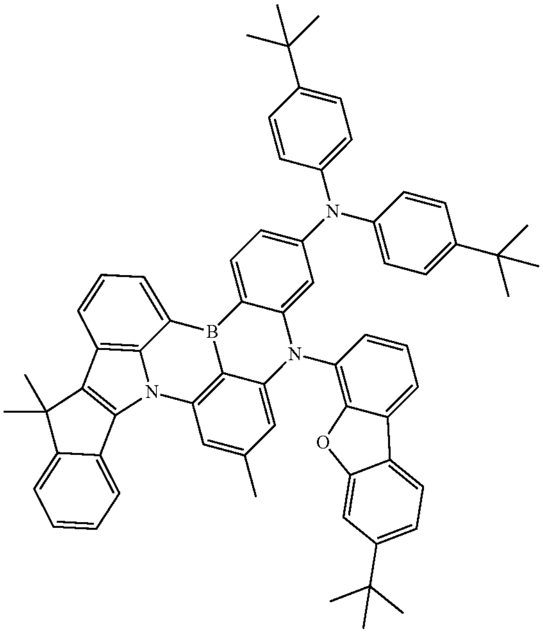
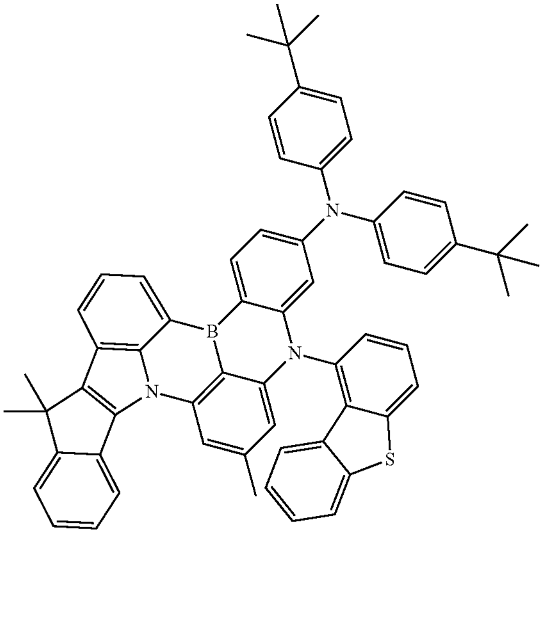
-continued
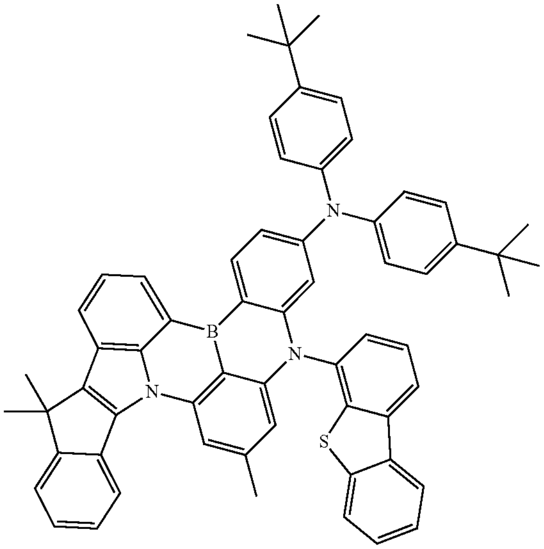
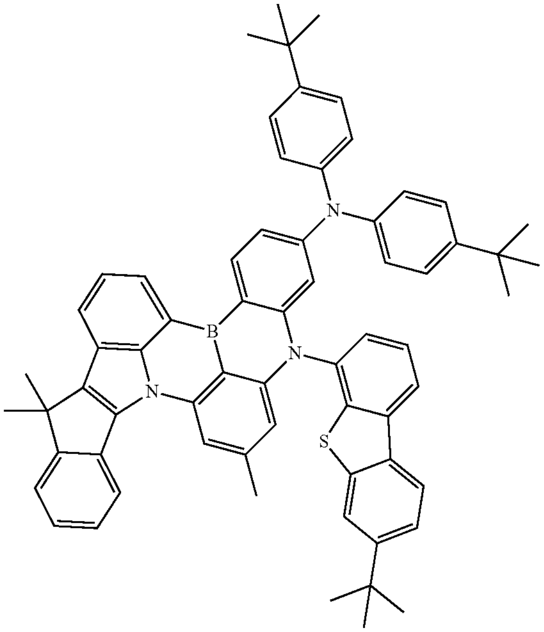
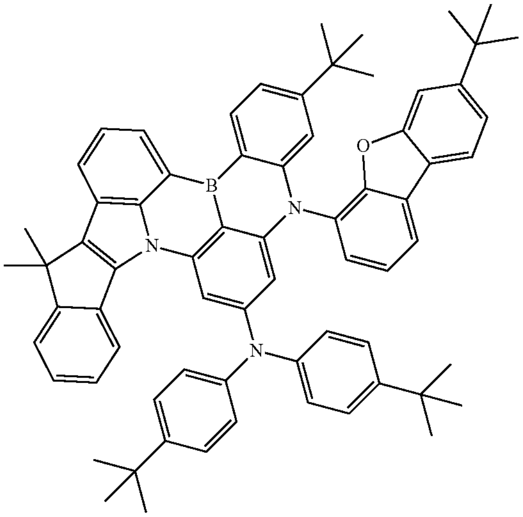

-continued
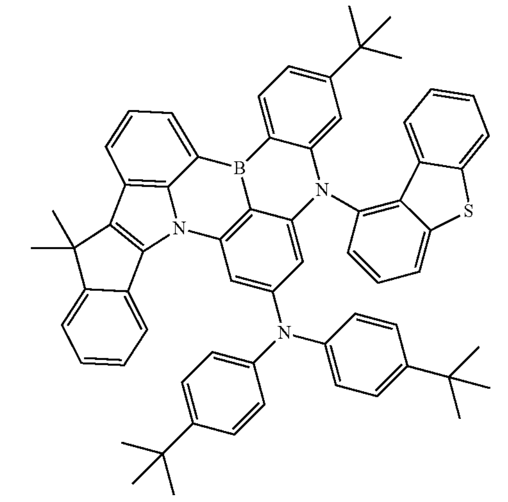
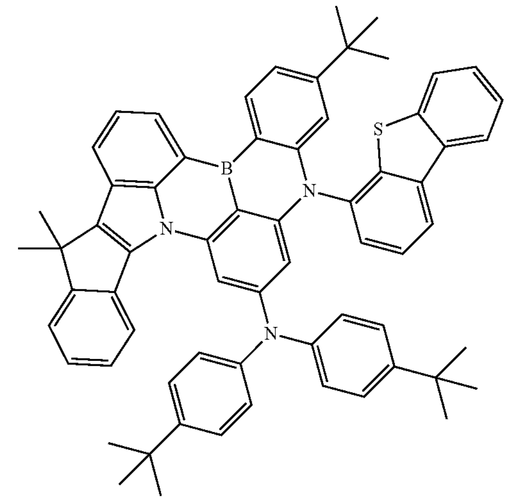
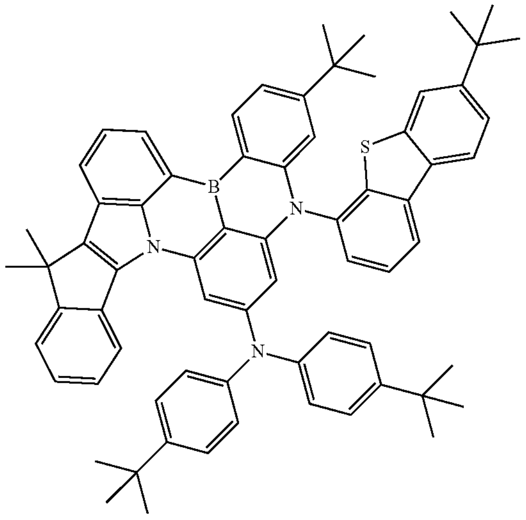
-continued
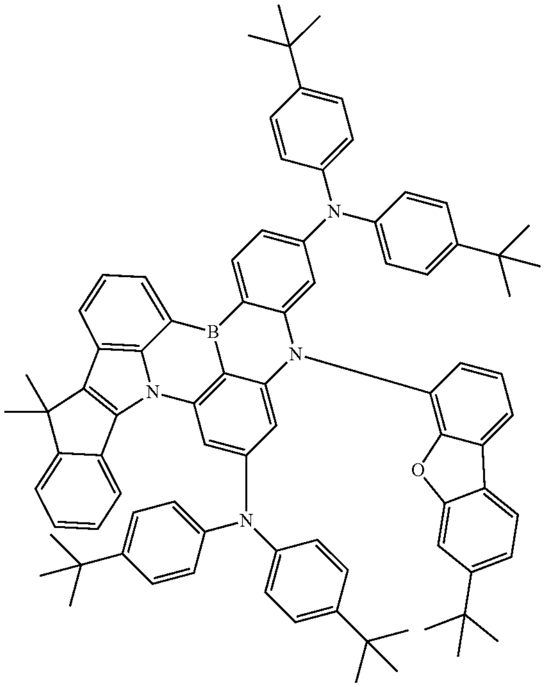
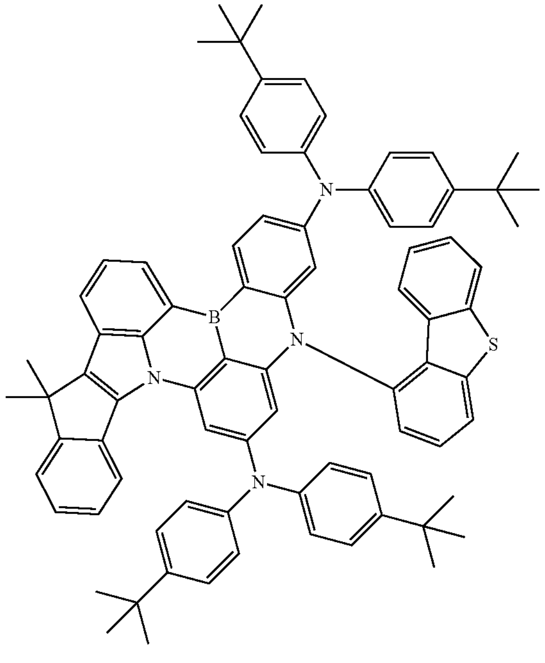

-continued
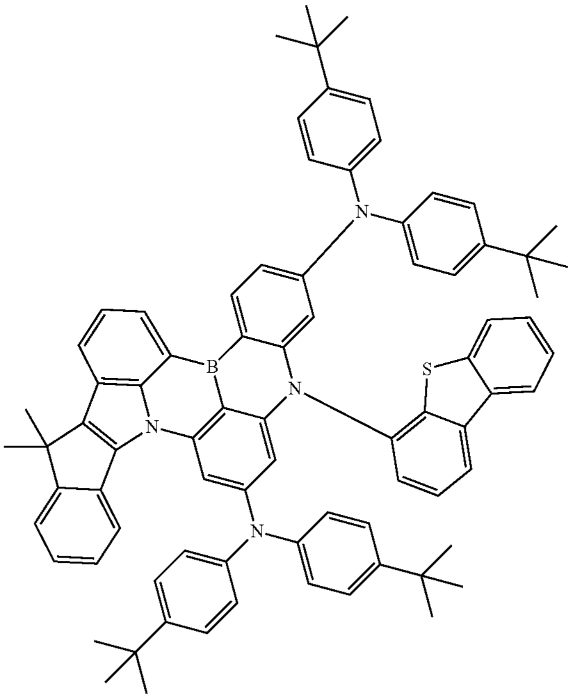
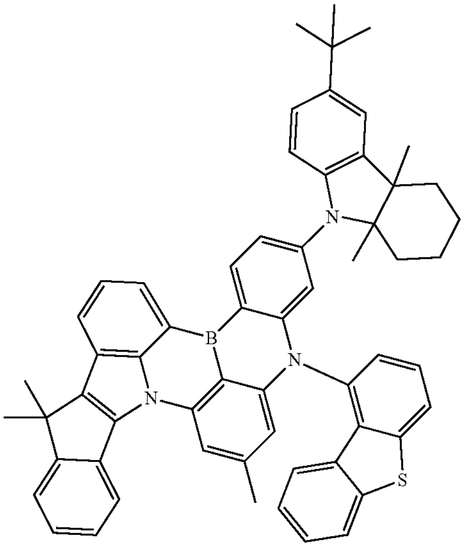
-continued
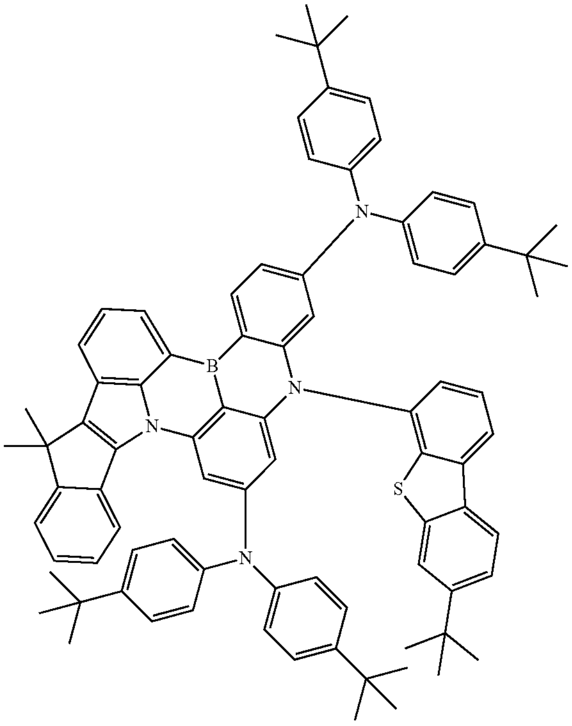
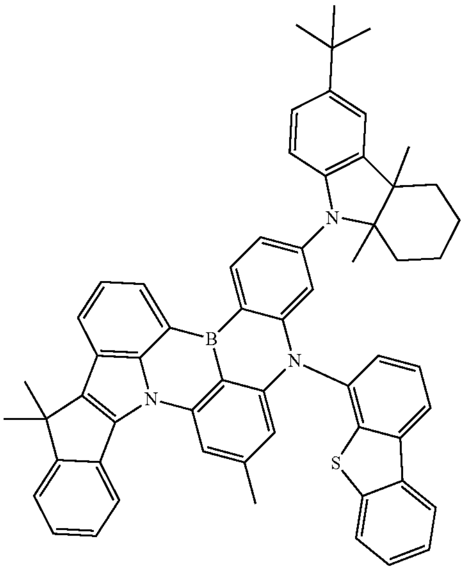

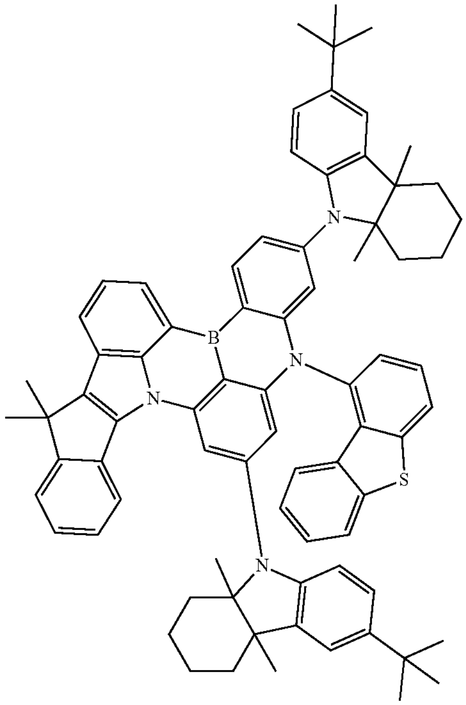
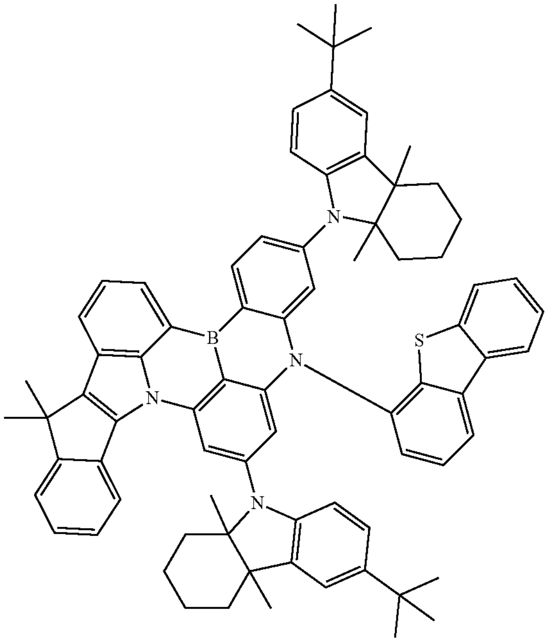
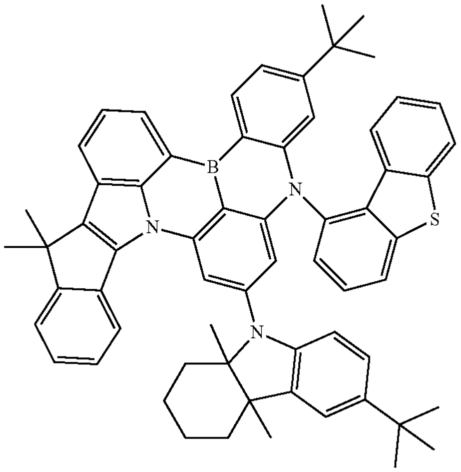
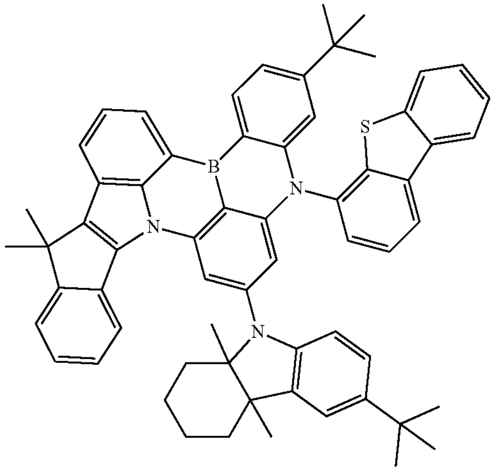
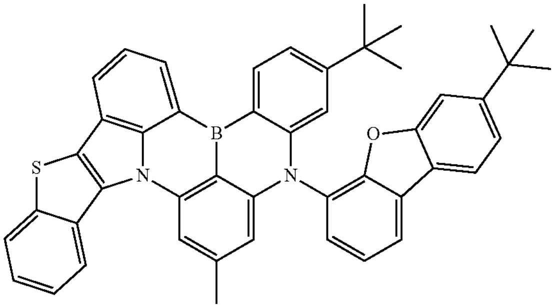
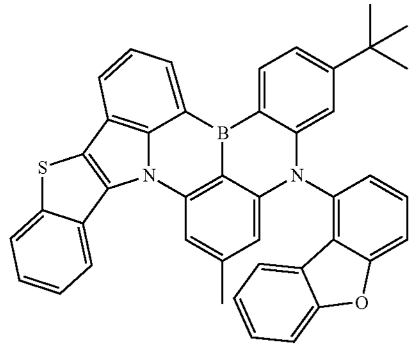

-continued
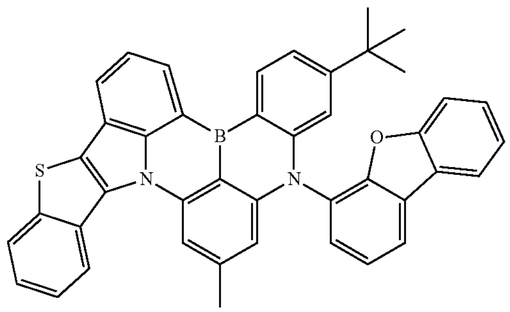
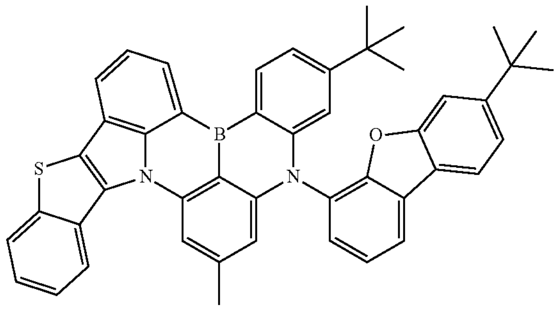
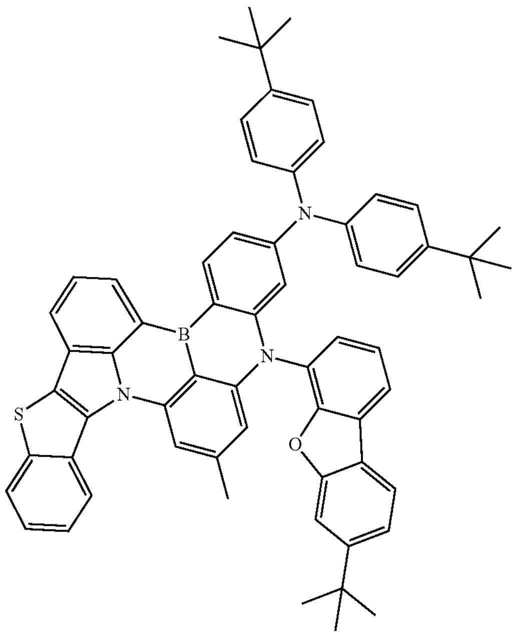
-continued
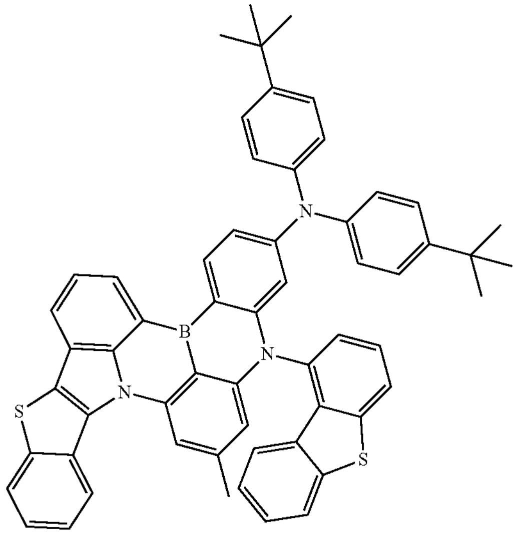
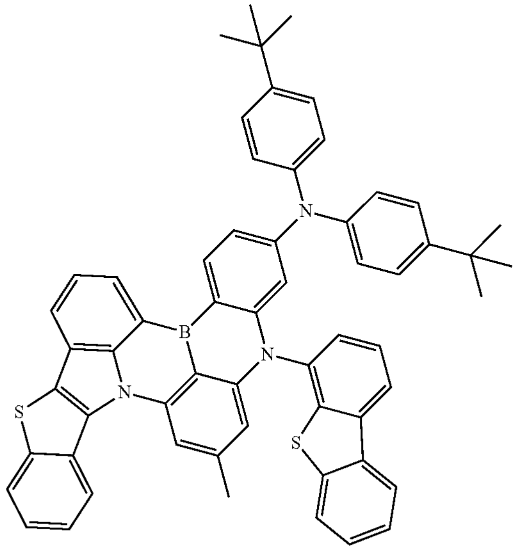
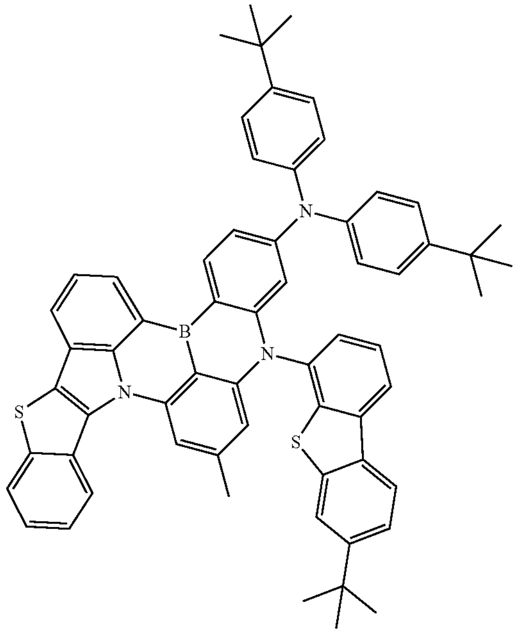

-continued
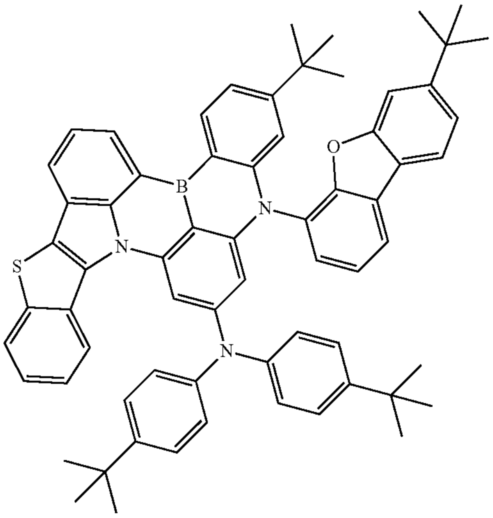
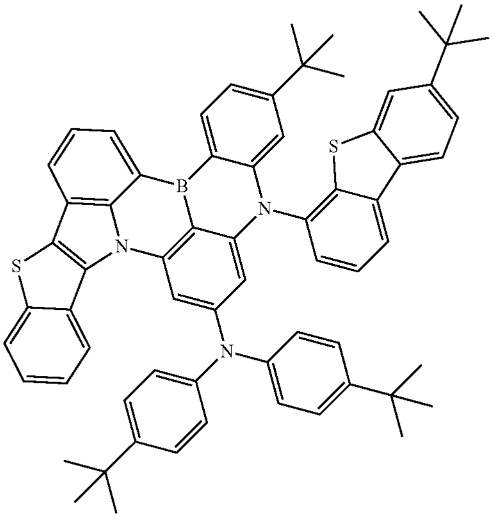
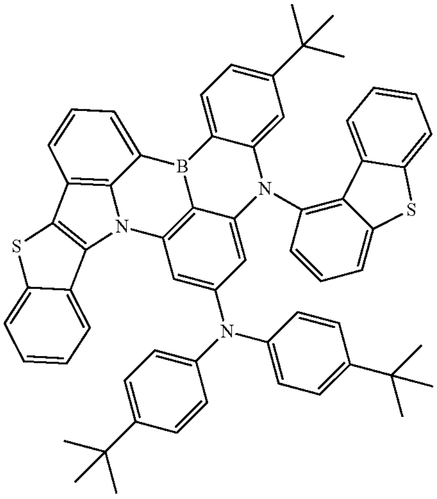
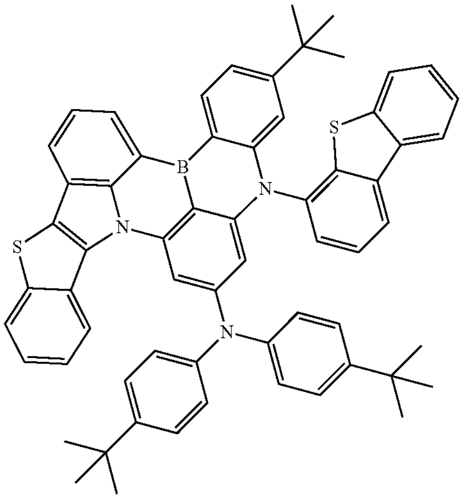
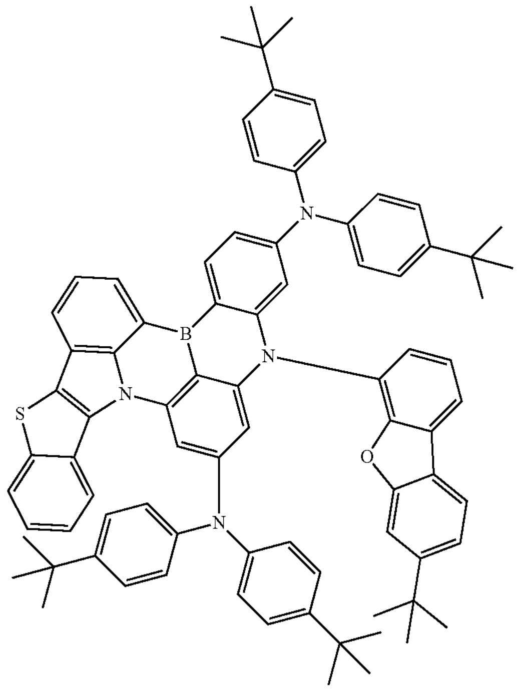

-continued
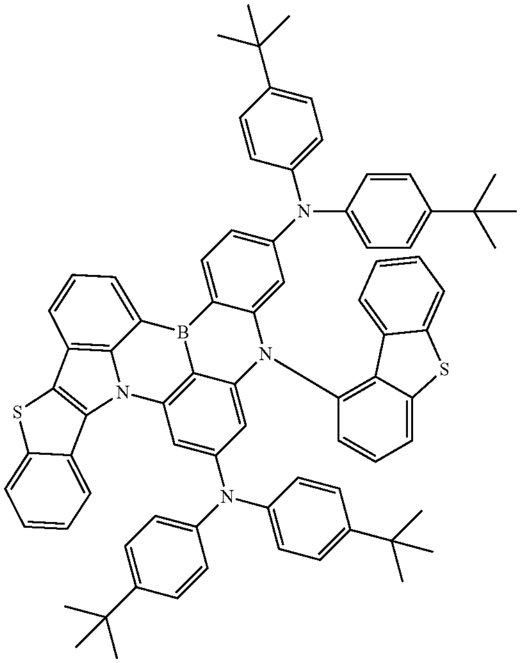
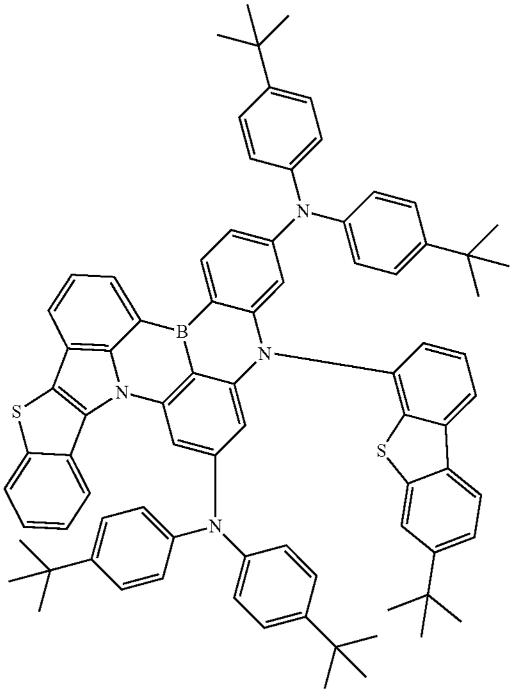
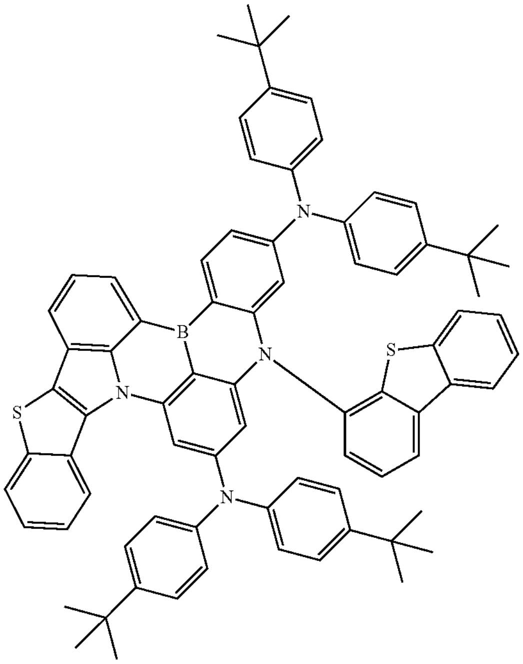
-continued
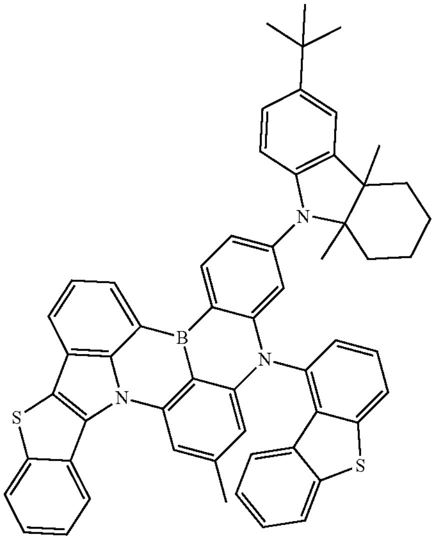

-continued
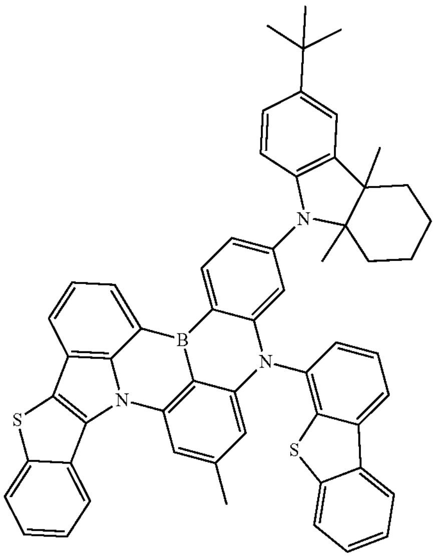
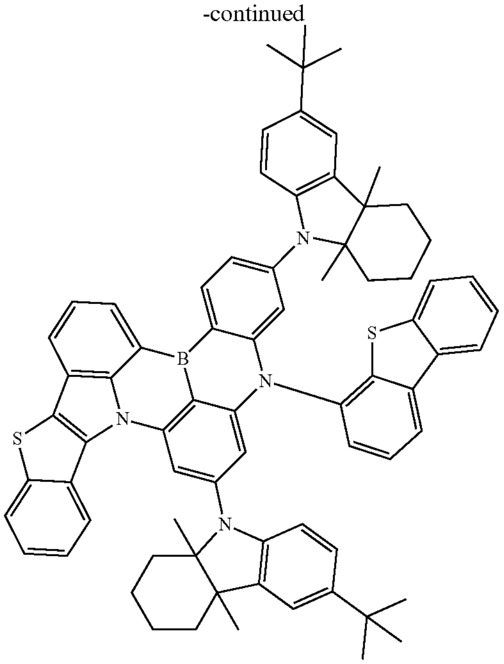
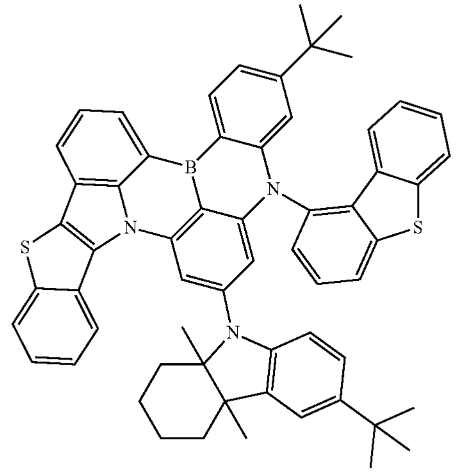
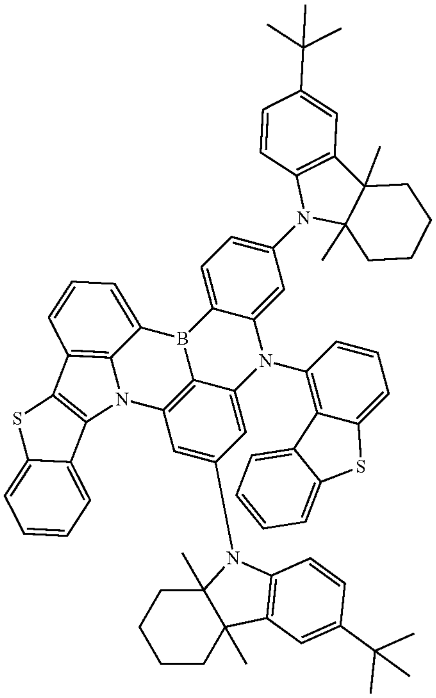
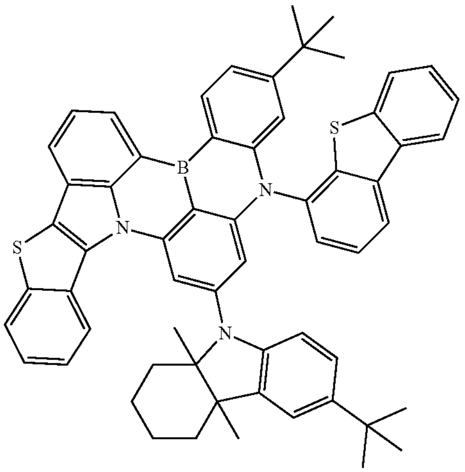

-continued
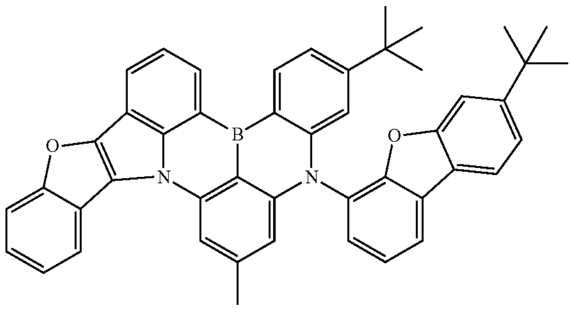
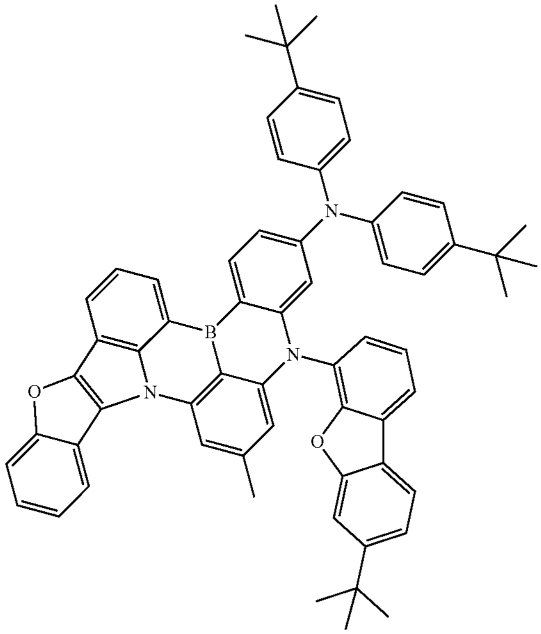
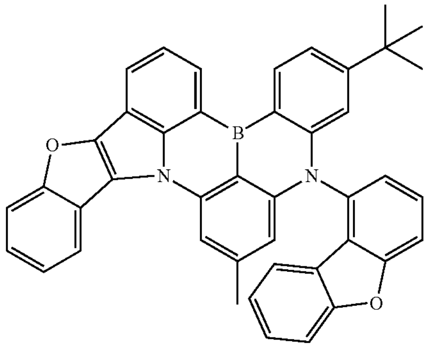
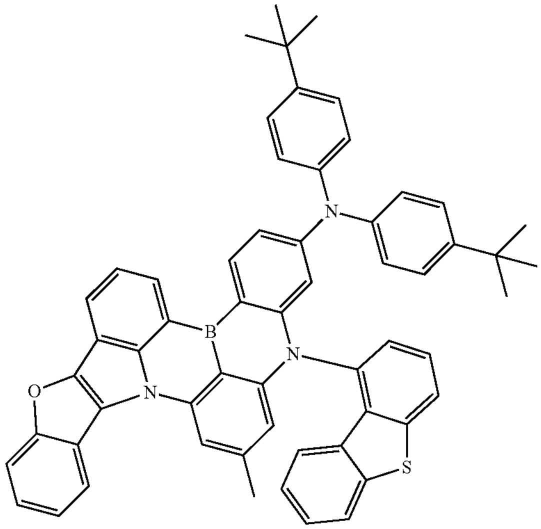
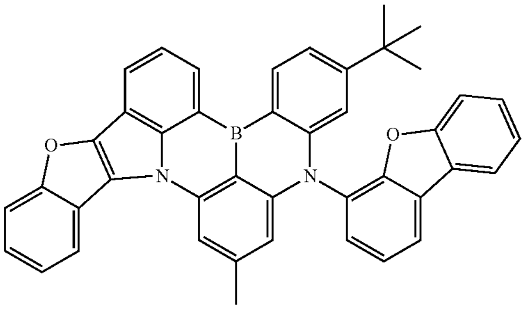
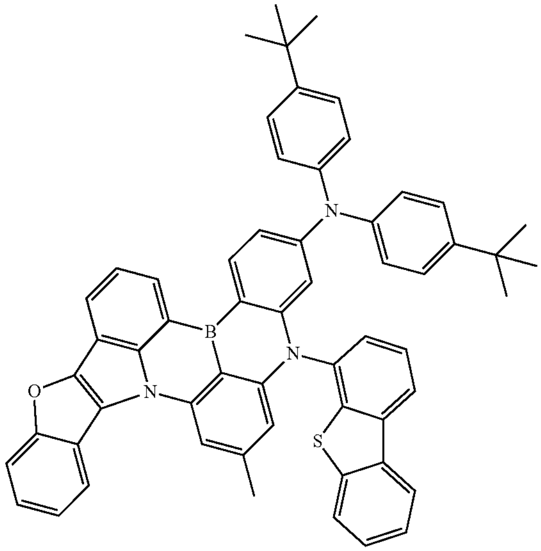
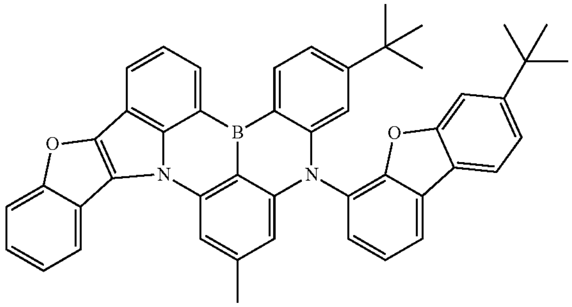

-continued
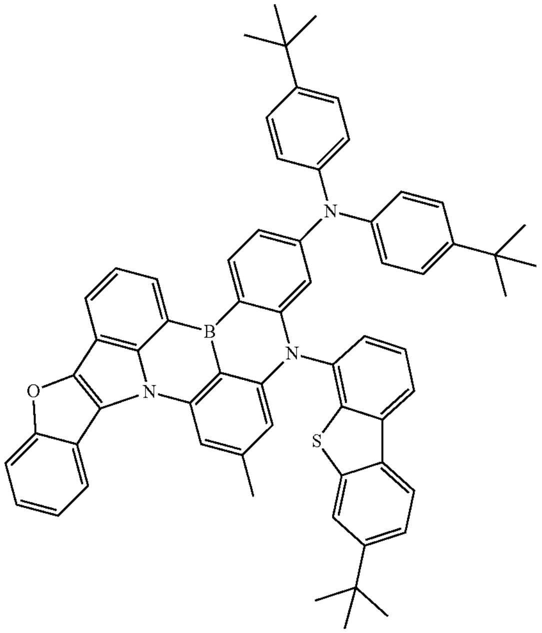
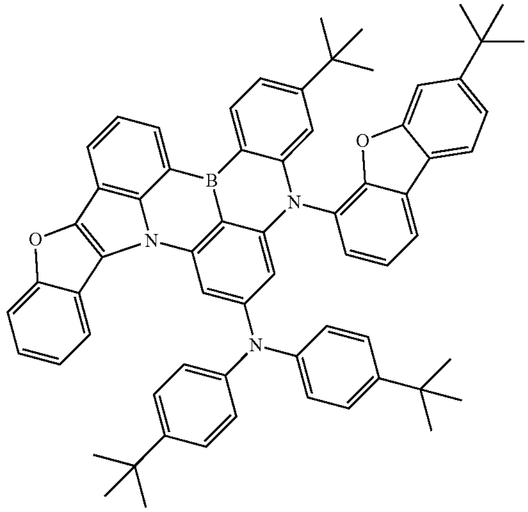
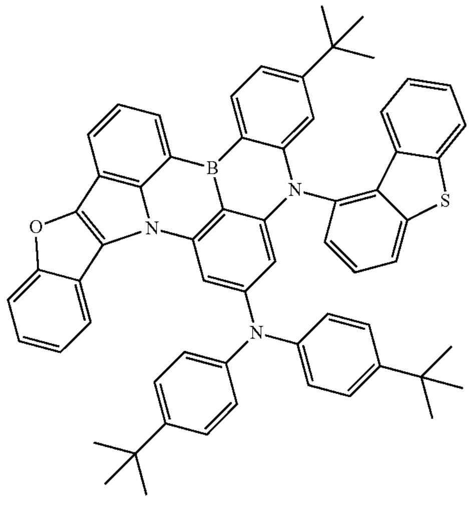
-continued
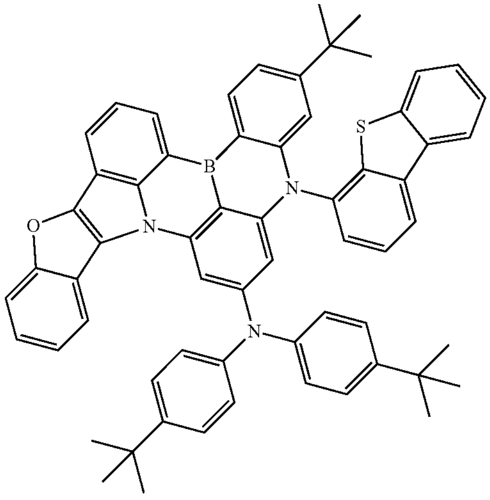
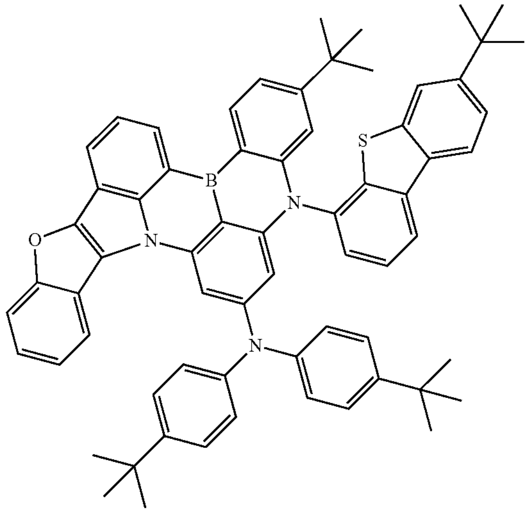
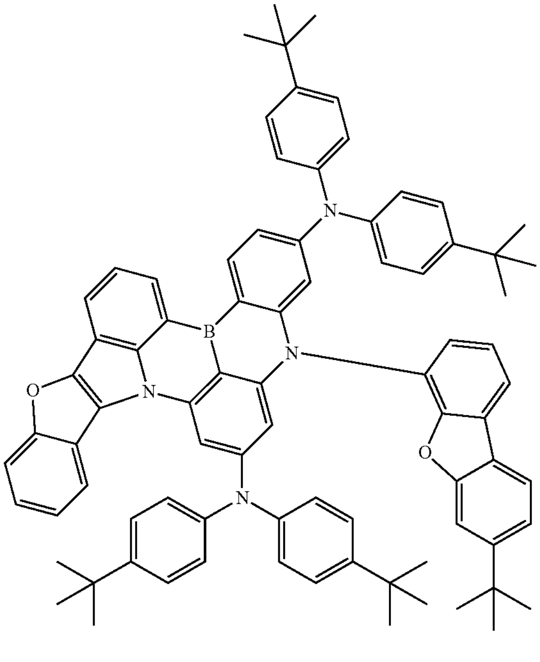

-continued
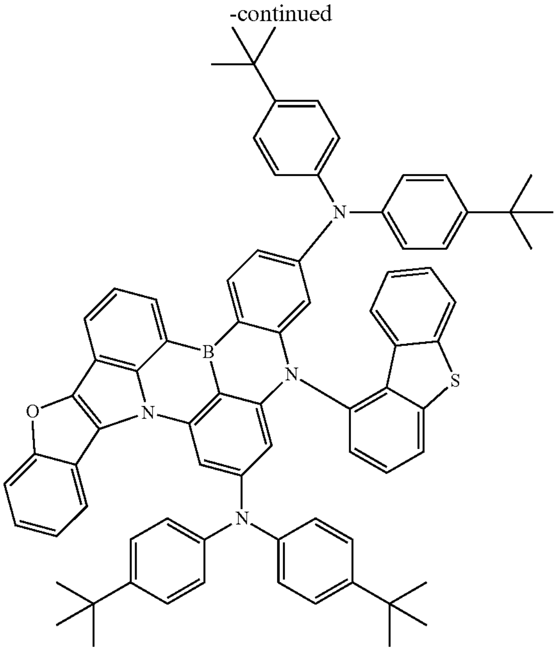
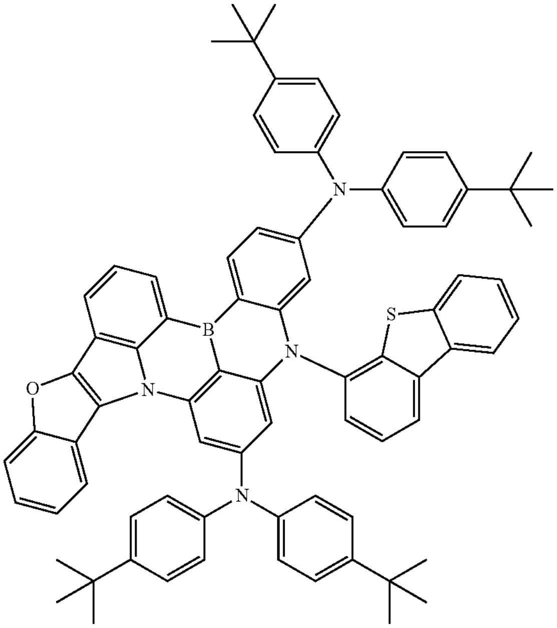
-continued
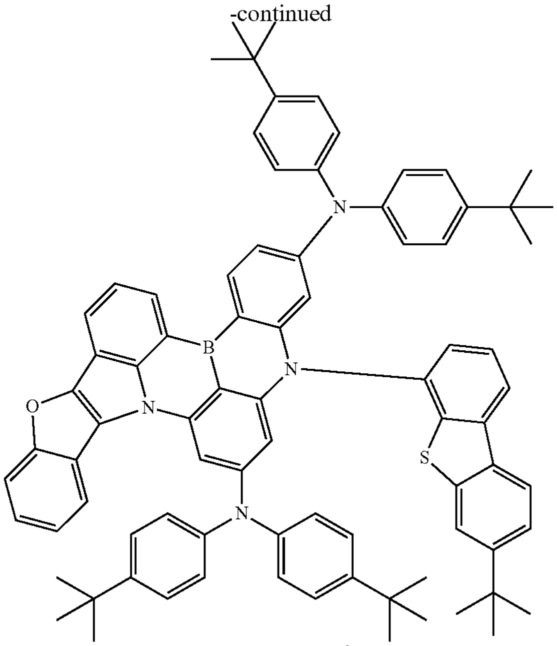
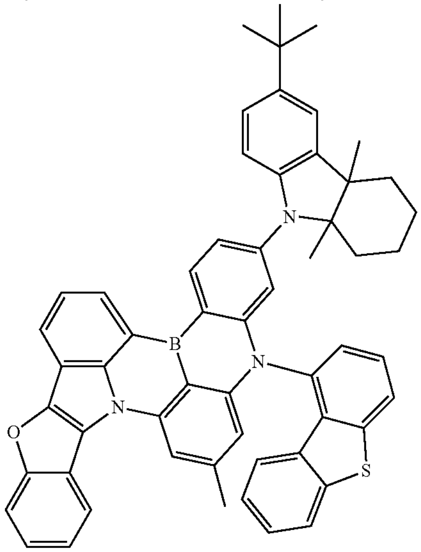
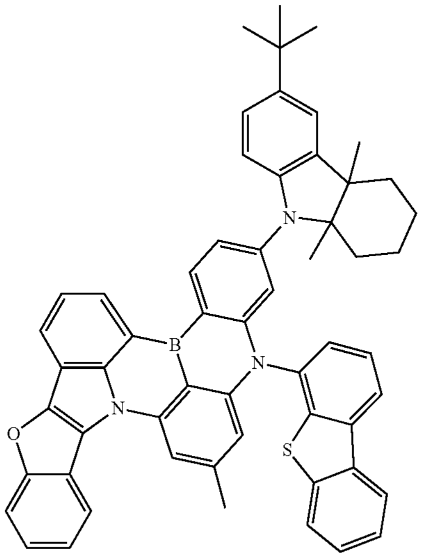

-continued
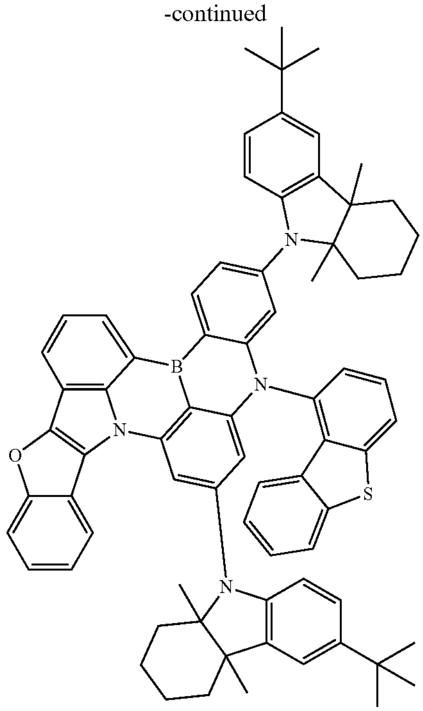
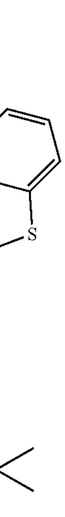
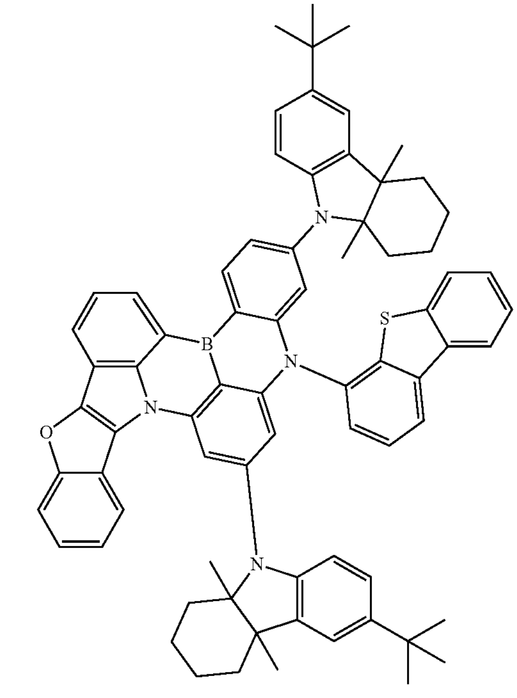
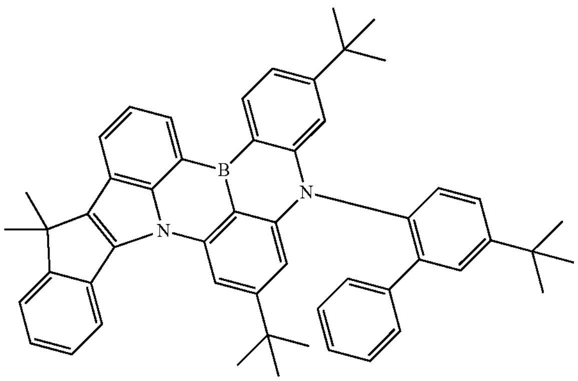
-continued

-continued
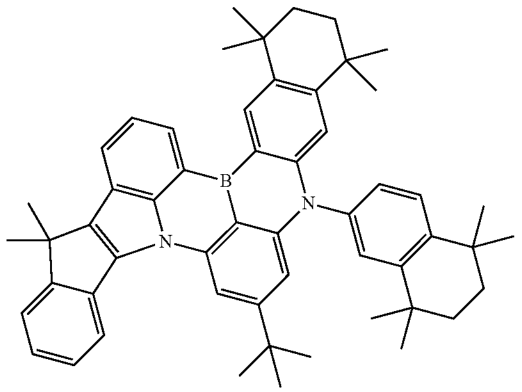
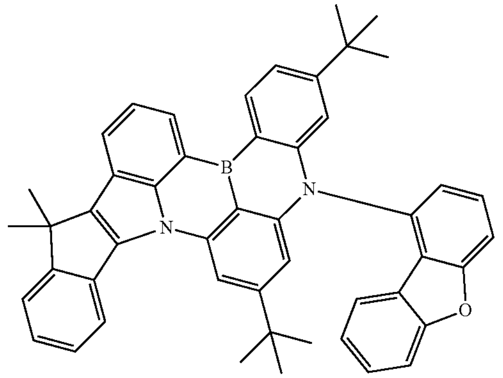
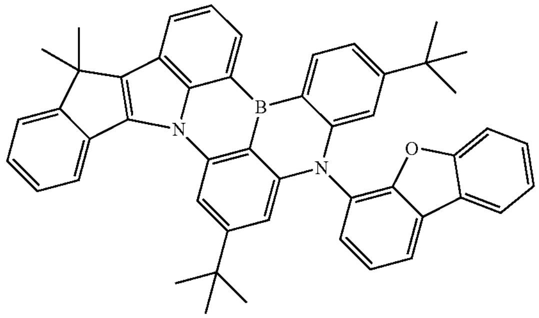
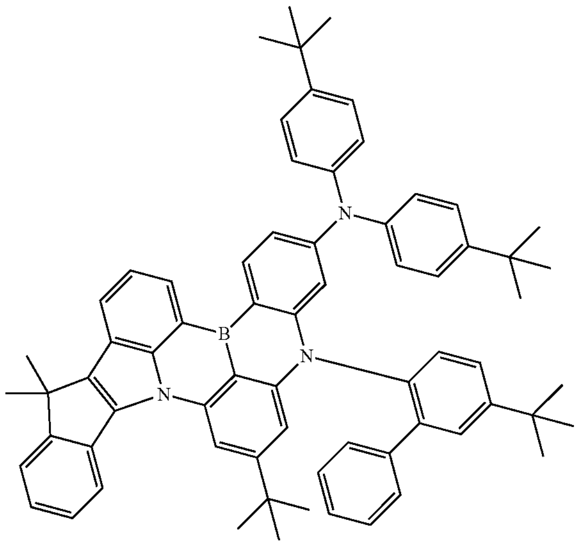
-continued
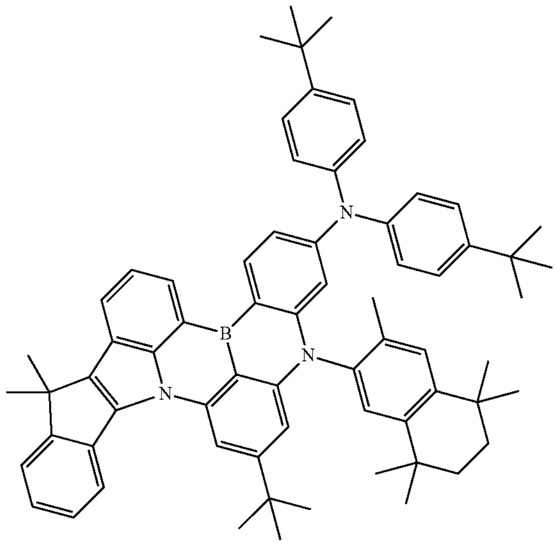
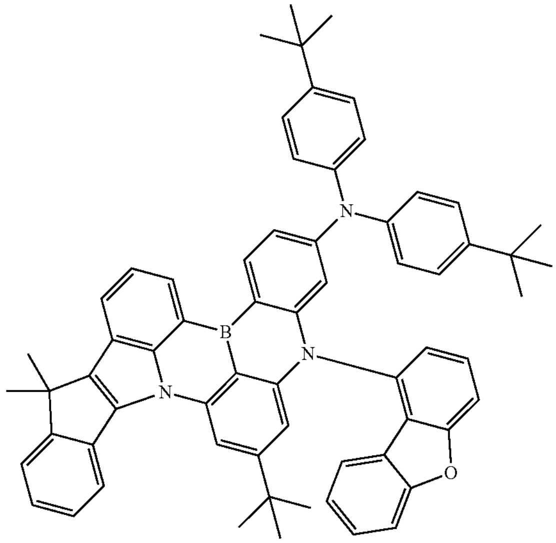
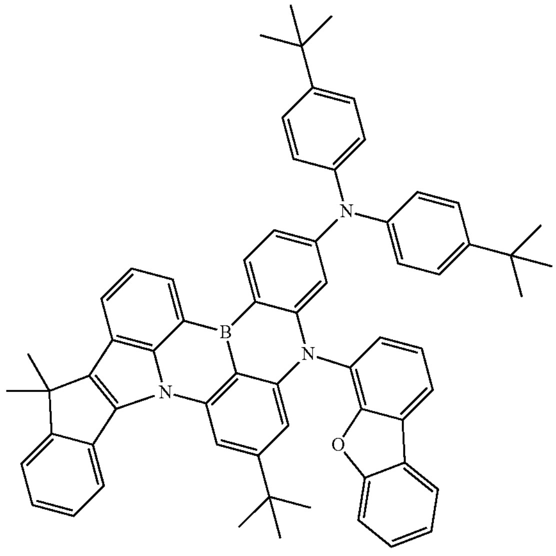

-continued
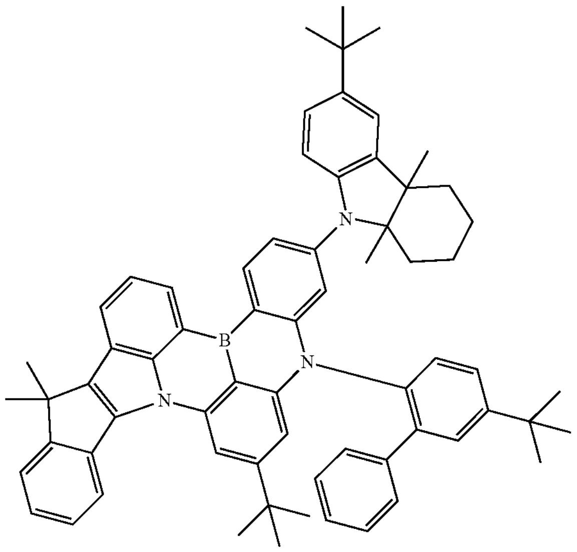
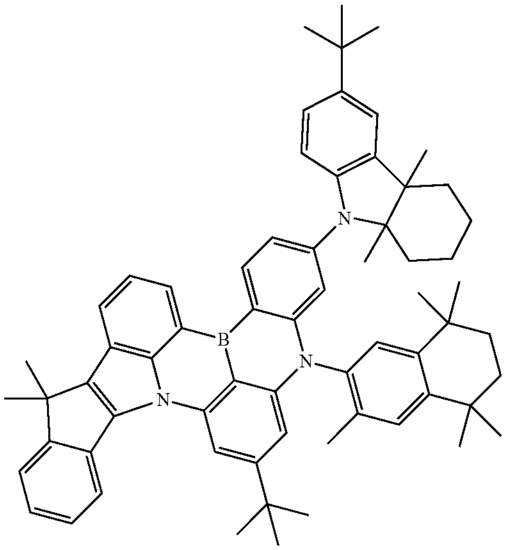
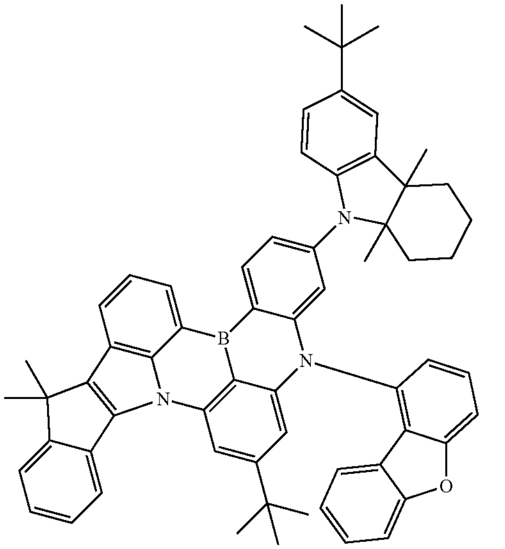
-continued
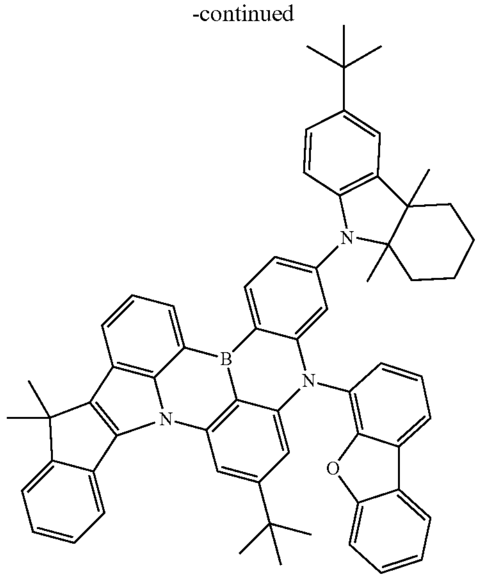
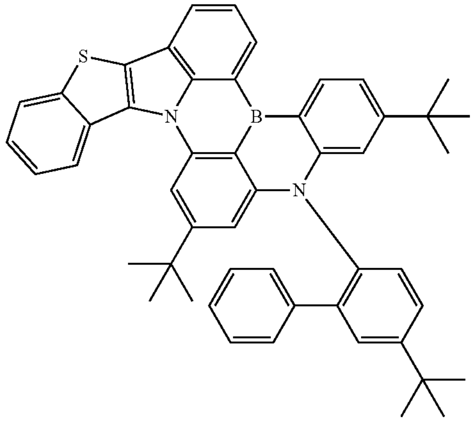
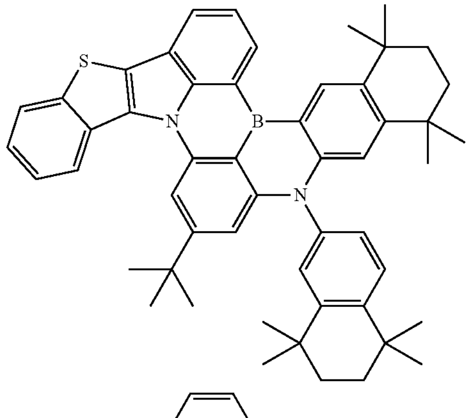
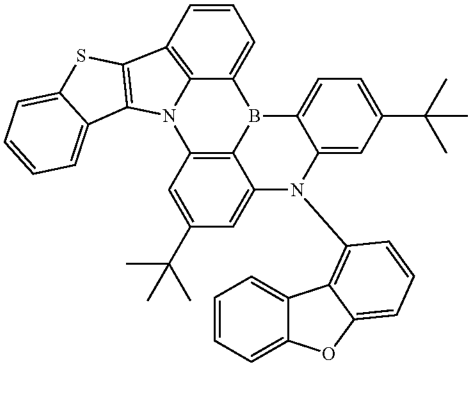

-continued
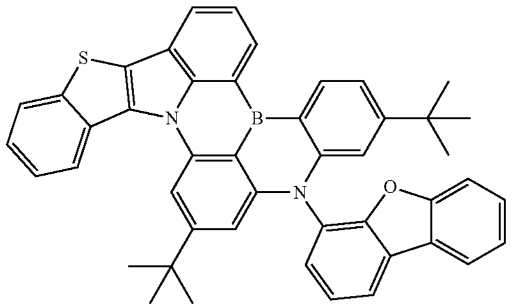
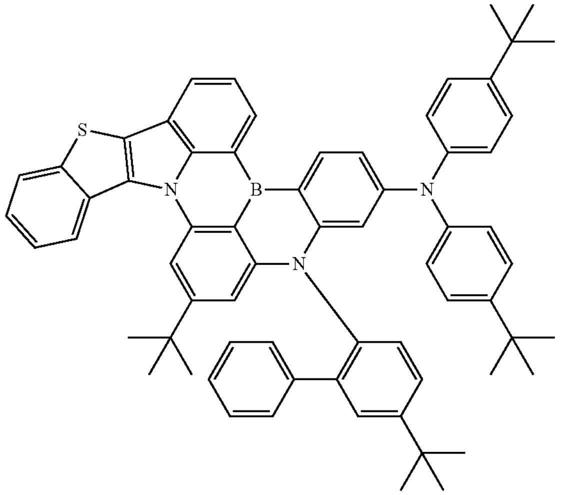
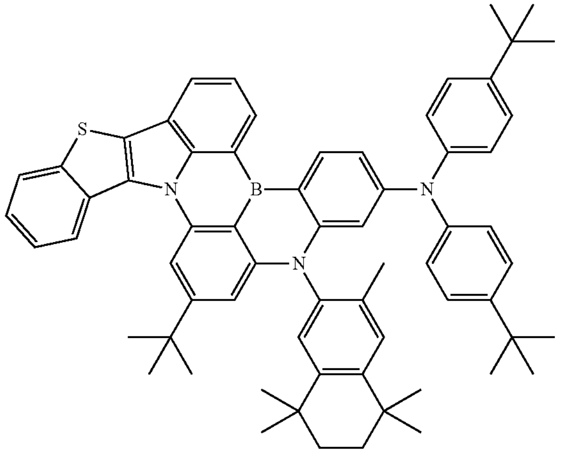
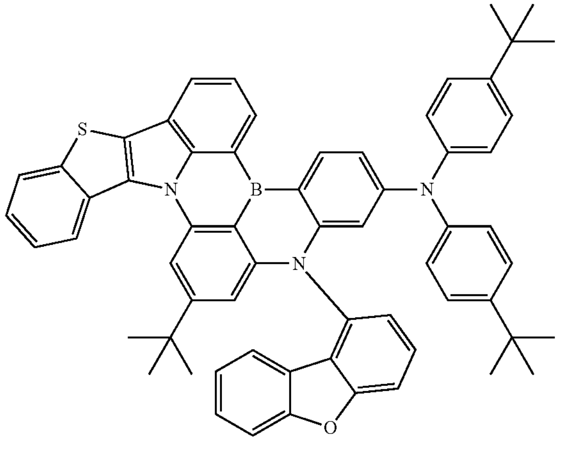
-continued
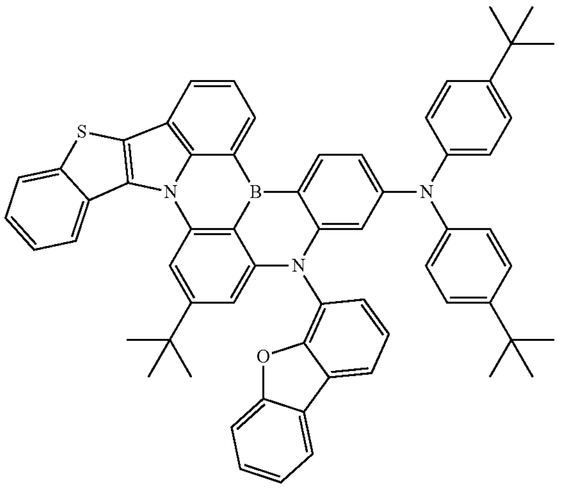
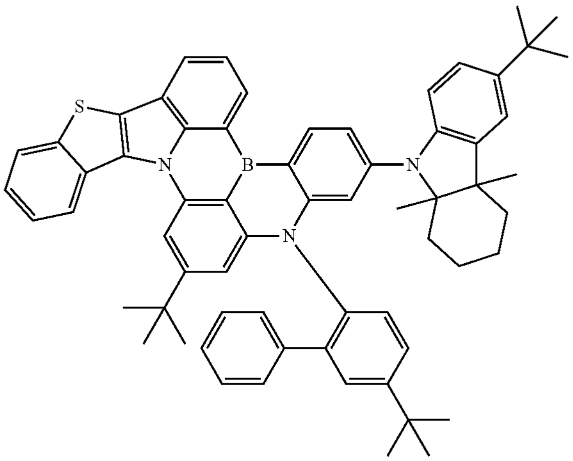
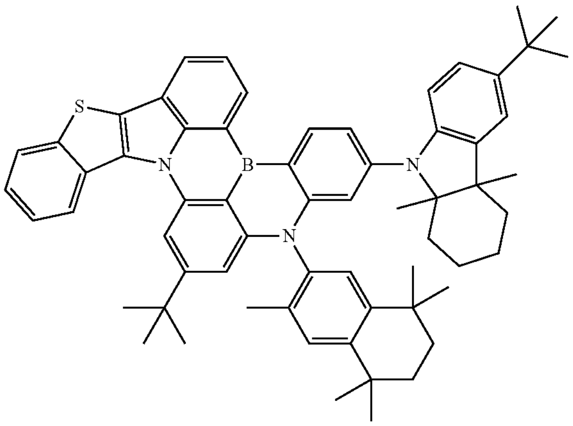

-continued
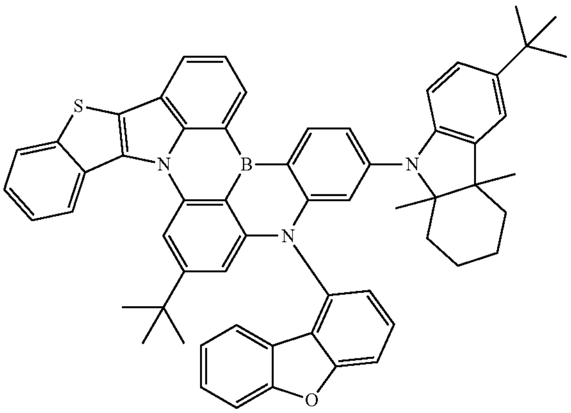
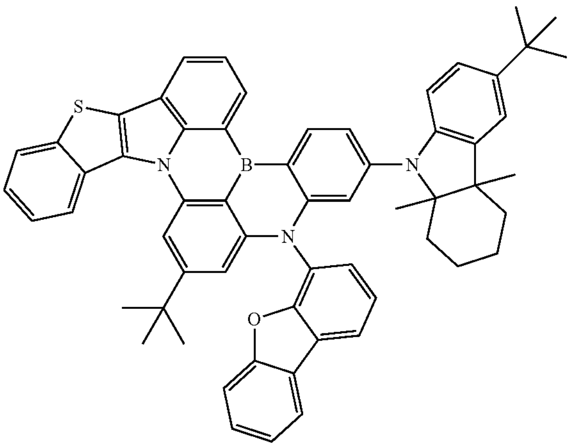
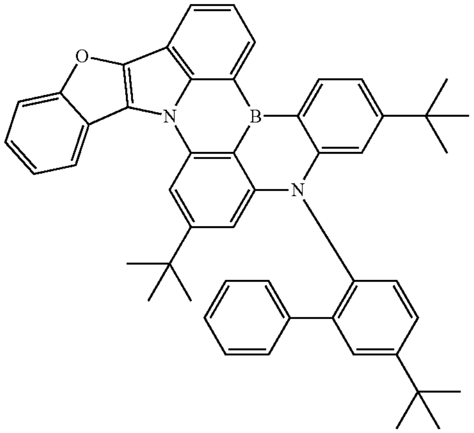
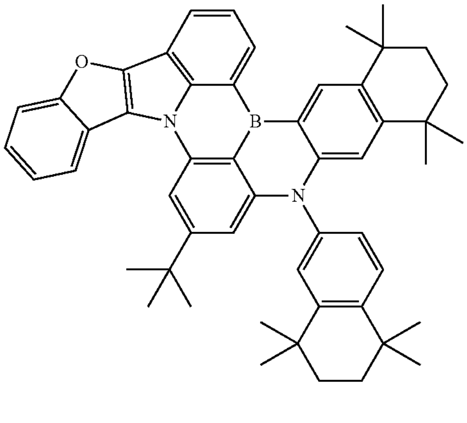
-continued
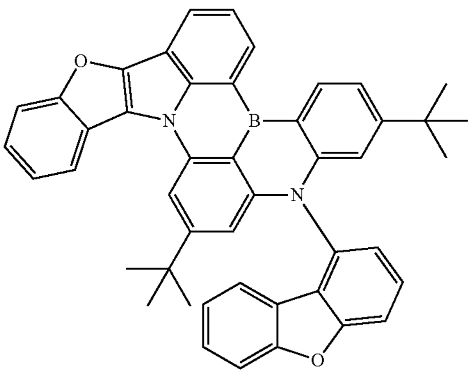
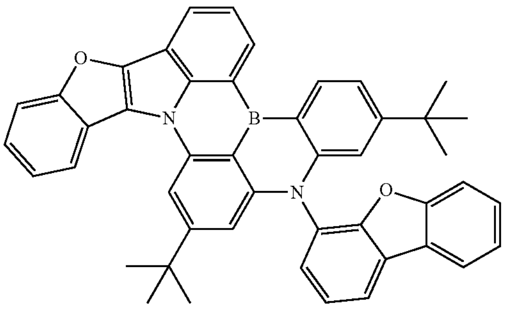
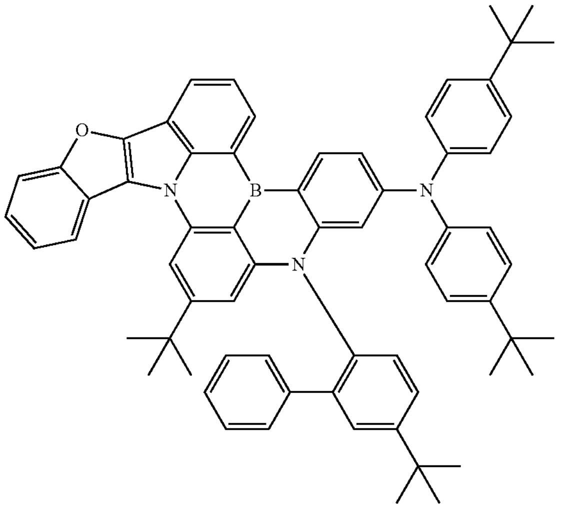
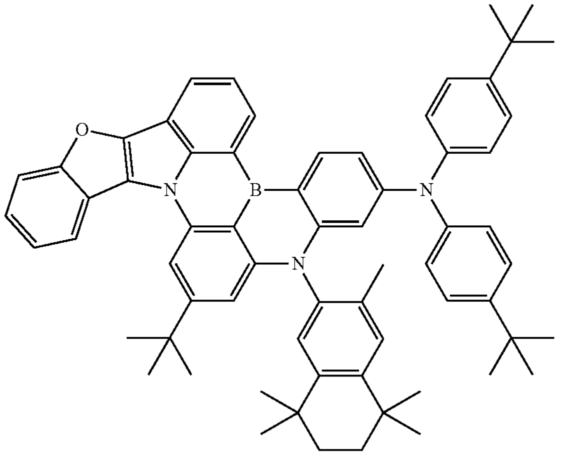

-continued
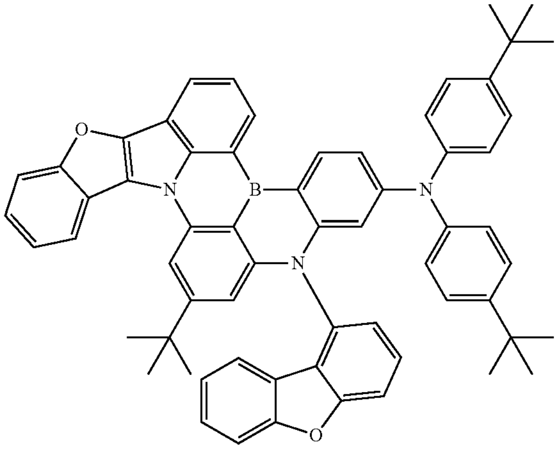
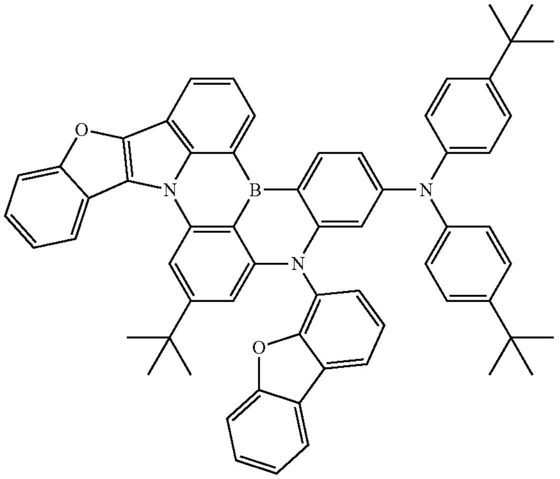
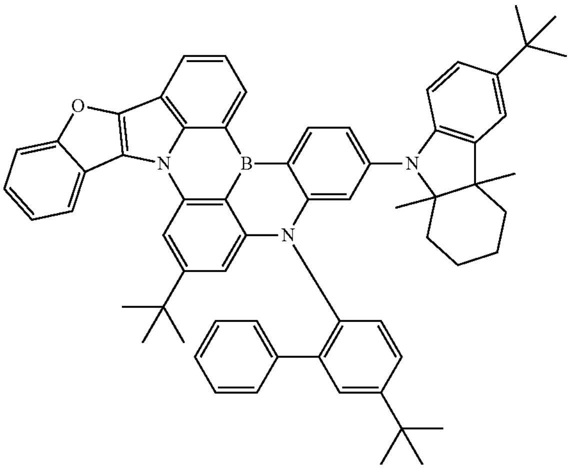
-continued
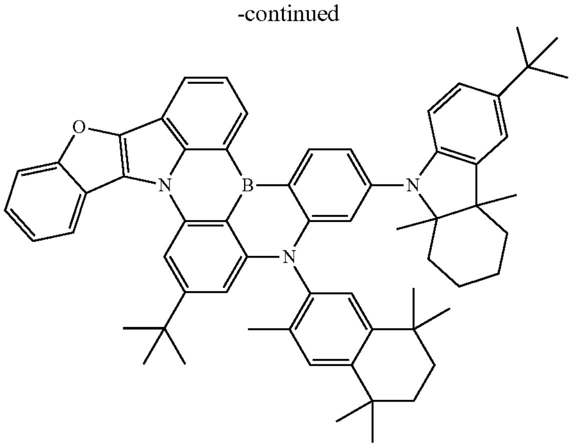
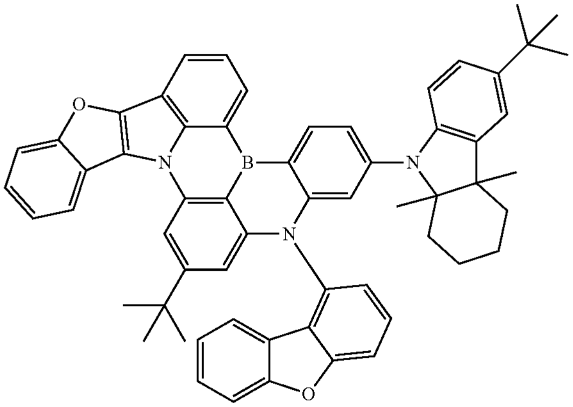
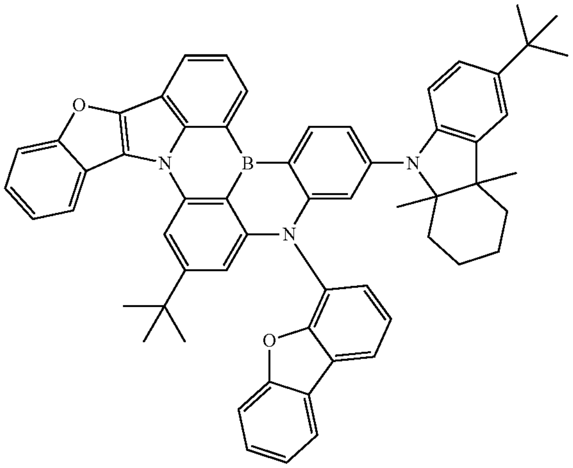
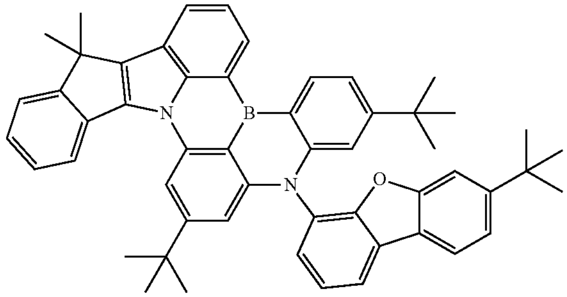

-continued
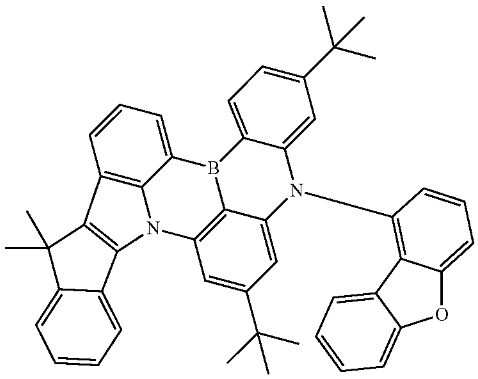
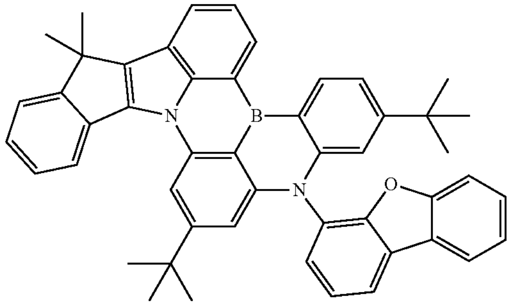
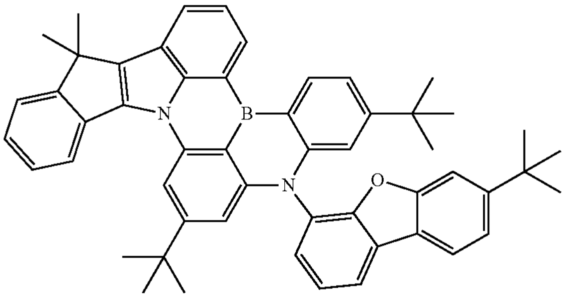
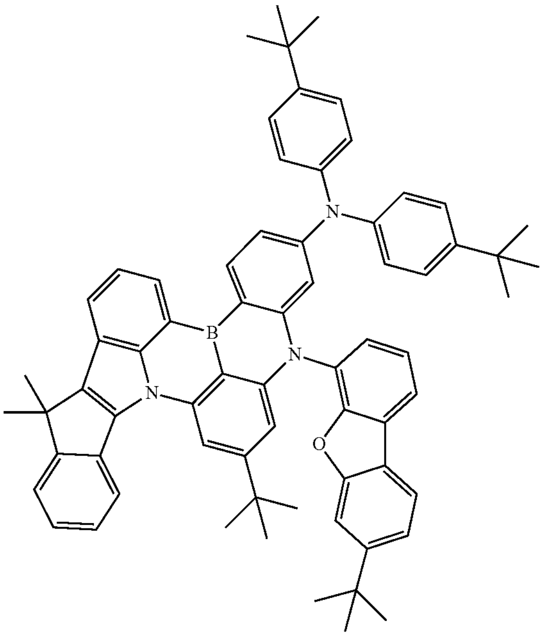
-continued
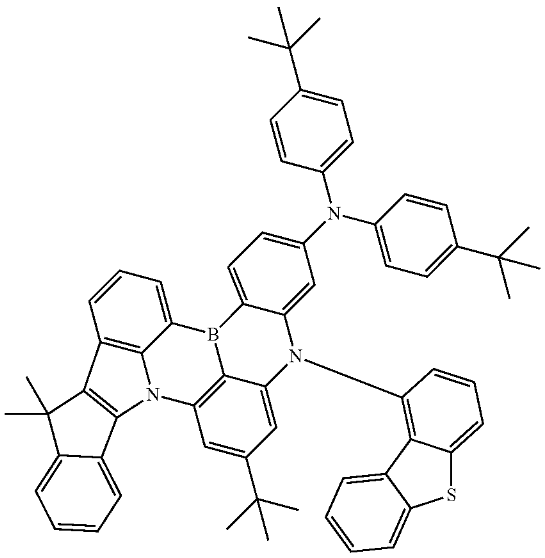
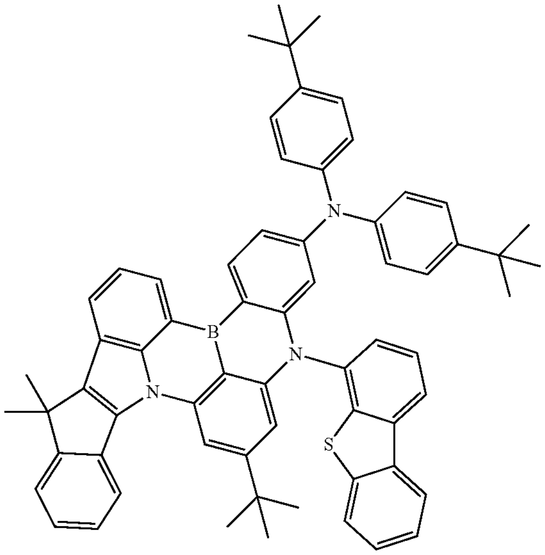

-continued
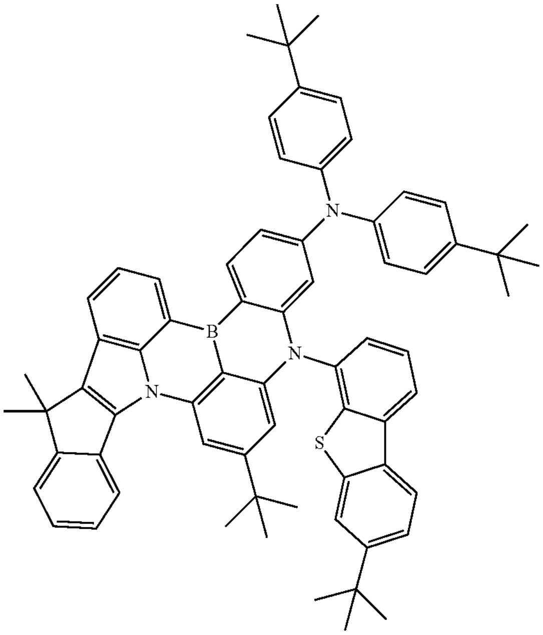
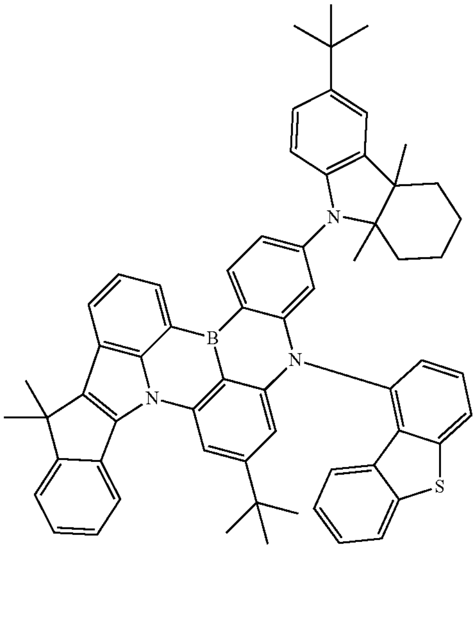
-continued
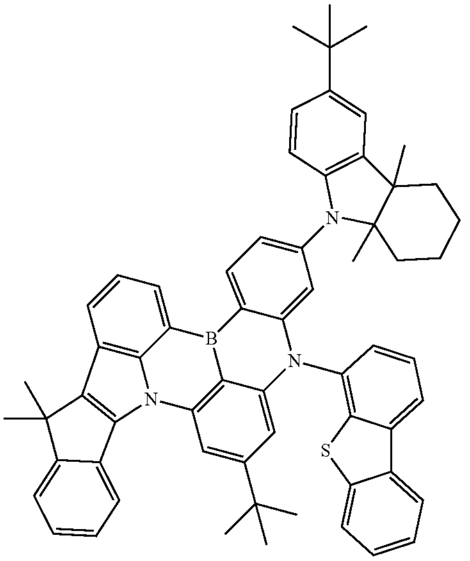
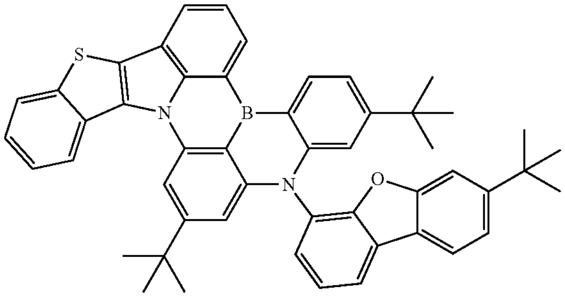
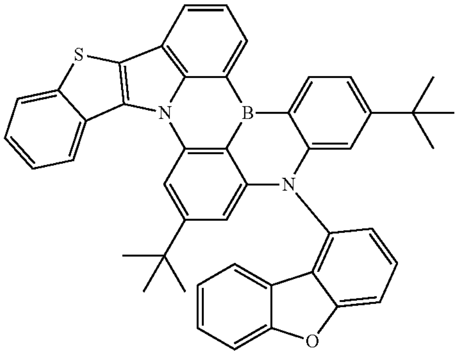
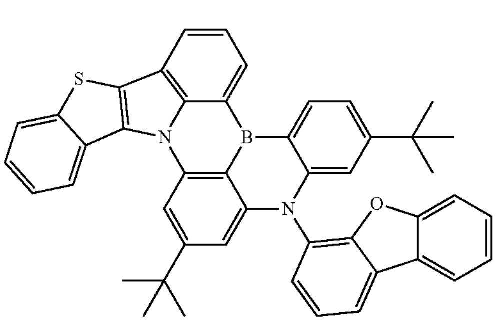

-continued
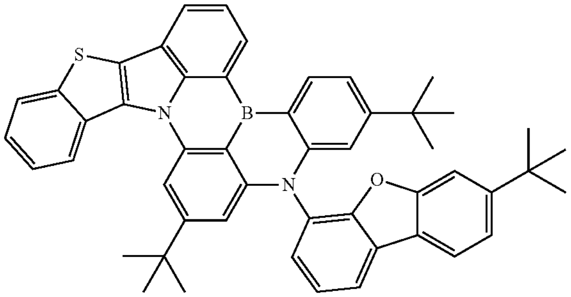
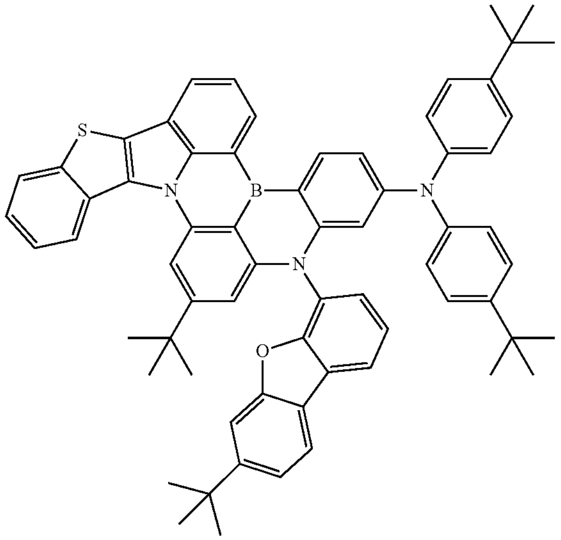
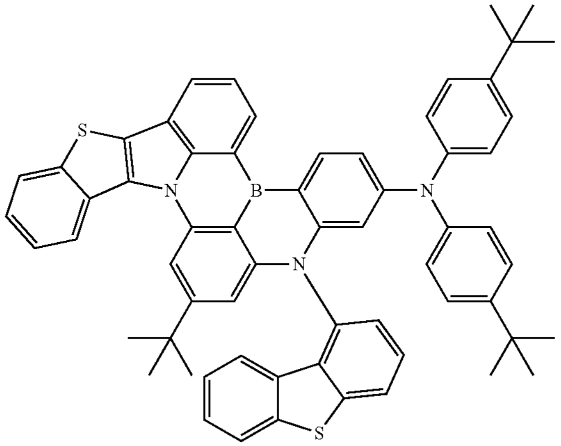
-continued
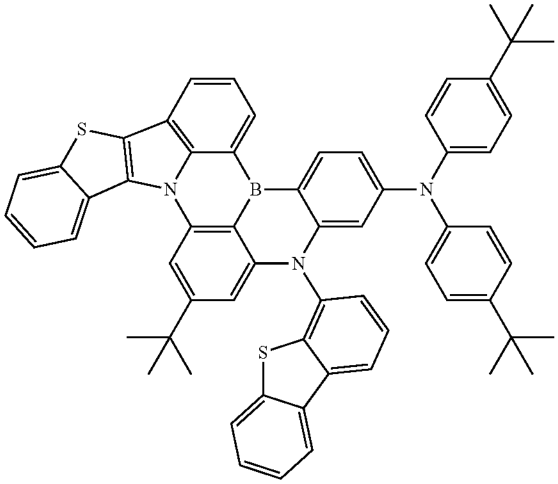
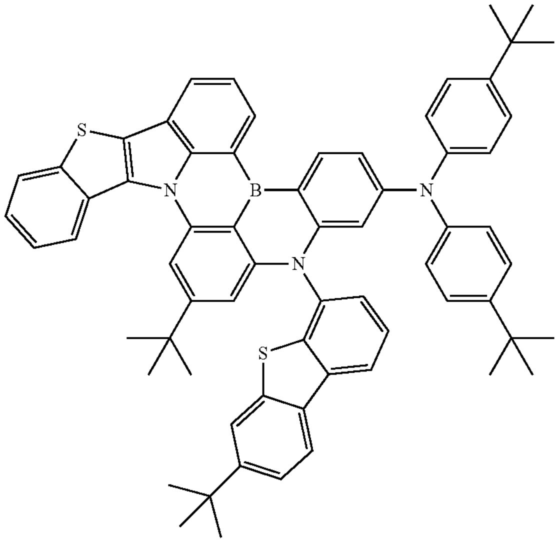
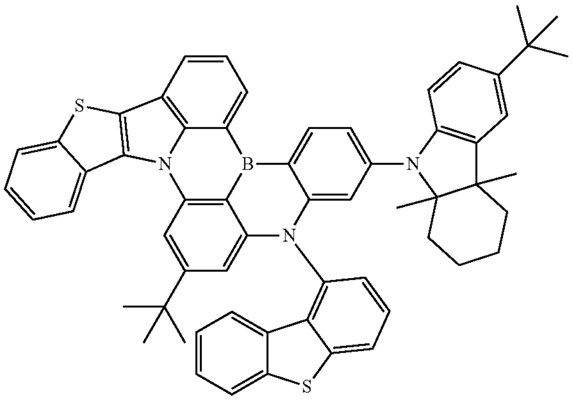

-continued
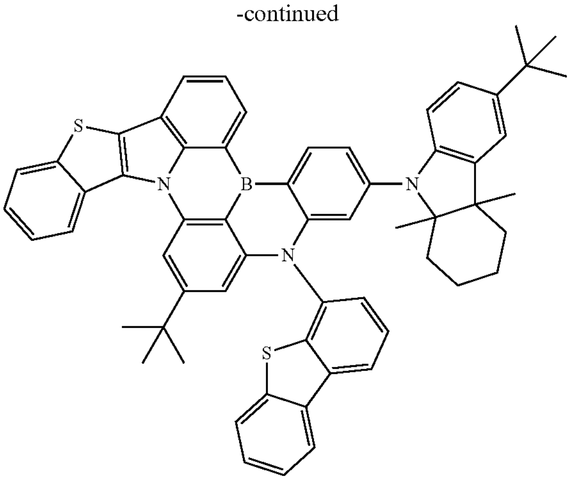
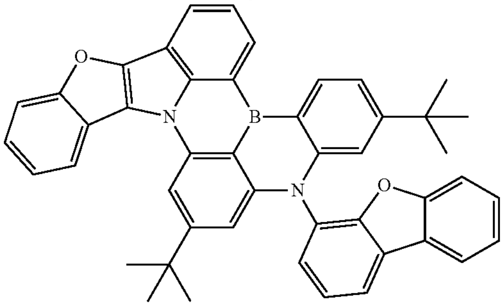
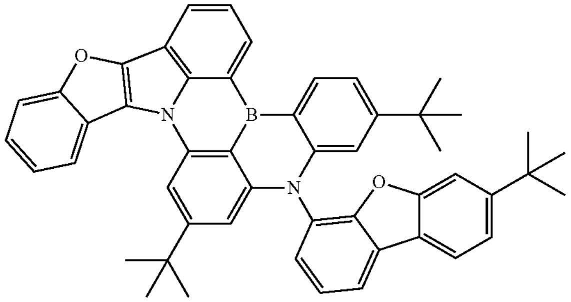
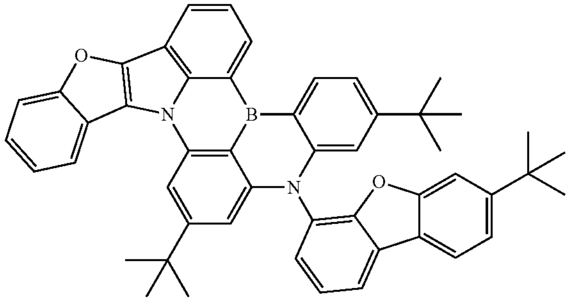
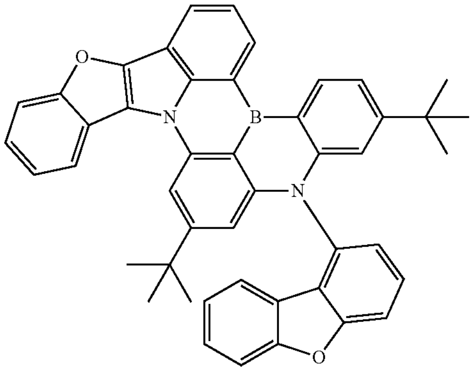
-continued
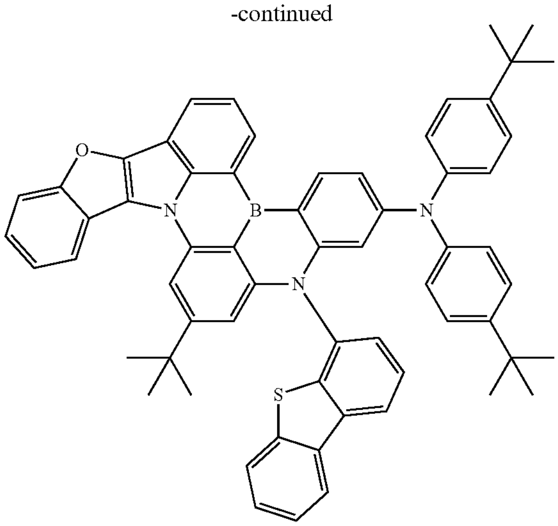
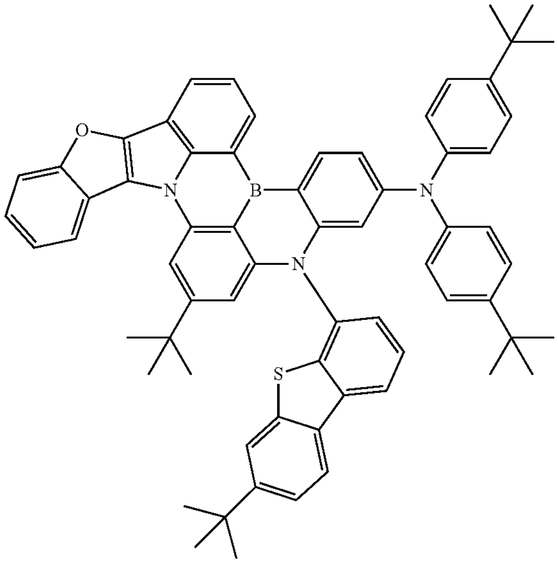
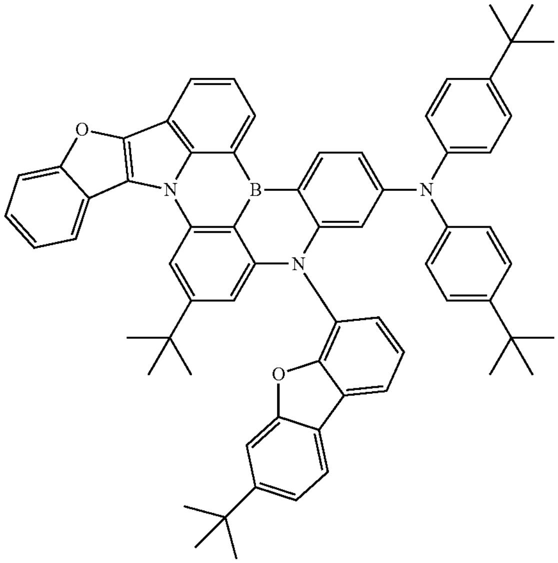

-continued
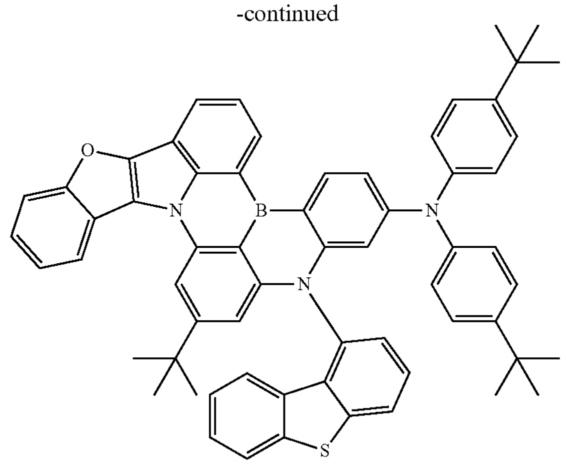
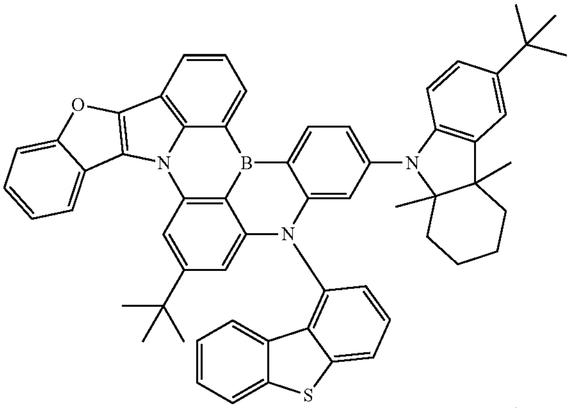
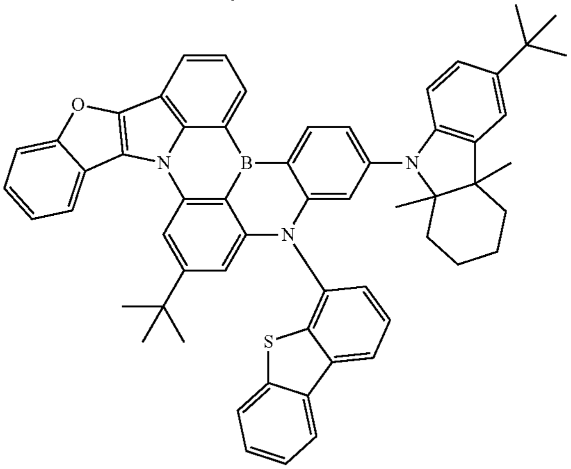
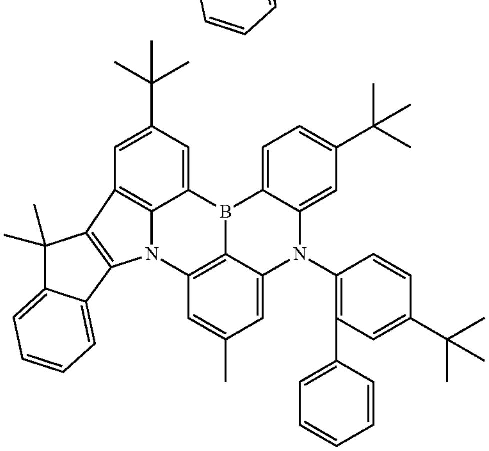
-continued
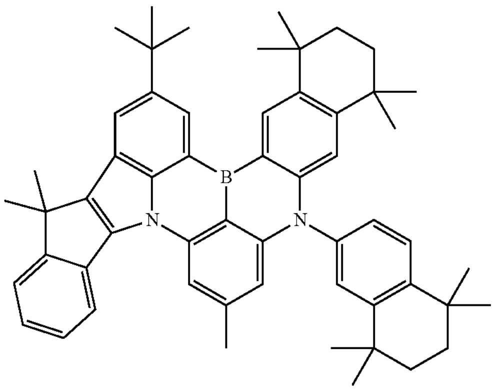
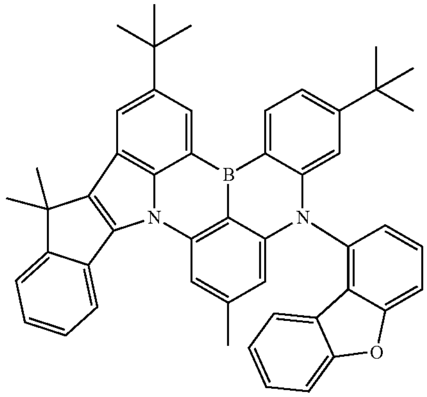
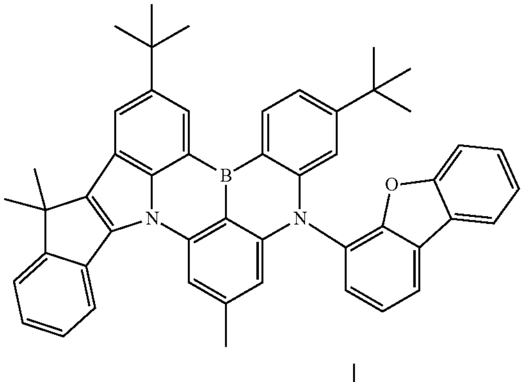
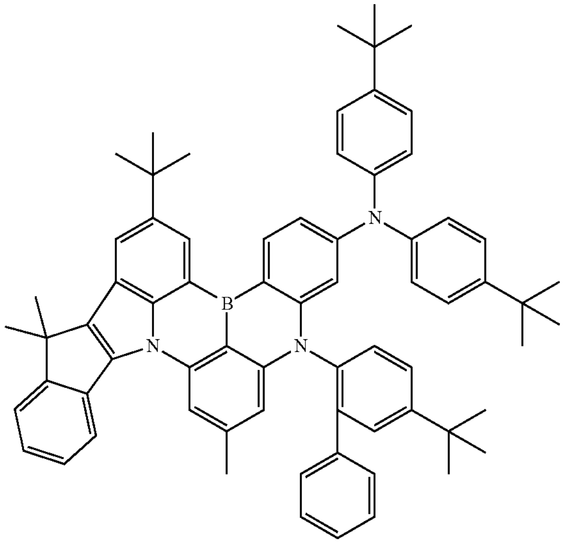

-continued
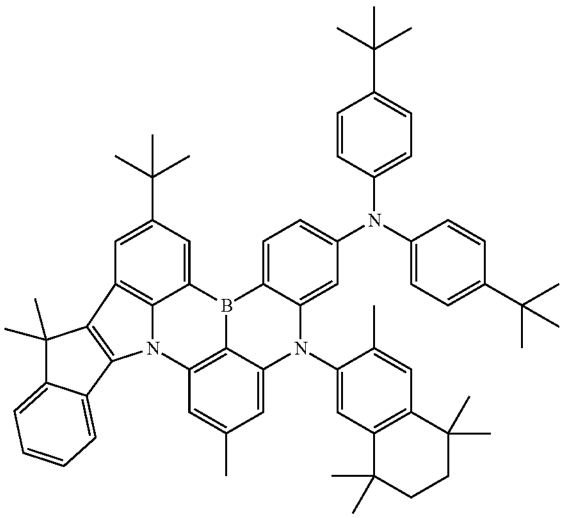
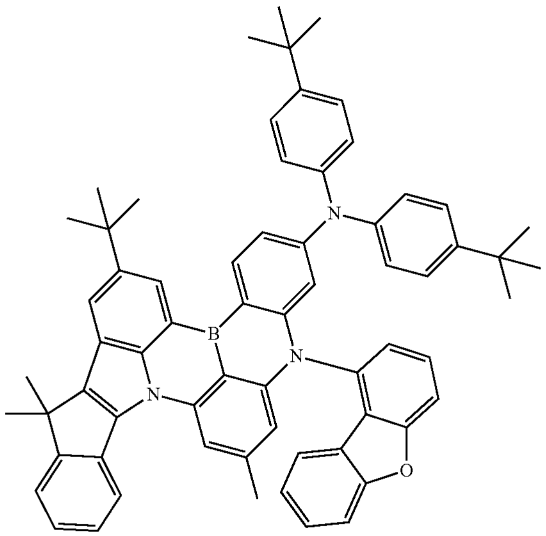
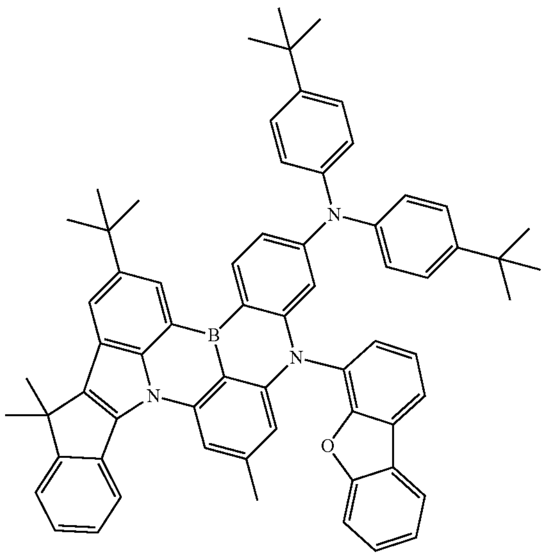
-continued
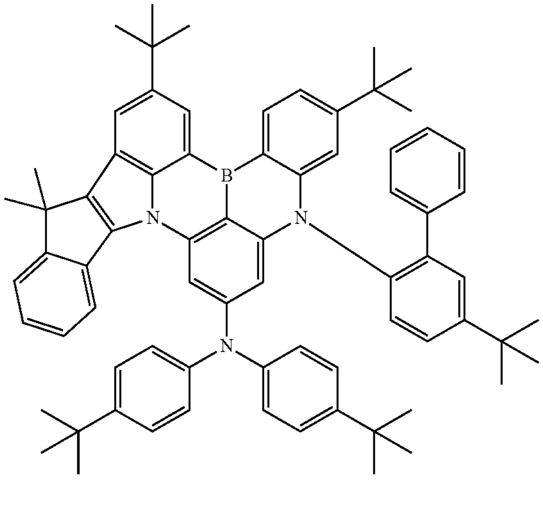
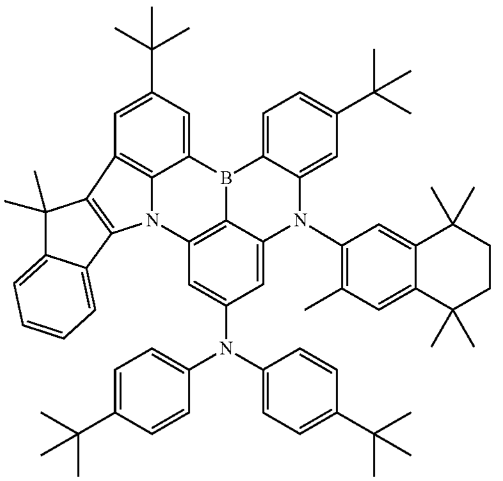
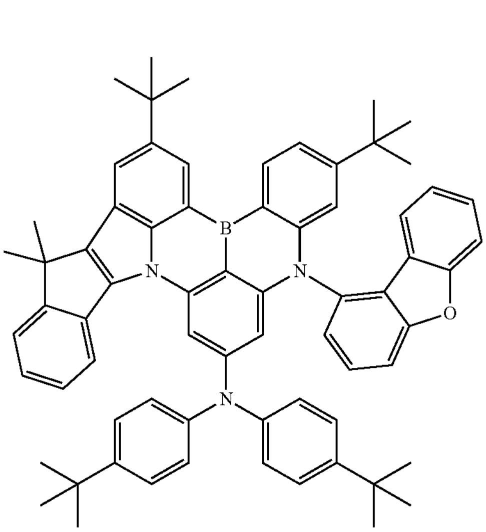

-continued
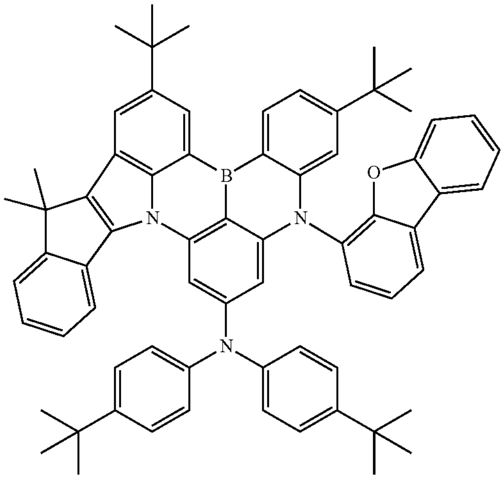
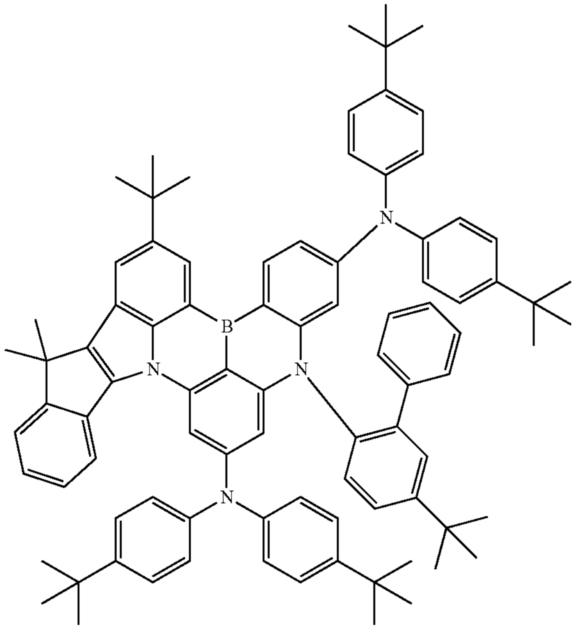
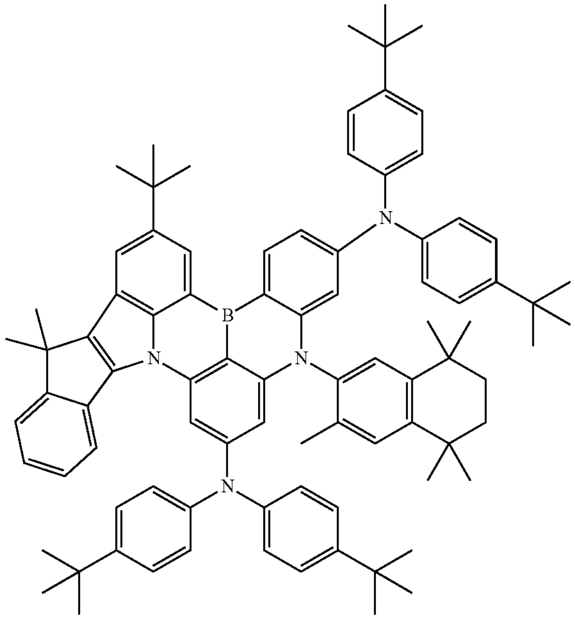
-continued
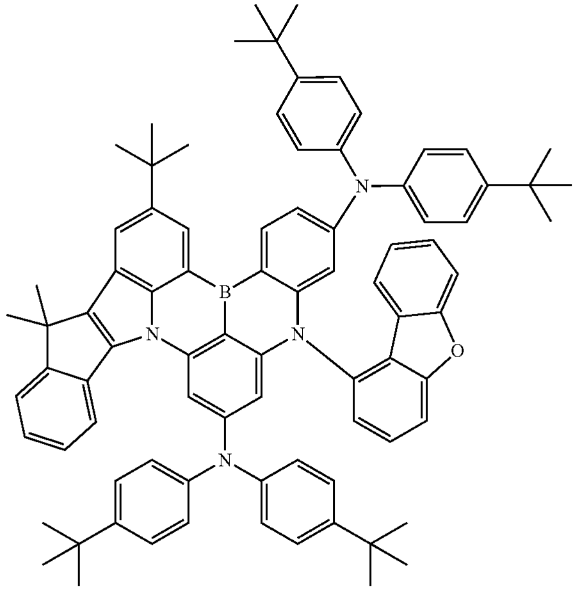
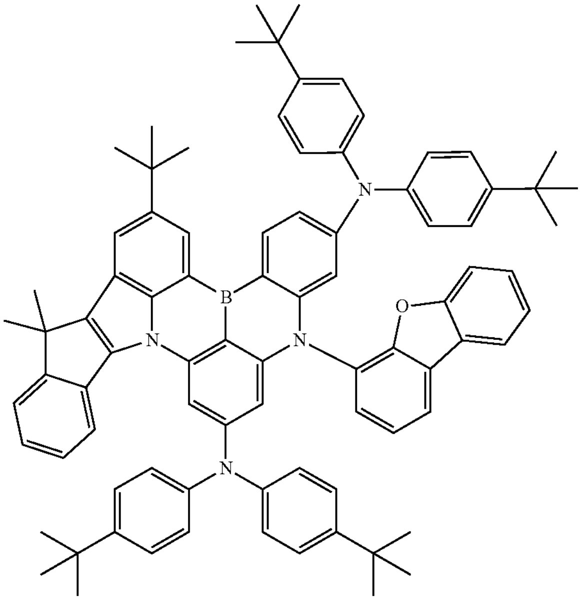
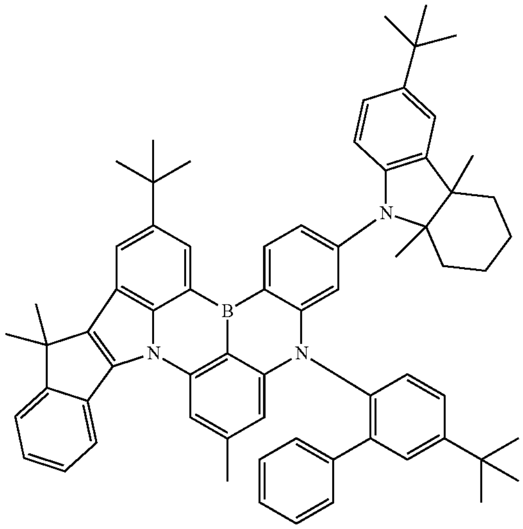

-continued
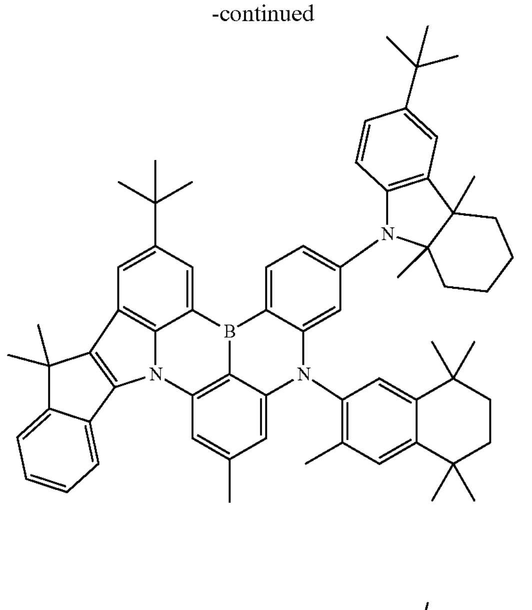
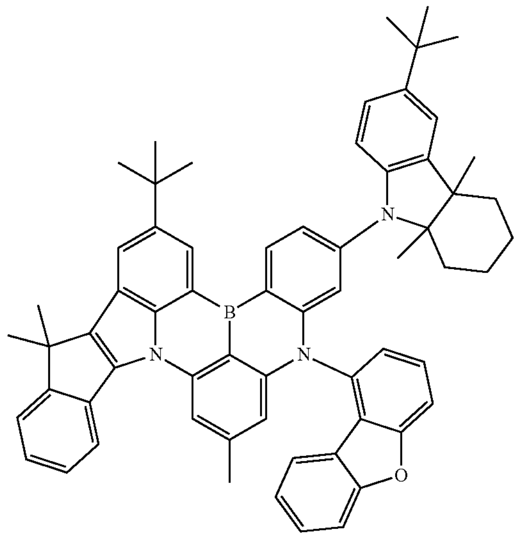
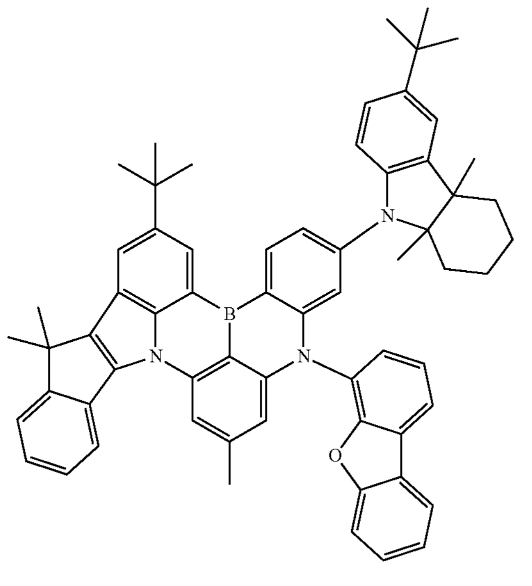
-continued
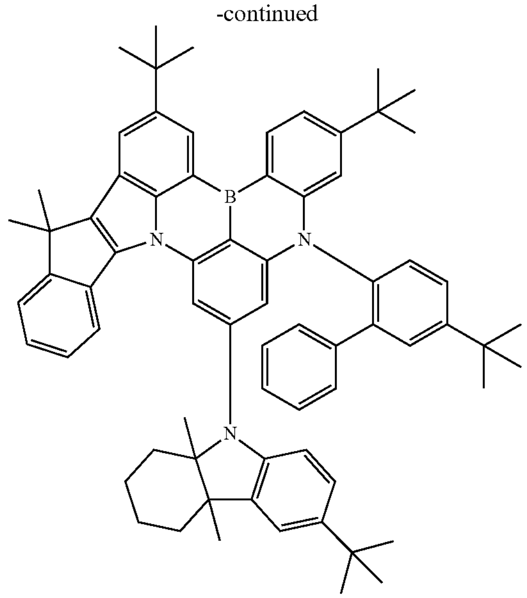
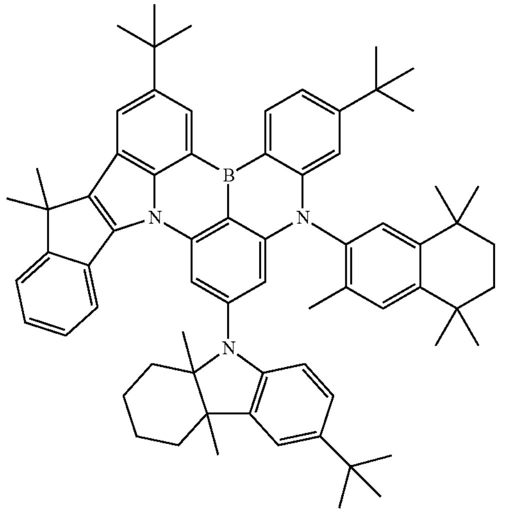
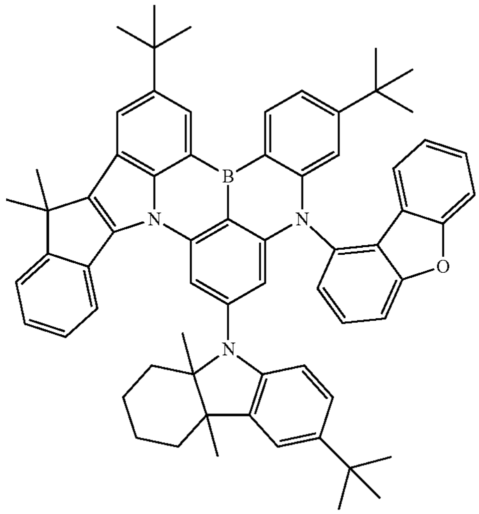

-continued
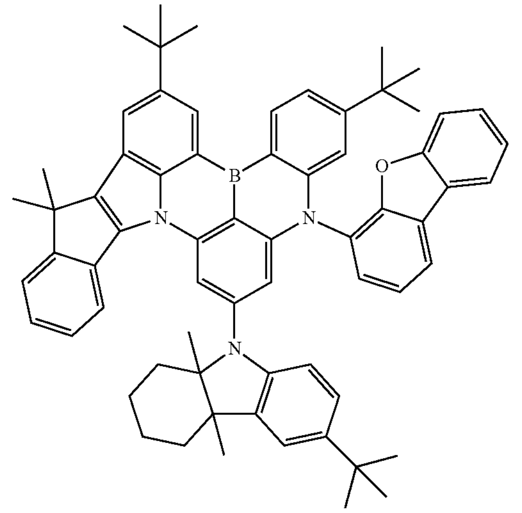
-continued
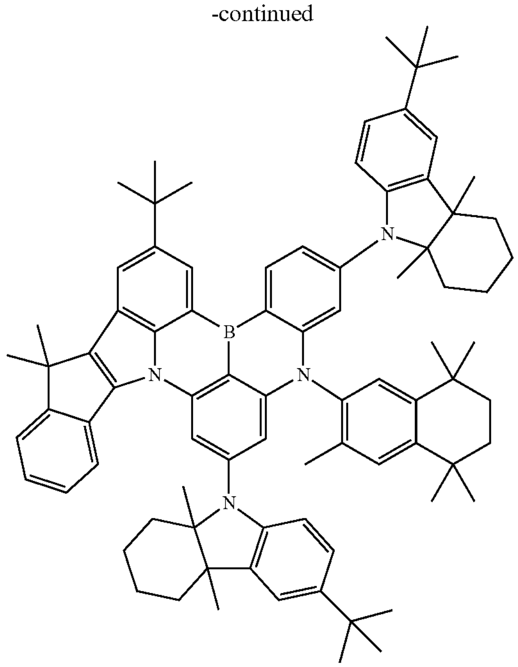
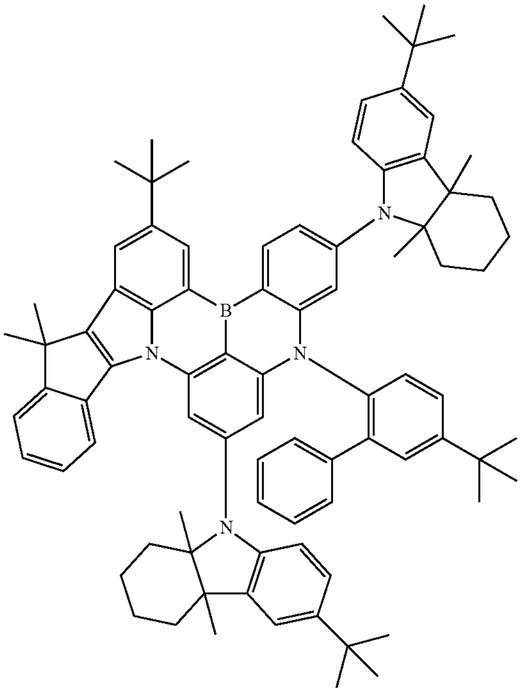
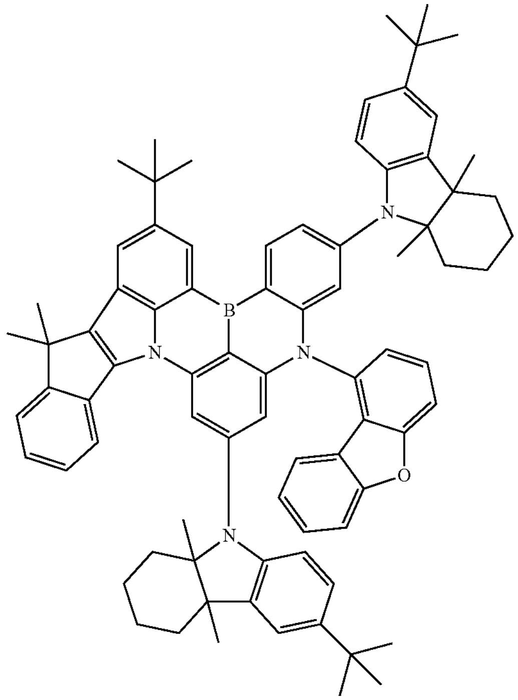

-continued
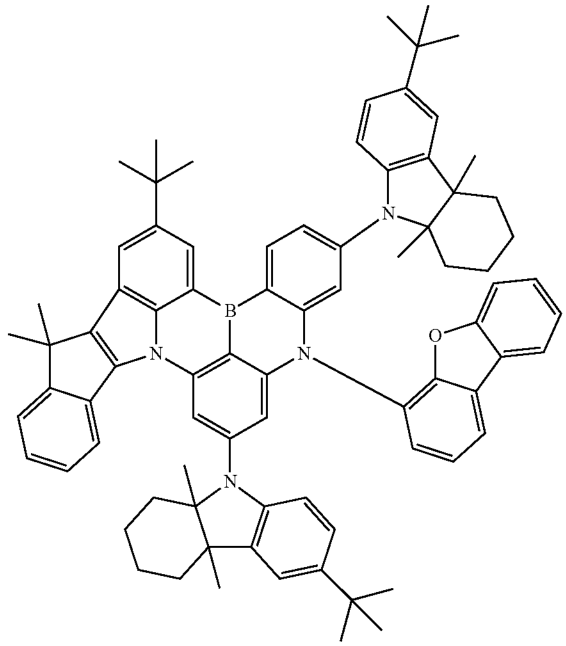
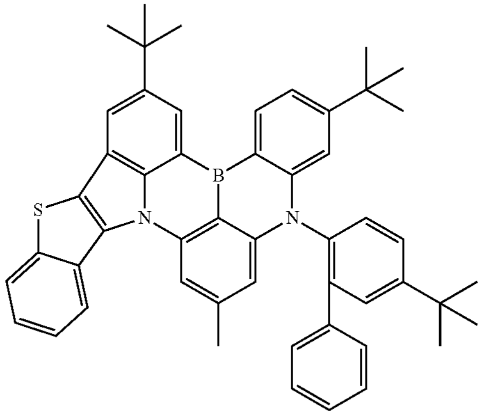
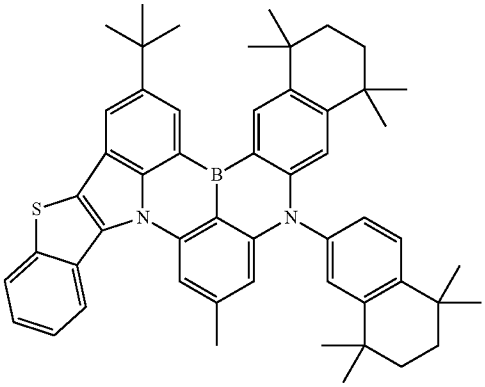
-continued
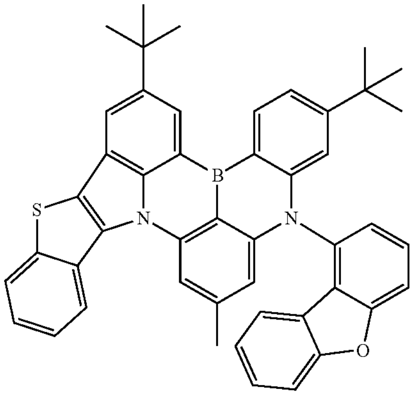
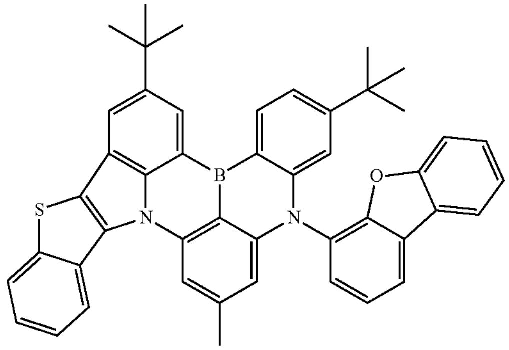
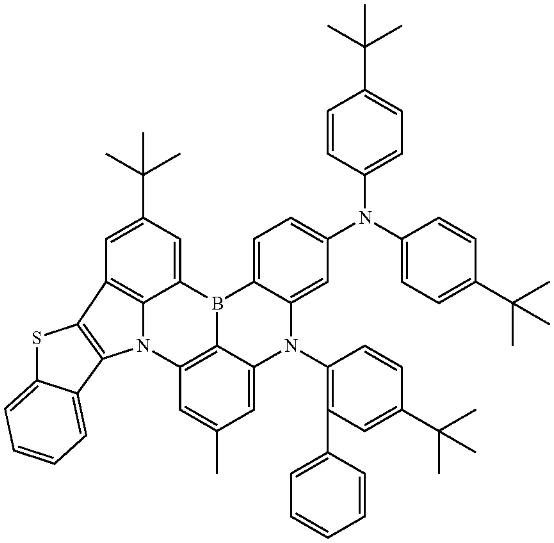

-continued
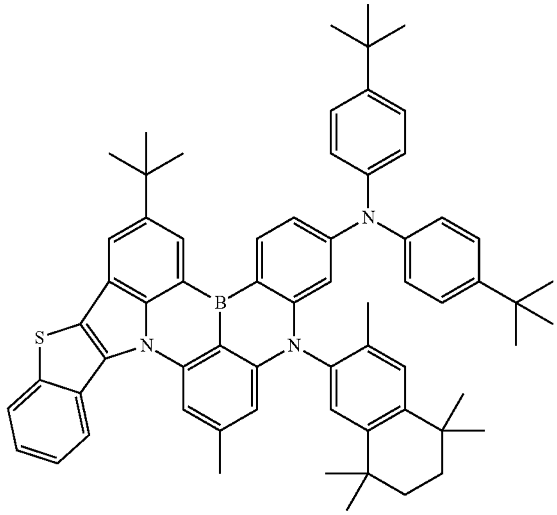
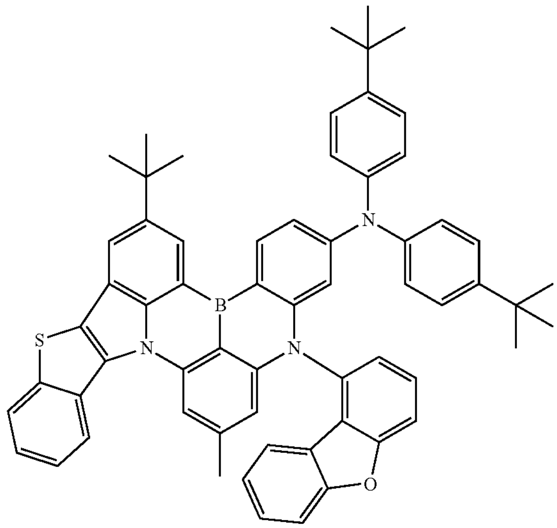
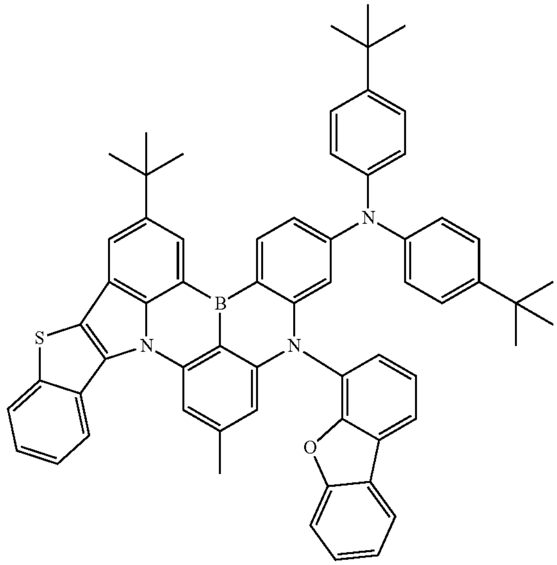
-continued
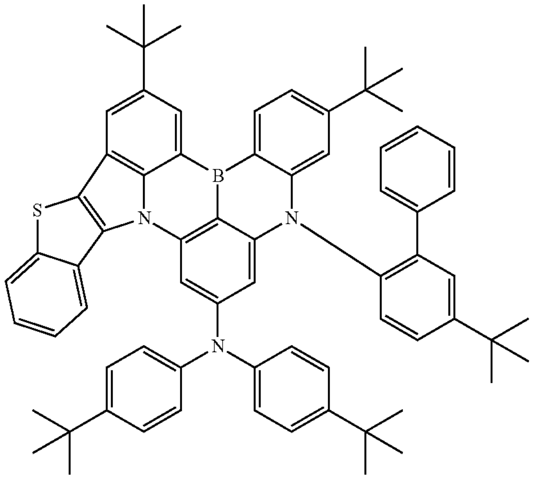
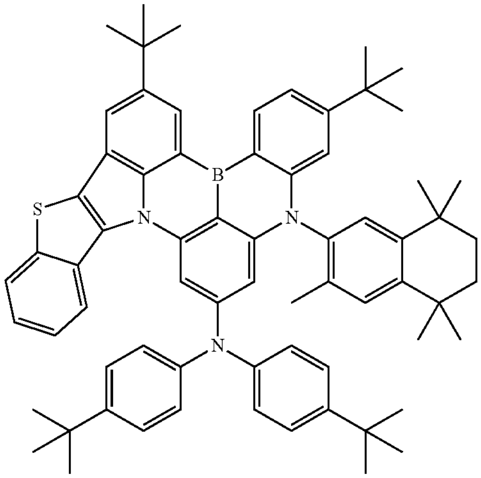
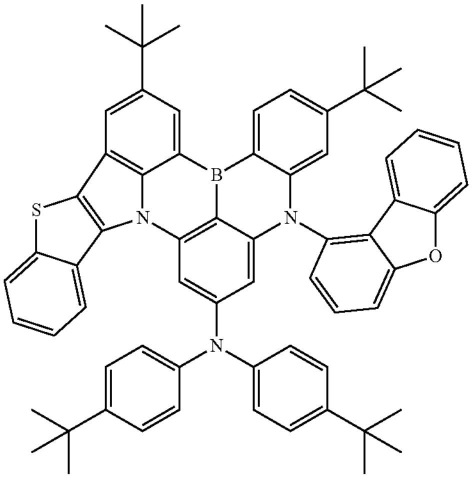

-continued
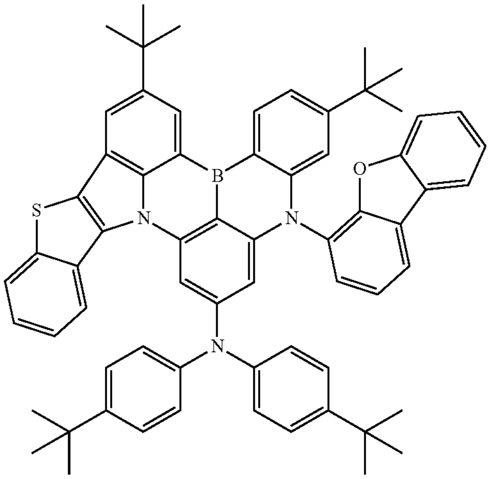
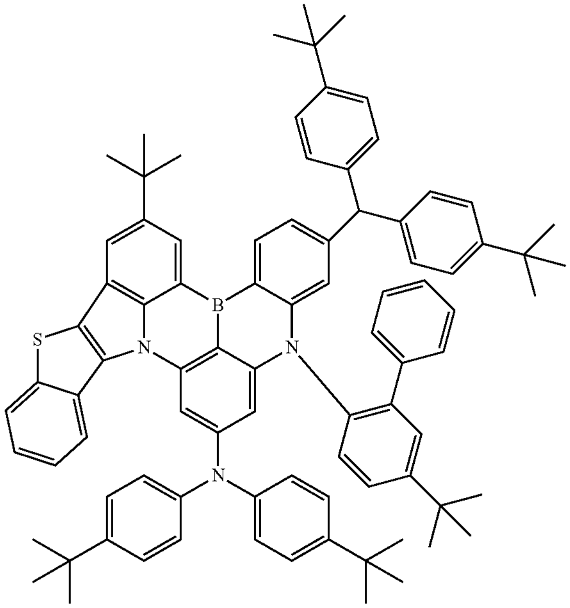
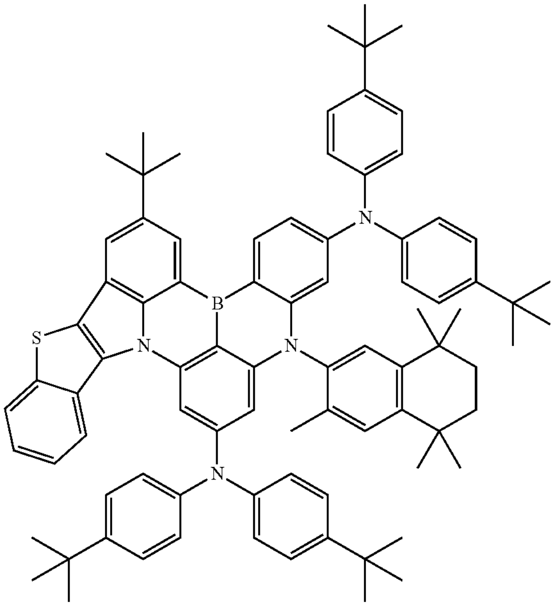
-continued
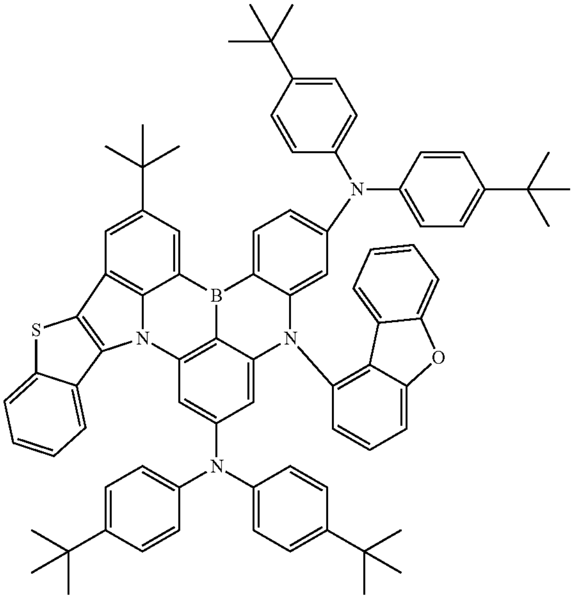
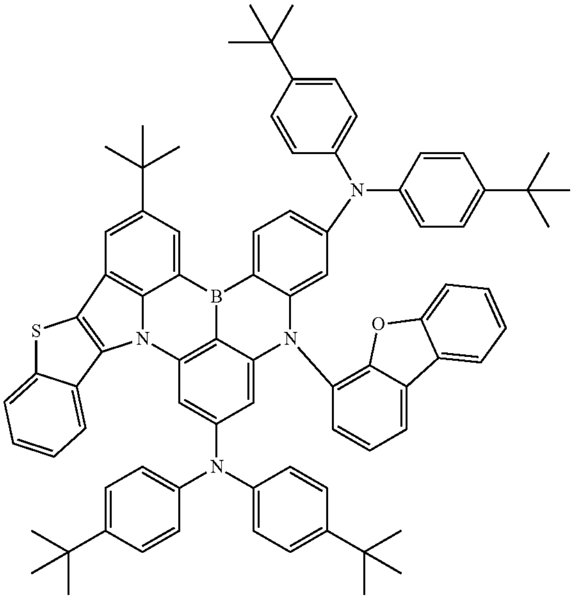

-continued
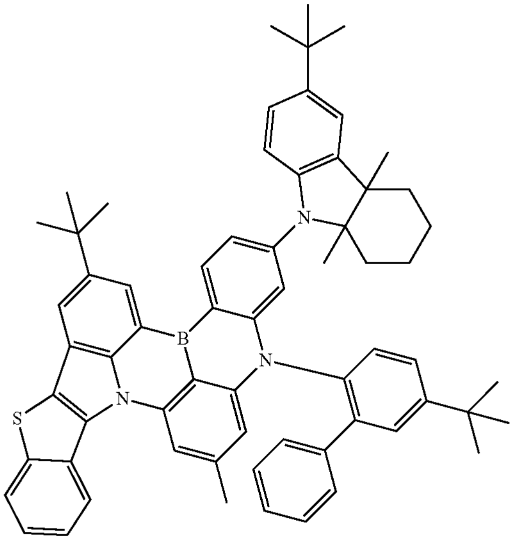
-continued
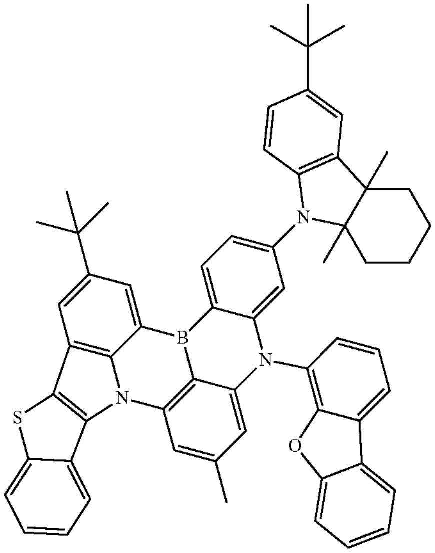
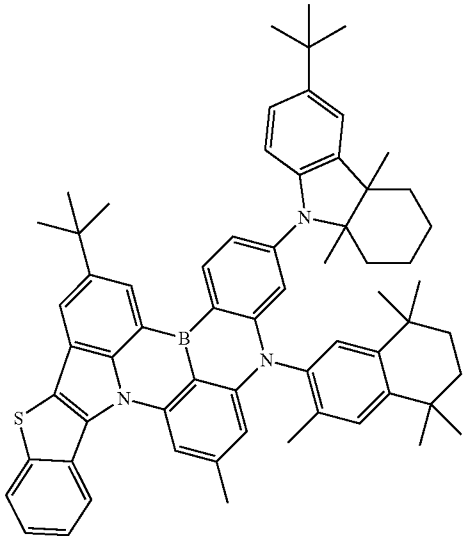
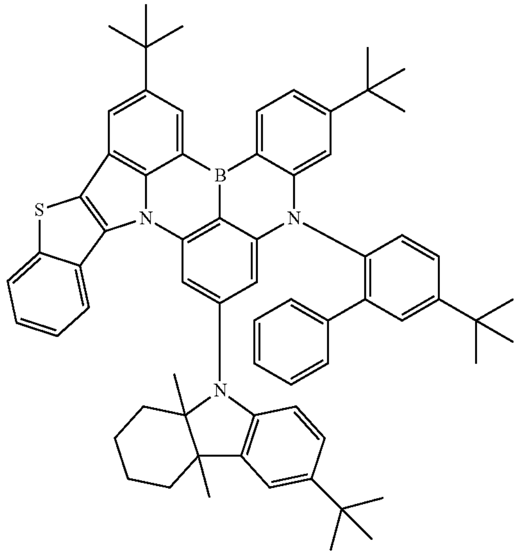
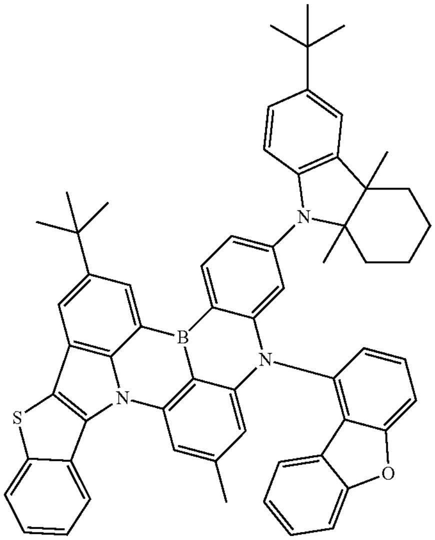
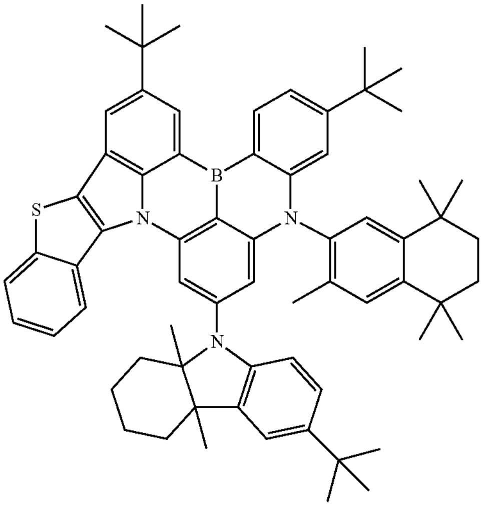

-continued
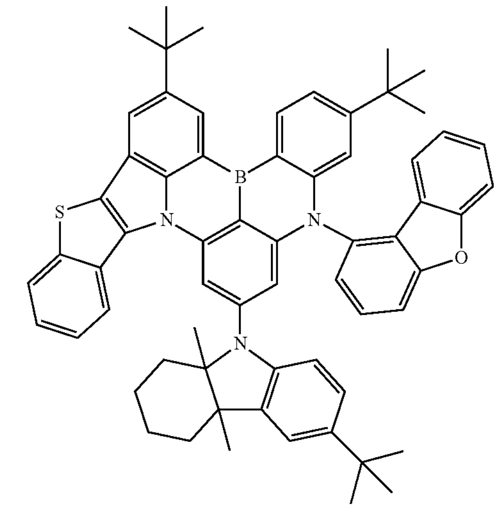
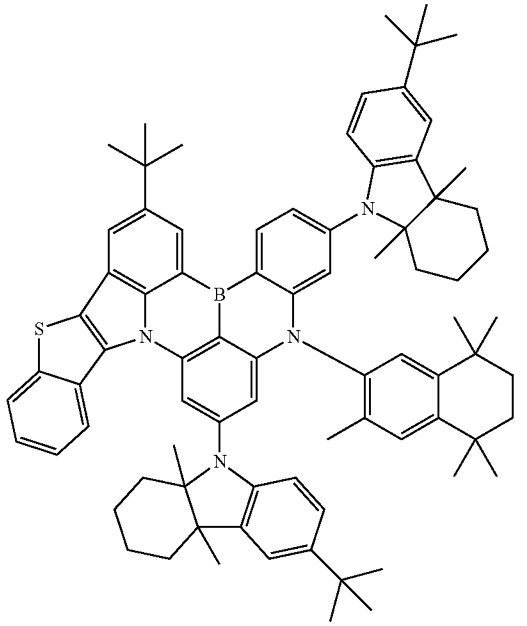
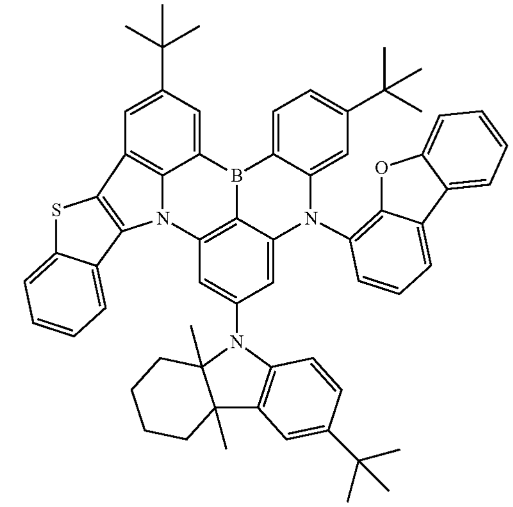
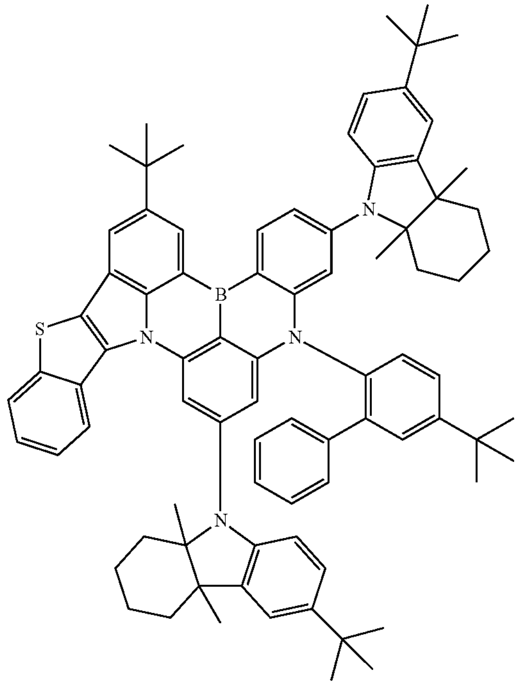
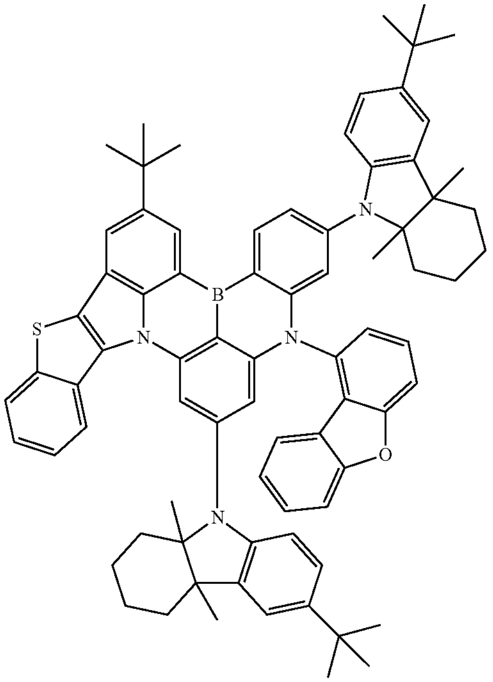
-continued -continued
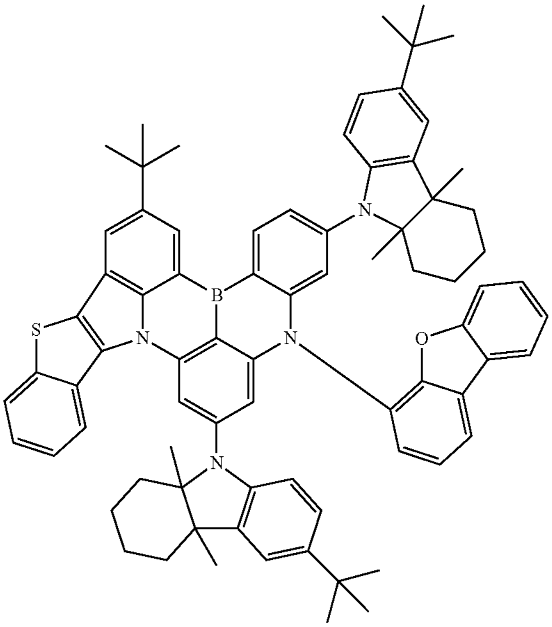
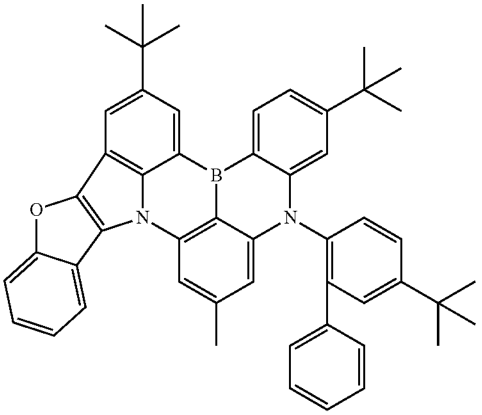
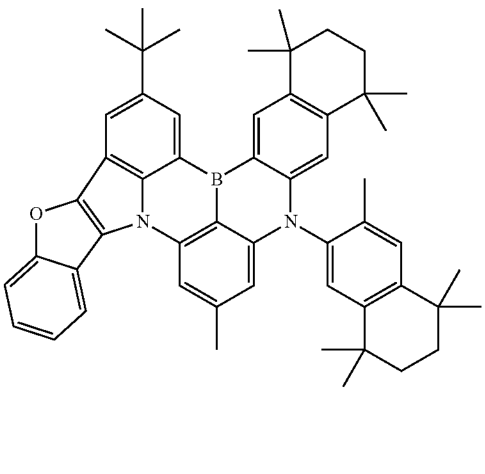
-continued
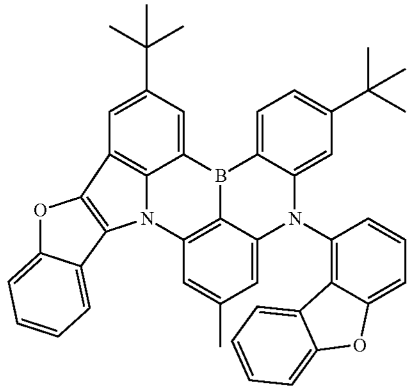
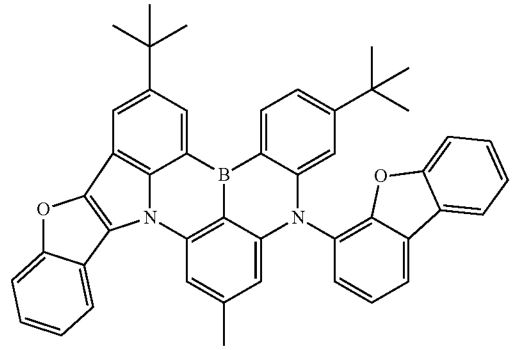
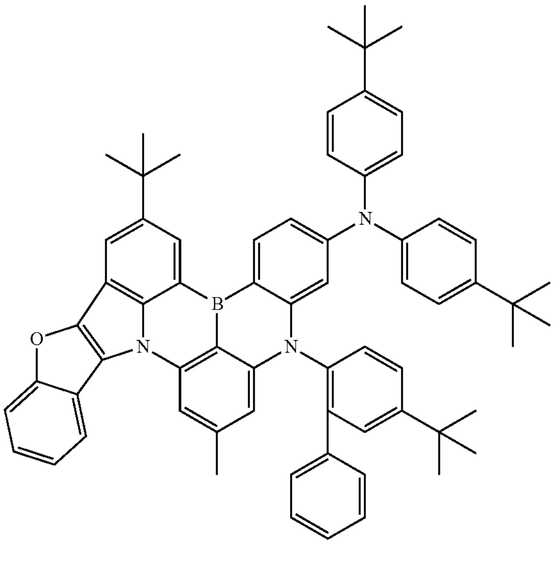

-continued
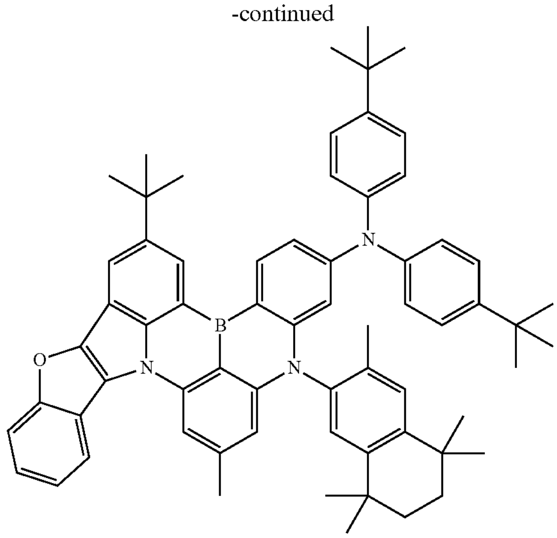
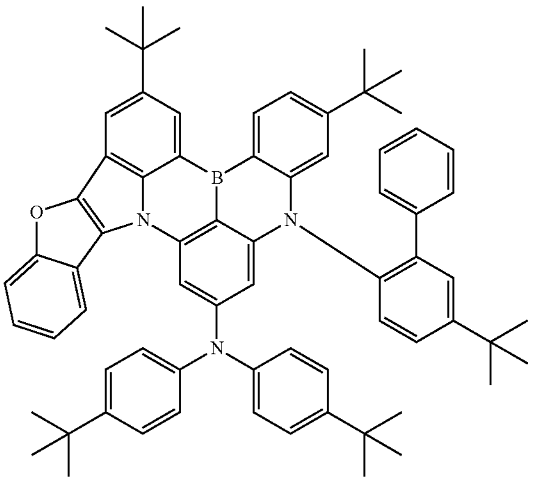
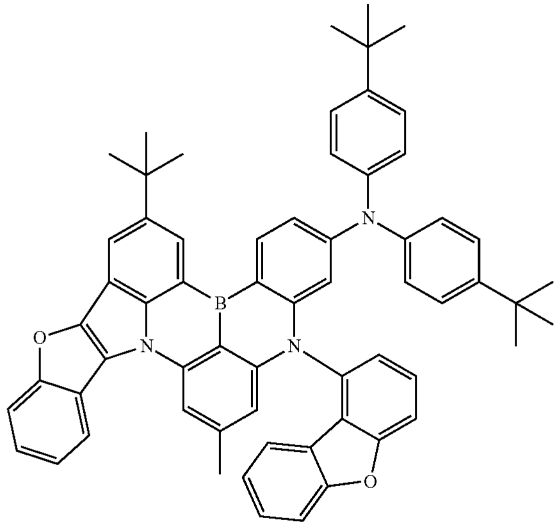
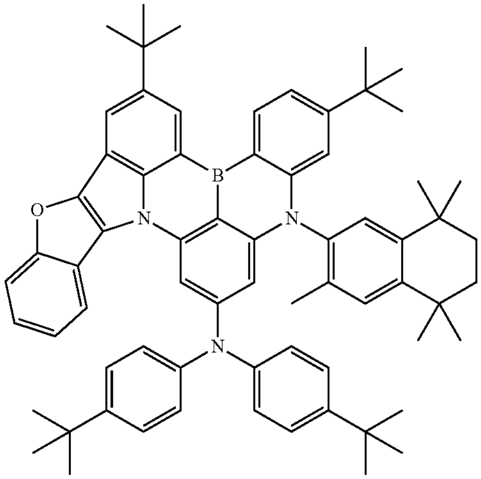
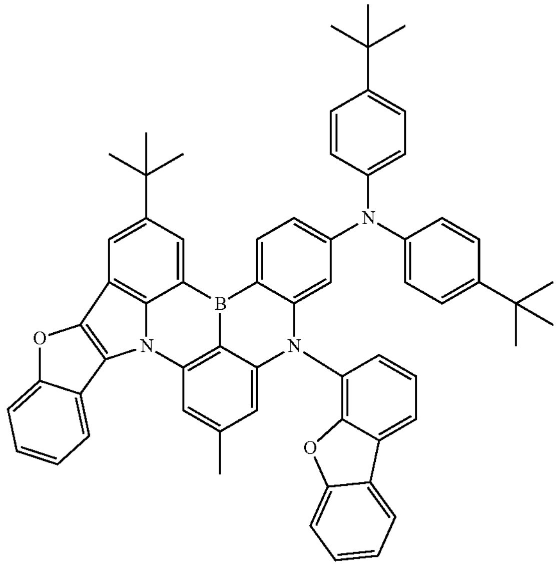
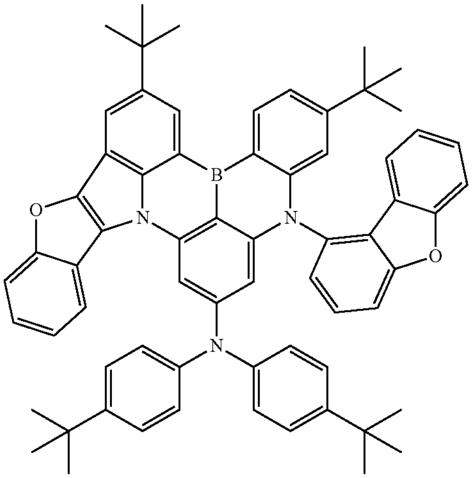

-continued
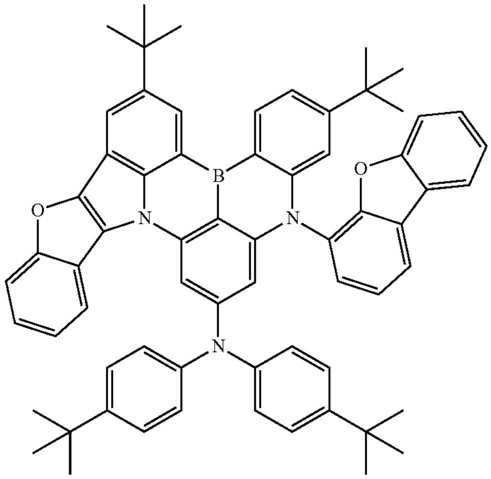
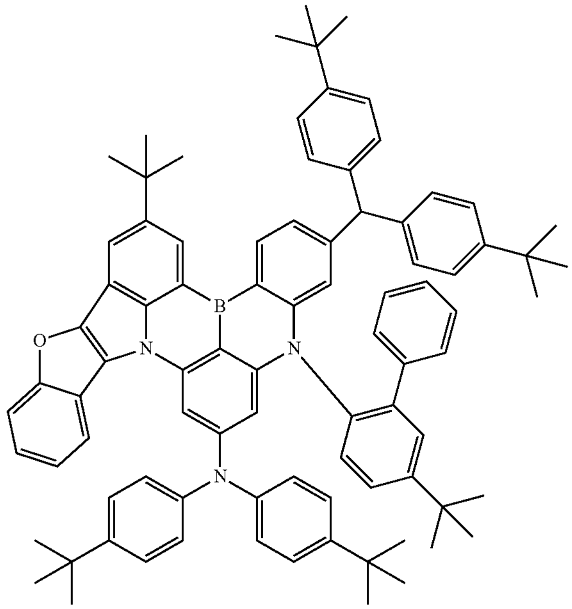
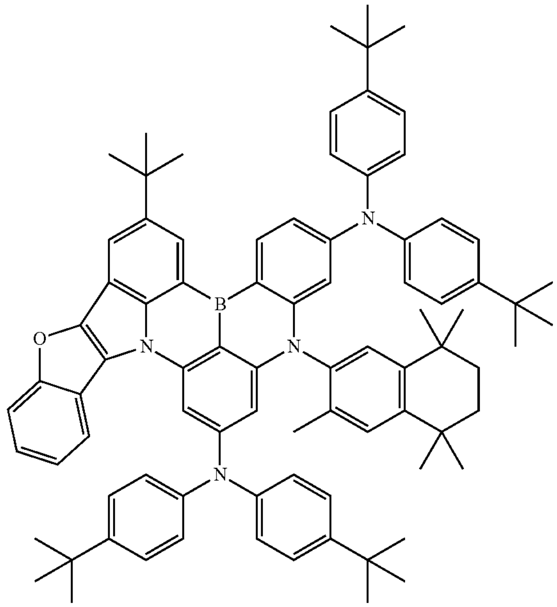
-continued
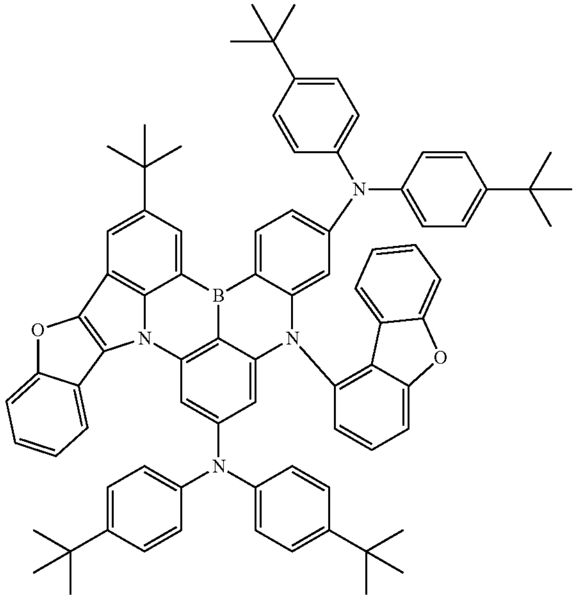
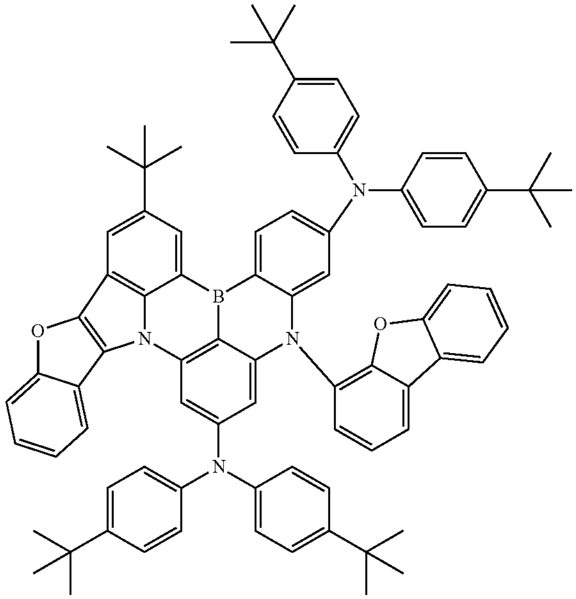

-continued
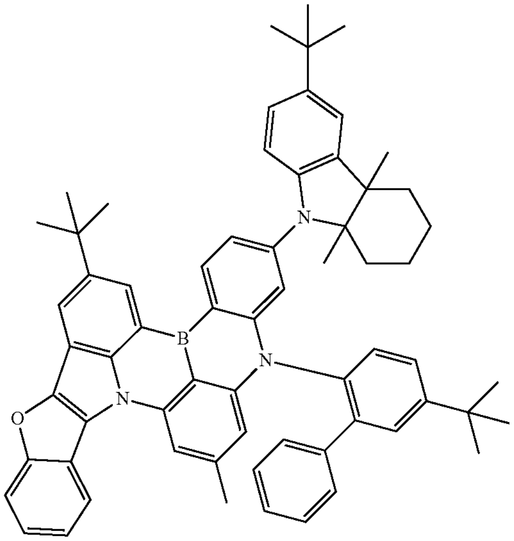
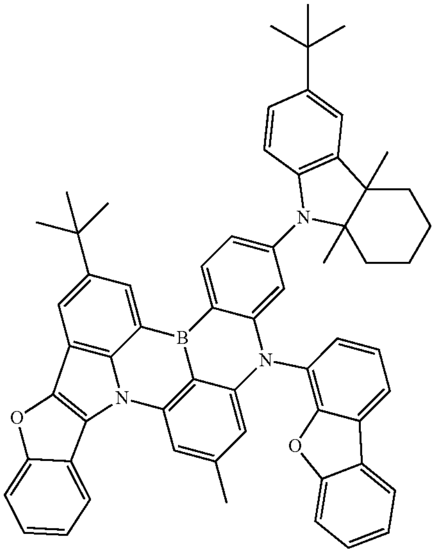
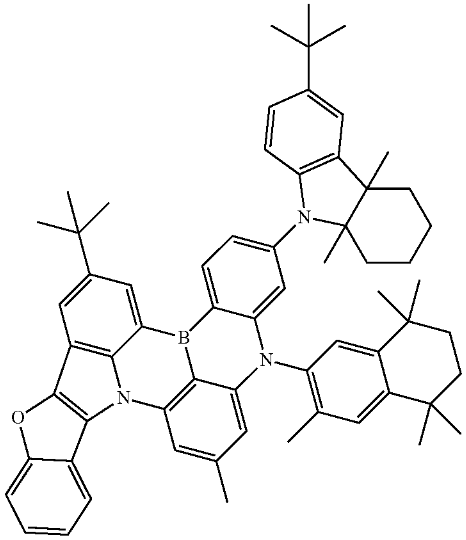
-continued
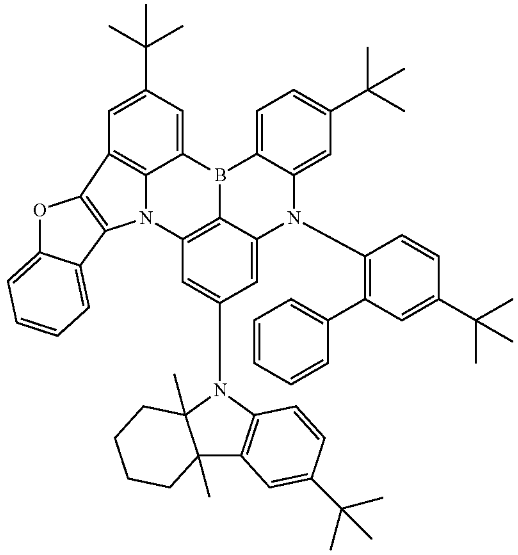
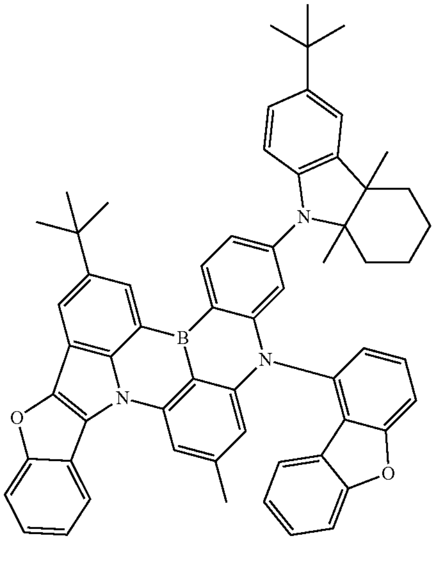
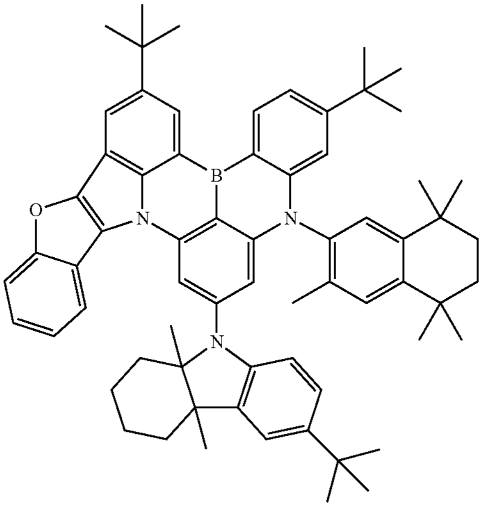

-continued
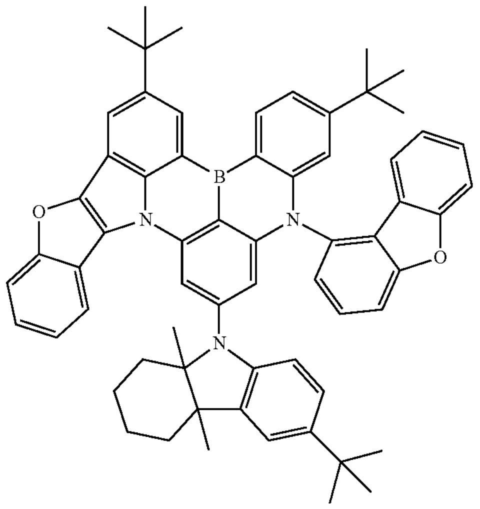
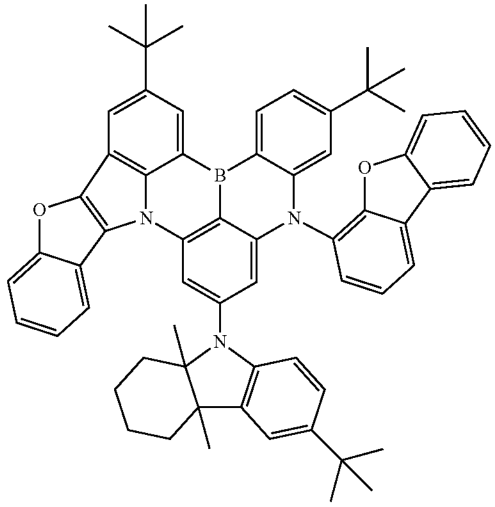
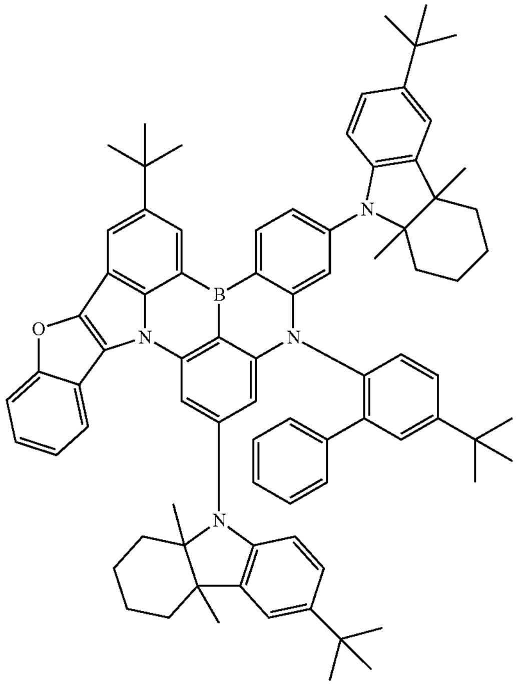
-continued
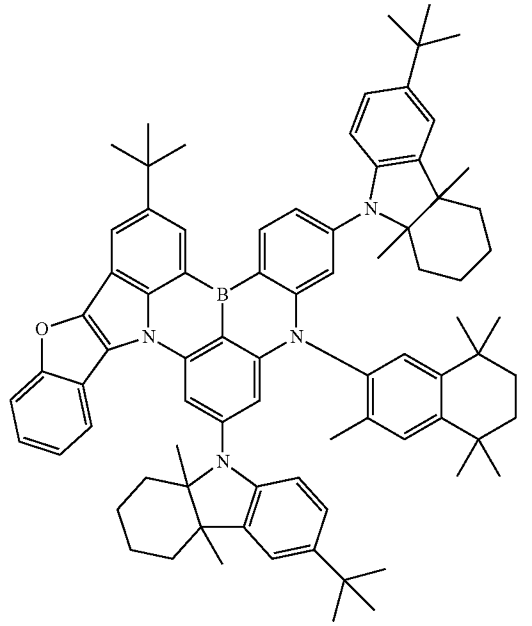
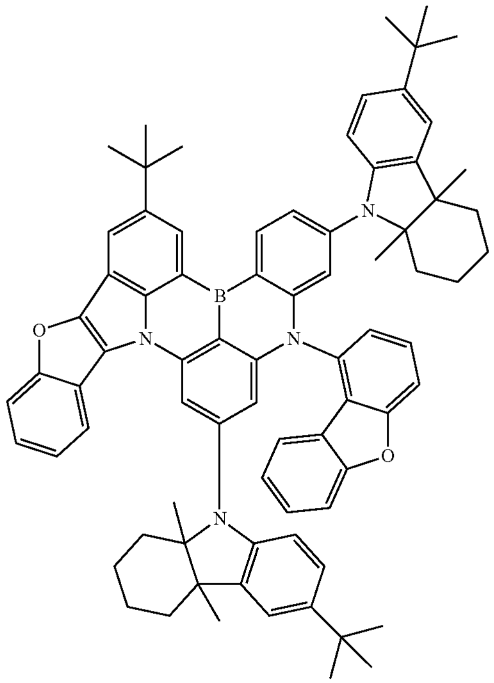

-continued
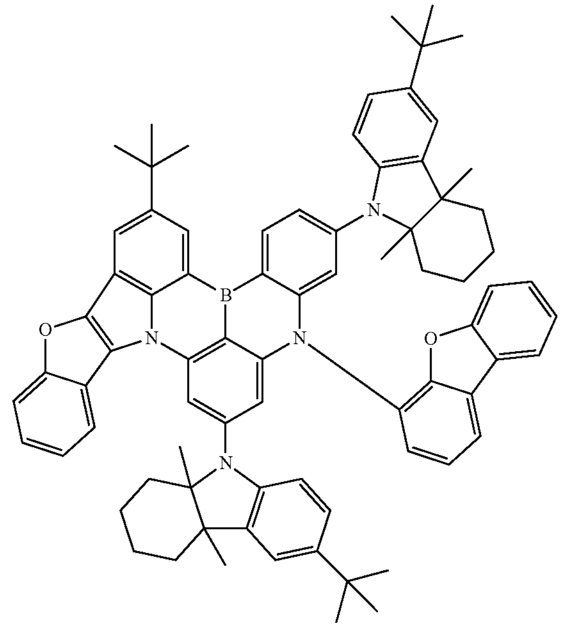 [SMILES: CC(C)(C)c1ccc2c(c1)C1(C)CCCCC1(C)N2c1ccc2c(c1)N(c1cccc3c1oc1ccccc13)c1cc(N3c4ccc(C(C)(C)C)cc4C4(C)CCCCC34C)cc3c1B2c1cc(C(C)(C)C)cc2c4oc5ccccc5c4n-3c12]
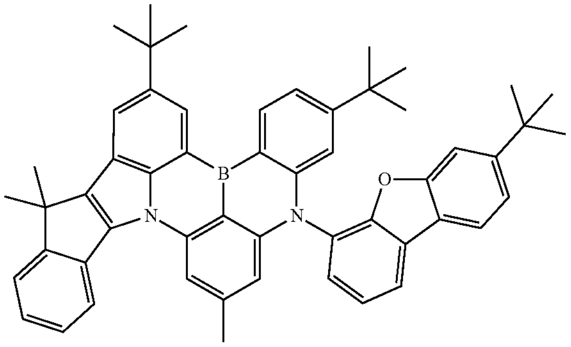
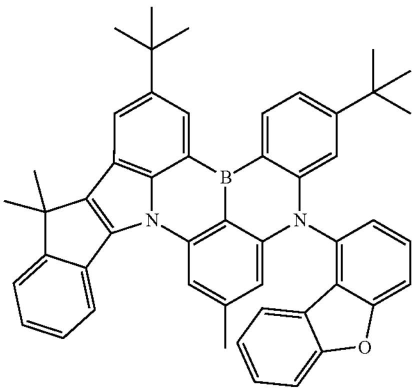
-continued
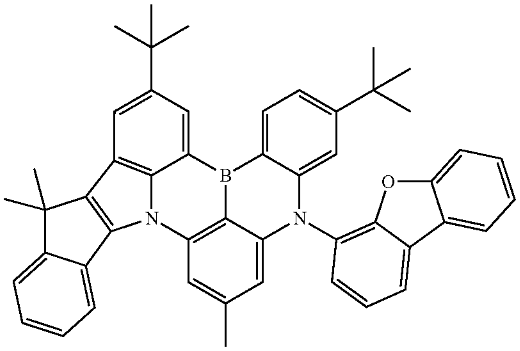
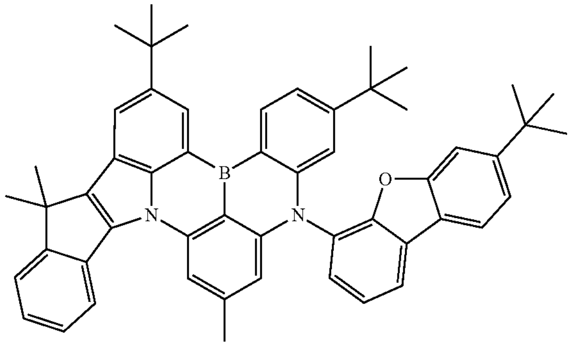
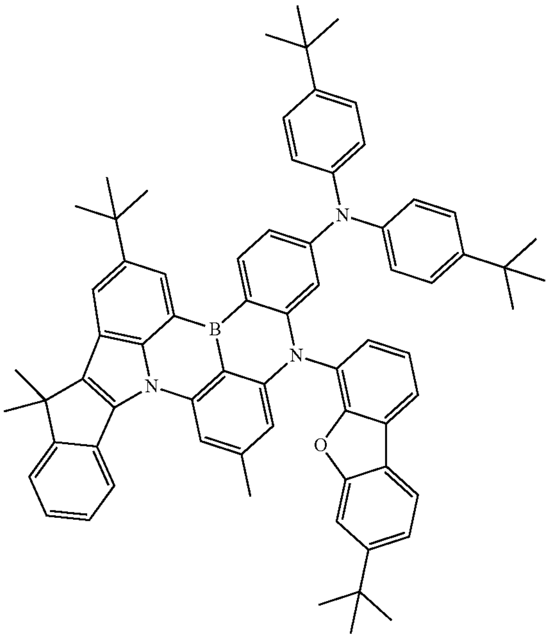

-continued
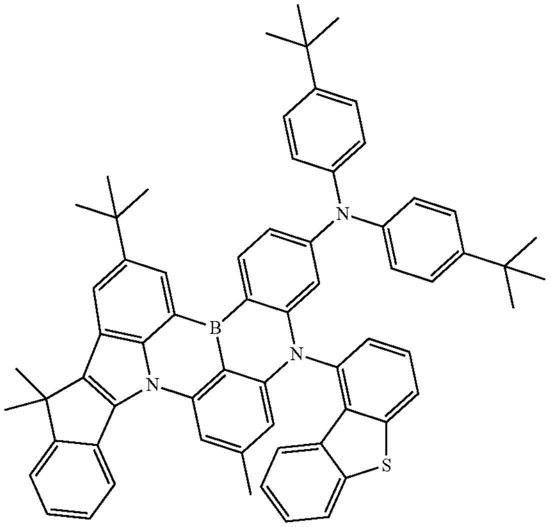
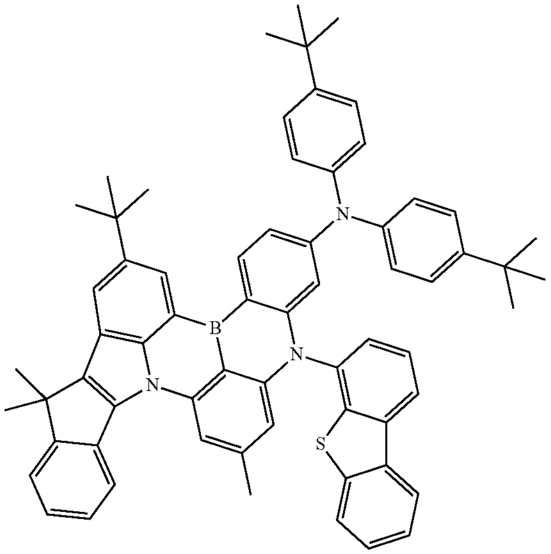
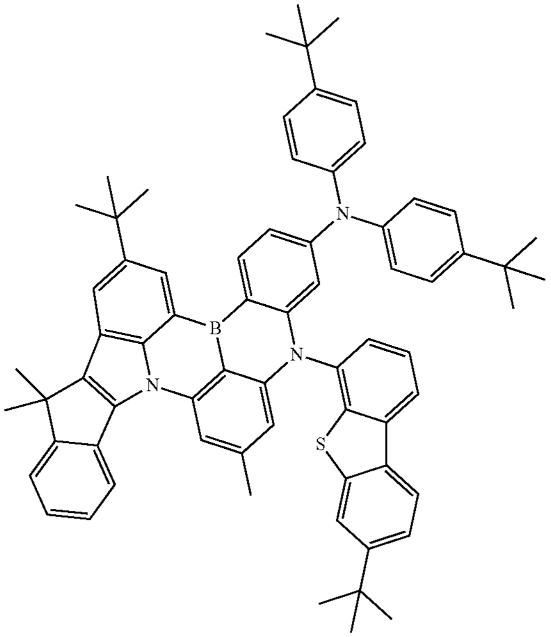
-continued
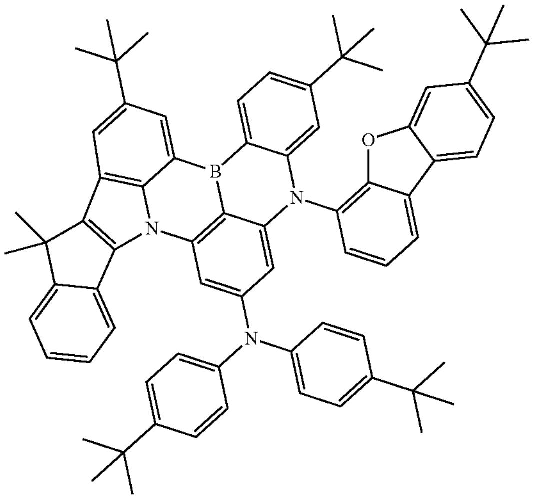
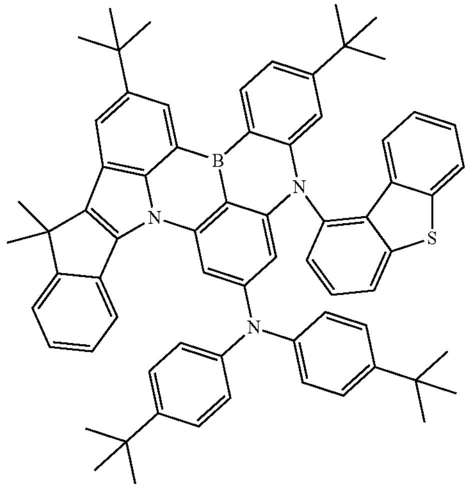
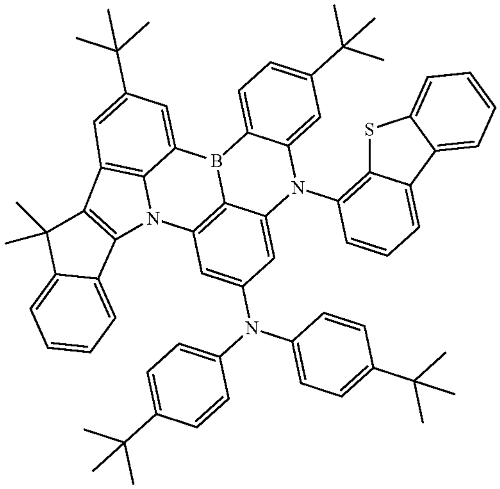

-continued
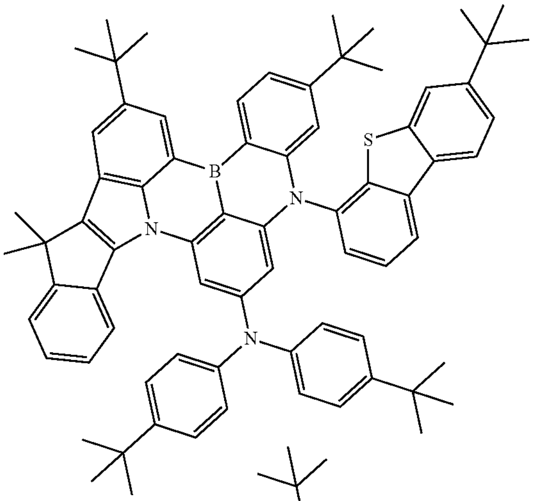
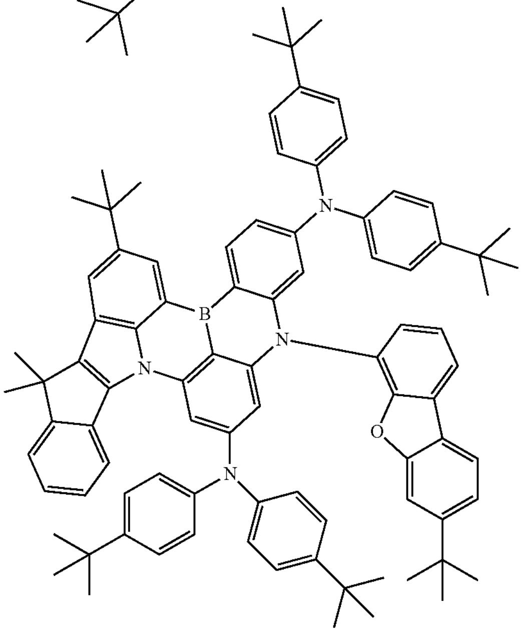
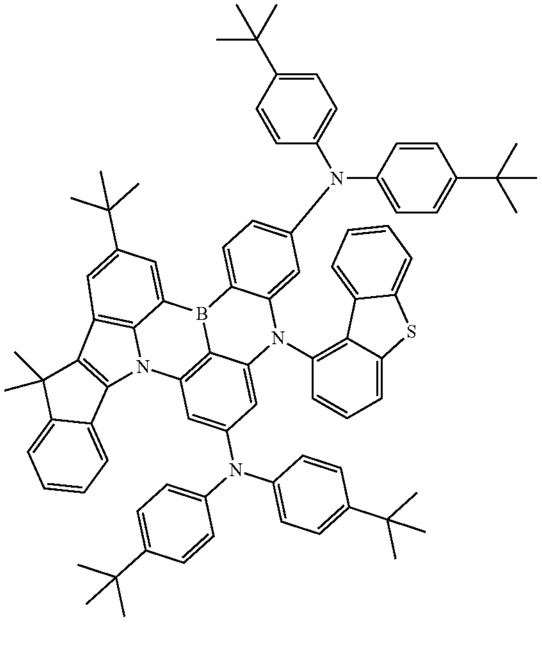
-continued
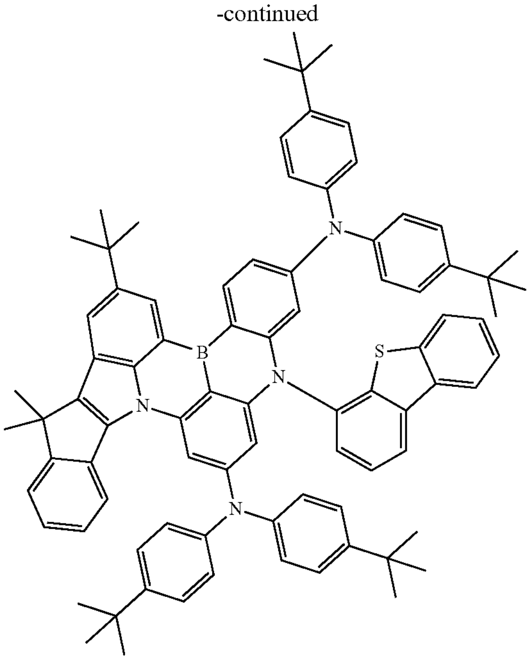
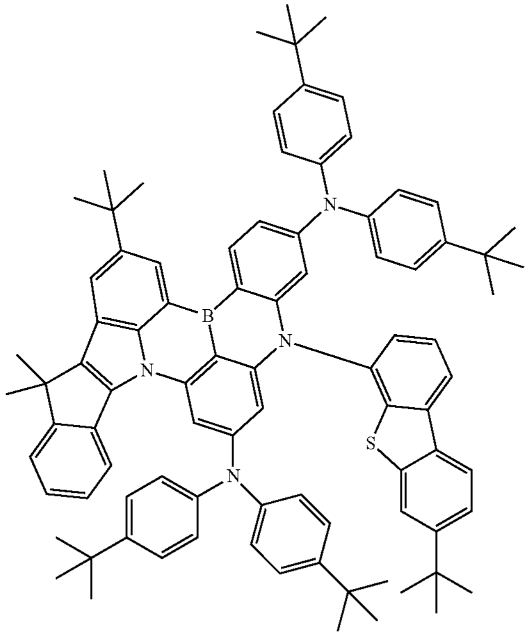

-continued
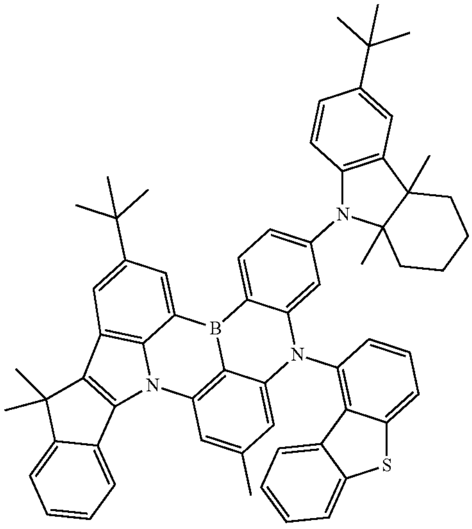
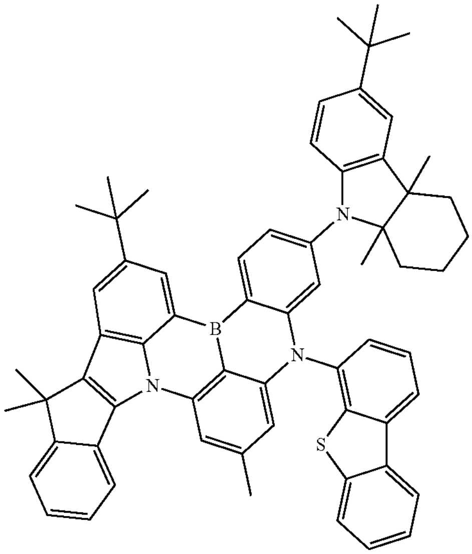
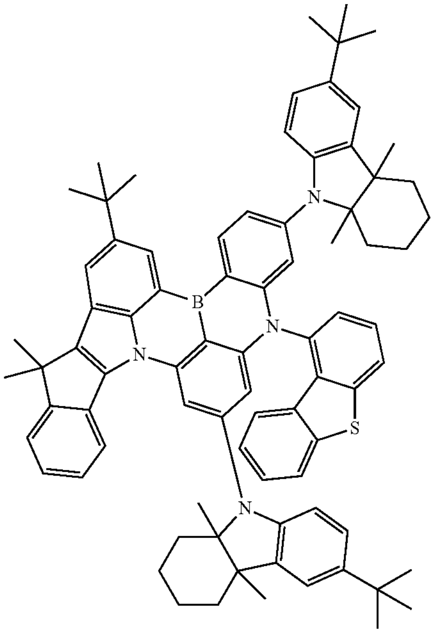
-continued
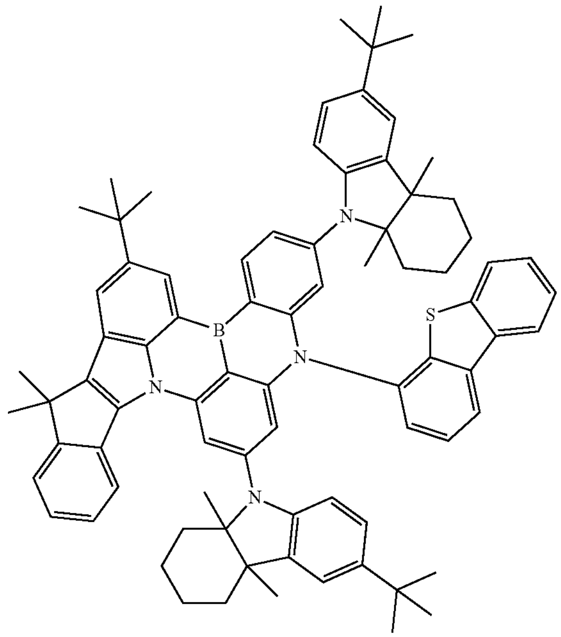
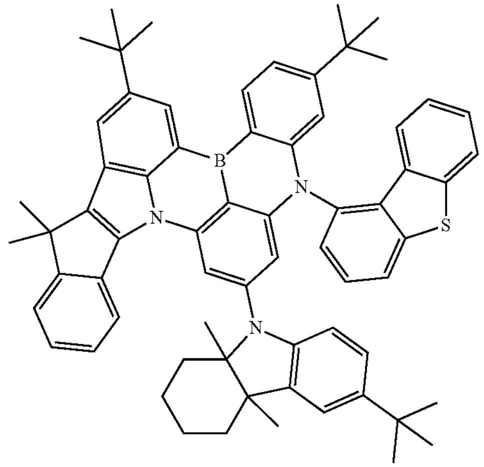
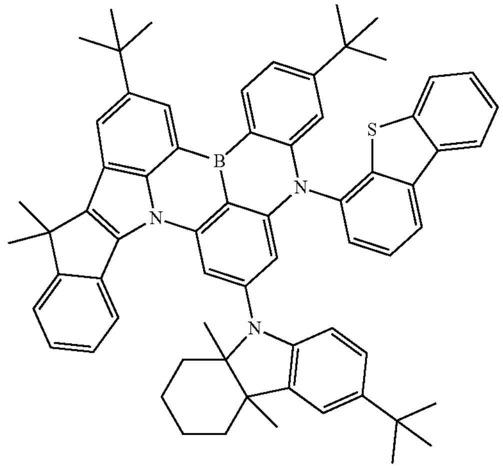 [SMILES: CC(C)(C)c1ccc2c(c1)N(c1cccc3c1sc1ccccc13)c1cc(N3c4ccc(C(C)(C)C)cc4C4(C)CCCCC34C)cc3c1B2c1cc(C(C)(C)C)cc2c4c(n-3c12)-c1ccccc1C4(C)C]

-continued
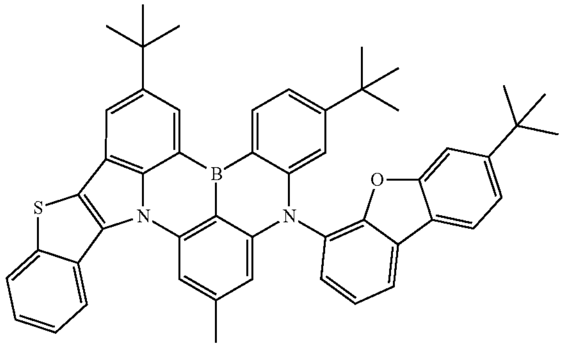
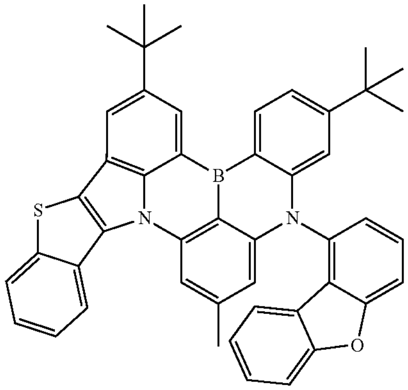
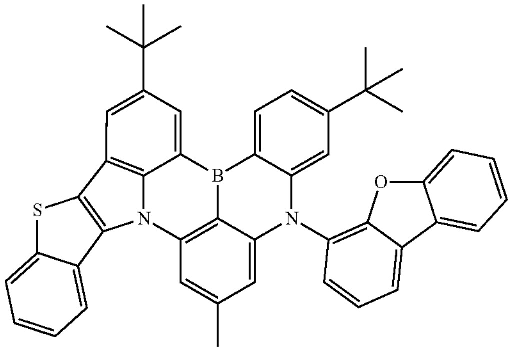
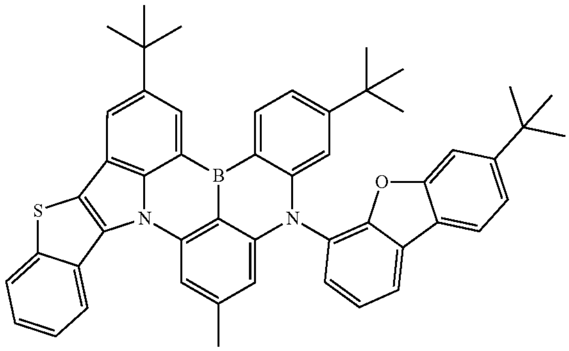
-continued
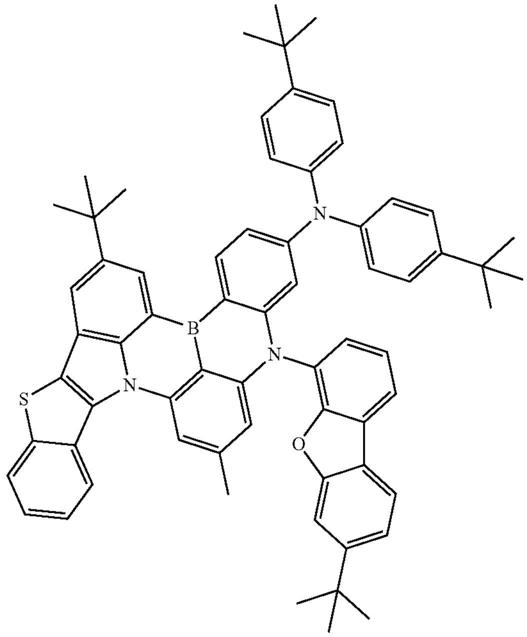
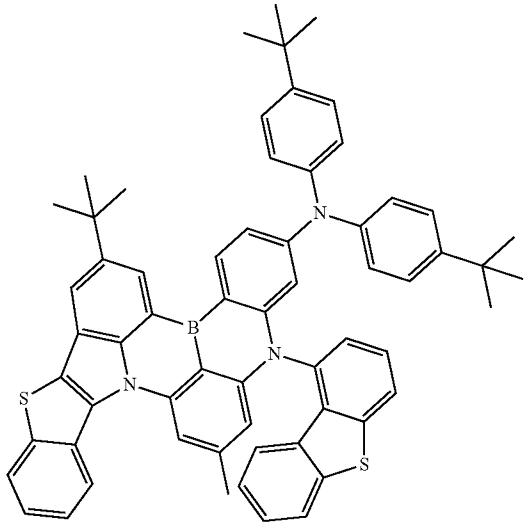
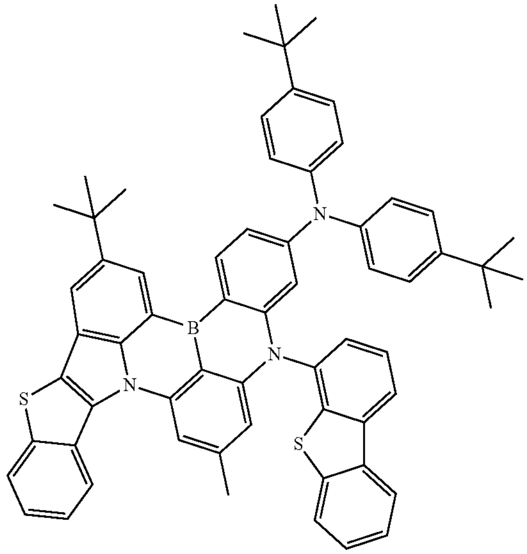

-continued
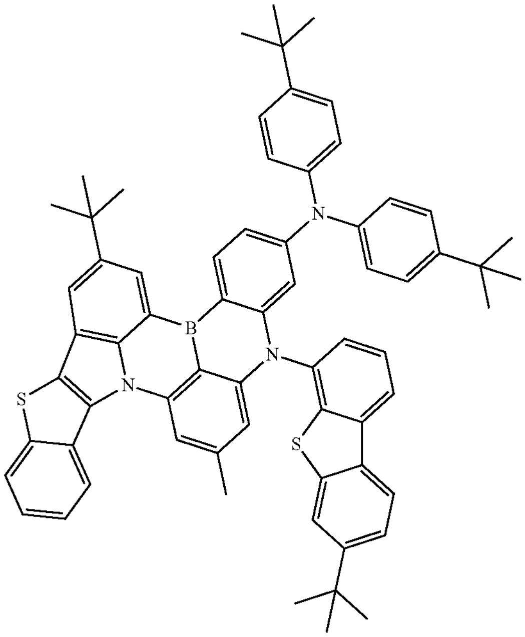
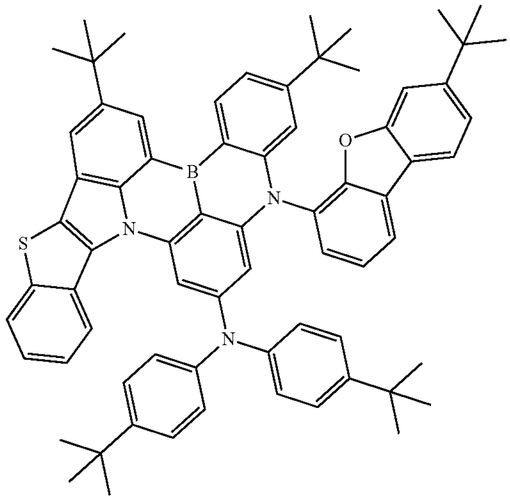
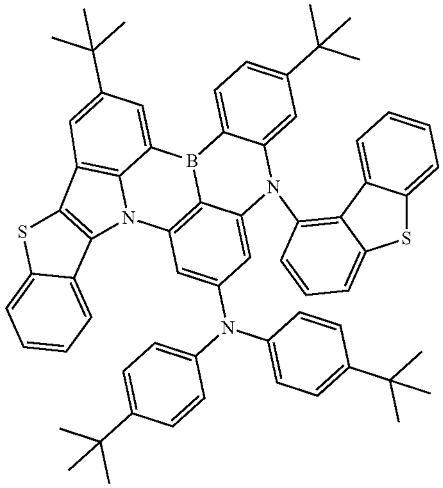
-continued
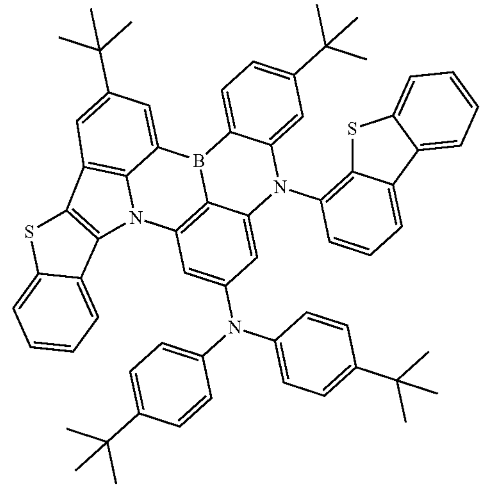
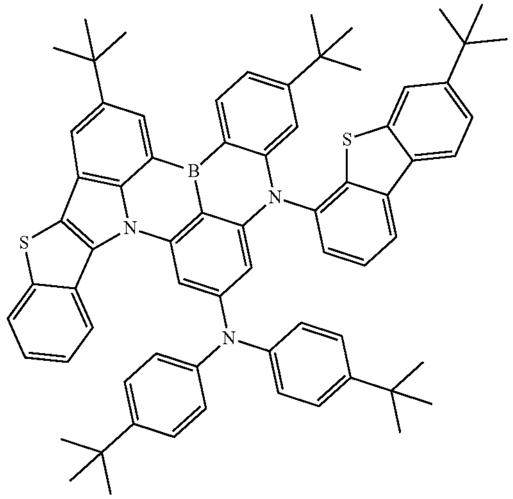
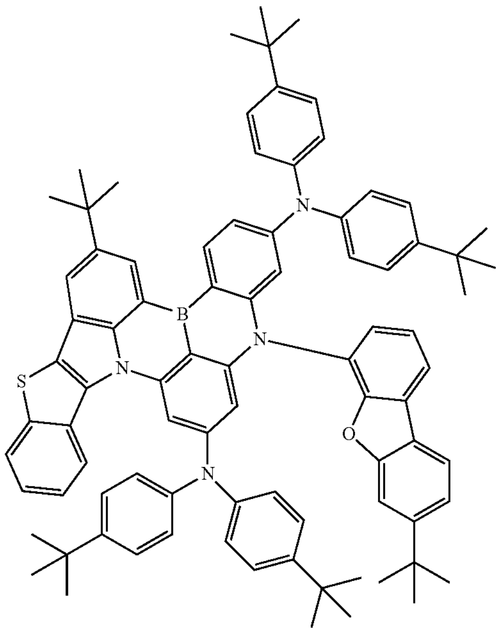

-continued
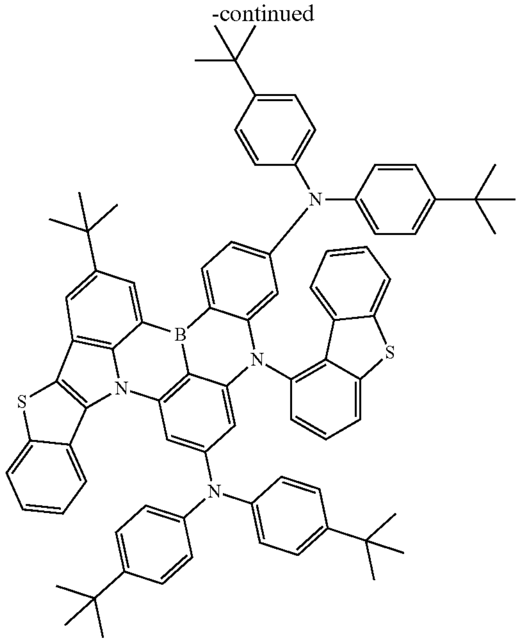
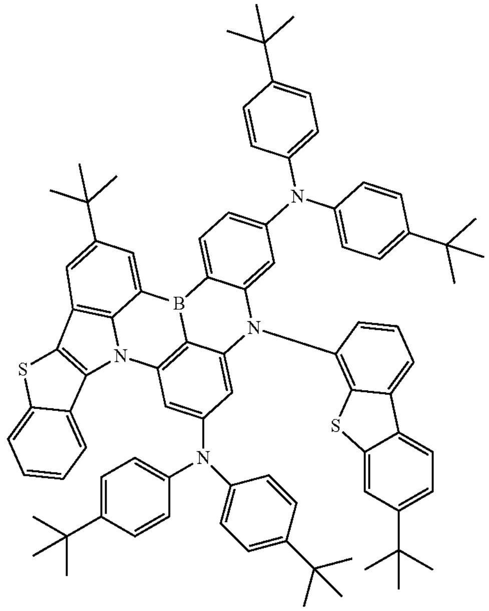
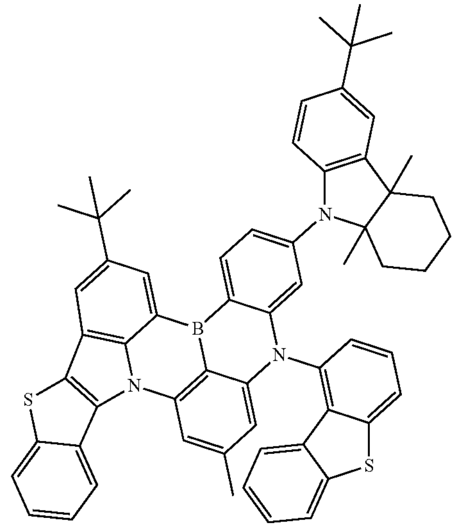
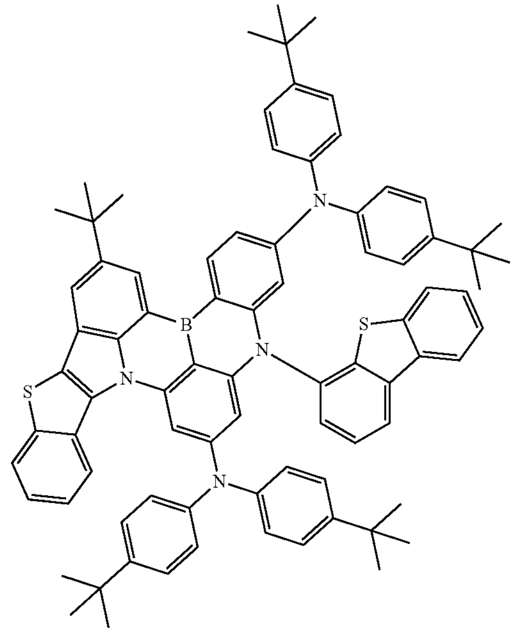
-continued
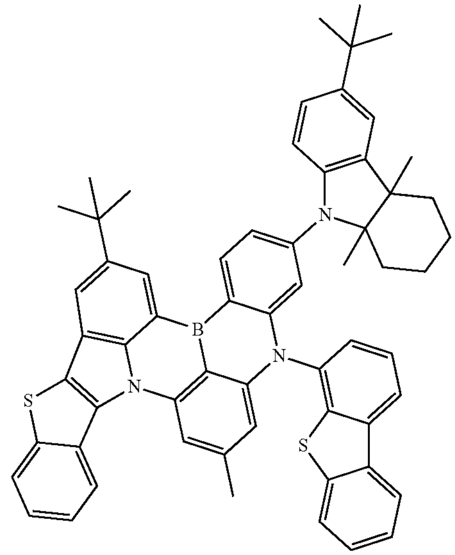

-continued
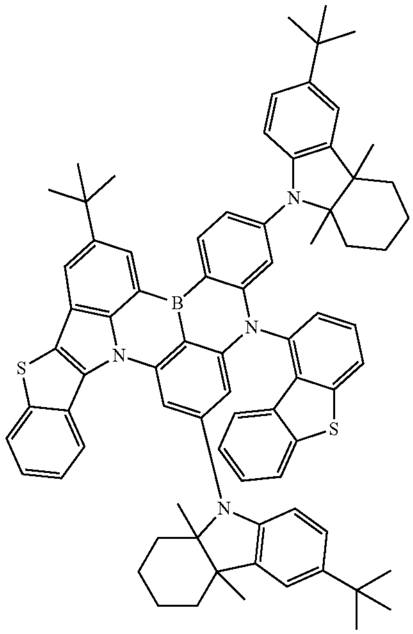
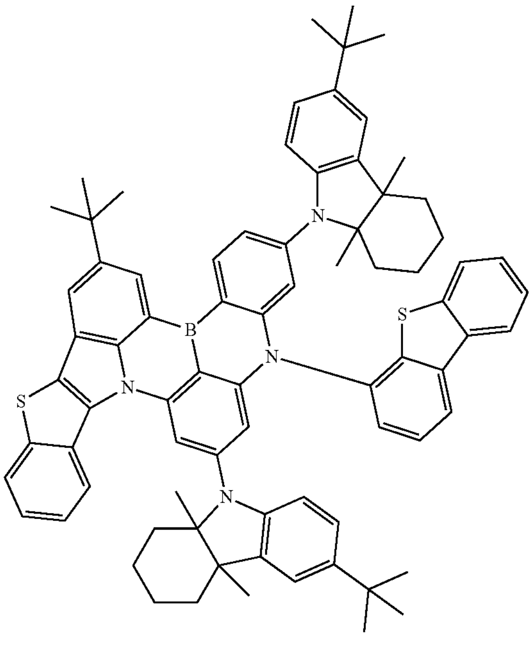
-continued
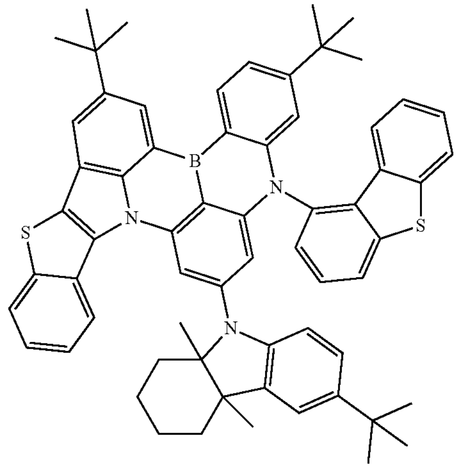
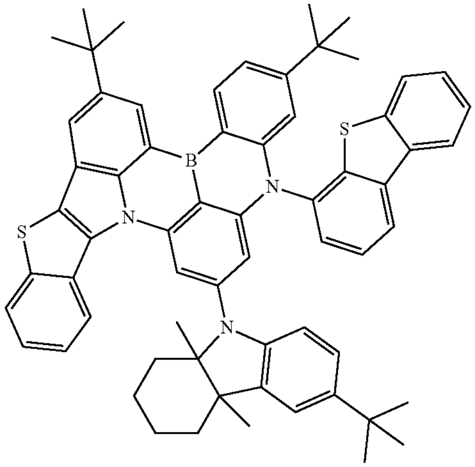
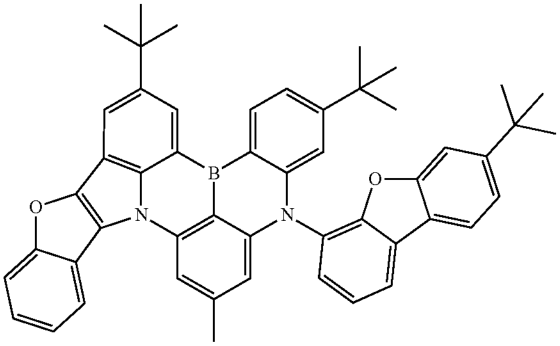
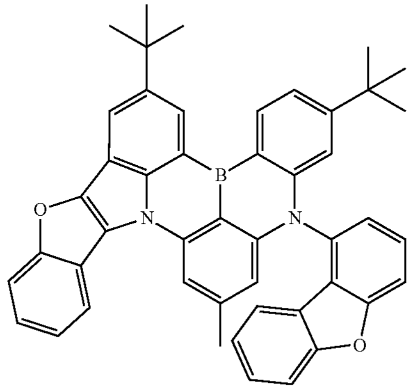

-continued
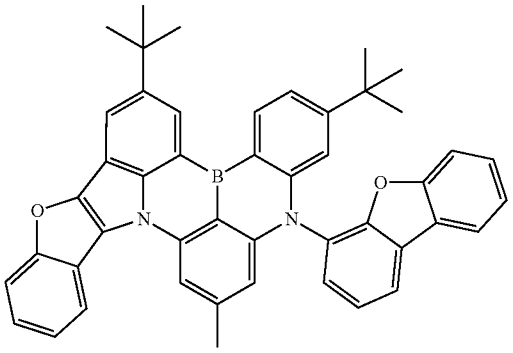
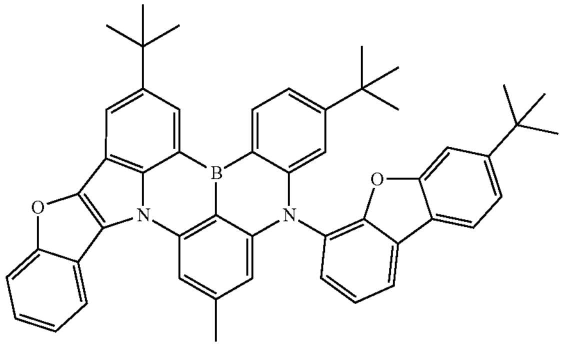
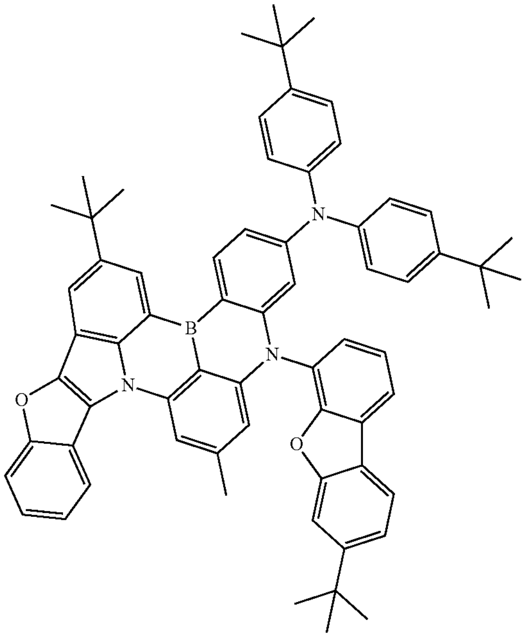
-continued
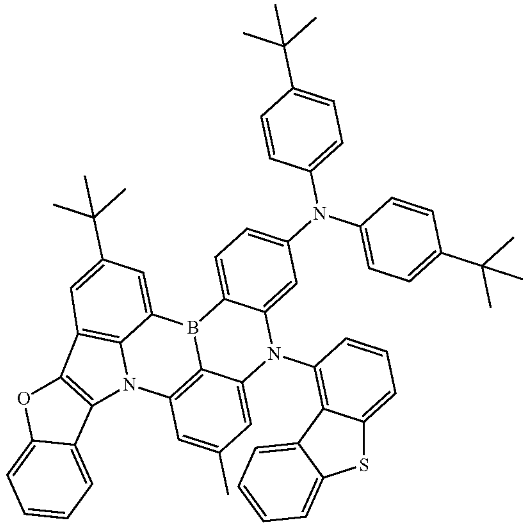
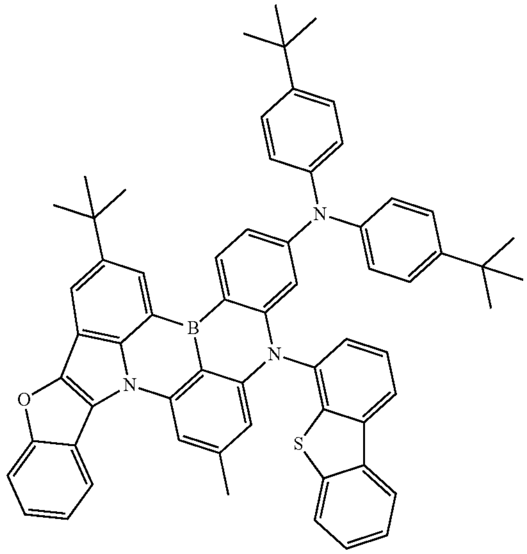
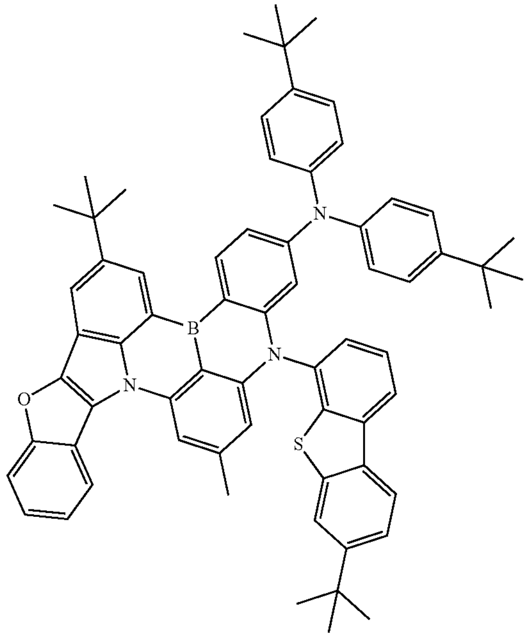

-continued
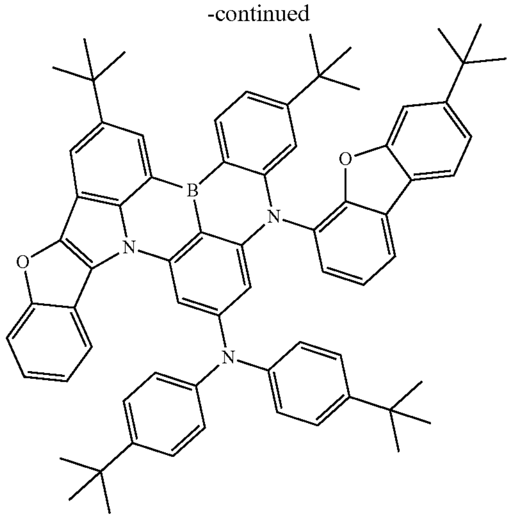
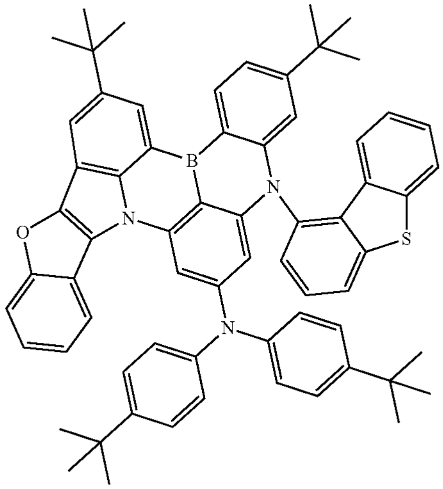
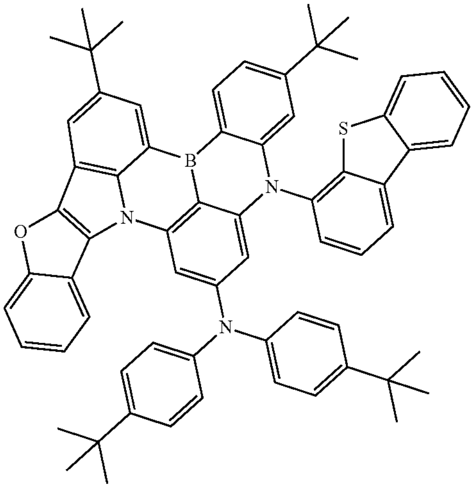
-continued
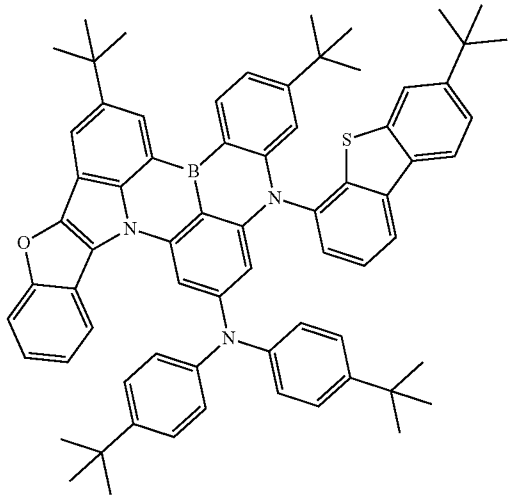
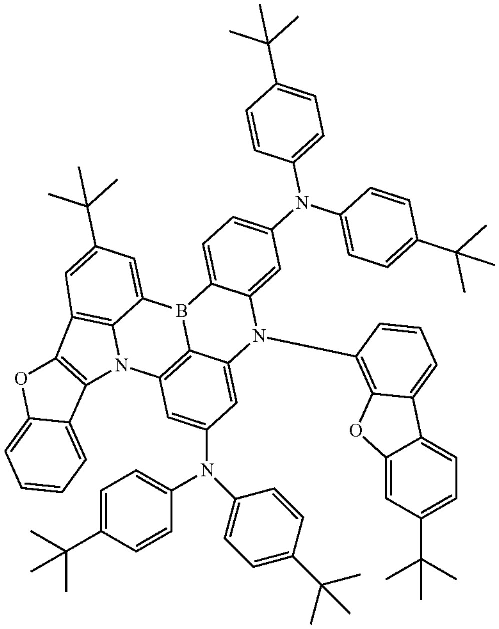

-continued
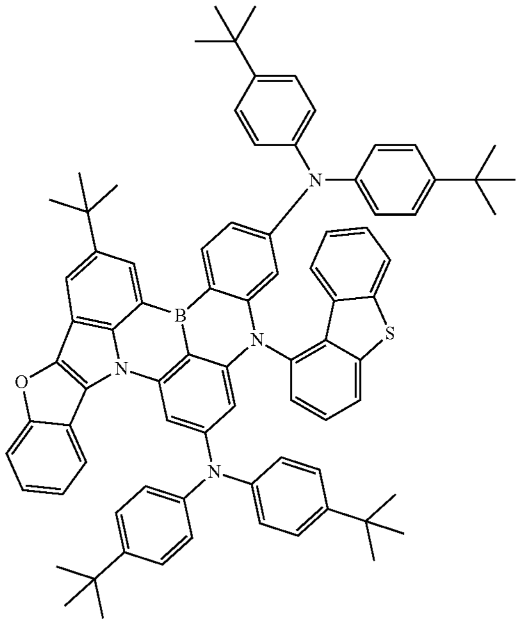
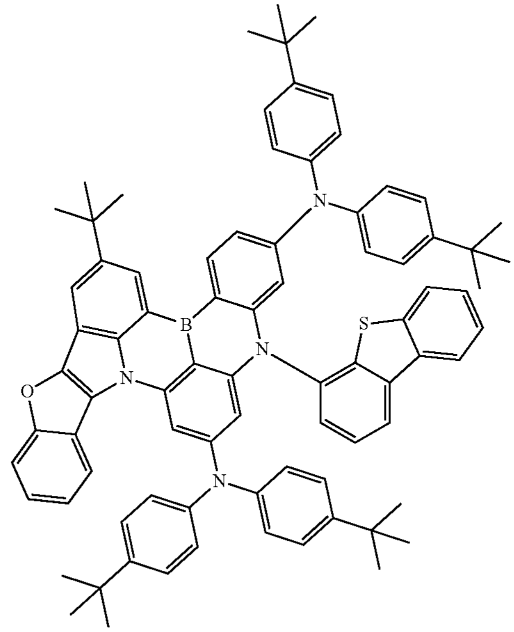
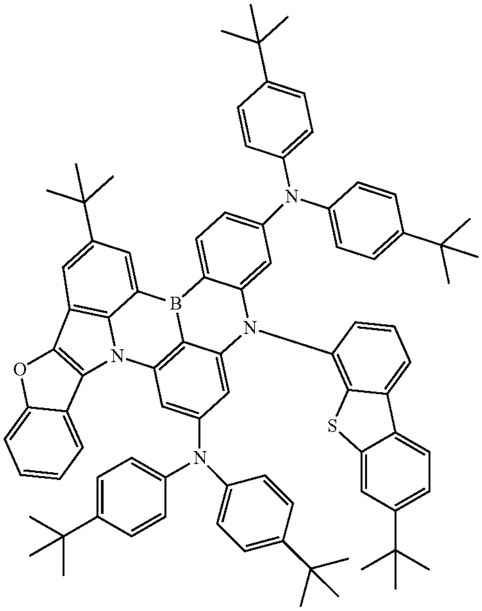
-continued
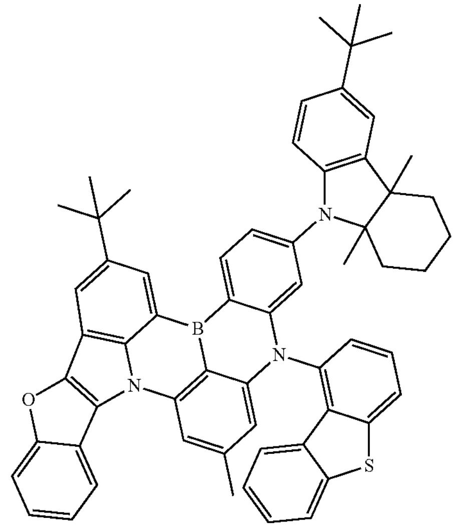
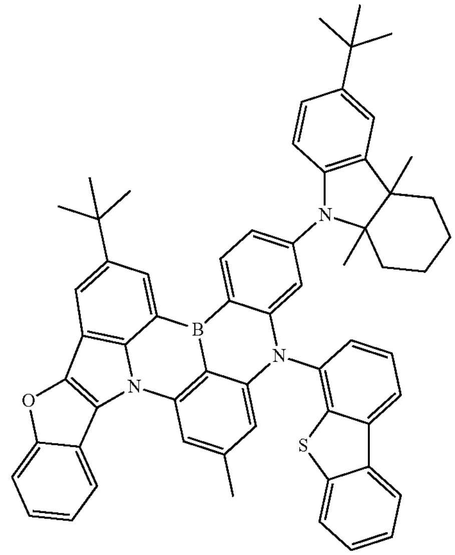

-continued
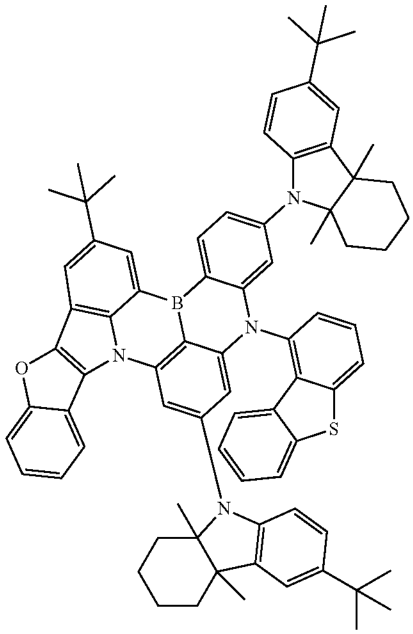
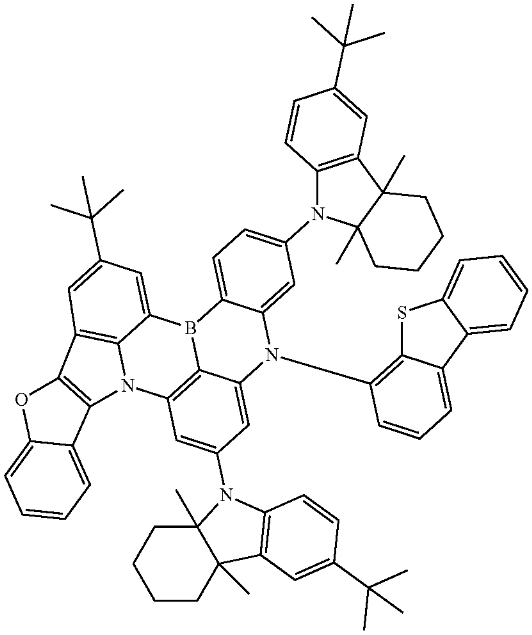
-continued
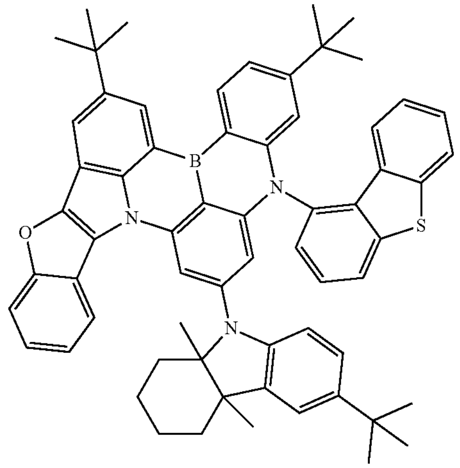
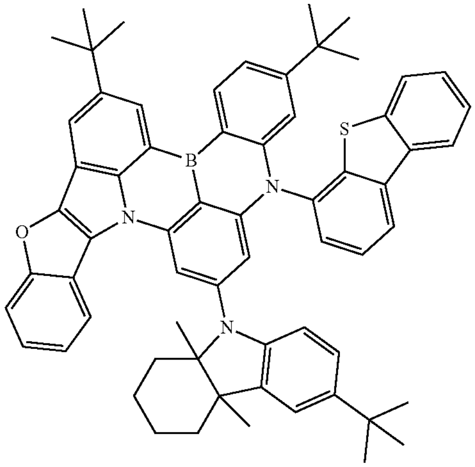 [SMILES: CC(C)(C)c1ccc2c(c1)N(c1cccc3c1sc1ccccc13)c1cc(N3c4ccc(C(C)(C)C)cc4C4(C)CCCCC34C)cc3c1B2c1cc(C(C)(C)C)cc2c4sc5ccccc5c4n-3c12]
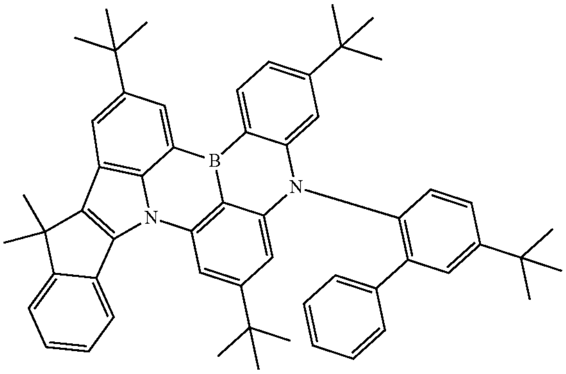
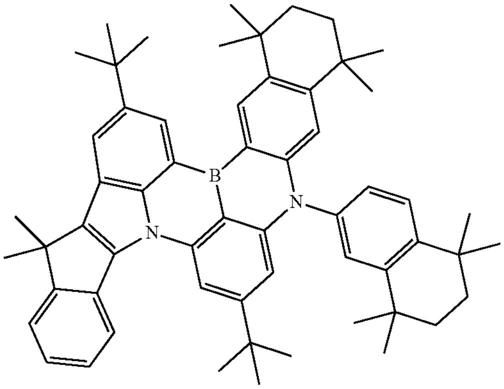

-continued
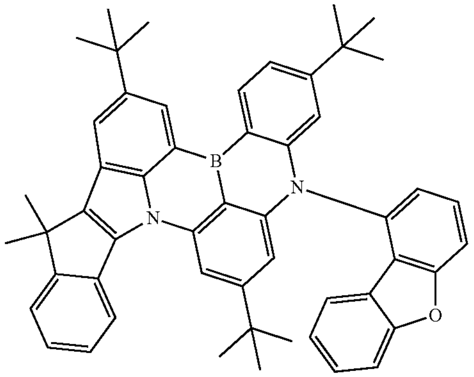
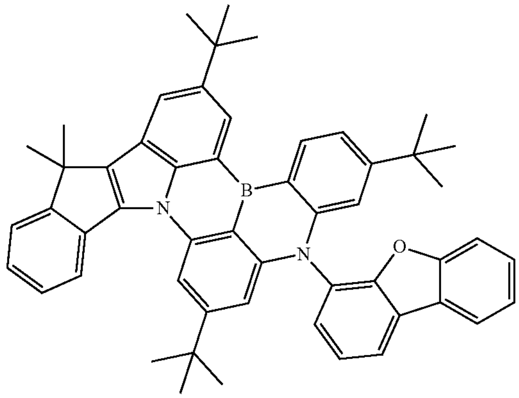
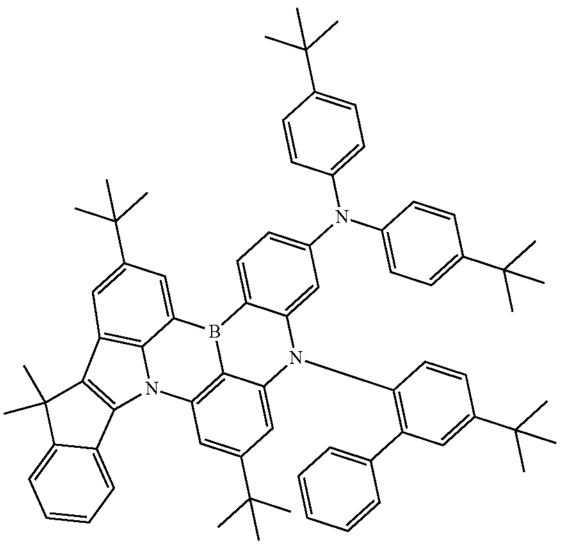
-continued
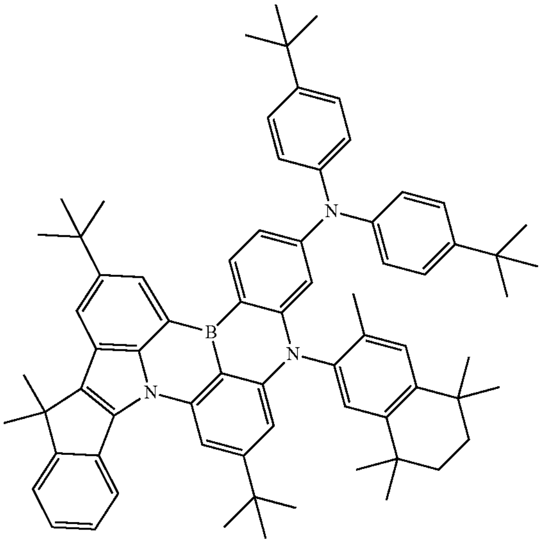
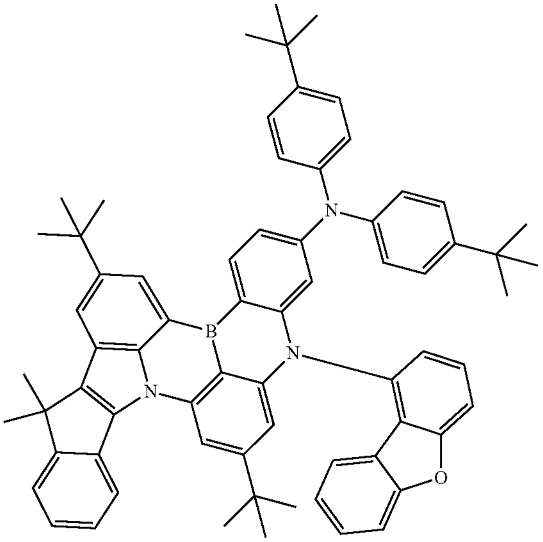
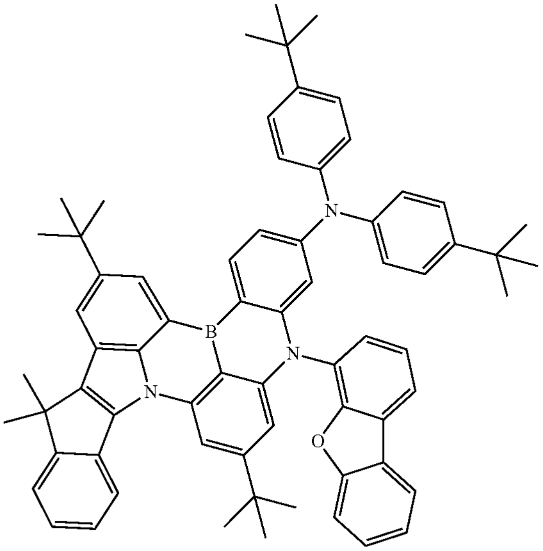

-continued
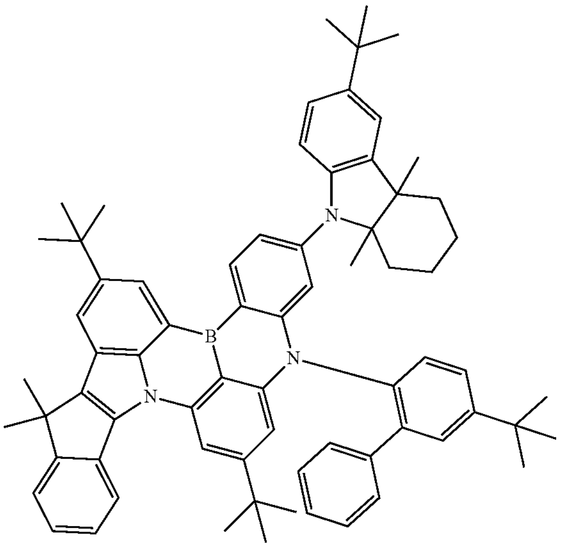
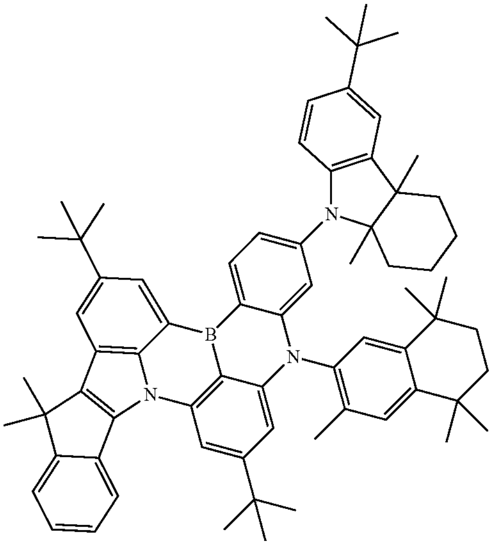
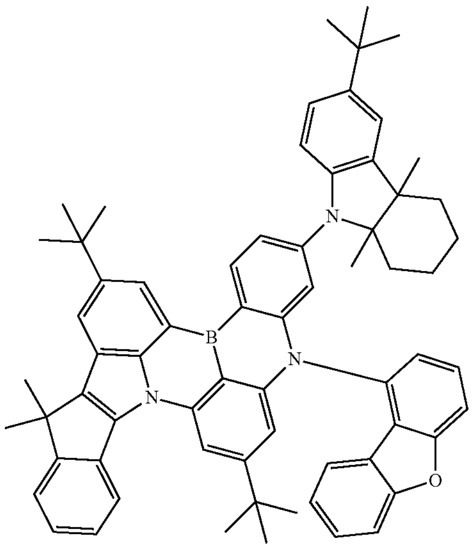
-continued
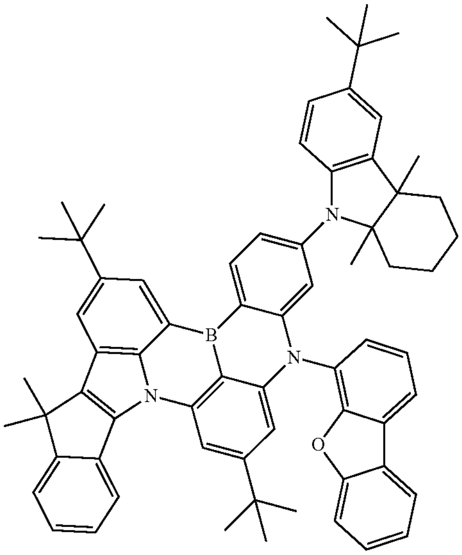
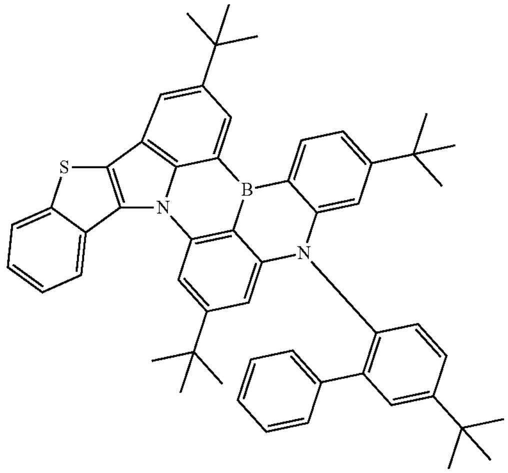
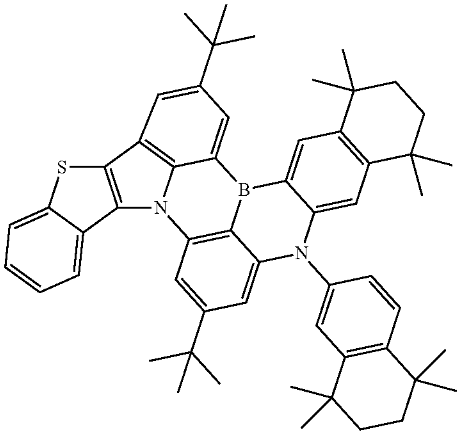

-continued
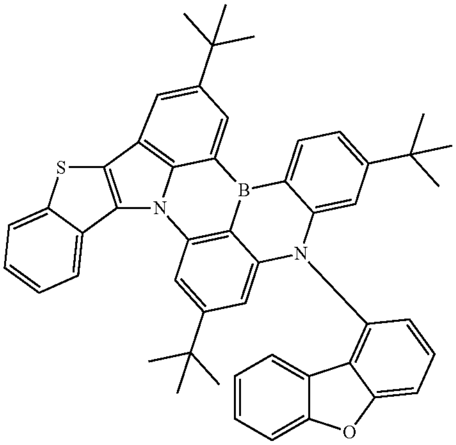
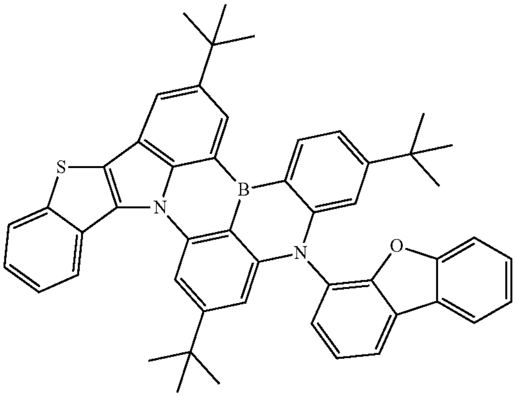
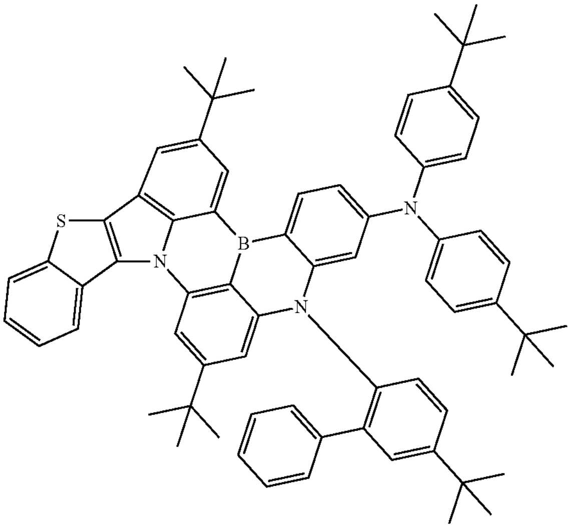
-continued
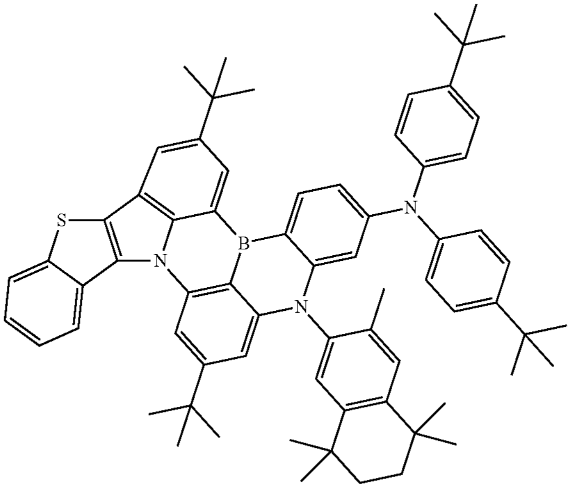
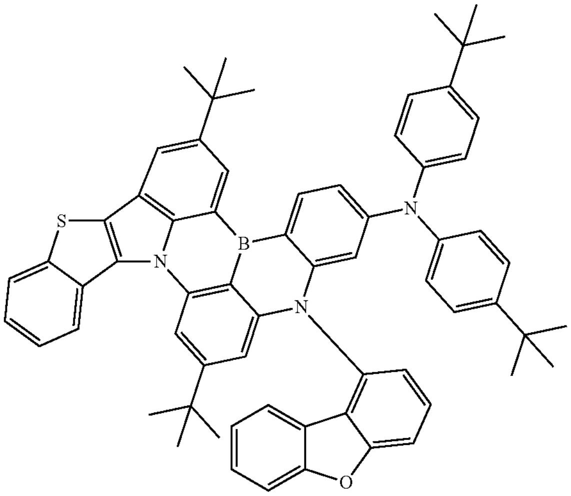
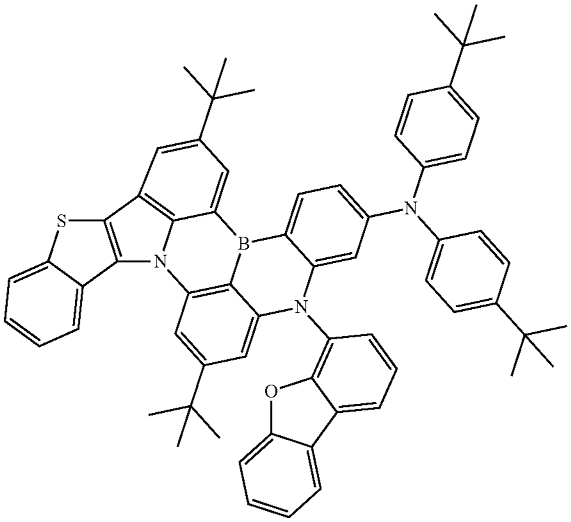

-continued
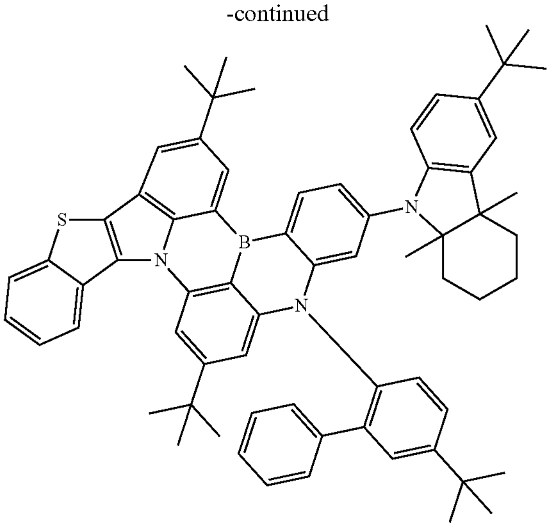
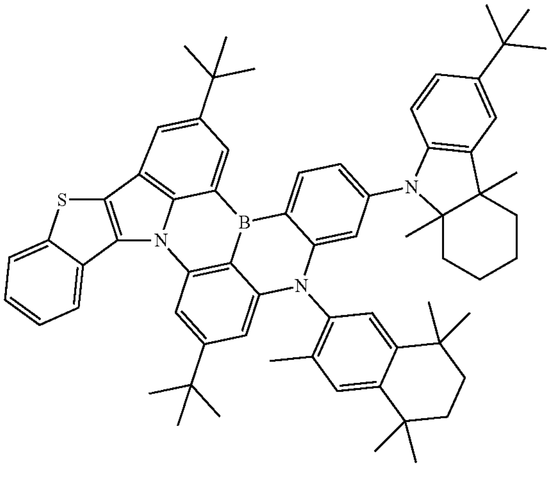
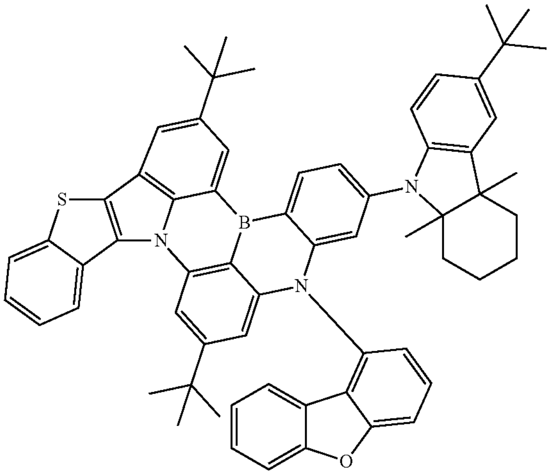
-continued
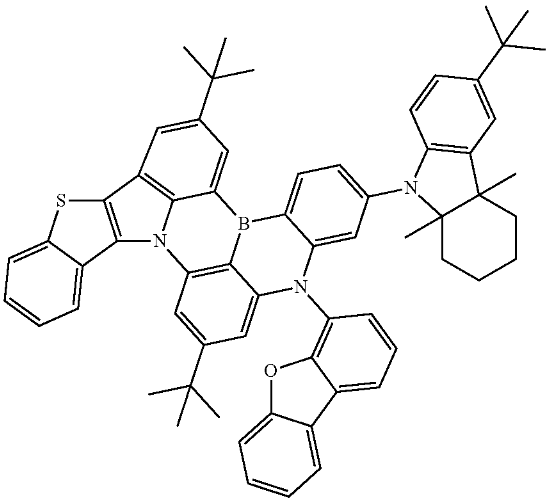
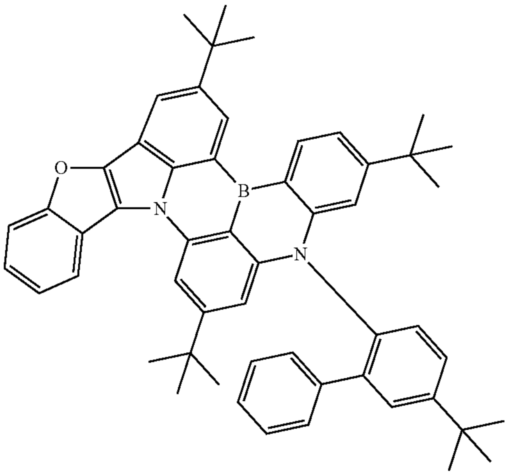
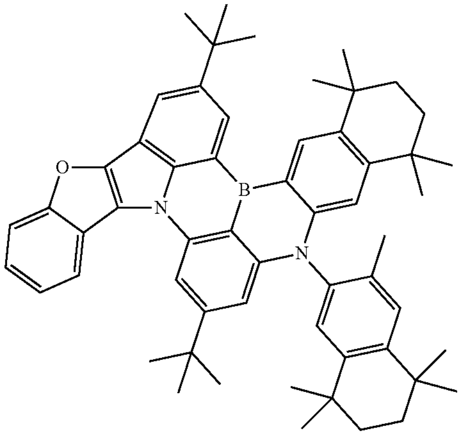

-continued
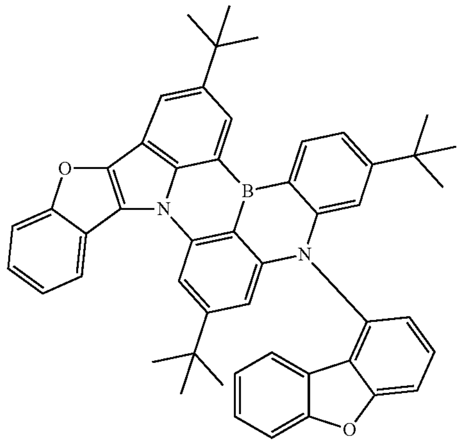
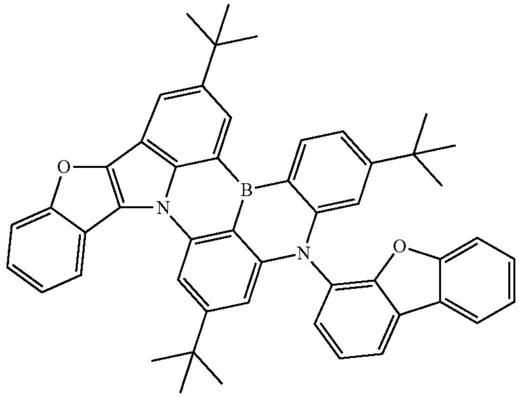
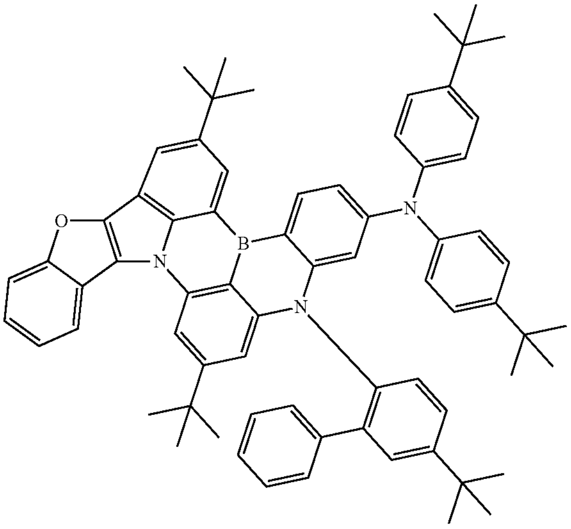
-continued
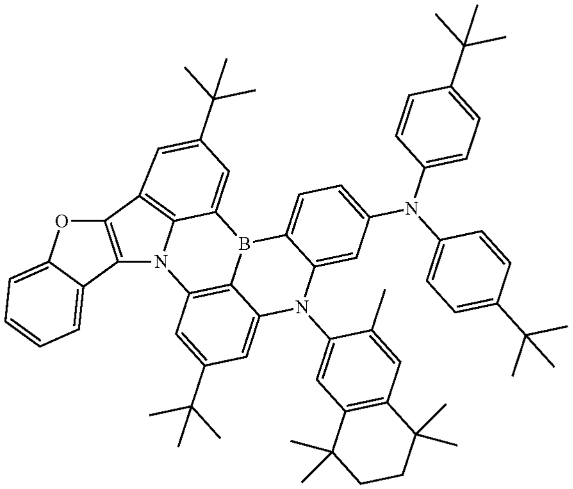
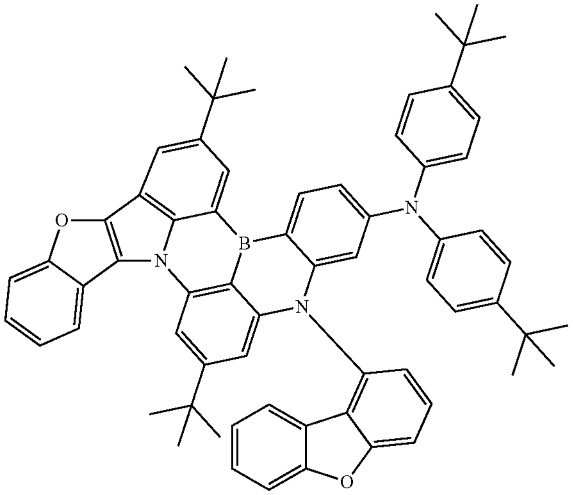
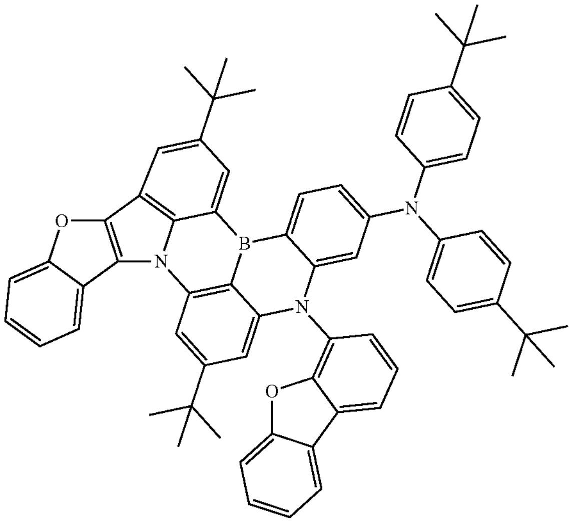

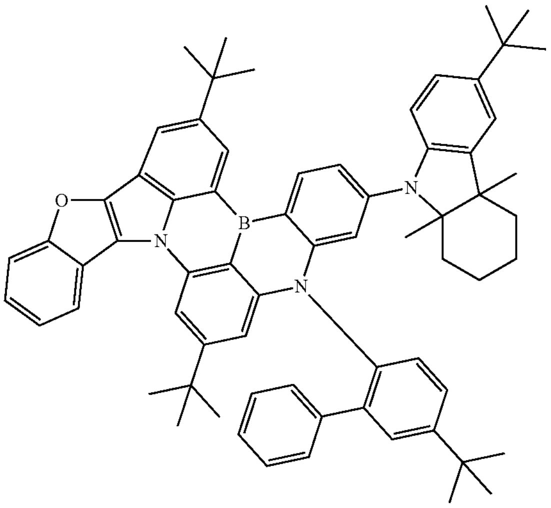
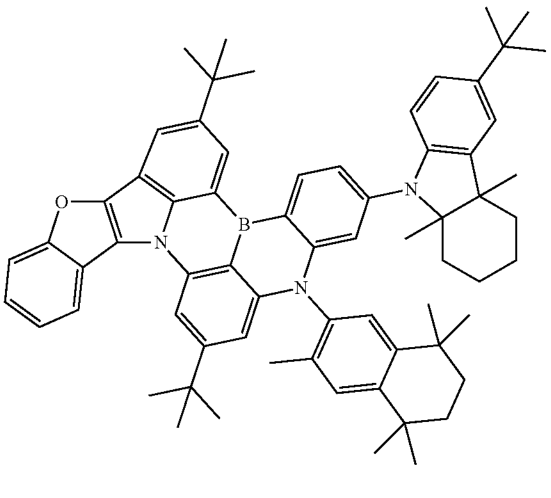
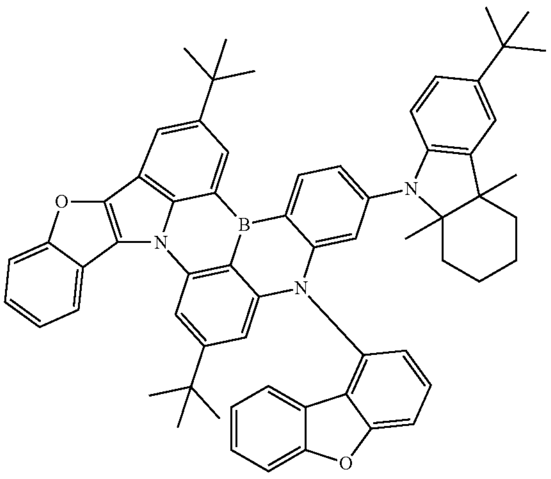
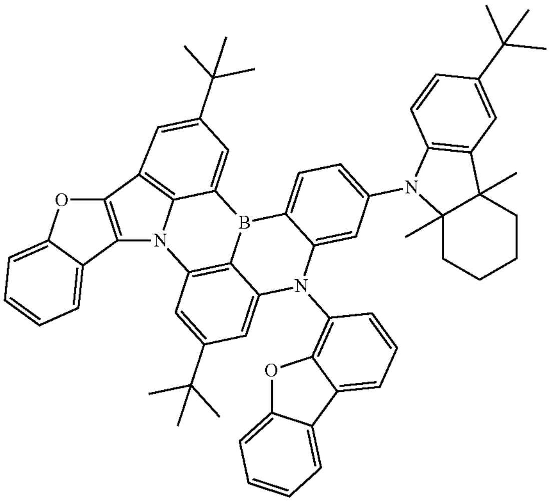
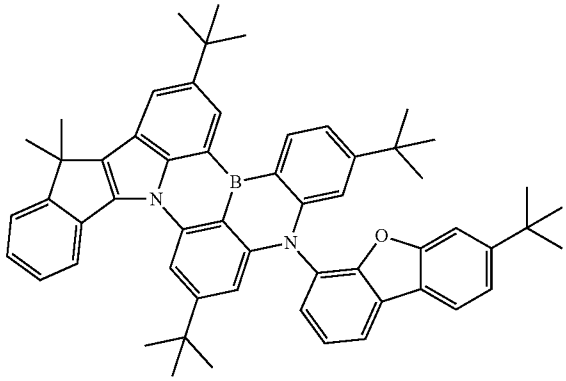
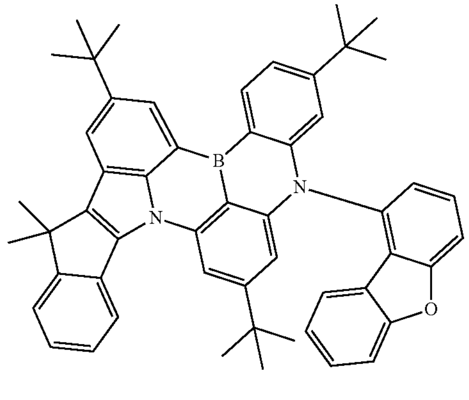
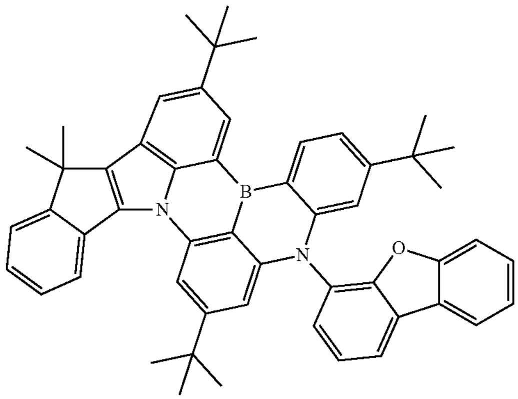

-continued
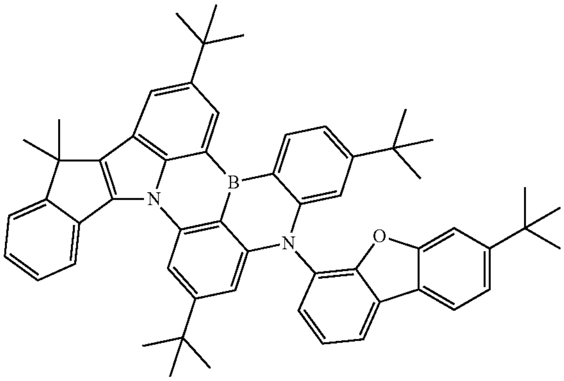
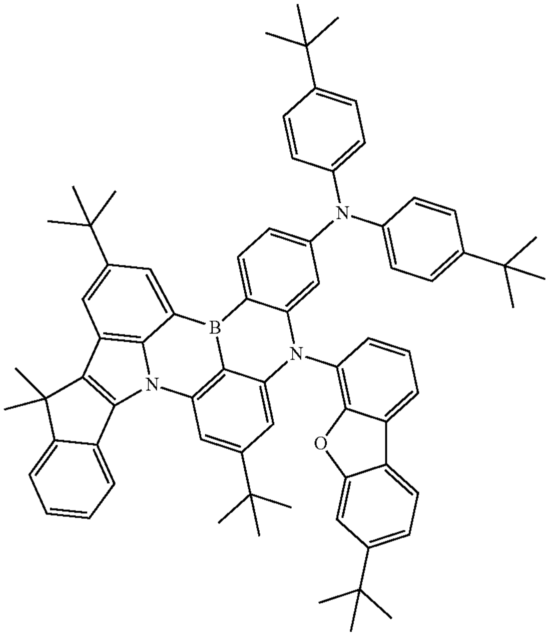
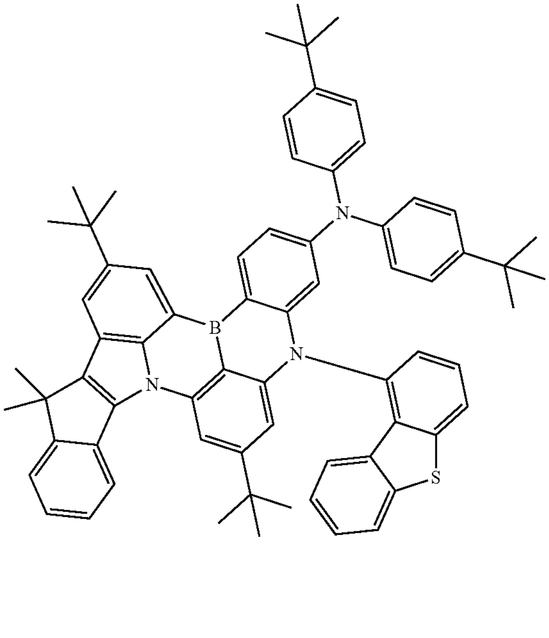
-continued
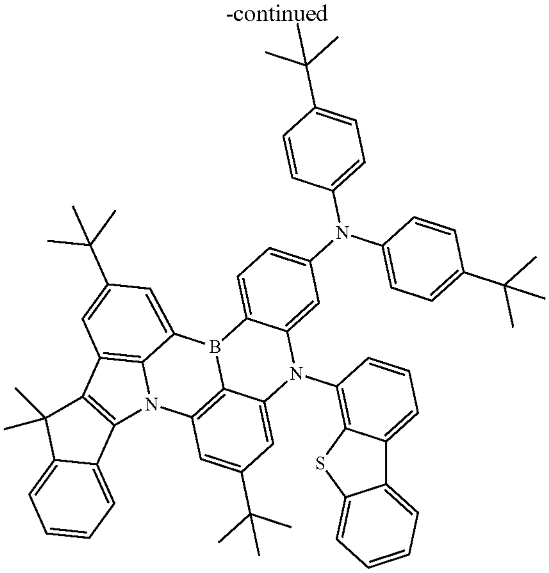
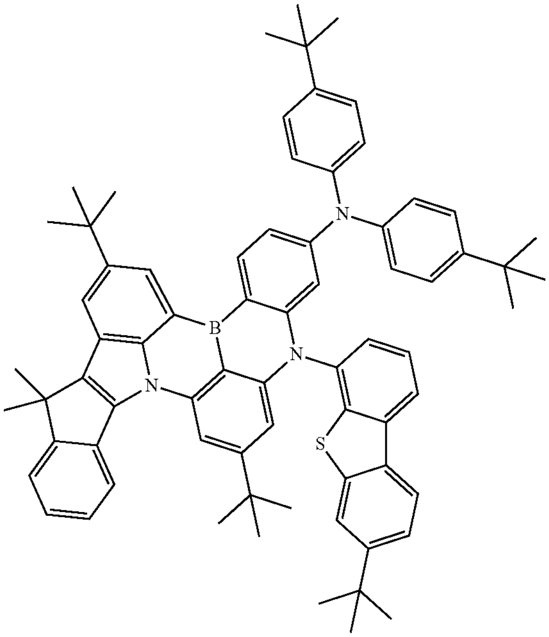
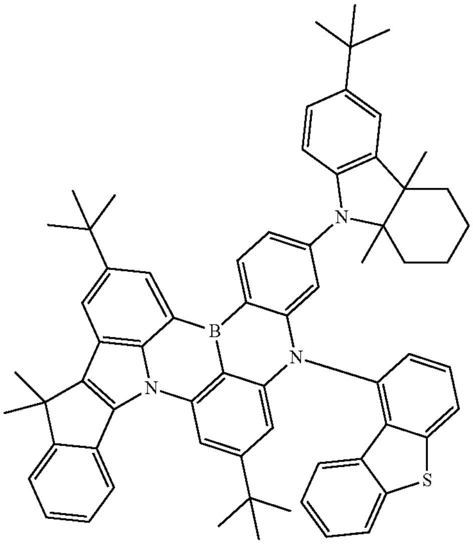

-continued
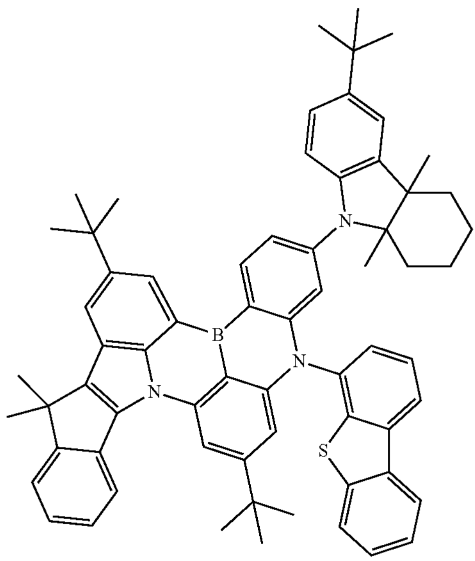
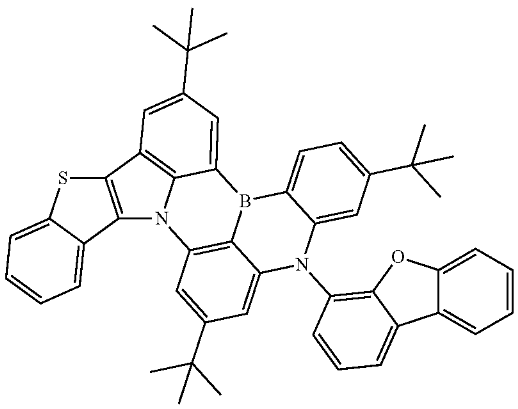
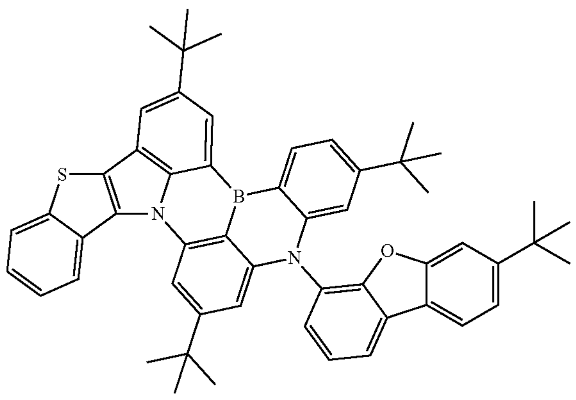
-continued
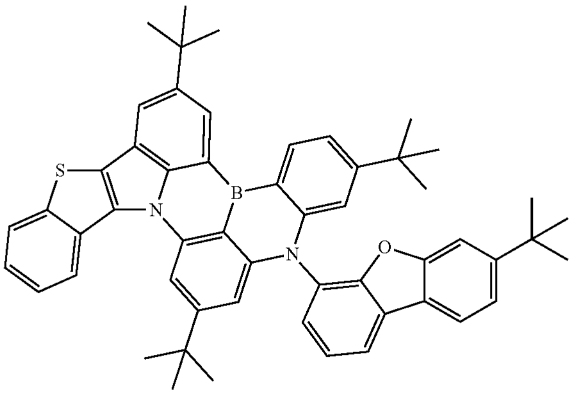
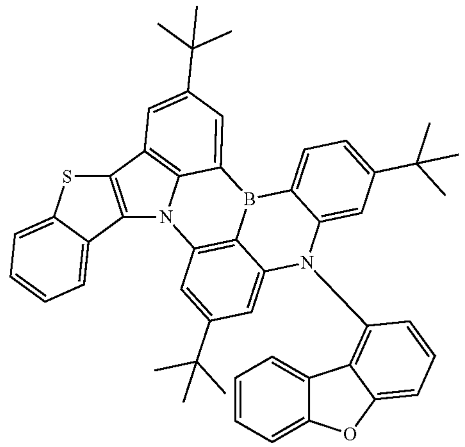
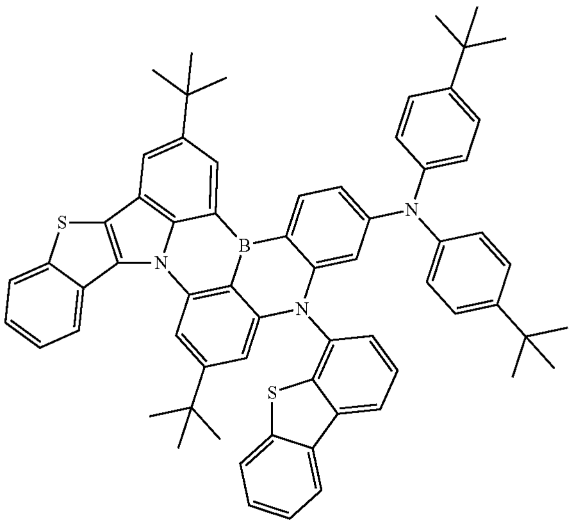

-continued
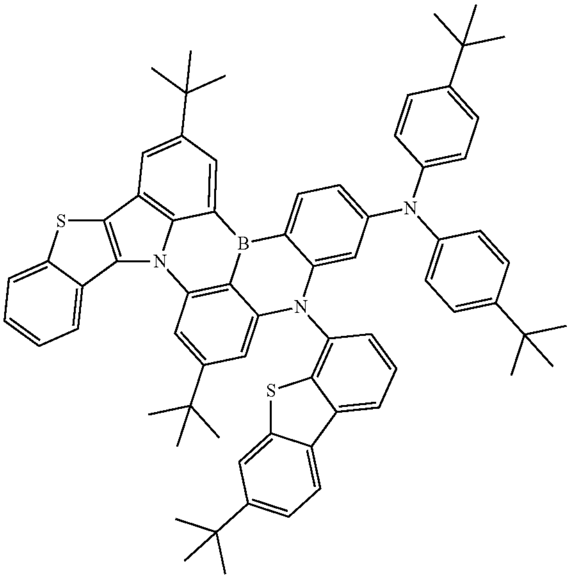
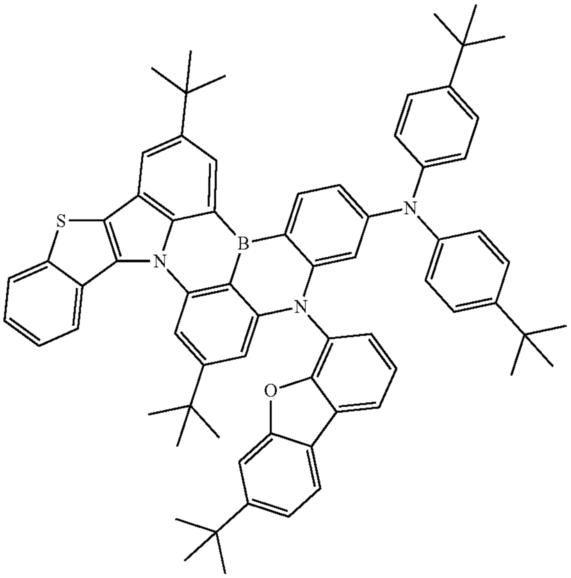
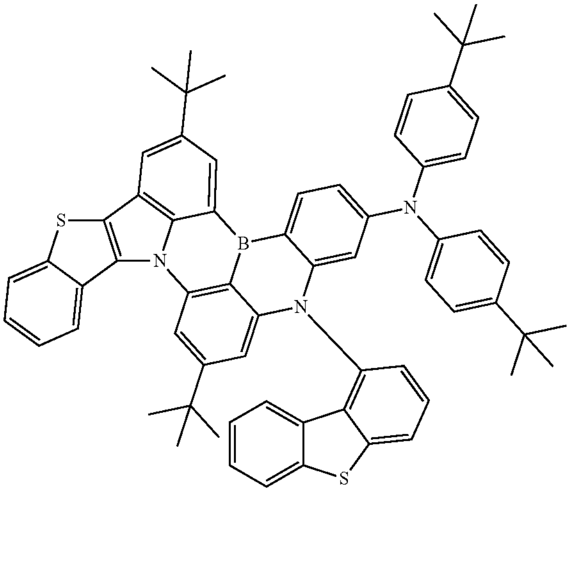
-continued
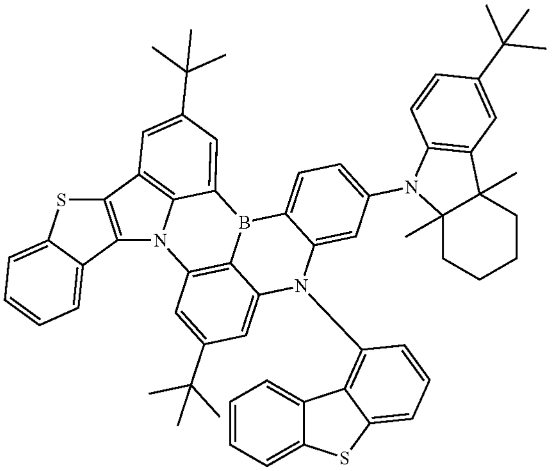
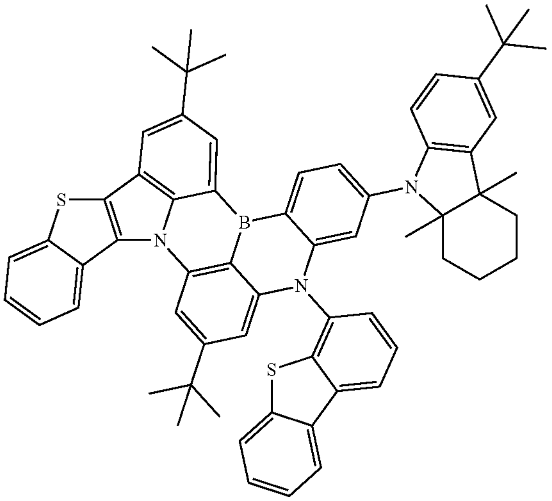
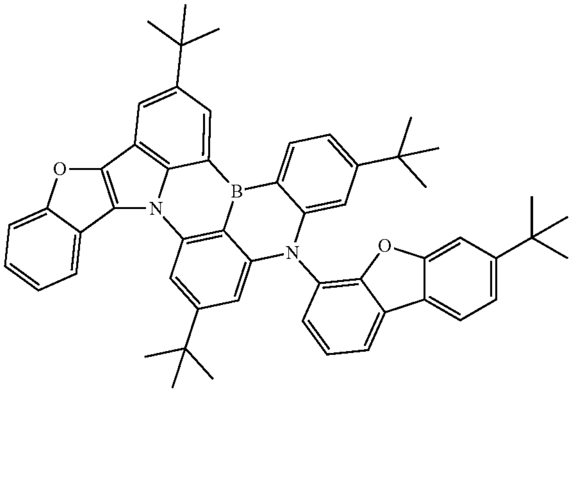

-continued
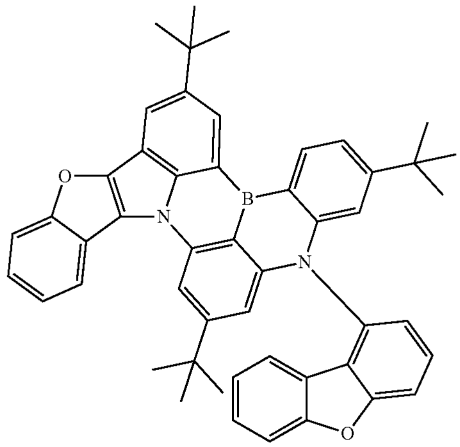
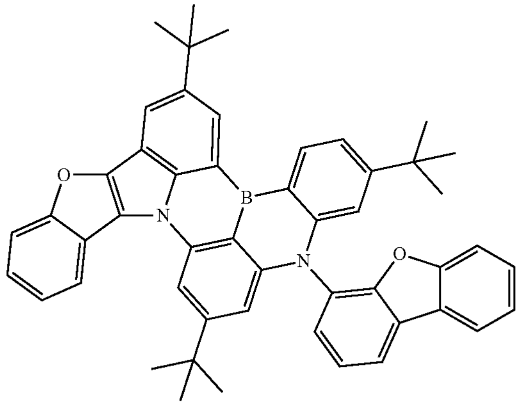
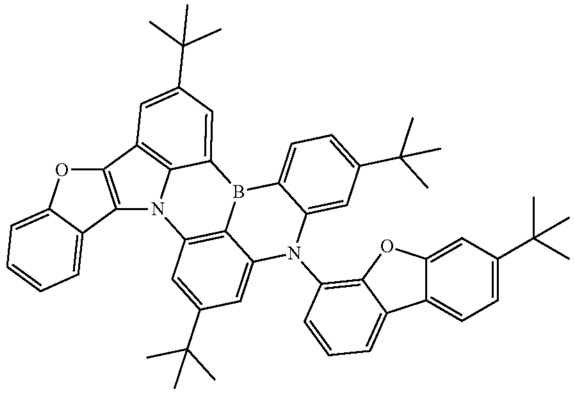
-continued
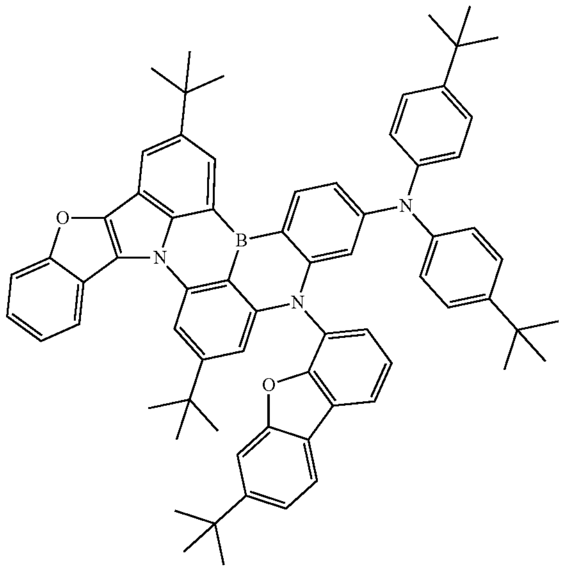
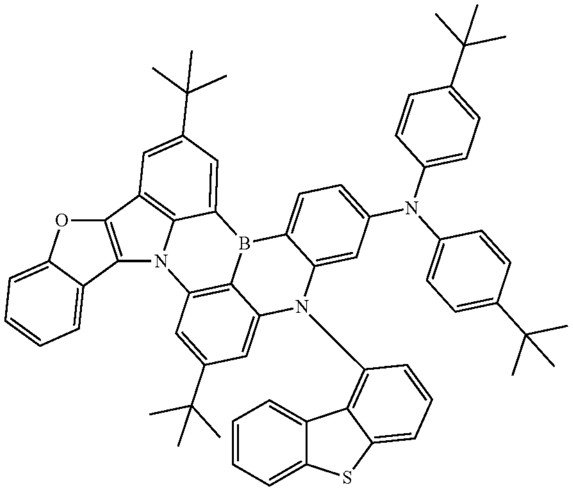
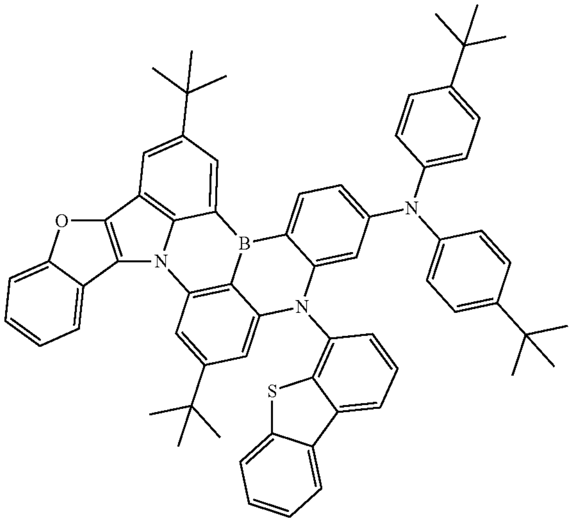

-continued
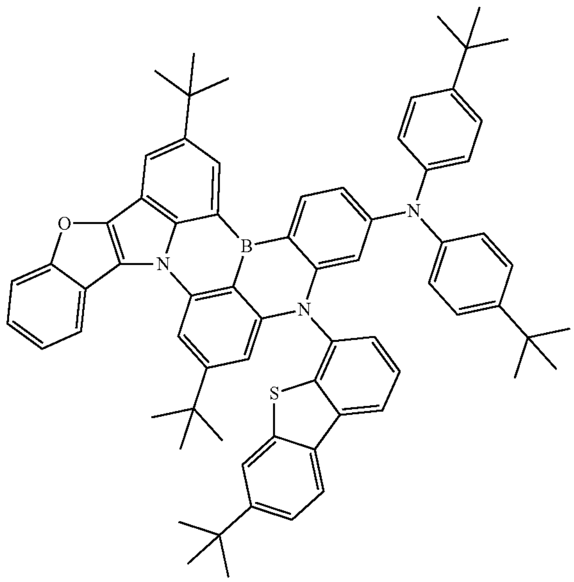
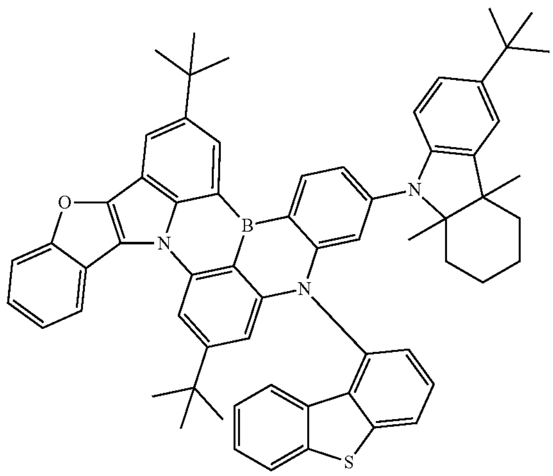
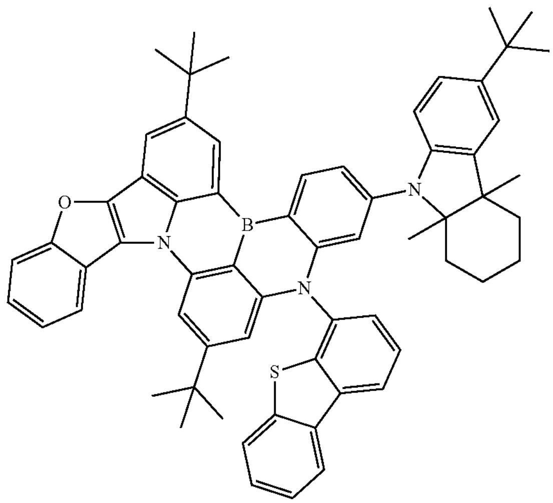
-continued
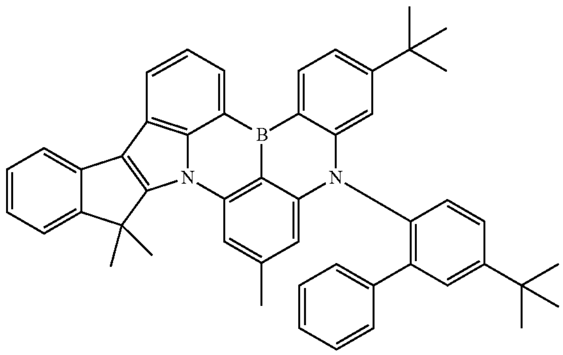
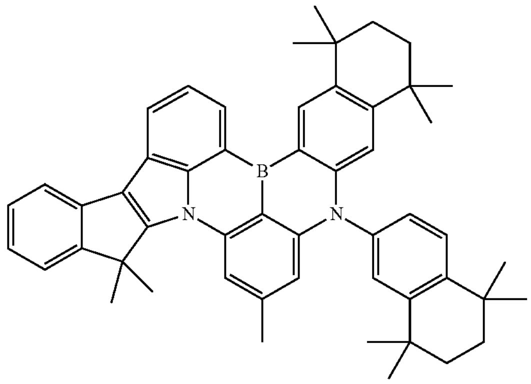
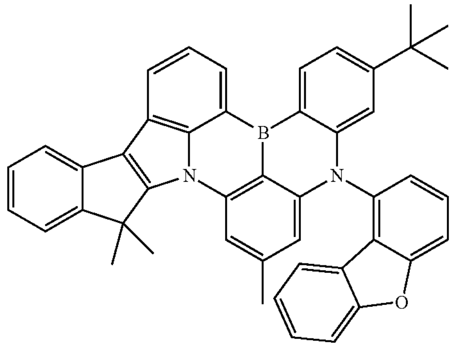
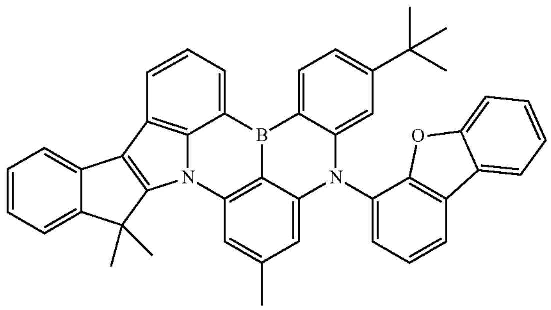

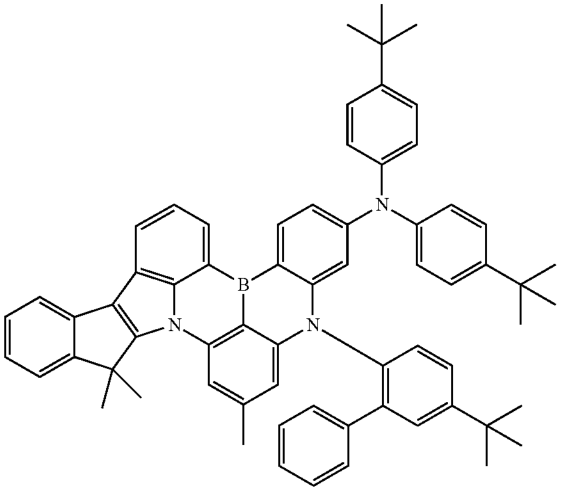
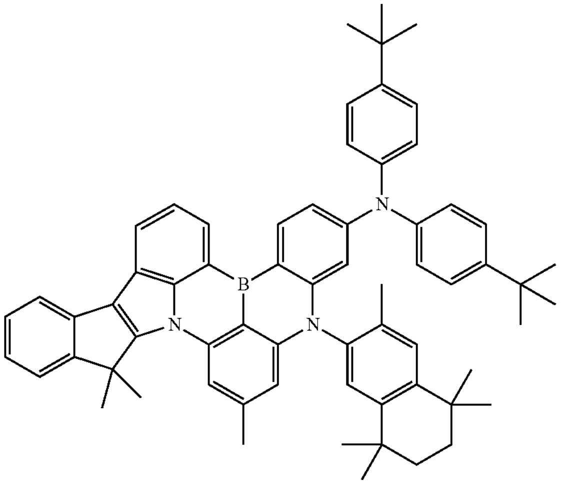
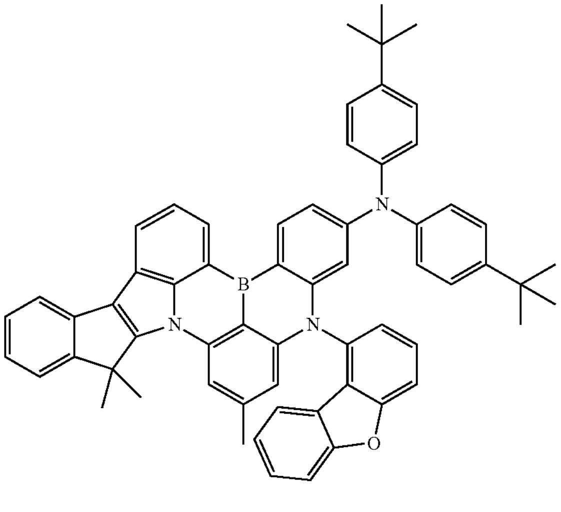
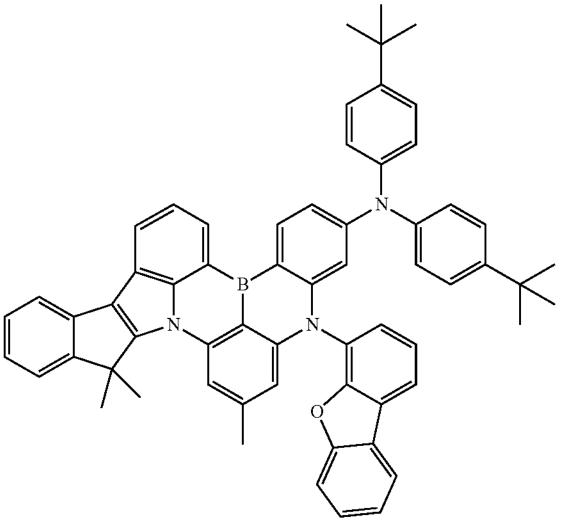
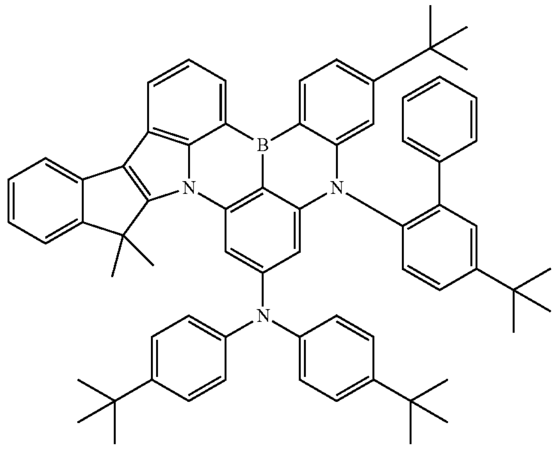
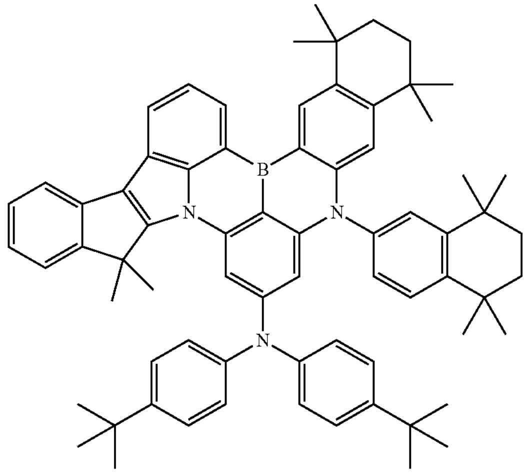

-continued
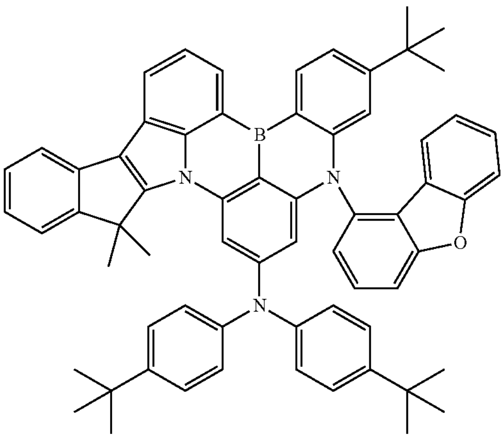
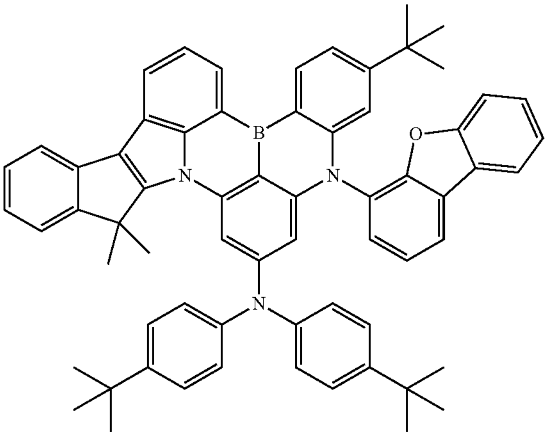
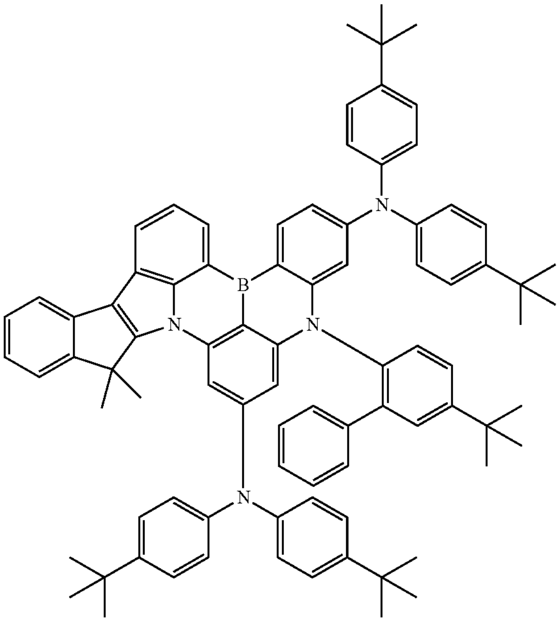
-continued
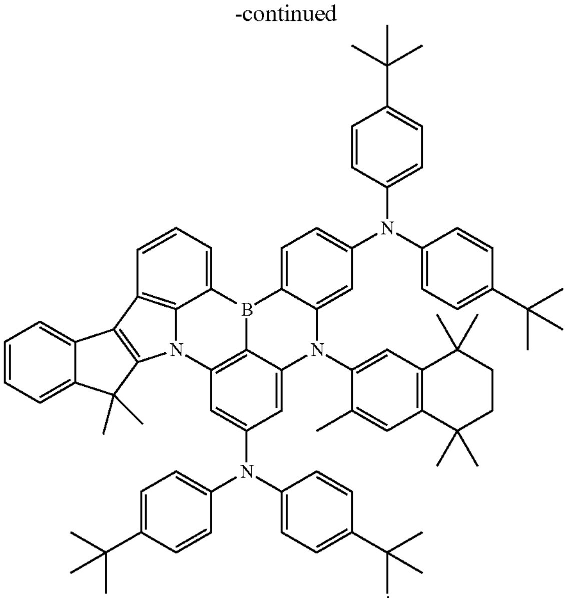
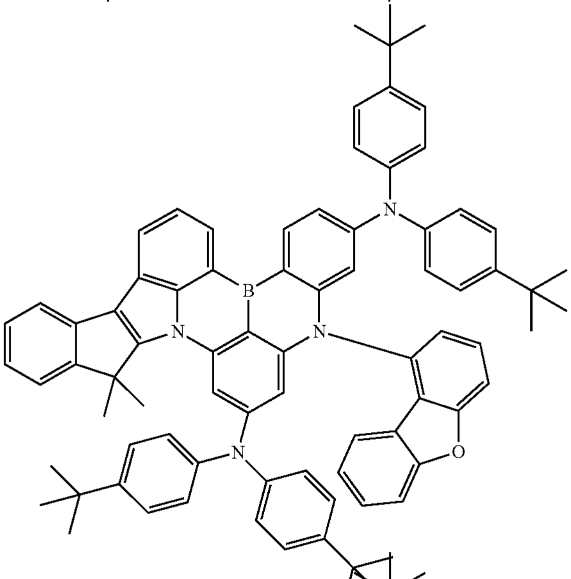
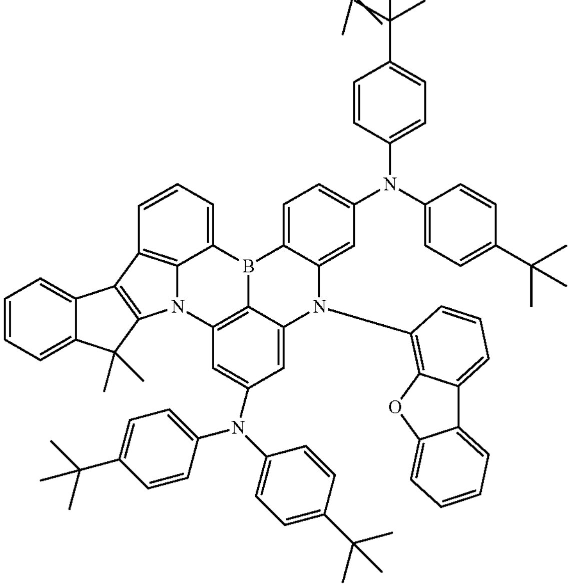

-continued
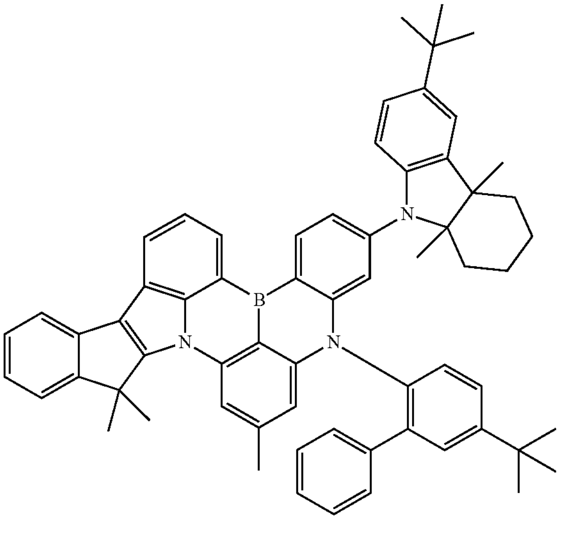
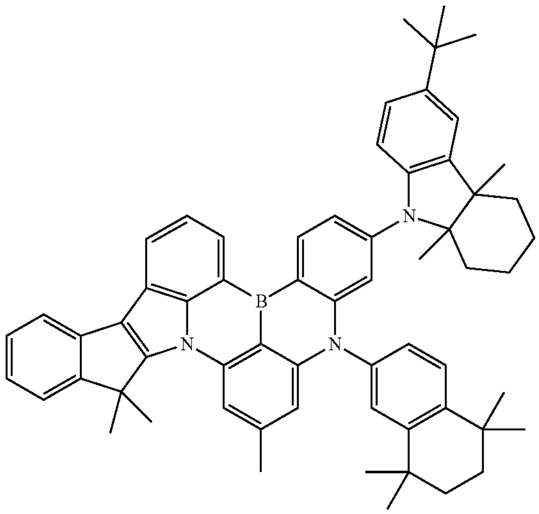
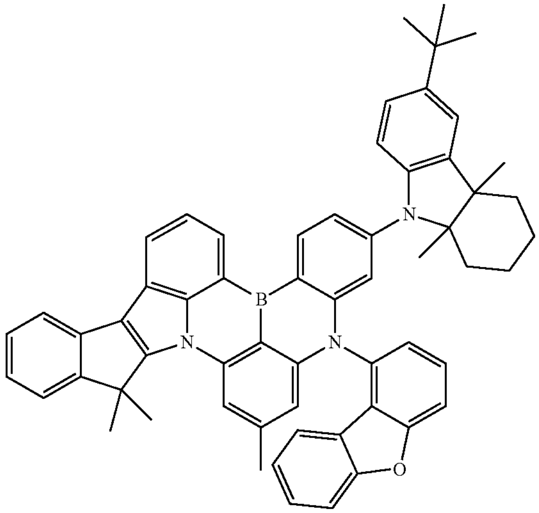
-continued
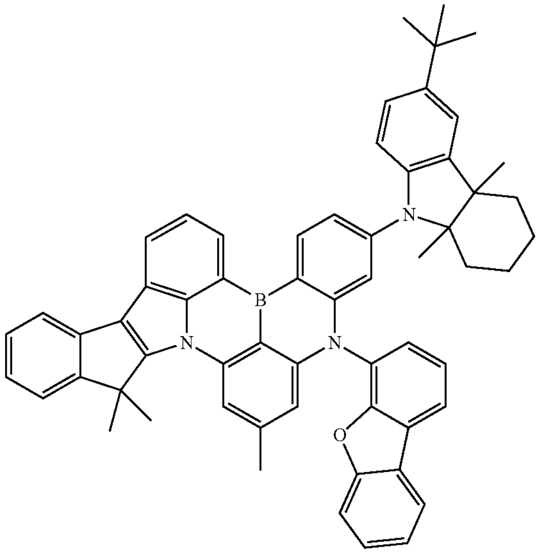
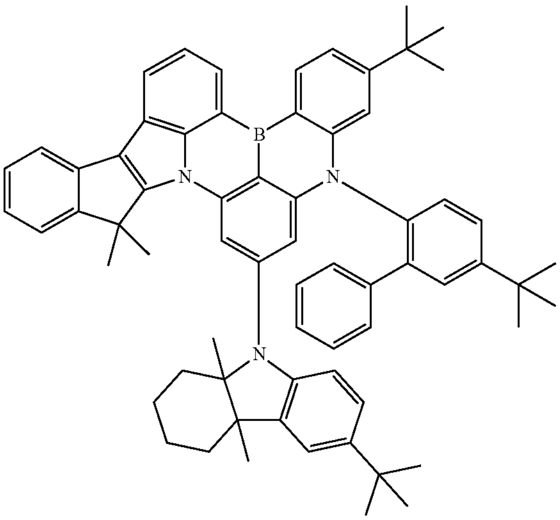
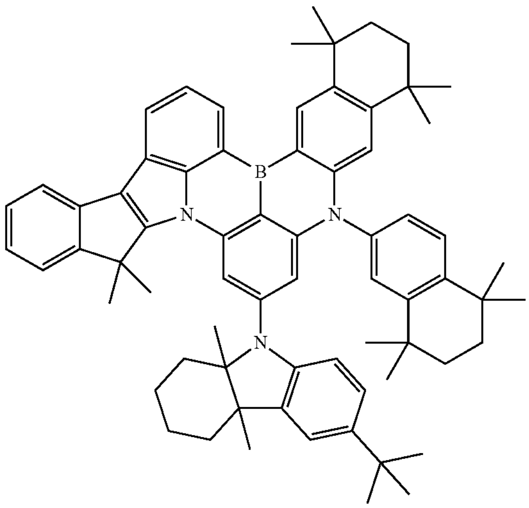

-continued
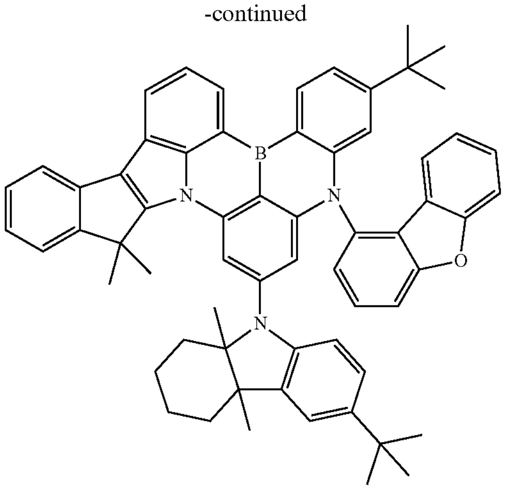
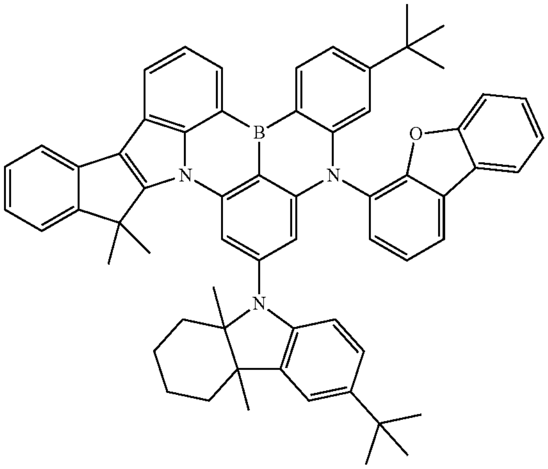
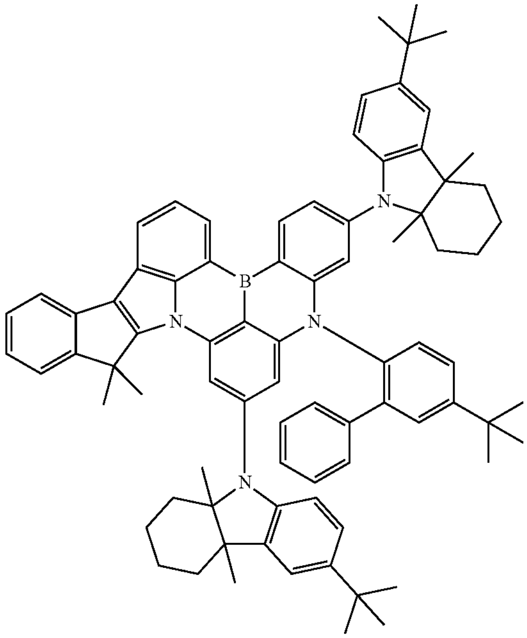
-continued
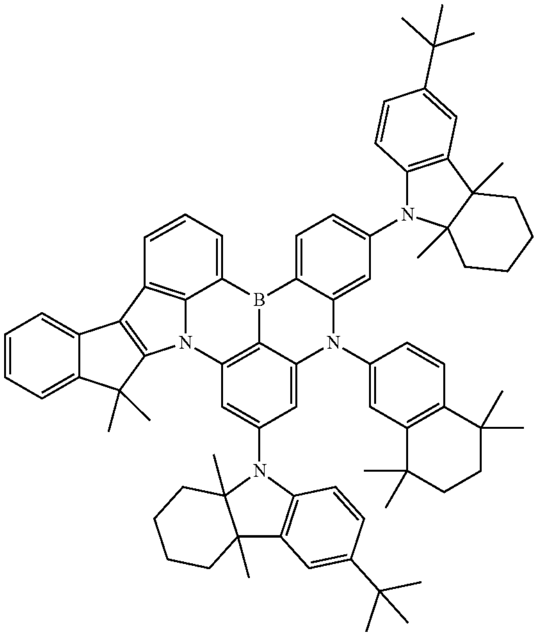
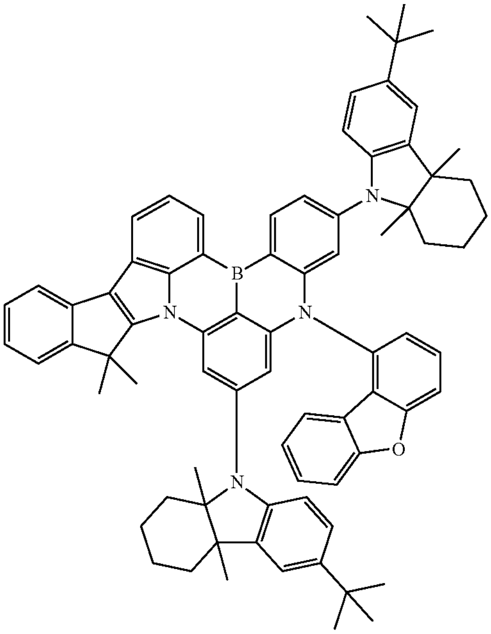

-continued
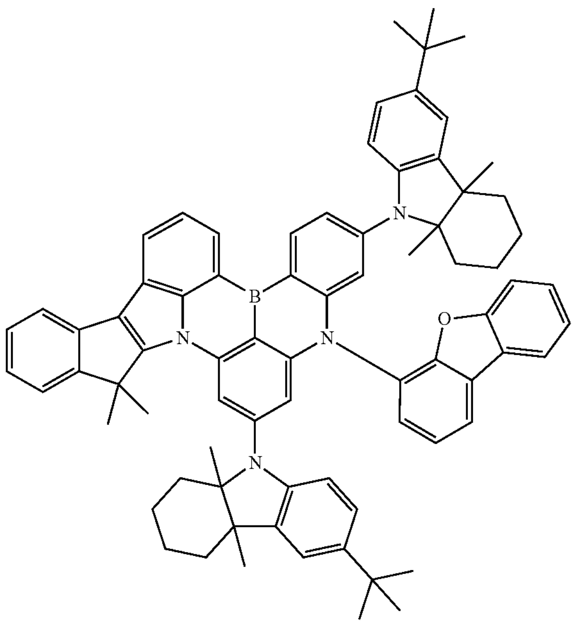
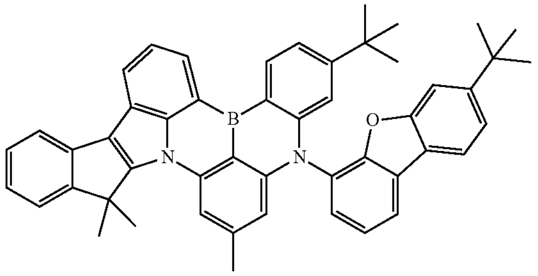
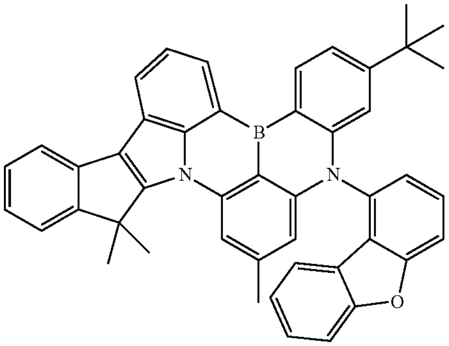
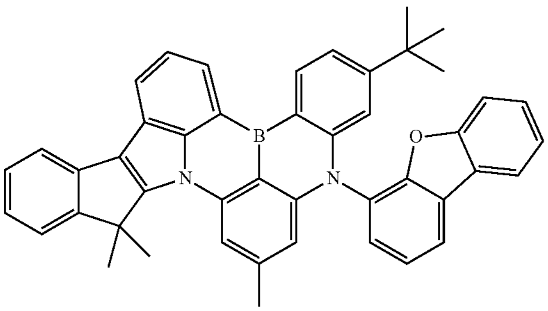
-continued
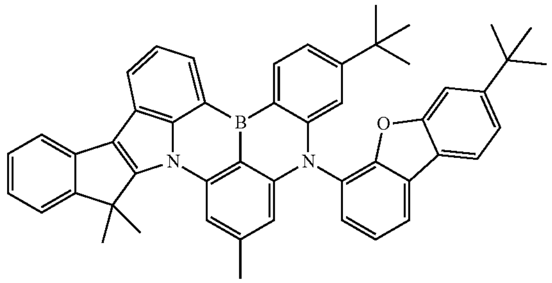
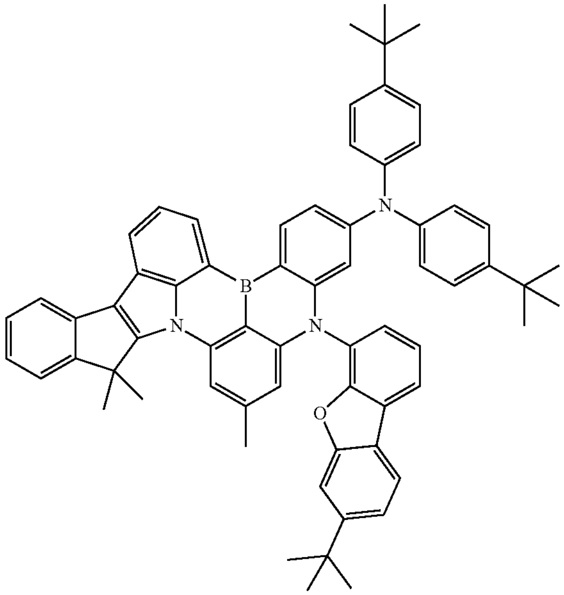
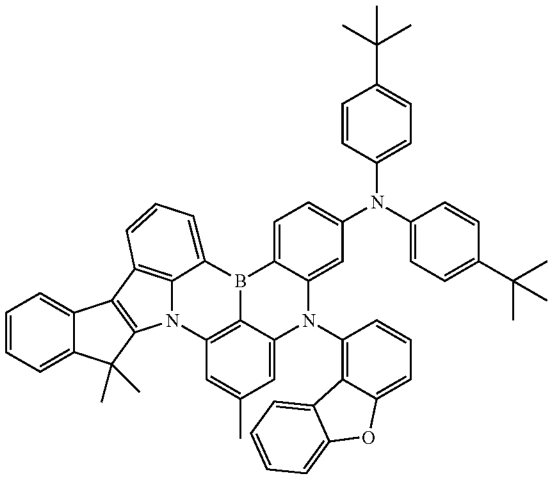

-continued
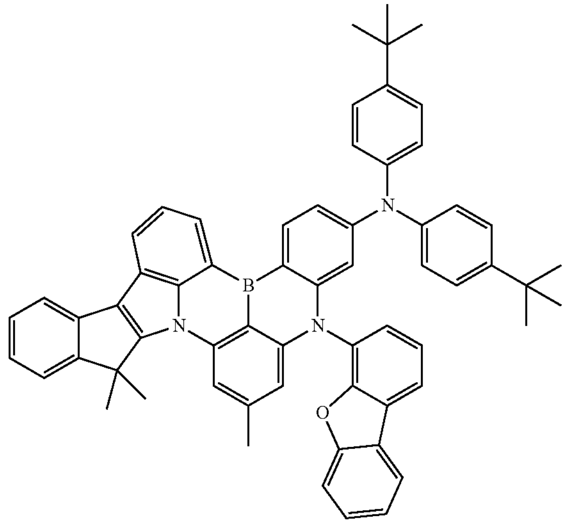
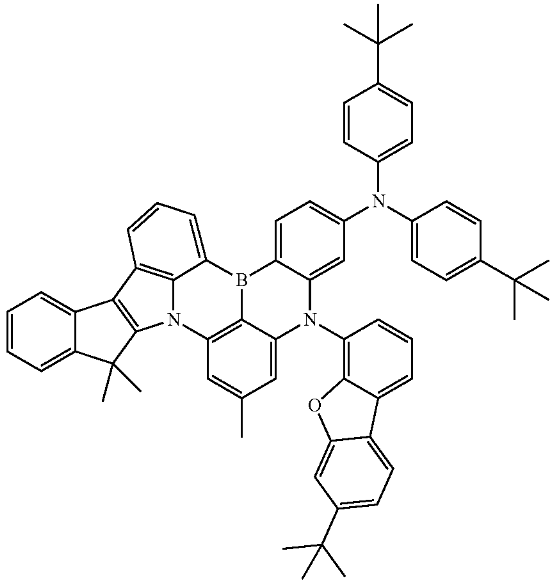
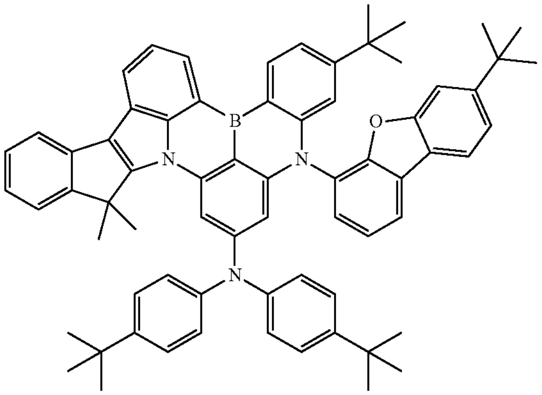
-continued
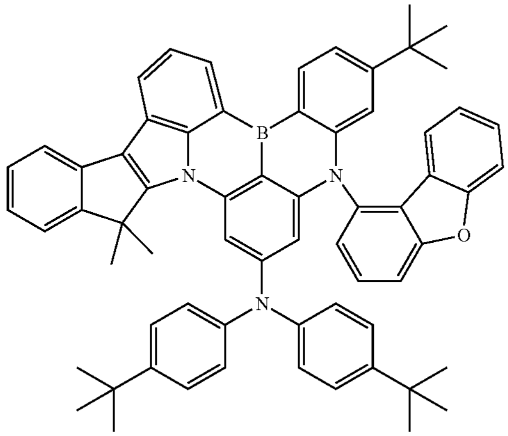
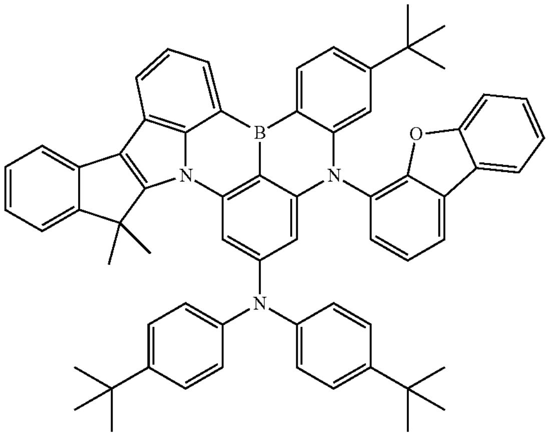
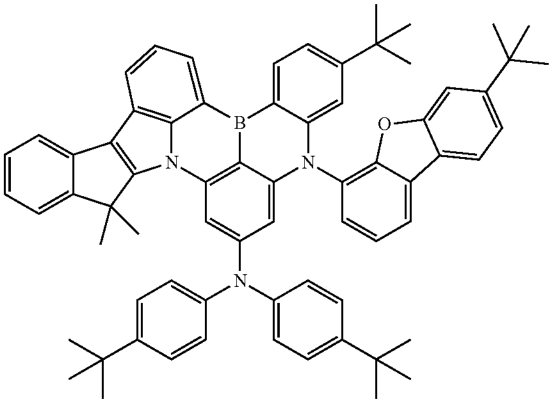

-continued
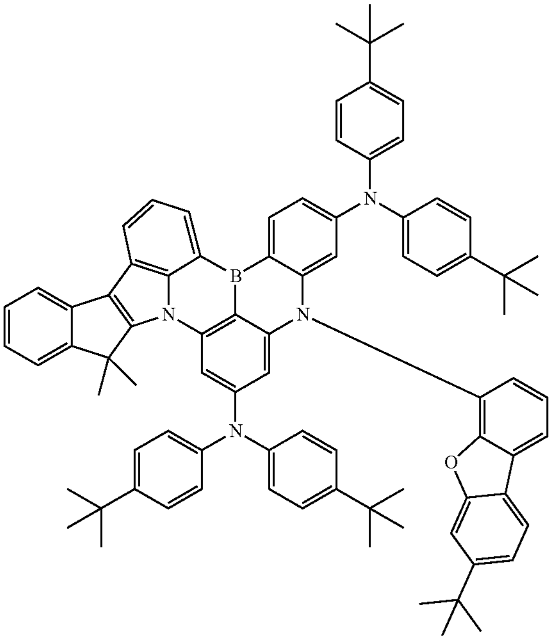
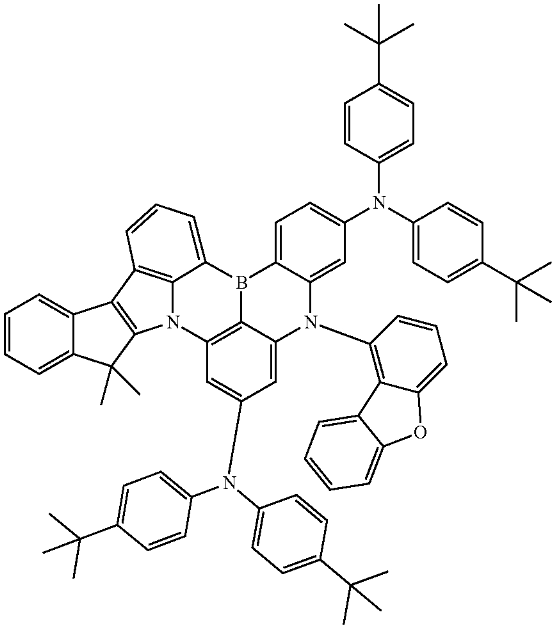
-continued
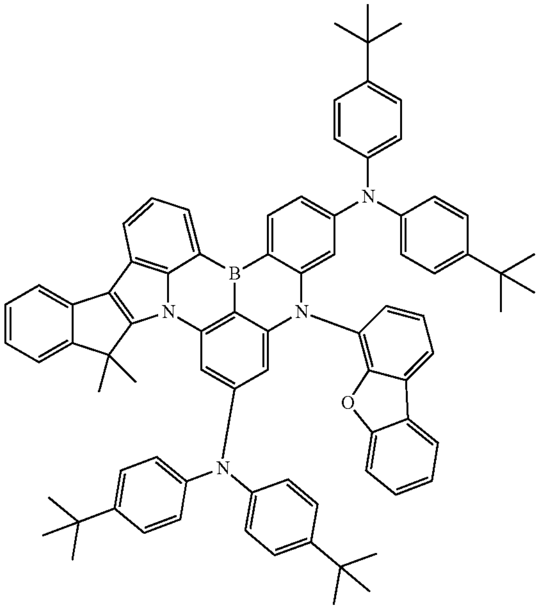
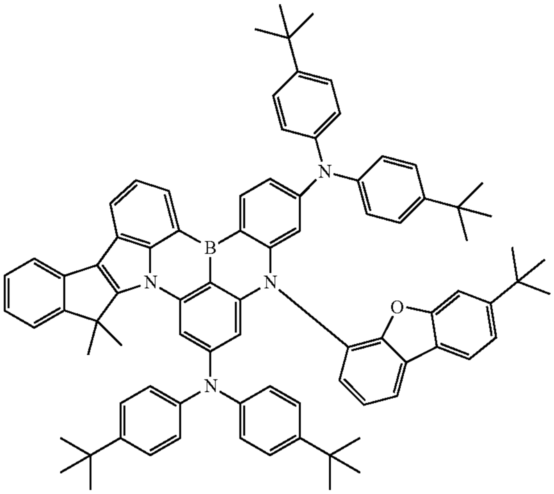
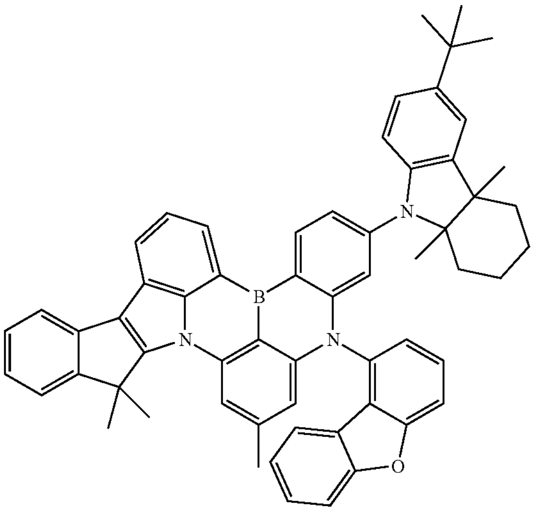

-continued
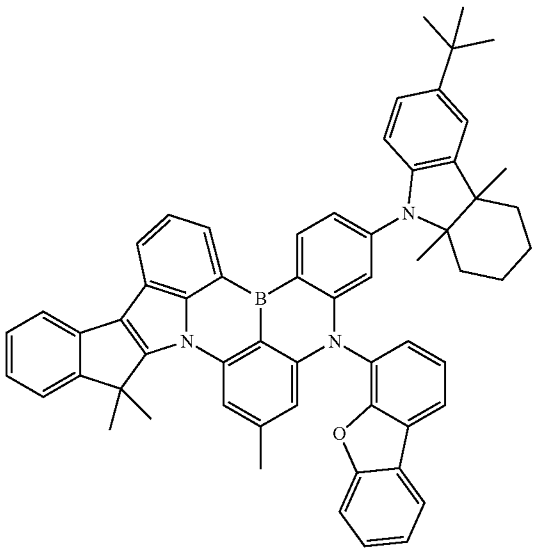
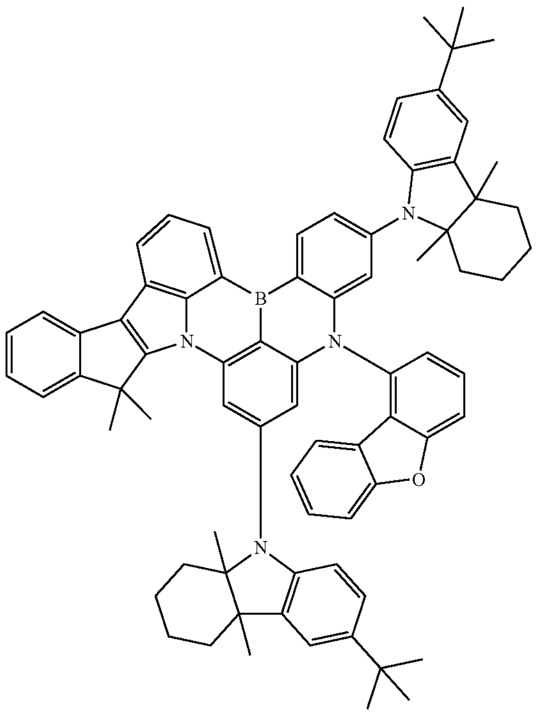
-continued
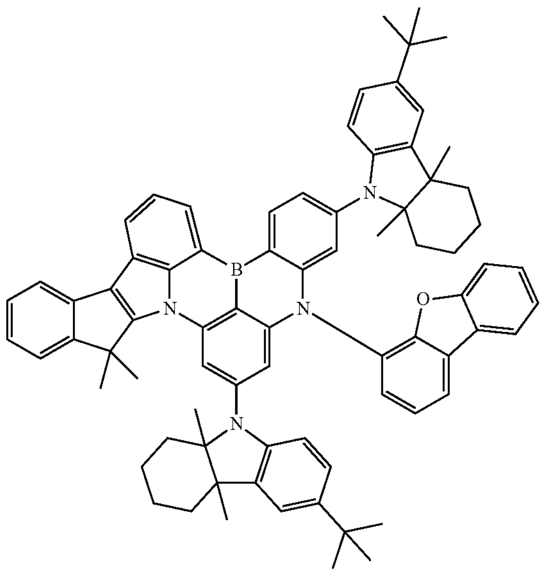
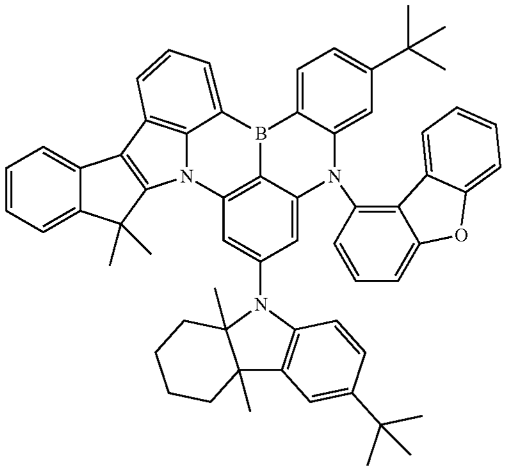
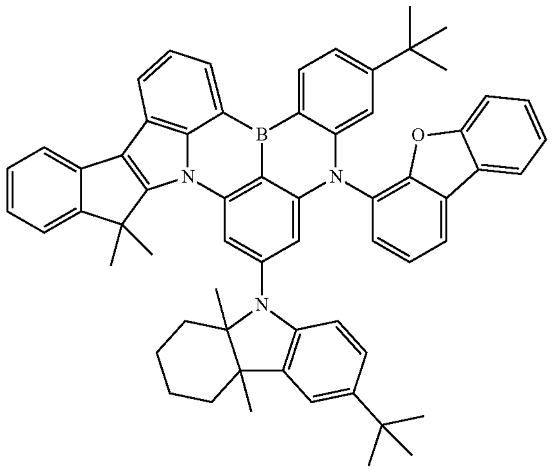

-continued
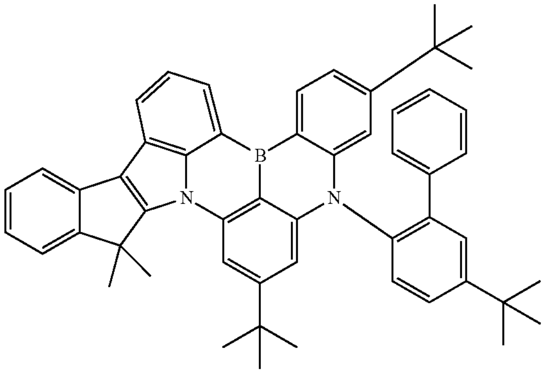
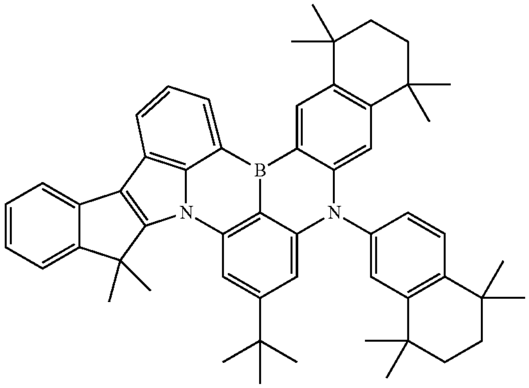
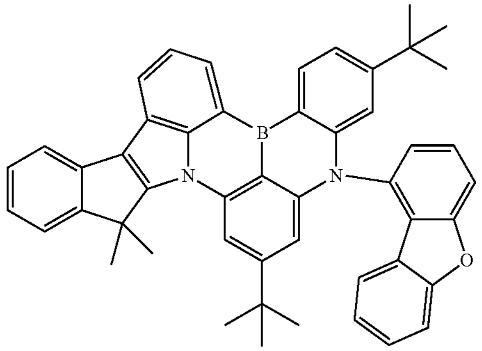
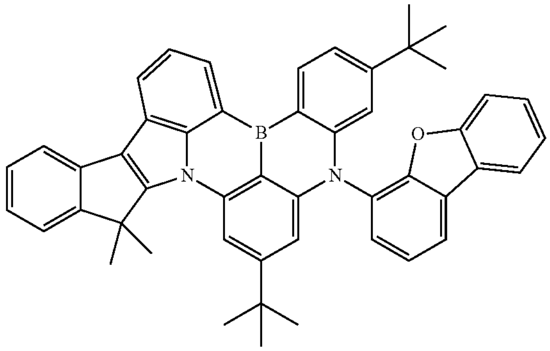
-continued
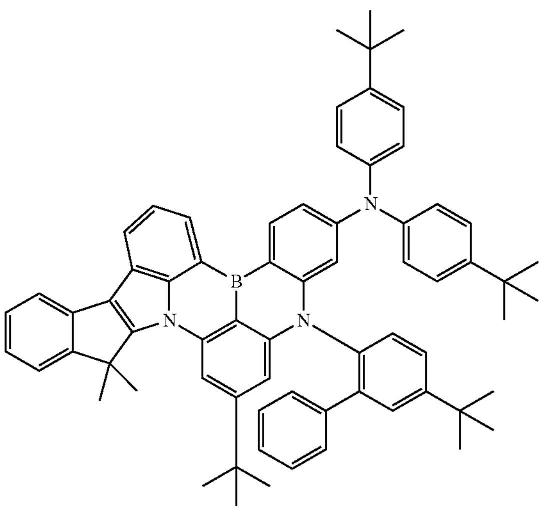
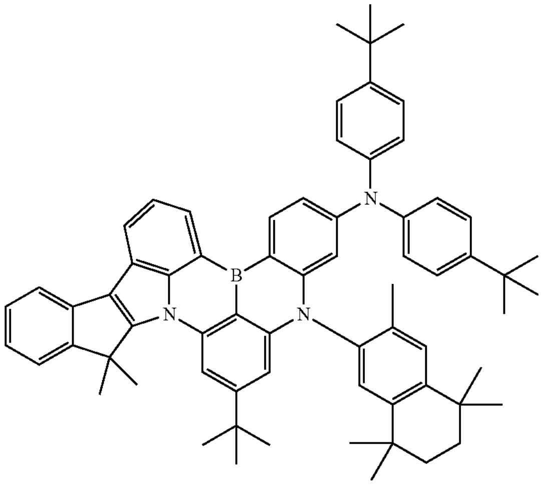
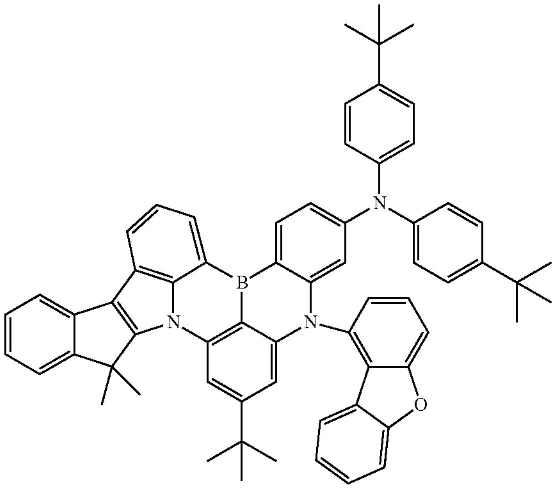

-continued
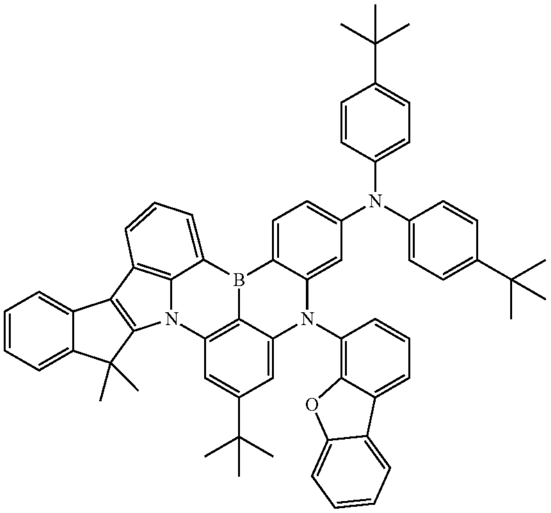
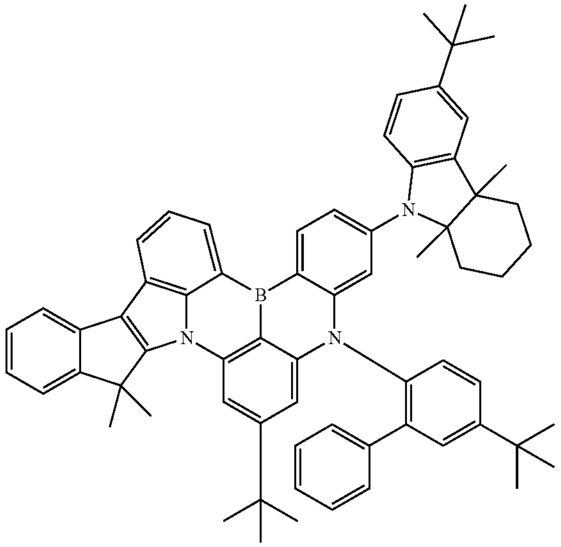
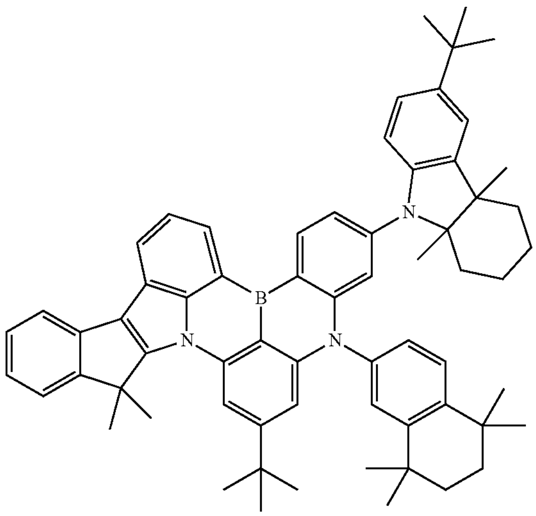
-continued
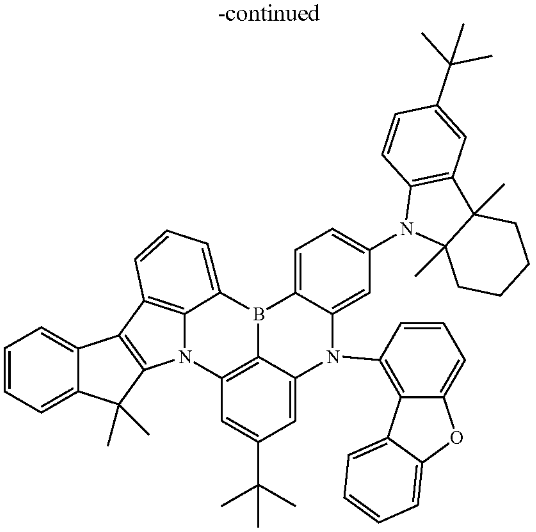
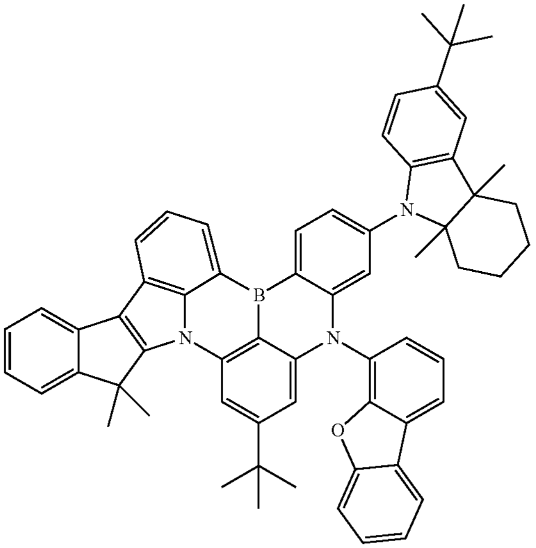
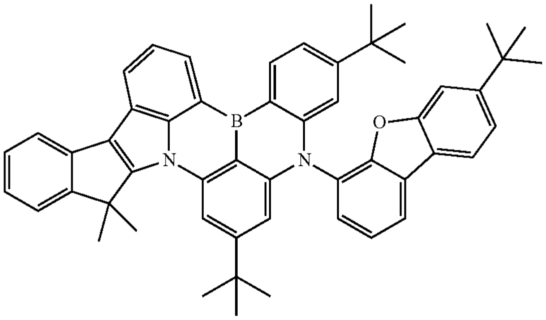
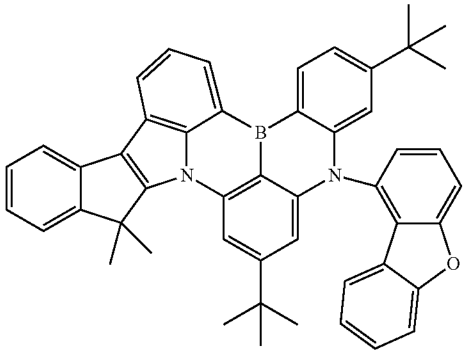

-continued
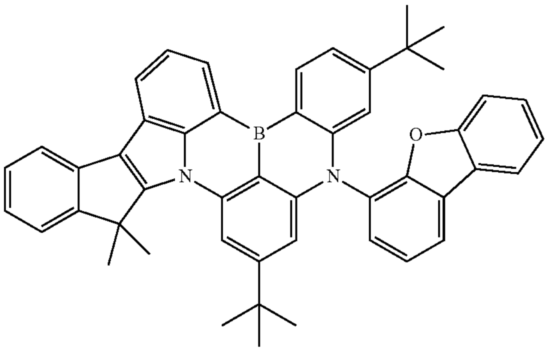
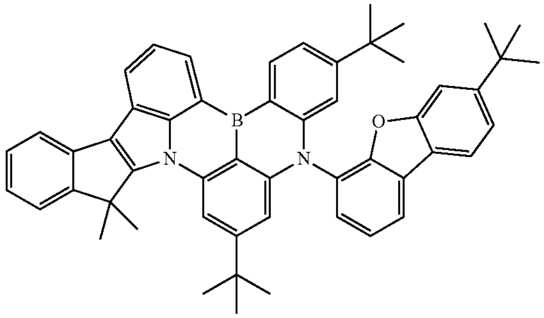
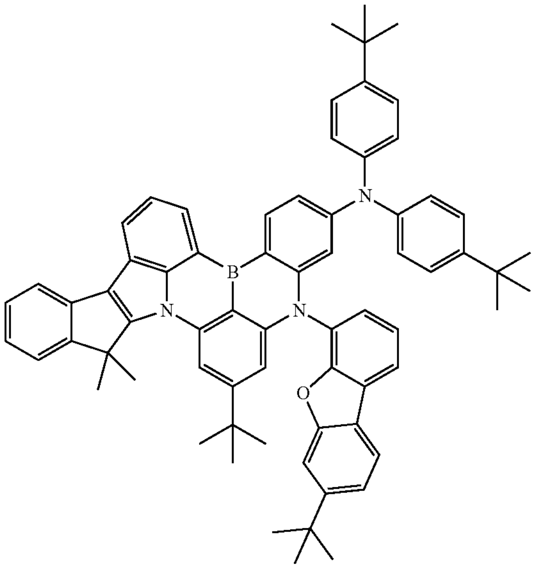
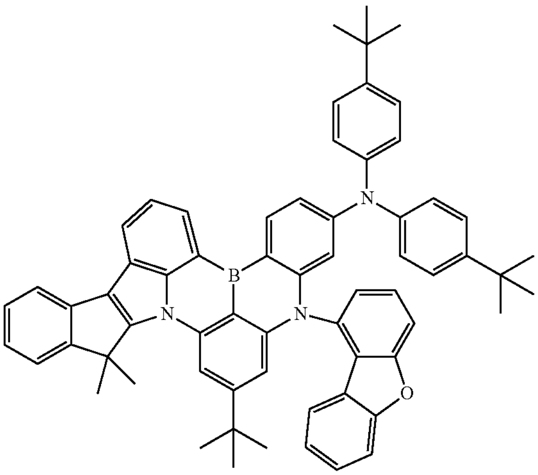
-continued
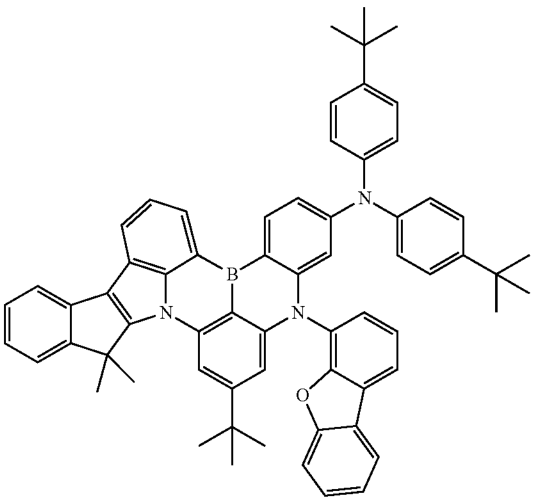
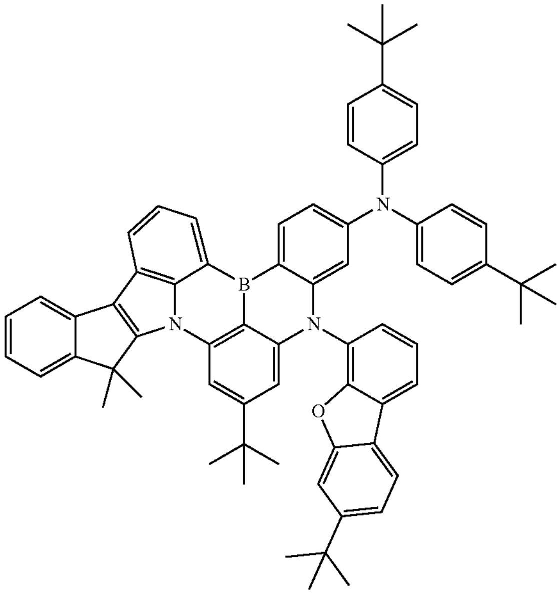
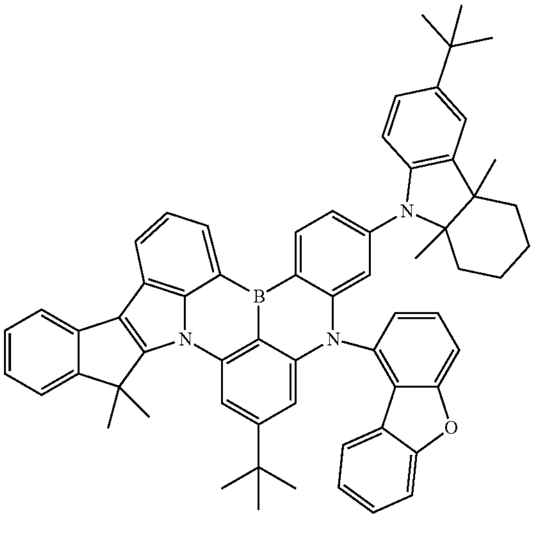

-continued
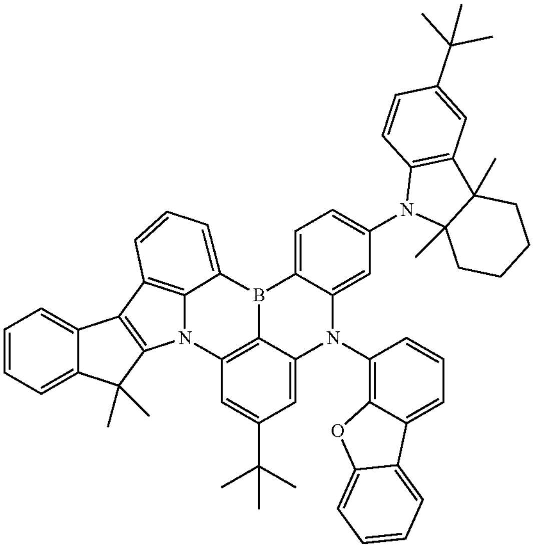
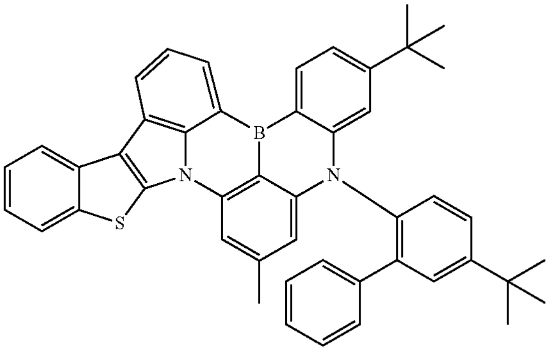
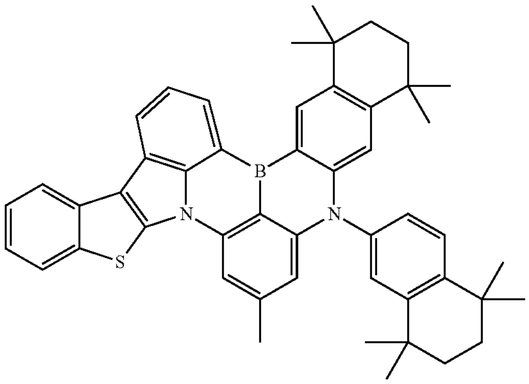
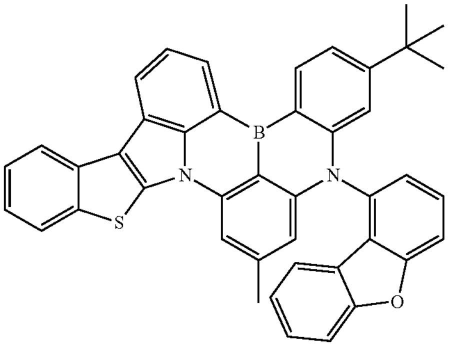
-continued
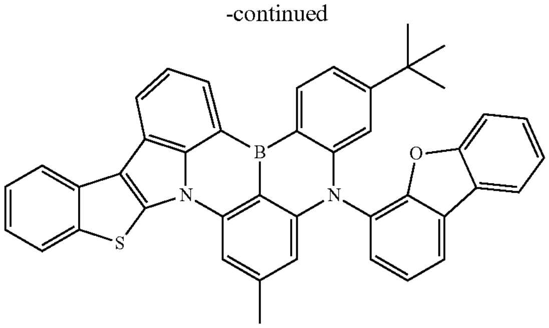
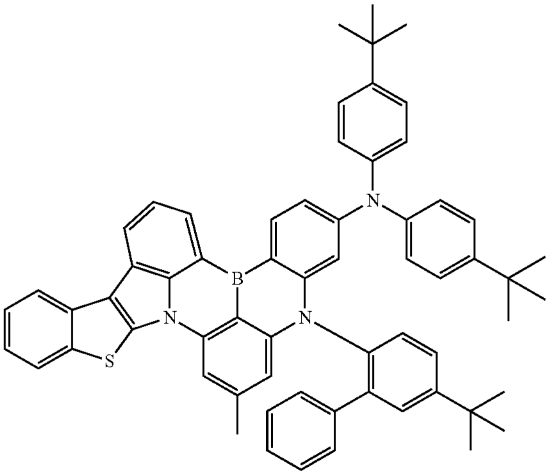
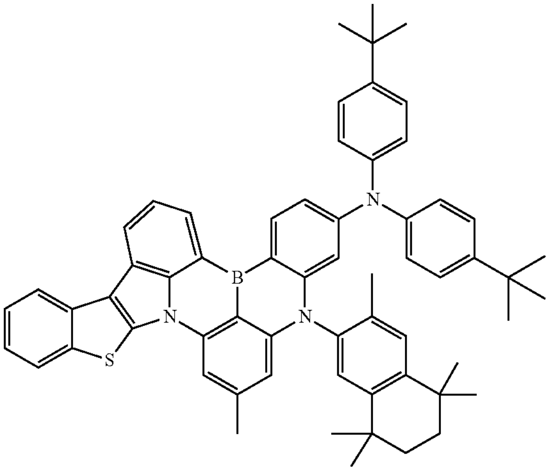
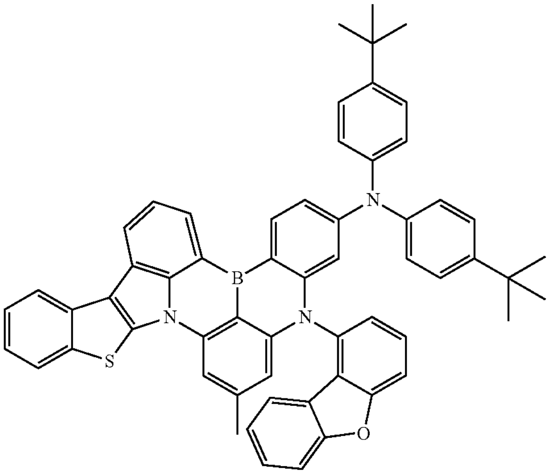

-continued
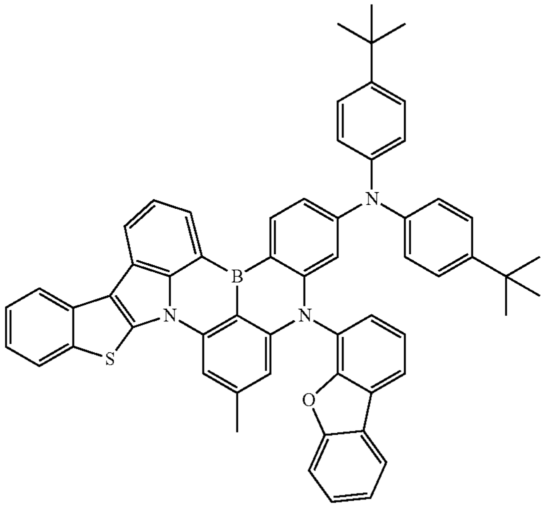
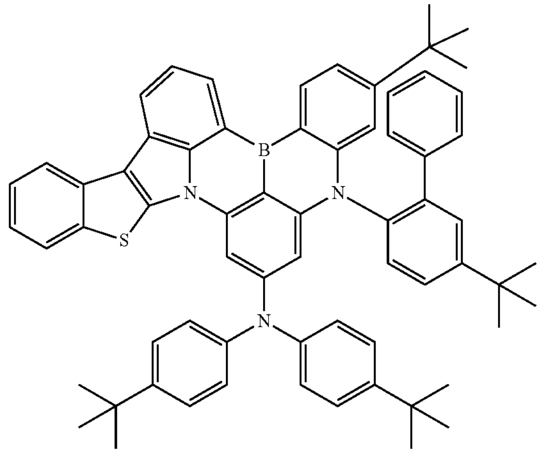
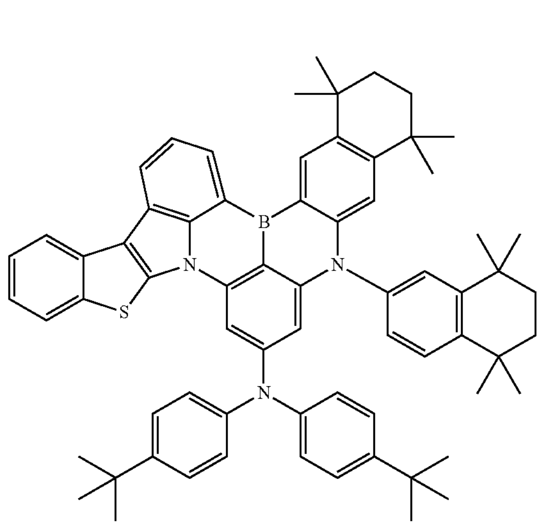
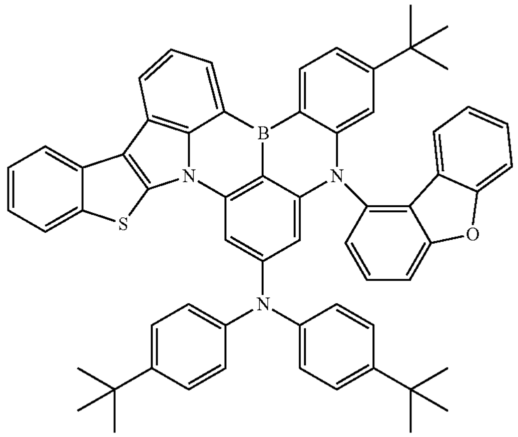
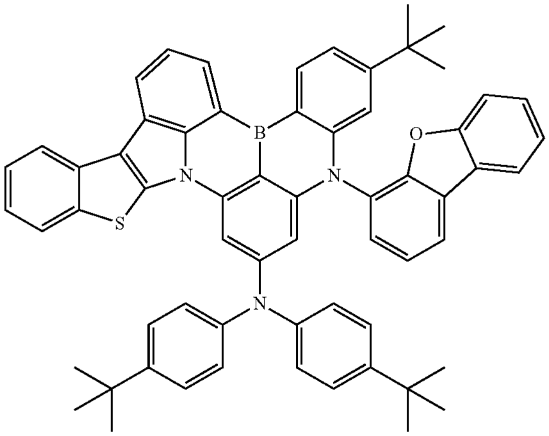
-continued
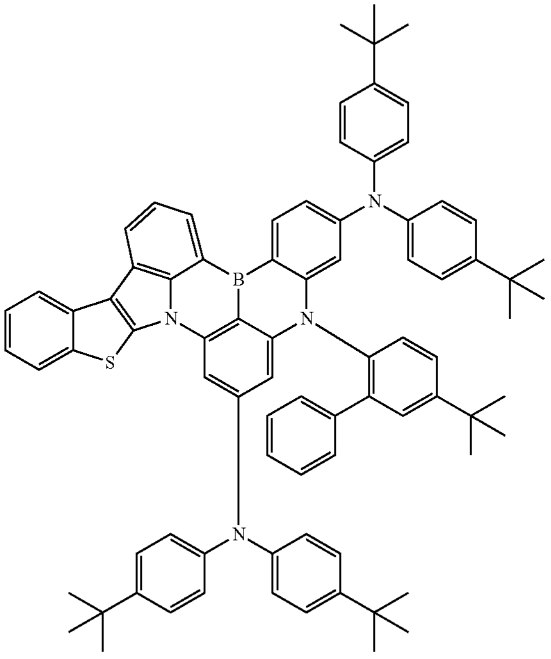

-continued
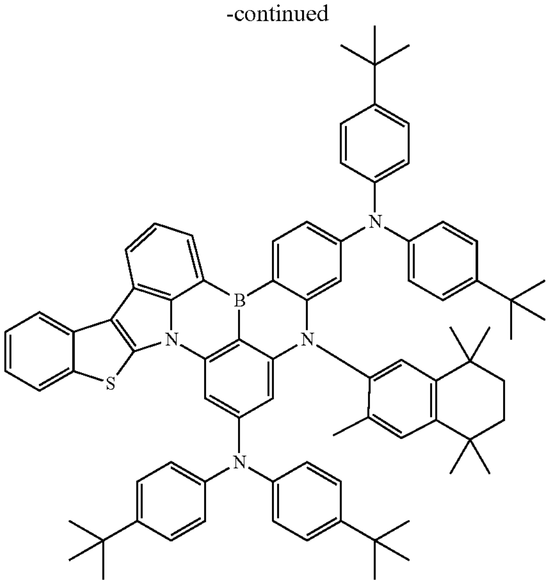
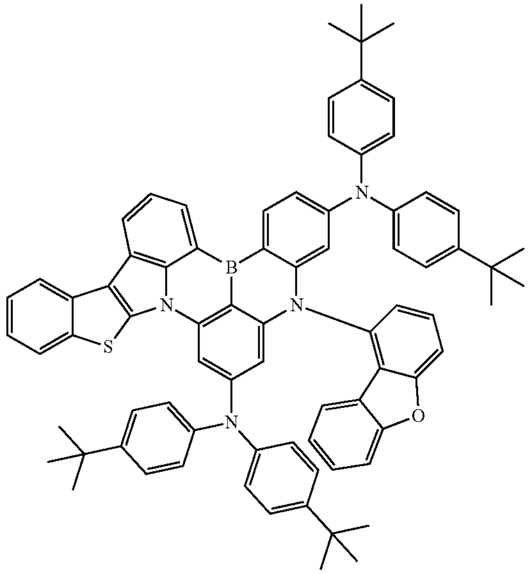
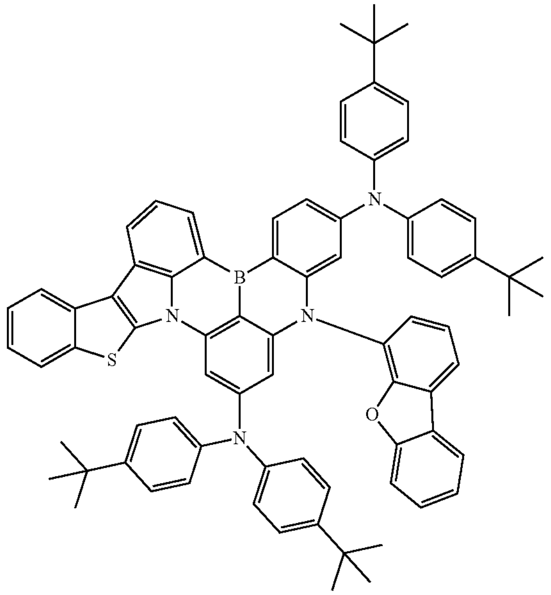
-continued
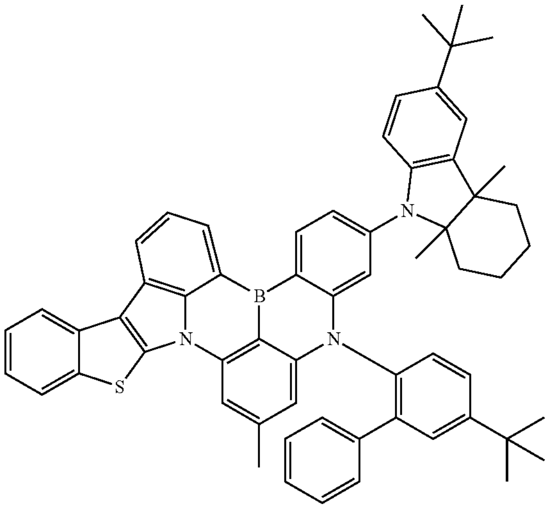
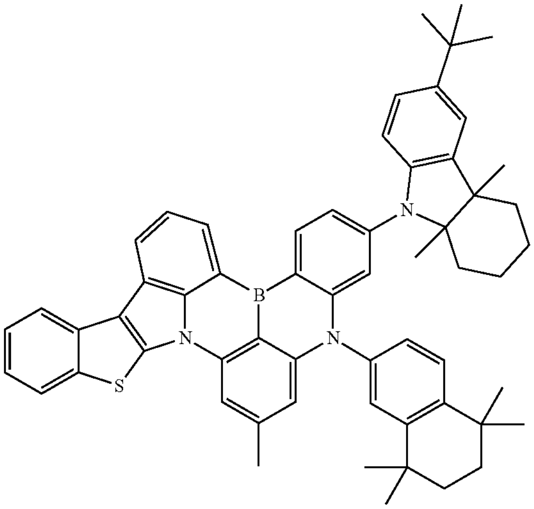
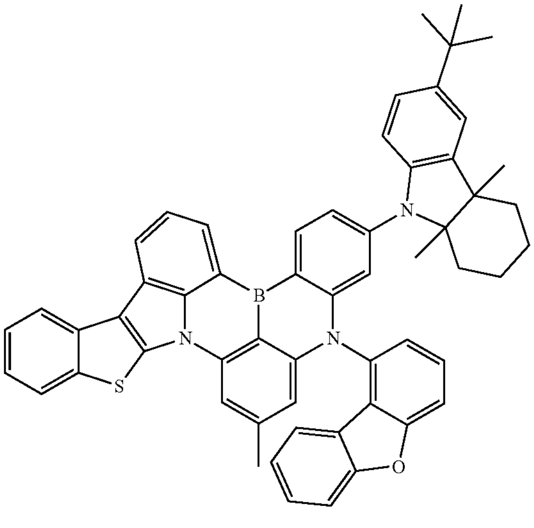

-continued
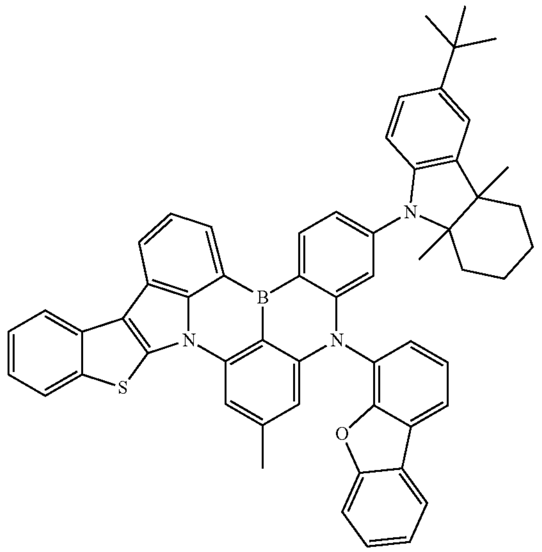
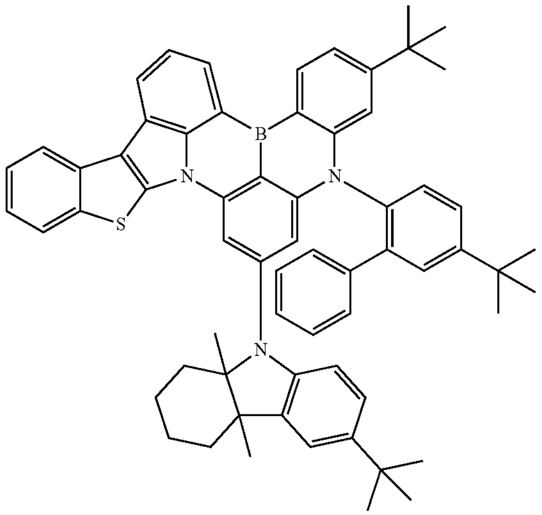
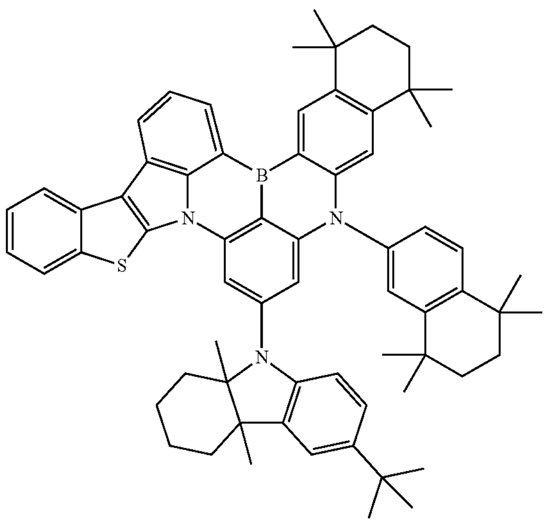
-continued
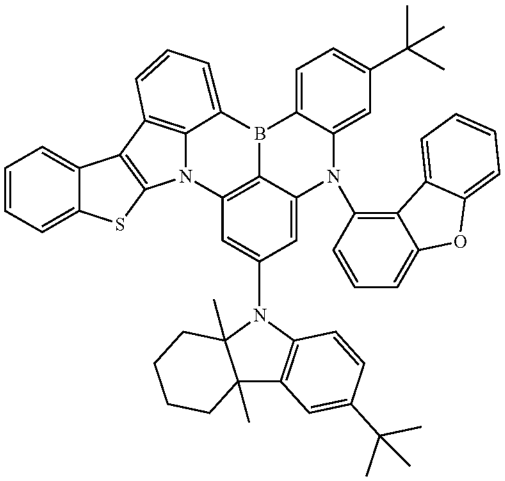
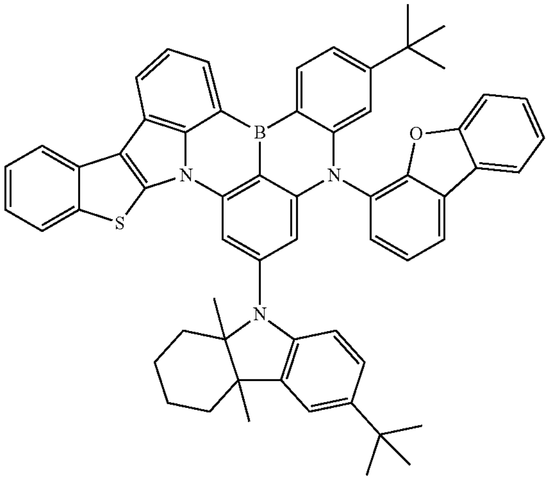
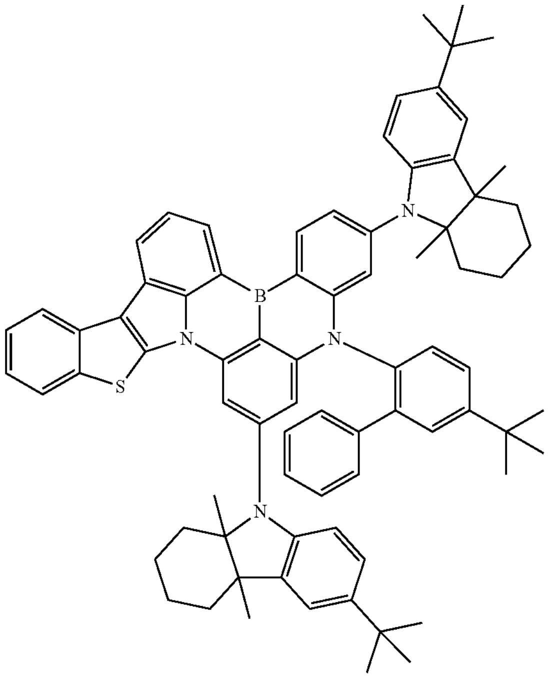

-continued
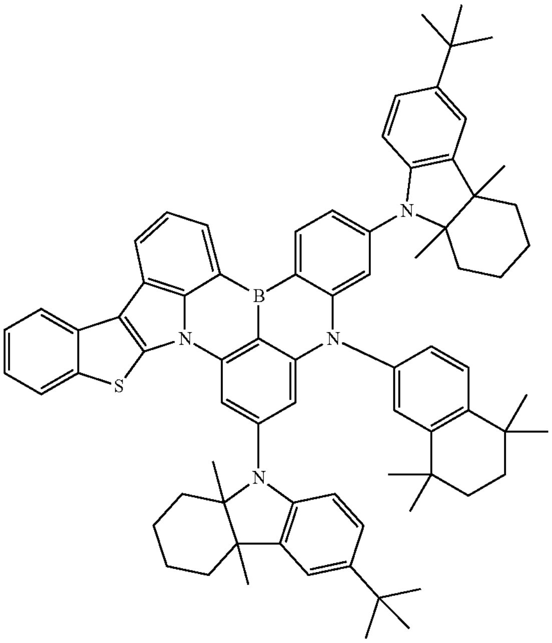
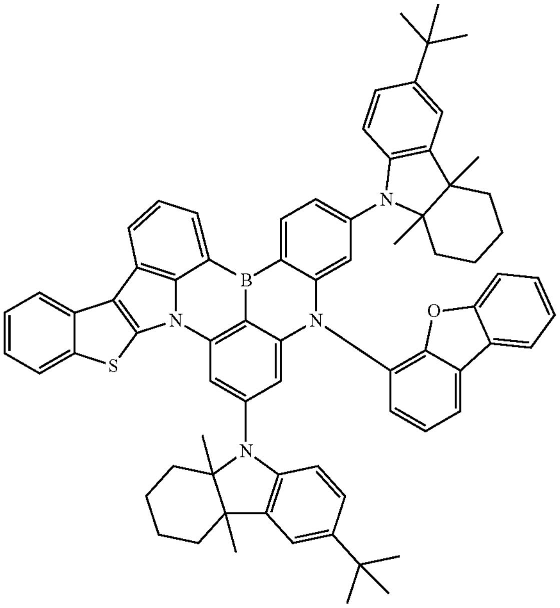
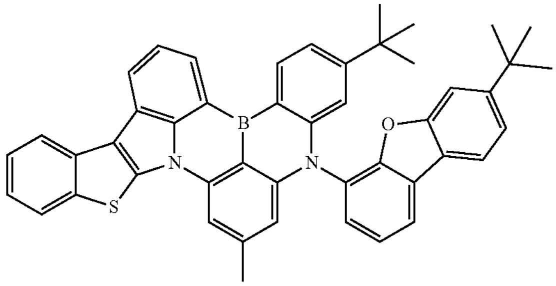
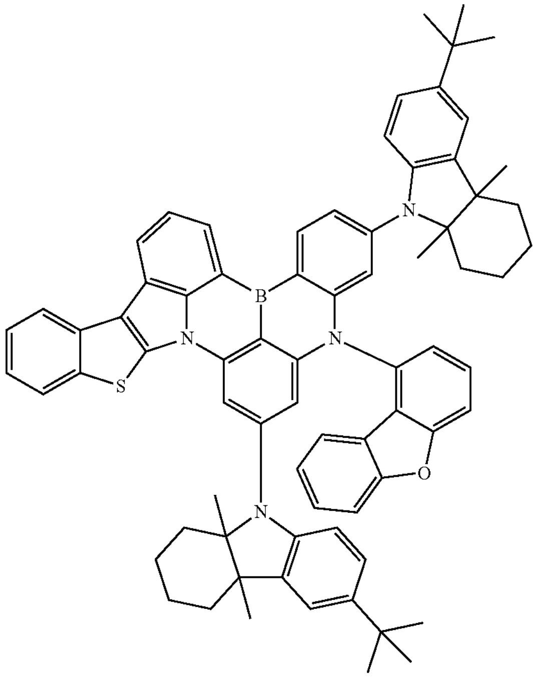
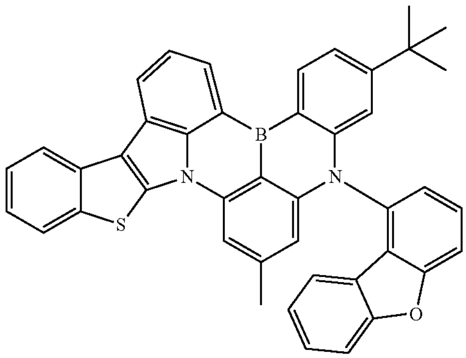
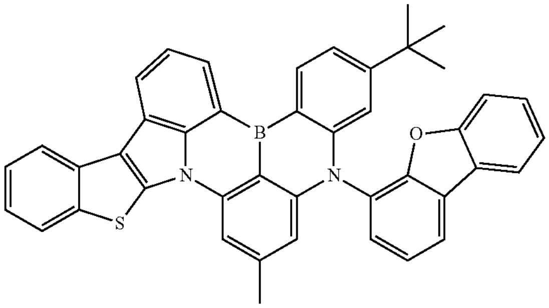
-continued -continued
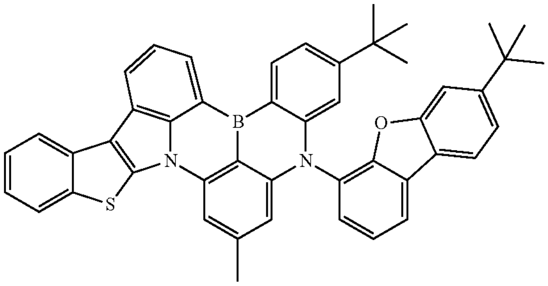
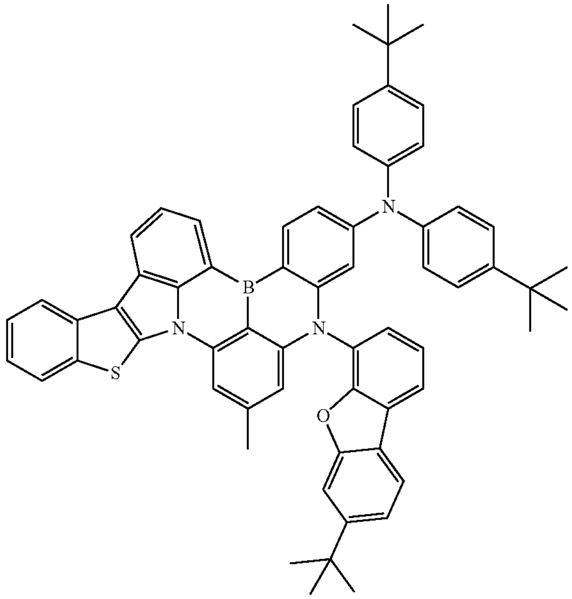
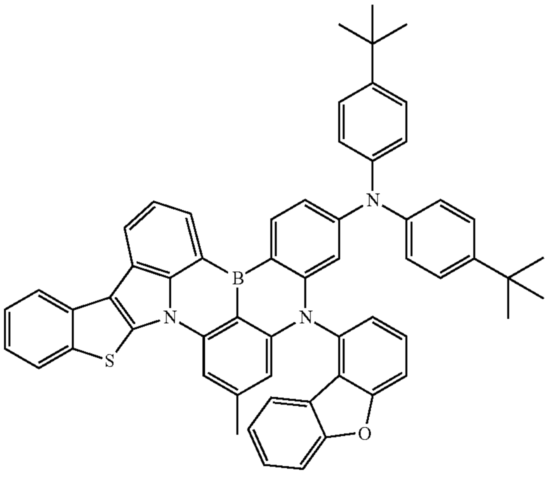
-continued
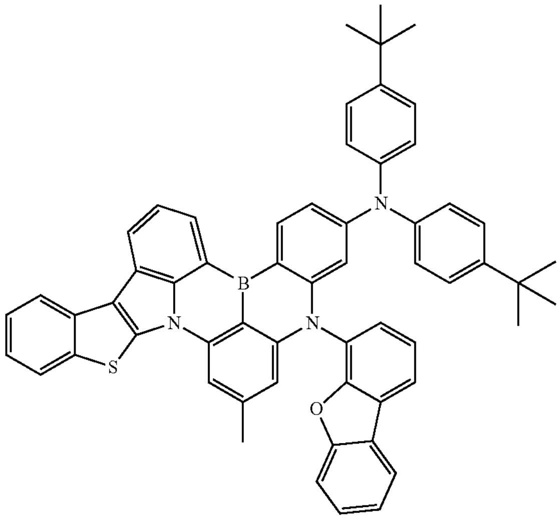
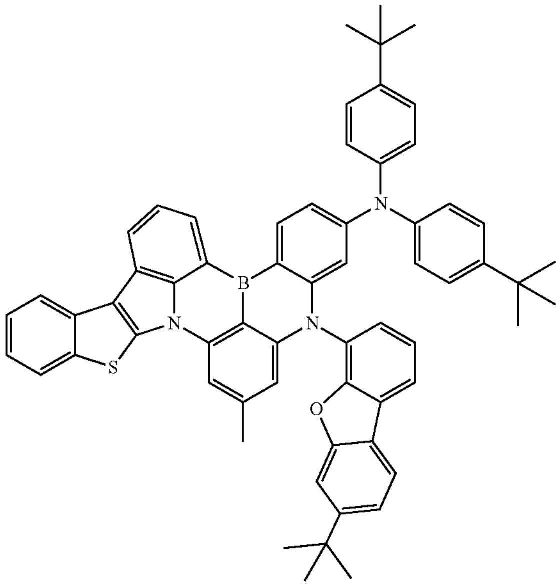
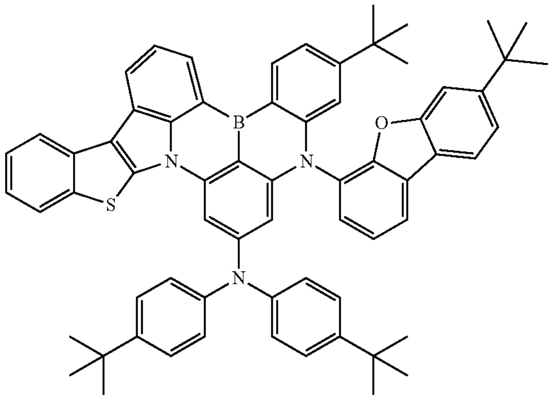

-continued
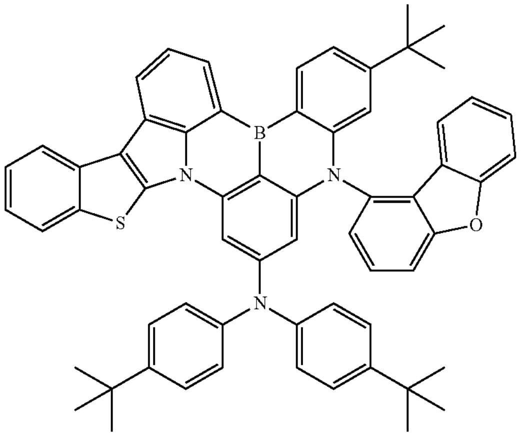
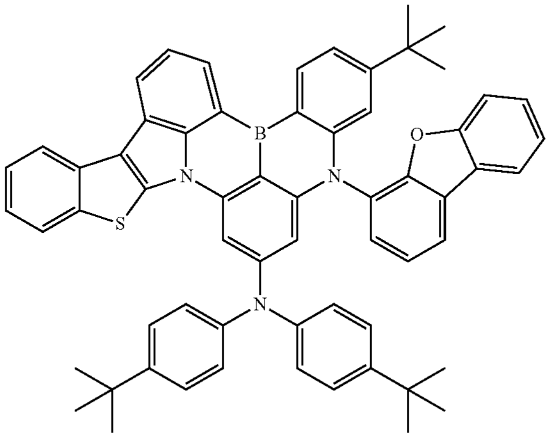
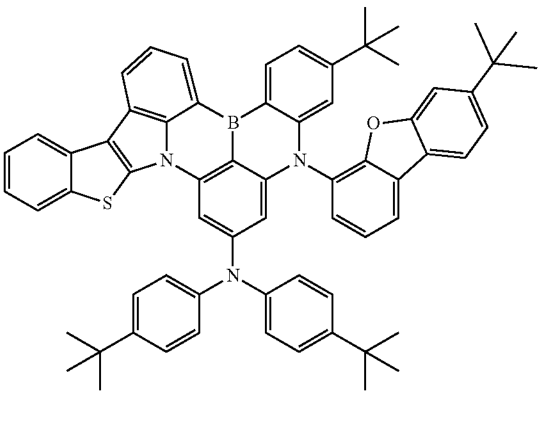
-continued
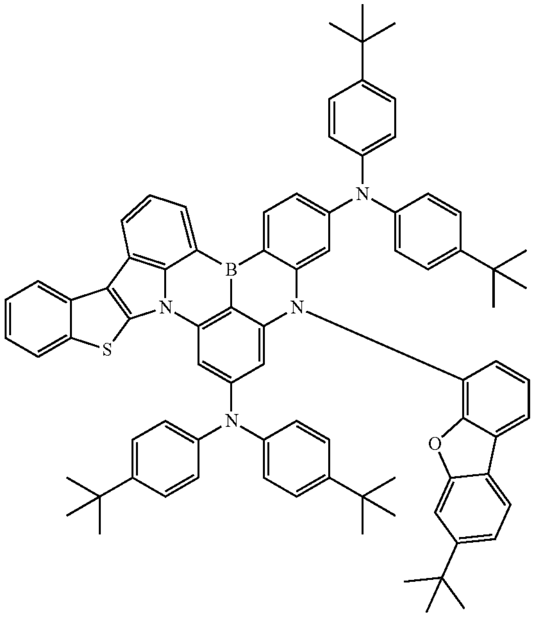
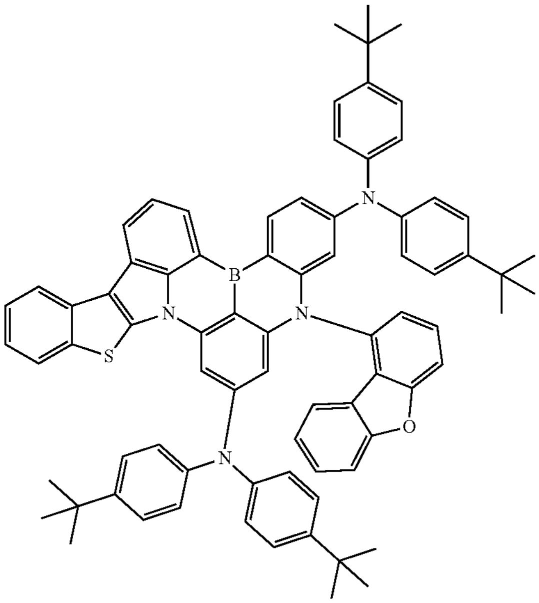

-continued
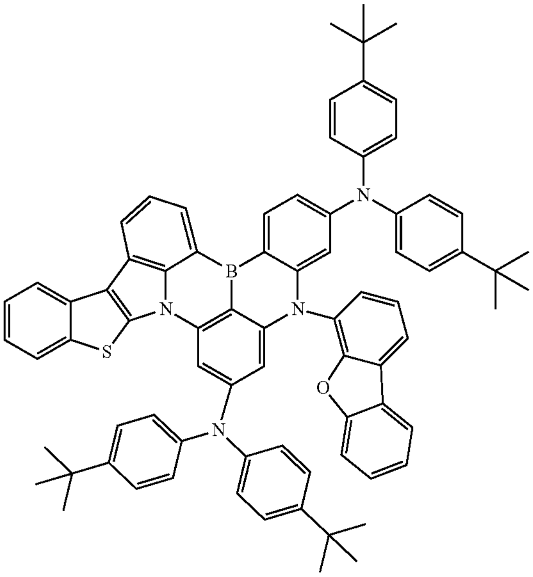
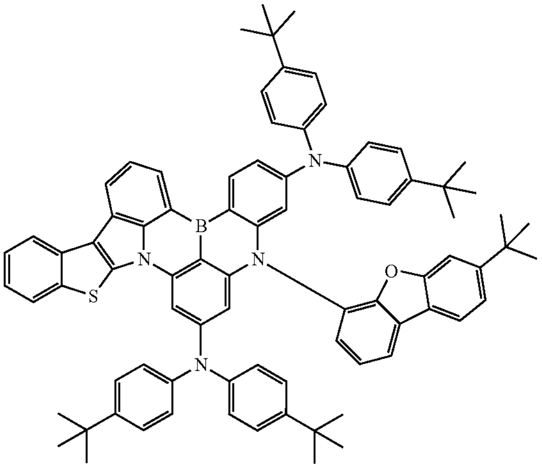
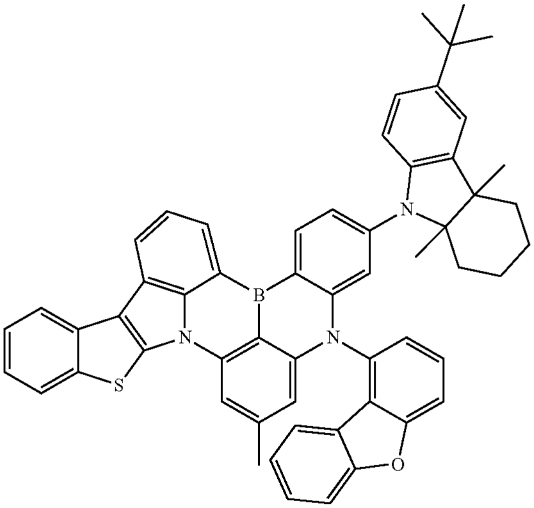
-continued
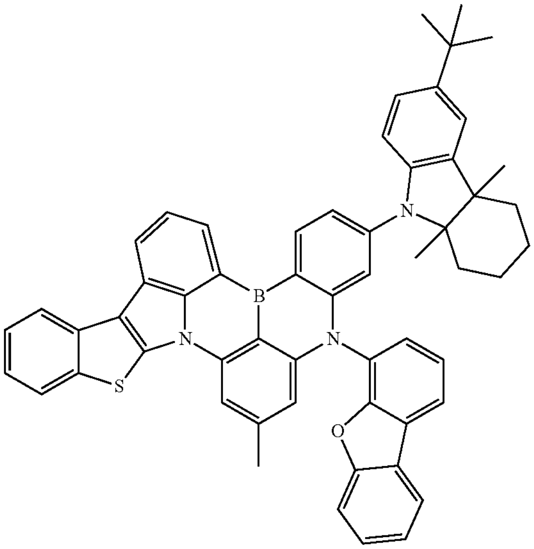
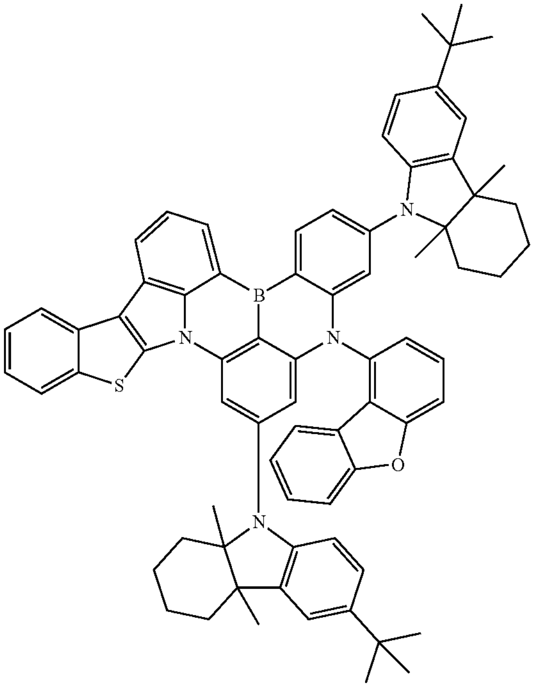

-continued
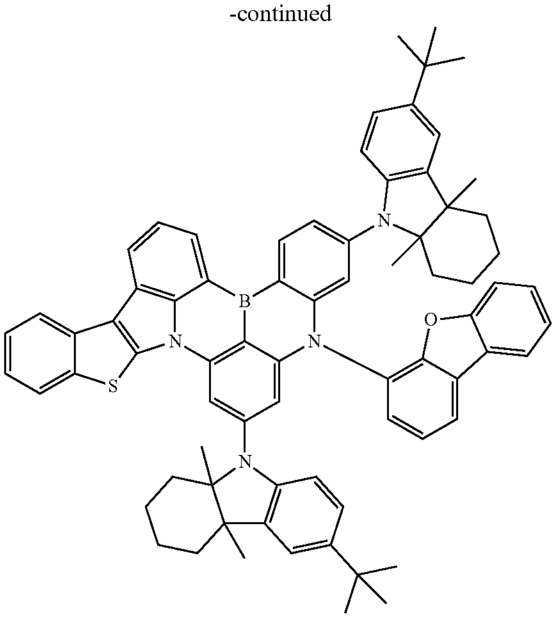
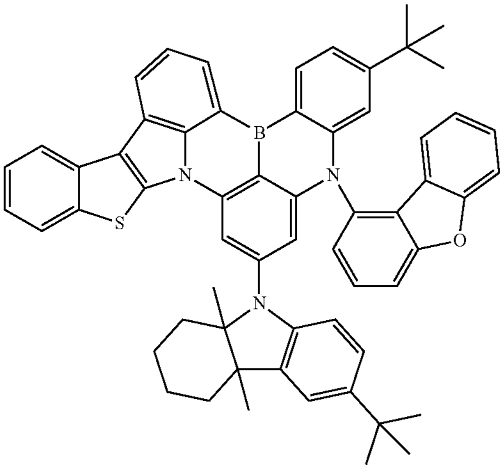
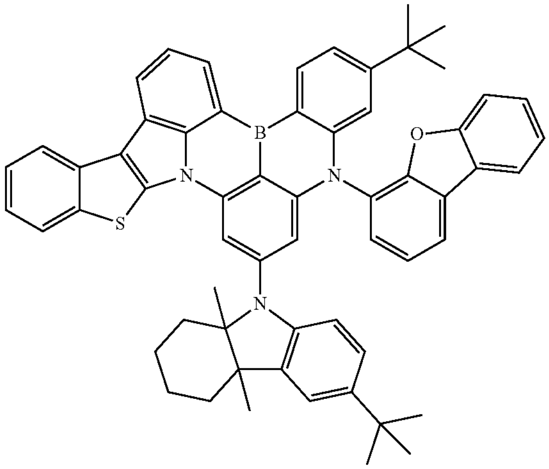
-continued
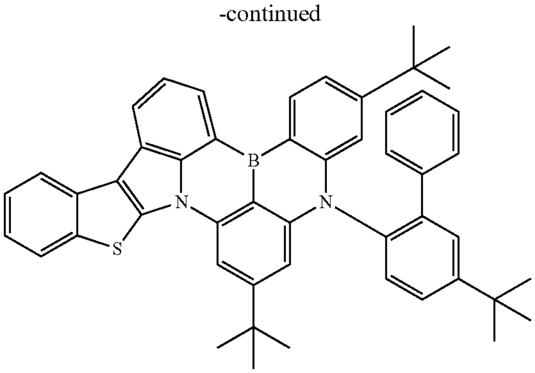
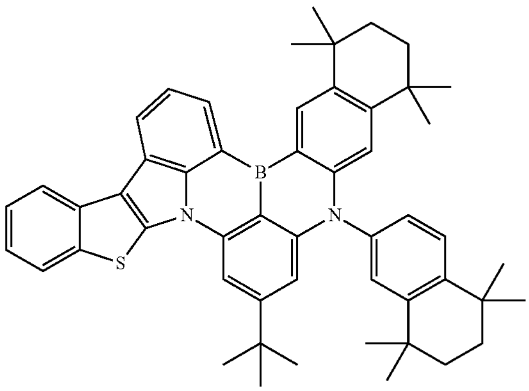
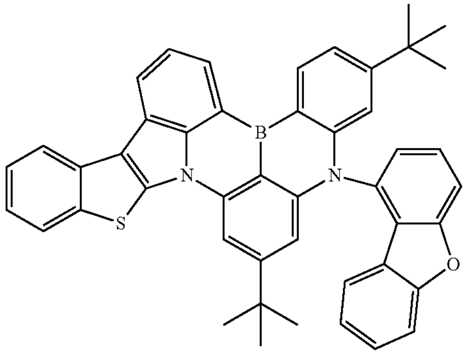
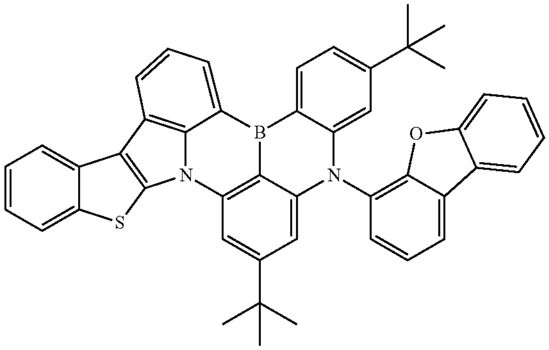

-continued
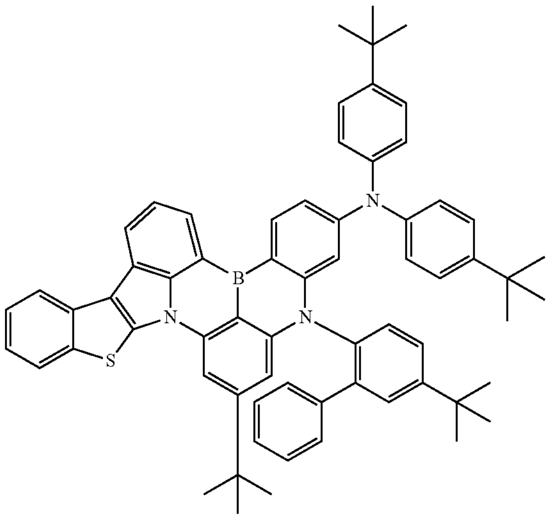
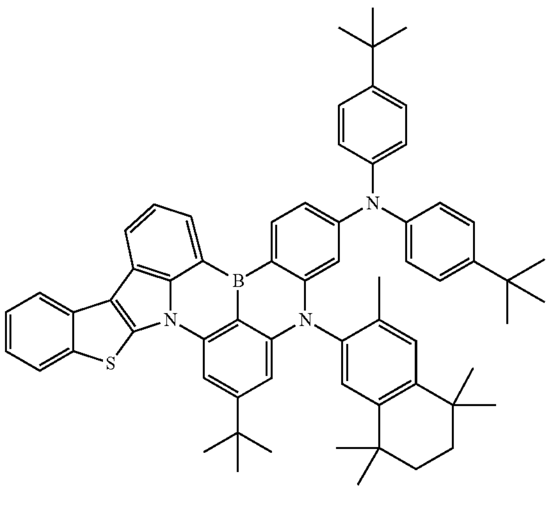
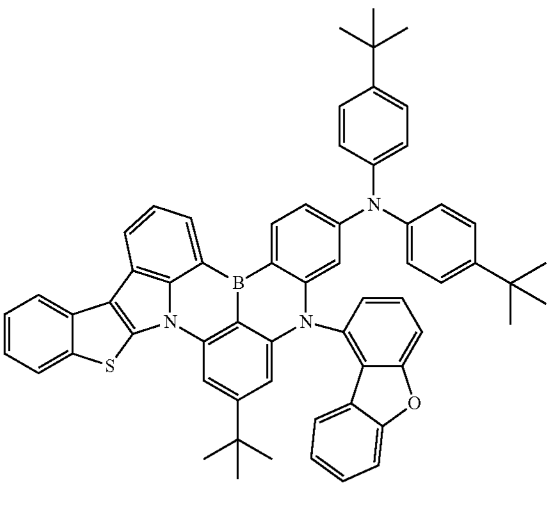
-continued
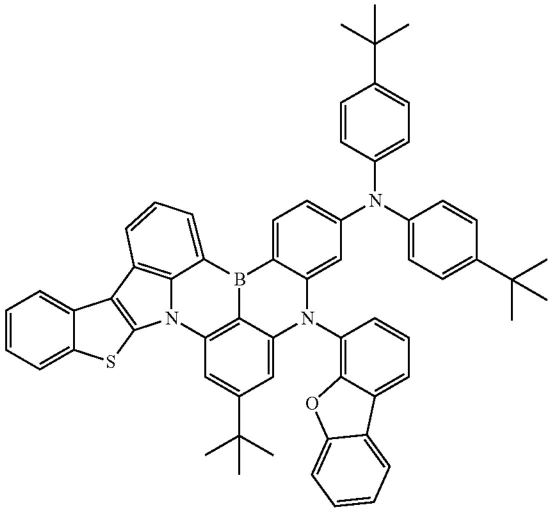
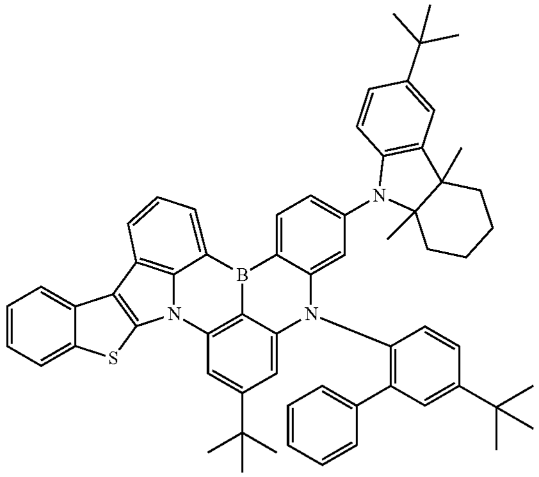
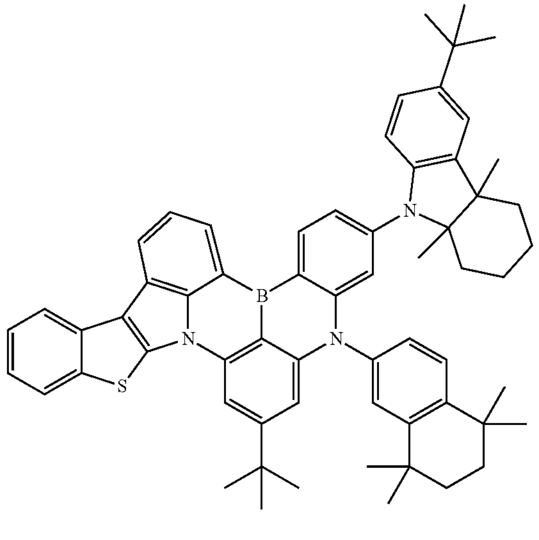

-continued
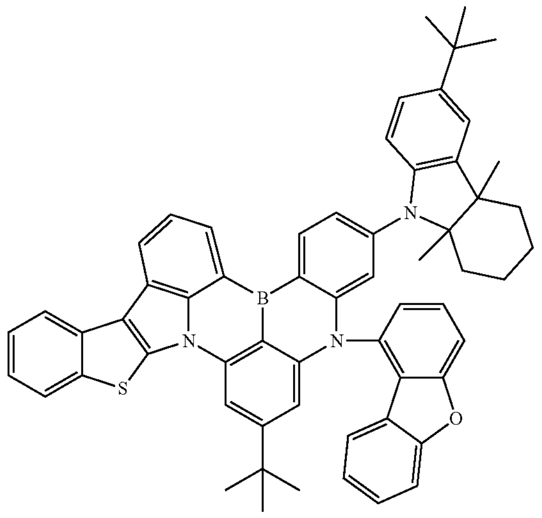
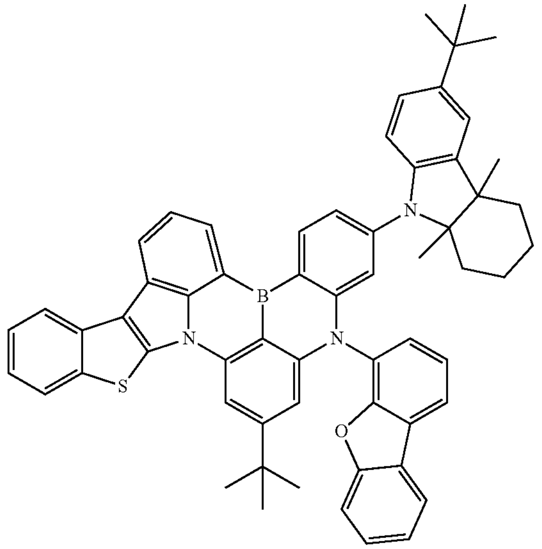
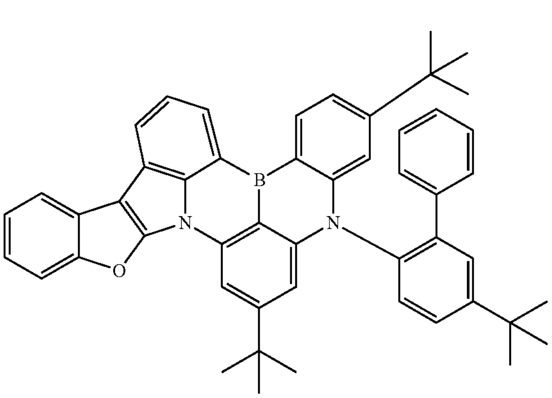
-continued
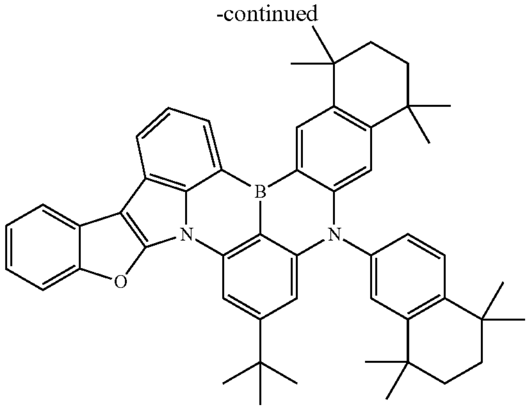
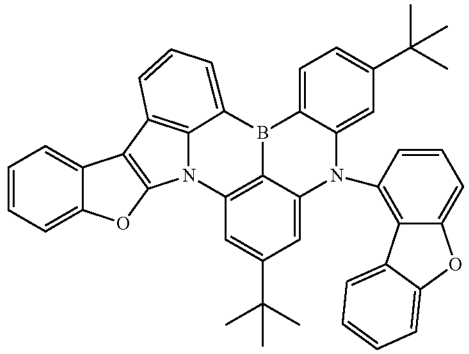
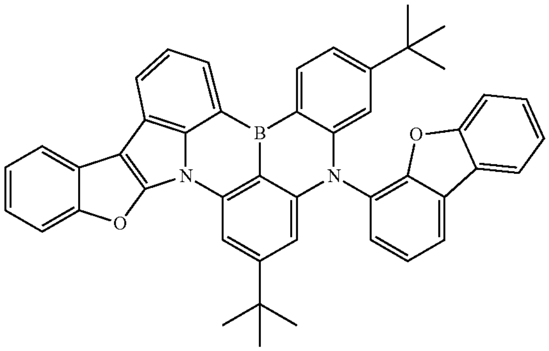
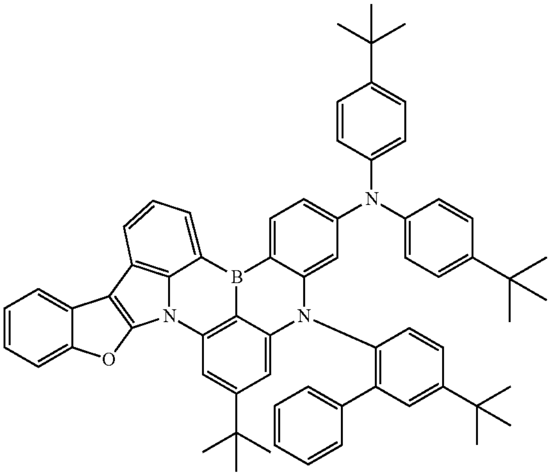

-continued
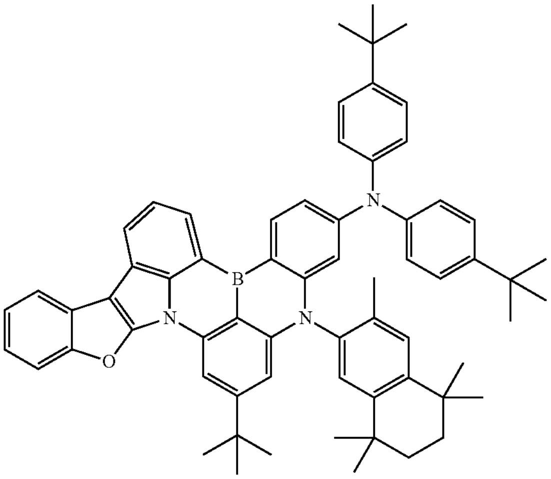
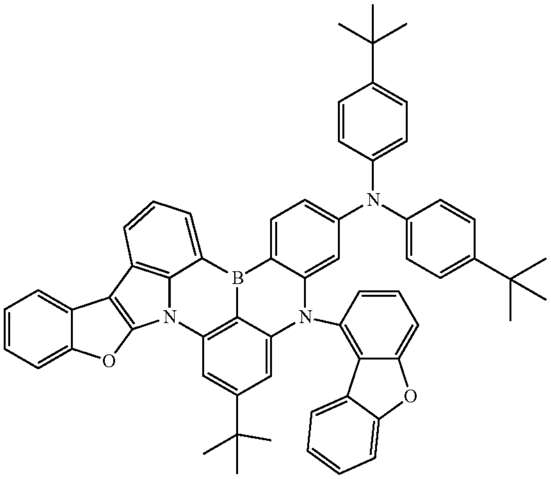
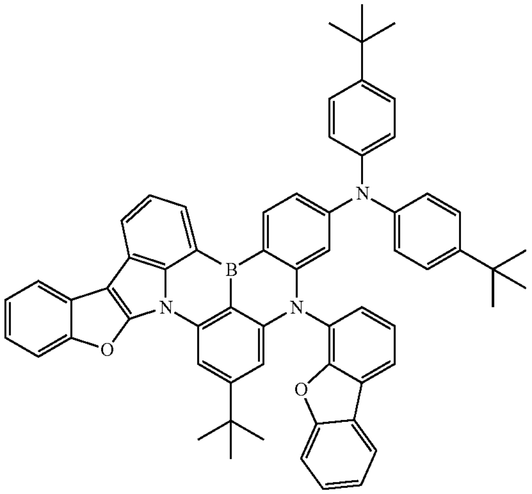
-continued
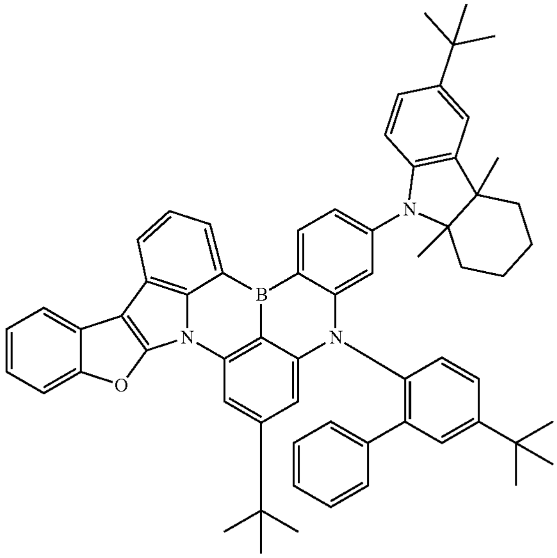
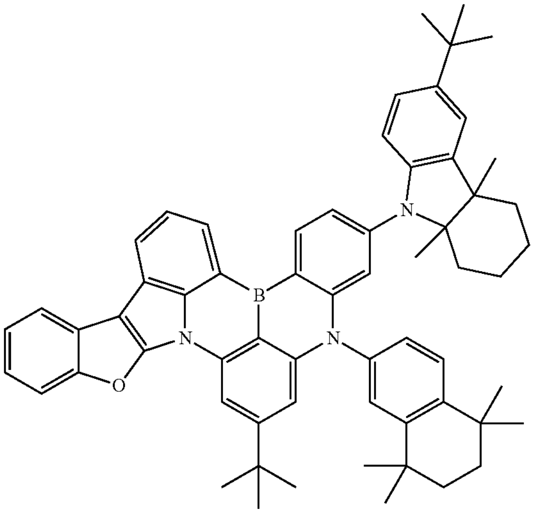
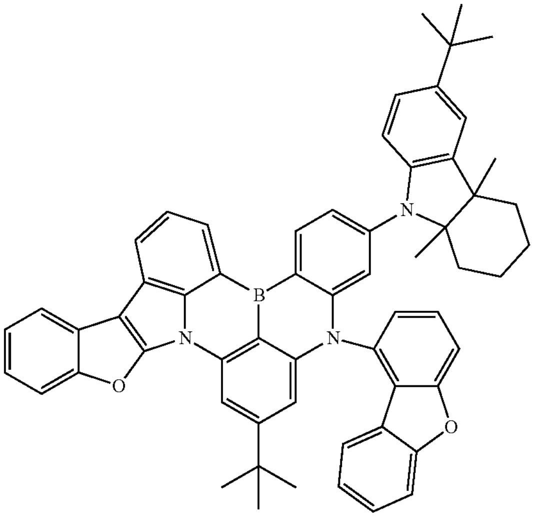

-continued
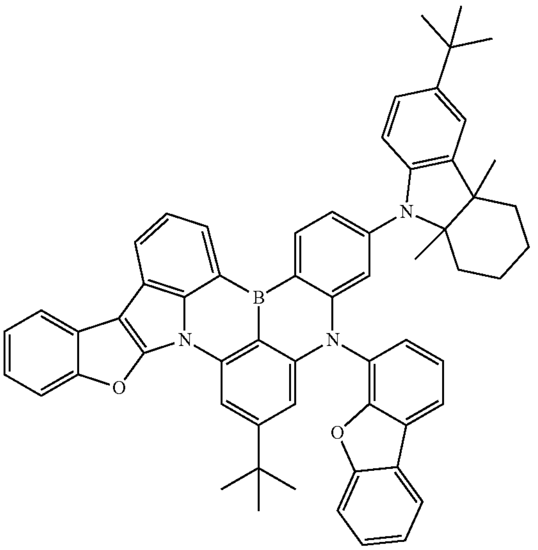
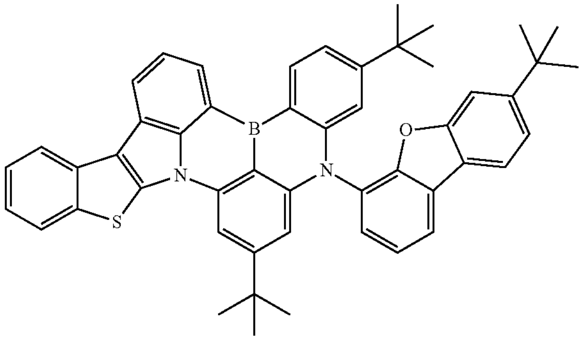
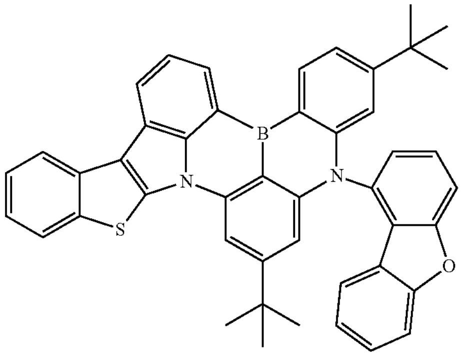
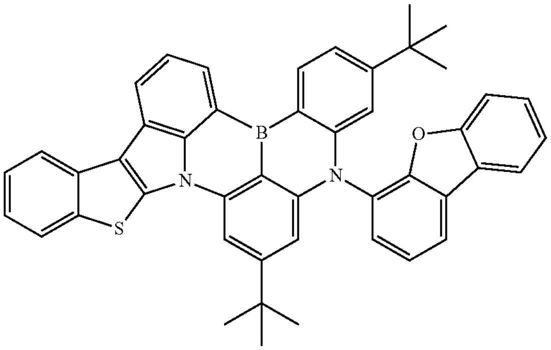
-continued
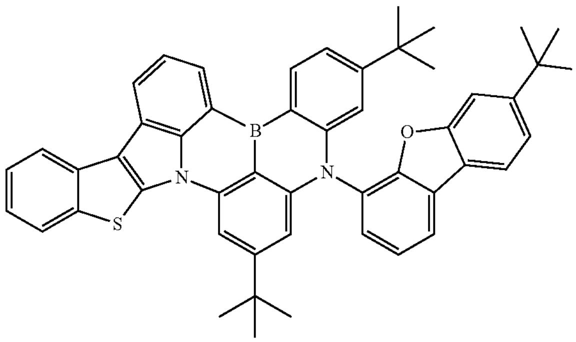
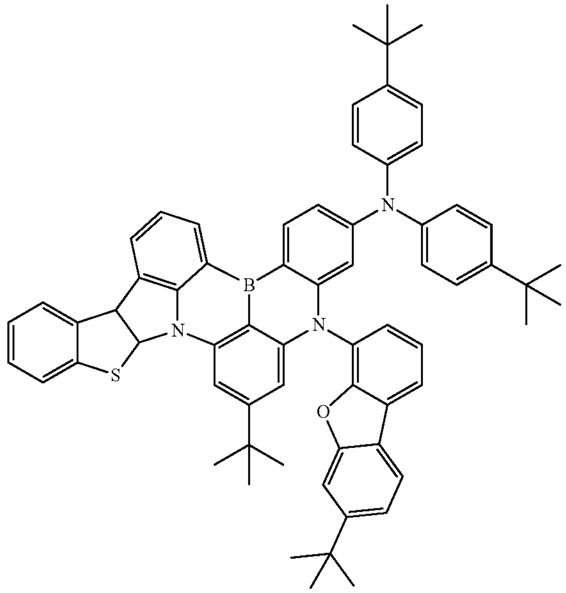
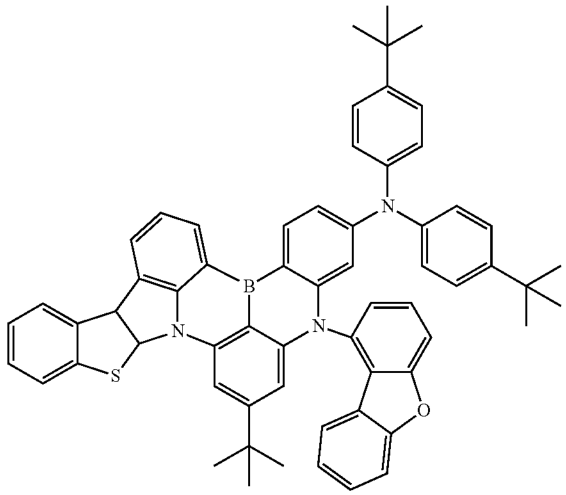

-continued
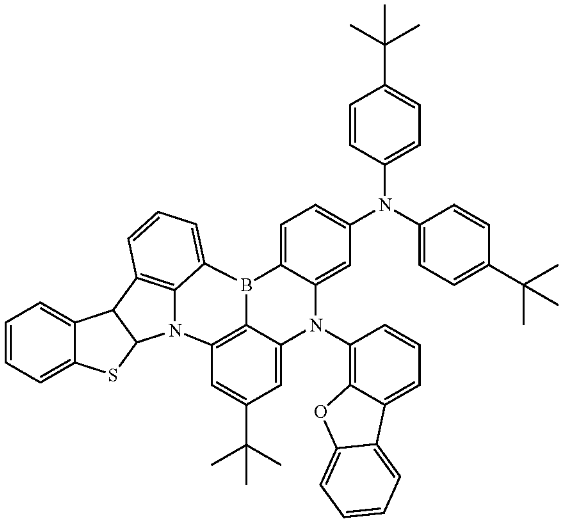
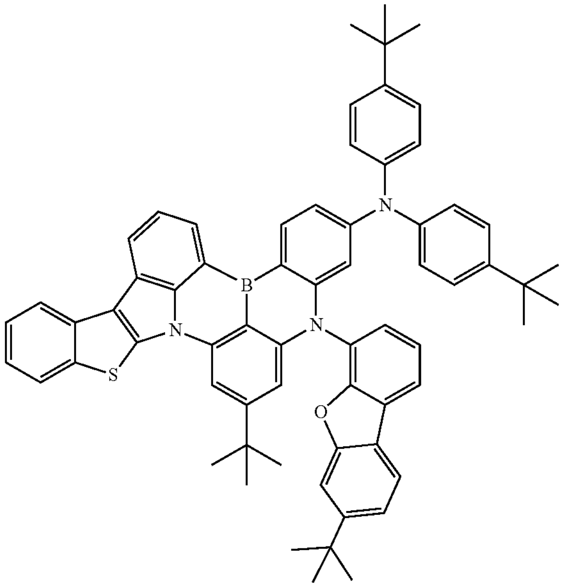
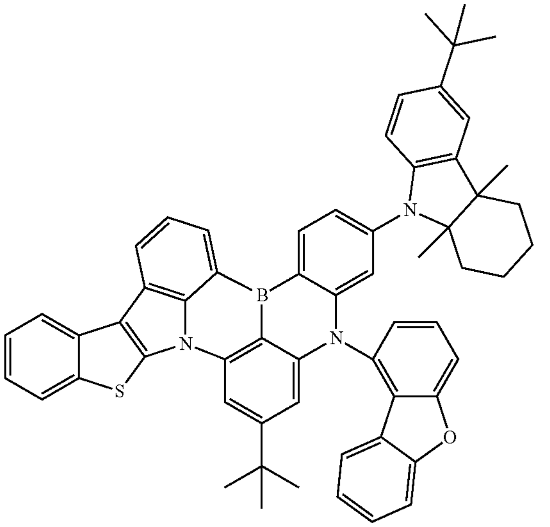
-continued
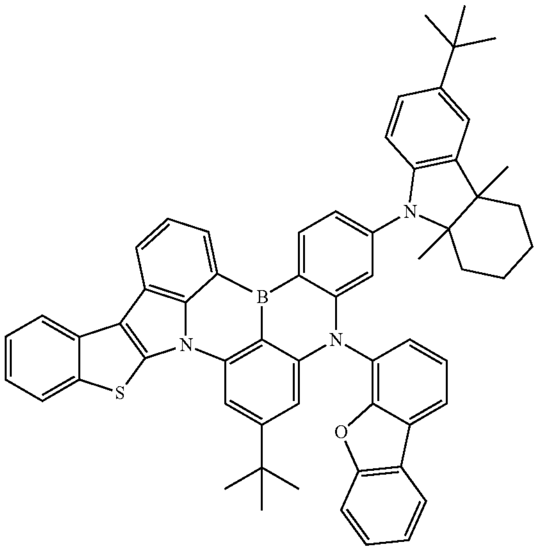
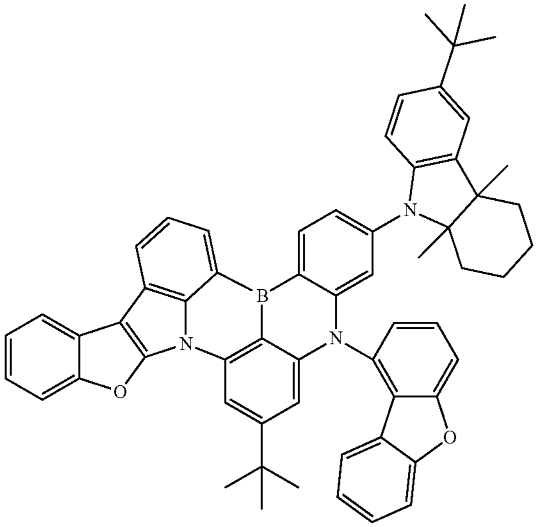
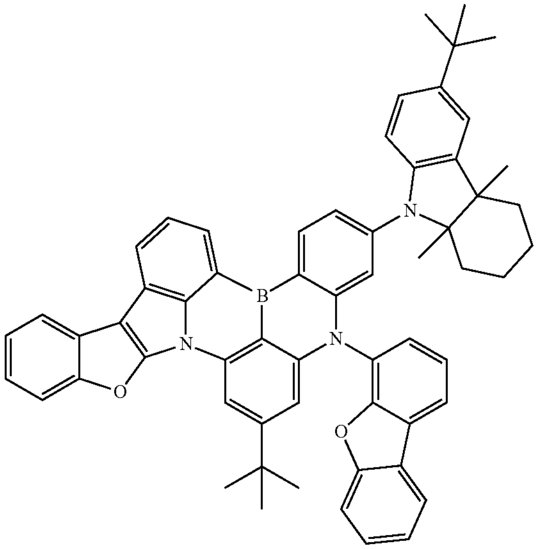

-continued
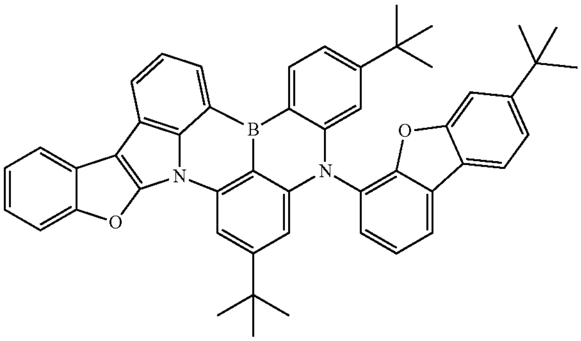
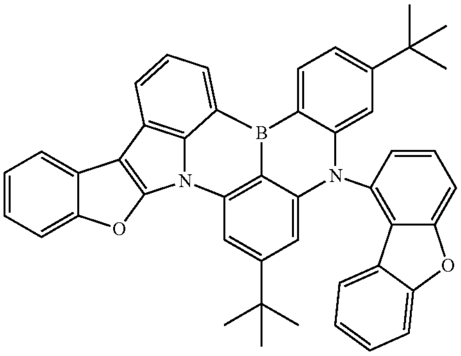
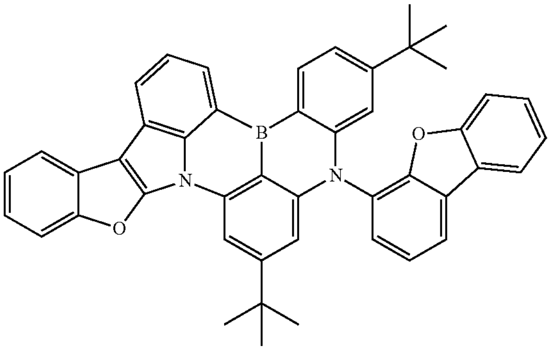
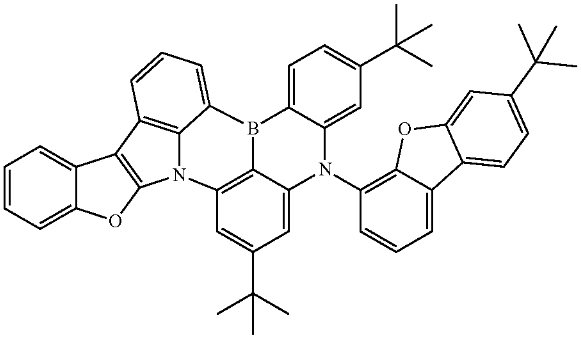
-continued
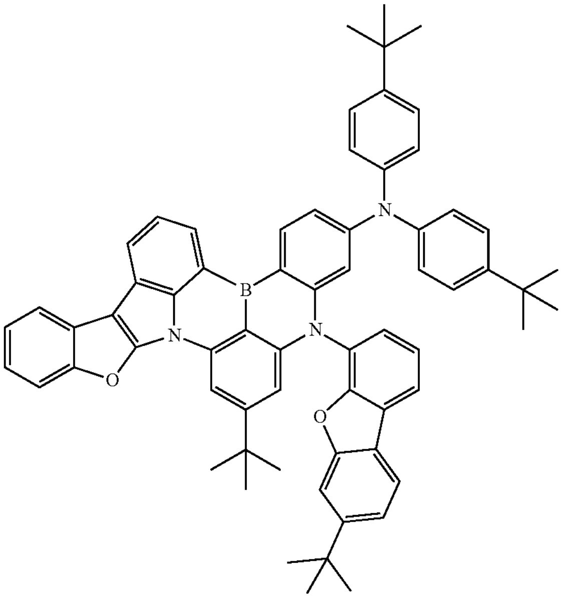
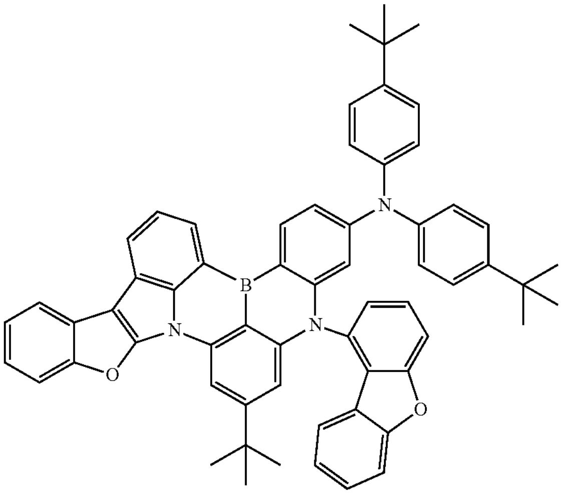
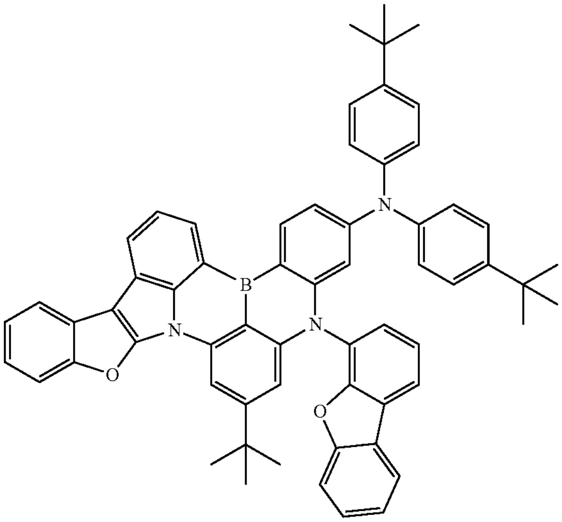

-continued
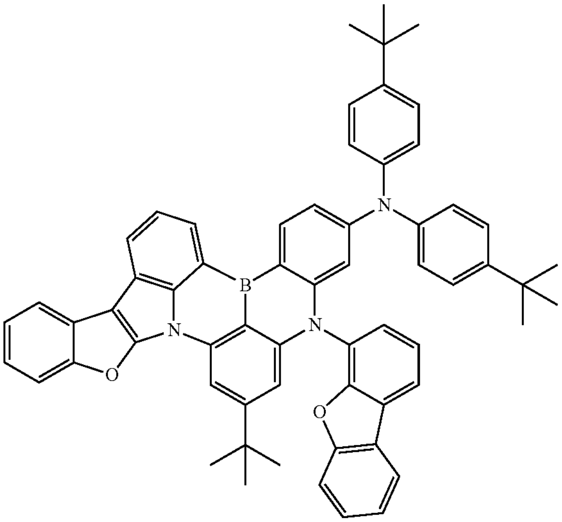
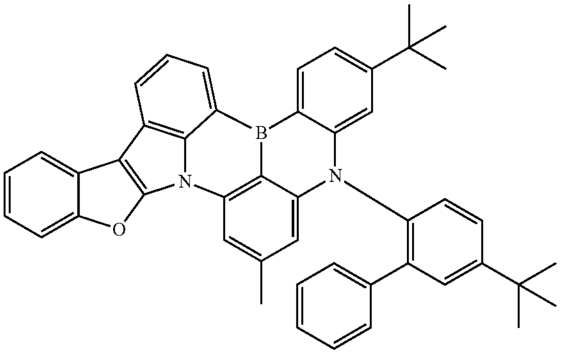
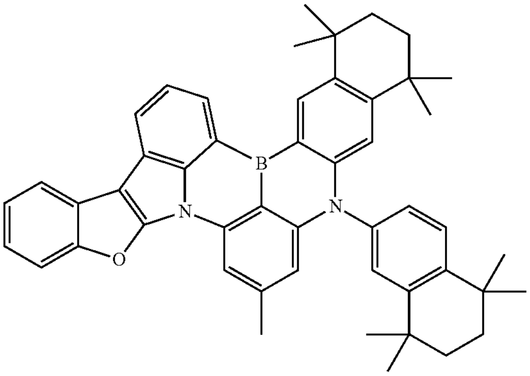
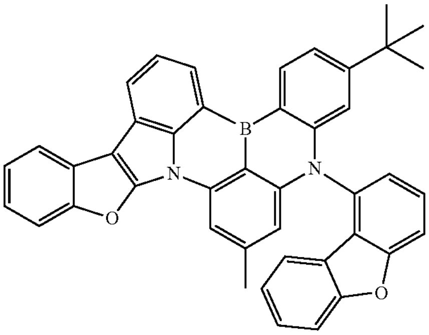
-continued
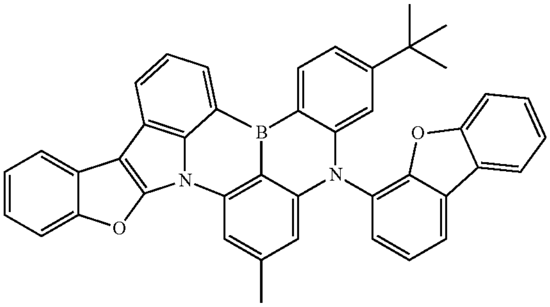
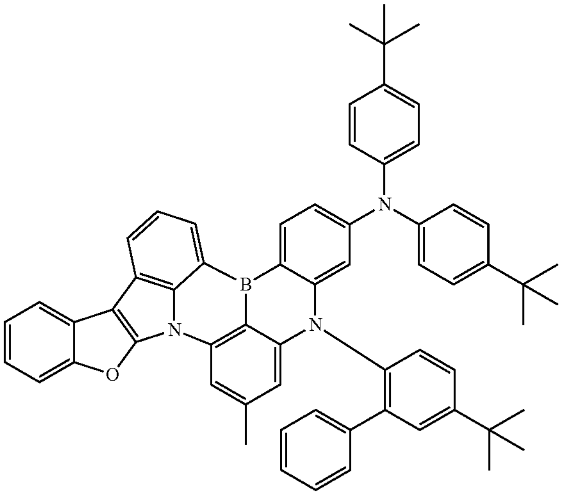
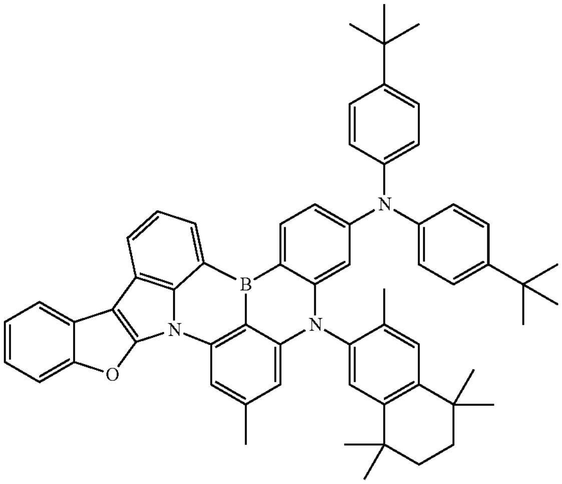

-continued
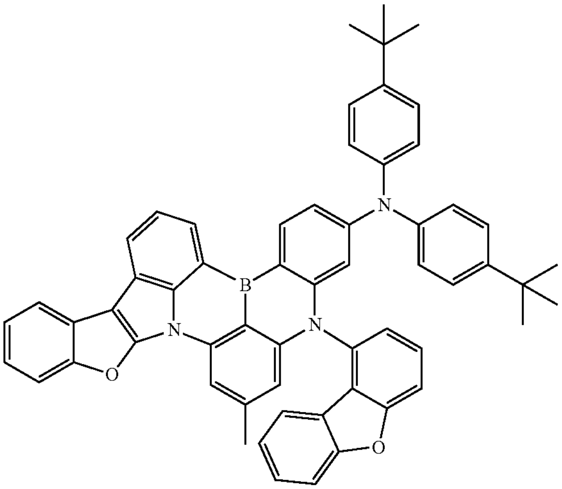
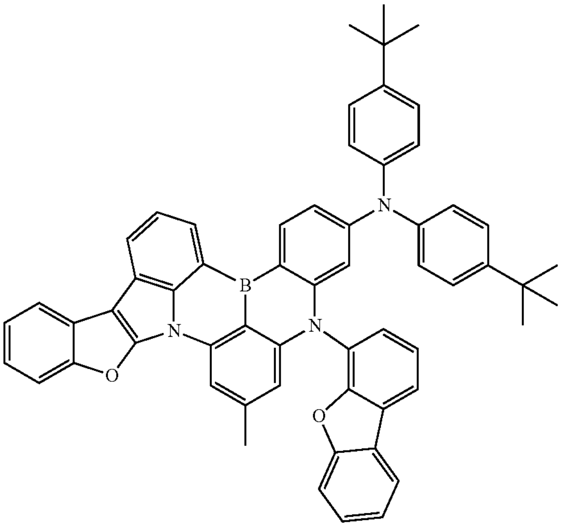
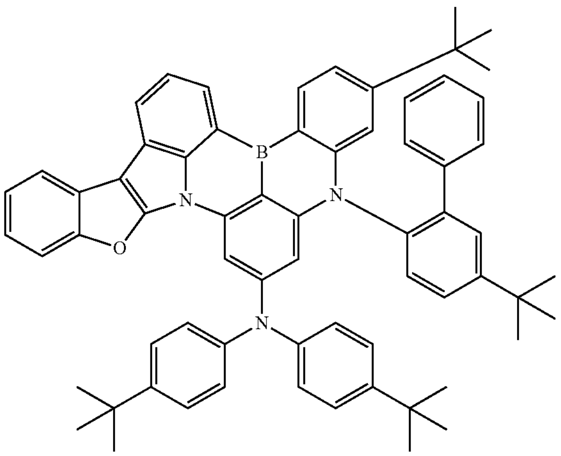
-continued
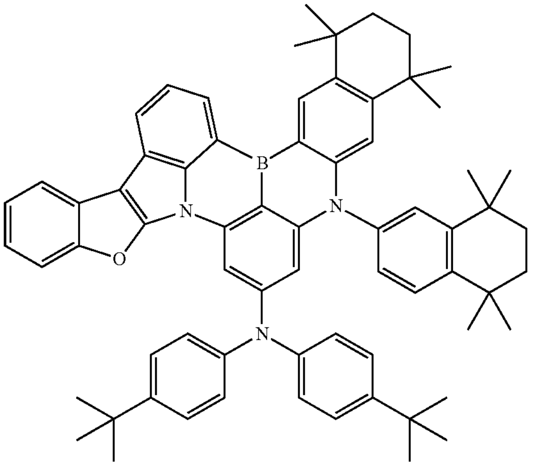
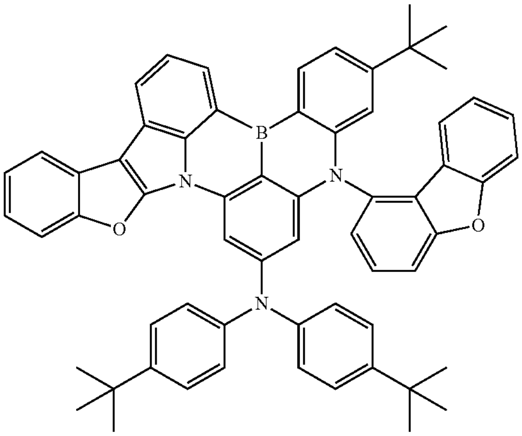
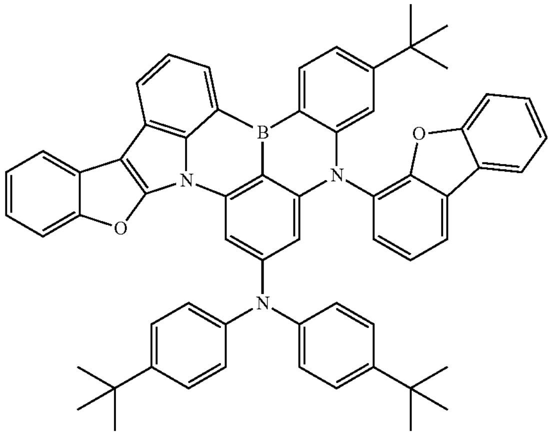

-continued
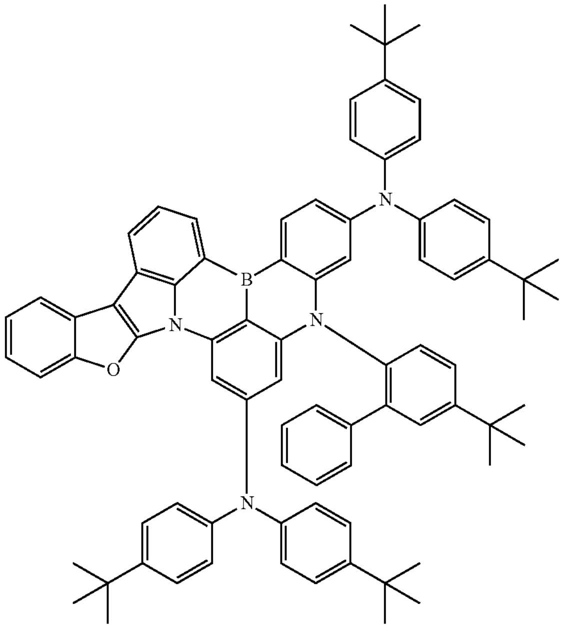
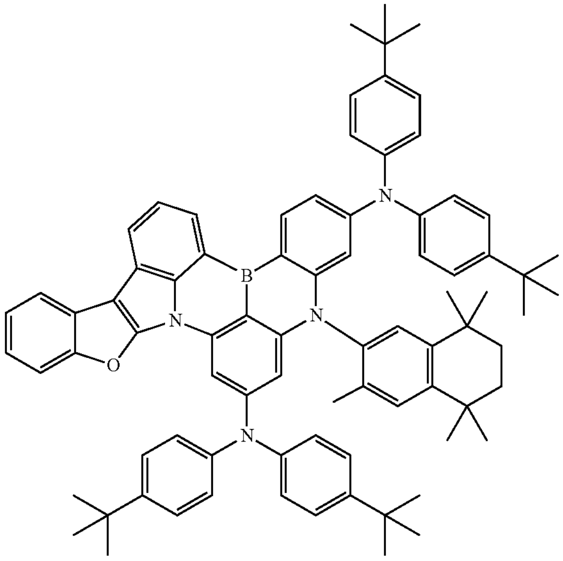
-continued
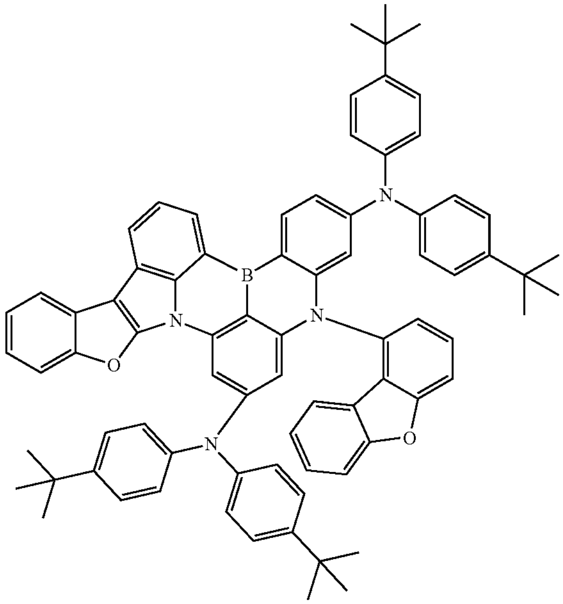
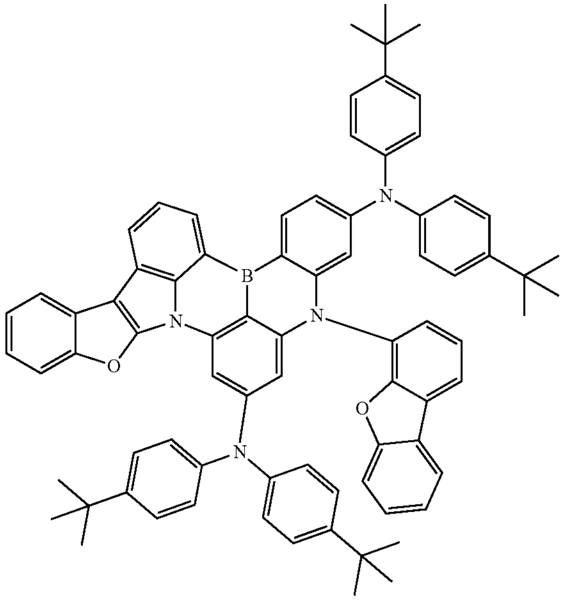
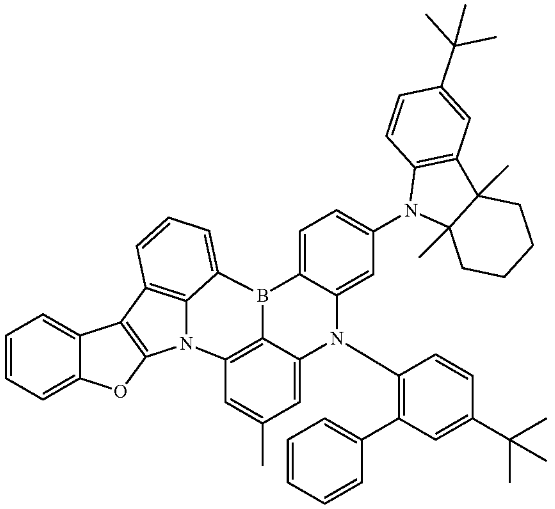

-continued
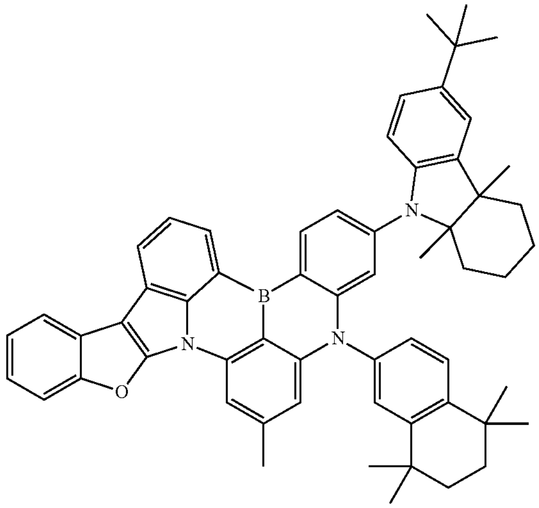
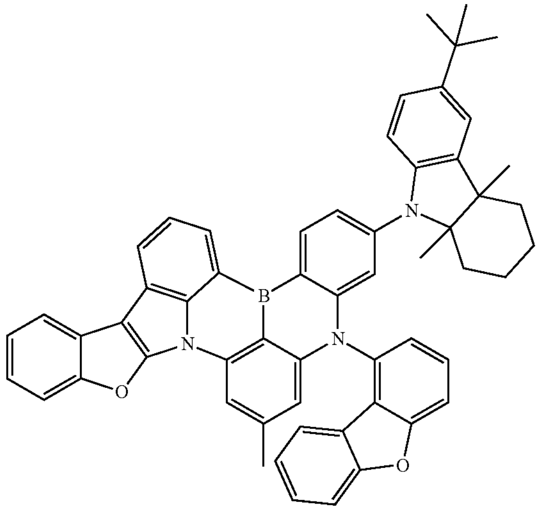 [SMILES: Cc1cc2c3c(c1)-n1c4oc5ccccc5c4c4cccc(c41)B3c1ccc(N3c4ccc(C(C)(C)C)cc4C4(C)CCCCC34C)cc1N2c1cccc2oc3ccccc3c12]
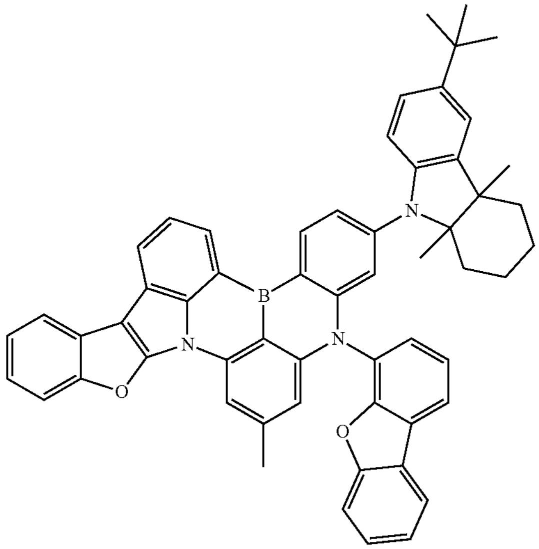
-continued
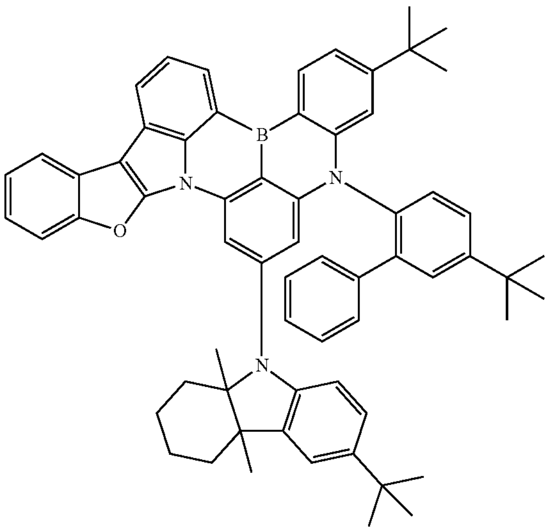
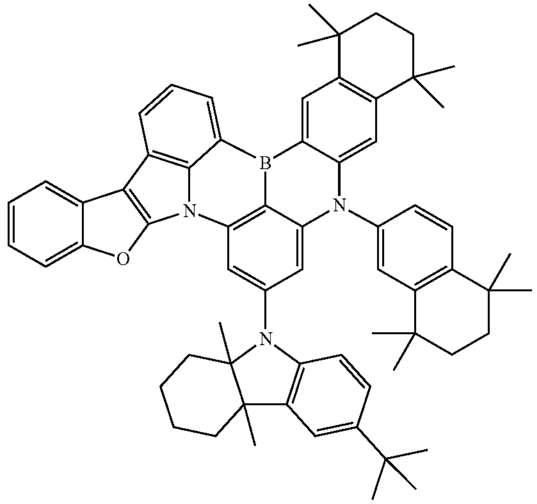
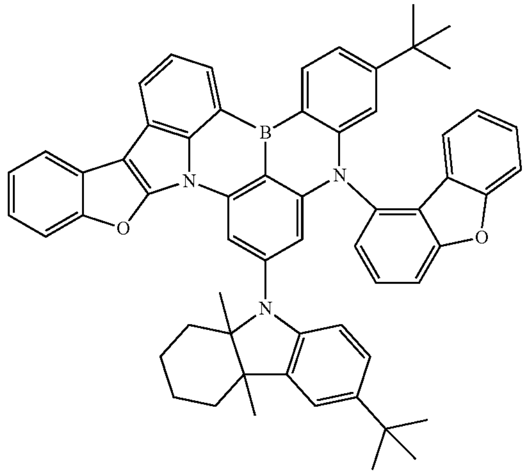

-continued
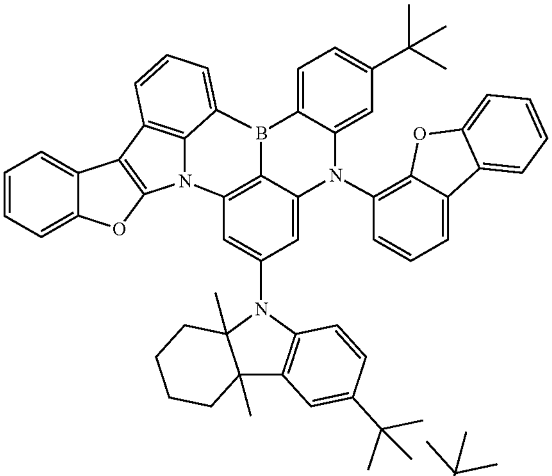
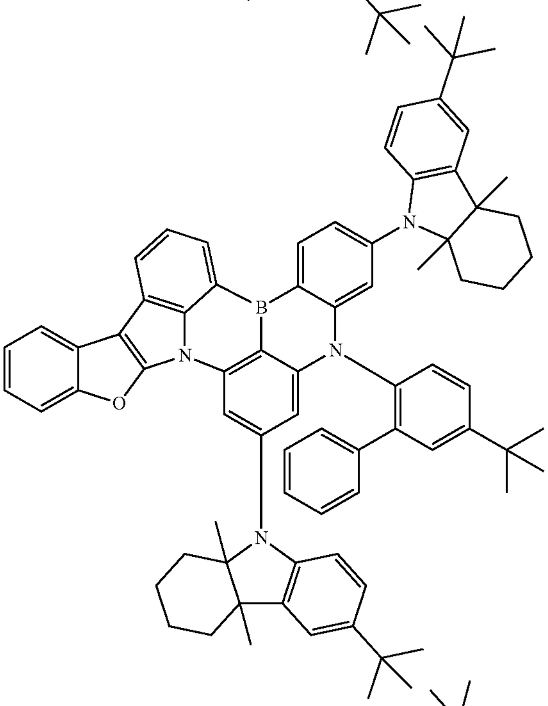
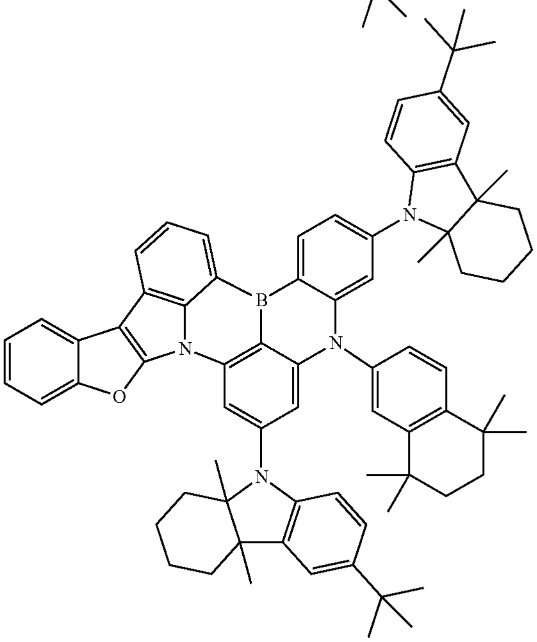
-continued
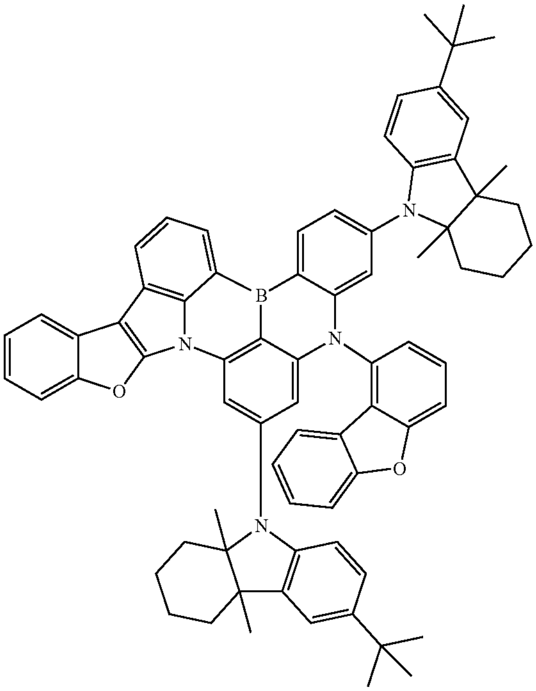
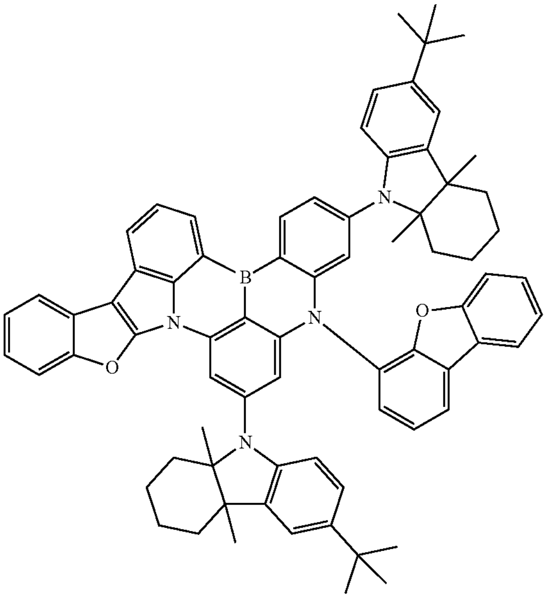
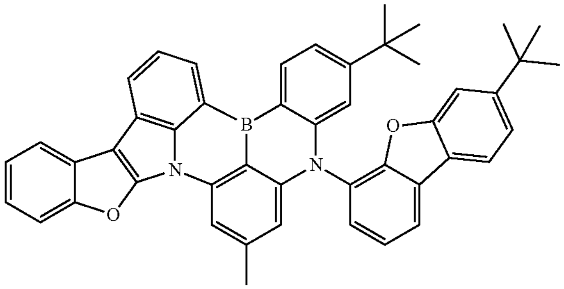

-continued
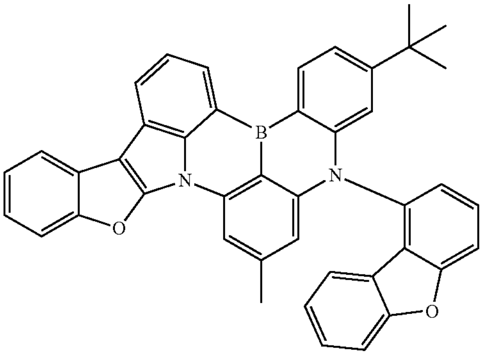
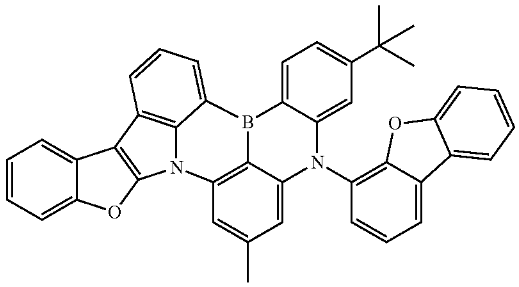
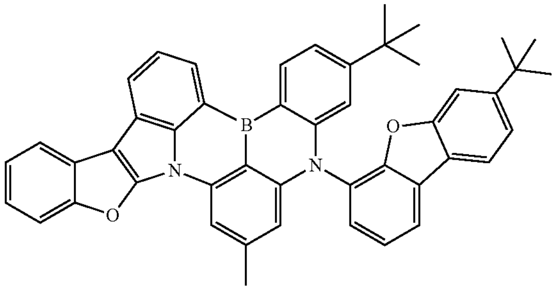
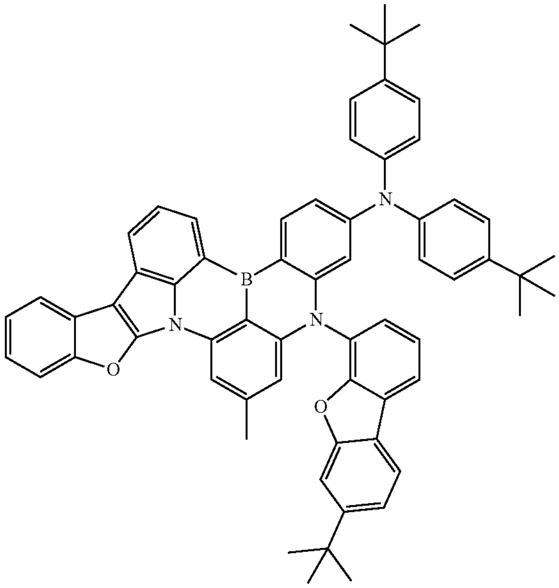
-continued
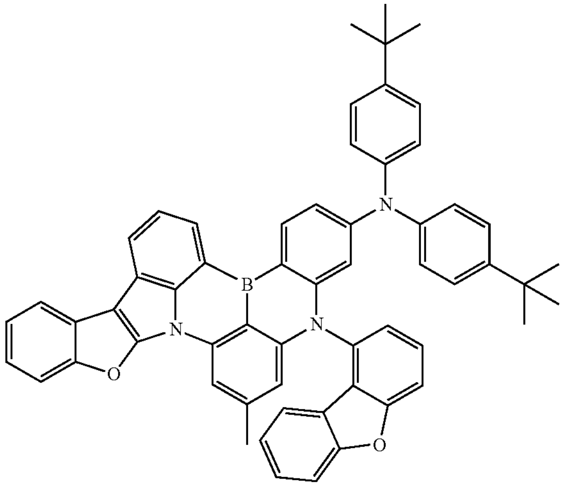
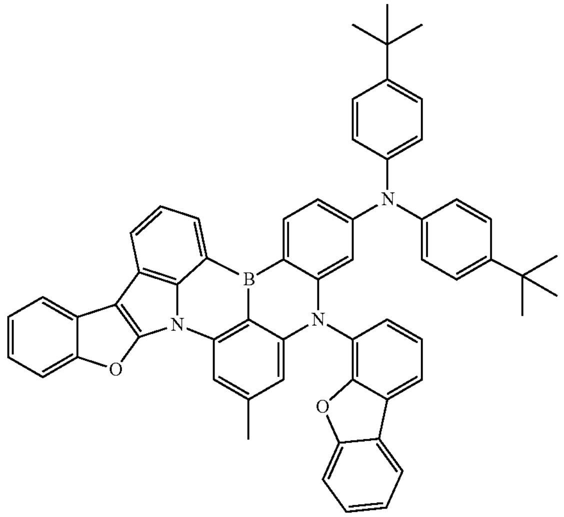
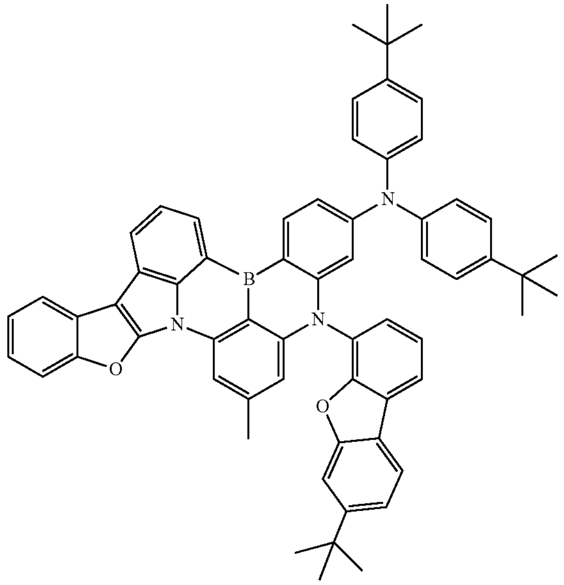

-continued
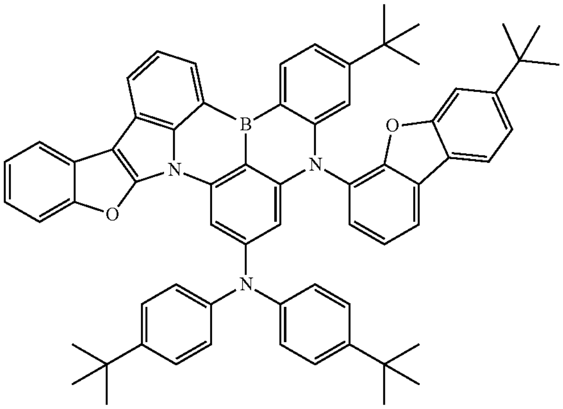
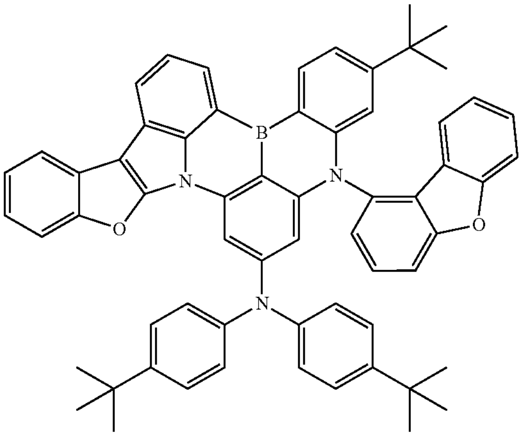
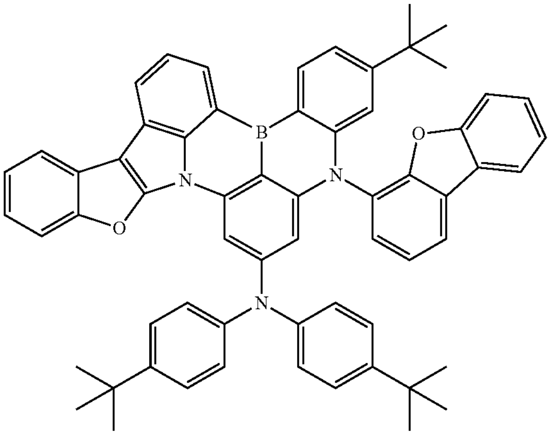
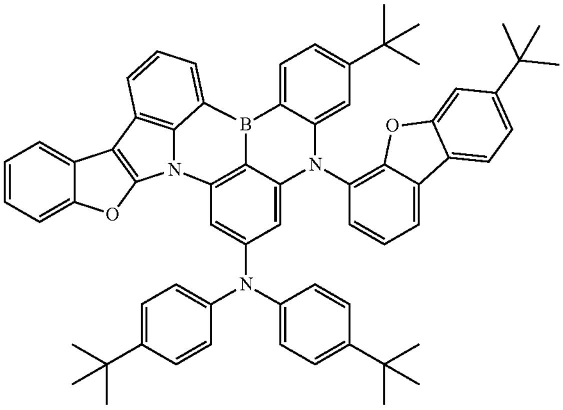
-continued
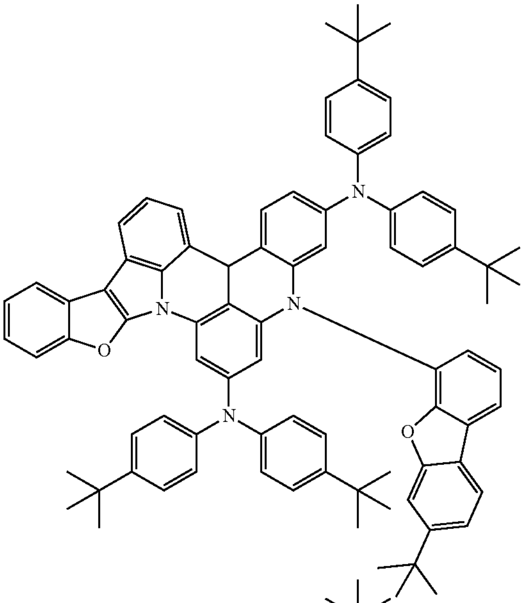
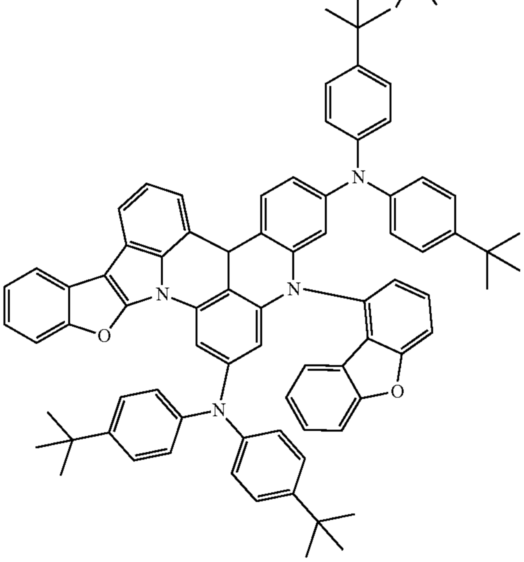
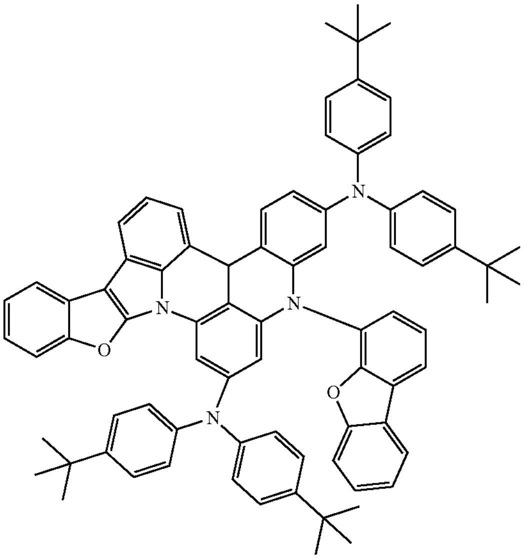

-continued
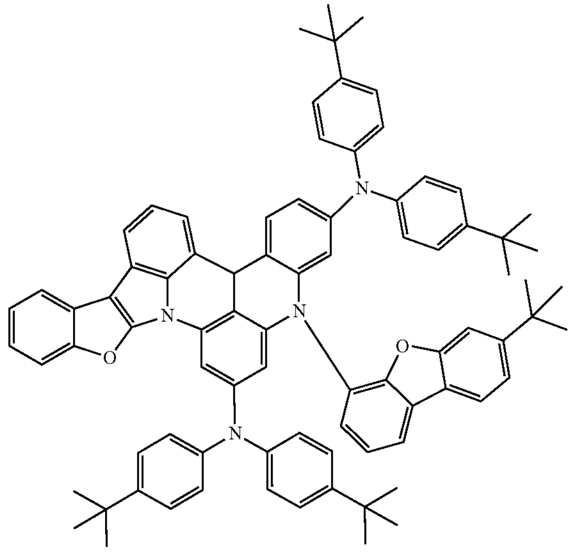
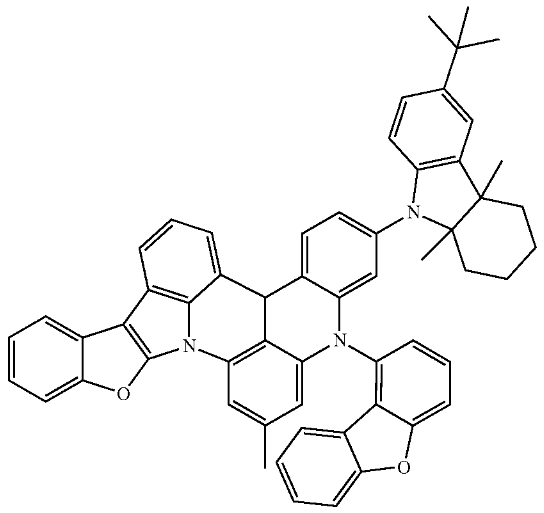
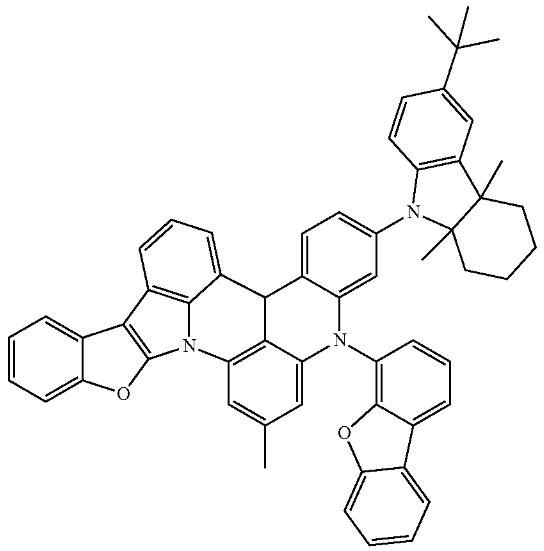
-continued
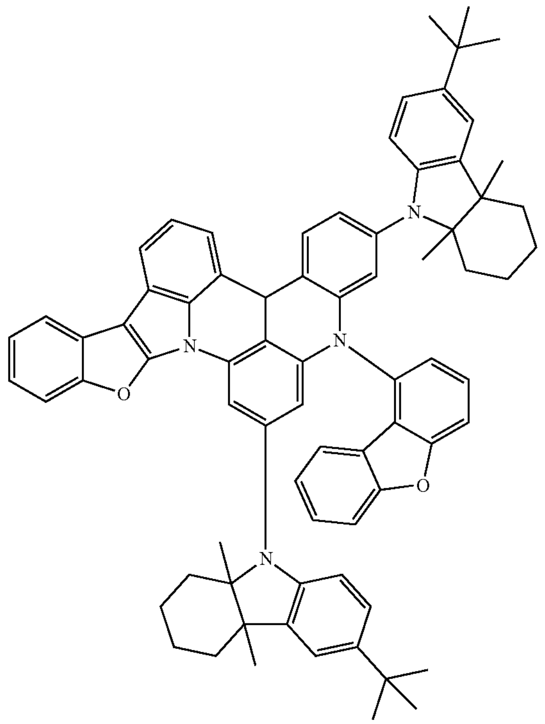
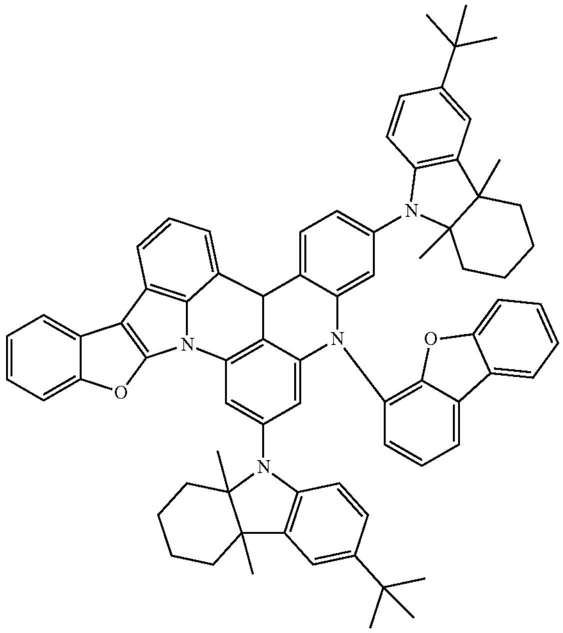

-continued
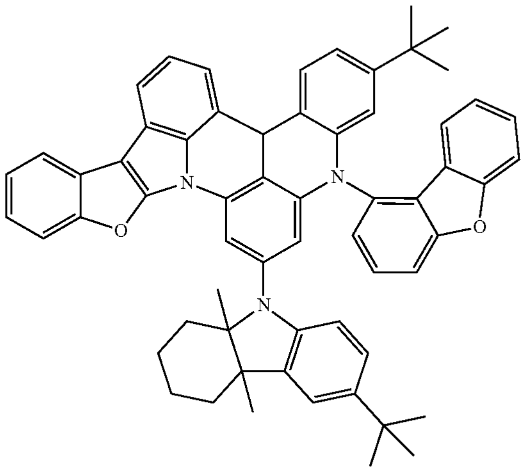
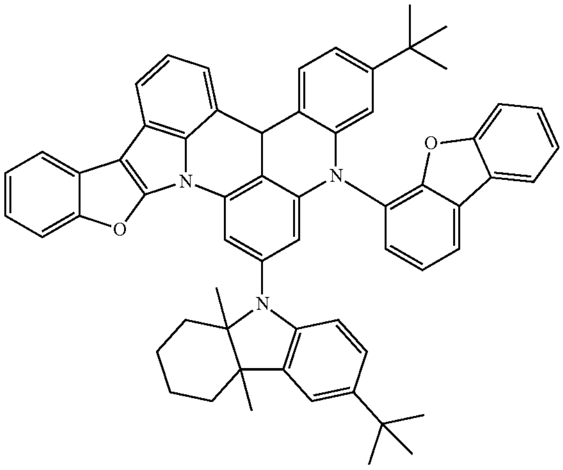
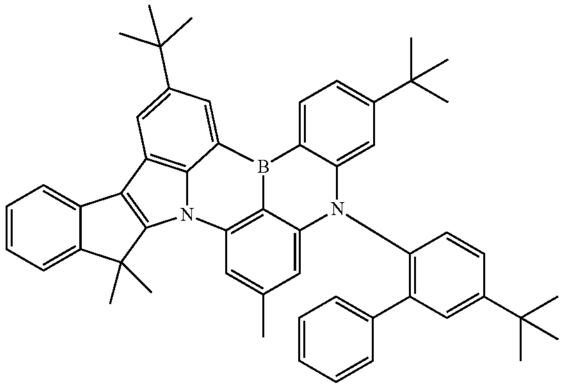
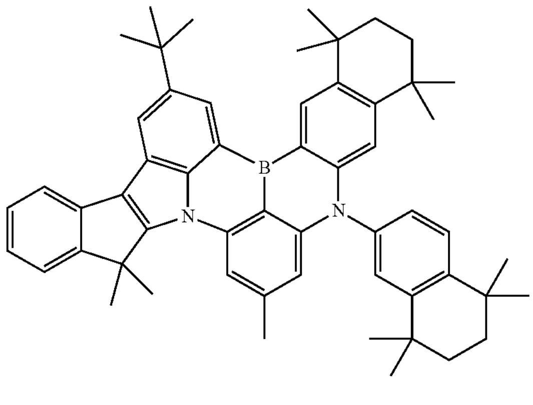
-continued
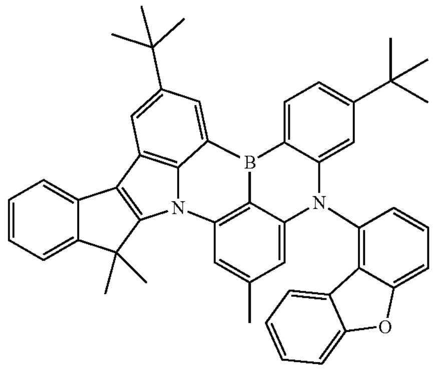
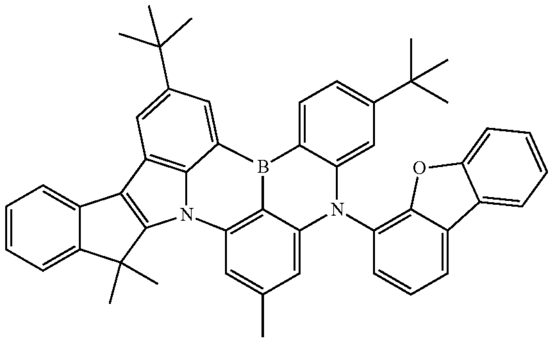
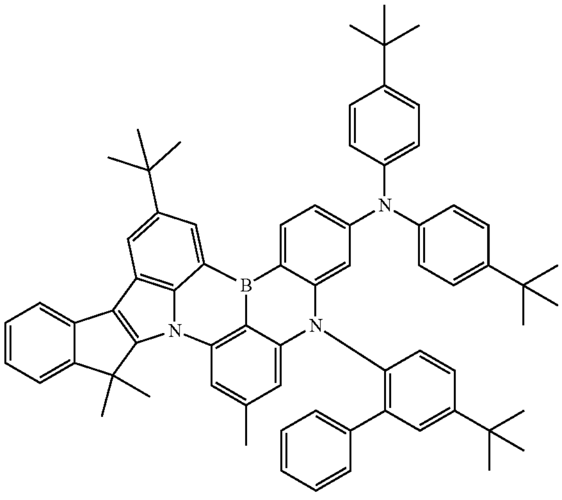
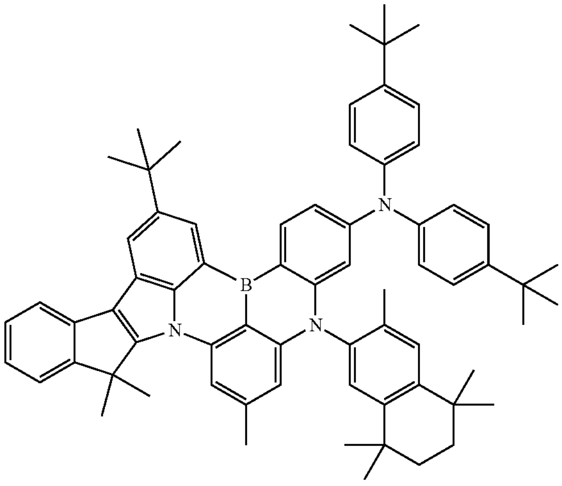

-continued
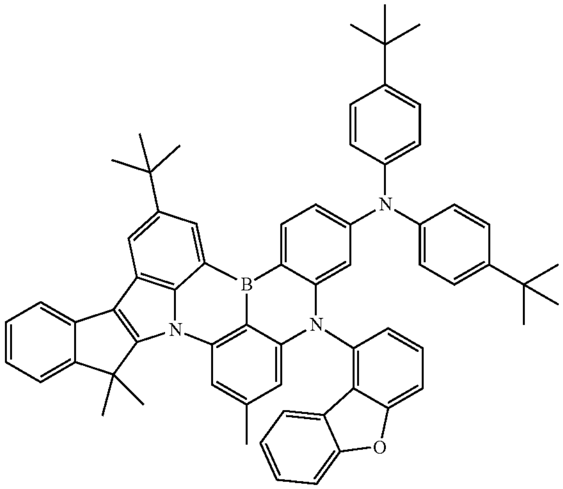
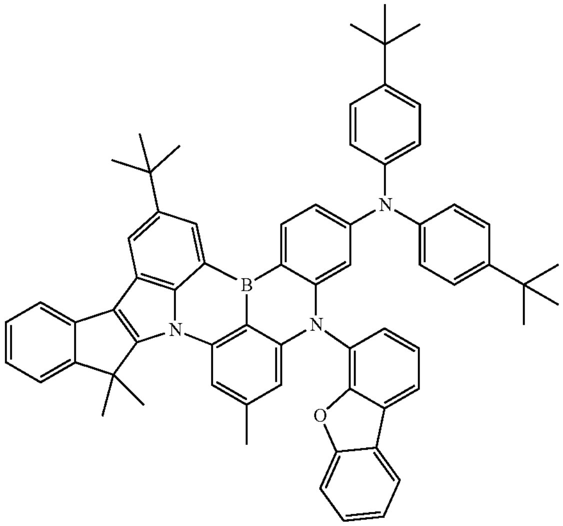
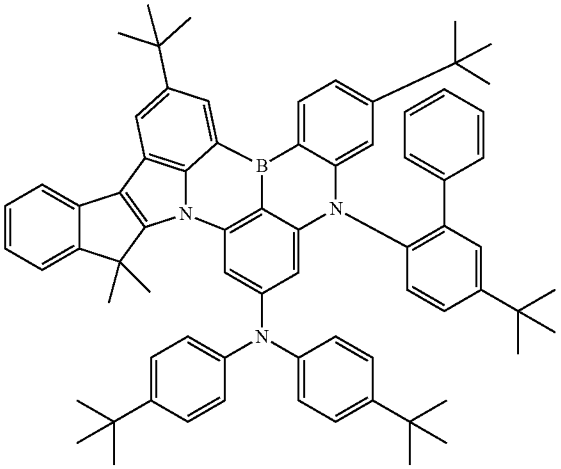
-continued
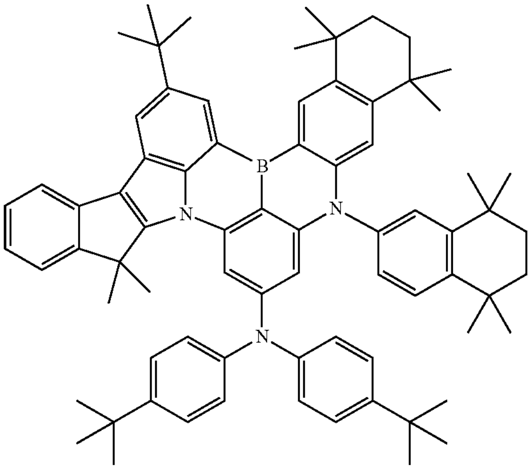
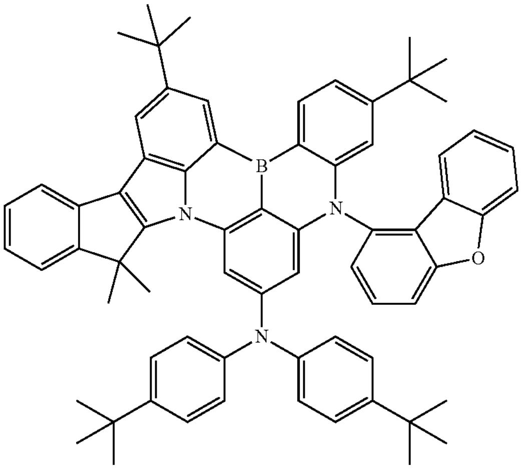
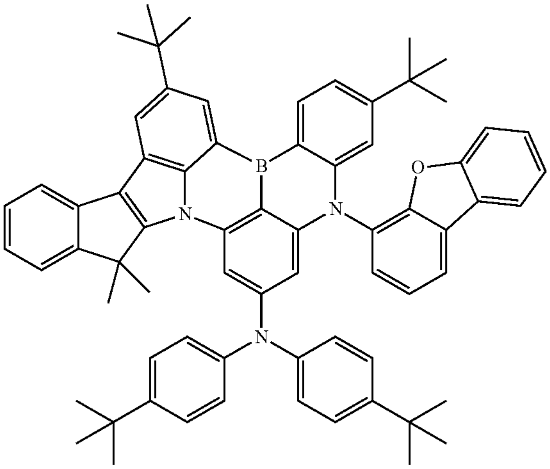

-continued
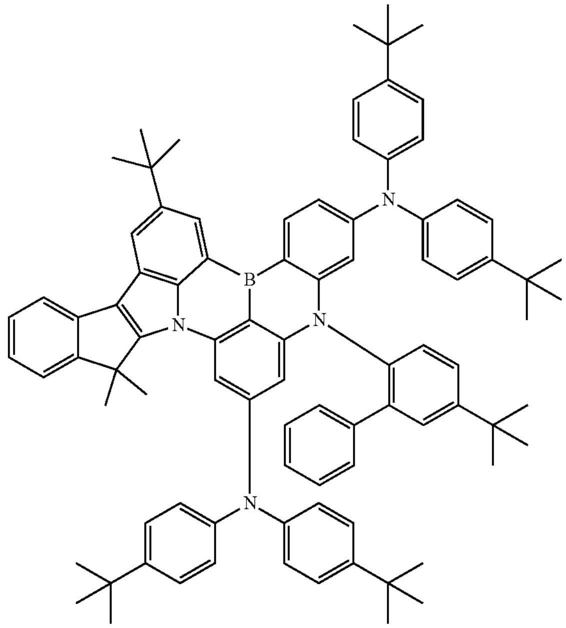
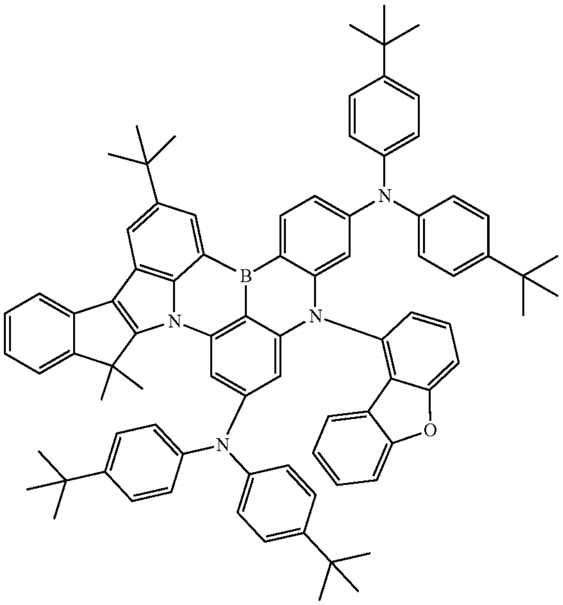
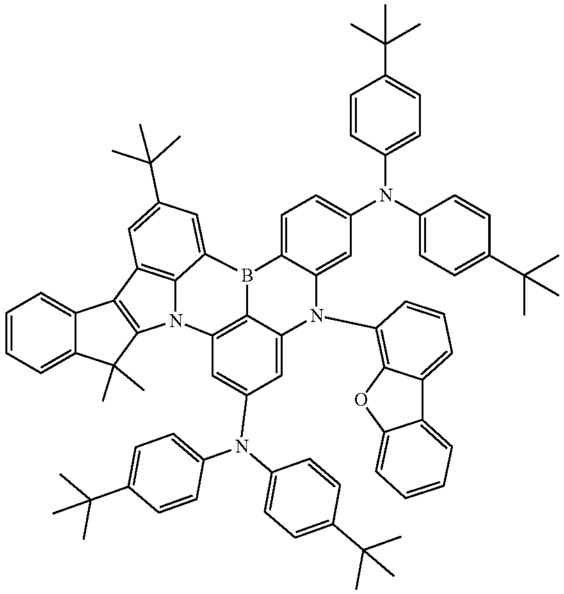
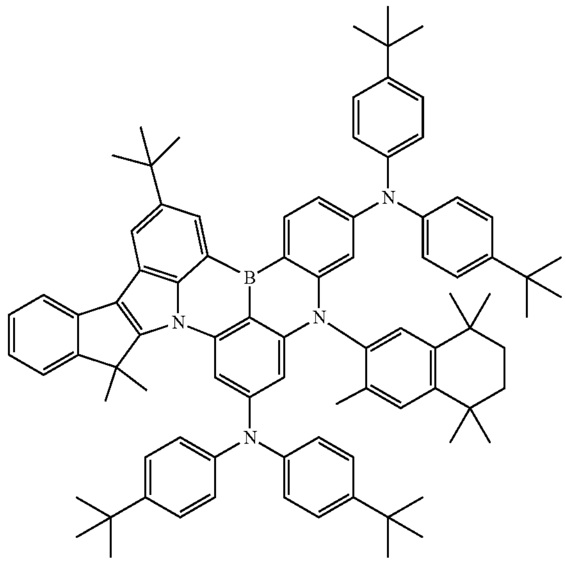
-continued
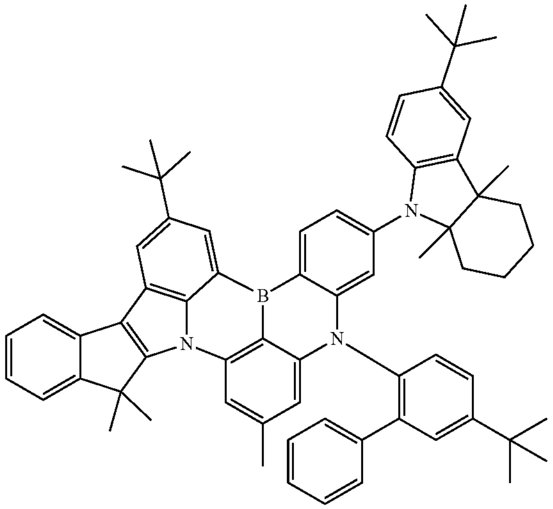

-continued
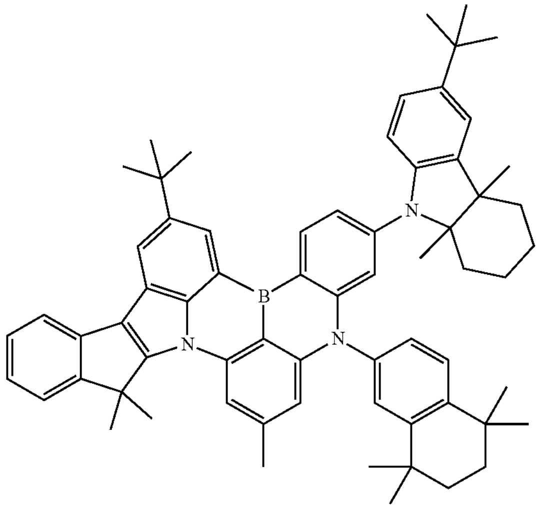
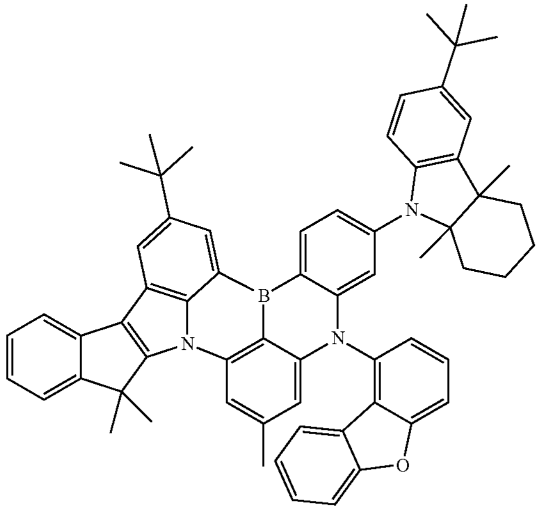
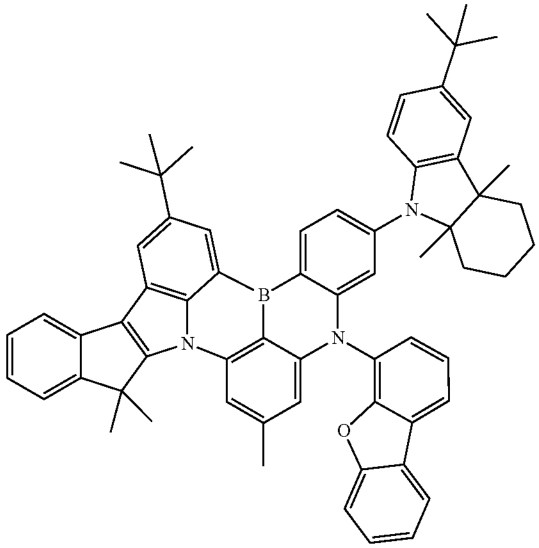
-continued
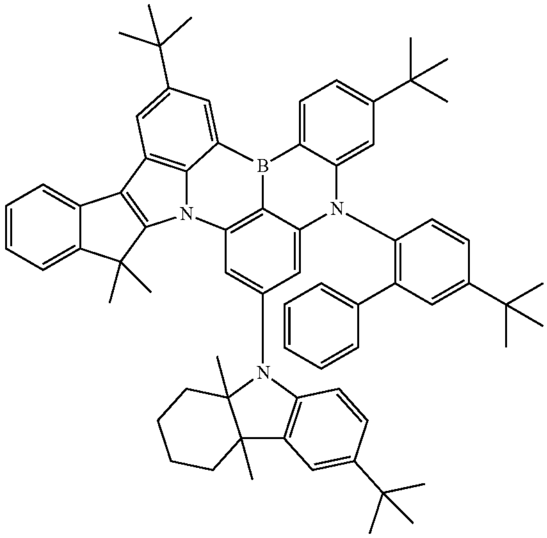
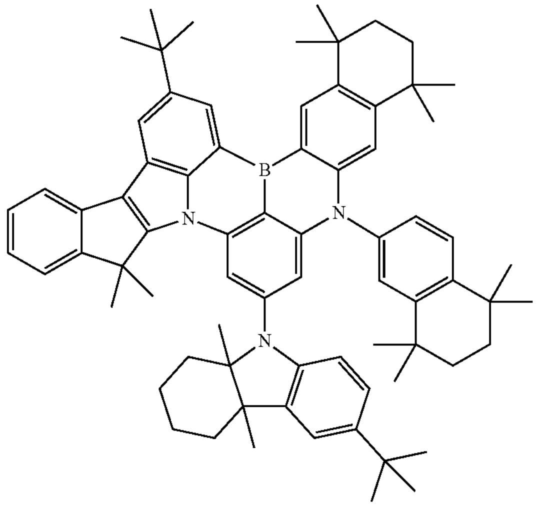
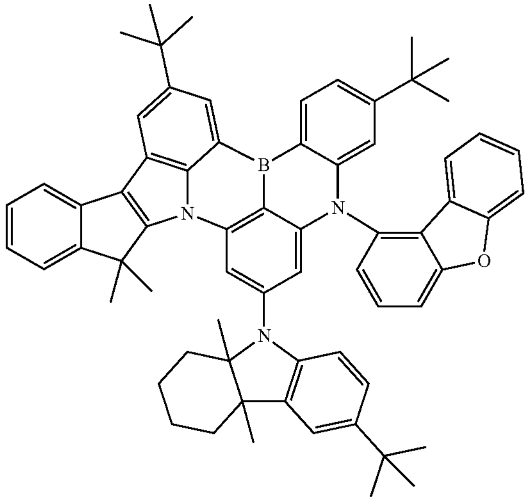

-continued
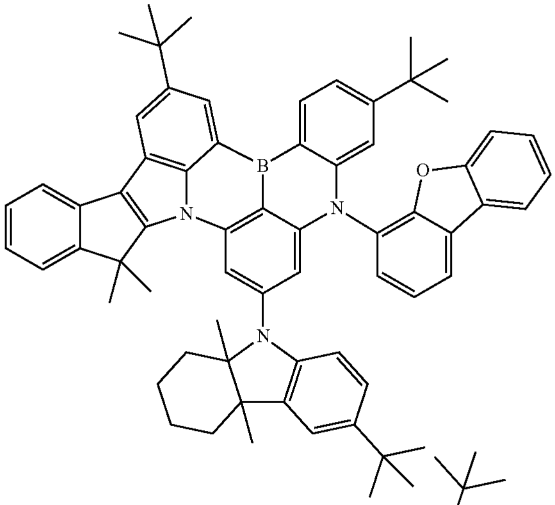
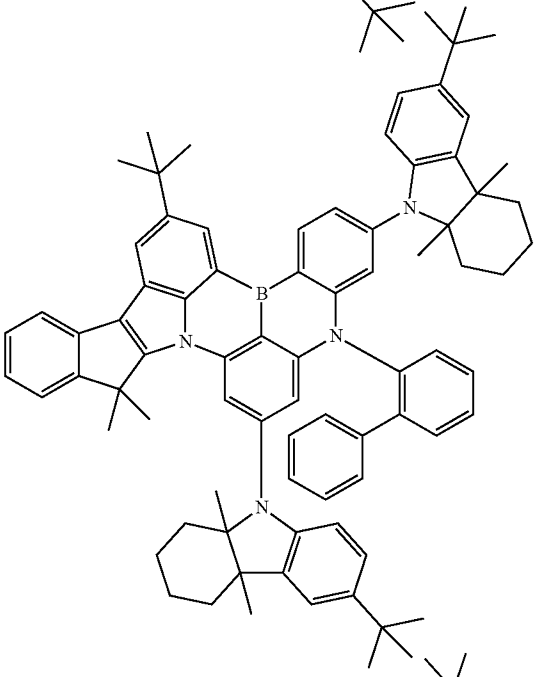
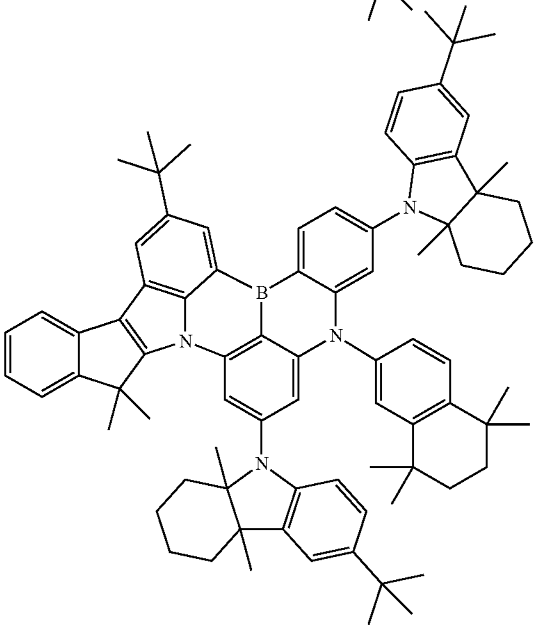
-continued
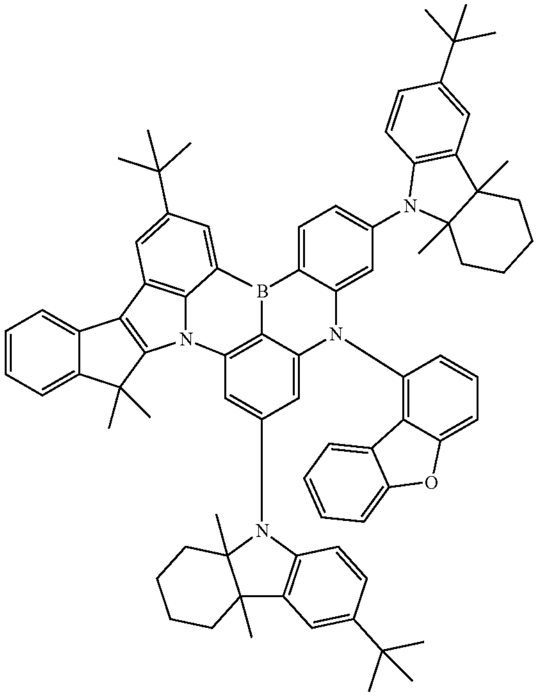
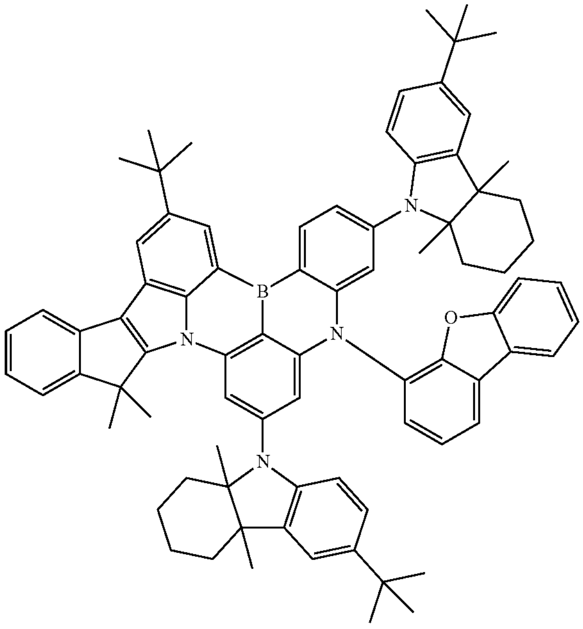
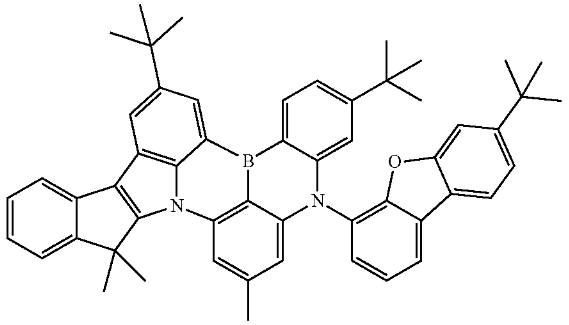

-continued
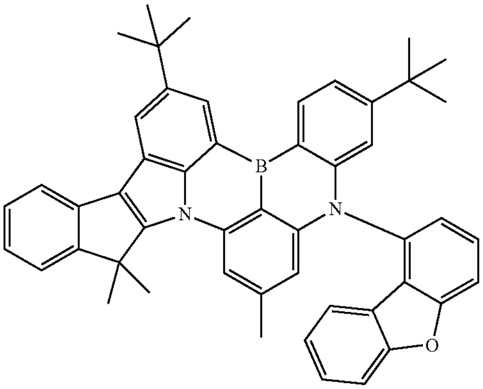
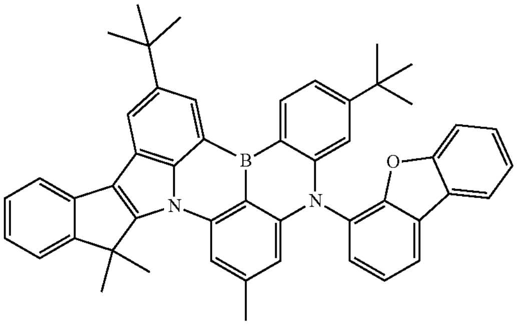
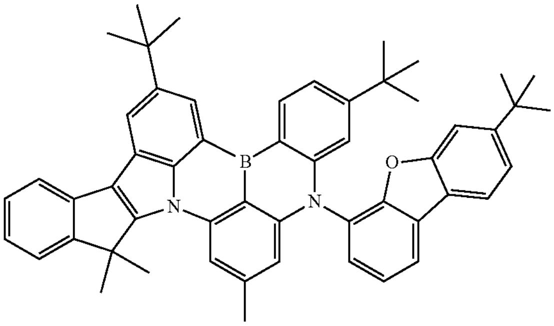
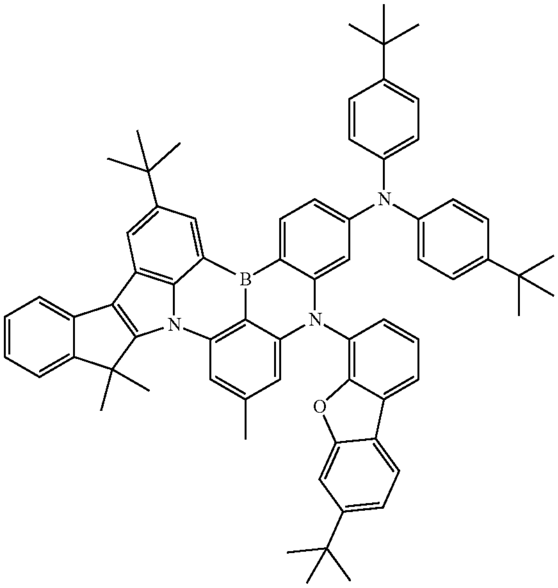
-continued
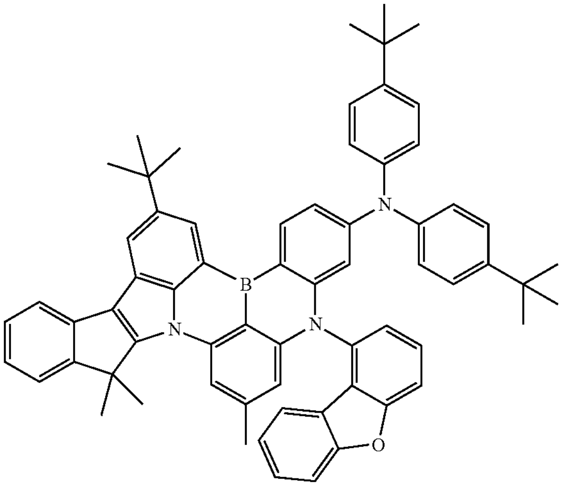
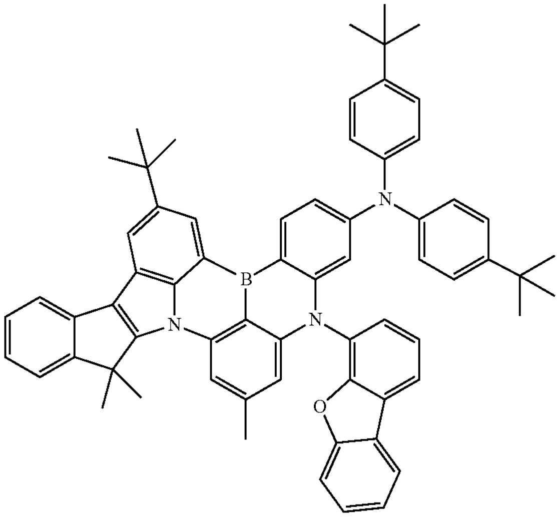
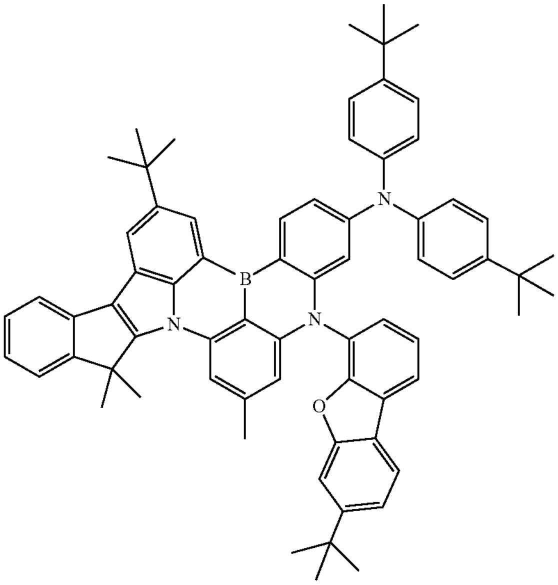

-continued
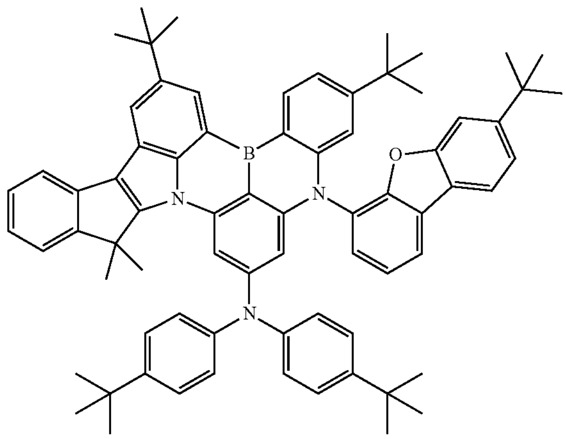
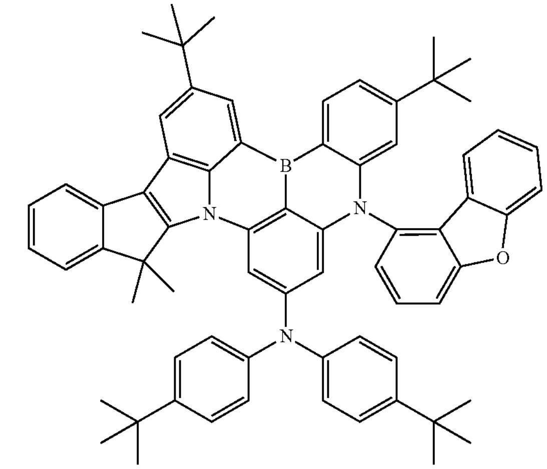
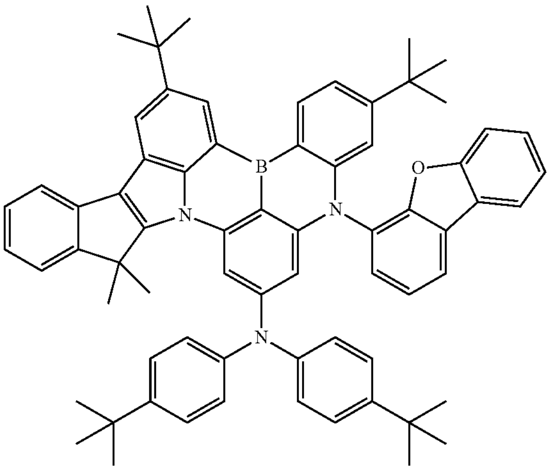
-continued
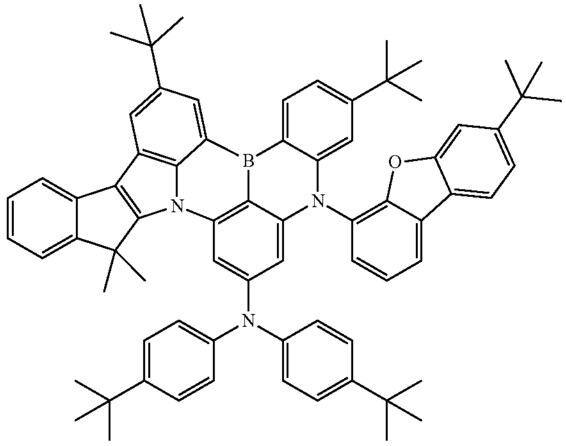
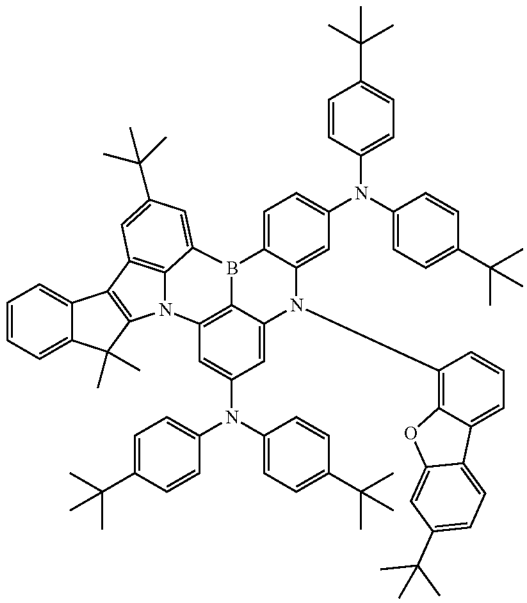
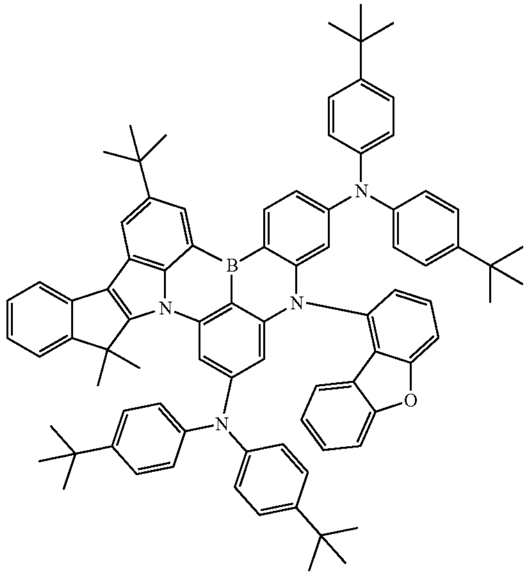

-continued
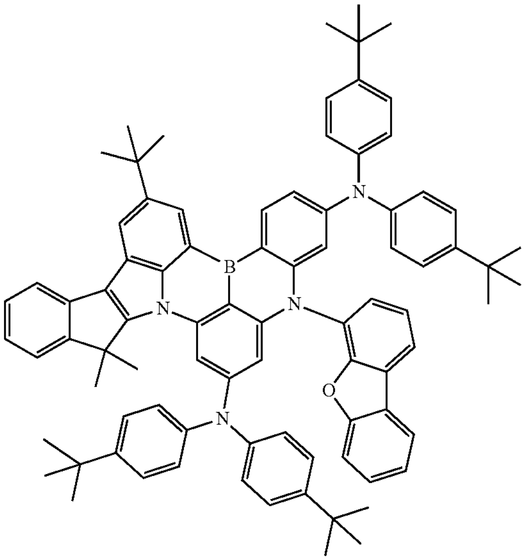
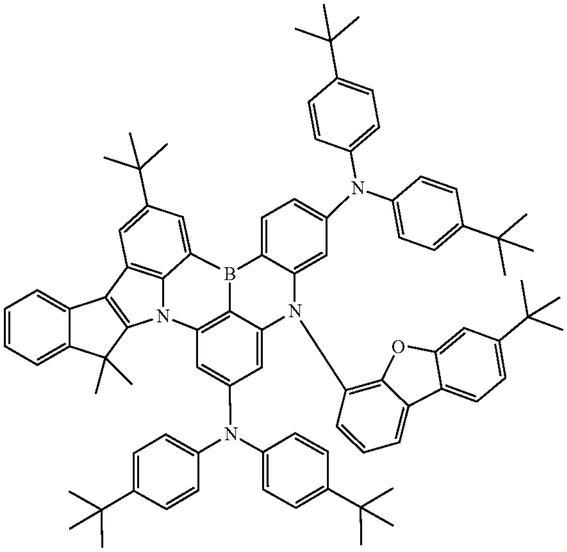
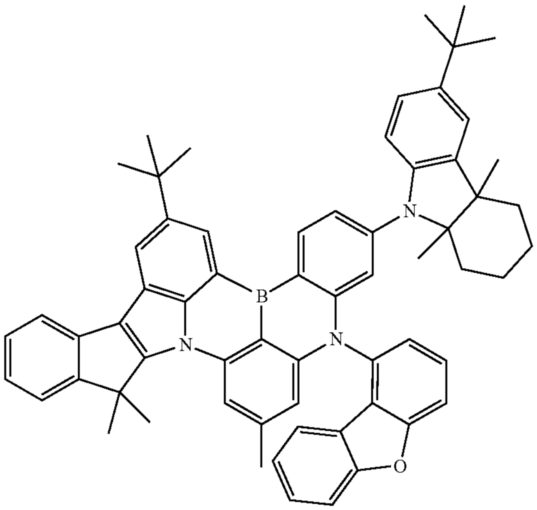
-continued
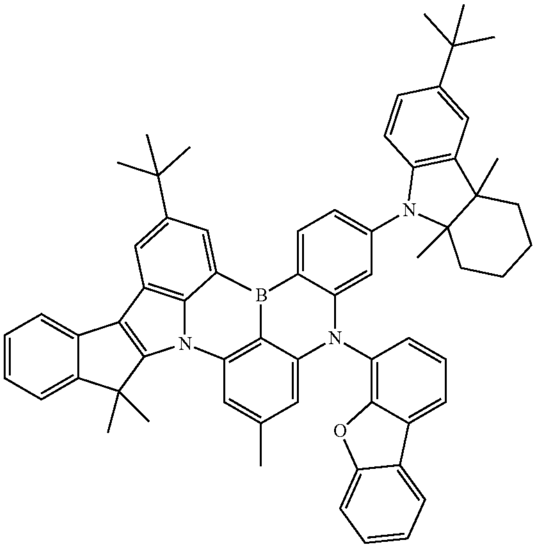
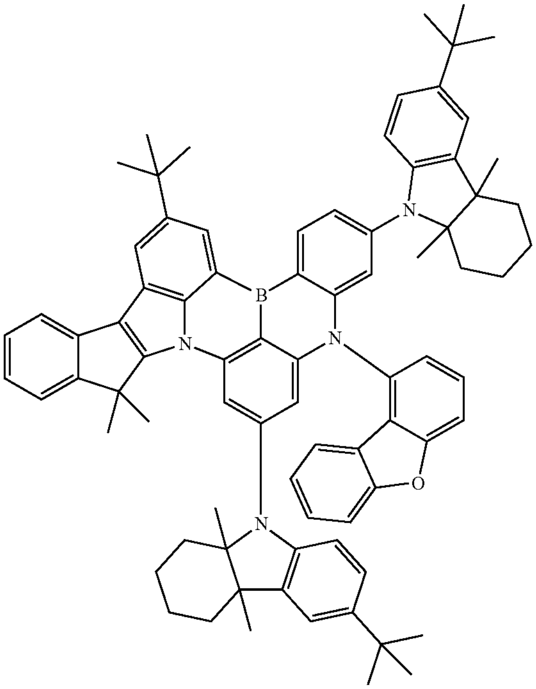

-continued
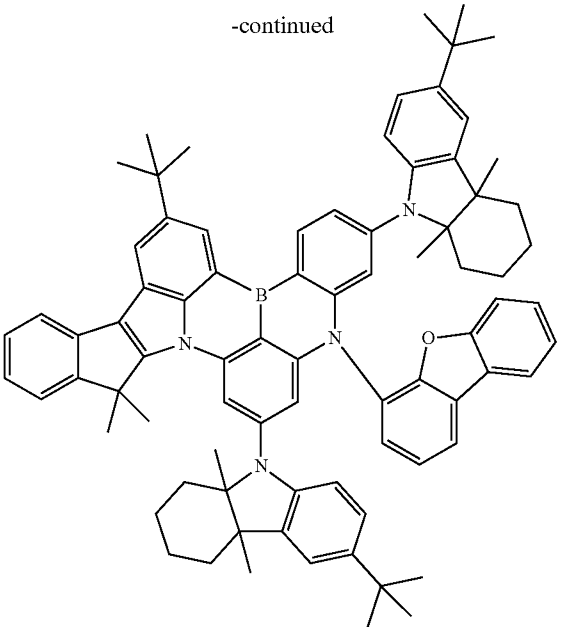
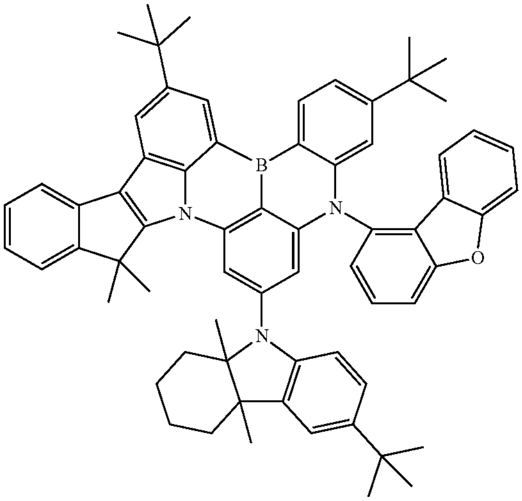
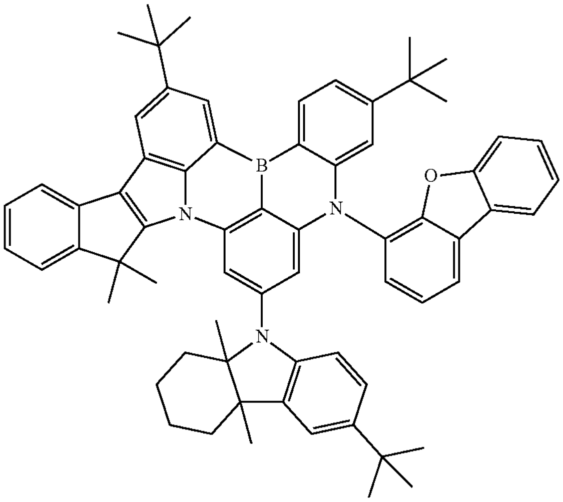
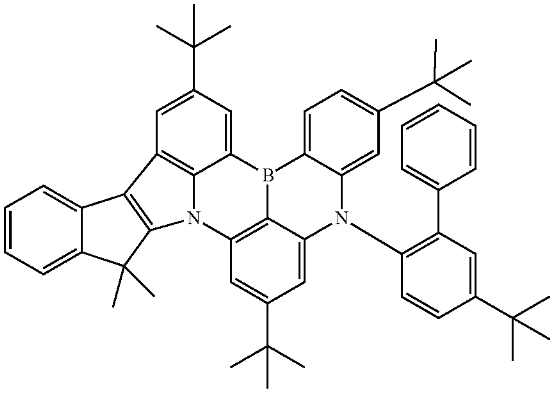
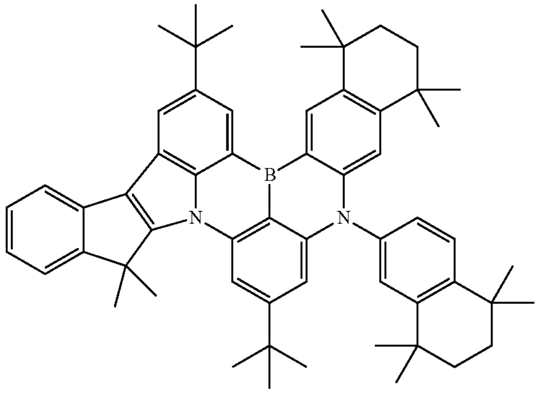
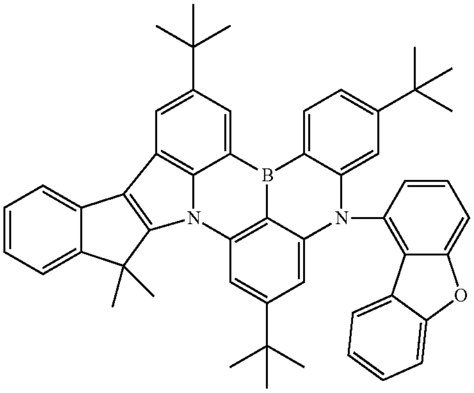
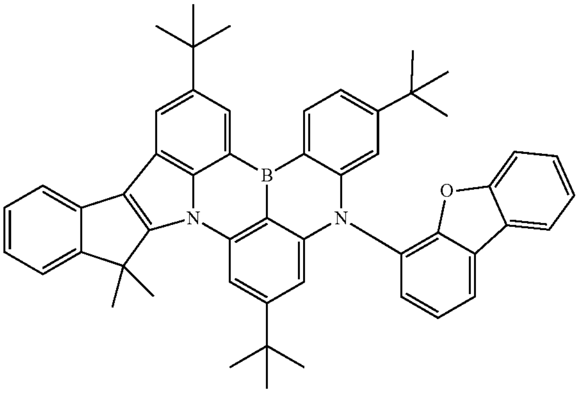

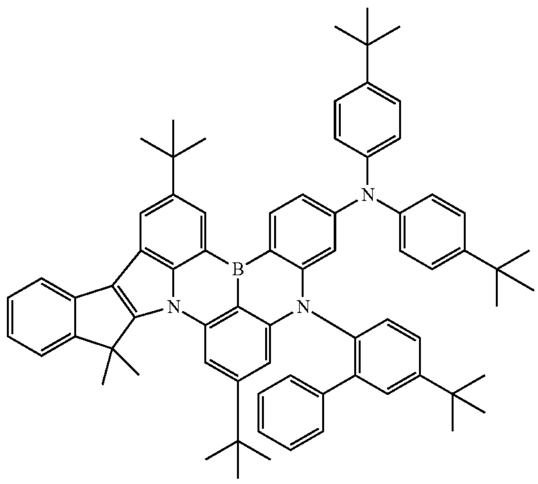
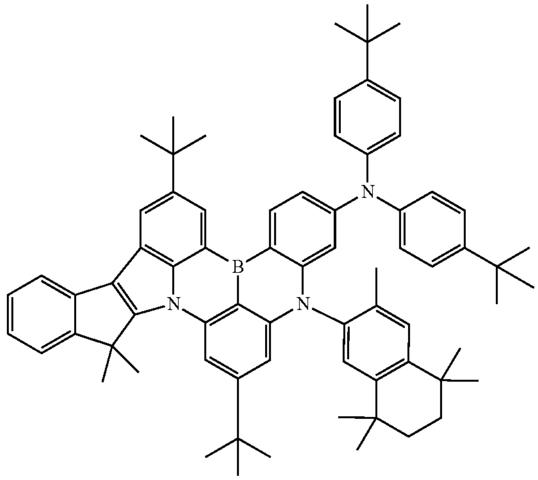
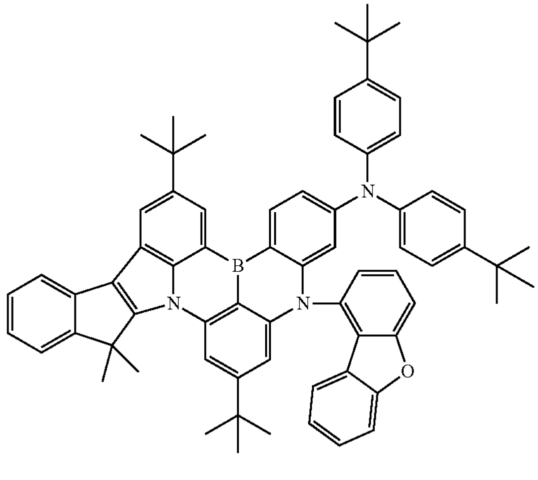
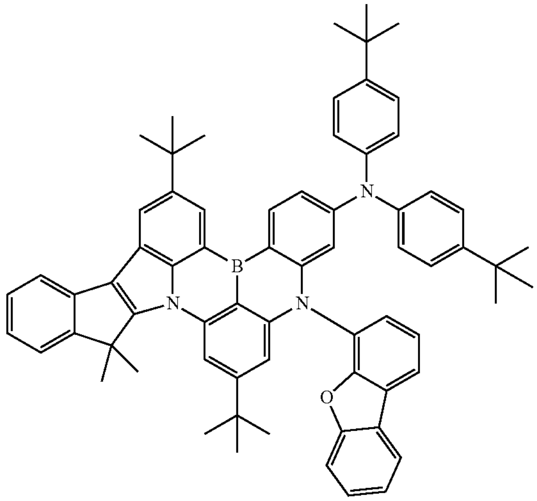
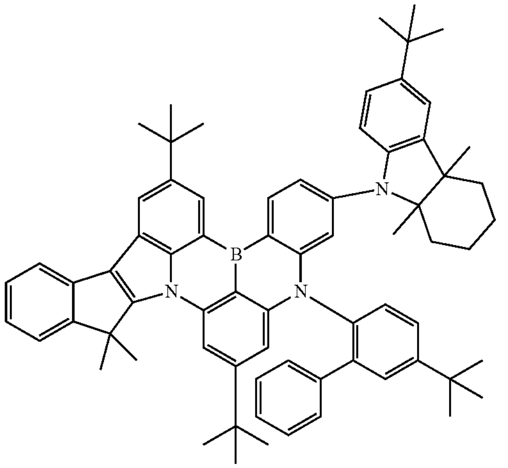
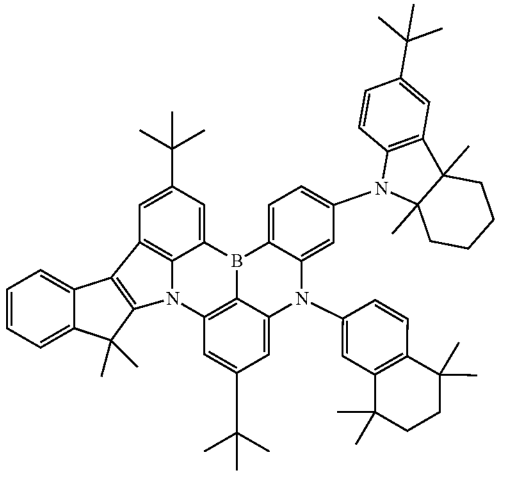

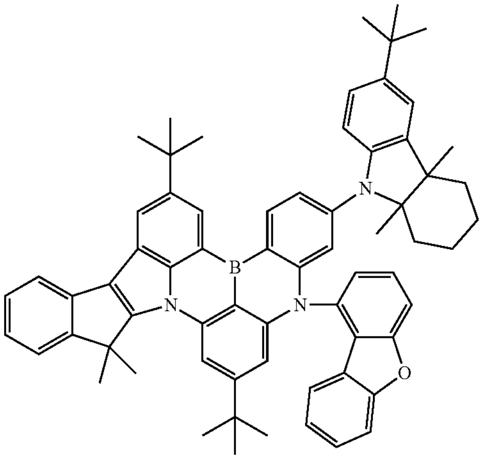
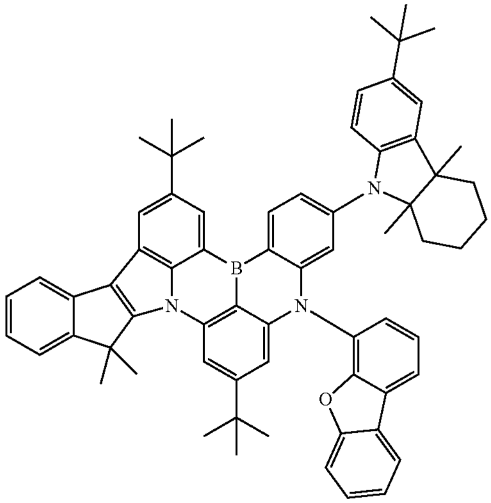
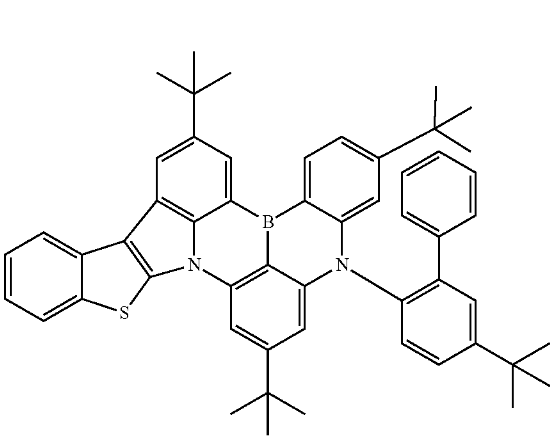
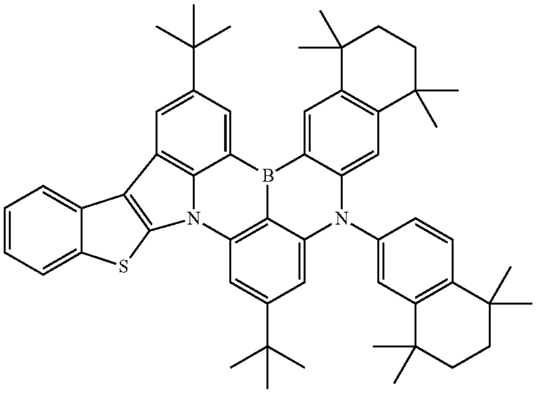
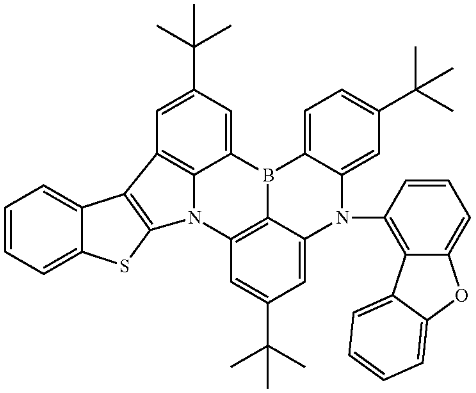
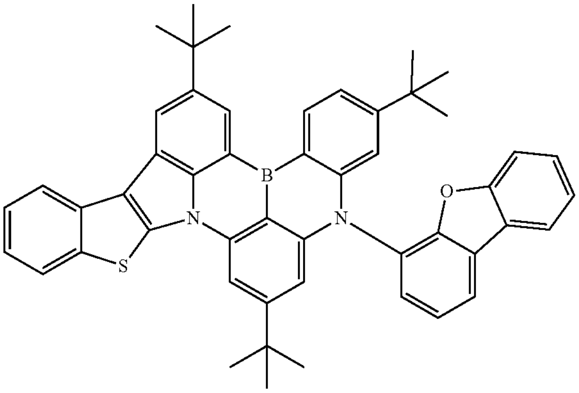
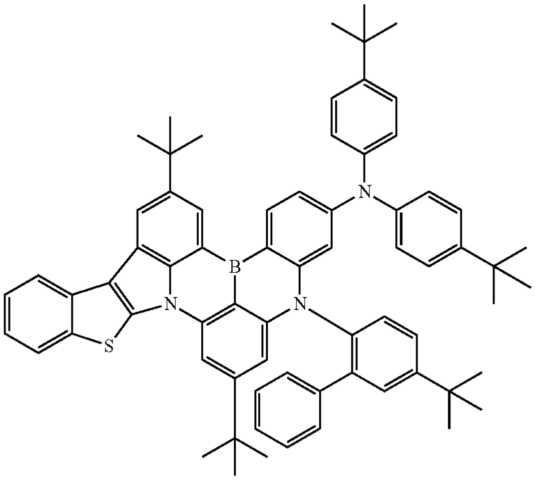

-continued
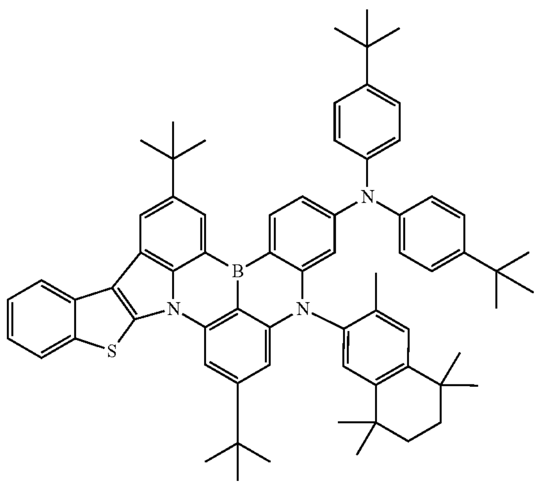
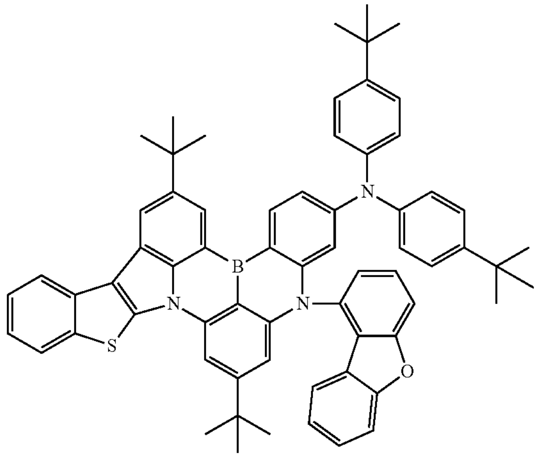
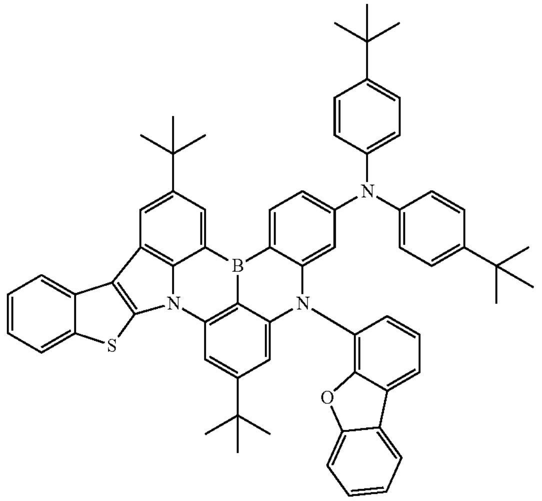
-continued
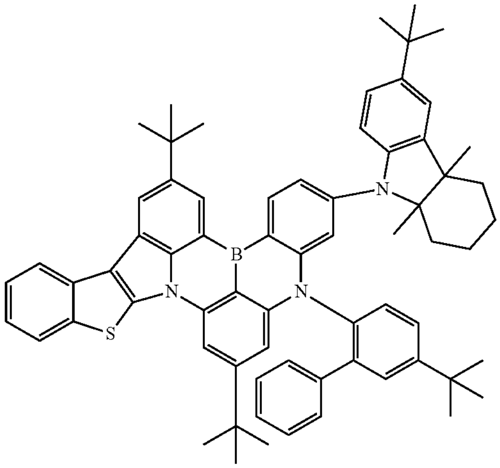
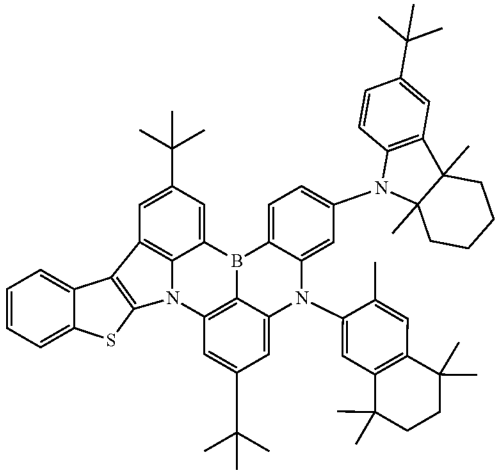
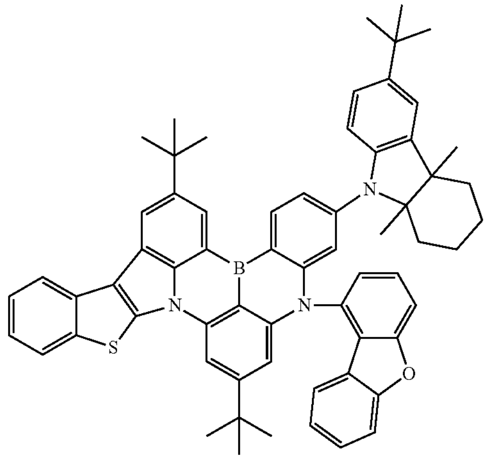

-continued
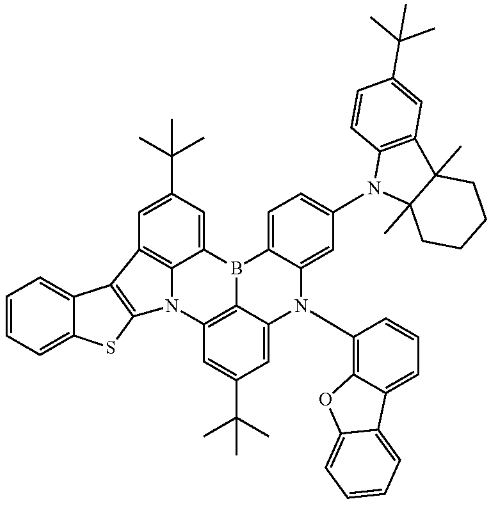
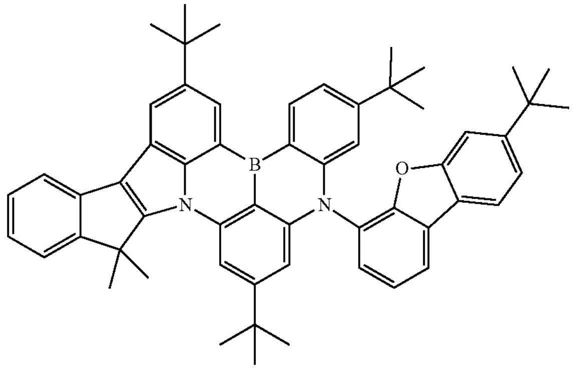
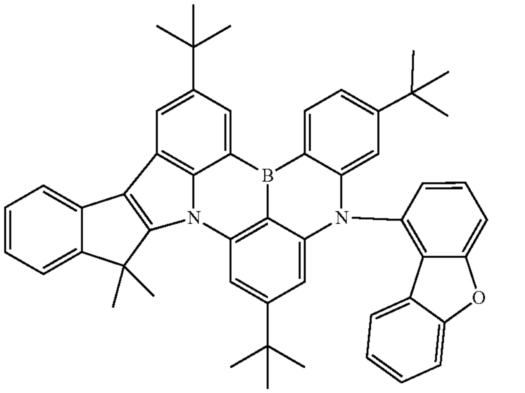
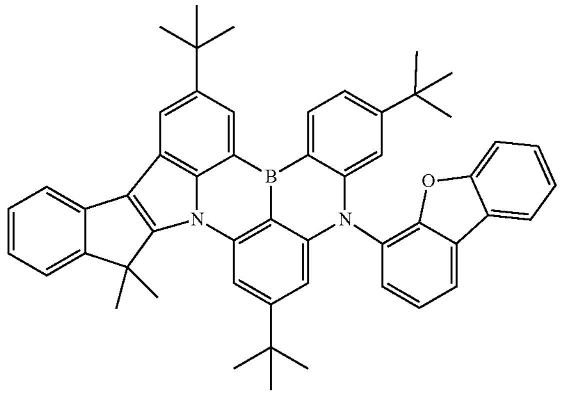
-continued
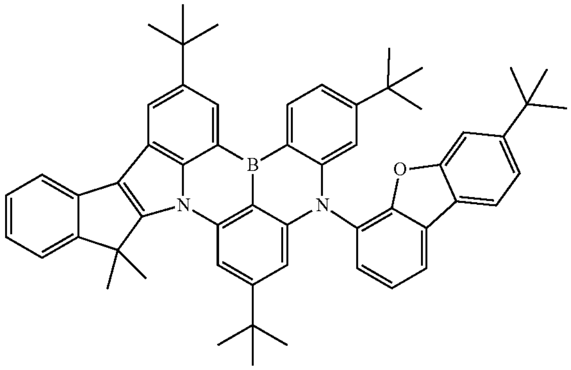
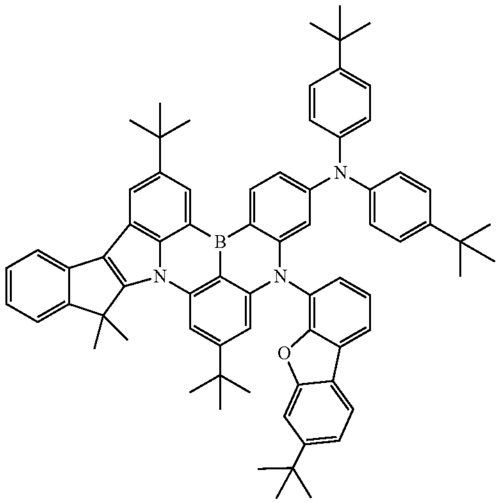
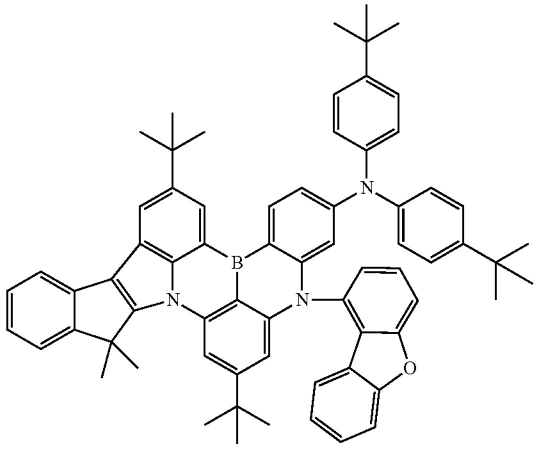

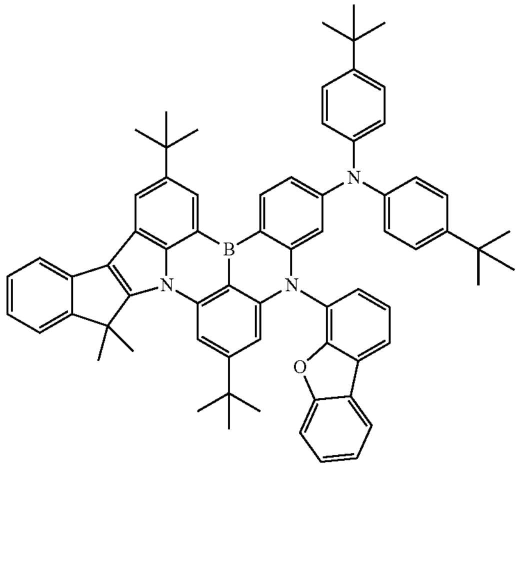
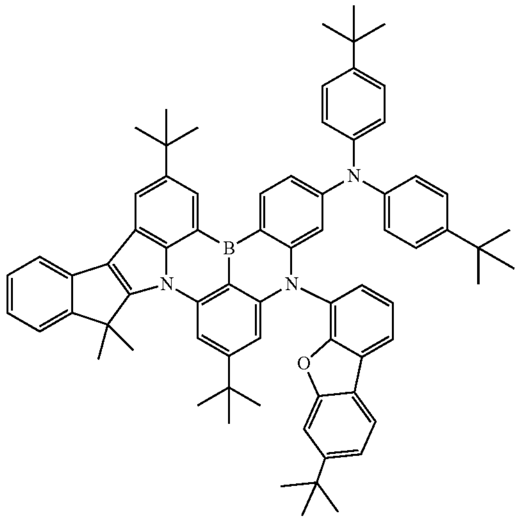
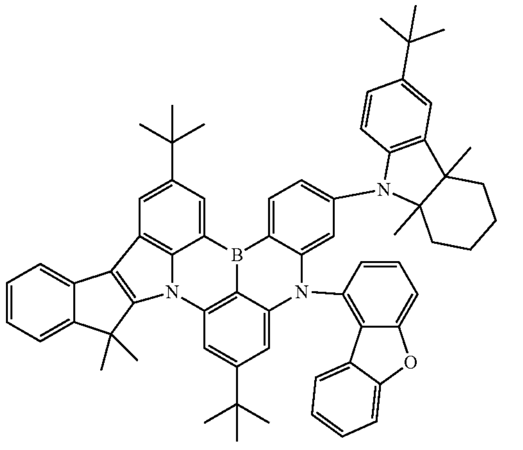
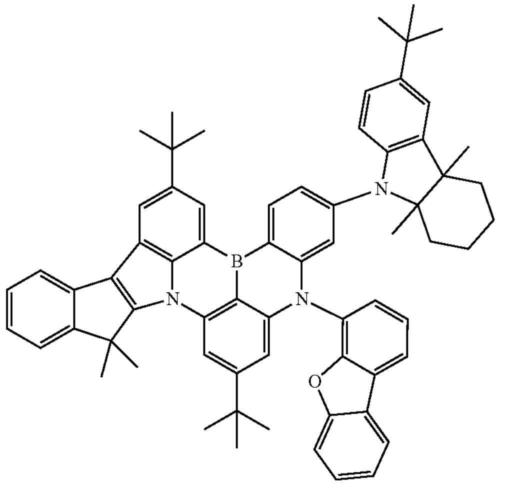
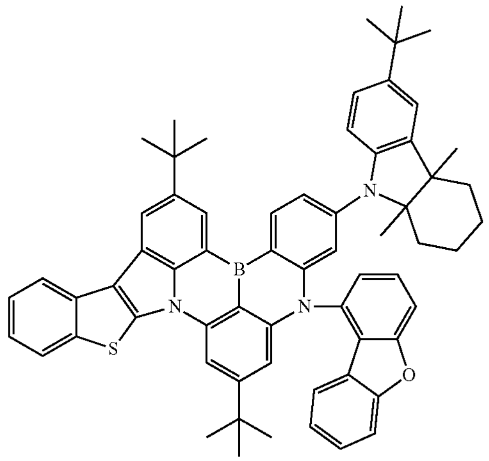
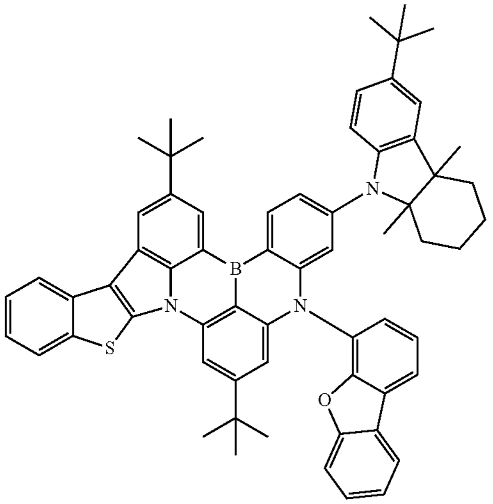

-continued
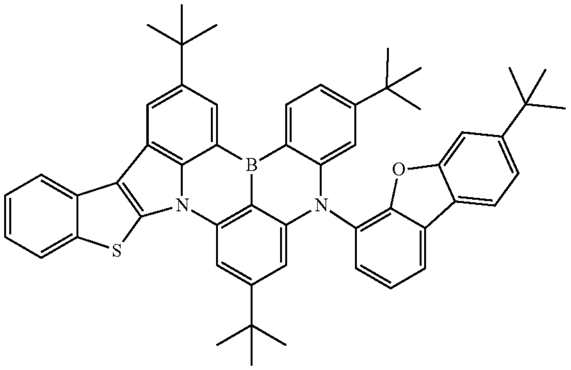
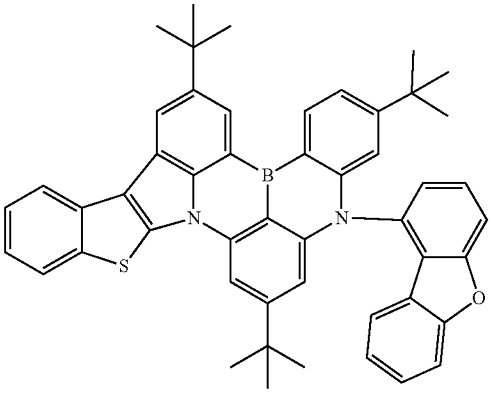
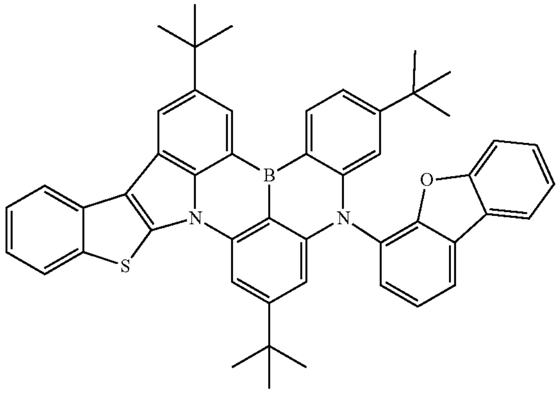
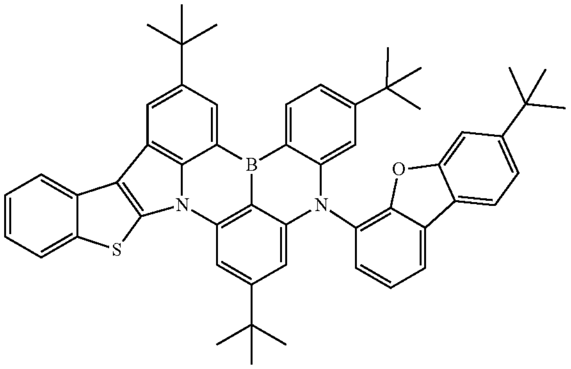
-continued
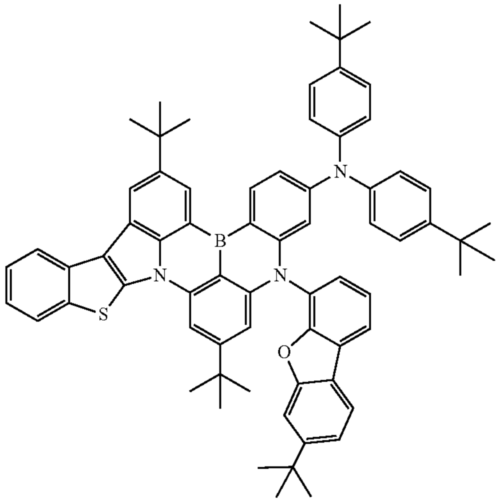
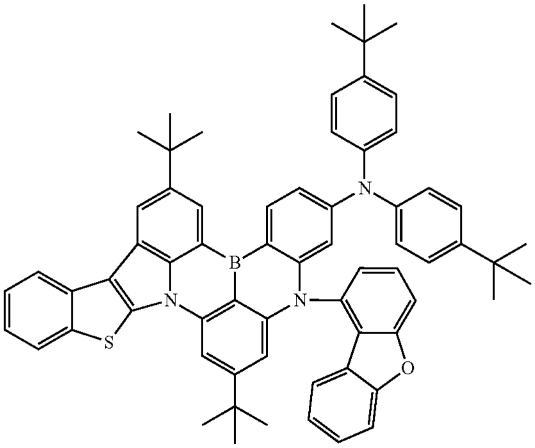
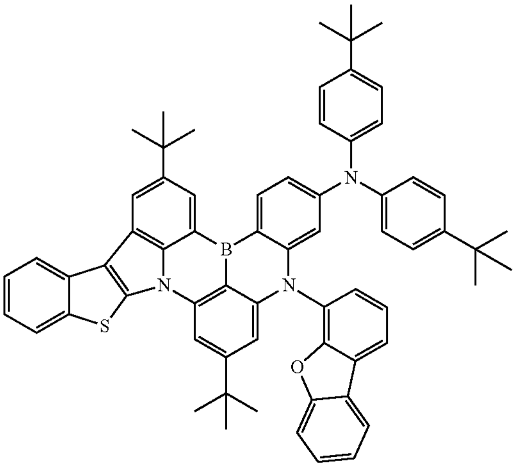

-continued
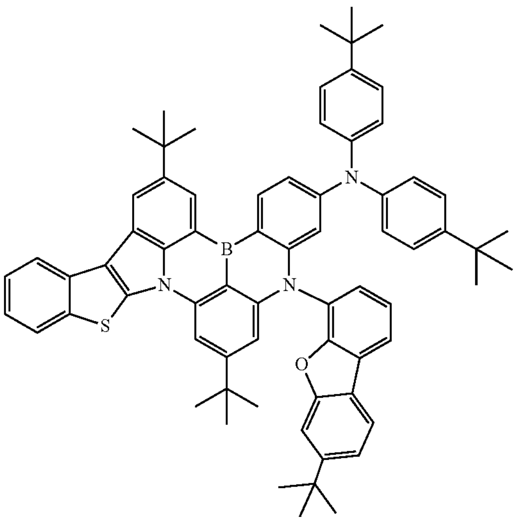
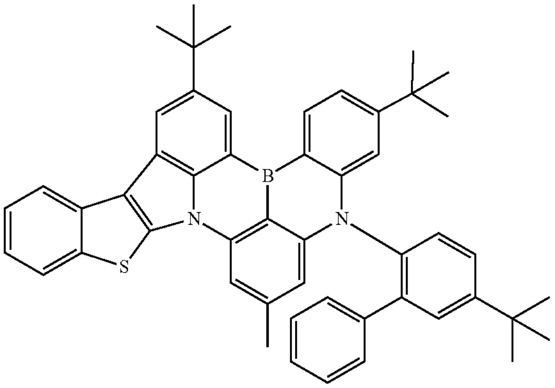
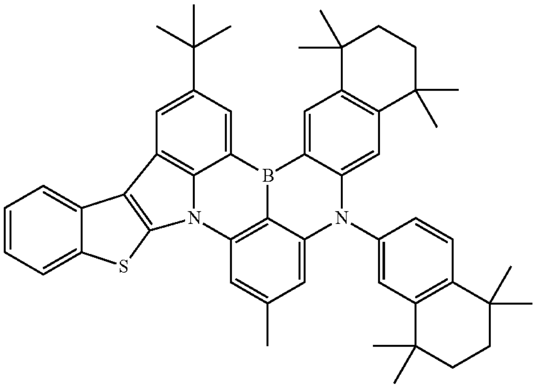
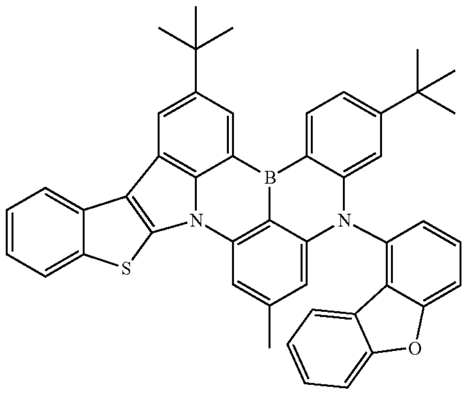
-continued
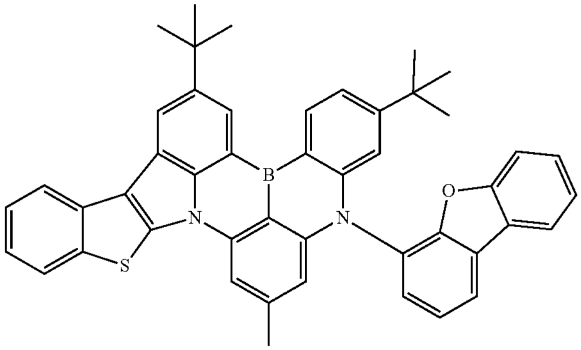
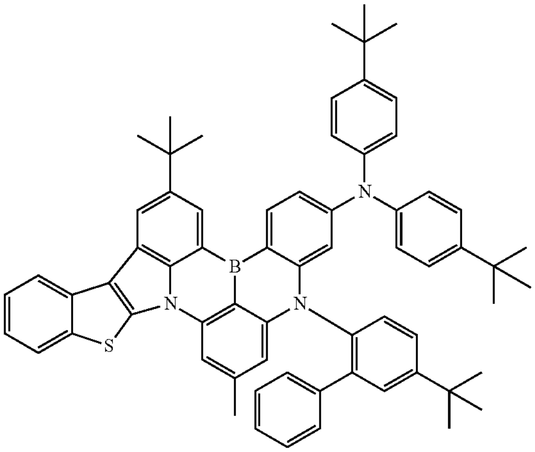
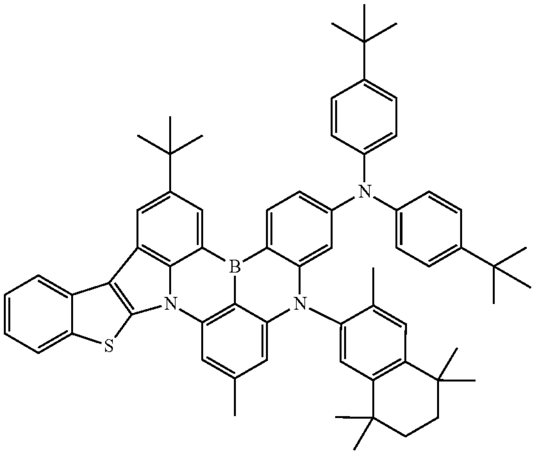
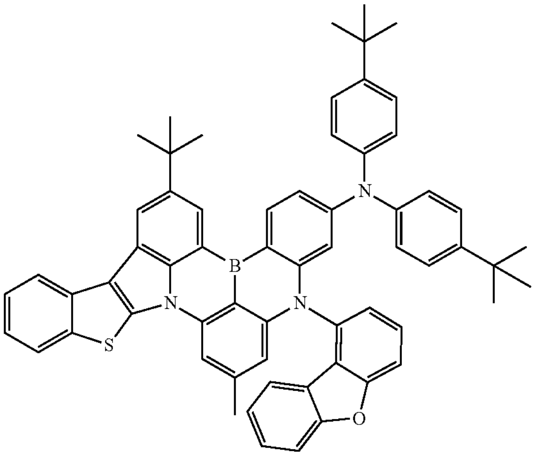

-continued
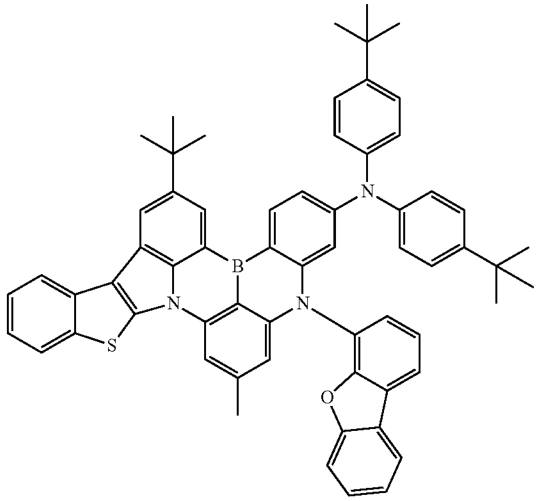
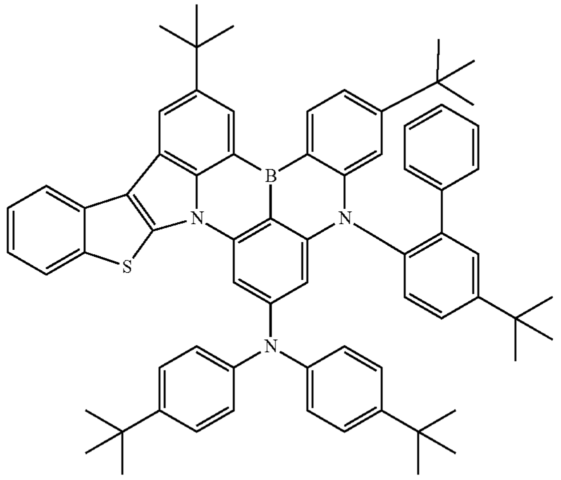
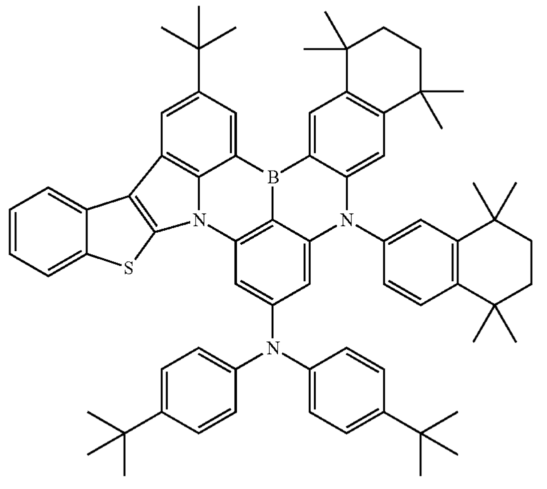
-continued
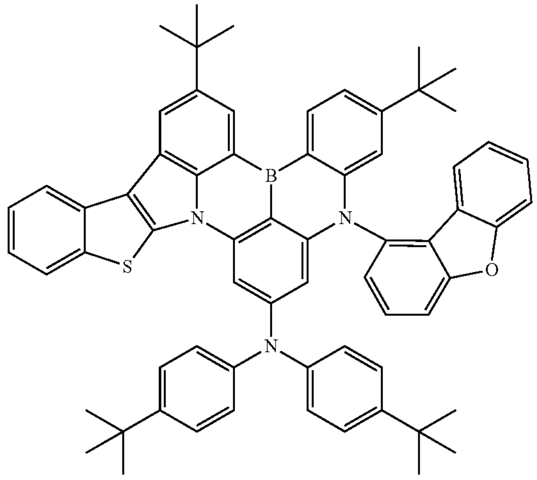
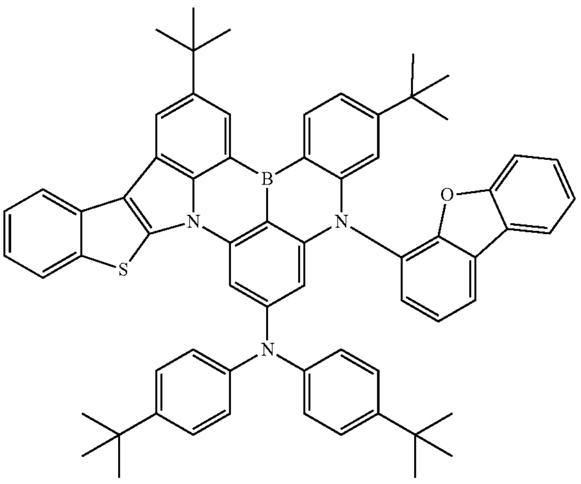
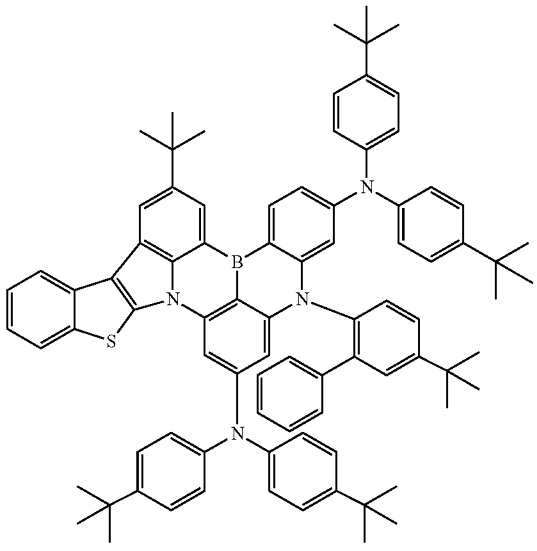

-continued
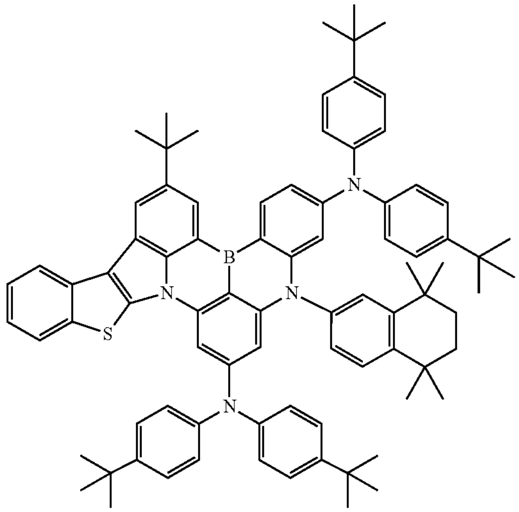
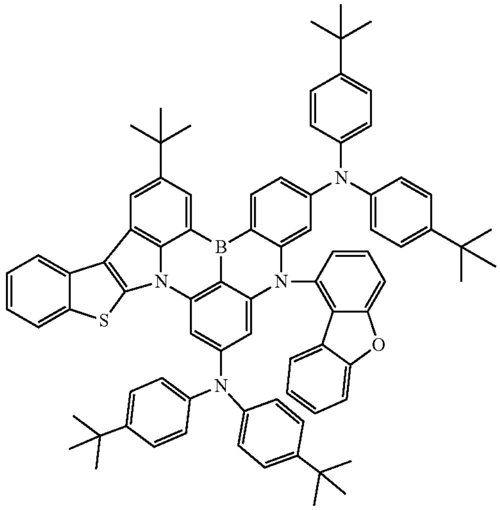
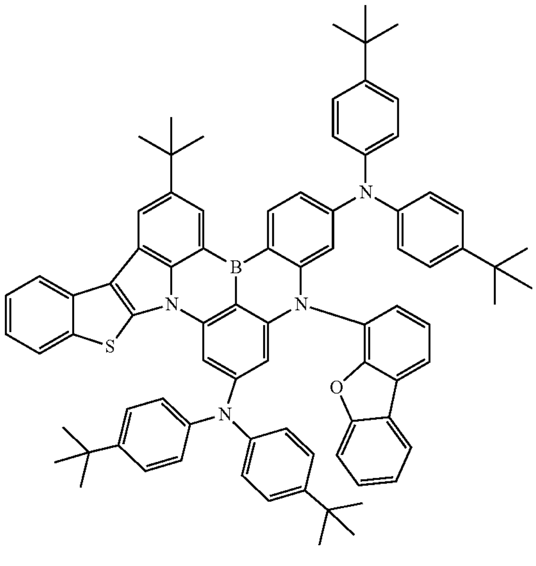 [SMILES: CC(C)(C)c1ccc(N(c2ccc(C(C)(C)C)cc2)c2ccc3c(c2)N(c2cccc4c2oc2ccccc24)c2cc(N(c4ccc(C(C)(C)C)cc4)c4ccc(C(C)(C)C)cc4)cc4c2B3c2cc(C(C)(C)C)cc3c5c6ccccc6sc5n-4c23)cc1]
-continued
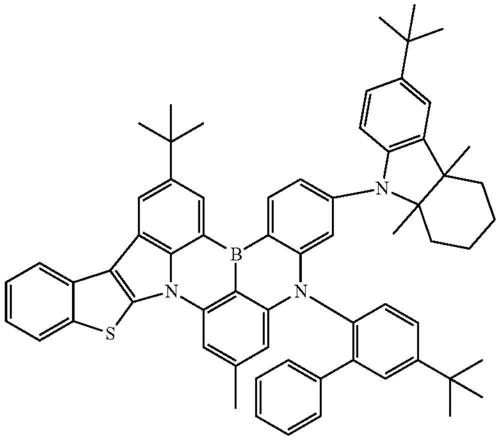
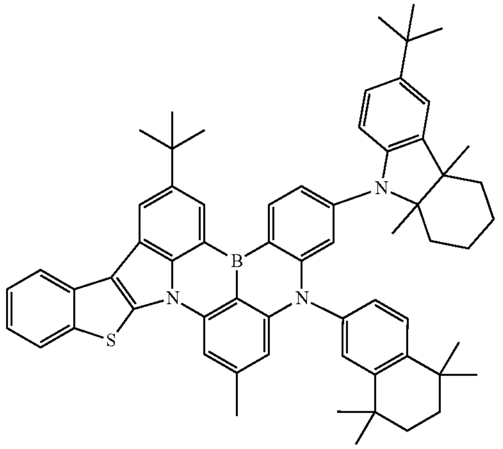
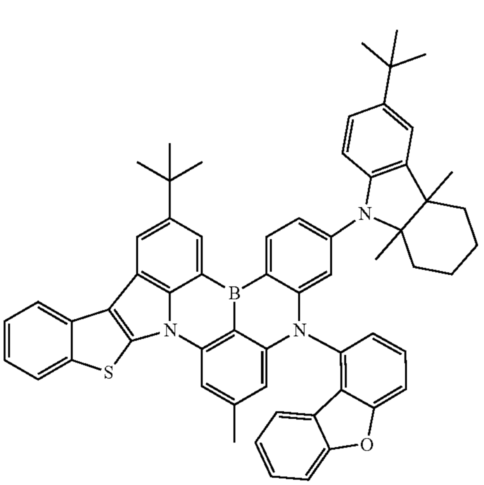

-continued
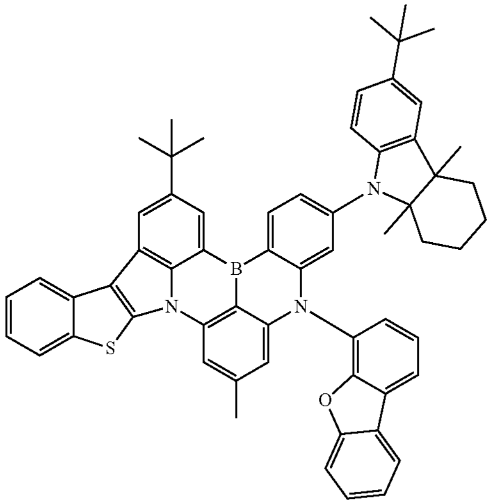
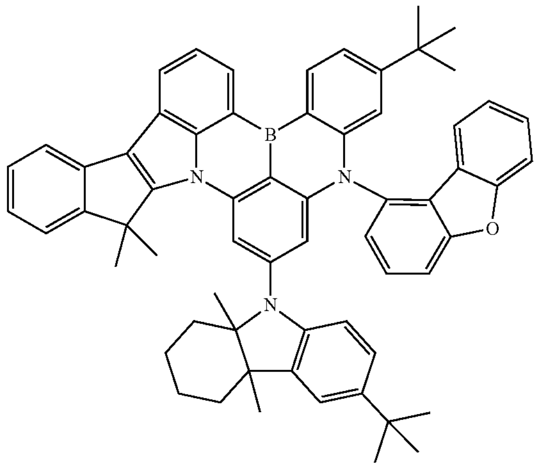
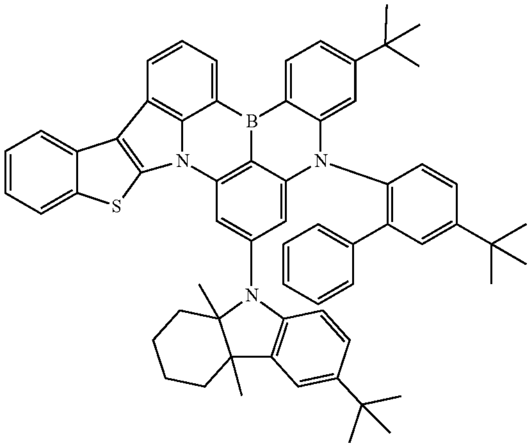
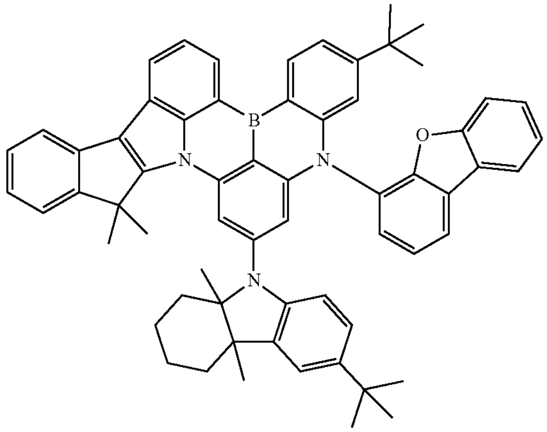
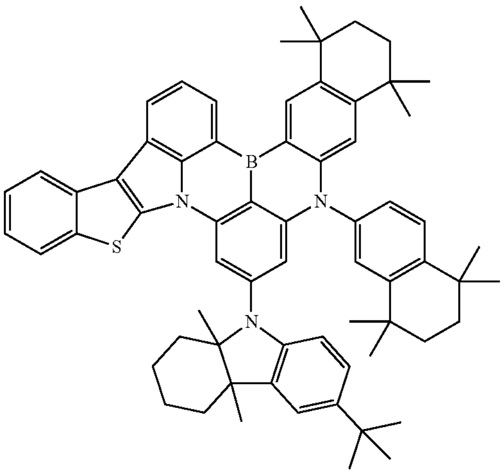
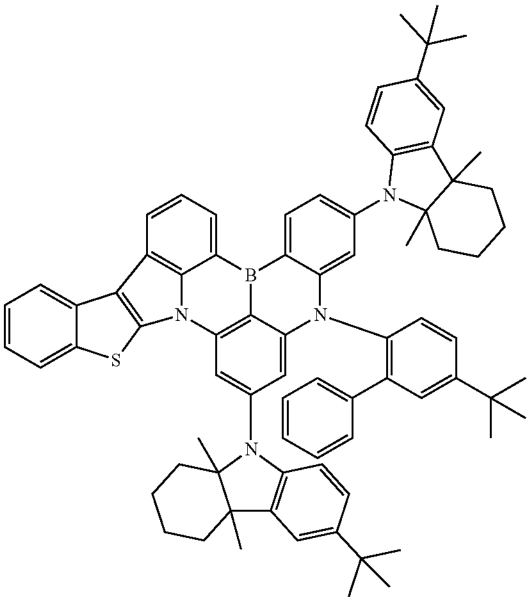
-continued -continued
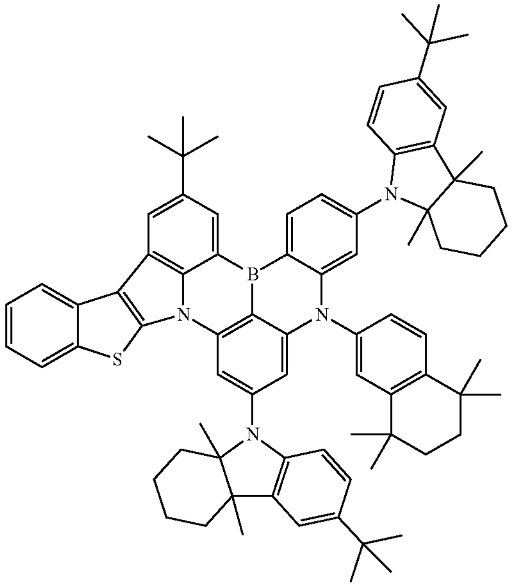
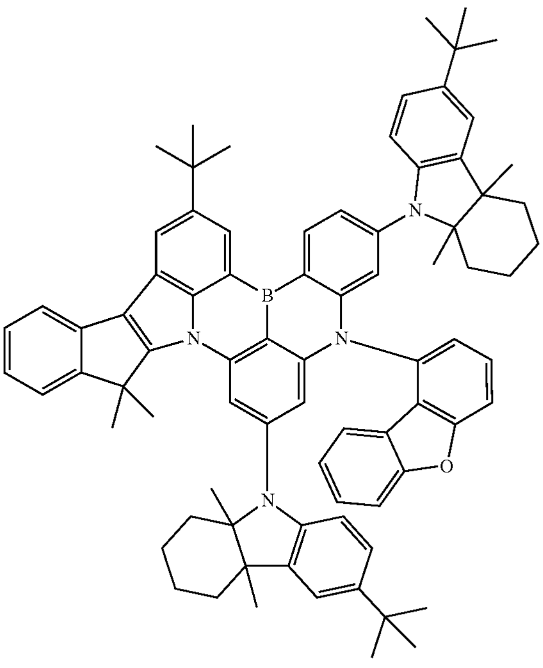
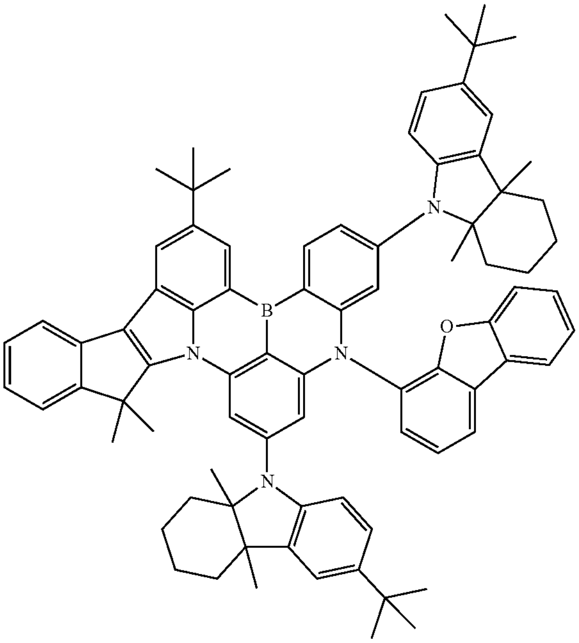
-continued
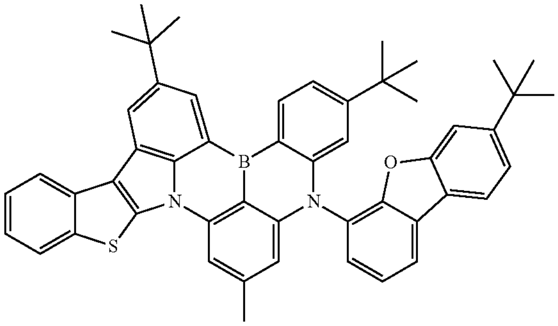
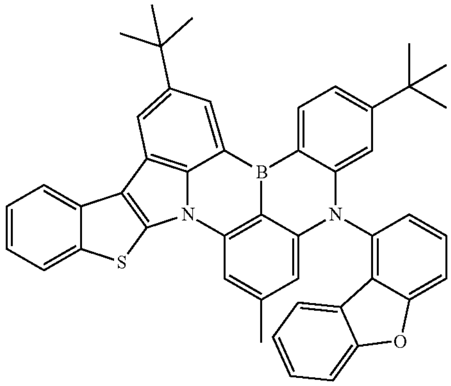

-continued
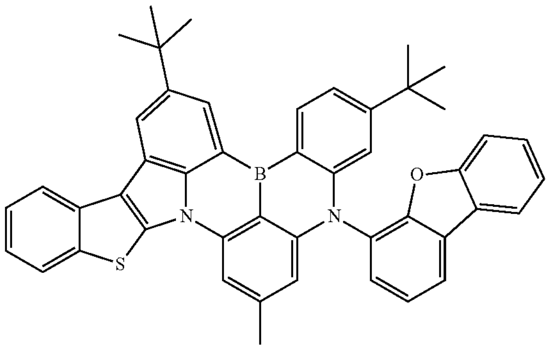
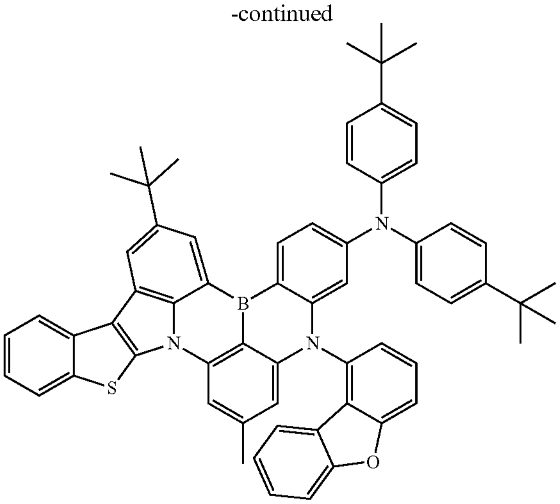
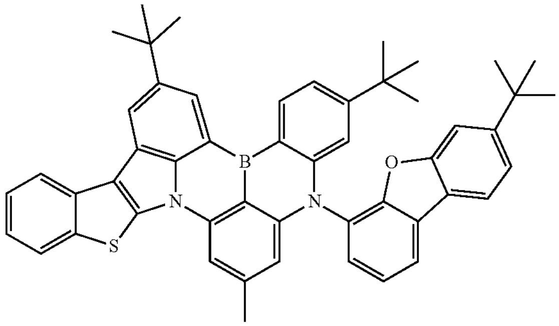
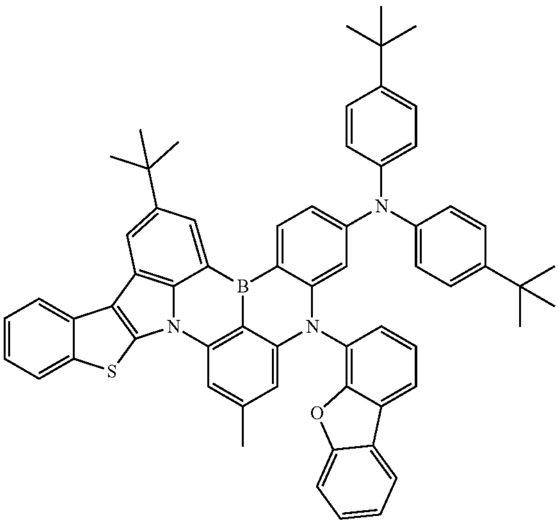
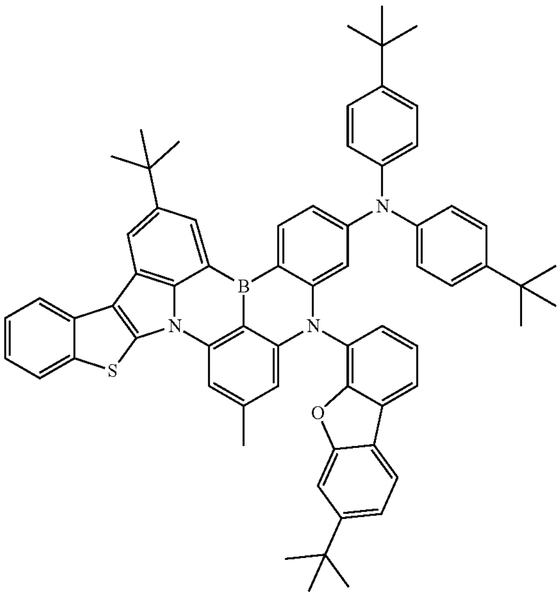
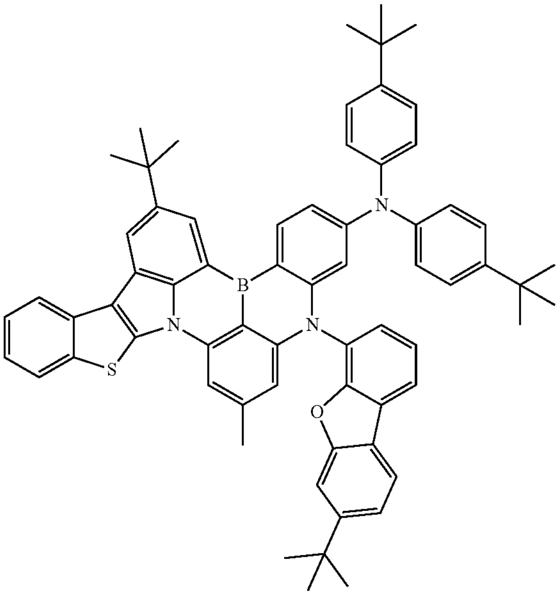
-continued -continued
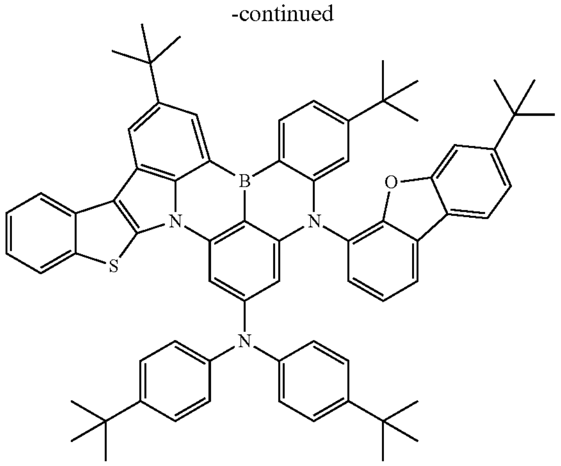
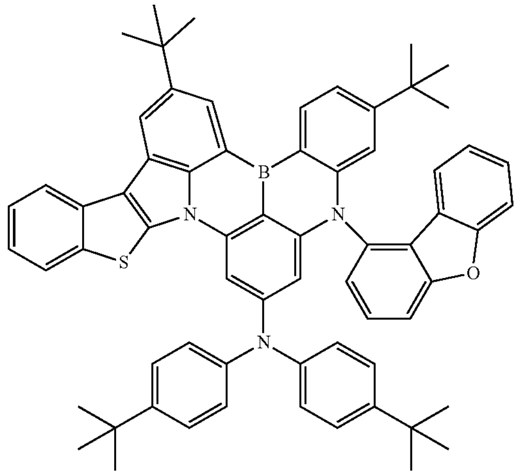
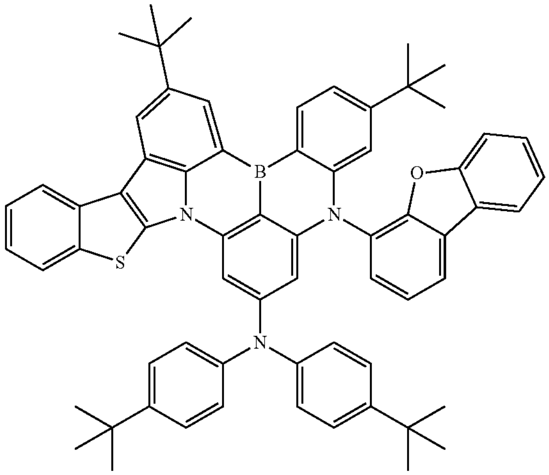
-continued
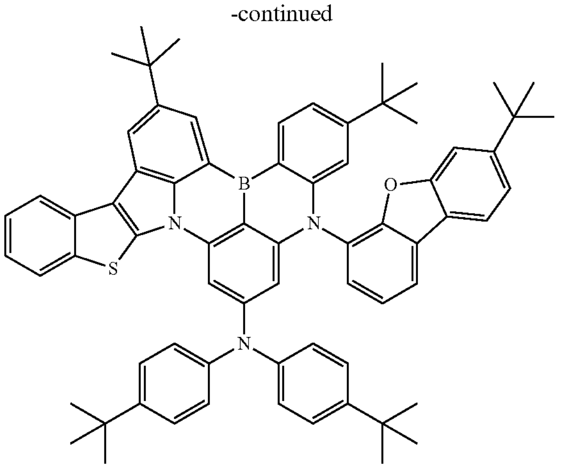
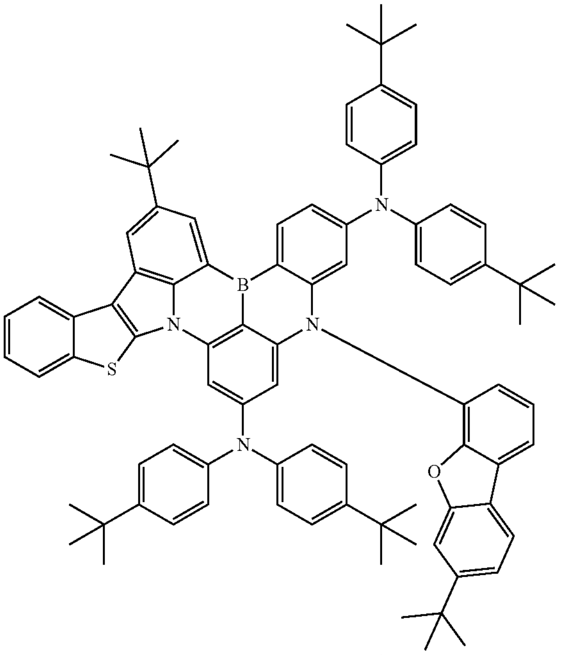
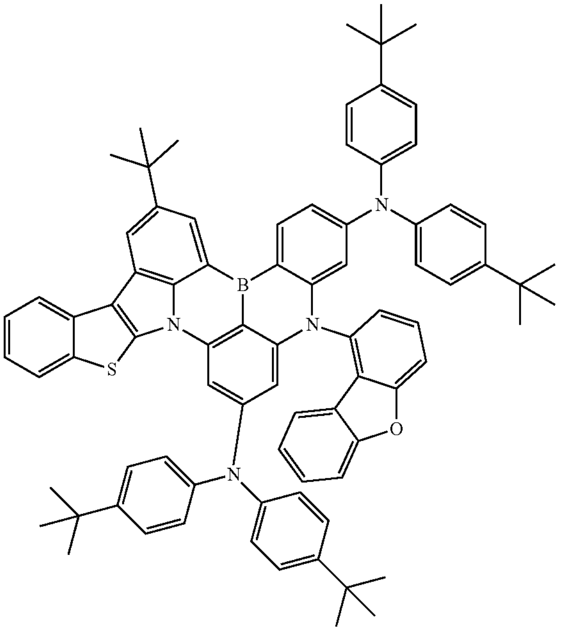

-continued
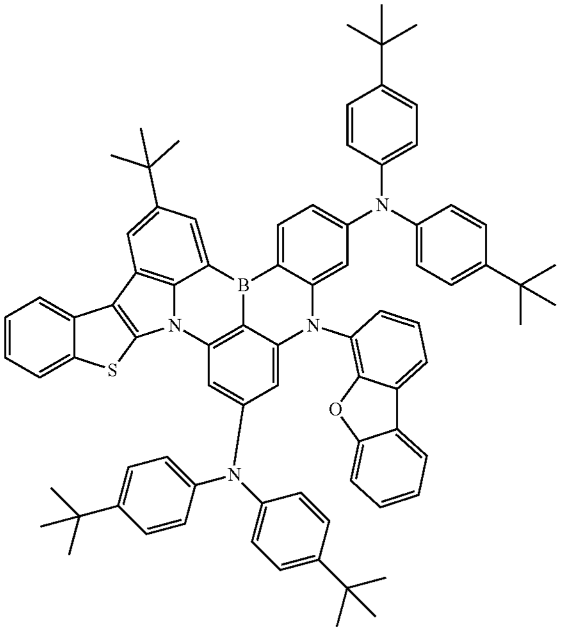
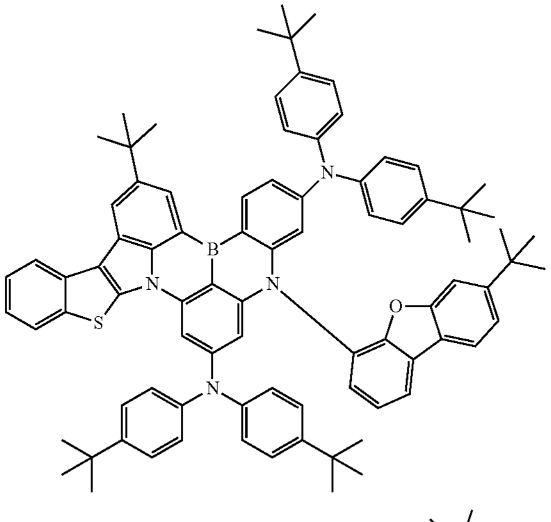
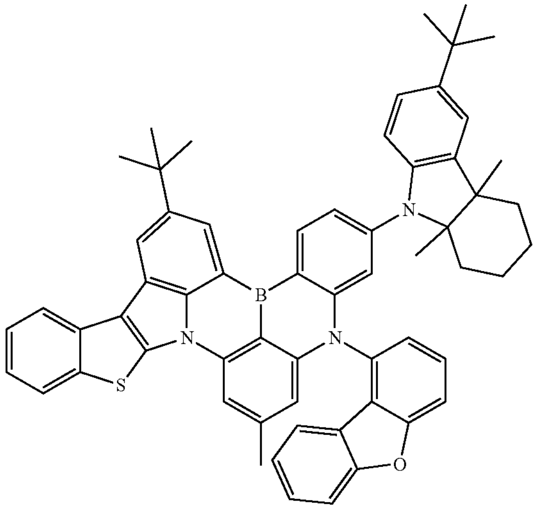
-continued
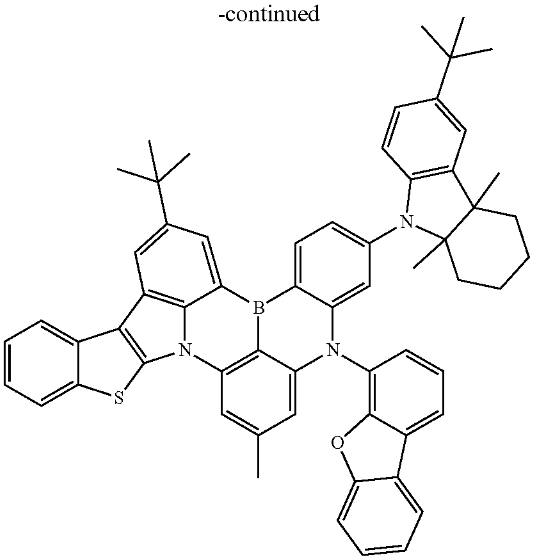
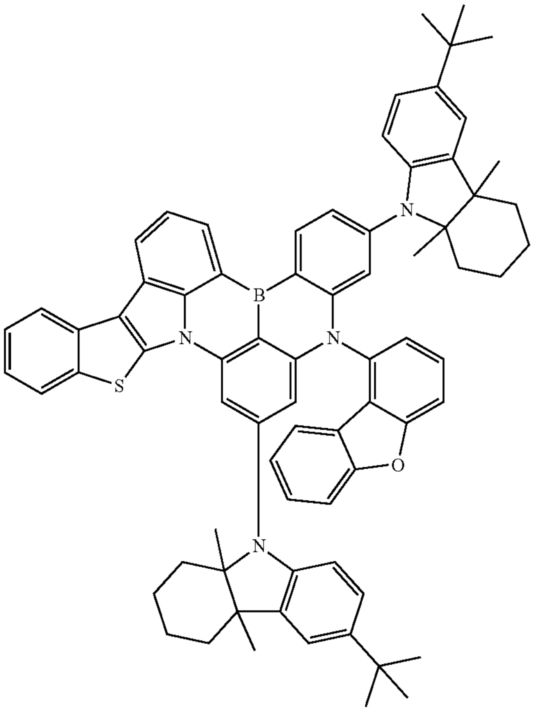

-continued
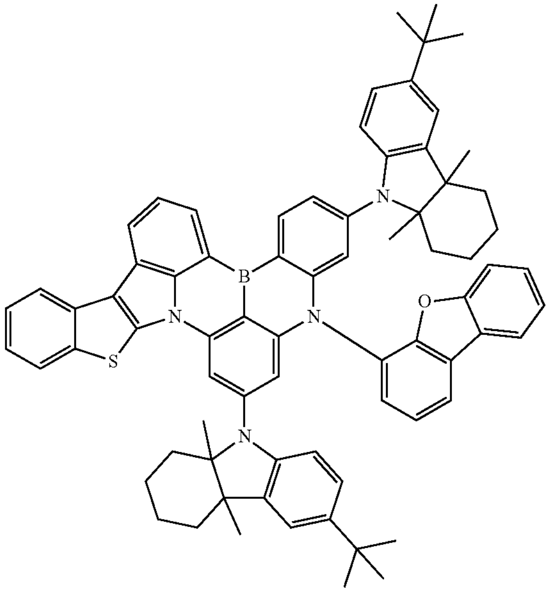
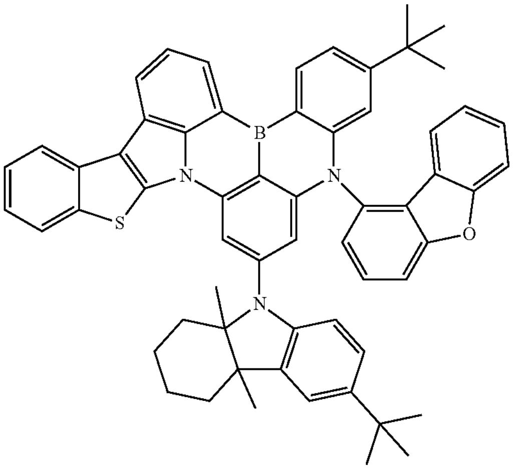
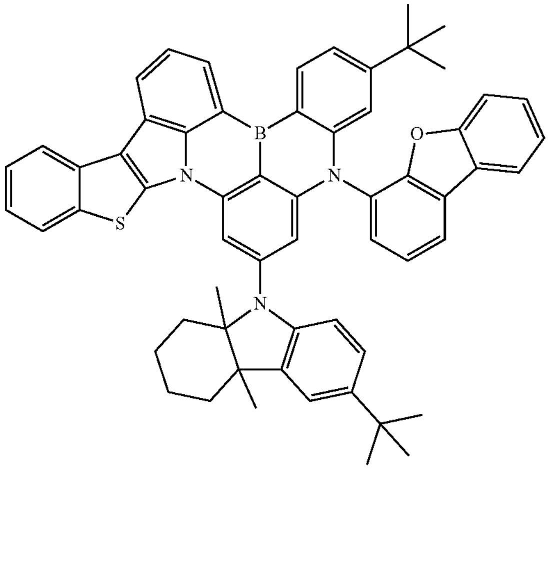
-continued
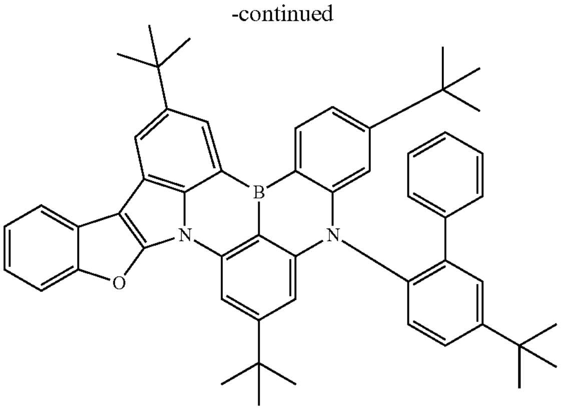
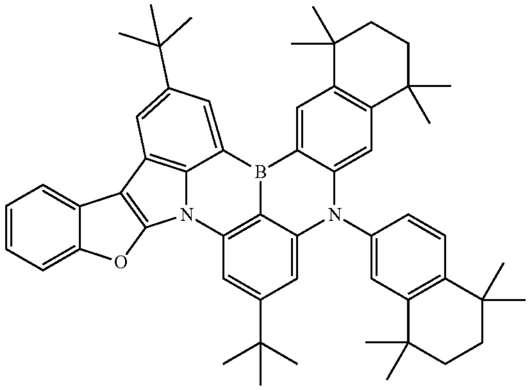
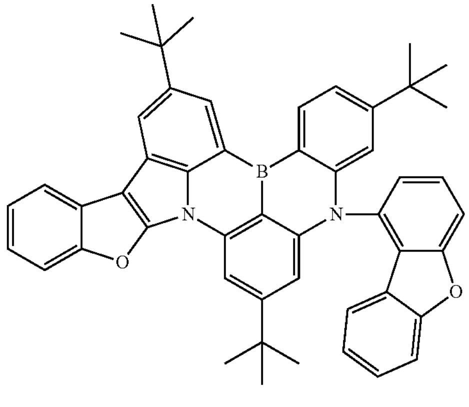
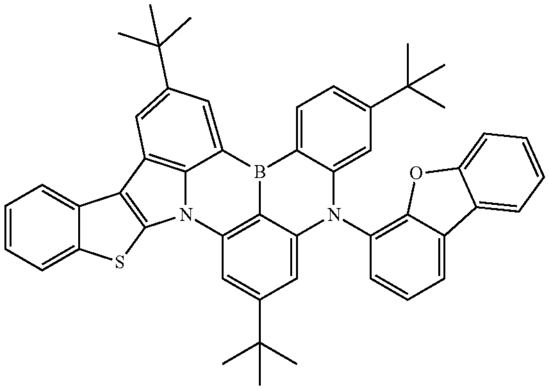

-continued
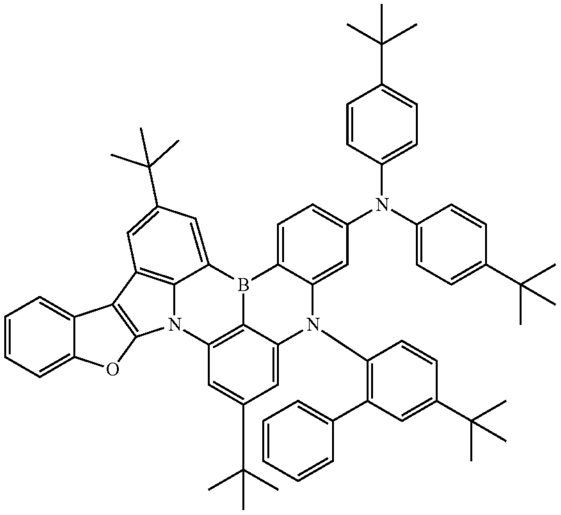
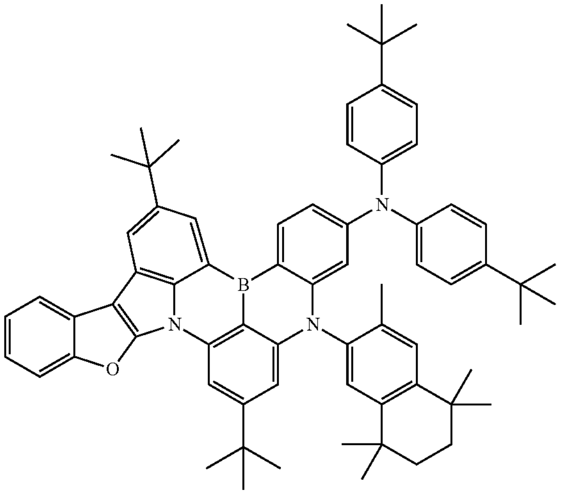
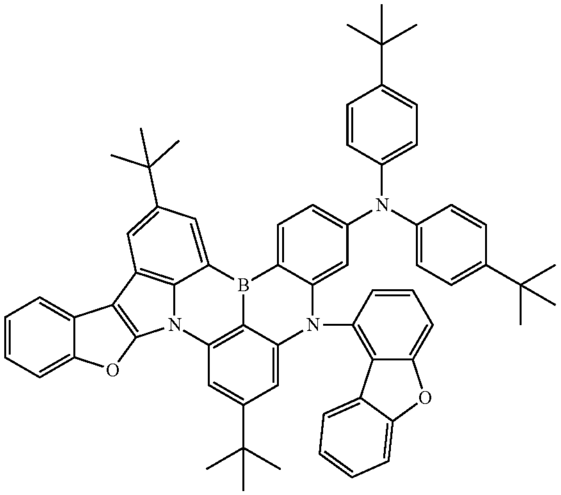
-continued
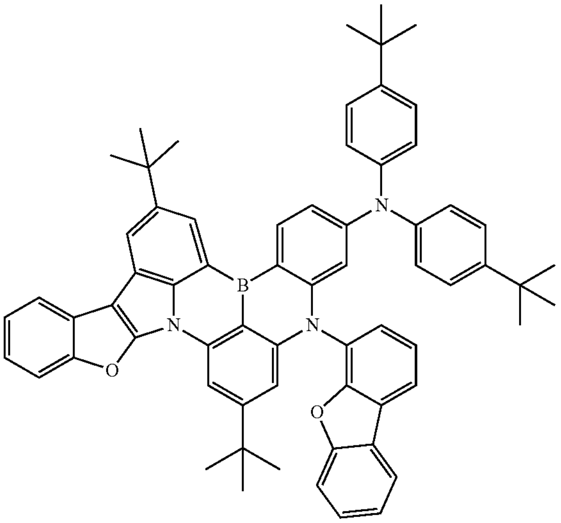
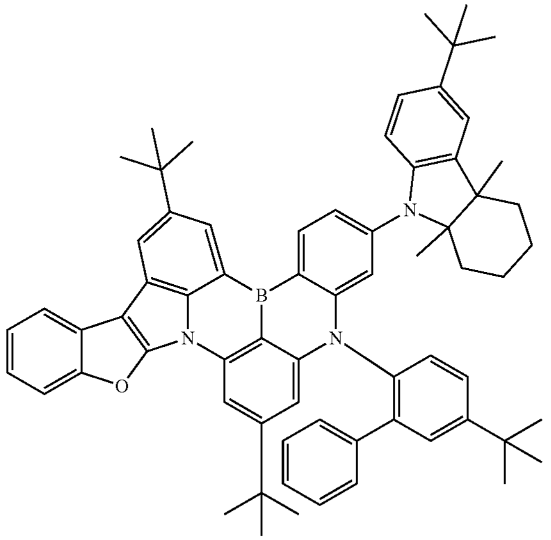
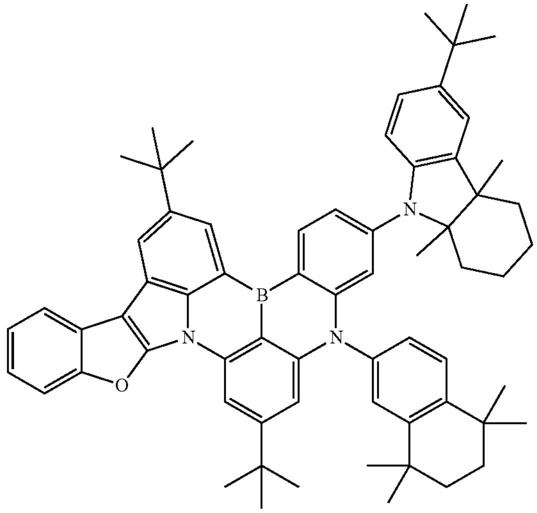

-continued
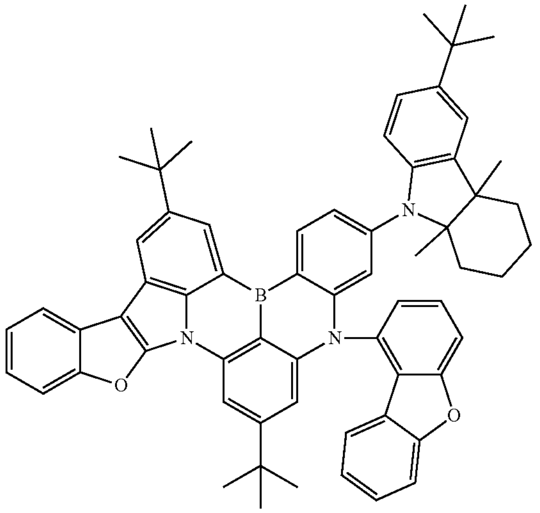
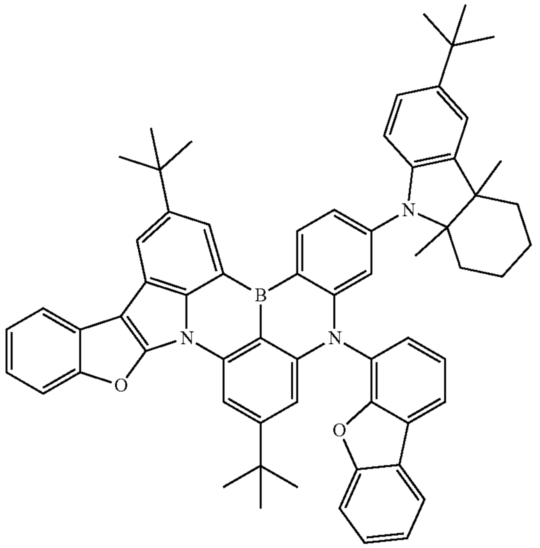
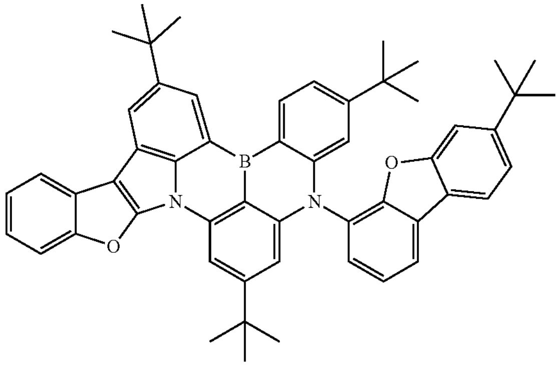
-continued
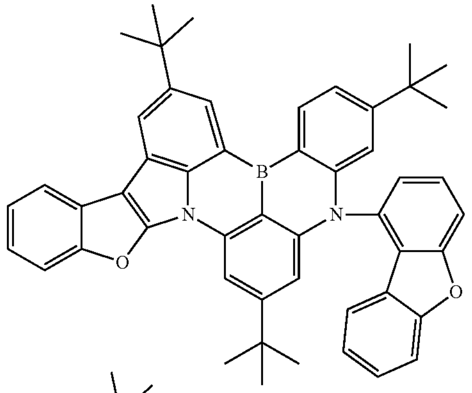
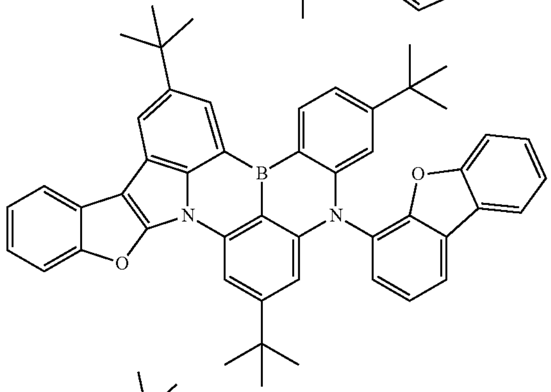
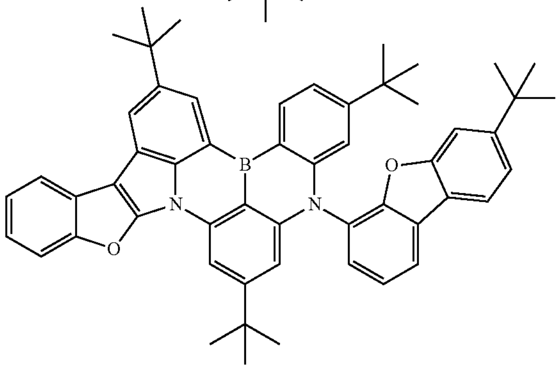
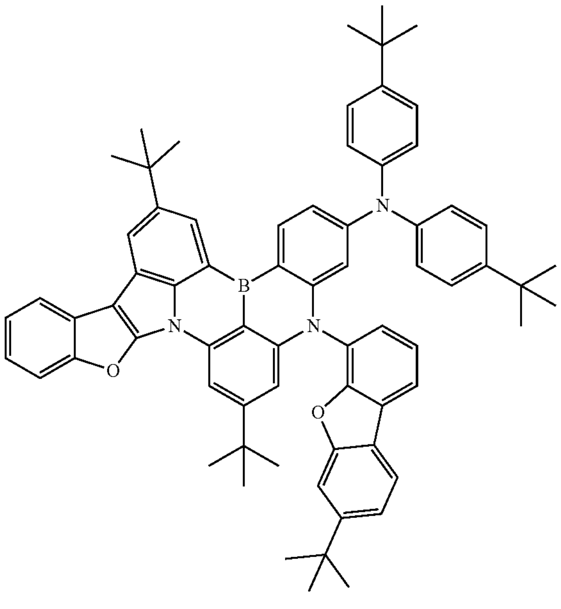

-continued
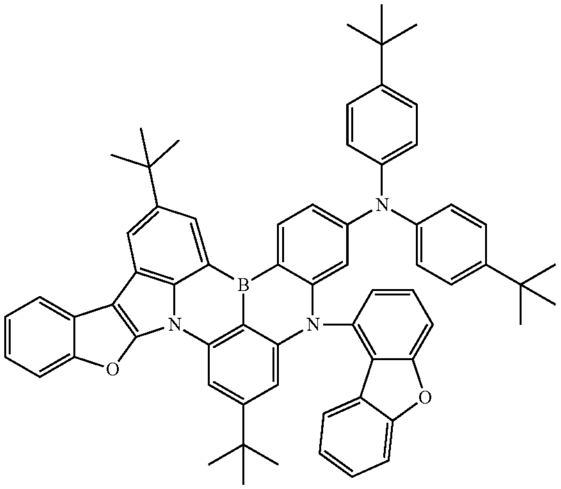
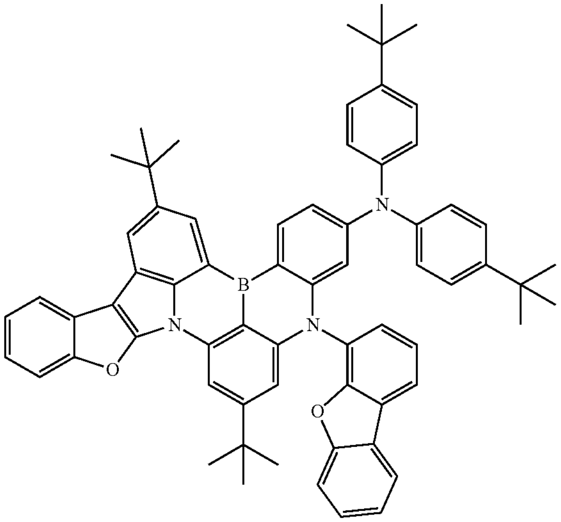
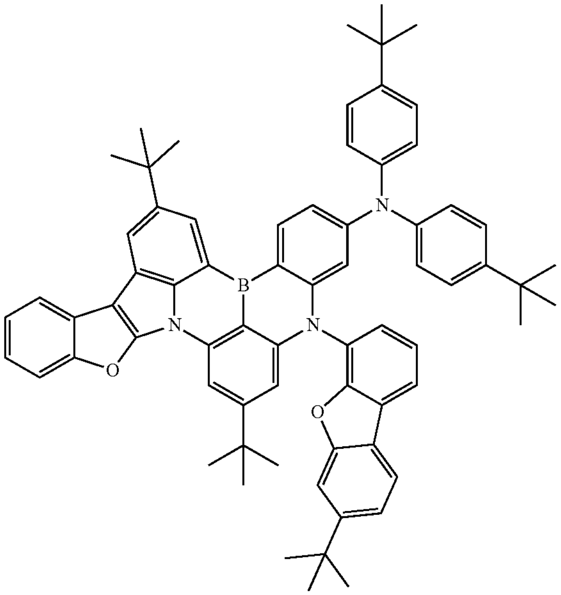
-continued
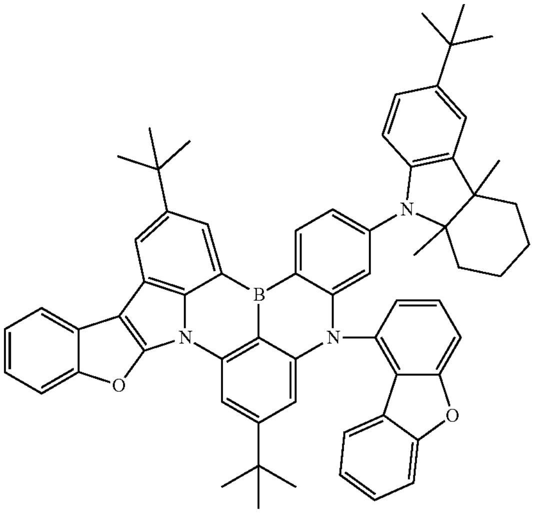
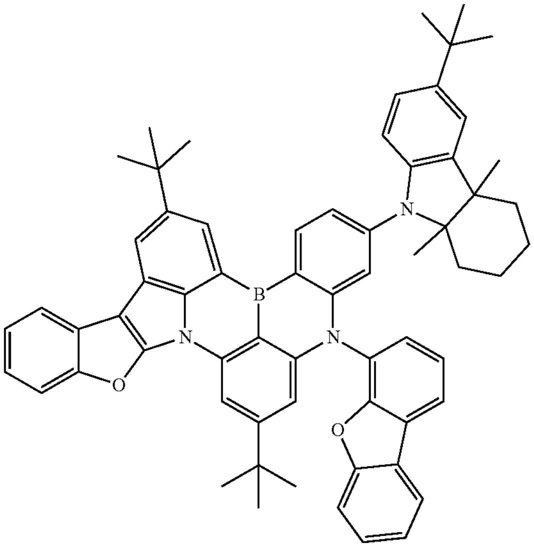
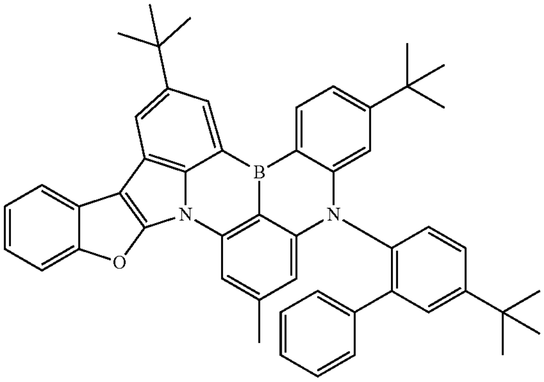

-continued
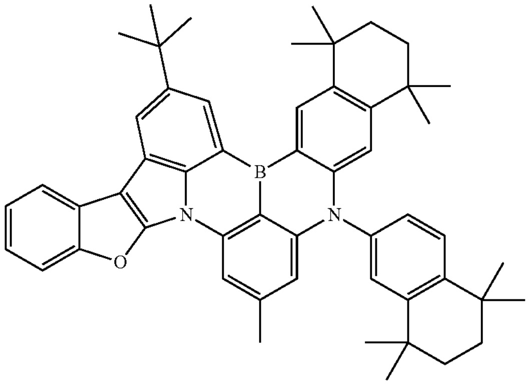
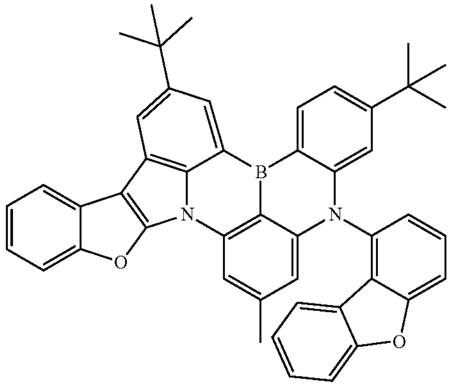
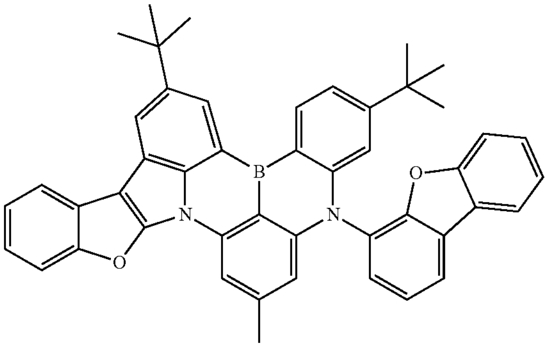
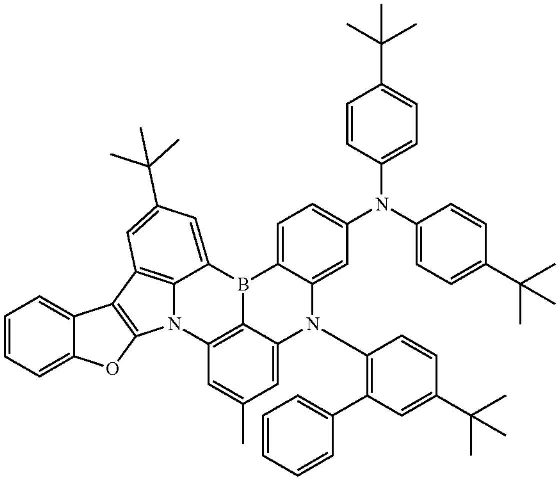
-continued
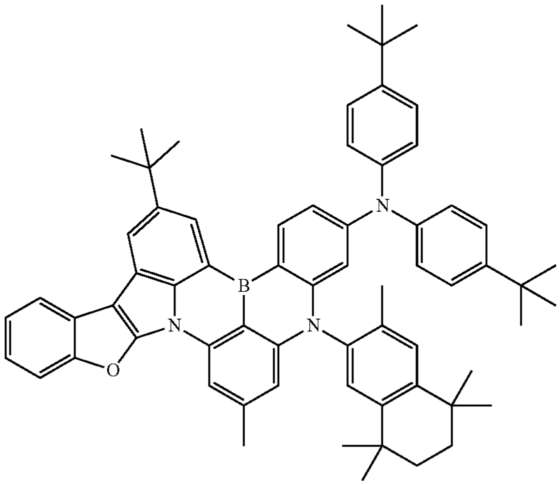
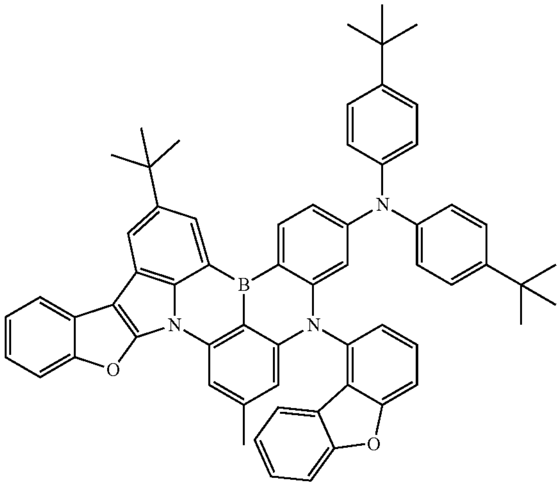
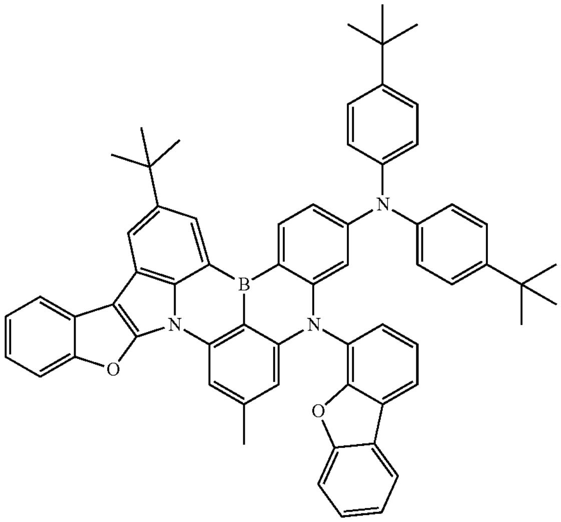

-continued
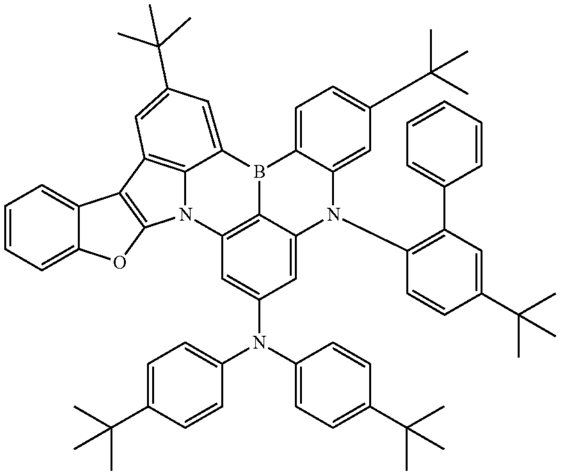
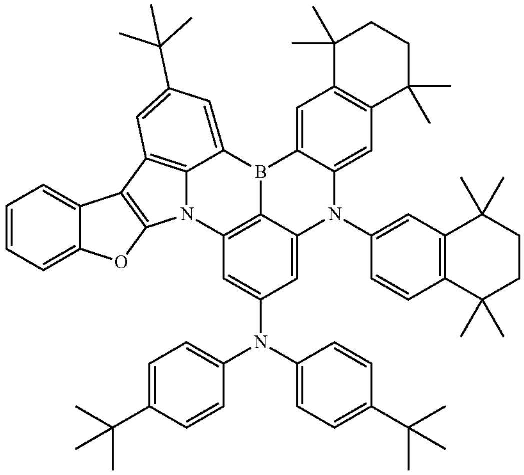
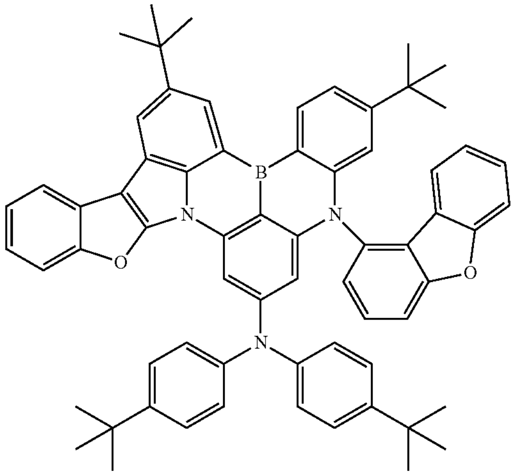
-continued
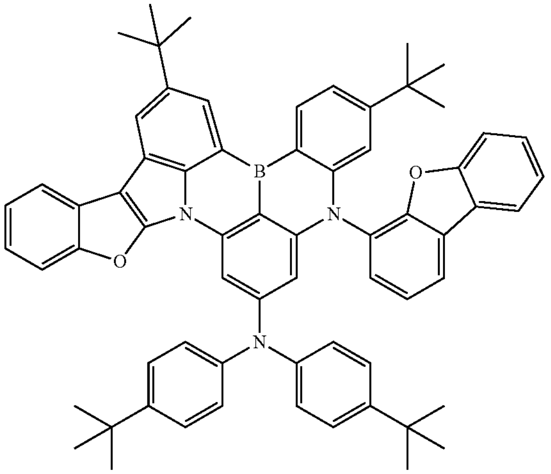
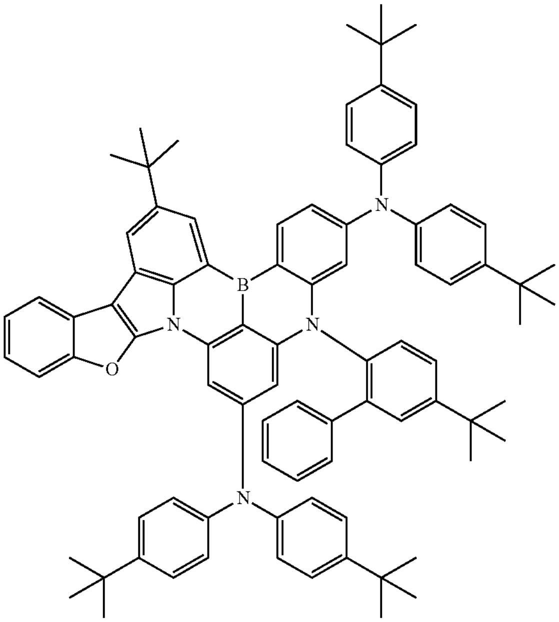
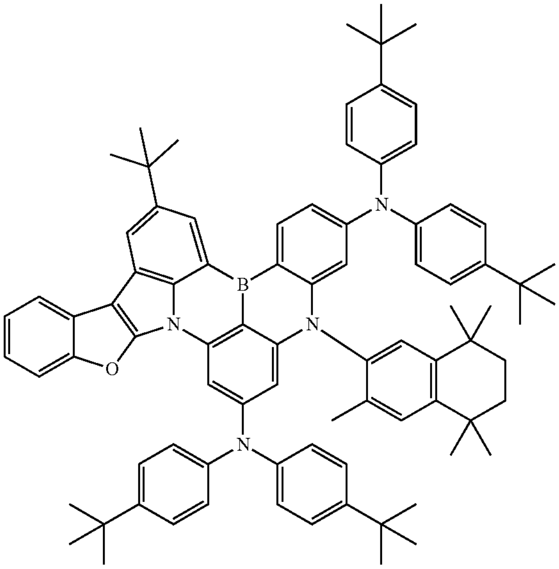

-continued
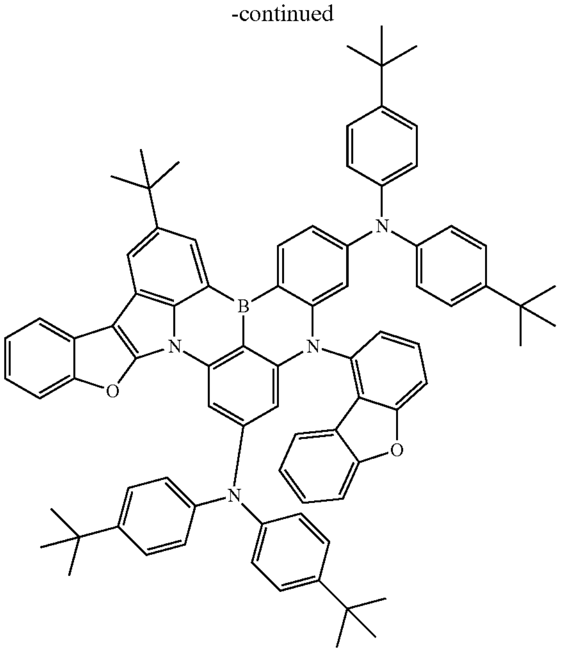
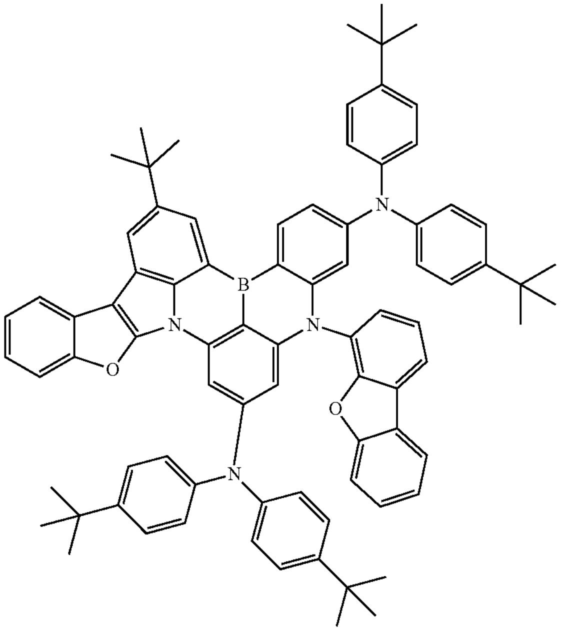
-continued
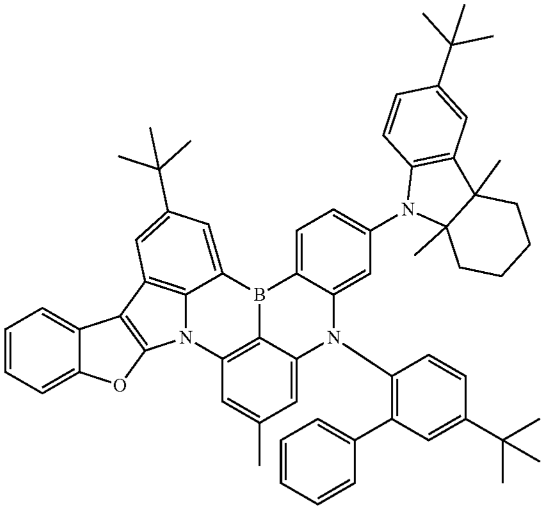
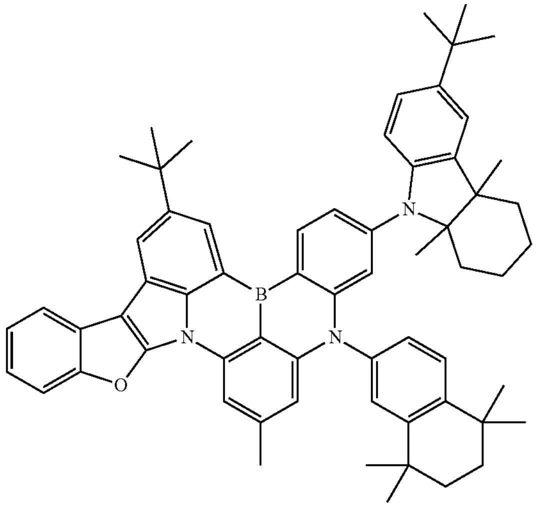
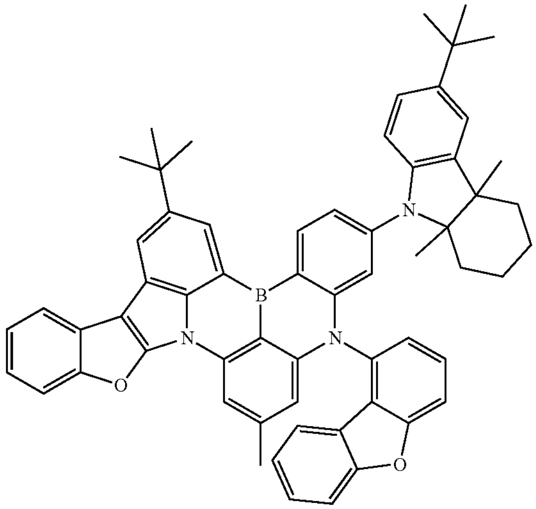

-continued
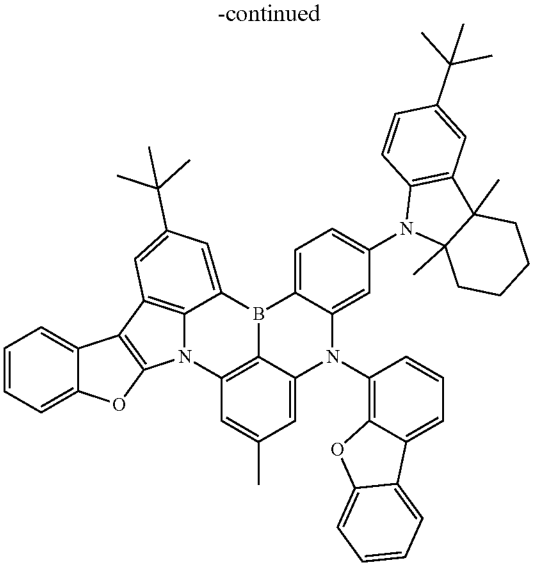
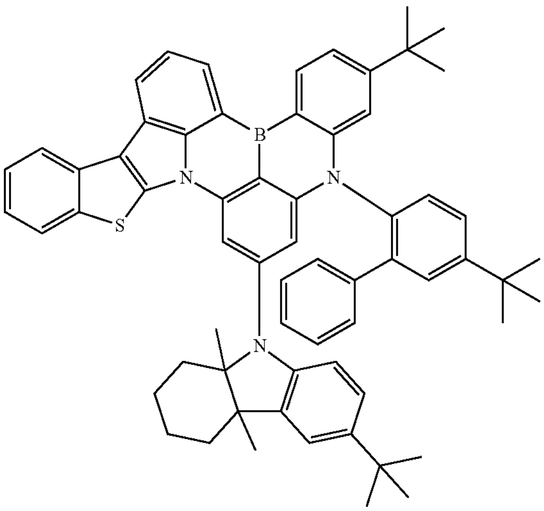
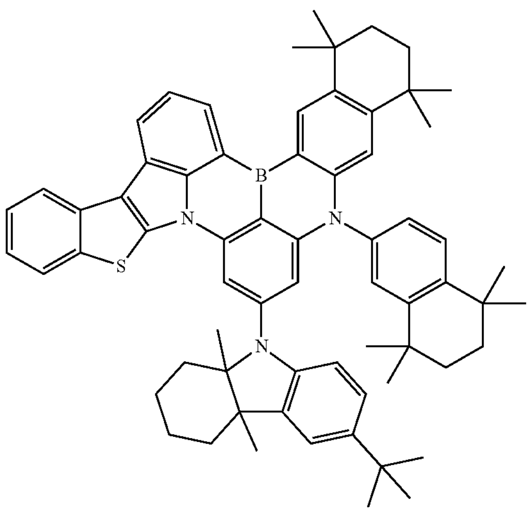
-continued
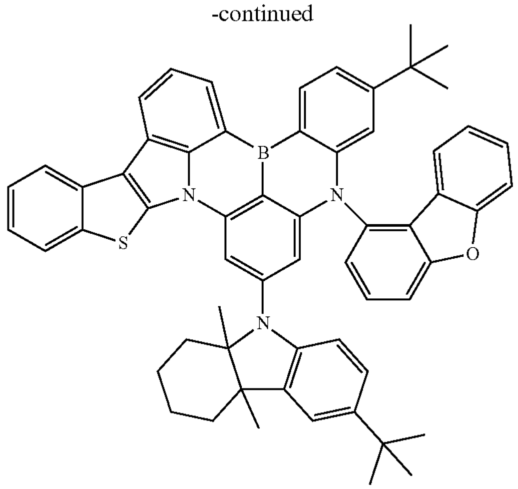
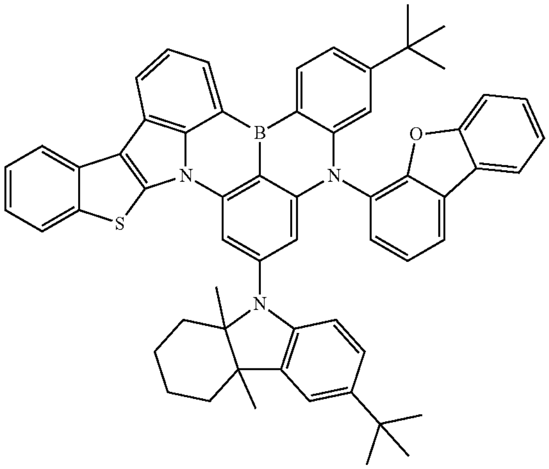
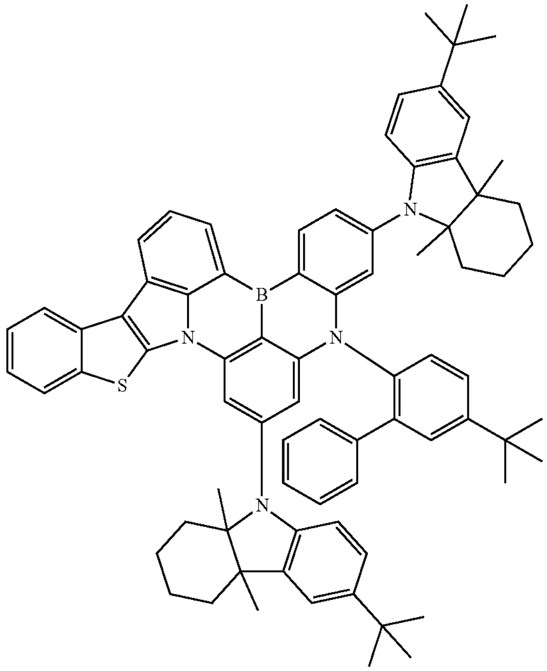

-continued
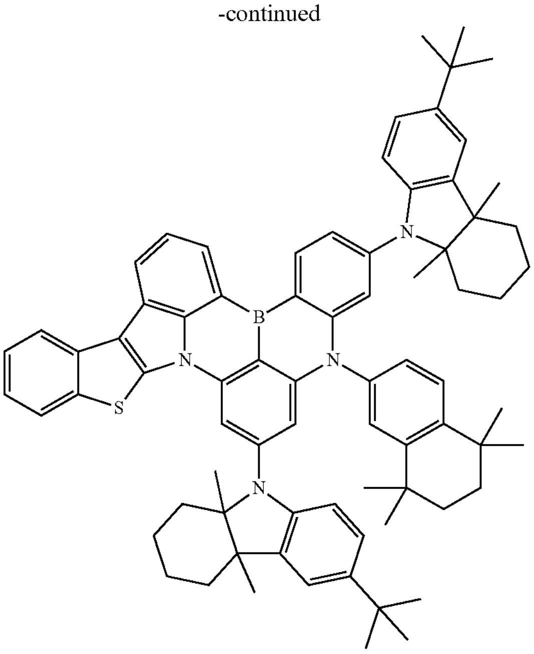
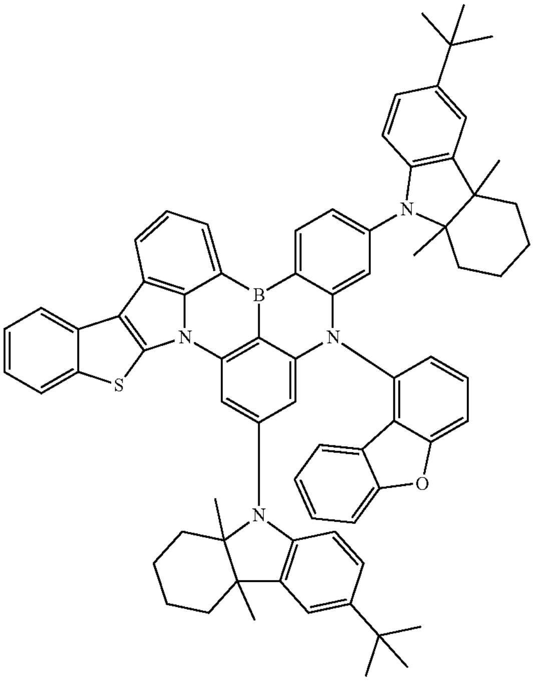
-continued
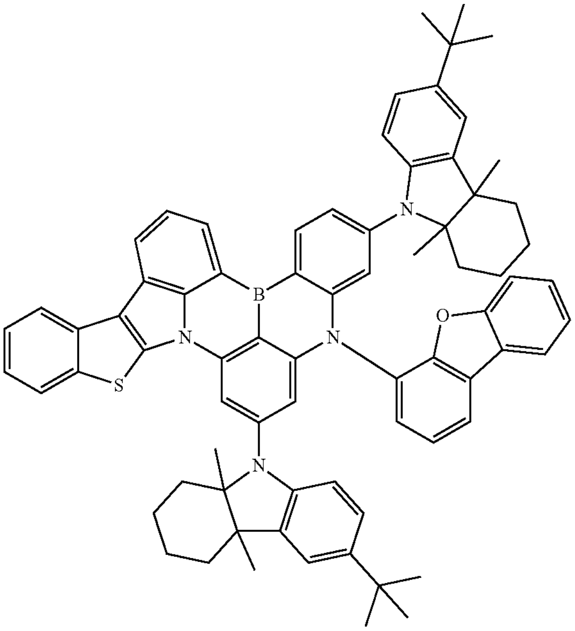
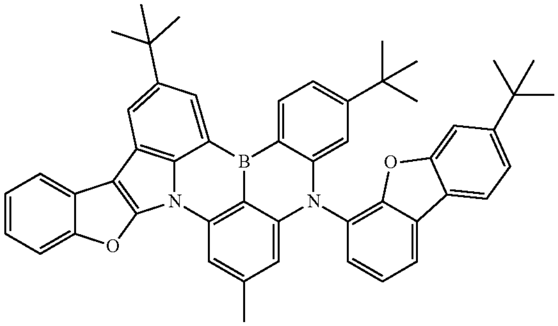
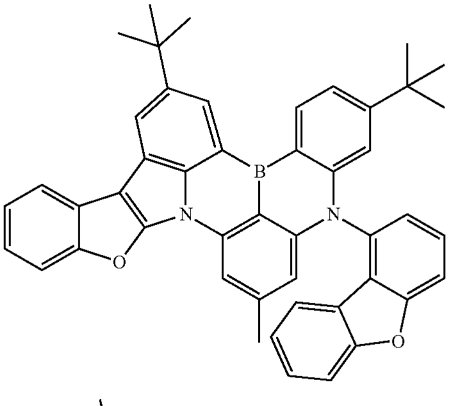
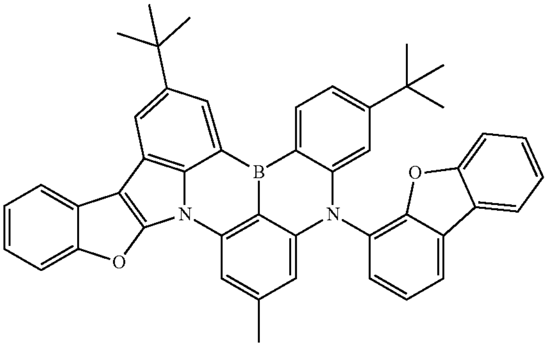

-continued
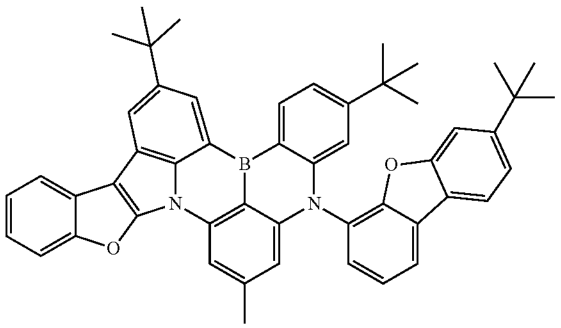
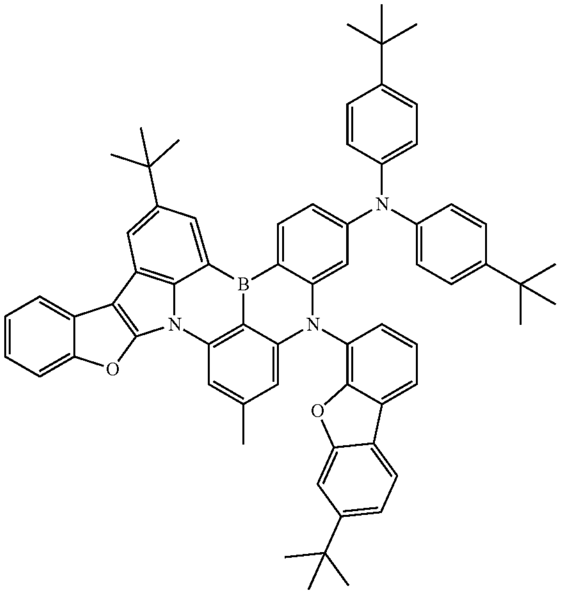
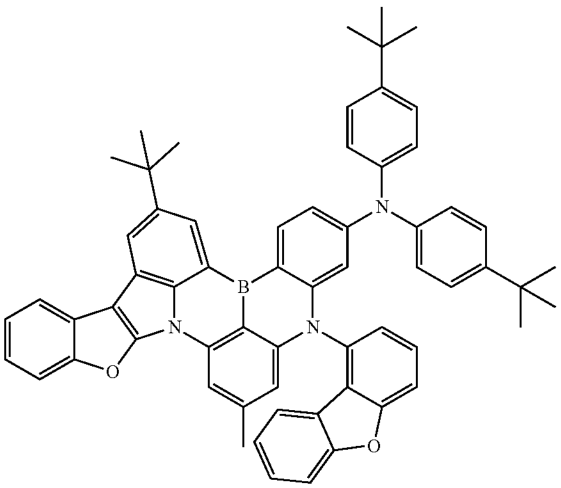
-continued
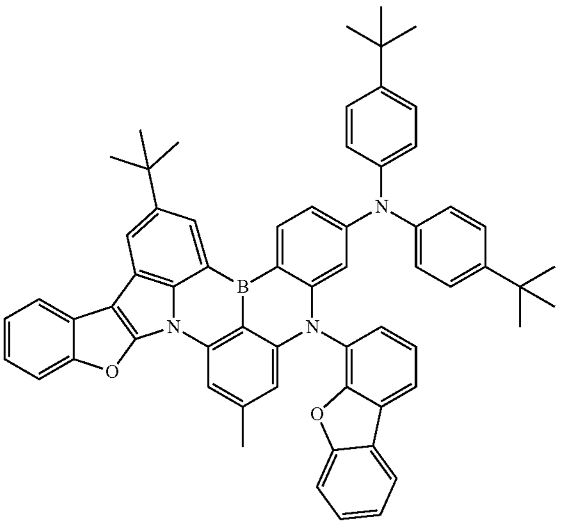
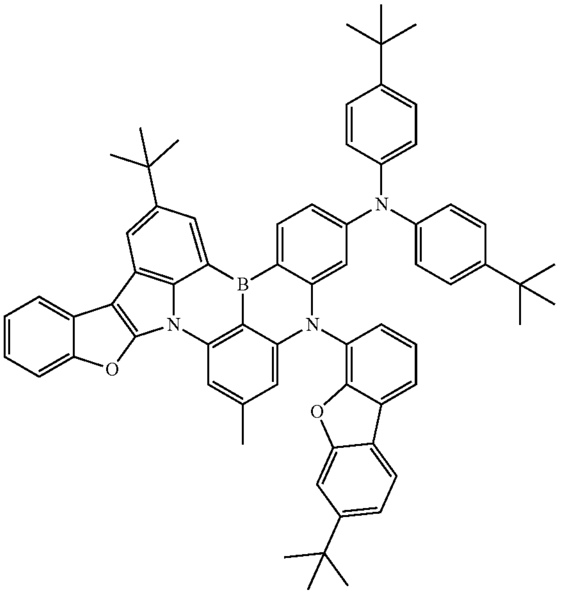
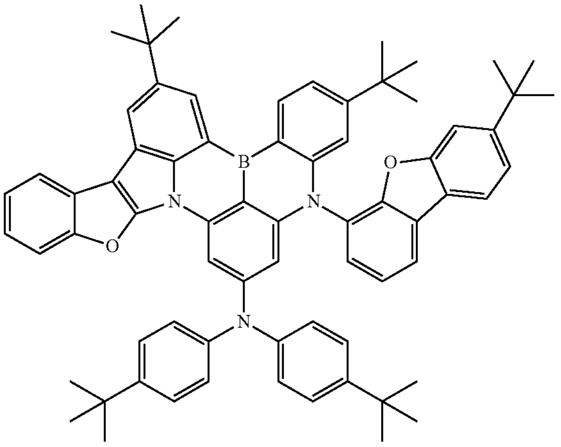

-continued
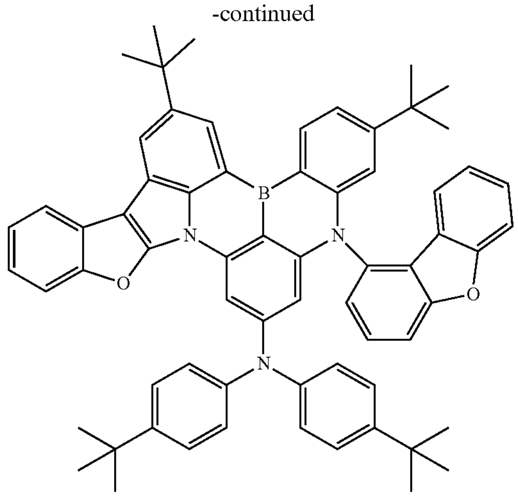
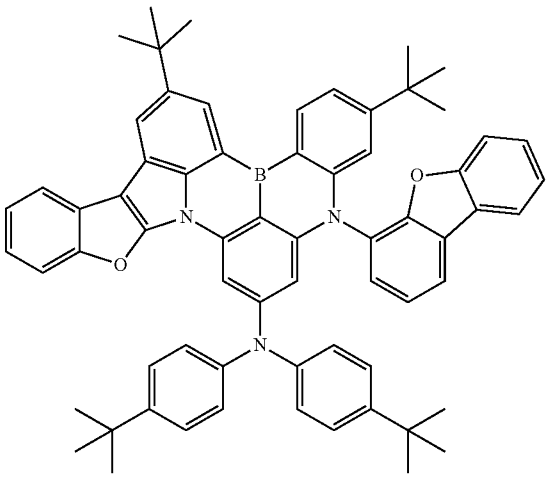
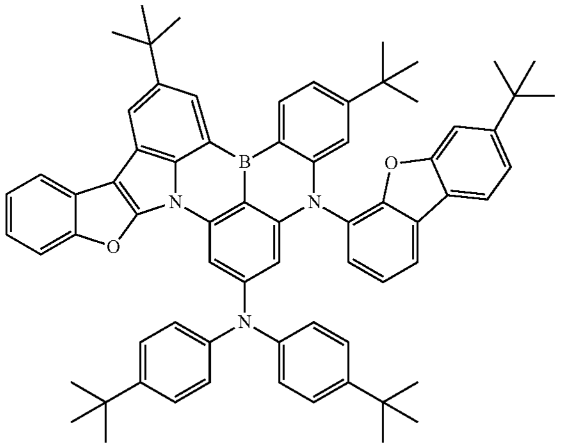
-continued
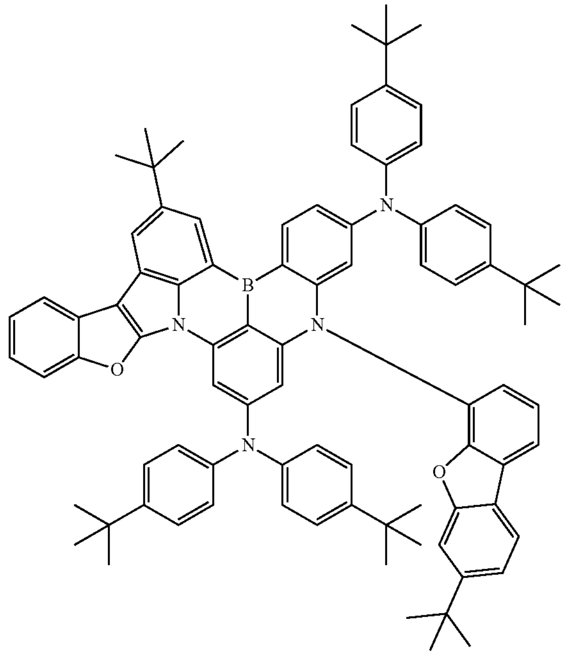
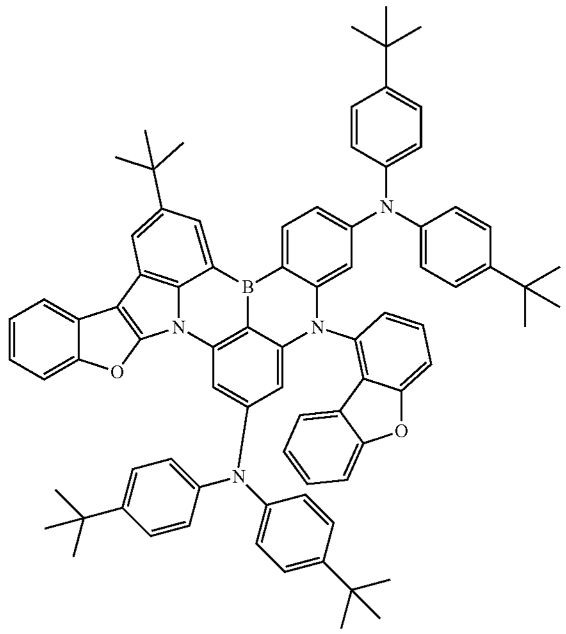

-continued
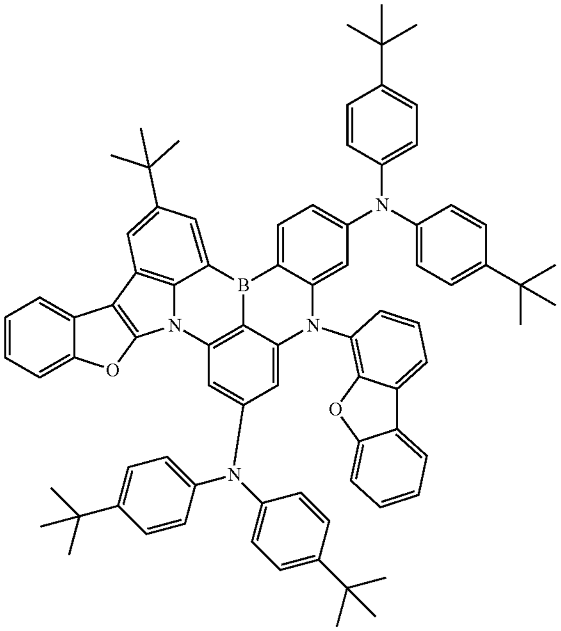
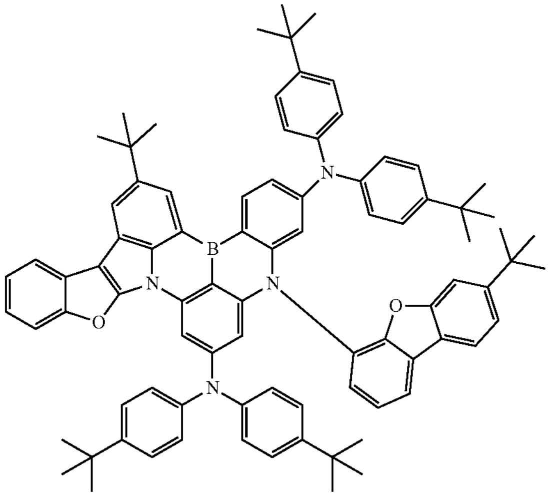
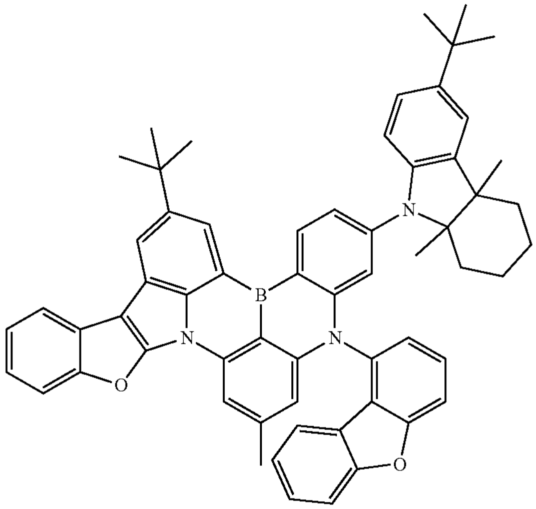
-continued
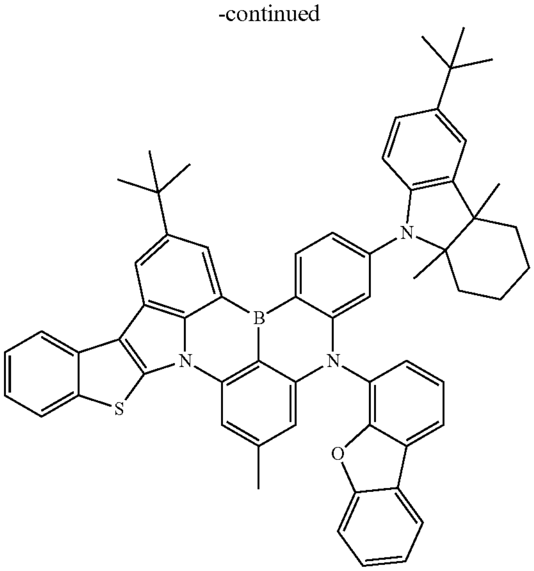
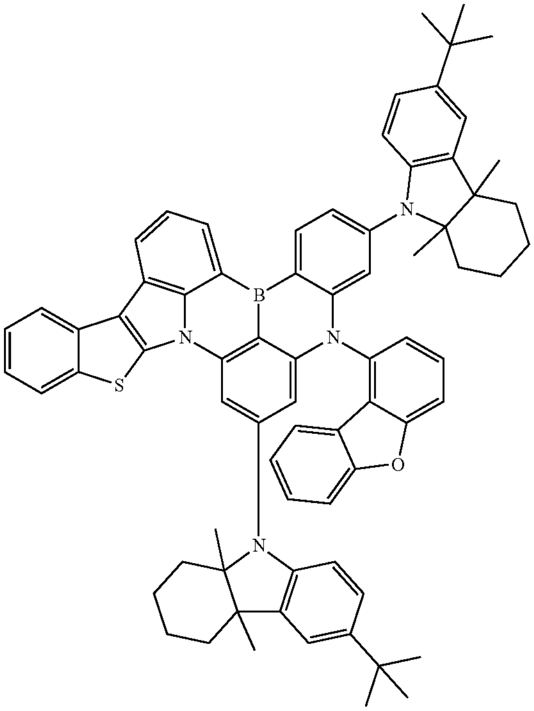

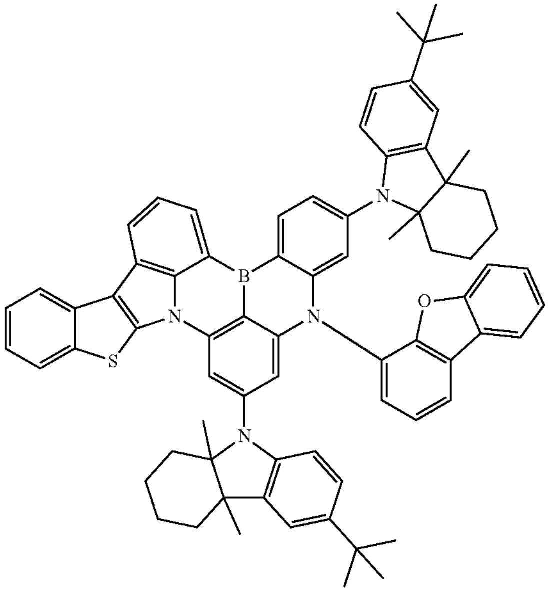
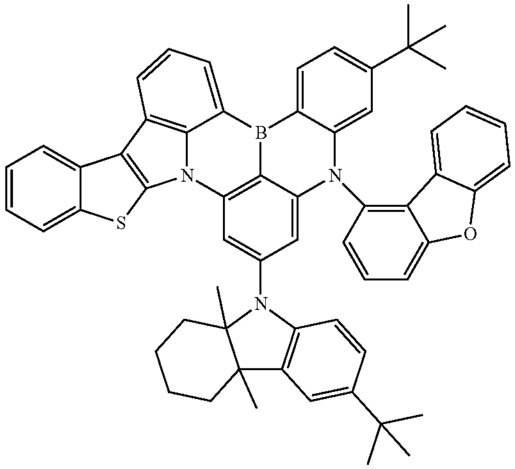
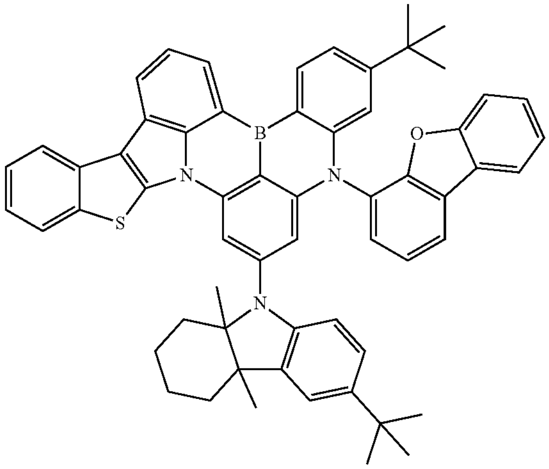
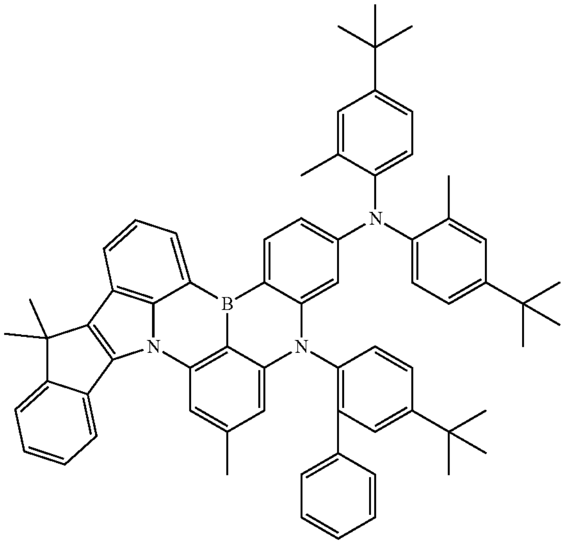
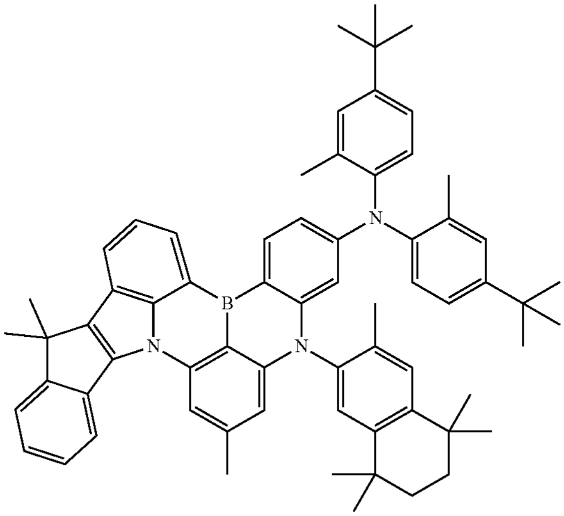
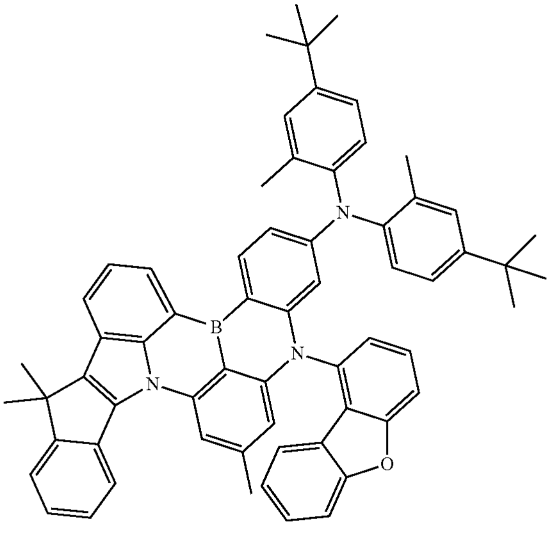

-continued
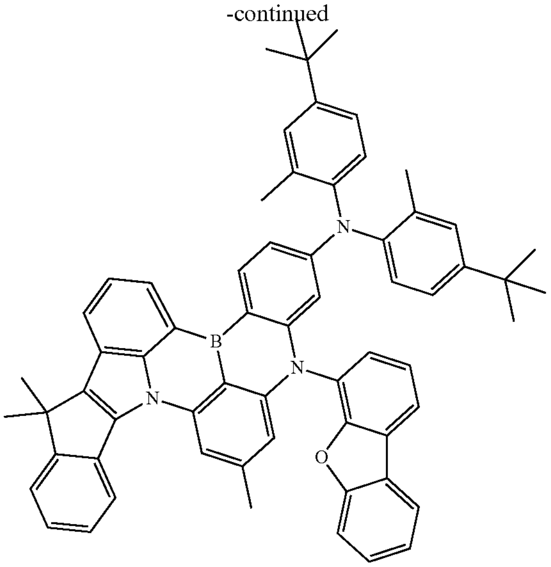
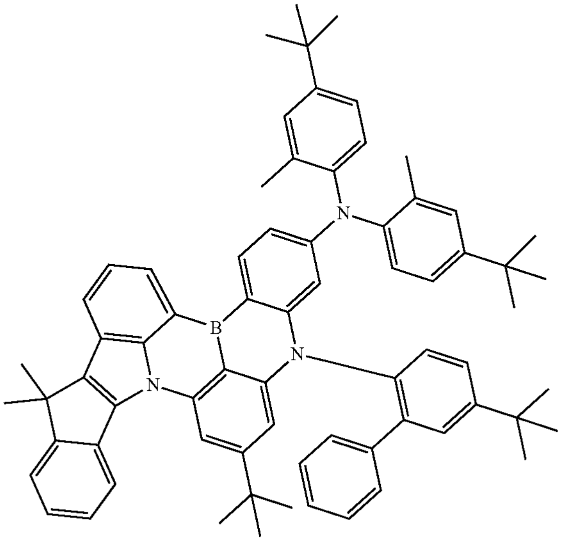
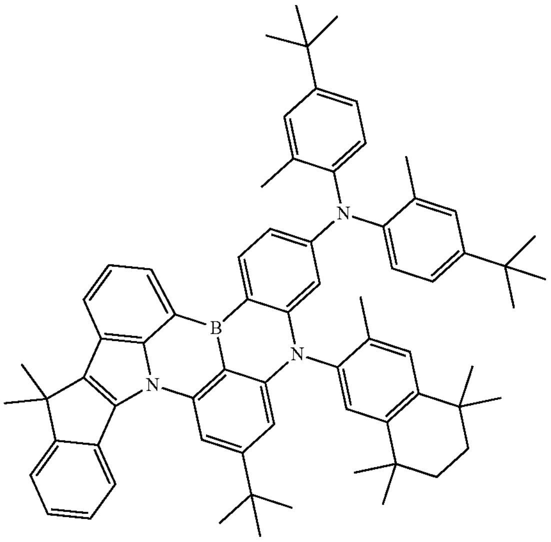
-continued
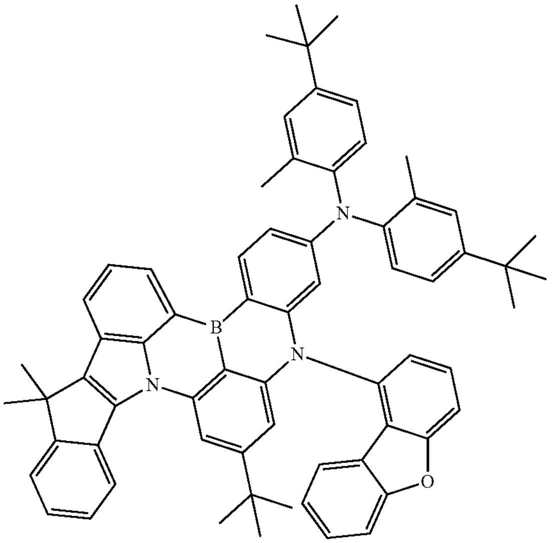
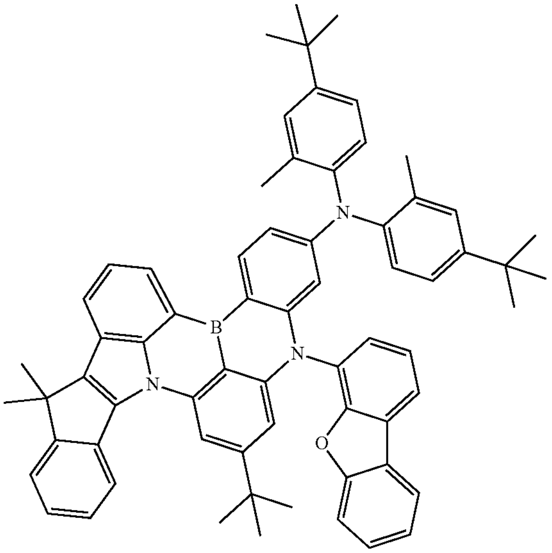
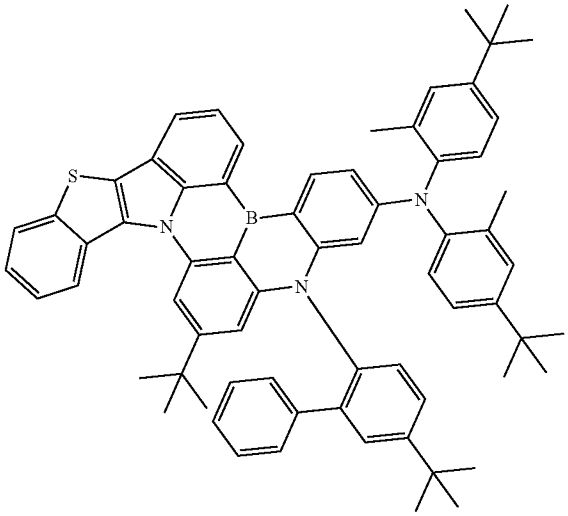

-continued
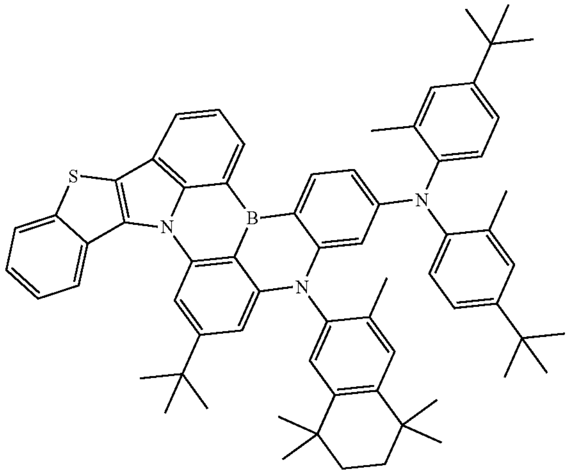
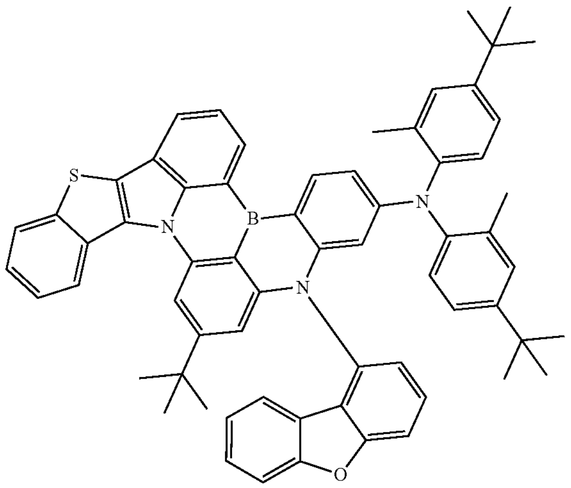
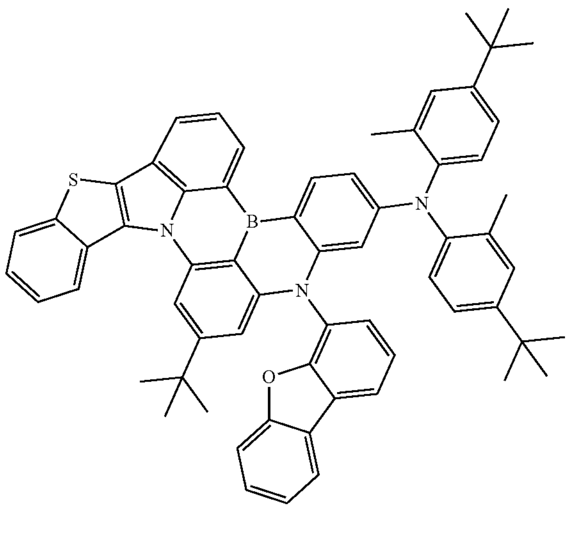
-continued
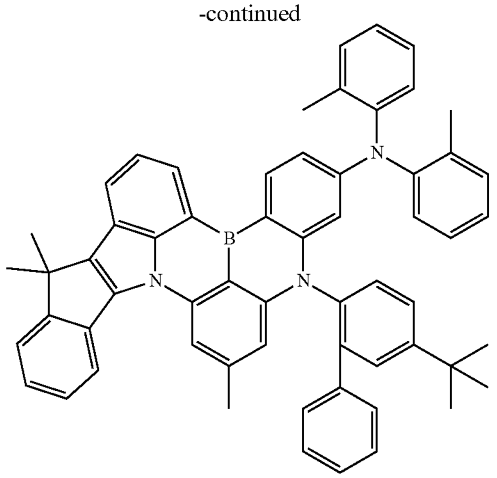
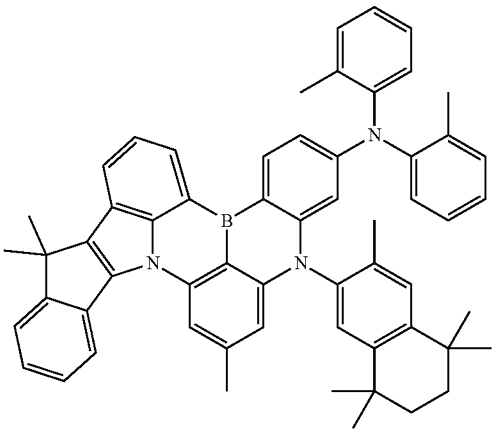
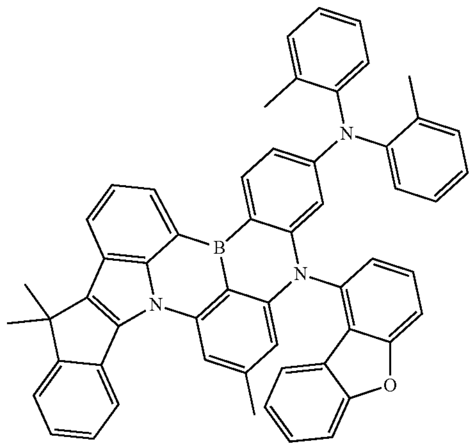

-continued
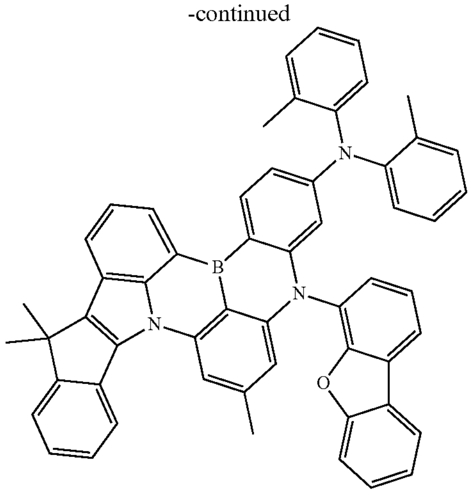
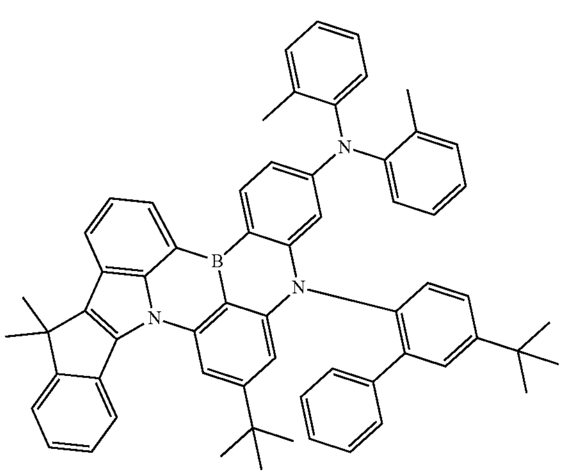
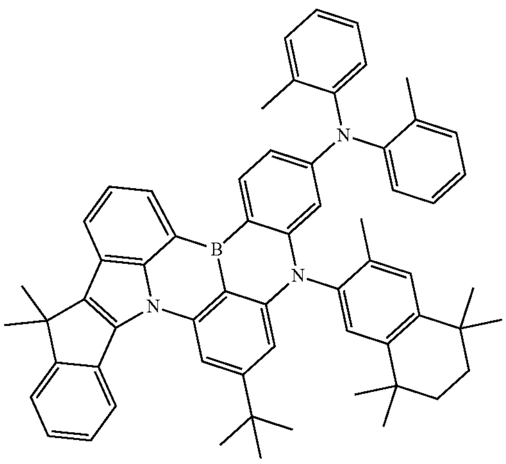
-continued
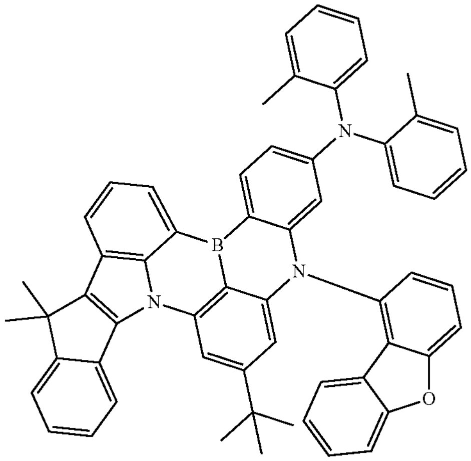
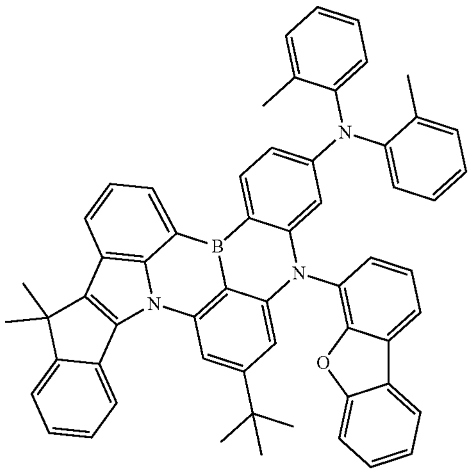
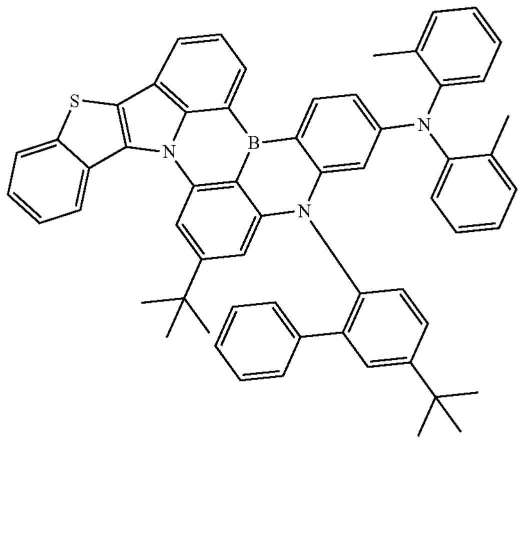

-continued
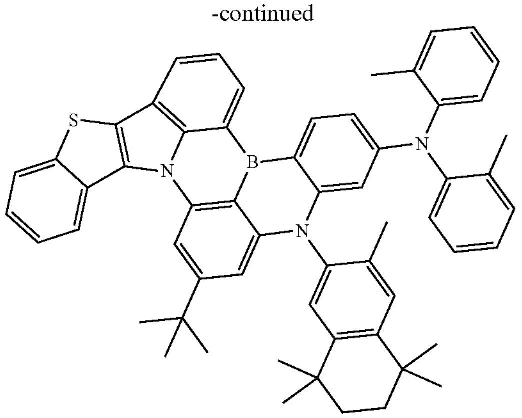
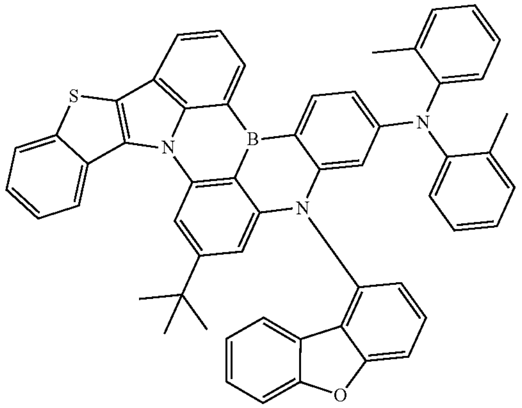
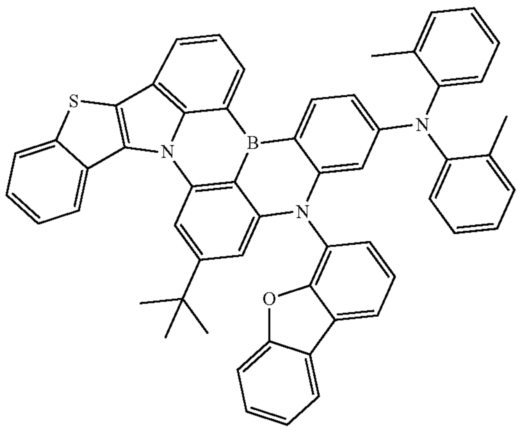
-continued
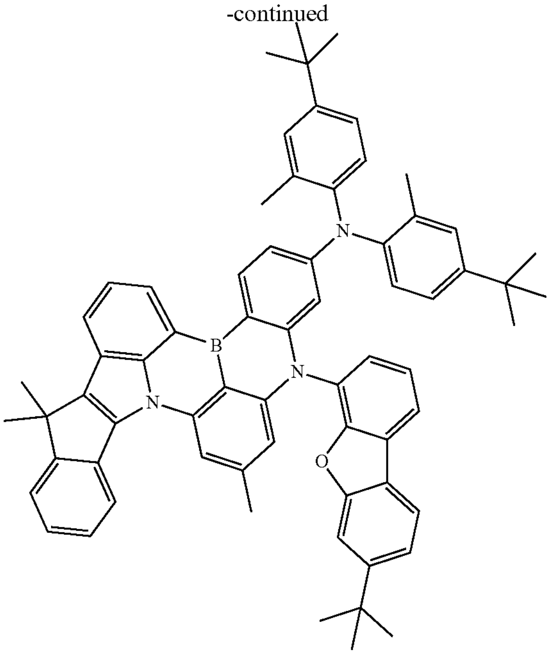
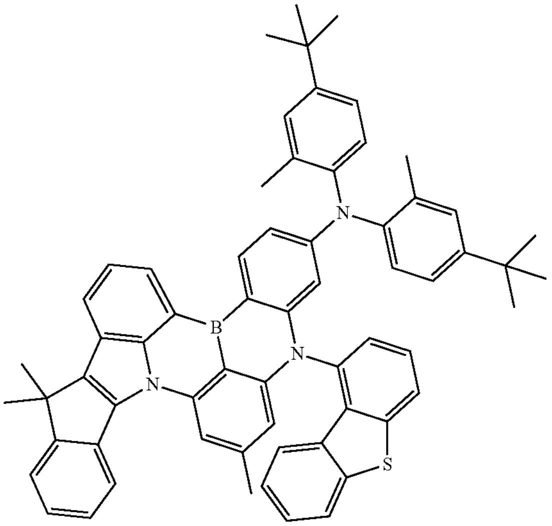
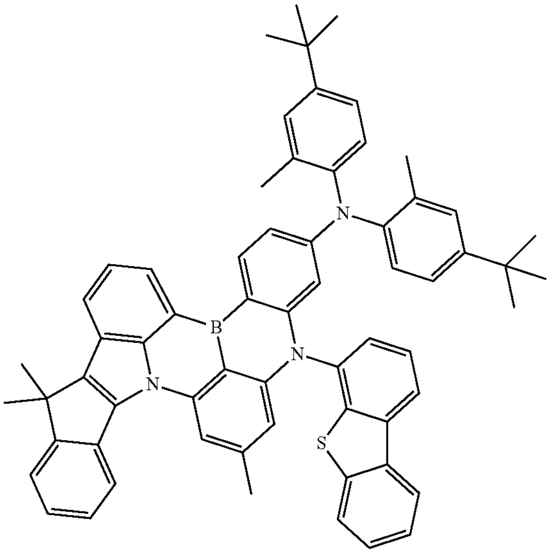

-continued
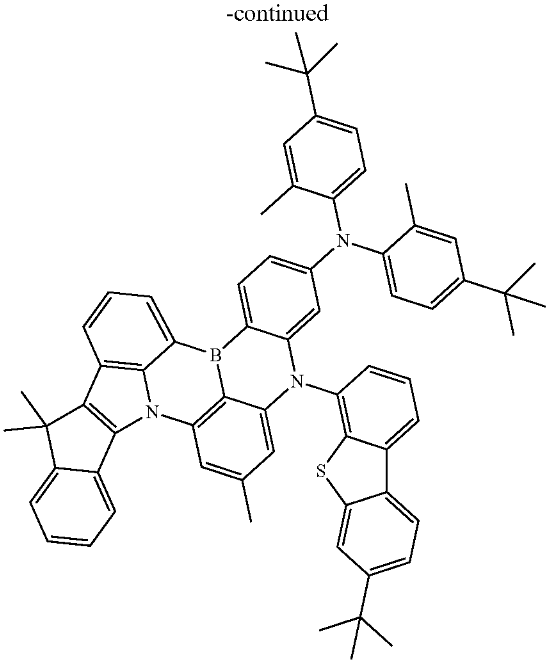
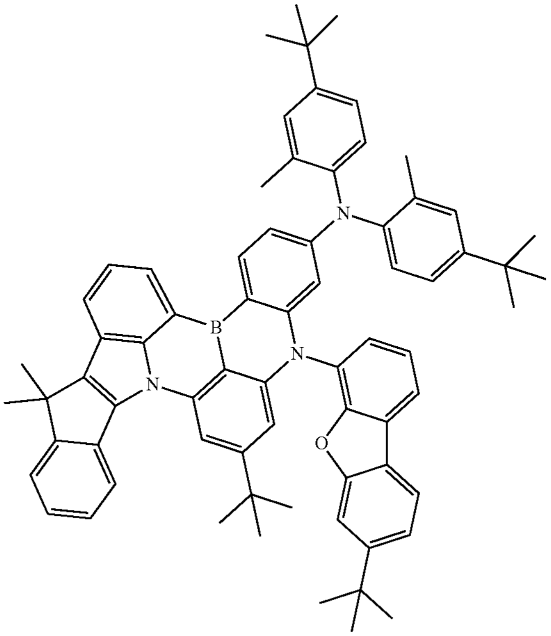
-continued
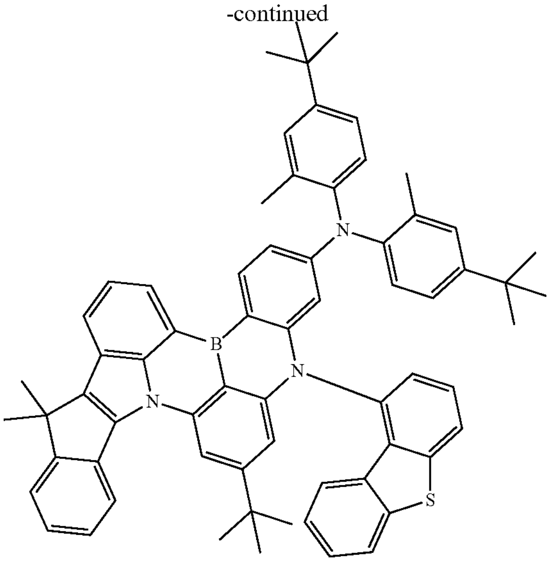
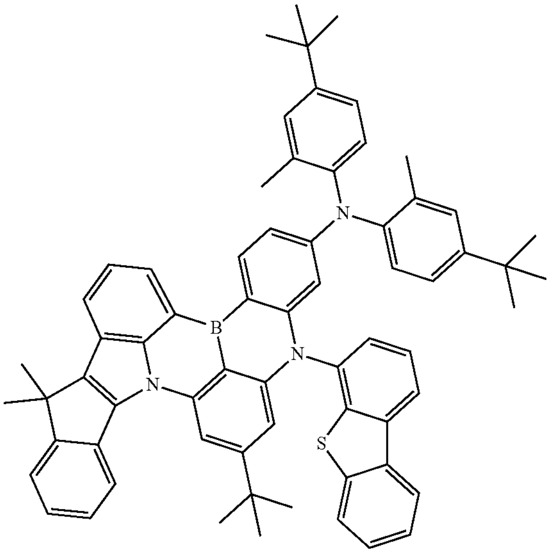
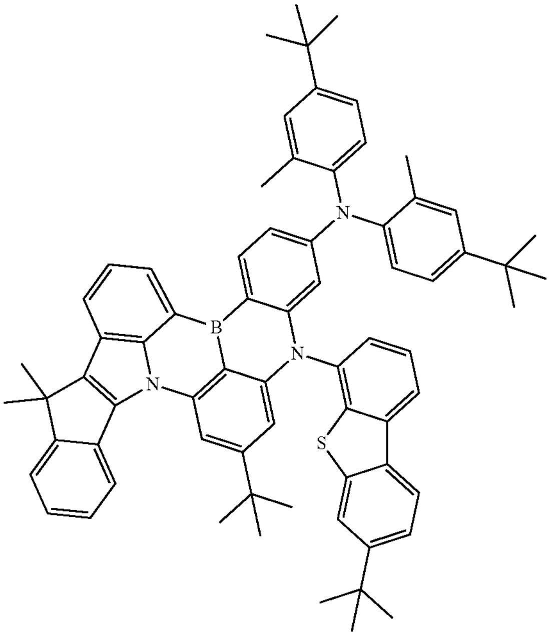

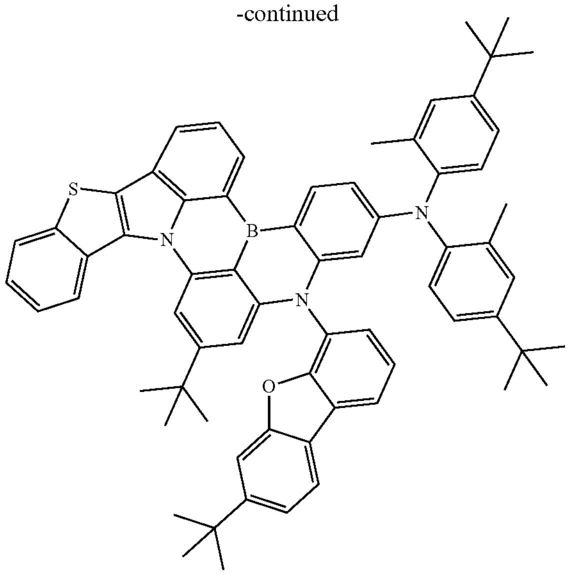
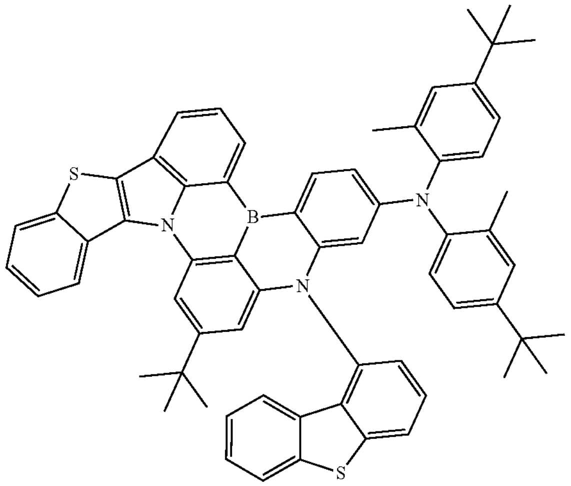
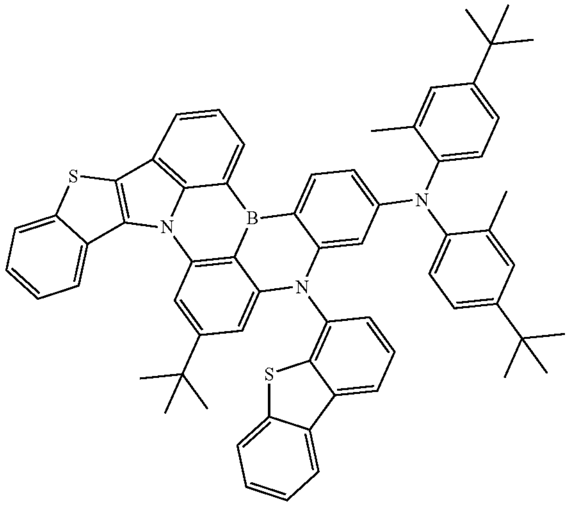
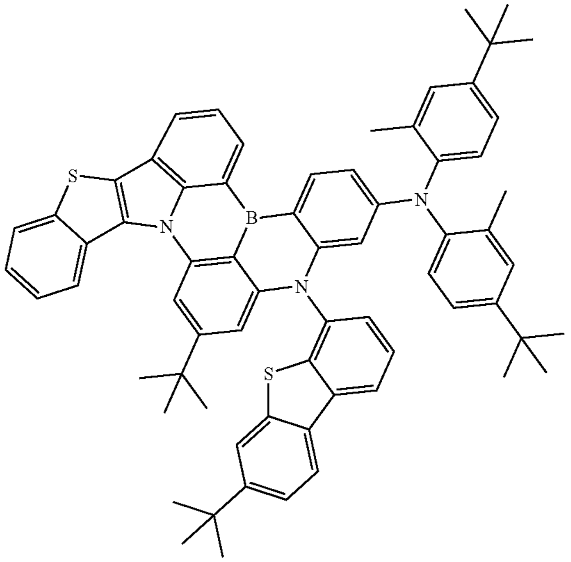
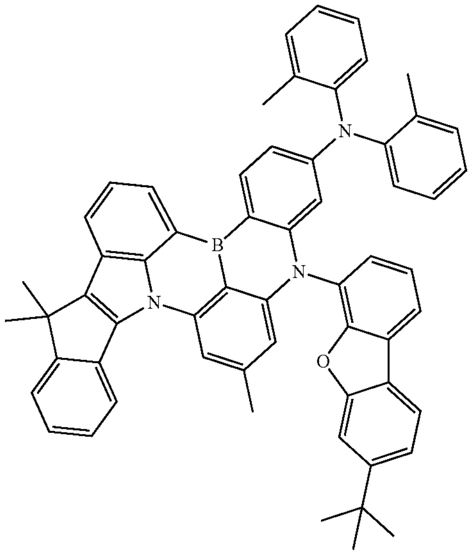
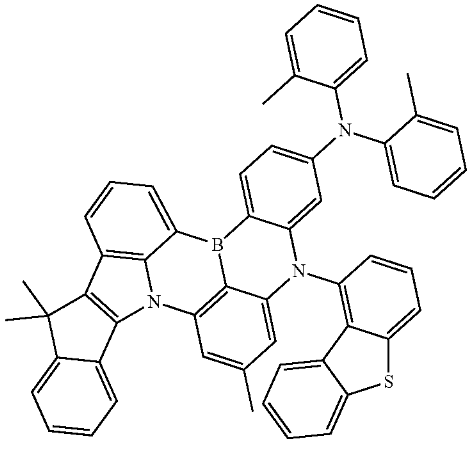

-continued
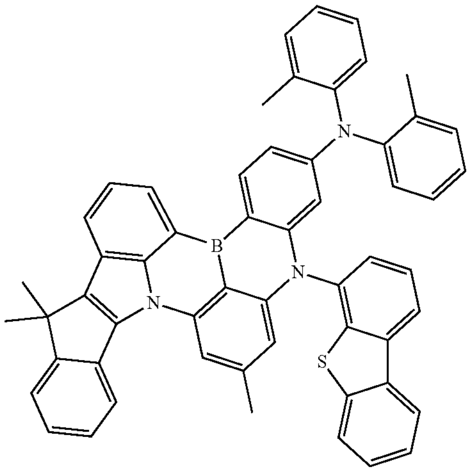
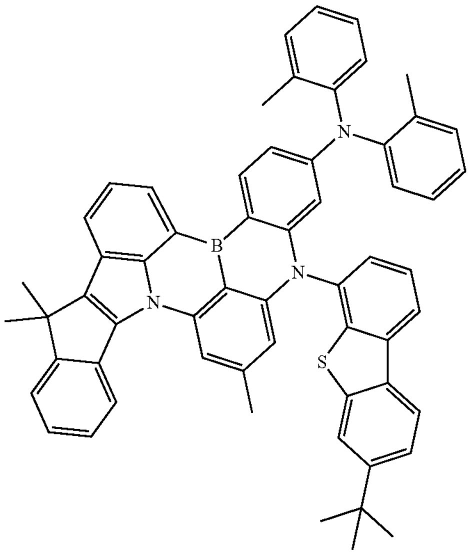
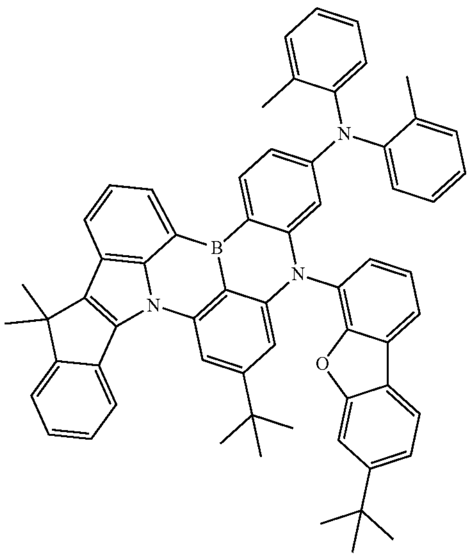
-continued
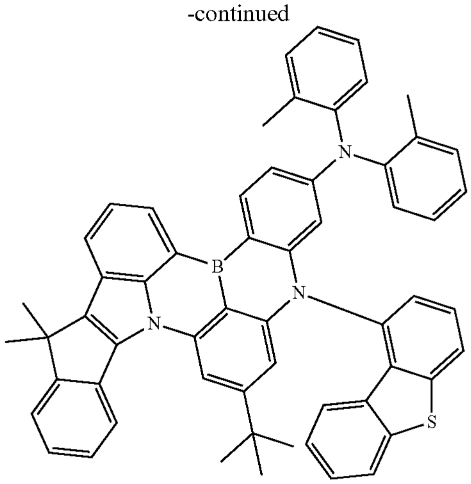
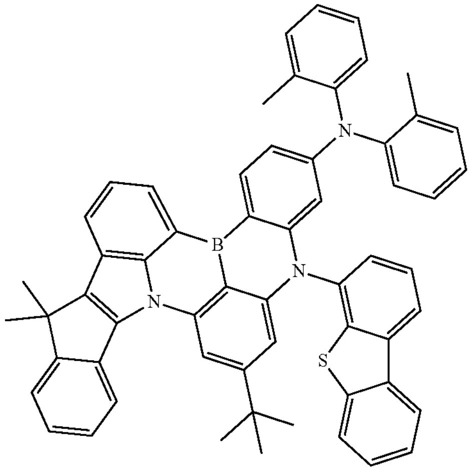
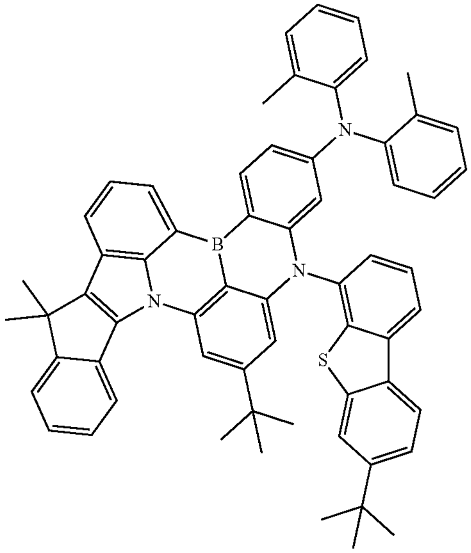

-continued
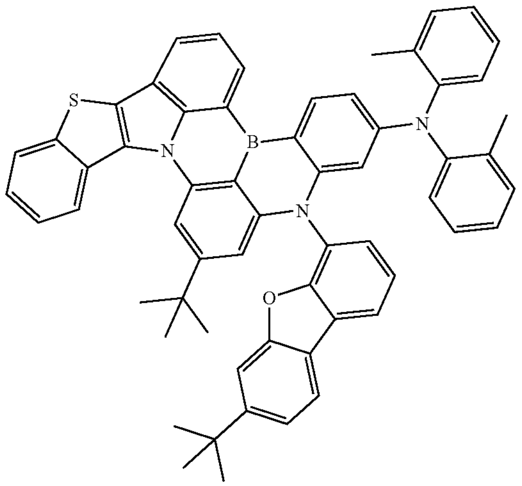
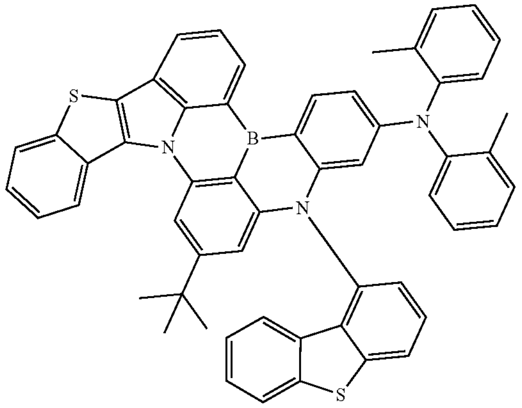
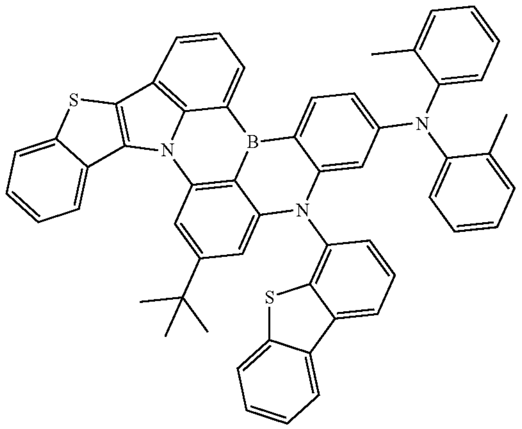
-continued
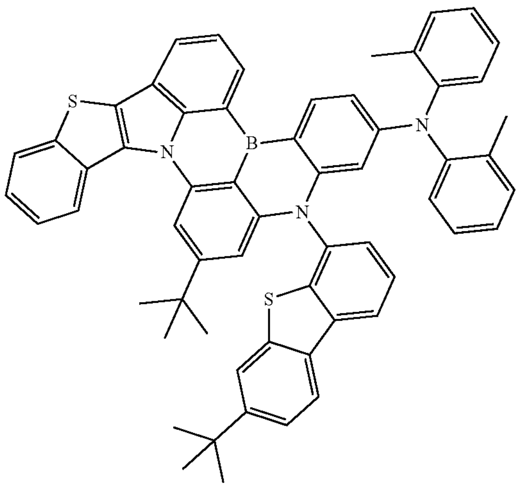
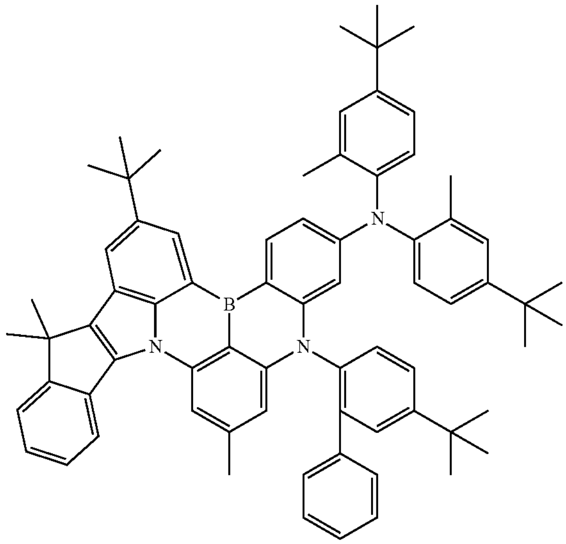
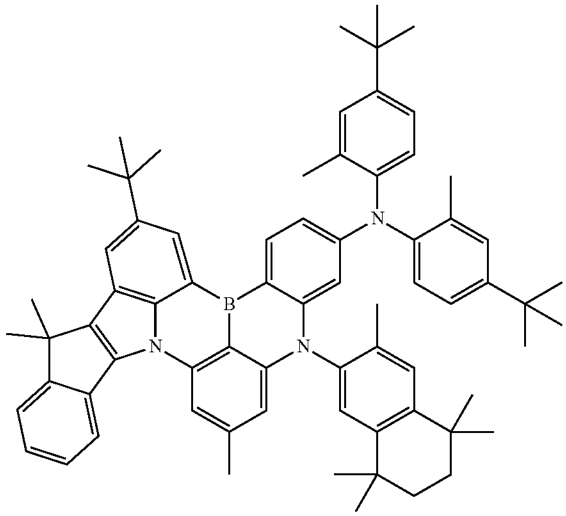

-continued
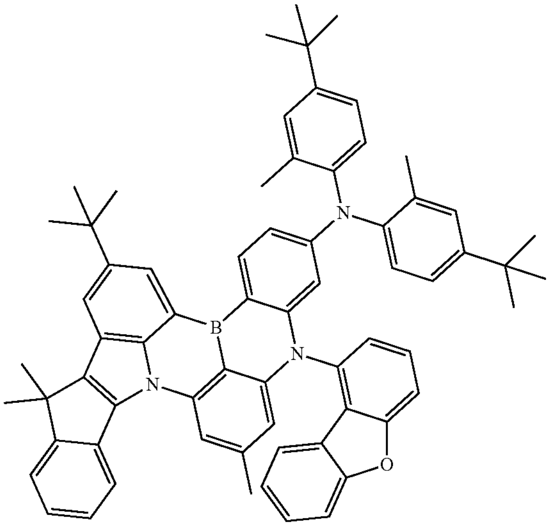
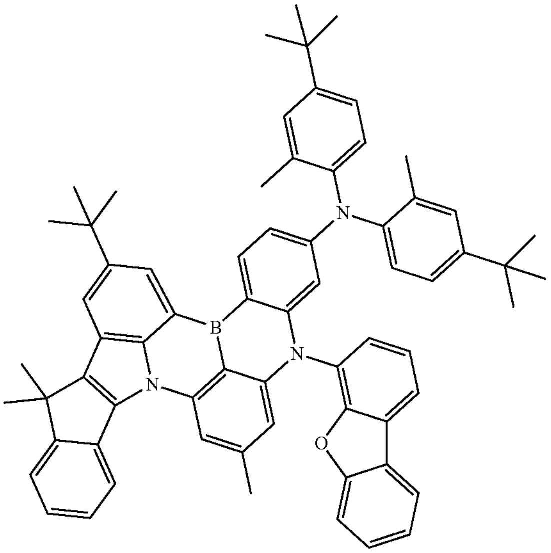
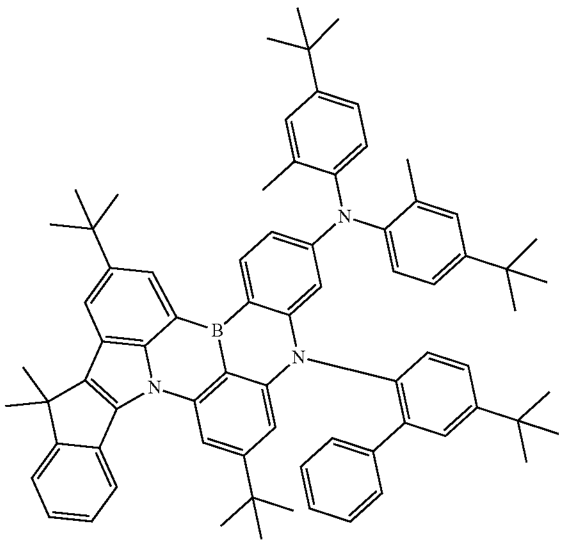
-continued
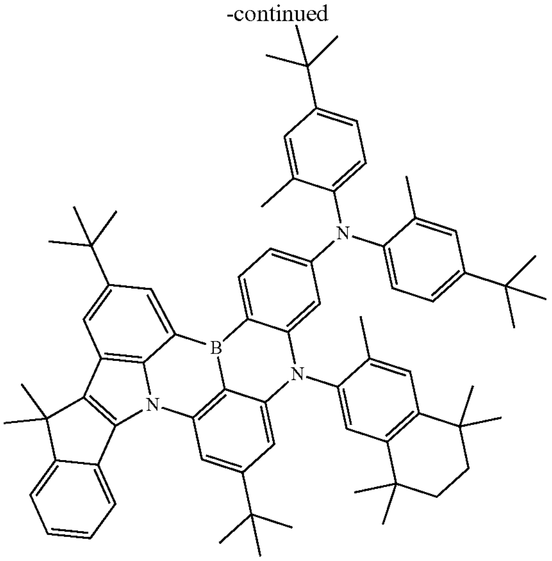
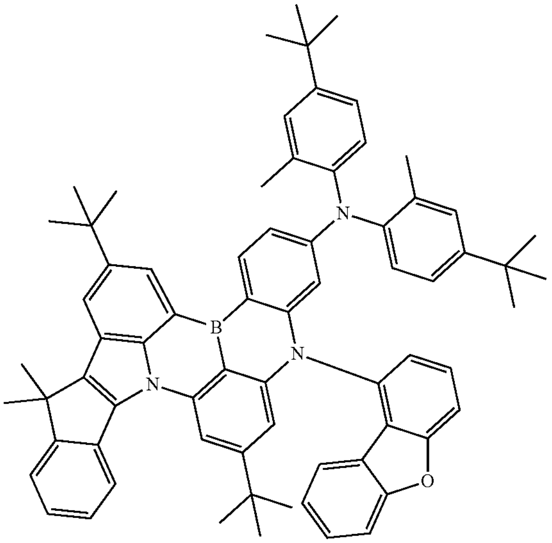
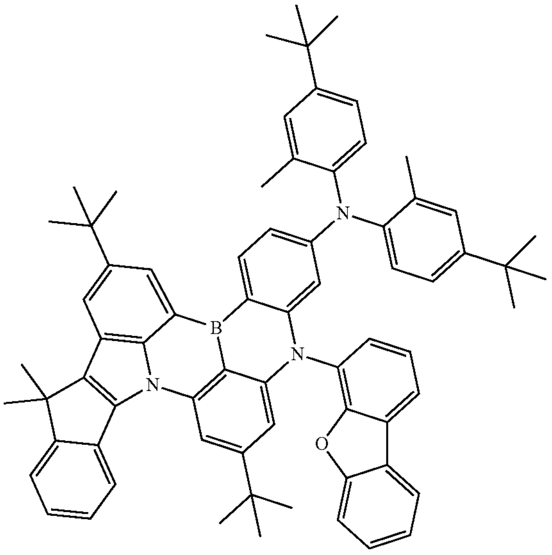

-continued
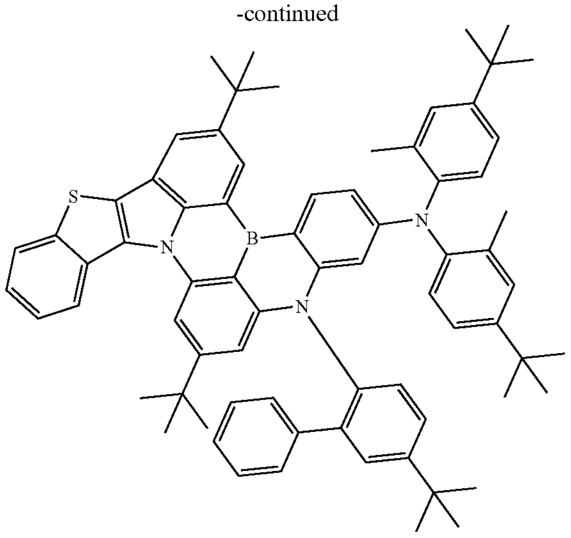
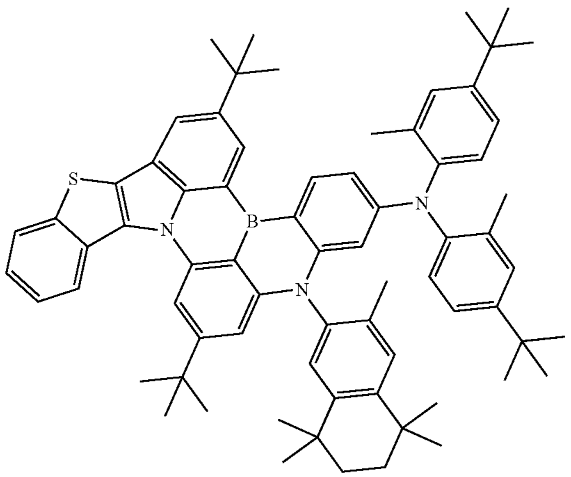
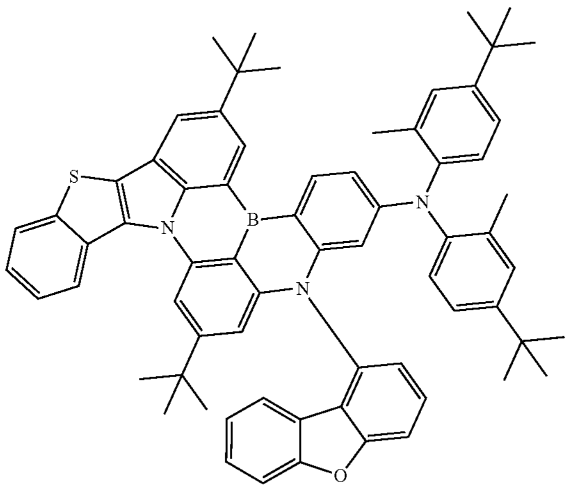
-continued
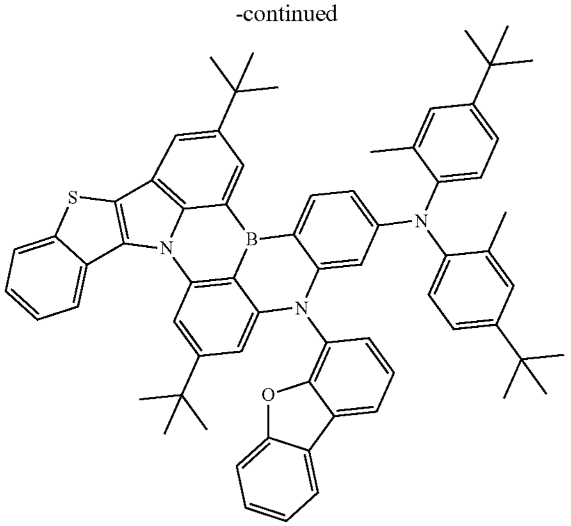
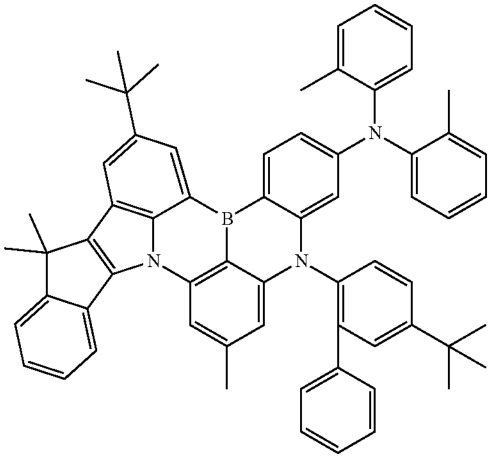
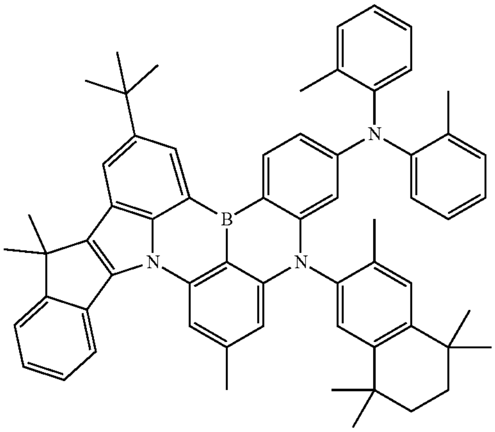

-continued
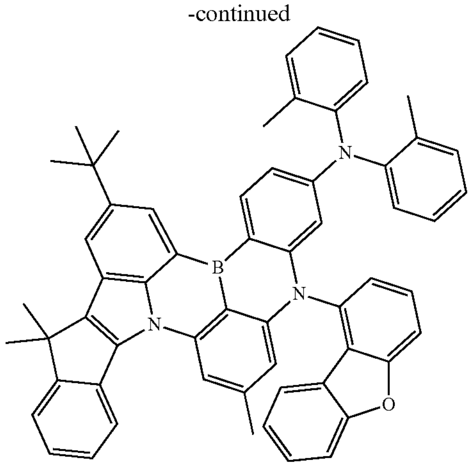
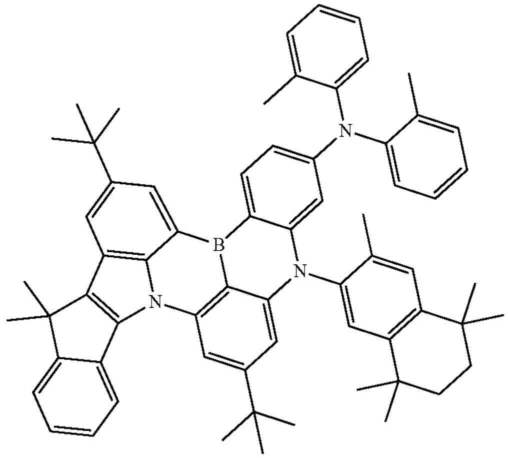
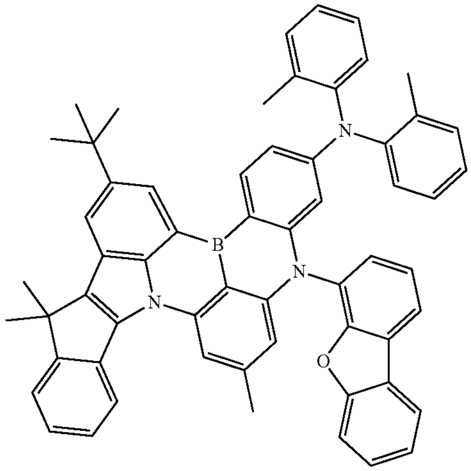
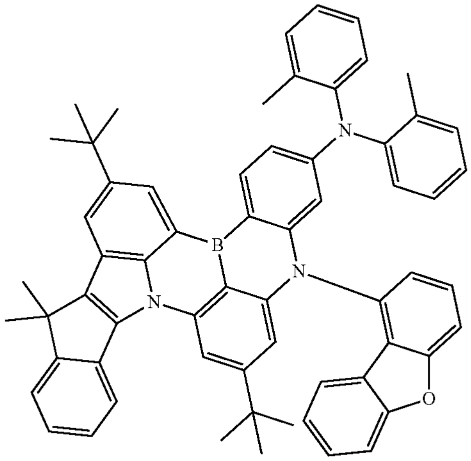
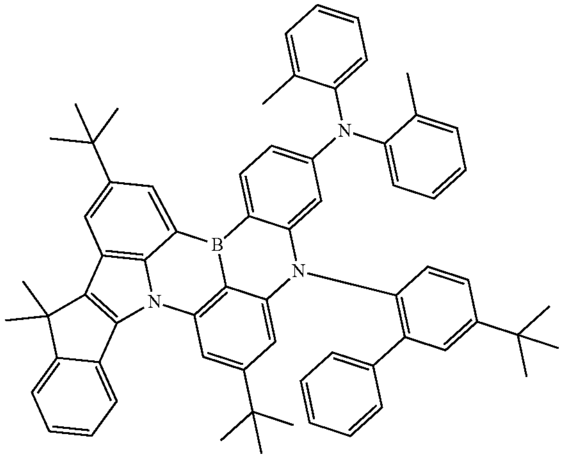
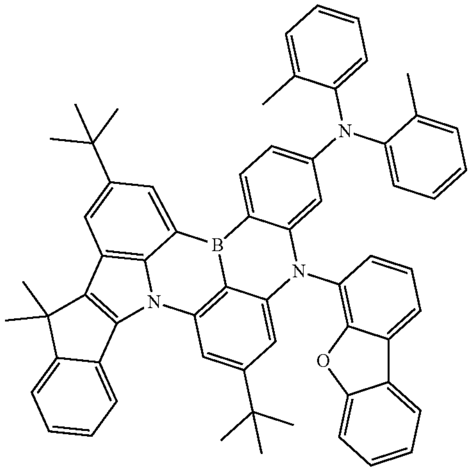
-continued -continued
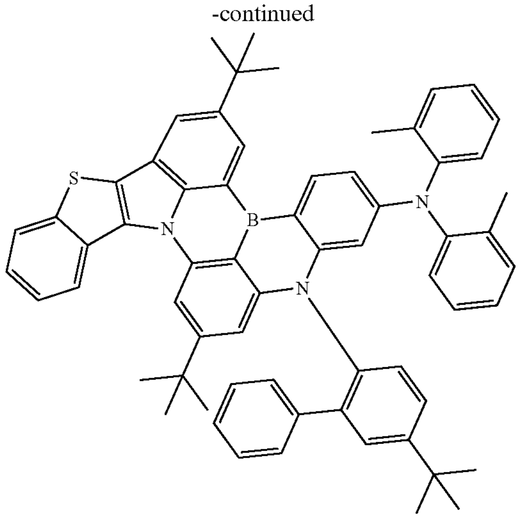
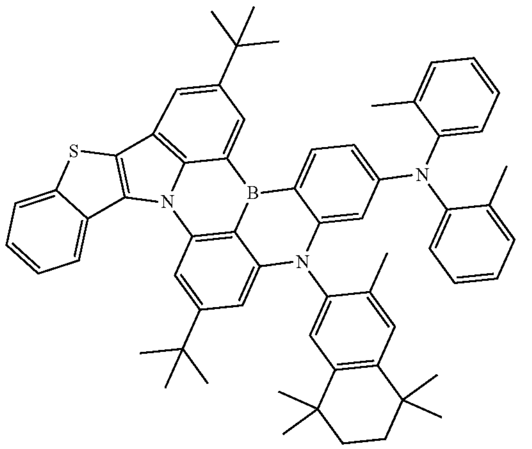
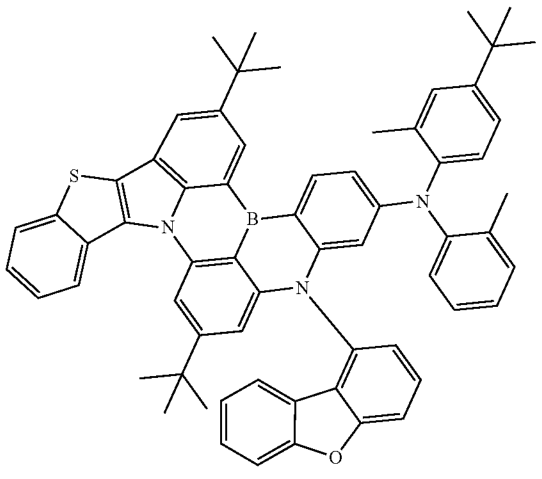
-continued
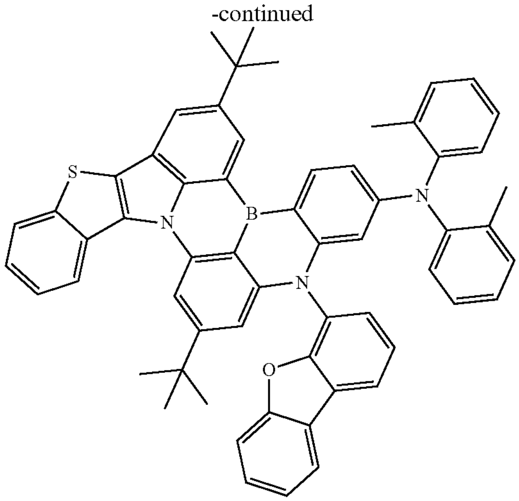
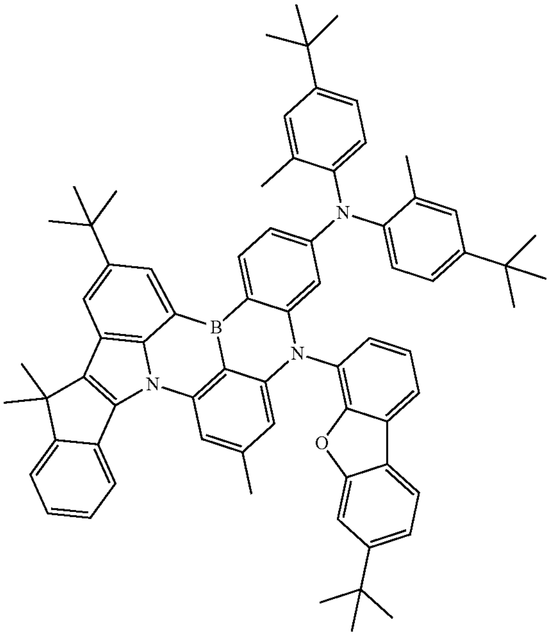
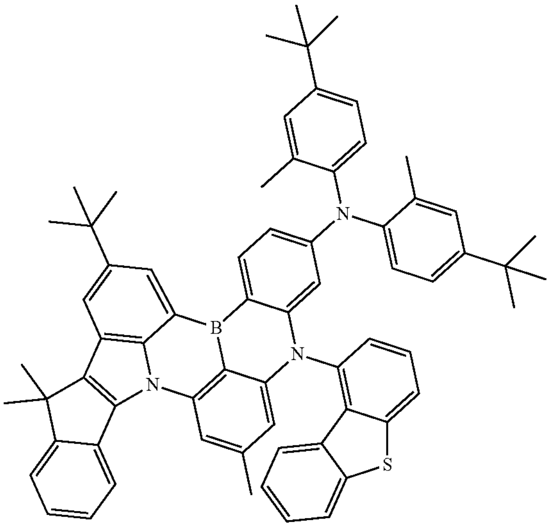

-continued
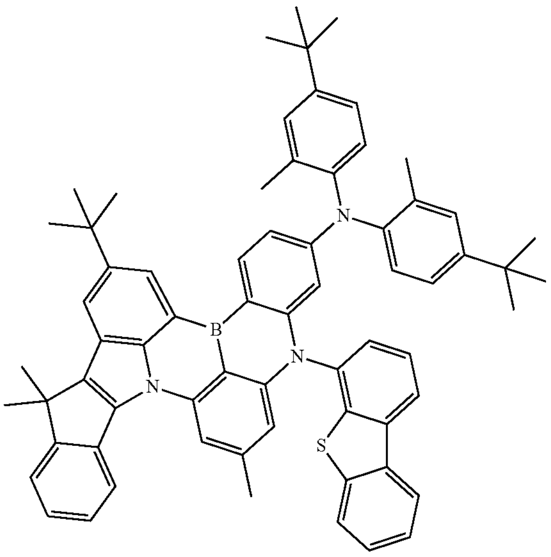
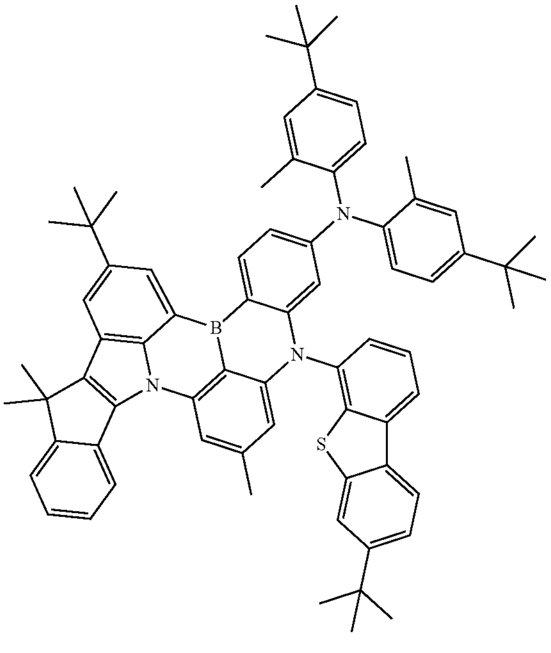
-continued
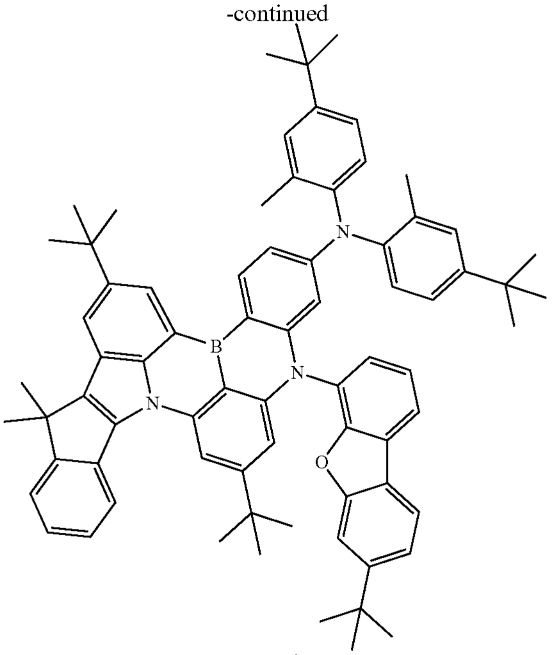
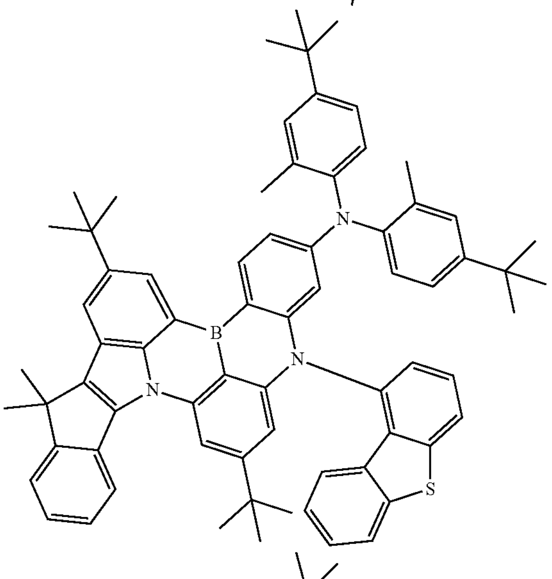
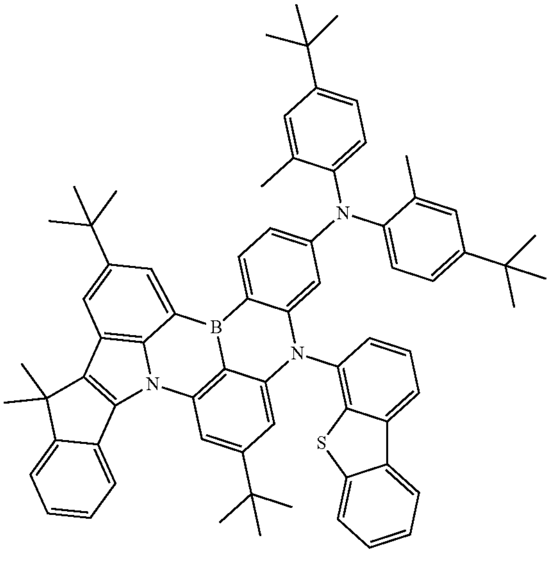

-continued
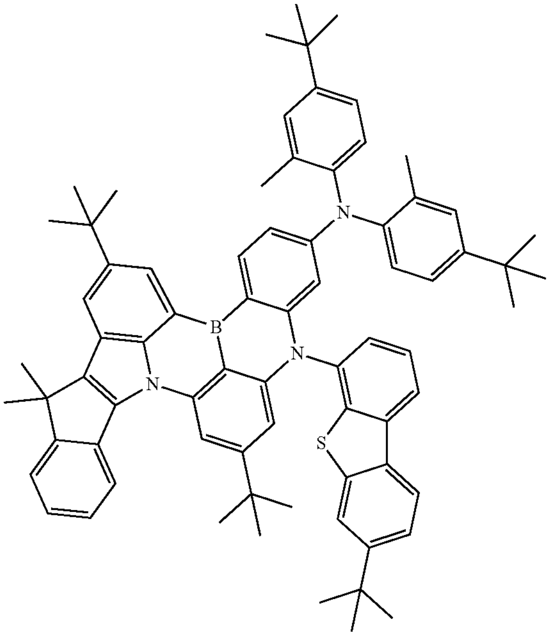
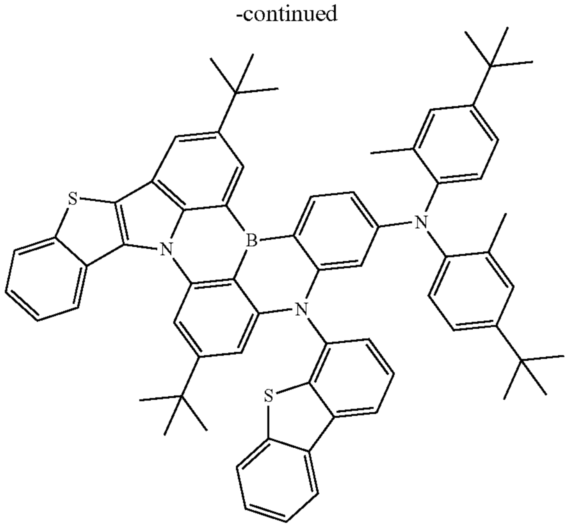
-continued
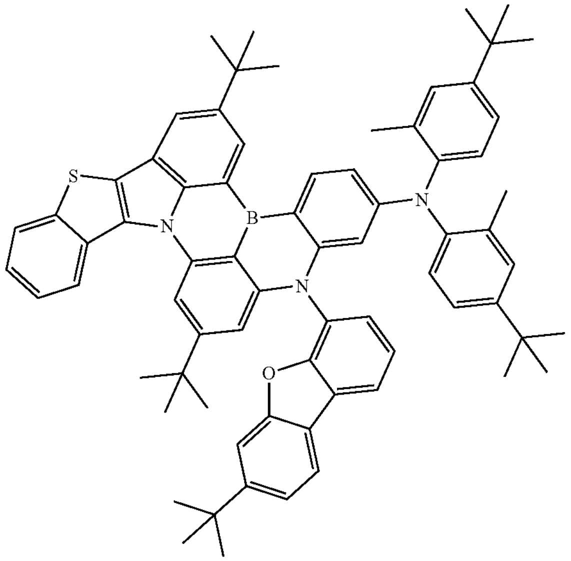
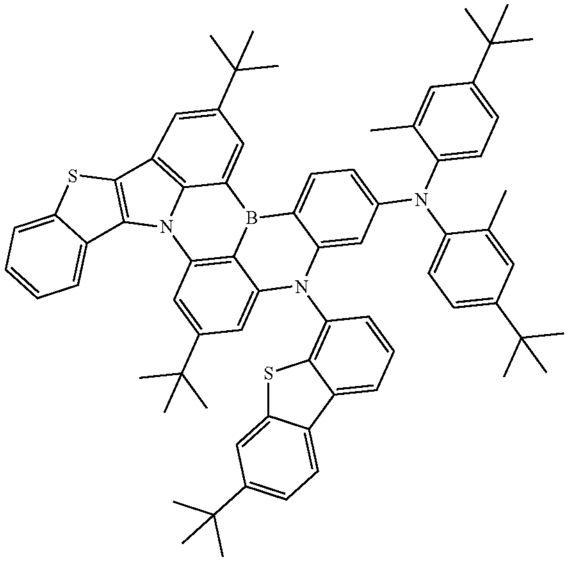
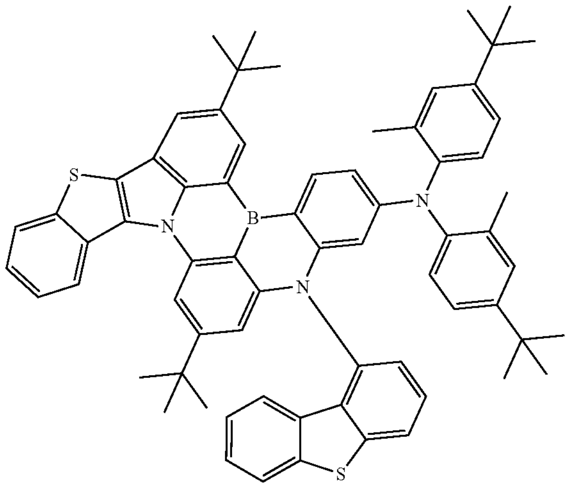
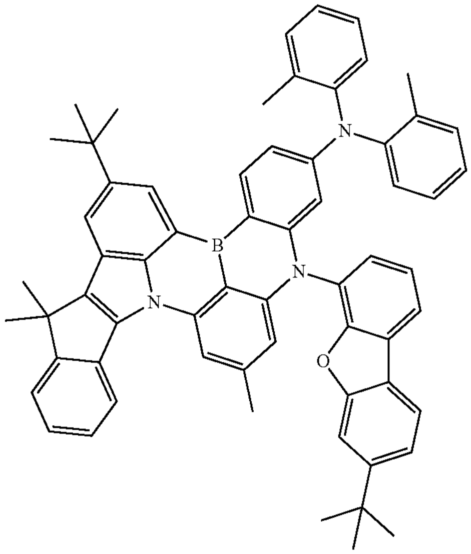

-continued
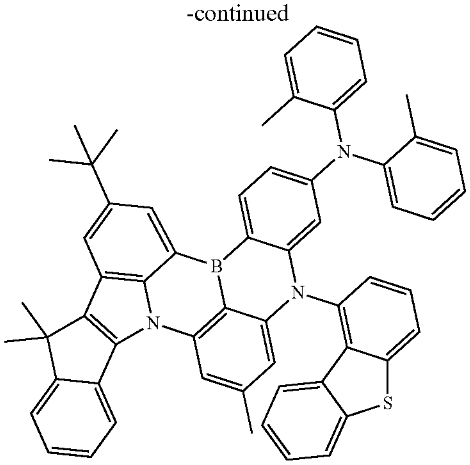
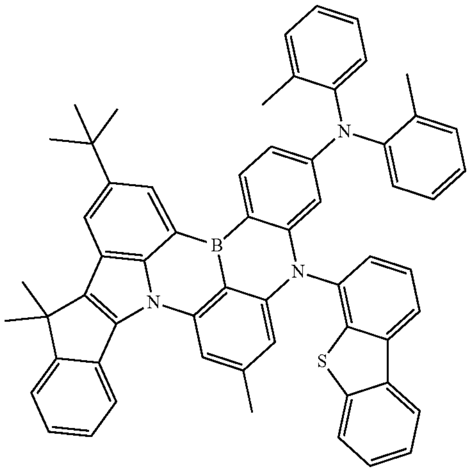
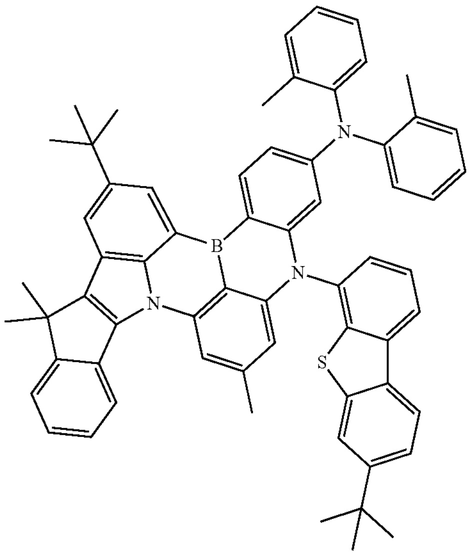
-continued
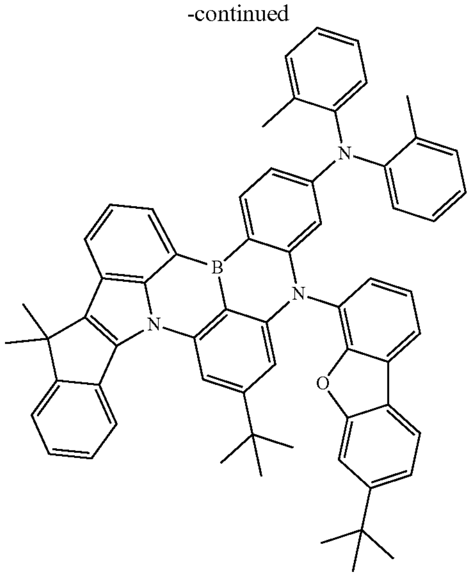
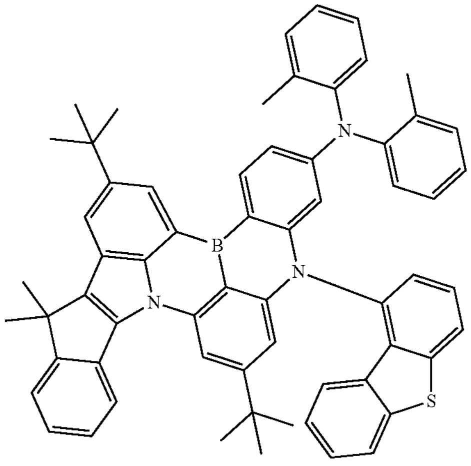
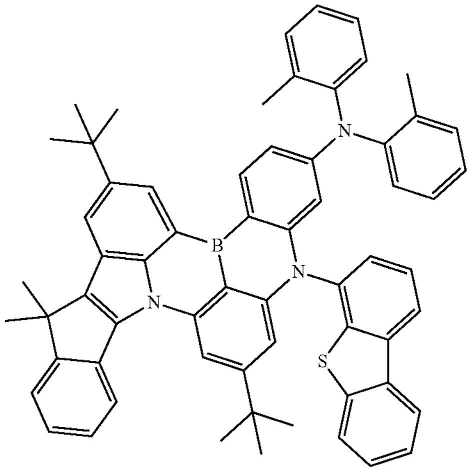

-continued
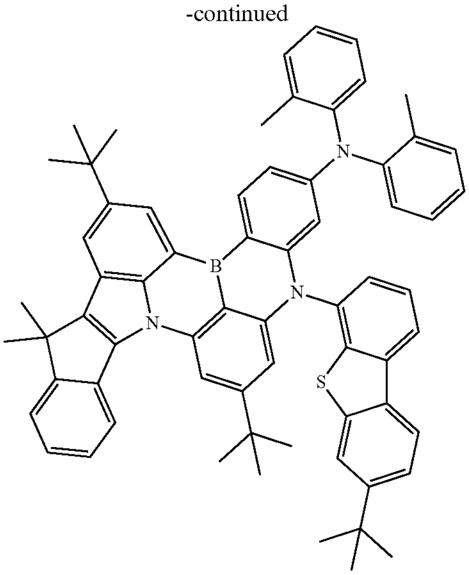
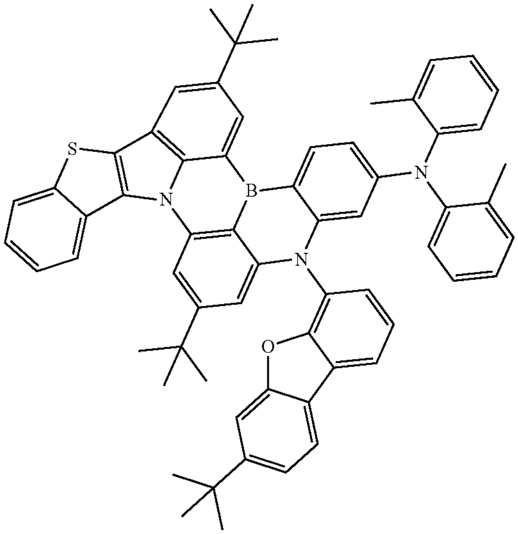
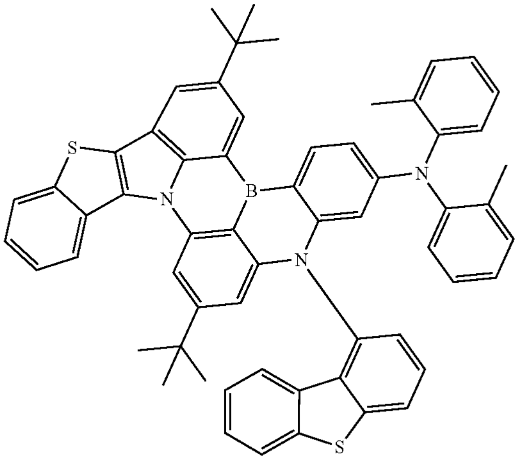
-continued
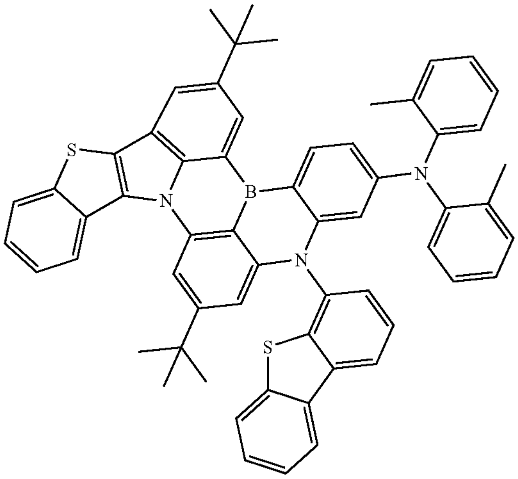
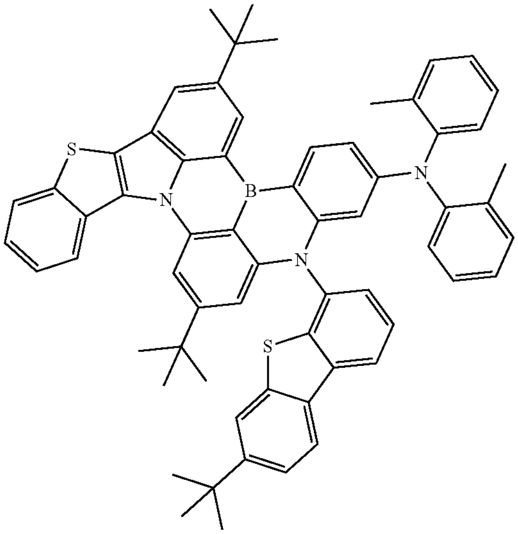
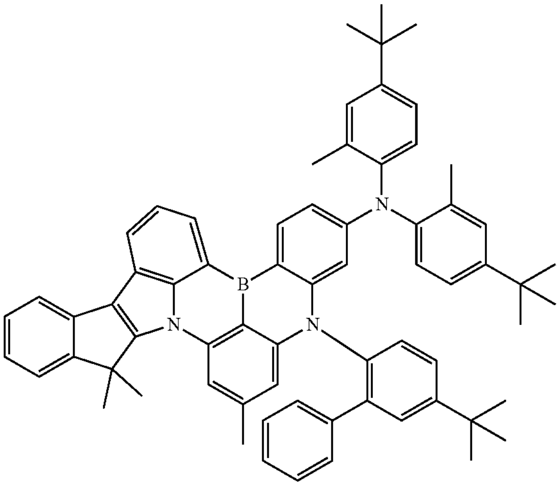

-continued
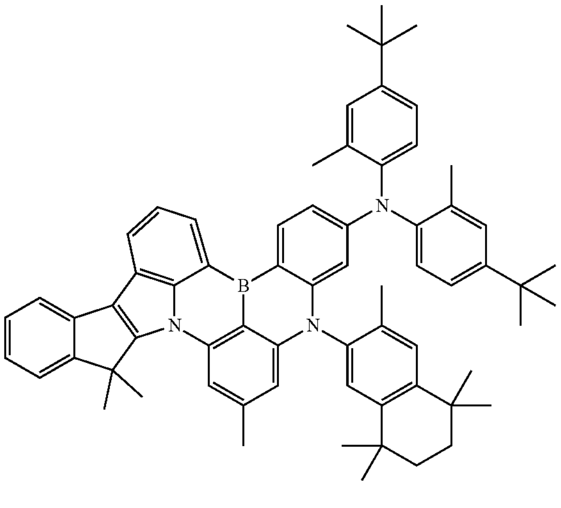
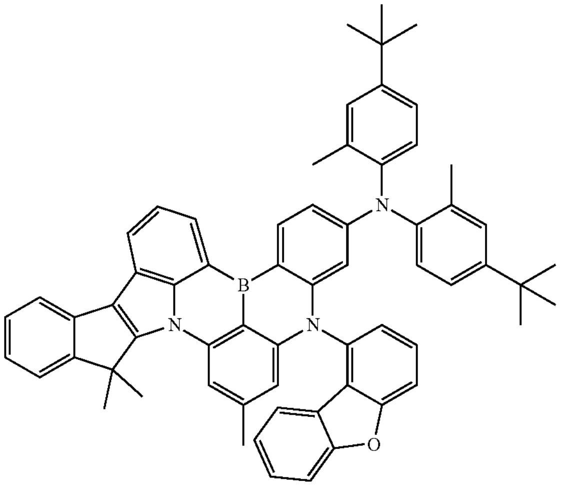
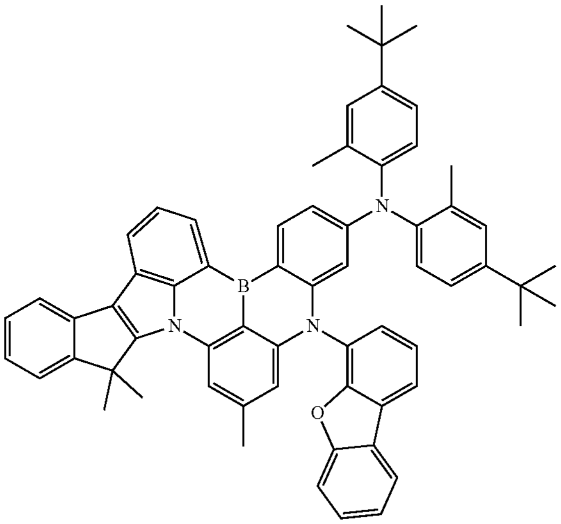
-continued
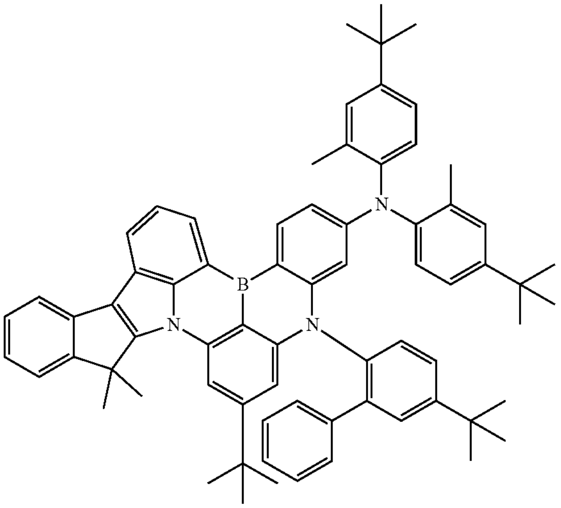
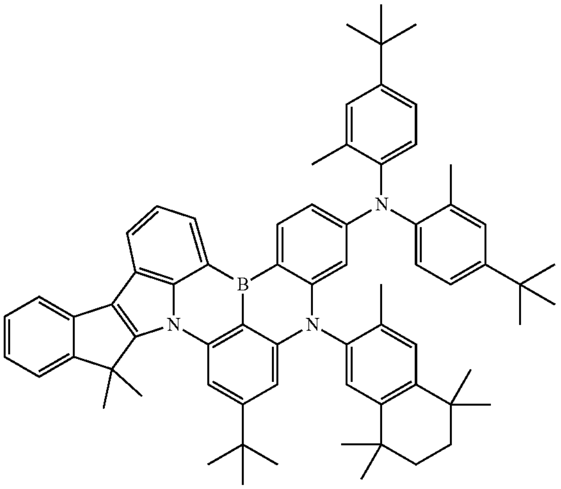
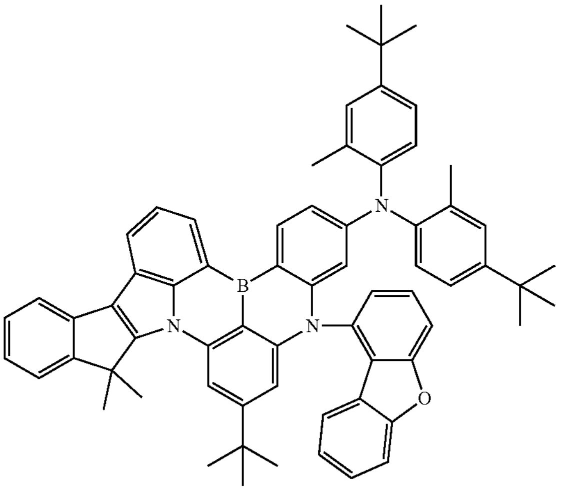

-continued
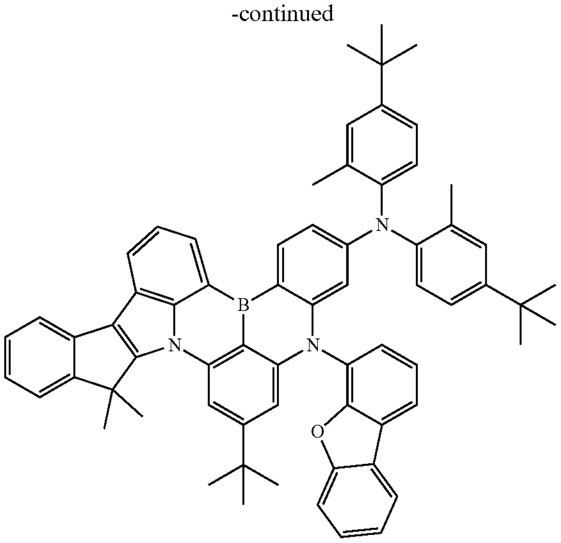
-continued
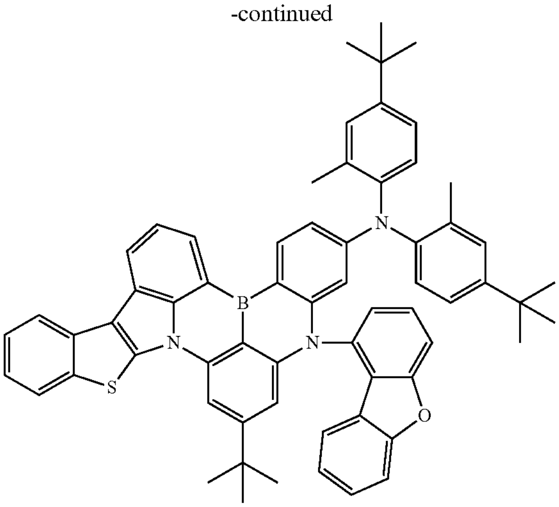
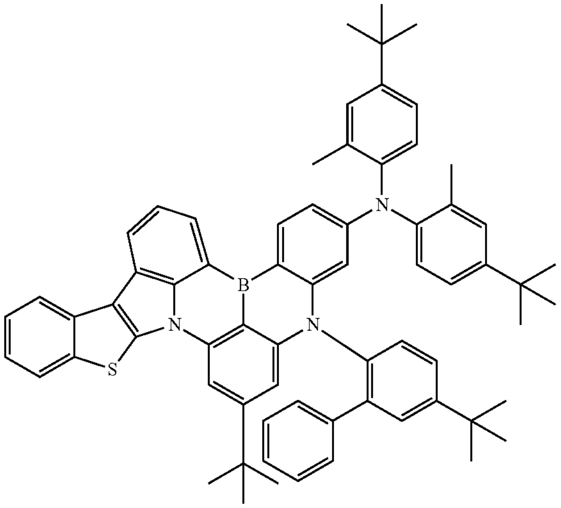
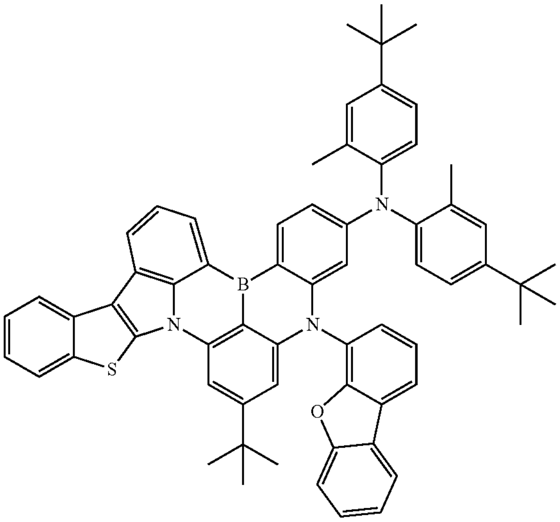
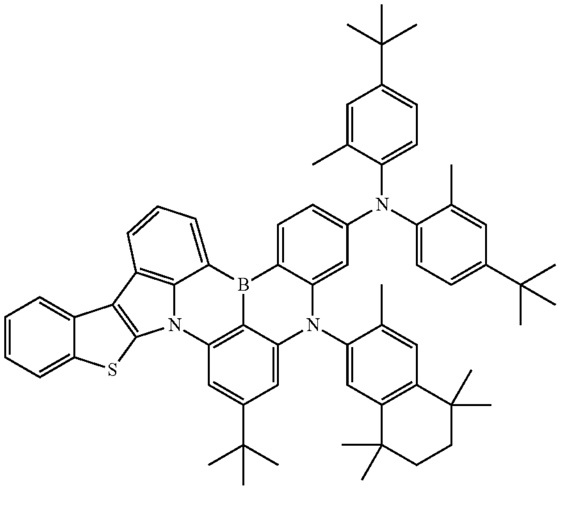
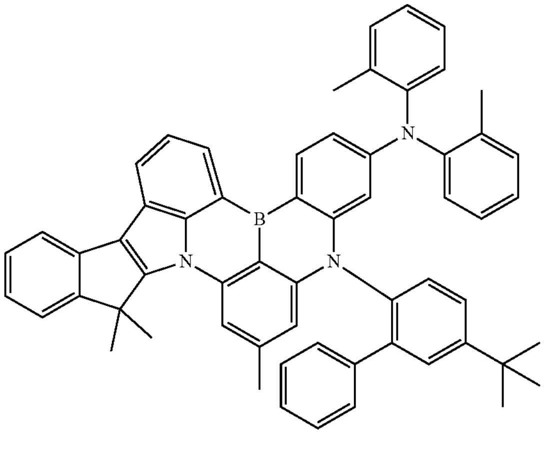

-continued
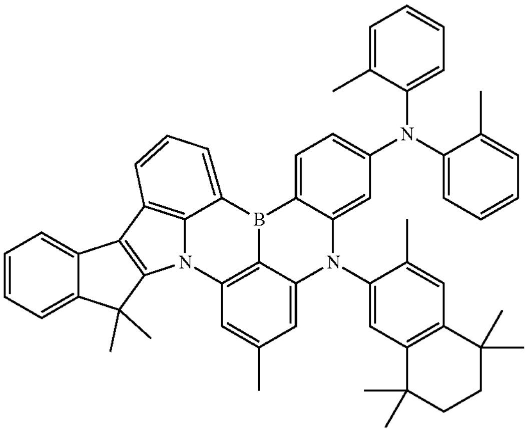
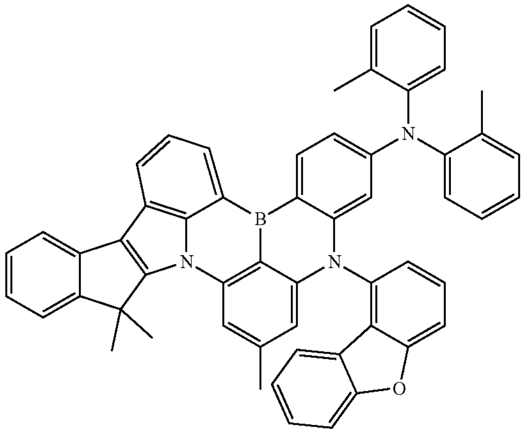
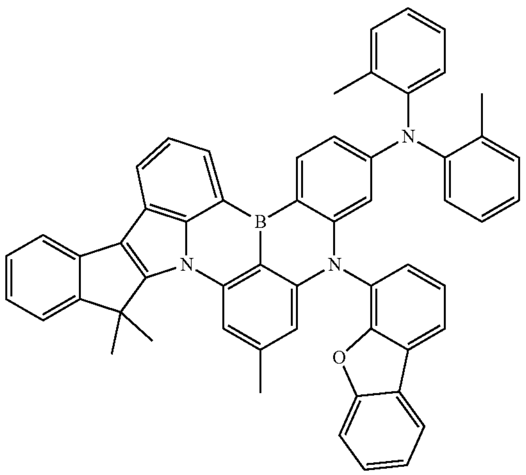
-continued
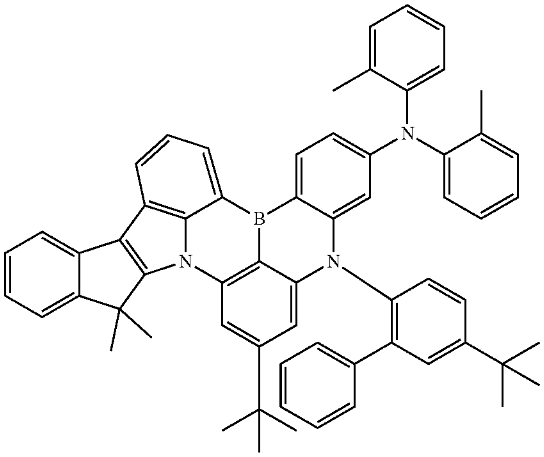
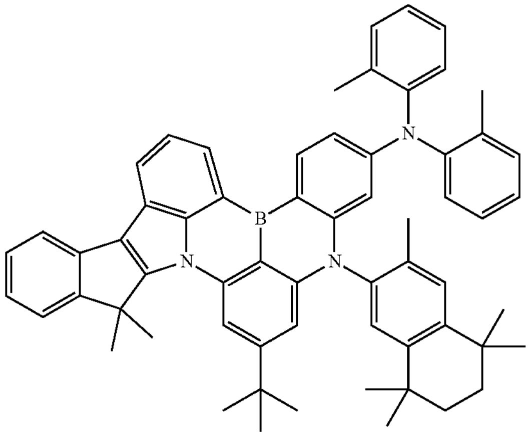
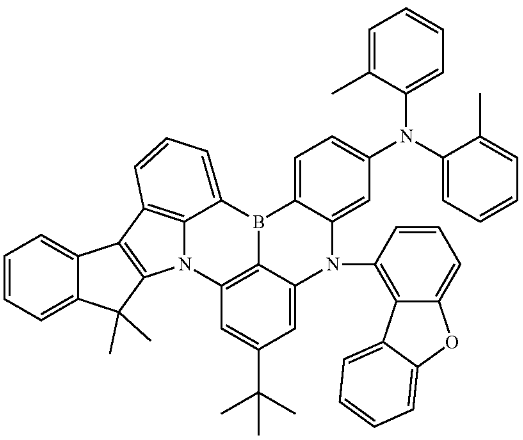

-continued
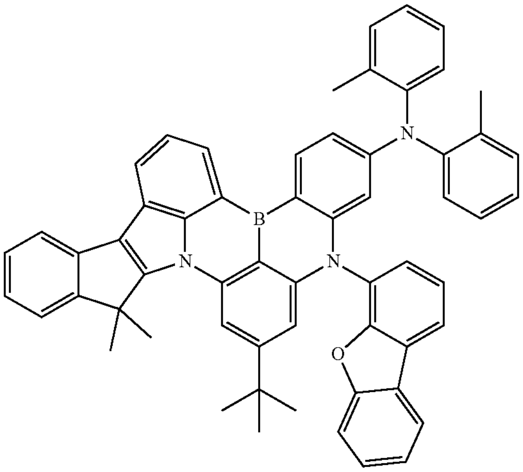
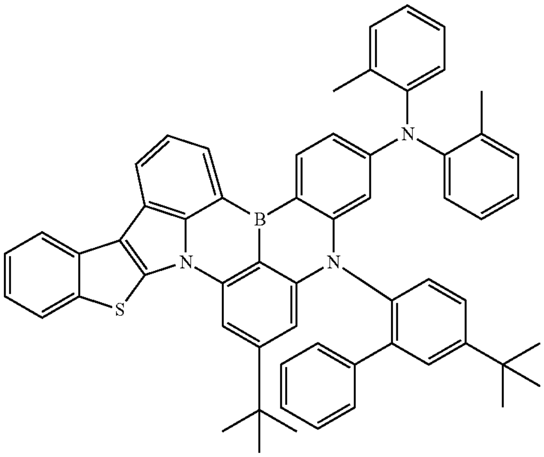
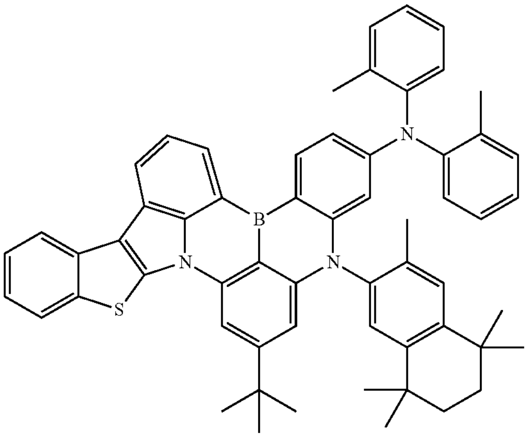
-continued
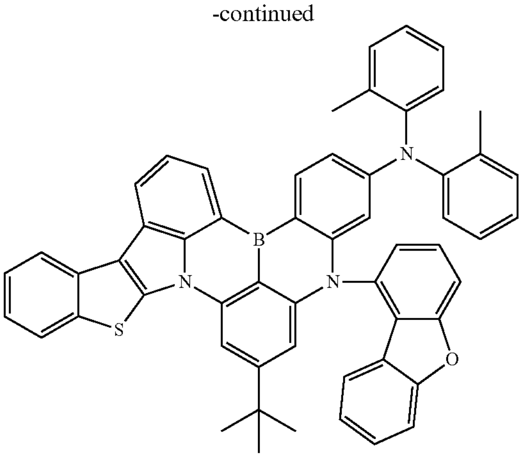
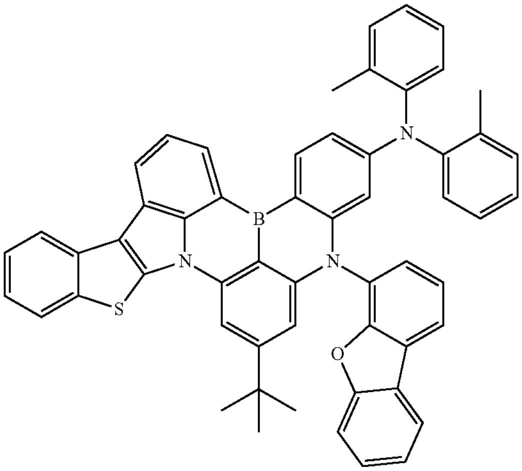
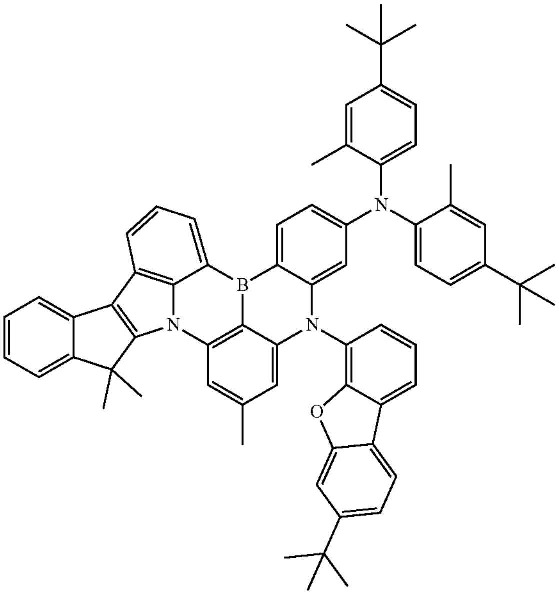

-continued
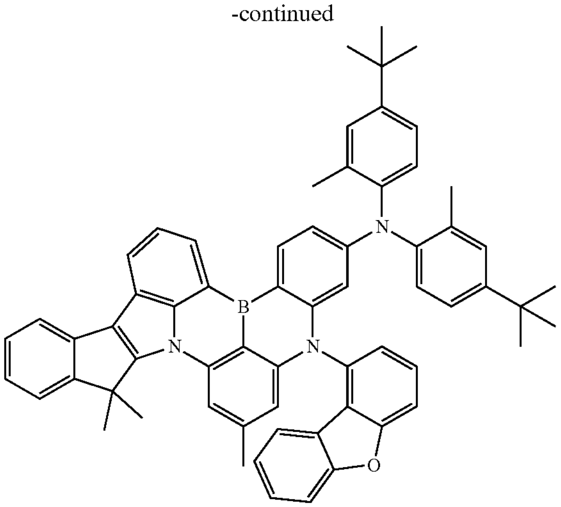
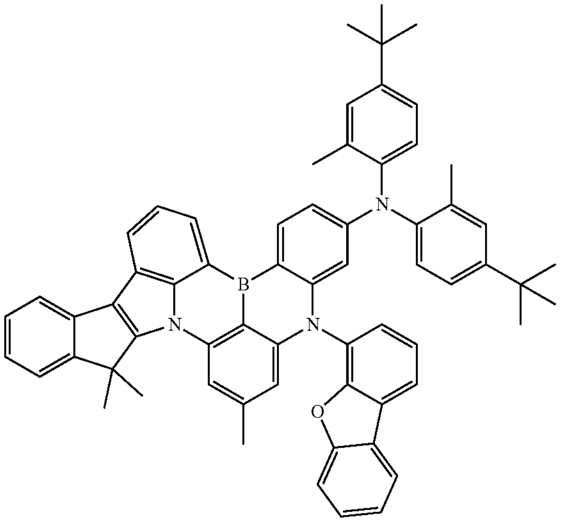
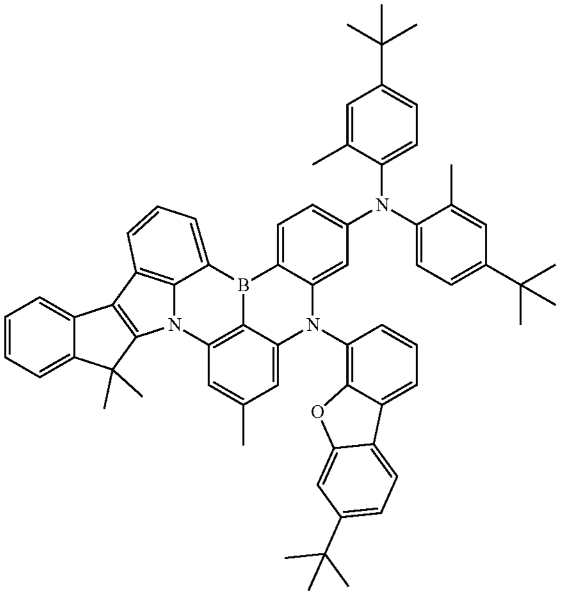
-continued
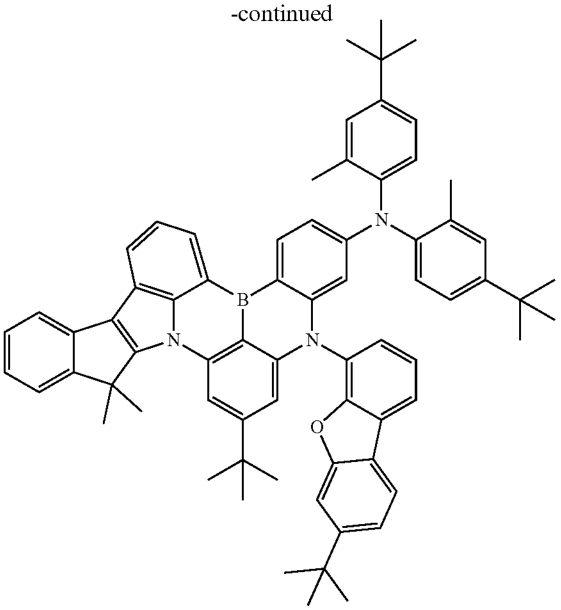
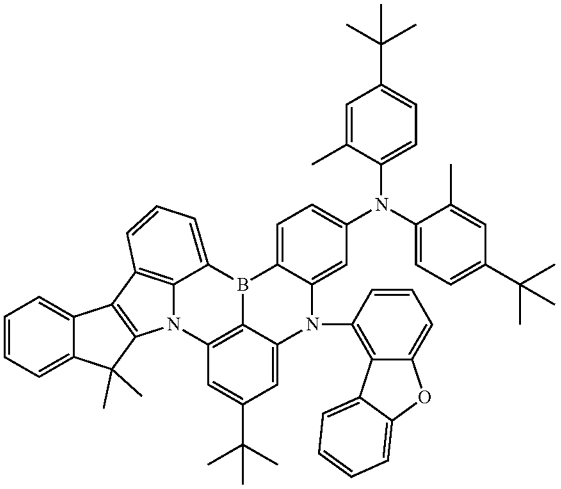
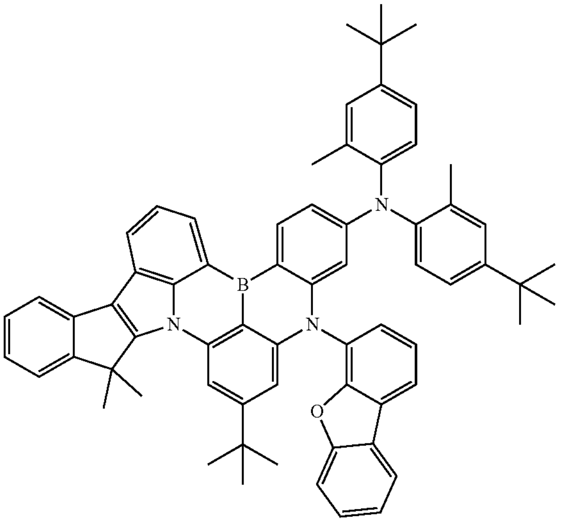

-continued
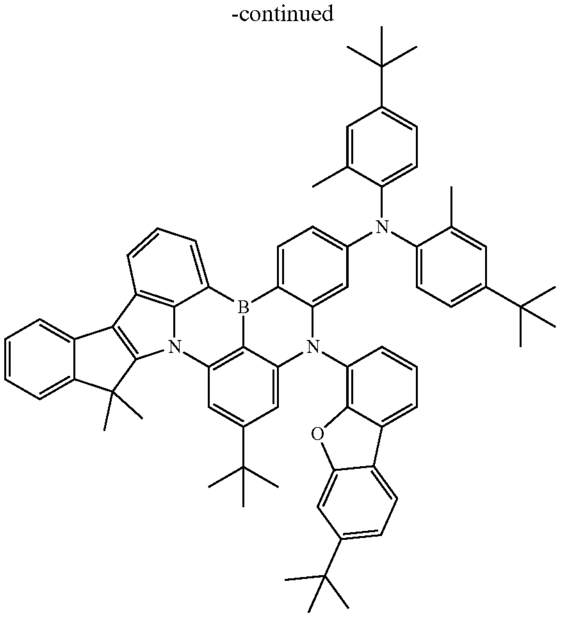
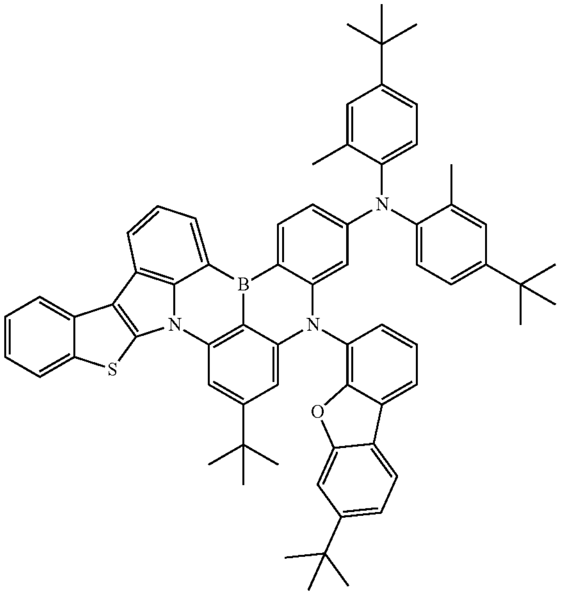
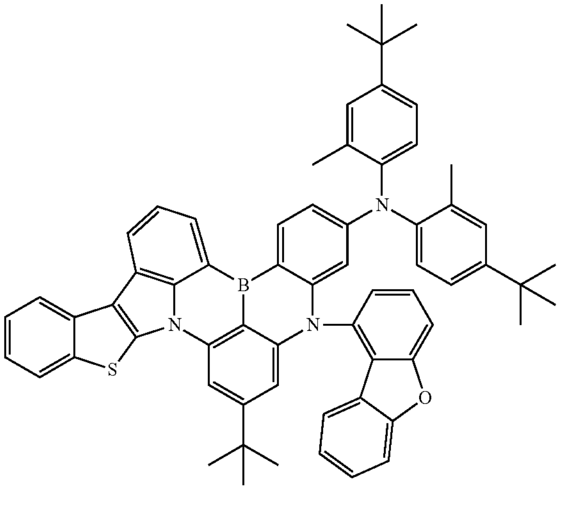
-continued
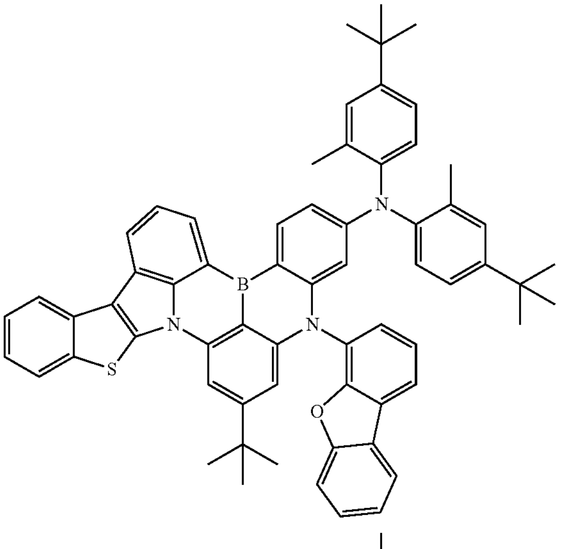
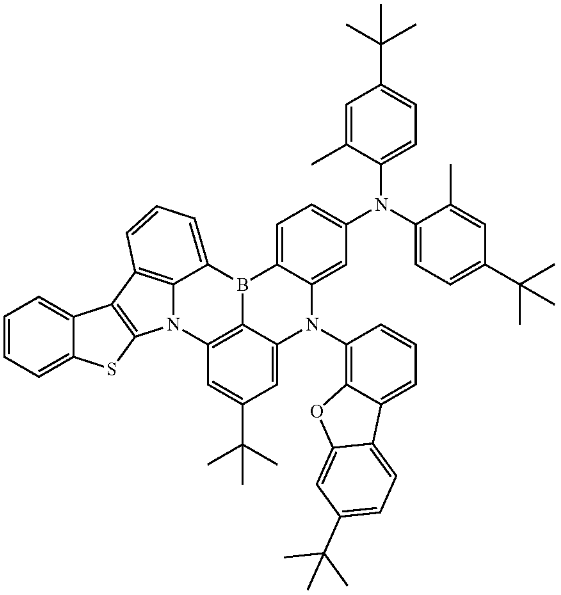
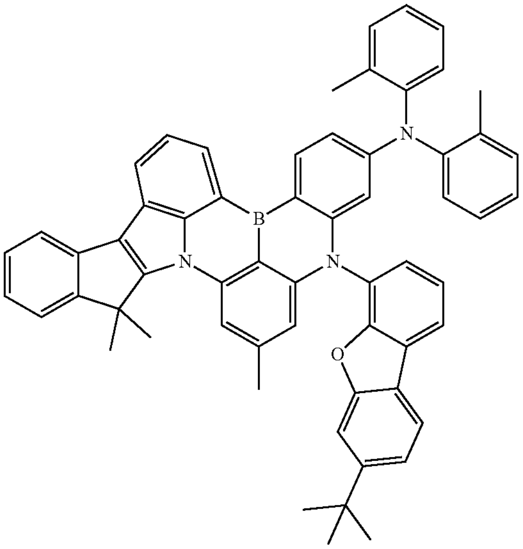

-continued
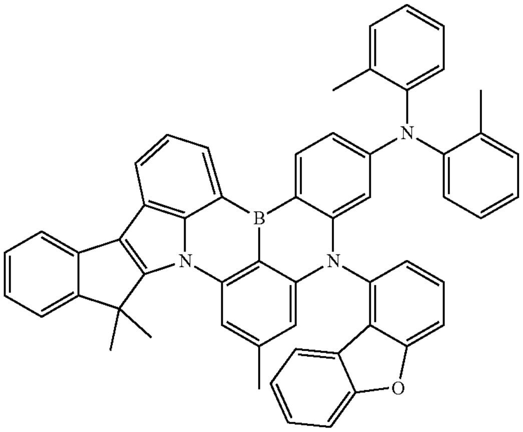
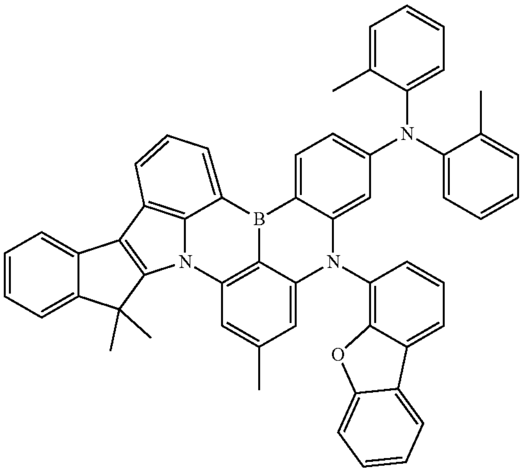
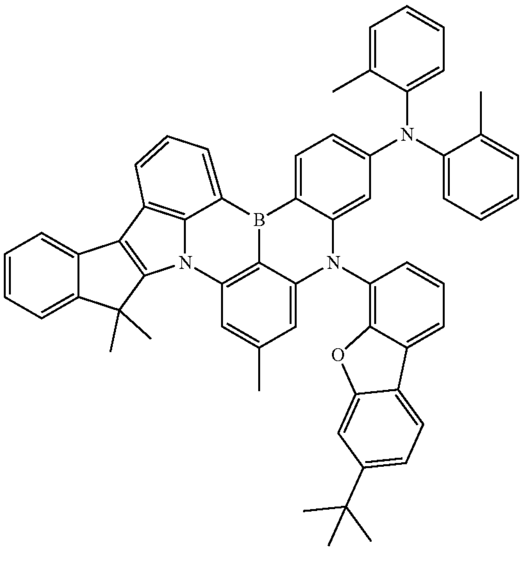
-continued
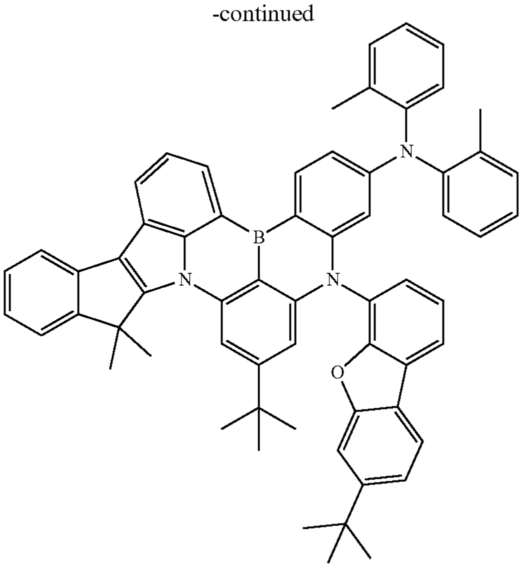
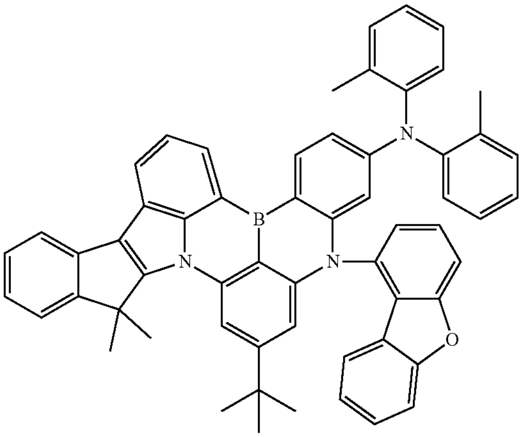
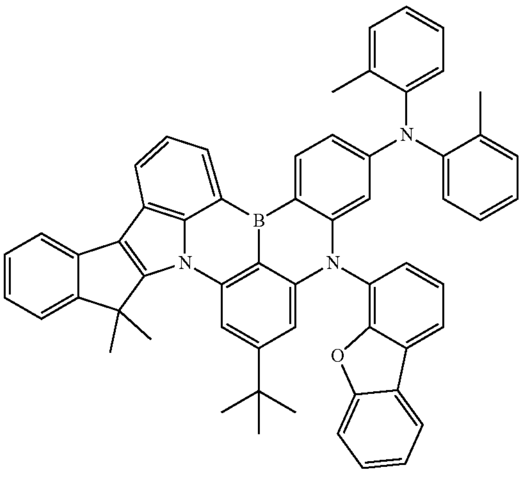

-continued
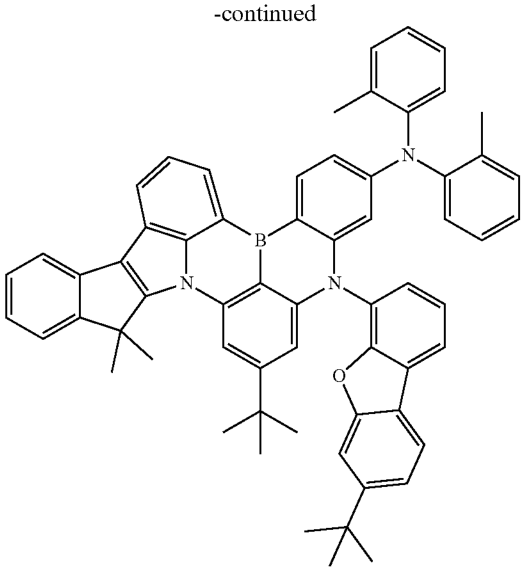
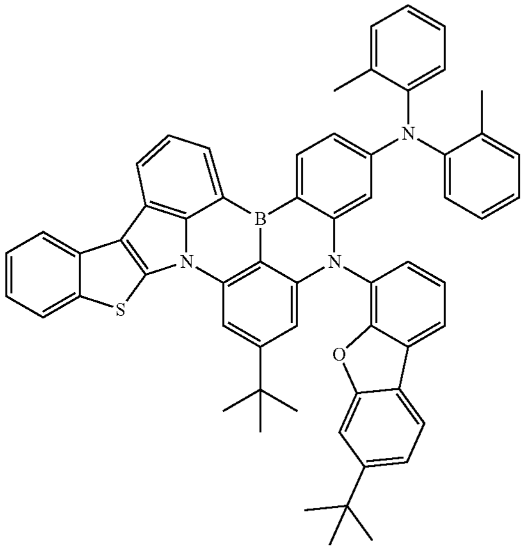
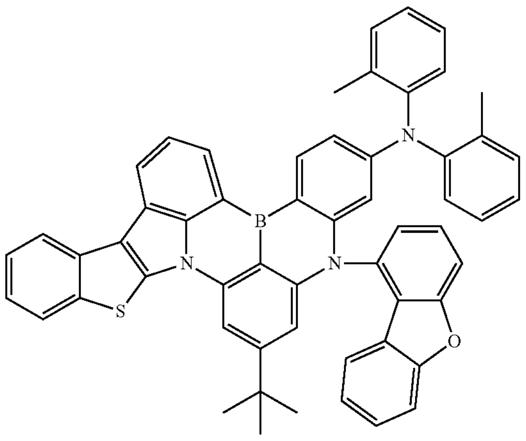
-continued
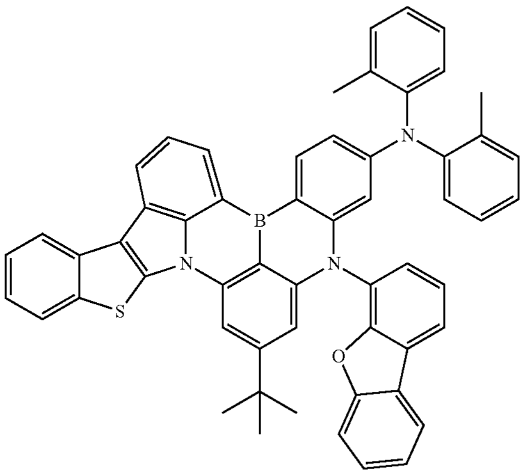
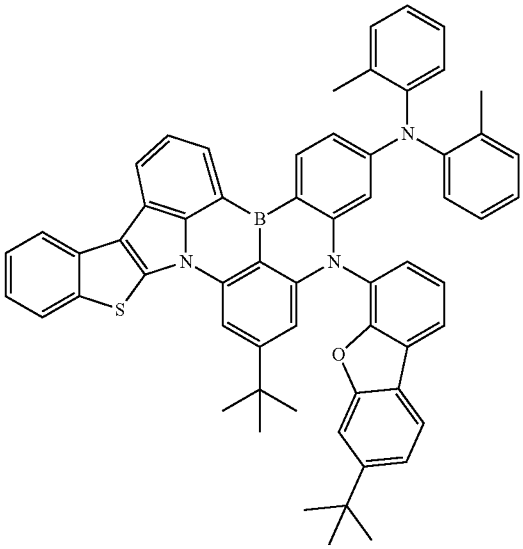
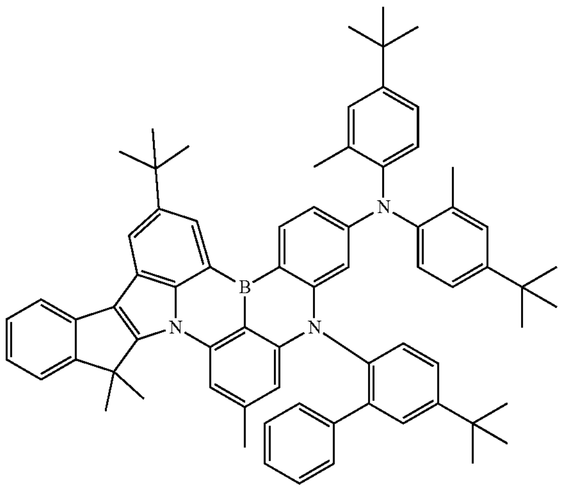

-continued
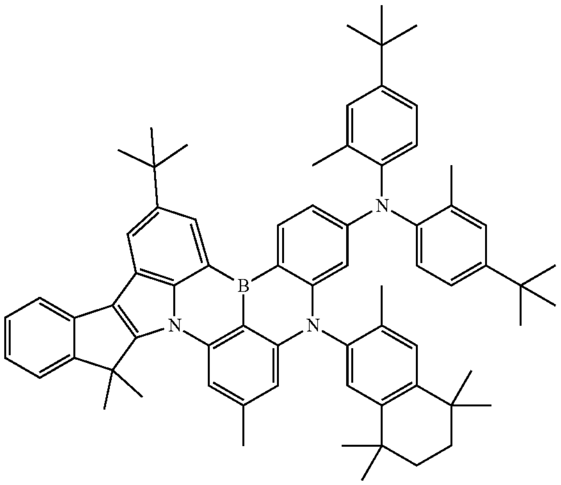
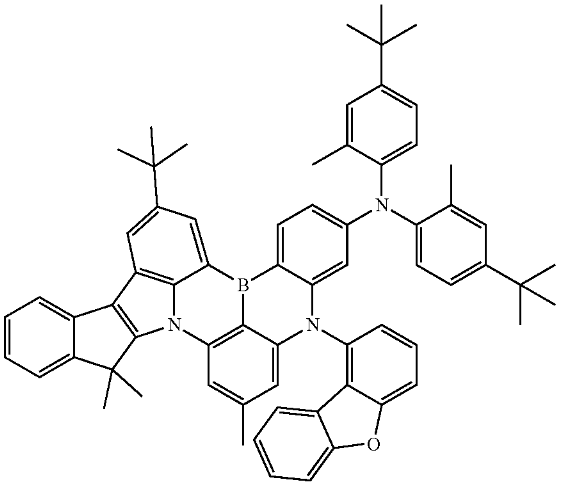
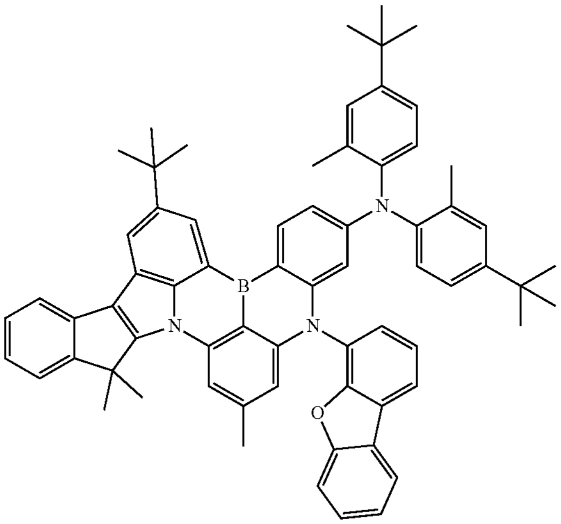
-continued
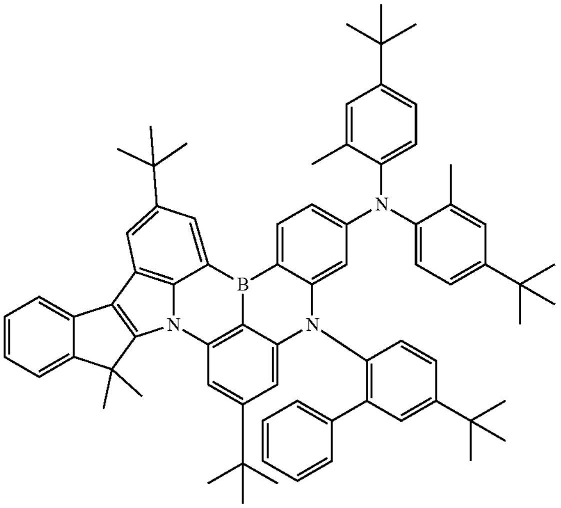
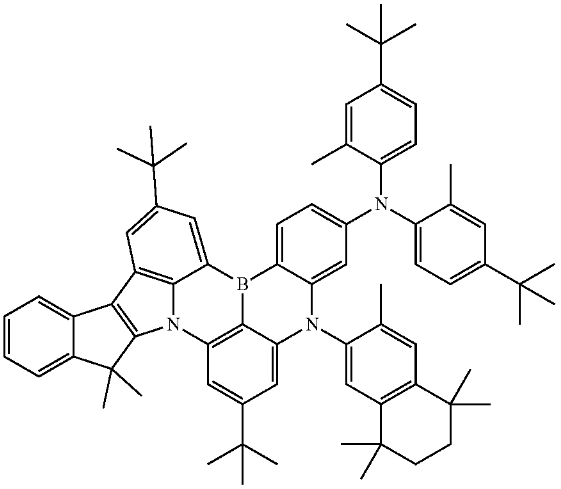
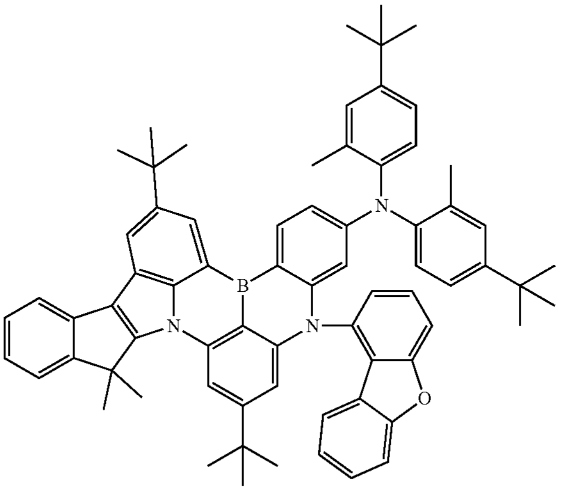

-continued
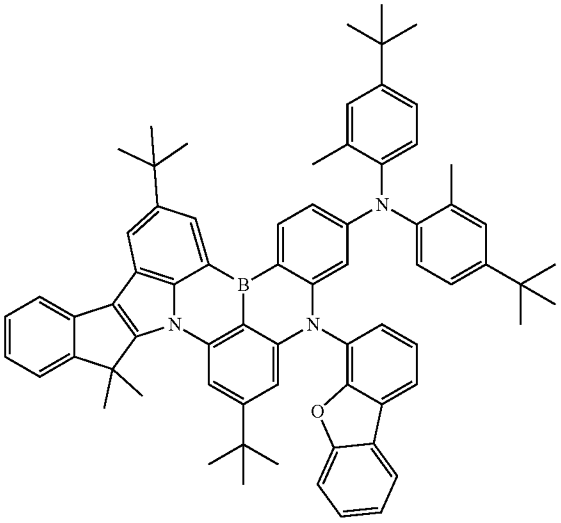
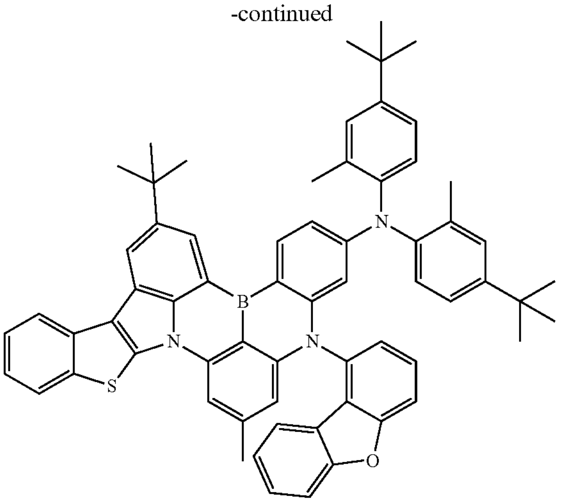
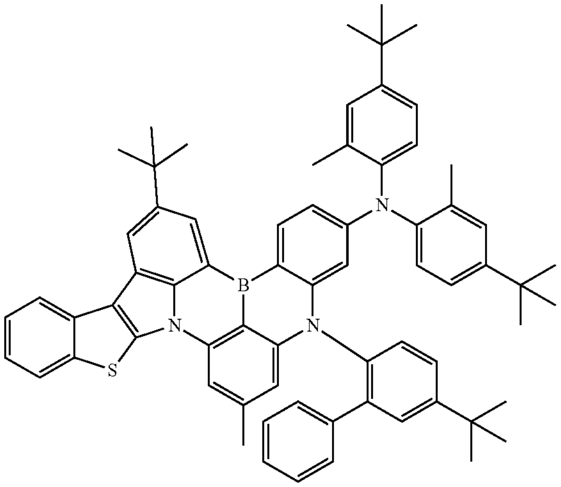
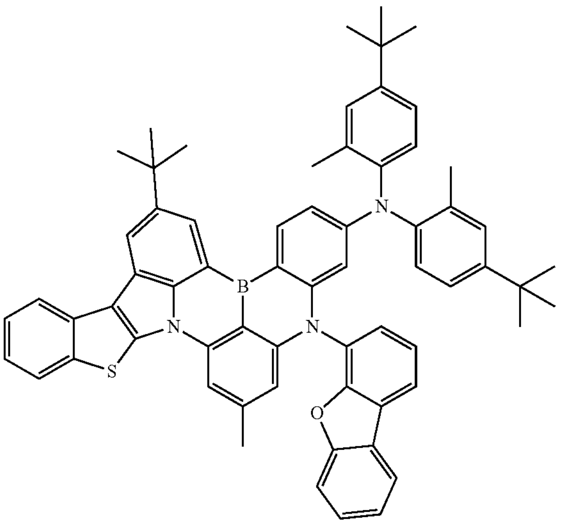
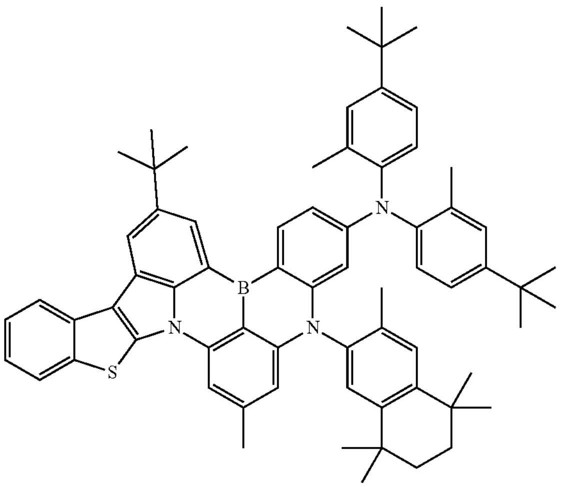
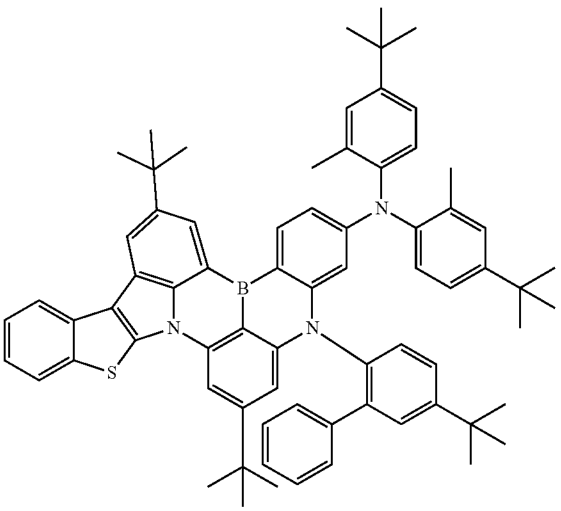
-continued

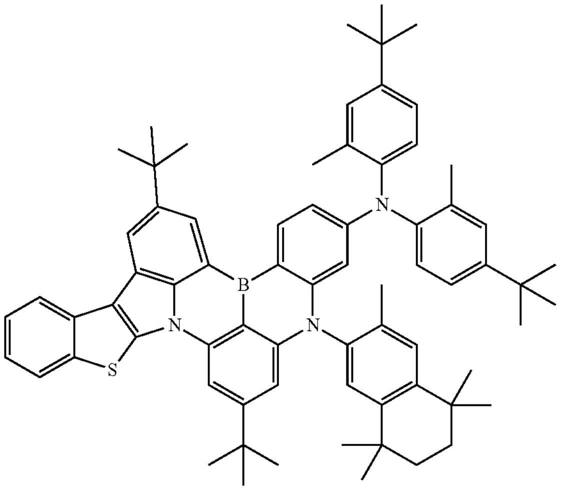
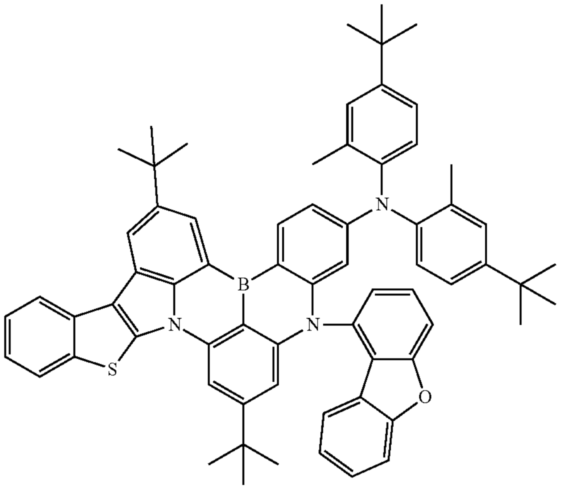
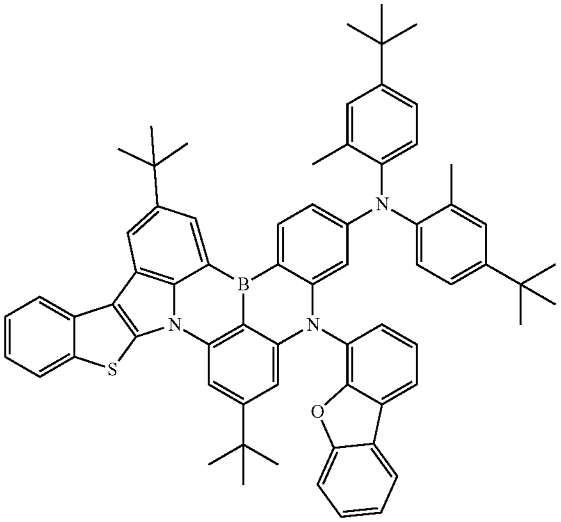
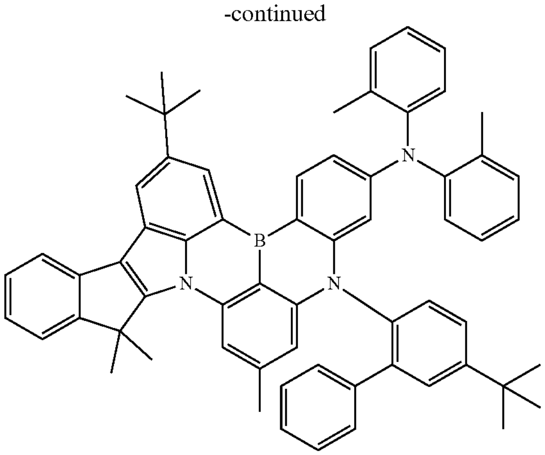
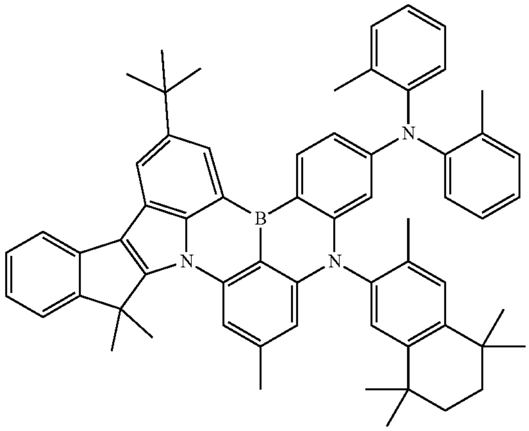
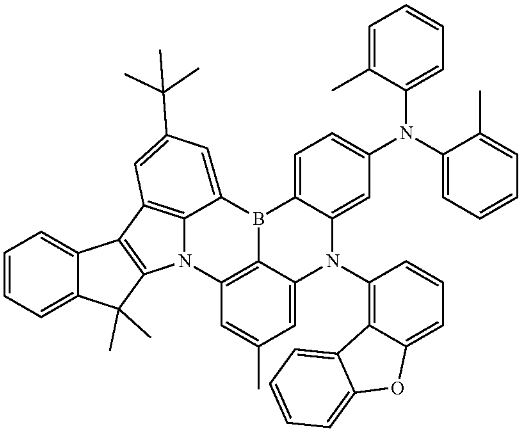

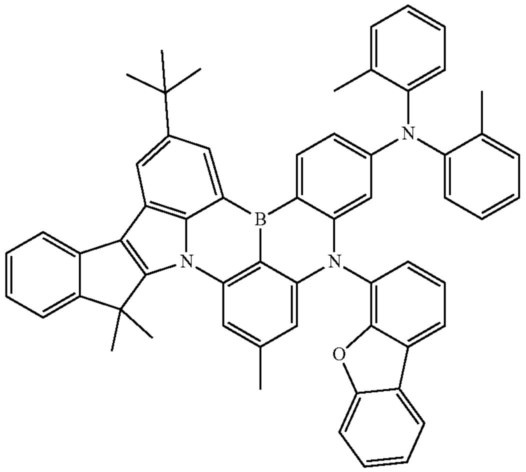
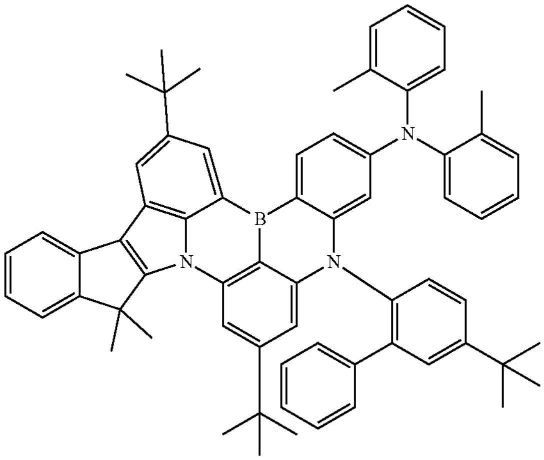
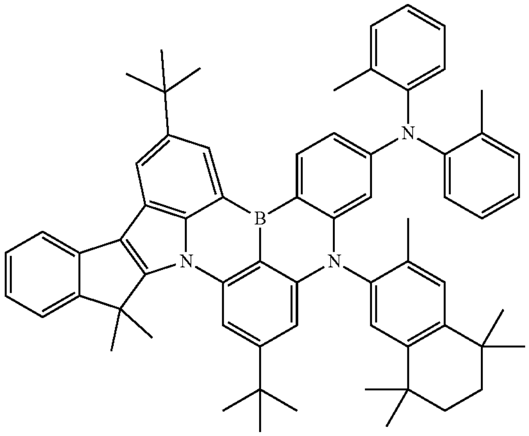
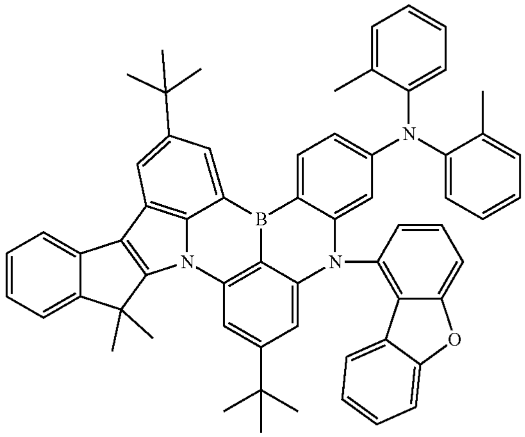
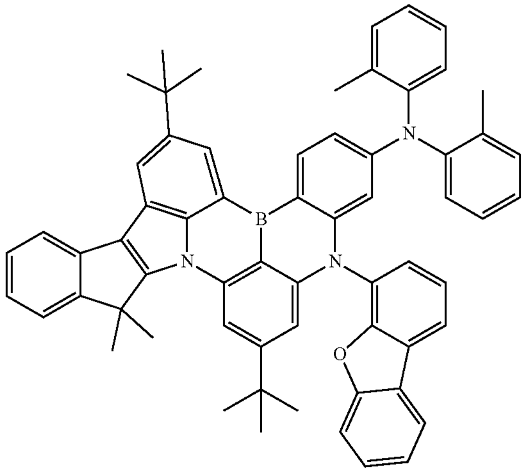
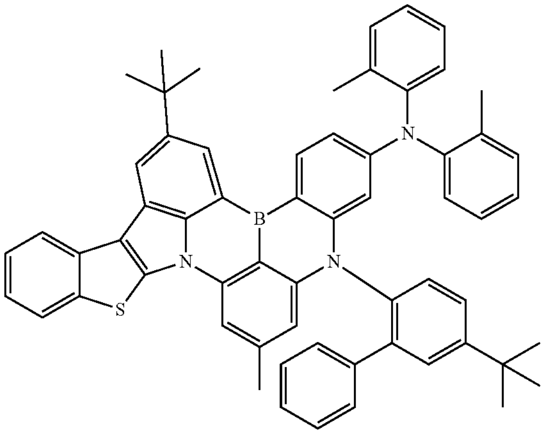

-continued
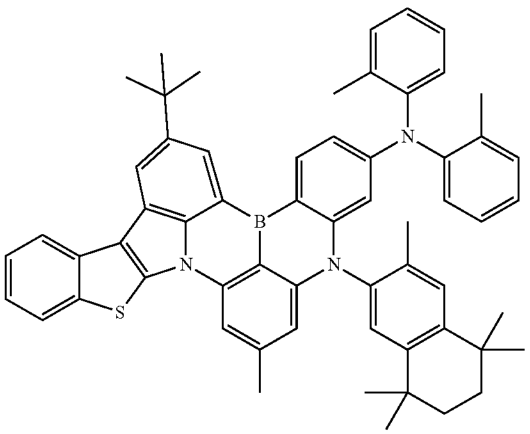
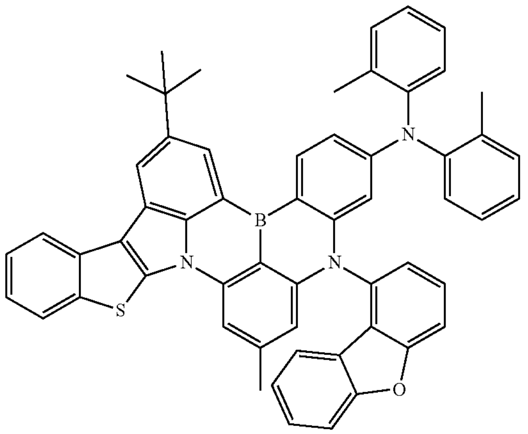
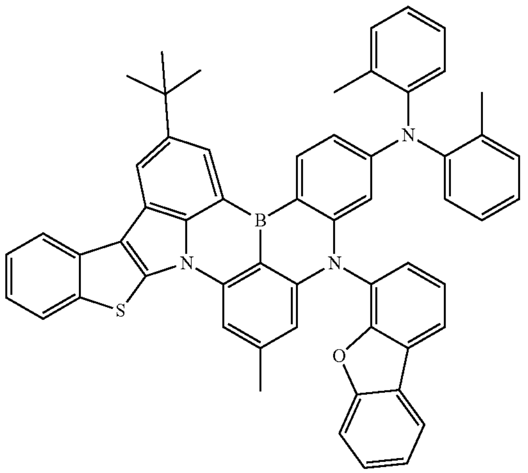
-continued
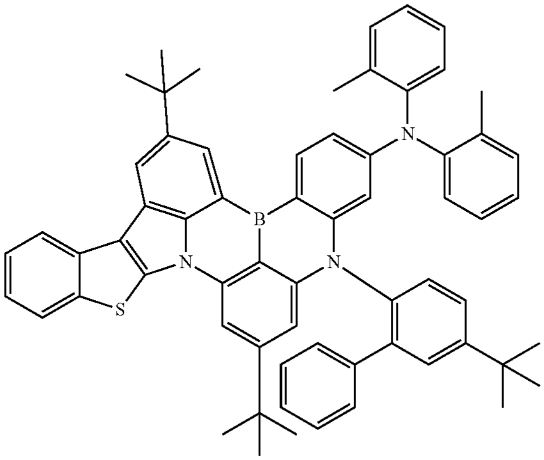
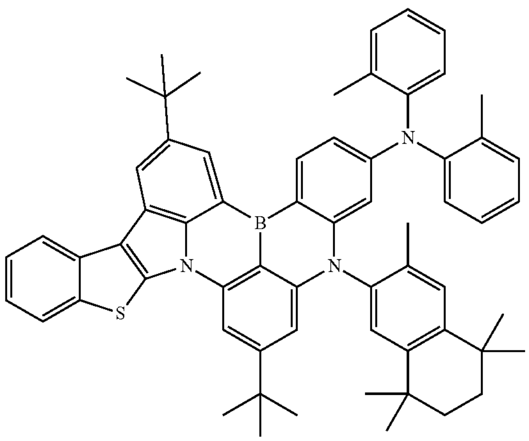
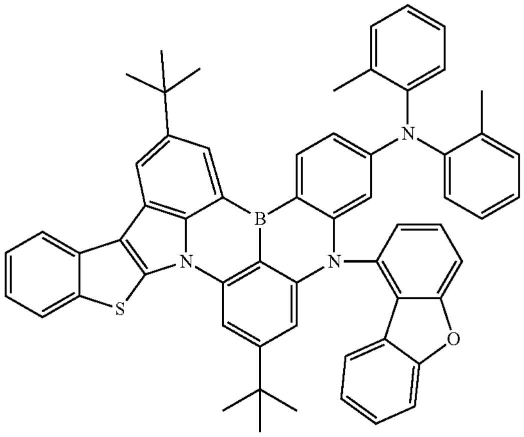

-continued
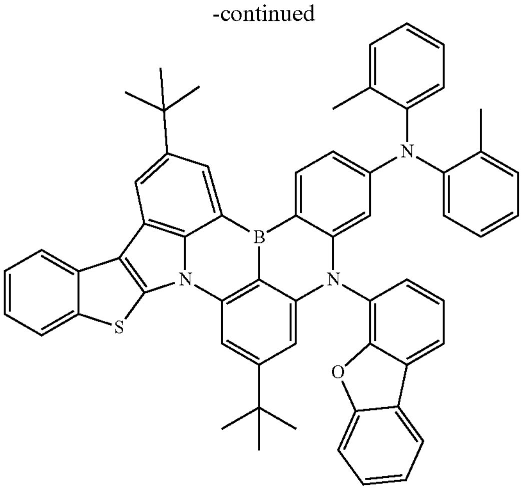
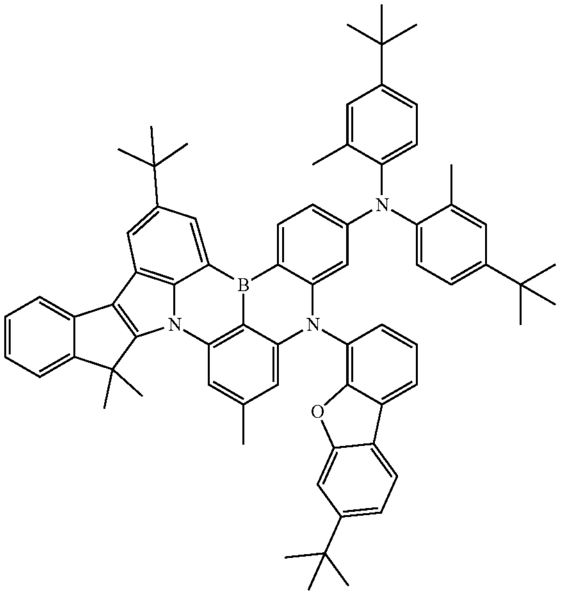
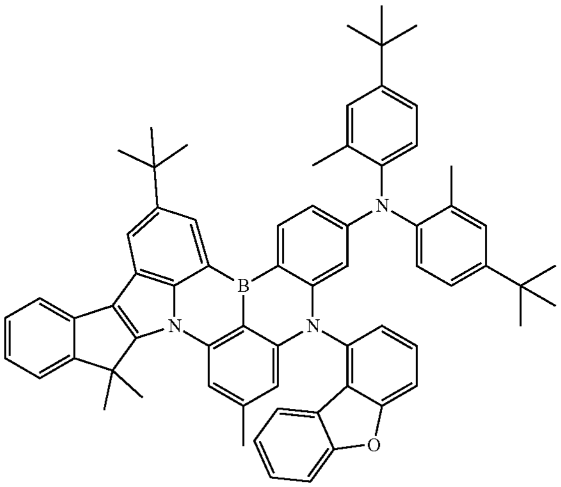
-continued
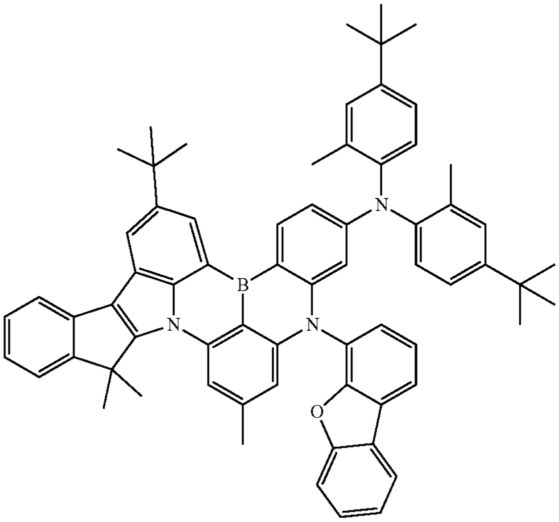
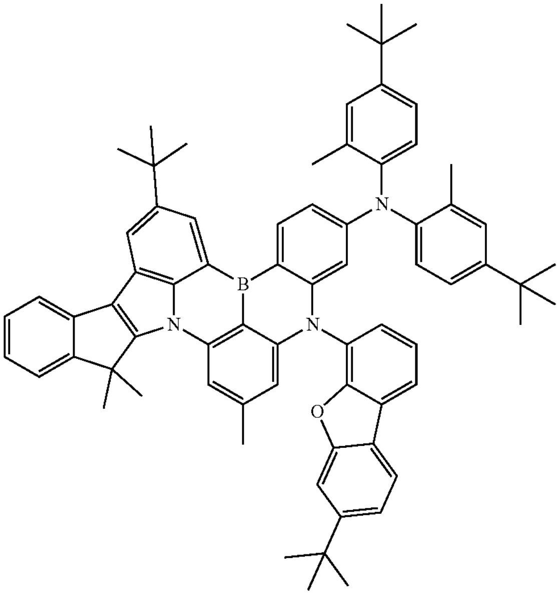
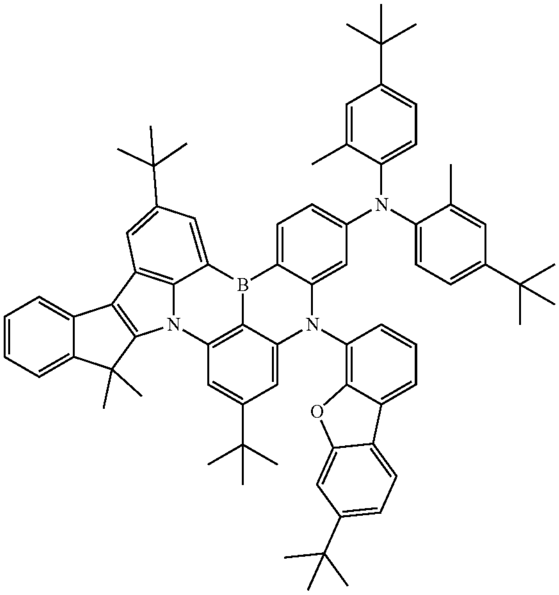

-continued
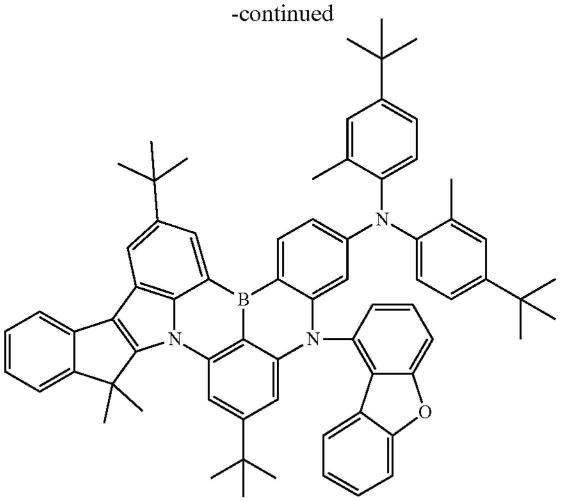
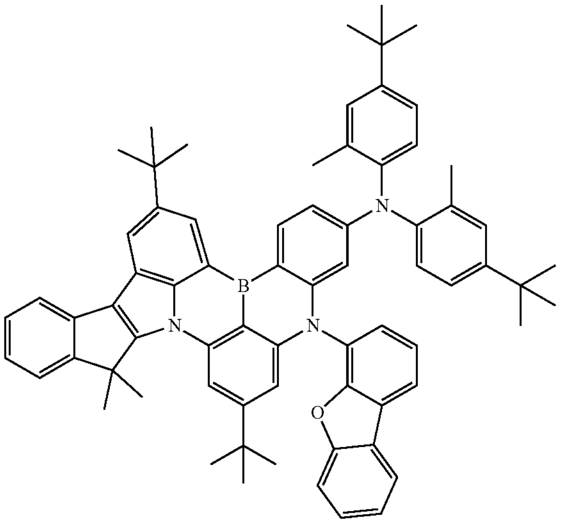
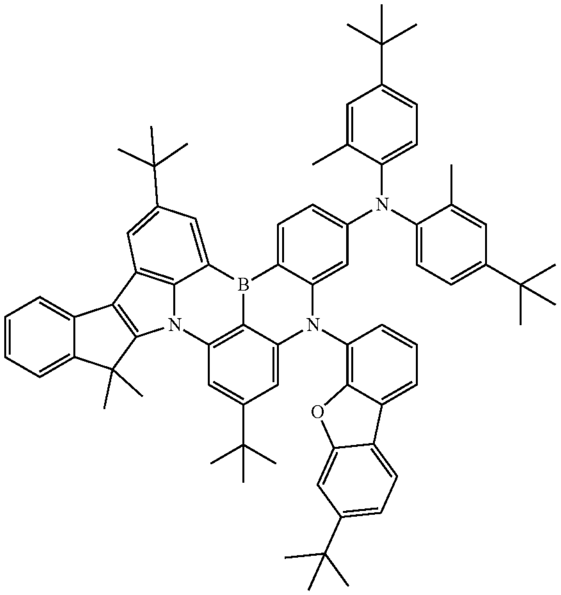
-continued
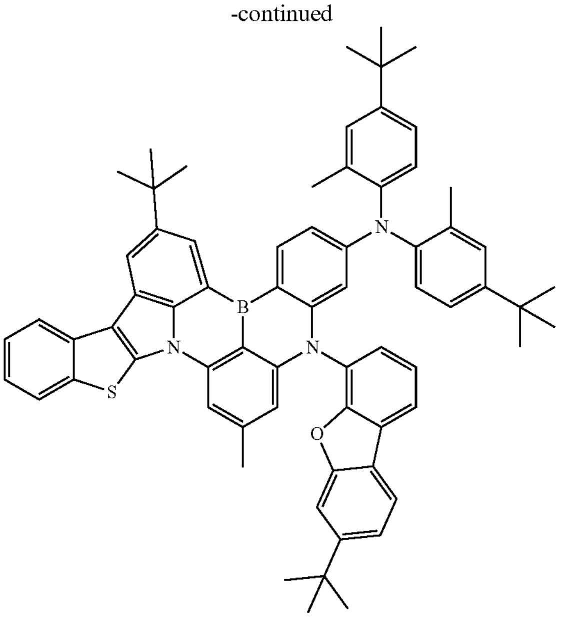
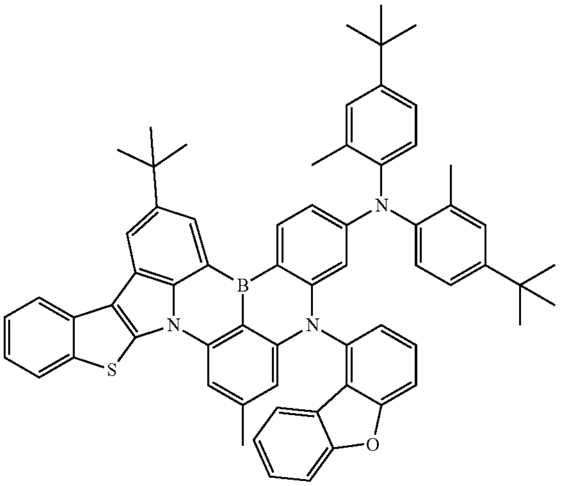
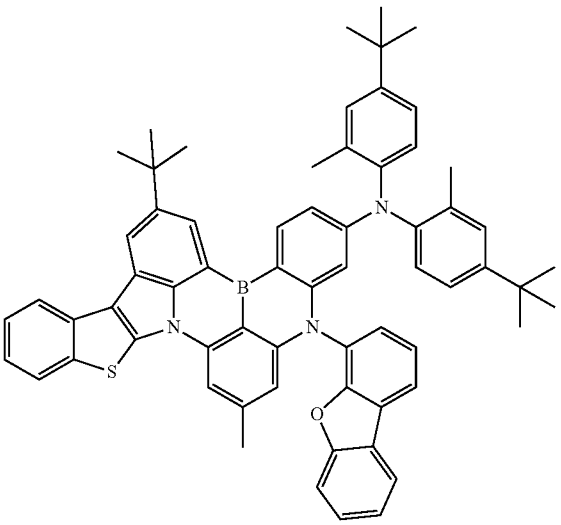

-continued
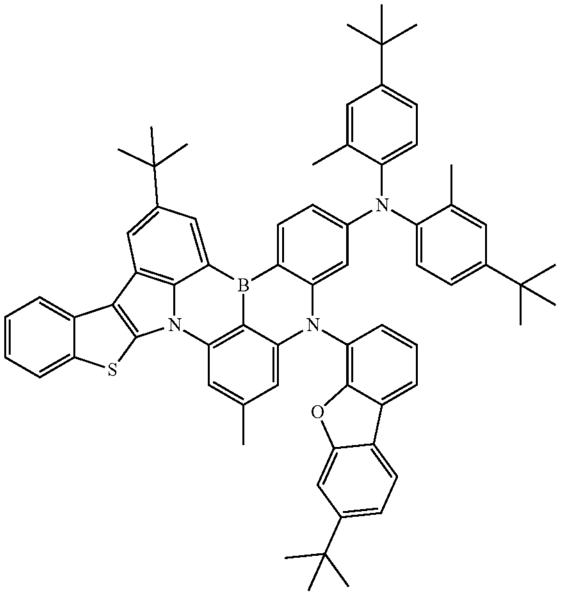
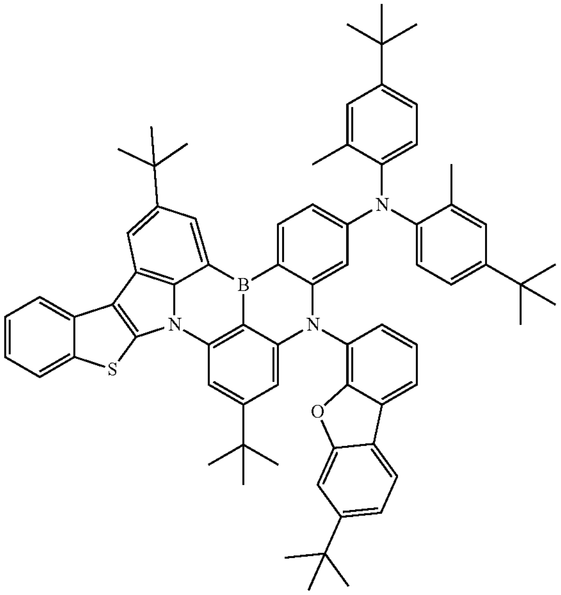
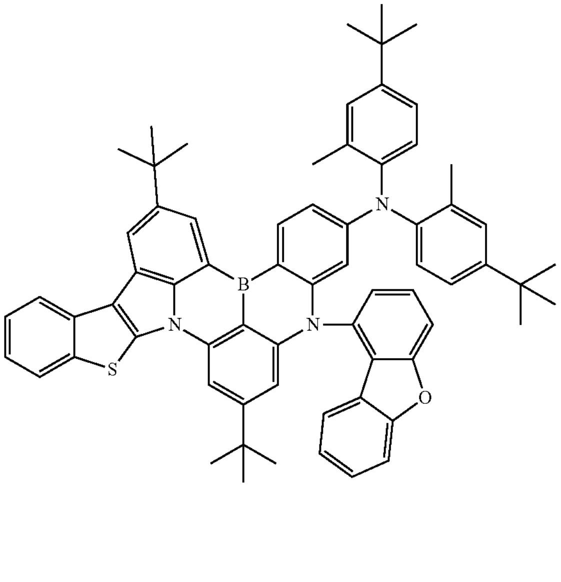
-continued
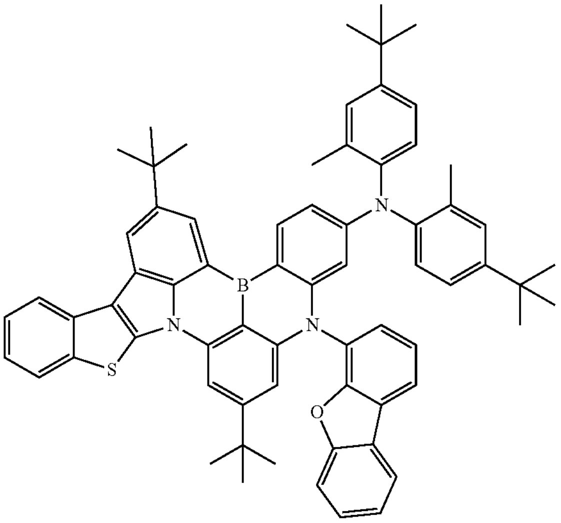
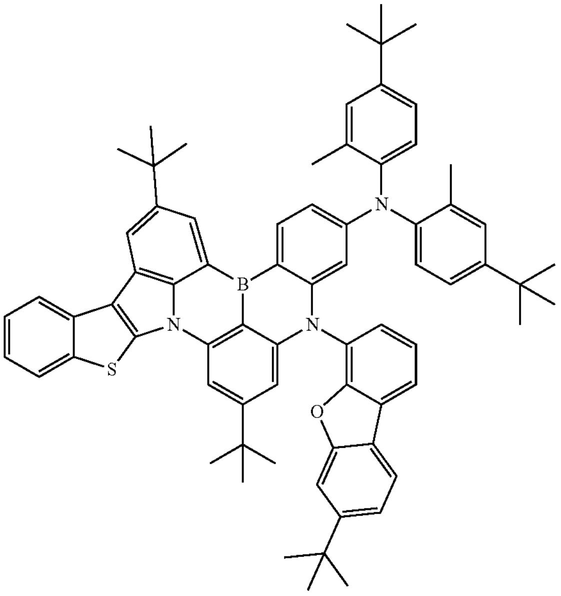
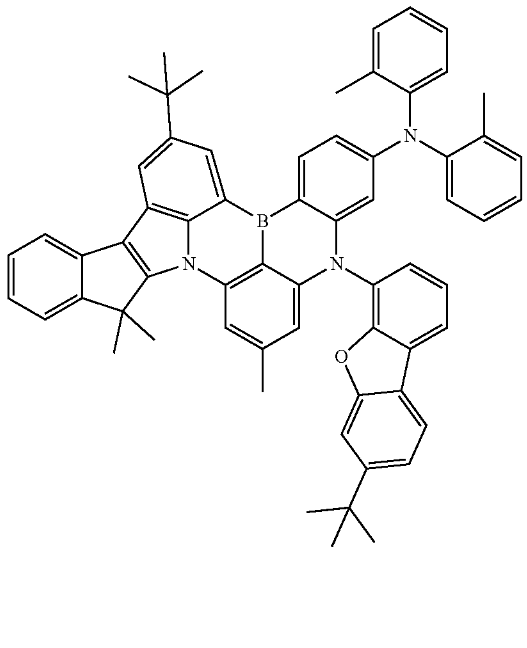

-continued
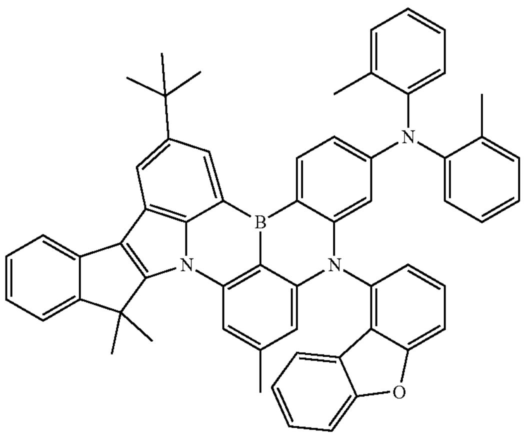
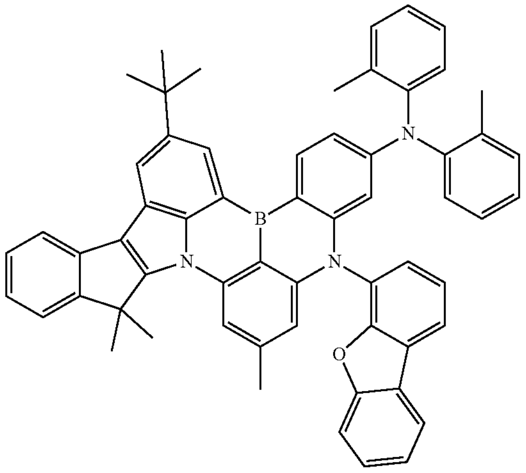
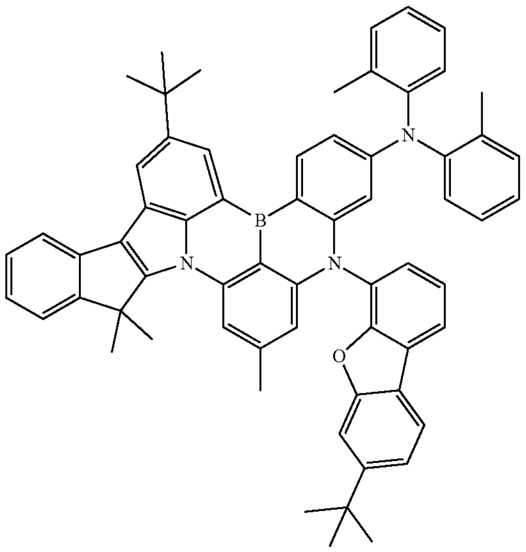
-continued
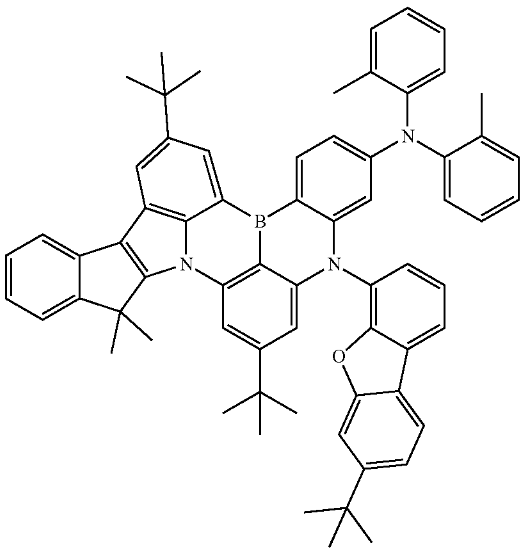
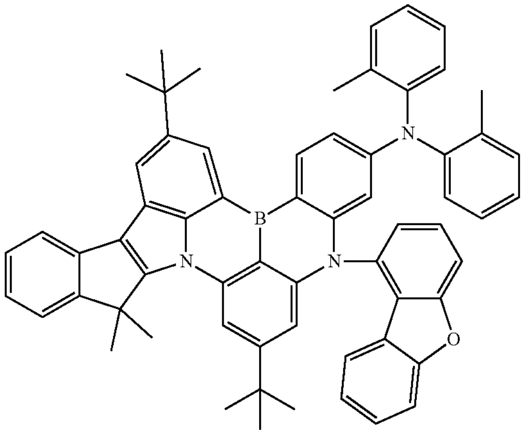
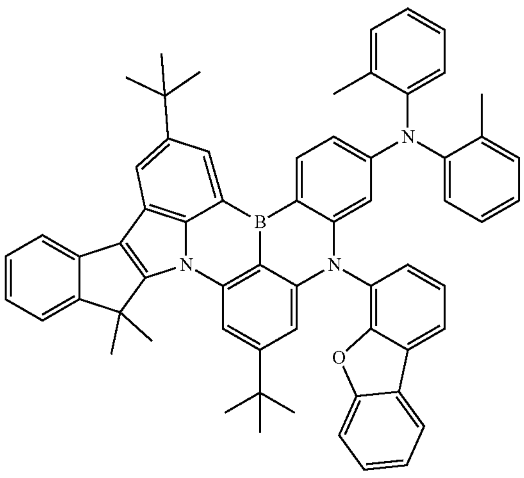

-continued
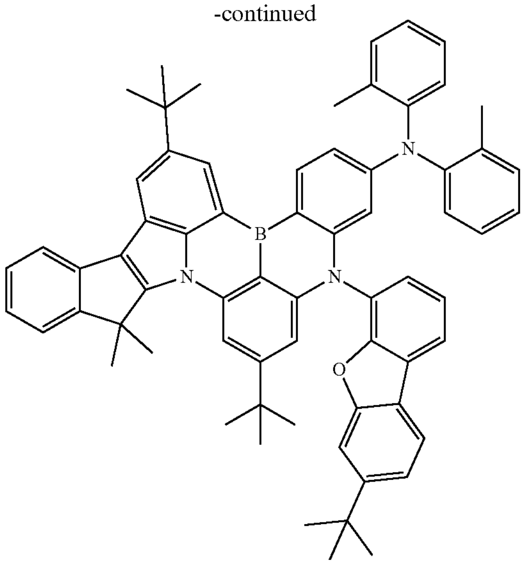
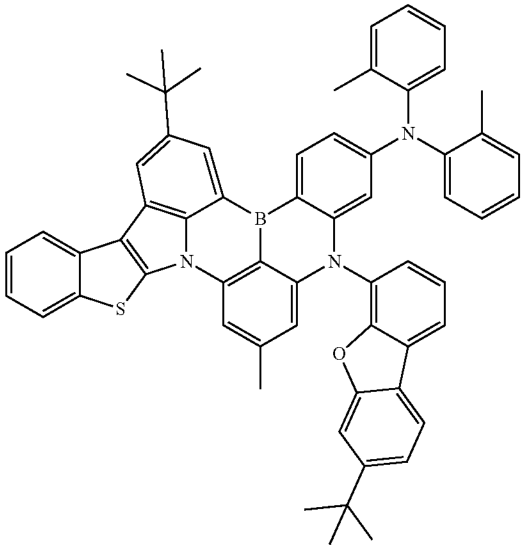
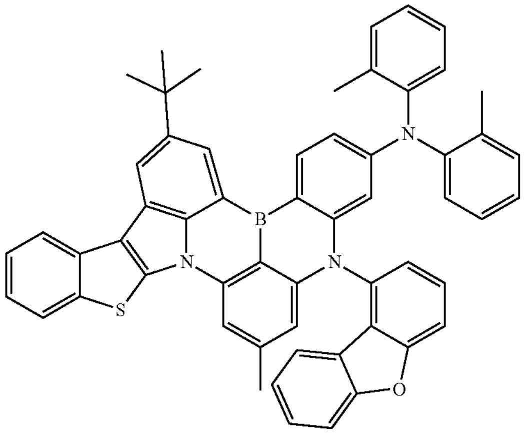
-continued
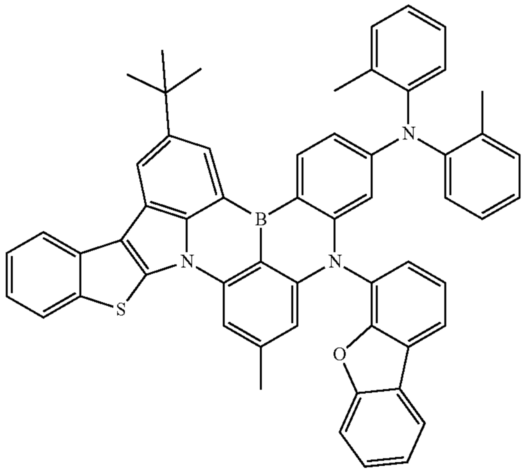
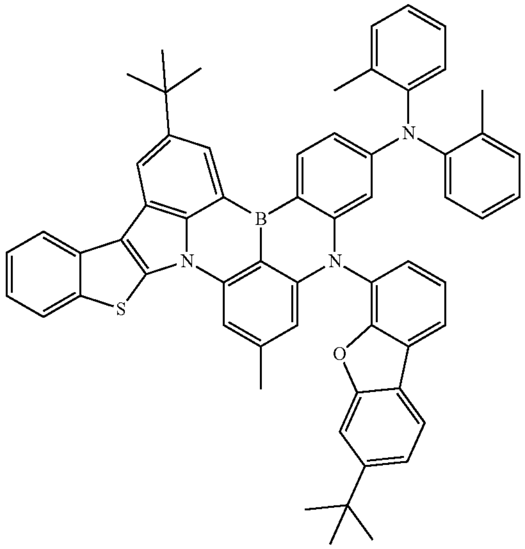
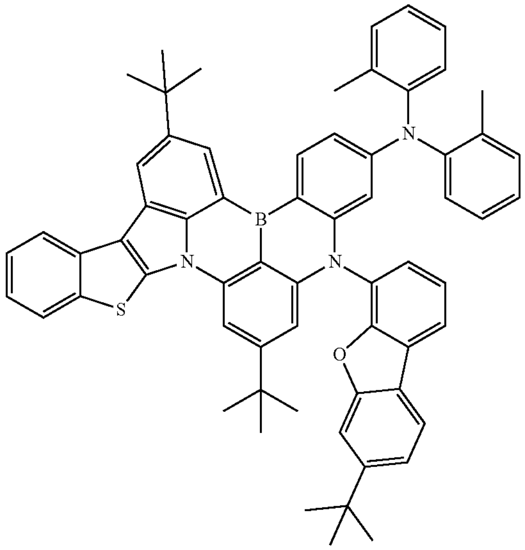

-continued
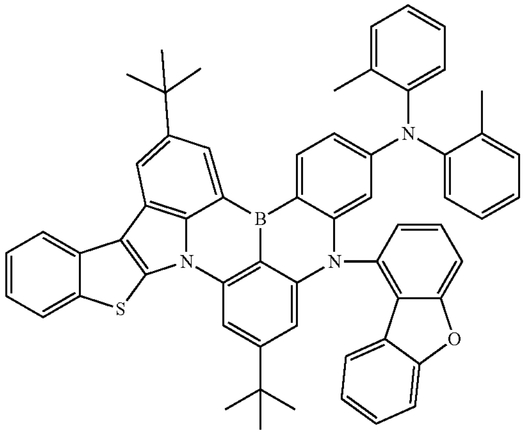
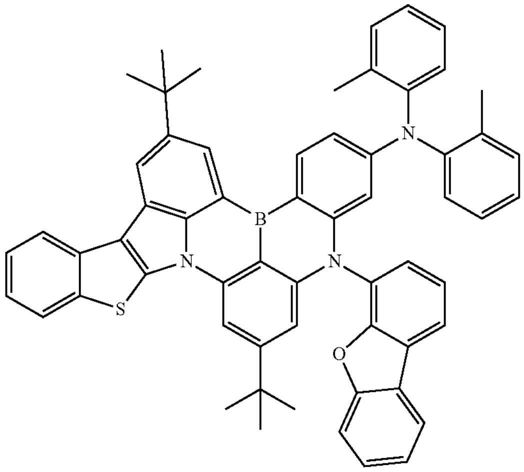
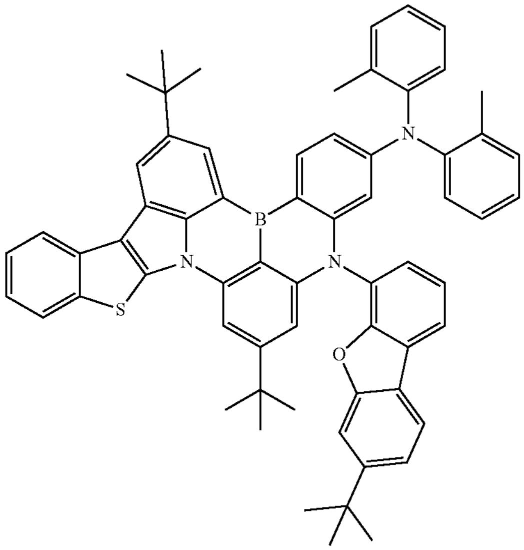
-continued
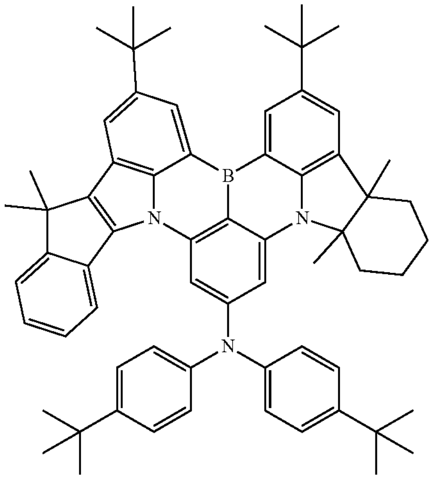
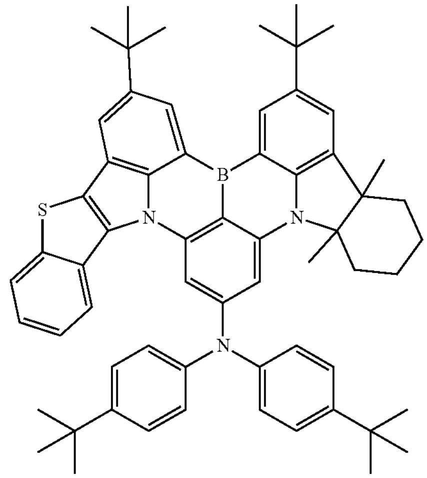
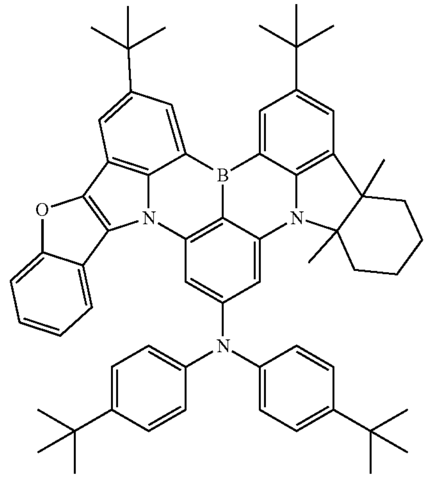

-continued
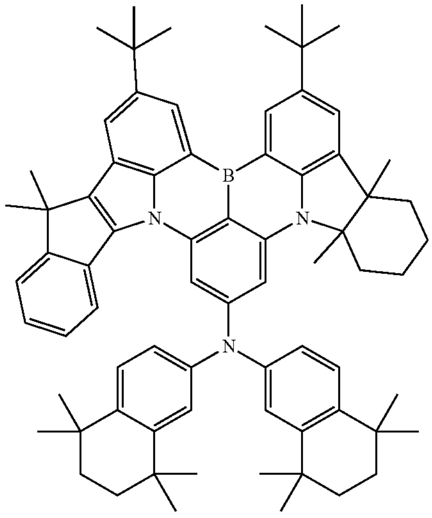
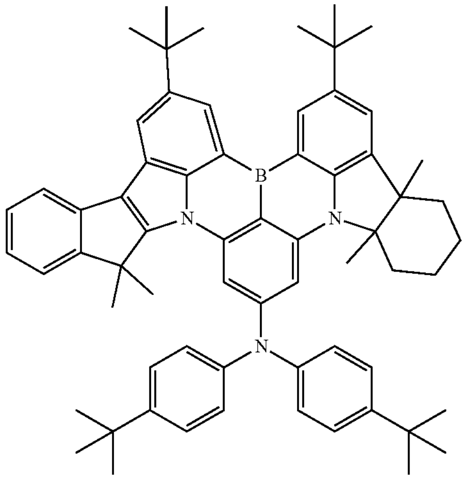
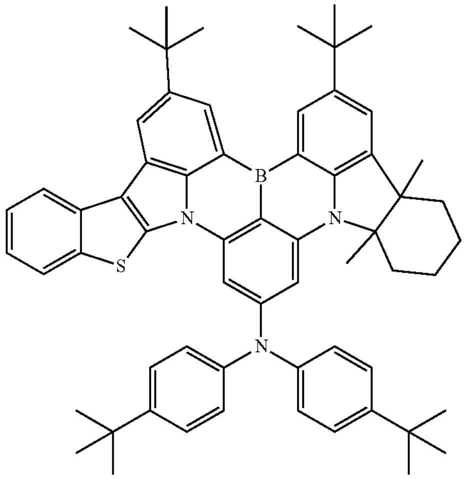
-continued
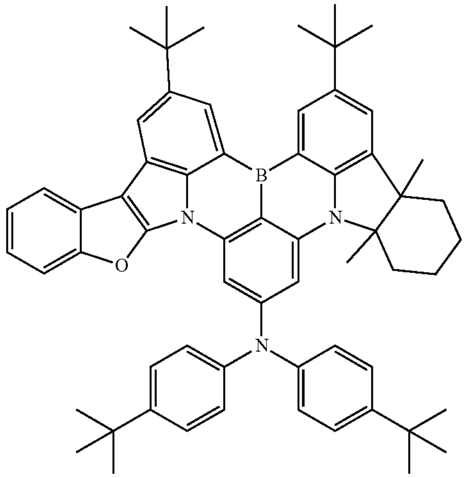
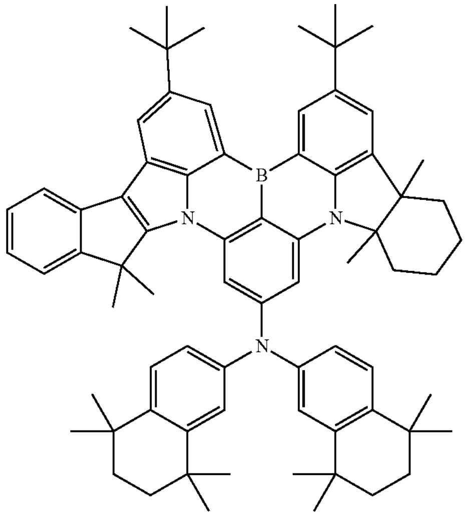
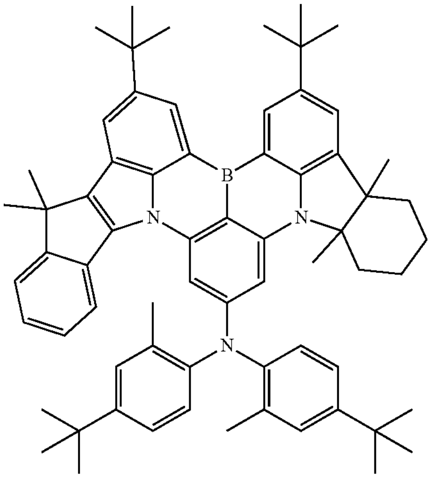

-continued
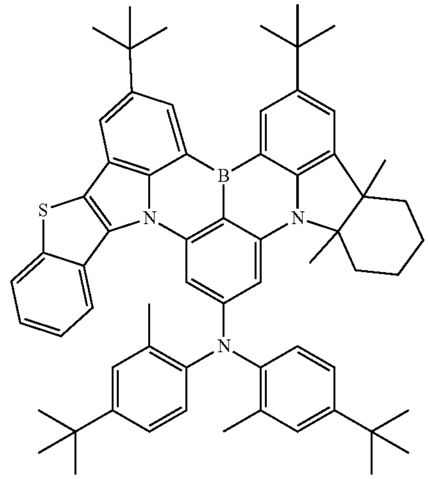
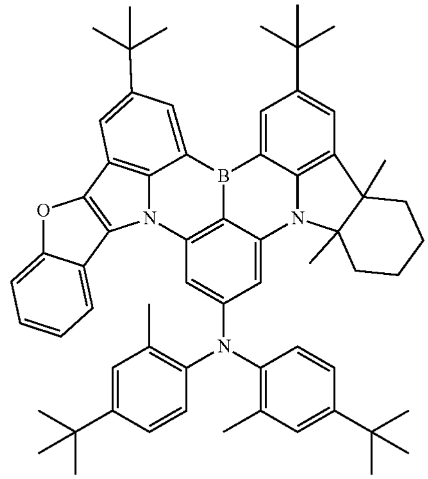
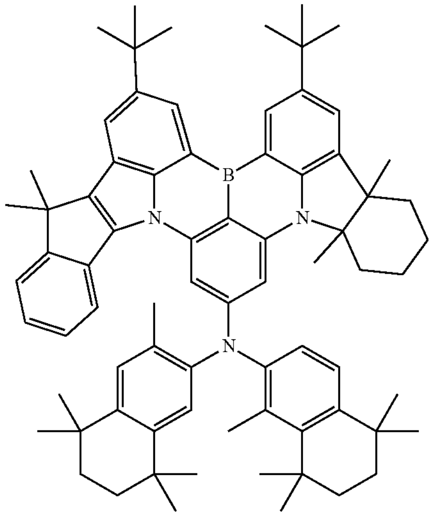
-continued
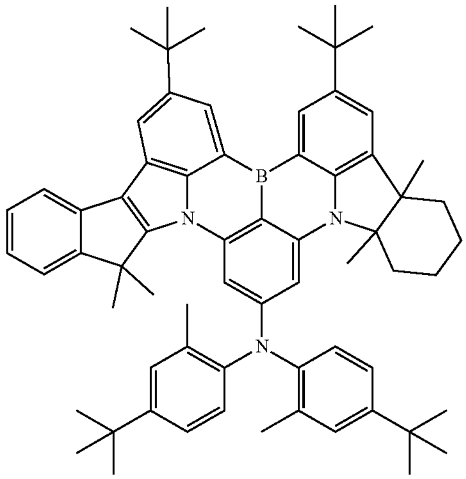
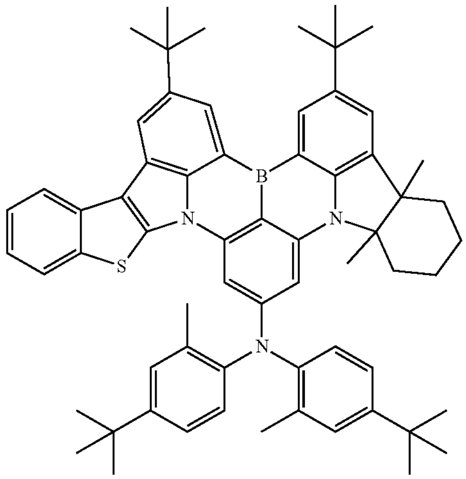
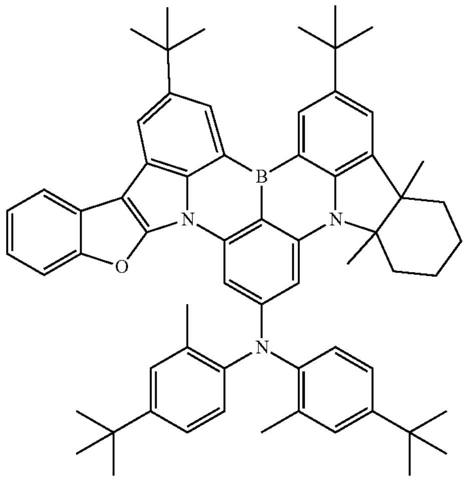

-continued
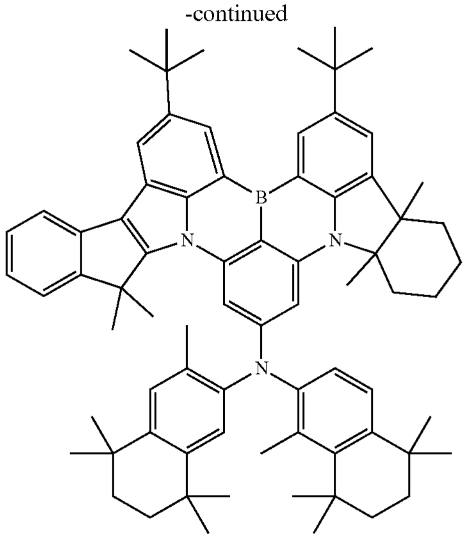
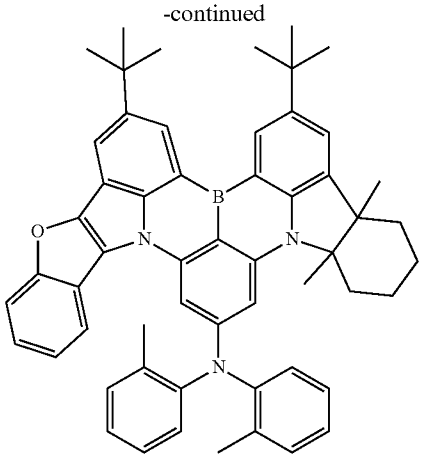
-continued
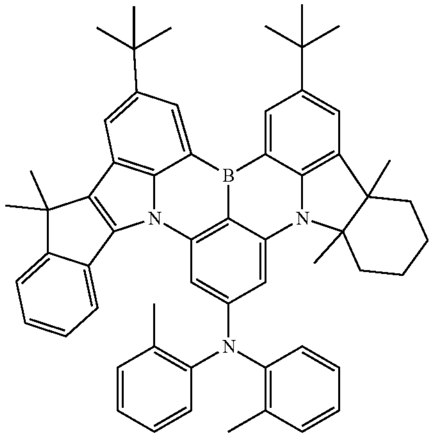
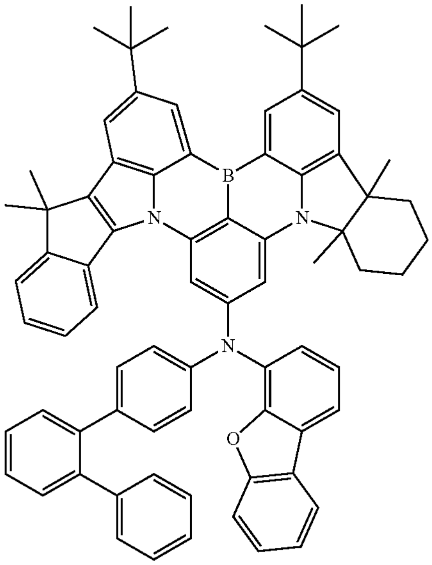
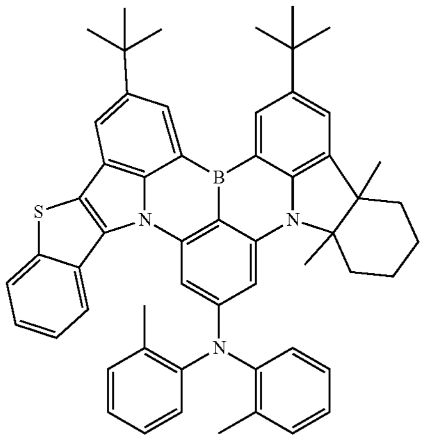
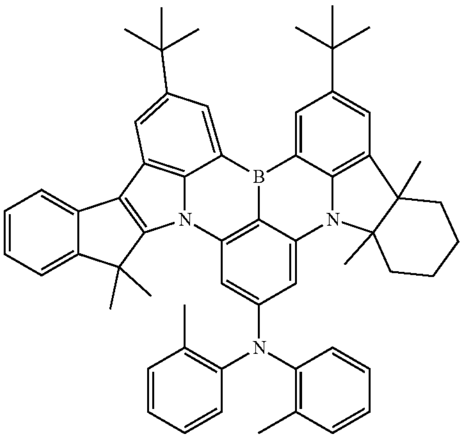

-continued
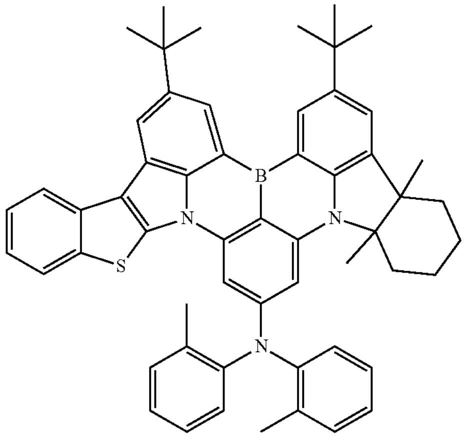
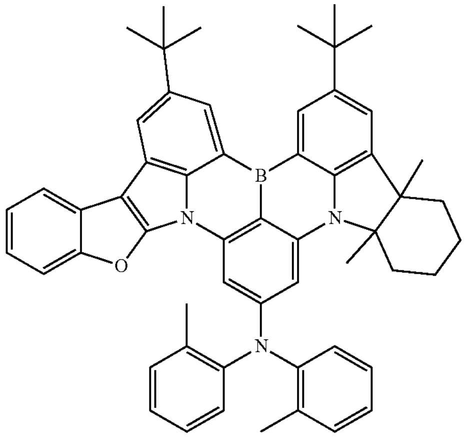
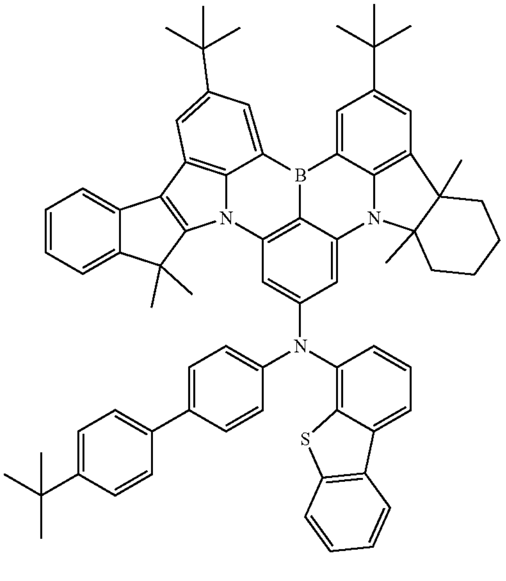
-continued
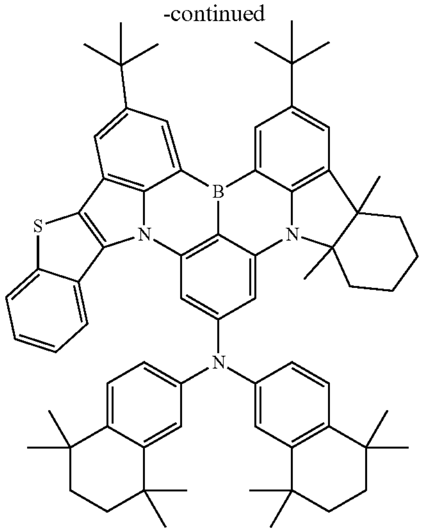
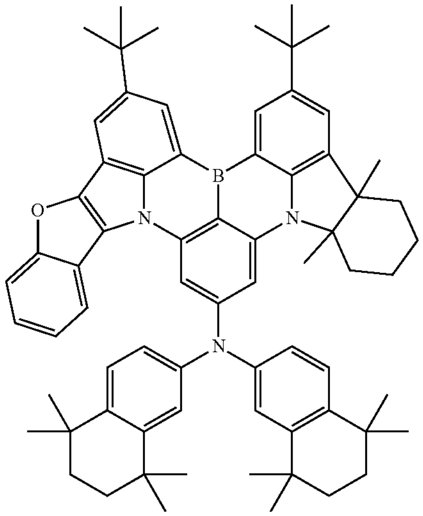
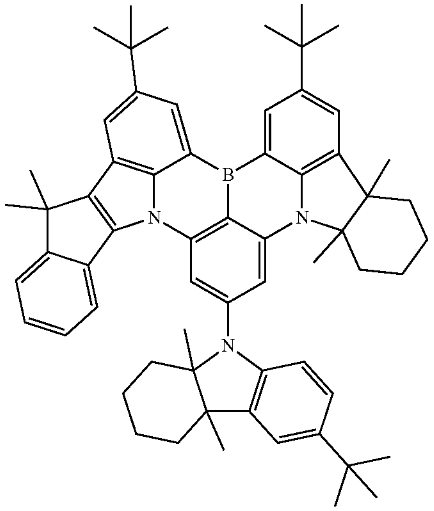

-continued
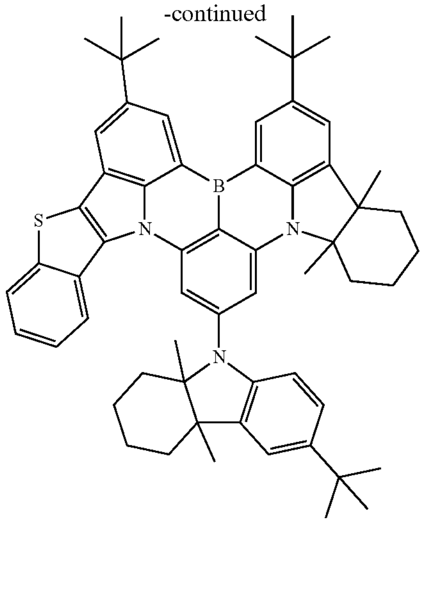
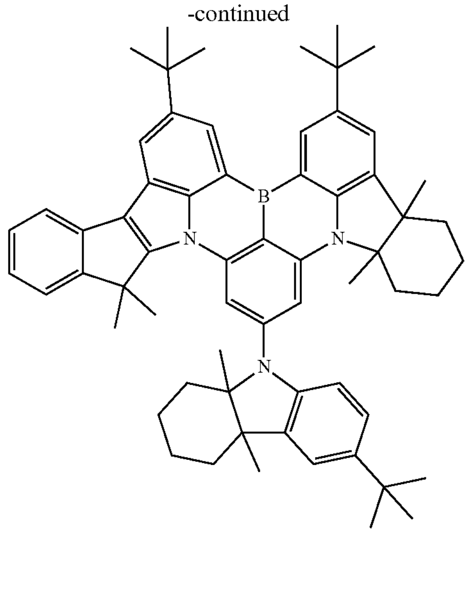
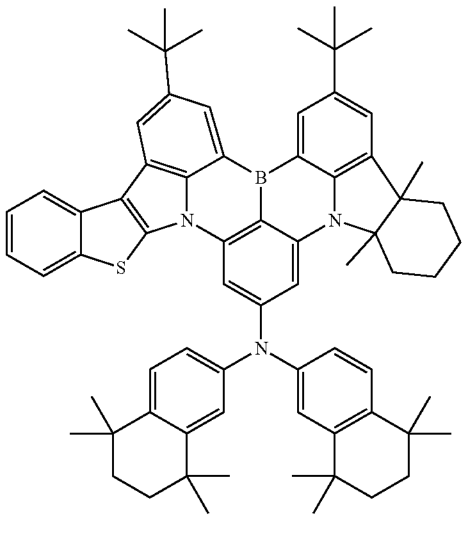
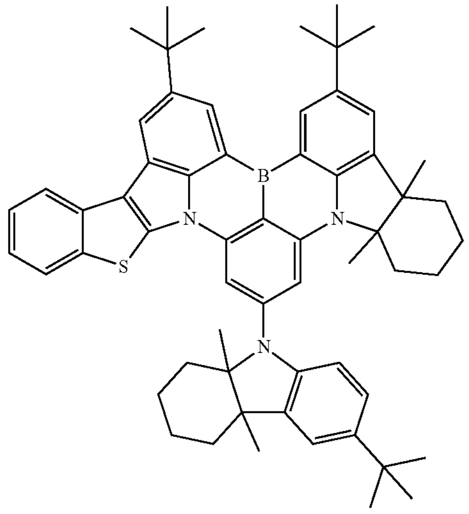
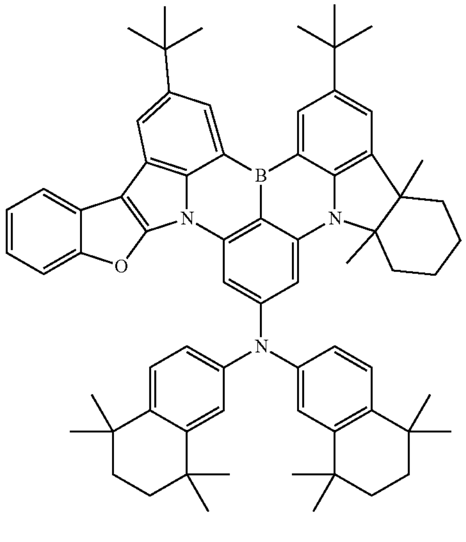
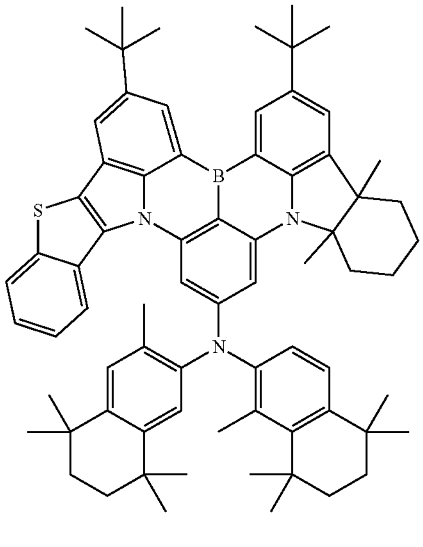

-continued
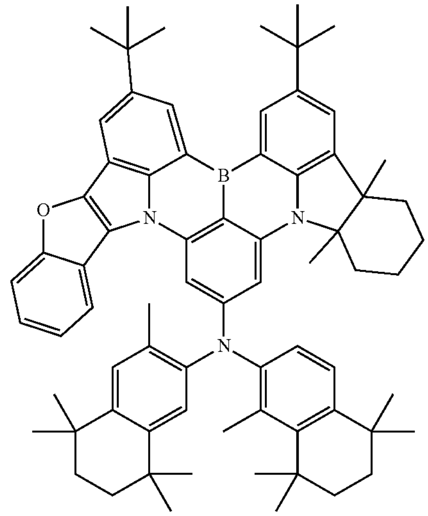
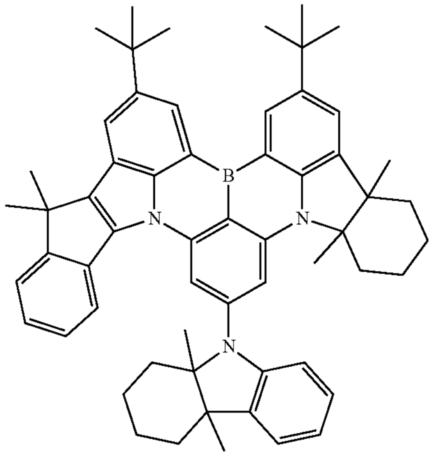
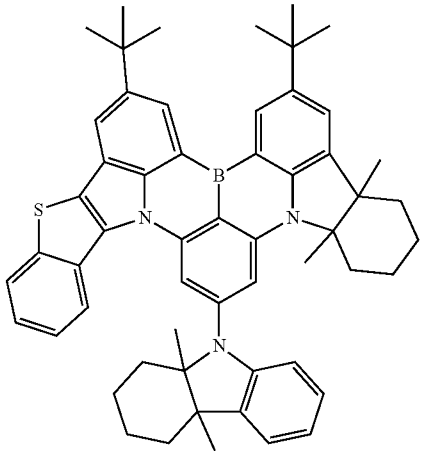
-continued
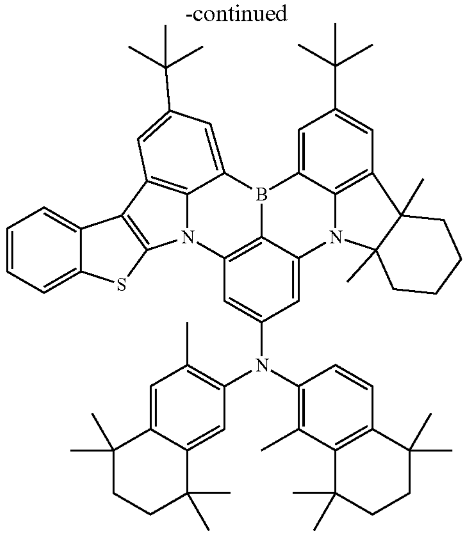
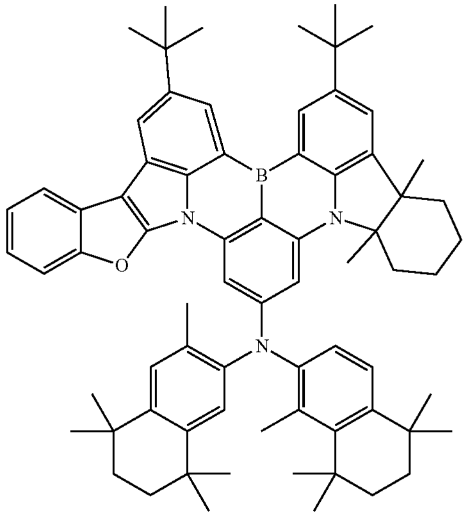
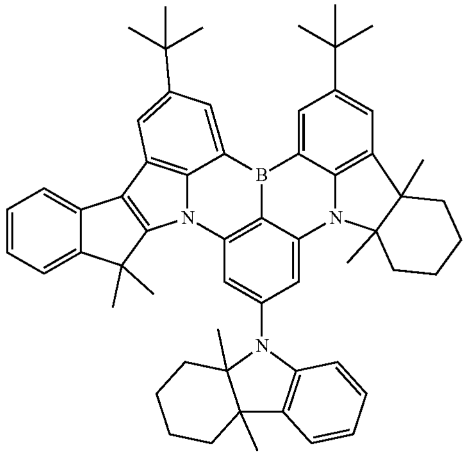

-continued
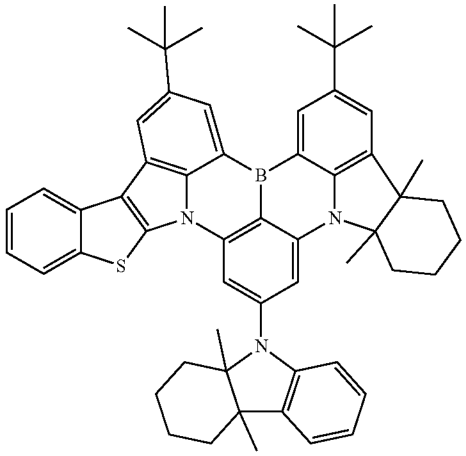
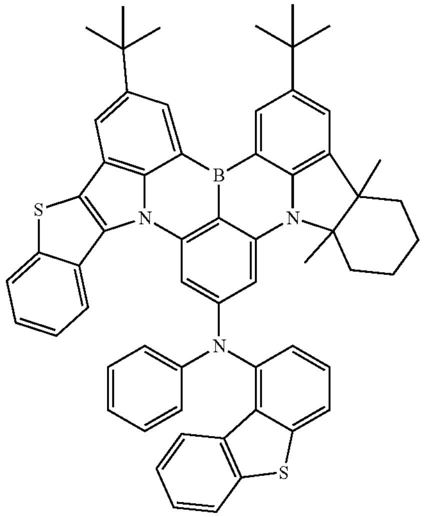
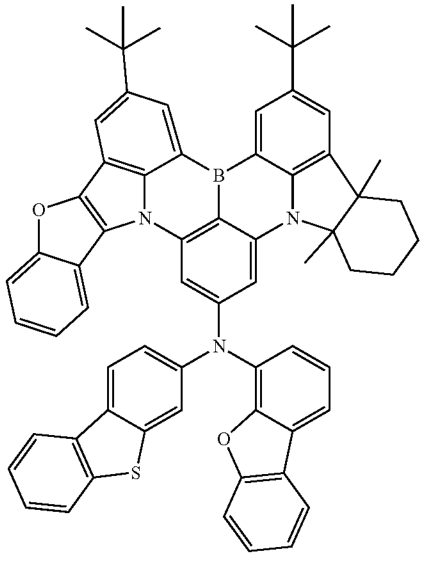
-continued
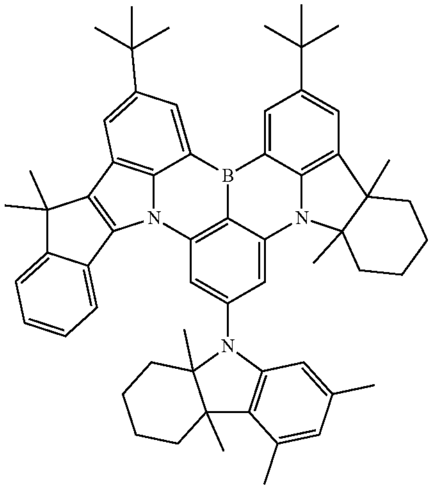
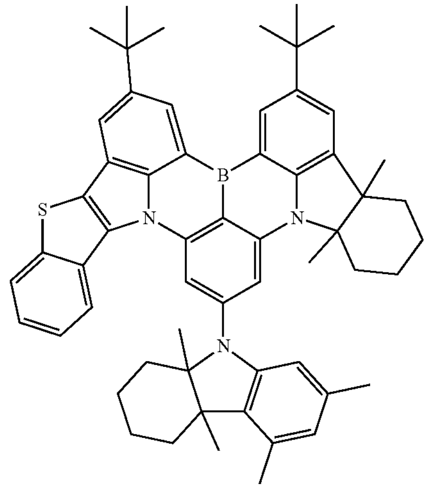
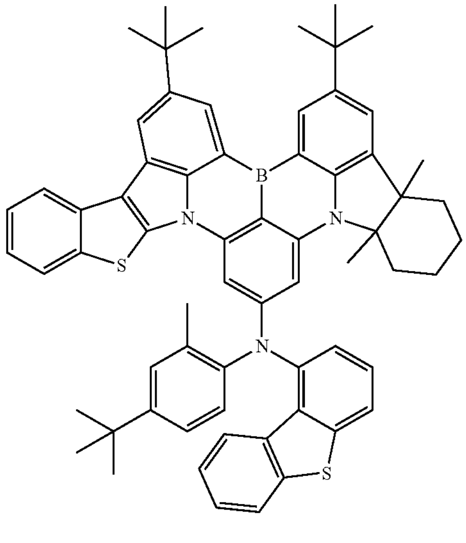

-continued
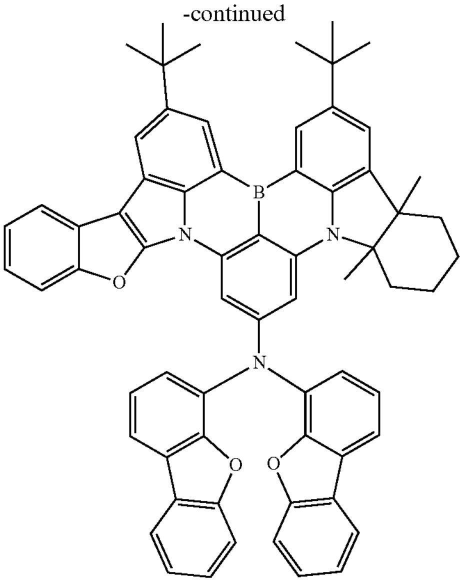
-continued
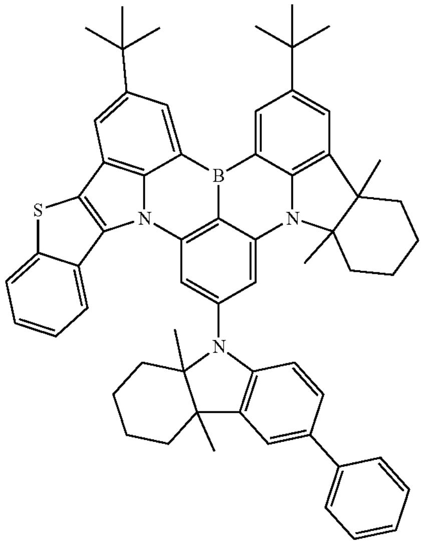
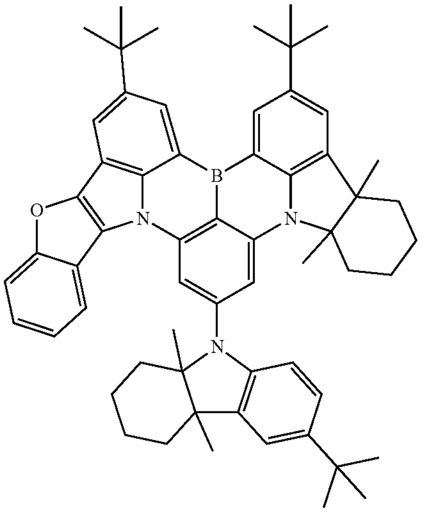
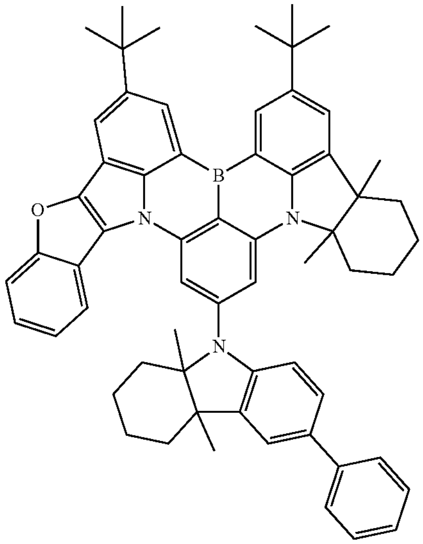
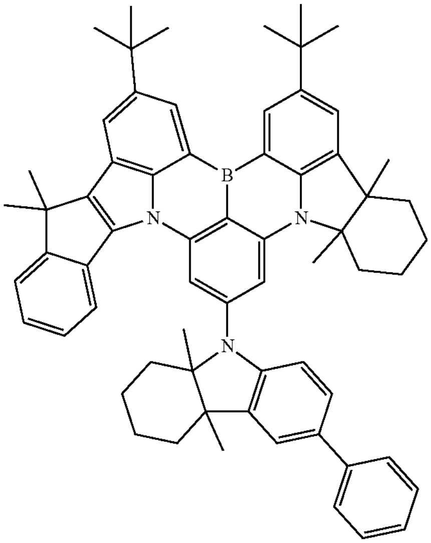
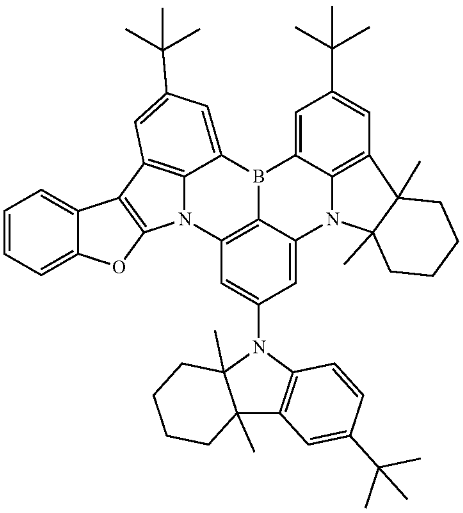

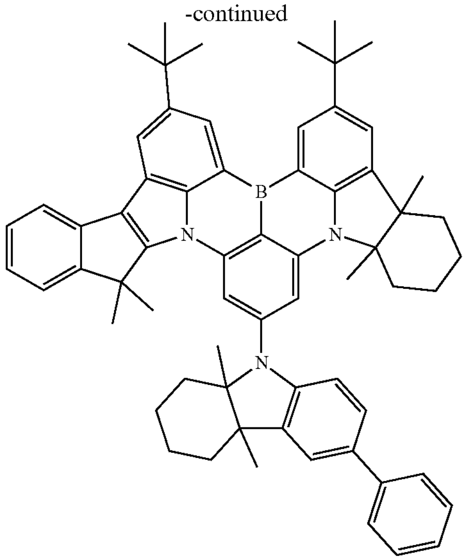
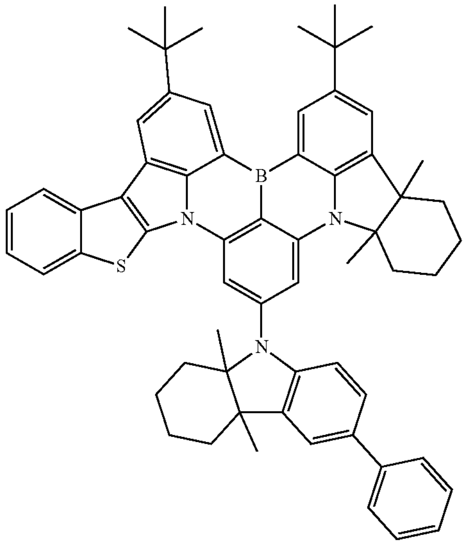
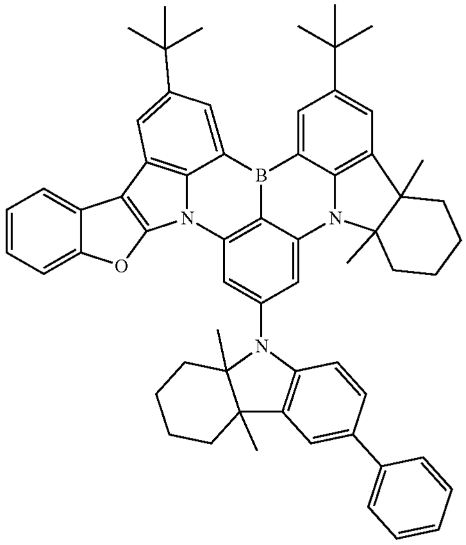
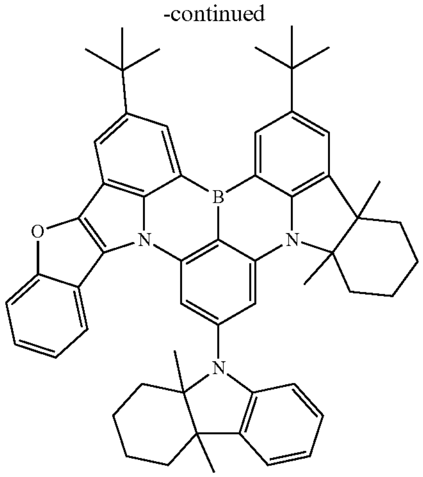
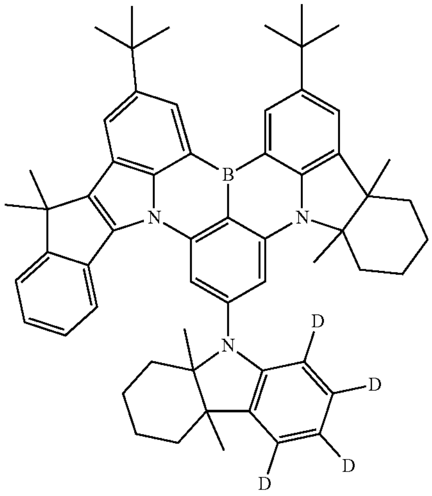
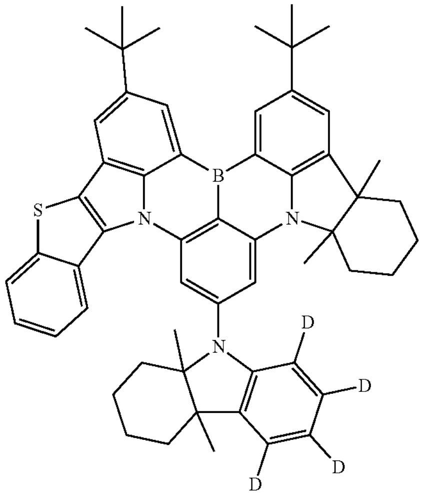

-continued
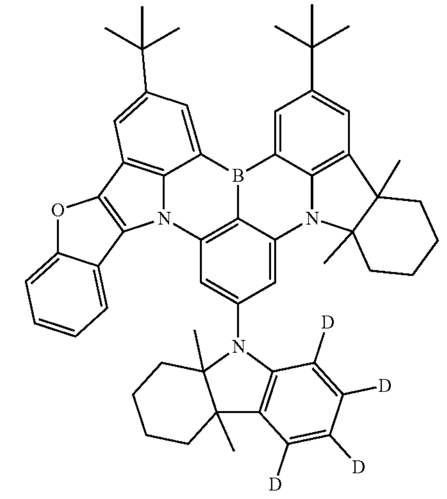
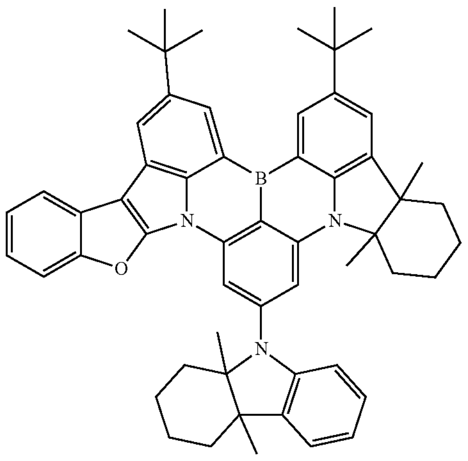
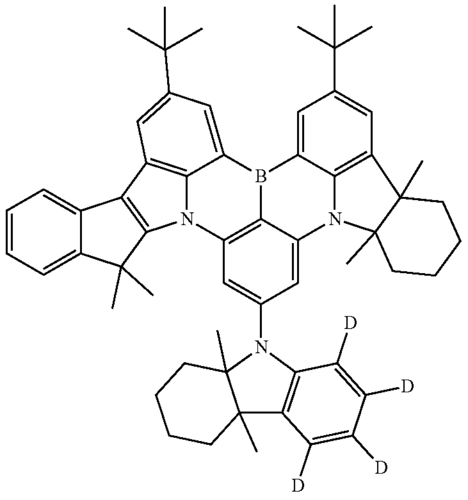
-continued
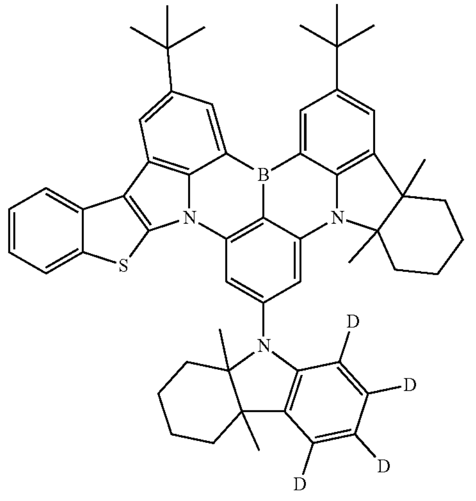
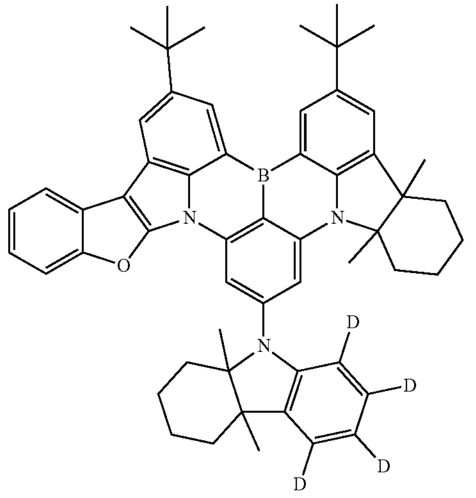
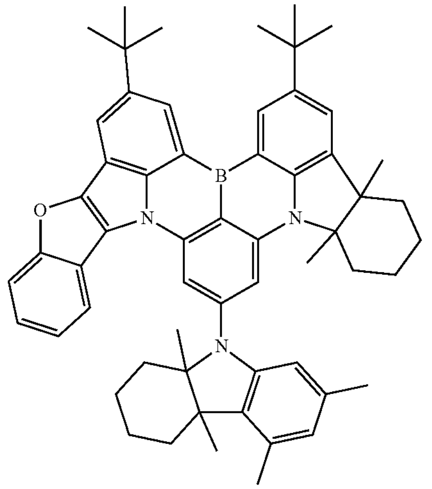

-continued
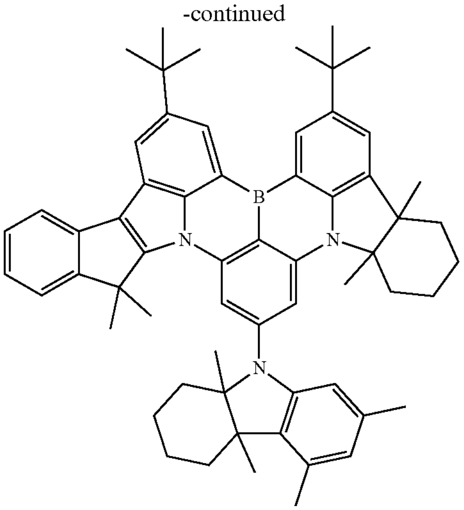
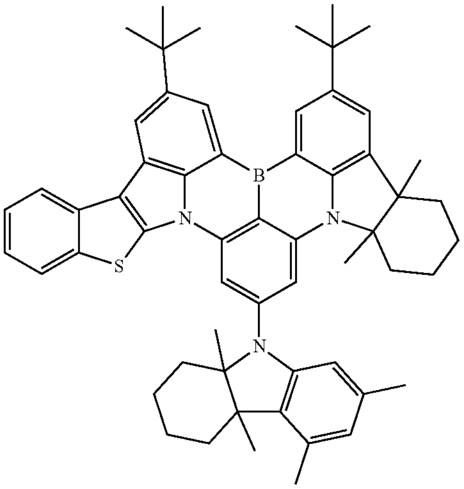
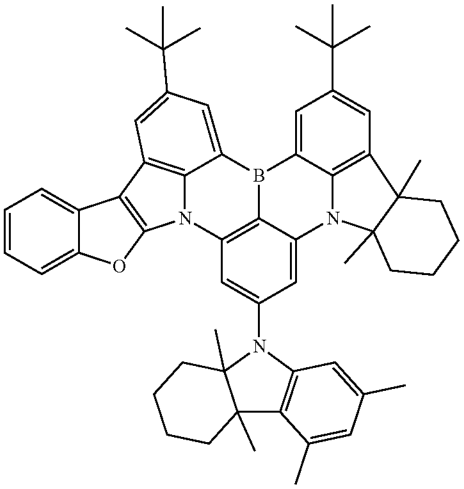
-continued
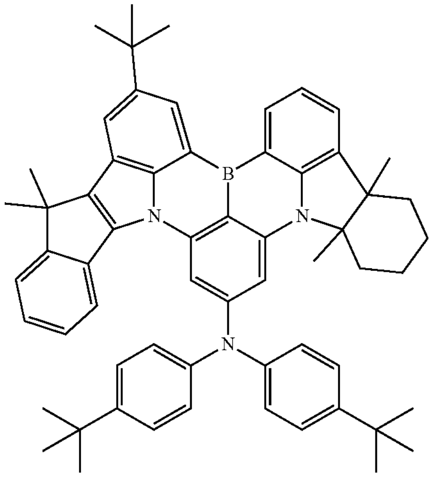
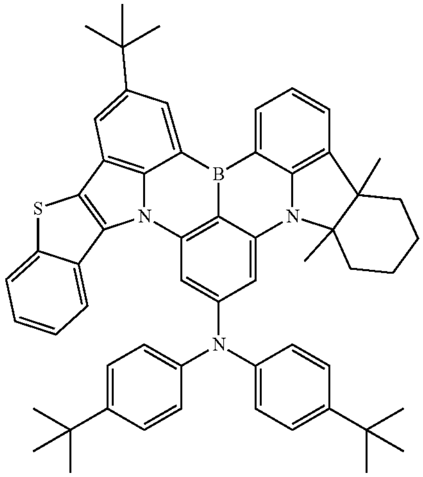
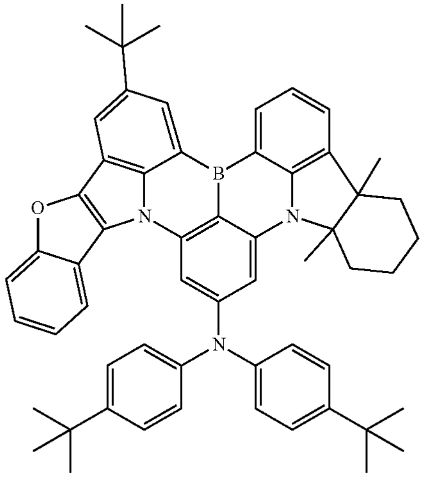

-continued
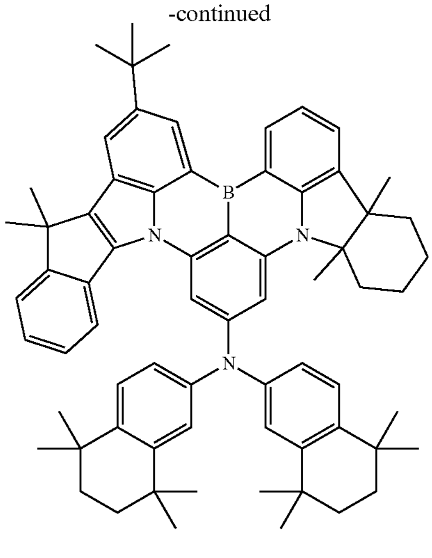
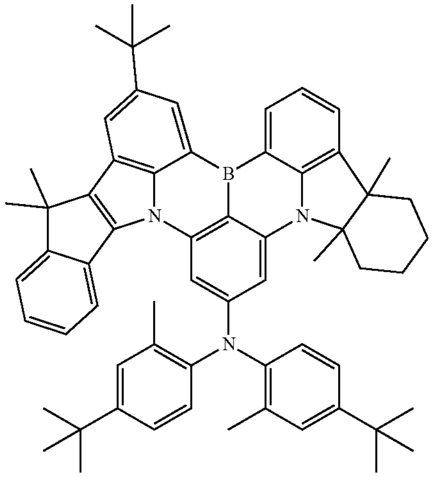
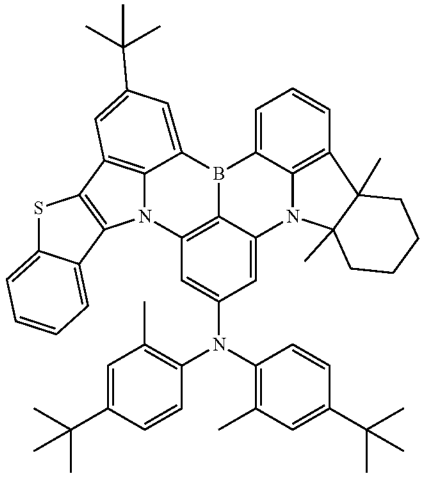
-continued
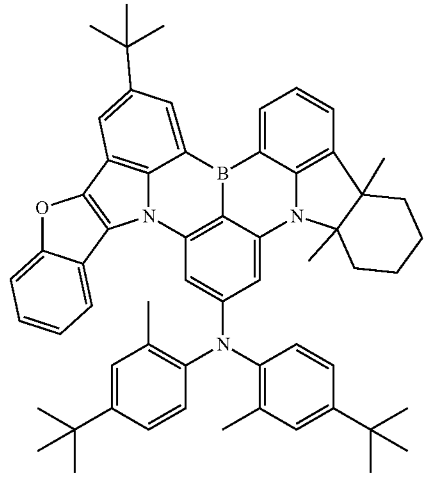
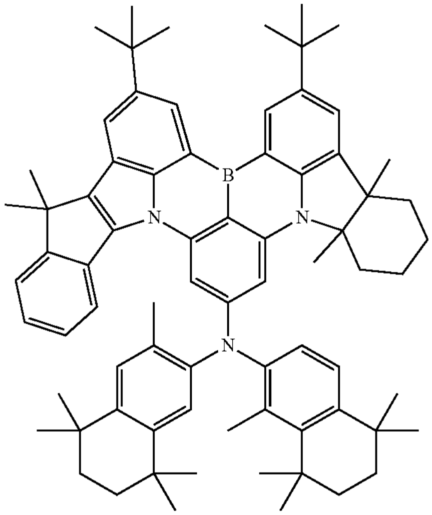
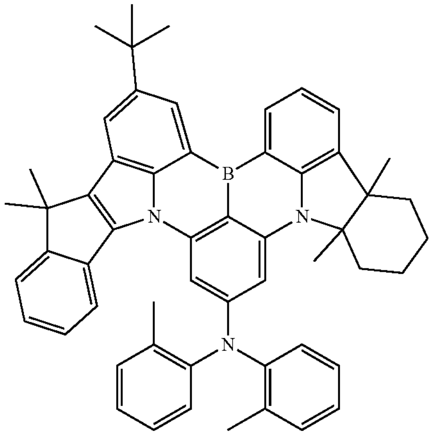

-continued
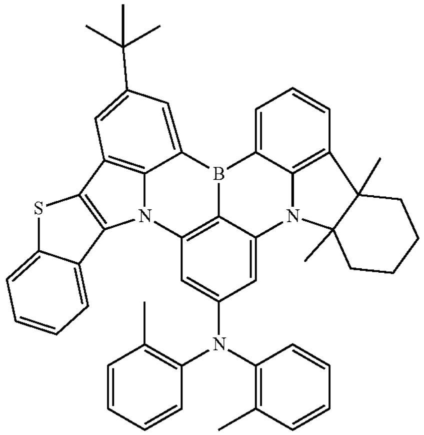
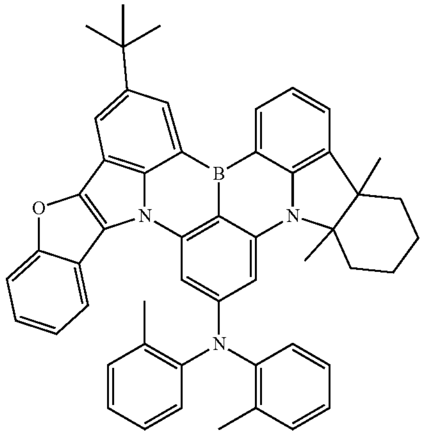
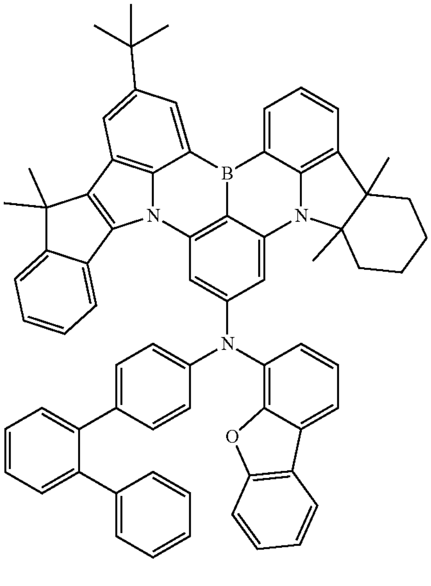
-continued
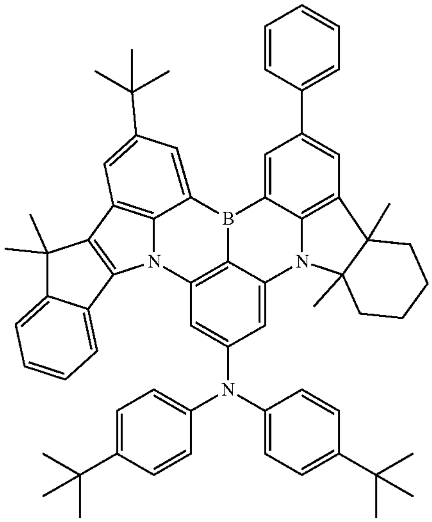
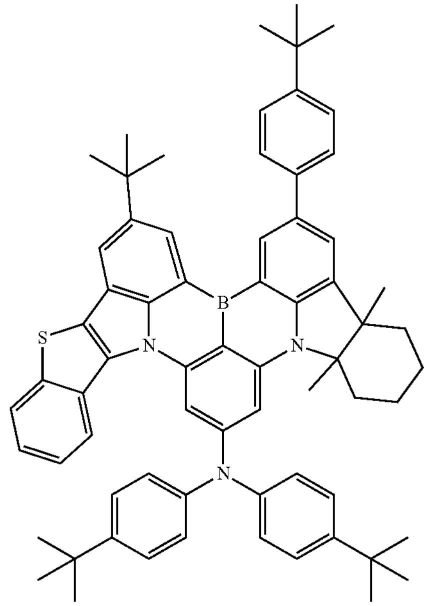
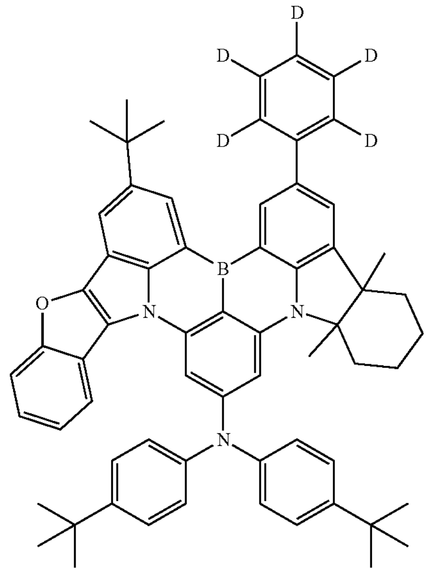

-continued
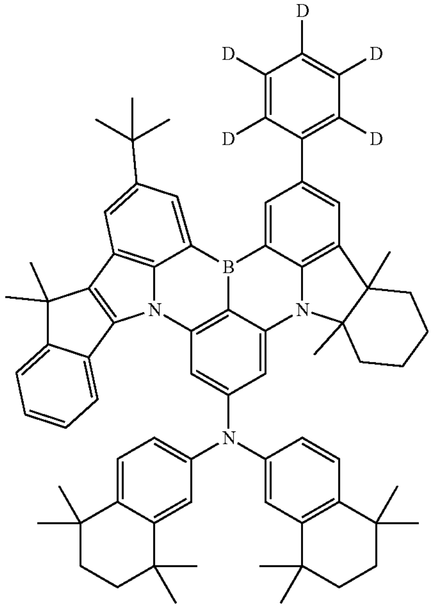
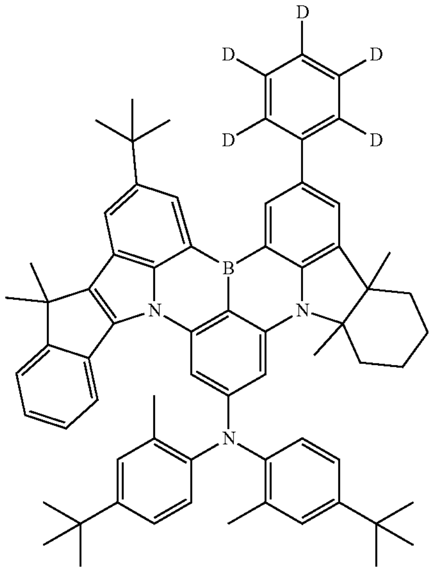
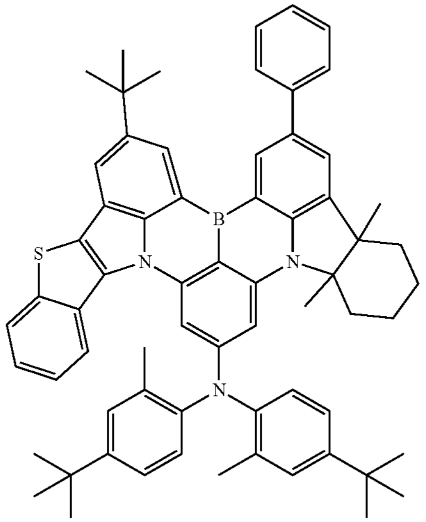
-continued
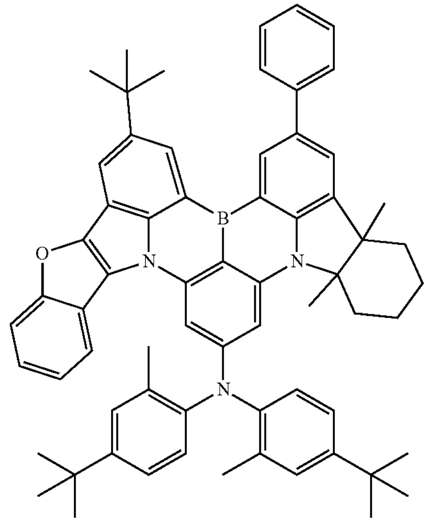
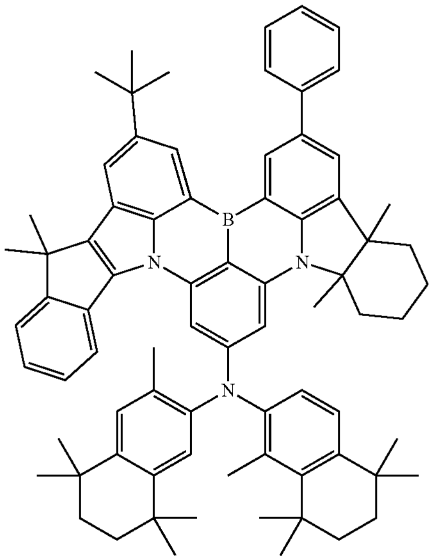
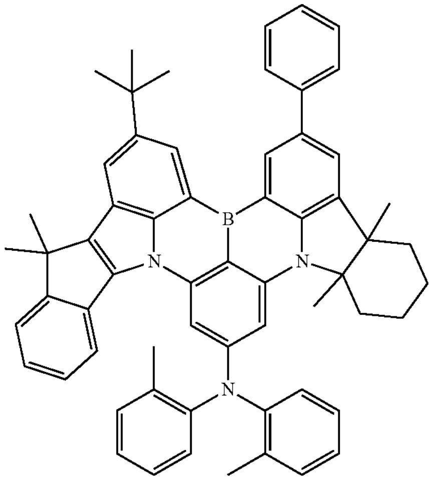

-continued
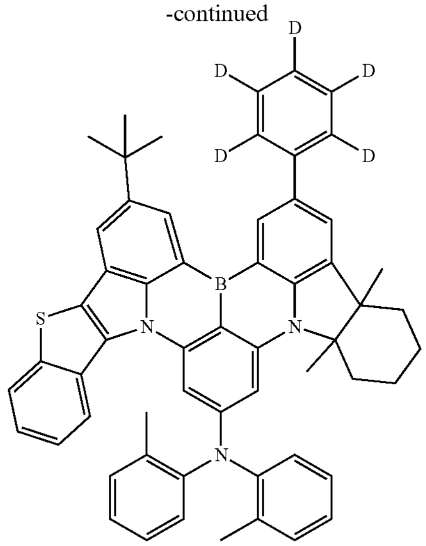
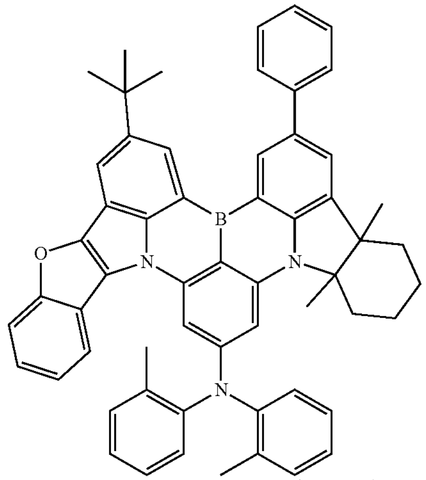
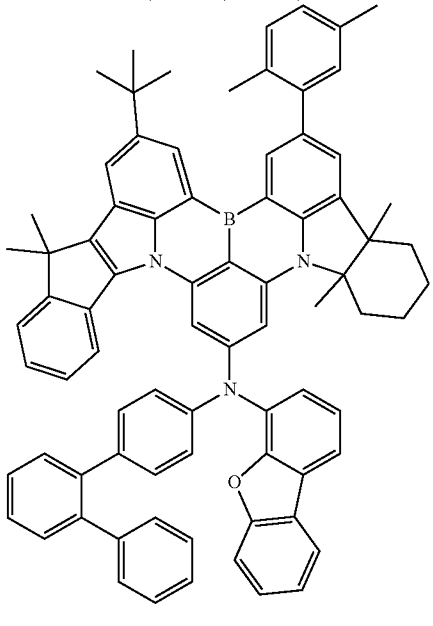
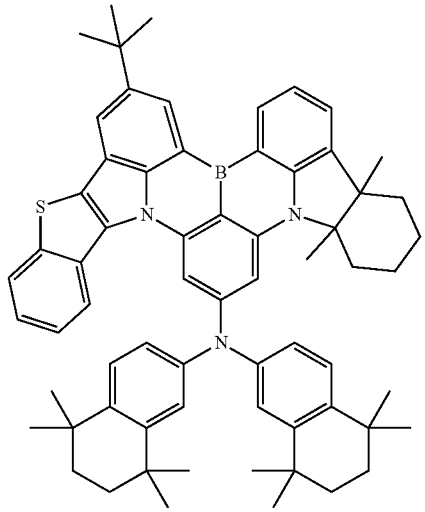
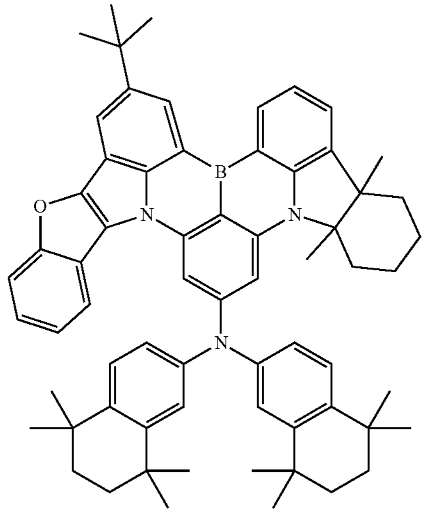
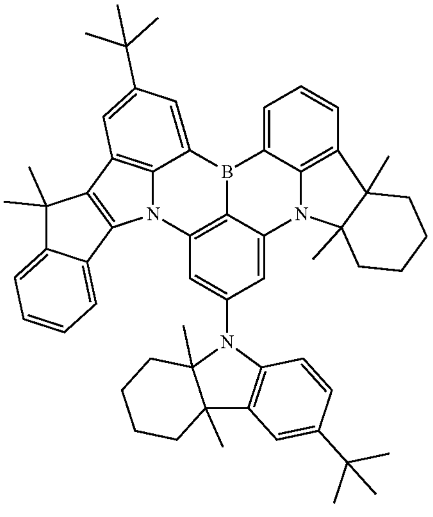

-continued
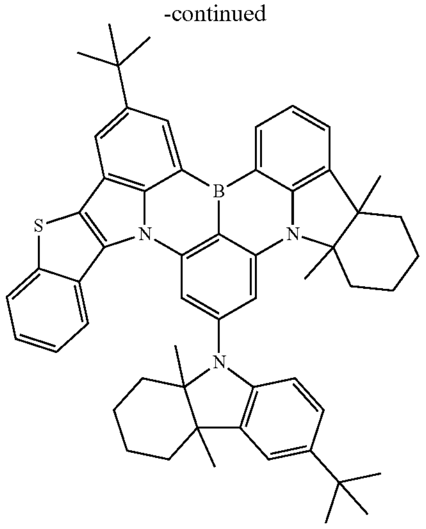
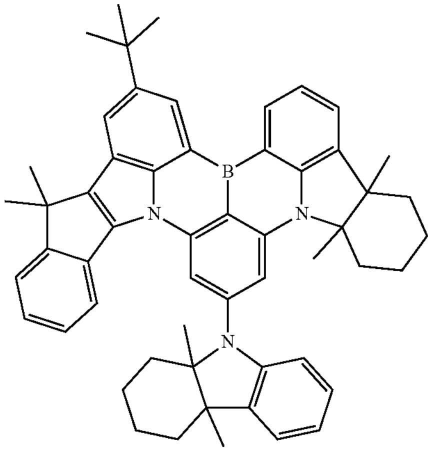
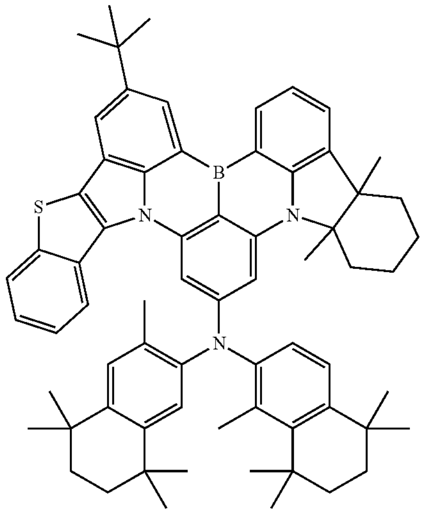
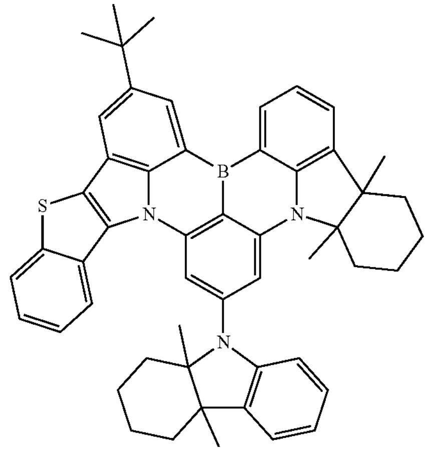
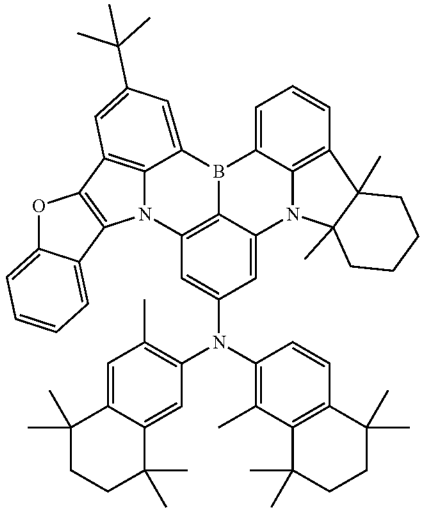
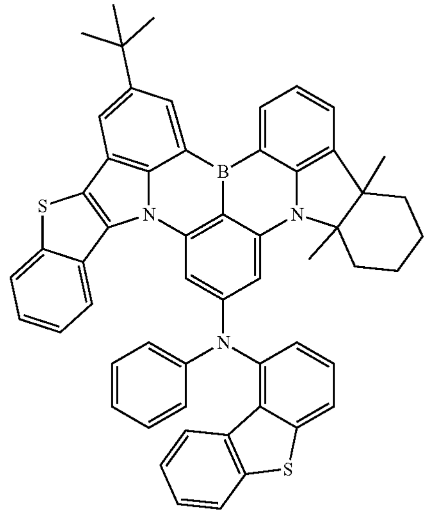
-continued

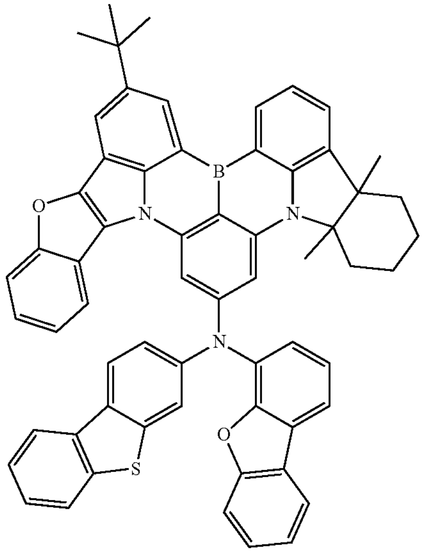
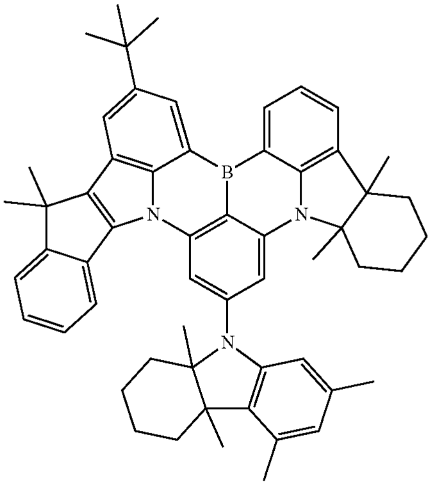
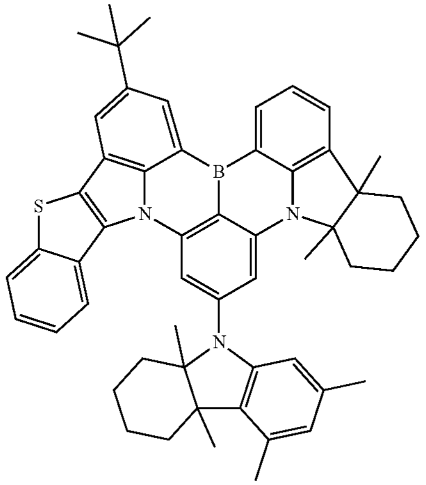
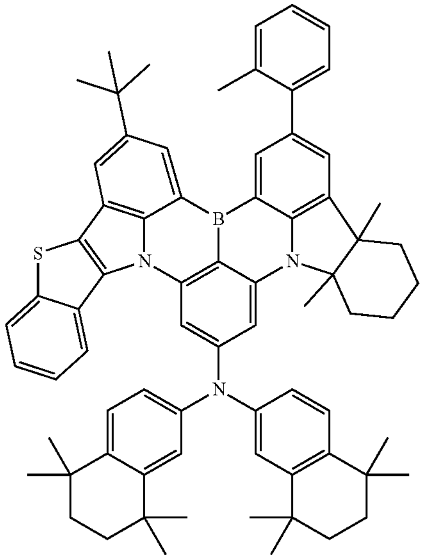
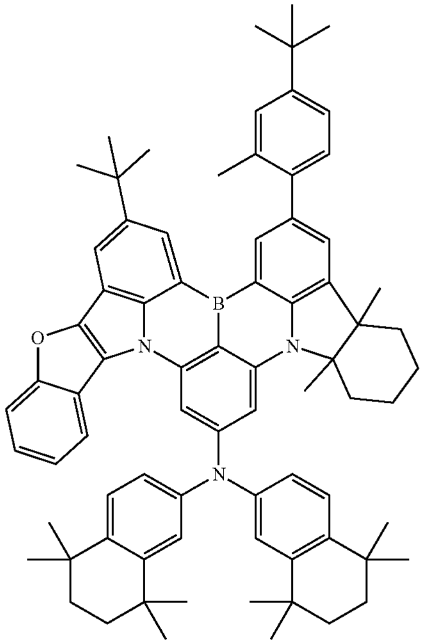

-continued
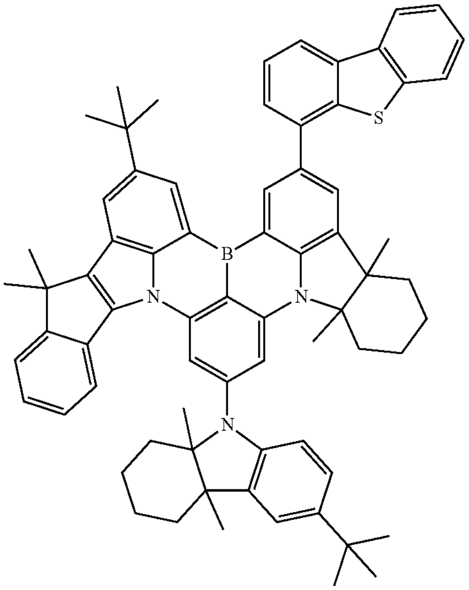
-continued
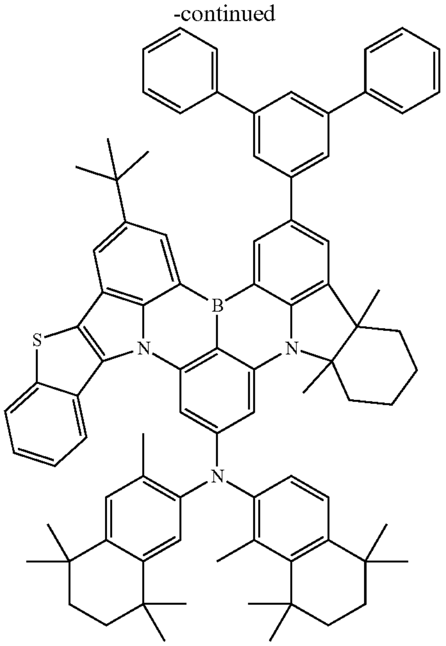
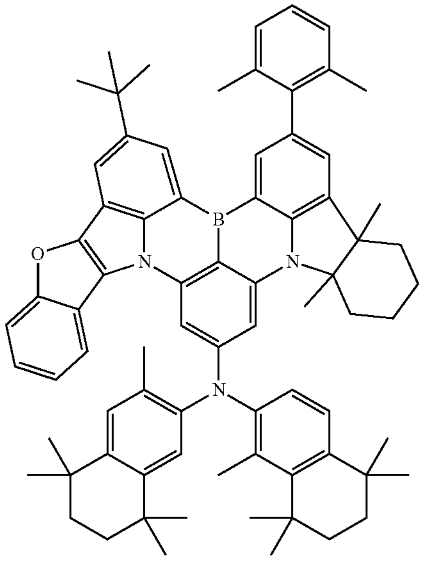
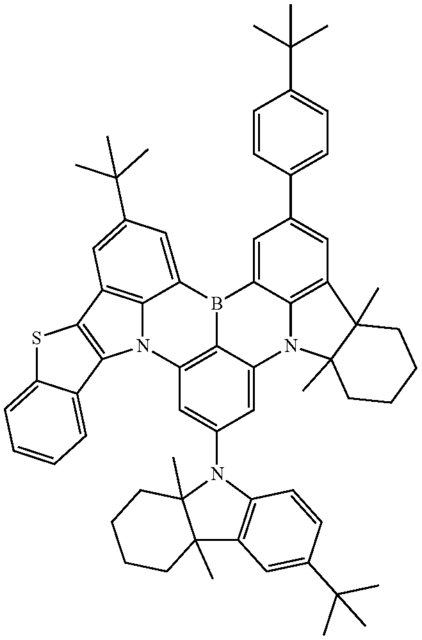
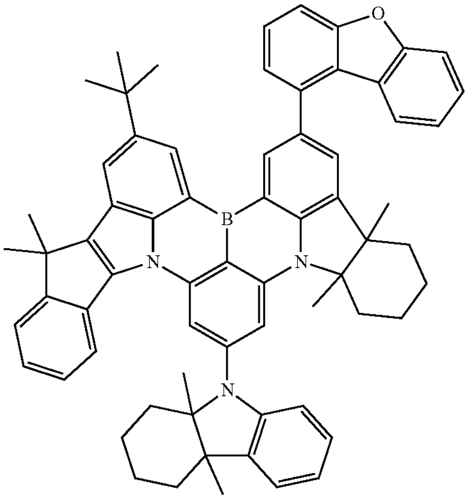

-continued
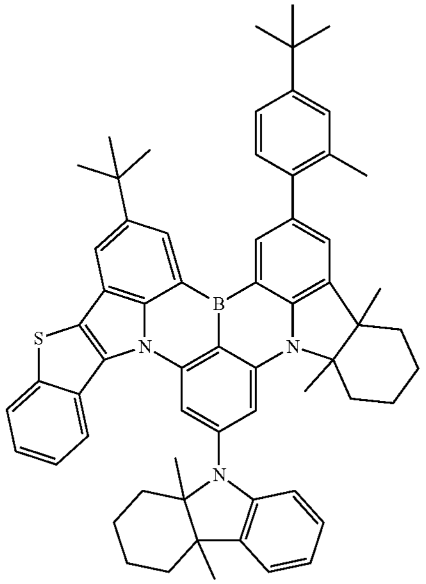
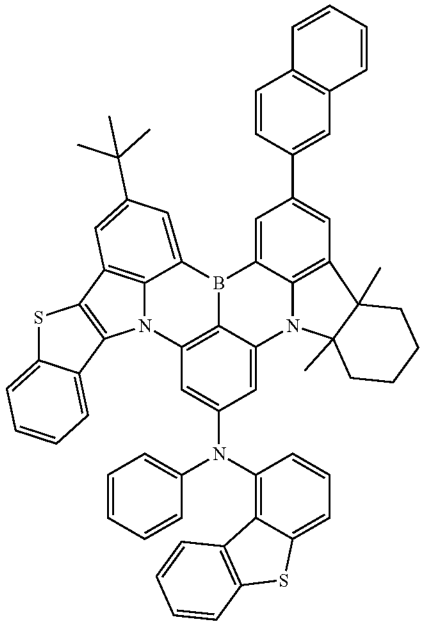
-continued
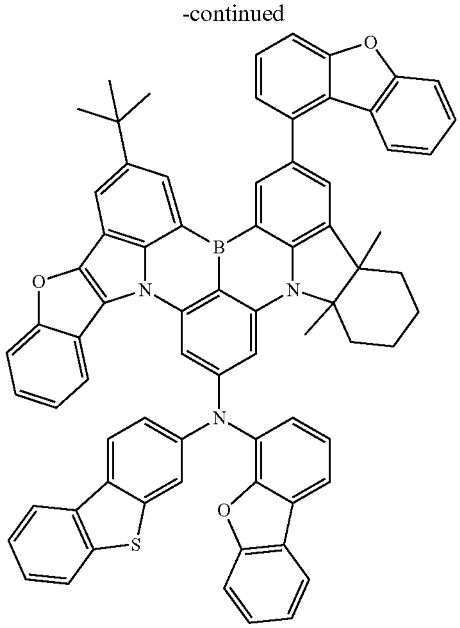
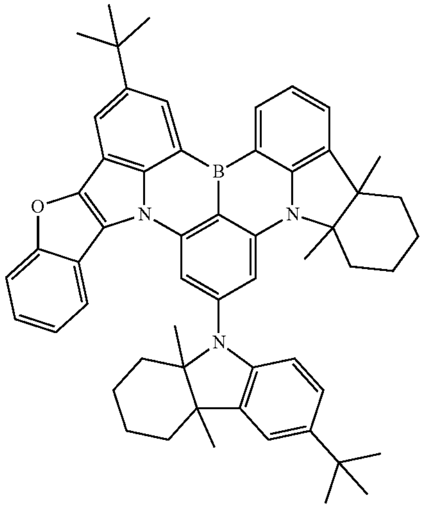
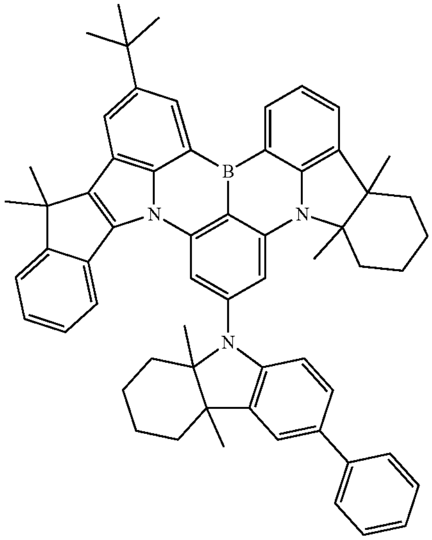

-continued
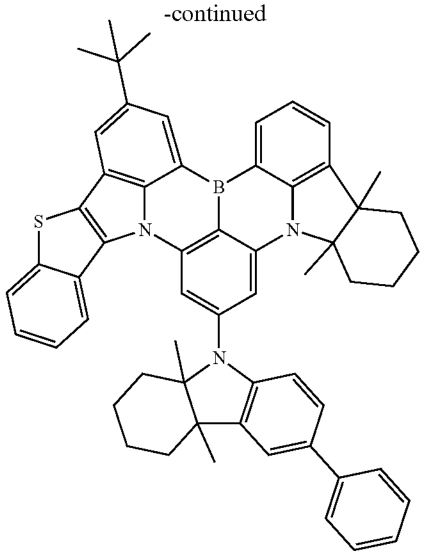
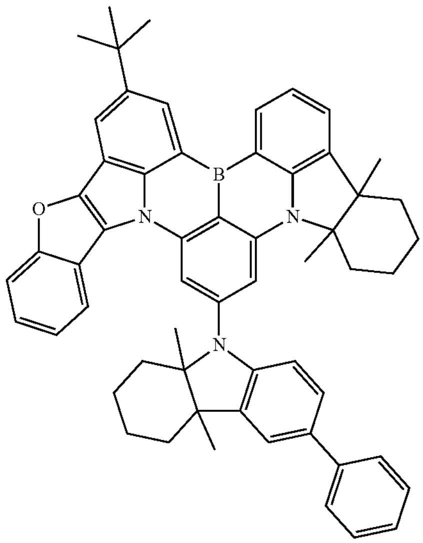
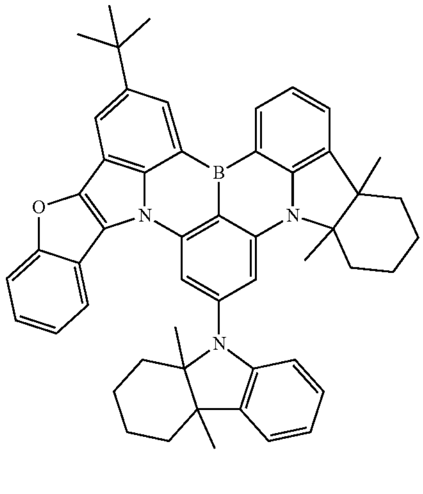
-continued
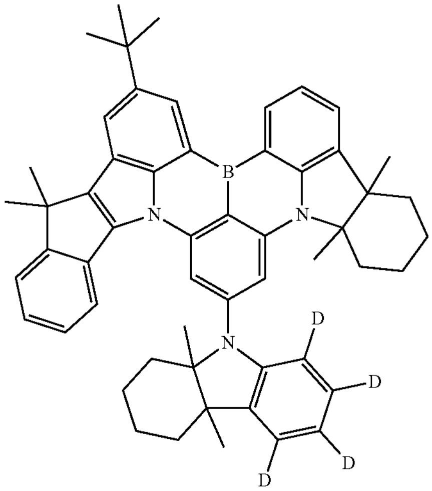
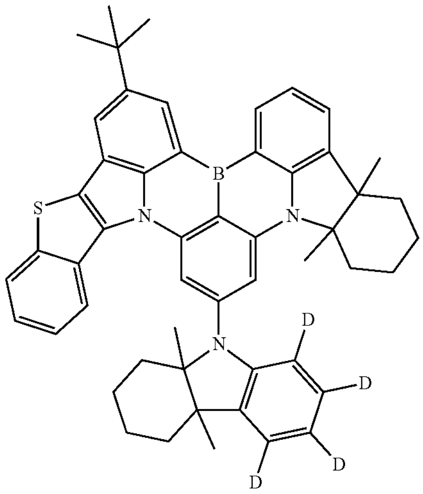
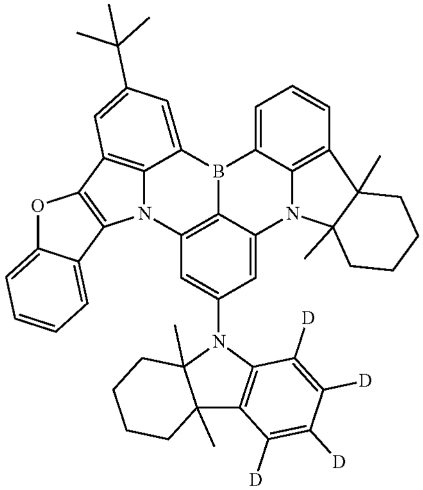

-continued
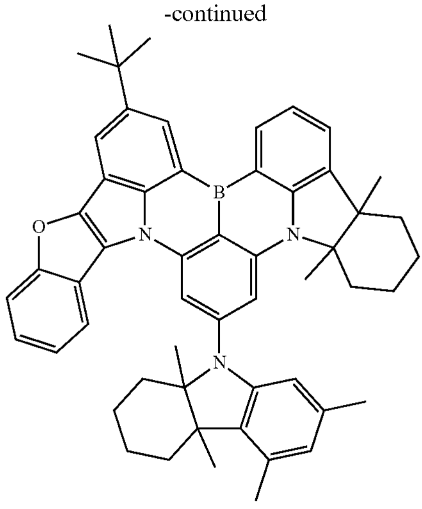
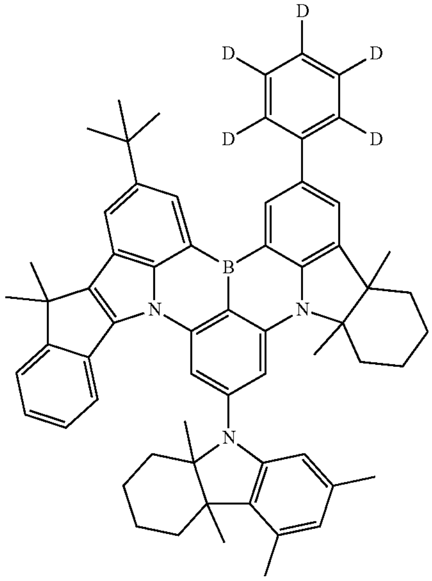
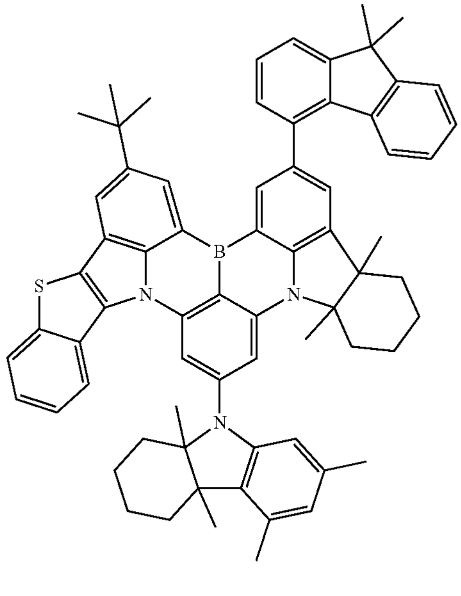
-continued
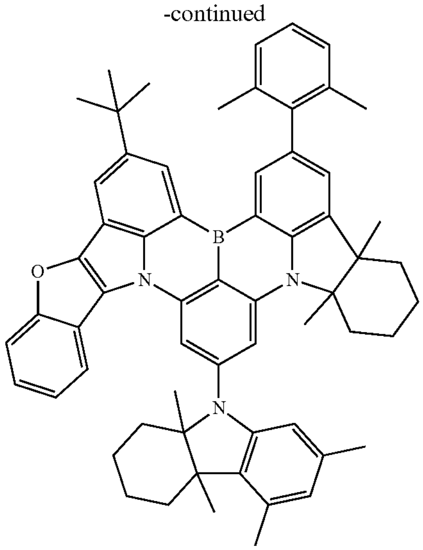
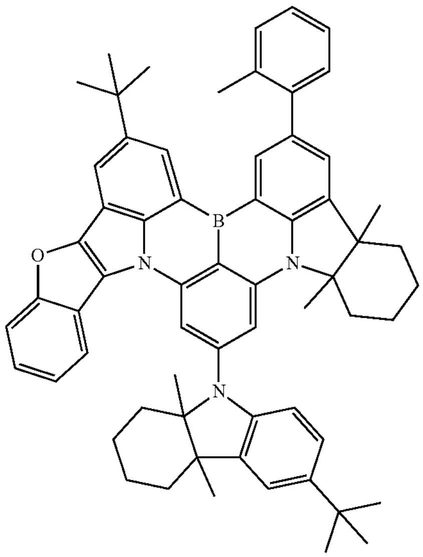
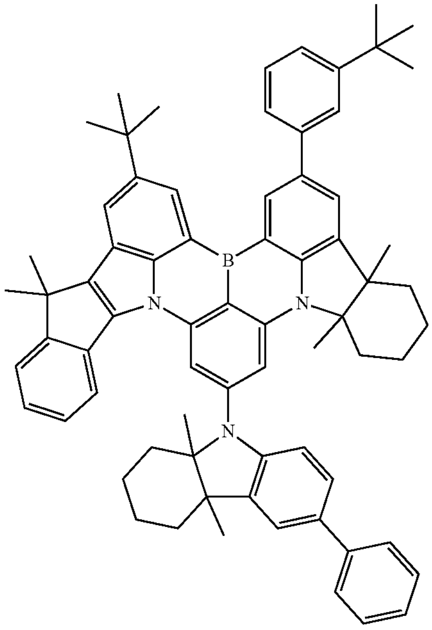

-continued
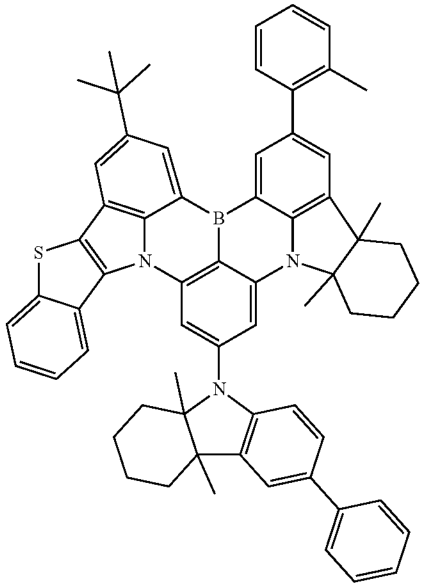
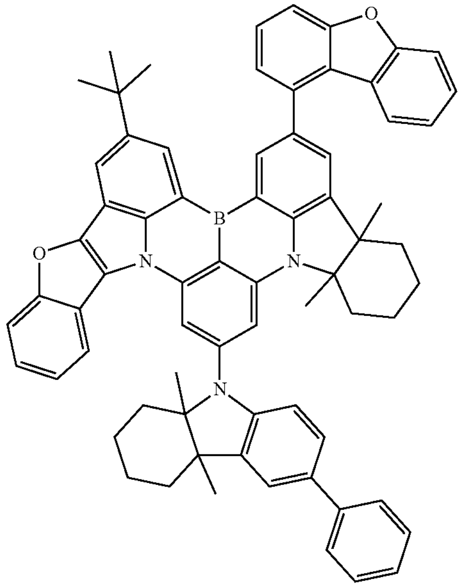
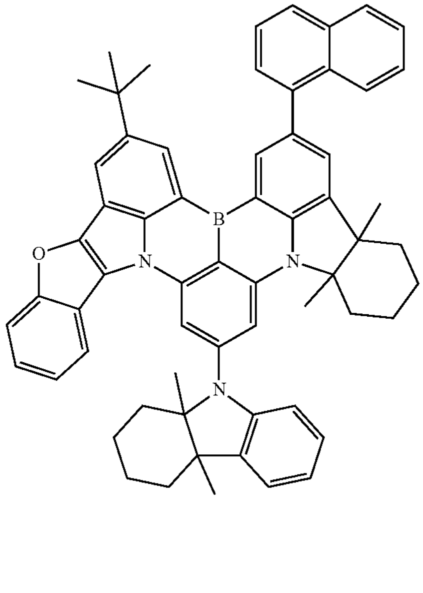
-continued
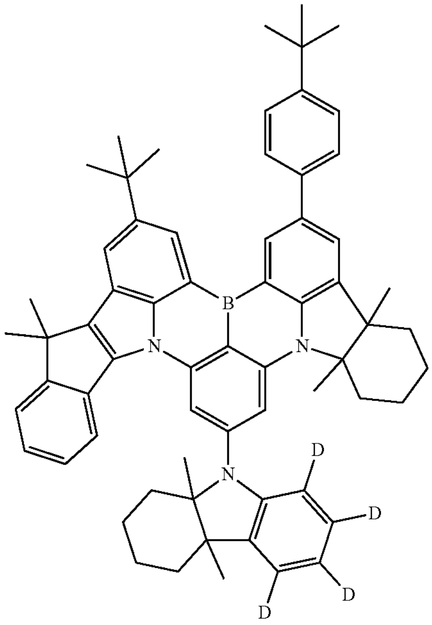
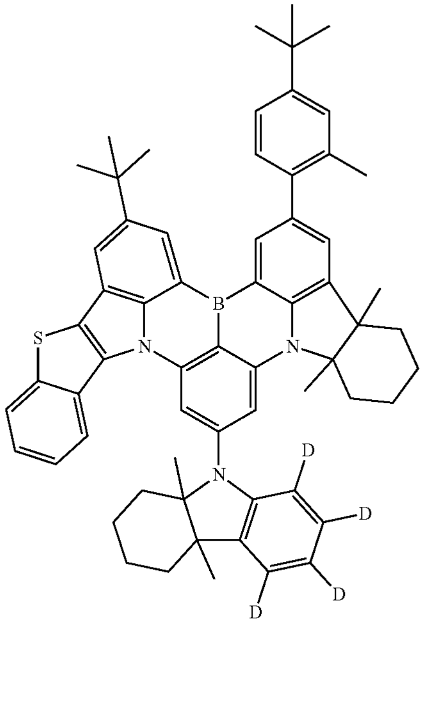

-continued
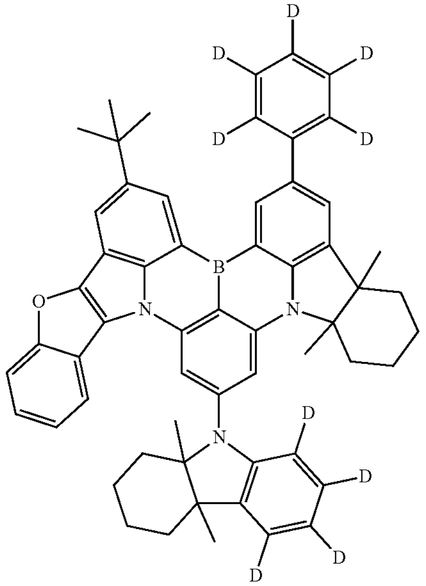
-continued
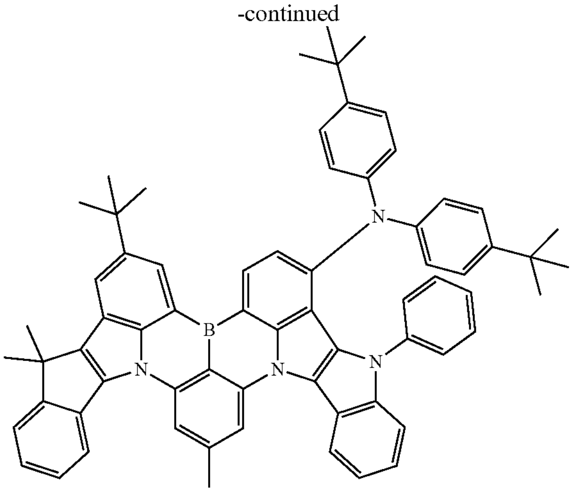
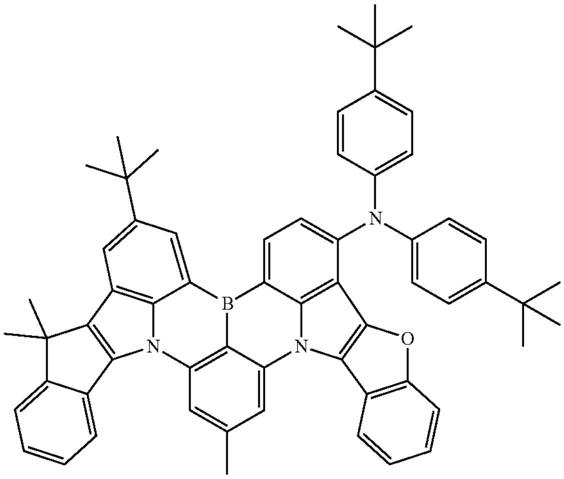
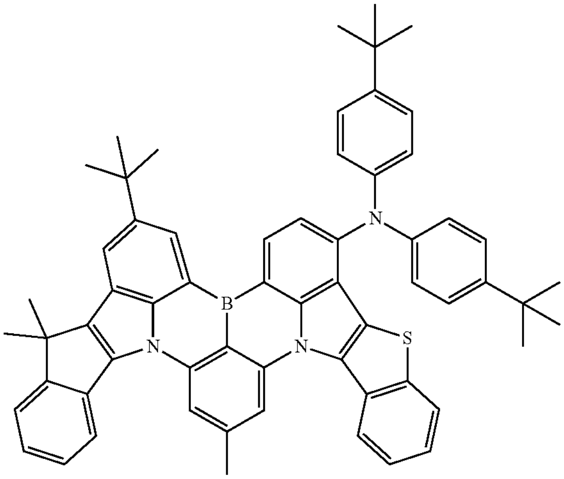
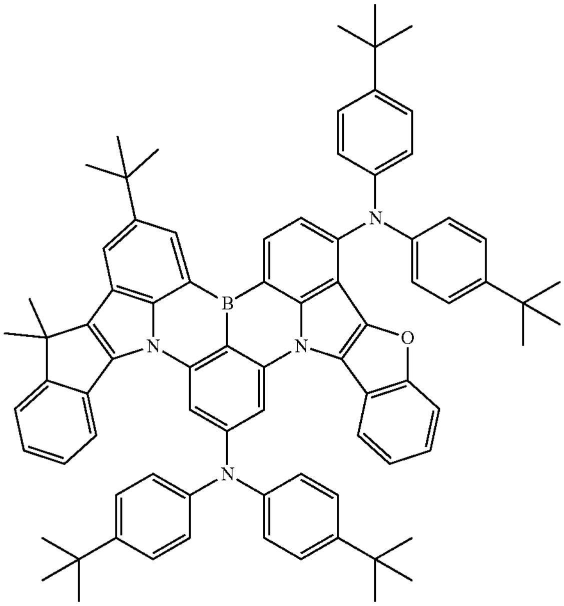
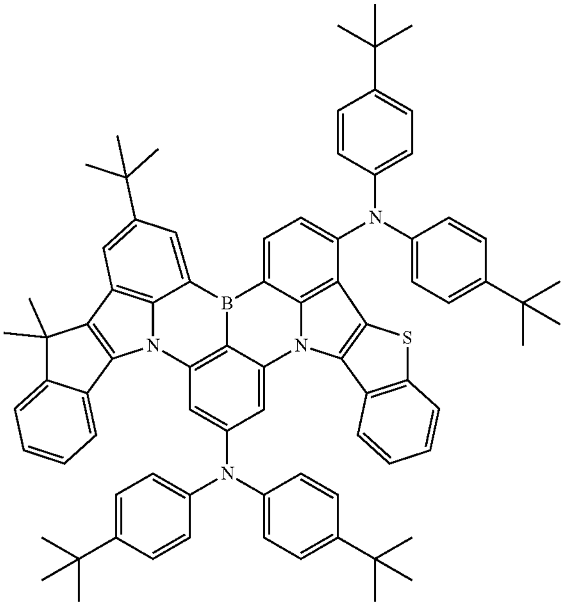

-continued

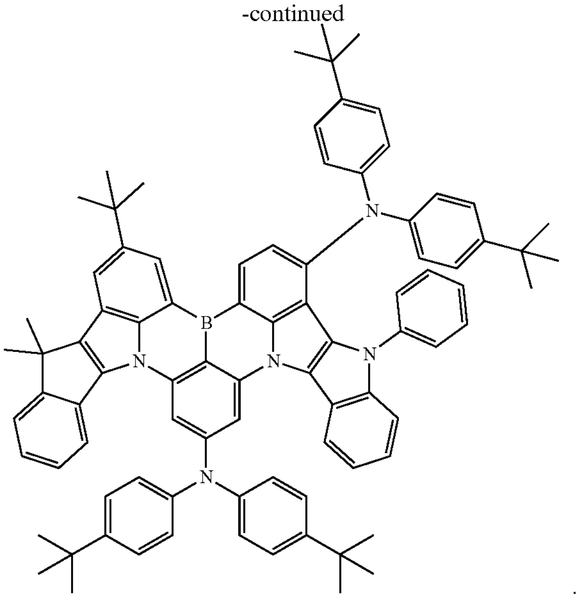

When one part "includes" one constituent element in the present specification, unless otherwise specifically described, this does not mean that another constituent element is excluded, but means that another constituent element can be further included.

When one member is disposed "on" another member in the present specification, this includes not only a case where the one member is brought into contact with another member, but also a case where still another member is present between the two members.

The organic light emitting device of the present invention is an organic light emitting device including: a first electrode; a second electrode provided to face the first electrode; and one, two or more organic material layers provided between the first electrode and the second electrode, and one or more layers of the organic material layer can include the above-described compound.

For example, the structure of the organic light emitting device of the present invention can have a structure as illustrated in FIGS. 1 and 2, but is not limited thereto.

FIG. 1 exemplifies a structure of an organic light emitting device in which a first electrode 2, an organic material layer 3, and a second electrode 4 are sequentially stacked on a substrate 1.

FIG. 1 exemplifies an organic light emitting device, and the organic light emitting device is not limited thereto.

FIG. 2 exemplifies a structure of an organic light emitting device in which a first electrode 2, a first hole injection layer 5, a second hole injection layer 6, a hole transport layer 7, an electron blocking layer 8, a light emitting layer 9, a first electron transport layer 10, a second electron transport layer 11, an electron injection layer 12, and a second electrode 4 are sequentially stacked on a substrate 1. In the structure described above, the compound of Formula 1 can be included in the light emitting layer 9.

FIG. 2 exemplifies an organic light emitting device, and the organic light emitting device is not limited thereto.

In an exemplary embodiment of the present invention, the first electrode is a positive electrode, and the second electrode is a negative electrode.

In an exemplary embodiment of the present invention, the organic material layer includes a light emitting layer, and the light emitting layer includes the compound of Formula 1.

In an exemplary embodiment of the present invention, the organic material layer can include a hole injection layer, a hole transport layer, or a hole injection and transport layer, and the hole injection layer, the hole transport layer, or the hole injection and transport layer can include the compound of Formula 1.

In an exemplary embodiment of the present invention, the organic material layer can include an electron injection layer, an electron transport layer, or an electron injection and transport layer, and the electron injection layer, the electron transport layer, or the electron injection and transport layer can include the compound of Formula 1.

In an exemplary embodiment of the present invention, the organic material layer can include an electron blocking layer or a hole blocking layer, and the electron blocking layer or the hole blocking layer can include the compound of Formula 1.

For example, the organic light emitting device according to the present invention can be manufactured by depositing a metal or a metal oxide having conductivity, or an alloy thereof on a substrate to form a positive electrode, forming an organic material layer including a hole injection layer, a hole transport layer, a light emitting layer, and an electron transport layer and an organic material layer including the compound of Formula 1 thereon, and then depositing a material, which can be used as a negative electrode, thereon, by using a physical vapor deposition (PVD) method such as sputtering or e-beam evaporation. In addition to the method described above, an organic light emitting device can also be made by sequentially depositing a negative electrode material, an organic material layer, and a positive electrode material on a substrate.

The positive electrode is an electrode which injects holes, and as the positive electrode material, materials having a high work function are usually preferred so as to facilitate the injection of holes into an organic material layer. Specific examples of the positive electrode material which can be used in the present invention include: a metal, such as vanadium, chromium, copper, zinc, and gold, or alloys thereof; a metal oxide, such as zinc oxide, indium oxide, indium tin oxide (ITO), and indium zinc oxide (IZO); a combination of metal and oxide, such as ZnO:Al or $SnO_2$:Sb; an electrically conductive polymer, such as poly(3-methyl compound), poly[3,4-(ethylene-1,2-dioxy)compound](PEDT), polypyrrole, and polyaniline, and the like, but are not limited thereto.

The negative electrode is an electrode which injects electrons, and as the negative electrode material, materials having a low work function are usually preferred so as to facilitate the injection of electrons into an organic material layer. Specific examples of the negative electrode material include: a metal such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al; and the like, but are not limited thereto.

The hole injection layer is a layer which serves to facilitate the injection of holes from a positive electrode to a light emitting layer and has a single-layered structure or multi-layered structure of two or more layers, and the hole injection material is a material which can proficiently accept holes from a positive electrode at a low voltage, and the highest occupied molecular orbital (HOMO) of the hole injection material is preferably a value between the work function of the positive electrode material and the HOMO of the neighboring organic material layer. Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone, polyaniline-based and polycompound-based conductive polymers, and the like, but are not limited thereto.

The hole transport layer can serve to facilitate the injection of holes and has a single-layered structure or multi-layered structure of two or more layers, and as the hole transport material, a material which can accept holes from a positive electrode or a hole injection layer and transfer the holes to a light emitting layer and has a high mobility to holes is suitable. Specific examples thereof include arylamine-based organic materials, conductive polymers, block copolymers having both conjugated portions and non-conjugated portions, and the like, but are not limited thereto.

The light emitting layer can emit red, green or blue light and can be composed of a phosphorescent material or a fluorescent material, and the light emitting material is preferably a material having good quantum efficiency for fluorescence or phosphorescence as a material which can emit light in a visible ray region by accepting holes and electrons from the hole transport layer and the electron transport layer, respectively, and combining the holes and the electrons. Specific examples thereof include: 8-hydroxy-quinoline aluminum complexes ($Alq_3$); carbazole-based compounds; dimerized styryl compounds; BAlq; 10-hydroxybenzoquinoline-metal compounds; benzoxazole-based, benzothiazole-based and benzimidazole-based compounds; poly(p-phenylenevinylene) (PPV)-based polymers; spiro compounds; polyfluorene, rubrene, and the like, but are not limited thereto.

When the organic light emitting device includes a plurality of organic material layers, the organic material layers can be formed of the same material or different materials.

When the organic light emitting device includes a plurality of organic material layers, the organic material layers can be formed of the same material or different materials. The organic light emitting device according to the present specification can be manufactured by depositing a metal or a metal oxide having conductivity, or an alloy thereof on a substrate to form a positive electrode, forming an organic material layer including the first organic material layer and the second organic material layer described above thereon, and then depositing a material, which can be used as a negative electrode, thereon. In addition to the method described above, an organic light emitting device can also be made by sequentially depositing a negative electrode material, an organic material layer, and a positive electrode material on a substrate.

The organic material layer including the first organic material layer and the second organic material layer can have a multi-layered structure further including a hole injection layer, a hole transport layer, an electron injection and transport layer, an electron blocking layer, a light emitting layer, an electron transport layer, an electron injection layer, an electron injection and transport layer, a hole blocking layer, and the like.

The organic light emitting device of the present specification can be manufactured by the materials and methods known in the art, except that one or more layers of the organic material layer are formed by using the compound.

The present specification also provides a method for manufacturing an organic light emitting device formed by using the compound.

Examples of the dopant material include aromatic compounds, styrylamine compounds, boron complexes, fluoranthene compounds, metal complexes, and the like. Specifically, the aromatic compound is a fused aromatic ring derivative having a substituted or unsubstituted arylamino group, and examples thereof include a pyrene, an anthracene, a chrysene, a periflanthene, and the like, which have an arylamino group, and the styrylamine compound is a compound in which a substituted or unsubstituted arylamine is substituted with at least one arylvinyl group, and one or two or more substituents selected from the group consisting of an aryl group, a silyl group, an alkyl group, a cycloalkyl group, and an arylamino group is or are substituted or unsubstituted. Specific examples thereof include styrylamine, styryldiamine, styryltriamine, styryltetramine, and the like, but are not limited thereto. Further, examples of the metal complex include iridium complexes, platinum complexes, and the like, but are not limited thereto.

The electron transport layer is a layer which accepts electrons from an electron injection layer and transports the electrons to a light emitting layer, and an electron transport material is suitably a material having high electron mobility which can proficiently accept electrons from a cathode and transfer the electrons to a light emitting layer. Specific examples thereof include: Al complexes of 8-hydroxyquinoline; complexes including $Alq_3$; organic radical compounds; hydroxyflavone-metal complexes, and the like, but are not limited thereto. The electron transport layer can be used with any desired cathode material, as used according to the related art. In particular, examples of an appropriate cathode material include a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which injects electrons from an electrode, and an electron injection material is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, metal complex compounds, nitrogen-containing 5-membered ring derivatives, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxy-quinolinato) manganese, tris(8-hydroxyquinolinato) aluminum, tris (2-methyl-8-hydroxyquinolinato) aluminum, tris(8-hydroxy-quinolinato) gallium, bis(10-hydroxybenzo[h] quinolinato) beryllium, bis(10-hydroxybenzo[h]-quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which blocks holes from reaching a cathode, and can be generally formed under the same conditions as those of the hole injection layer. Specific examples thereof include oxadiazole derivatives or triazole derivatives, phenanthroline derivatives, BCP, aluminum complexes, and the like, but are not limited thereto.

The organic light emitting device according to the present specification can be a top emission type, a bottom emission type, or a dual emission type according to the materials to be used.

The organic light emitting device of the present invention can be manufactured using typical manufacturing methods and materials of an organic light emitting device, except that the above-described compound is used to form an organic material layer having one or more layers.

The preparation method of the compound of Formula 1 and the manufacture of an organic light emitting device using the same will be specifically described in the following Examples. However, the following Examples are provided for exemplifying the present invention, and the scope of the present invention is not limited thereby.

In the following reaction formulae, with respect to the type and number of substituent, various types of intermediates can be synthesized as a person skilled in the art appropriately selects a publicly-known starting material. As the type of reaction and the reaction condition, those known in the art can be used.

Description of Host

<Formula H>

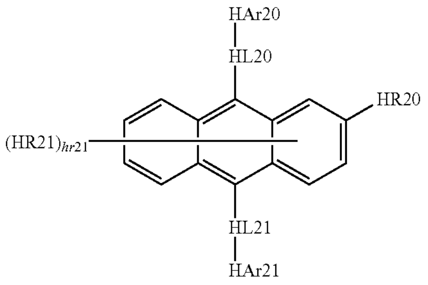

wherein in Formula H:

HL20 and HL21 are the same as or different from each other, and are each independently a direct bond, a substituted or unsubstituted arylene group, or a substituted or unsubstituted heterocyclic group;

HAr20 and HAr21 are the same as or different from each other, and are each independently hydrogen, deuterium, a substituted or unsubstituted aryl group, or a substituted or unsubstituted heterocyclic group;

HR20 and HR21 are the same as or different from each other, and are each independently hydrogen, deuterium, a halogen group, a substituted or unsubstituted alkyl group, a substituted or unsubstituted cycloalkyl group, a substituted or unsubstituted aryl group, or a substituted or unsubstituted heterocyclic group; and hr21 is an integer from 1 to 7, and when hr21 is 2 or higher, two or more HR21s are the same as or different from each other.

In an exemplary embodiment of the present specification, HL20 and HL21 are the same as or different from each other, and are each independently a direct bond, a monocyclic or polycyclic arylene group having 6 to 30 carbon atoms, or a monocyclic or polycyclic heteroarylene group having 2 to 30 carbon atoms.

In an exemplary embodiment of the present specification, HL20 and HL21 are the same as or different from each other, and are each independently a direct bond, a monocyclic or polycyclic arylene group having 6 to 20 carbon atoms, or a monocyclic or polycyclic heteroarylene group having 2 to 20 carbon atoms.

In an exemplary embodiment of the present specification, HL20 and HL21 are the same as or different from each other, and are each independently a direct bond; a phenylene group which is unsubstituted or substituted with deuterium; a biphenylylene group which is unsubstituted or substituted with deuterium; a naphthylene group which is unsubstituted or substituted with deuterium; a divalent dibenzofuran group; or a divalent dibenzothiophene group.

In an exemplary embodiment of the present specification, HAr20 and HAr21 are the same as or different from each other, and are each independently a substituted or unsubstituted monocyclic or polycyclic aryl group having 6 to 30 carbon atoms, or a substituted or unsubstituted monocyclic or polycyclic heterocyclic group having 2 to 30 carbon atoms.

In an exemplary embodiment of the present specification, HAr20 and HAr21 are the same as or different from each other, and are each independently a substituted or unsubstituted monocyclic or polycyclic aryl group having 6 to 20 carbon atoms, or a substituted or unsubstituted monocyclic or polycyclic heterocyclic group having 2 to 20 carbon atoms.

In an exemplary embodiment of the present specification, HAr20 and HAr21 are the same as or different from each other, and are each independently a substituted or unsubstituted monocyclic to tetracyclic aryl group having 6 to 20 carbon atoms, or a substituted or unsubstituted monocyclic to tetracyclic heterocyclic group having 6 to 20 carbon atoms.

In an exemplary embodiment of the present specification, HAr20 and HAr22 are the same as or different from each other, and are each independently a substituted or unsubstituted phenyl group, a substituted or unsubstituted biphenyl group, a substituted or unsubstituted terphenyl group, a substituted or unsubstituted naphthyl group, a substituted or unsubstituted anthracene group, a substituted or unsubstituted phenanthrene group, a substituted or unsubstituted phenalene group, a substituted or unsubstituted fluorene group, a substituted or unsubstituted benzofluorene group, a substituted or unsubstituted furan group, a substituted or unsubstituted thiophene group, a substituted or unsubstituted dibenzofuran group, a substituted or unsubstituted naphthobenzofuran group, a substituted or unsubstituted dibenzothiophene group, or a substituted or unsubstituted naphthobenzothiophene group.

In an exemplary embodiment of the present specification, HAr20 and HAr21 are the same as or different from each other, and are each independently a phenyl group which is unsubstituted or substituted with deuterium or a monocyclic or polycyclic aryl group having 6 to 20 carbon atoms; a biphenyl group which is unsubstituted or substituted with deuterium or a monocyclic or polycyclic aryl group having 6 to 20 carbon atoms; a naphthyl group which is unsubstituted or substituted with a monocyclic or polycyclic aryl group having 6 to 20 carbon atoms; a dibenzofuran group which is unsubstituted or substituted with a monocyclic or polycyclic aryl group having 6 to 20 carbon atoms; a naphthobenzofuran group which is unsubstituted or substituted with a monocyclic or polycyclic aryl group having 6 to 20 carbon atoms; a dibenzothiophene group which is unsubstituted or substituted with a monocyclic or polycyclic aryl group having 6 to 20 carbon atoms; or a naphthobenzothiophene group which is unsubstituted or substituted with a monocyclic or polycyclic aryl group having 6 to 20 carbon atoms.

In an exemplary embodiment of the present specification, HAr20 and HAr21 are the same as or different from each other, and are each independently a phenyl group which is unsubstituted or substituted with deuterium; a biphenyl group which is unsubstituted or substituted with deuterium; a terphenyl group; a naphthyl group which is unsubstituted or substituted with deuterium; a phenanthrene group; a dibenzofuran group; a naphthobenzofuran group; a dibenzothiophene group; or a naphthobenzothiophene group.

In an exemplary embodiment of the present specification, HAr20 is a substituted or unsubstituted heterocyclic group, and HAr21 is a substituted or unsubstituted aryl group.

In an exemplary embodiment of the present specification, HR20 is hydrogen, deuterium, a halogen group, a substituted or unsubstituted straight-chained or branched alkyl group having 1 to 30 carbon atoms, a substituted or unsubstituted monocyclic or polycyclic cycloalkyl group having 3 to 30 carbon atoms, a substituted or unsubstituted monocyclic or polycyclic aryl group having 6 to 30 carbon atoms, or a substituted or unsubstituted monocyclic or polycyclic heterocyclic group having 2 to 30 carbon atoms.

In an exemplary embodiment of the present specification, HR20 is hydrogen, deuterium, fluorine, a substituted or unsubstituted straight-chained or branched alkyl group having 1 to 10 carbon atoms, a substituted or unsubstituted monocyclic or polycyclic cycloalkyl group having 3 to 10 carbon atoms, a substituted or unsubstituted monocyclic or polycyclic aryl group having 6 to 30 carbon atoms, or a substituted or unsubstituted monocyclic or polycyclic heterocyclic group having 2 to 30 carbon atoms.

In an exemplary embodiment of the present specification, HR20 is hydrogen, a substituted or unsubstituted monocyclic or polycyclic aryl group having 6 to 30 carbon atoms, or a substituted or unsubstituted monocyclic or polycyclic heterocyclic group having 2 to 30 carbon atoms.

In an exemplary embodiment of the present specification, HR20 is hydrogen, a substituted or unsubstituted monocyclic or polycyclic aryl group having 6 to 20 carbon atoms, or a substituted or unsubstituted monocyclic or polycyclic heterocyclic group having 2 to 20 carbon atoms.

In an exemplary embodiment of the present specification, HR20 is hydrogen, a substituted or unsubstituted monocyclic to tetracyclic aryl group having 6 to 20 carbon atoms, or a substituted or unsubstituted monocyclic to tetracyclic heterocyclic group having 6 to 20 carbon atoms.

In an exemplary embodiment of the present specification, HR20 is hydrogen, a substituted or unsubstituted phenyl group, a substituted or unsubstituted biphenyl group, a substituted or unsubstituted terphenyl group, a substituted or unsubstituted naphthyl group, a substituted or unsubstituted anthracene group, a substituted or unsubstituted phenanthrene group, a substituted or unsubstituted phenalene group, a substituted or unsubstituted fluorene group, a substituted or unsubstituted benzofluorene group, a substituted or unsubstituted furan group, a substituted or unsubstituted thiophene group, a substituted or unsubstituted dibenzofuran group, a substituted or unsubstituted naphthobenzofuran group, a substituted or unsubstituted dibenzothiophene group, or a substituted or unsubstituted naphthobenzothiophene group.

In an exemplary embodiment of the present specification, HR20 is hydrogen; deuterium; a phenyl group which is unsubstituted or substituted with deuterium or a monocyclic or polycyclic aryl group having 6 to 20 carbon atoms; a biphenyl group which is unsubstituted or substituted with a monocyclic or polycyclic aryl group having 6 to 20 carbon atoms; a naphthyl group which is unsubstituted or substituted with deuterium or a monocyclic or polycyclic aryl group having 6 to 20 carbon atoms; a dibenzofuran group which is unsubstituted or substituted with a monocyclic or polycyclic aryl group having 6 to 20 carbon atoms; a naphthobenzofuran group which is unsubstituted or substituted with a monocyclic or polycyclic aryl group having 6 to 20 carbon atoms; a dibenzothiophene group which is unsubstituted or substituted with a monocyclic or polycyclic aryl group having 6 to 20 carbon atoms; or a naphthobenzothiophene group which is unsubstituted or substituted with a monocyclic or polycyclic aryl group having 6 to 20 carbon atoms.

In an exemplary embodiment of the present specification, HR20 is hydrogen; deuterium; a phenyl group which is unsubstituted or substituted with deuterium, a phenyl group, or a naphthyl group; a biphenyl group; a naphthyl group which is unsubstituted or substituted with deuterium, a phenyl group, or a naphthyl group; a dibenzofuran group; a naphthobenzofuran group; a dibenzothiophene group; or a naphthobenzothiophene group.

According to an exemplary embodiment of the present specification, HR21 is hydrogen.

According to an exemplary embodiment of the present specification, HR21 is deuterium.

In an exemplary embodiment of the present specification, when the compound of Formula H is substituted with deuterium, 30% or more of H at a substitutable position is substituted with deuterium. In another exemplary embodiment, in the structure of Formula H, 40% or more of H at a substitutable position is substituted with deuterium. In still another exemplary embodiment, in the structure of Formula H, 60% or more of H at a substitutable position is substituted with deuterium.

In yet another exemplary embodiment, in the structure of Formula H, 80% or more of H at a substitutable position is substituted with deuterium. In still yet another exemplary embodiment, in the structure of Formula H, 100% of H at a substitutable position is substituted with deuterium.

In an exemplary embodiment of the present specification, the compound of Formula H is any one compound selected from among the following compounds:

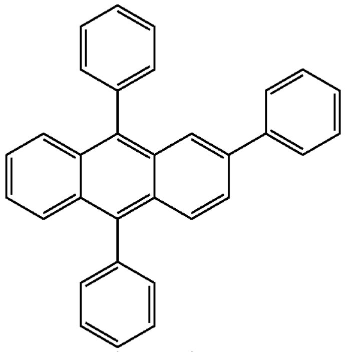

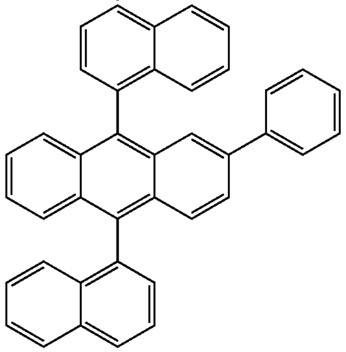

-continued
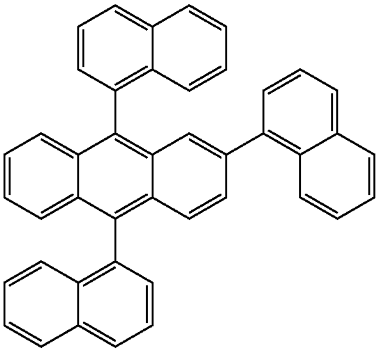
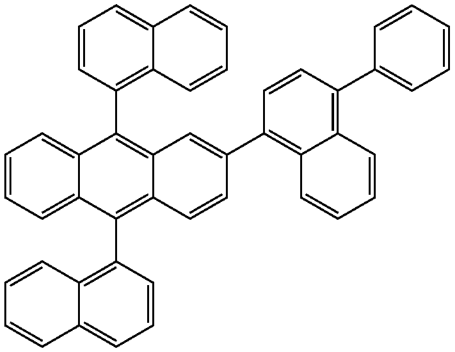
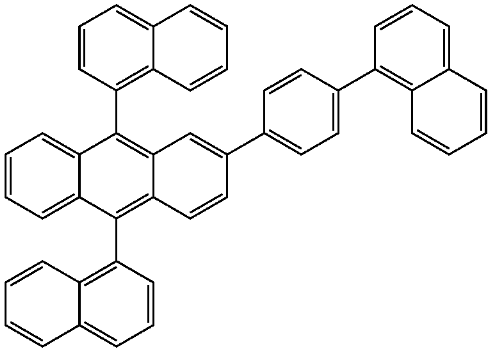
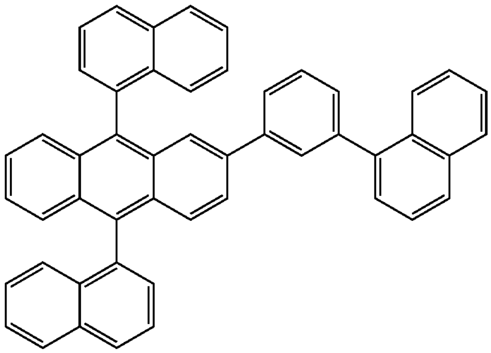
-continued
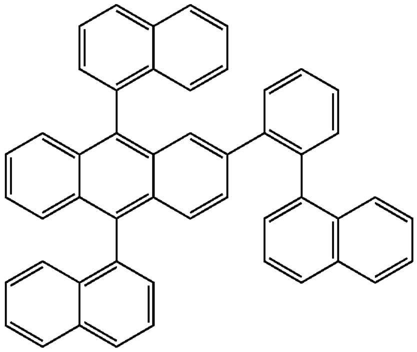
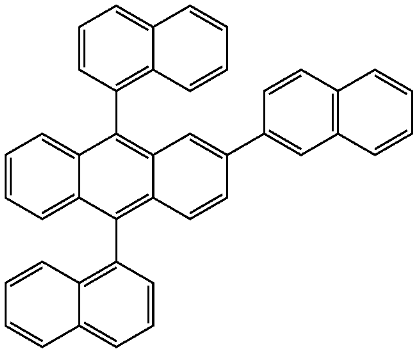
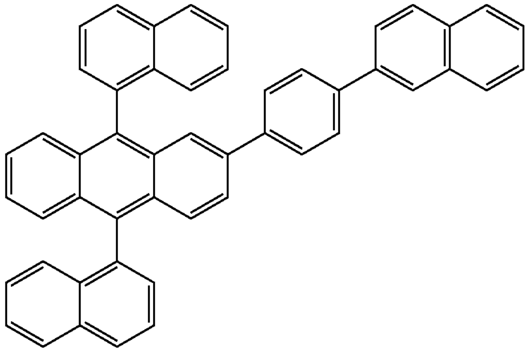
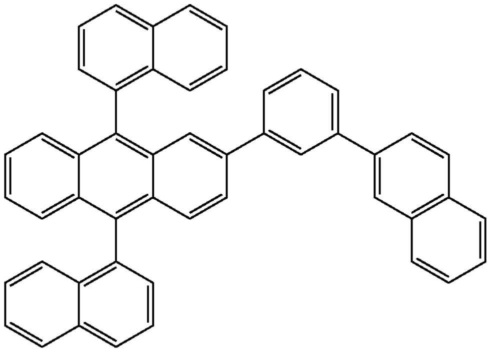

-continued
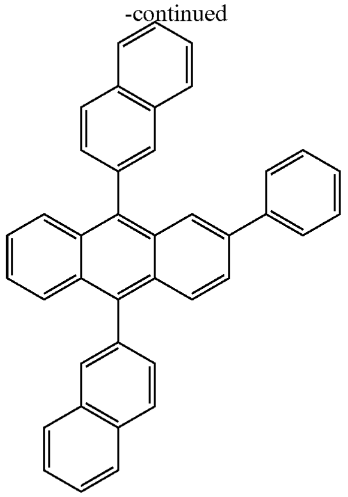
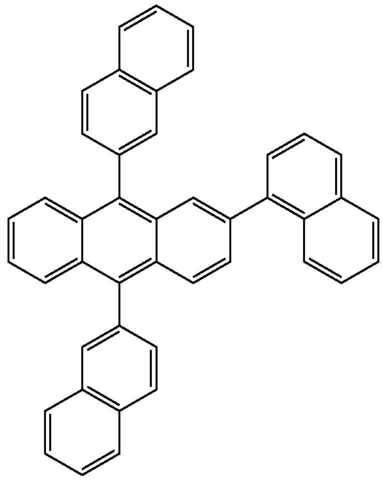
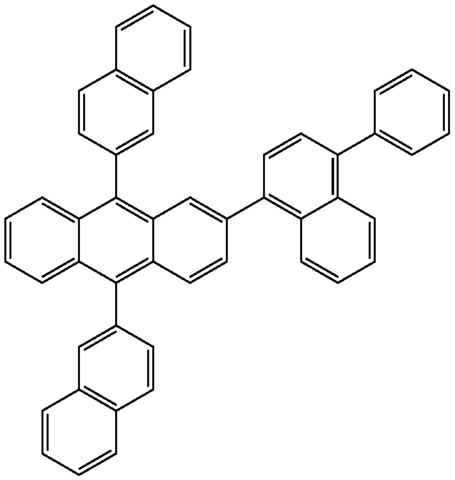
-continued
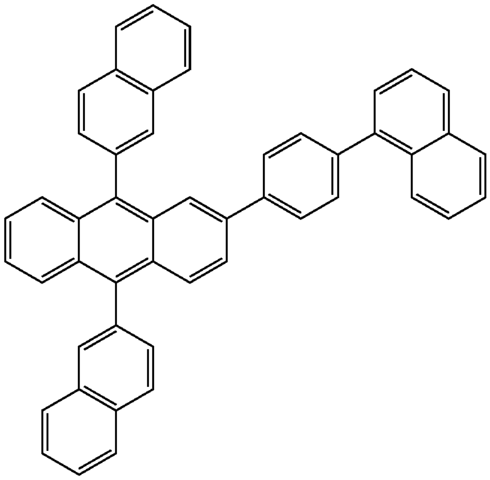
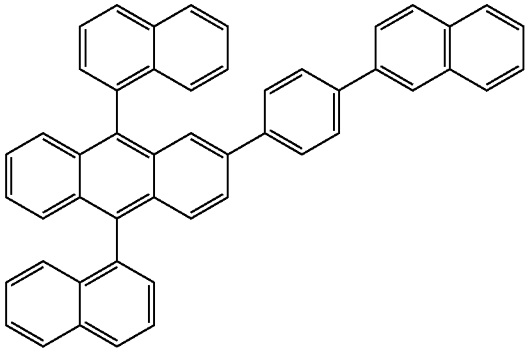
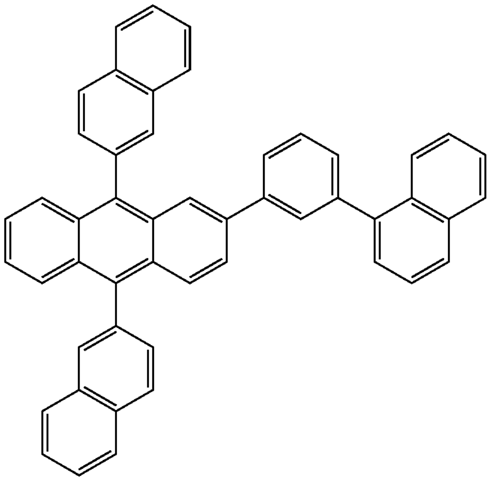

-continued
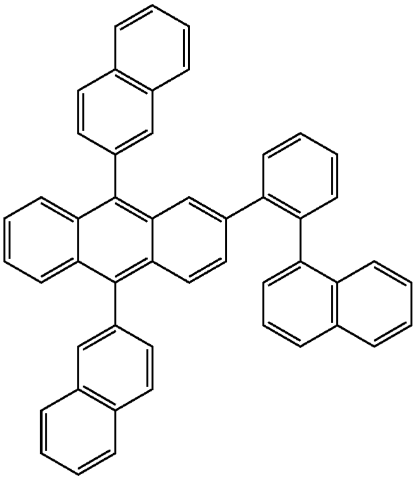
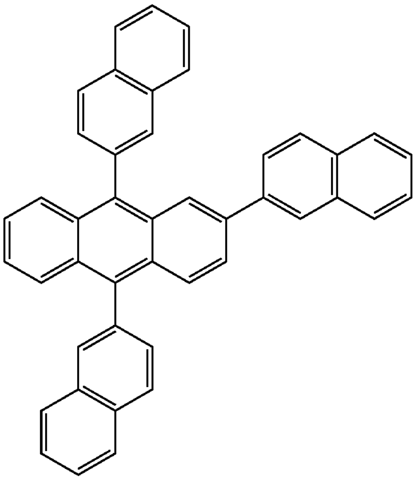
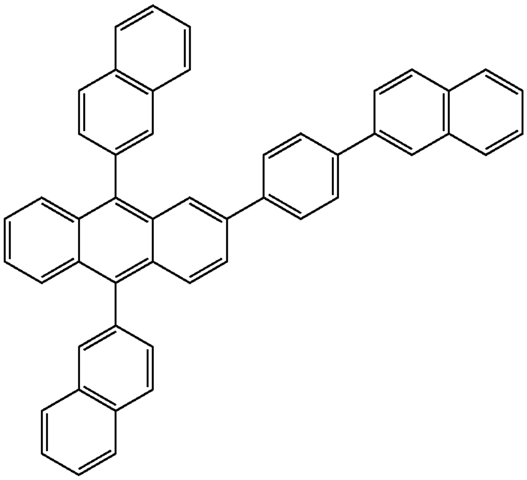
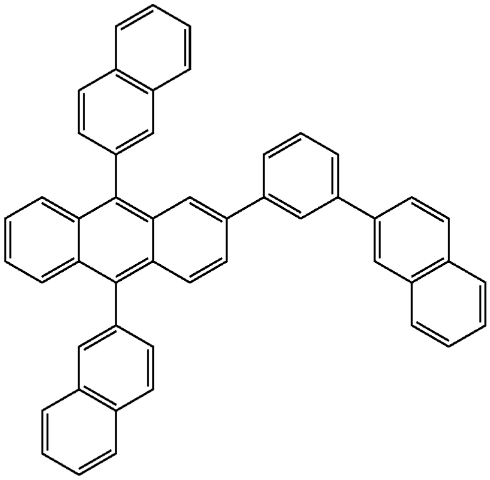
-continued
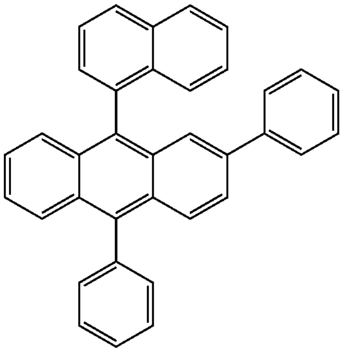
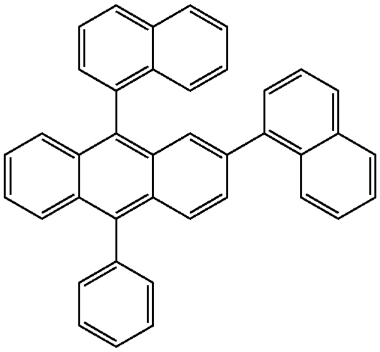
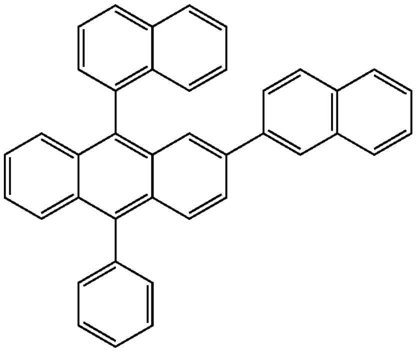

-continued
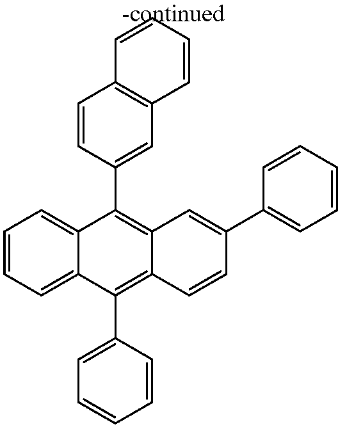
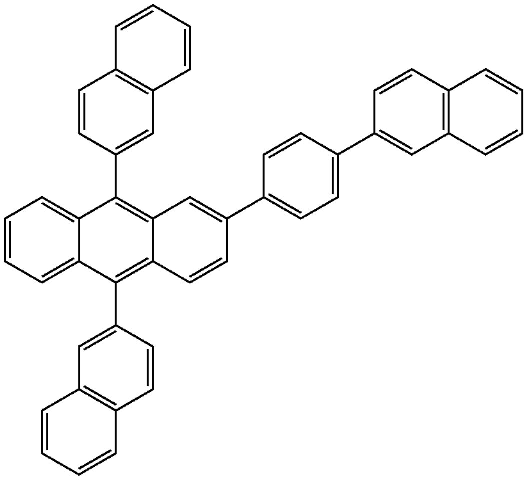
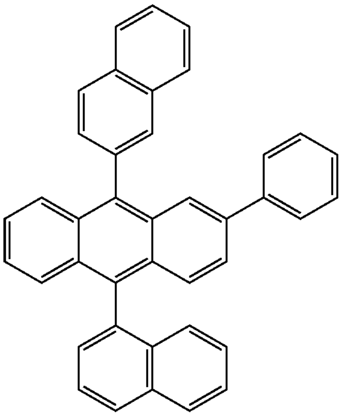
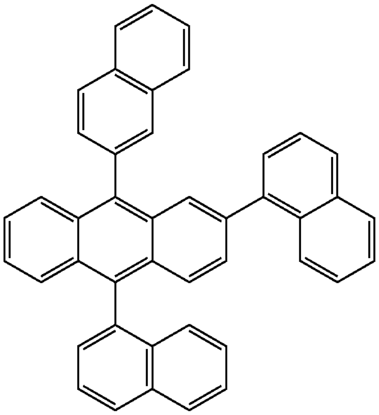
-continued
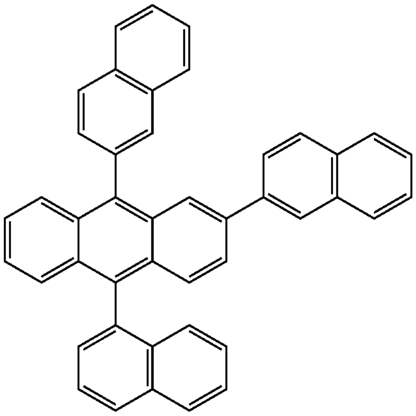
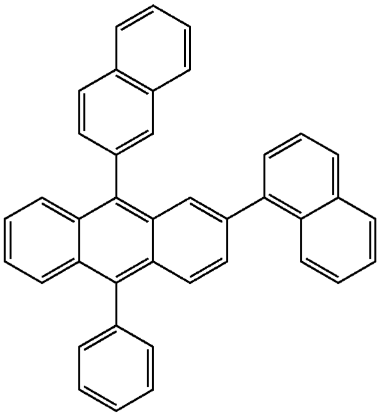
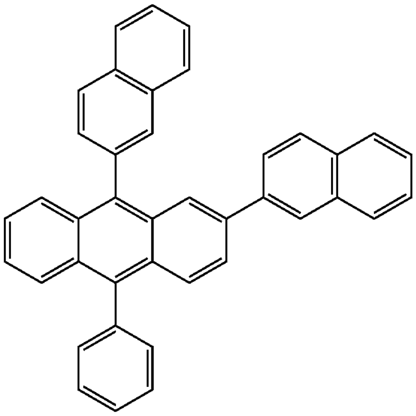

-continued
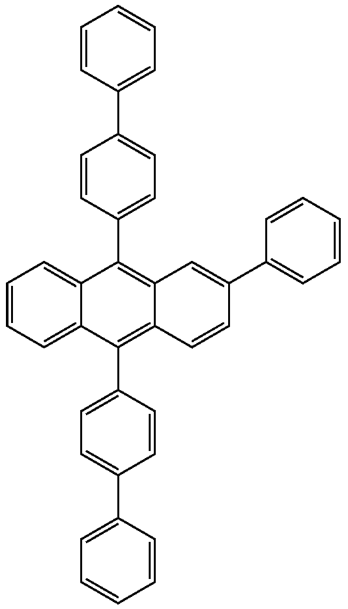
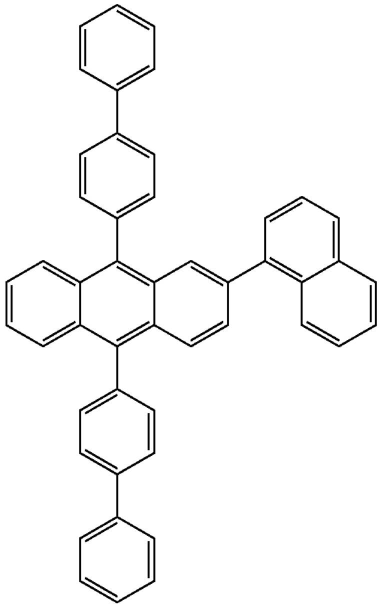
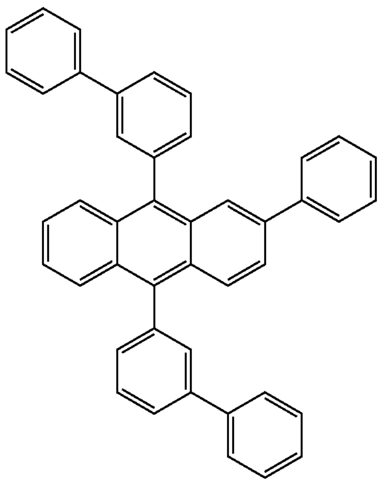
-continued
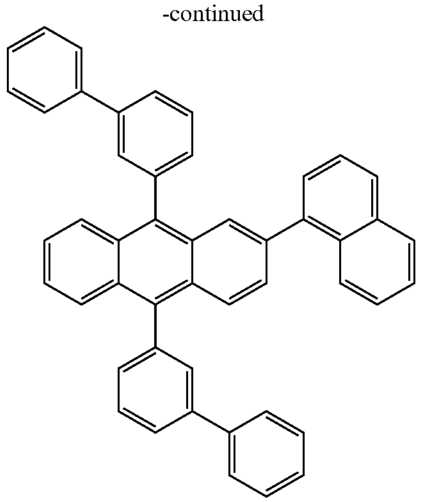
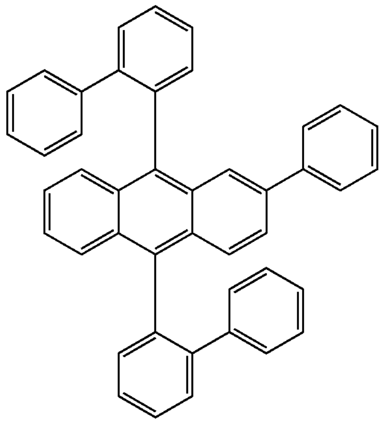
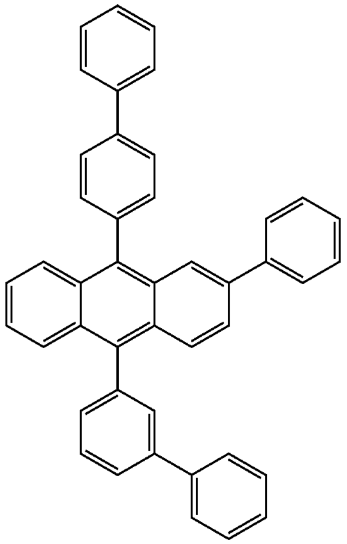

-continued
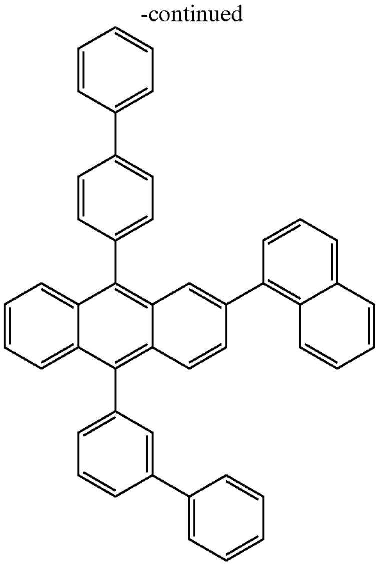
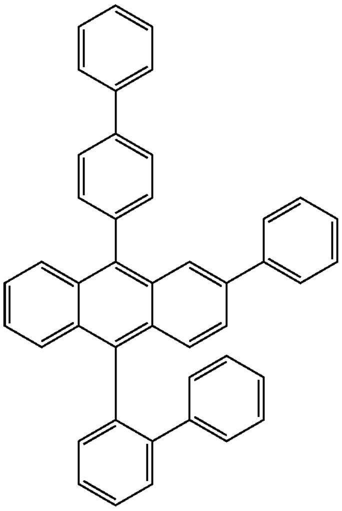
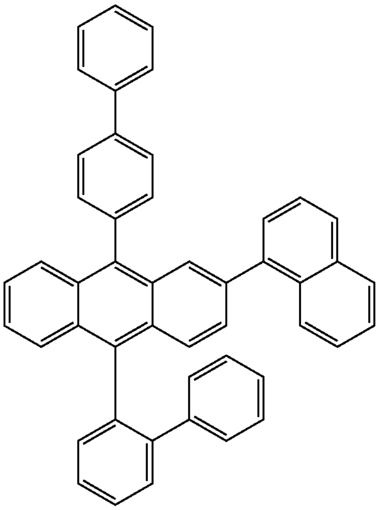
-continued
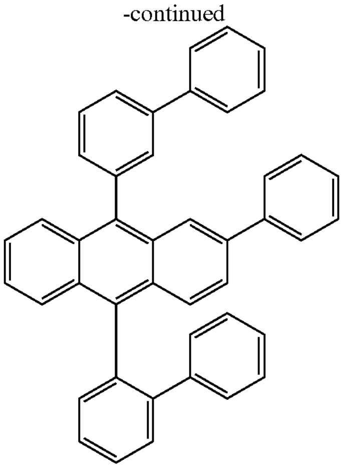
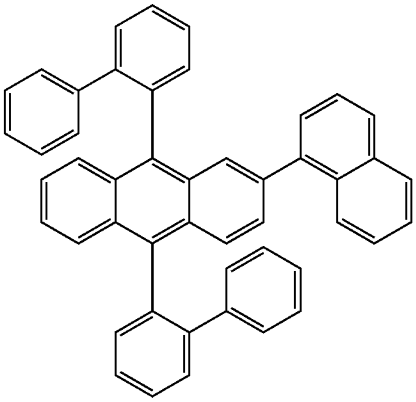
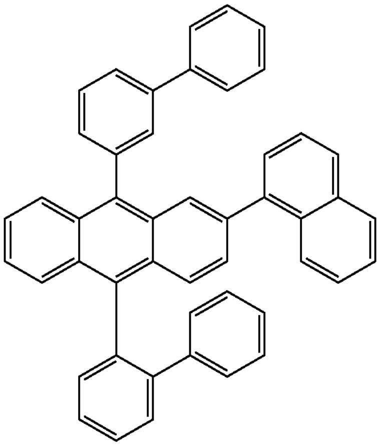
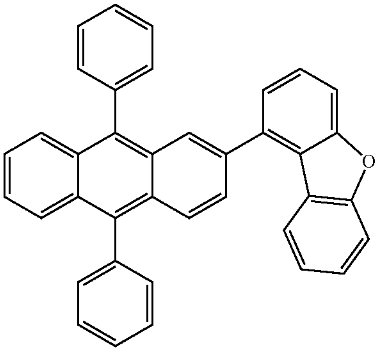

-continued
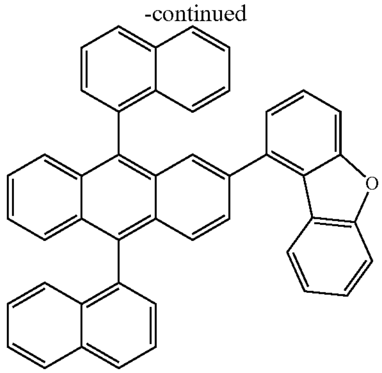
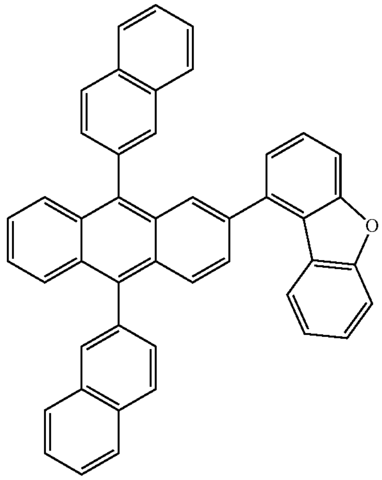
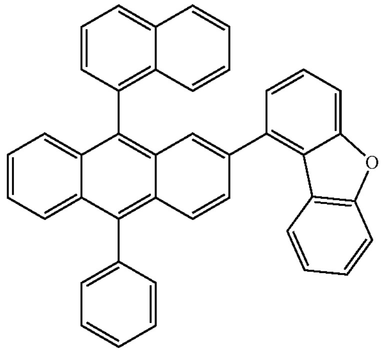
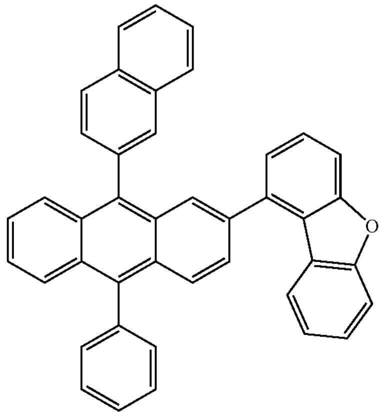
-continued
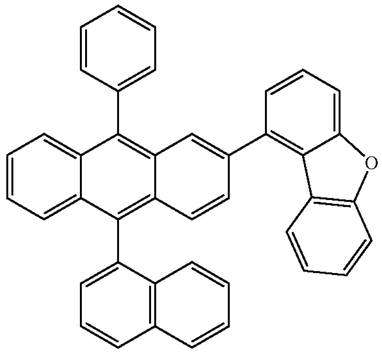
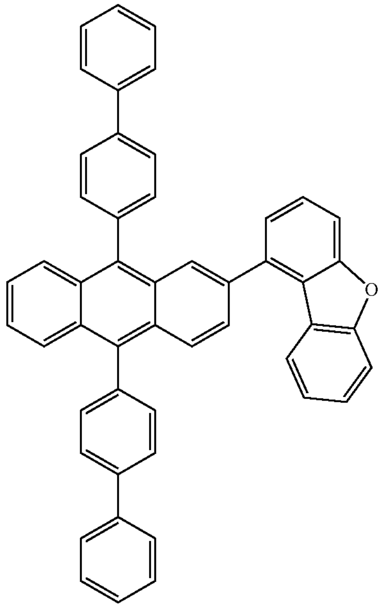
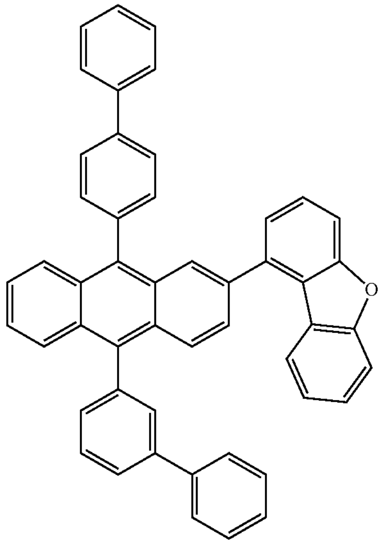

-continued
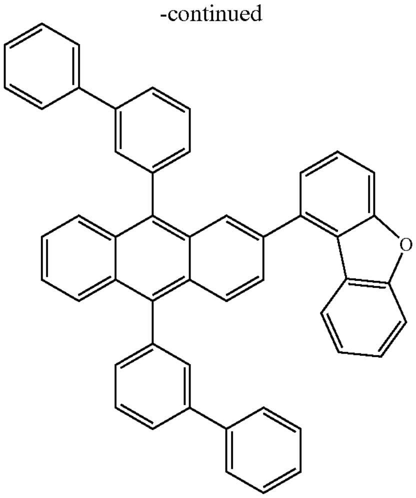
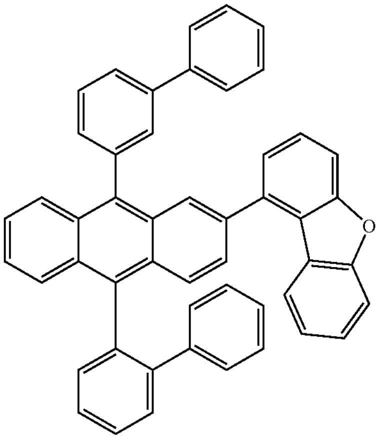
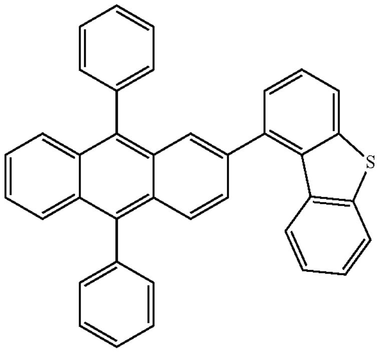
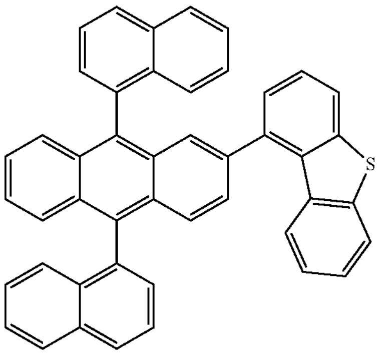
-continued
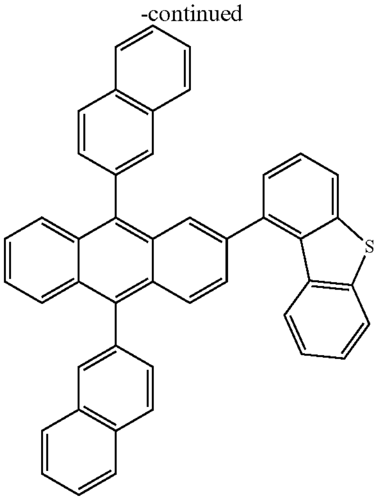
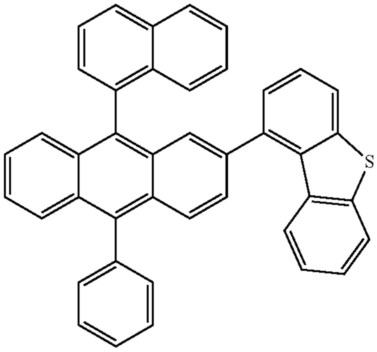
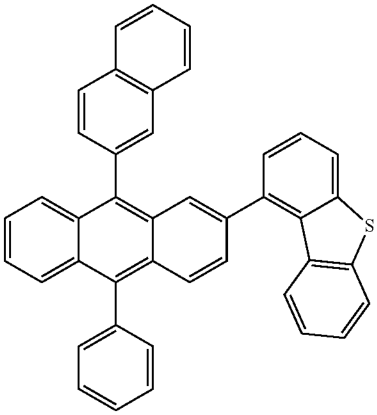
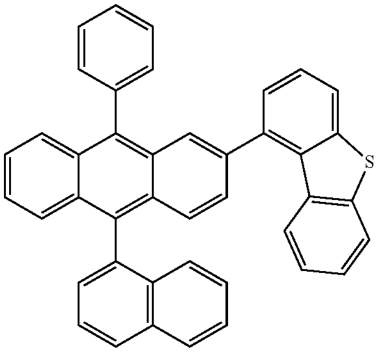

-continued
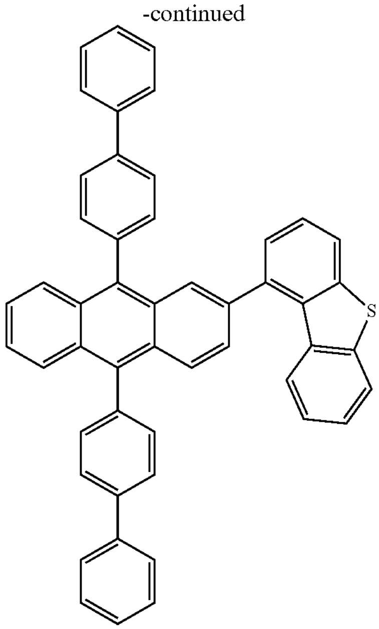
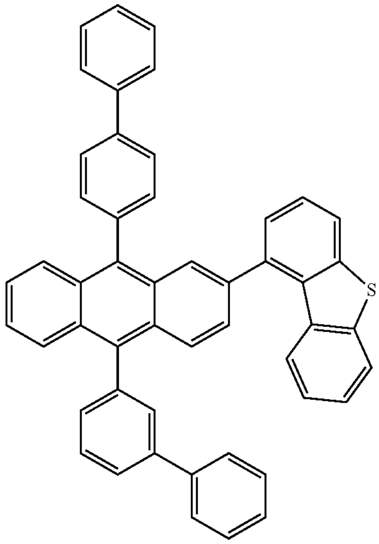
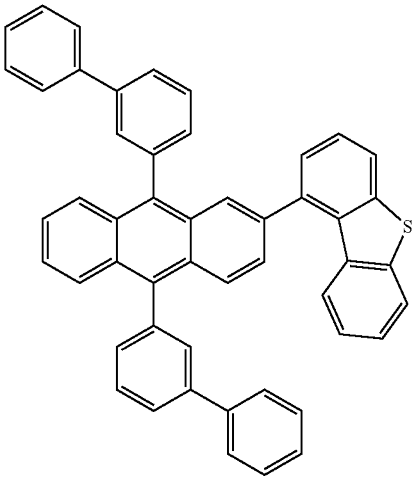
-continued
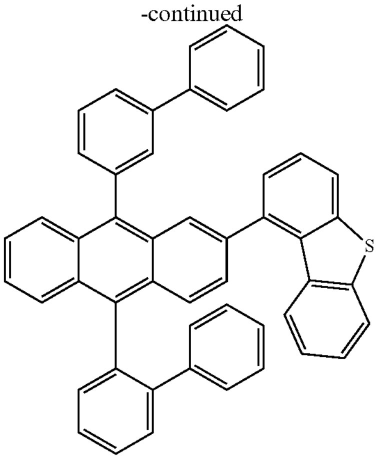
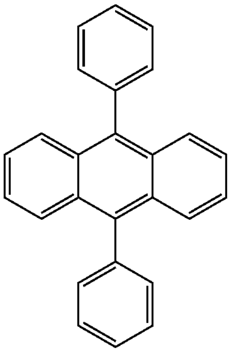
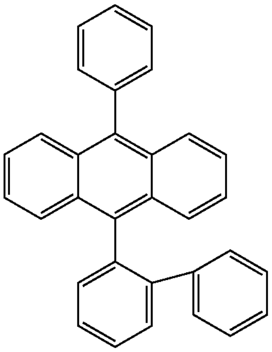
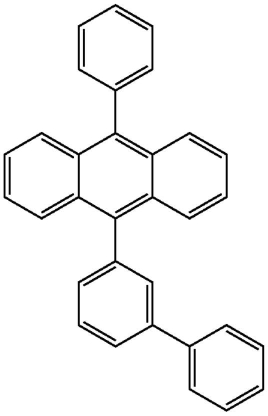
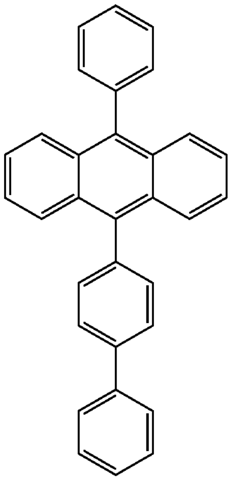
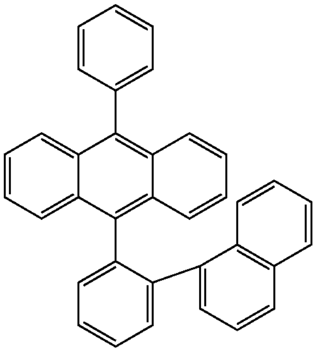

-continued
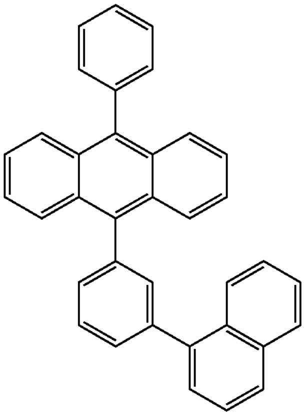
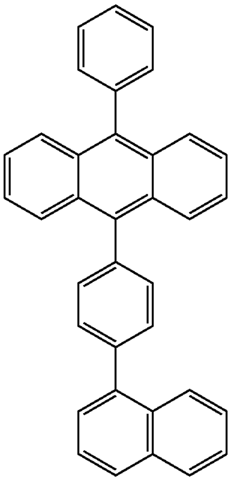
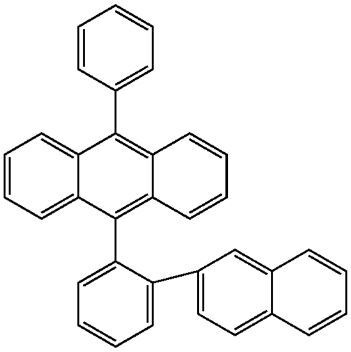
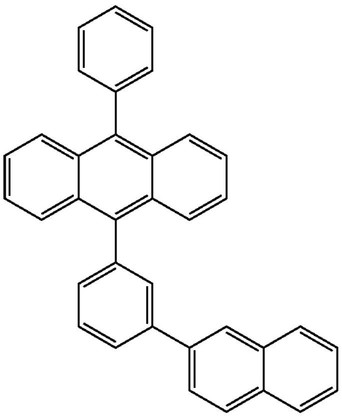
-continued
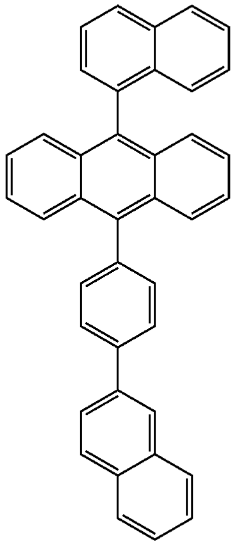
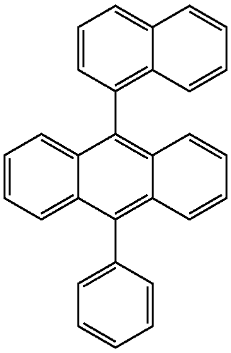
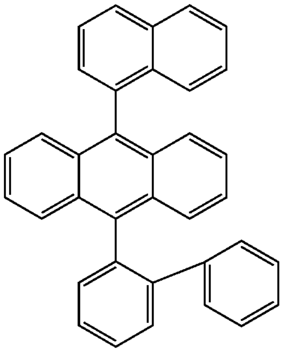
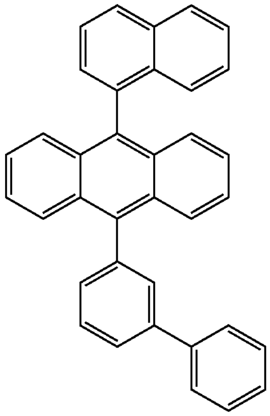
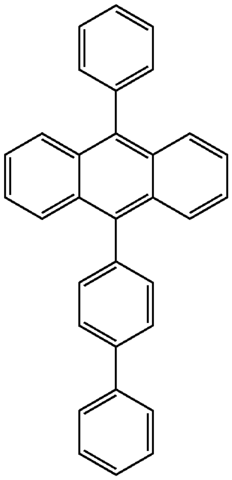
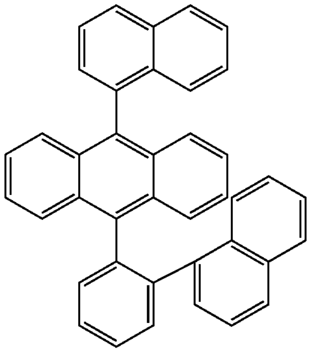

-continued
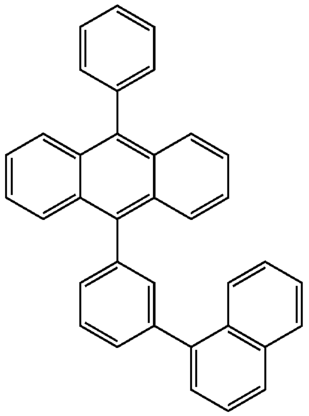
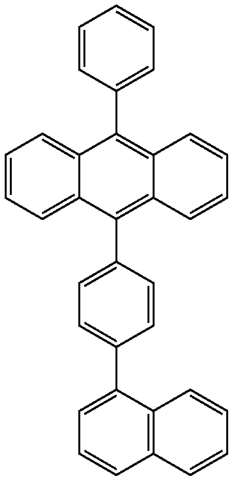
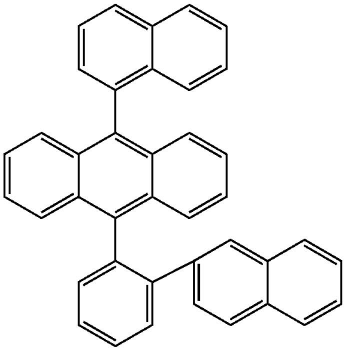
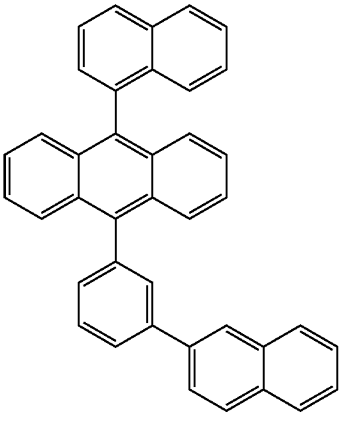
-continued
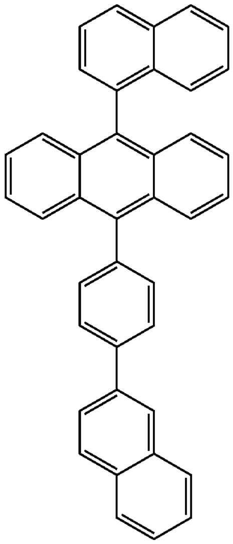
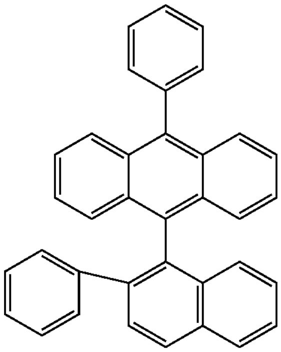
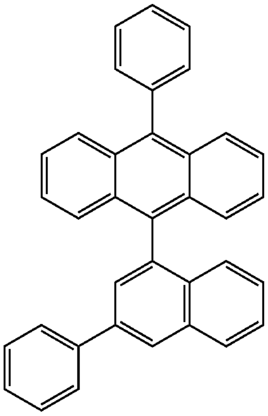
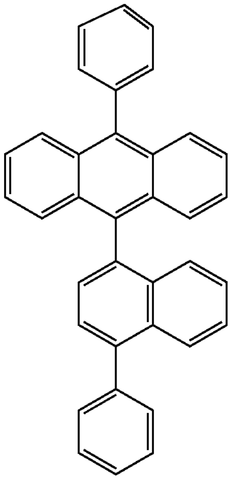
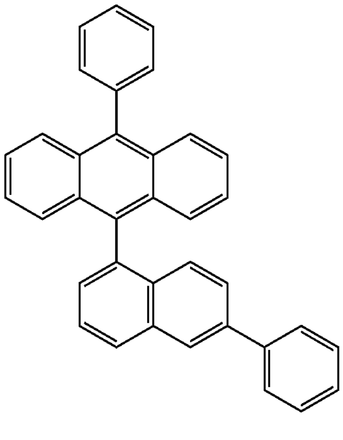

-continued
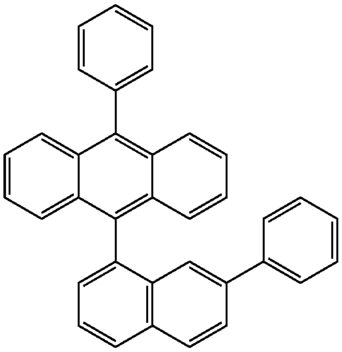
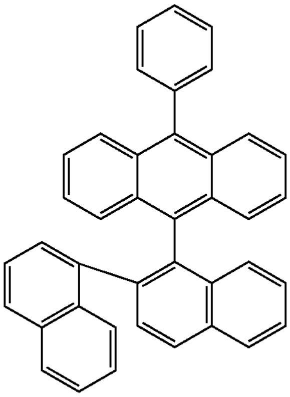
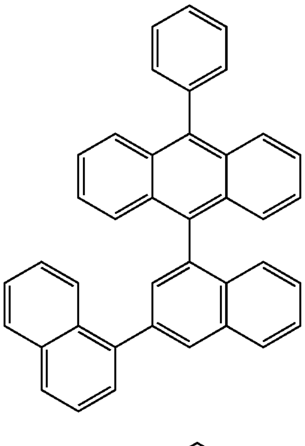
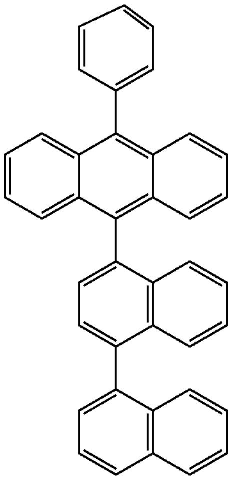
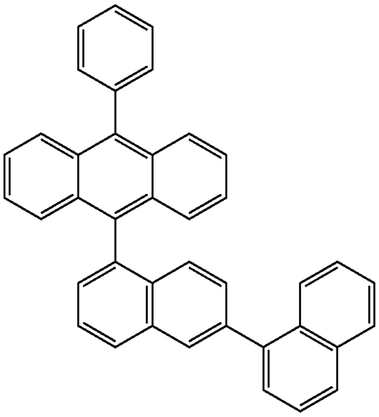
-continued
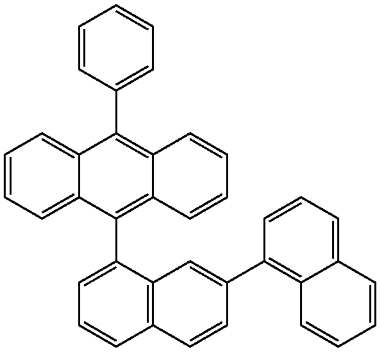
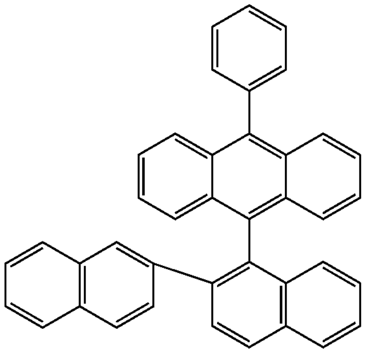
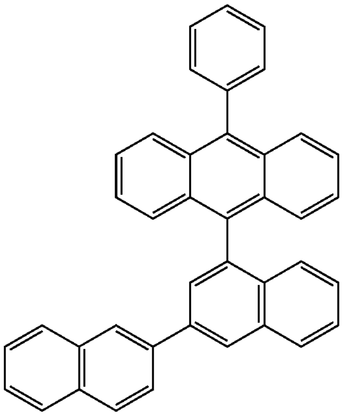
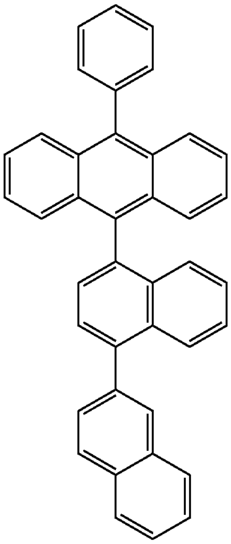

-continued
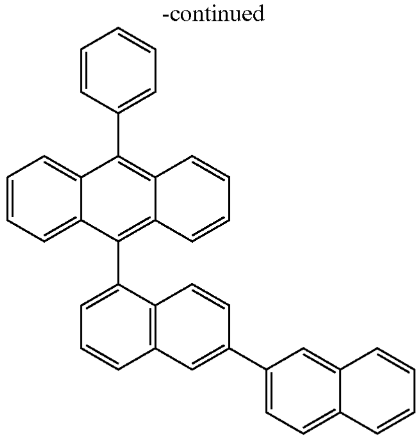
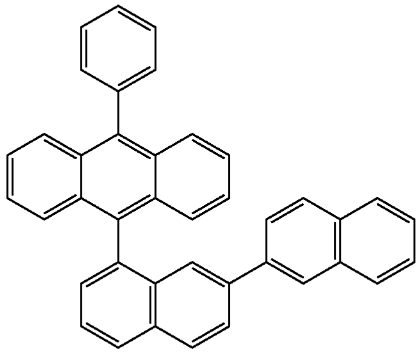
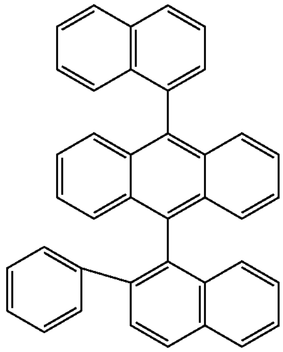
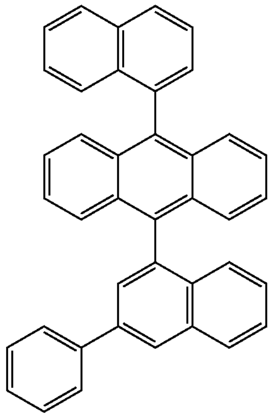
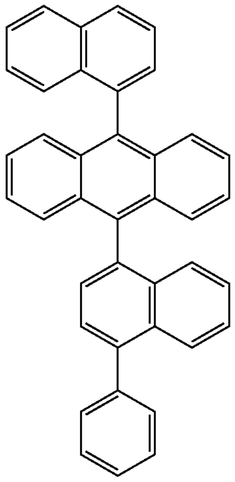
-continued
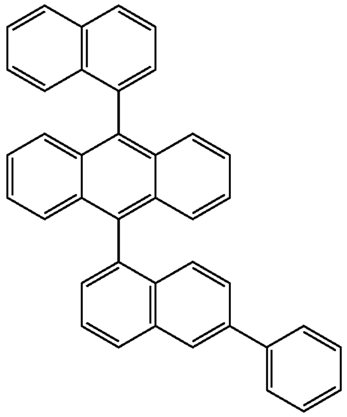
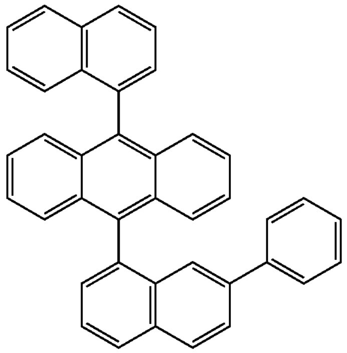
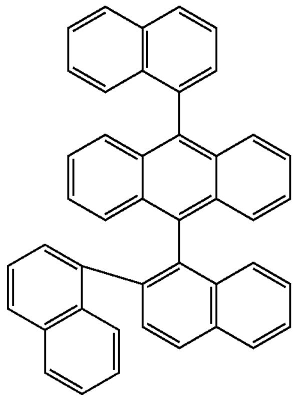
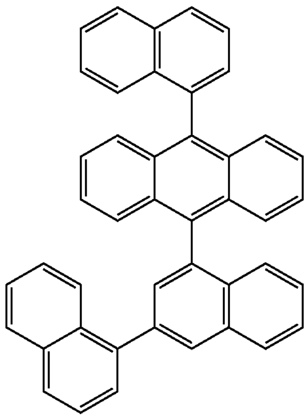

-continued
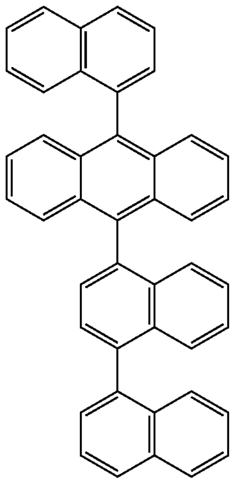
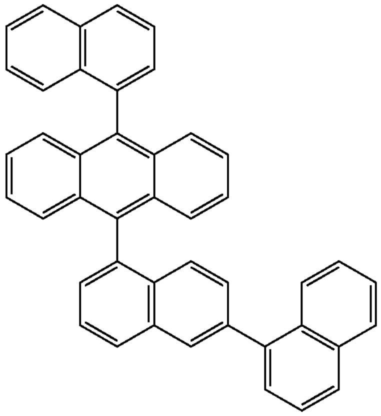
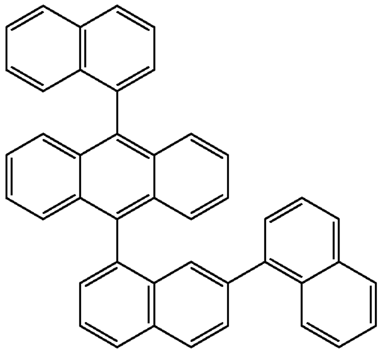
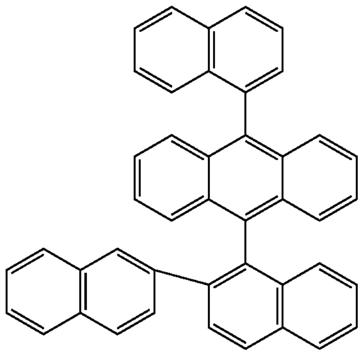
-continued
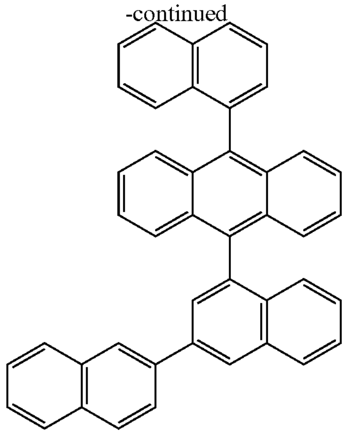
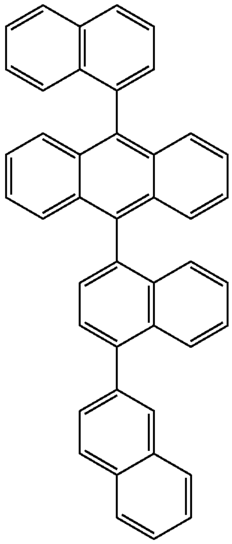
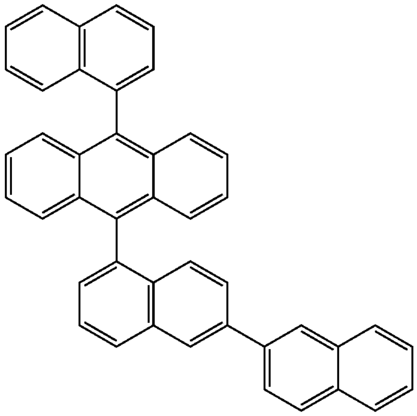
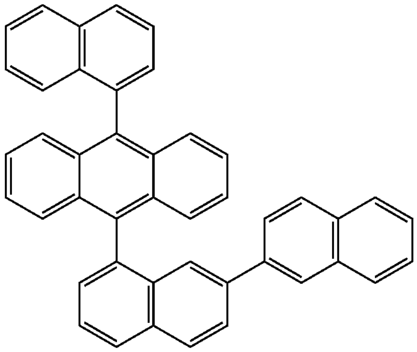

-continued
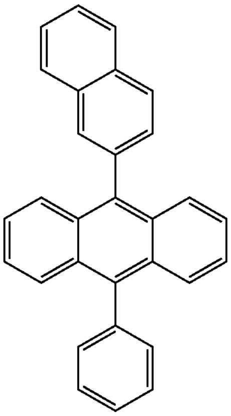
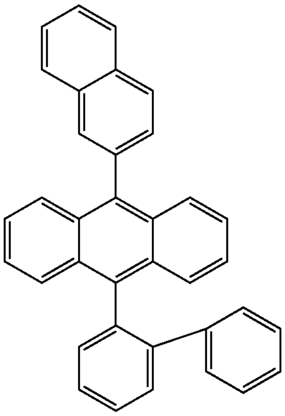
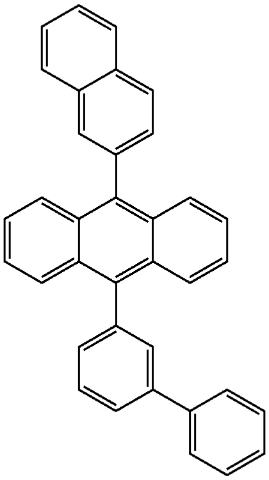
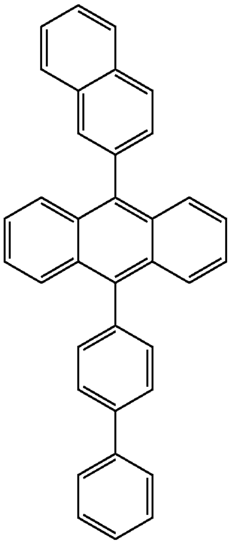
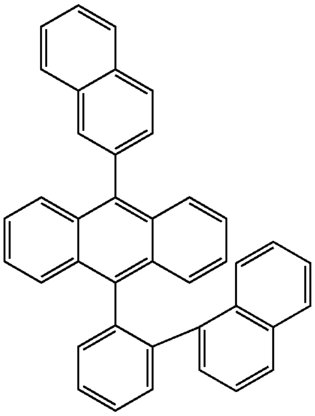
-continued
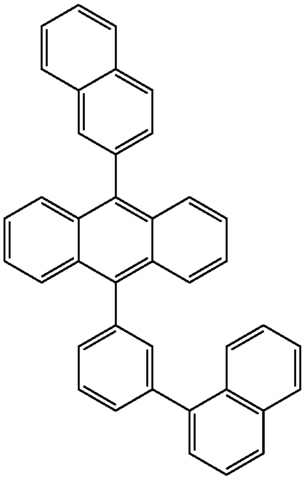
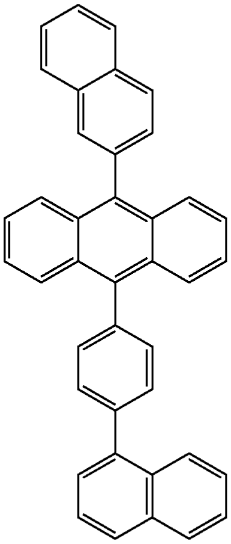
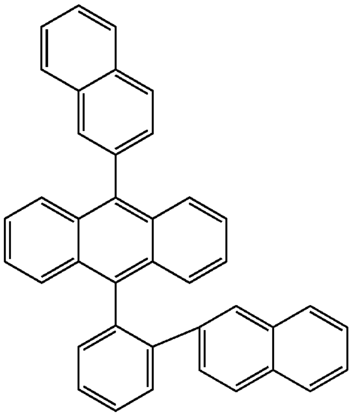
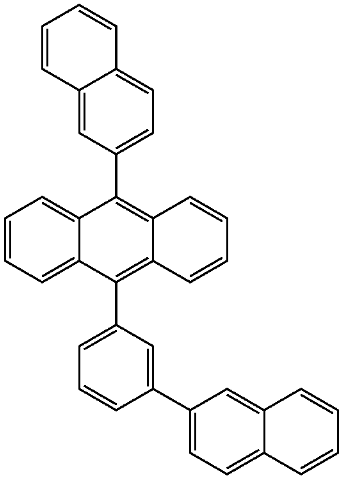

-continued
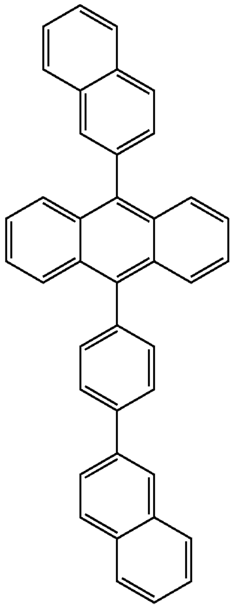
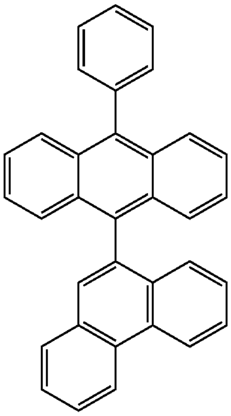
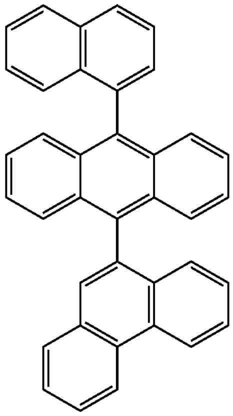
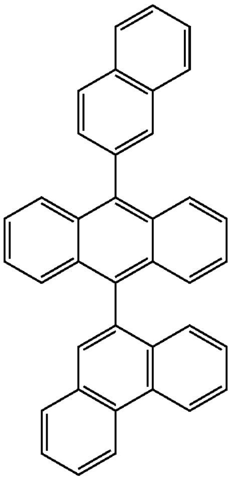
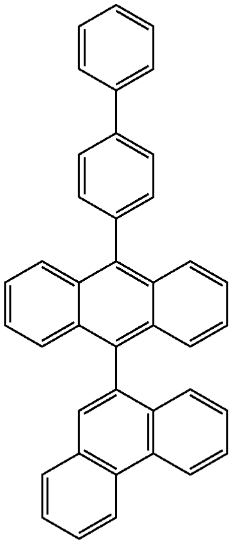
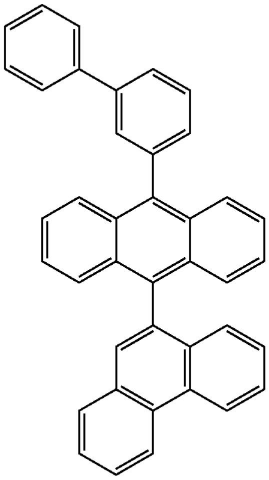
-continued
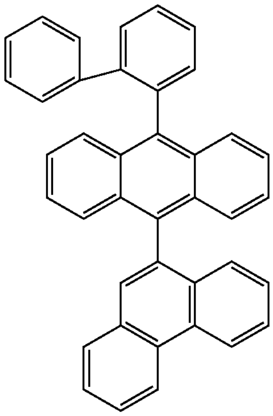
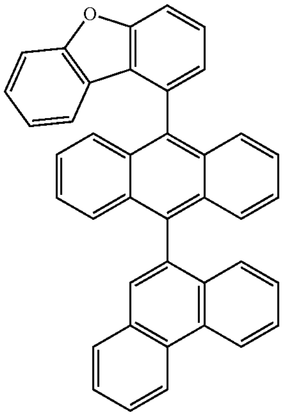
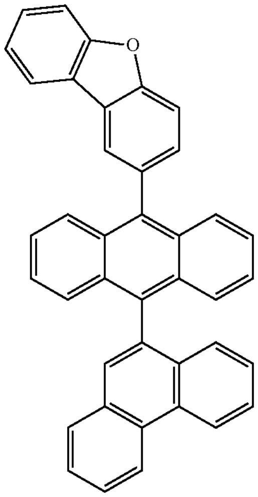
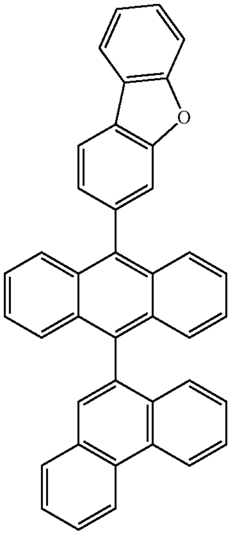
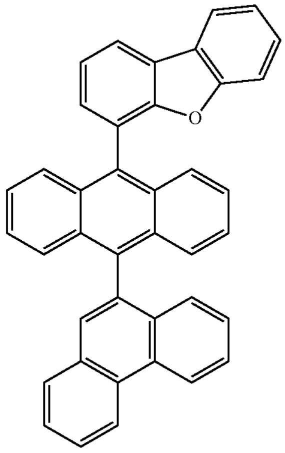
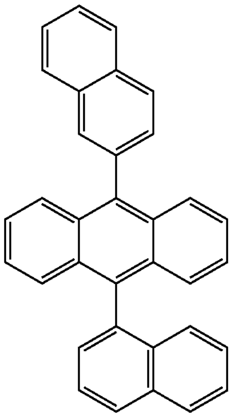

-continued
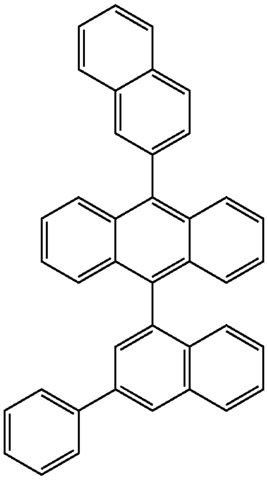
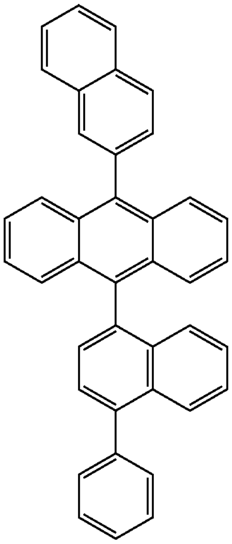
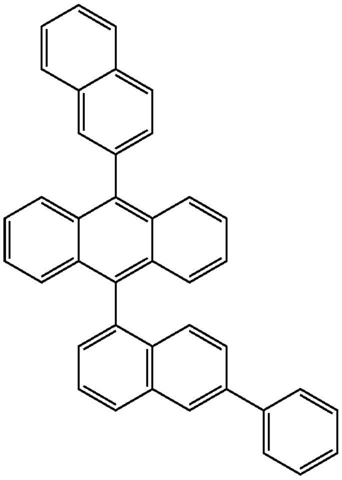
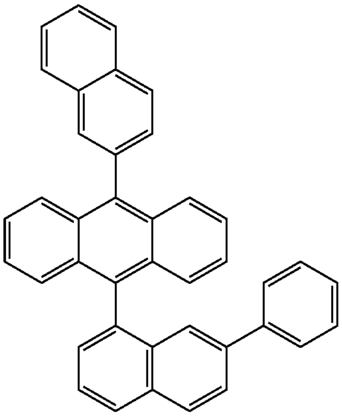
-continued
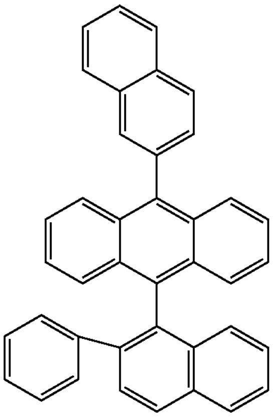
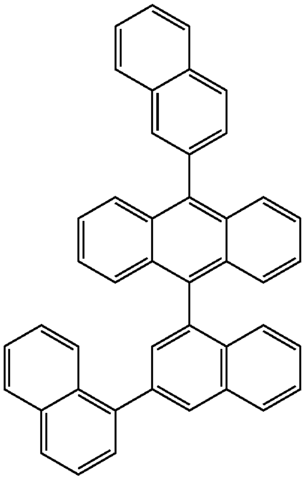
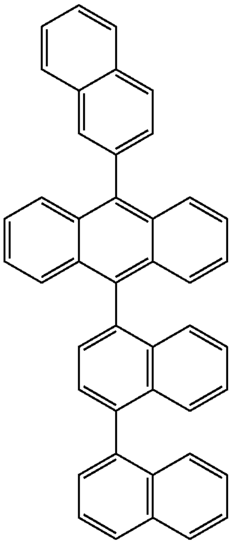
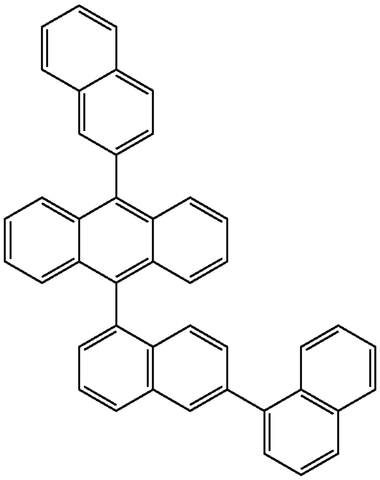

-continued
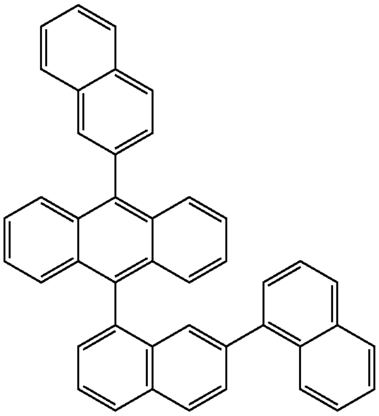
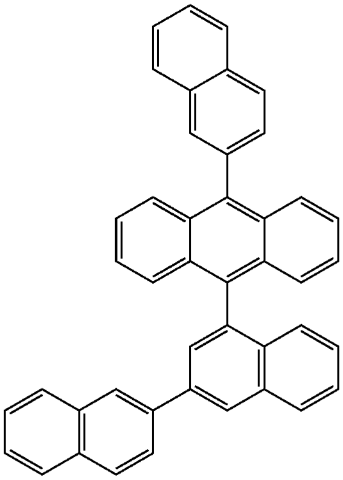
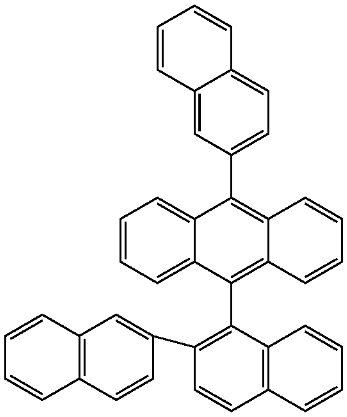
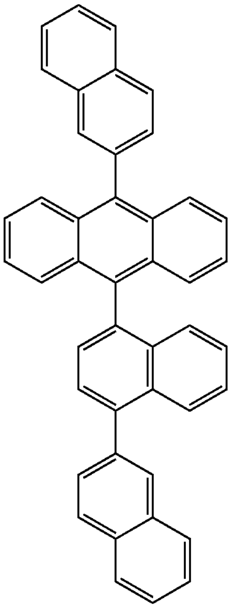
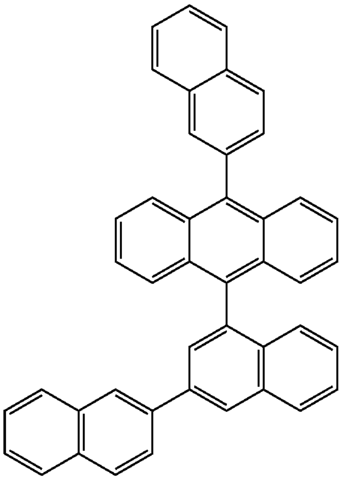
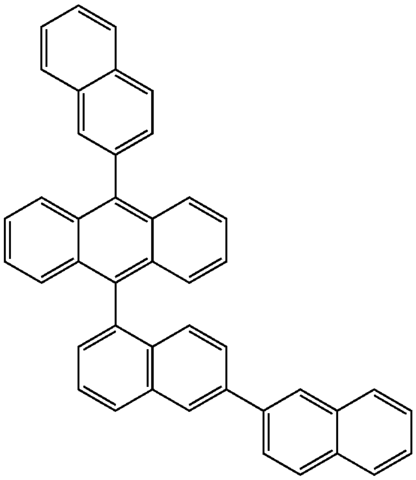
-continued -continued
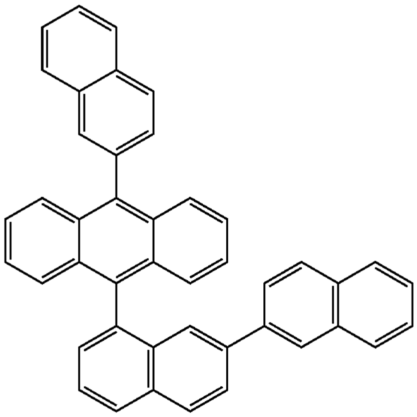
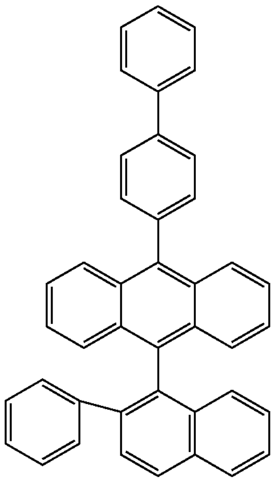
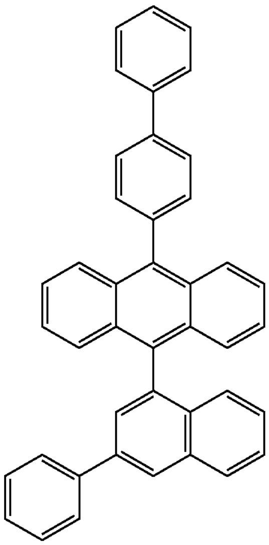
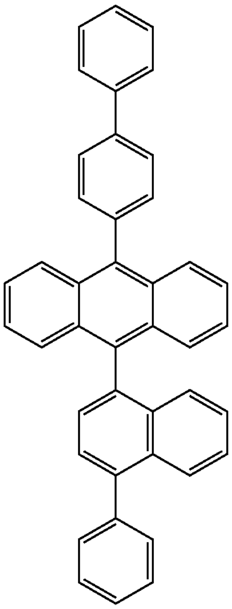
-continued
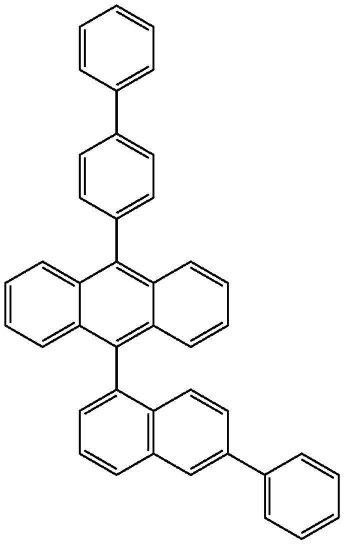
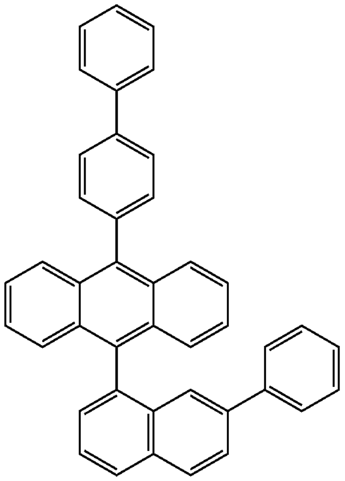
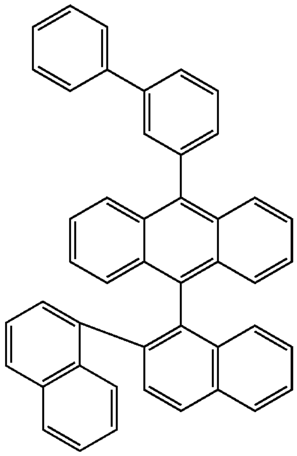

-continued
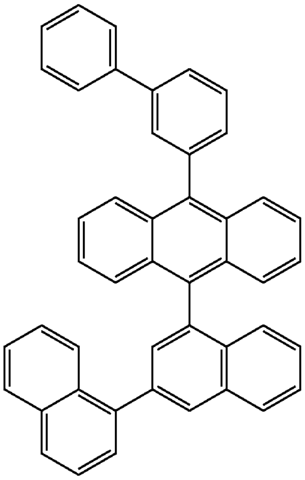
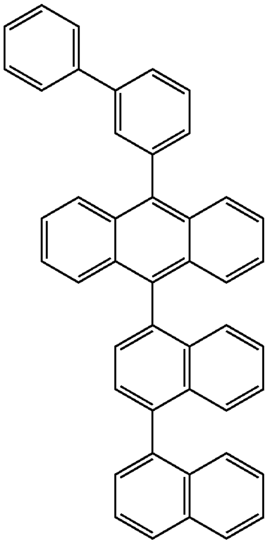
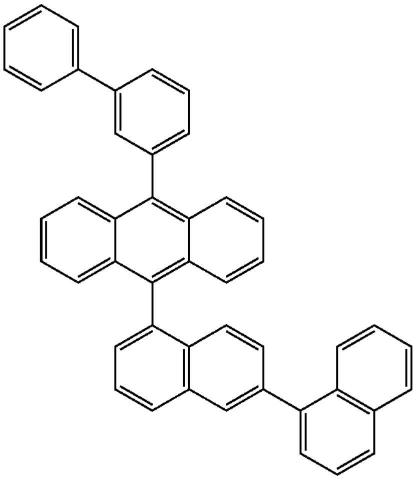
-continued
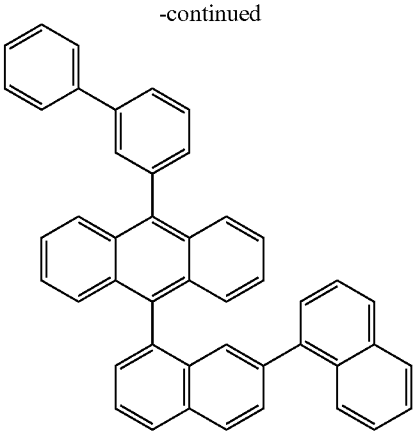
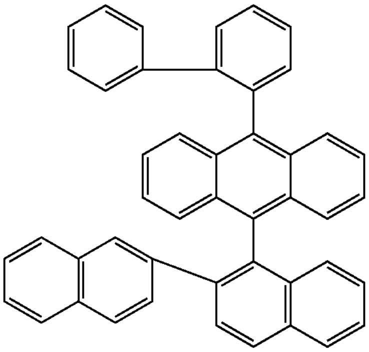
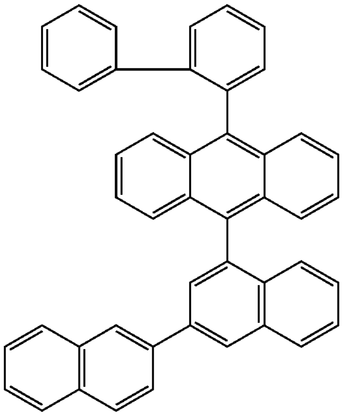
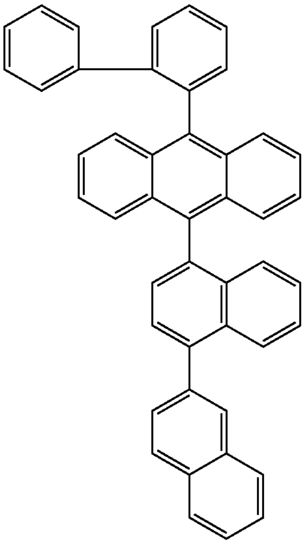

-continued
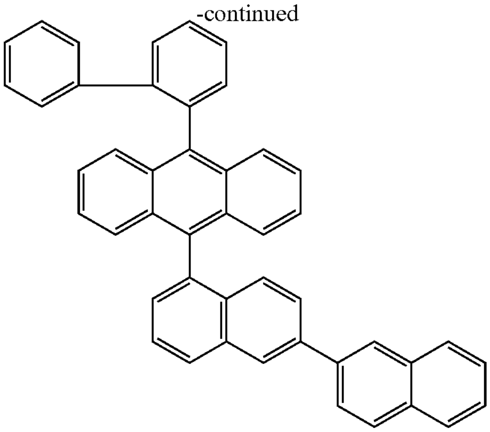
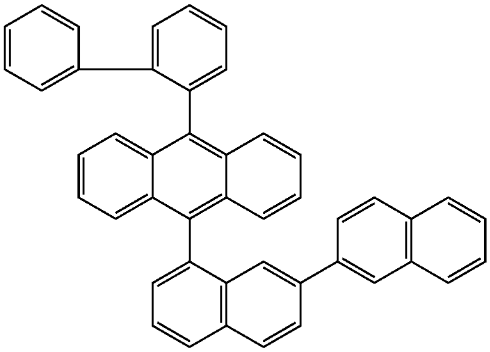
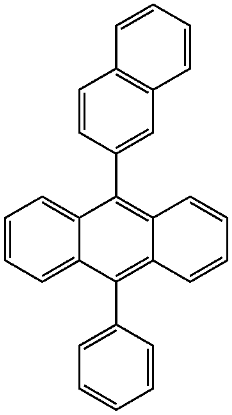
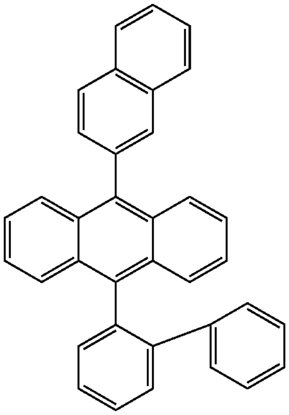
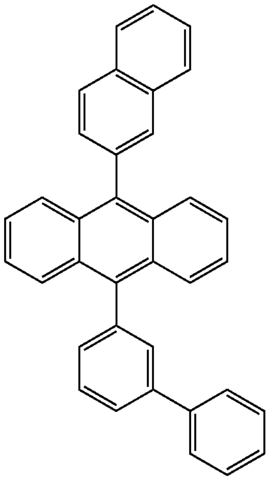
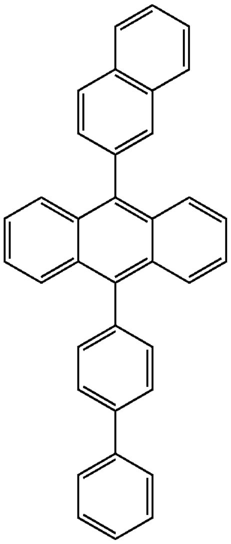
-continued
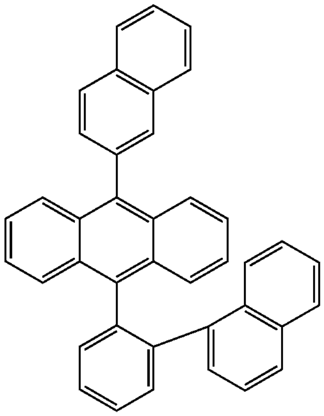
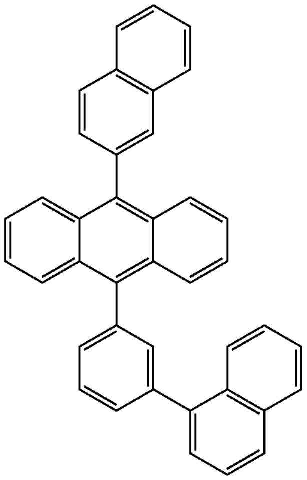
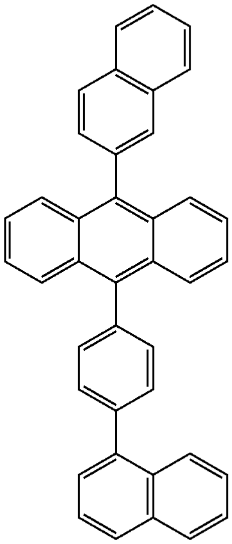
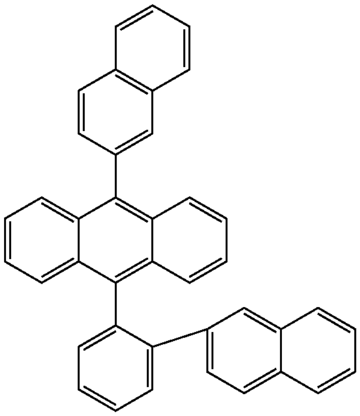

-continued
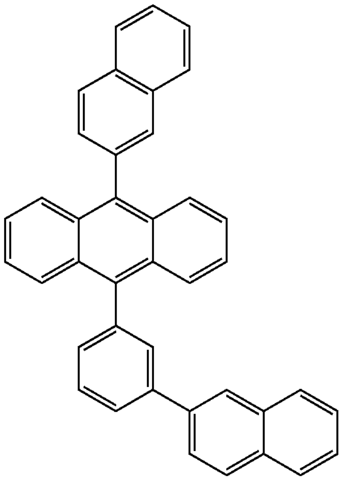
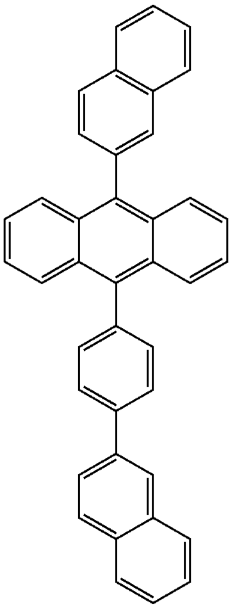
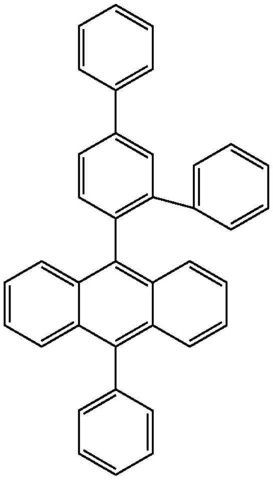
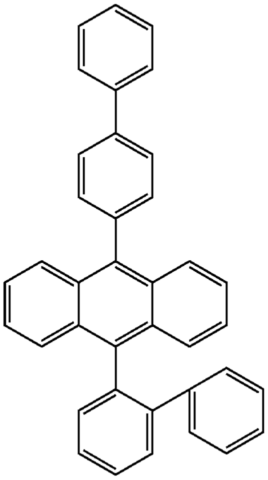
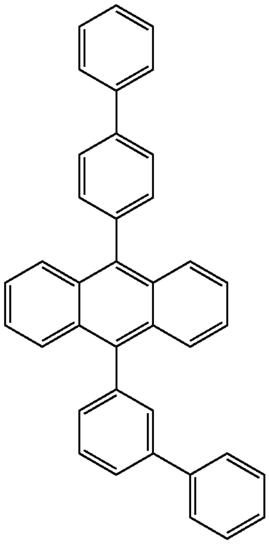
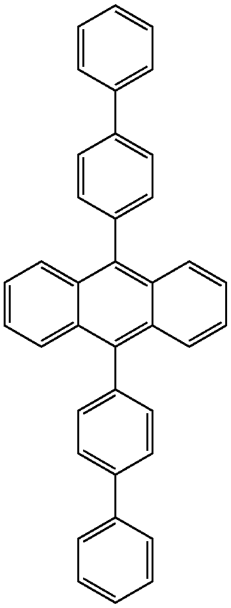
-continued
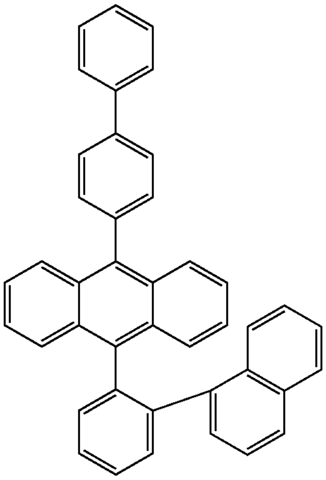
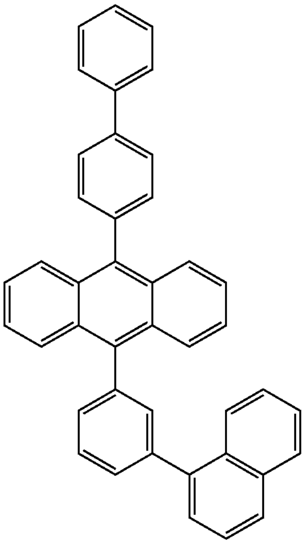
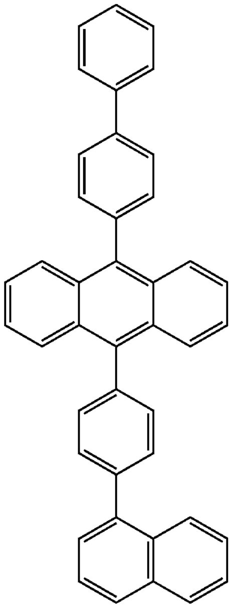
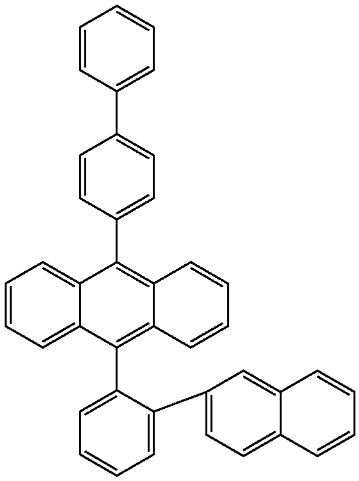

-continued
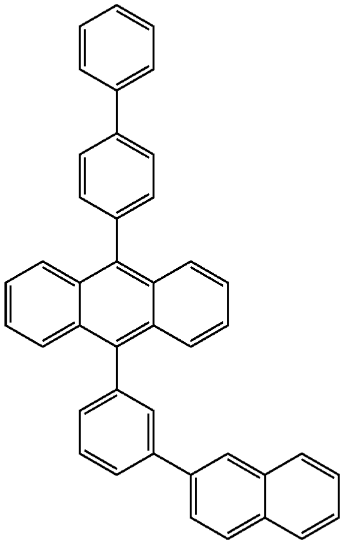
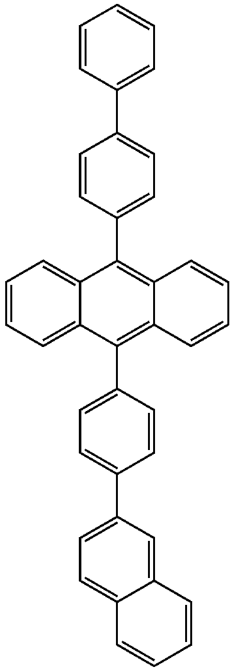
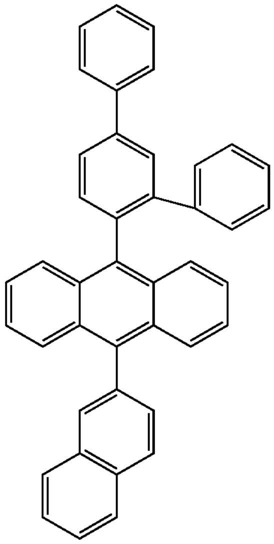
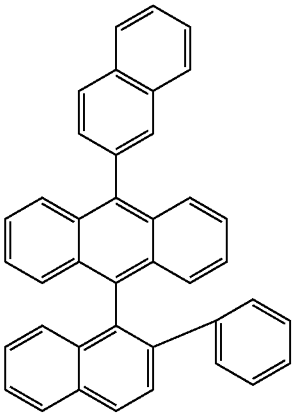
-continued
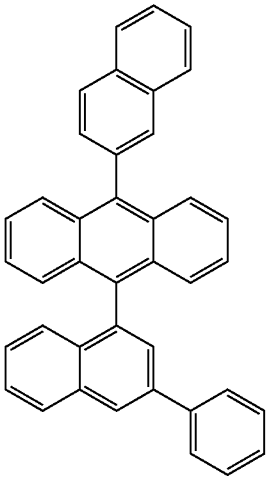
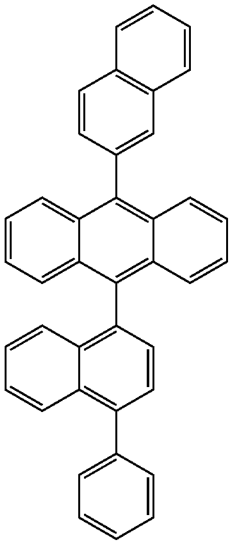
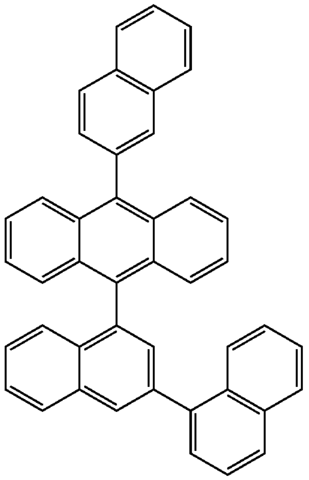
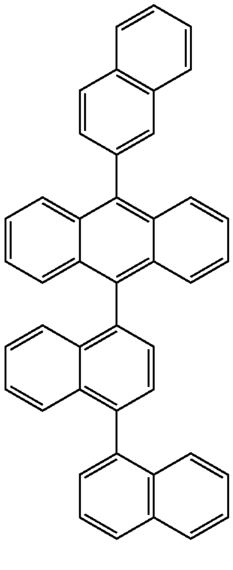
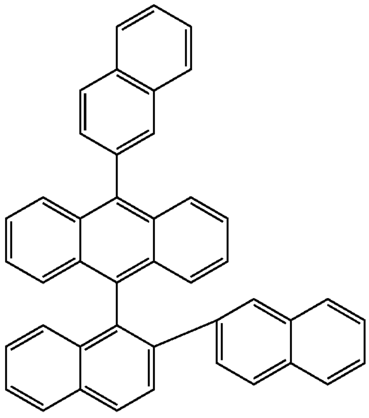

-continued
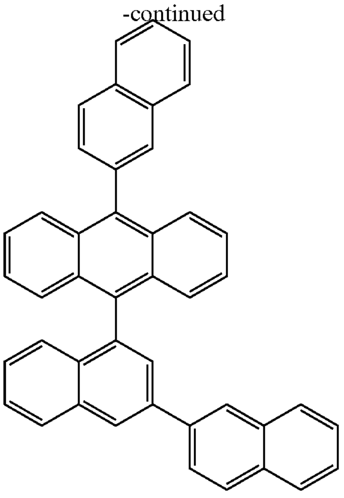
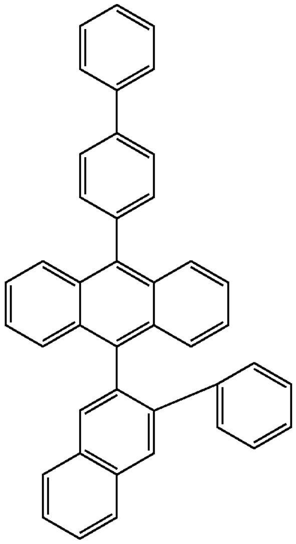
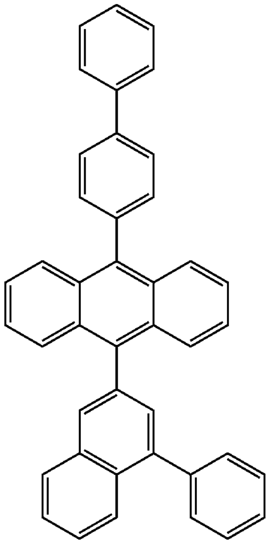
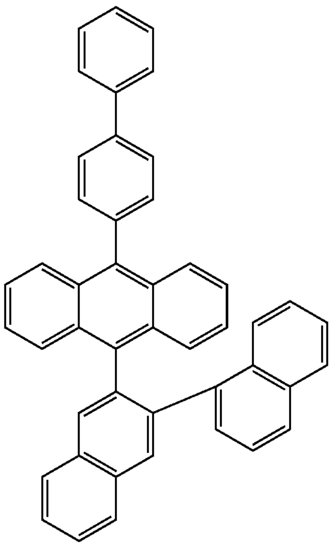
-continued
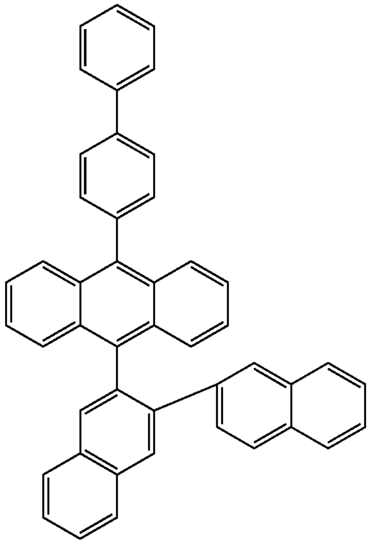
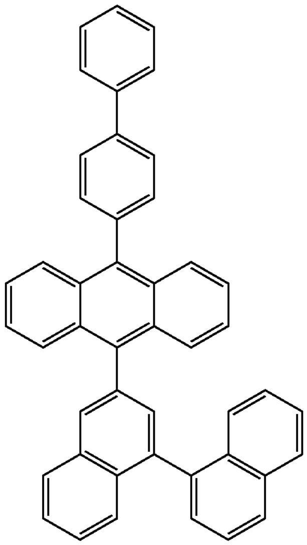
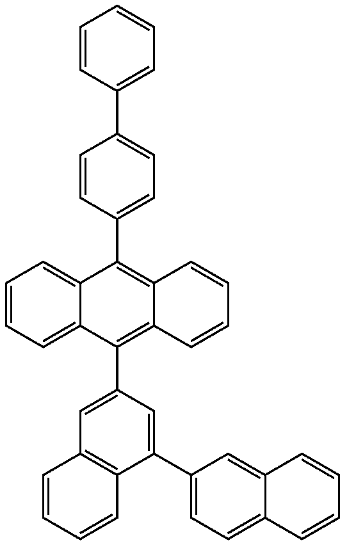

-continued
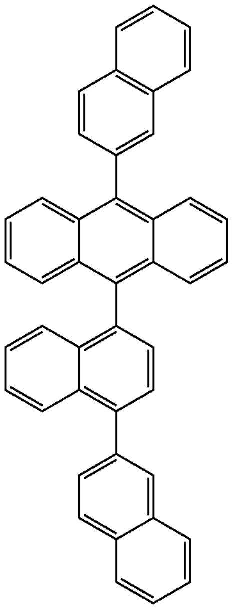
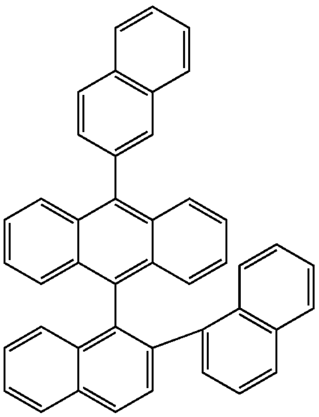
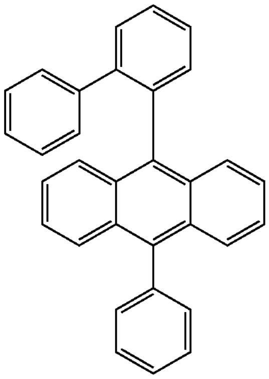
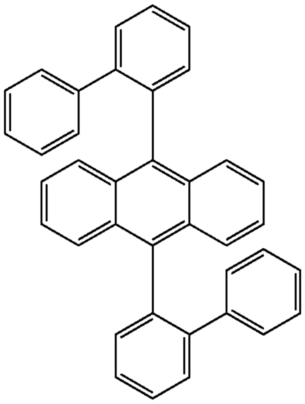
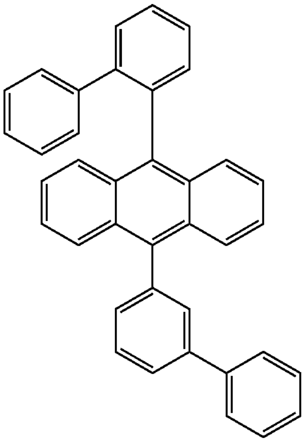
-continued
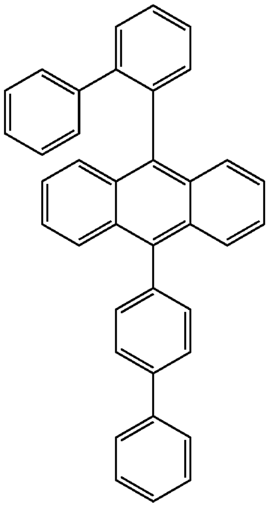
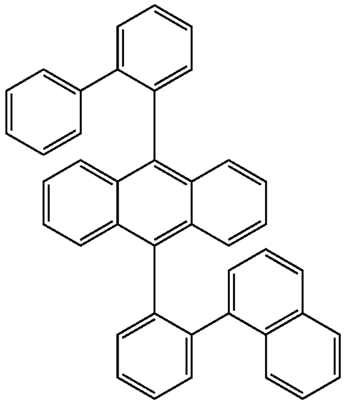
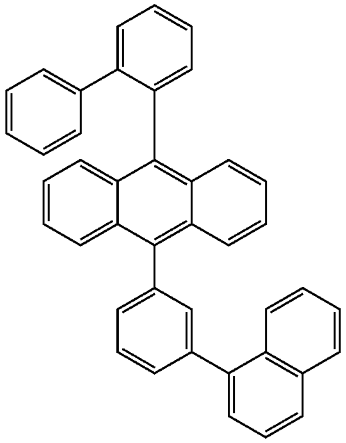

-continued
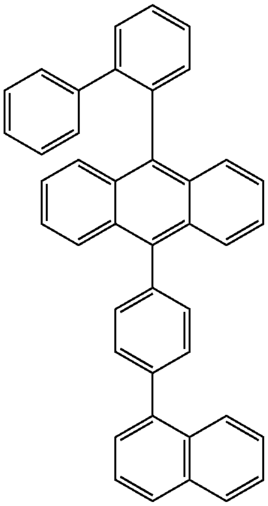
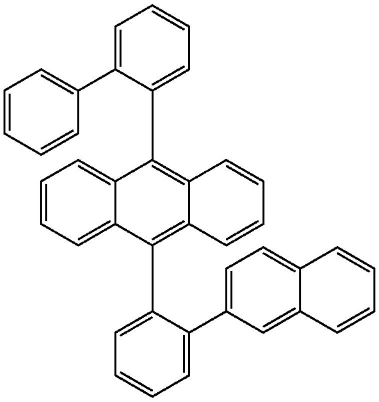
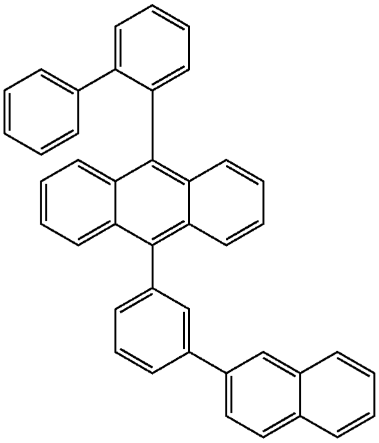
-continued
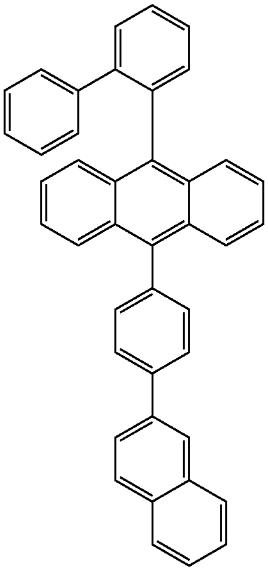
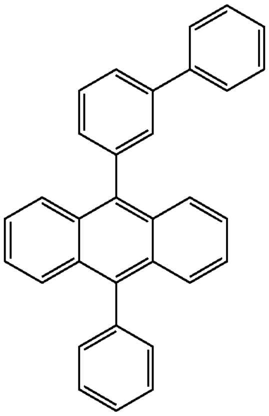
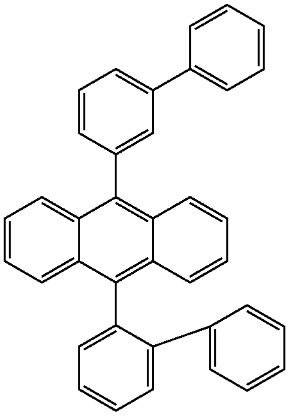
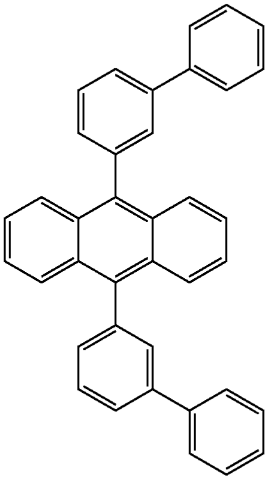
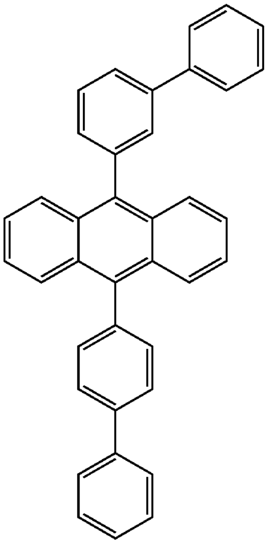

-continued
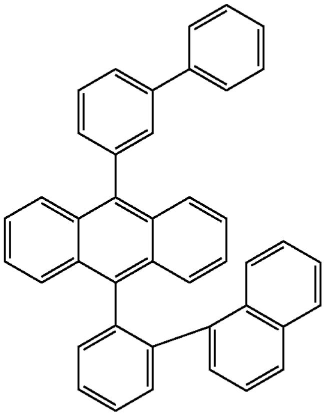
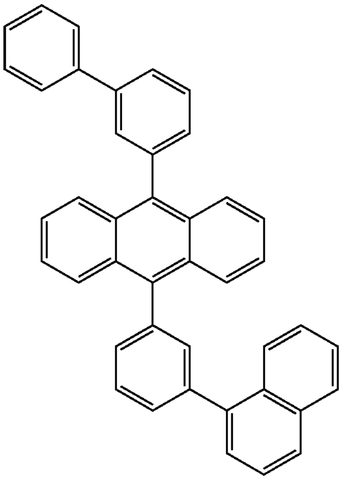
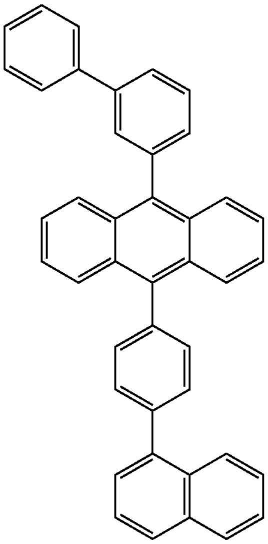
-continued
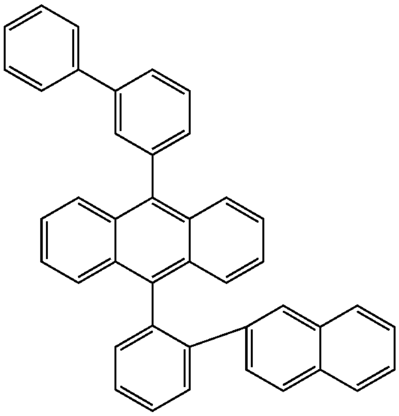
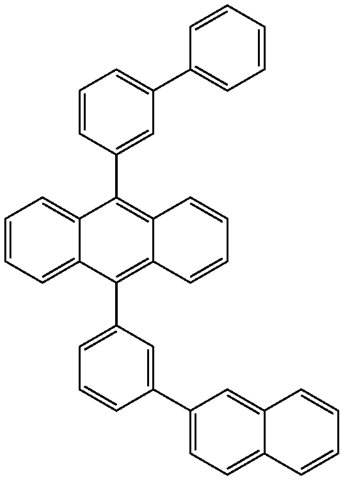
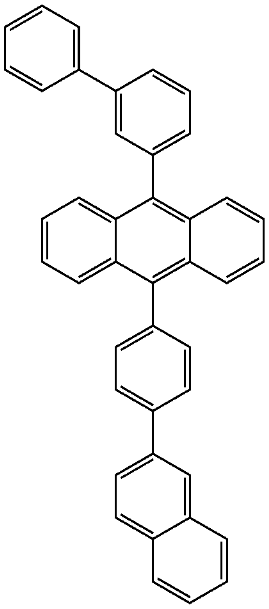
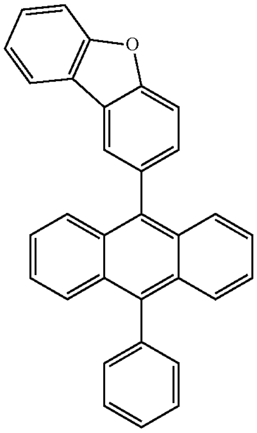

-continued
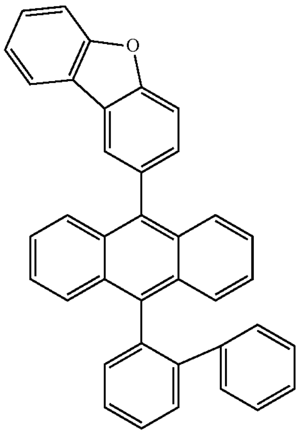
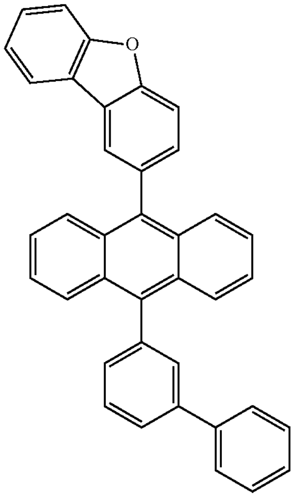
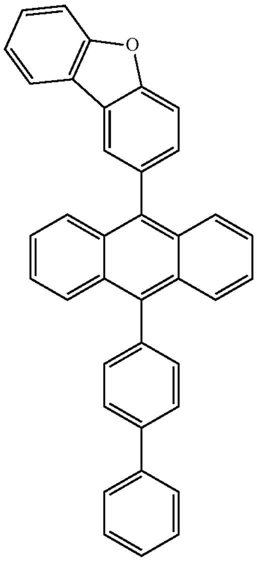
-continued
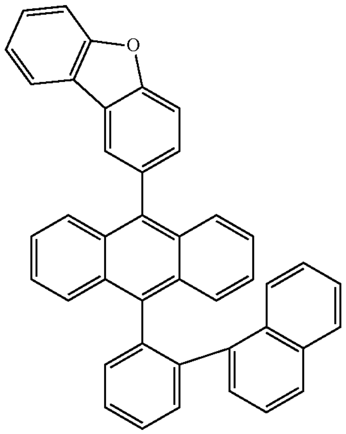
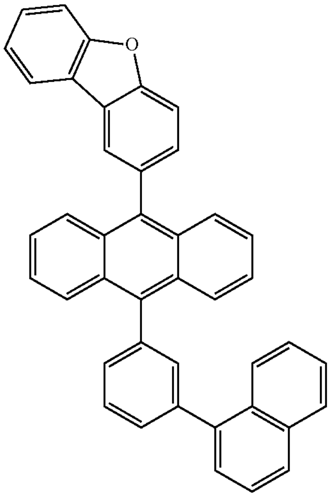
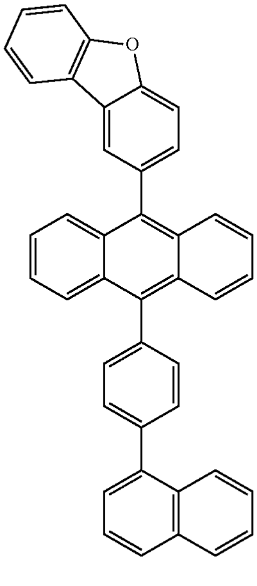

-continued
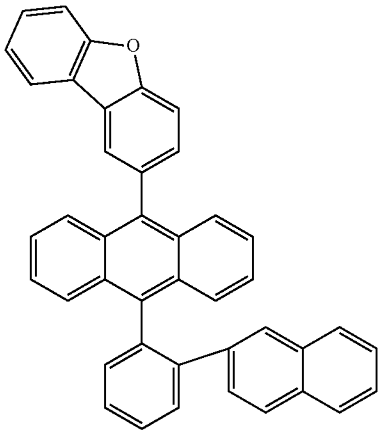
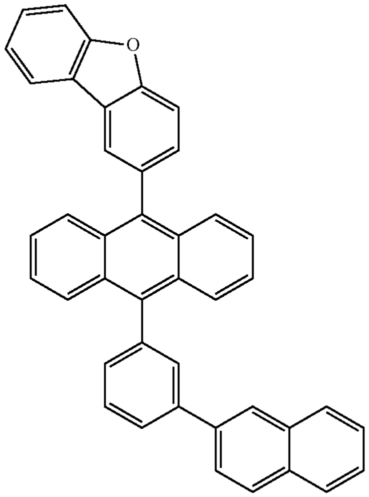
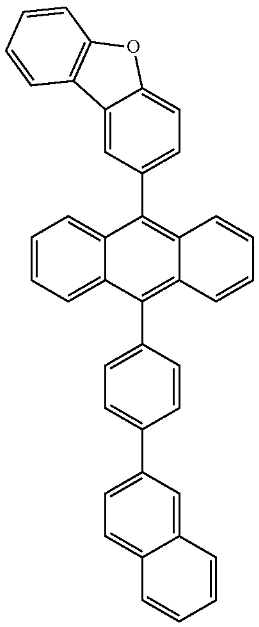
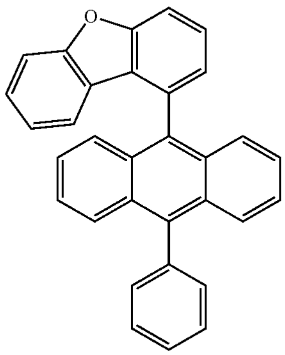
-continued
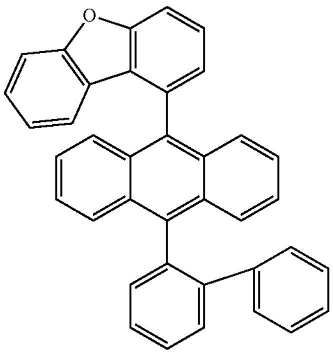
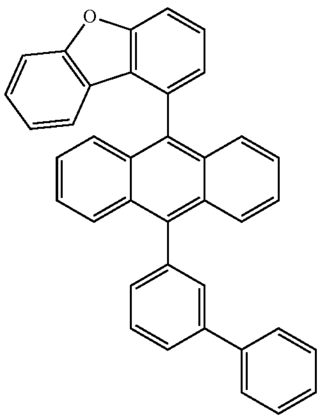
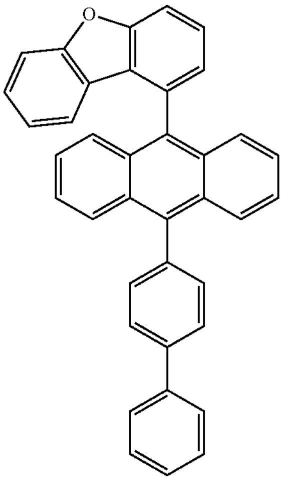
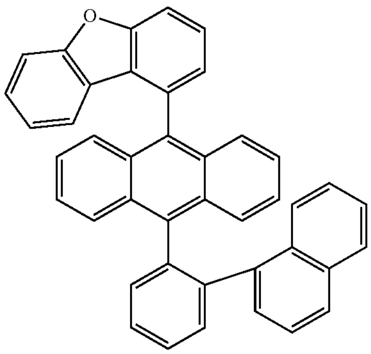

-continued
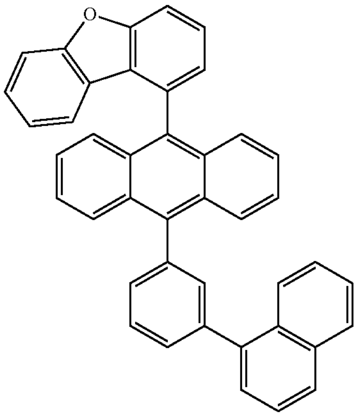
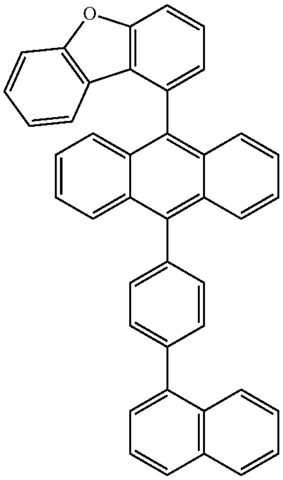
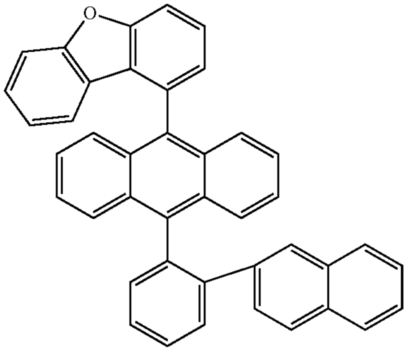
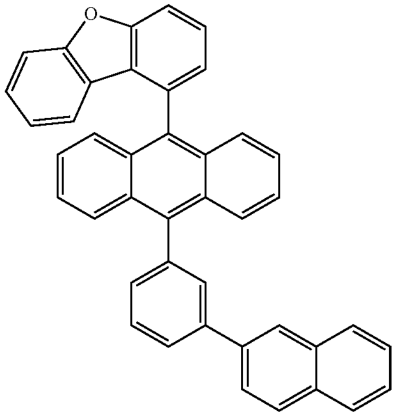
-continued
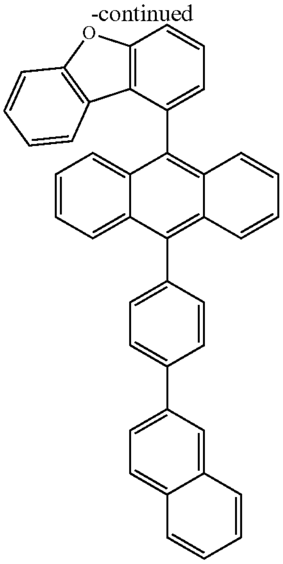
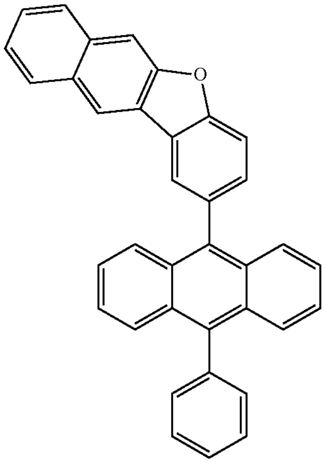
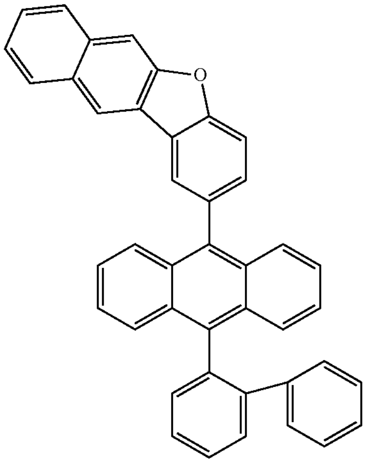

-continued
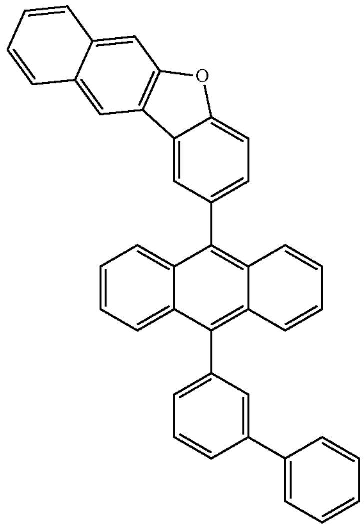
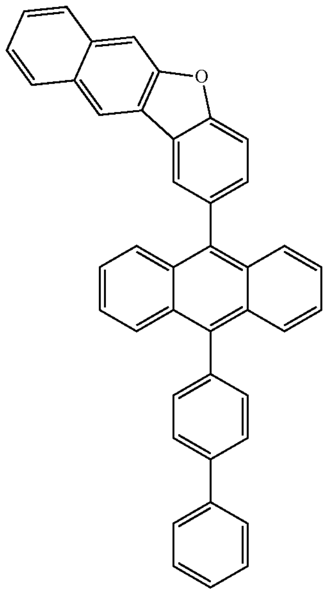
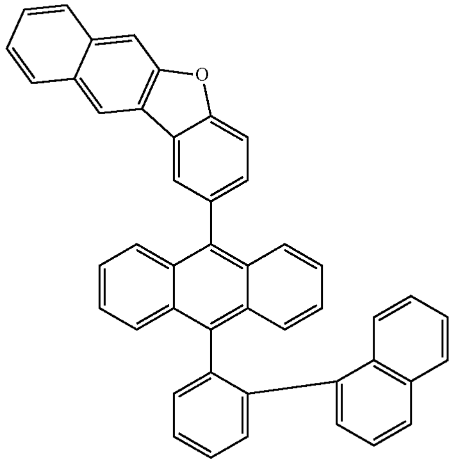
-continued
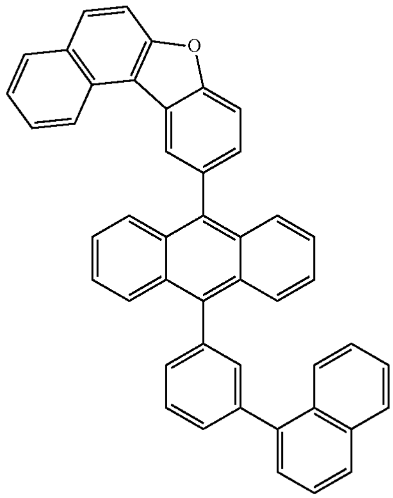
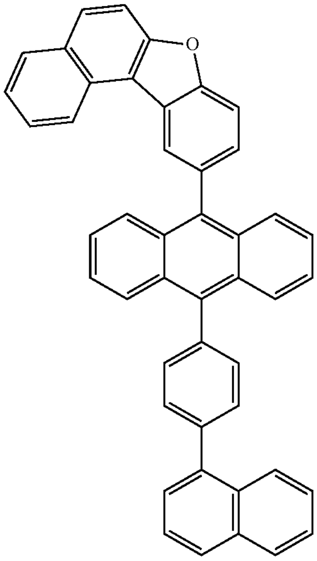
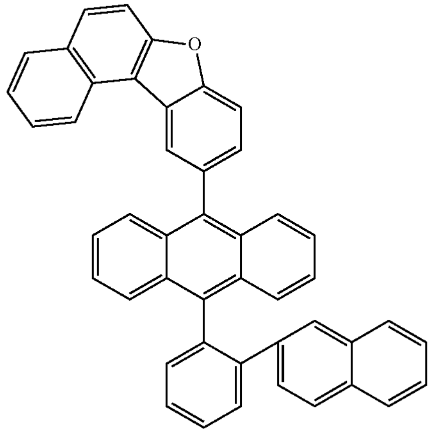

-continued
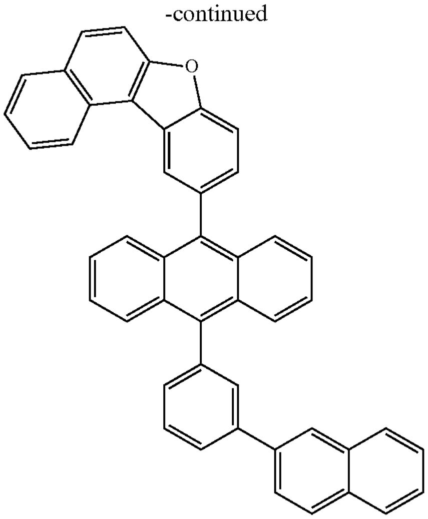
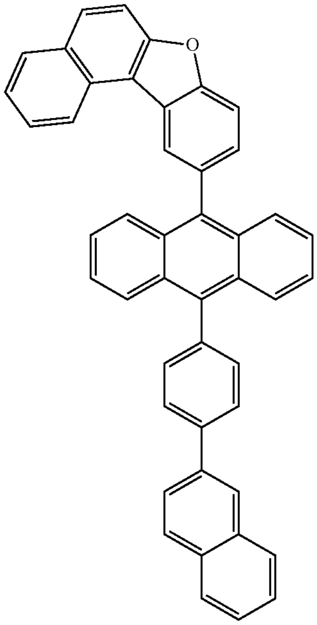
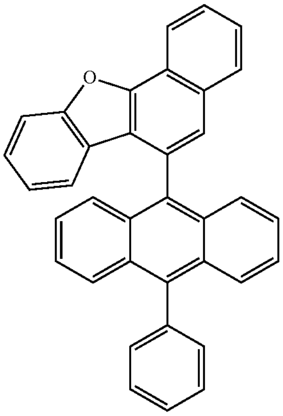
-continued
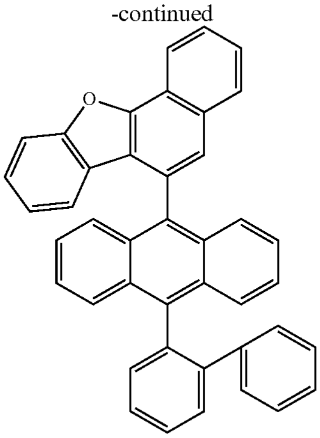
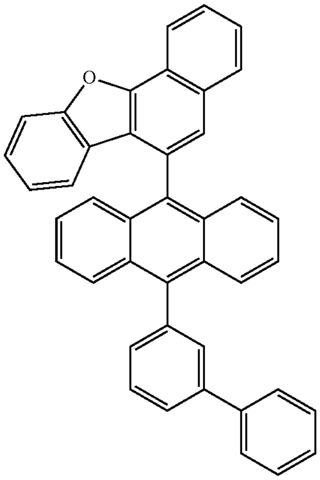
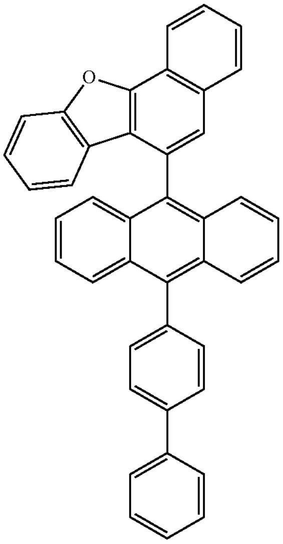

-continued
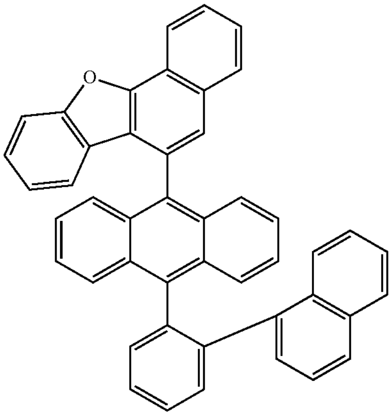
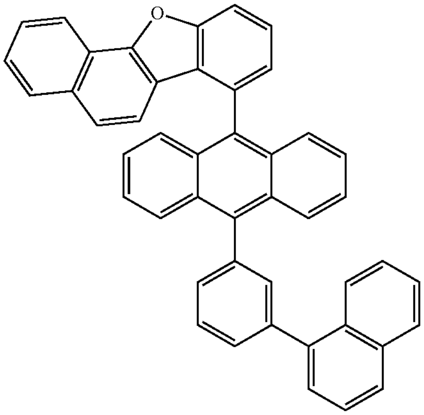
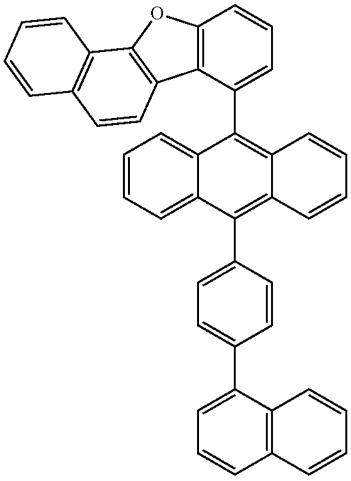
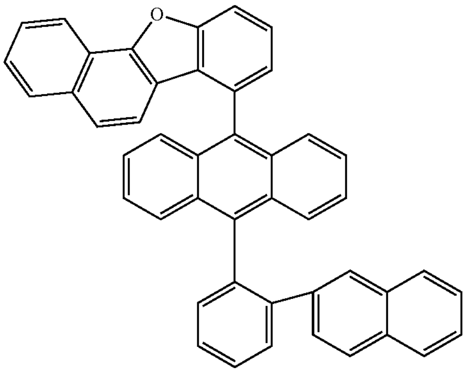
-continued
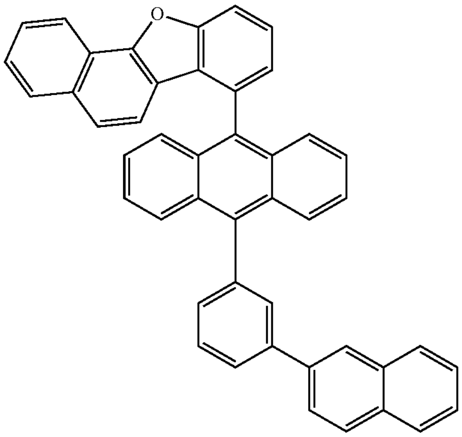
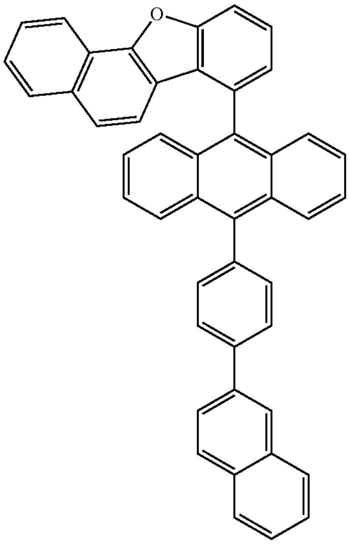
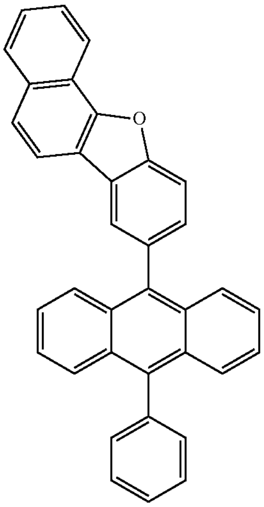

-continued
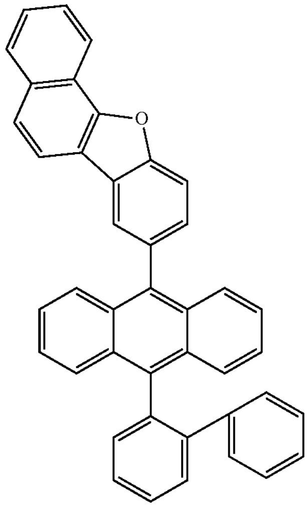
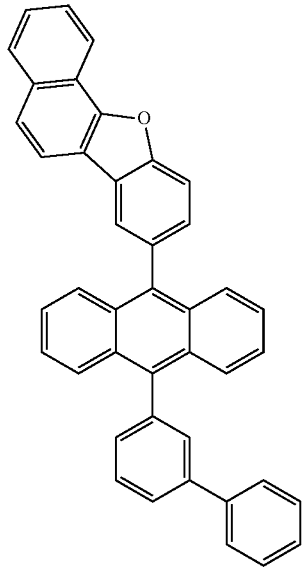
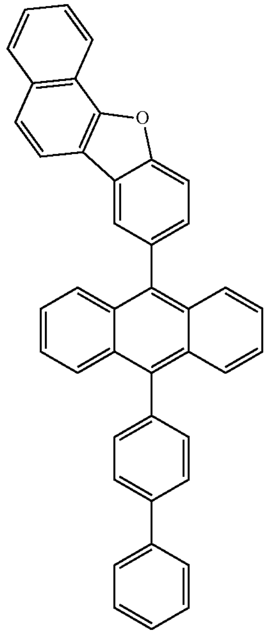
-continued
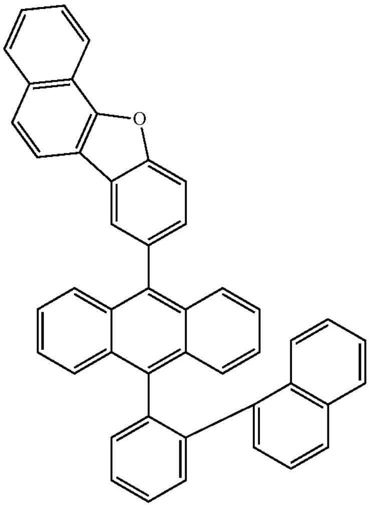
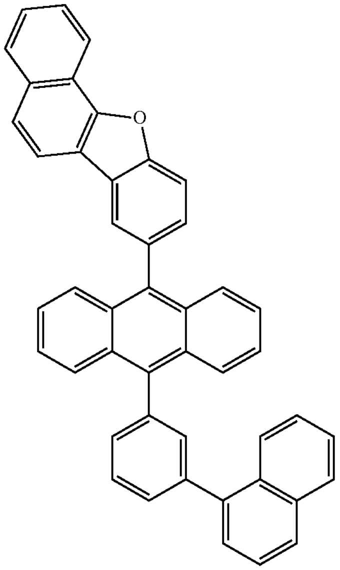
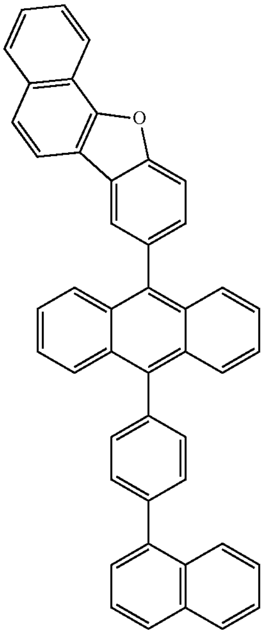

-continued
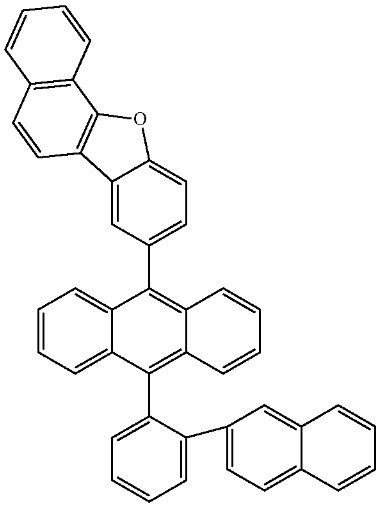
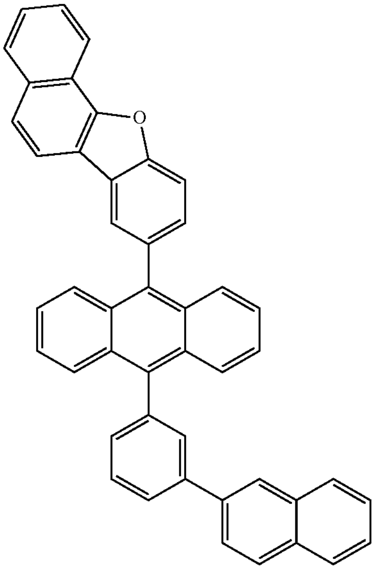
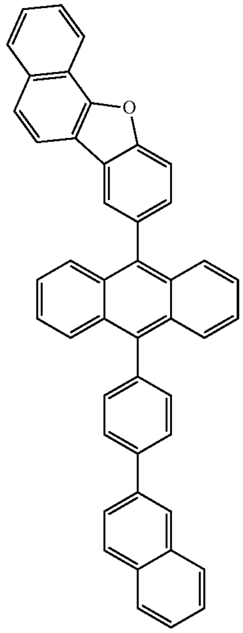
-continued
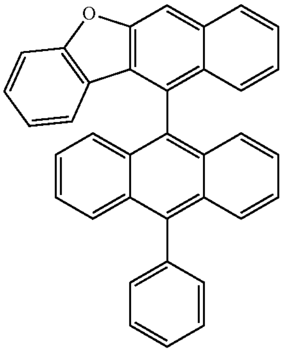
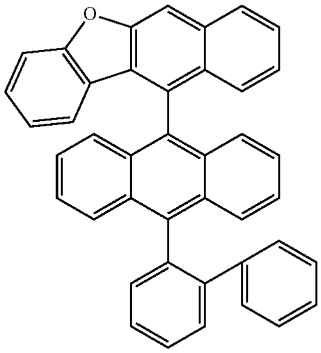
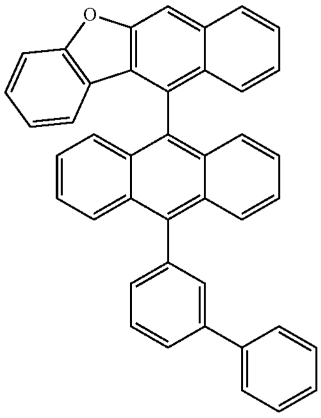
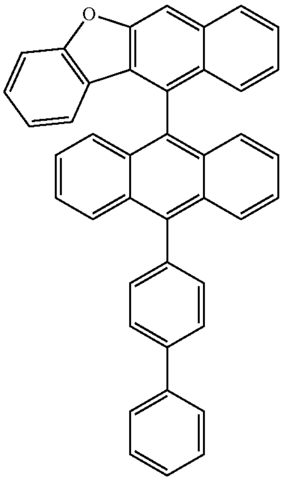

-continued
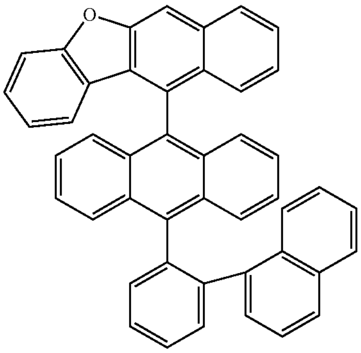
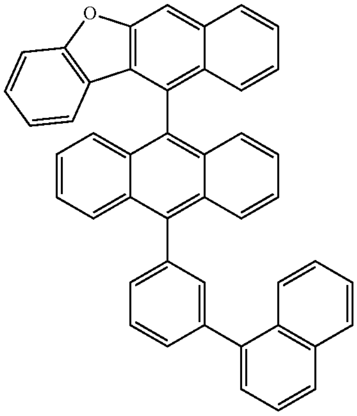
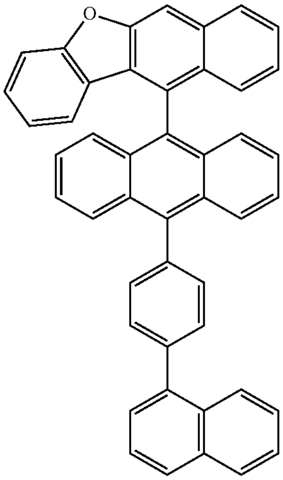
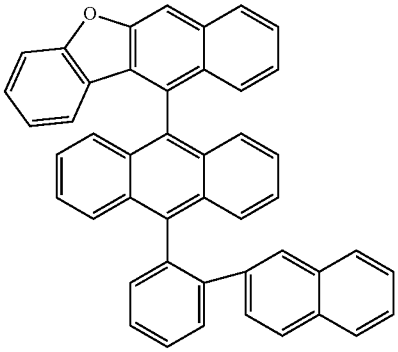
-continued
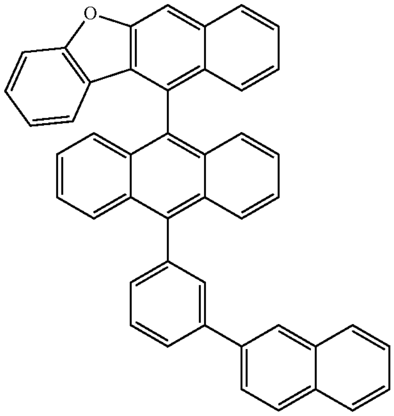
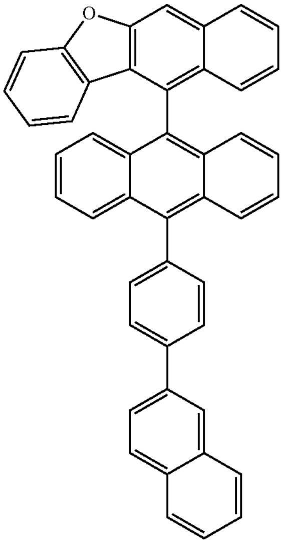
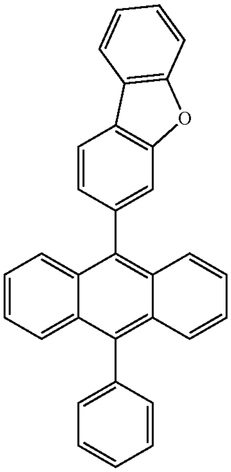

-continued
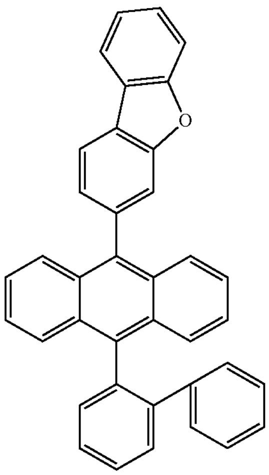
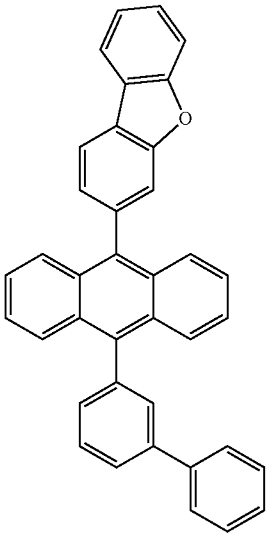
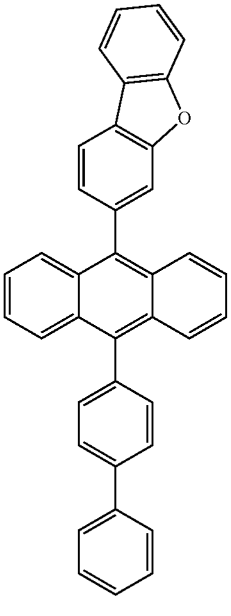
-continued
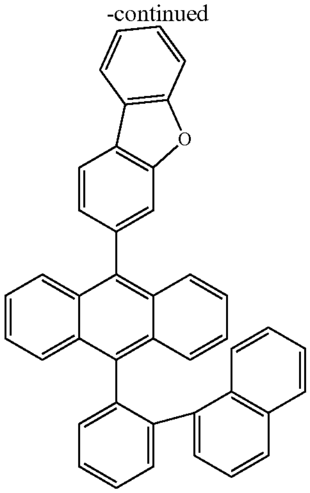
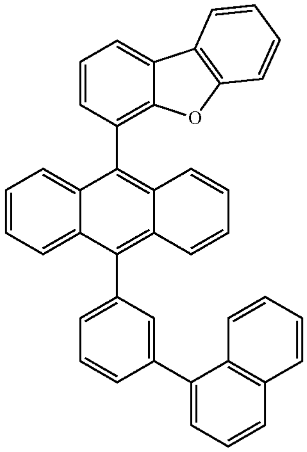
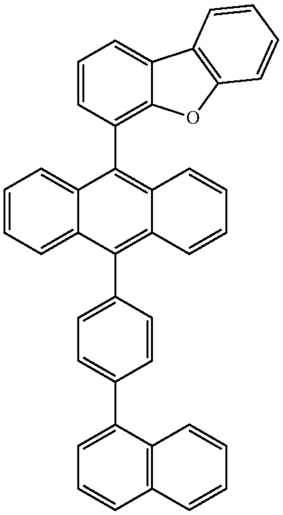

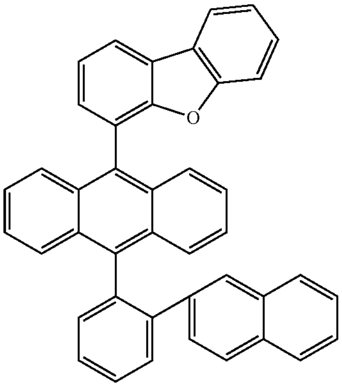
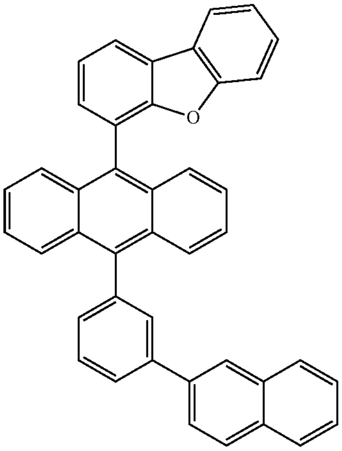
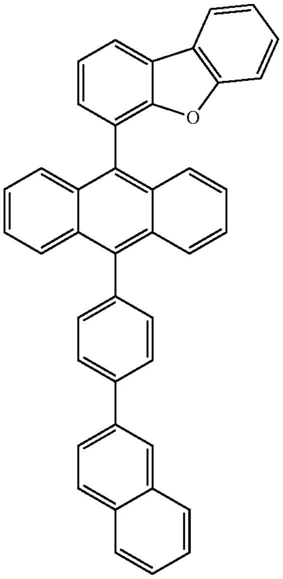
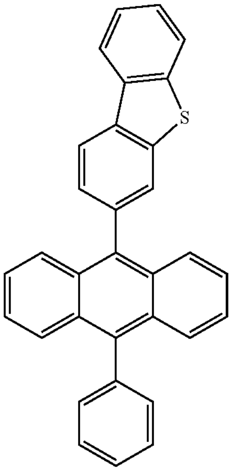
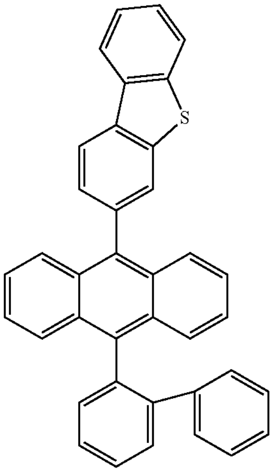
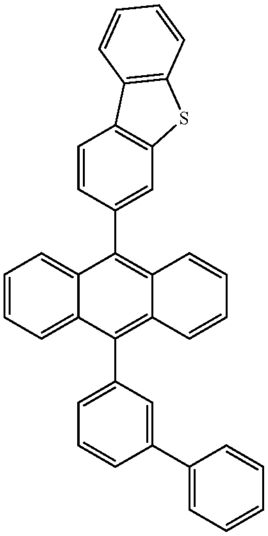
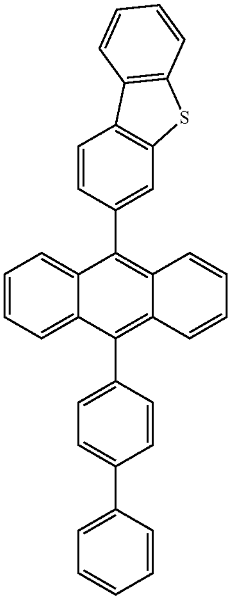

-continued
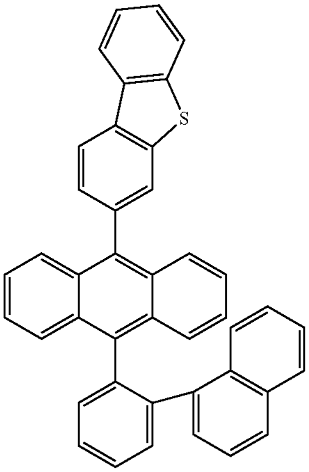
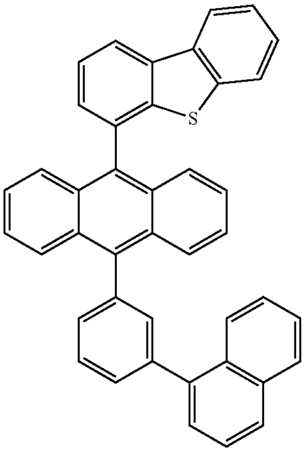
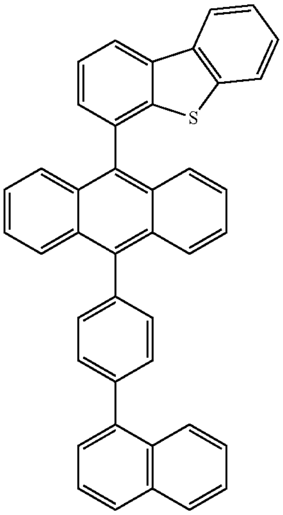
-continued
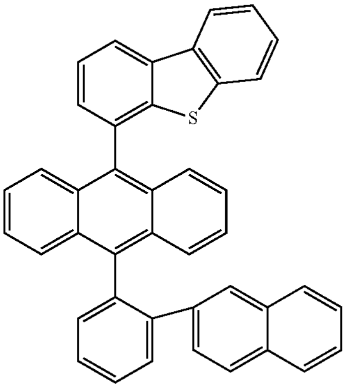
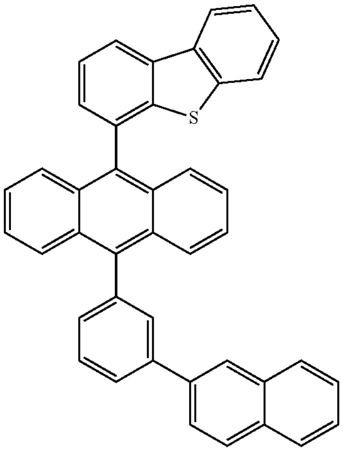
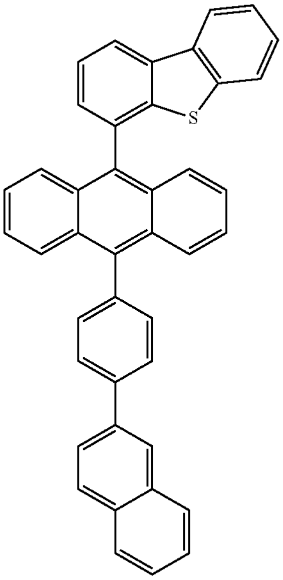

-continued
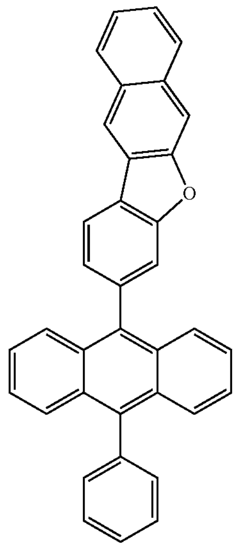
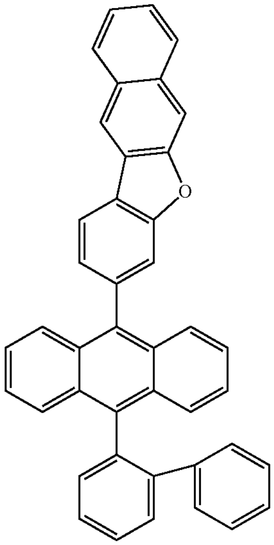
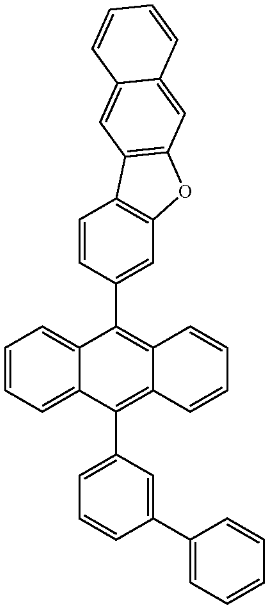
-continued
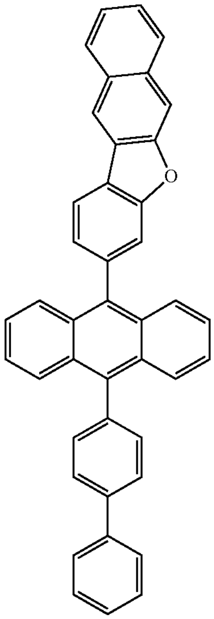
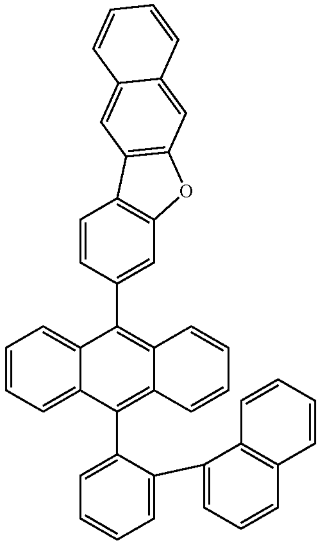
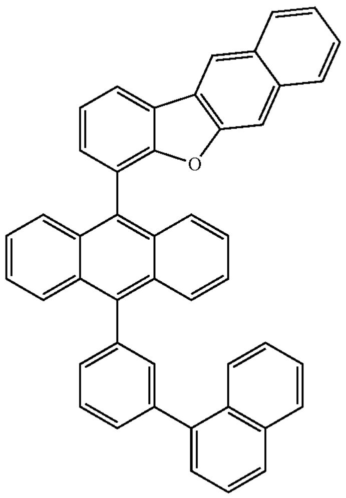

-continued
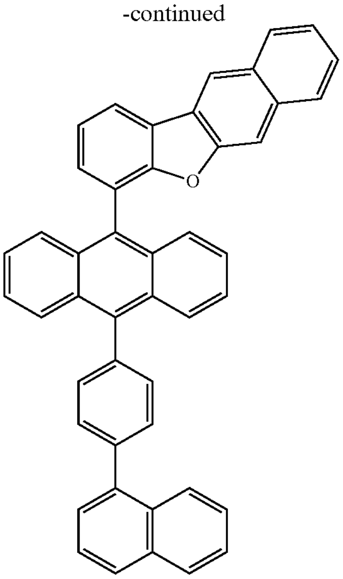
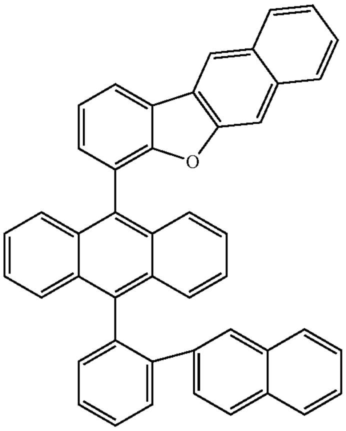
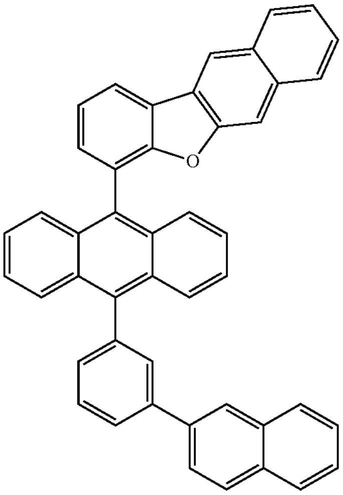
-continued
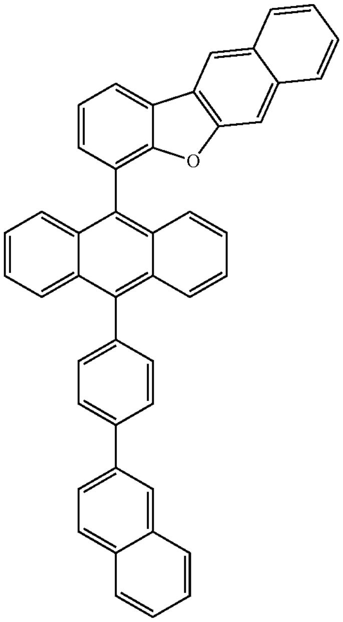
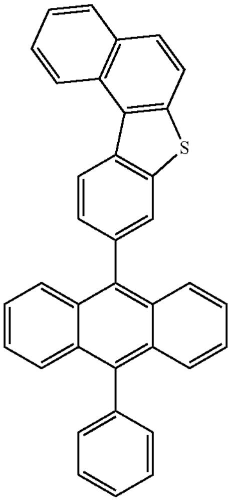
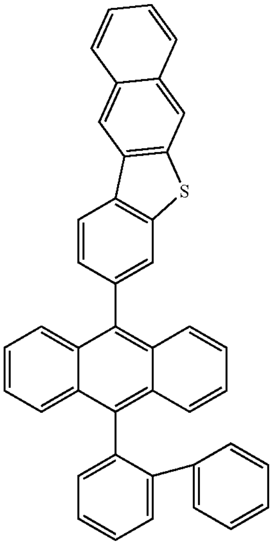

-continued
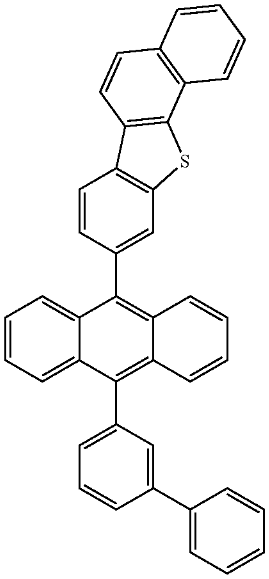
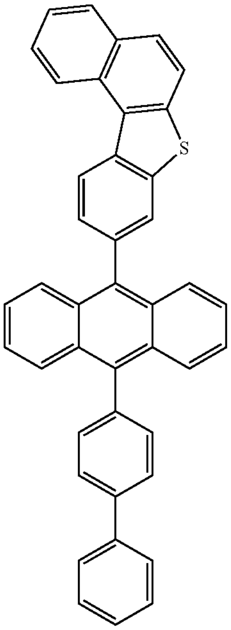
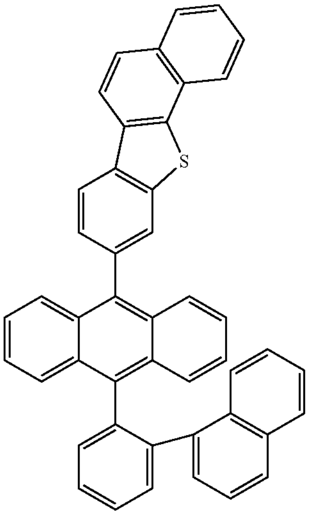
-continued
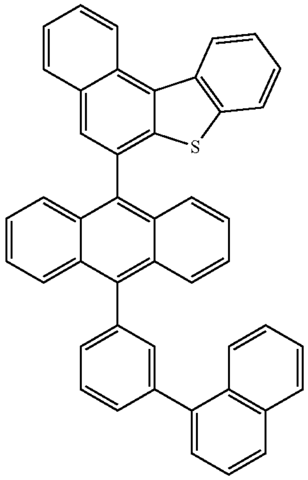
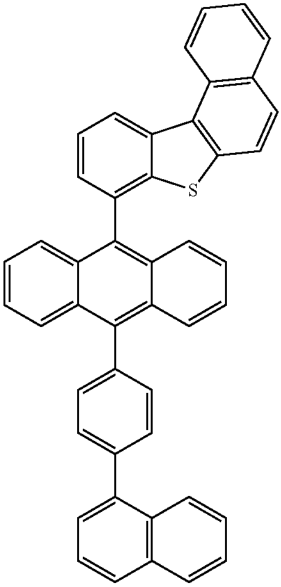
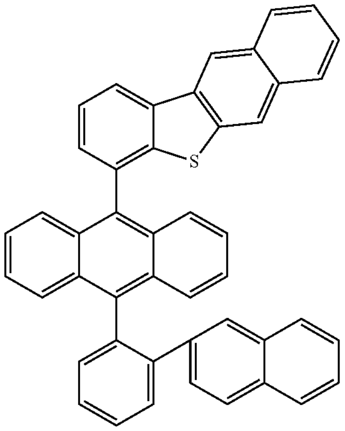

-continued
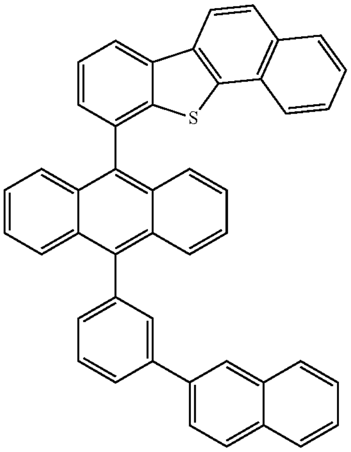
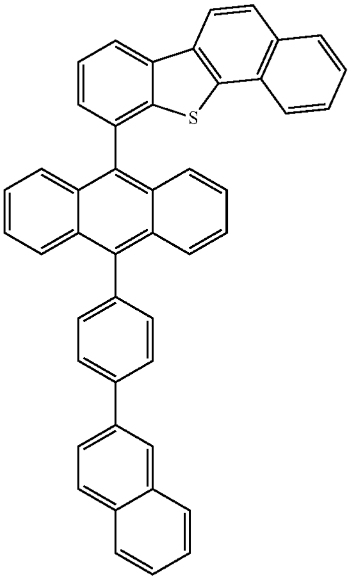
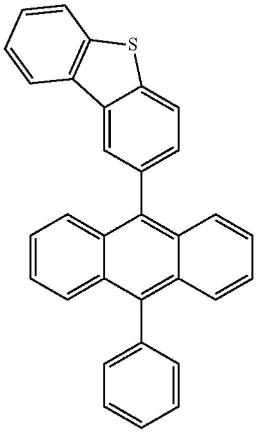
-continued
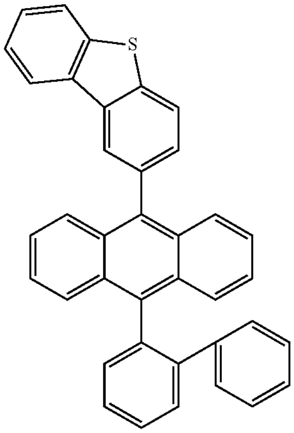
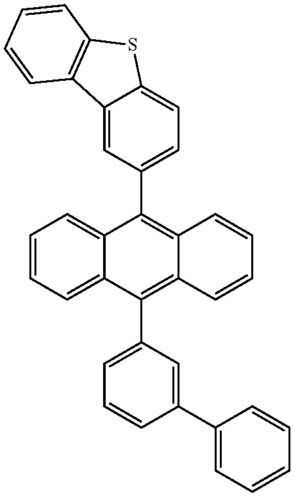
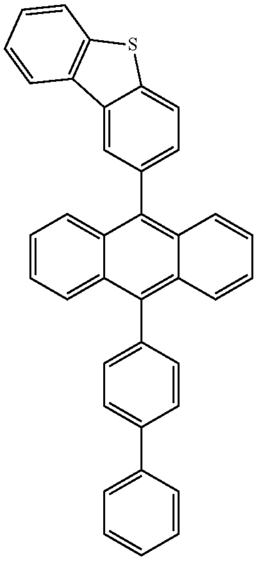

-continued
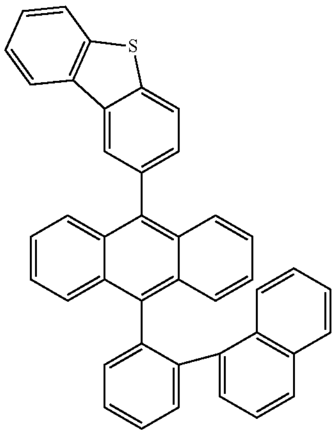
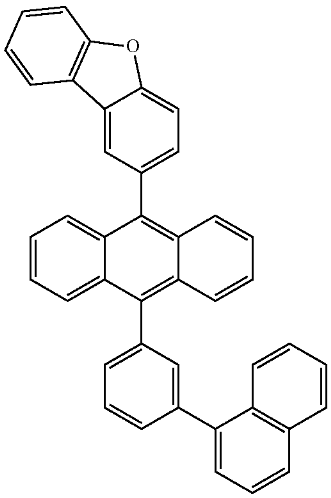
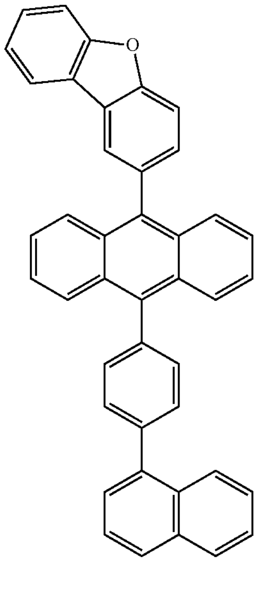
-continued
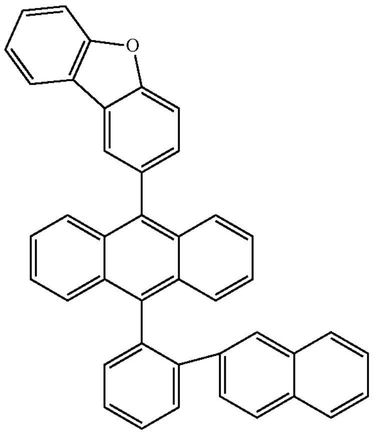
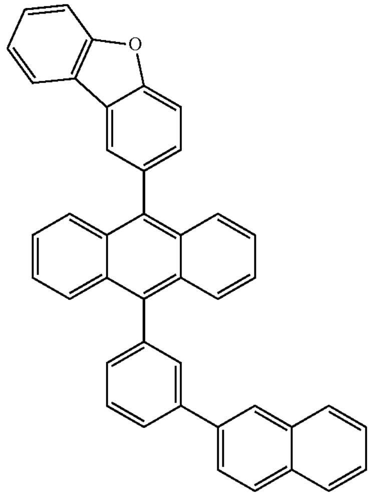
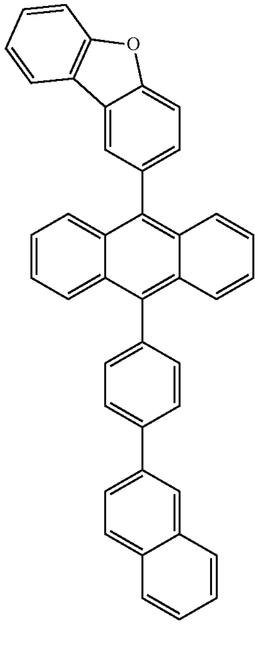

-continued
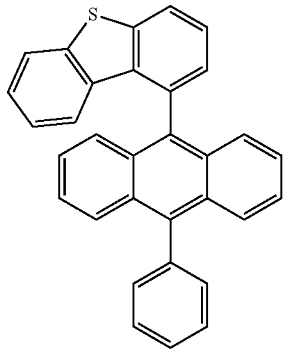
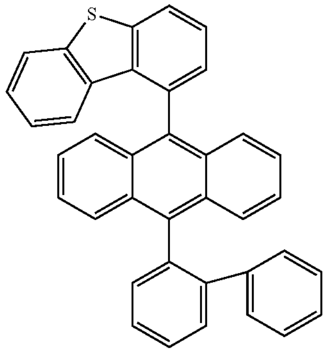
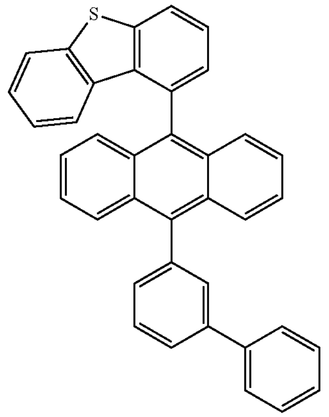
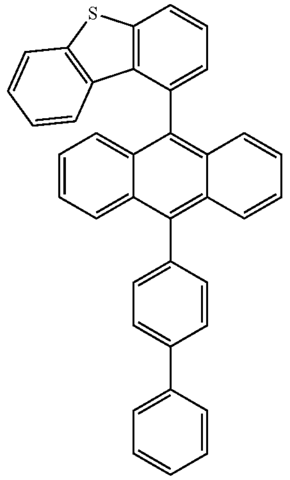
-continued
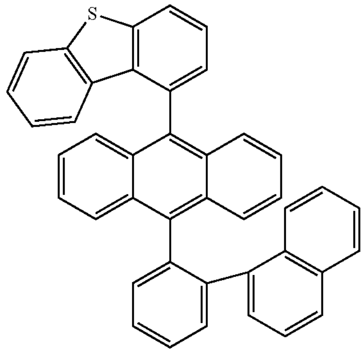
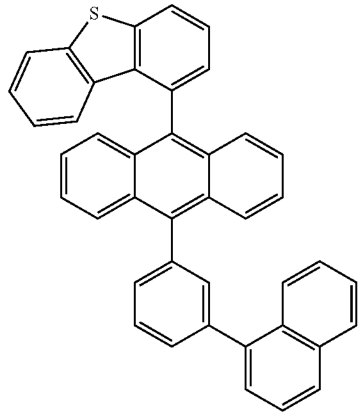
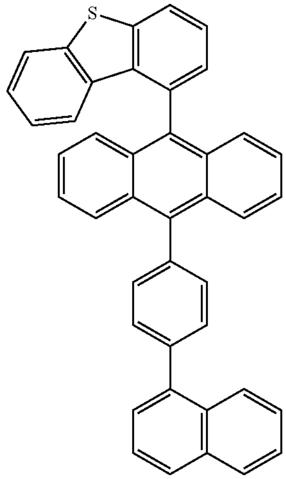
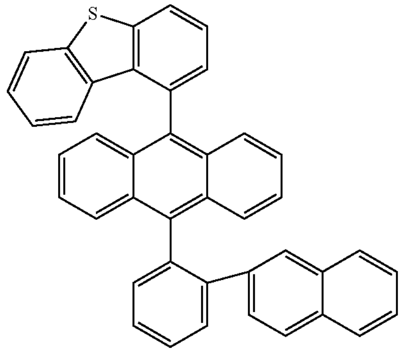

-continued
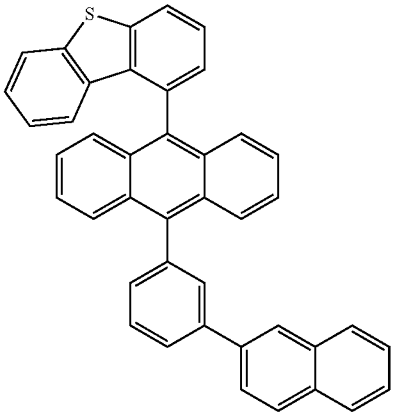
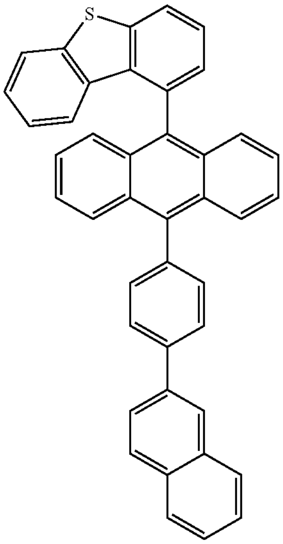
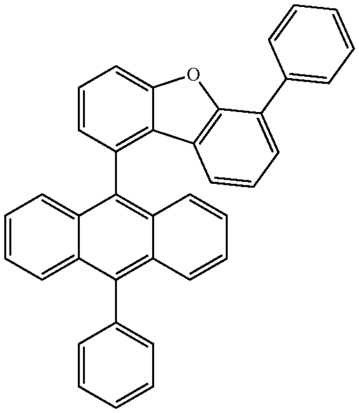
-continued
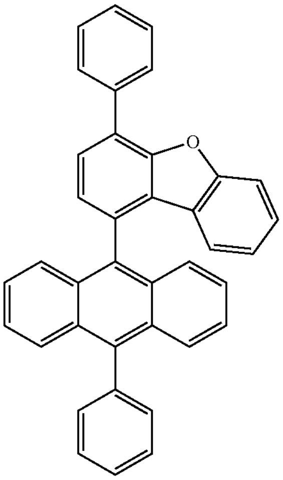
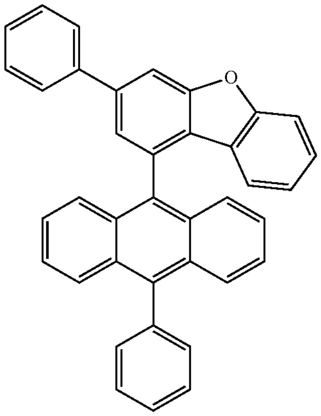
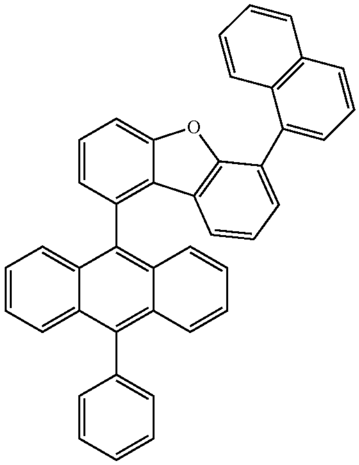

-continued
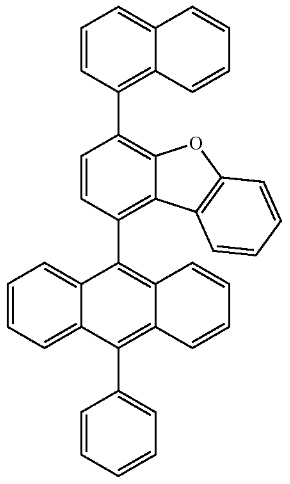
-continued
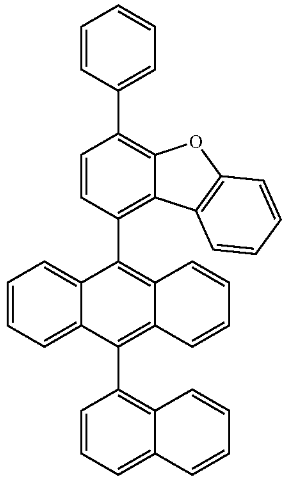
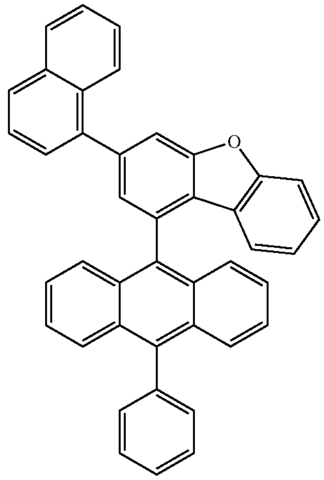
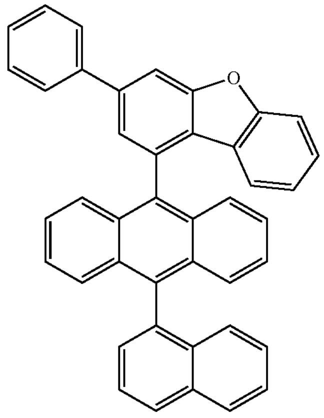
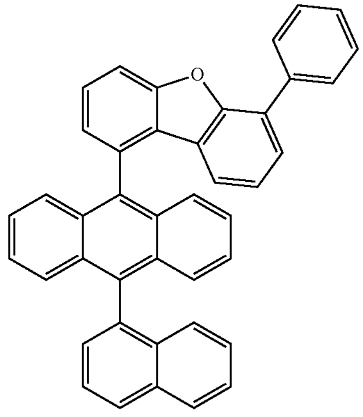
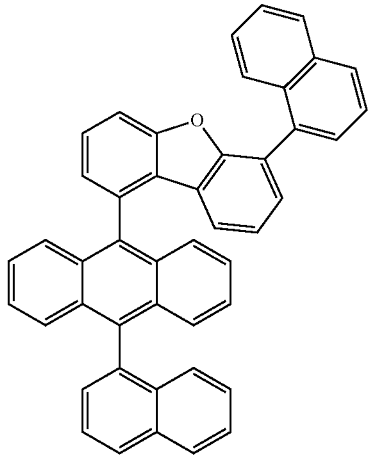

-continued
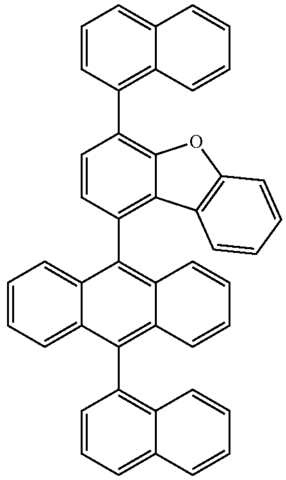
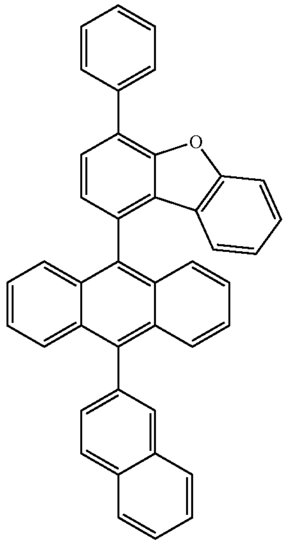
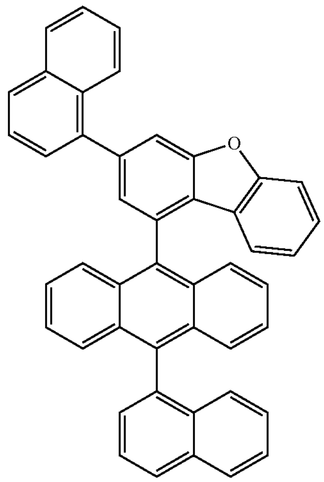
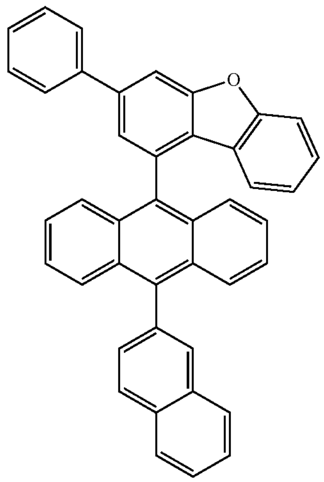
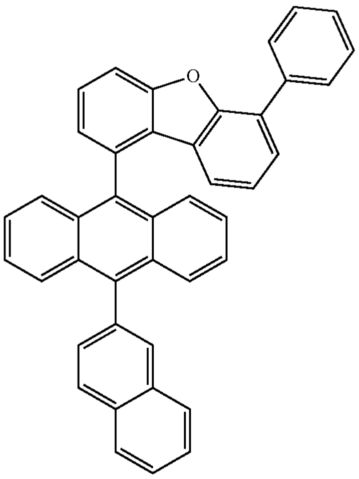
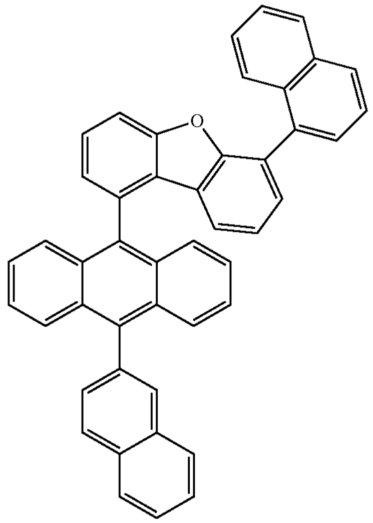
-continued -continued
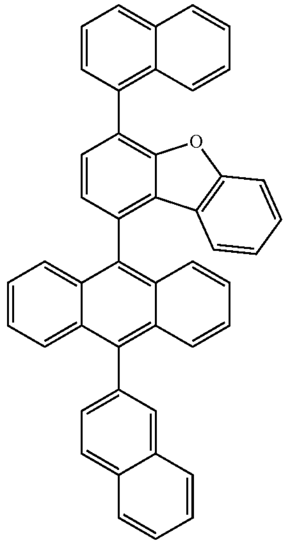
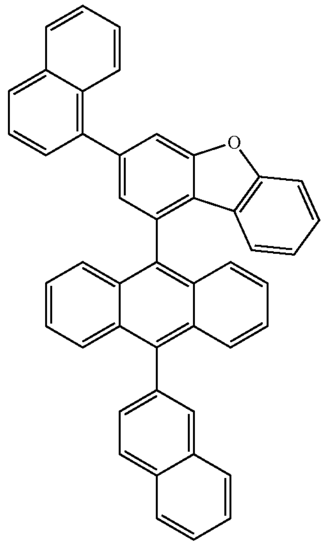
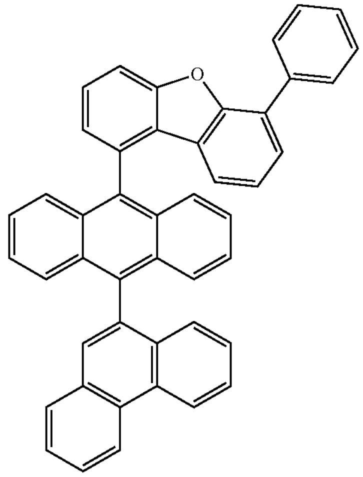
-continued
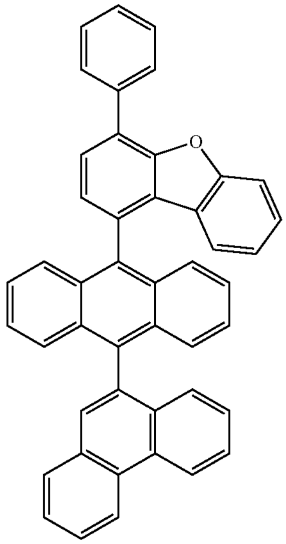
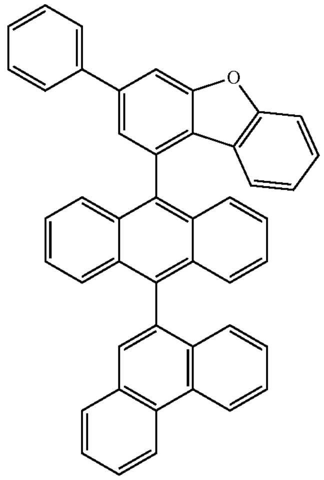
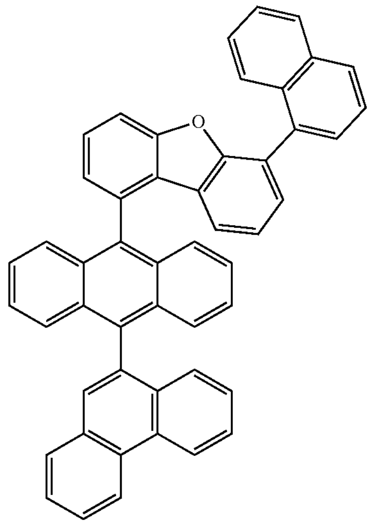

-continued
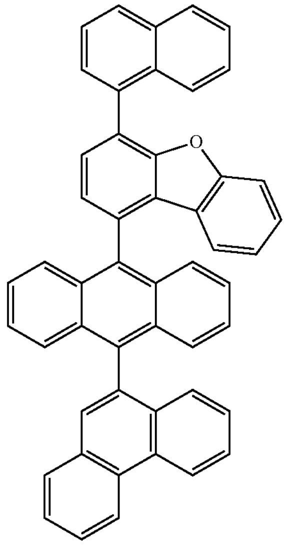
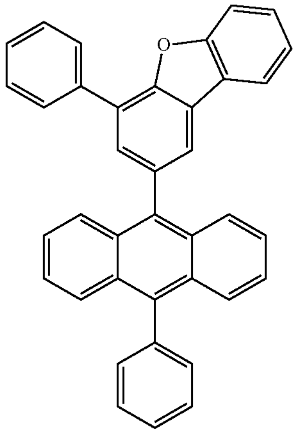
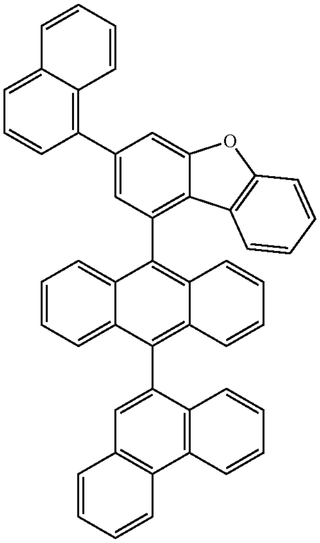
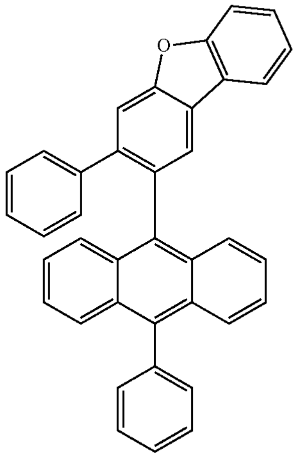
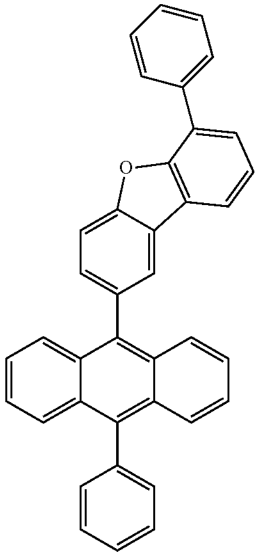
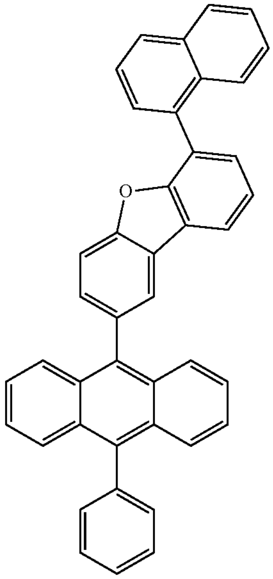

-continued
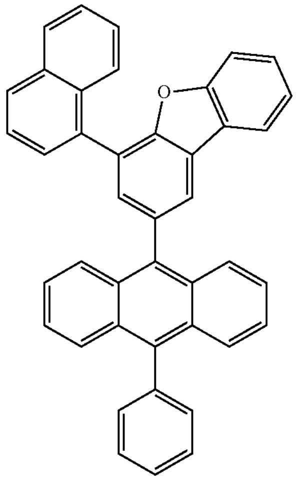
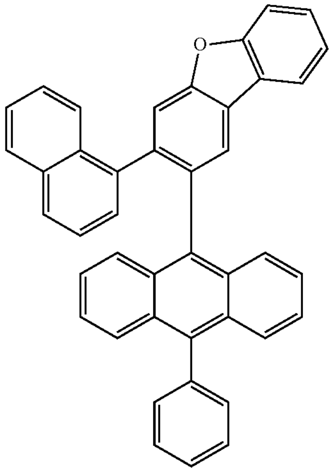
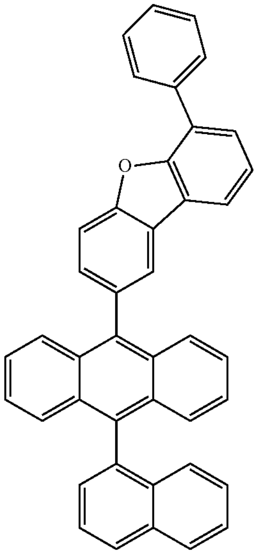
-continued
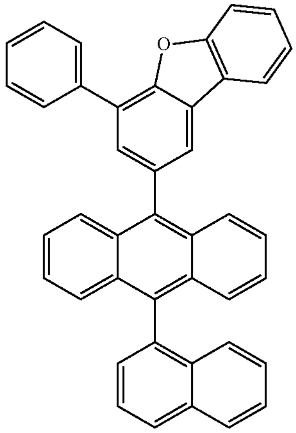
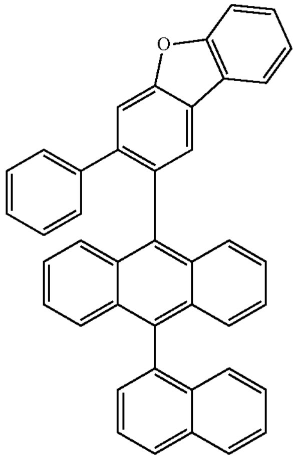
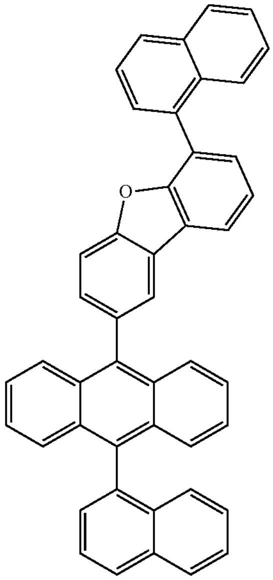

-continued
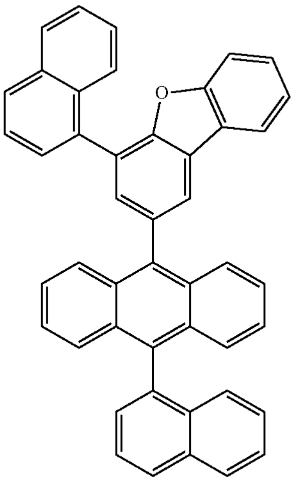
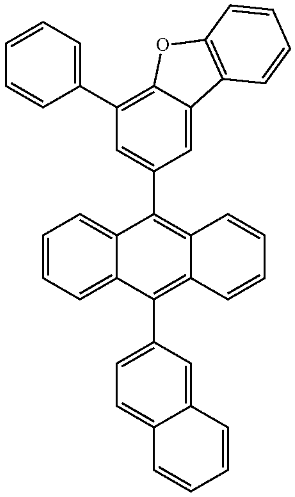
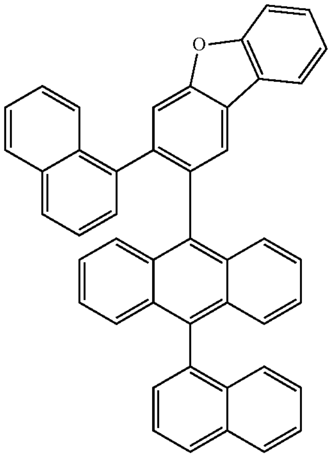
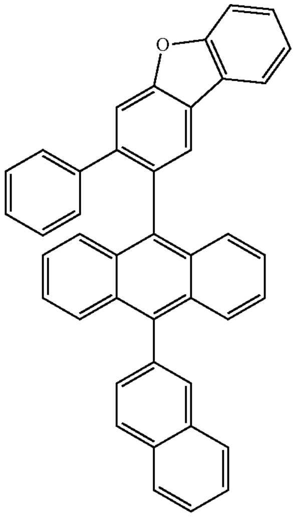
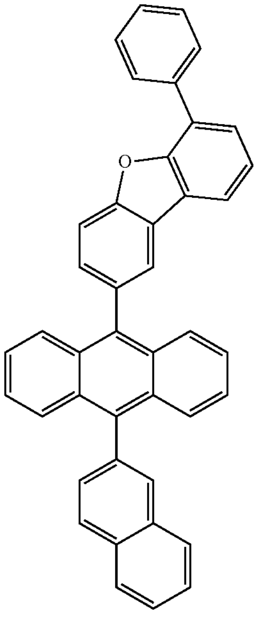
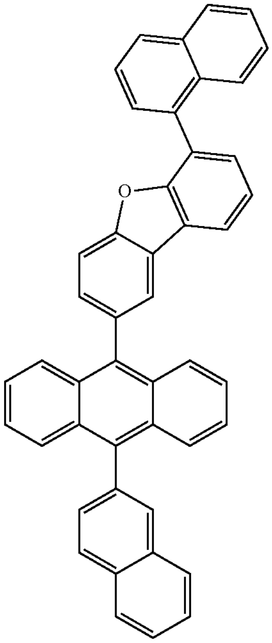

-continued
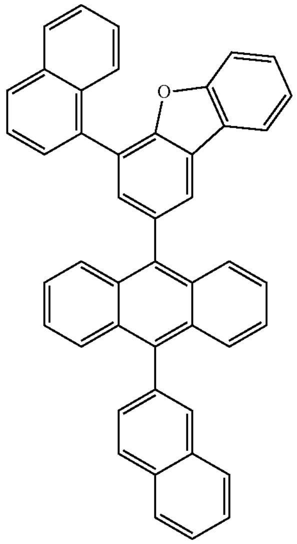
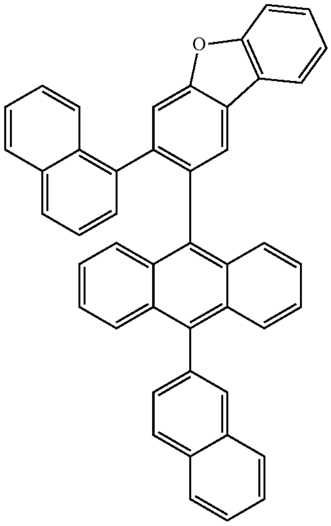
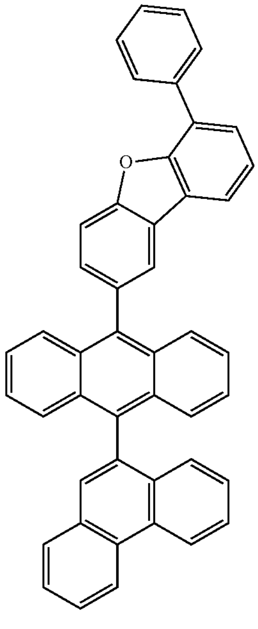
-continued
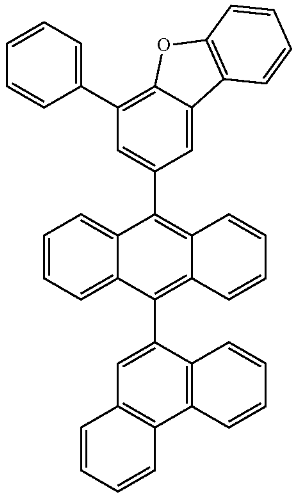
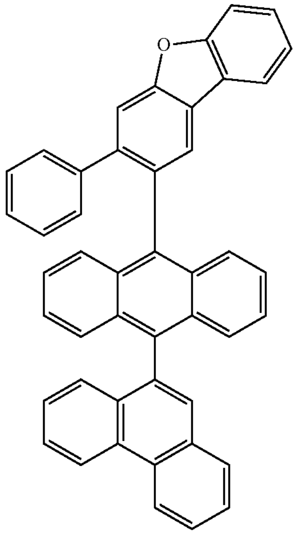
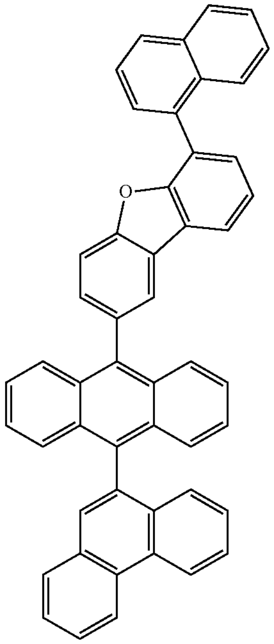

-continued
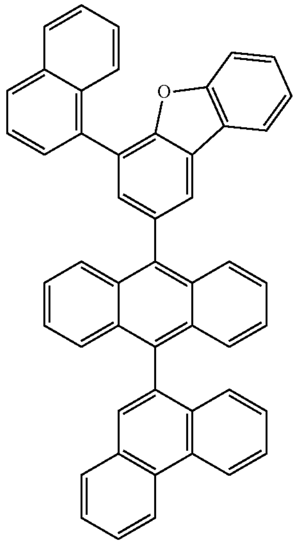
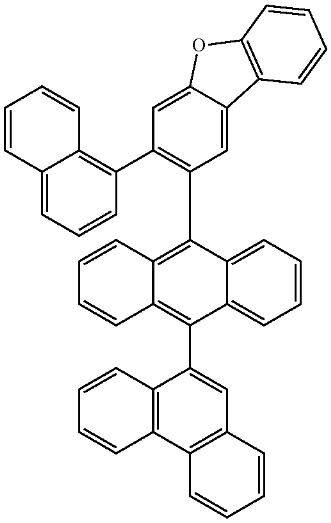
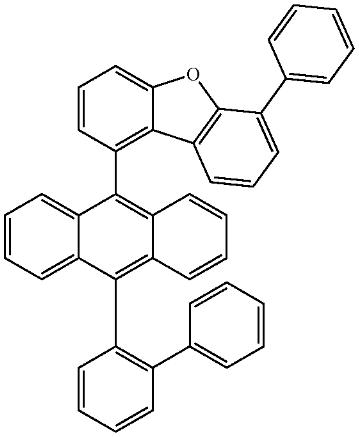
-continued
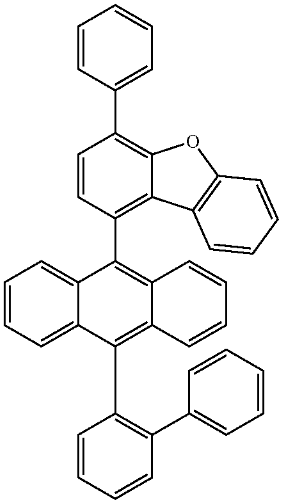
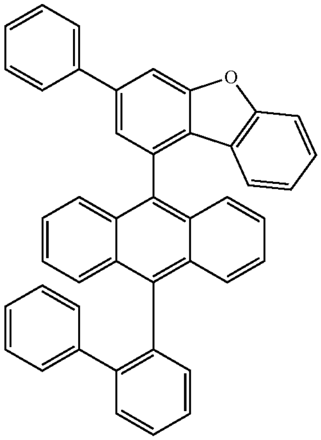
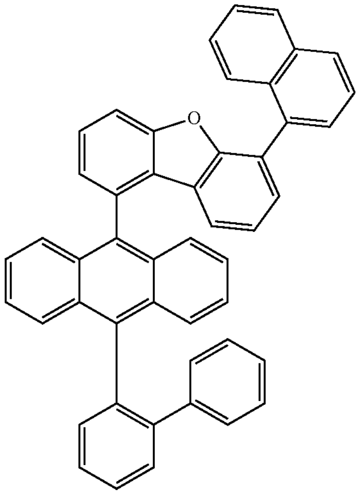

-continued
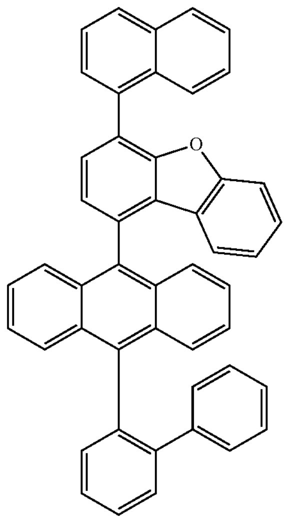
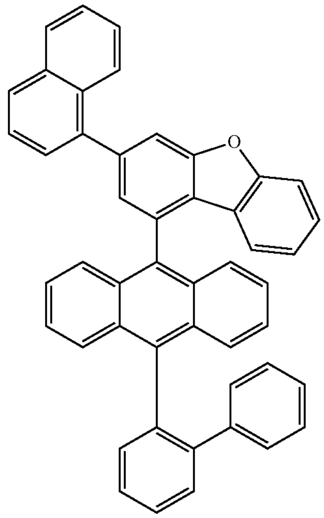
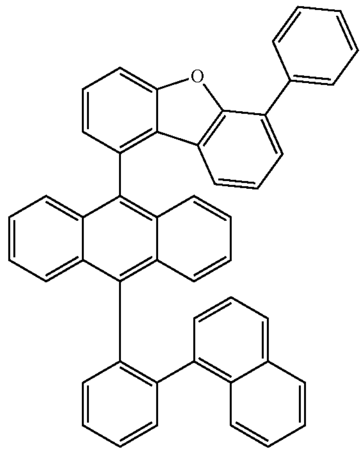
-continued
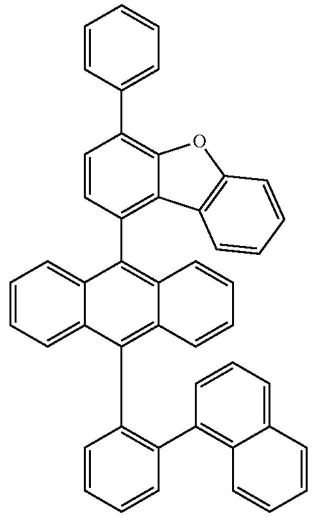
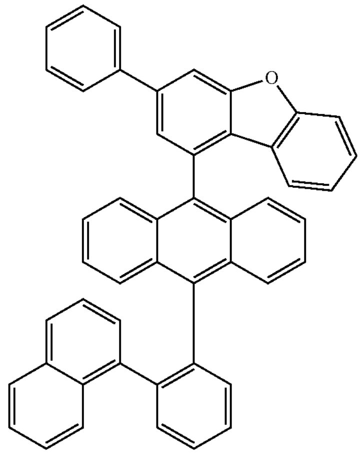
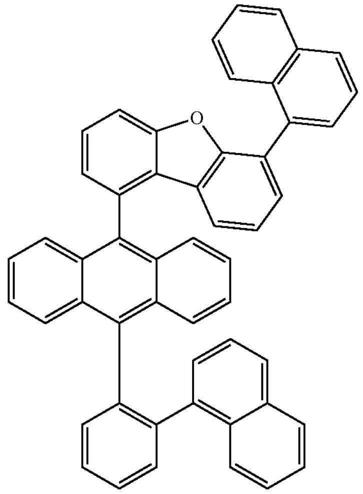

-continued
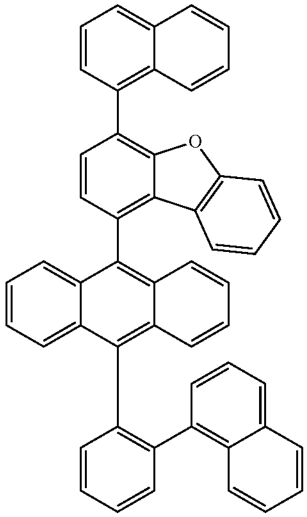
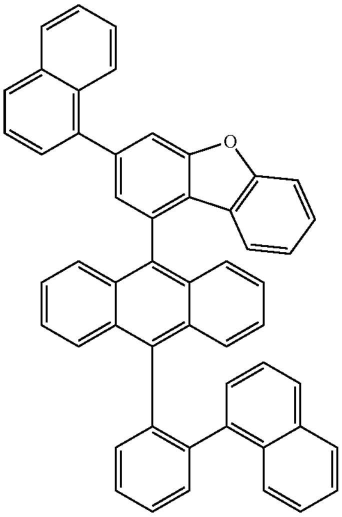
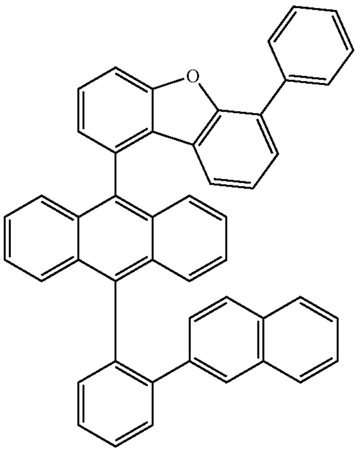
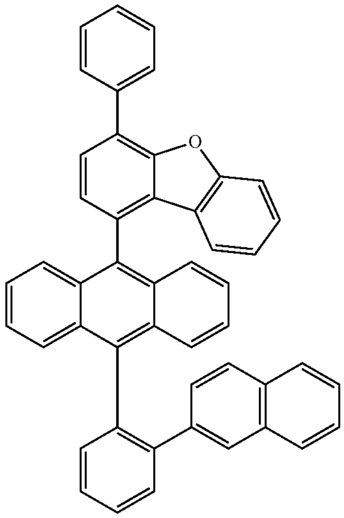
-continued
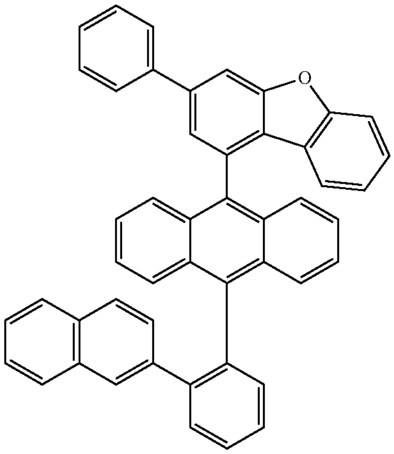
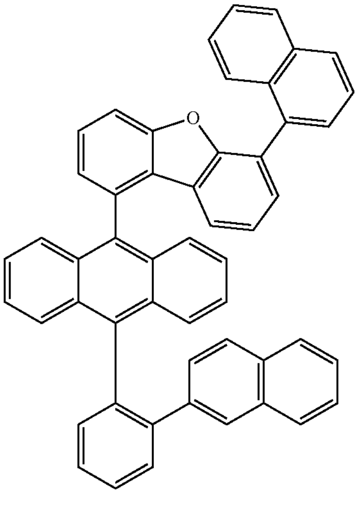

-continued
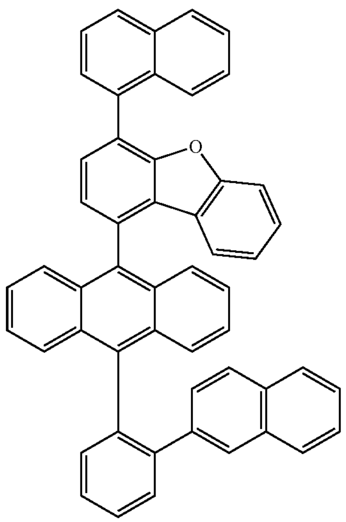
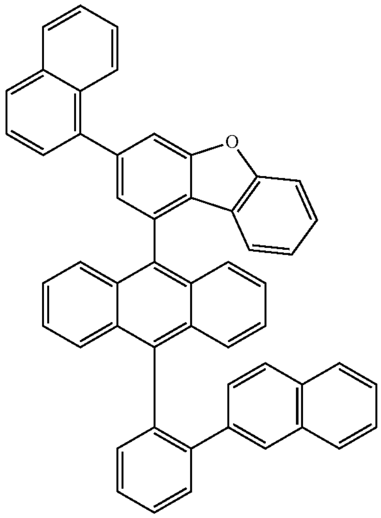
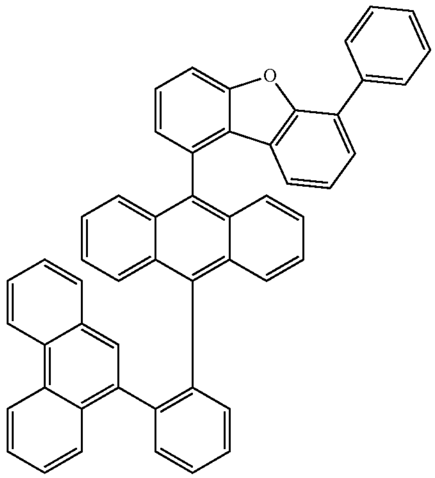
-continued
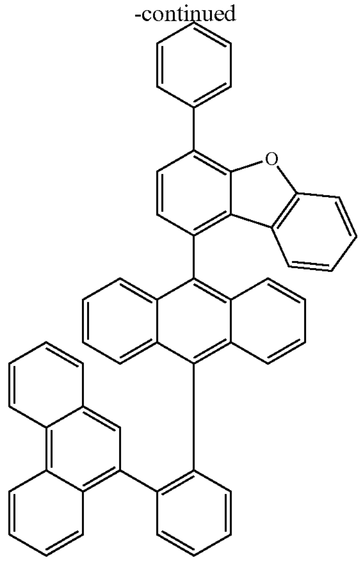
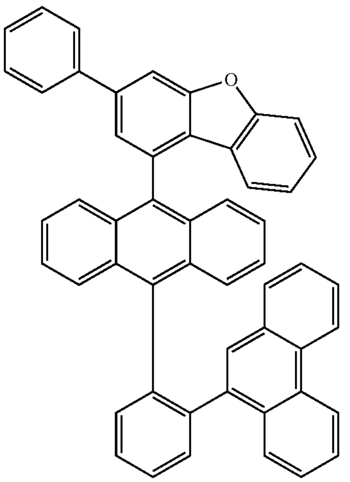
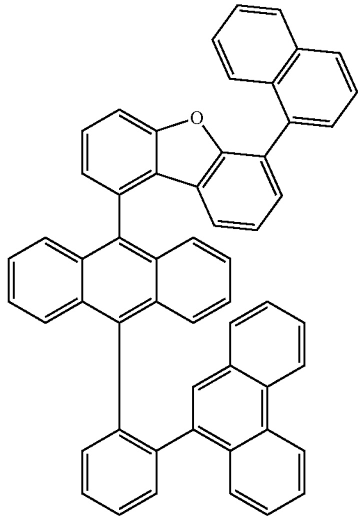

-continued
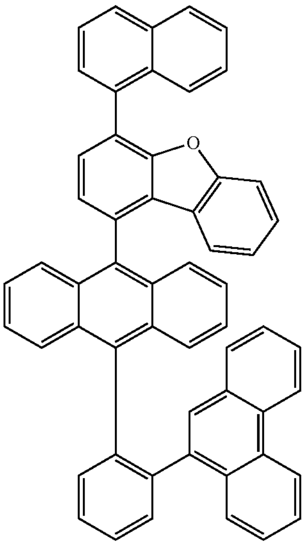
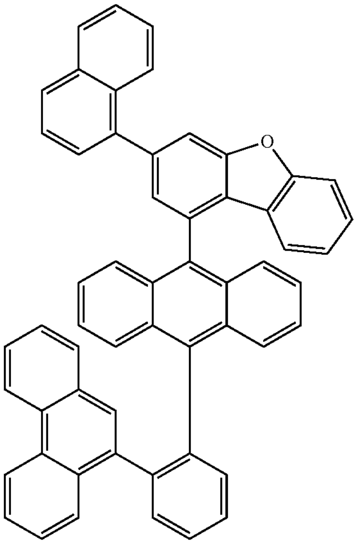
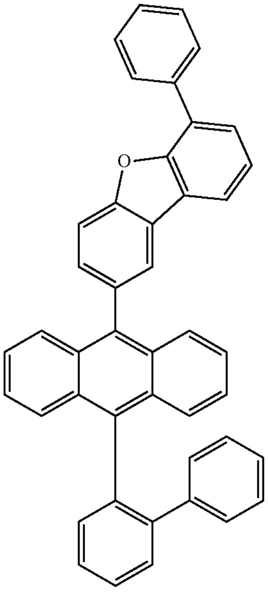
-continued
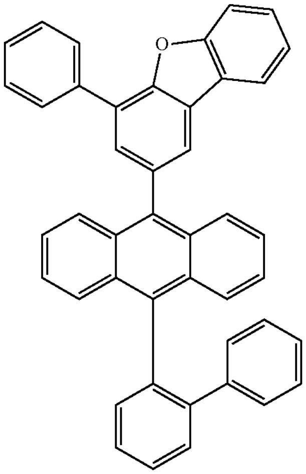
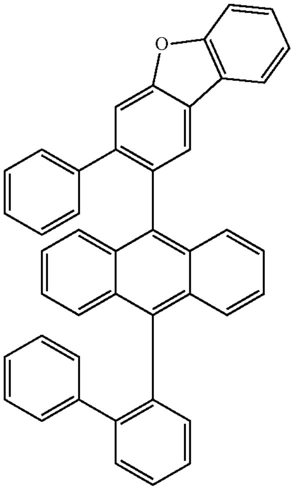
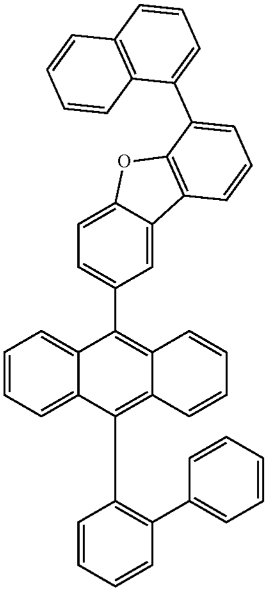

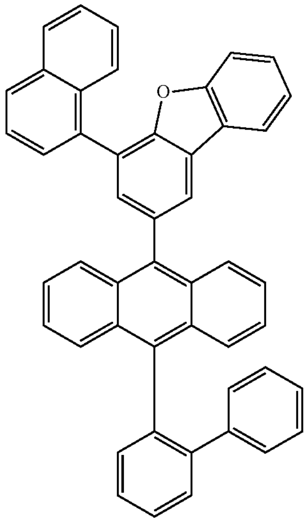
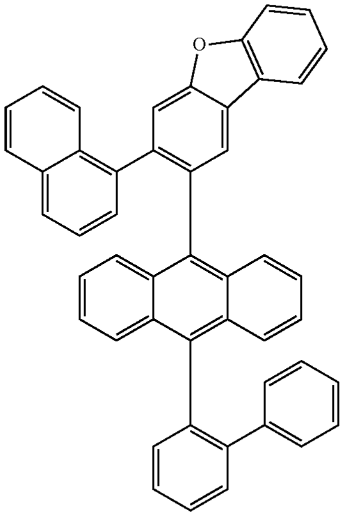
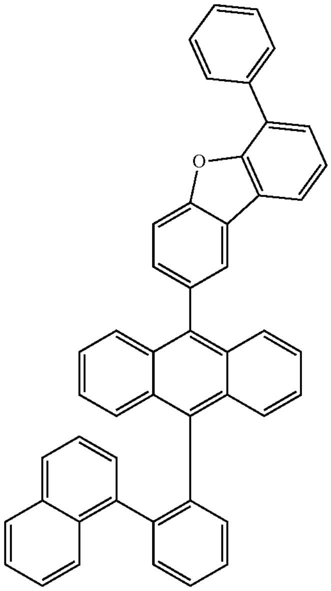
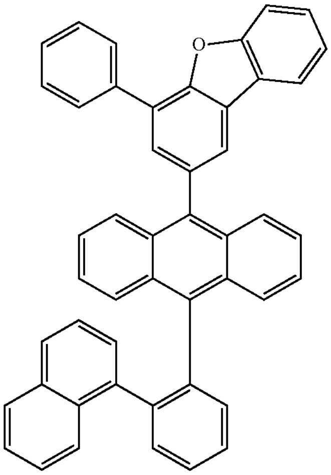
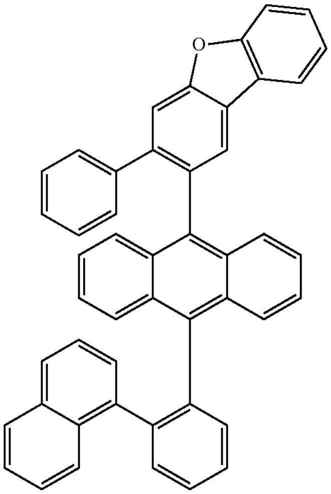
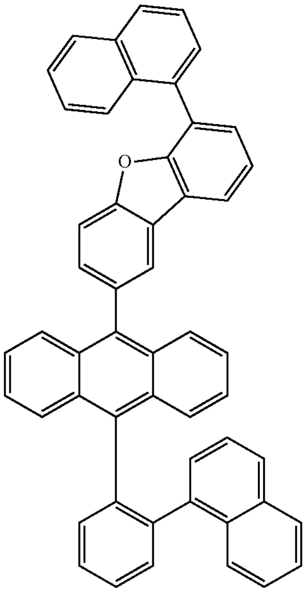

-continued
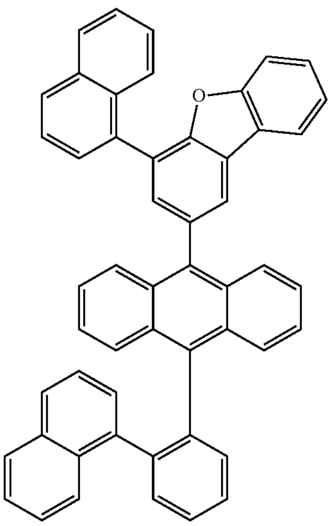
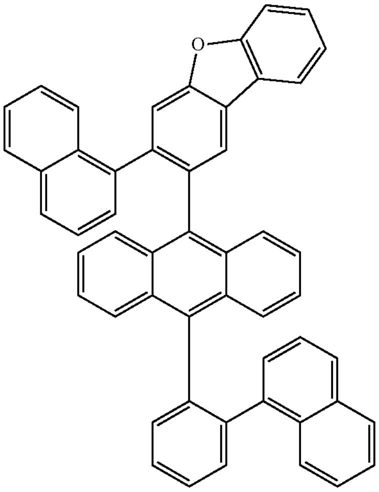
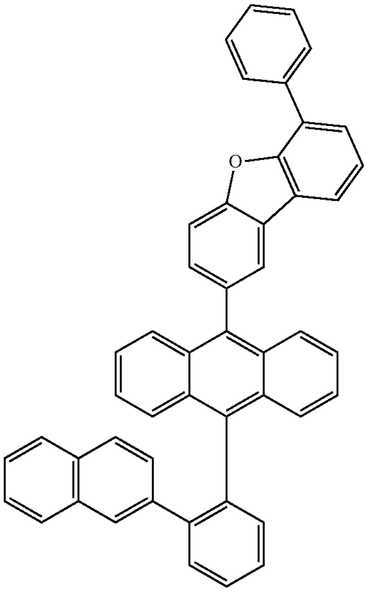
-continued
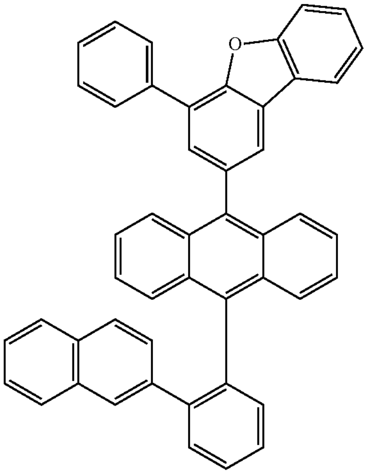
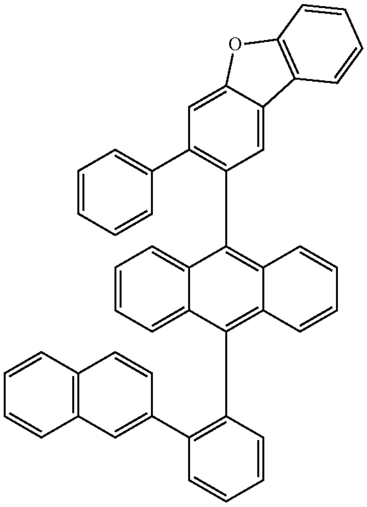
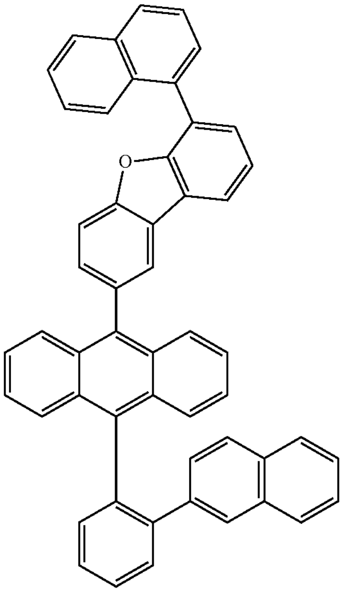

-continued
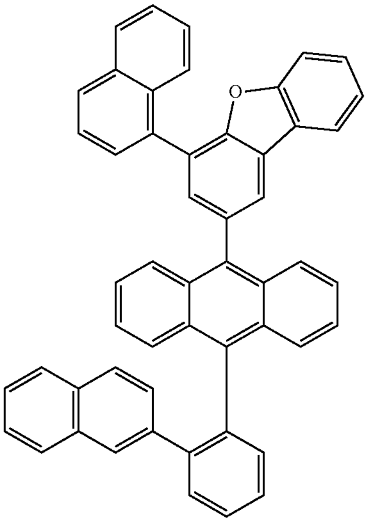
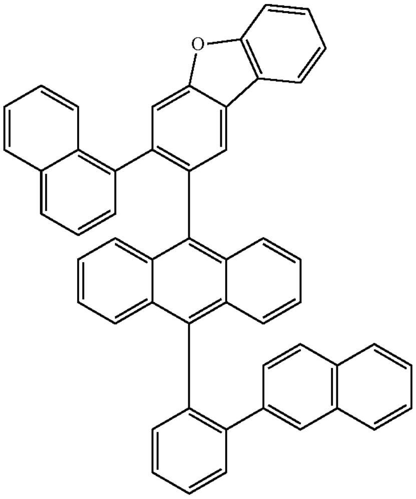
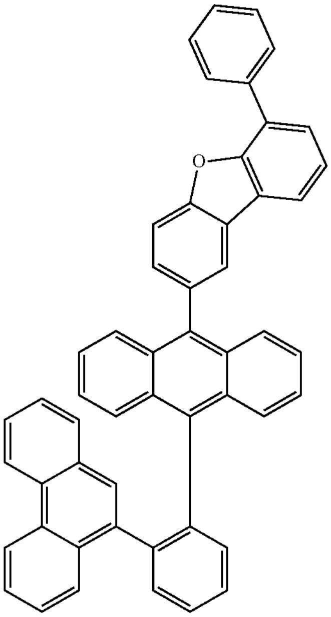
-continued
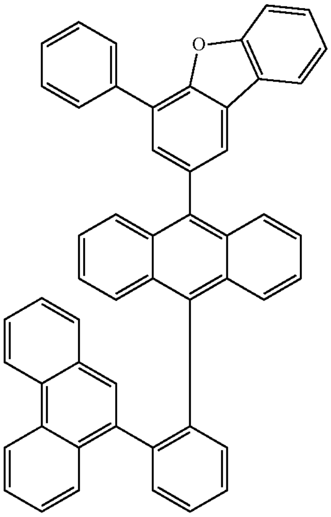
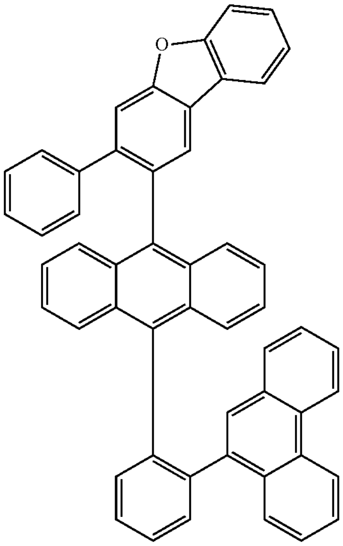
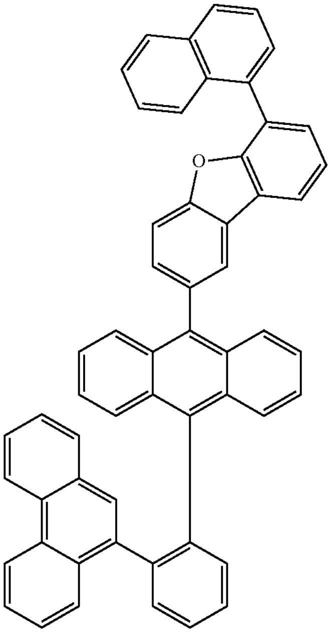

-continued
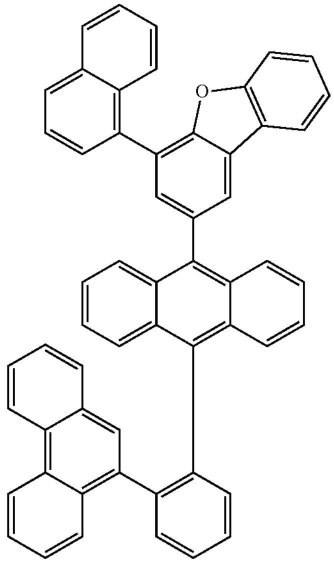
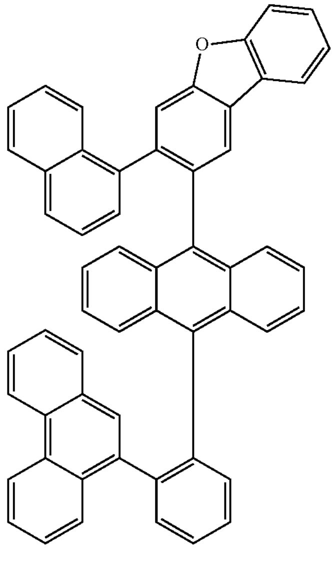
-continued
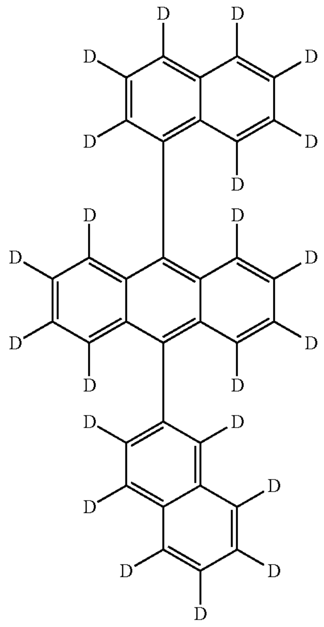
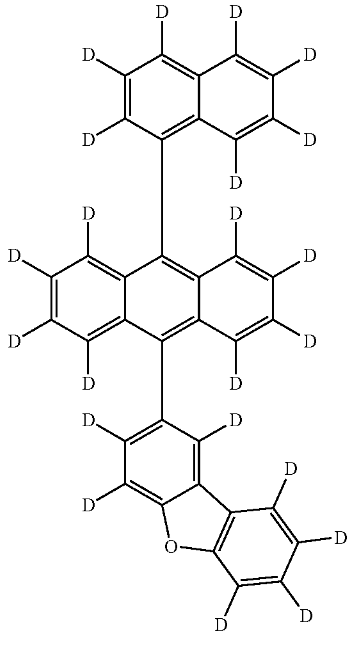

-continued
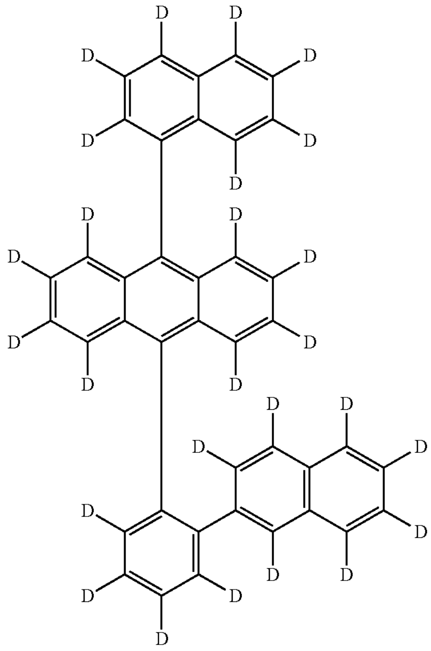
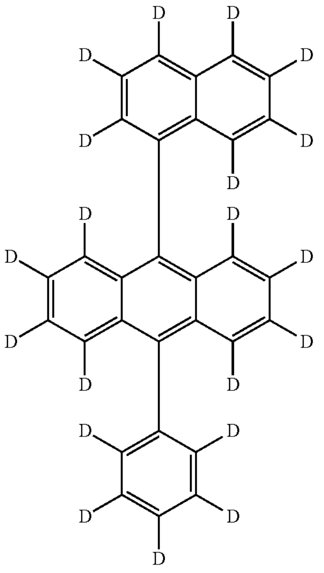
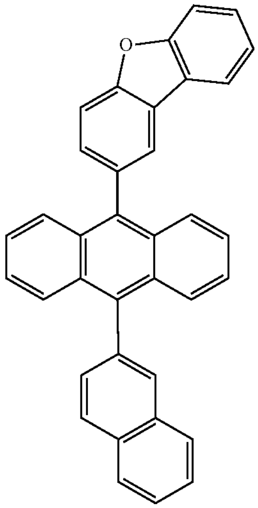
-continued
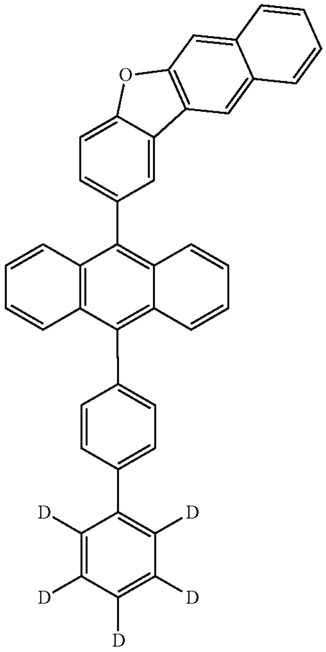
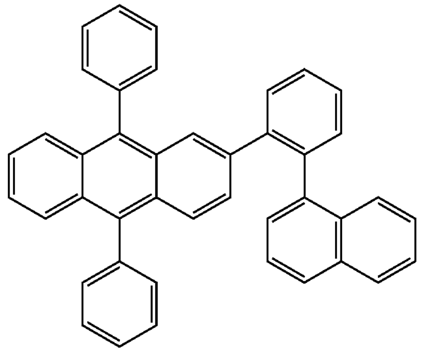
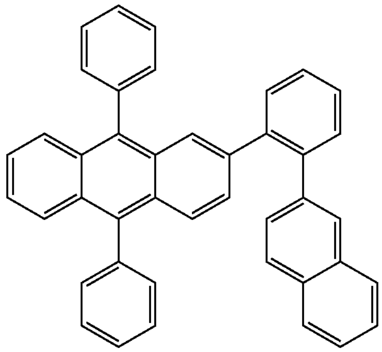
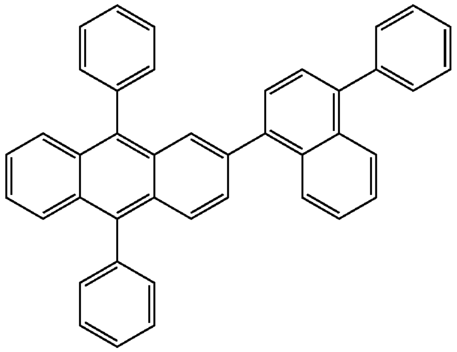

-continued
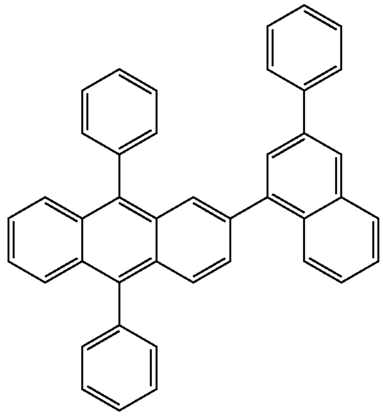
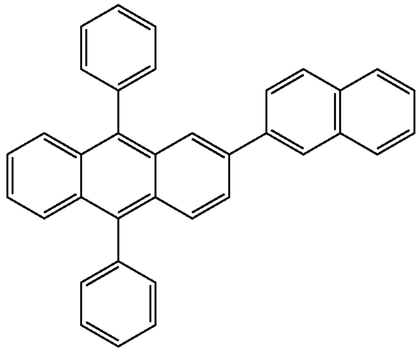
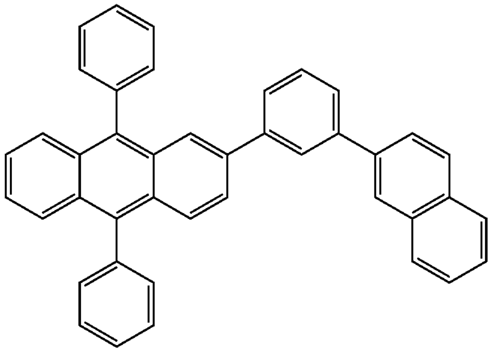
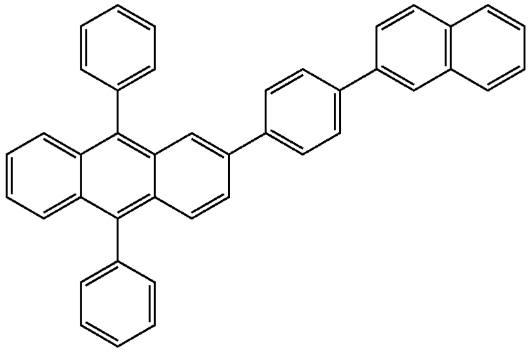
-continued
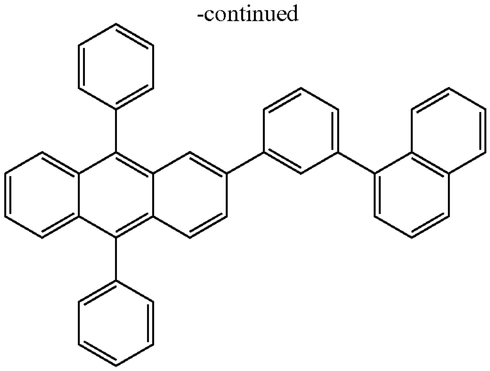
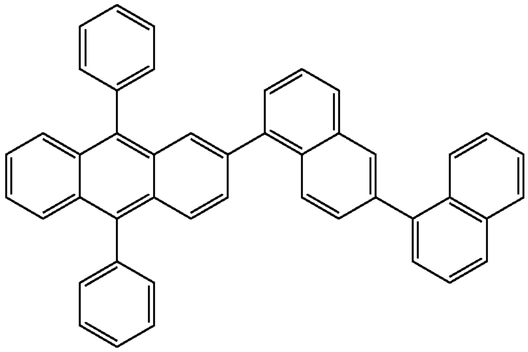
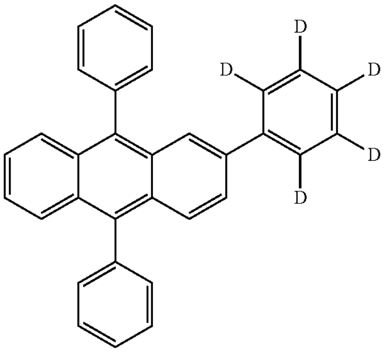
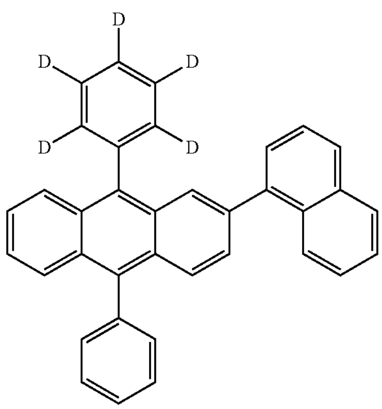

-continued
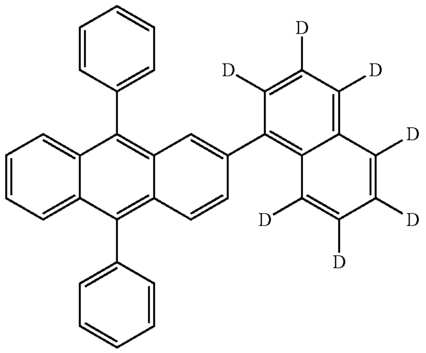
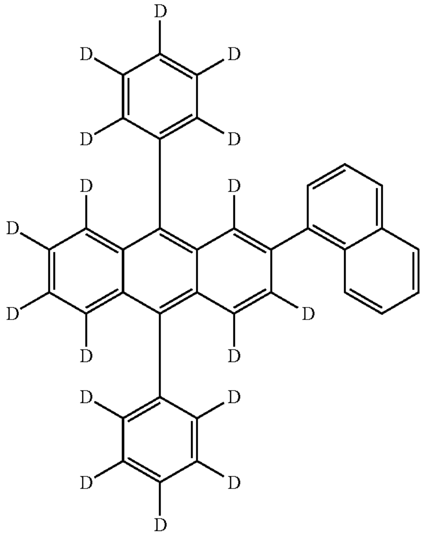
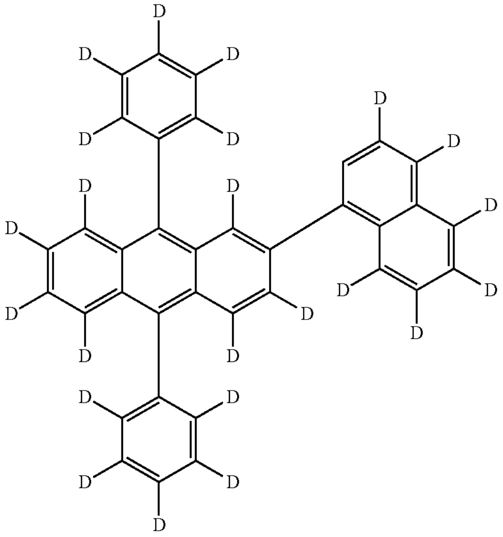
-continued
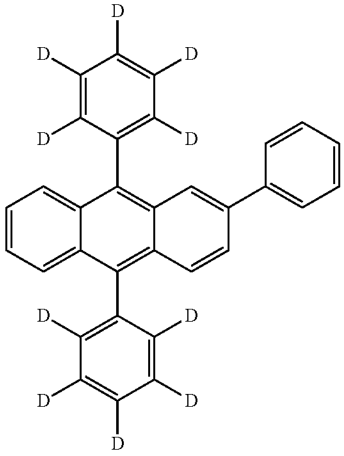
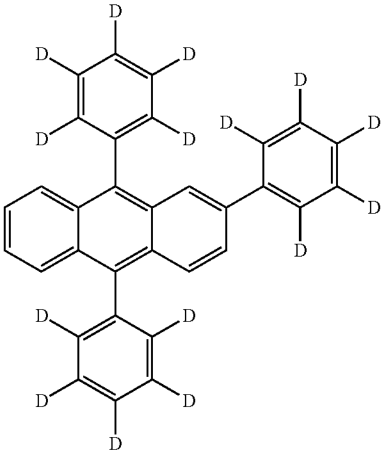
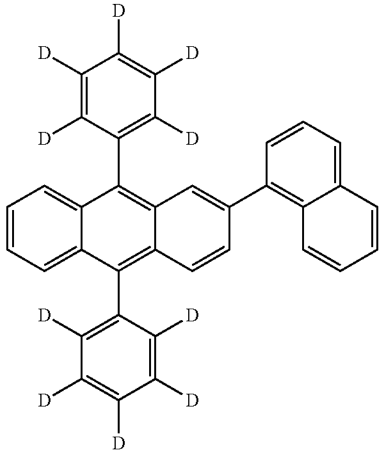

-continued
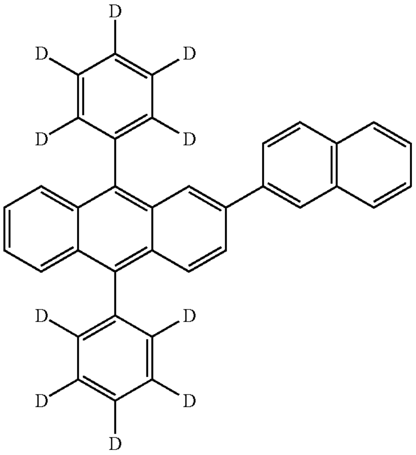
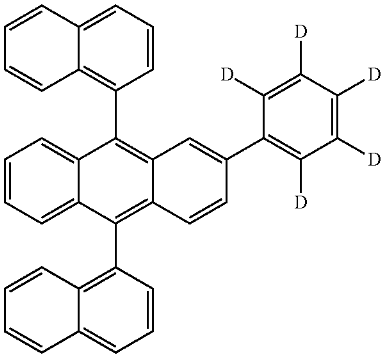
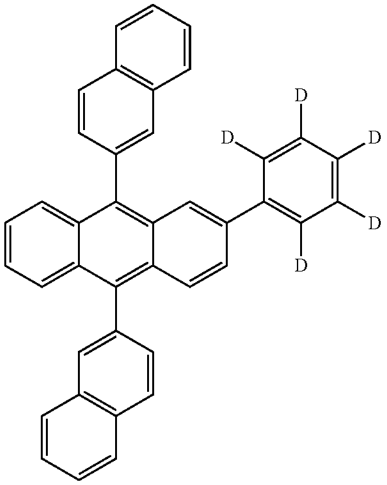
-continued
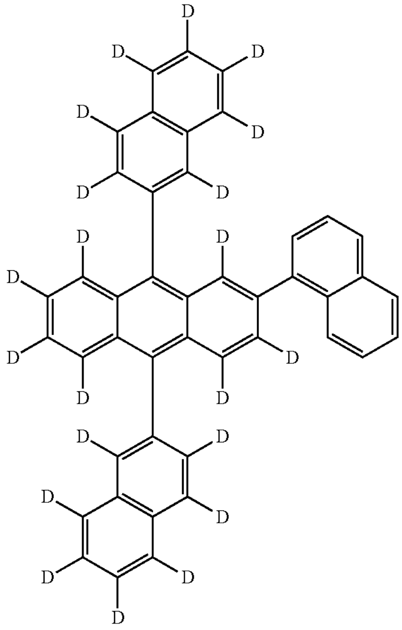
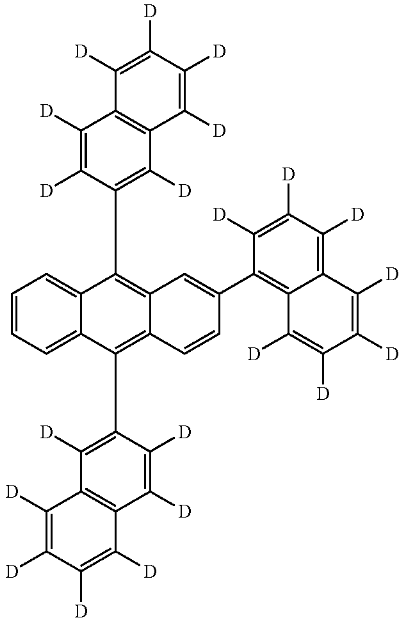

-continued
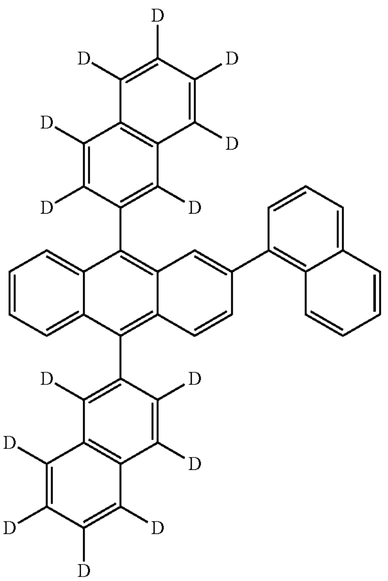
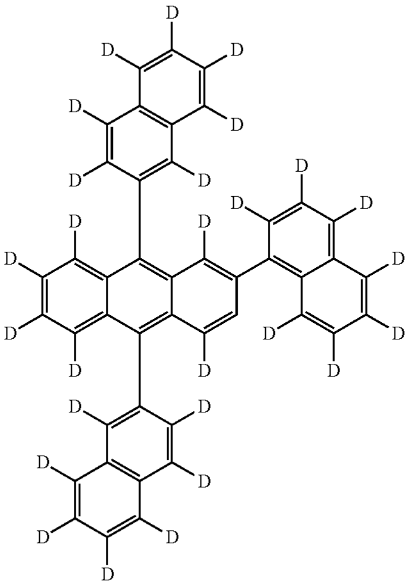
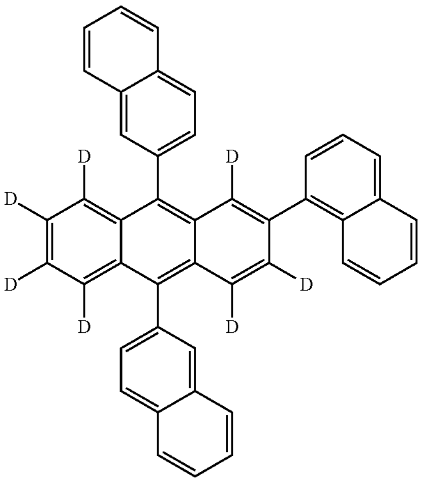
-continued
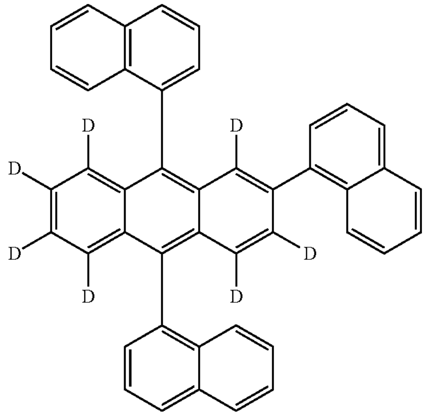
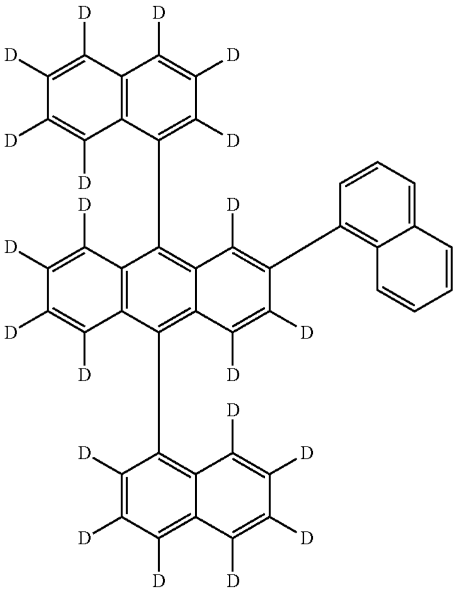
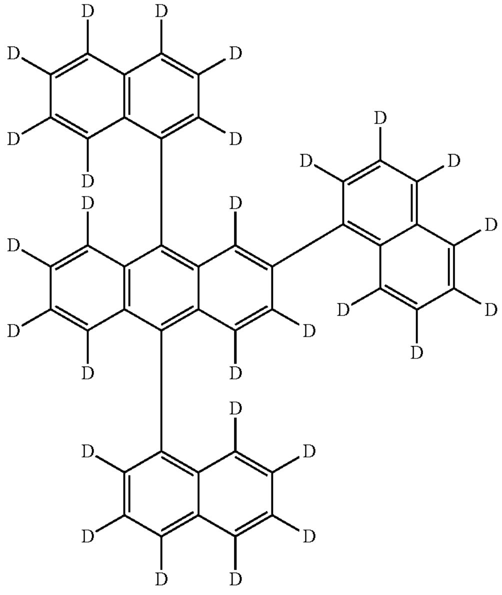

-continued
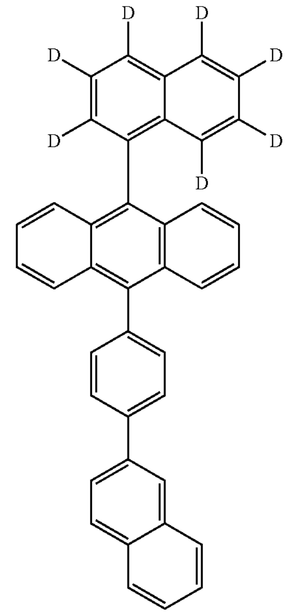
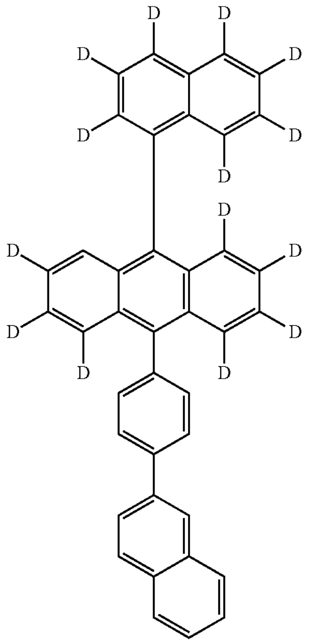
-continued
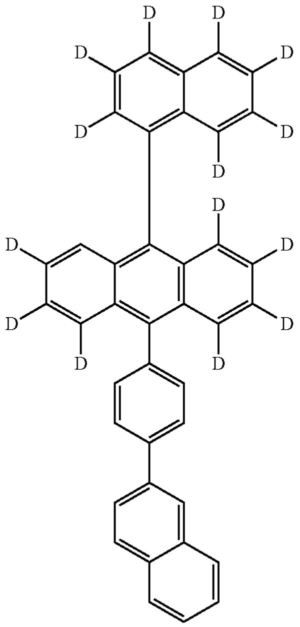
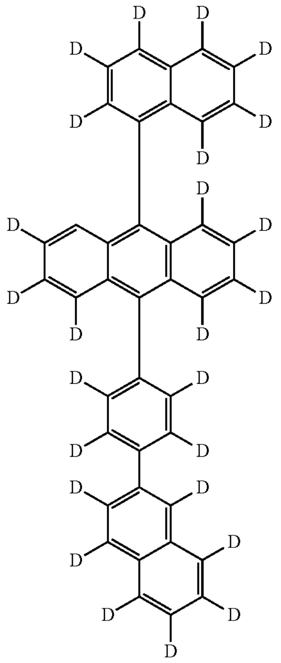

-continued
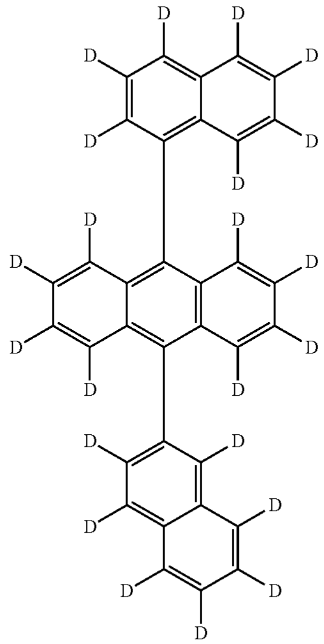
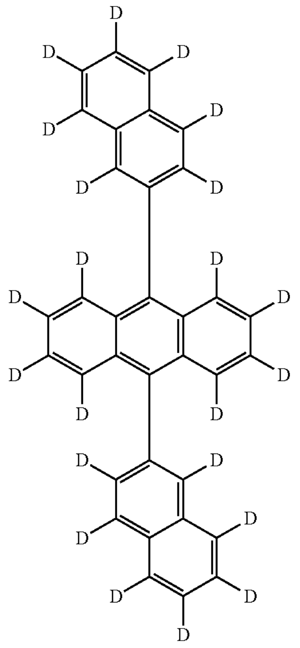
-continued
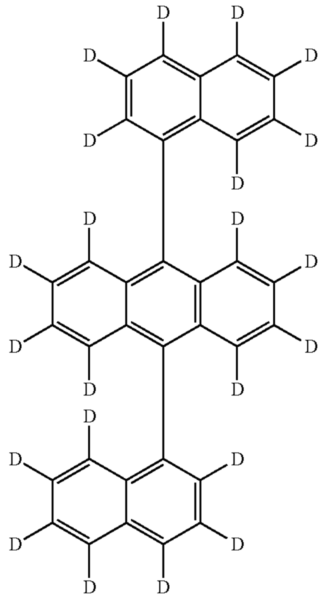
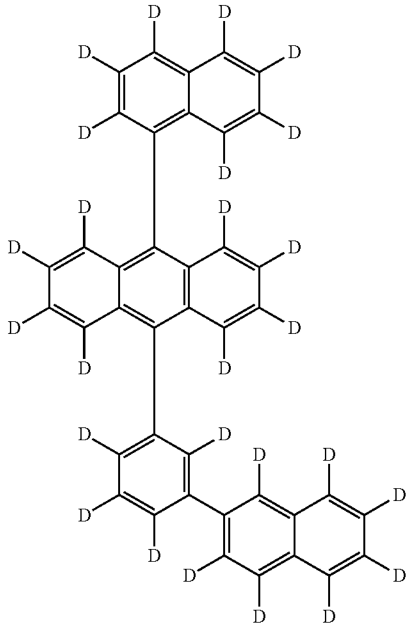

-continued
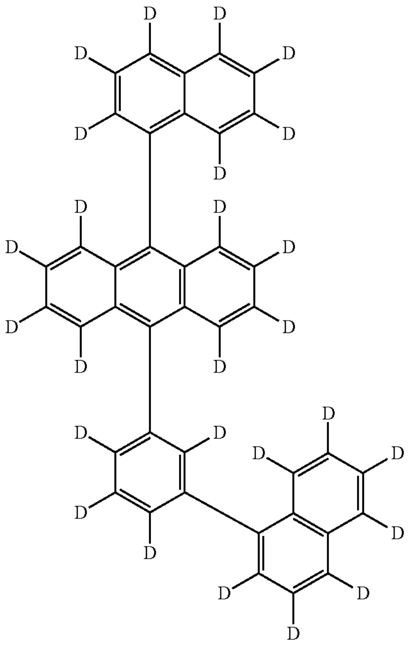
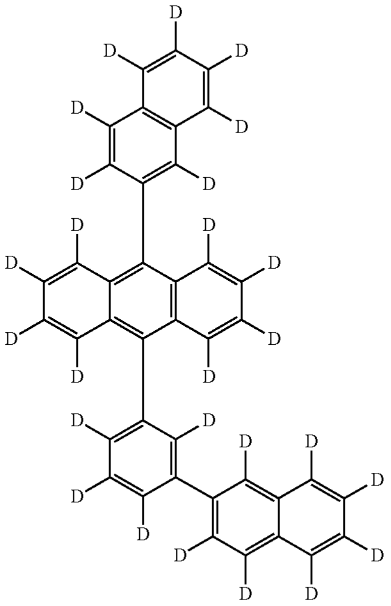
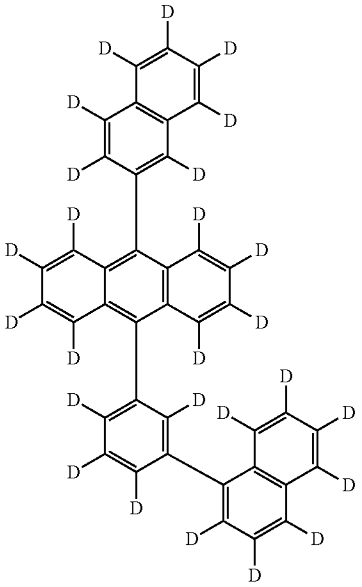
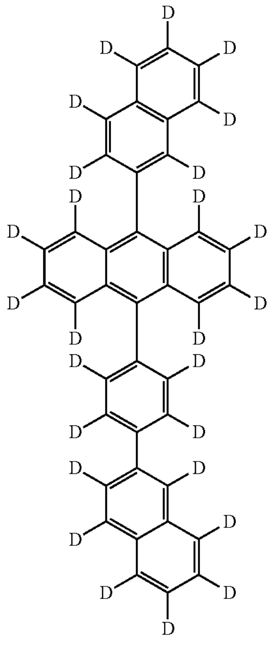
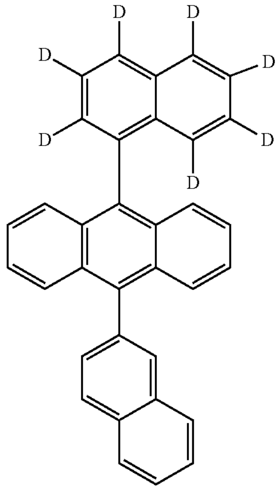

-continued
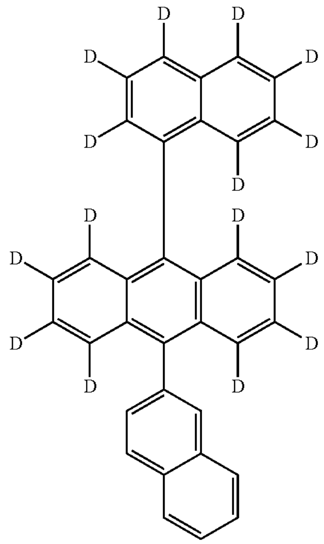
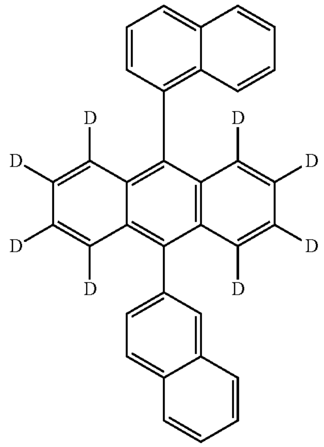
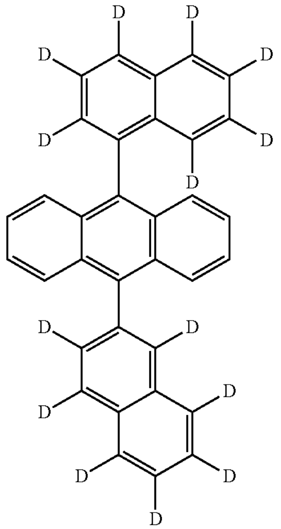
-continued
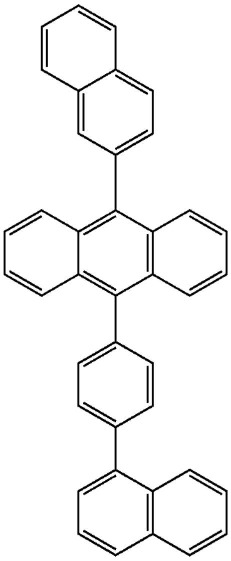
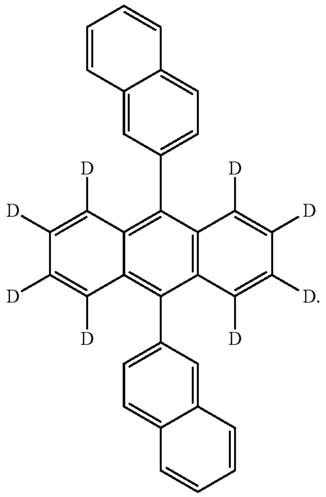
According to an exemplary embodiment of the present specification, the compound of Formula H can be prepared by the following General Formula 1, but is not limited thereto:
<General Formula 1>
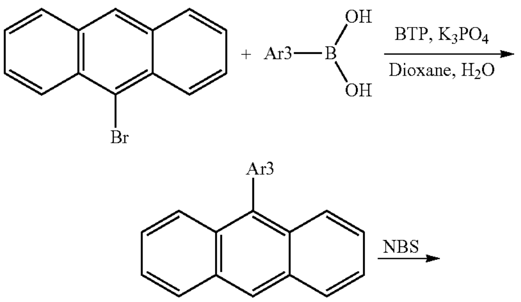

-continued

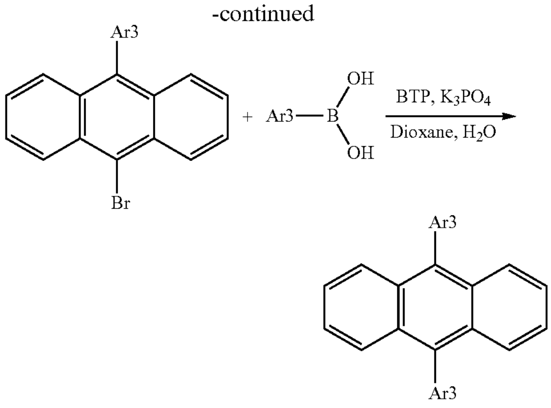

wherein in General Formula 1:

Ar3 is the same as the definition of -HL20-HAr20 of Formula H; and

Ar4 is the same as the definition of -HL21-HAr21 of Formula H, and HR20 can be further substituted with the anthracene core of General Formula 1.

In an exemplary embodiment of the present specification, in the light emitting layer, the compound of Formula 1 is used as a dopant, and the compound of Formula H is used as a host.

In an exemplary embodiment of the present specification, when the light emitting layer includes a host and a dopant, a content of the dopant can be selected within a range of 0.01 to 10 parts by weight based on 100 parts by weight of the light emitting layer, but is not limited thereto.

In an exemplary embodiment of the present specification, the light emitting layer includes a host and a dopant, and the host and the dopant are included at a weight ratio of 99:1 to 1:99, preferably 99:1 to 70:30, and more preferably 99:1 to 90:10.

The light emitting layer can further include a host material, and examples of the host include a fused aromatic ring derivative, a hetero ring-containing compound, and the like. Specifically, examples of the fused aromatic ring derivative include anthracene derivatives, pyrene derivatives, naphthalene derivatives, pentacene derivatives, phenanthrene compounds, fluoranthene compounds, and the like, and examples of the hetero ring-containing compound include carbazole derivatives, dibenzofuran derivatives, ladder-type furan compounds, pyrimidine derivatives, triazine derivatives, or the like, and the examples thereof can be a mixture of two or more thereof, but are not limited thereto.

According to an exemplary embodiment of the present specification, the organic material layer includes a light emitting layer, and the light emitting layer includes one or more dopants, and a host.

According to an exemplary embodiment of the present specification, the organic material layer includes a light emitting layer, and the light emitting layer includes two or more mixed dopants and a host.

According to an exemplary embodiment of the present specification, one or more of the two or more mixed dopants include Formula 1, and the host includes the compound of Formula H. One or more of the two or more mixed dopants include Formula 1, and the others can use dopant materials known in the related art, but the present invention is not limited thereto.

According to an exemplary embodiment of the present specification, one or more of the two or more mixed dopants include Formula 1, and the others can use one or more of a boron-based compound, a pyrene-based compound, and a delayed fluorescence-based compound, which are different from the compounds in Formula 1, but the present invention is not limited thereto.

According to an exemplary embodiment of the present specification, the organic material layer includes a light emitting layer, and the light emitting layer includes one or more hosts.

According to an exemplary embodiment of the present specification, the organic material layer includes a light emitting layer, and the light emitting layer includes two or more mixed hosts.

According to an exemplary embodiment of the present specification, one or more of the two or more mixed hosts are the compound of Formula H.

According to an exemplary embodiment of the present specification, the two or more mixed hosts are different from each other, and are each independently the compound of Formula H.

According to an exemplary embodiment of the present specification, the organic material layer includes a light emitting layer, and the light emitting layer includes two mixed hosts.

According to an exemplary embodiment of the present specification, the organic material layer includes a light emitting layer, the light emitting layer includes two mixed hosts, the two mixed hosts are different from each other, and the two hosts are the compounds of Formula H.

According to an exemplary embodiment of the present specification, the organic material layer includes a light emitting layer, and includes: a first host of Formula H; and a second host of Formula H, and the first host and the second host are different from each other.

According to an exemplary embodiment of the present specification, the first host:the second host are included at a weight ratio of 95:5 to 5:95, preferably at a weight ratio of 70:30 to 30:70.

According to an exemplary embodiment of the present specification, the organic material layer includes a light emitting layer, and the light emitting layer includes one or more hosts, and a dopant.

According to an exemplary embodiment of the present specification, the organic material layer includes a light emitting layer, the light emitting layer includes one or more hosts and a dopant, the host includes the compound of Formula H, and the dopant includes the compound of Formula 1.

According to an exemplary embodiment of the present specification, the organic material layer includes a light emitting layer, and the light emitting layer includes two or more mixed hosts, and a dopant.

According to an exemplary embodiment of the present specification, one or more of the two or more mixed hosts include the compound of Formula H, and the dopant includes the compound of Formula 1.

In the present specification, the two or more mixed hosts are different from each other.

According to an exemplary embodiment of the present specification, the organic material layer includes a light emitting layer, and the light emitting layer includes two mixed hosts, and a dopant.

According to an exemplary embodiment of the present specification, the two mixed hosts are different from each other, and each independently include the compound of Formula H, and the dopant includes the compound of Formula 1.

According to an exemplary embodiment of the present specification, the organic material layer includes a light emitting layer, and includes: a first host of Formula H; a second host of Formula H; and a dopant of Formula 1, and the first host and the second host are different from each other.

According to an exemplary embodiment of the present specification, one or more hosts and one or more dopants are used in the organic material layer, the one or more hosts include the compound of Formula H, and the one or more dopants include the compound of Formula 1.

According to an exemplary embodiment of the present specification, two or more mixed hosts and two or more mixed dopants are used in the organic material layer, the same material as described above can be used in the two or more mixed hosts, and the same material as described above can be used in the two or more mixed dopants.

In an exemplary embodiment of the present specification, the organic light emitting device includes: a first electrode; a second electrode; a light emitting layer provided between the first electrode and the second electrode; and an organic material layer having two or more layers provided between the light emitting layer and the first electrode, or between the light emitting layer and the second electrode, in which at least one of the two or more organic material layers includes the compound of Formula 1.

In an exemplary embodiment of the present specification, as the organic material layer having two or more layers, two or more can be selected from the group consisting of a light emitting layer, a hole transport layer, a hole injection layer, a layer which simultaneously transports and injects holes, and an electron blocking layer.

In an exemplary embodiment of the present specification, the organic light emitting device can include an electron transport layer having two or more layers, but is not limited thereto.

In an exemplary embodiment of the present specification, the organic material layer includes an electron transport layer having two or more layers, and at least one of the two or more electron transport layers includes the compound of Formula 1. Specifically, in an exemplary embodiment of the present specification, the compound of Formula 1 can also be included in one layer of the electron transport layer having two or more layers, and can be included in each of the electron transport layer having two or more layers.

EXAMPLES

Hereinafter, the present specification will be described in detail with reference to Examples, Comparative Examples, and the like for specifically describing the present specification. However, the Examples and the Comparative Examples according to the present specification can be modified in various forms, and it is not interpreted that the scope of the present specification is limited to the Examples and the Comparative Examples described below in detail. The Examples and the Comparative Examples of the present specification are provided to more completely explain the present specification to a person with ordinary skill in the art.

When the preparation formulae and the intermediates described in the following Examples of the present specification are appropriately combined based on a typical technology common sense, the compounds of Formula 1 described in the present specification can be all prepared.

Synthesis Example A. Synthesis of Intermediates A to D

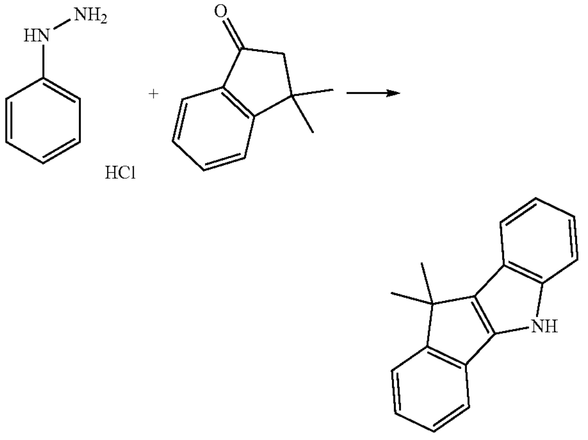

[Intermediate A]

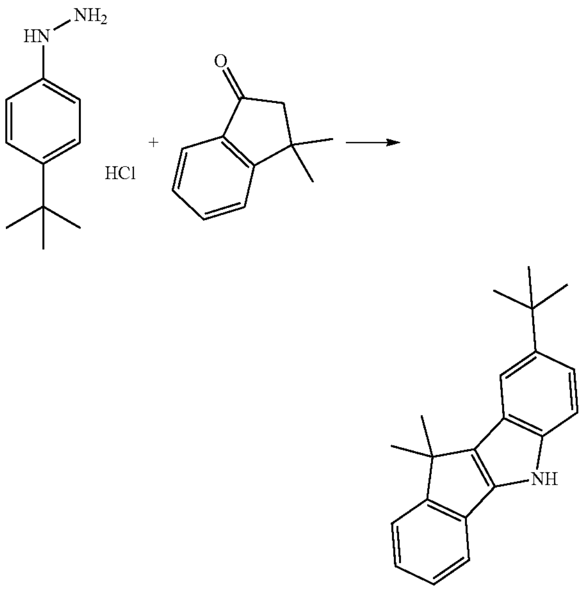

[Intermediate B]

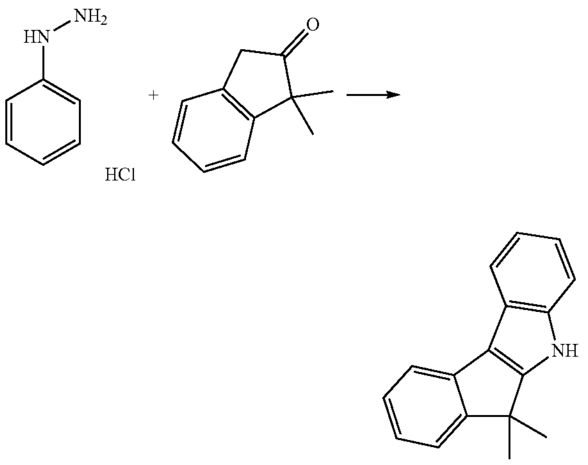

[Intermediate C]

-continued

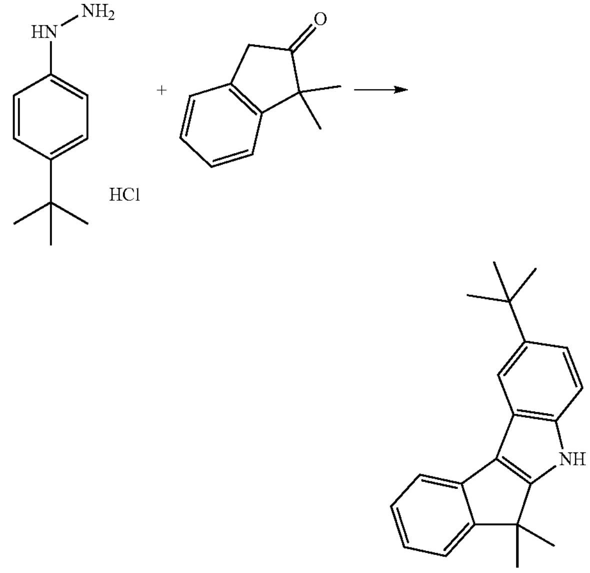

[Intermediate D]

After 22.5 g of phenylhydrazine hydrochloride and 25 g of 3,3-dimethyl-1-indanone were put into 250 ml of acetic acid, the resulting mixture was reacted under reflux for 8 hours and column purified, and then 25 g of Intermediate A was obtained. (yield 69%). MS[M+H]+=234

By using the same method for Intermediates B, C, and D, 23 g of Intermediate B (yield 71%, MS[M+H]+=290), 26 g of Intermediate C (yield 72%, MS[M+H]+=234), and 25 g of Intermediate D (yield 77%, MS[M+H]+=290) were obtained.

Synthesis Example B. Synthesis of Intermediates E to H

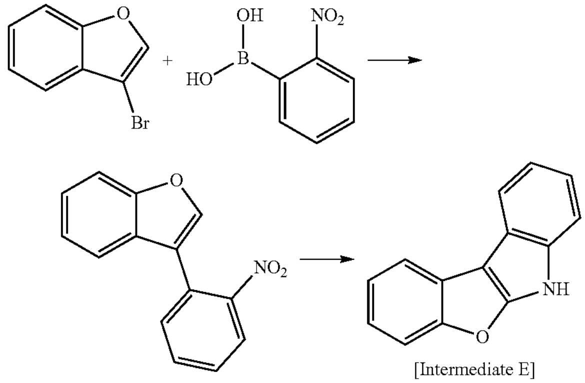

[Intermediate E]

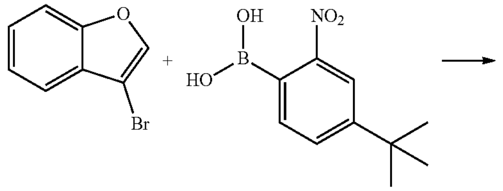

-continued

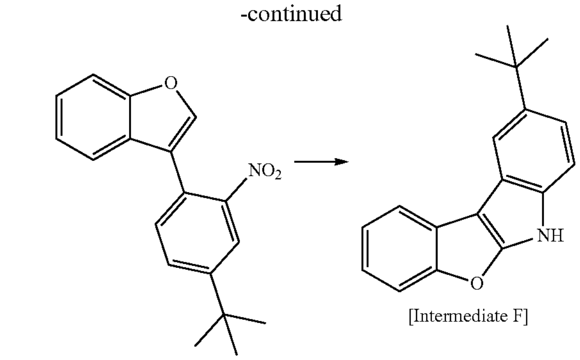

[Intermediate F]

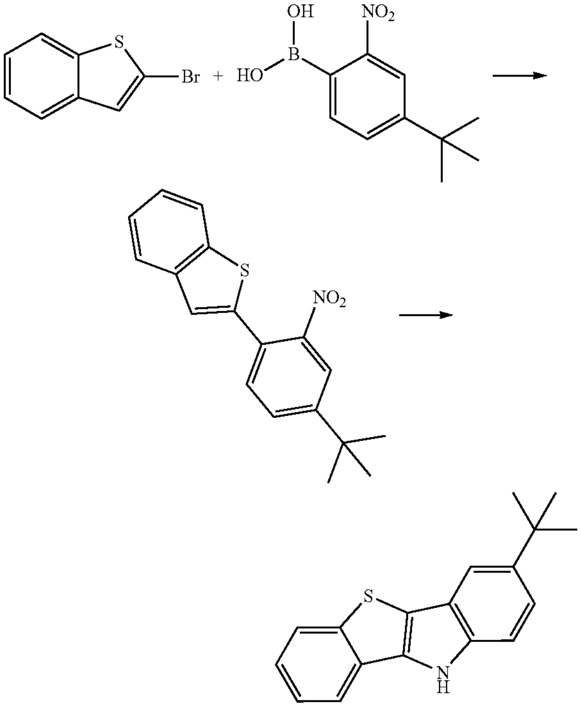

[Intermediate G]

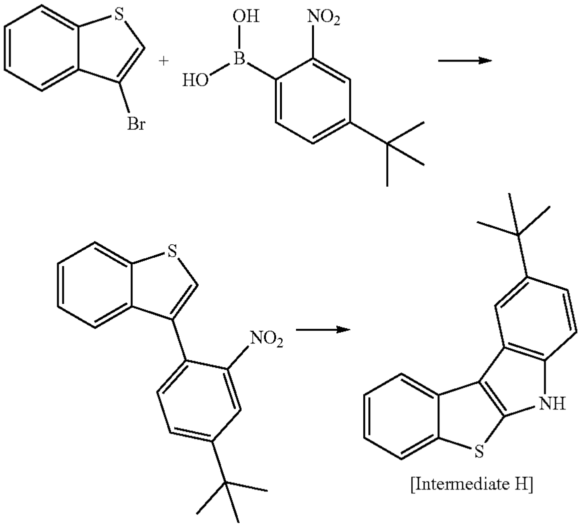

[Intermediate H]

After 40 g of 3-bromobenzofuran, 33.9 g of (2-nitrophenyl)boronic acid, 3.1 g of bis(tri-tert-butyl-phosphine)palladium(0), and 107 g of potassium phosphate were put into 600 ml of 1,4-dioxane and 300 ml of water, the resulting mixture was stirred under reflux for 8 hours. Thereafter, the resulting product was extracted, and then after the solvent was completely removed, 150 g of triphenylphosphine was put into 800 ml of 1,2-dichlorobenzene, and then the resulting mixture was stirred under reflux for 12 hours. Thereafter, the resulting product was extracted, and then column purified to obtain 35 g of Intermediate E. MS[M+H]+=208

By using the same method for Intermediates F, G, and H, 43 g of Intermediate F (MS[M+H]+=264), 35 g of Intermediate G (MS[M+H]+=280), and 36 g of Intermediate H (MS[M+H]+=280) were obtained.

Synthesis Example 2. Synthesis of Compound 2

1) Synthesis of Intermediate 1

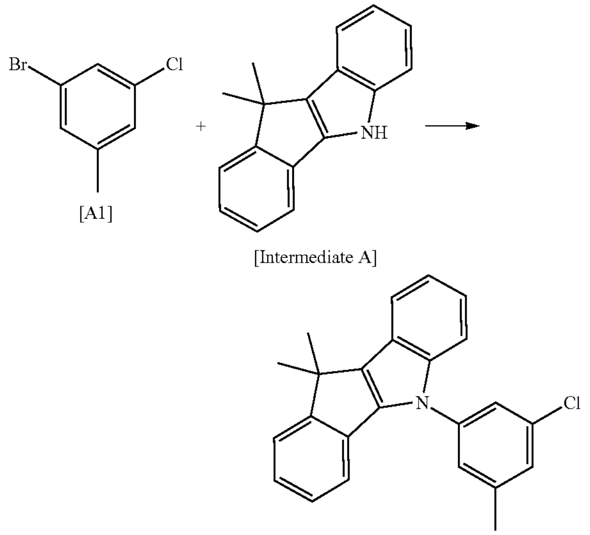

[A1]

[Intermediate A]

[Intermediate 1]

After 40 g of A1, 45.4 g of Intermediate A, 37.4 g of sodium-tert-butoxide, and 1.0 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 51 g of Intermediate 1. (yield 73%). MS[M+H]+=358

2) Synthesis of Intermediate 5

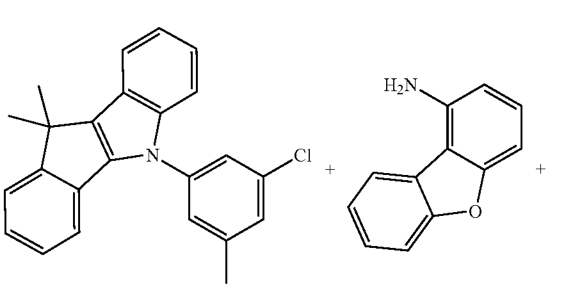

[Intermediate 1]

-continued

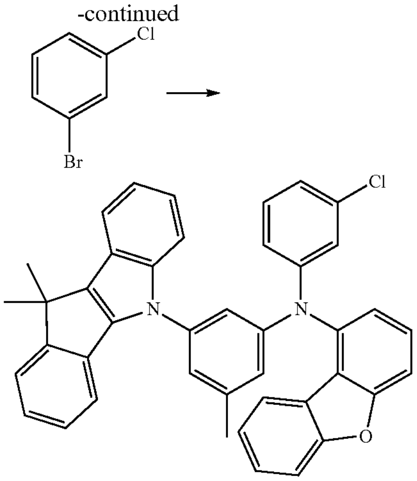

[Intermediate 5]

After 40 g of Intermediate 1, 20.5 g of dibenzo[b,d]furan-1-amine, 0.6 g of bis(tri-tert-butylphosphine)palladium(0), and 26.9 g of sodium-tert-butoxide were put into 600 ml of toluene under a nitrogen atmosphere, the resulting mixture was stirred under reflux for 1 hour. Thereafter, whether the reaction proceeded was confirmed, and then 21.4 g of 1-bromo-3-chlorobenzene was put thereinto during the stirring, and then the resulting mixture was stirred under reflux for 4 hours. After the completion of the reaction, the resulting product was extracted, and then recrystallized to obtain 49 g of Intermediate 5. (yield 71%). MS[M+H]+=616

3) Synthesis of Intermediate 6

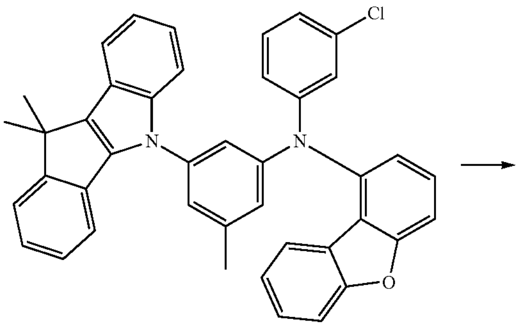

[Intermediate 5]

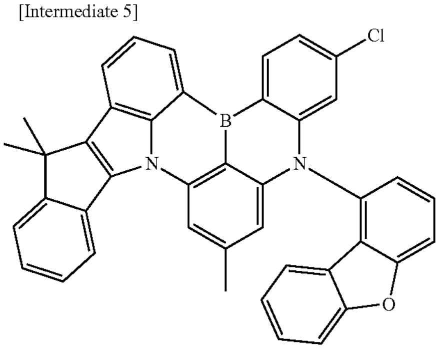

[Intermediate 6]

After 25 g of Intermediate 5 and 27.1 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.6 g of Intermediate 6. (yield 30%). MS [M+H]+=624

4) Synthesis of Compound 2

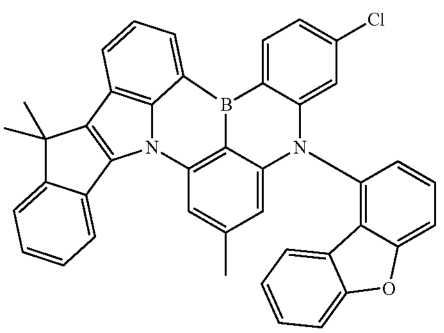

+

[Intermediate 6]

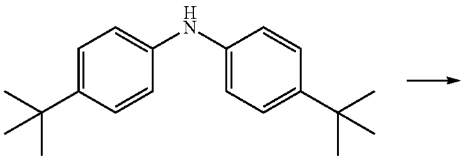

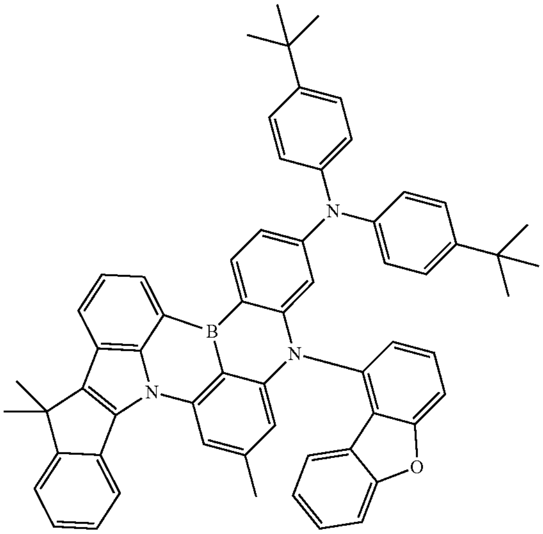

[Compound 2]

After 7 g of Intermediate 6, 3.2 g of bis(4-(tert-butyl) phenyl)amine, 2.2 g of sodium-tert-butoxide, and 0.06 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 7.3 g of Compound 2. (yield 75%). MS[M+H]+=869

Synthesis Example 3. Synthesis of Compound 3

1) Synthesis of Intermediate 7

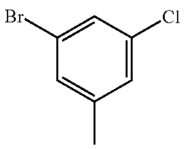

[A1]

+

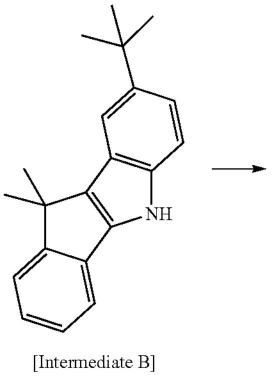

[Intermediate B]

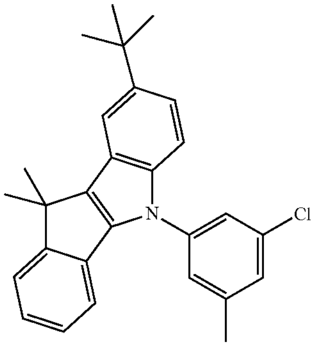

[Intermediate 7]

After 40 g of A1, 56.3 g of Intermediate B, 37.4 g of sodium-tert-butoxide, and 1.0 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 61 g of Intermediate 7. (yield 76%). MS[M+H]+=415

2) Synthesis of Intermediate 8

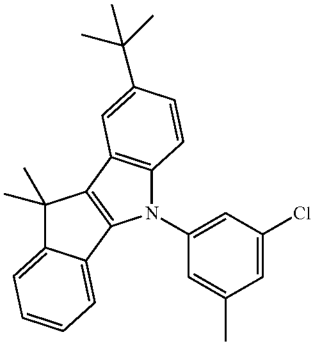

+

[Intermediate 7]

-continued

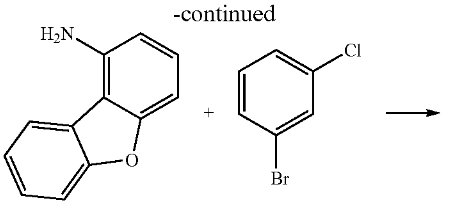

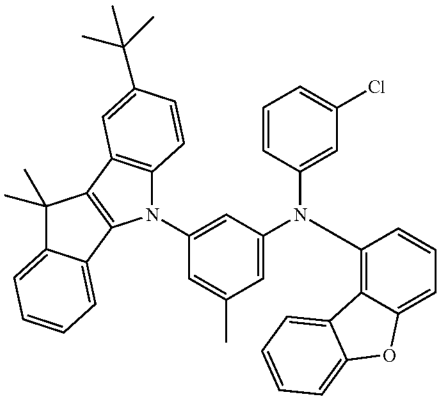

[Intermediate 8]

After 40 g of Intermediate 7, 17.7 g of dibenzo[b,d]furan-1-amine, 0.5 g of bis(tri-tert-butylphosphine)palladium(0), and 23.2 g of sodium-tert-butoxide were put into 600 ml of toluene under a nitrogen atmosphere, the resulting mixture was stirred under reflux for 1 hour. Thereafter, whether the reaction proceeded was confirmed, and then 18.5 g of 1-bromo-3-chlorobenzene was introduced thereinto during the stirring, and then the resulting mixture was stirred under reflux for 4 hours. After the completion of the reaction, the resulting product was extracted, and then recrystallized to obtain 48 g of Intermediate 8. (yield 74%). MS[M+H]+=672

3) Synthesis of Intermediate 9

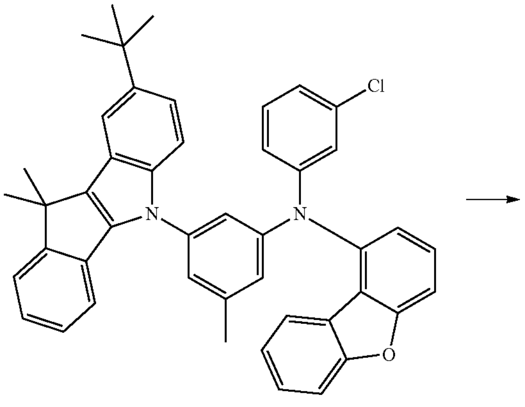

[Intermediate 8]

-continued

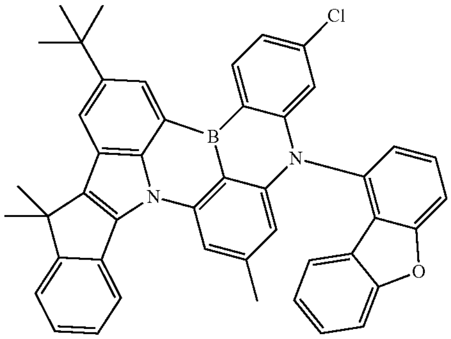

[Intermediate 9]

After 25 g of Intermediate 8 and 24.8 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.9 g of Intermediate 9. (yield 31%). MS[M+H]+=680

Synthesis of Compound 3

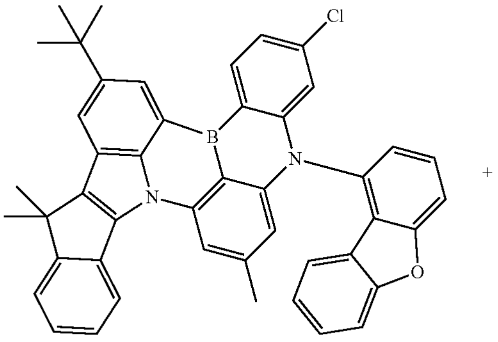

[Intermediate 9]

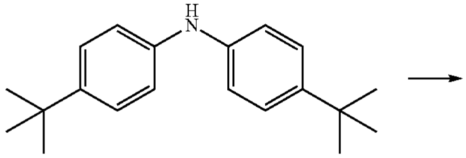

-continued

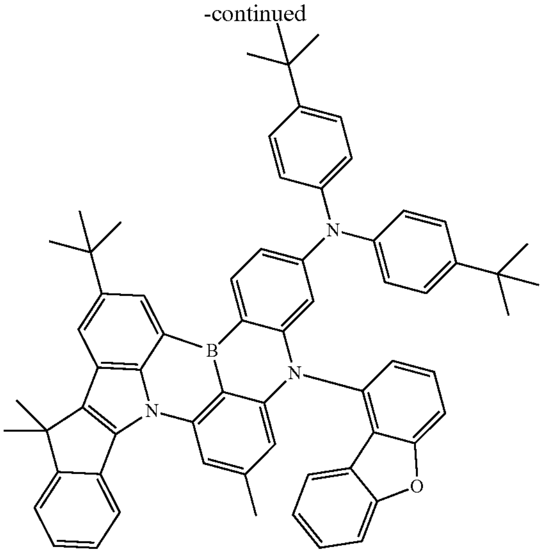

[Compound 3]

After 7 g of Intermediate 9, 2.9 g of bis(4-(tert-butyl) phenyl)amine, 2.0 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 7.5 g of Compound 3. (yield 79%). MS[M+H]+=925

Synthesis Example 4. Synthesis of Compound 4

1) Synthesis of Intermediate 10

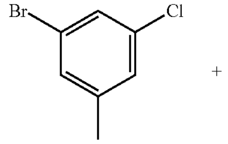

[A1]

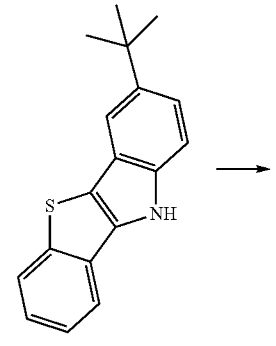

[Intermediate G]

-continued

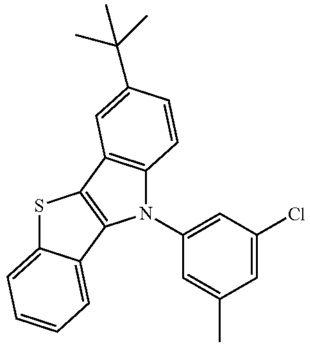

[Intermediate 10]

After 40 g of A1, 54.4 g of Intermediate G, 37.4 g of sodium-tert-butoxide, and 1.0 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 58 g of Intermediate 10. (yield 74%). MS[M+H]+=405

2) Synthesis of Intermediate 11

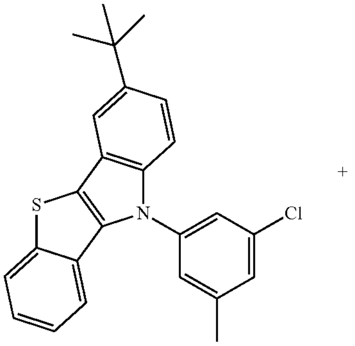

[Intermediate 10]

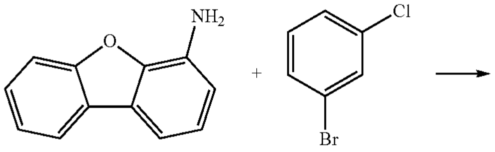

-continued

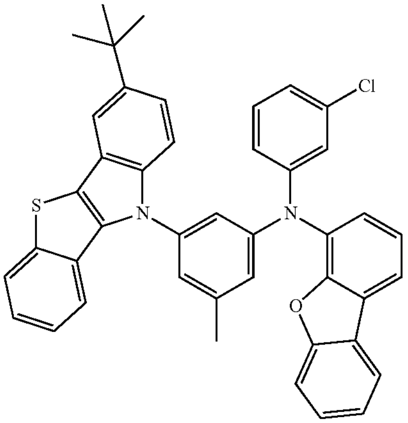

[Intermediate 11]

After 40 g of Intermediate 10, 17.7 g of dibenzo[b,d]furan-4-amine, 0.5 g of bis(tri-tert-butylphosphine)palladium(0), and 23.2 g of sodium-tert-butoxide were put into 600 ml of toluene under a nitrogen atmosphere, the resulting mixture was stirred under reflux for 1 hour. Thereafter, whether the reaction proceeded was confirmed, and then 18.5 g of 1-bromo-3-chlorobenzene was introduced thereinto during the stirring, and then the resulting mixture was stirred under reflux for 4 hours. After the completion of the reaction, the resulting product was extracted, and then recrystallized to obtain 47 g of Intermediate 11. (yield 72%). MS [M+H]+=662

3) Synthesis of Intermediate 12

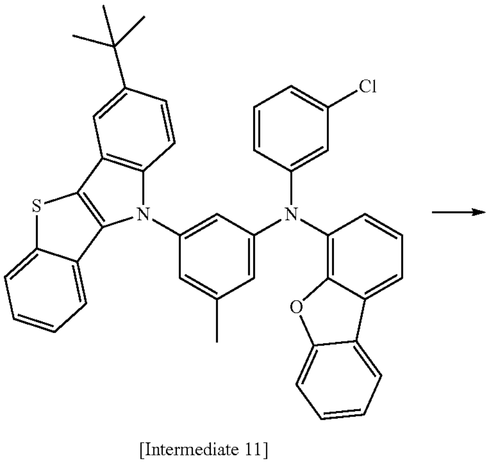

[Intermediate 11]

-continued

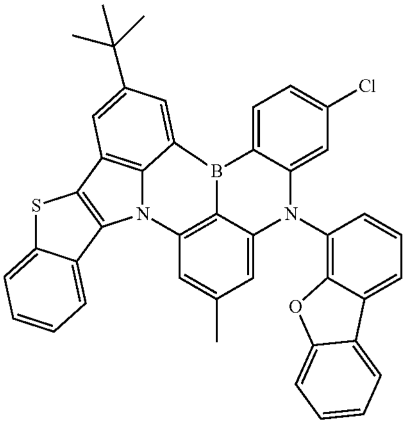

[Intermediate 12]

After 25 g of Intermediate 11 and 25.2 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.7 g of Intermediate 12. (yield 30%). MS[M+H]+=670

4) Synthesis of Compound 4

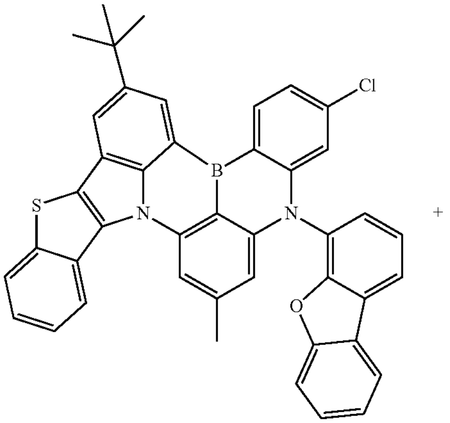

[Intermediate 12]

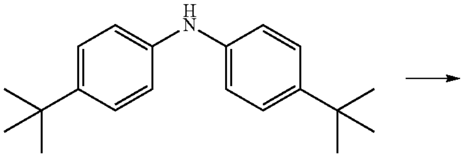

-continued

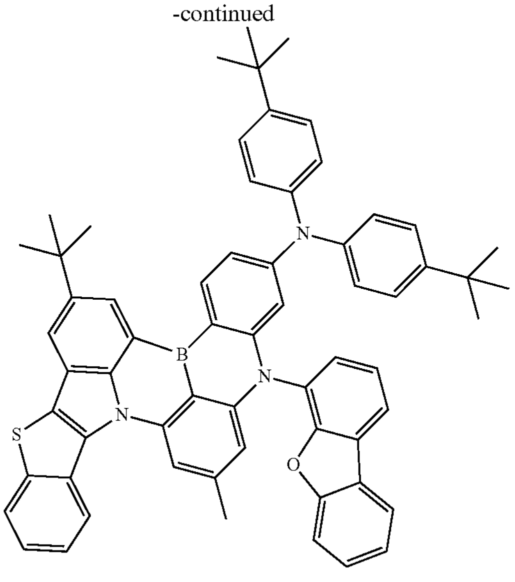

[Compound 4]

After 7 g of Intermediate 12, 3.0 g of bis(4-(tert-butyl) phenyl)amine, 2.0 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 7.3 g of Compound 4. (yield 76%). MS[M+H]+=915

Synthesis Example 5. Synthesis of Compound 5

1) Synthesis of Intermediate 13

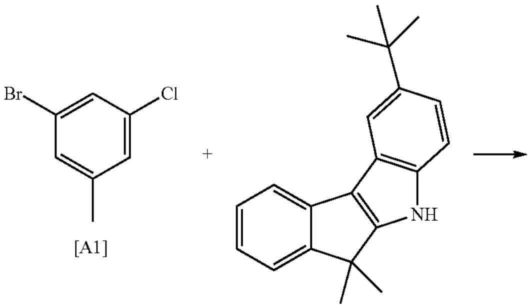

[A1]

[Intermediate D]

-continued

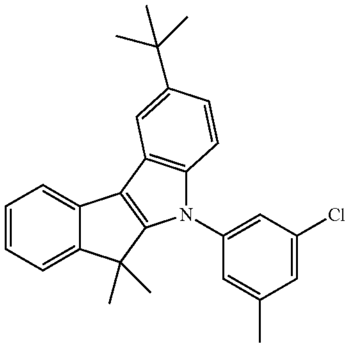

[Intermediate 13]

After 40 g of A1, 56.4 g of Intermediate D, 37.4 g of sodium-tert-butoxide, and 1.0 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 59 g of Intermediate 13. (yield 73%). MS[M+H]+=415

2) Synthesis of Intermediate 14

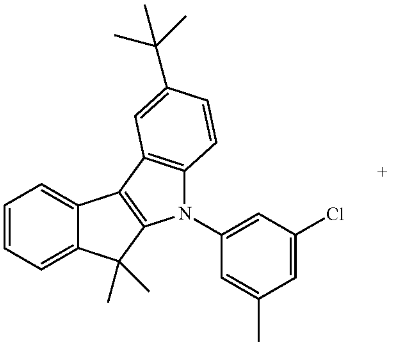

[Intermediate 13]

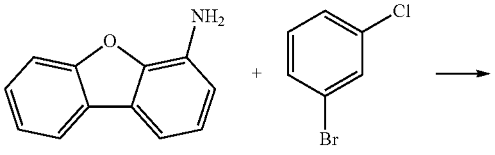

-continued

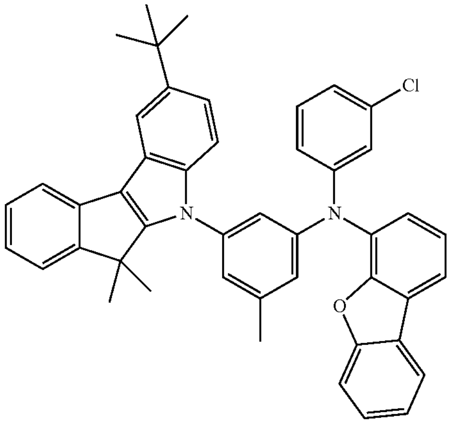

[Intermediate 14]

After 40 g of Intermediate 13, 17.7 g of dibenzo[b,d]furan-4-amine, 0.5 g of bis(tri-tert-butylphosphine)palladium(0), and 23.2 g of sodium-tert-butoxide were put into 600 ml of toluene under a nitrogen atmosphere, the resulting mixture was stirred under reflux for 1 hour. Thereafter, whether the reaction proceeded was confirmed, and then 18.5 g of 1-bromo-3-chlorobenzene was introduced thereinto during the stirring, and then the resulting mixture was stirred under reflux for 4 hours. After the completion of the reaction, the resulting product was extracted, and then recrystallized to obtain 48 g of Intermediate 14. (yield 74%). MS[M+H]+=672

3) Synthesis of Intermediate 15

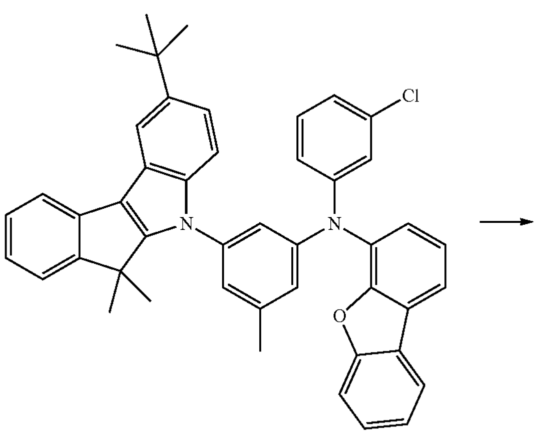

[Intermediate 14]

-continued

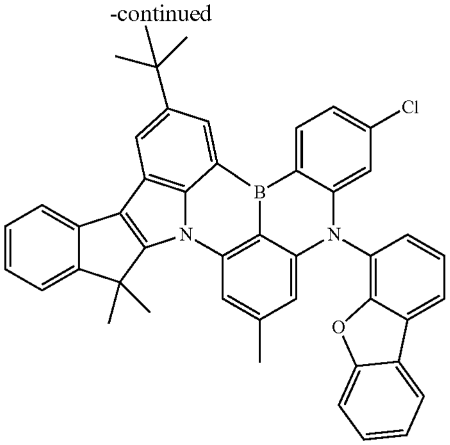

[Intermediate 15]

After 25 g of Intermediate 14 and 24.8 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.5 g of Intermediate 15. (yield 30%). MS[M+H]+=680

4) Synthesis of Compound 5

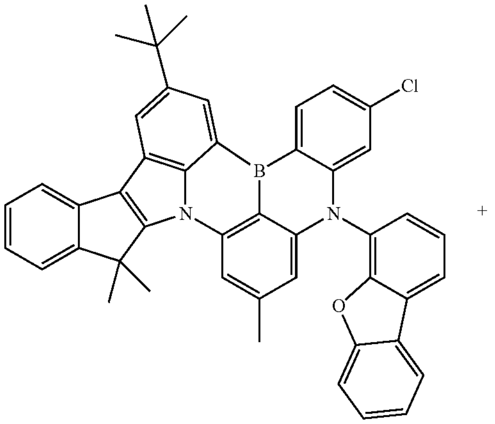

[Intermediate 15]

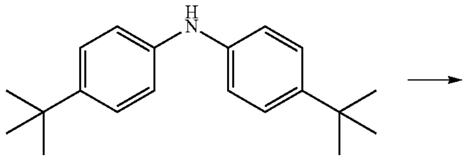

-continued

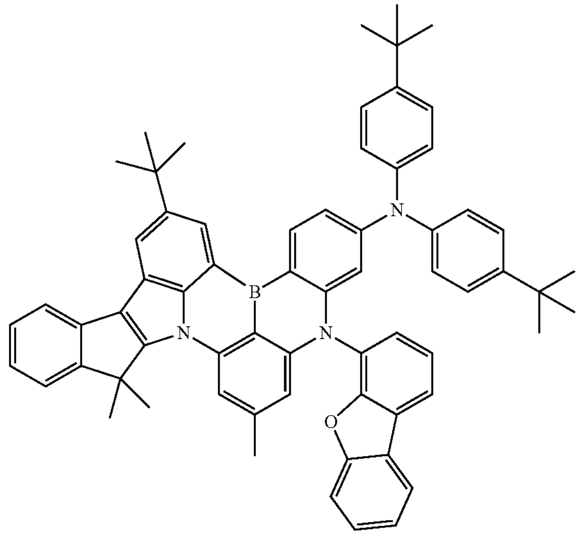

[Compound 5]

After 7 g of Intermediate 15, 2.9 g of bis(4-(tert-butyl)phenyl)amine, 2.0 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 7.6 g of Compound 5. (yield 80%). MS[M+H]+=925

Synthesis Example 6. Synthesis of Compound 6

1) Synthesis of Intermediate 16

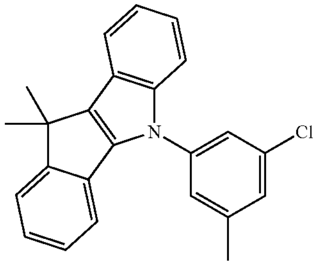

+

[Intermediate 1]

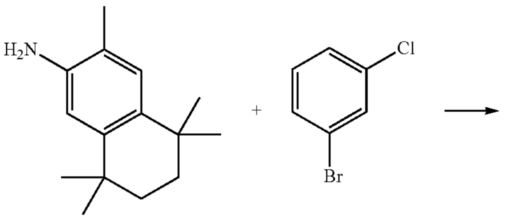

-continued

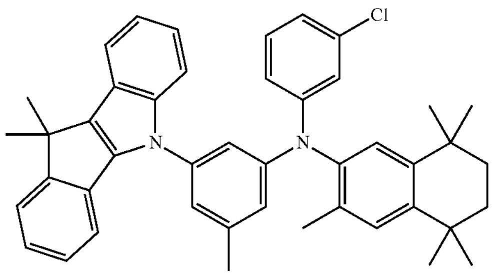

[Intermediate 16]

After 40 g of Intermediate 1, 24.3 g of 3,5,5,8,8-pentamethyl-5,6,7,8-tetrahydronaphthalen-2-amine, 0.6 g of bis(tri-tert-butylphosphine)palladium(0), and 26.9 g of sodium-tert-butoxide were put into 600 ml of toluene under a nitrogen atmosphere, the resulting mixture was stirred under reflux for 1 hour. Thereafter, whether the reaction proceeded was confirmed, and then 21.4 g of 1-bromo-3-chlorobenzene was put thereinto during the stirring, and then the resulting mixture was stirred under reflux for 4 hours. After the completion of the reaction, the resulting product was extracted, and then recrystallized to obtain 51 g of Intermediate 16. (yield 70%). MS[M+H]+=650

2) Synthesis of Intermediate 17

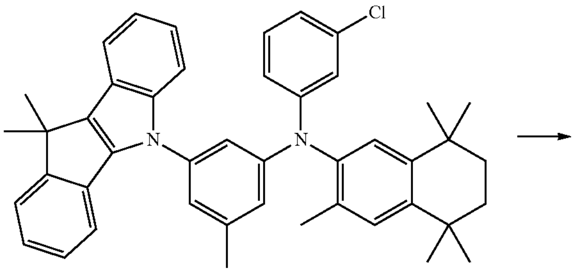

[Intermediate 16]

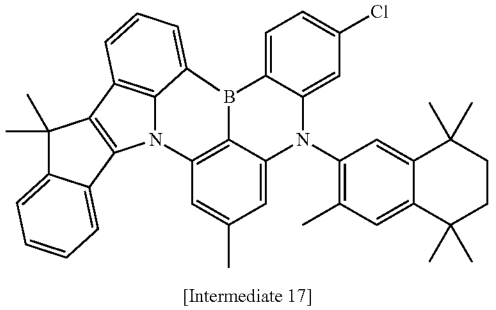

[Intermediate 17]

After 25 g of Intermediate 16 and 25.6 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.8 g of Intermediate 17. (yield 31%). MS[M+H]+=658

3) Synthesis of Compound 6

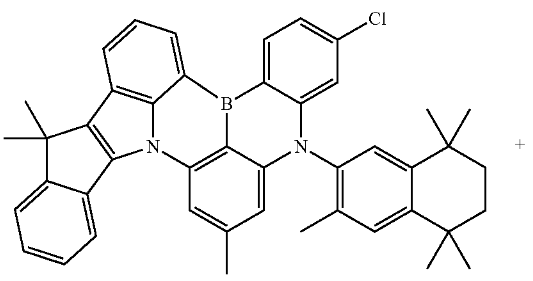

[Intermediate 17]

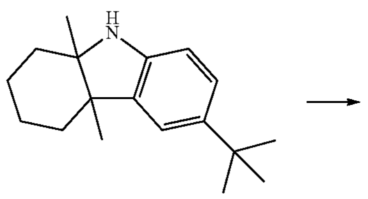

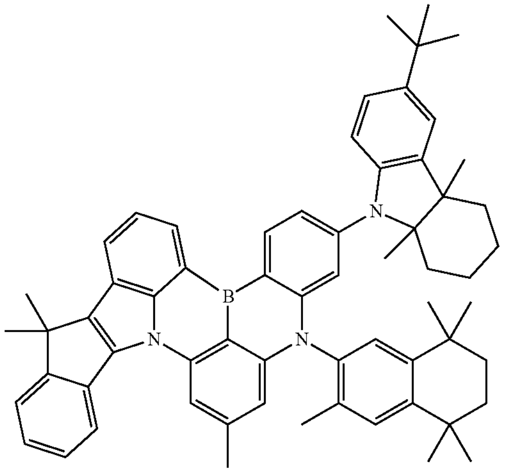

[Compound 6]

After 7 g of Intermediate 17, 2.8 g of 6-(tert-butyl)-4a, 9a-dimethyl-2,3,4,4a,9,9a-hexahydro-1H-carbazole, 2.1 g of sodium-tert-butoxide, and 0.06 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 7.5 g of Compound 6. (yield 80%). MS[M+H]+=879

Synthesis Example 7. Synthesis of Compound 7

1) Synthesis of Intermediate 18

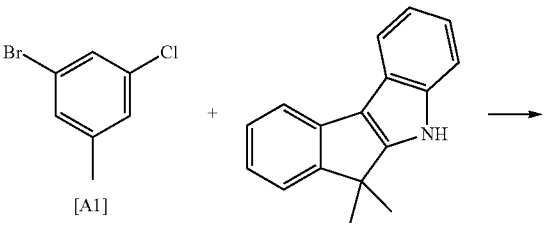

[A1]

[Intermediate C]

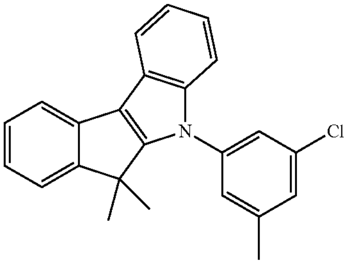

[Intermediate 18]

After 40 g of A1, 45.4 g of Intermediate C, 37.4 g of sodium-tert-butoxide, and 1.0 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 51 g of Intermediate 18. (yield 73%). MS[M+H]+=358

2) Synthesis of Intermediate 19

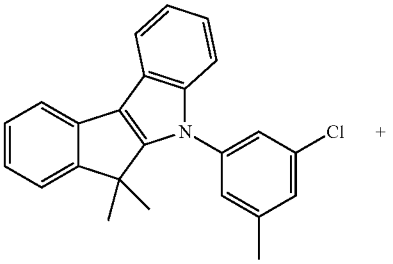

[Intermediate 18]

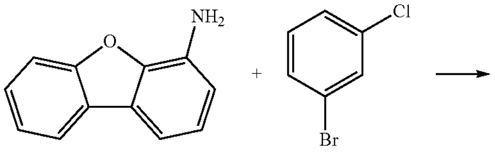

-continued

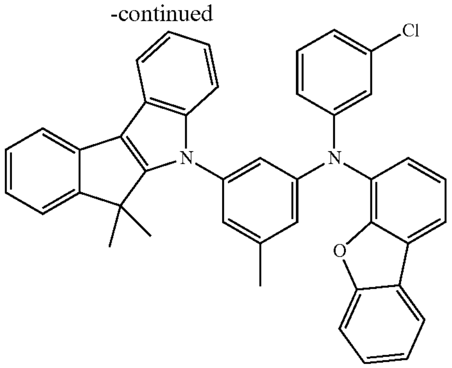

[Intermediate 19]

After 40 g of Intermediate 18, 20.5 g of dibenzo[b,d]furan-4-amine, 0.6 g of bis(tri-tert-butylphosphine)palladium(0), and 26.8 g of sodium-tert-butoxide were put into 600 ml of toluene under a nitrogen atmosphere, the resulting mixture was stirred under reflux for 1 hour. Thereafter, whether the reaction proceeded was confirmed, and then 21.4 g of 1-bromo-3-chlorobenzene was put thereinto during the stirring, and then the resulting mixture was stirred under reflux for 4 hours. After the completion of the reaction, the resulting product was extracted, and then recrystallized to obtain 52 g of Intermediate 19. (yield 76%). MS[M+H]+=616

3) Synthesis of Intermediate 20

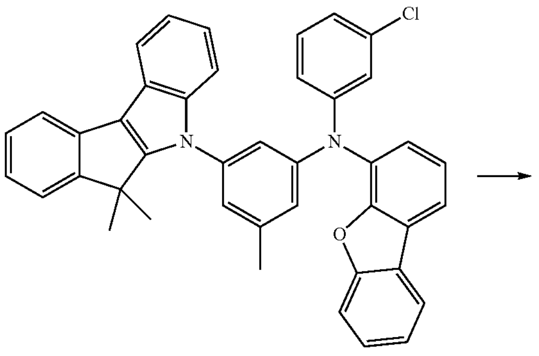

[Intermediate 19]

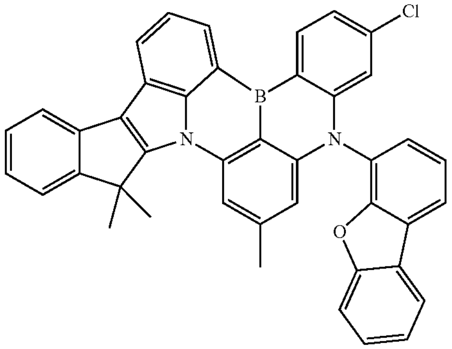

[Intermediate 20]

After 25 g of Intermediate 19 and 27.1 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.8 g of Intermediate 20. (yield 31%). MS[M+H]+=624

4) Synthesis of Compound 7

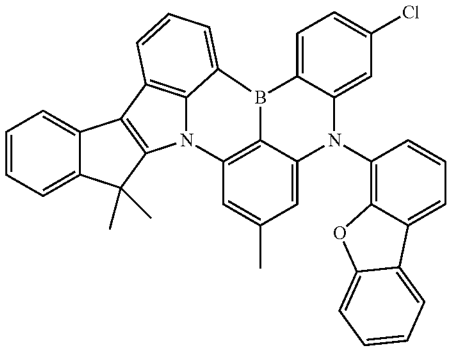

+

[Intermediate 20]

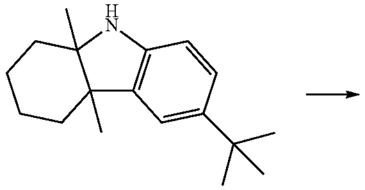

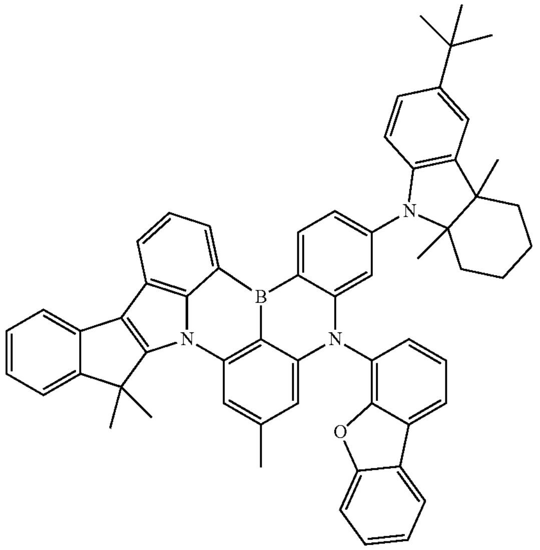

[Compound 7]

After 7 g of Intermediate 20, 2.9 g of 6-(tert-butyl)-4a,9a-dimethyl-2,3,4,4a,9,9a-hexahydro-1H-carbazole, 2.2 g of sodium-tert-butoxide, and 0.06 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 7.4 g of Compound 7. (yield 78%). MS[M+H]+=845

Synthesis Example 9. Synthesis of Compound 9

1) Synthesis of Intermediate 23

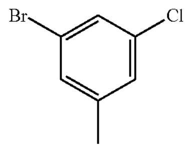

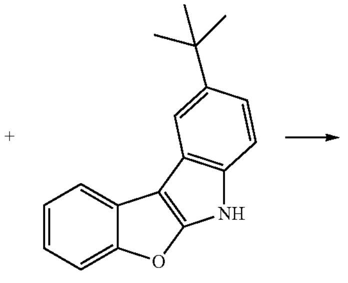

[A1]

[Intermediate F]

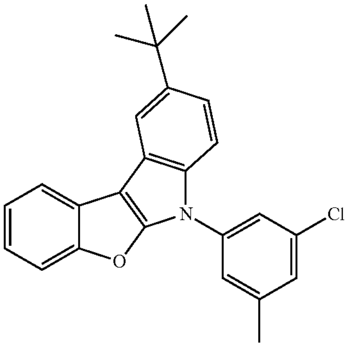

[Intermediate 23]

After 40 g of A1, 51.3 g of Intermediate F, 37.4 g of sodium-tert-butoxide, and 1.0 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 57 g of Intermediate 23. (yield 75%). MS[M+H]+=389

2) Synthesis of Intermediate 24

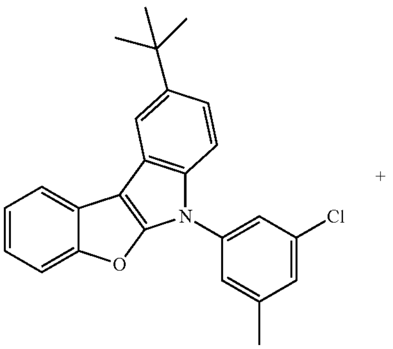

[Intermediate 23]

-continued

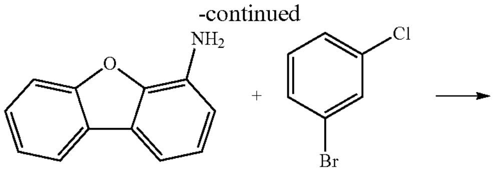

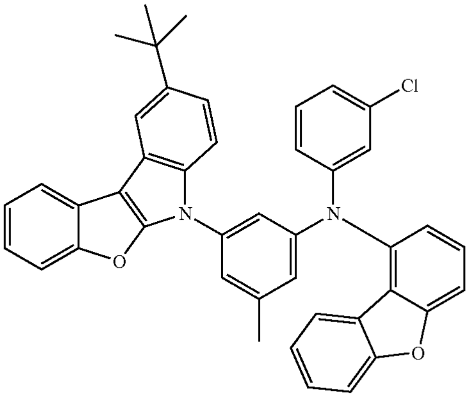

[Intermediate 24]

After 40 g of Intermediate 23, 18.9 g of dibenzo[b,d]furan-4-amine, 0.6 g of bis(tri-tert-butylphosphine)palladium(0), and 24.8 g of sodium-tert-butoxide were put into 600 ml of toluene under a nitrogen atmosphere, the resulting mixture was stirred under reflux for 1 hour. Thereafter, whether the reaction proceeded was confirmed, and then 25.5 g of 1-bromo-3-chlorobenzene was introduced thereinto during the stirring, and then the resulting mixture was stirred under reflux for 4 hours. After the completion of the reaction, the resulting product was extracted, and then recrystallized to obtain 52 g of Intermediate 24. (yield 78%). MS[M+H]+=646

3) Synthesis of Intermediate 25

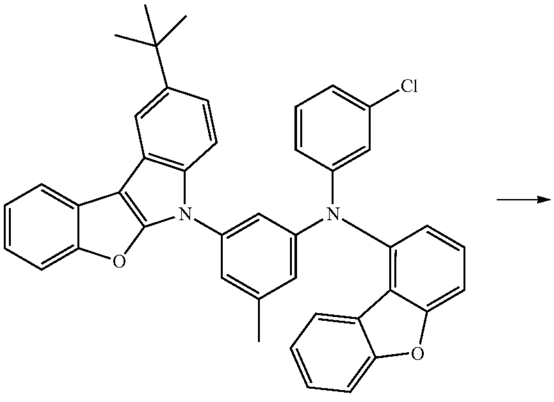

[Intermediate 24]

-continued

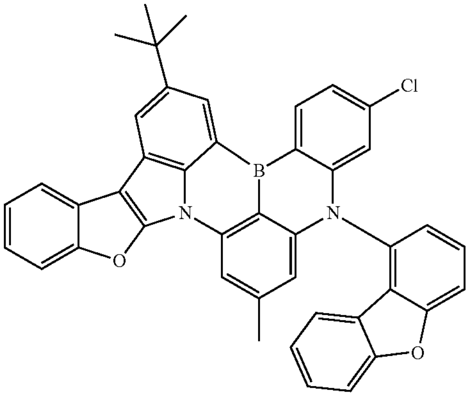

[Intermediate 25]

After 25 g of Intermediate 24 and 25.8 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.7 g of Intermediate 25. (yield 30%). MS[M+H]+=654

4) Synthesis of Compound 9

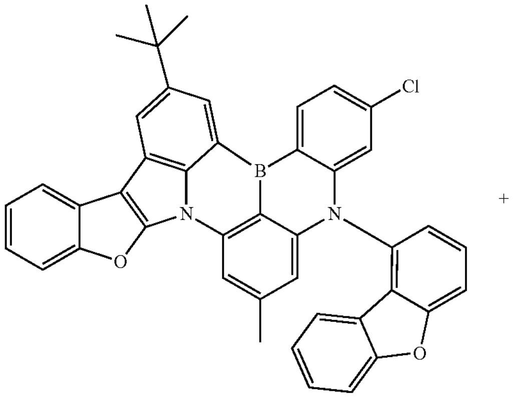

[Intermediate 25]

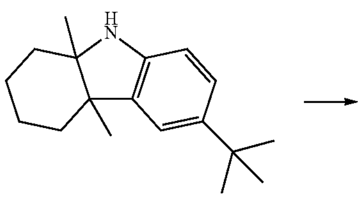

-continued

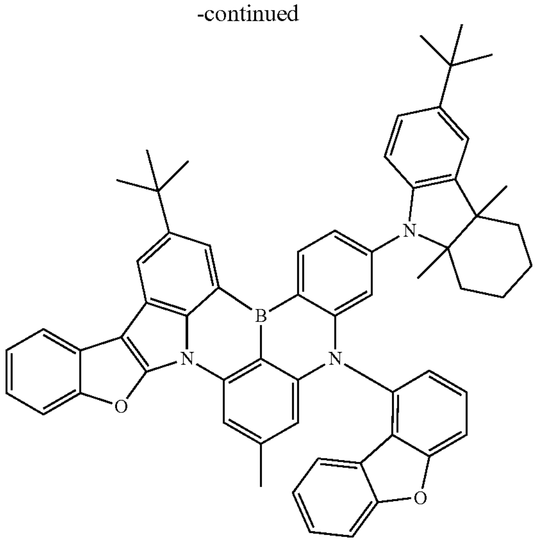

[Compound 9]

After 7 g of Intermediate 25, 2.8 g of 6-(tert-butyl)-4a,9a-dimethyl-2,3,4,4a,9,9a-hexahydro-1H-carbazole, 2.1 g of sodium-tert-butoxide, and 0.06 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 7.1 g of Compound 9. (yield 76%). MS[M+H]+=875

Synthesis Example 11. Synthesis of Compound 11

1) Synthesis of Intermediate 26

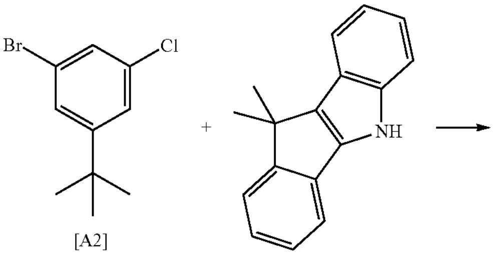

[A2]

[Intermediate A]

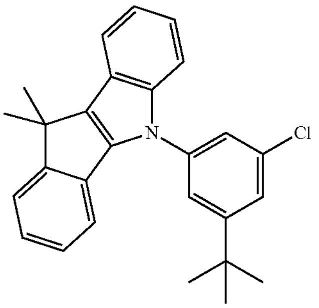

[Intermediate 26]

After 40 g of A2, 37.7 g of Intermediate A, 31.1 g of sodium-tert-butoxide, and 0.9 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 49 g of Intermediate 26. (yield 76%). MS[M+H]+=401

2) Synthesis of Intermediate 29

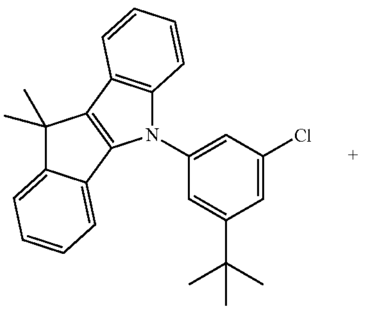

[Intermediate 26]

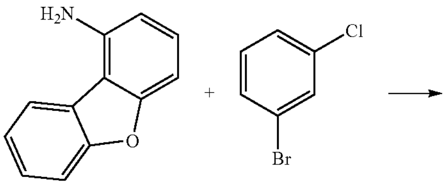

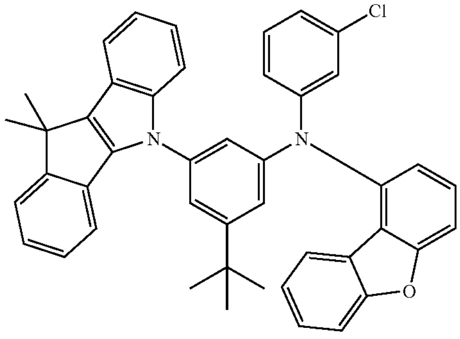

[Intermediate 29]

After 40 g of Intermediate 26, 18.3 g of dibenzo[b,d]furan-1-amine, 0.5 g of bis(tri-tert-butylphosphine)palladium(0), and 24.1 g of sodium-tert-butoxide were put into 600 ml of toluene under a nitrogen atmosphere, the resulting mixture was stirred under reflux for 1 hour. Thereafter, whether the reaction proceeded was confirmed, and then 19.2 g of 1-bromo-3-chlorobenzene was introduced thereinto during the stirring, and then the resulting mixture was stirred under reflux for 4 hours. After the completion of the reaction, the resulting product was extracted, and then recrystallized to obtain 51 g of Intermediate 29. (yield 78%). MS[M+H]+=658

3) Synthesis of Intermediate 30

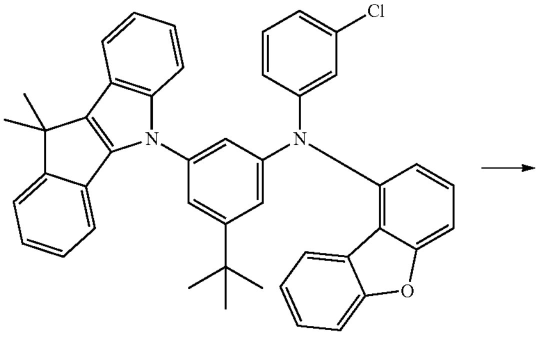

[Intermediate 29]

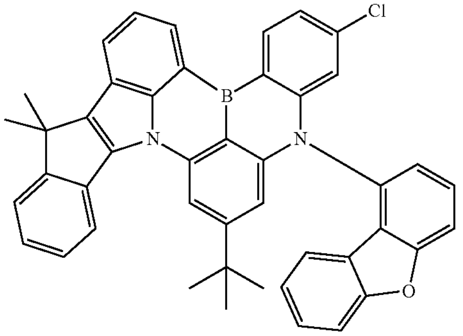

[Intermediate 30]

After 25 g of Intermediate 29 and 25.3 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.7 g of Intermediate 30. (yield 30%). MS[M+H]+=666

4) Synthesis of Compound 11

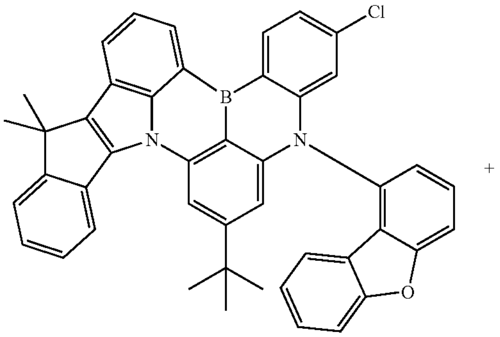

[Intermediate 30]

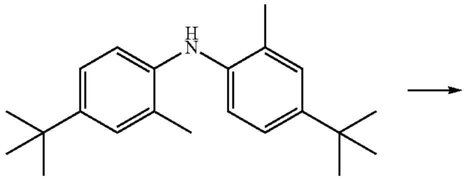

-continued

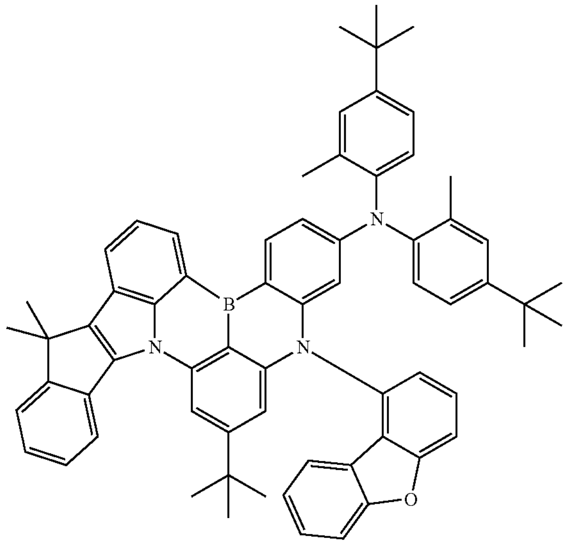

[Compound 11]

After 7 g of Intermediate 30, 3.3 g of bis(4-(tert-butyl)-2-methylphenyl)amine, 2.0 g of sodium-tert-butoxide, and 0.05 g of bis(tri-tert-butylphosphine)-palladium(0) were put into 100 ml of toluene under a nitrogen atmosphere, the resulting mixture was stirred under reflux for 6 hours. After the completion of the reaction, the resulting product was extracted, and then recrystallized to obtain 7.5 g of Compound 11. (yield 76%). MS[M+H]+=939

Synthesis Example 12. Synthesis of Compound 12

1) Synthesis of Intermediate 31

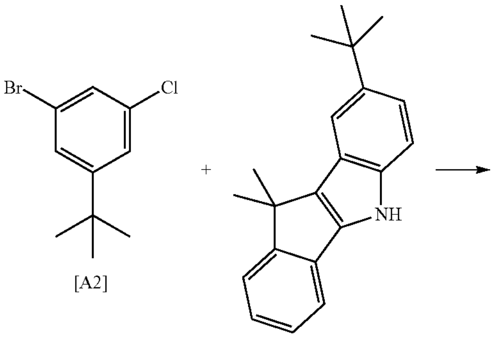

[A2]

[Intermediate B]

-continued

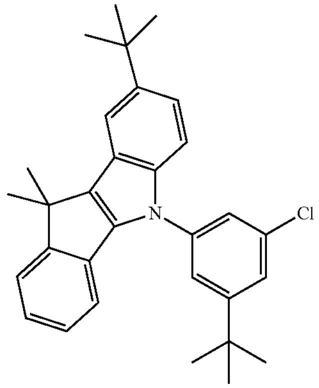

[Intermediate 31]

After 40 g of A2, 46.8 g of Intermediate B, 31.1 g of sodium-tert-butoxide, and 0.9 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 52 g of Intermediate 31. (yield 71%). MS[M+H]+=457

2) Synthesis of Intermediate 32

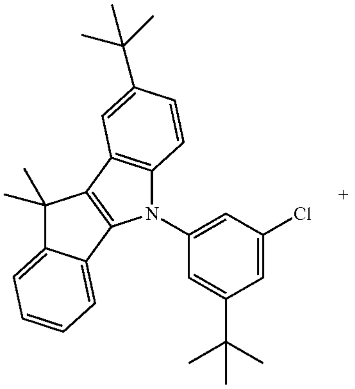

[Intermediate 31]

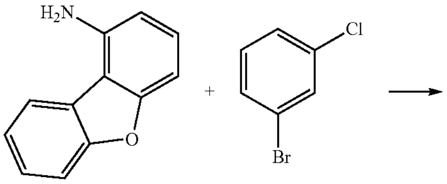

-continued

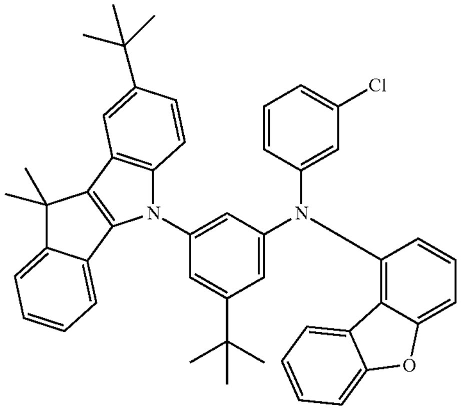

[Intermediate 32]

After 40 g of Intermediate 31, 16.1 g of dibenzo[b,d]furan-1-amine, 0.5 g of bis(tri-tert-butylphosphine)palladium(0), and 21.1 g of sodium-tert-butoxide were put into 600 ml of toluene under a nitrogen atmosphere, the resulting mixture was stirred under reflux for 1 hour. Thereafter, whether the reaction proceeded was confirmed, and then 16.8 g of 1-bromo-3-chlorobenzene was introduced thereinto during the stirring, and then the resulting mixture was stirred under reflux for 4 hours. After the completion of the reaction, the resulting product was extracted, and then recrystallized to obtain 50 g of Intermediate 32. (yield 80%). MS[M+H]+=714

3) Synthesis of Intermediate 33

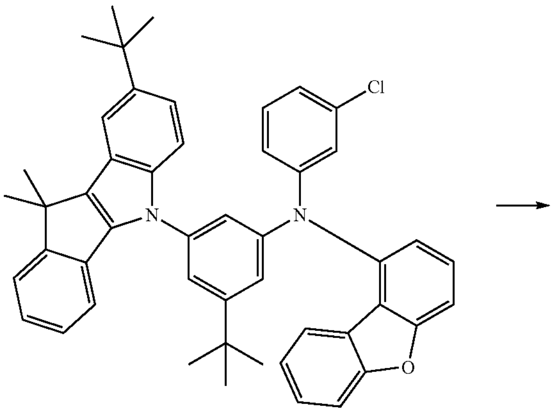

[Intermediate 32]

-continued

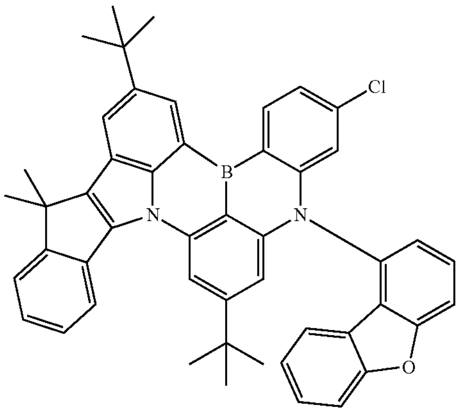

[Intermediate 33]

After 25 g of Intermediate 32 and 22.3 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.4 g of Intermediate 33. (yield 29%). MS[M+H]+=722

4) Synthesis of Compound 12

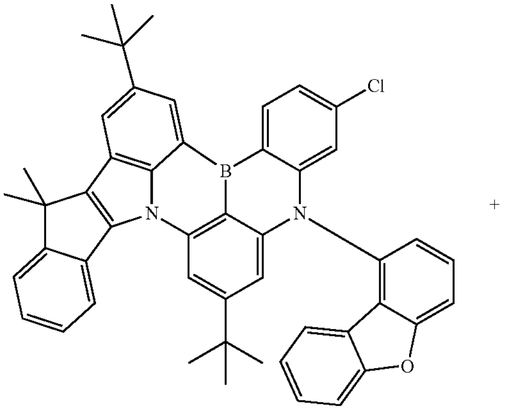

[Intermediate 33]

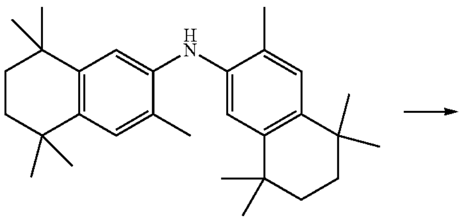

-continued

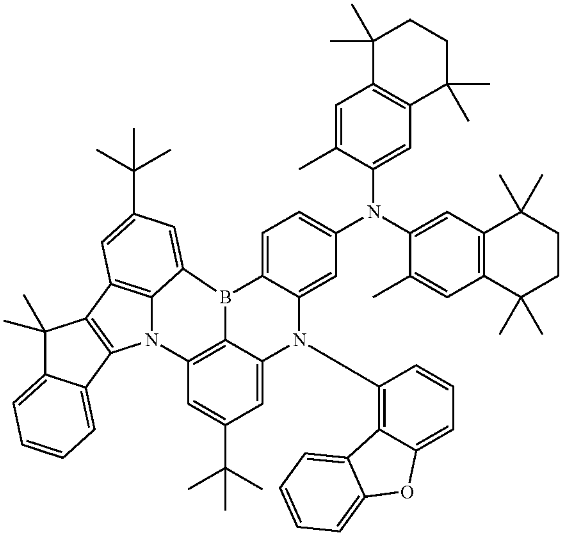

[Compound 12]

After 7 g of Intermediate 33, 4.1 g of bis(3,5,5,8,8-pentamethyl-5,6,7,8-tetrahydronaphthalen-2-yl)amine, 1.8 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 7.7 g of Compound 12. (yield 72%). MS[M+H]+=1103

Synthesis Example 16. Synthesis of Compound 16

1) Synthesis of Intermediate 34

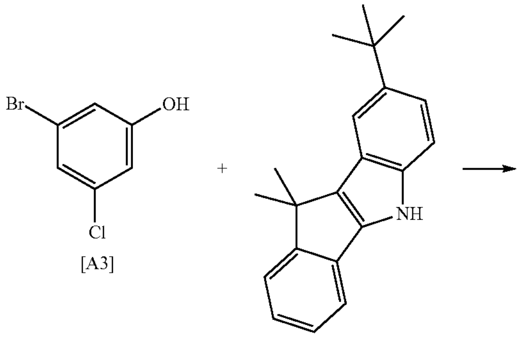

[A3]

[Intermediate B]

-continued

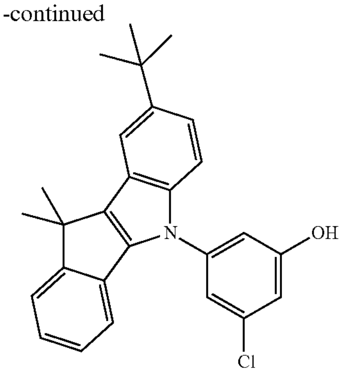

[Intermediate 34]

After 40 g of 3-bromo-5-chlorophenol (A3), 55.8 g of Intermediate B, 55.6 g of sodium-tert-butoxide, and 1 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 58 g of Intermediate 34. (yield 72%). MS[M+H]+=417

2) Synthesis of Intermediate 35

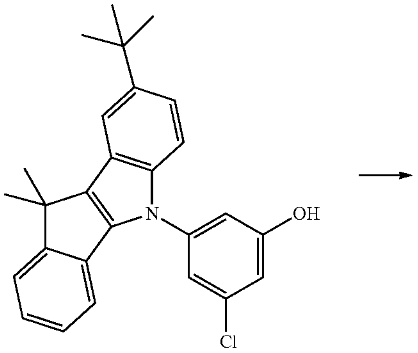

[Intermediate 34]

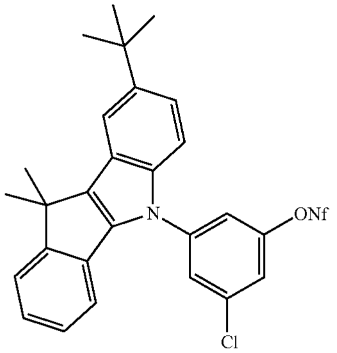

[Intermediate 35]

After 40 g of intermediate 34, 26 ml of 1,1,2,2,3,3,4,4,4-nonafluorobutane-1-sulfonyl fluoride, and 40 g of potassium carbonate were put into 400 ml of tetrahydrofuran and 200 ml of water, the resulting mixture was reacted for 3 hours, and then the resulting product was extracted after the completion of the reaction, and then the solution was removed to obtain 64 g of Intermediate 35. (yield 95%). MS[M+H]+=699

3) Synthesis of Intermediate 42

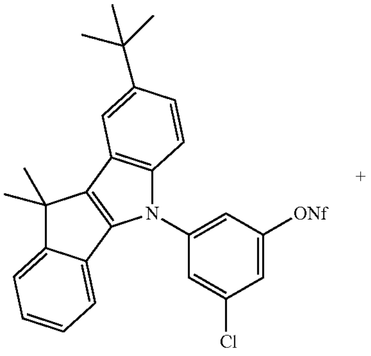

[Intermediate 35]

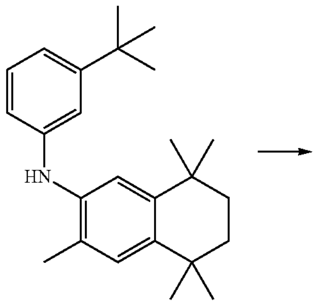

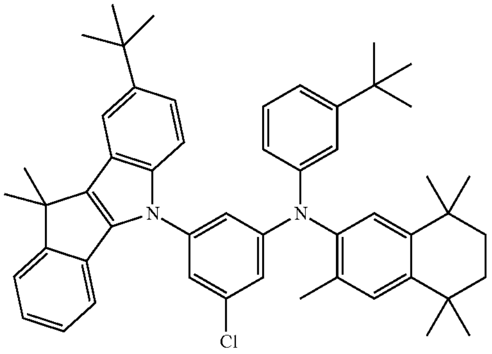

[Intermediate 42]

After 40 g of Intermediate 35, 20.1 g of N-(3-(tert-butyl) phenyl)-3,5,5,8,8-pentamethyl-5,6,7,8-tetrahydronaphthalen-2-amine, 1.0 g of $Pd(dba)_2$, 1.6 g of Xphos, and 56 g of cesium carbonate were put into 500 ml of xylene under a nitrogen atmosphere, the resulting mixture was stirred under reflux for 24 hours. After the completion of the reaction, the resulting product was extracted, and then recrystallized to obtain 33 g of Intermediate 42 (yield 77%). MS[M+H]+=748

4) Synthesis of Intermediate 43

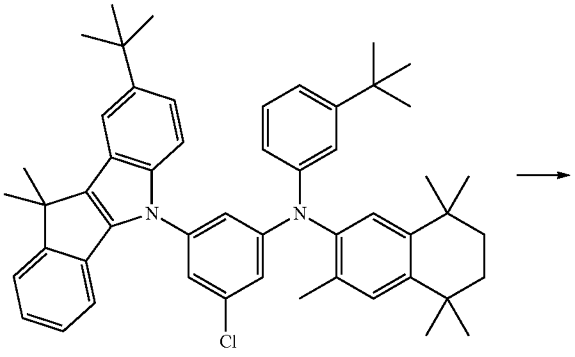

[Intermediate 42]

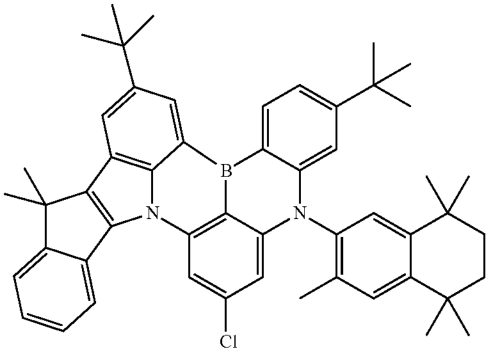

[Intermediate 43]

After 25 g of Intermediate 42 and 22.3 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.1 g of Intermediate 43. (yield 28%). MS[M+H]+=756

5) Synthesis of Compound 16

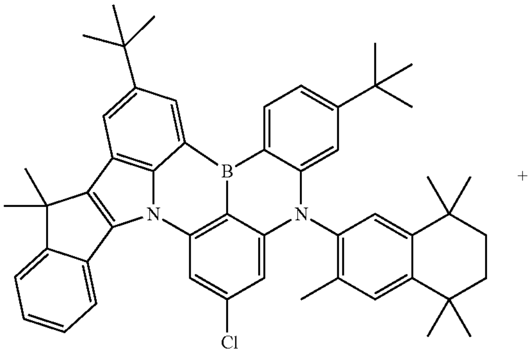

[Intermediate 43]

-continued

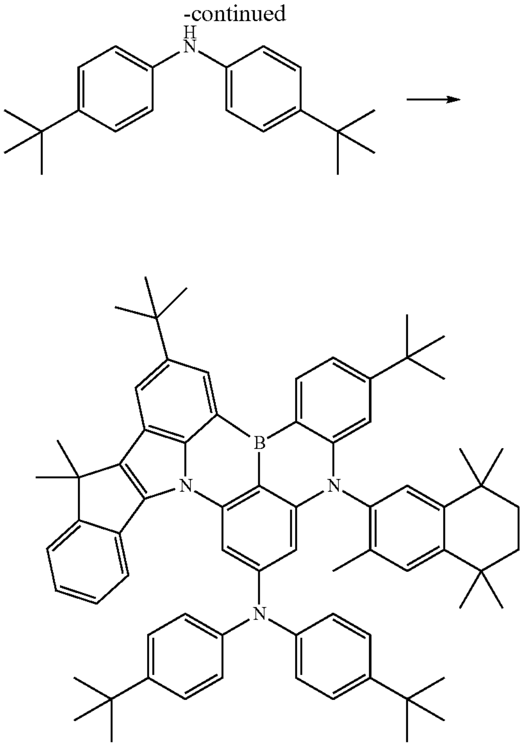

[Compound 16]

After 7 g of Intermediate 43, 2.6 g of bis(4-(tert-butyl) phenyl)amine, 1.8 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.6 g of Compound 16. (yield 71%). MS[M+H]+=1001

Synthesis Example 17. Synthesis of Compound 17

1) Synthesis of Intermediate 44

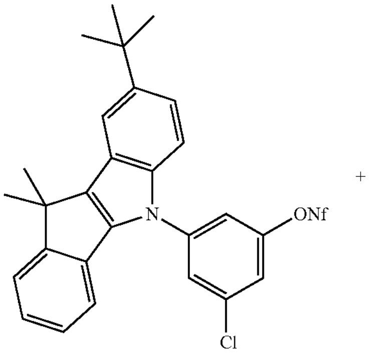

[Intermediate 35]

-continued

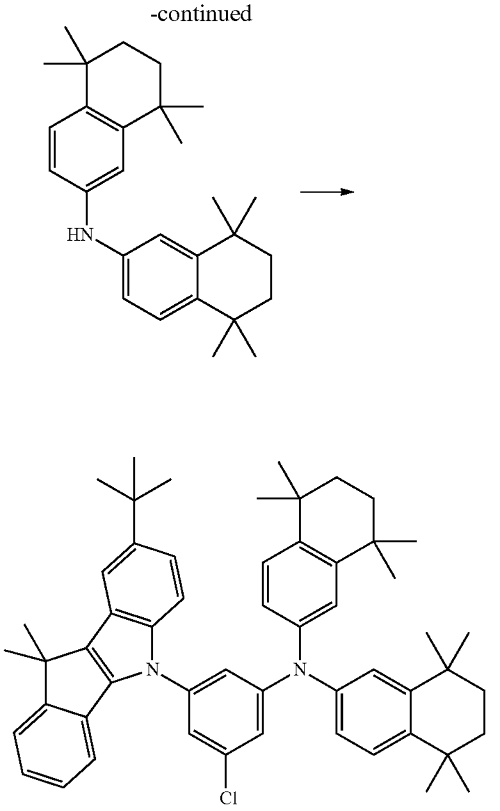

[Intermediate 44]

After 40 g of Intermediate 35, 22.3 g of bis(5,5,8,8-tetramethyl-5,6,7,8-tetrahydronaphthalen-2-yl)amine, 1.0 g of $Pd(dba)_2$, 1.6 g of Xphos, and 56 g of cesium carbonate were put into 500 ml of xylene under a nitrogen atmosphere, the resulting mixture was stirred under reflux for 24 hours. After the completion of the reaction, the resulting product was extracted, and then recrystallized to obtain 34 g of Intermediate 44 (yield 75%). MS[M+H]+=788

2) Synthesis of Intermediate 45

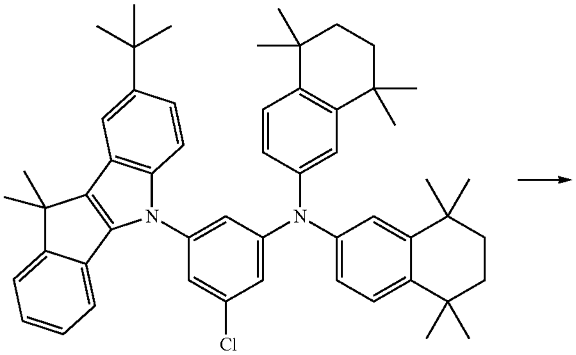

[Intermediate 44]

-continued

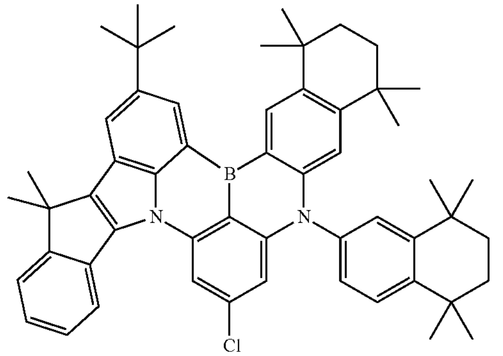

[Intermediate 45]

After 25 g of Intermediate 44 and 21.1 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.5 g of Intermediate 45. (yield 30%). MS[M+H]+=796

3) Synthesis of Compound 17

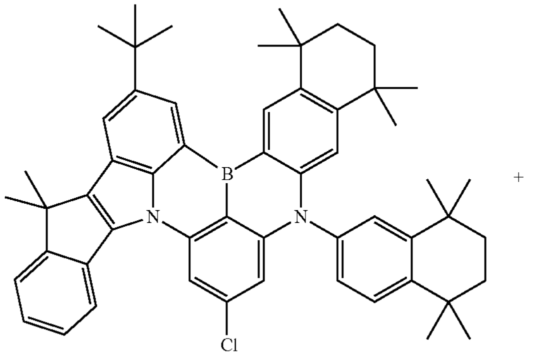

[Intermediate 45]

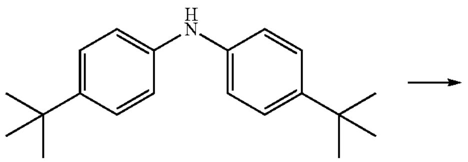

-continued

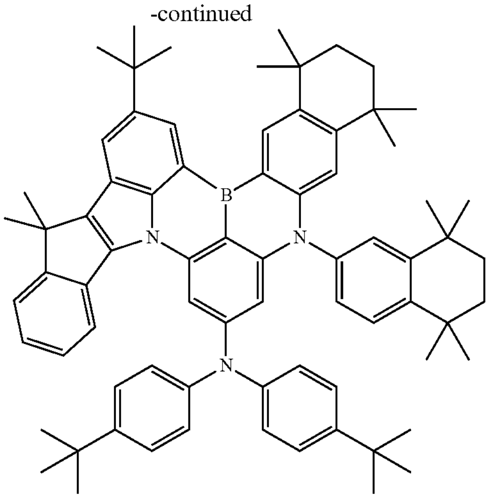

[Compound 17]

After 7 g of Intermediate 45, 2.5 g of bis(4-(tert-butyl)phenyl)amine, 1.7 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.7 g of Compound 17. (yield 73%). MS[M+H]+=1041

Synthesis Example 19. Synthesis of Compound 19

1) Synthesis of Intermediate 48

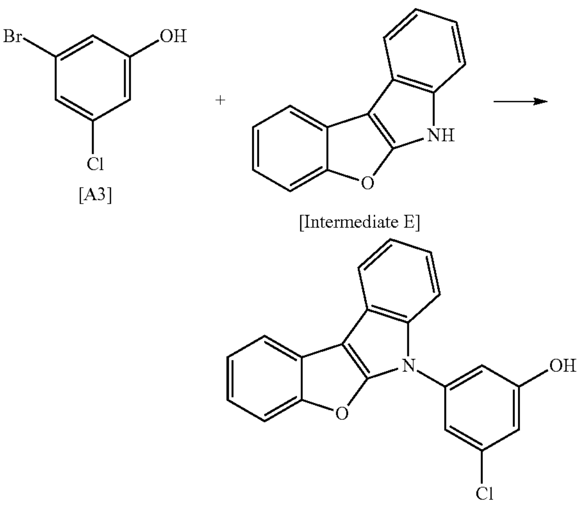

[A3]

[Intermediate E]

[Intermediate 48]

After 40 g of 3-bromo-5-chlorophenol (A3), 40 g of Intermediate E, 55.6 g of sodium-tert-butoxide, and 1 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 46 g of Intermediate 48. (yield 72%). MS[M+H]+=334

2) Synthesis of Intermediate 49

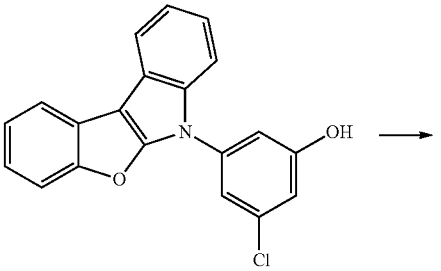

[Intermediate 48]

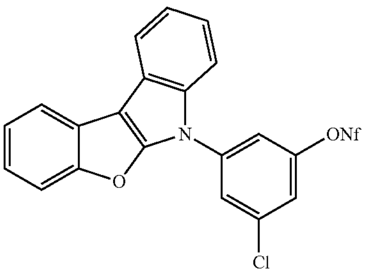

[Intermediate 49]

After 40 g of intermediate 48, 32 ml of 1,1,2,2,3,3,4,4,4-nonafluorobutane-1-sulfonyl fluoride, and 50 g of potassium carbonate were put into 400 ml of tetrahydrofuran and 200 ml of water, the resulting mixture was reacted for 3 hours, and then the resulting product was extracted after the completion of the reaction, and then the solution was removed to obtain 69 g of Intermediate 49. (yield 93%). MS[M+H]+=616

3) Synthesis of Intermediate 50

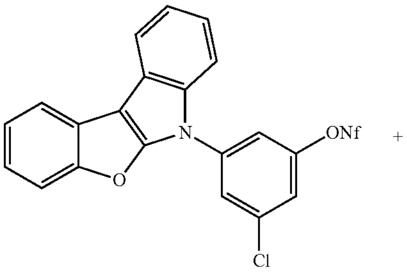

[Intermediate 49]

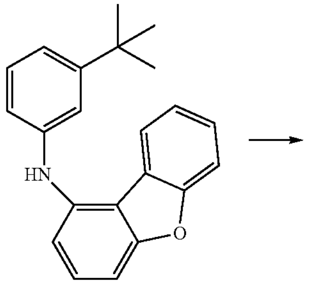

-continued

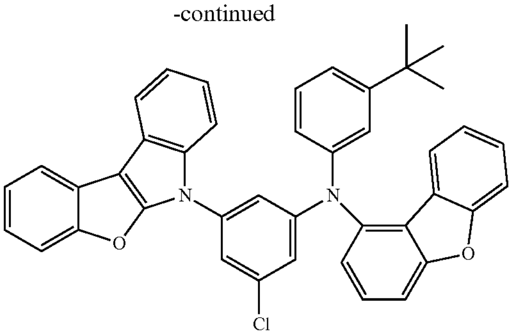

[Intermediate 50]

After 40 g of Intermediate 49, 20.5 g of N-(3-(tert-butyl)phenyl)dibenzo[b,d]furan-1-amine, 1.2 g of $Pd(dba)_2$, 1.9 g of Xphos, and 64 g of cesium carbonate were put into 500 ml of xylene under a nitrogen atmosphere, the resulting mixture was stirred under reflux for 24 hours. After the completion of the reaction, the resulting product was extracted, and then recrystallized to obtain 33 g of Intermediate 50 (yield 80%). MS[M+H]+=632

4) Synthesis of Intermediate 51

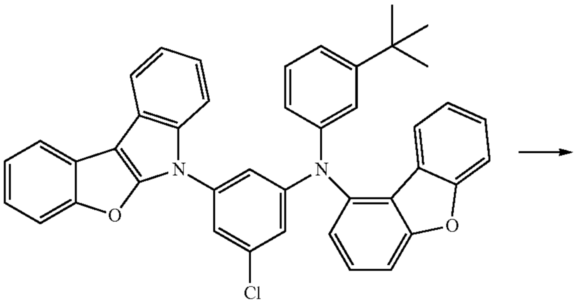

[Intermediate 50]

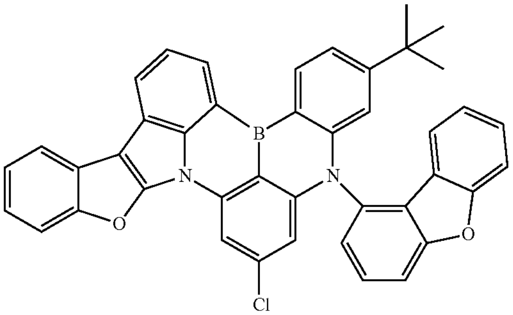

[Intermediate 51]

After 25 g of Intermediate 50 and 26.4 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.5 g of Intermediate 51. (yield 30%). MS[M+H]+=640

5) Synthesis of Compound 19

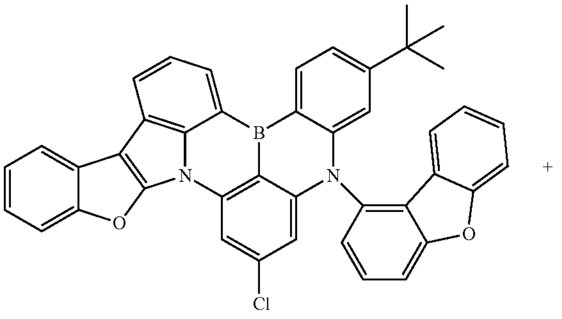

[Intermediate 51]

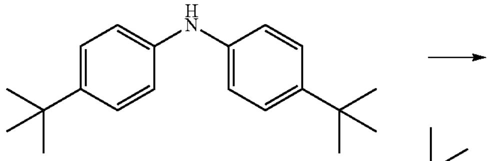

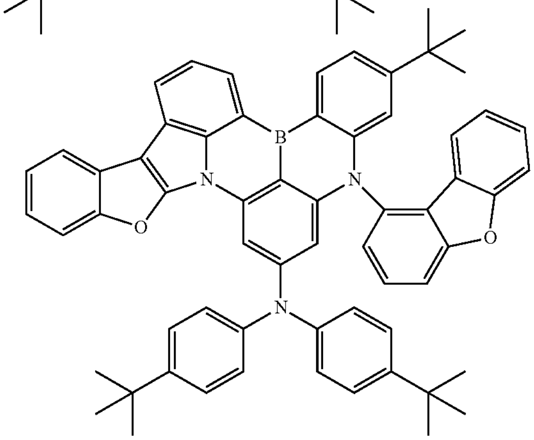

[Compound 19]

After 7 g of Intermediate 51, 3.1 g of bis(4-(tert-butyl) phenyl)amine, 2.1 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.9 g of Compound 19. (yield 71%). MS[M+H]+=885

Synthesis Example 20. Synthesis of Compound 20

1) Synthesis of Intermediate 52

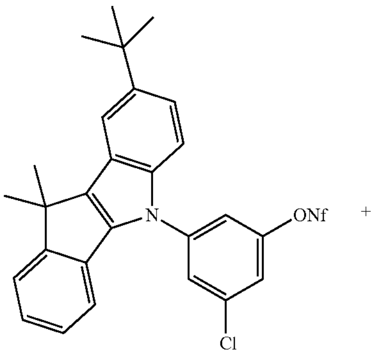

[Intermediate 35]

-continued

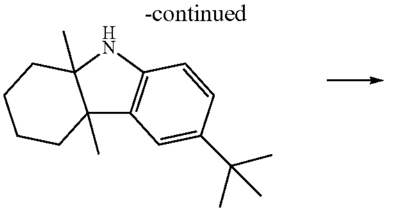

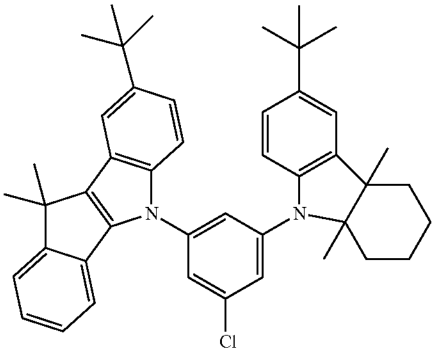

[Intermediate 52]

After 40 g of Intermediate 35, 14.8 g of 6-(tert-butyl)-4a,9a-dimethyl-2,3,4,4a,9,9a-hexahydro-1H-carbazole, 1.0 g of $Pd(dba)_2$, 1.6 g of Xphos, and 56 g of cesium carbonate were put into 500 ml of xylene under a nitrogen atmosphere, the resulting mixture was stirred under reflux for 24 hours. After the completion of the reaction, the resulting product was extracted, and then recrystallized to obtain 29 g of Intermediate 52 (yield 77%). MS[M+H]+=656

2) Synthesis of Intermediate 53

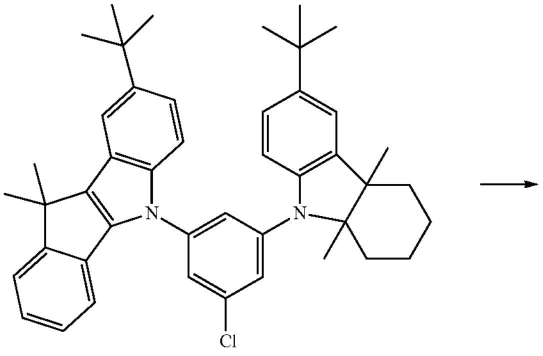

[Intermediate 52]

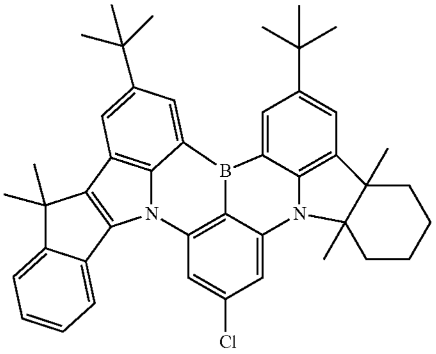

[Intermediate 53]

After 25 g of Intermediate 52 and 25.4 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.6 g of Intermediate 53. (yield 30%). MS[M+H]+=664

3) Synthesis of Compound 20

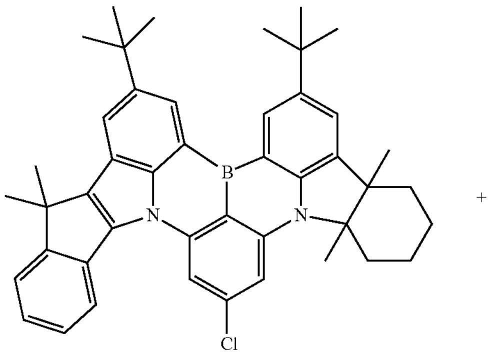

[Intermediate 53]

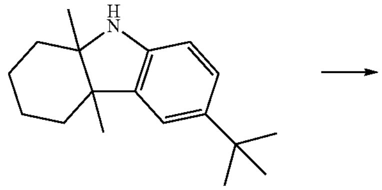

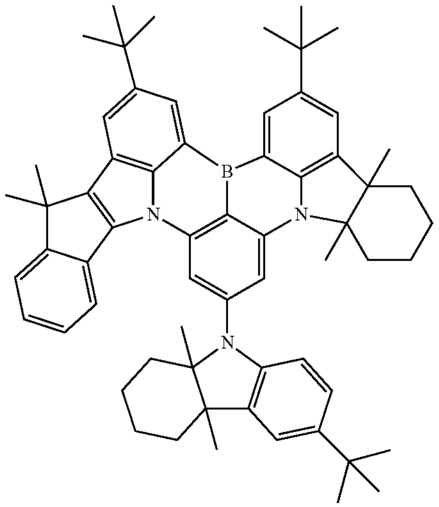

[Compound 20]

After 7 g of Intermediate 53, 2.7 g of 6-(tert-butyl)-4a,9a-dimethyl-2,3,4,4a,9,9a-hexahydro-1H-carbazole, 2.1 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 7.1 g of Compound 20. (yield 76%). MS[M+H]+=885

Synthesis Example 21. Synthesis of Compound 21

1) Synthesis of Intermediate 54

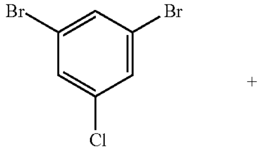

[A4]

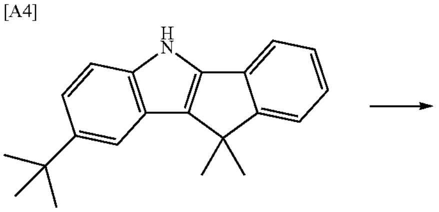

[Intermediate B]

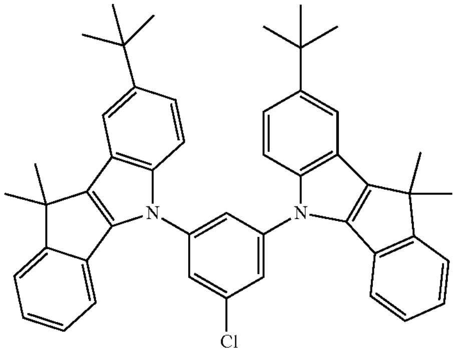

[Intermediate 54]

After 20 g of A4, 42.8 g of Intermediate B, 42.6 g of sodium-tert-butoxide, and 0.4 g of bis(tri-tert-butylphosphine)palladium(0) were put into 500 ml of toluene under a nitrogen atmosphere, the resulting mixture was stirred under reflux for 12 hours. After the completion of the reaction, the resulting product was extracted, and then recrystallized to obtain 42 g of Intermediate 54 (yield 83%). MS[M+H]+=688

2) Synthesis of Intermediate 55

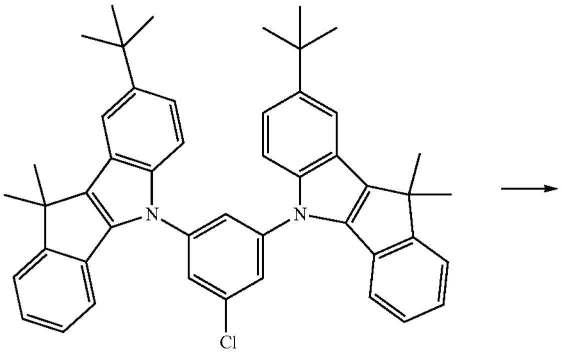

[Intermediate 54]

-continued

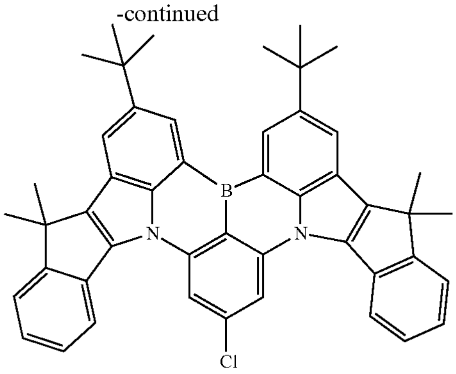

[Intermediate 55]

After 25 g of Intermediate 54 and 24.2 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.4 g of Intermediate 55. (yield 29%). MS[M+H]+=696

3) Synthesis of Compound 21

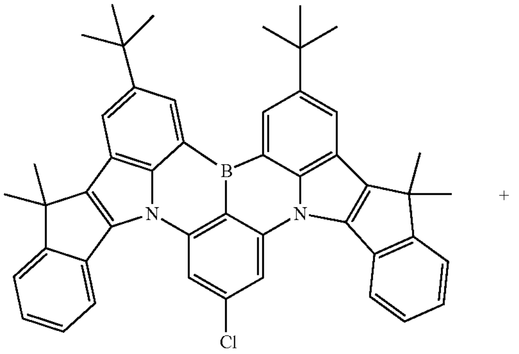

[Intermediate 55]

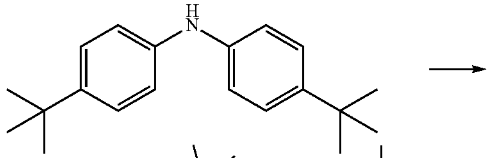

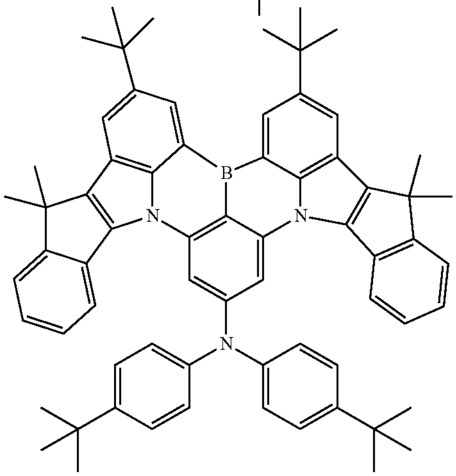

[Compound 21]

After 7 g of Intermediate 55, 2.9 g of bis(4-(tert-butyl) phenyl)amine, 1.9 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 7.2 g of Compound 21. (yield 76%). MS[M+H]+=941

Synthesis Example 22. Synthesis of Compound 22

1) Synthesis of Intermediate 56

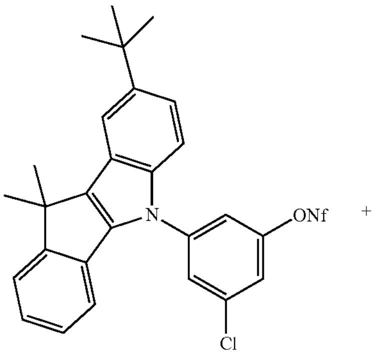

[Intermediate 35]

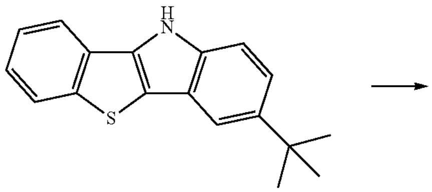

[Intermediate G]

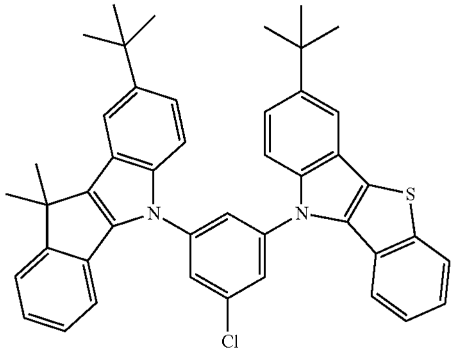

[Intermediate 56]

After 40 g of Intermediate 35, 16 g of Intermediate G, 1.0 g of $Pd(dba)_2$, 1.6 g of Xphos, and 56 g of cesium carbonate were put into 500 ml of xylene under a nitrogen atmosphere, the resulting mixture was stirred under reflux for 24 hours. After the completion of the reaction, the resulting product was extracted, and then recrystallized to obtain 28 g of Intermediate 56 (yield 72%). MS[M+H]+=678

2) Synthesis of Intermediate 57

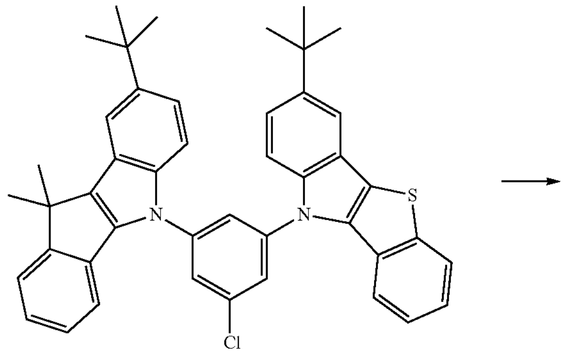

[Intermediate 56]

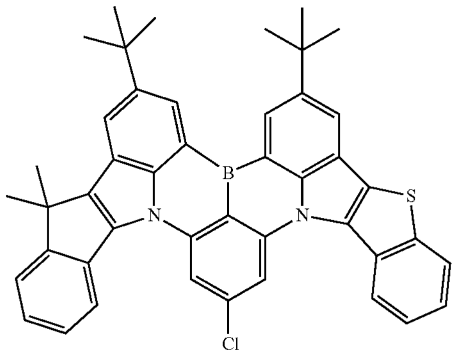

[Intermediate 57]

After 25 g of Intermediate 56 and 24.6 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.8 g of Intermediate 57. (yield 31%). MS[M+H]+=686

3) Synthesis of Compound 22

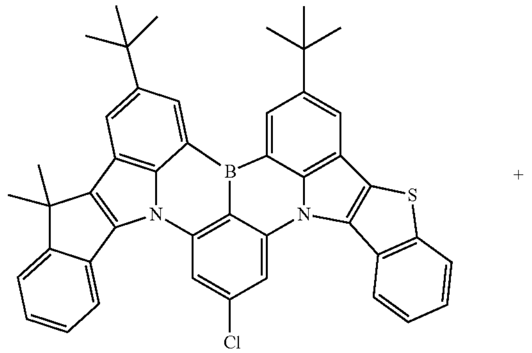

[Intermediate 57]

-continued

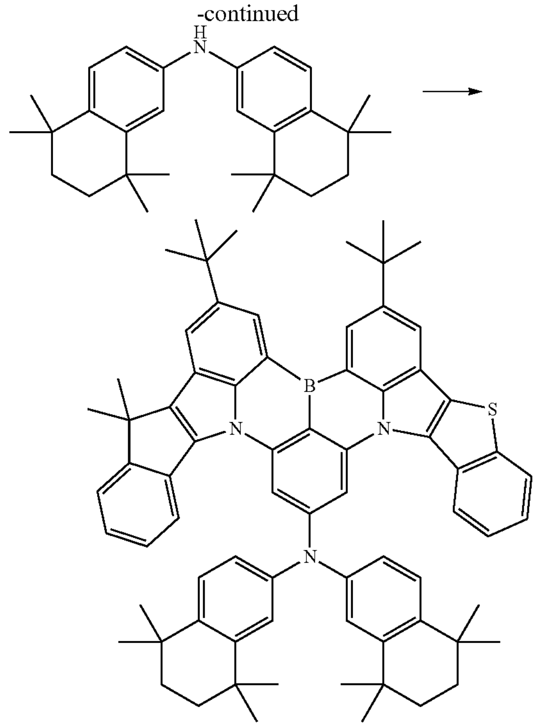

[Compound 22]

After 7 g of Intermediate 57, 4 g of bis(5,5,8,8-tetramethyl-5,6,7,8-tetrahydronaphthalen-2-yl)amine, 2 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 7.8 g of Compound 22. (yield 74%). MS[M+H]+=1039

Synthesis Example 23. Synthesis of Compound 23

1) Synthesis of Intermediate 58

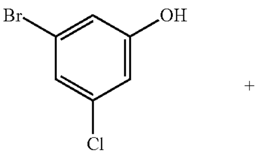

[A3]

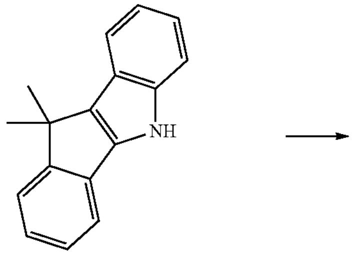

[Intermediate A]

-continued

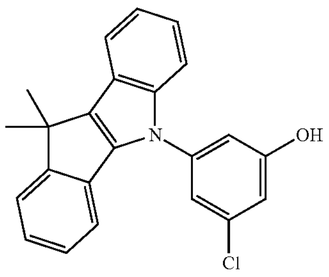

[Intermediate 58]

After 40 g of 3-bromo-5-chlorophenol (A3), 45 g of Intermediate A, 55.6 g of sodium-tert-butoxide, and 1 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 49 g of Intermediate 58. (yield 71%). MS[M+H]+=360

2) Synthesis of Intermediate 59

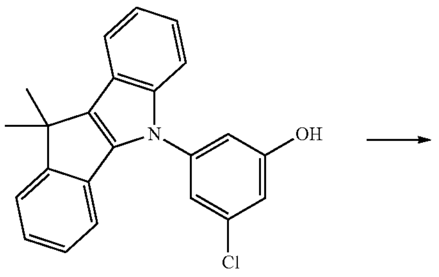

[Intermediate 58]

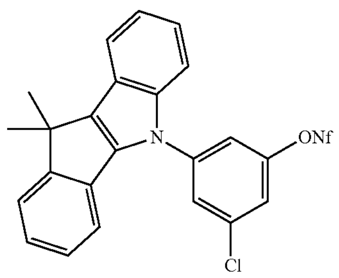

[Intermediate 59]

After 40 g of intermediate 58, 30 ml of 1,1,2,2,3,3,4,4,4-nonafluorobutane-1-sulfonyl fluoride, and 46 g of potassium carbonate were put into 400 ml of tetrahydrofuran and 200 ml of water, the resulting mixture was reacted for 3 hours, and then the resulting product was extracted after the completion of the reaction, and then the solution was removed to obtain 66 g of Intermediate 59. (yield 92%). MS[M+H]+=643

3) Synthesis of Intermediate 60

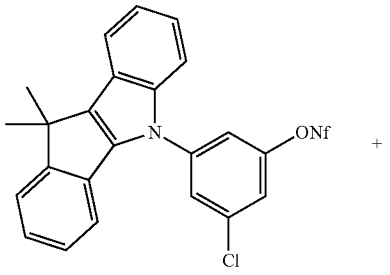

[Intermediate 59]

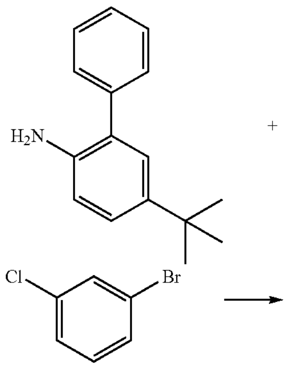

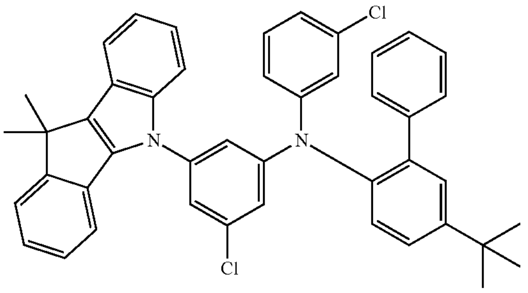

[Intermediate 60]

After 40 g of Intermediate 59, 14.1 g of 5-(tert-butyl)-[1,1'-biphenyl]-2-amine, 1.1 g of $Pd(dba)_2$, 1.8 g of Xphos, and 61 g of cesium carbonate were put into 500 ml of xylene under a nitrogen atmosphere, the resulting mixture was stirred under reflux for 24 hours. Thereafter, whether the reaction proceeded was confirmed, and then 12 g of 1-bromo-3-chlorobenzene was introduced thereinto during the stirring, and then the resulting mixture was stirred under reflux for 8 hours. After the completion of the reaction, the resulting product was extracted, and then recrystallized to obtain 32 g of Intermediate 60 (yield 76%). MS[M+H]+=678

4) Synthesis of Intermediate 61

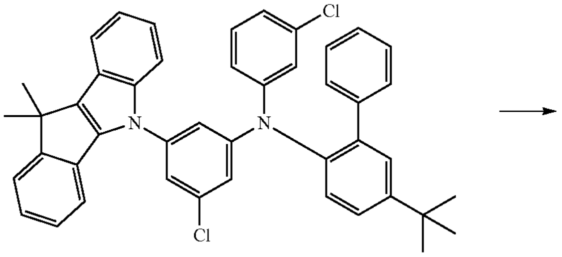

[Intermediate 60]

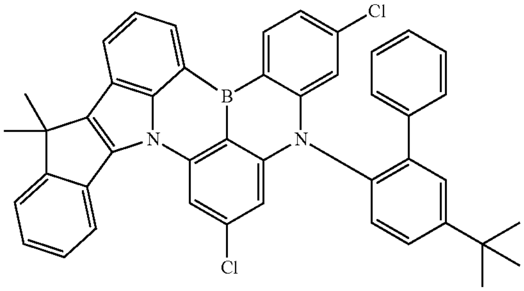

[Intermediate 61]

After 25 g of Intermediate 60 and 24.6 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.4 g of Intermediate 61. (yield 29%). MS[M+H]+=686

5) Synthesis of Compound 23

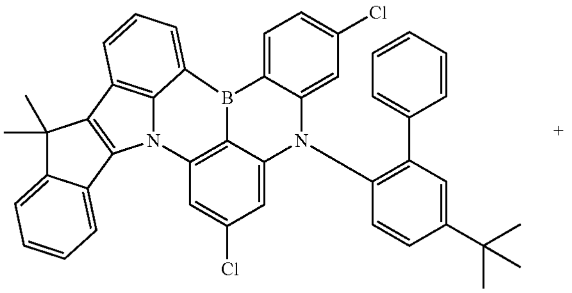

[Intermediate 61]

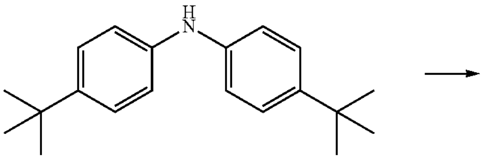

-continued

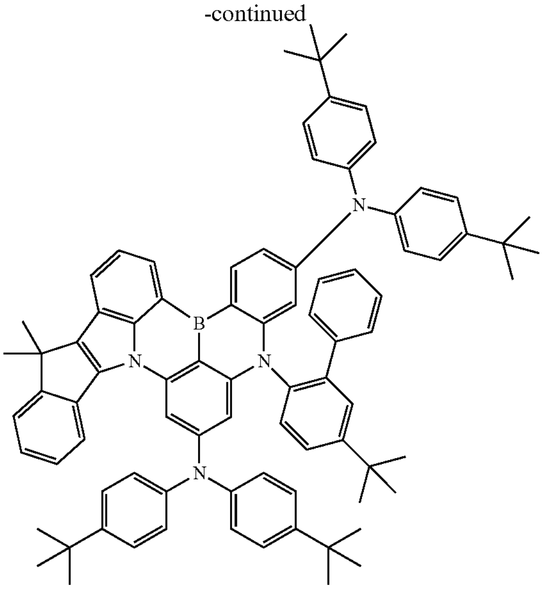

[Compound 23]

After 7 g of Intermediate 61, 5.8 g of bis(4-(tert-butyl) phenyl)amine, 4 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 8.1 g of Compound 23. (yield 67%). MS[M+H]+=1176

Synthesis Example 24. Synthesis of Compound 24

1) Synthesis of Intermediate 62

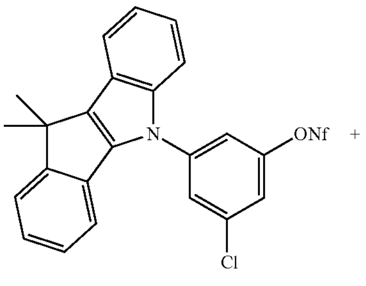

[Intermediate 59]

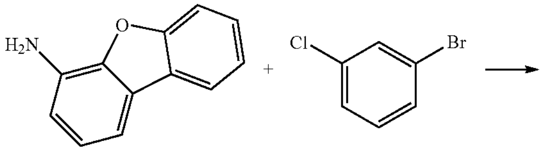

-continued

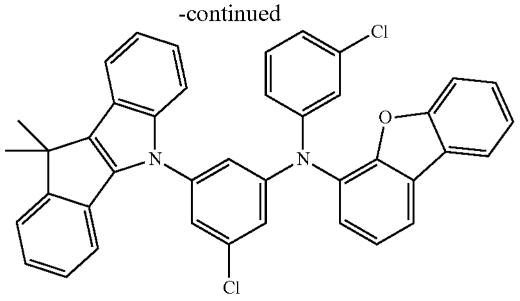

[Intermediate 62]

After 40 g of Intermediate 59, 11.4 g of dibenzo[b,d]furan-4-amine, 1.1 g of $Pd(dba)_2$, 1.8 g of Xphos, and 61 g of cesium carbonate were put into 500 ml of xylene under a nitrogen atmosphere, the resulting mixture was stirred under reflux for 24 hours. Thereafter, whether the reaction proceeded was confirmed, and then 12 g of 1-bromo-3-chlorobenzene was introduced thereinto during the stirring, and then the resulting mixture was stirred under reflux for 8 hours. After the completion of the reaction, the resulting product was extracted, and then recrystallized to obtain 31 g of Intermediate 62. (yield 78%). MS[M+H]+=636

2) Synthesis of Intermediate 63

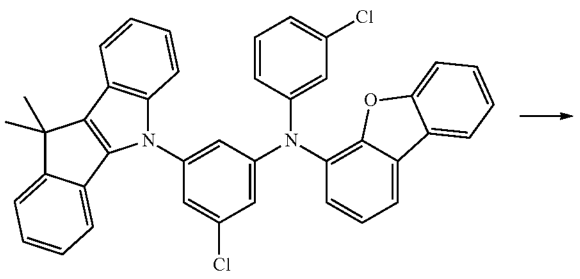

[Intermediate 62]

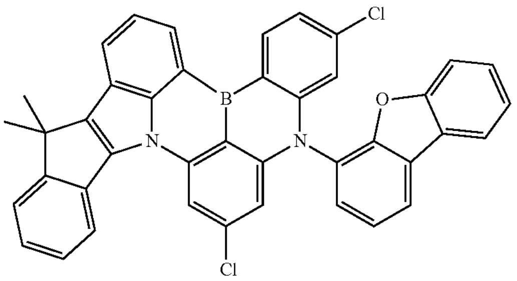

[Intermediate 63]

After 25 g of Intermediate 62 and 24.6 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.6 g of Intermediate 63. (yield 30%). MS[M+H]+=644

3) Synthesis of Compound 24

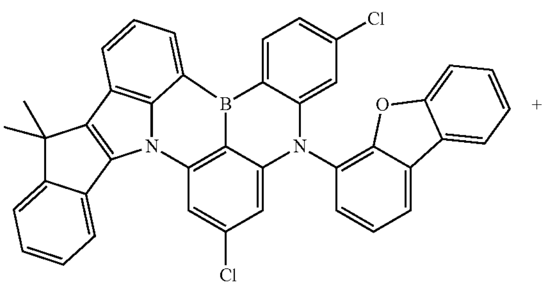

[Intermediate 63]

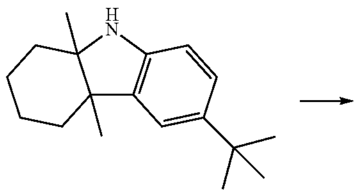

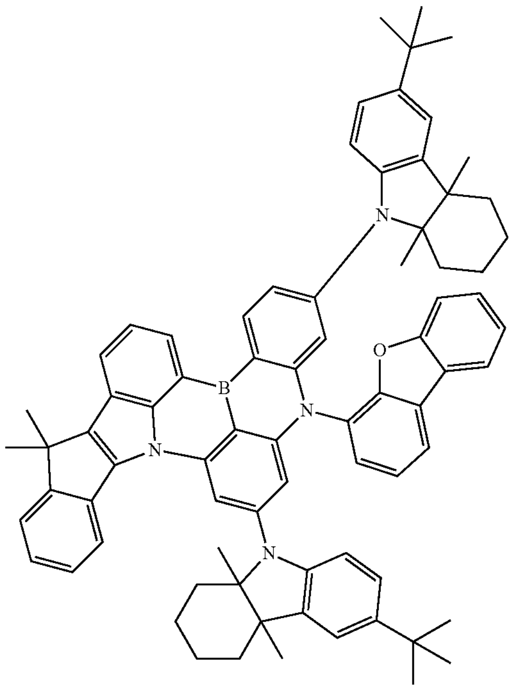

[Compound 24]

After 7 g of Intermediate 63, 5.6 g of 6-(tert-butyl)-4a,9a-dimethyl-2,3,4,4a,9,9a-hexahydro-1H-carbazole, 4.2 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 8.3 g of Compound 24. (yield 70%). MS[M+H]+=1086

Synthesis Example 25. Synthesis of Compound 25

1) Synthesis of Intermediate 64

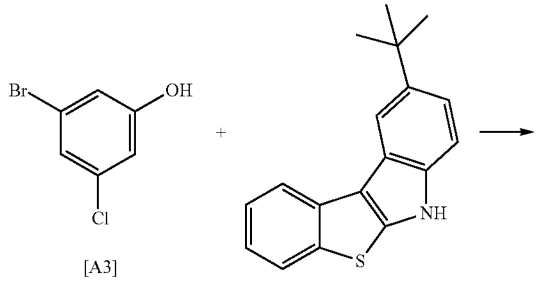

[A3]

[Intermediate G]

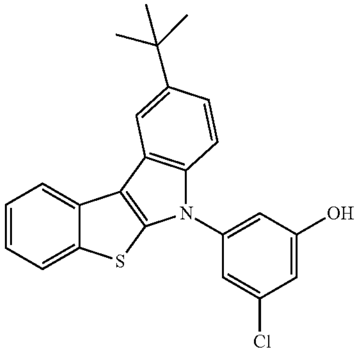

[Intermediate 64]

After 40 g of 3-bromo-5-chlorophenol (A3), 53.9 g of Intermediate G, 55.6 g of sodium-tert-butoxide, and 1 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 59 g of Intermediate 64. (yield 75%). MS[M+H]+=407

2) Synthesis of Intermediate 65

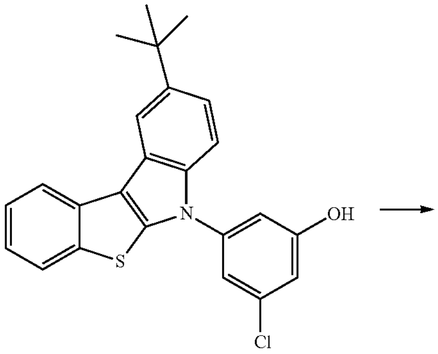

[Intermediate 64]

-continued

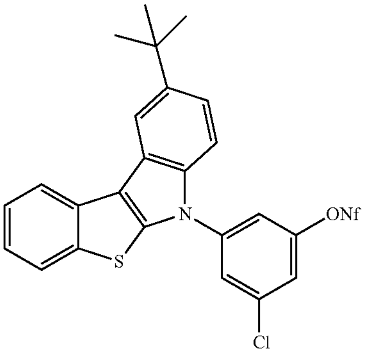

[Intermediate 65]

After 40 g of intermediate 64, 27 ml of 1,1,2,2,3,3,4,4,4-nonafluorobutane-1-sulfonyl fluoride, and 41 g of potassium carbonate were put into 400 ml of tetrahydrofuran and 200 ml of water, the resulting mixture was reacted for 3 hours, and then the resulting product was extracted after the completion of the reaction, and then the solution was removed to obtain 66 g of Intermediate 65. (yield 97%). MS[M+H]+=689

3) Synthesis of Intermediate 66

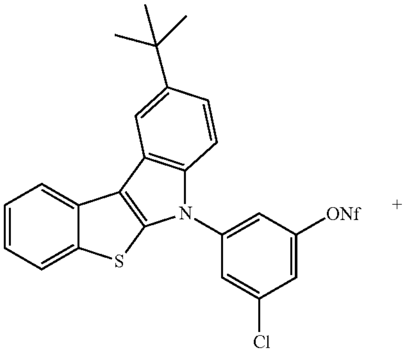

[Intermediate 65]

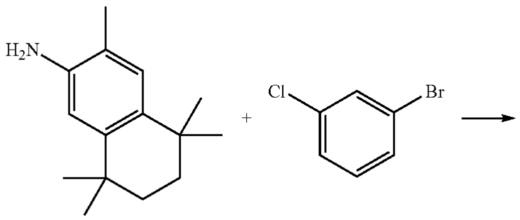

-continued

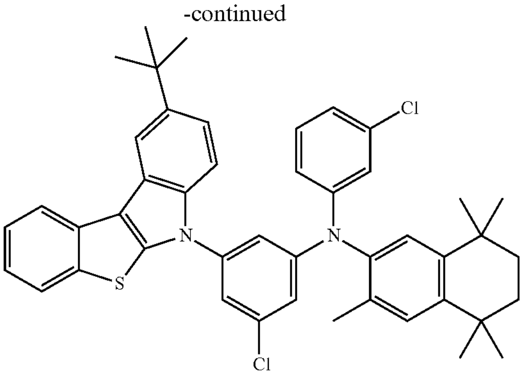

[Intermediate 66]

After 40 g of Intermediate 65, 12.7 g of 3,5,5,8,8-pentamethyl-5,6,7,8-tetrahydronaphthalen-2-amine, 1.1 g of $Pd(dba)_2$, 1.7 g of Xphos, and 57 g of cesium carbonate were put into 500 ml of xylene under a nitrogen atmosphere, the resulting mixture was stirred under reflux for 24 hours. Thereafter, whether the reaction proceeded was confirmed, and then 12 g of 1-bromo-3-chlorobenzene was introduced thereinto during the stirring, and then the resulting mixture was stirred under reflux for 8 hours. After the completion of the reaction, the resulting product was extracted, and then recrystallized to obtain 32 g of Intermediate 66 (yield 77%). MS[M+H]+=716

4) Synthesis of Intermediate 67

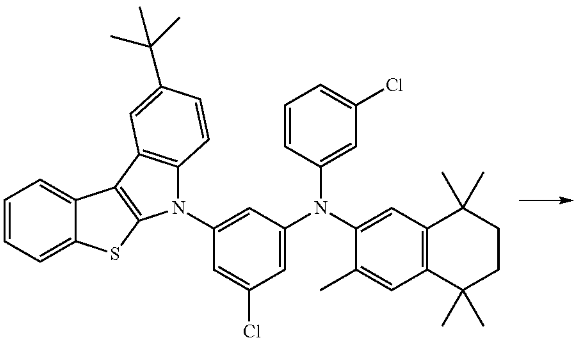

[Intermediate 66]

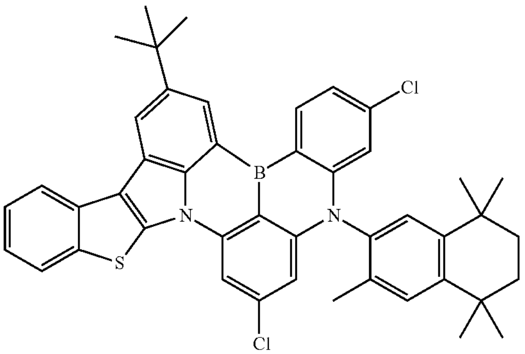

[Intermediate 67]

After 25 g of Intermediate 66 and 23.2 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.5 g of Intermediate 67. (yield 30%). MS[M+H]+=724

5) Synthesis of Compound 25

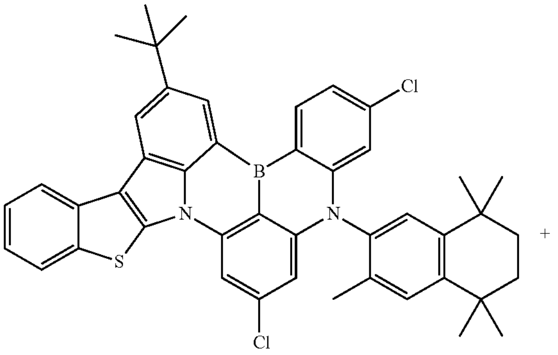

[Intermediate 67]

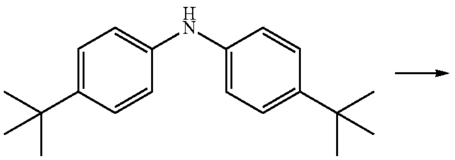

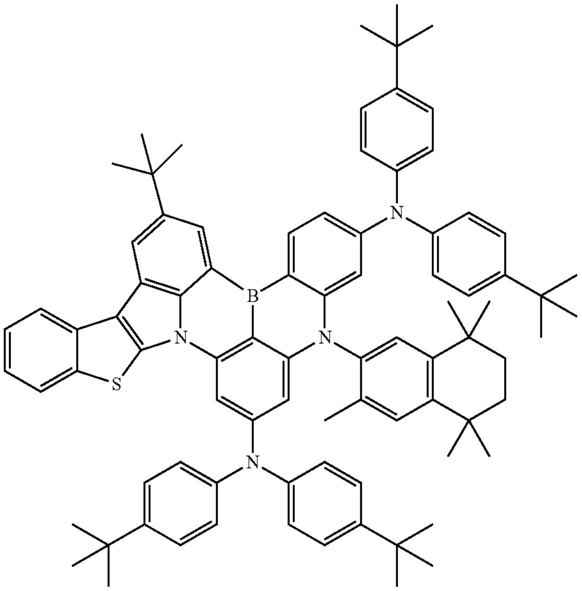

[Compound 25]

After 7 g of Intermediate 67, 5.5 g of bis(4-(tert-butyl)phenyl)amine, 3.8 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 8.1 g of Compound 25. (yield 69%). MS[M+H]+=1214

Synthesis Example 26. Synthesis of Compound 26

1) Synthesis of Intermediate 68

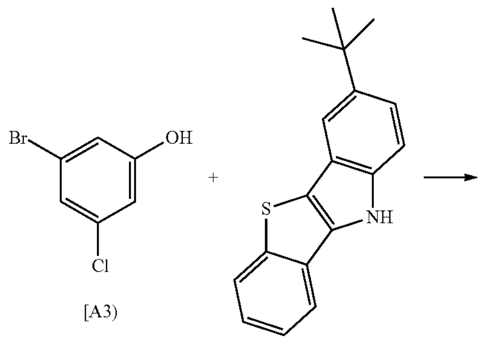

[A3)

[Intermediate H]

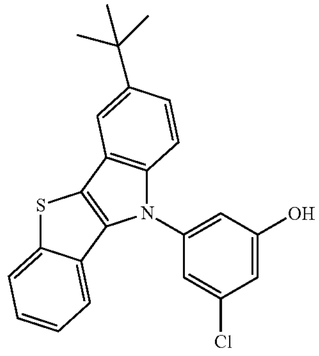

[Intermediate 68]

After 40 g of 3-bromo-5-chlorophenol (A3), 53.9 g of Intermediate H, 55.6 g of sodium-tert-butoxide, and 1 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 58 g of Intermediate 68. (yield 74%). MS[M+H]+=407

2) Synthesis of Intermediate 69

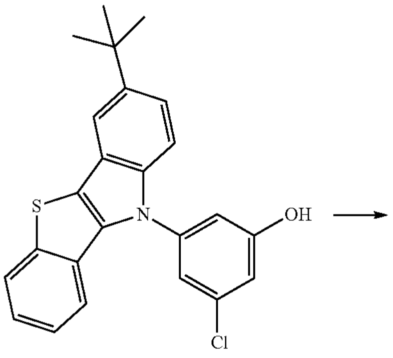

[Intermediate 68]

-continued

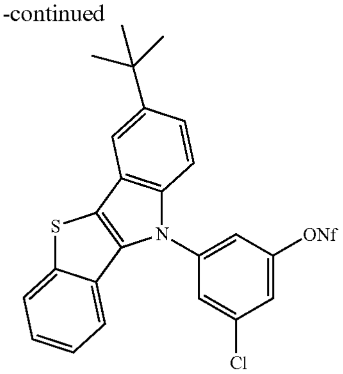

[Intermediate 69]

After 40 g of intermediate 68, 27 ml of 1,1,2,2,3,3,4,4,4-nona fluorobutane-1-sulfonyl fluoride, and 41 g of potassium carbonate were put into 400 ml of tetrahydrofuran and 200 ml of water, the resulting mixture was reacted for 3 hours, and then the resulting product was extracted after the completion of the reaction, and then the solution was removed to obtain 65 g of Intermediate 69. (yield 96%). MS[M+H]+=689

3) Synthesis of Intermediate 70

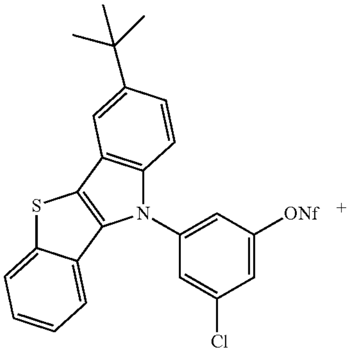

[Intermediate 69]

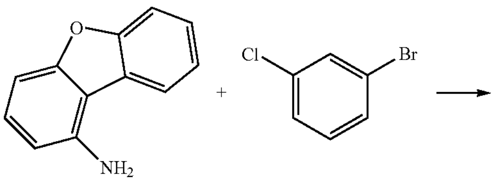

-continued

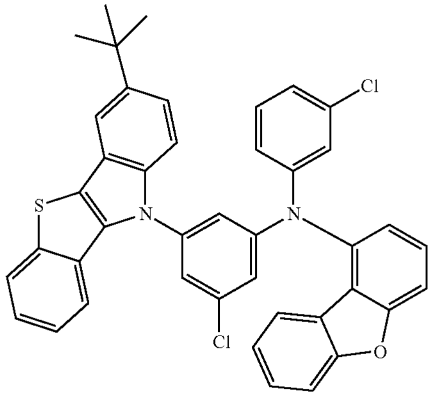

[Intermediate 70]

After 40 g of Intermediate 69, 10.7 g of dibenzo[b,d]furan-1-amine, 1.1 g of $Pd(dba)_2$, 1.7 g of Xphos, and 57 g of cesium carbonate were put into 500 ml of xylene under a nitrogen atmosphere, the resulting mixture was stirred under reflux for 24 hours. Thereafter, whether the reaction proceeded was confirmed, and then 12 g of 1-bromo-3-chlorobenzene was introduced thereinto during the stirring, and then the resulting mixture was stirred under reflux for 8 hours. After the completion of the reaction, the resulting product was extracted, and then recrystallized to obtain 30 g of Intermediate 70 (yield 76%). MS[M+H]+=682

4) Synthesis of Intermediate 71

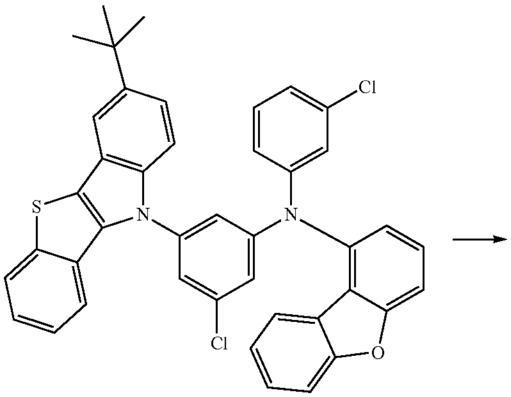

[Intermediate 70]

-continued

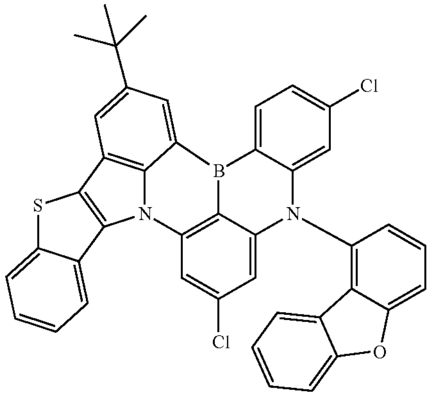

[Intermediate 71]

After 25 g of Intermediate 70 and 24.4 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.4 g of Intermediate 71. (yield 29%). MS[M+H]+=690

5) Synthesis of Compound 26

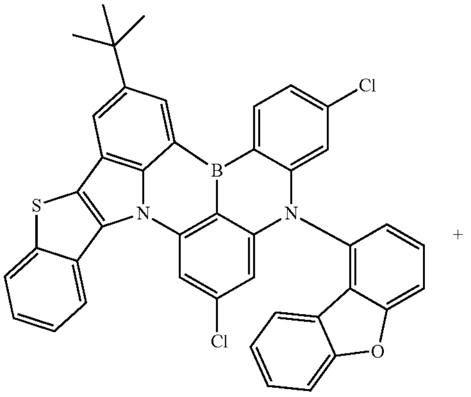

[Intermediate 71]

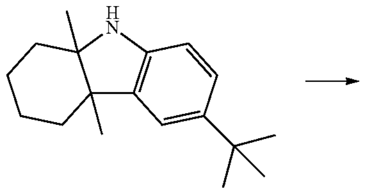

-continued

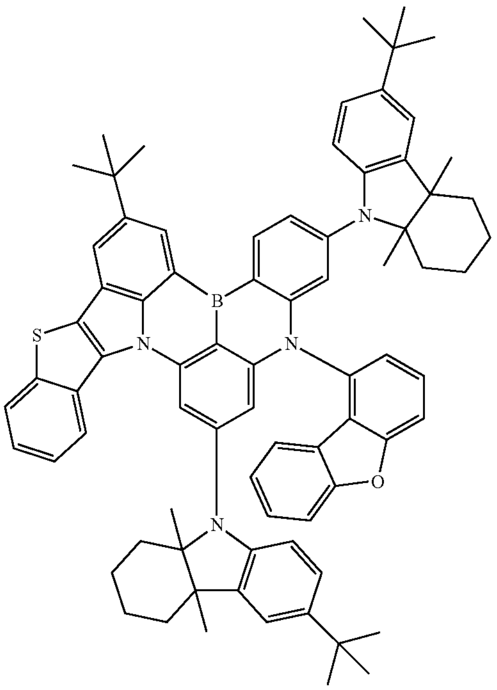

[Compound 26]

After 7 g of Intermediate 71, 5.3 g of 6-(tert-butyl)-4a, 9a-dimethyl-2,3,4,4a,9,9a-hexahydro-1H-carbazole, 3.9 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 7.9 g of Compound 26. (yield 69%). MS[M+H]+=1132

Synthesis Example 27. Synthesis of Compound 27

1) Synthesis of Compound 27

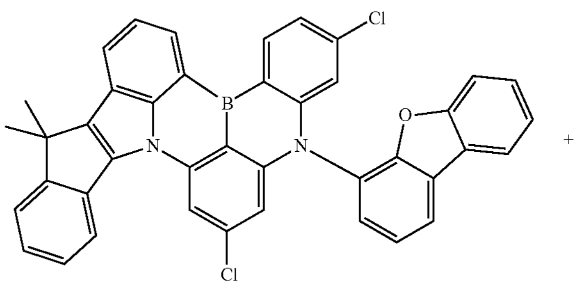

[Intermediate 63]

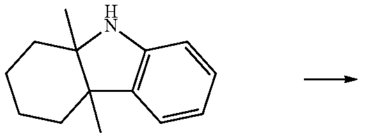

-continued

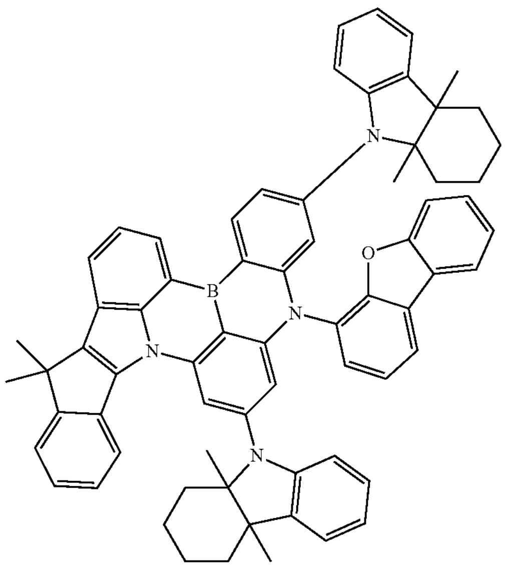

[Compound 27]

After 7 g of Intermediate 63, 4.4 g of 4a,9a-dimethyl-2,3,4,4a,9,9a-hexahydro-1H-carbazole, 4.2 g of sodium-tert-butoxide, and 0.06 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 7.4 g of Compound 27. (yield 70%). MS[M+H]+=974

Synthesis Example 28. Synthesis of Compound 28

1) Synthesis of Compound 28

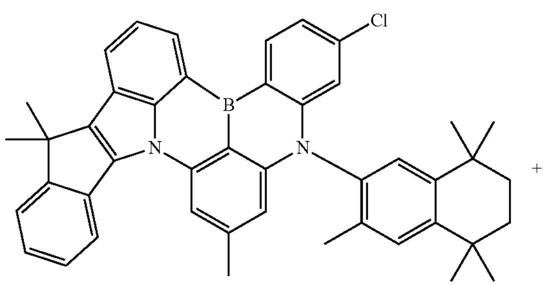

[Intermediate 17]

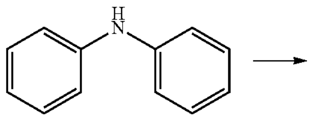

-continued

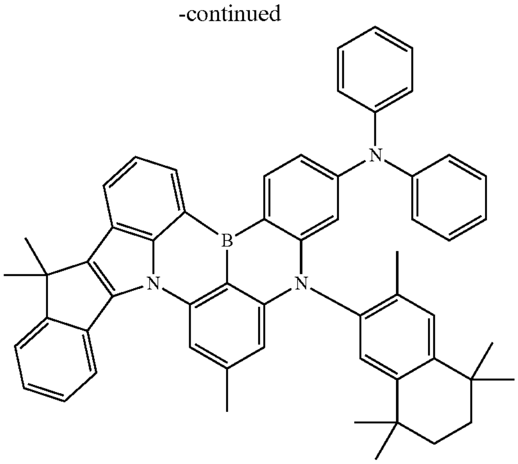

[Intermediate 28]

After 7 g of Intermediate 17, 1.8 g of diphenylamine, 2.0 g of sodium-tert-butoxide, and 0.06 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.5 g of Compound 28. (yield 77%). MS[M+H]+=791

<Experimental Example 1> Device Example

Example 1-2

A glass substrate thinly coated with indium tin oxide (ITO) to have a thickness of 1,400 Å was put into distilled water in which a detergent was dissolved, and ultrasonically washed. In this case, a product manufactured by Fischer Co., was used as the detergent, and distilled water, which had been filtered twice with a filter manufactured by Millipore Co., was used as the distilled water. After the ITO was washed for 30 minutes, ultrasonic washing was conducted twice repeatedly using distilled water for 10 minutes. After the washing using distilled water was completed, ultrasonic washing was conducted by using isopropyl alcohol, acetone, and methanol solvents, and the resulting product was dried and then transported to a plasma washing machine. The substrate was cleaned by using oxygen plasma for 5 minutes, and then was transported to a vacuum deposition machine.

The following compound HI-A and compound HAT-CN were thermally vacuum deposited to have a thickness of 650 A and 50 A, respectively, on the ITO transparent electrode prepared as described, thereby forming first and second hole injection layers. The following compound HT-A was vacuum deposited to have a thickness of 600 Å on the hole injection layer, thereby forming a hole transport layer. The following compound HT-B was vacuum deposited to have a thickness of 50 Å on the hole transport layer, thereby forming an electron blocking layer. Subsequently, 2 parts by weight of Compound 2 of the present invention as a blue light emitting dopant based on 100 parts by weight of the light emitting layer and the following compound BH as a host were vacuum deposited to have a thickness of 200 Å on the electron blocking layer, thereby forming a light emitting layer. Next, the following compound ET-A as a first electron transport layer was vacuum deposited to have a thickness of 50 Å on the light emitting layer, and subsequently, the following compound ET-B and compound LiQ were vacuum deposited at a weight ratio of 1:1, thereby forming a second electron transport layer having a thickness of 360 A. Compound LiQ was vacuum deposited to have a thickness of 5 Å on the second electron transport layer, thereby forming an electron injection layer. Lithium fluoride (LiF) and aluminum were sequentially deposited to have a thickness of 10 A and 1000 A, respectively, on the electron injection and transport layer, thereby forming a negative electrode.

In the aforementioned procedure, the deposition rate of the organic materials were maintained at 0.4 to 0.9 A/sec, the deposition rate of aluminum of the negative electrode was maintained at 2 A/sec, and the degree of vacuum during the deposition was maintained at $1\times10^{-7}$ to $1\times10^{-8}$ torr, thereby manufacturing an organic light emitting device.

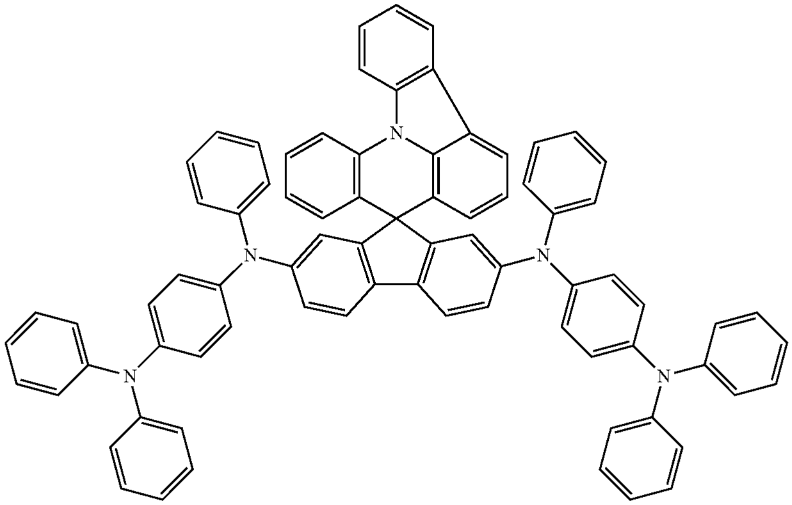

HI-A

-continued
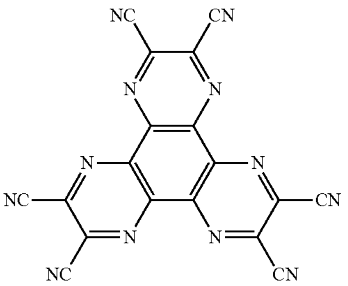
HAT-CN
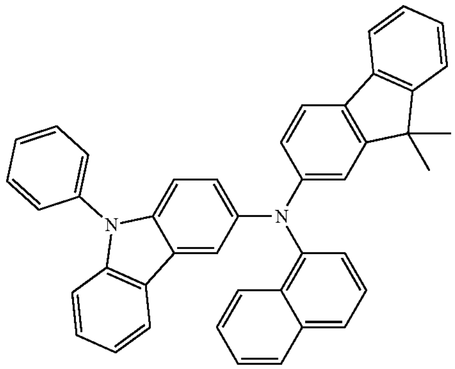
HT-A
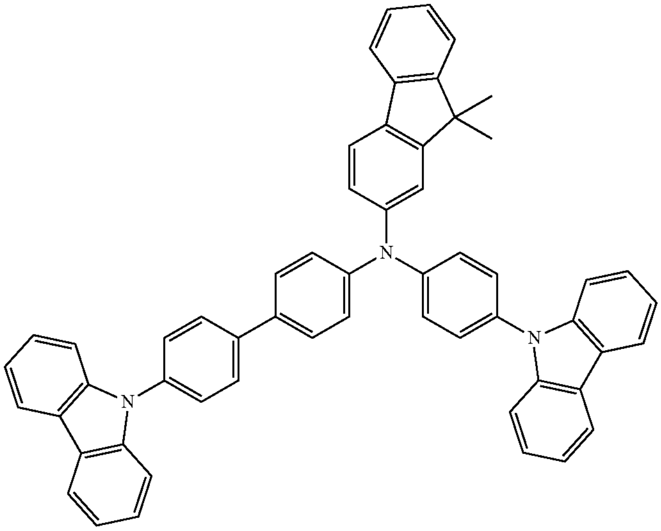
HT-B
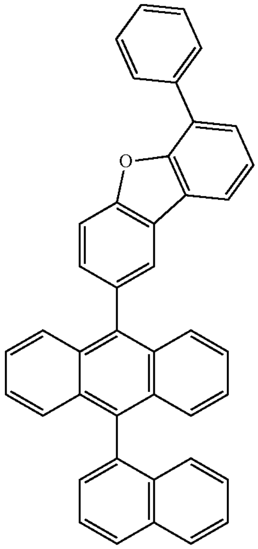
BH
Compound 2
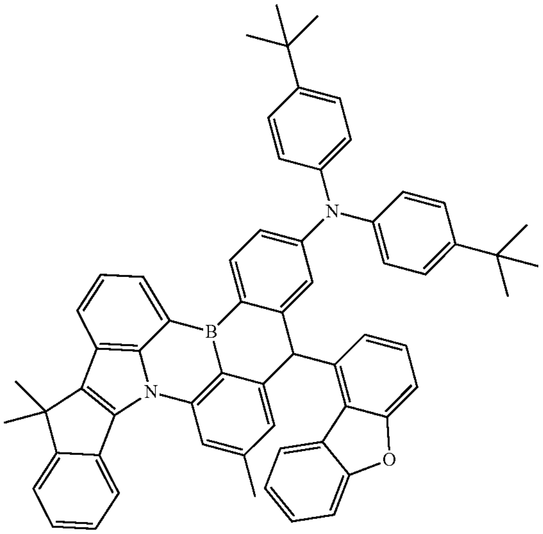
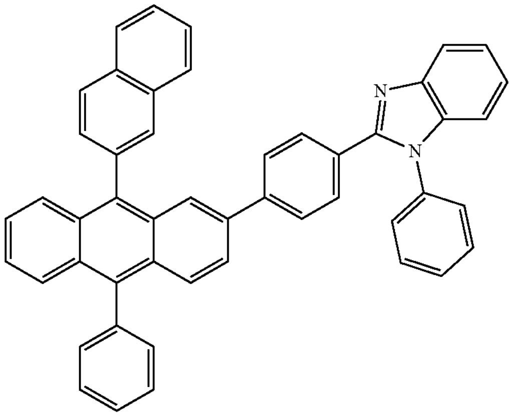
ET-A -continued
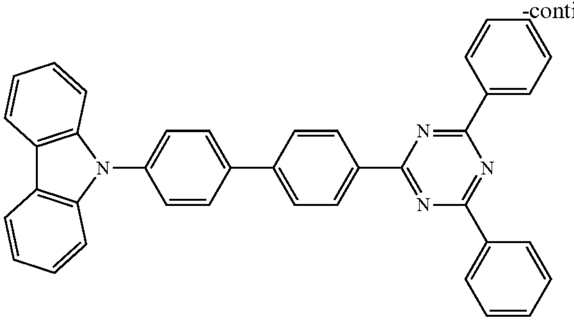
ET-B
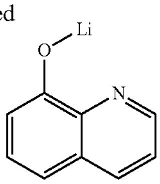
LiQ
Examples 1-3 to 1-28
Devices were manufactured in the same manner as in Example 1-2, except that compounds described in the following Table 1 were used as the dopant of the light emitting layer in Example 1-2.
[Compound 5]
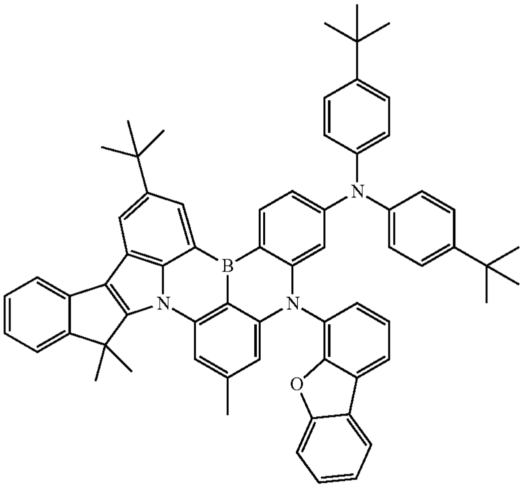
[Compound 9]
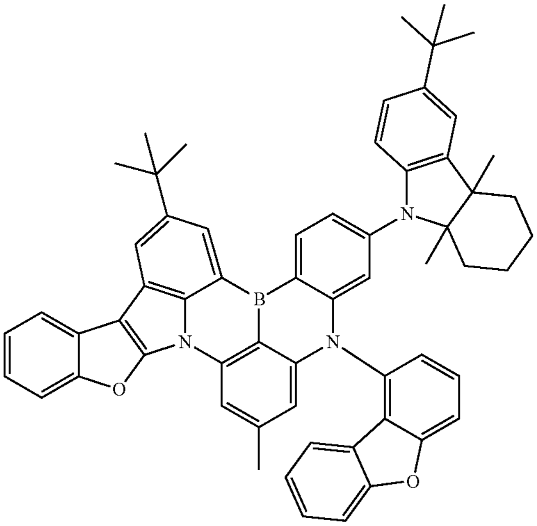
-continued
[Compound 2]
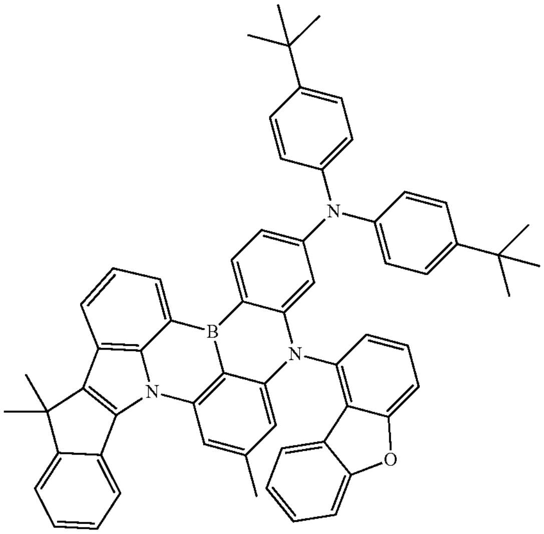
[Compound 6]
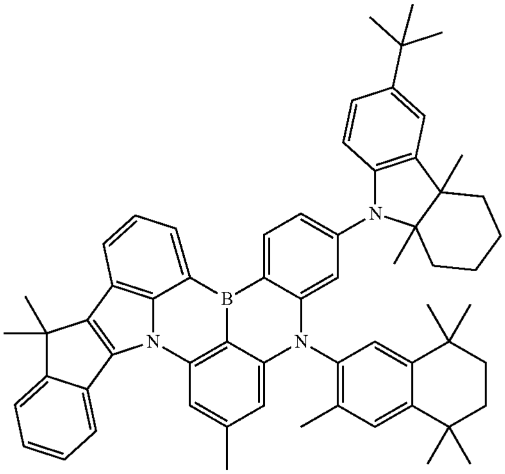

[Compound 3]
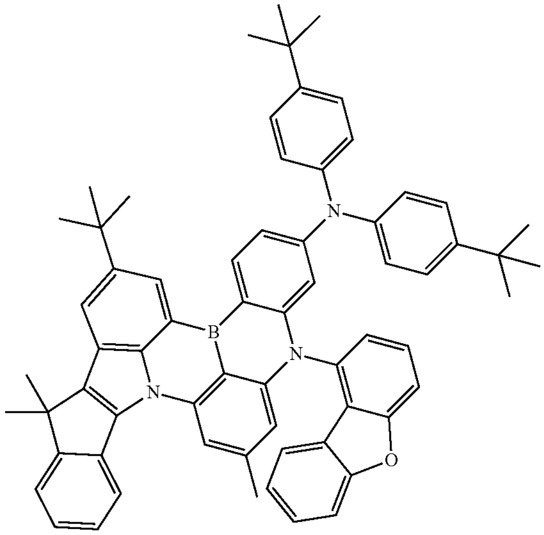
[Compound 7]
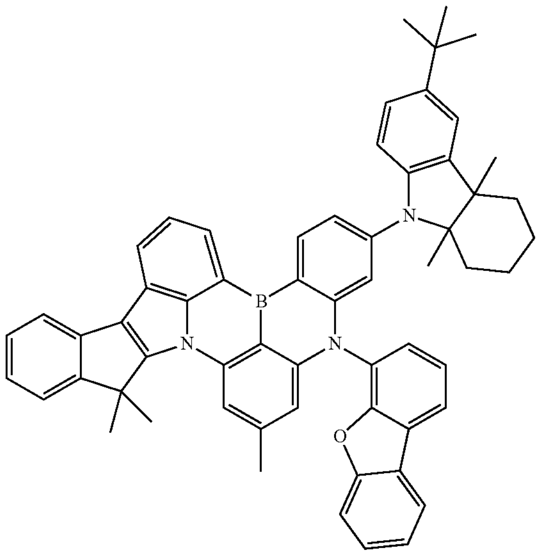
[Compound 11]
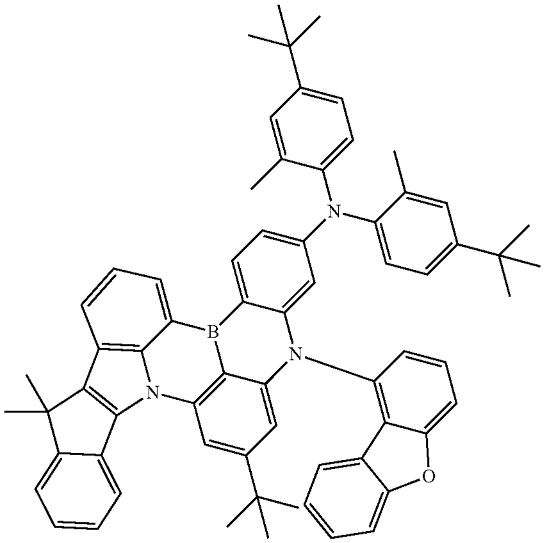
[Compound 4]
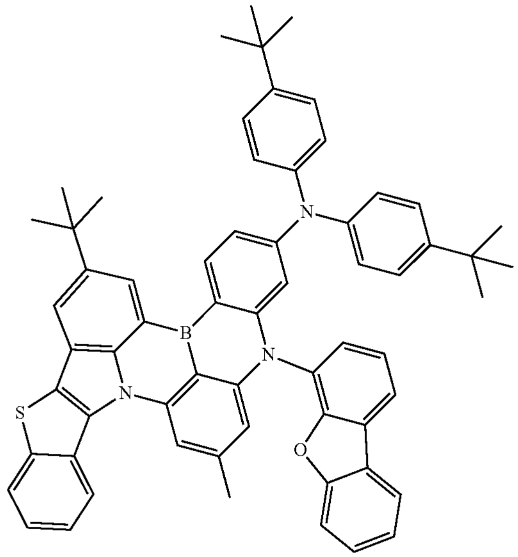

-continued
[Compound 12]
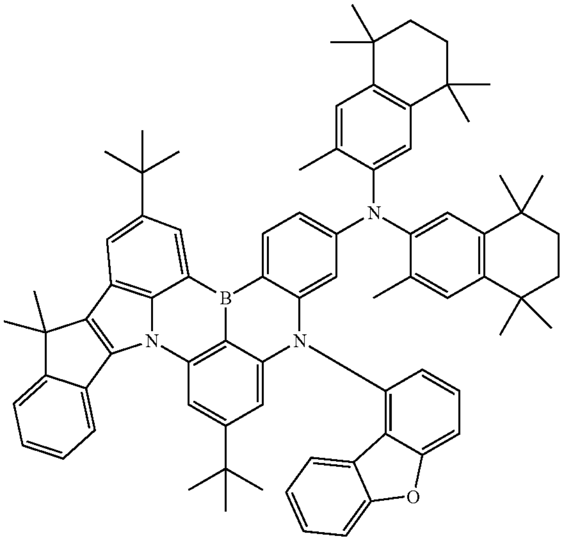
[Compound 16]
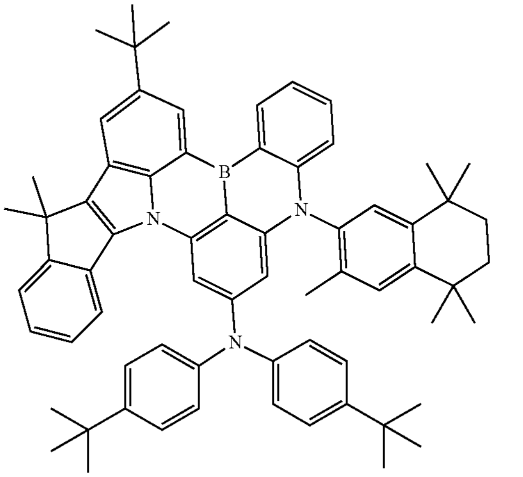
[Compound 17]
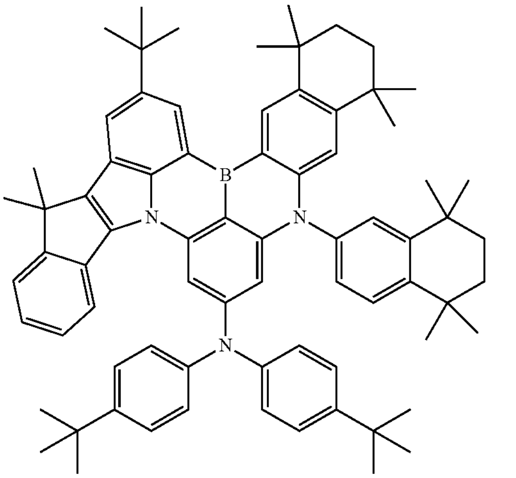
-continued
[Compound 21]
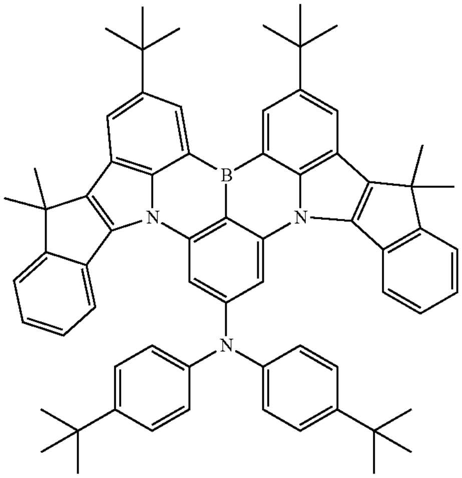
[Compound 25]
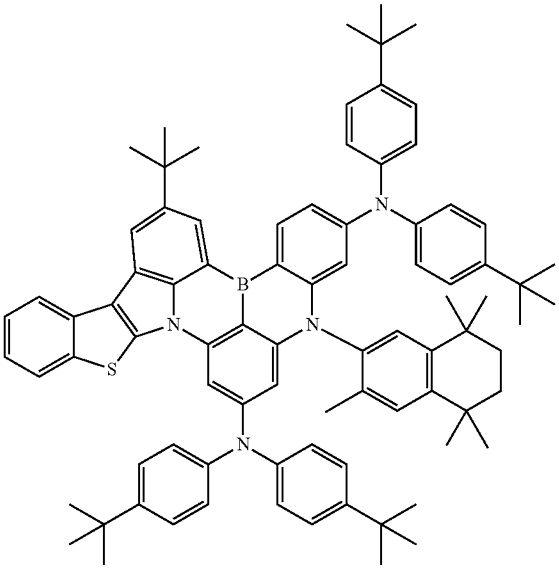
[Compound 22]
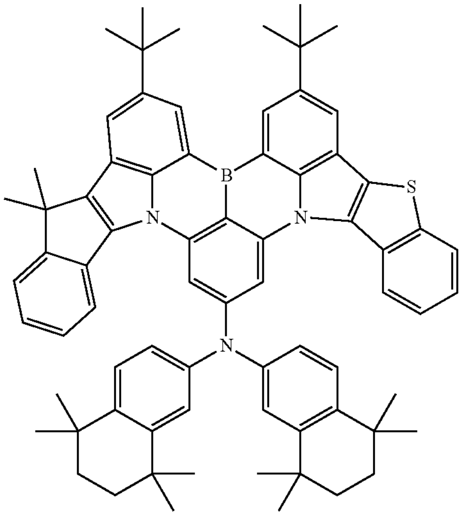

-continued
[Compound 26]
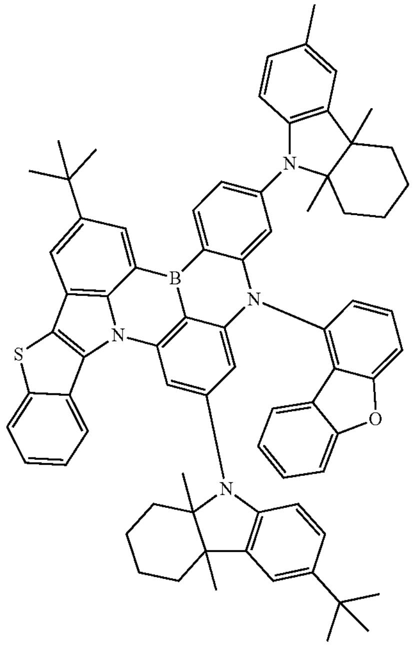
[Compound 22]
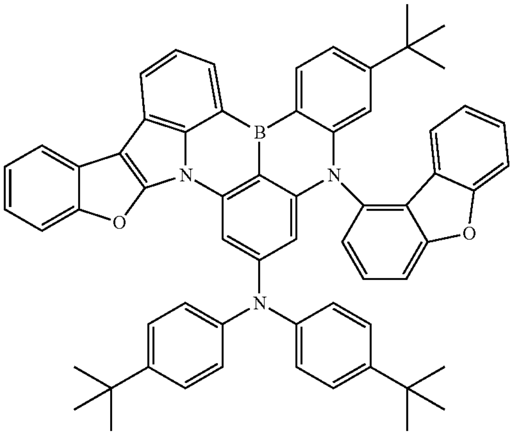
-continued
[Compound 23]
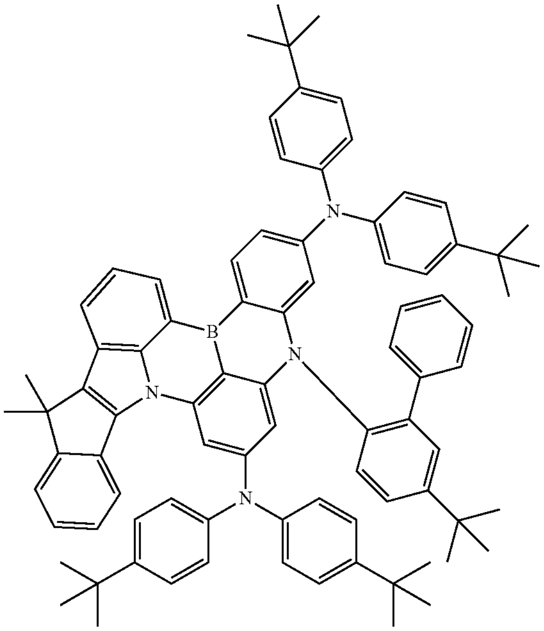
[Compound 27]
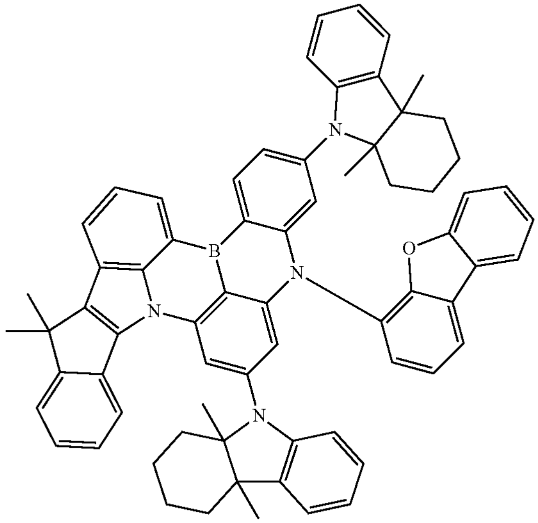

[Compound 20]
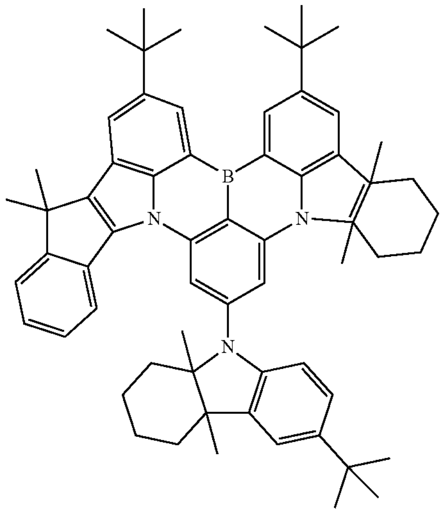
[Compound 24]
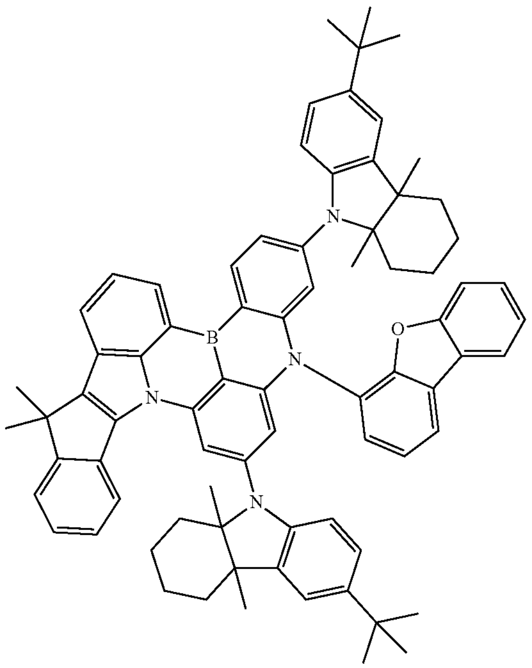
[Compound 28]
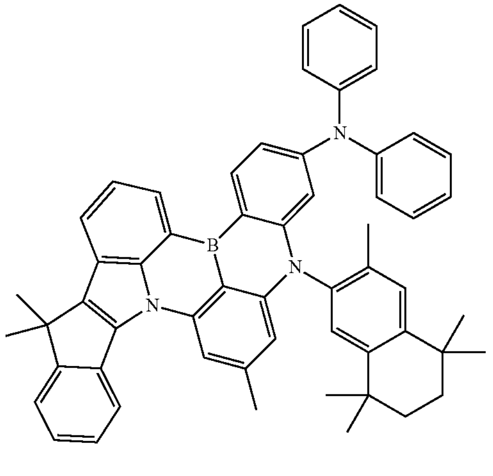
Comparative Examples 1-1 and 1-2
Devices of the following Comparative Examples 1-1 and 1-2 were manufactured in the same manner as in Example 1-2, except that compounds described in the following Table 1 were used as the dopant of the light emitting layer in Example 1-2.
[Comparative Compound 1]
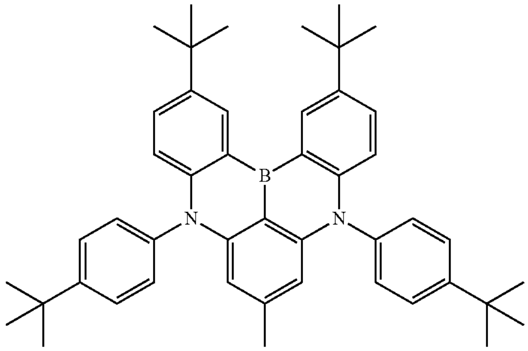
[Comparative Compound 2]
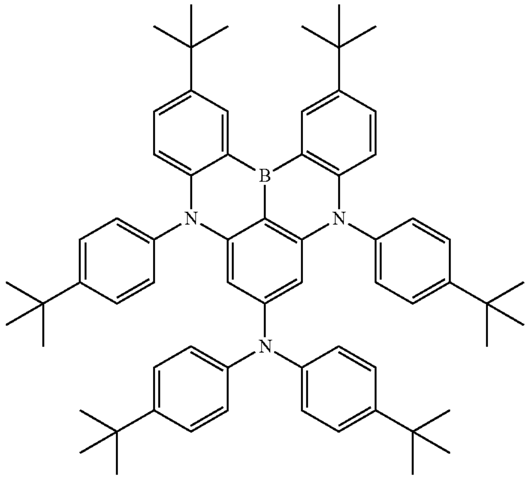

The efficiencies, service lives, and color coordinates (based on 1931 CIE color coordinate) of the organic light emitting devices manufactured in the Examples and the Comparative Examples at a current density of 10 $mA/cm^2$ were measured, and the results thereof are shown in the following Table 1.

TABLE 1

| Material | Efficiency (cd/A) | Color coordinate CIE (x) | CIE (y) | Service life T95 (hr) |
|---|---|---|---|---|
| Example 1-2 (Compound 2) | 8.2 | 0.15 | 0.06 | 198 |
| Example 1-3 (Compound 3) | 8.2 | 0.15 | 0.06 | 199 |
| Example 1-4 (Compound 4) | 8.1 | 0.15 | 0.07 | 204 |
| Example 1-5 (Compound 5) | 8.1 | 0.15 | 0.06 | 198 |
| Example 1-6 (Compound 6) | 8.3 | 0.14 | 0.05 | 201 |
| Example 1-7 (Compound 7) | 8.3 | 0.15 | 0.05 | 200 |
| Example 1-9 (Compound 9) | 8.1 | 0.15 | 0.05 | 203 |
| Example 1-11 (Compound 11) | 8.2 | 0.15 | 0.05 | 199 |
| Example 1-12 (Compound 12) | 8.2 | 0.15 | 0.06 | 200 |
| Example 1-16 (Compound 16) | 8 | 0.15 | 0.04 | 200 |
| Example 1-17 (Compound 17) | 8.1 | 0.15 | 0.04 | 200 |
| Example 1-19 (Compound 19) | 8 | 0.16 | 0.06 | 201 |
| Example 1-20 (Compound 20) | 8.1 | 0.15 | 0.06 | 210 |
| Example 1-21 (Compound 21) | 8.1 | 0.15 | 0.07 | 210 |
| Example 1-22 (Compound 22) | 8.2 | 0.15 | 0.08 | 209 |
| Example 1-23 (Compound 23) | 8.4 | 0.15 | 0.07 | 207 |
| Example 1-24 (Compound 24) | 8.5 | 0.16 | 0.06 | 209 |
| Example 1-25 (Compound 25) | 8.4 | 0.15 | 0.06 | 209 |
| Example 1-26 (Compound 26) | 8.5 | 0.16 | 0.07 | 208 |
| Example 1-27 (Compound 27) | 8.4 | 0.15 | 0.07 | 207 |
| Example 1-28 (Compound 28) | 8.2 | 0.15 | 0.05 | 201 |
| Comparative Example 1-1 (Comparative Compound 1) | 6.5 | 0.15 | 0.05 | 166 |
| Comparative Example 1-2 (Comparative Compound 2) | 6.7 | 0.14 | 0.04 | 167 |

From Table 1, it can be seen that the low voltage, high efficiency, and/or long service life characteristics of an organic light emitting device including the compound of Formula 1 of the present invention as a dopant of the light emitting layer are excellent.

The invention claimed is:

1. A compound of any one of the following Formulae 4, 6, 7, 8, 9, and 10:

<Formula 4>

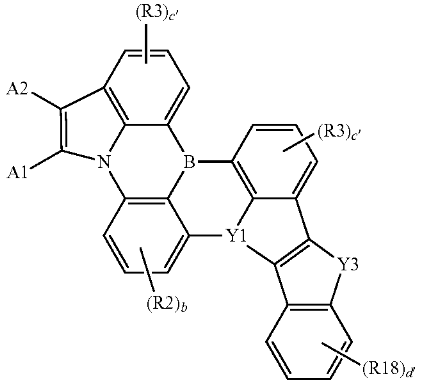

<Formua 6>

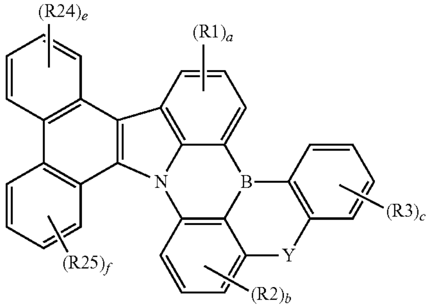

<Formula 7>

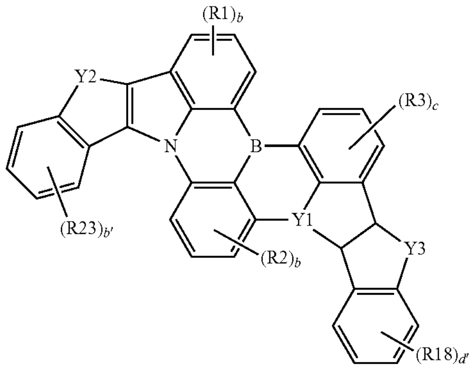

<Formula 8>

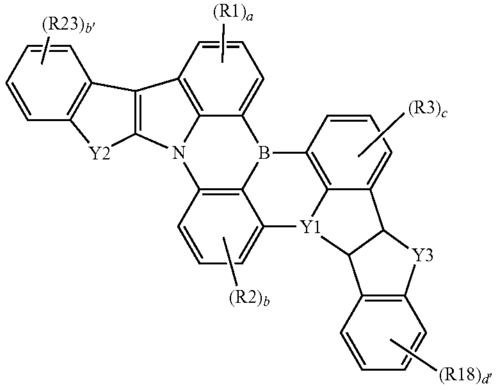

-continued

<Formula 9>

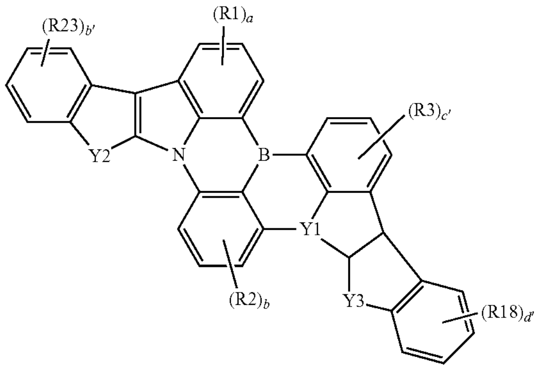

<Formula 10>

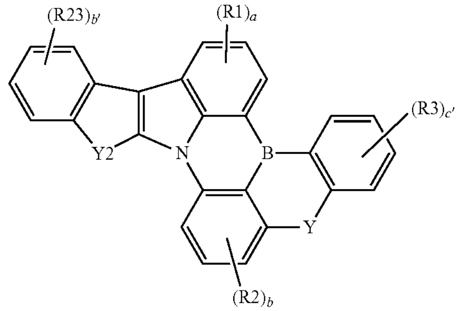

wherein in Formula 4, 6, 7, 8, 9, and 10:

Y is NR, CRxRy, O, or S;

R, Rx, and Ry are the same as or different from each other, and are each independently hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted heteroaryl group, a substituted or unsubstituted alkoxy group, a substituted or unsubstituted aryloxy group, a substituted or unsubstituted aralkyl group, a substituted or unsubstituted alkenyl group, or a substituted or unsubstituted alkynyl group, or are bonded to an adjacent group to form a substituted or unsubstituted ring;

Y1 is CRz or N;

Y2 is NR20, CR21R22, O, or S;

Y3 is CR16R17, NR19, O, or S;

Rz, R16, R17, and R19 are the same as or different from each other, and are each independently hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted heteroaryl group, a substituted or unsubstituted alkoxy group, a substituted or unsubstituted aryloxy group, a substituted or unsubstituted aralkyl group, a substituted or unsubstituted alkenyl group, or a substituted or unsubstituted alkynyl group, or are bonded to an adjacent group to form a substituted or unsubstituted ring;

R20 to R22 are the same as or different from each other, and are each independently hydrogen, a substituted or unsubstituted alkyl group, or a substituted or unsubstituted aryl group, or are bonded to an adjacent group to form a substituted or unsubstituted ring;

A1 and A2 are the same as or different from each other, and are each independently hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted heteroaryl group, a substituted or unsubstituted alkoxy group, a substituted or unsubstituted aryloxy group, a substituted or unsubstituted aralkyl group, a substituted or unsubstituted alkenyl group, or a substituted or unsubstituted alkynyl group, or are bonded to each other to form a substituted or unsubstituted ring;

R1 to R3 are the same as or different from each other, and are each independently hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted heteroaryl group, a substituted or unsubstituted alkoxy group, a substituted or unsubstituted aryloxy group, a substituted or unsubstituted aralkyl group, a substituted or unsubstituted amine group, a substituted or unsubstituted alkenyl group, or a substituted or unsubstituted alkynyl group, or are bonded to an adjacent group to form a substituted or unsubstituted ring;

R3 is optionally bonded to Y to form a substituted or unsubstituted ring;

R18 is hydrogen, a substituted or unsubstituted alkyl group, or a substituted or unsubstituted aryl group, or bonded to an adjacent group to form a substituted or unsubstituted ring;

R23 to R25 are the same as or different from each other, and are each independently hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted amine group, or a substituted or unsubstituted heteroaryl group;

a and b are each an integer from 0 to 3;

c is an integer from 0 to 4;

c' is an integer from 0 to 3;

b', d', e, and f are each an integer from 0 to 4;

when a is 2 or higher, two or more R1s are the same as or different from each other;

when b is 2 or higher, two or more R2s are the same as or different from each other;

when b' is 2 or higher, two or more R23s are the same as or different from each other;

when c is 2 or higher, two or more R3s are the same as or different from each other;

when c' is 2 or higher, two or more R3s are the same as or different from each other;

when d' is 2 or higher, two or more R18s are the same as or different from each other;

when e is 2 or higher, two or more R24s are the same as or different from each other; and when f is 2 or higher, two or more R25s are the same as or different from each other.

2. A compound selected from among the following compounds:

-continued
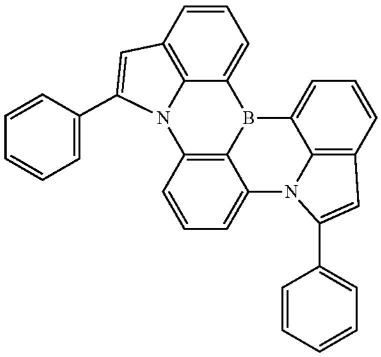 [SMILES: c1ccc(-c2cc3cccc4c3n2-c2cccc3c2B4c2cccc4cc(-c5ccccc5)n-3c24)cc1]
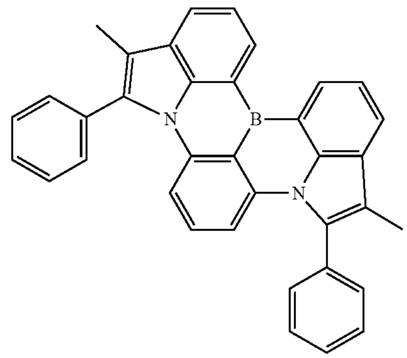
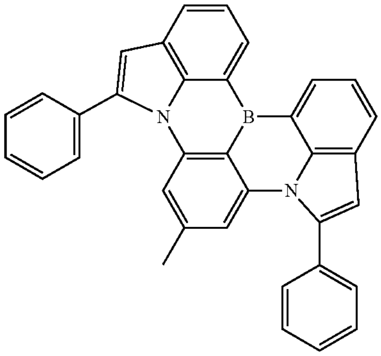
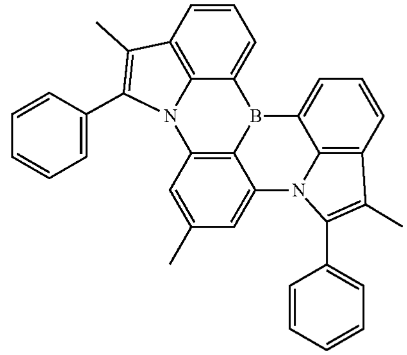
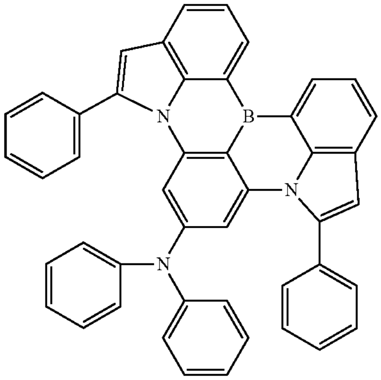
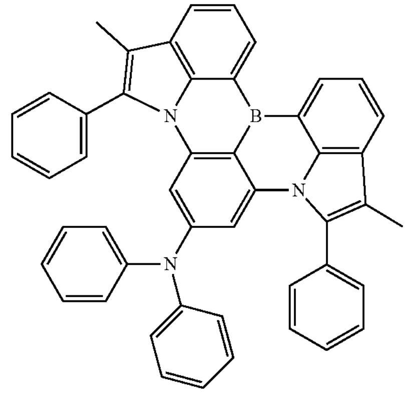
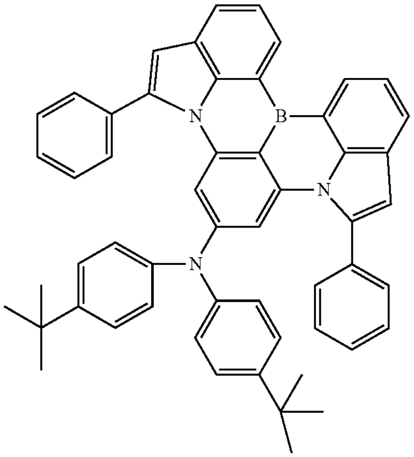
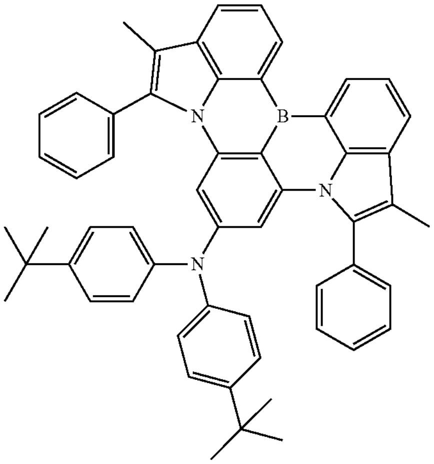

-continued
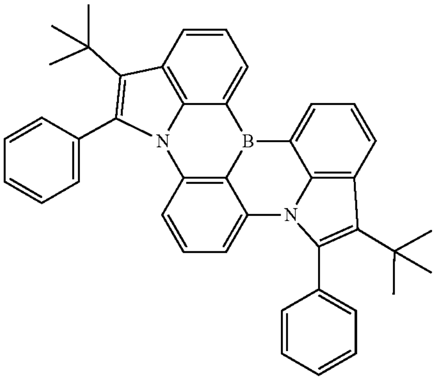
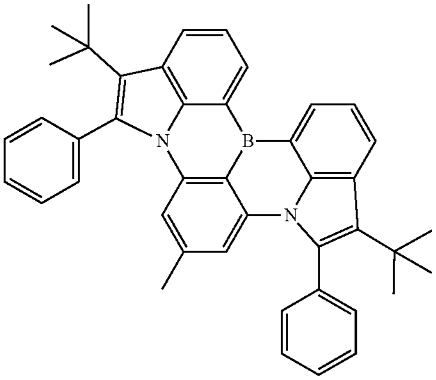
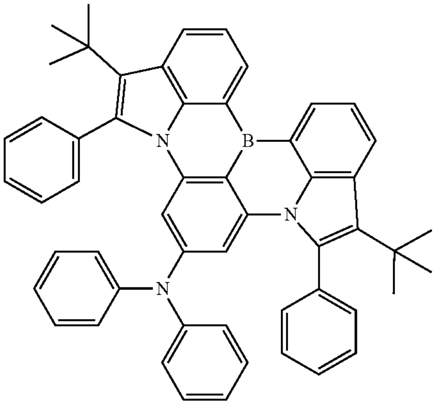
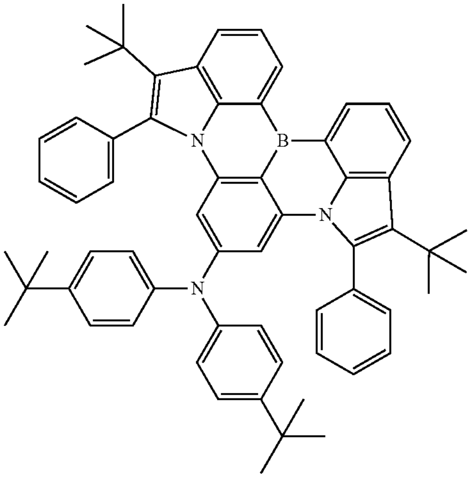
-continued
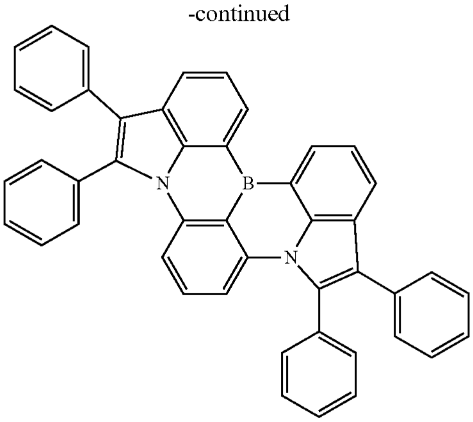
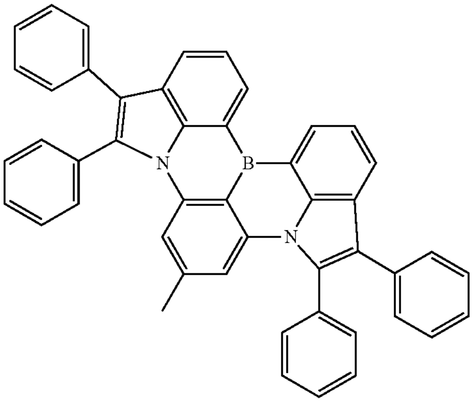
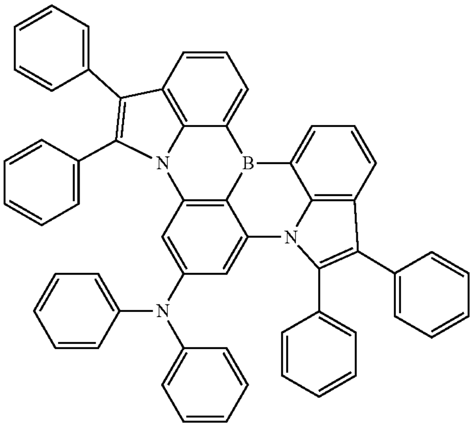
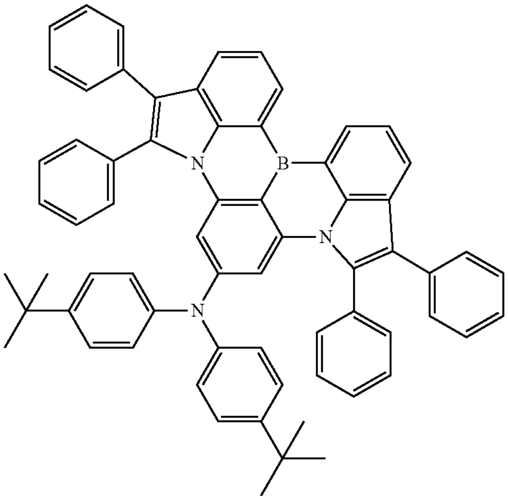

-continued
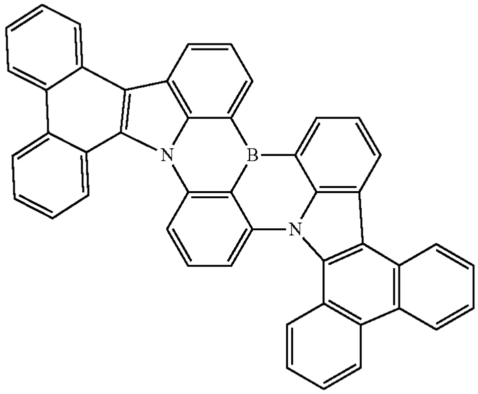
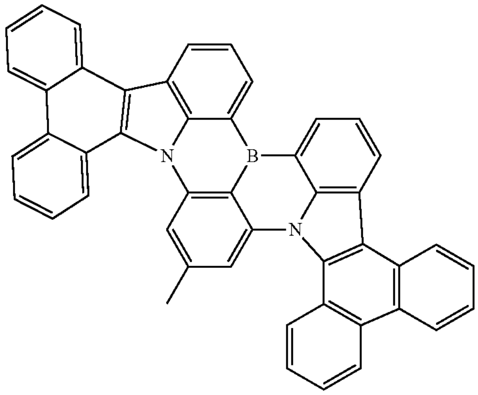
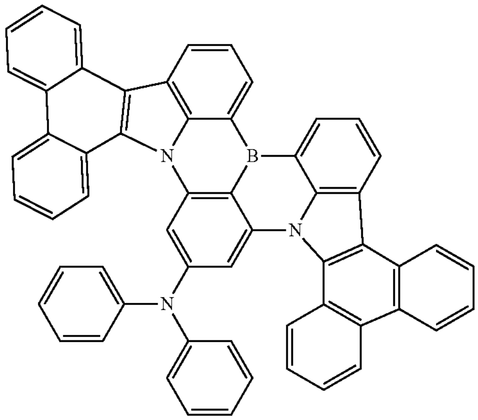
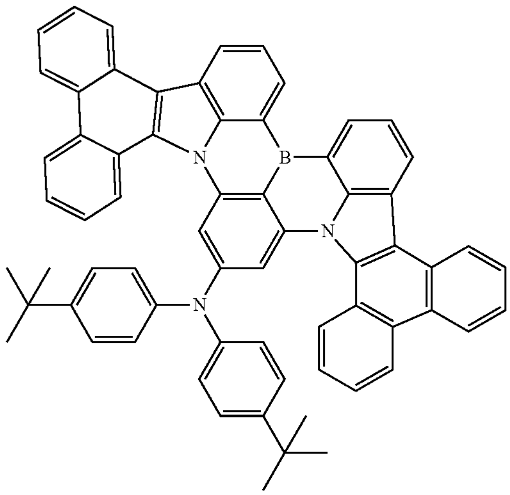
-continued
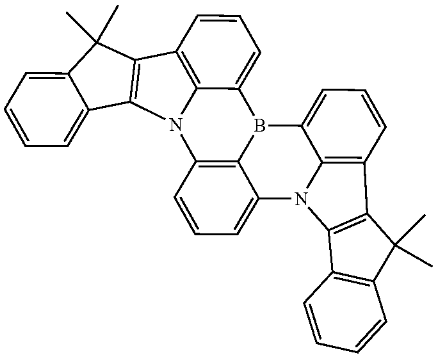
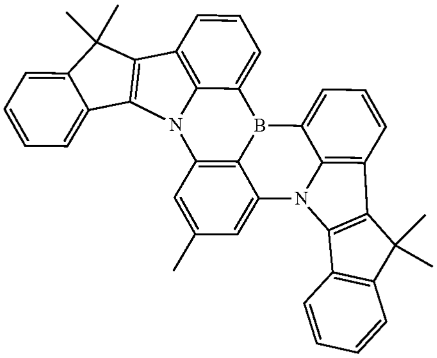
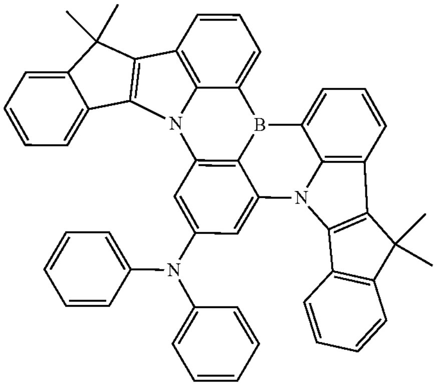
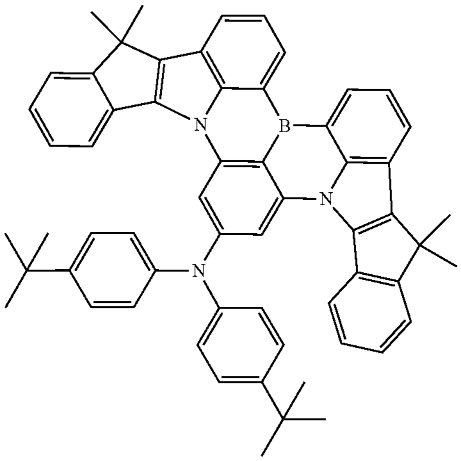

-continued
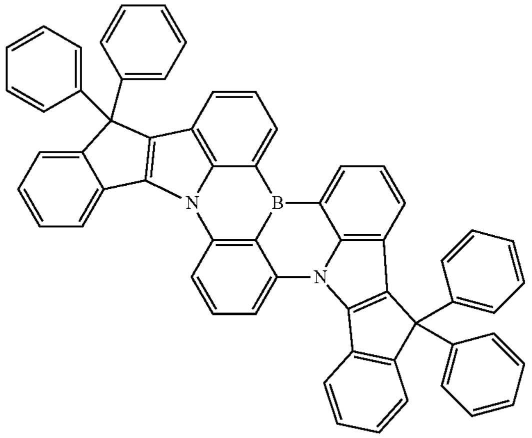
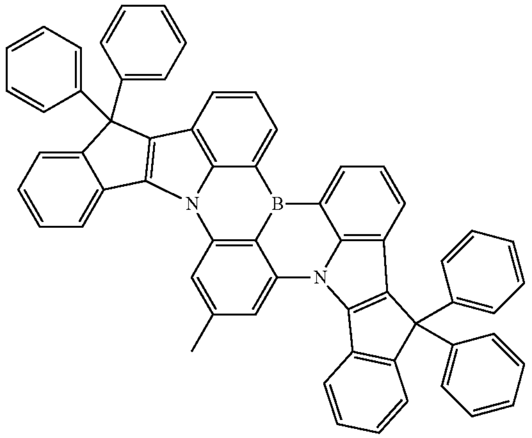
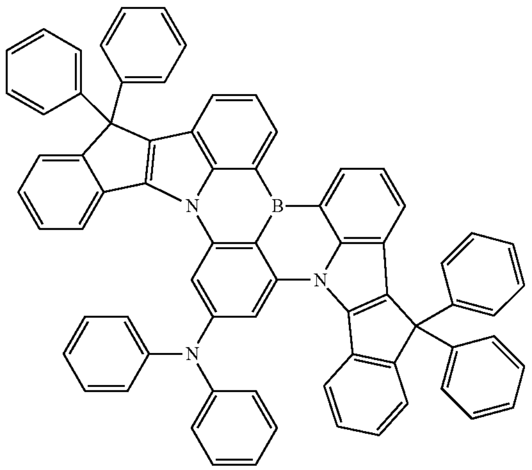
-continued
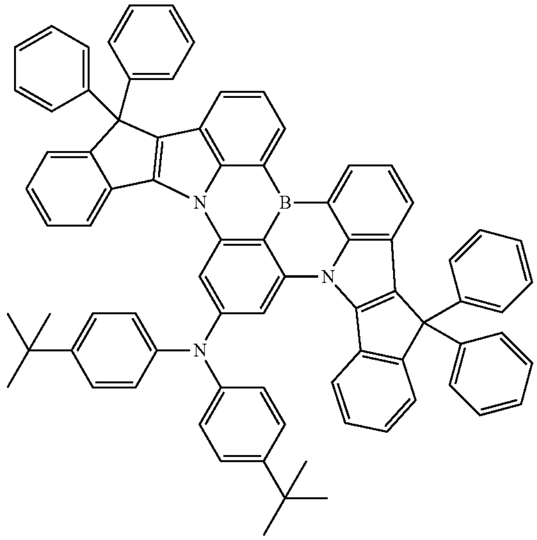
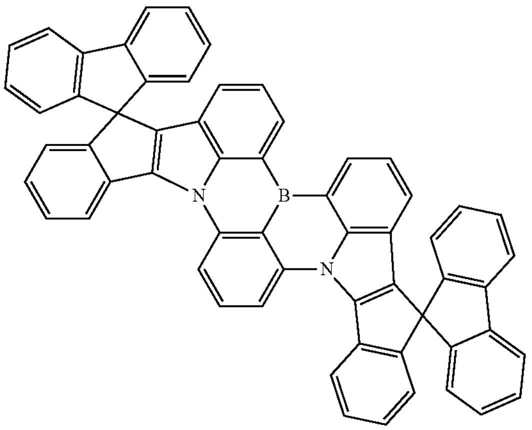
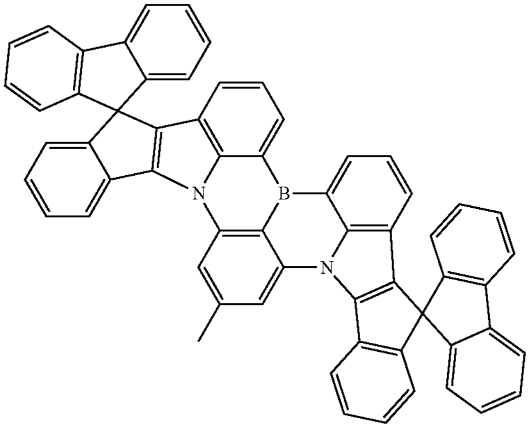

-continued
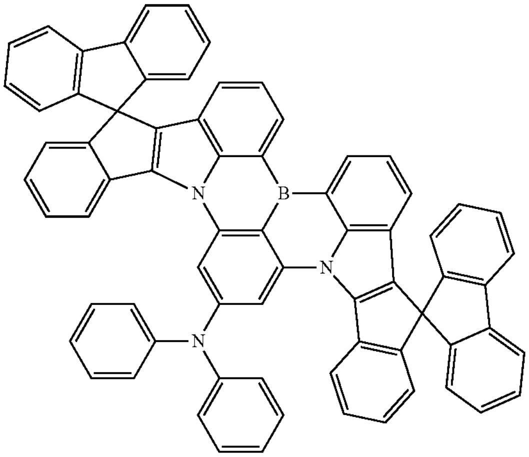
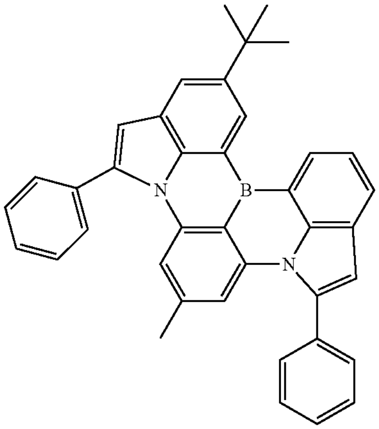
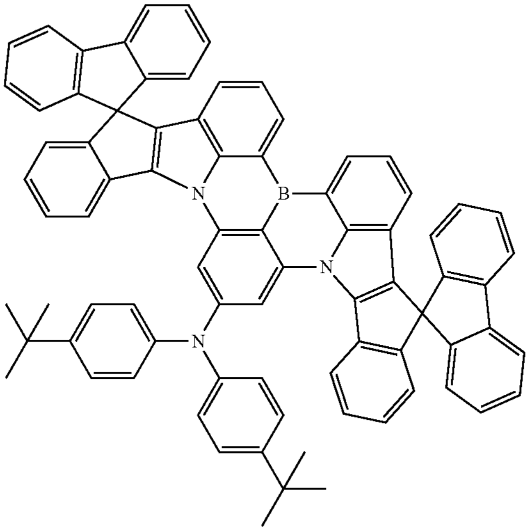
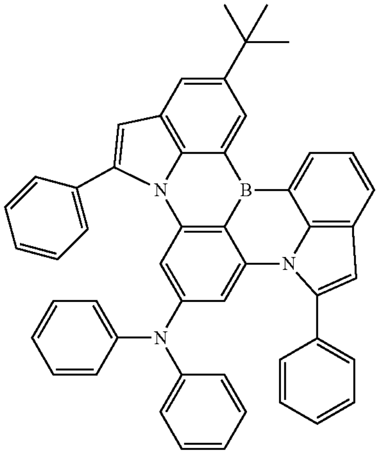
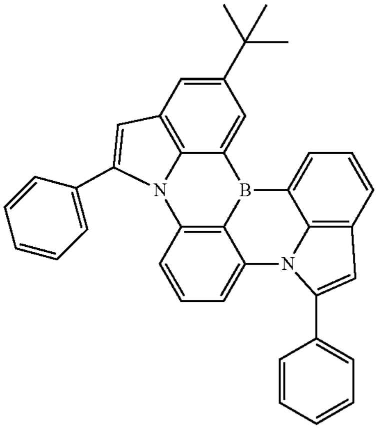 [SMILES: CC(C)(C)c1cc2c3c(c1)cc(-c1ccccc1)n3-c1cccc3c1B2c1cccc2cc(-c4ccccc4)n-3c12]
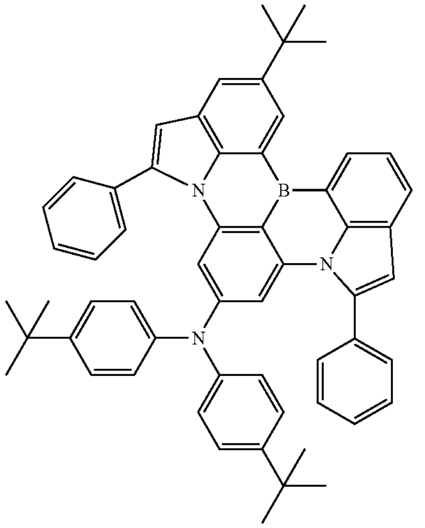

-continued
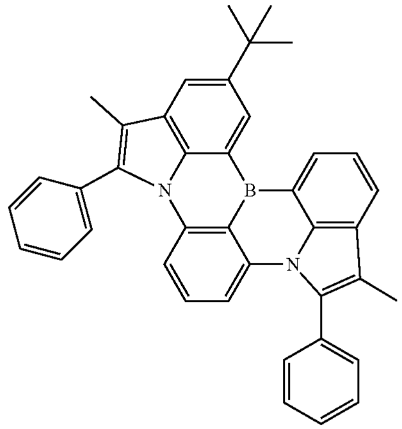
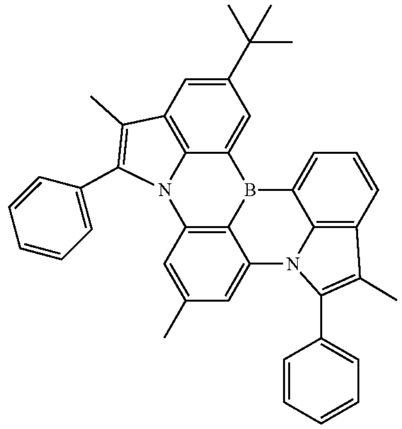
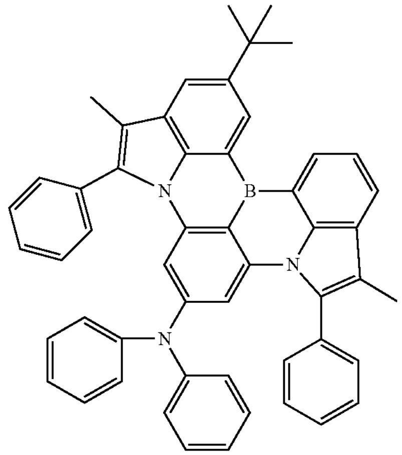
-continued
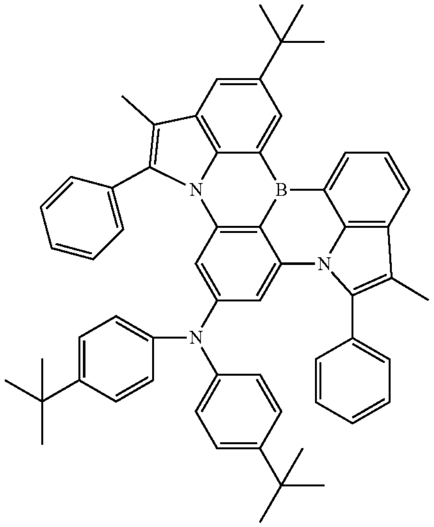
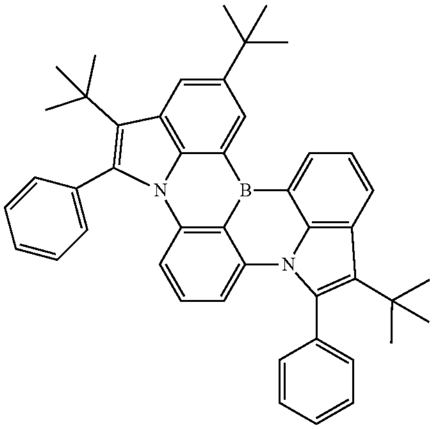
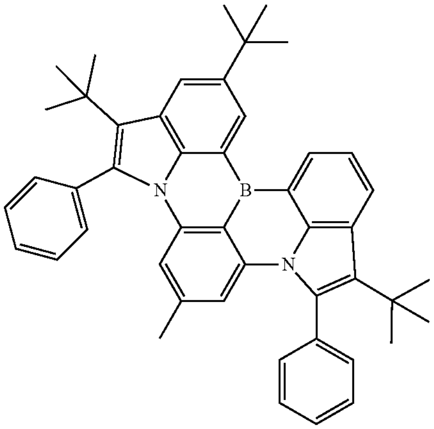

-continued
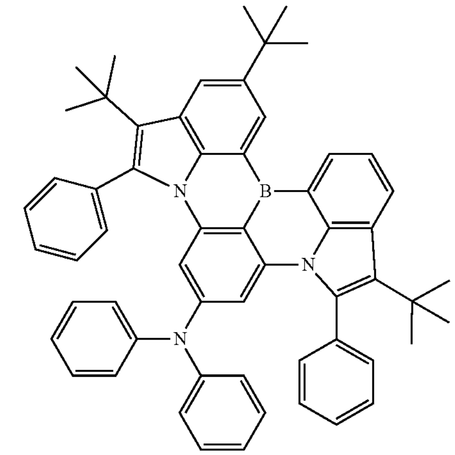
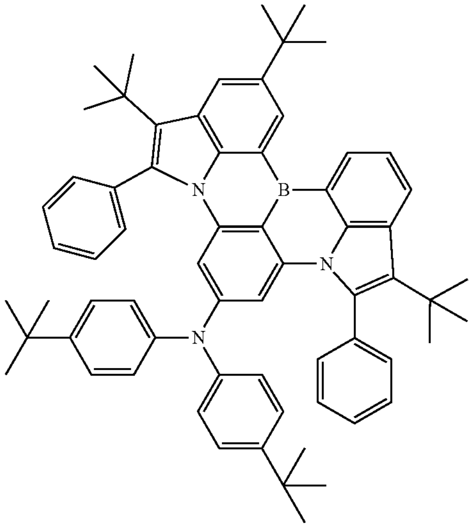
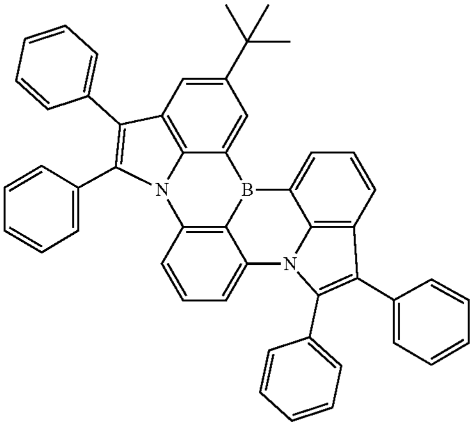
-continued
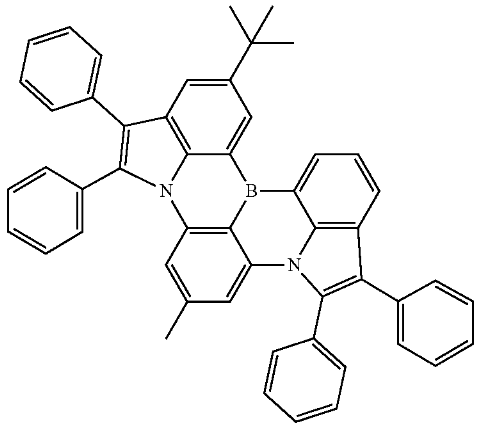
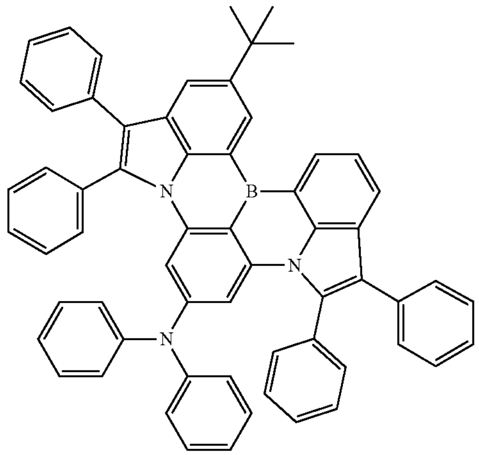
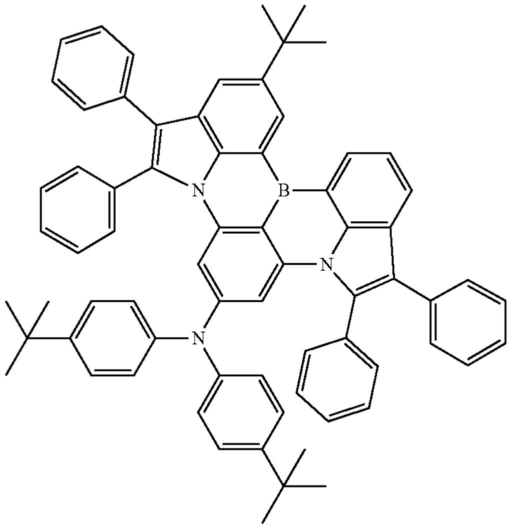

-continued
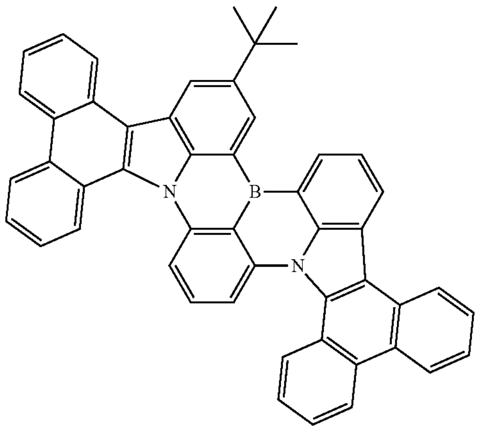
-continued
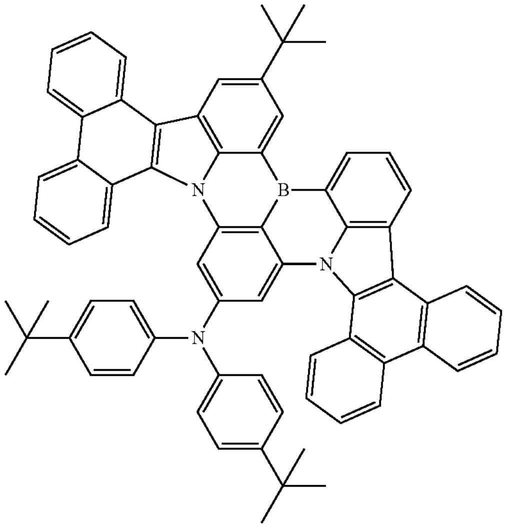
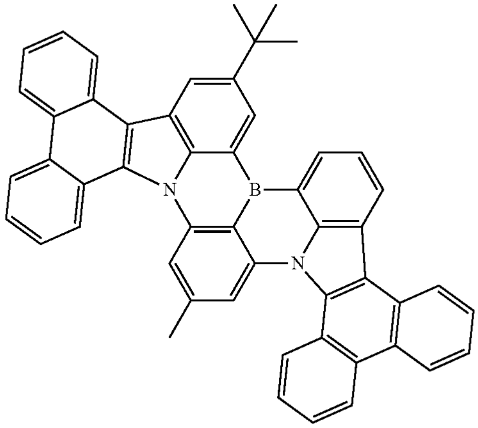
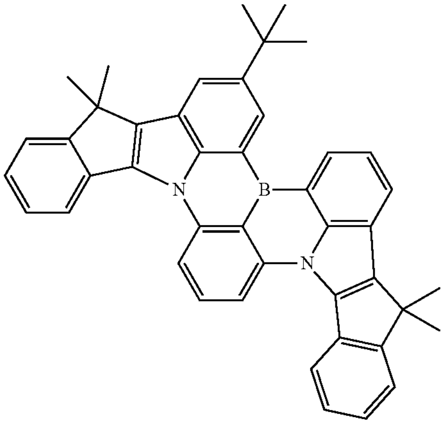
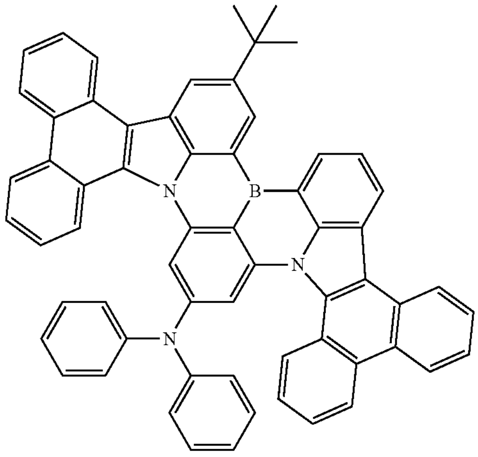
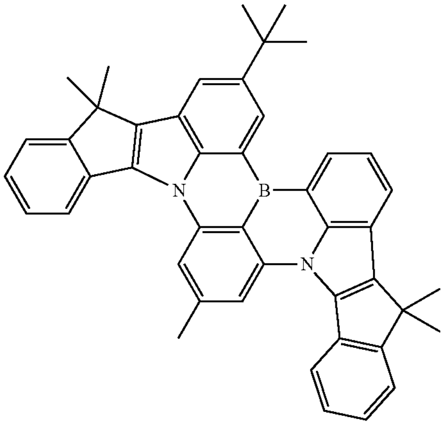

-continued
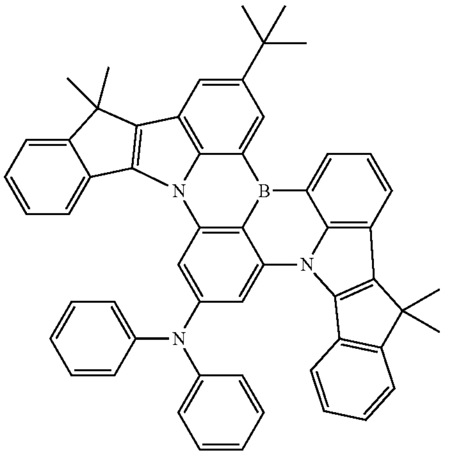
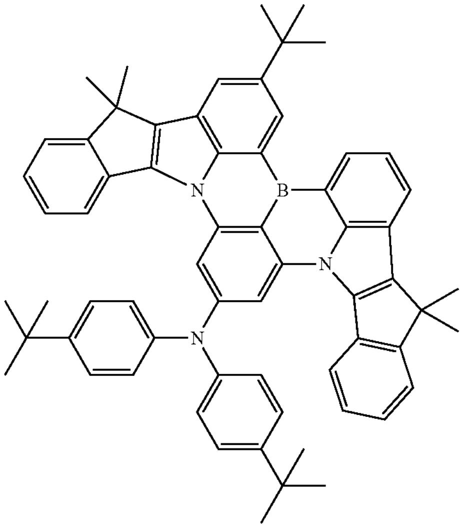
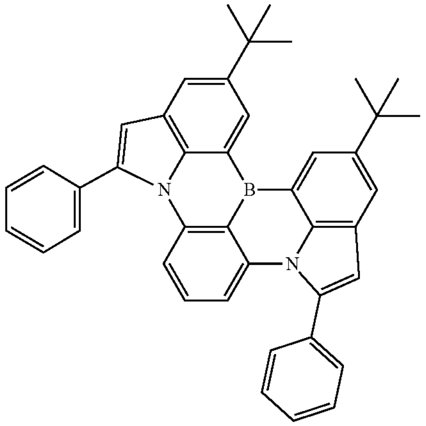
-continued
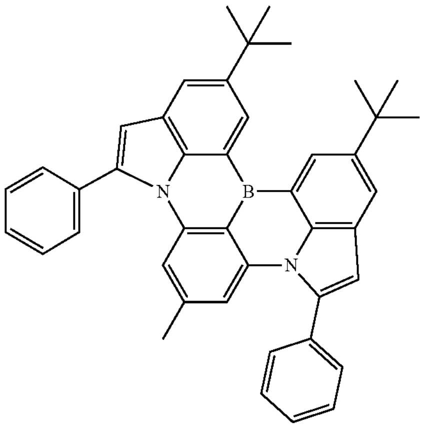
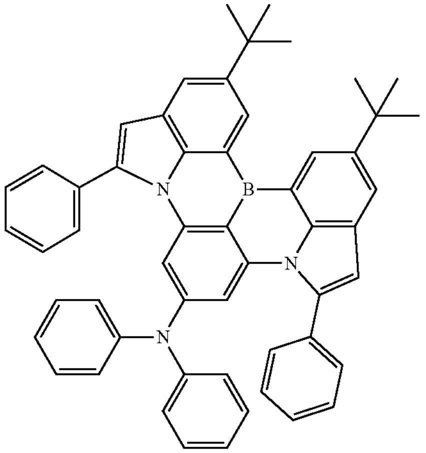
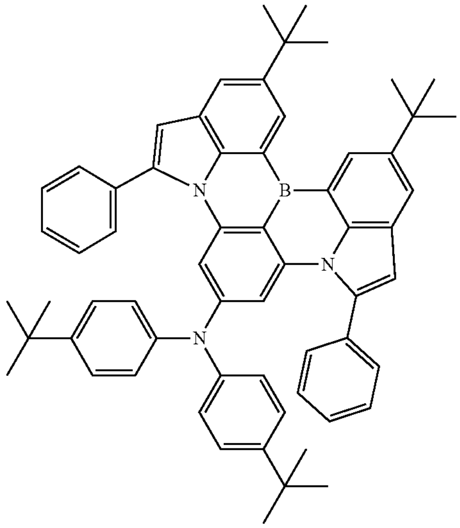

-continued
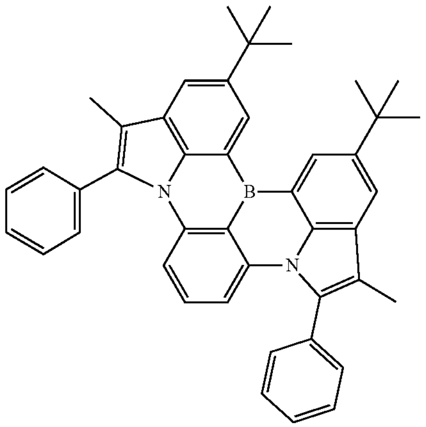
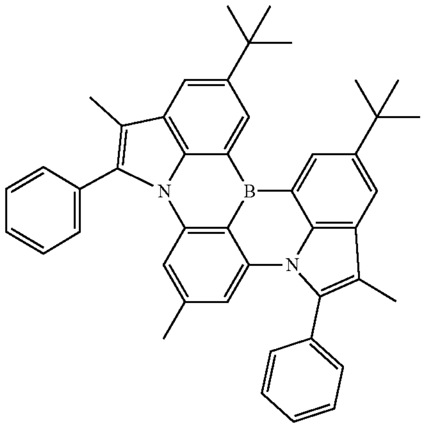
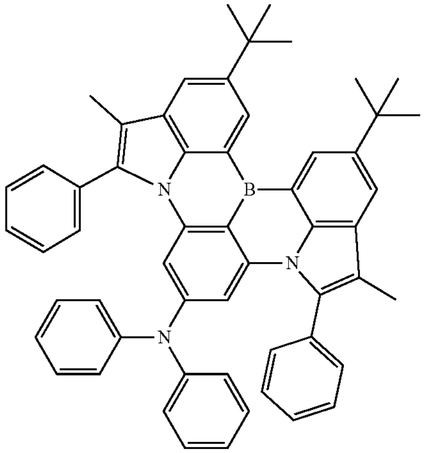
-continued
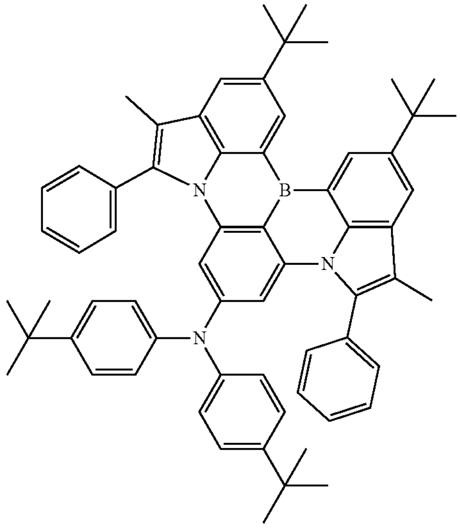
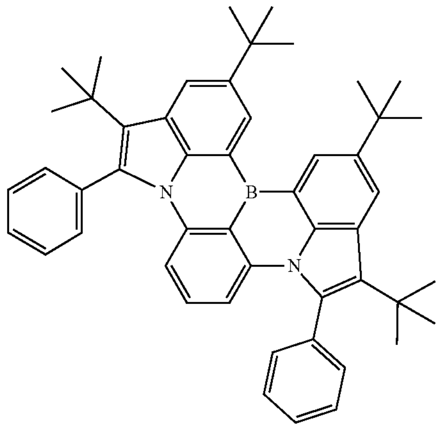
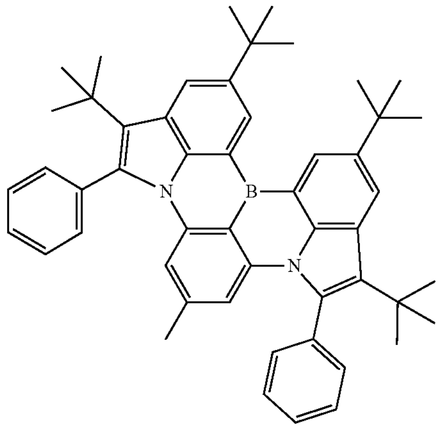

-continued
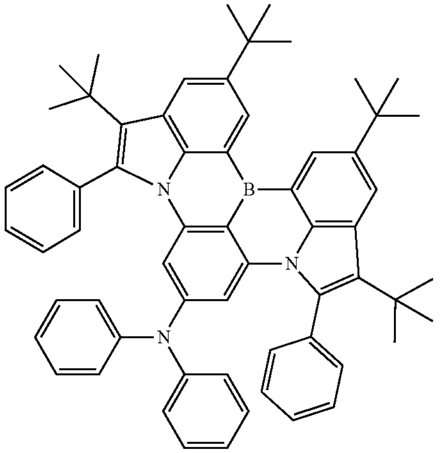
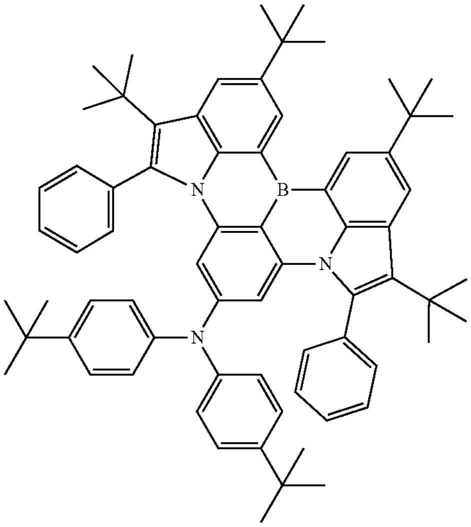
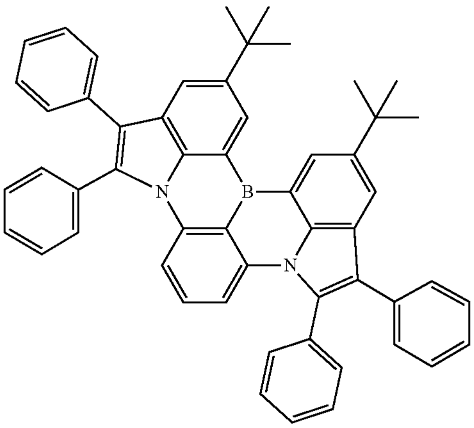
-continued
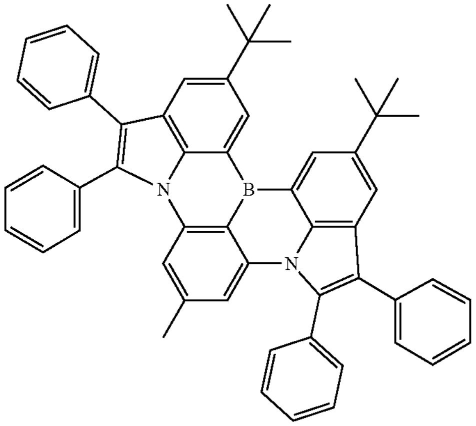
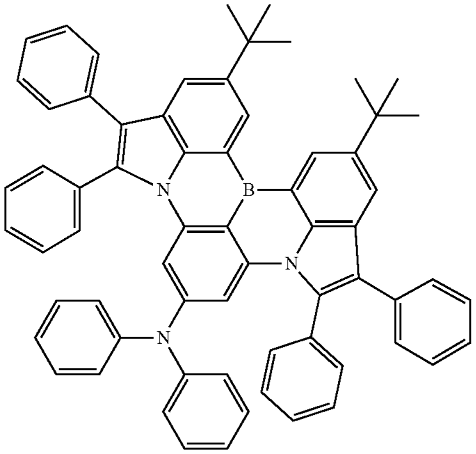
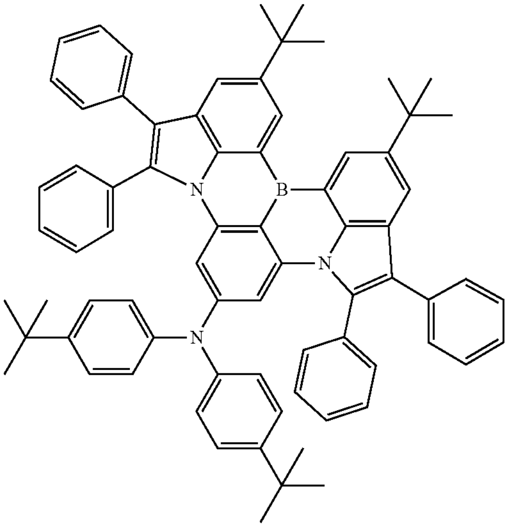

-continued
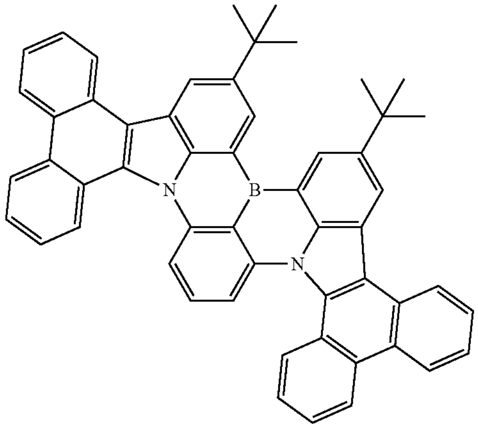
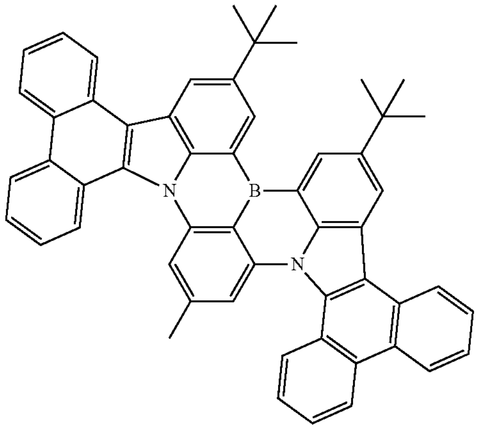
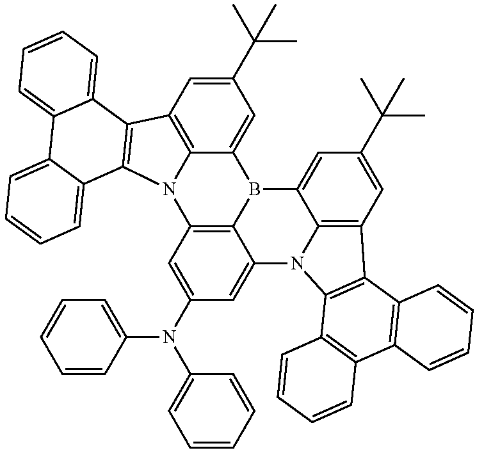
-continued
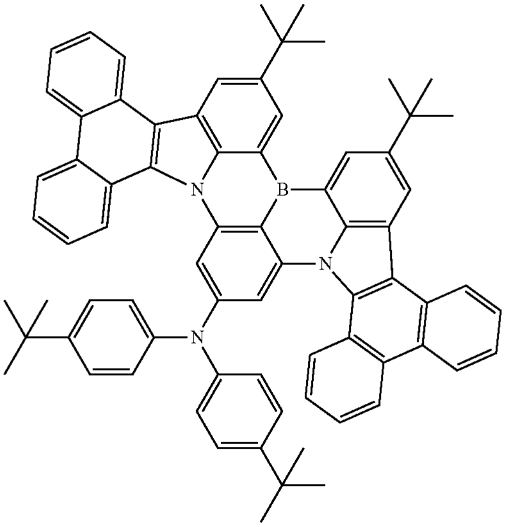
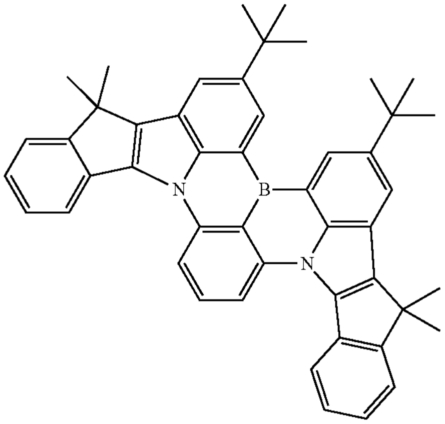
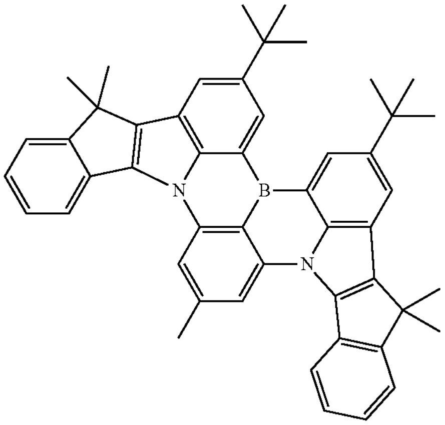

-continued
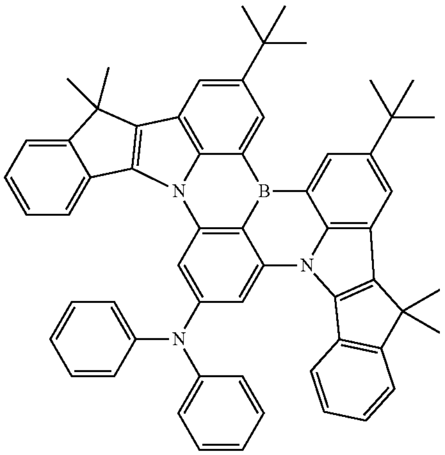
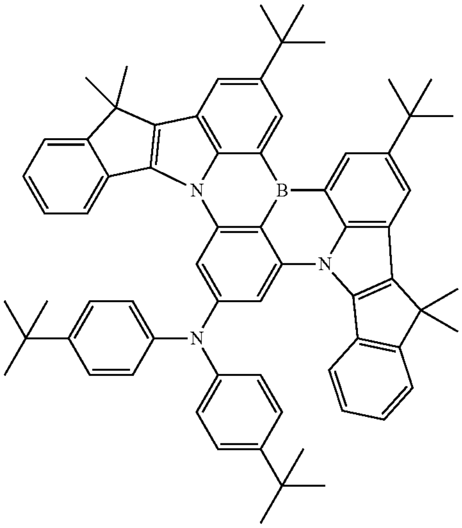
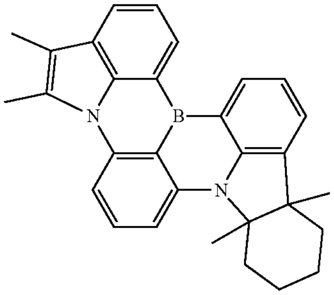
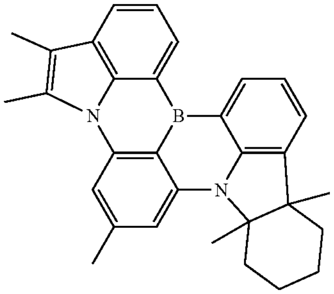
-continued
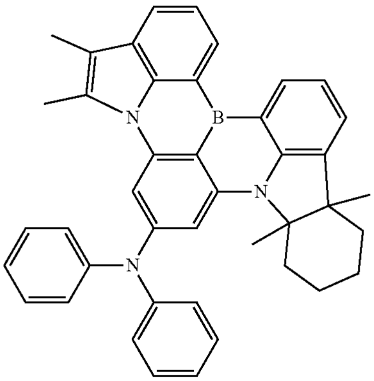
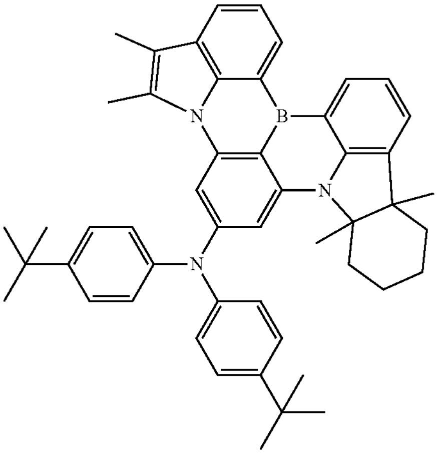
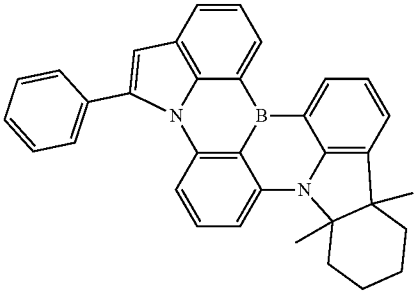
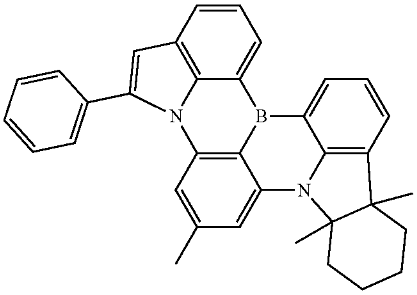

-continued
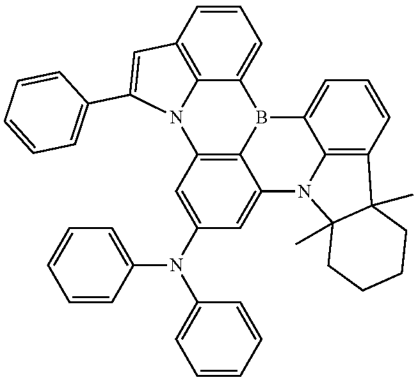
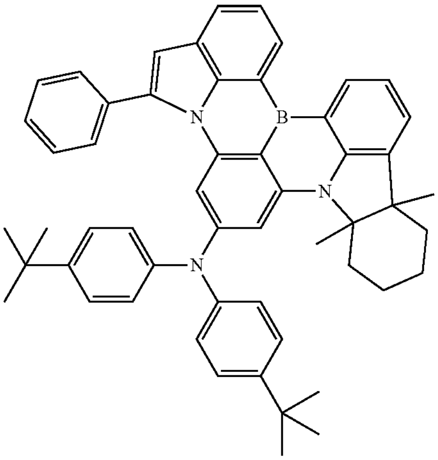
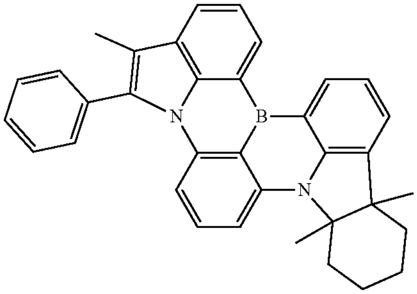
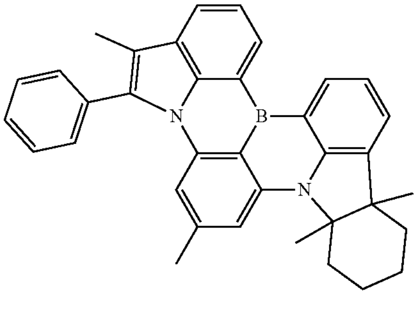
-continued
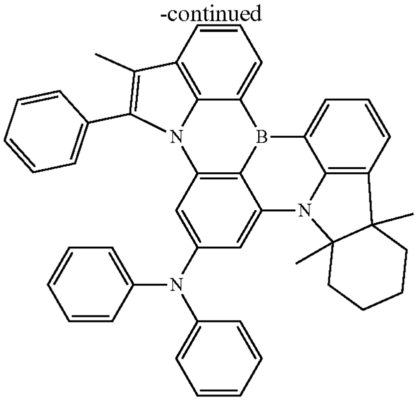
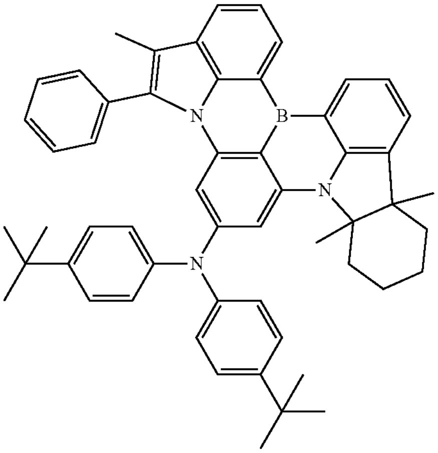
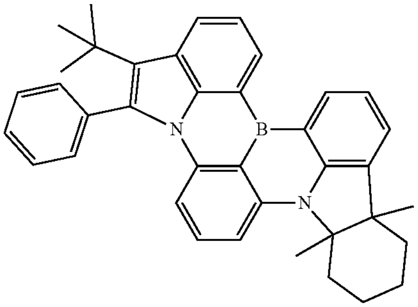
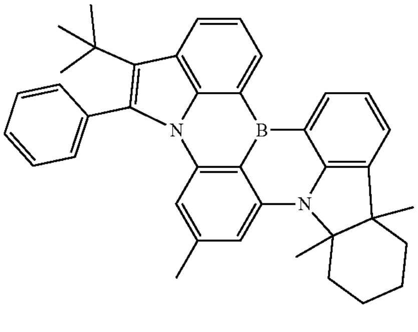

-continued
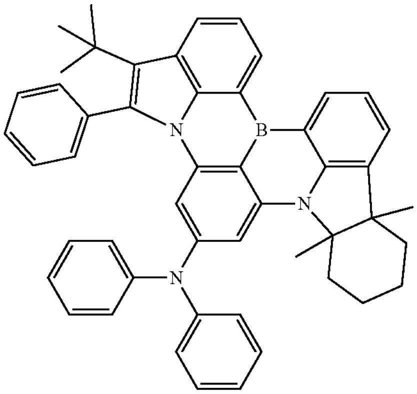
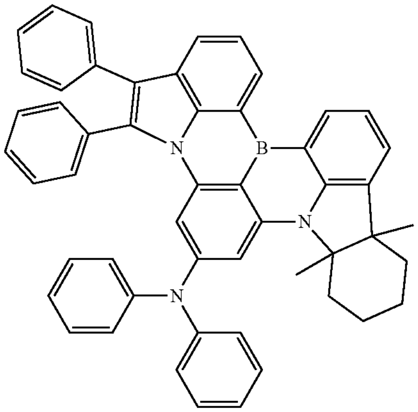
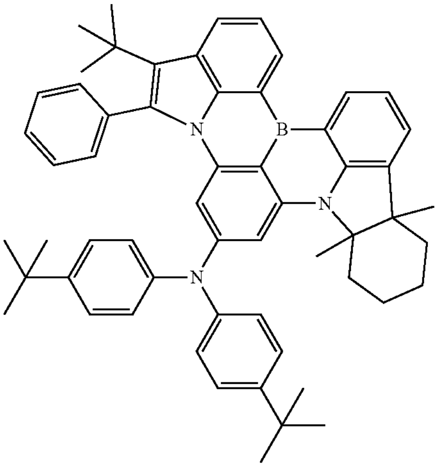
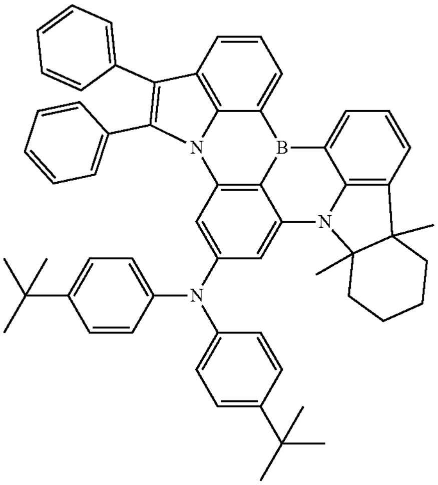
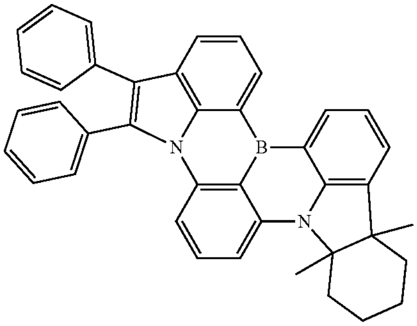
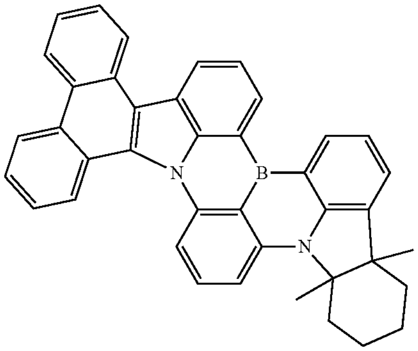
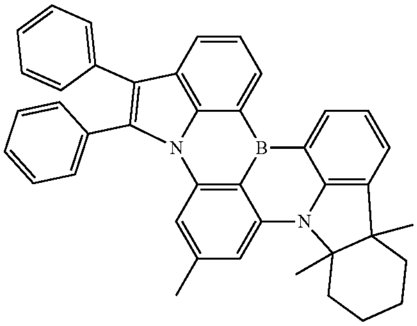
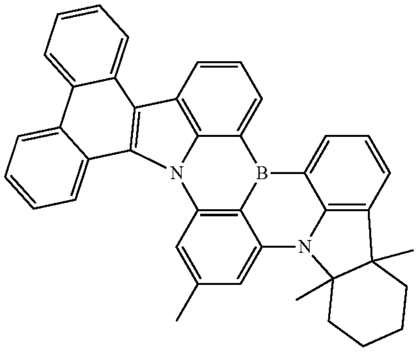

-continued
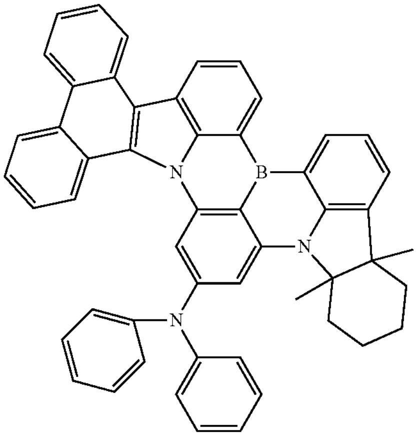
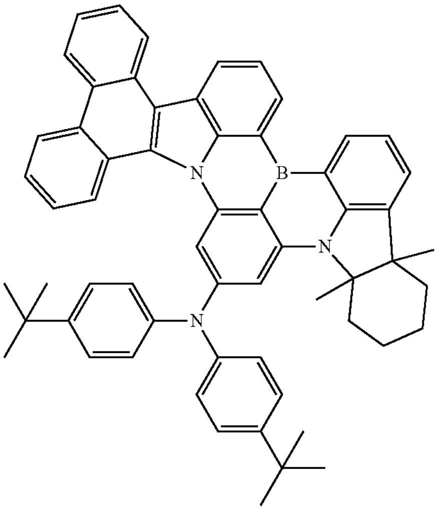
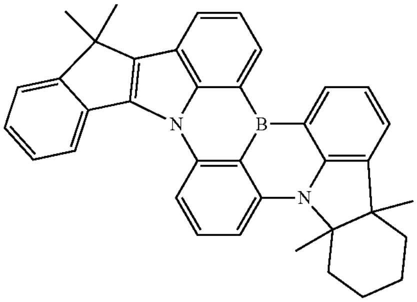
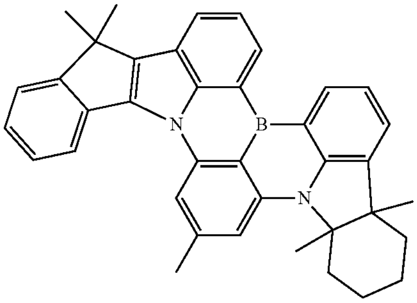
-continued
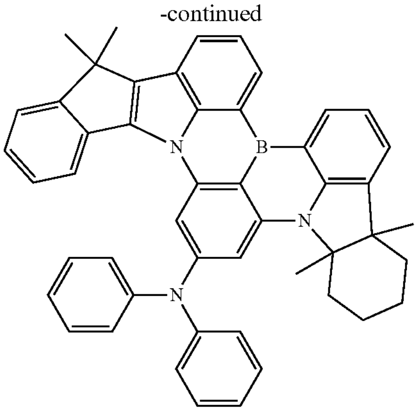
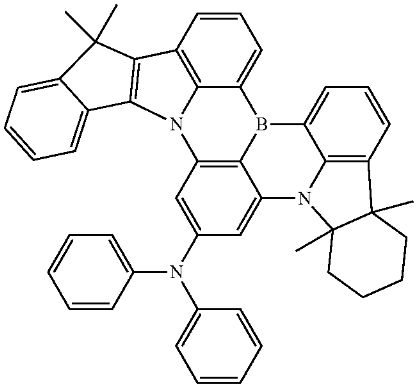
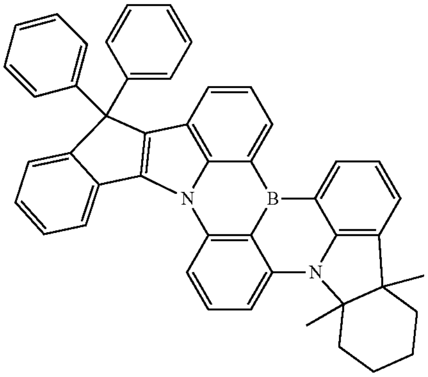
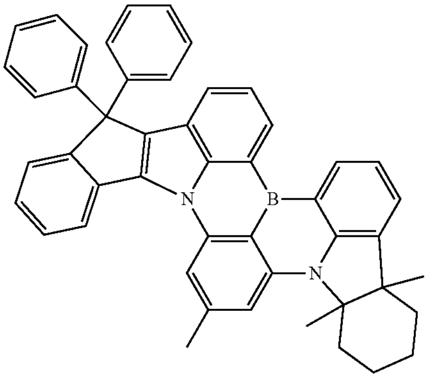

-continued
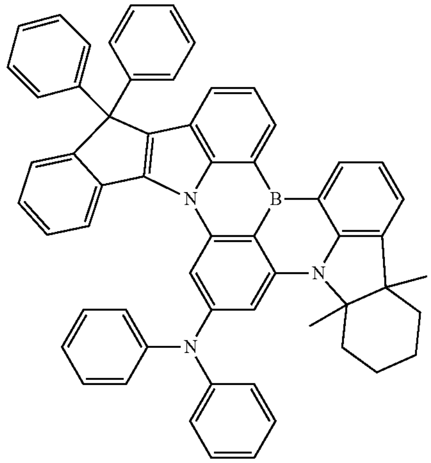
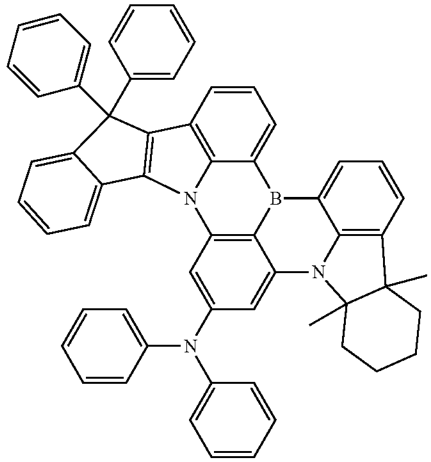
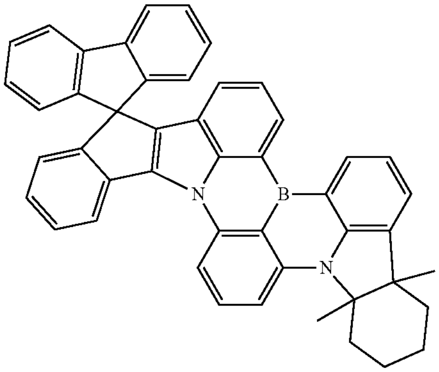
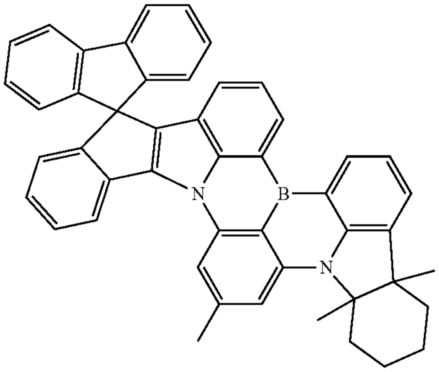
-continued
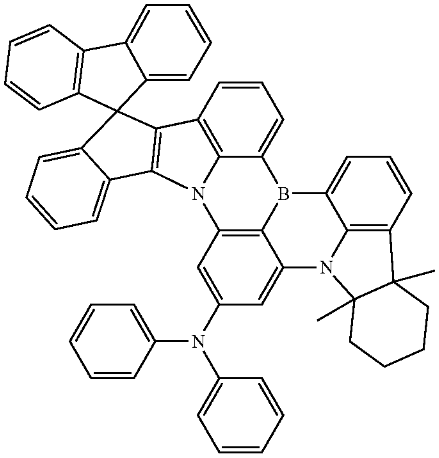
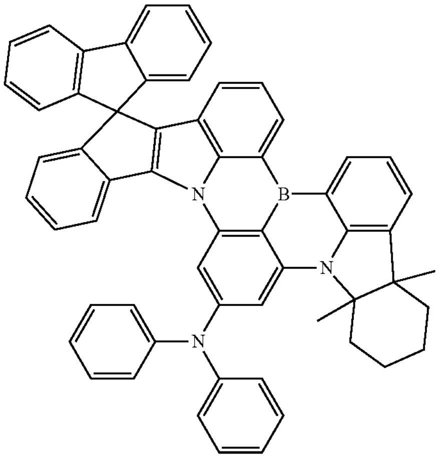
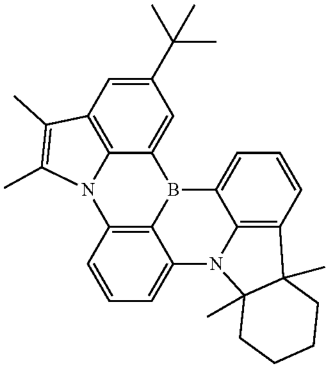
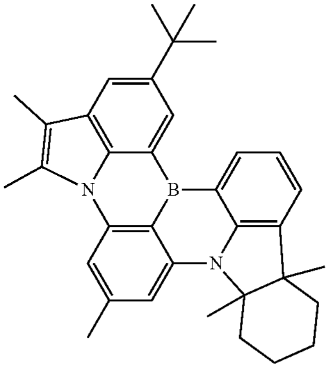

-continued
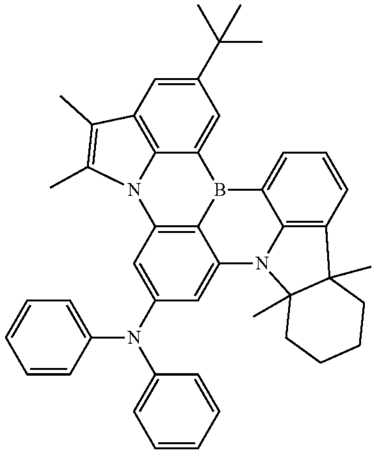
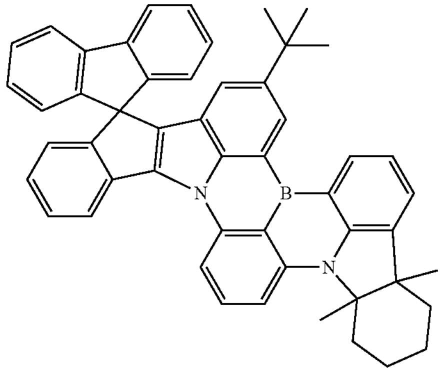
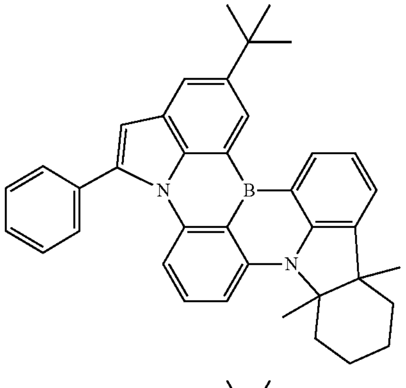
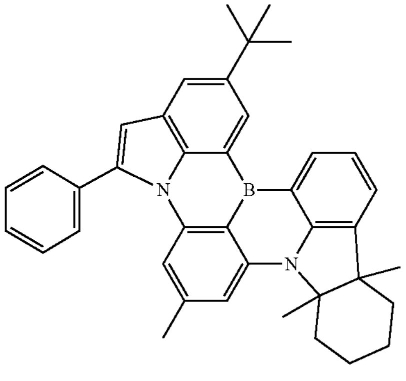
-continued
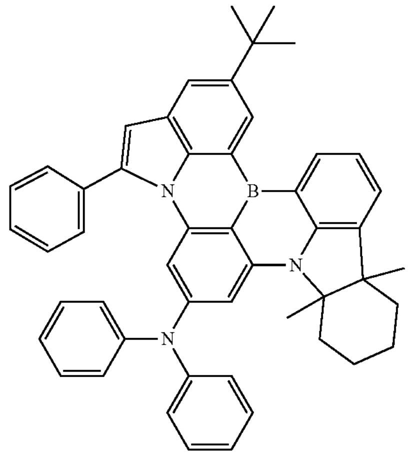
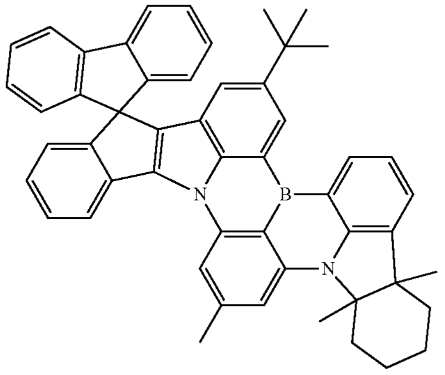
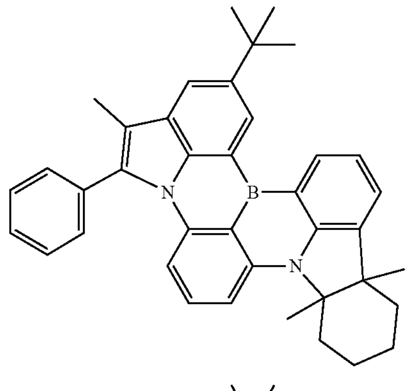
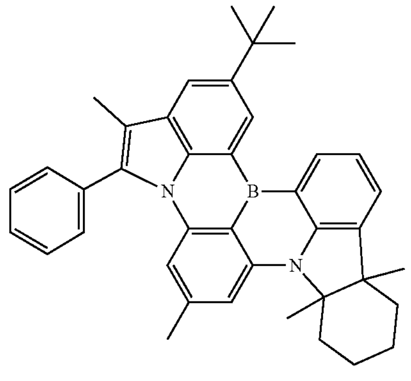

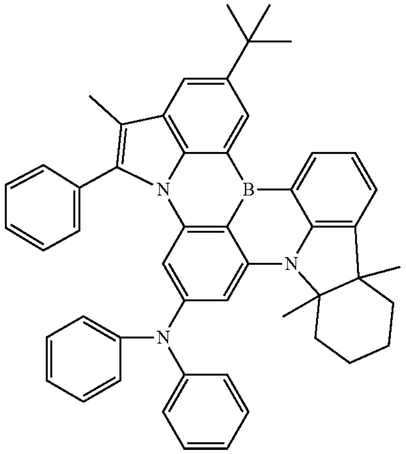
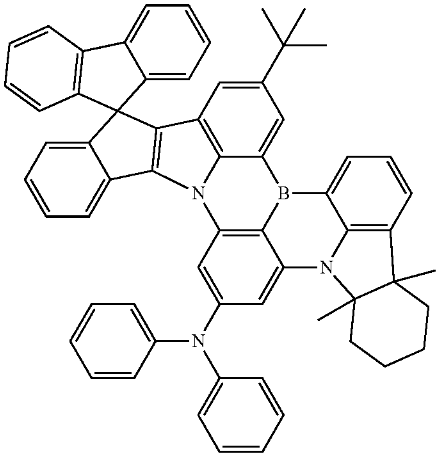
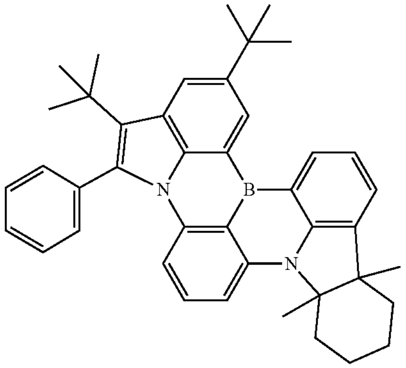
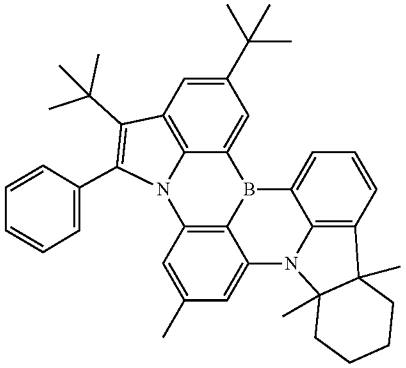
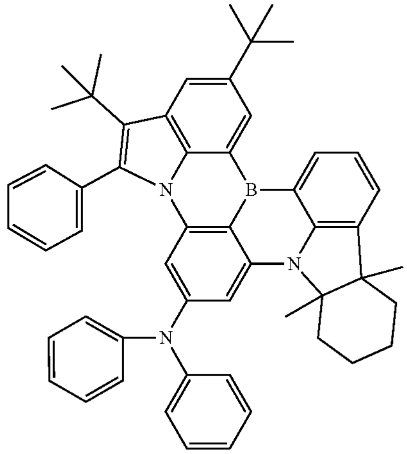
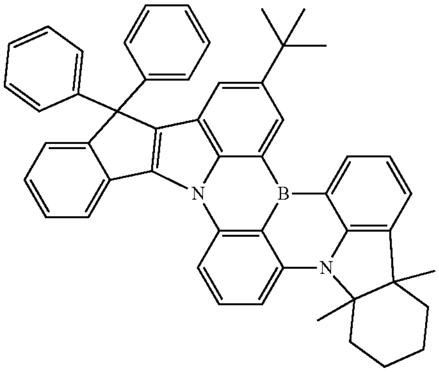
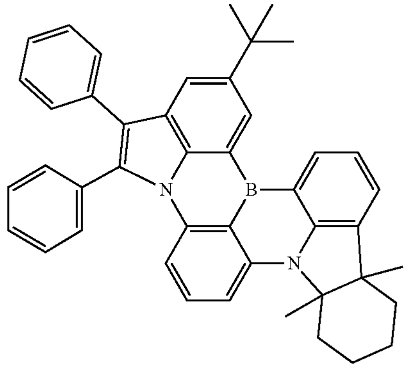
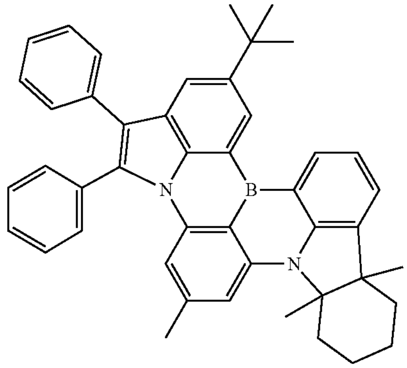

-continued
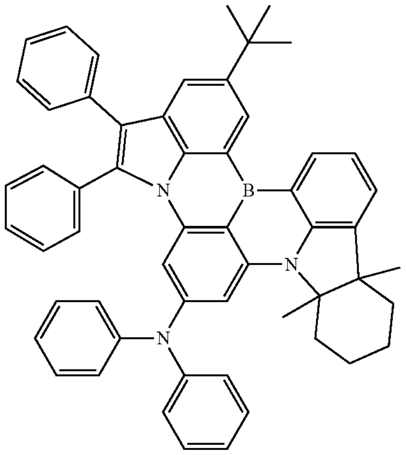
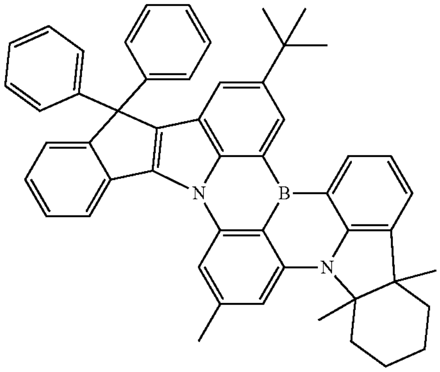
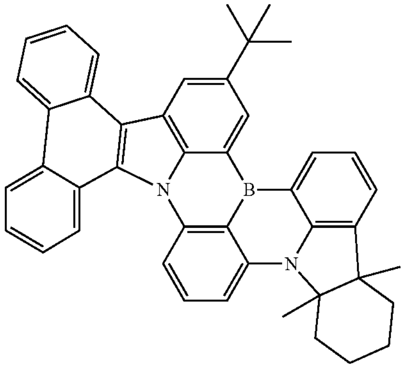
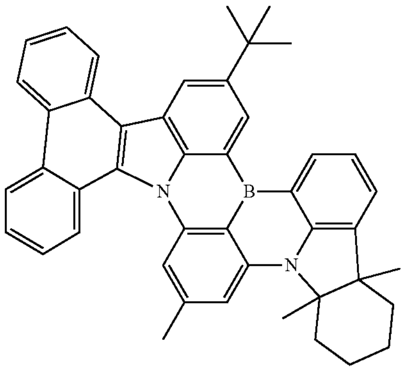
-continued
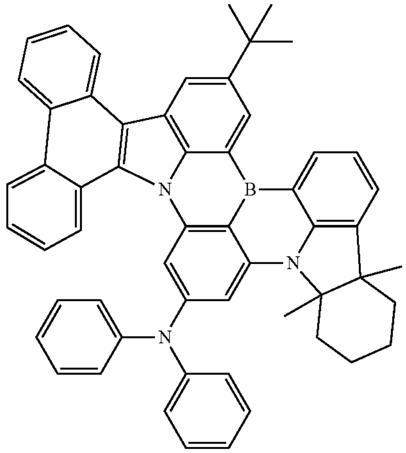
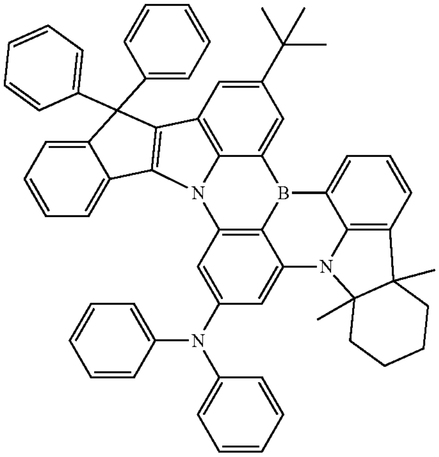
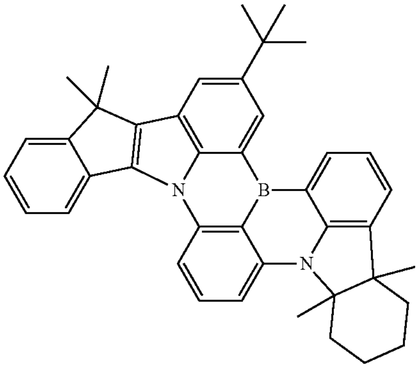
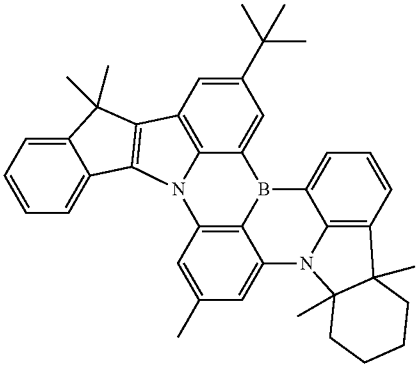

-continued
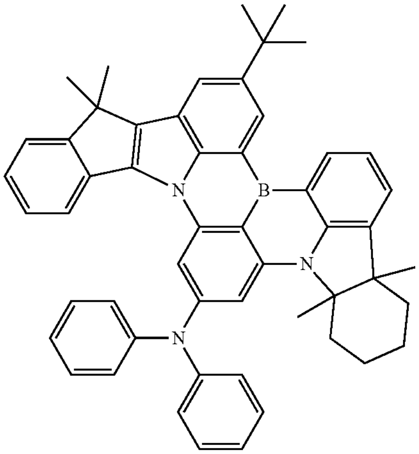
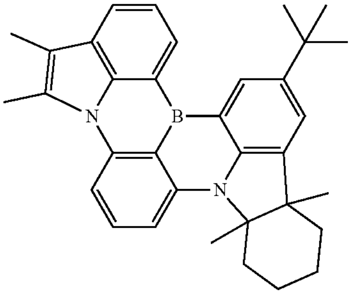
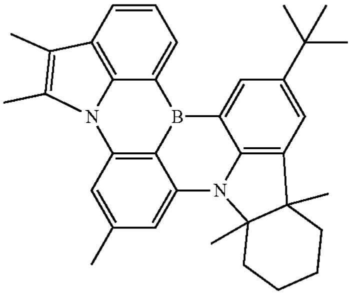
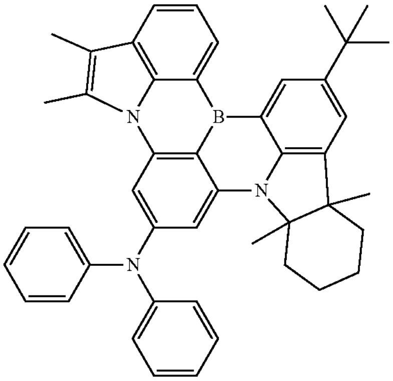
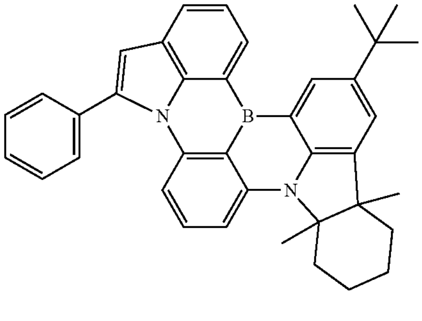
-continued
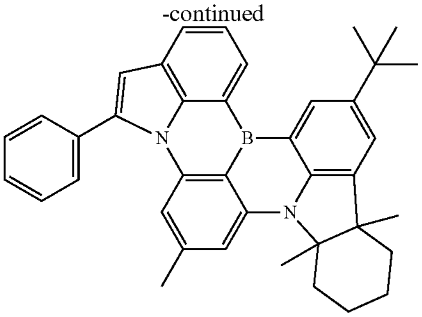
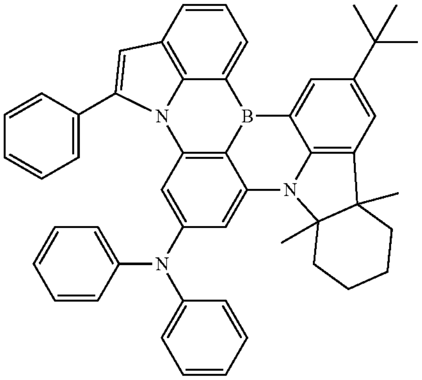
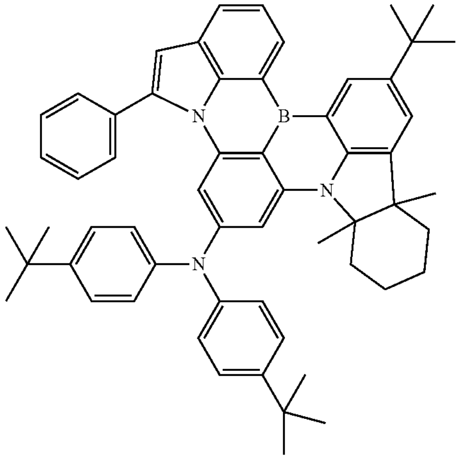
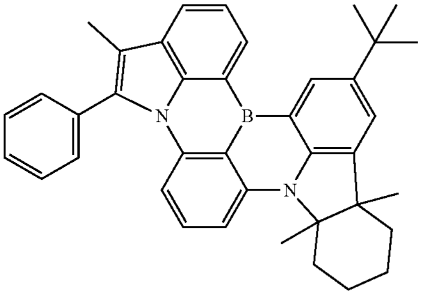
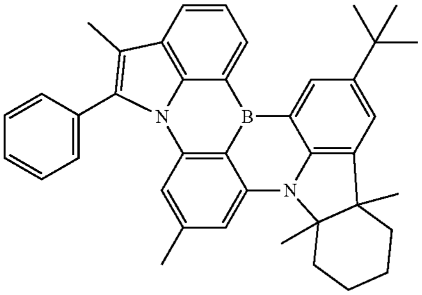

-continued
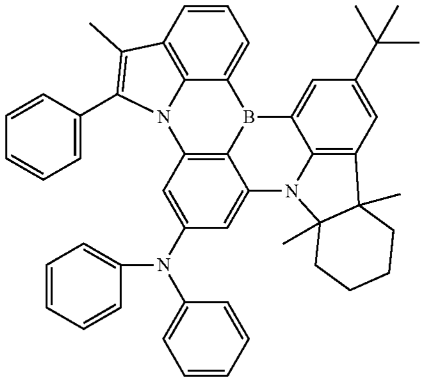
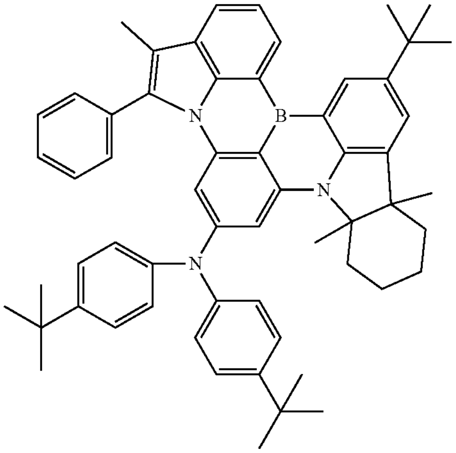
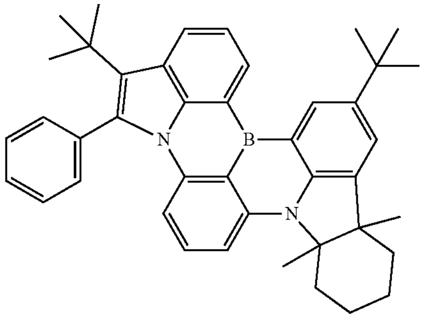
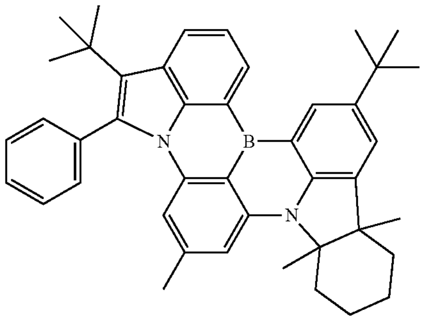
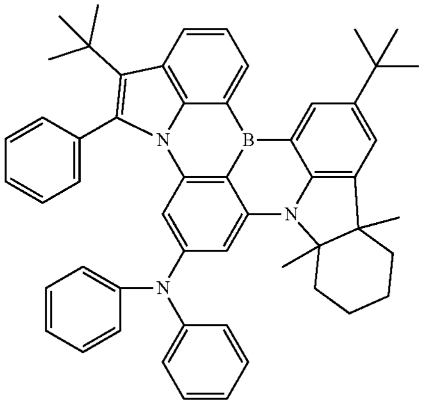
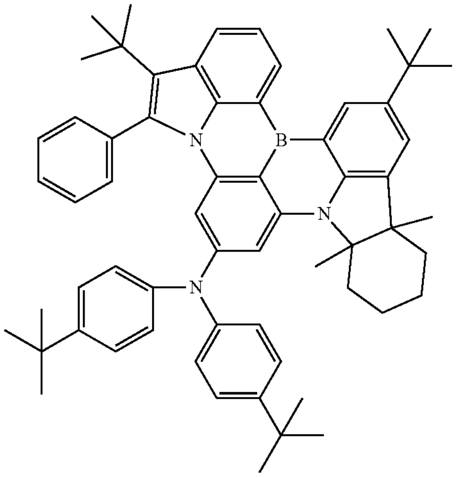
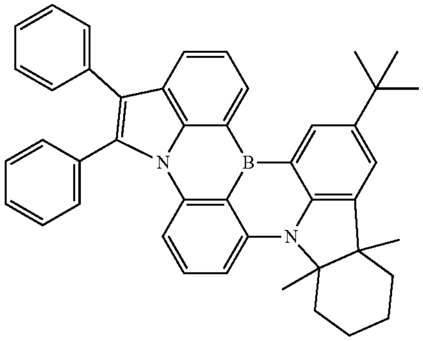
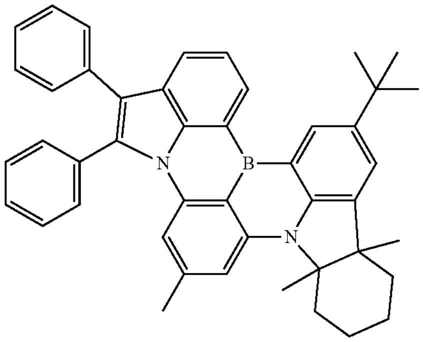
-continued -continued
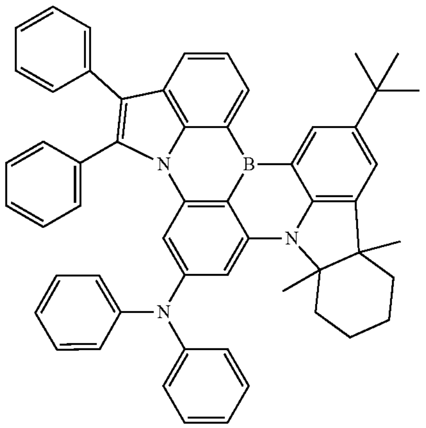
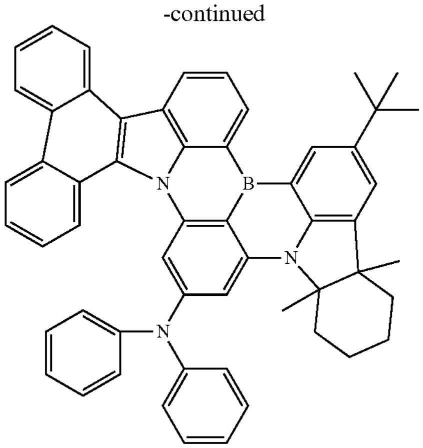
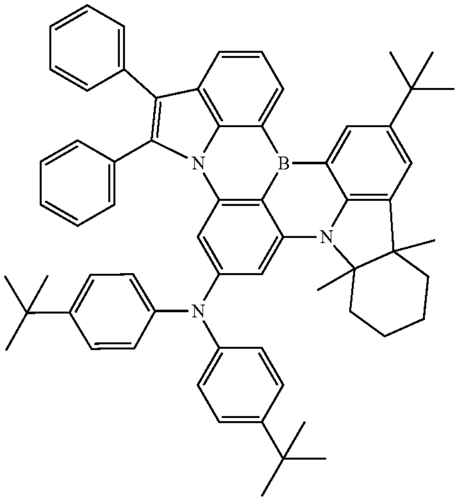
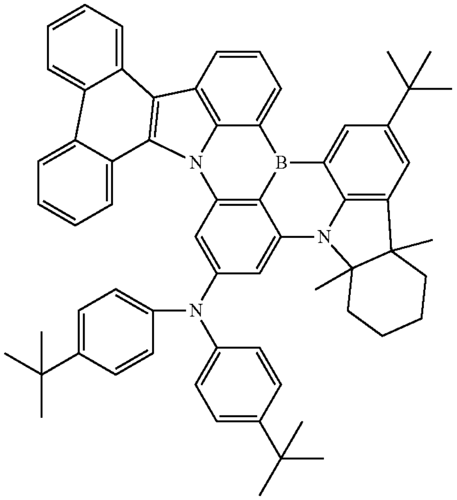
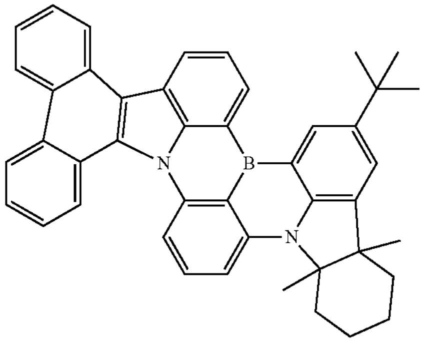
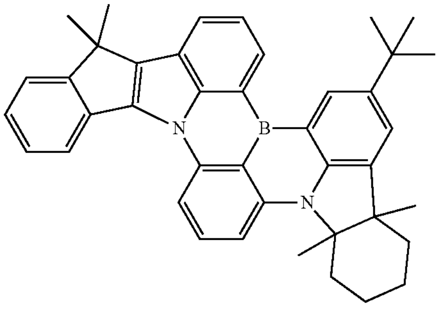
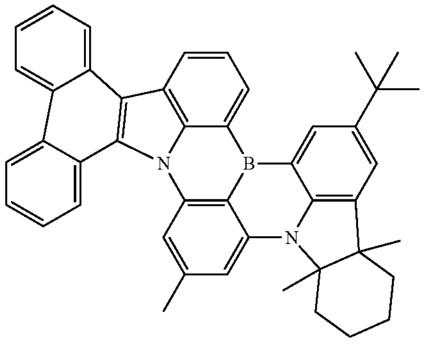
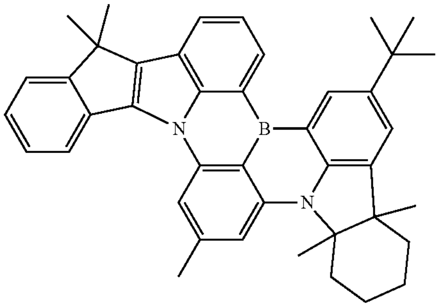
-continued -continued
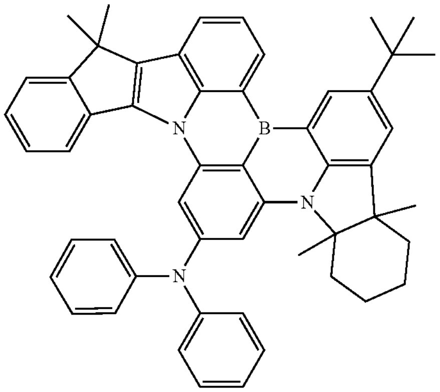
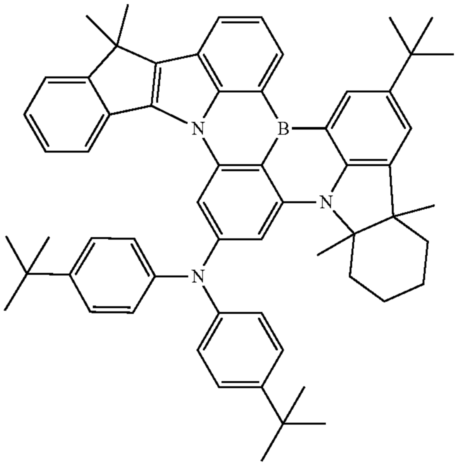
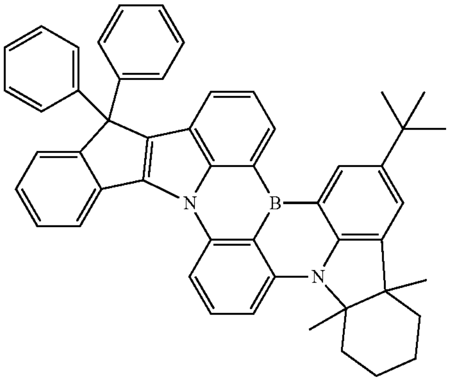
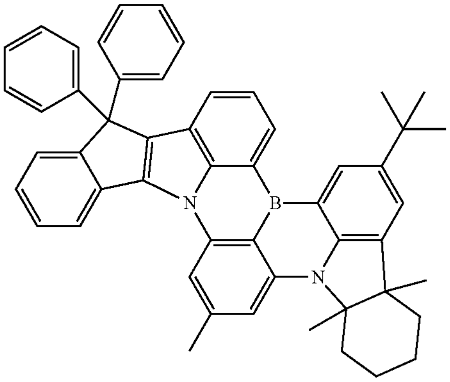
-continued
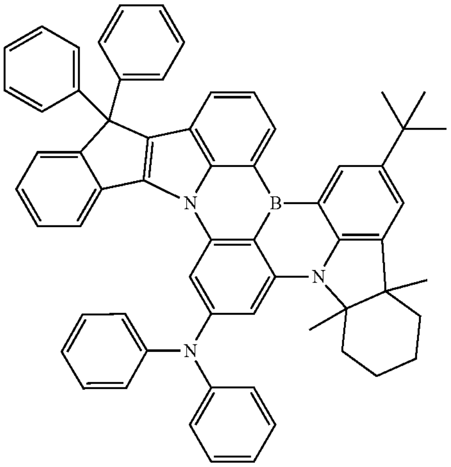
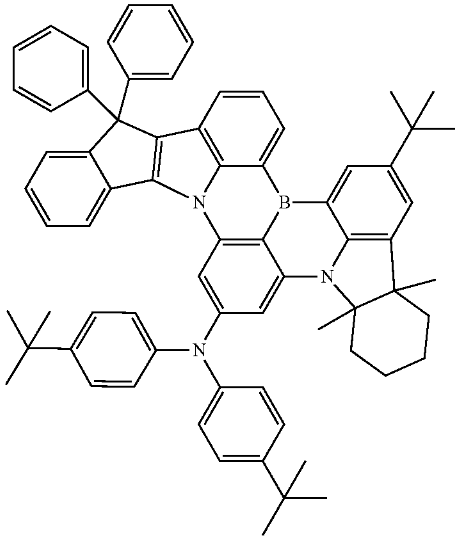
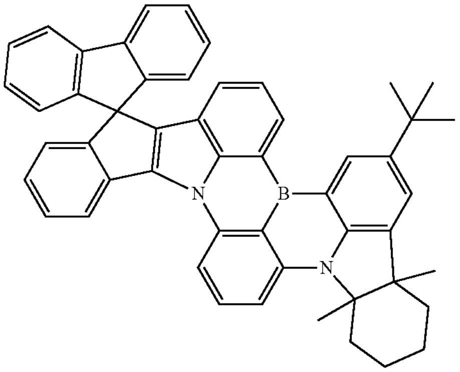

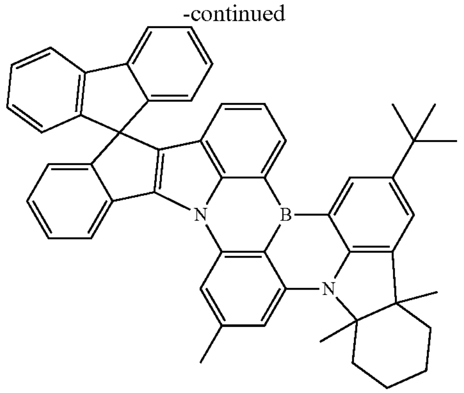
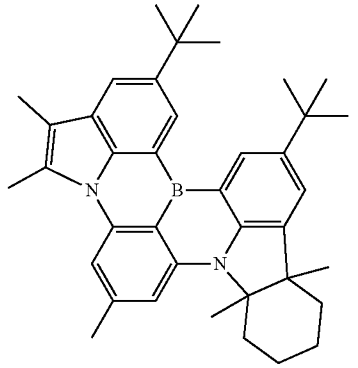
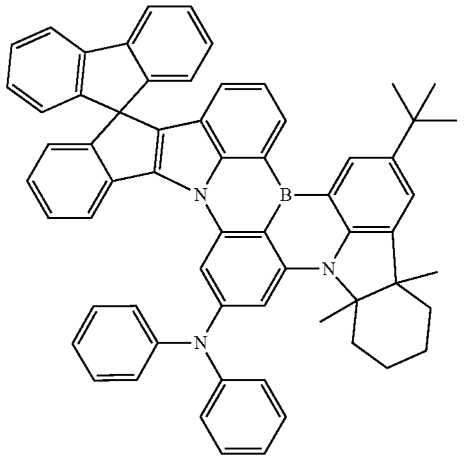
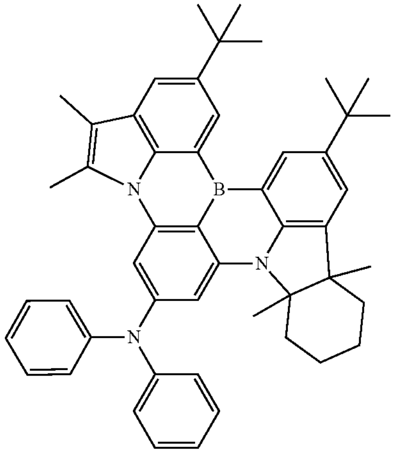
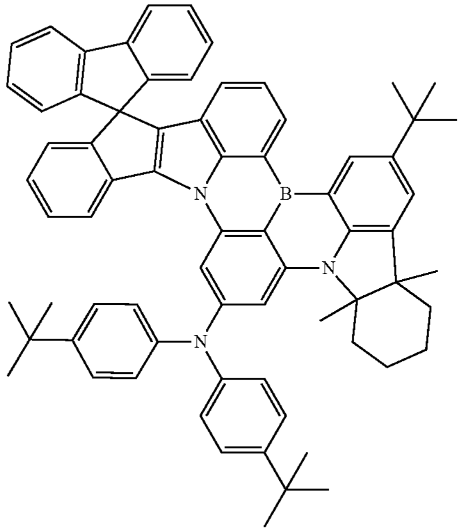
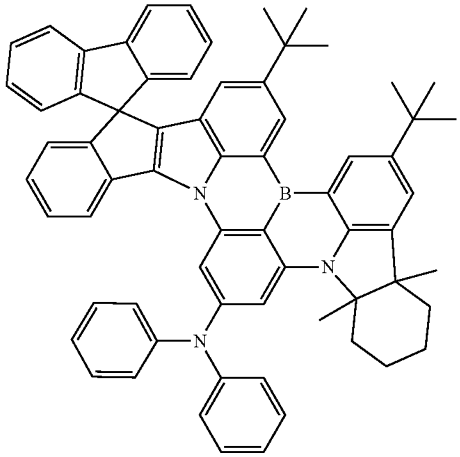
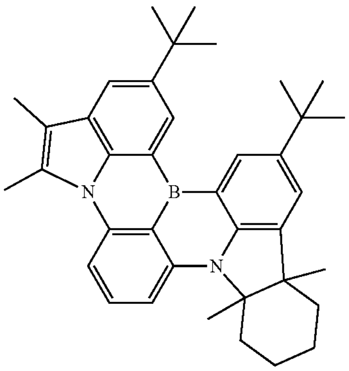
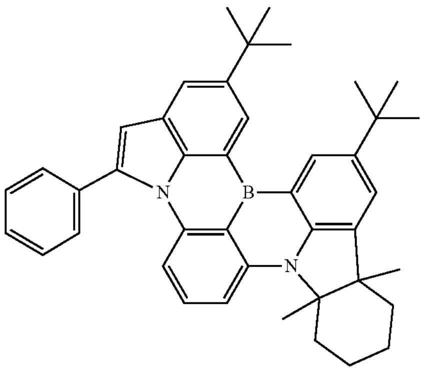

-continued
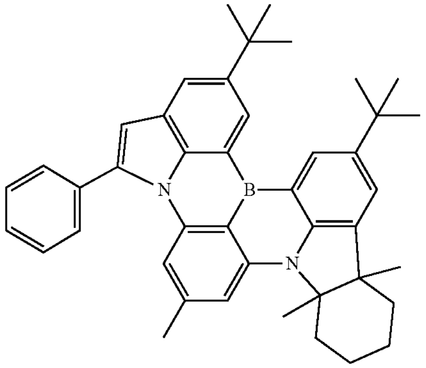
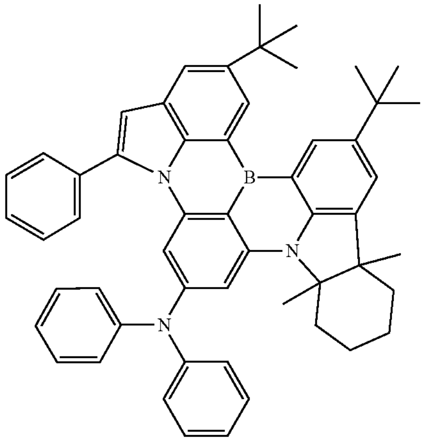
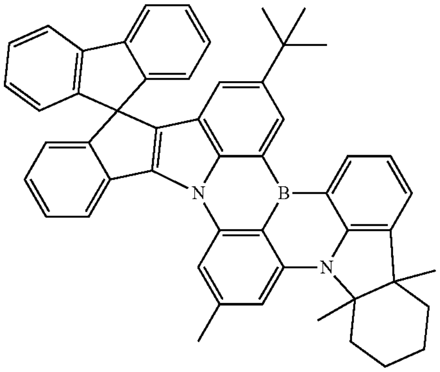
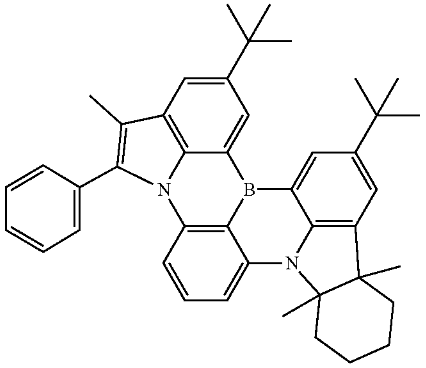
-continued
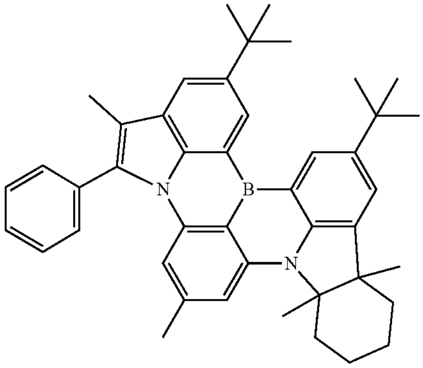
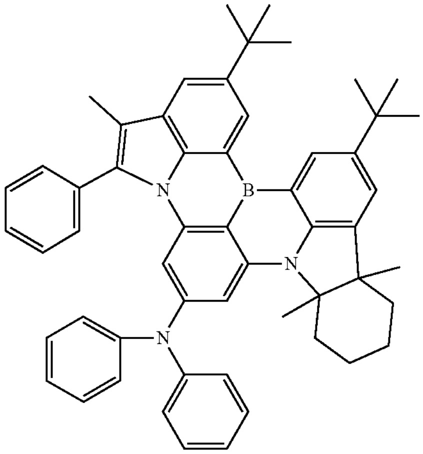
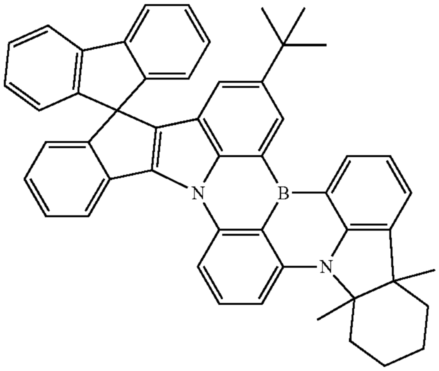
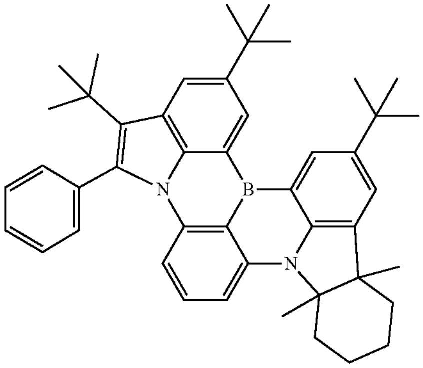

-continued
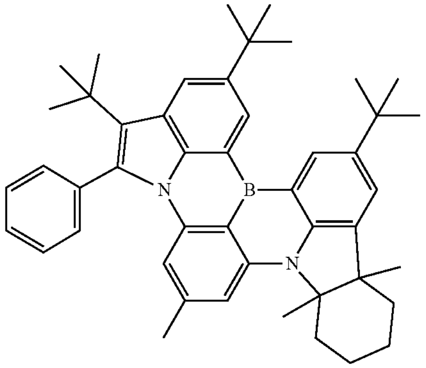
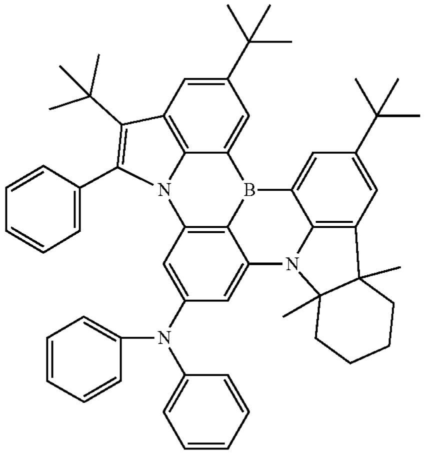
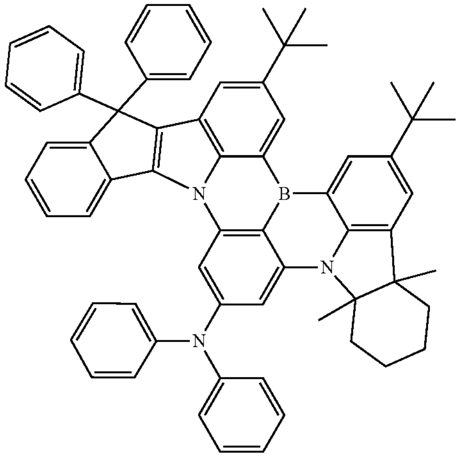
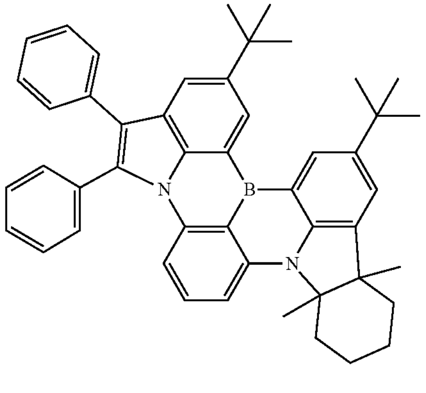
-continued
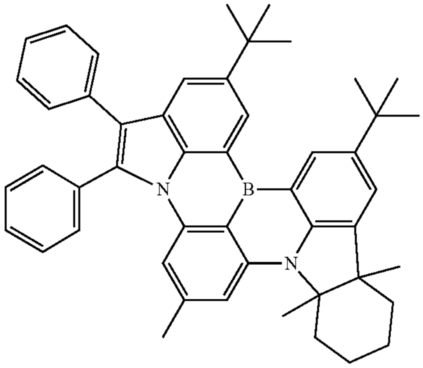
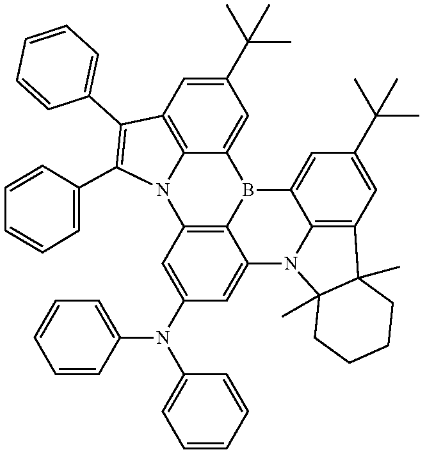
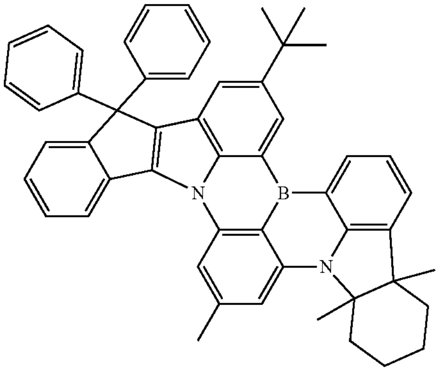
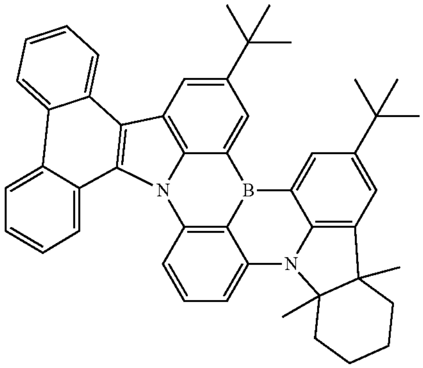

-continued
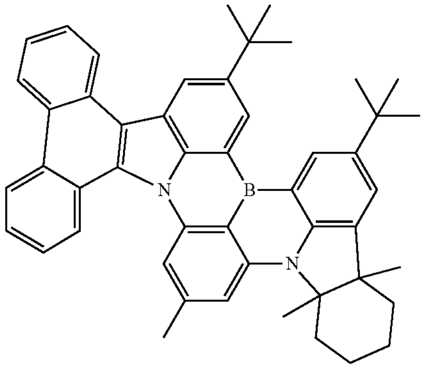
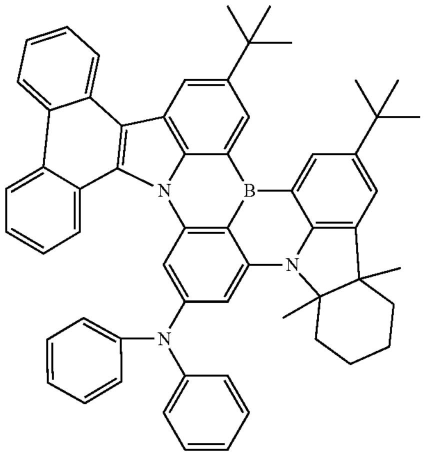
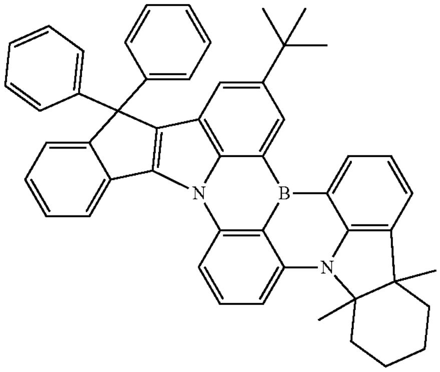
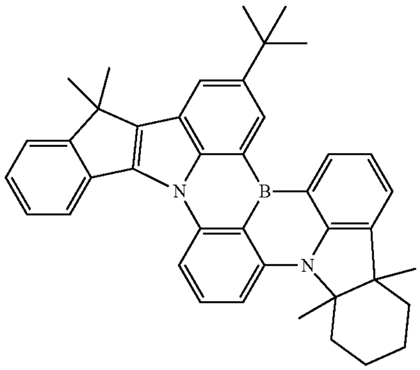
-continued
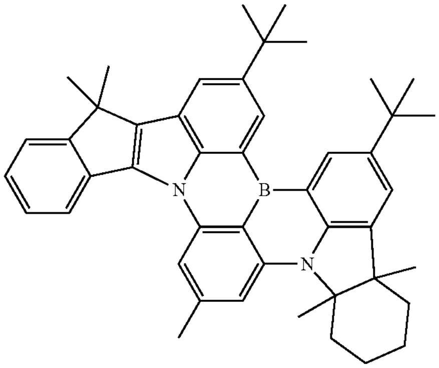
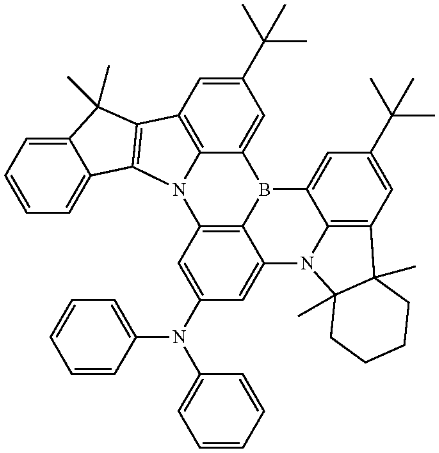
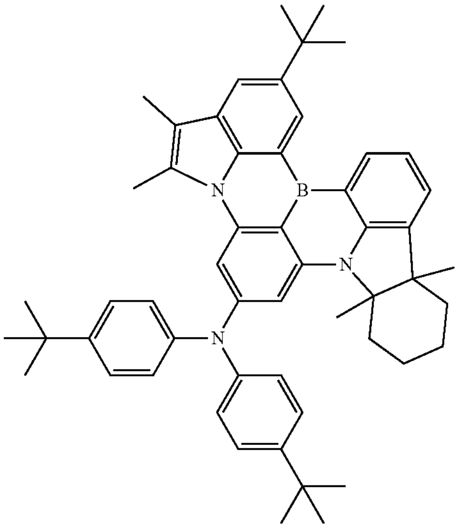

-continued
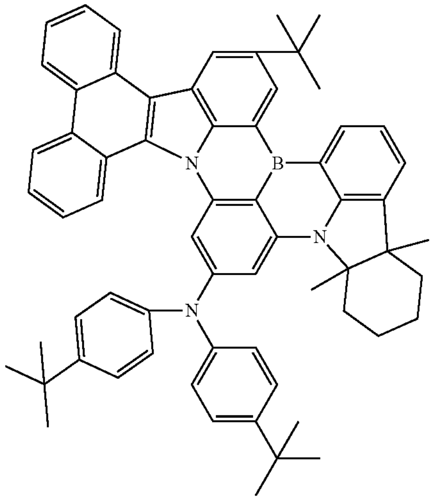
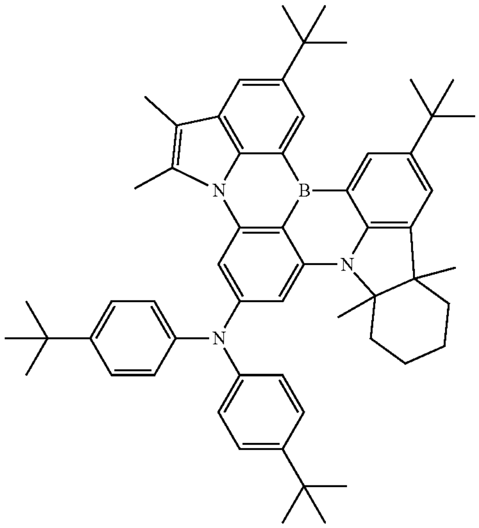
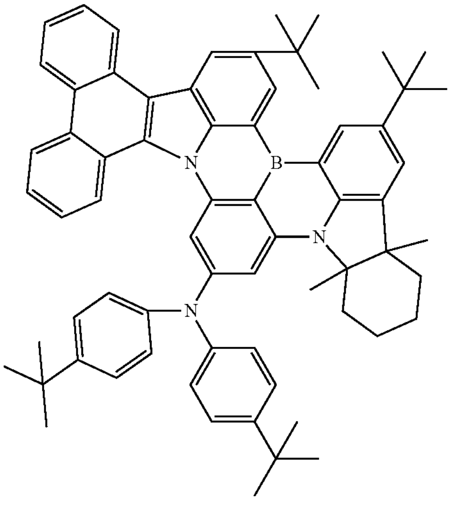
-continued
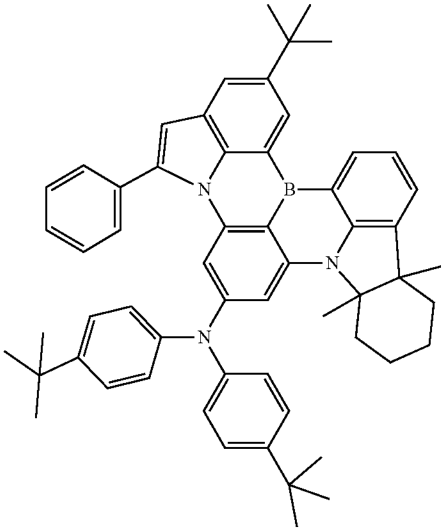
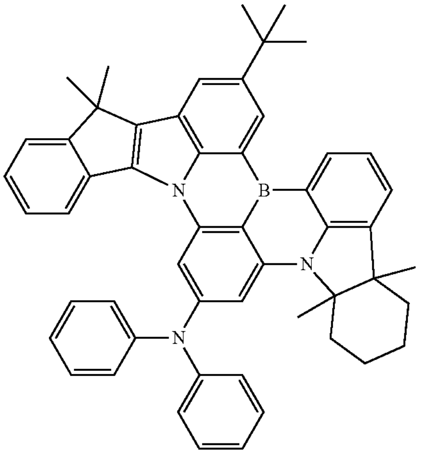
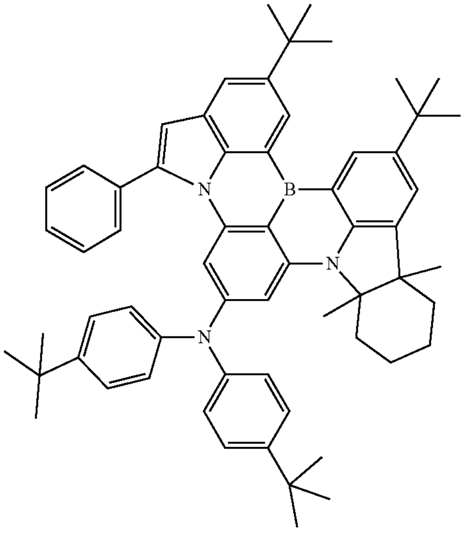

-continued
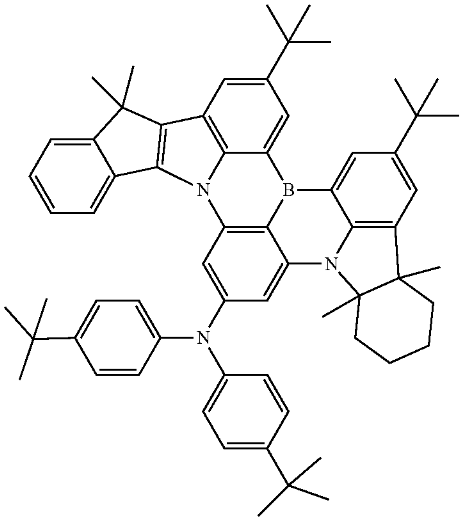
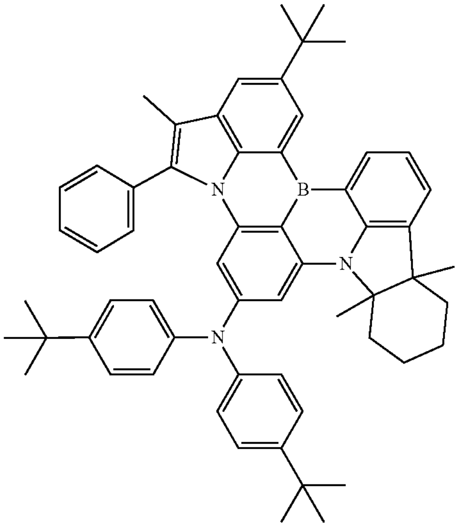
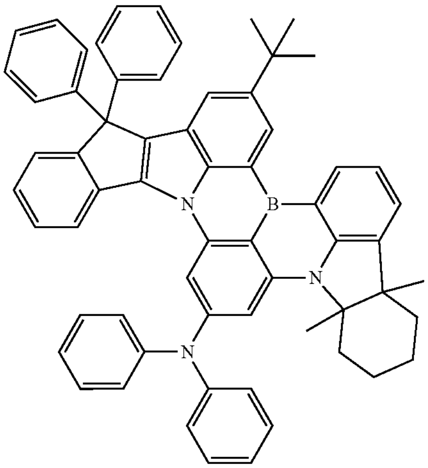
-continued
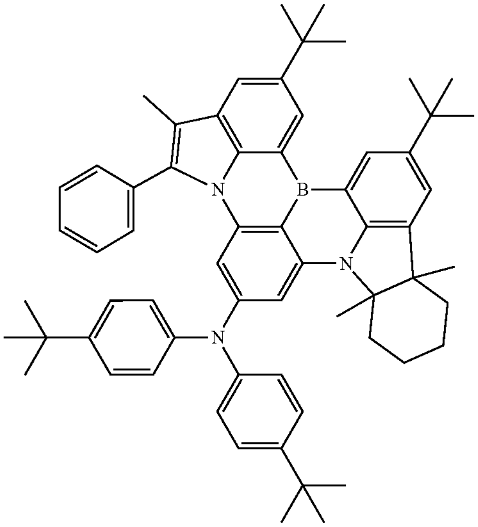
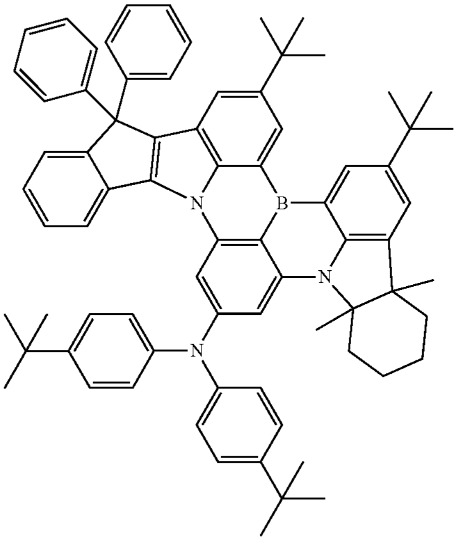
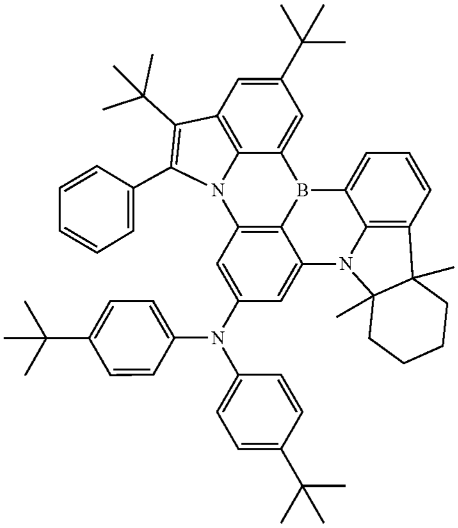

-continued
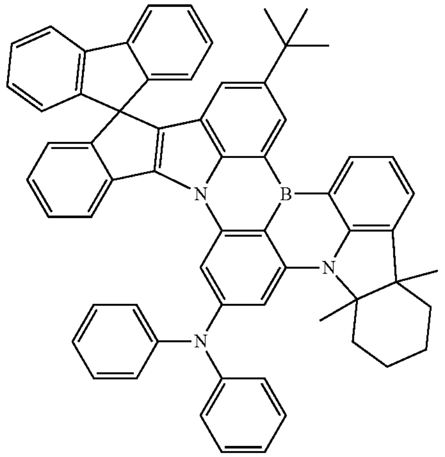
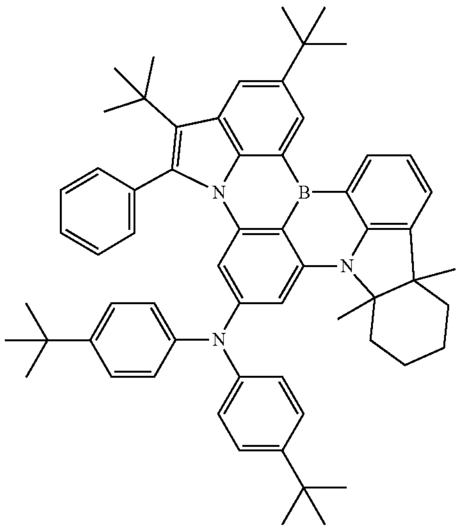
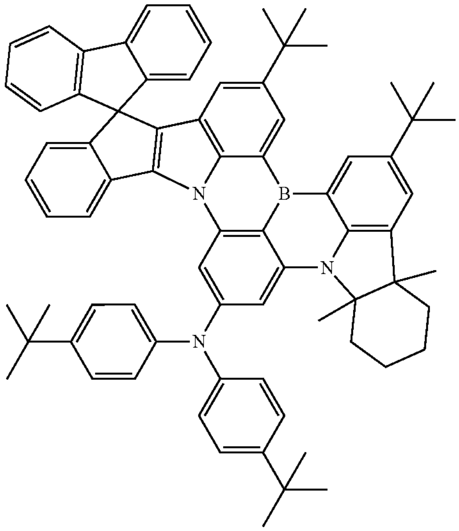
-continued
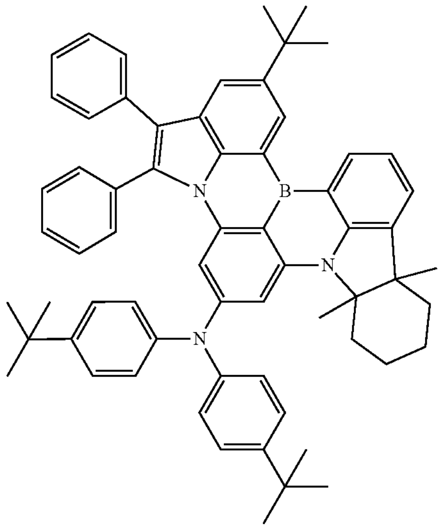
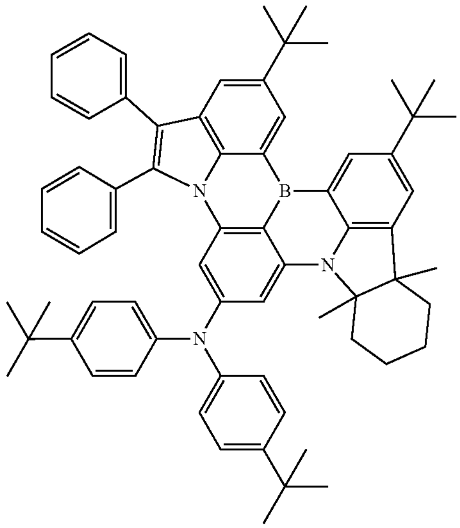
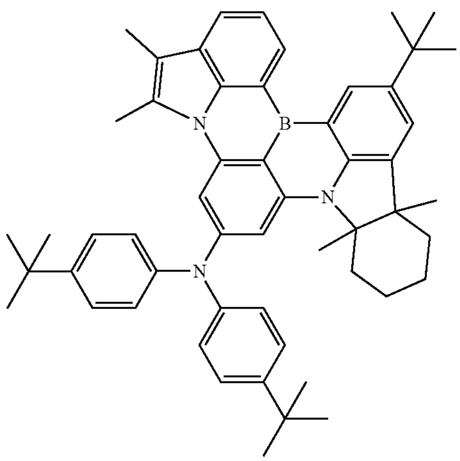

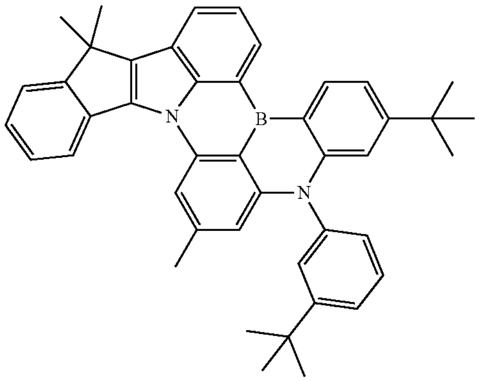
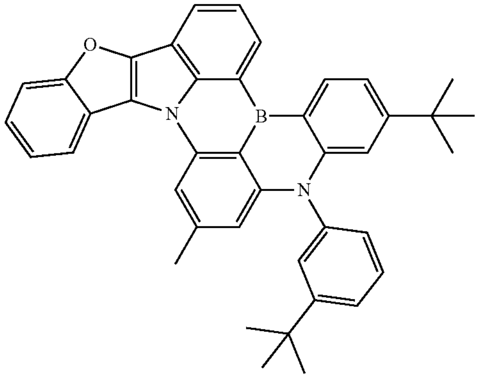
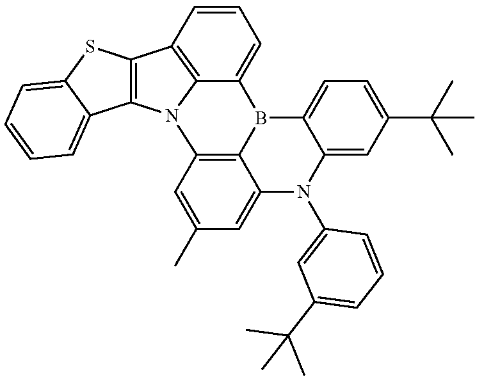
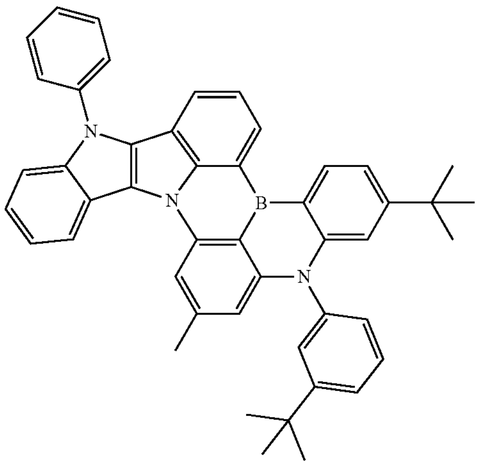
-continued
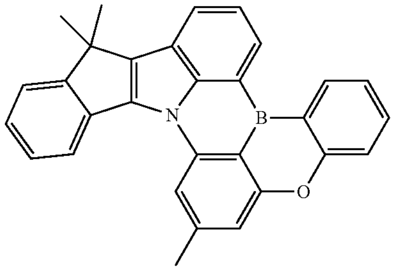
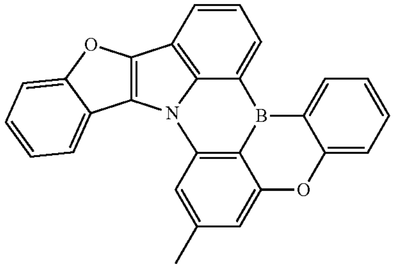
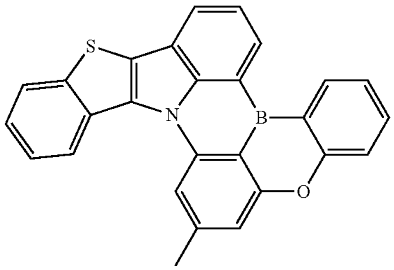
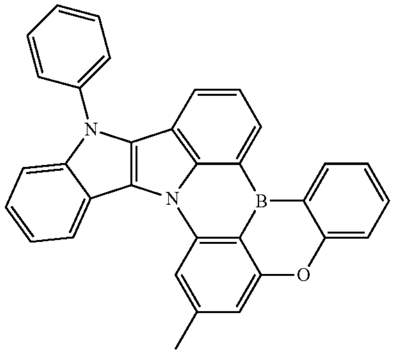
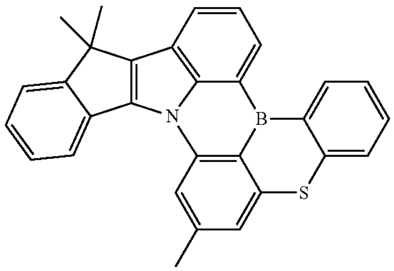
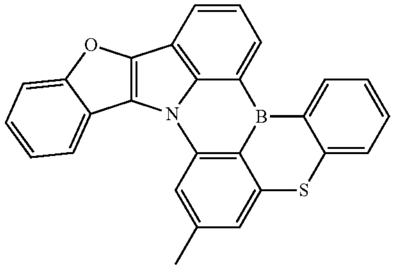

-continued
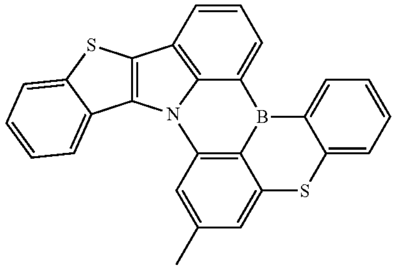
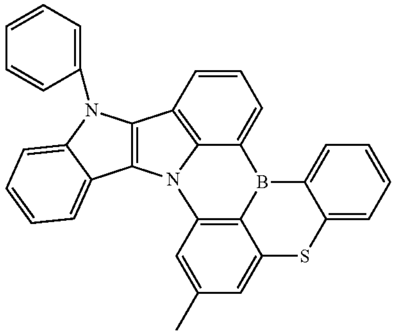
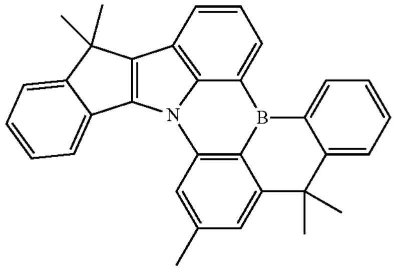
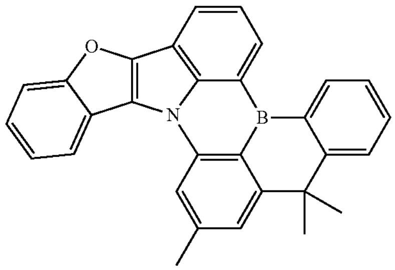
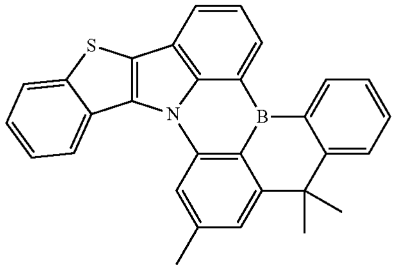
-continued
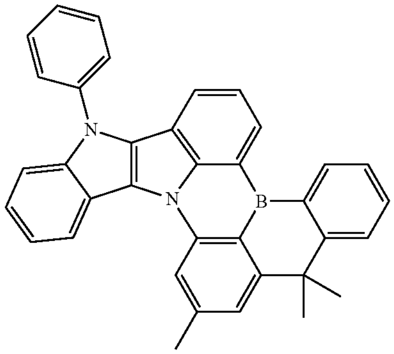
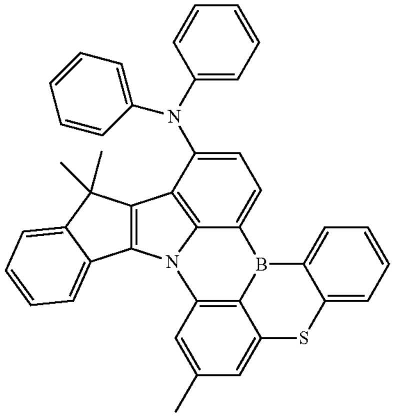
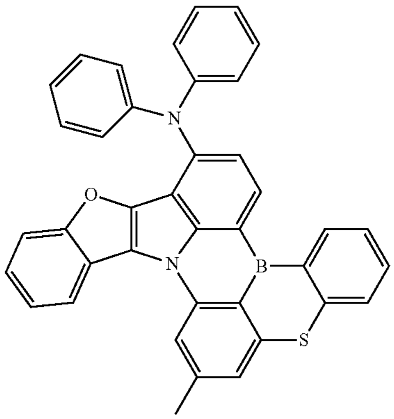
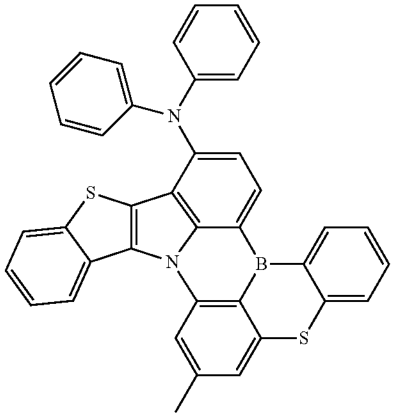

-continued
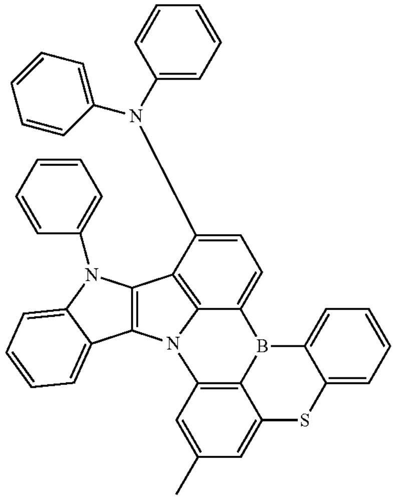
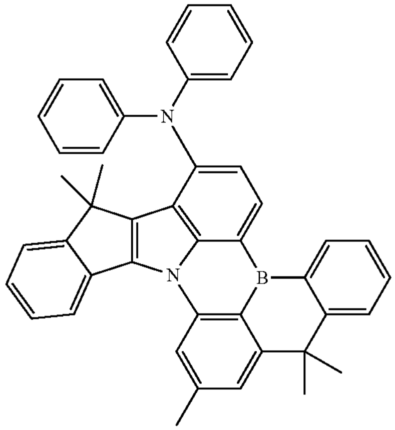
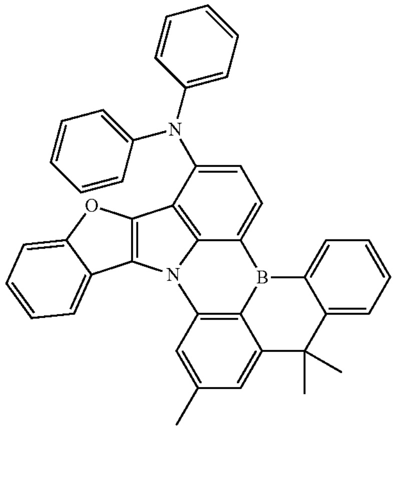
-continued
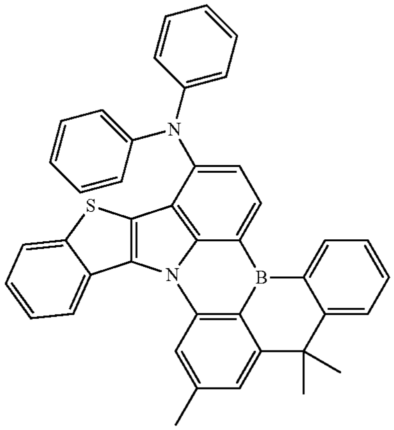
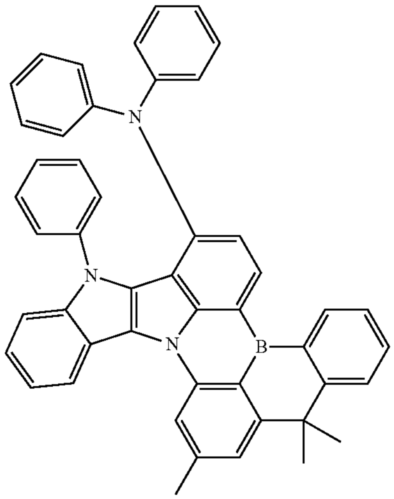
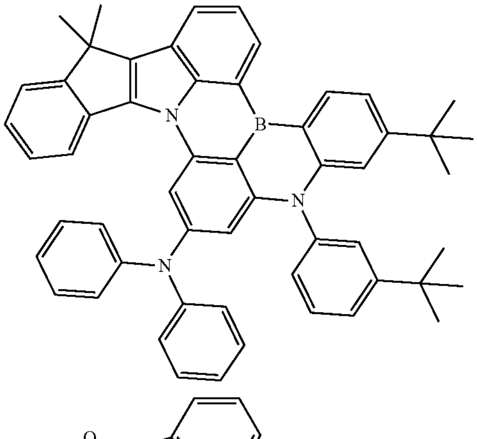
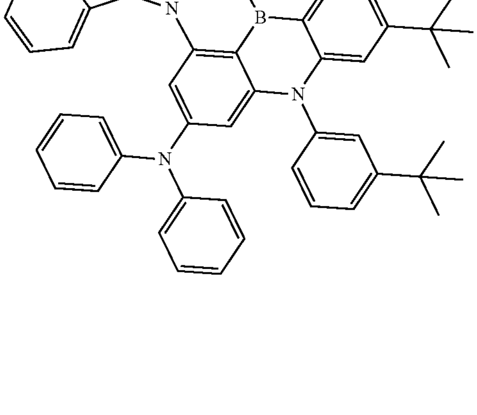

-continued
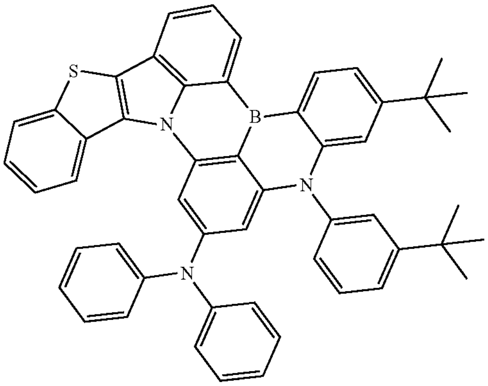
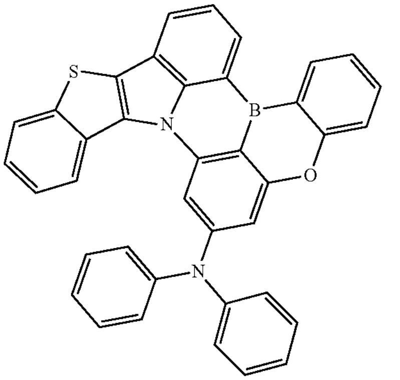
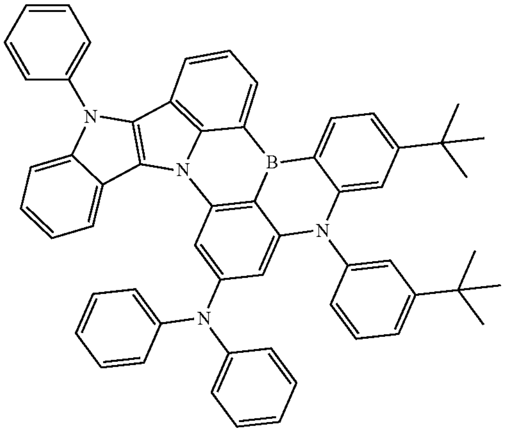
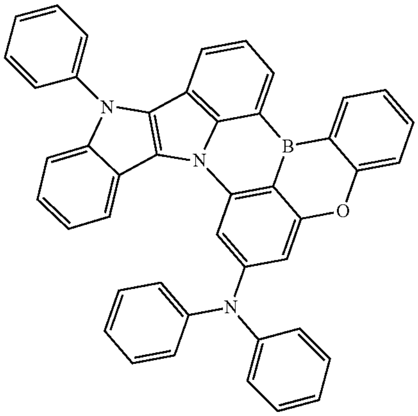
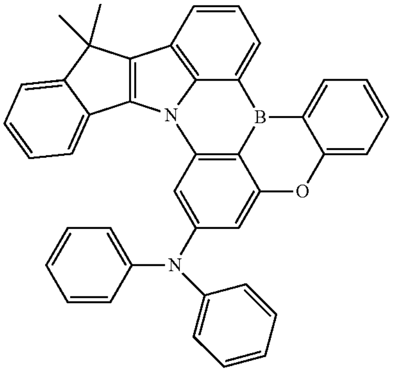
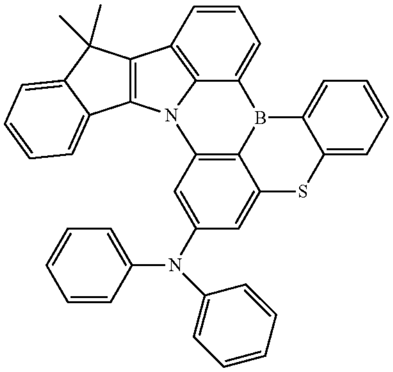
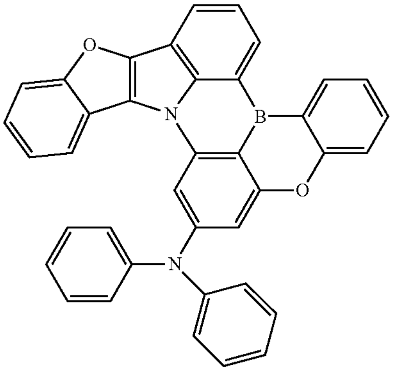
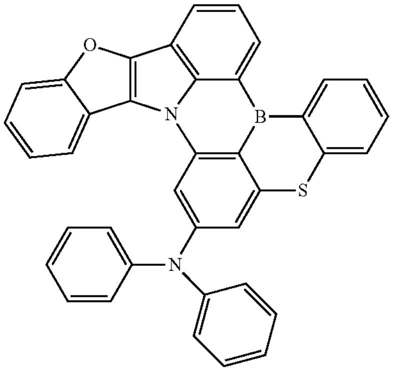
-continued -continued
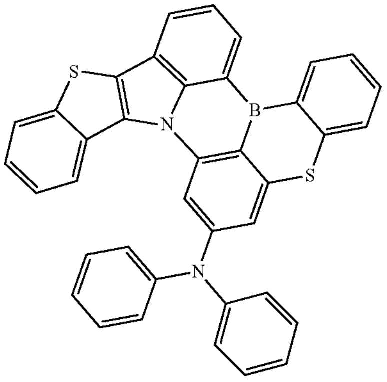
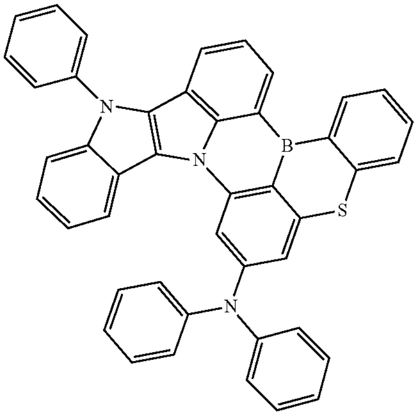
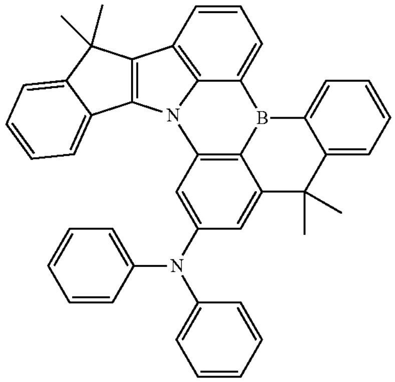
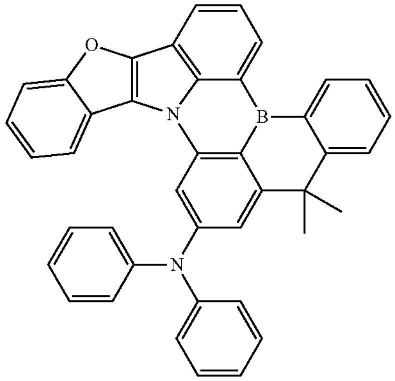
-continued
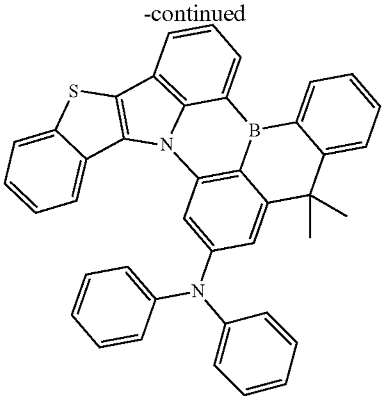
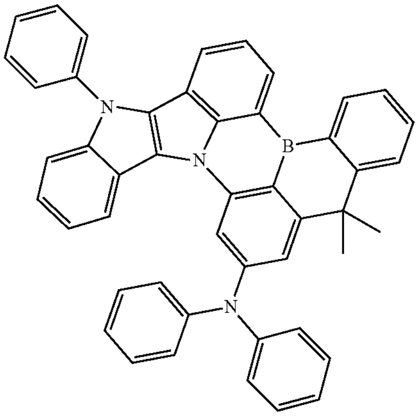
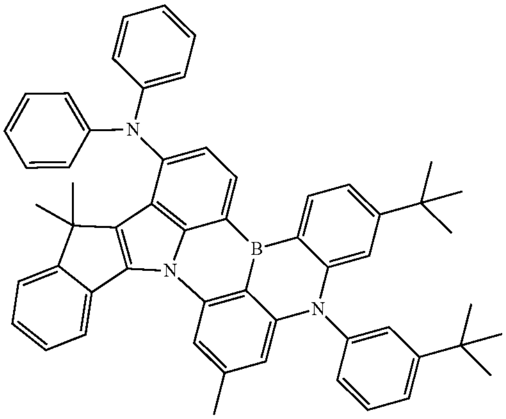
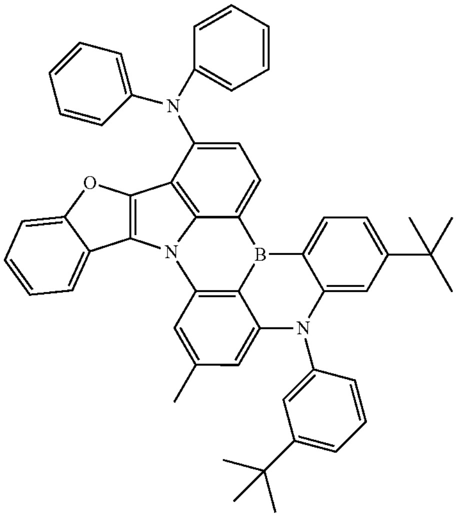

-continued
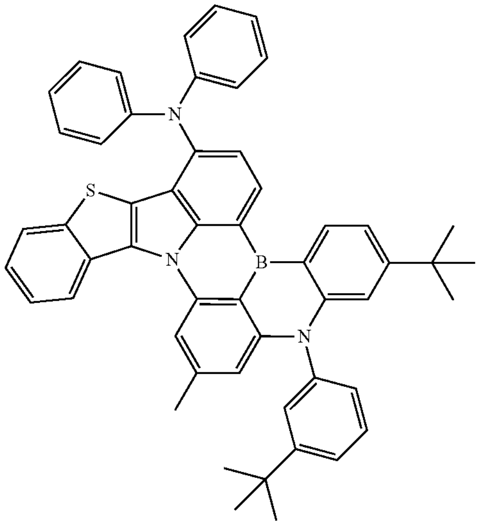
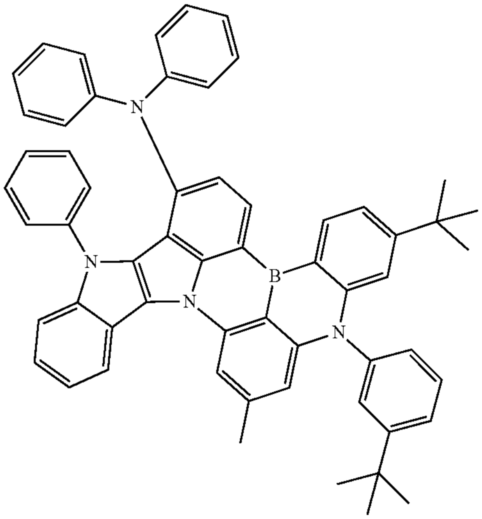
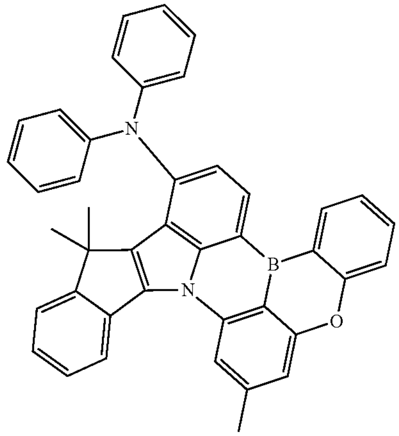
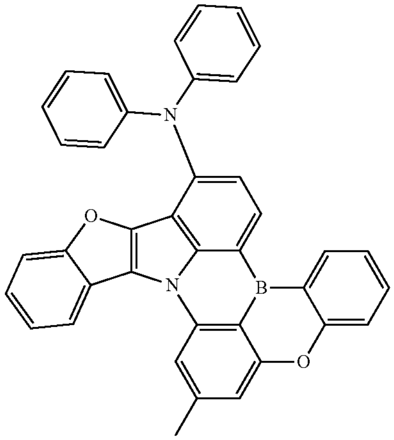
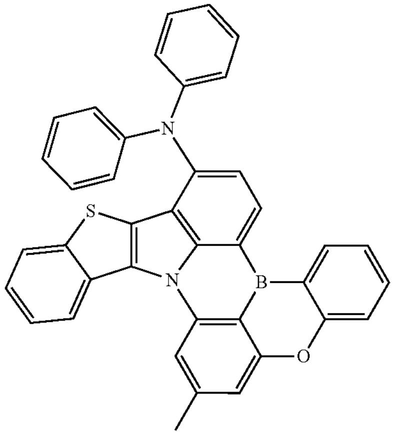
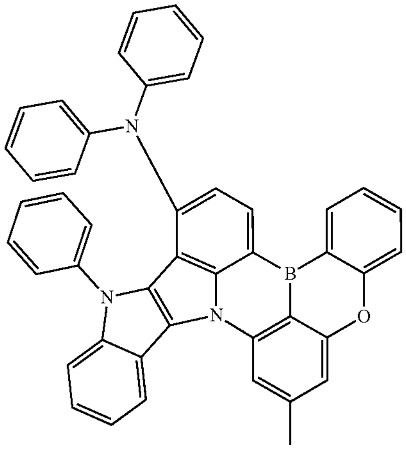
-continued
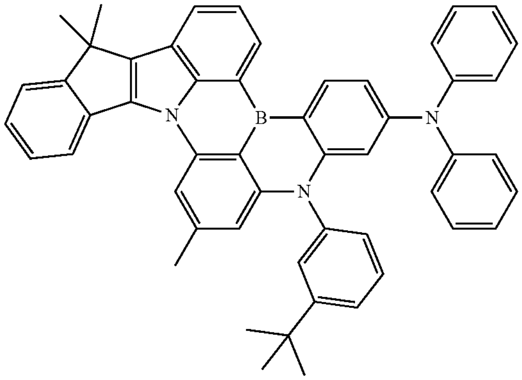

-continued
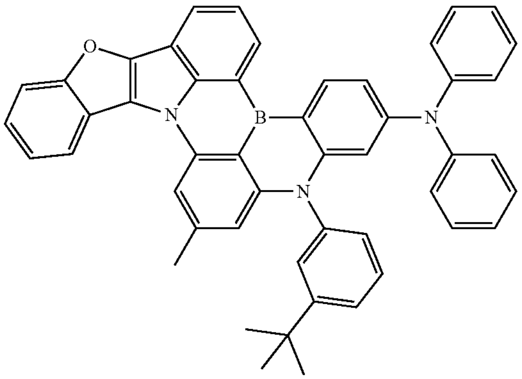
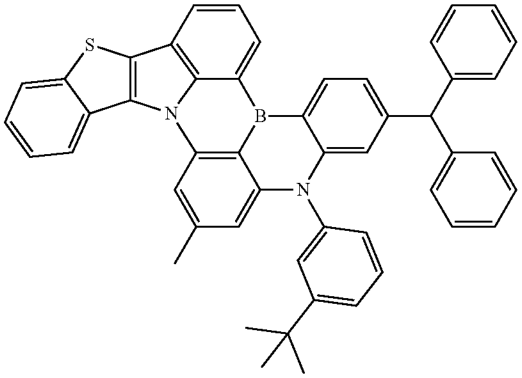
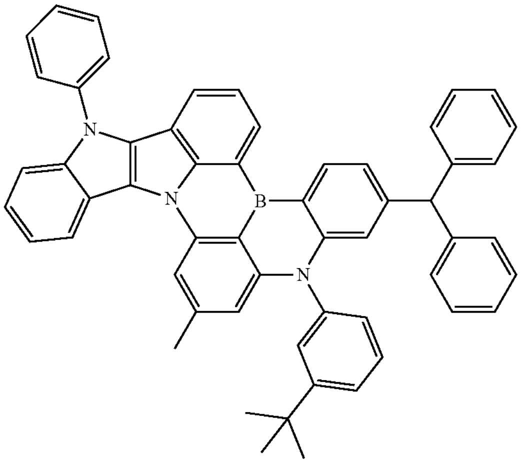
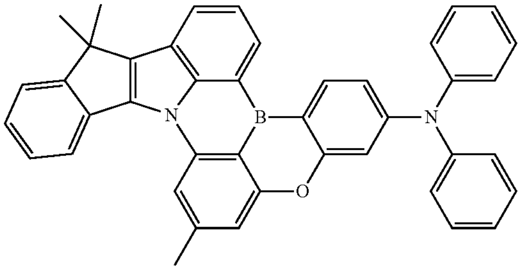
-continued
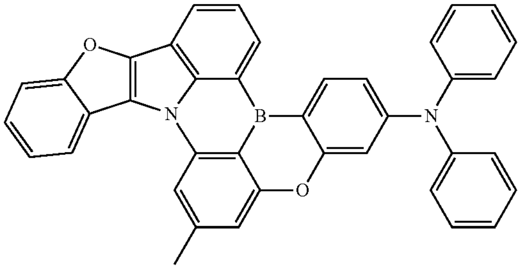
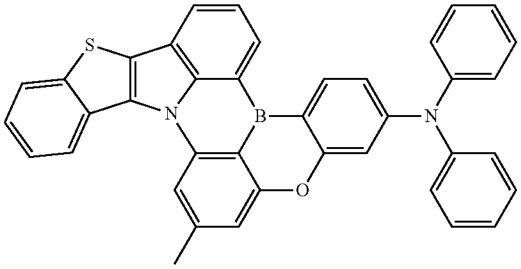
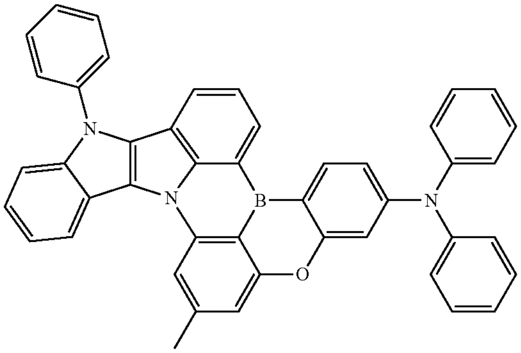
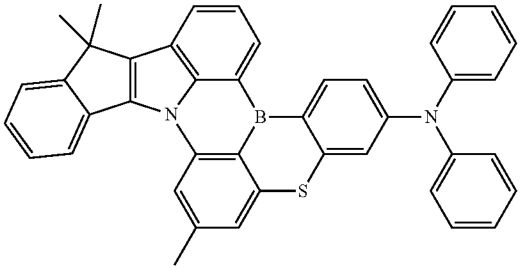
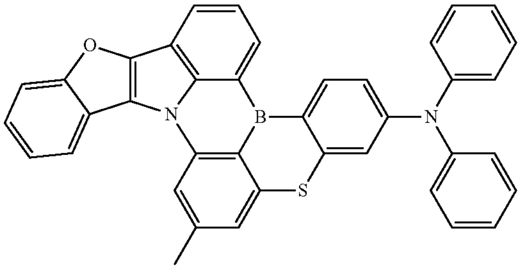
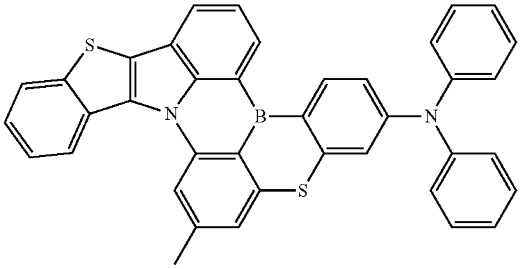

-continued
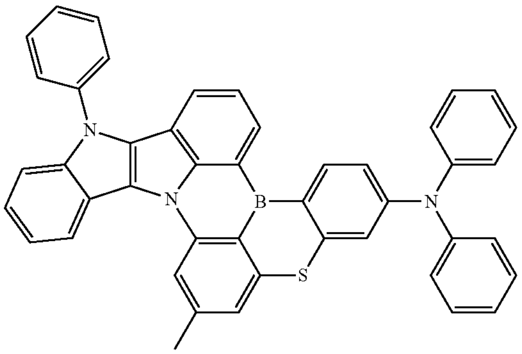
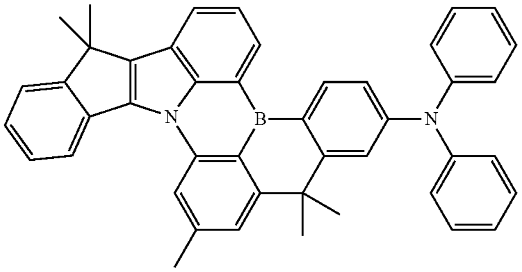
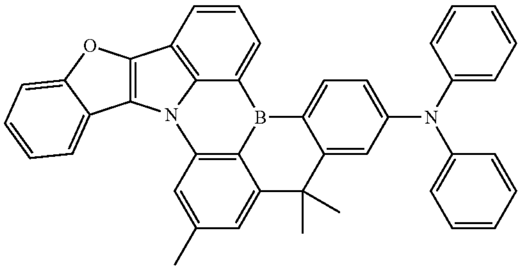
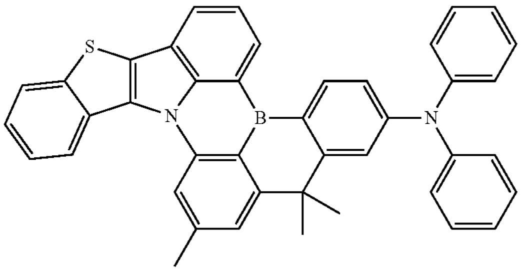
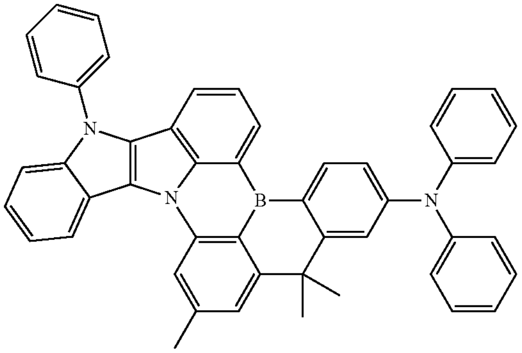
-continued
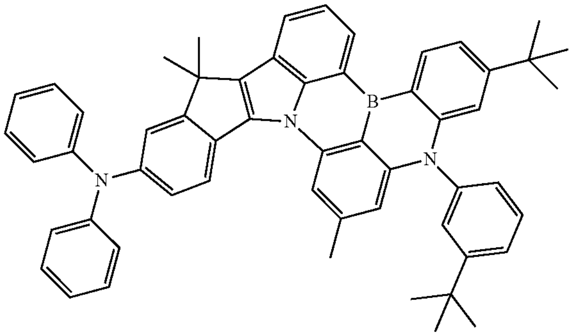
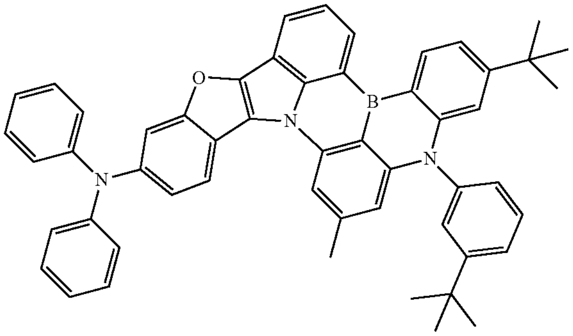
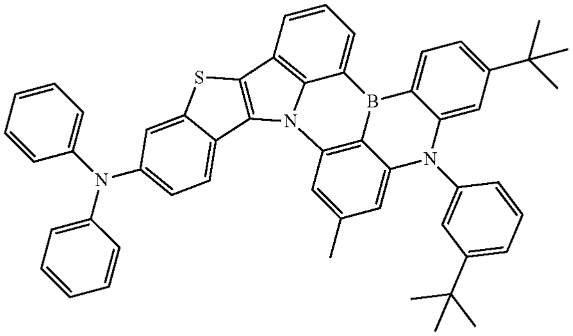
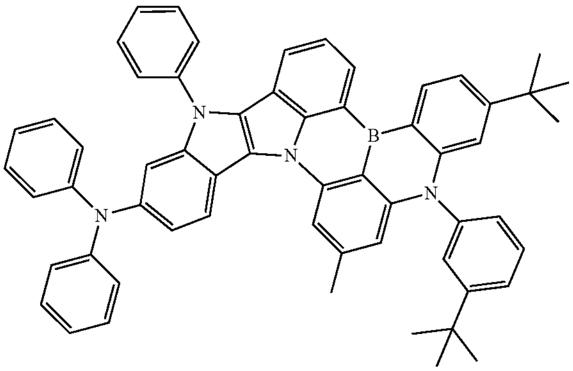
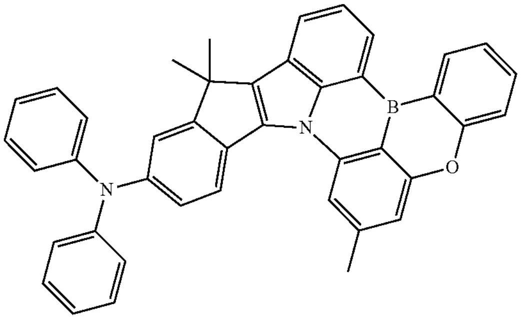

-continued
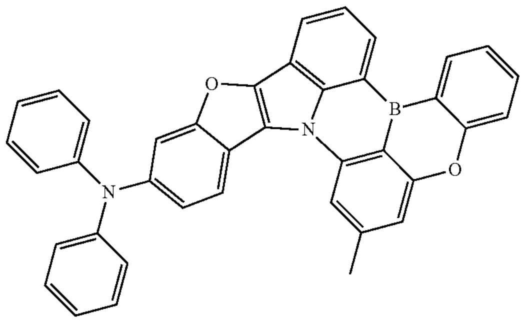
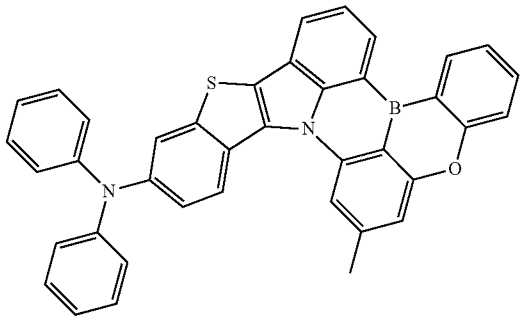
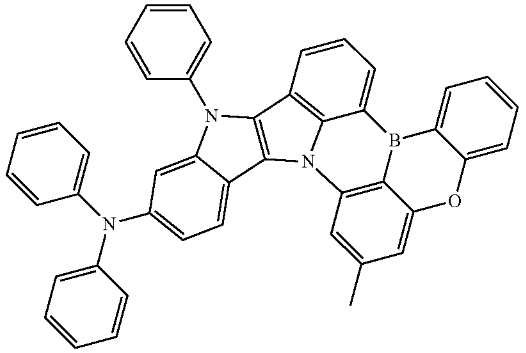
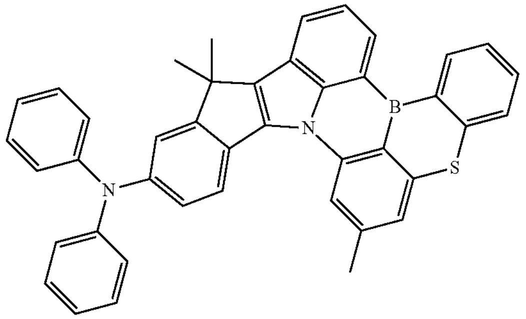
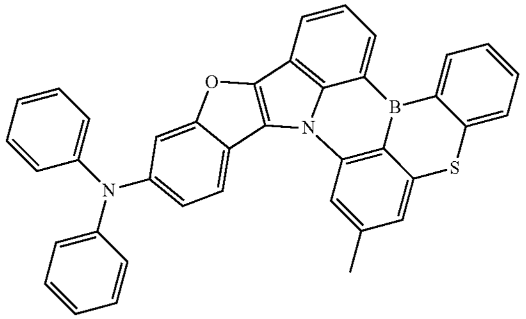
-continued
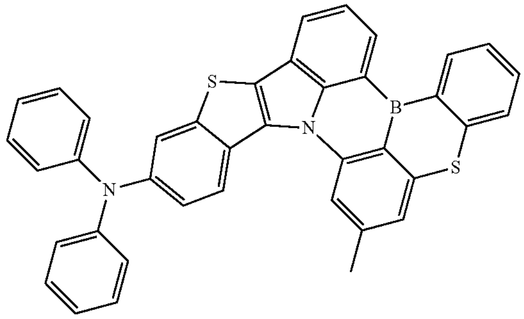
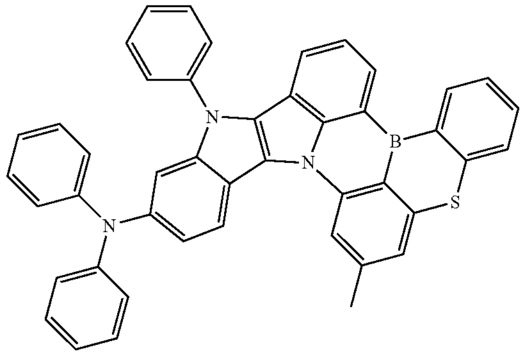
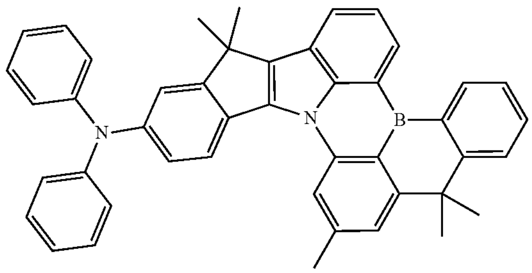
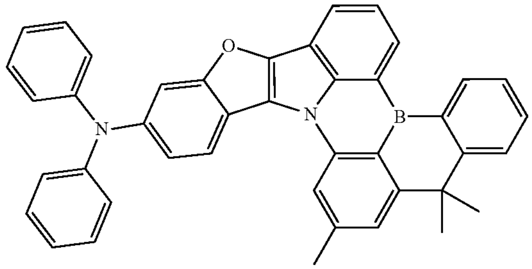
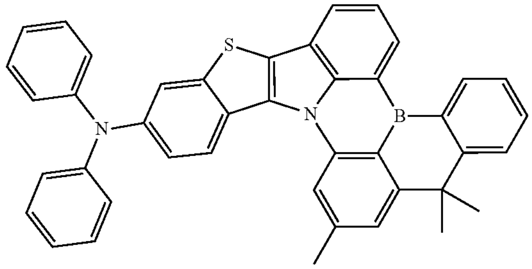

-continued
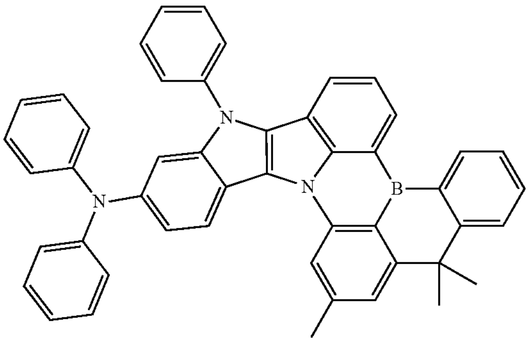
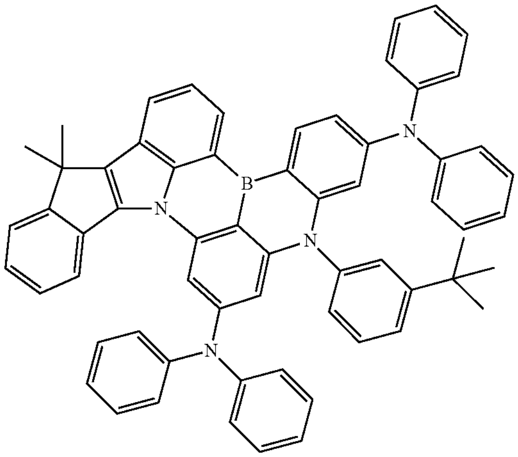
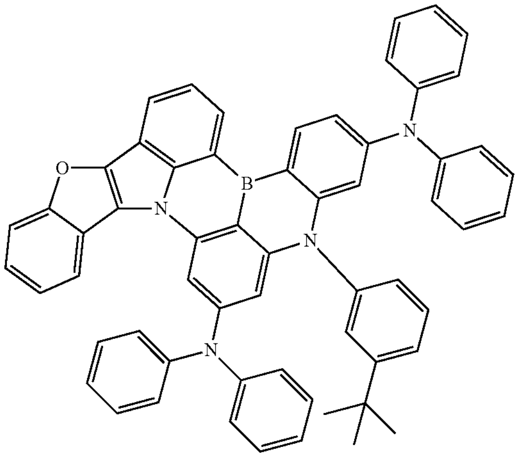
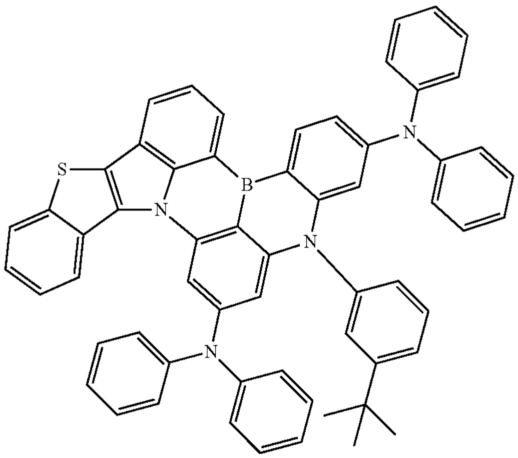
-continued
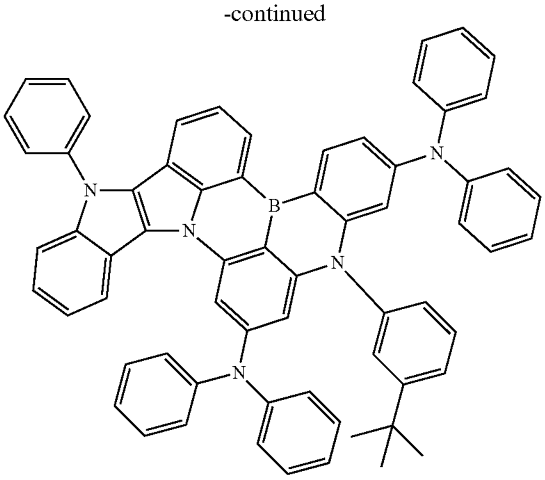
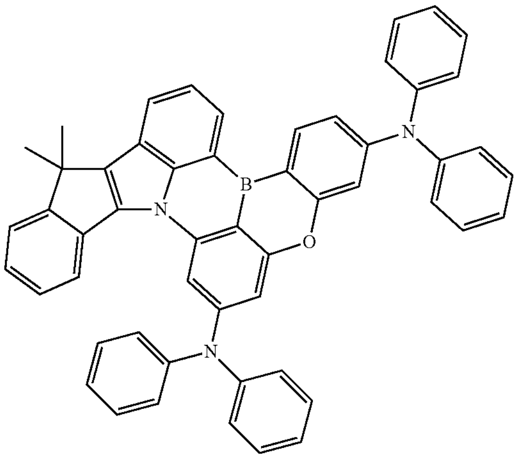
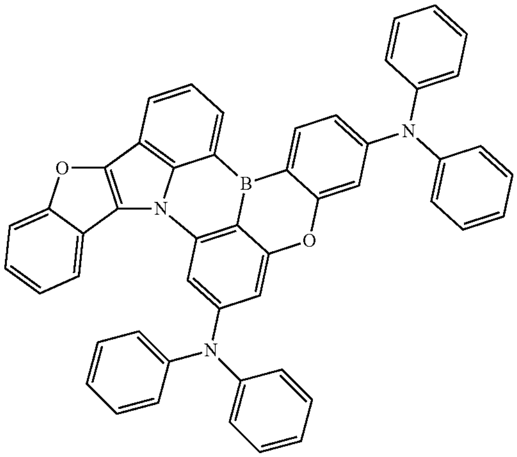

-continued
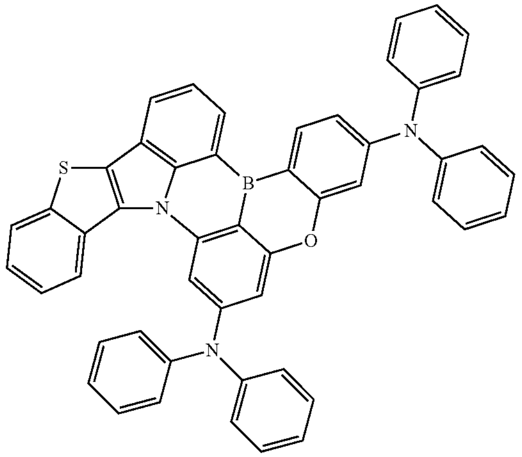
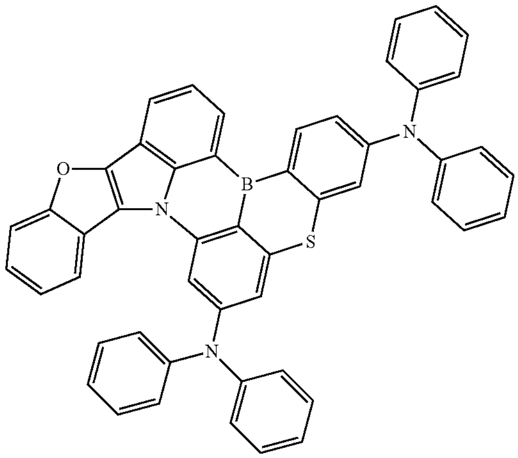
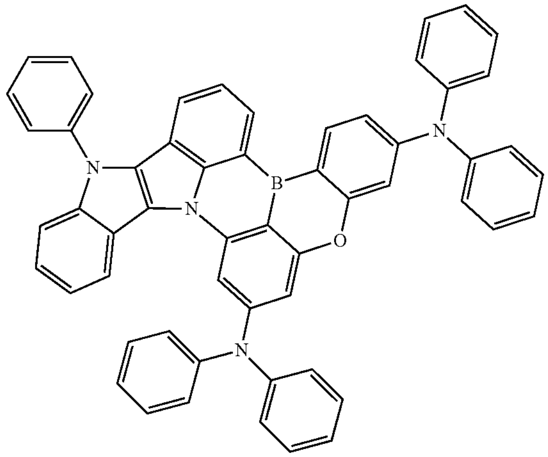
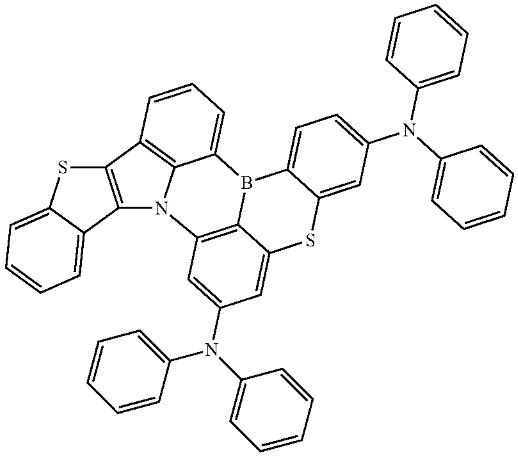
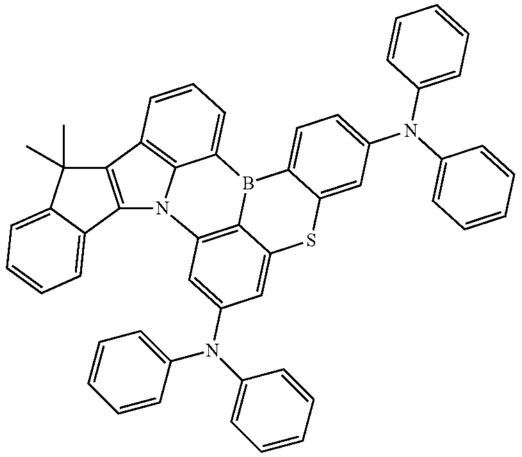
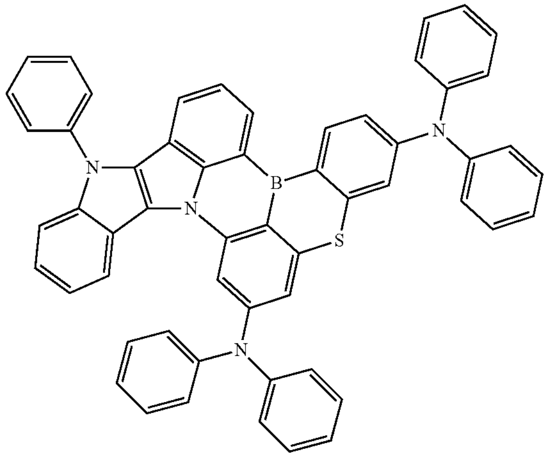
-continued -continued
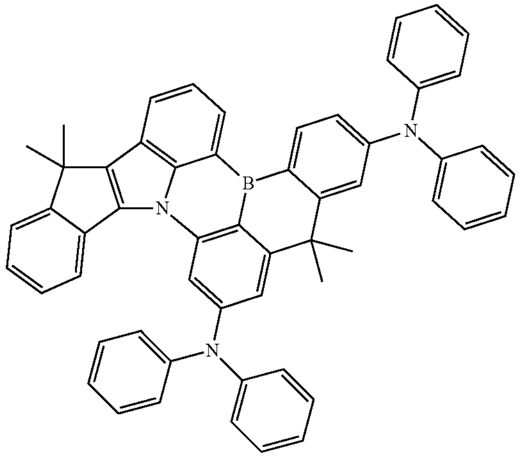
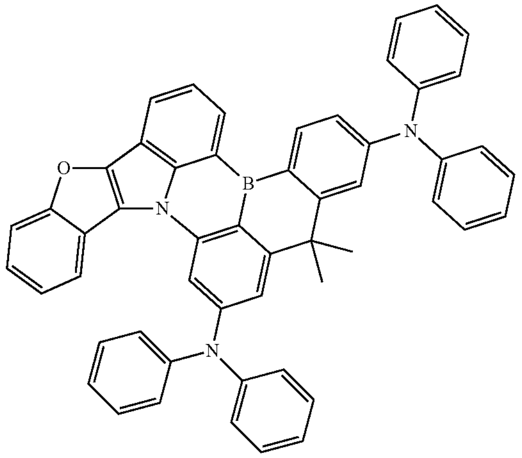
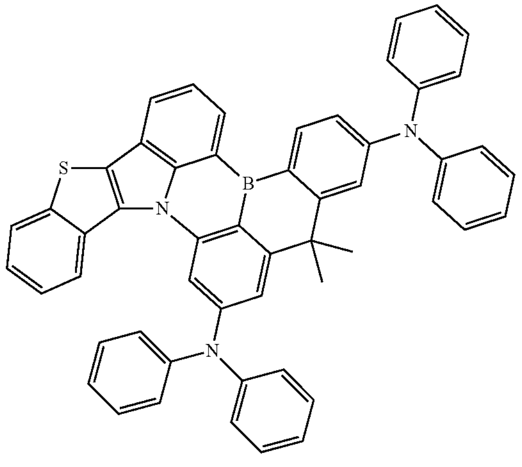
-continued
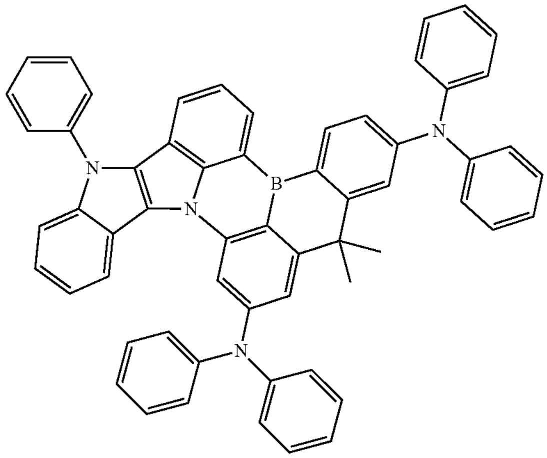
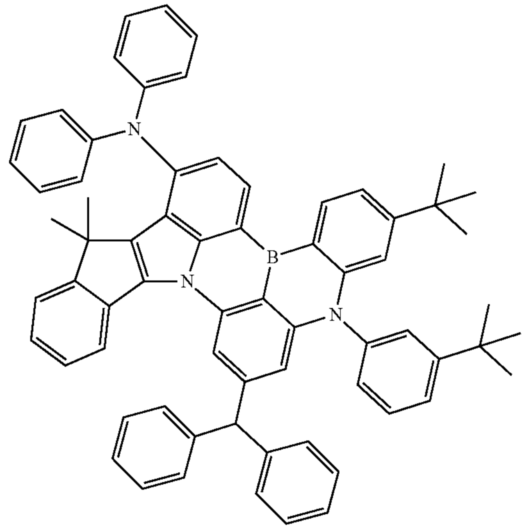
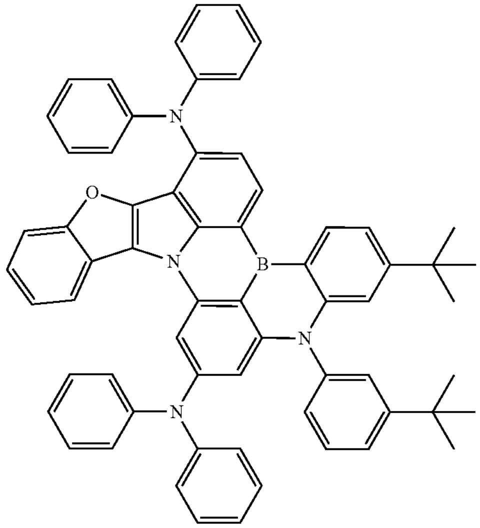

-continued
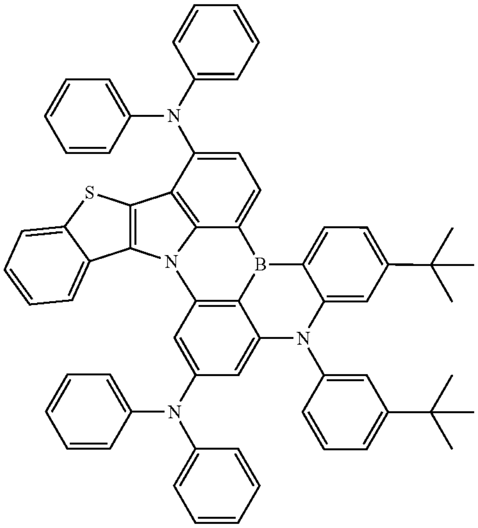
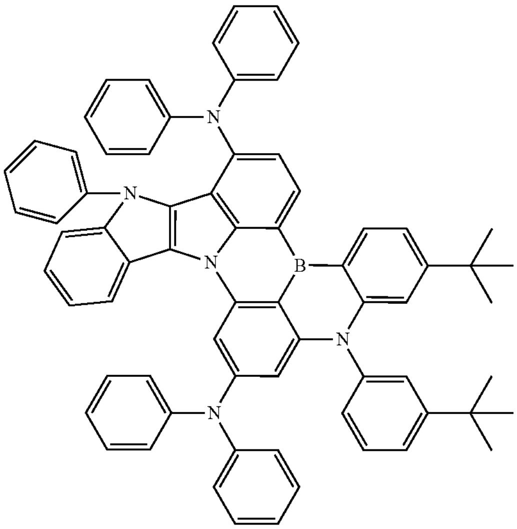
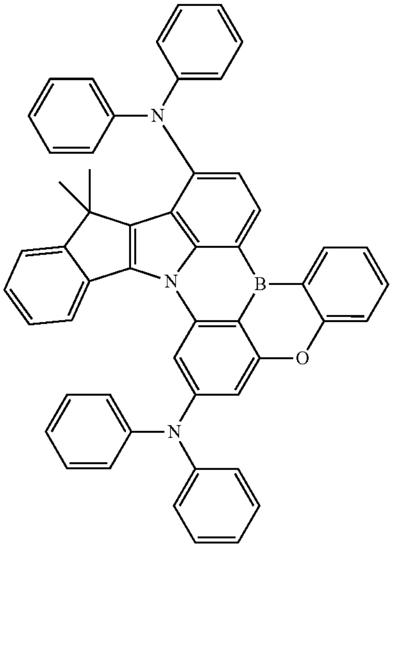
-continued
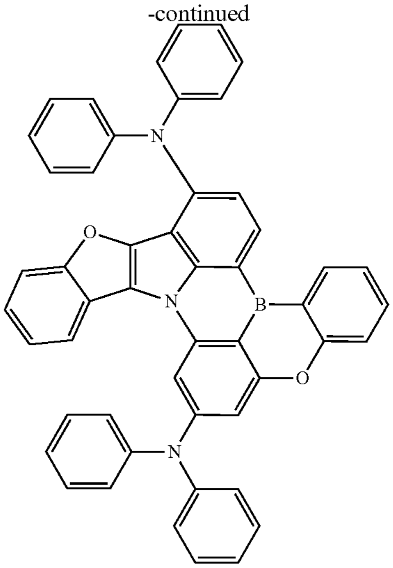
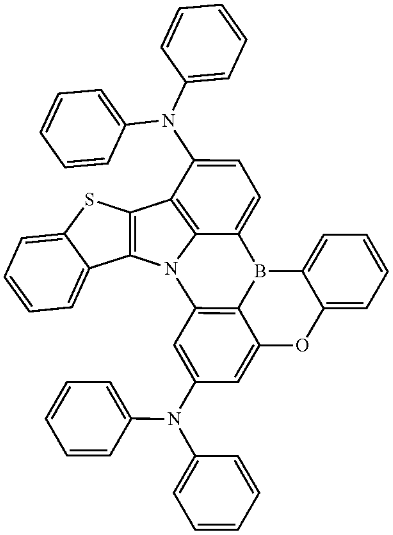
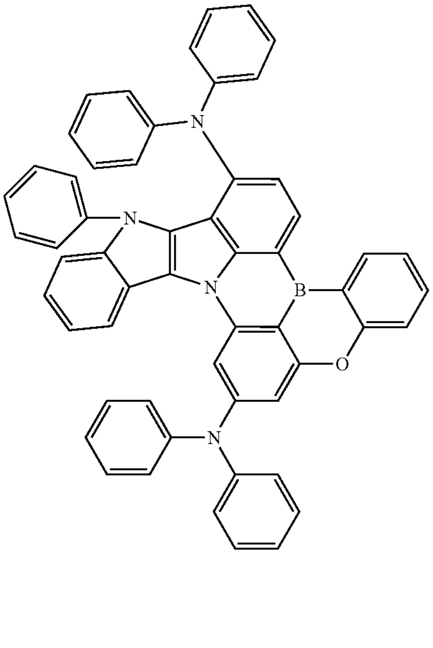

-continued
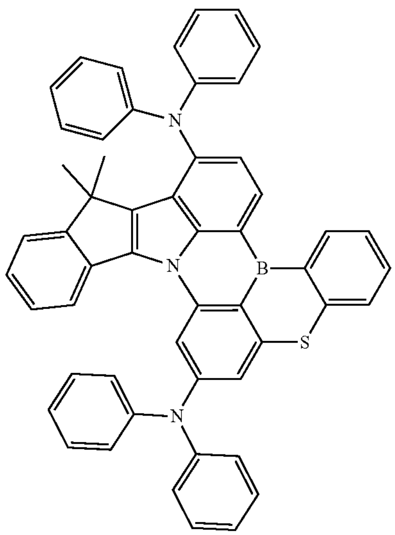
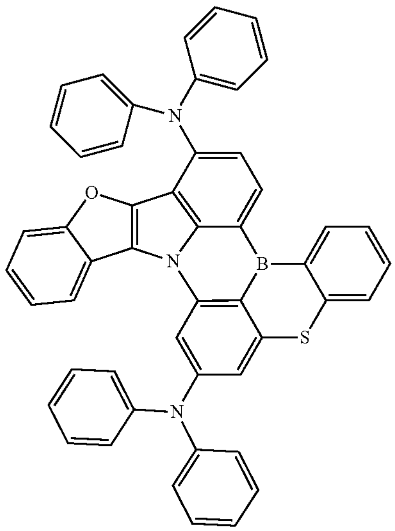
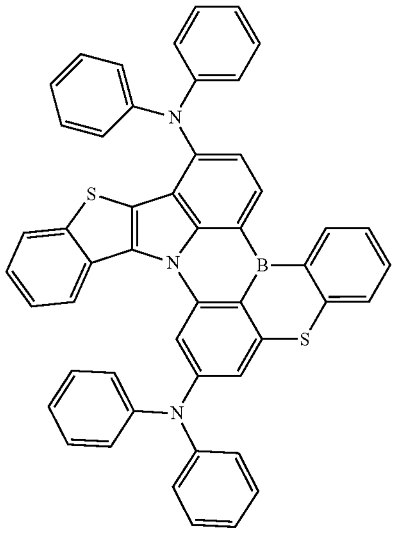
-continued
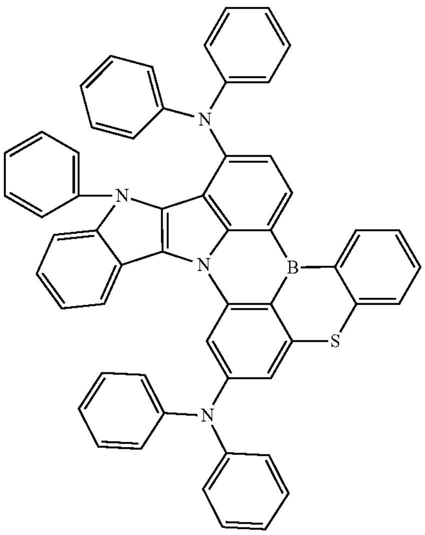
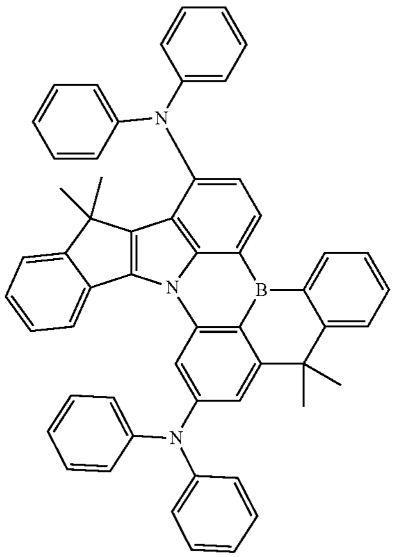
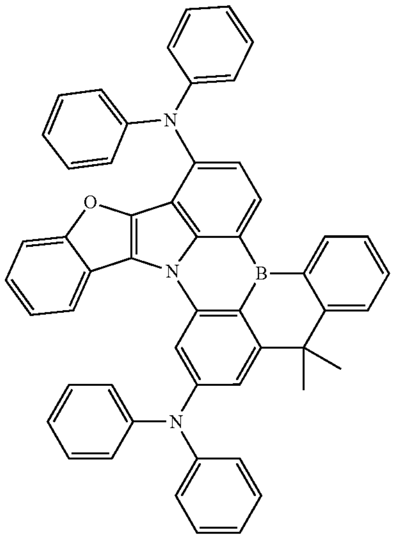

-continued
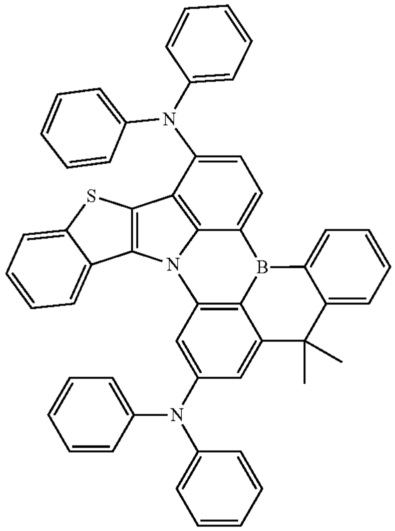
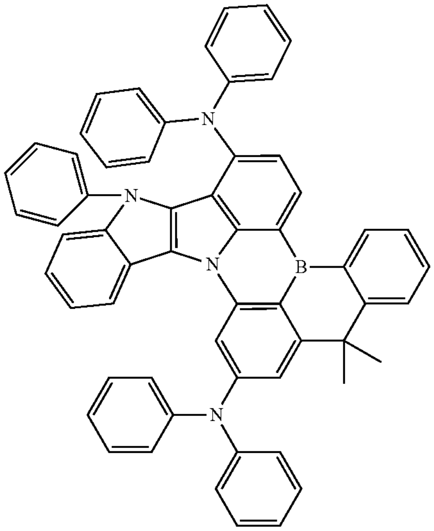
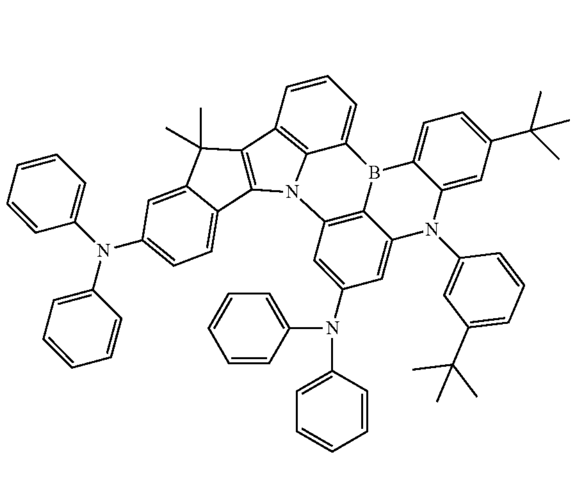
-continued
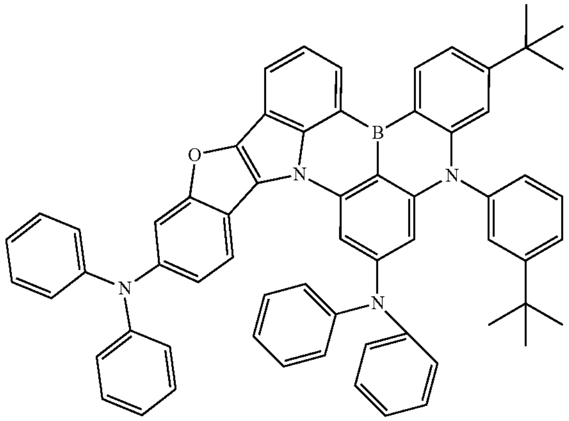
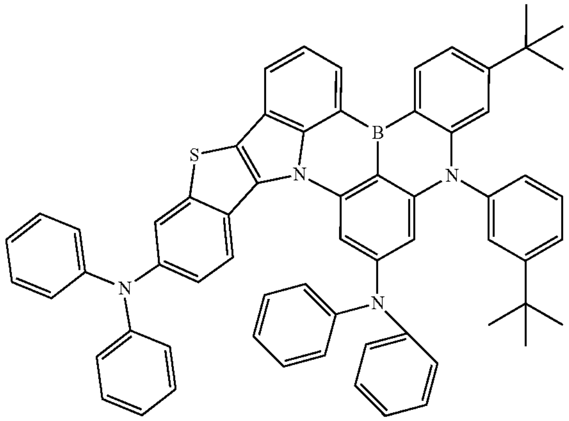
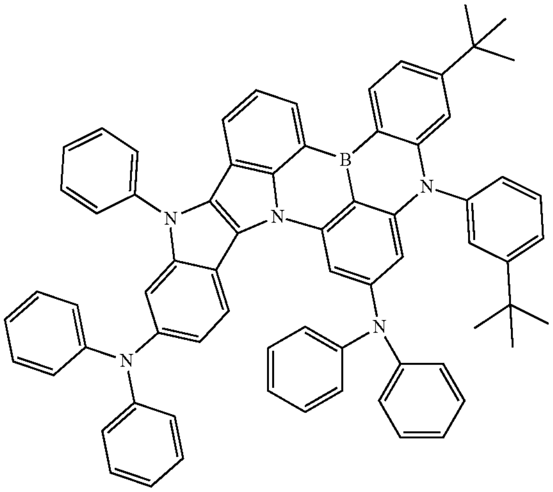
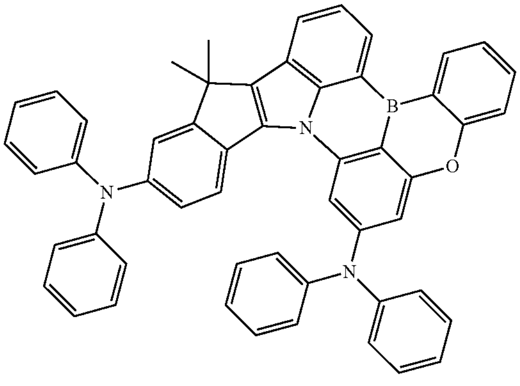

-continued
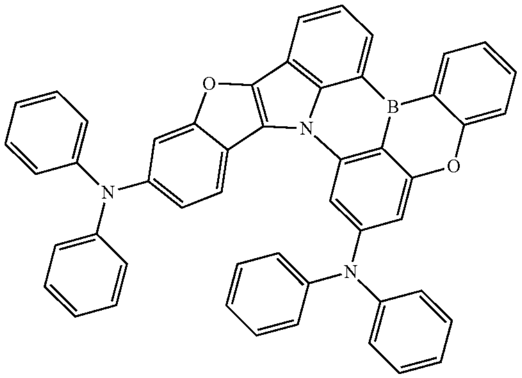
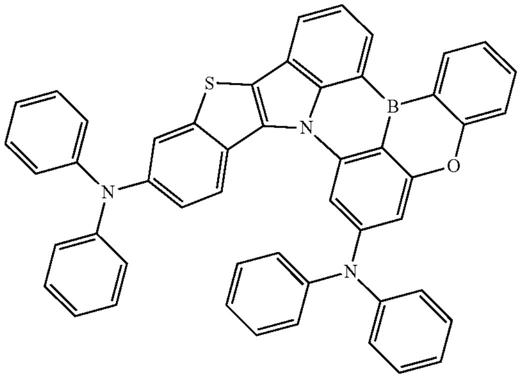
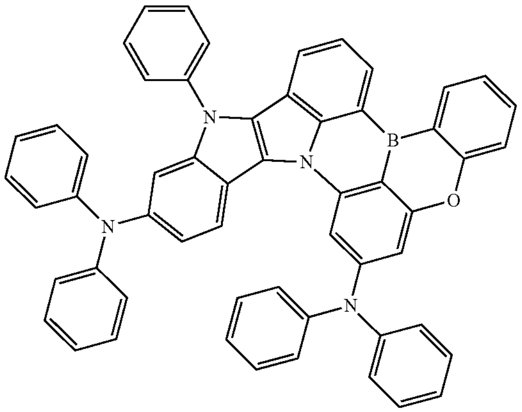
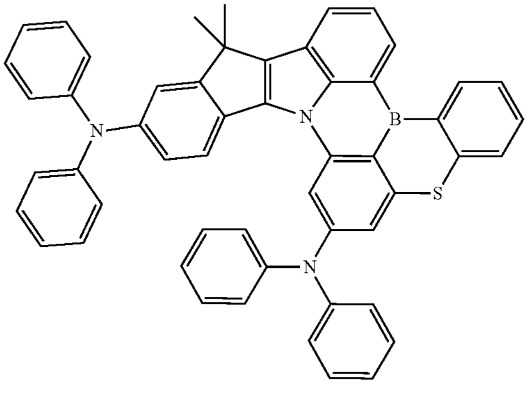
-continued
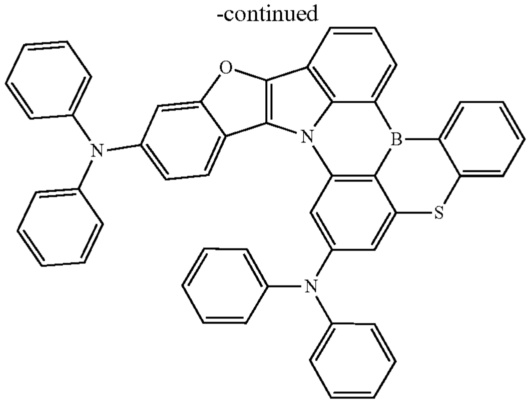
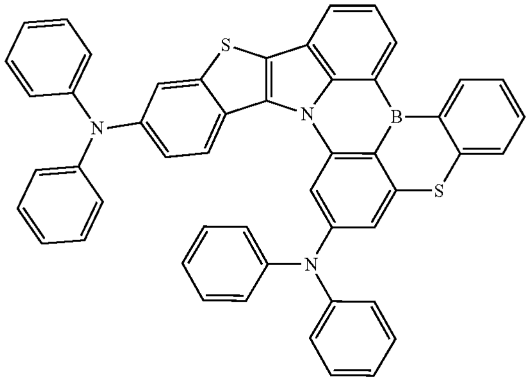
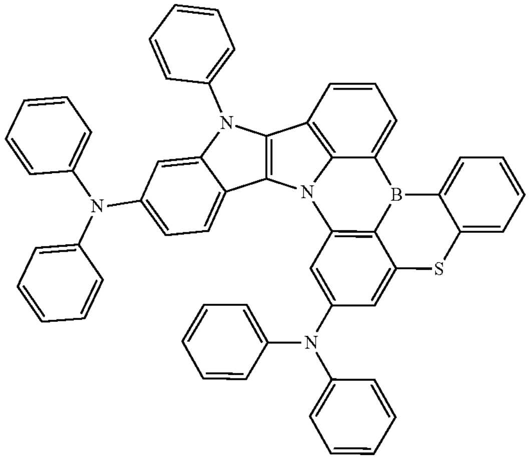
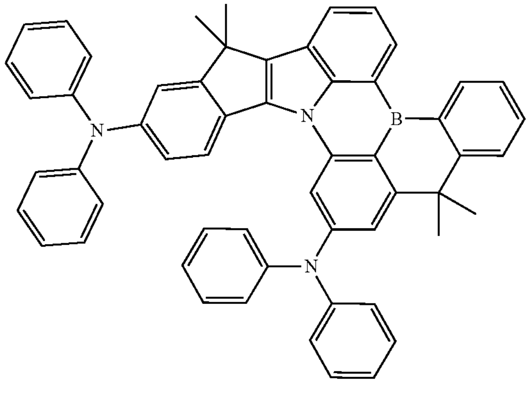

-continued
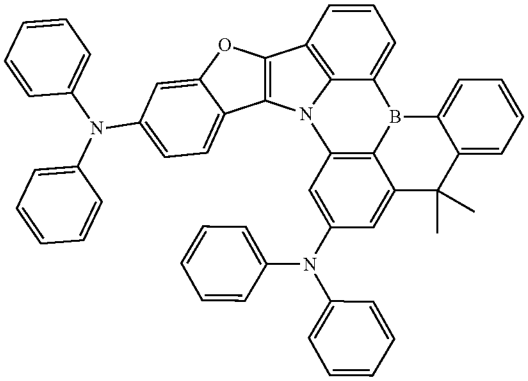
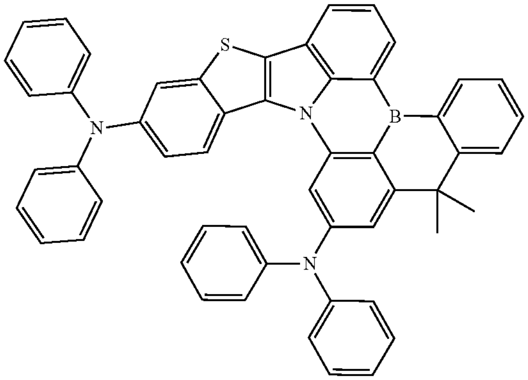
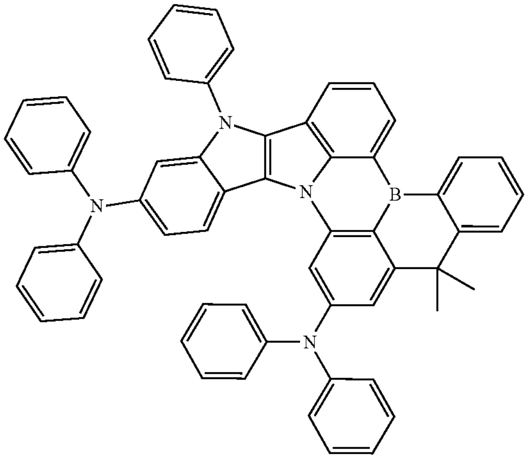
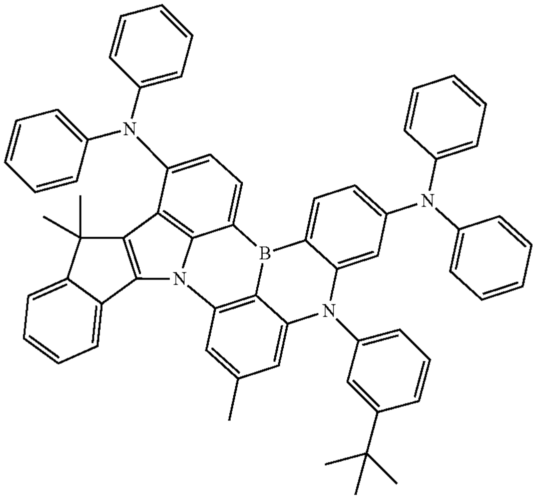
-continued
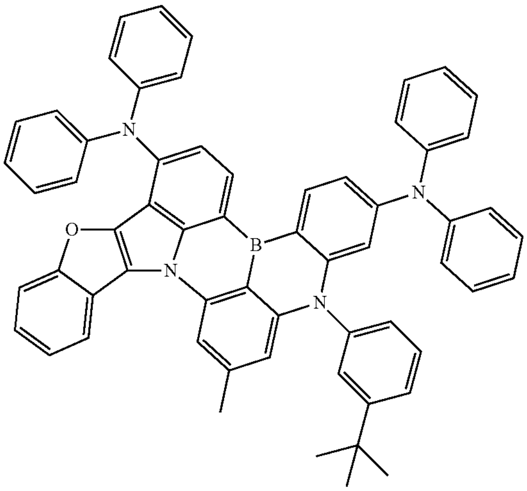
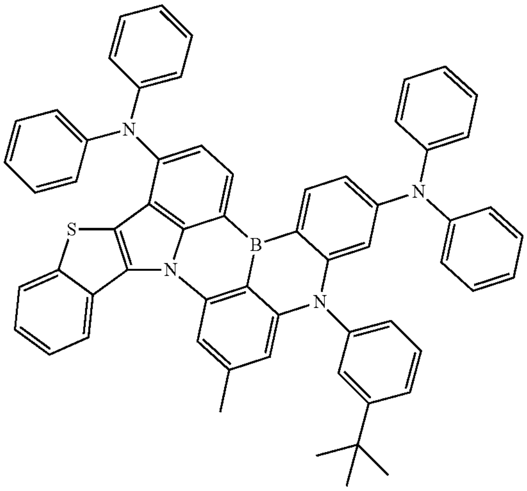
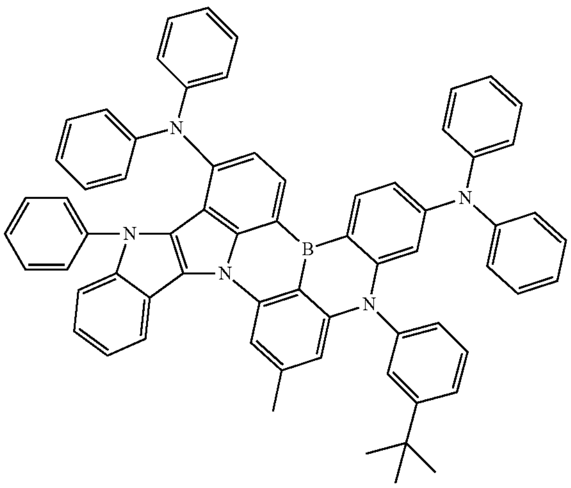 [SMILES: Cc1cc2c3c(c1)-n1c4c(ccc(N(c5ccccc5)c5ccccc5)c4c4c1c1ccccc1n4-c1ccccc1)B3c1ccc(N(c3ccccc3)c3ccccc3)cc1N2c1cccc(C(C)(C)C)c1]

-continued
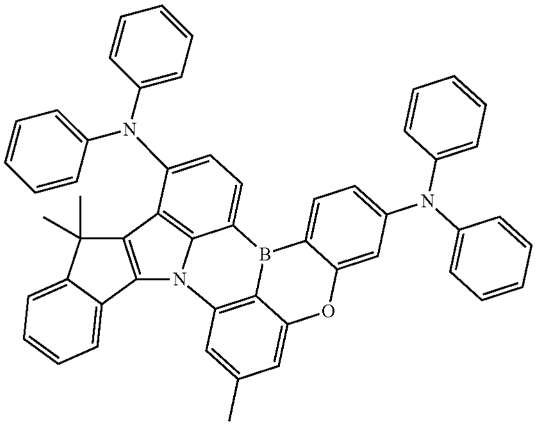
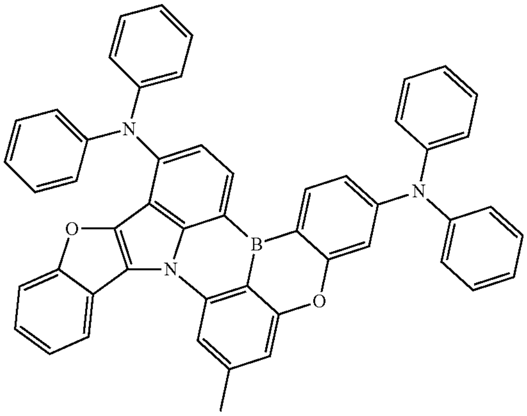
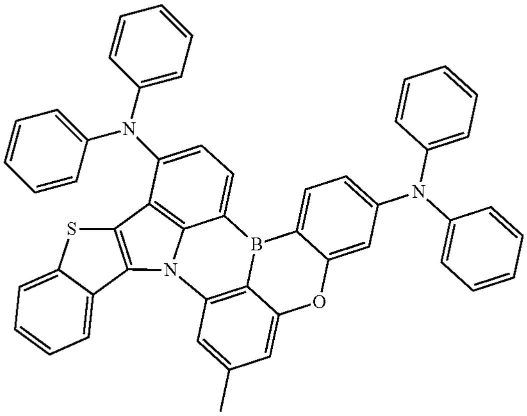
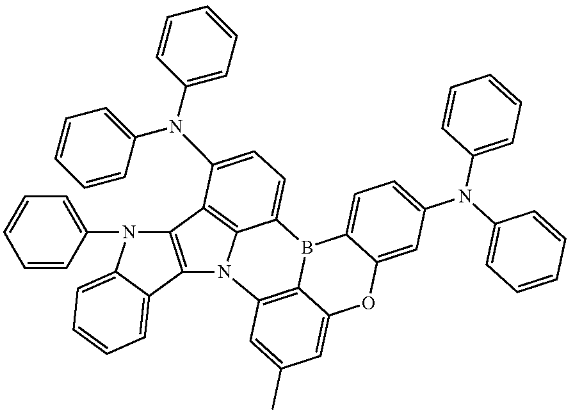 [SMILES: Cc1cc2c3c(c1)-n1c4c(ccc(N(c5ccccc5)c5ccccc5)c4c4c1c1ccccc1n4-c1ccccc1)B3c1ccc(N(c3ccccc3)c3ccccc3)cc1O2]
-continued
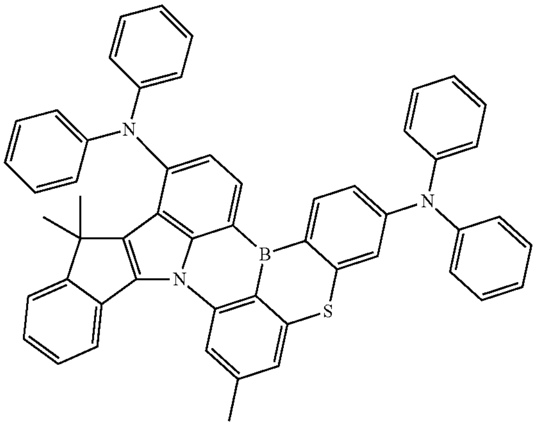
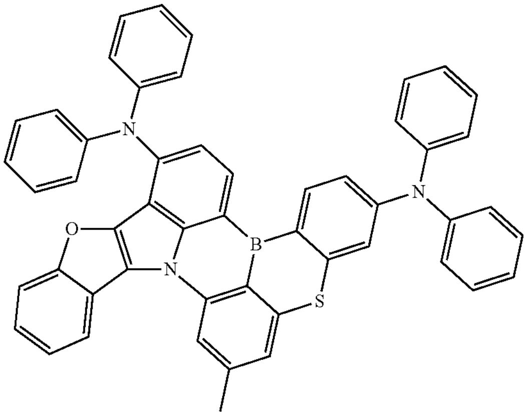
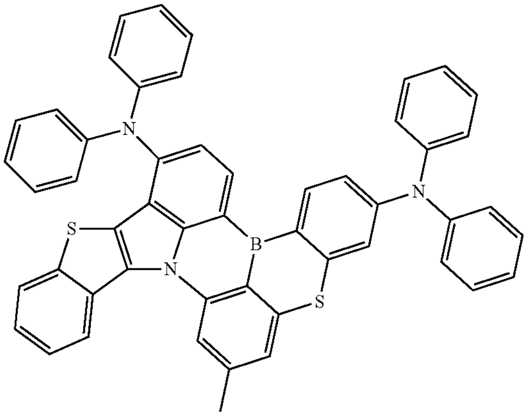
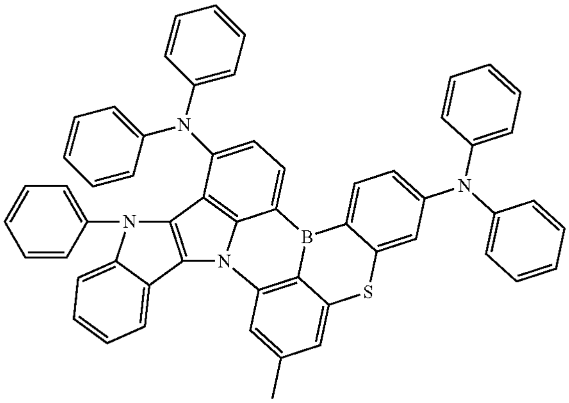

-continued
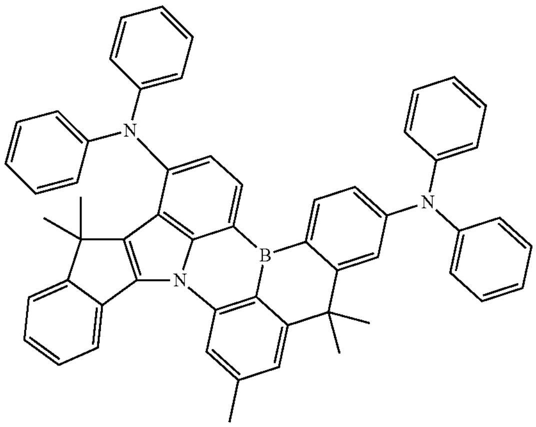
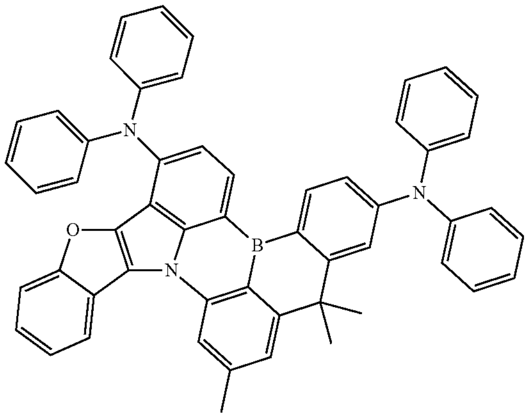
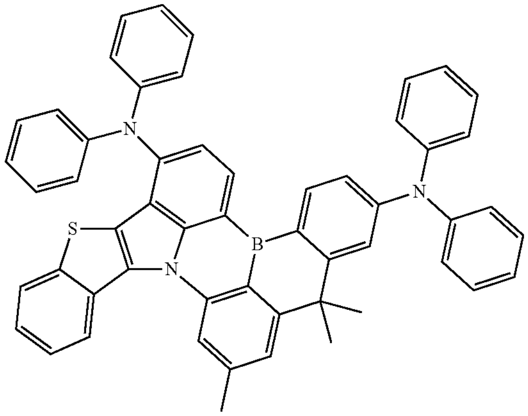
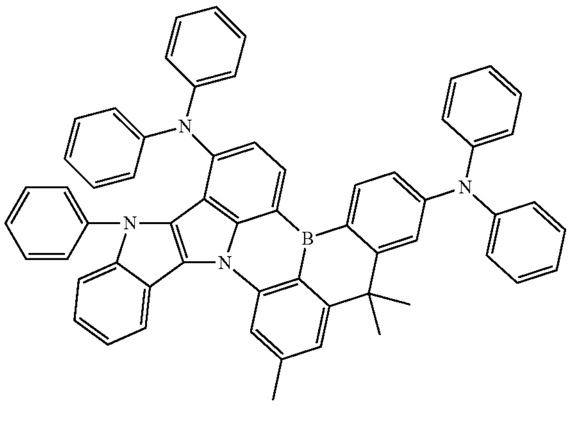
-continued
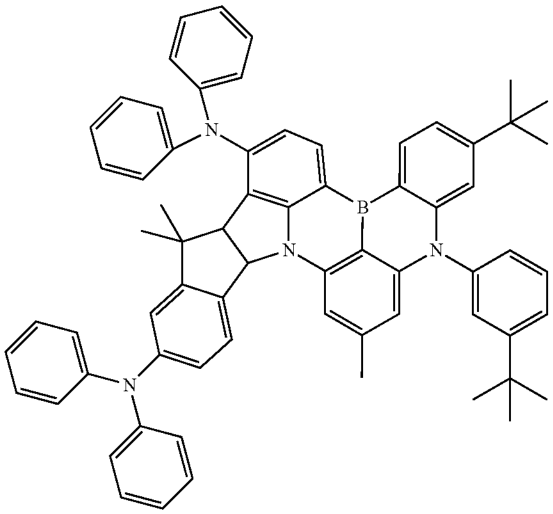
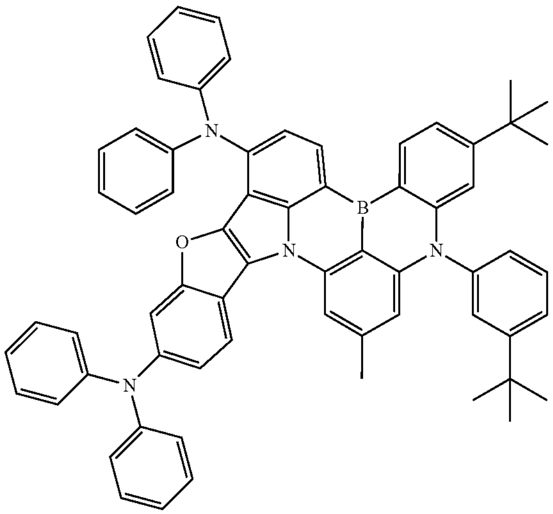
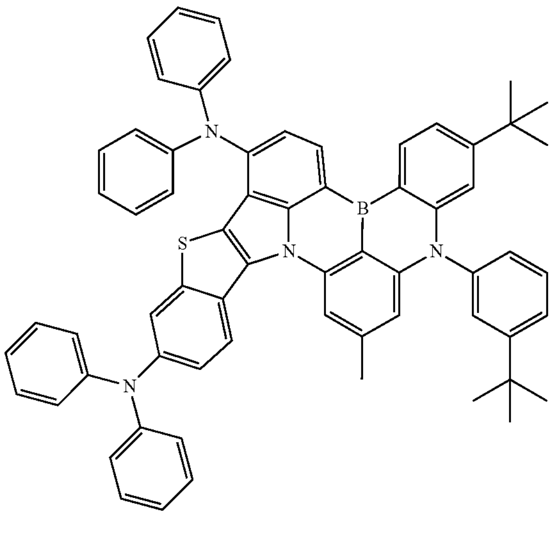

-continued
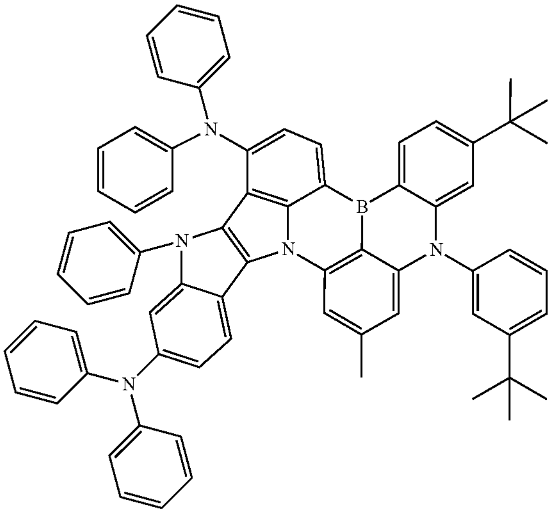
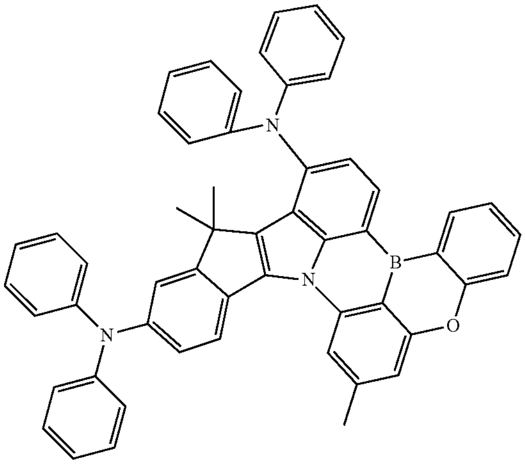
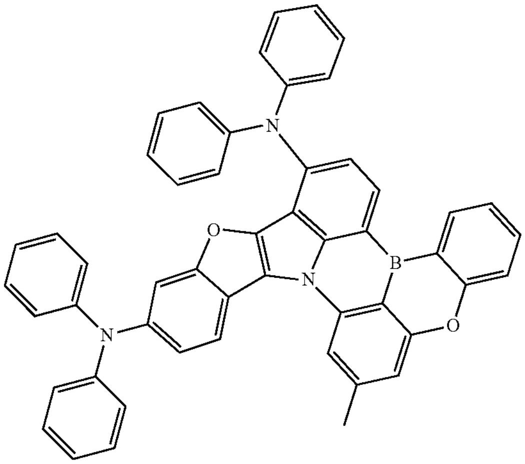
-continued
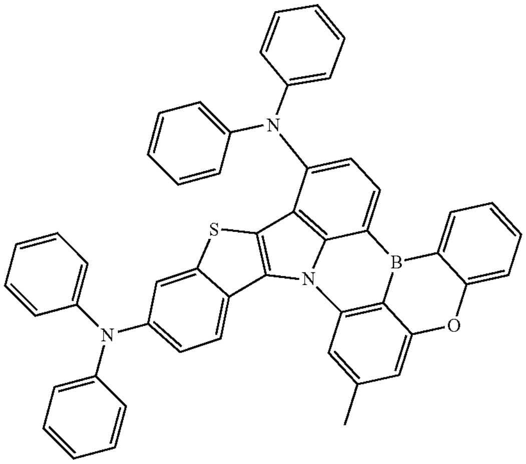
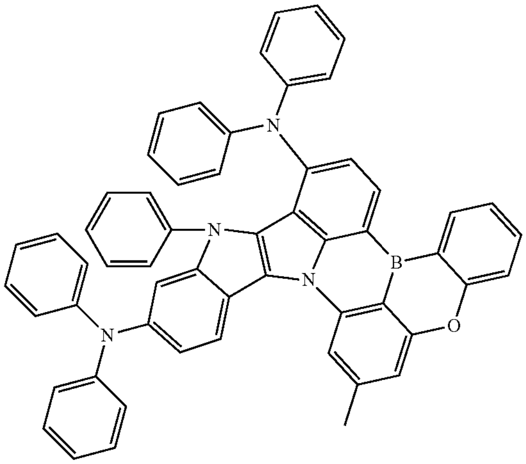
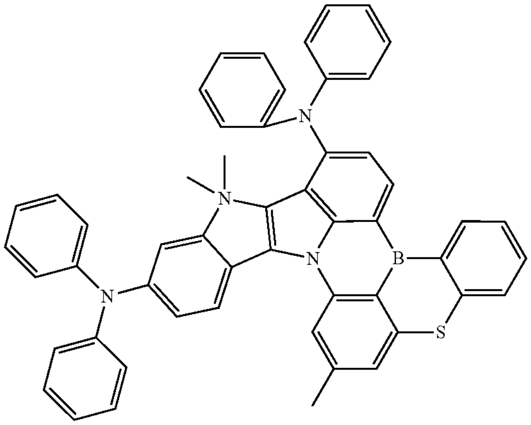

-continued
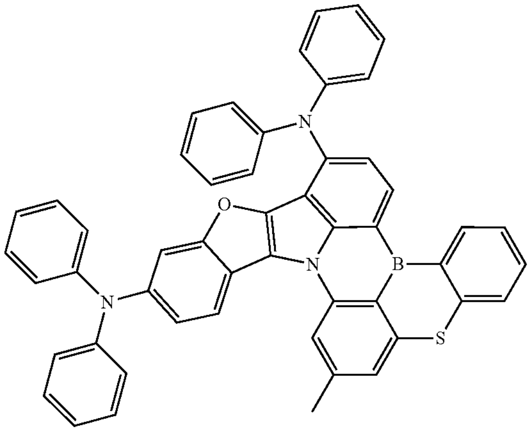
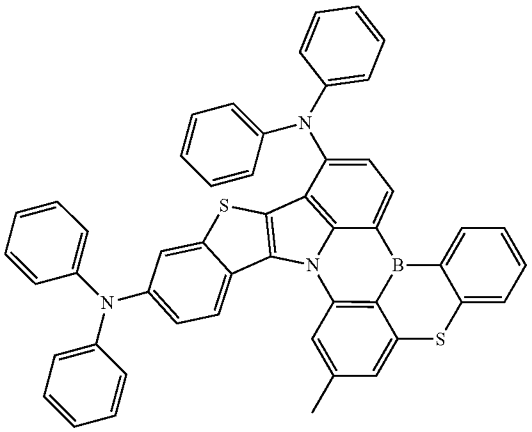
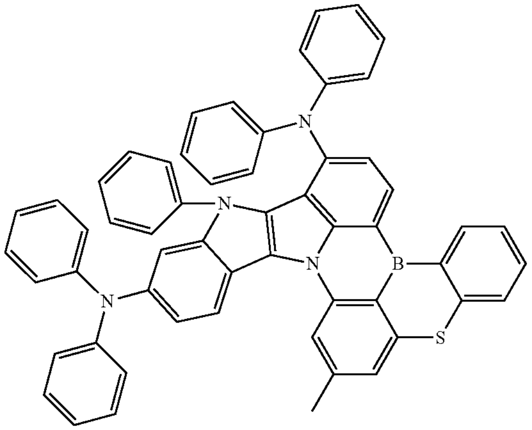
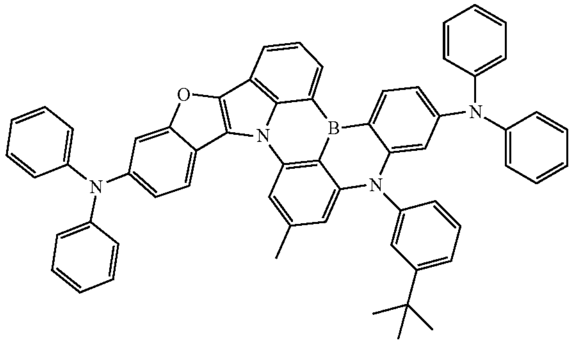
-continued
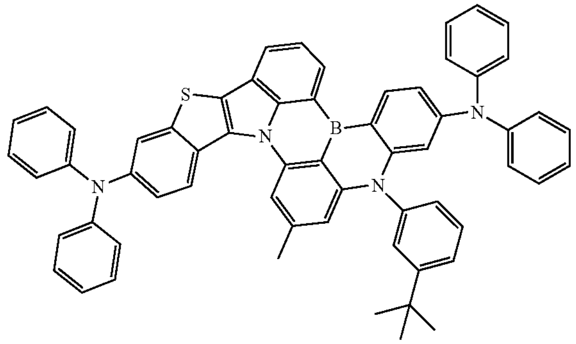
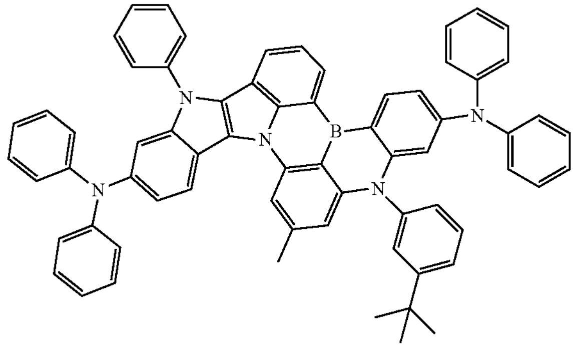
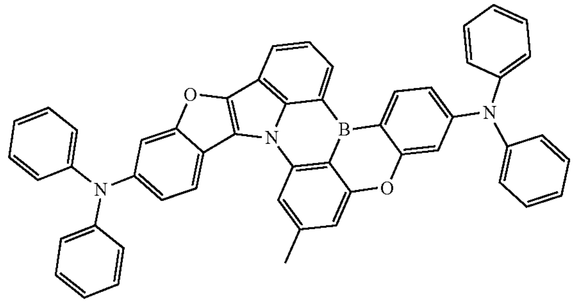
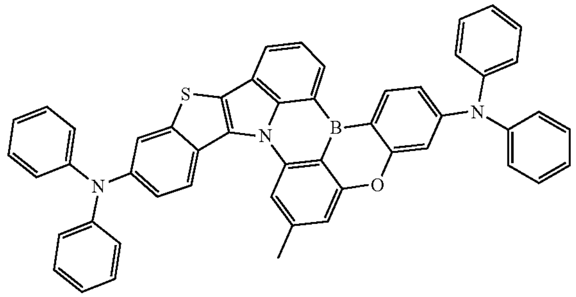
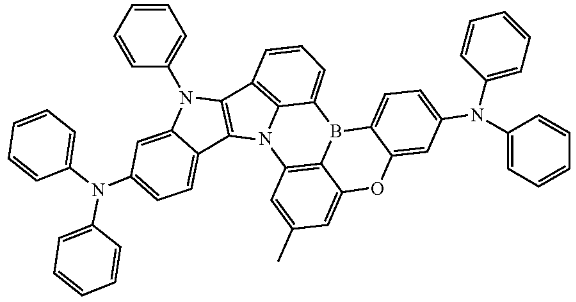

-continued
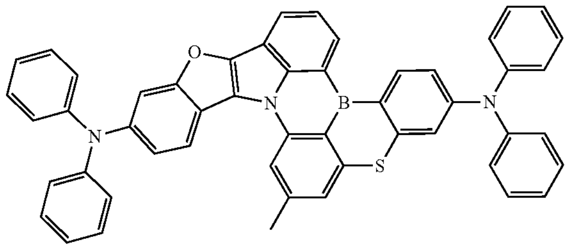
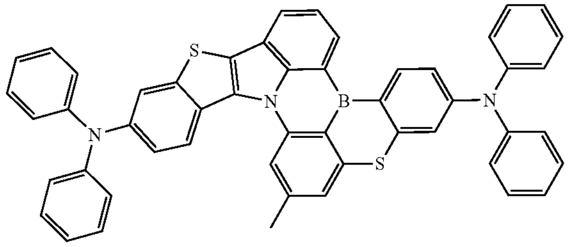
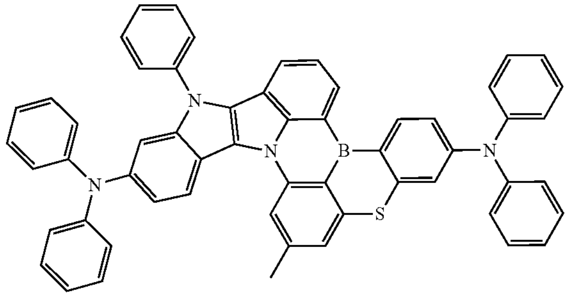
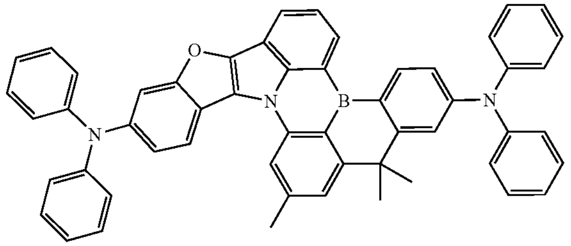
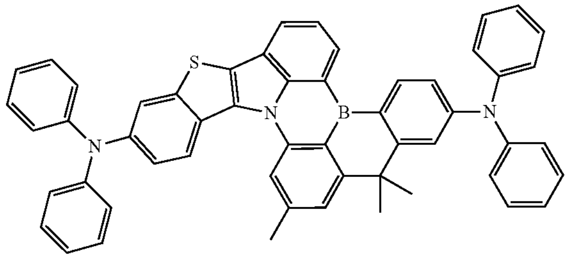
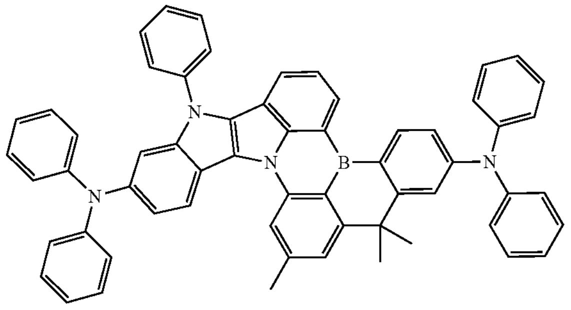
-continued
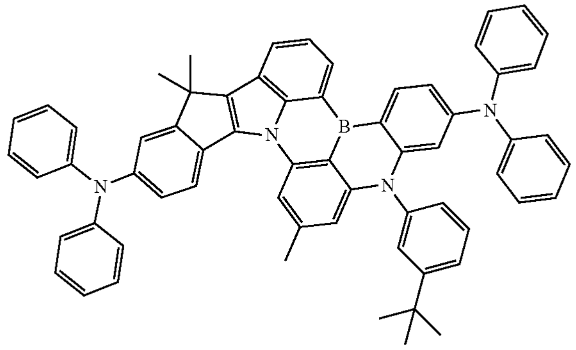
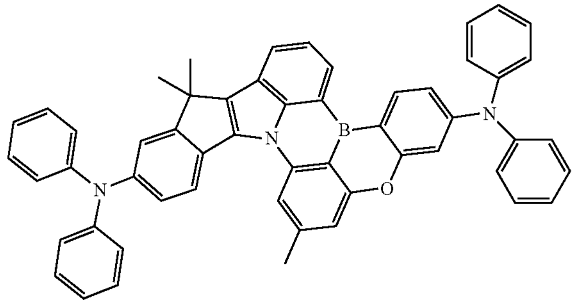
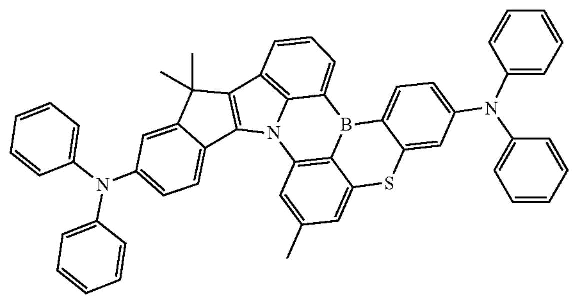
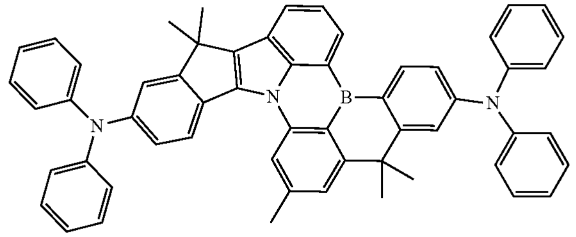
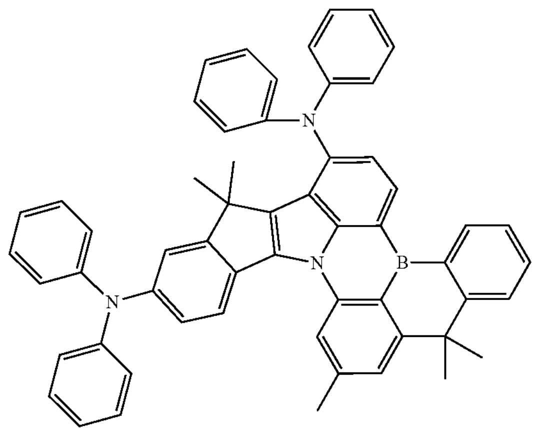

-continued
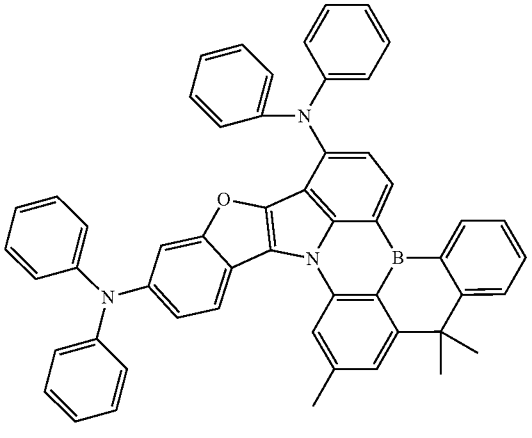
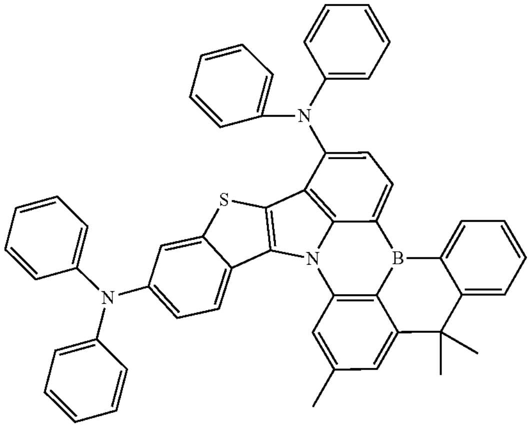
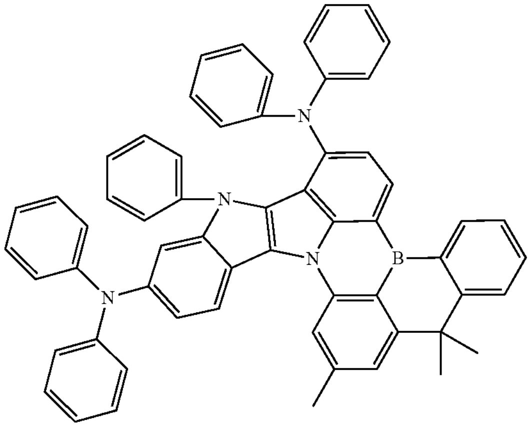
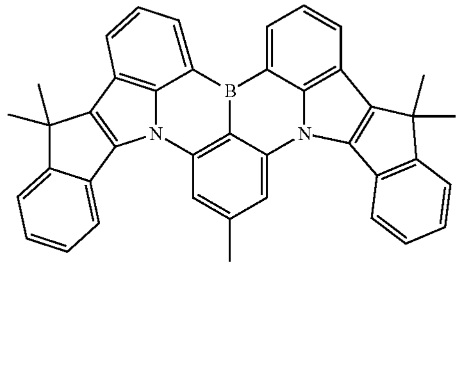
-continued
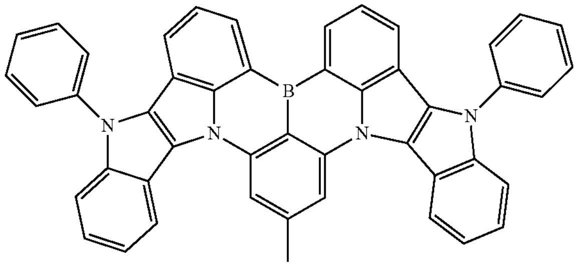
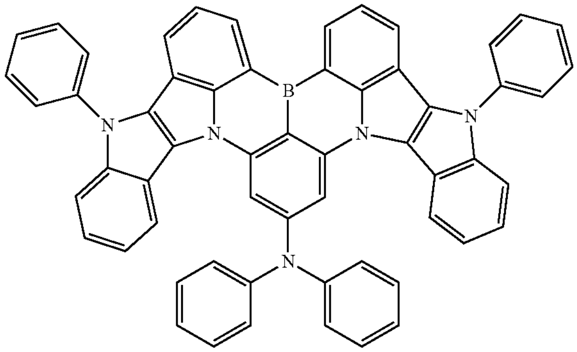
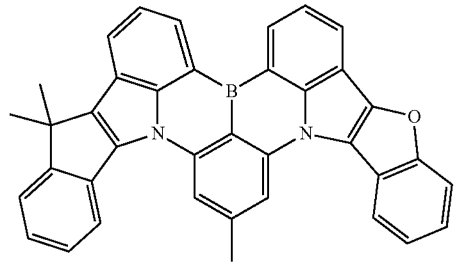
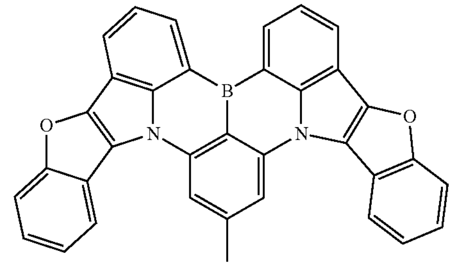
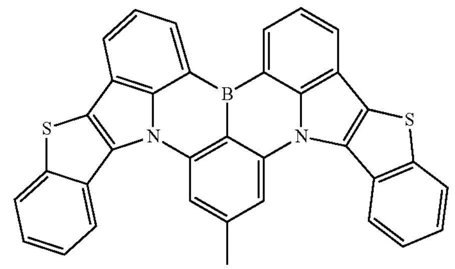
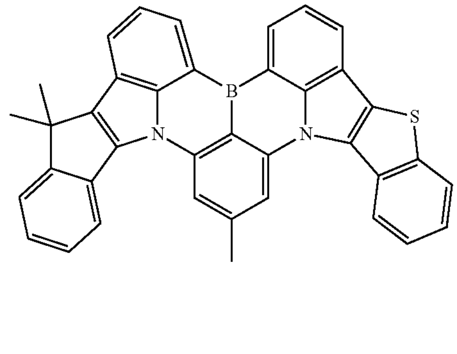

-continued
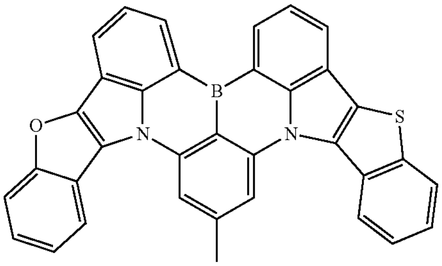
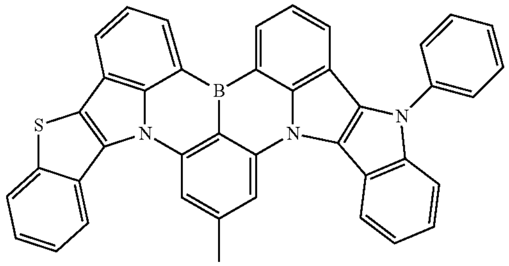
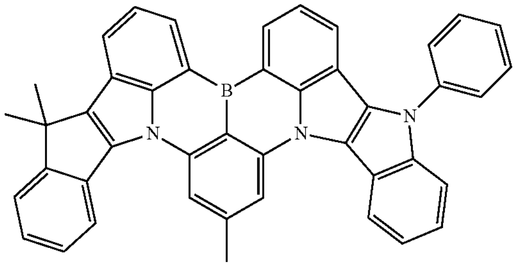
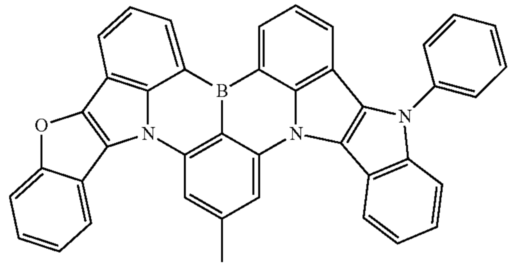
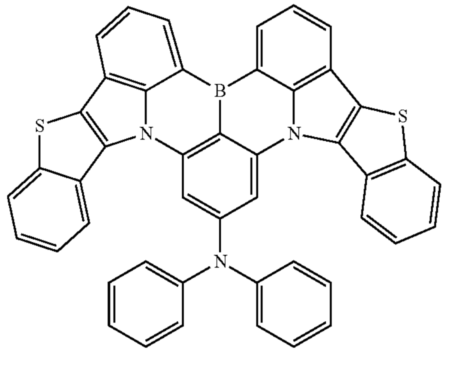
-continued
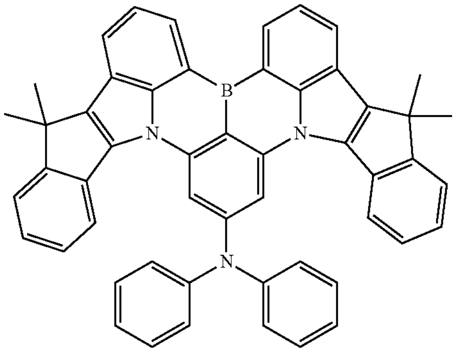
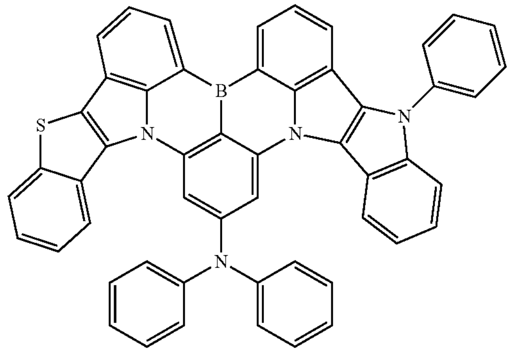
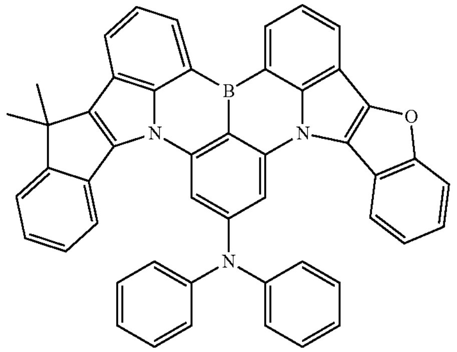
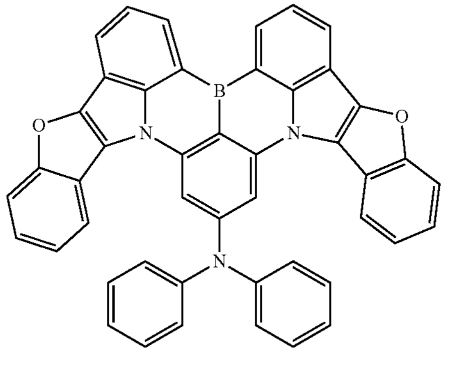

-continued
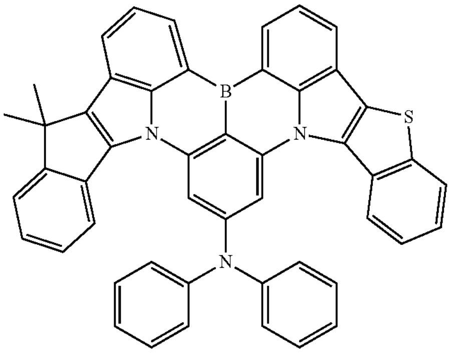
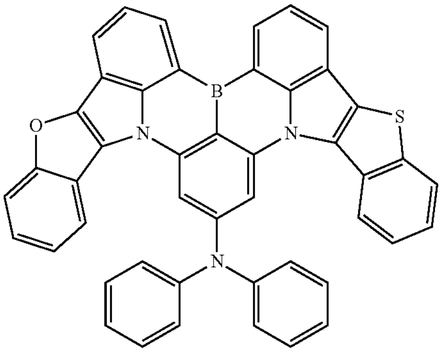
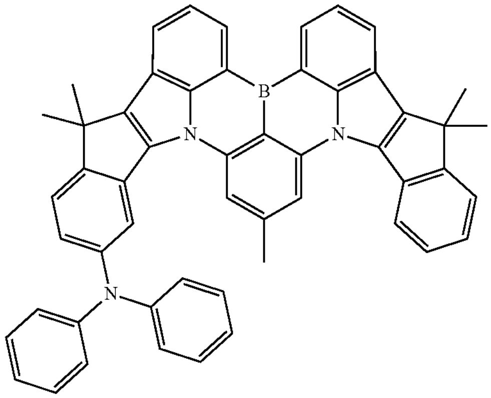
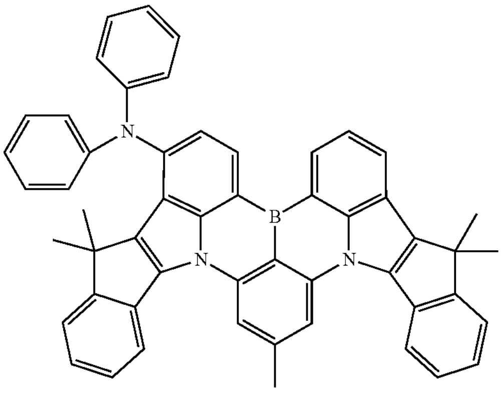
-continued
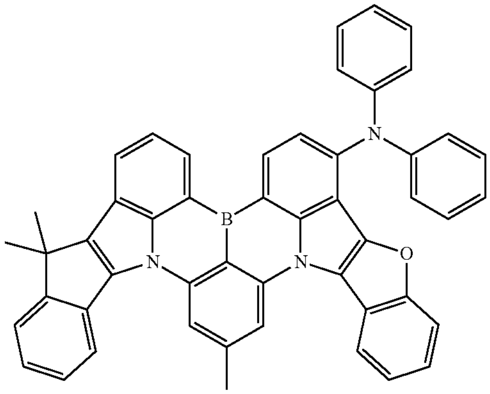
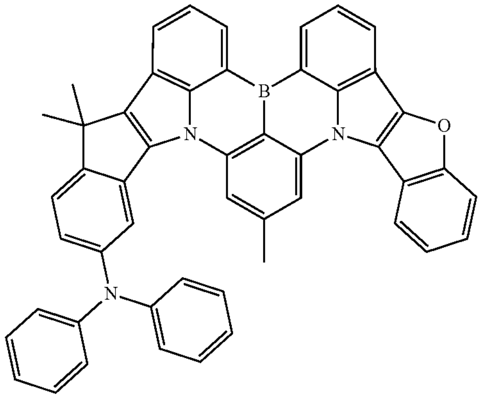
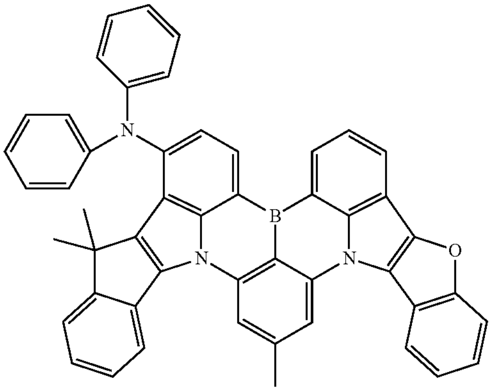
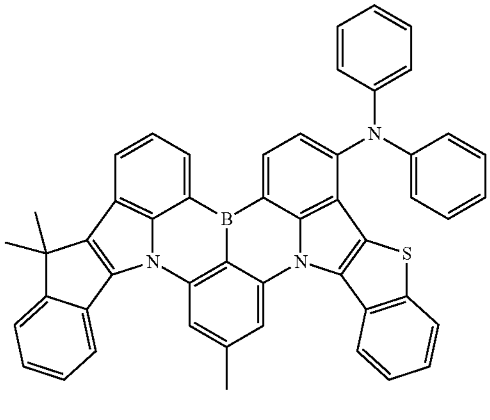

-continued
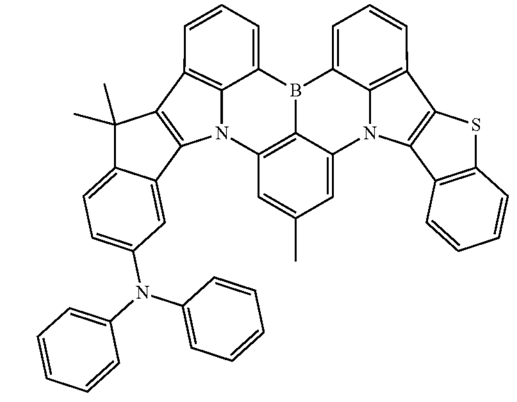
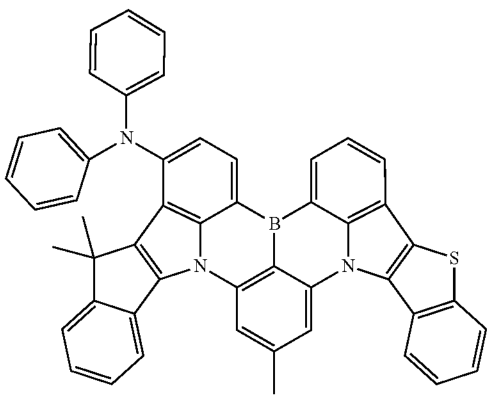
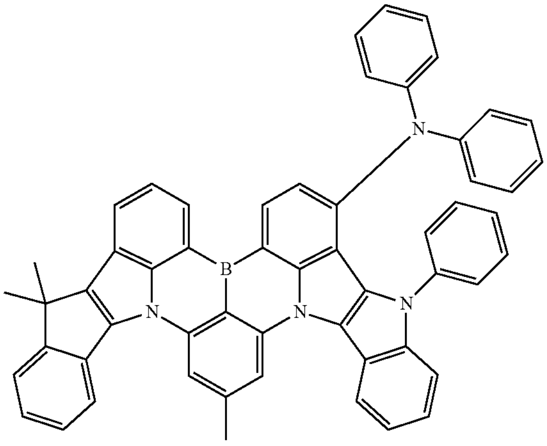
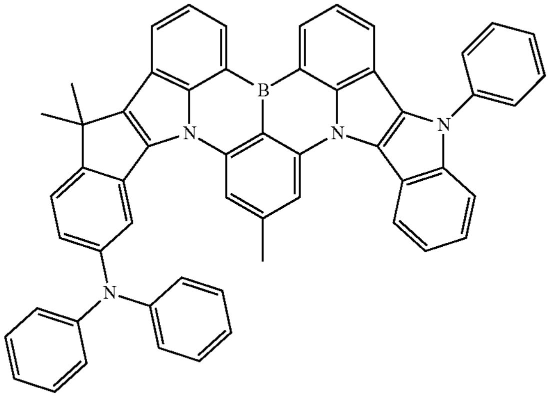
-continued
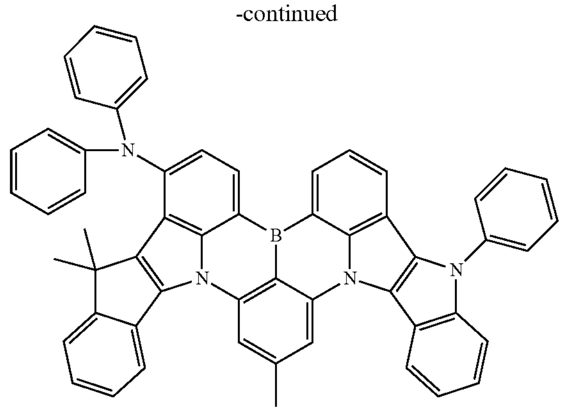
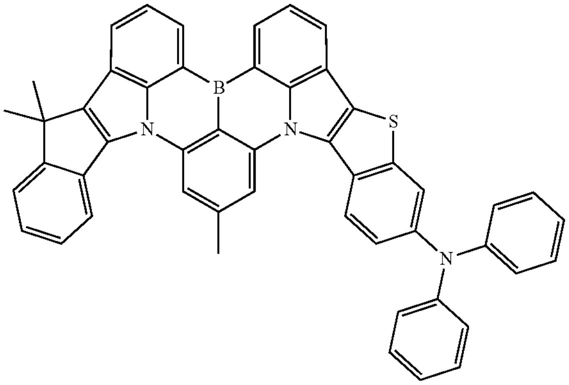
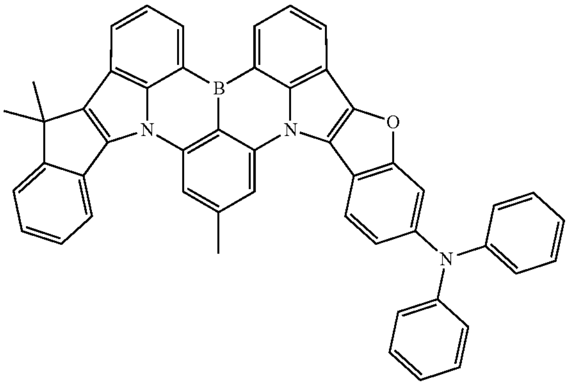
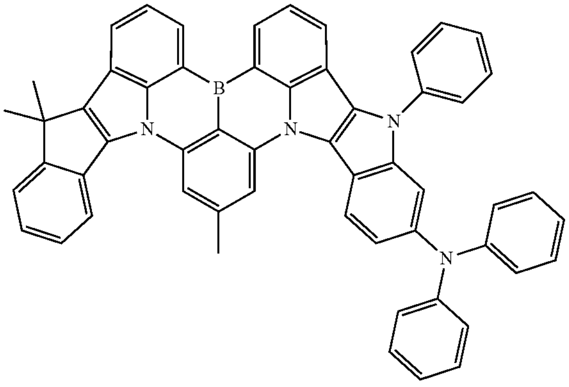

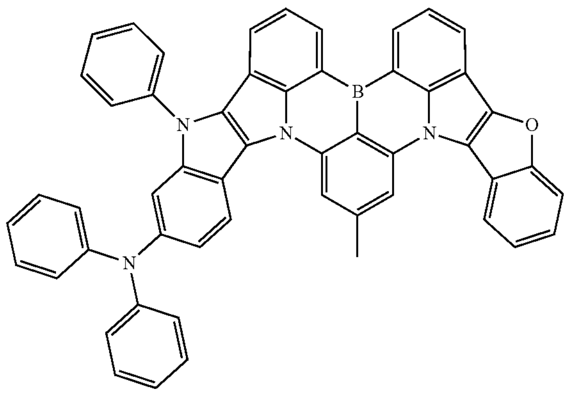
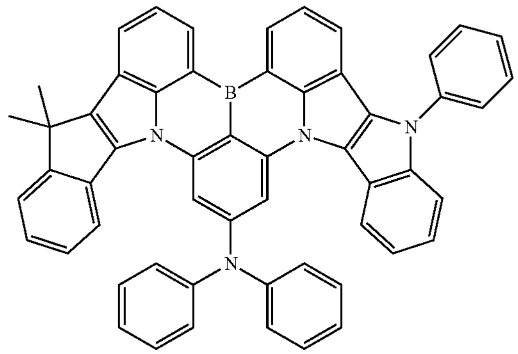
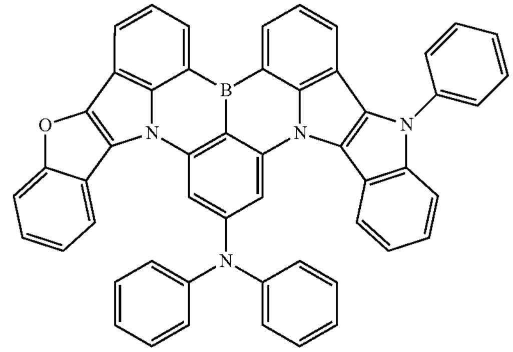
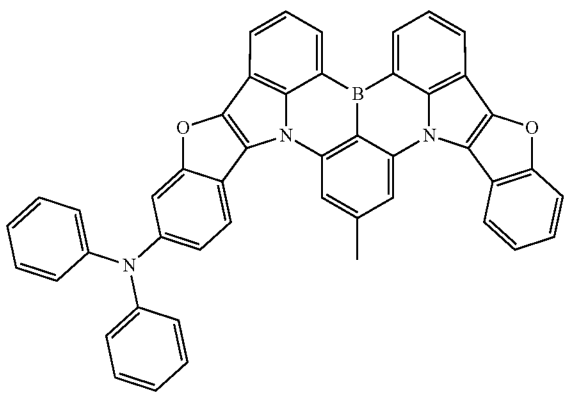
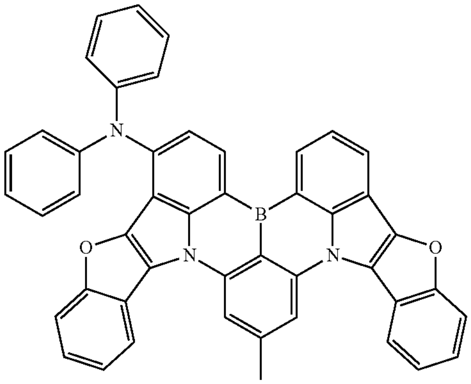
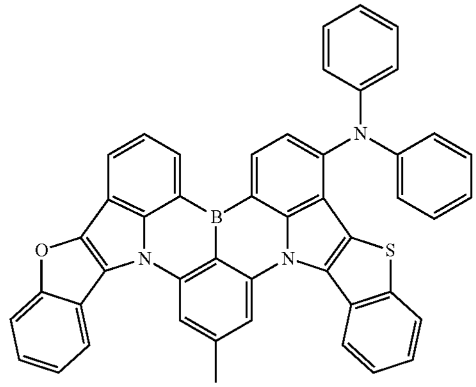
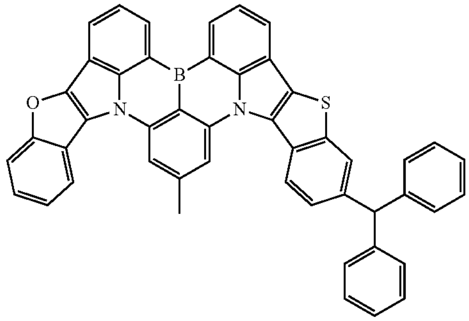
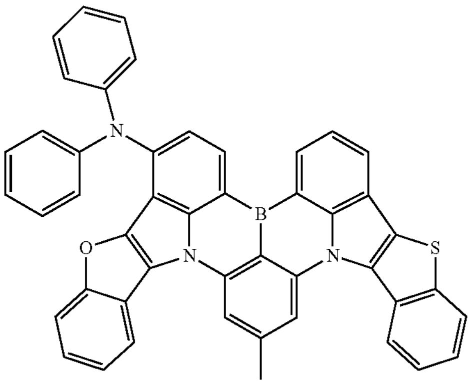

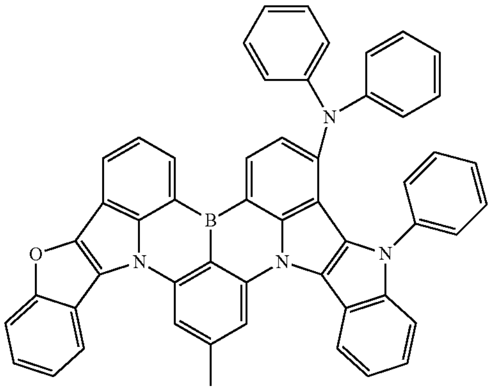
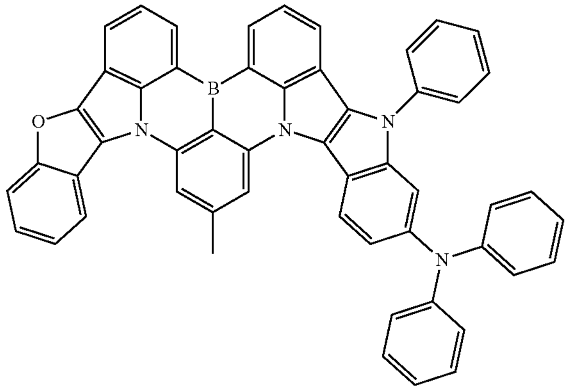
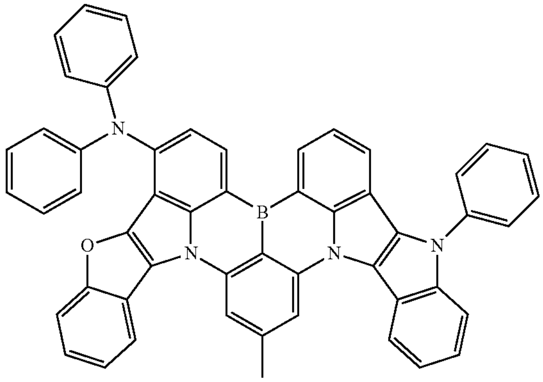
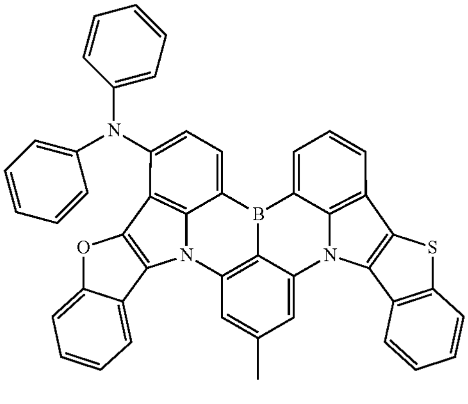
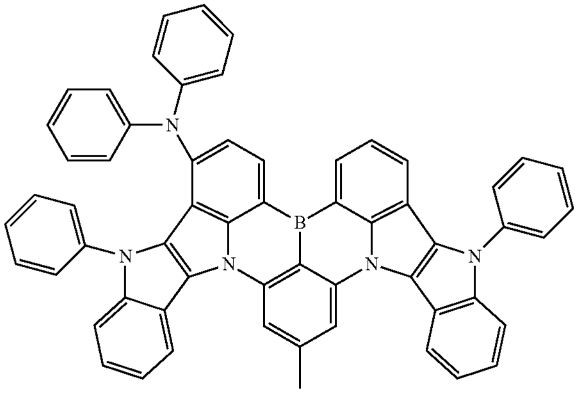
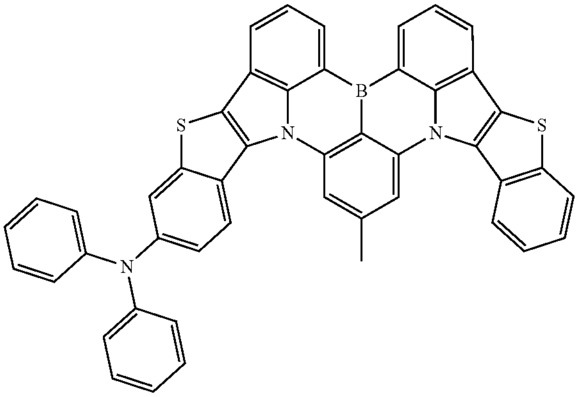
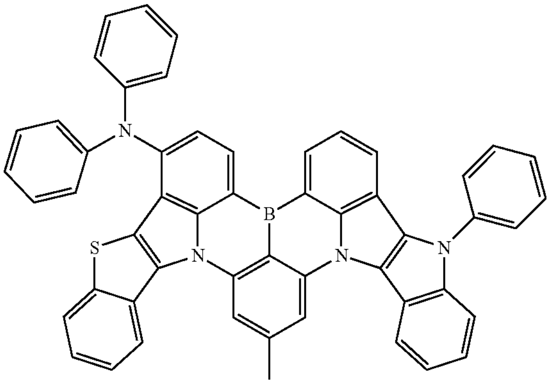
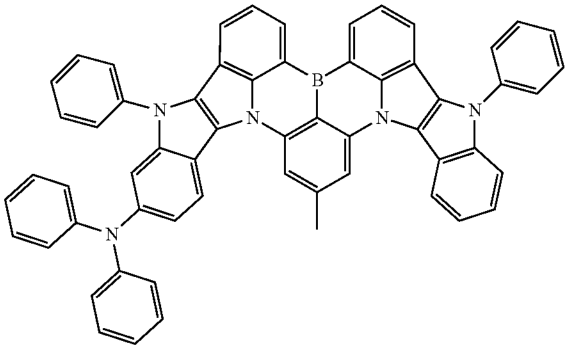

-continued
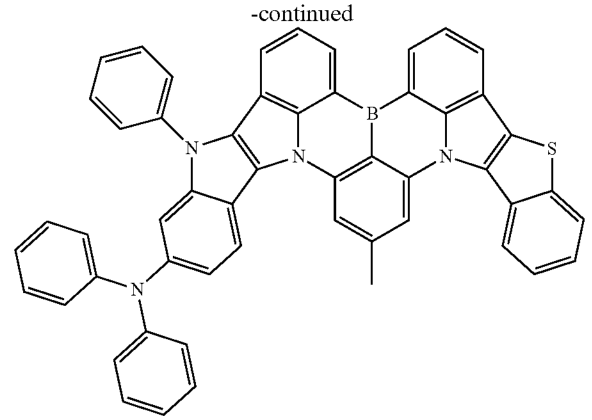
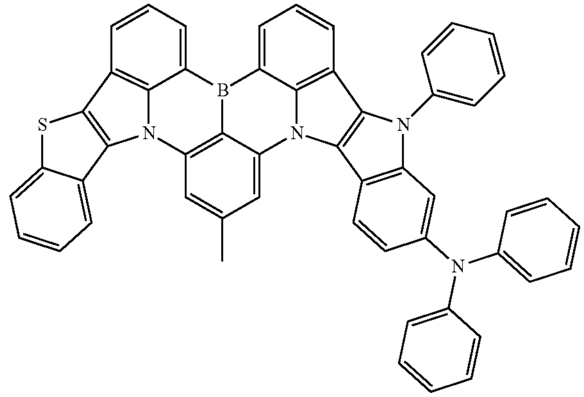
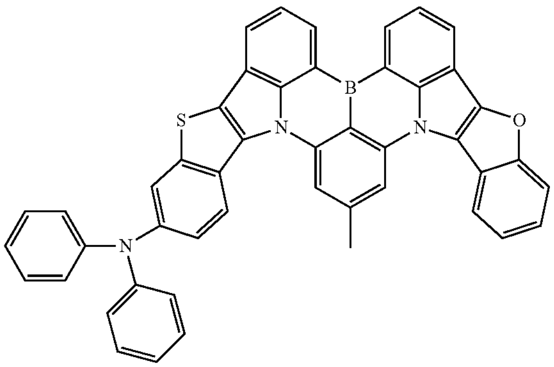
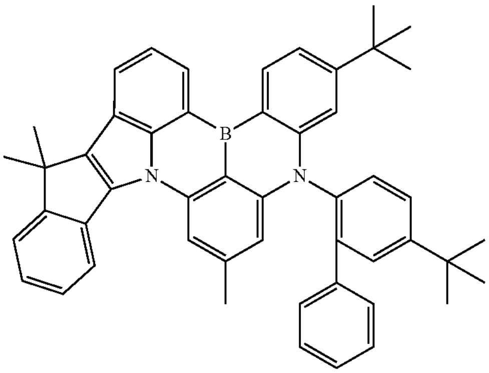
-continued
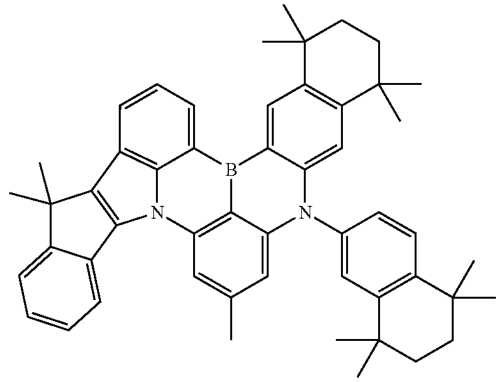
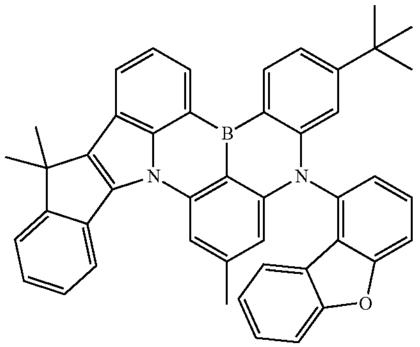
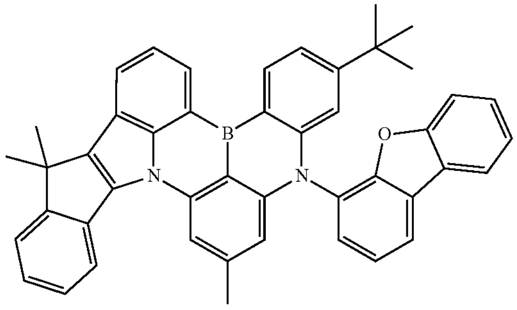
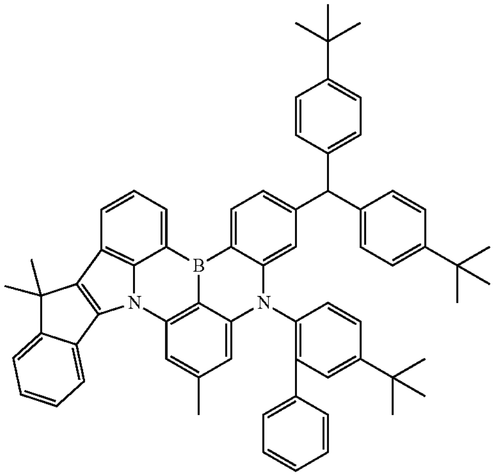

-continued
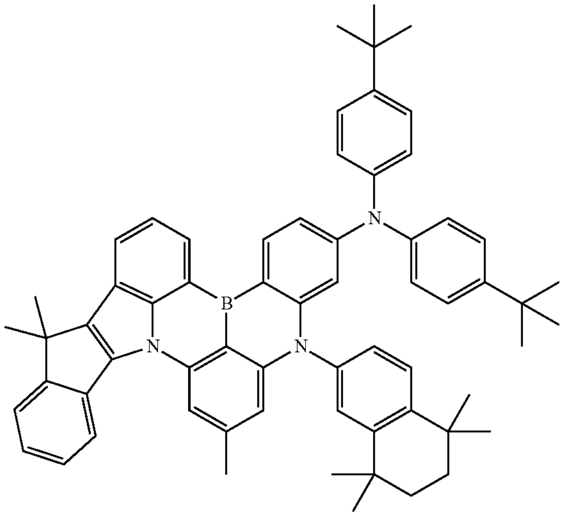
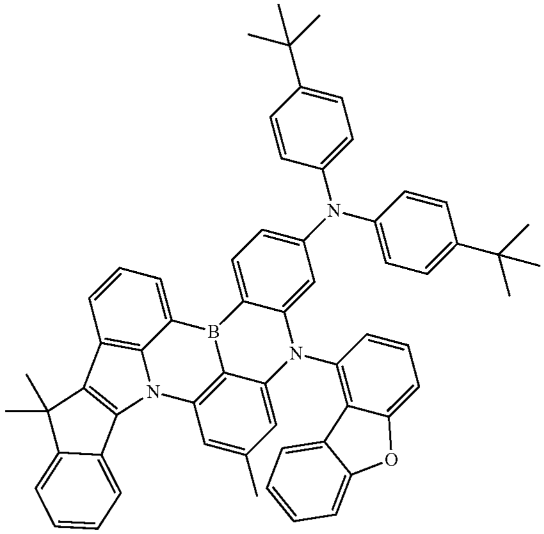
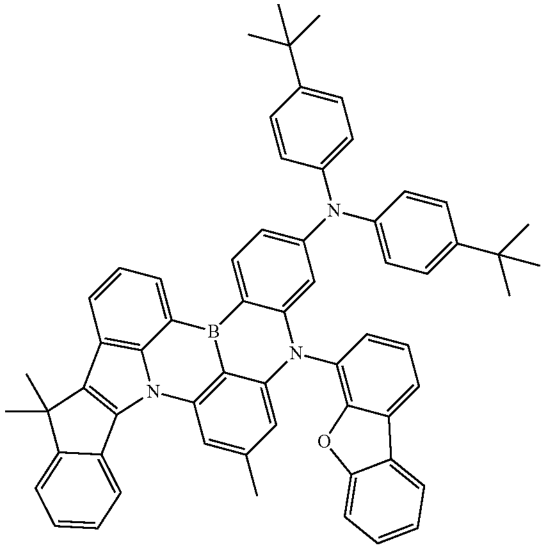
-continued
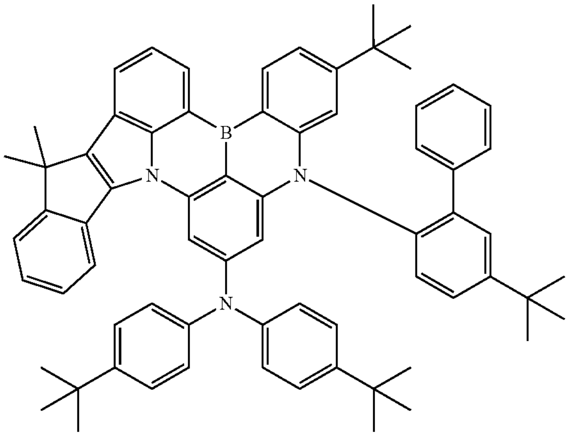
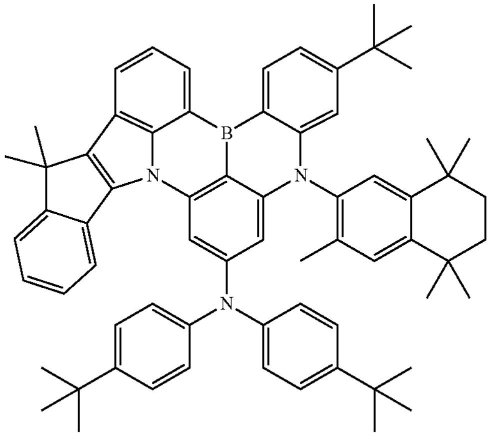
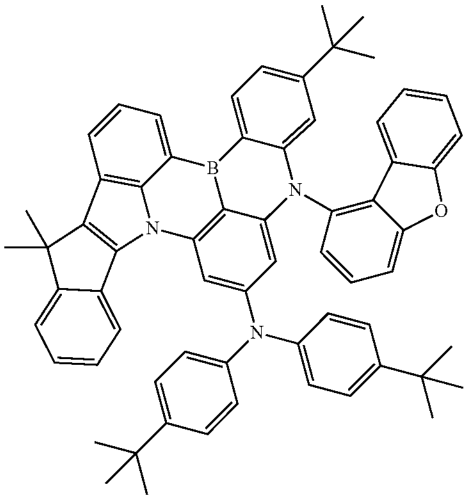

-continued
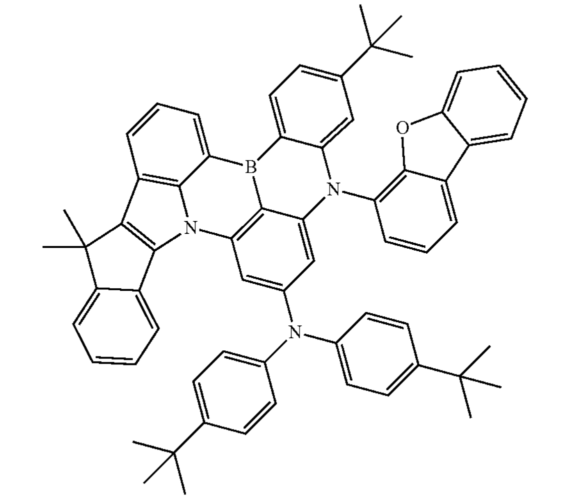
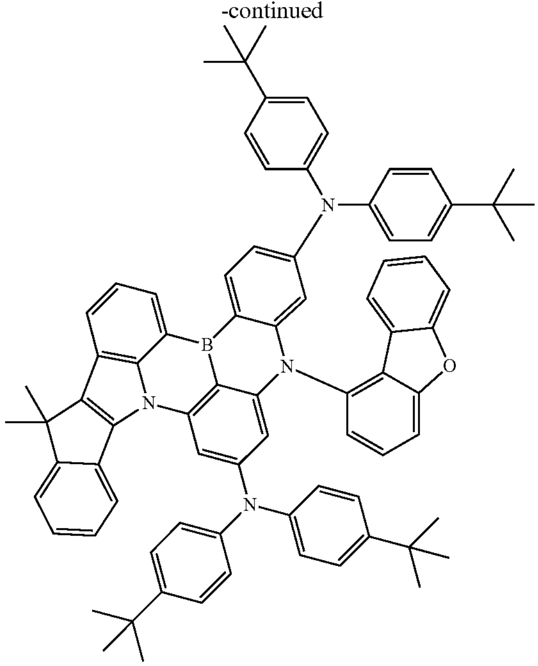
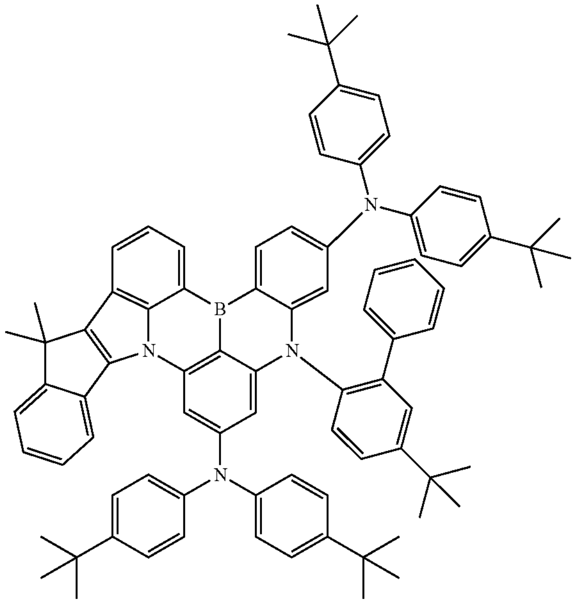
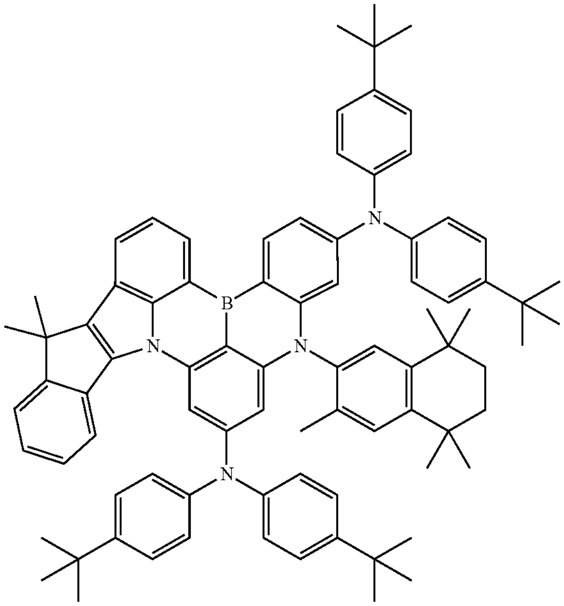
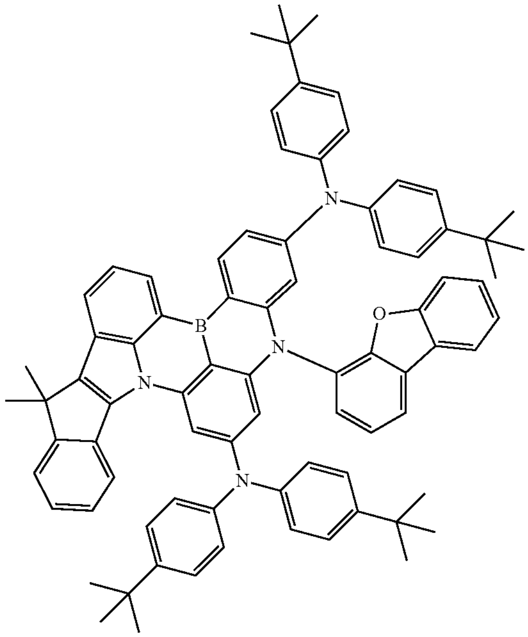
-continued -continued
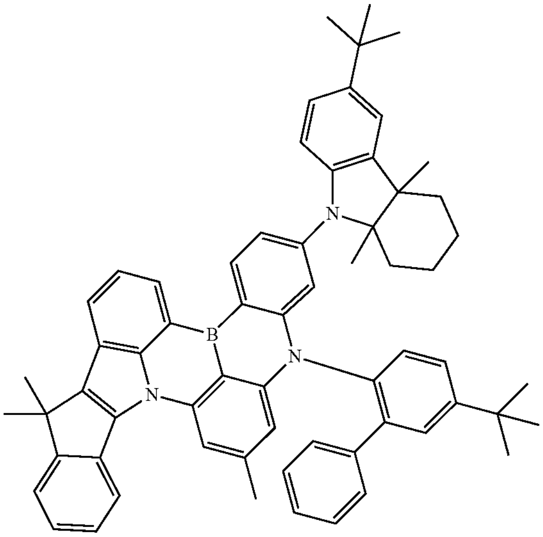
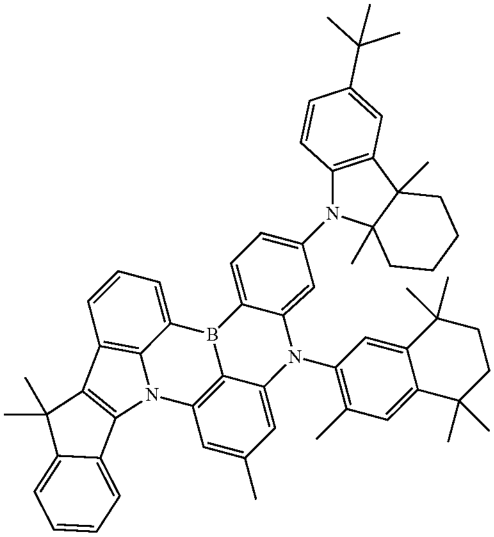
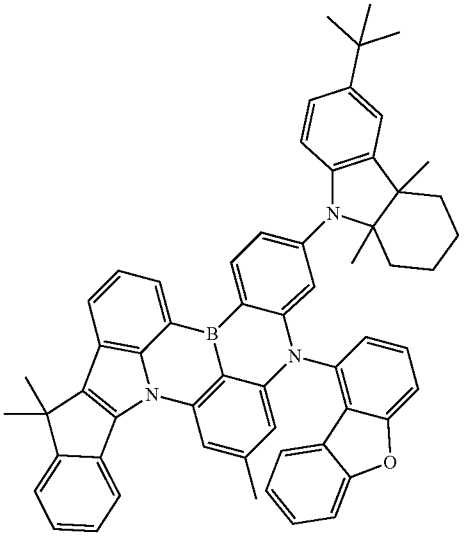
-continued
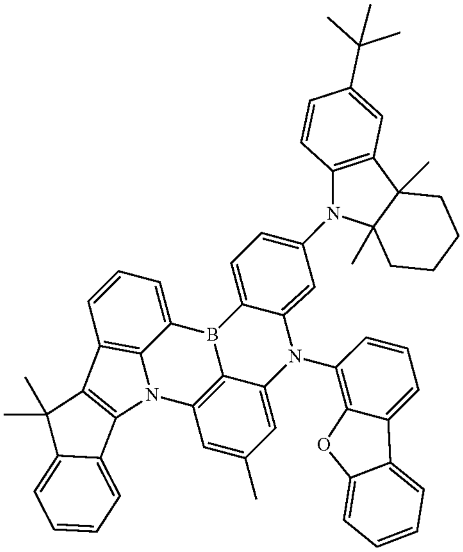
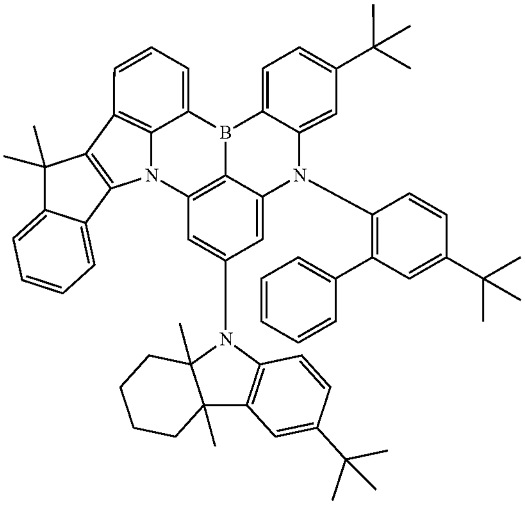
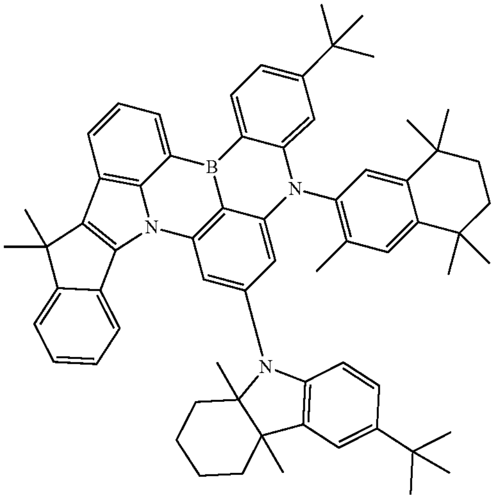

-continued
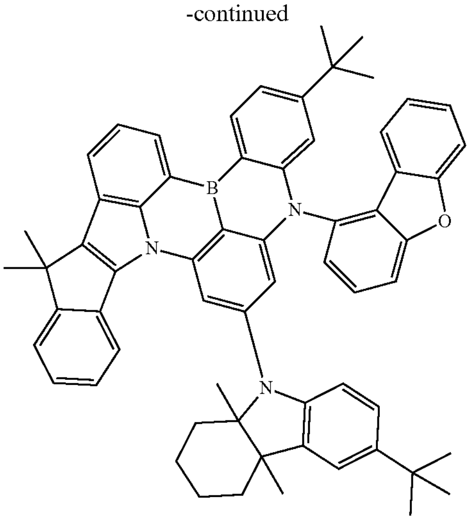
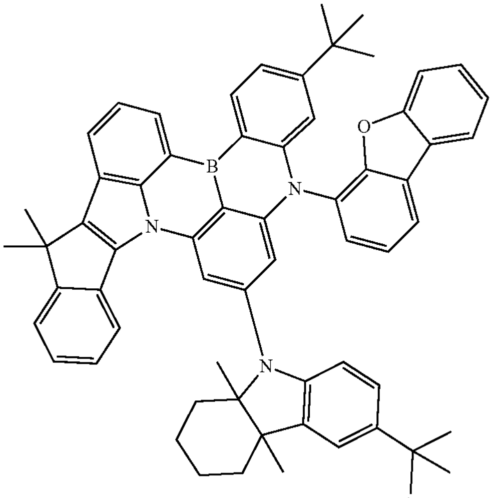
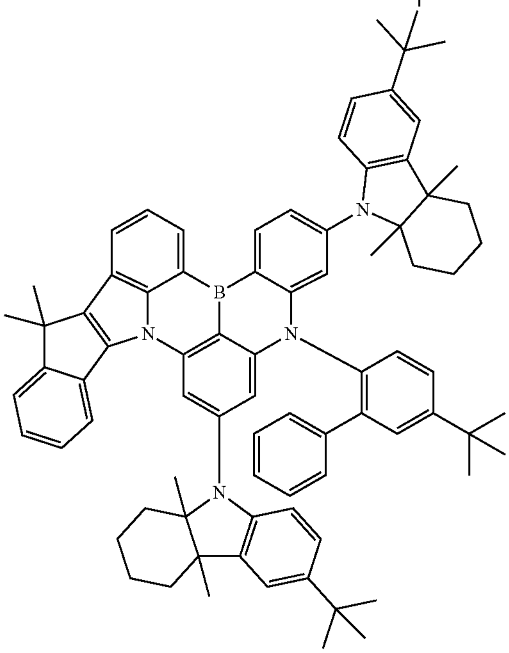
-continued
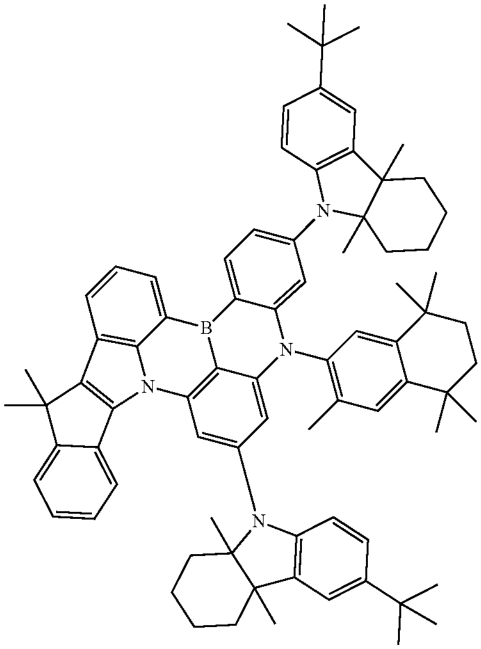
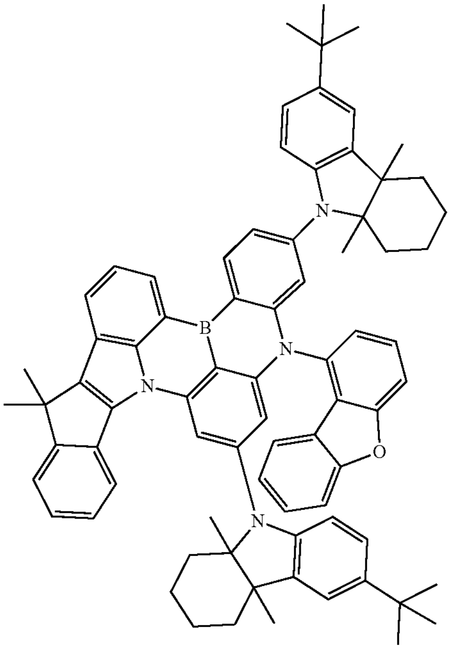

-continued
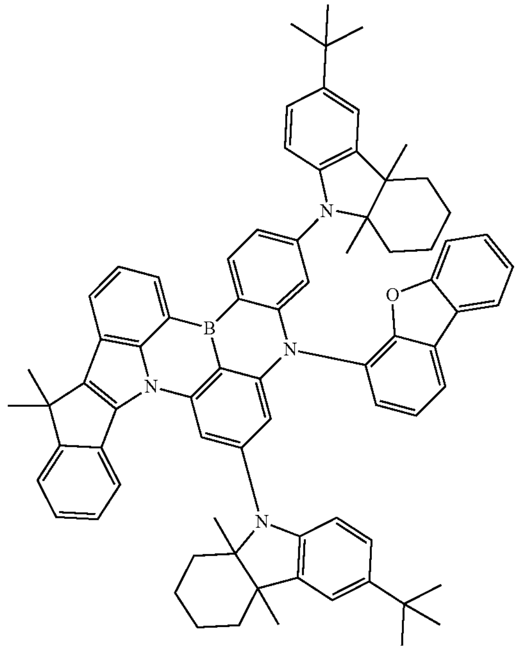
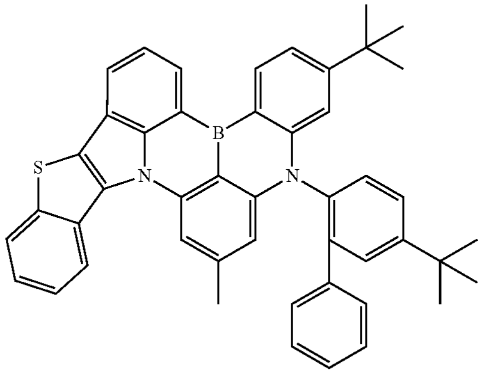
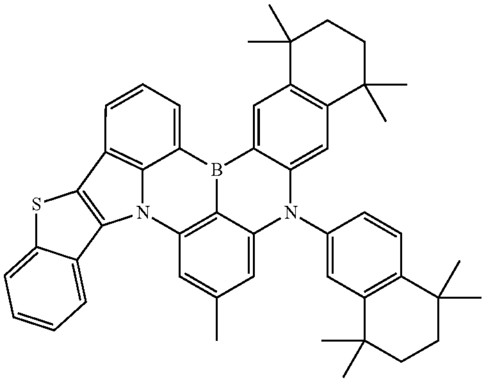
-continued
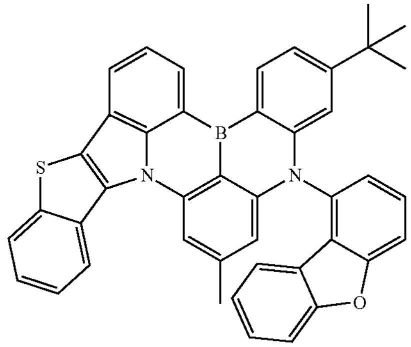
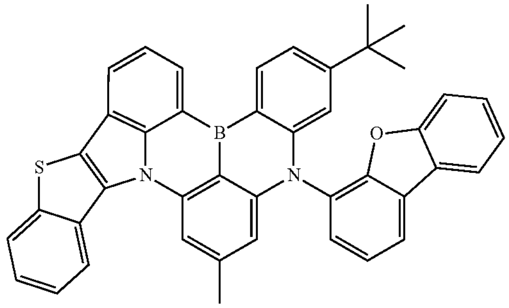
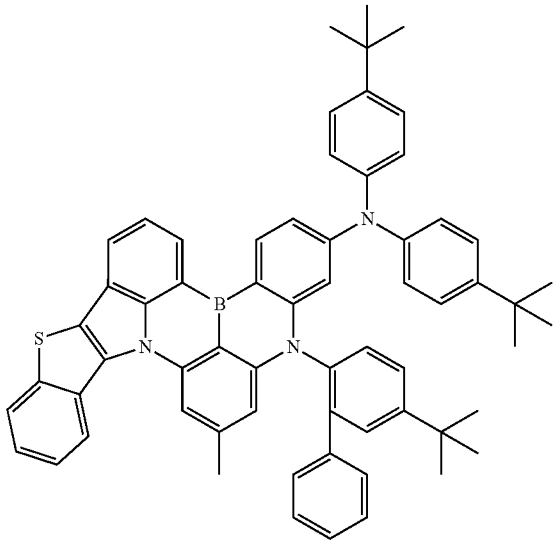
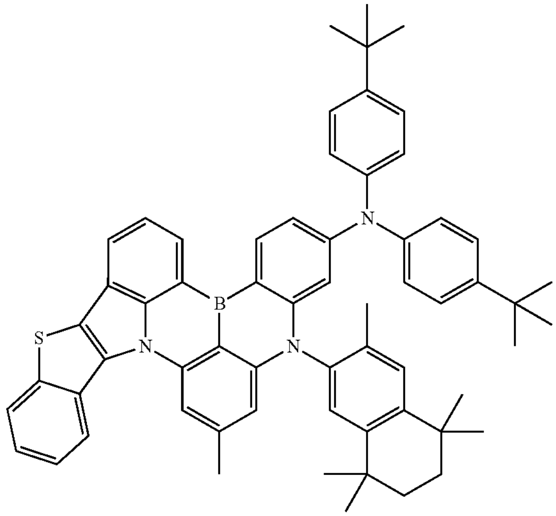

-continued
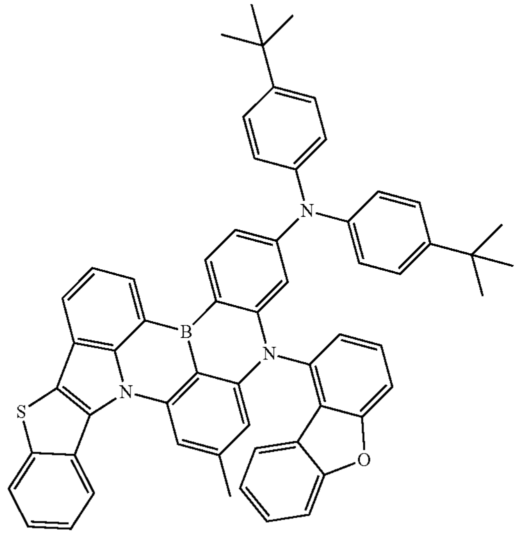
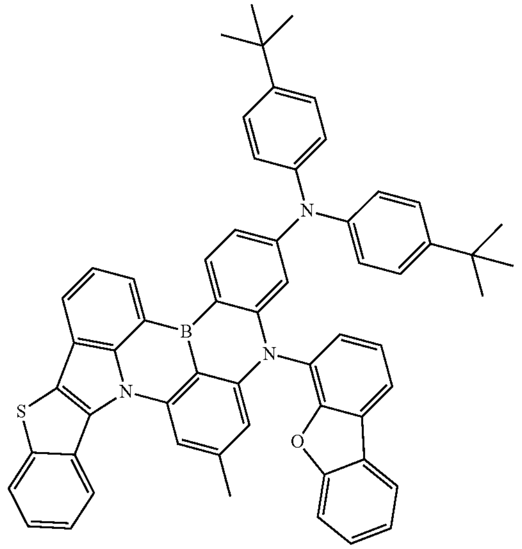
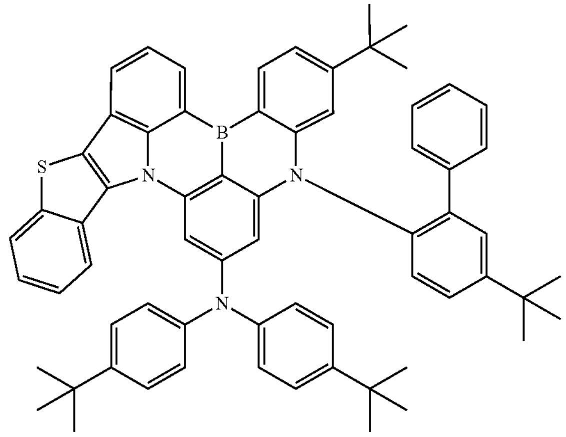
-continued
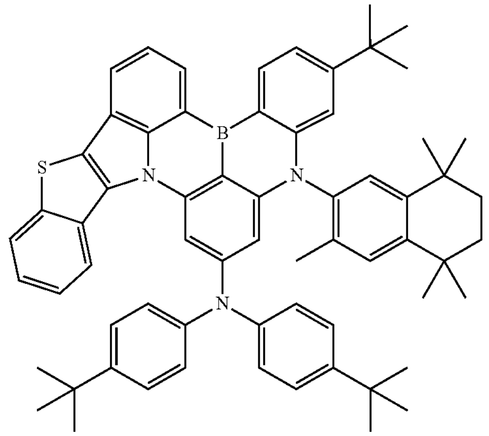
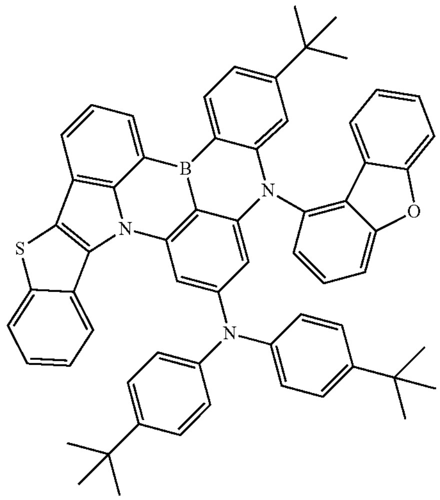
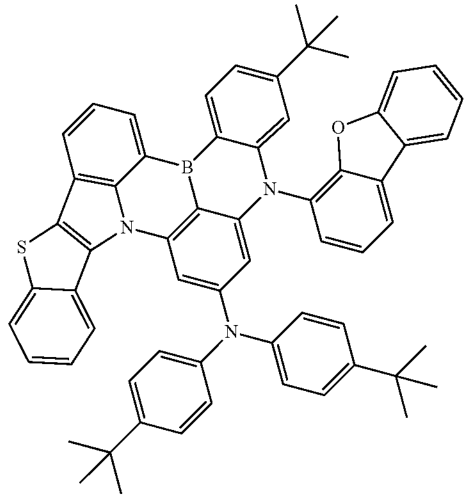

-continued
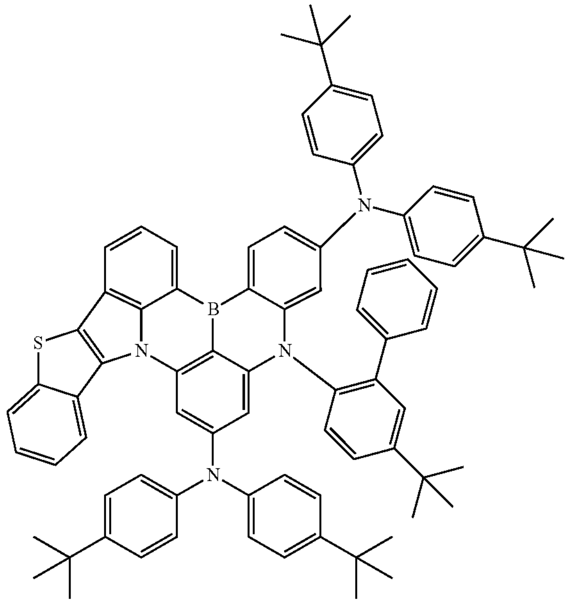
-continued
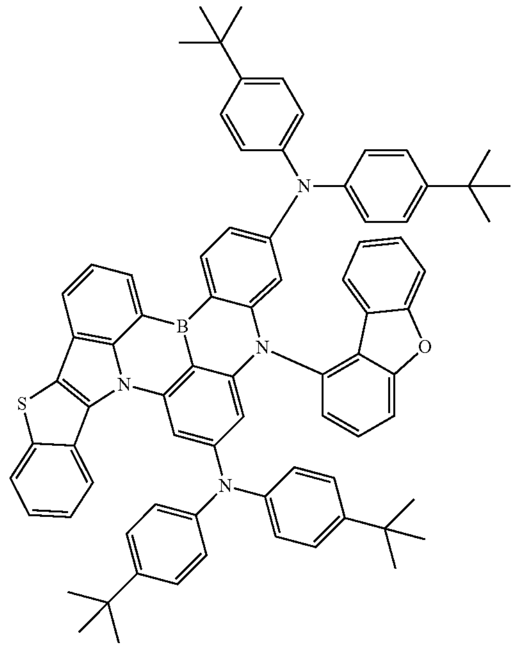
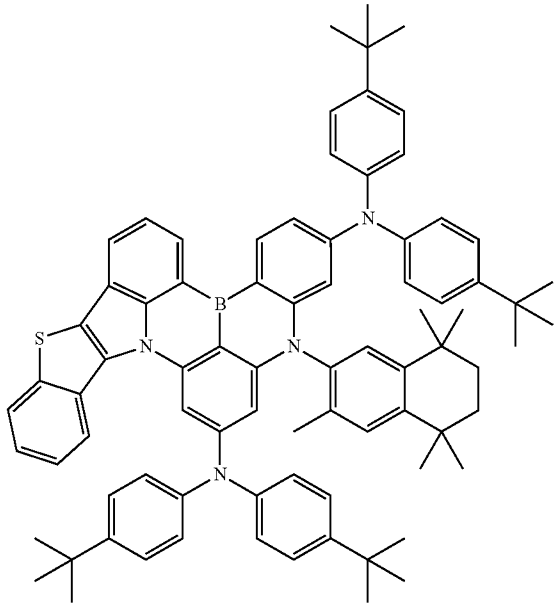
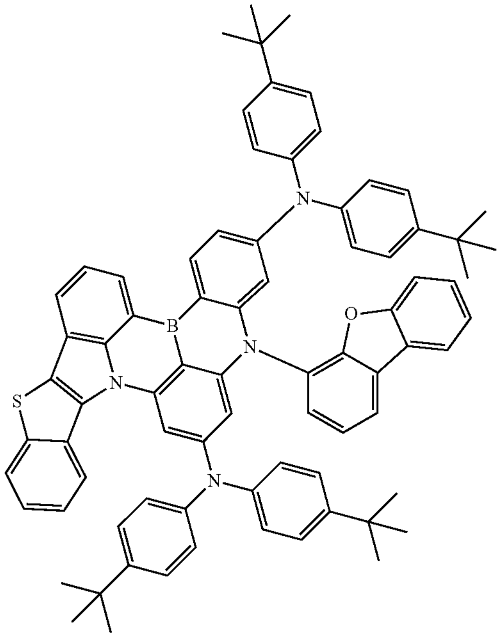

-continued
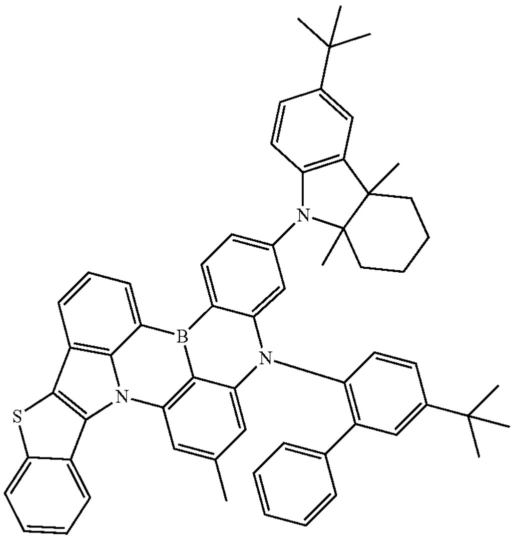
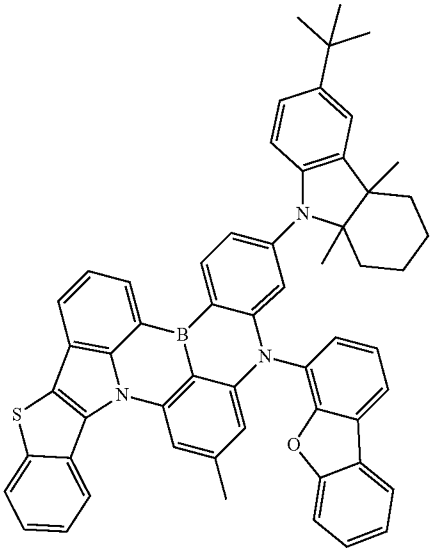
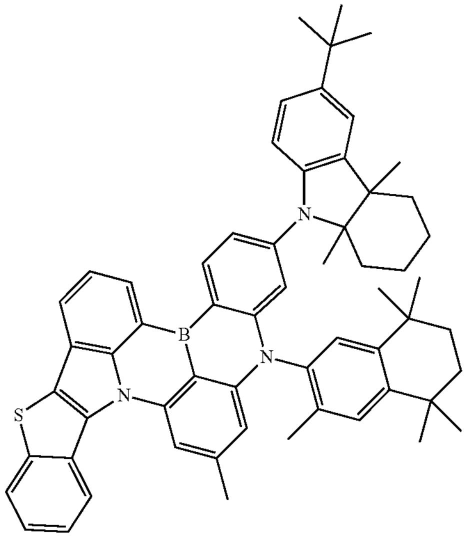
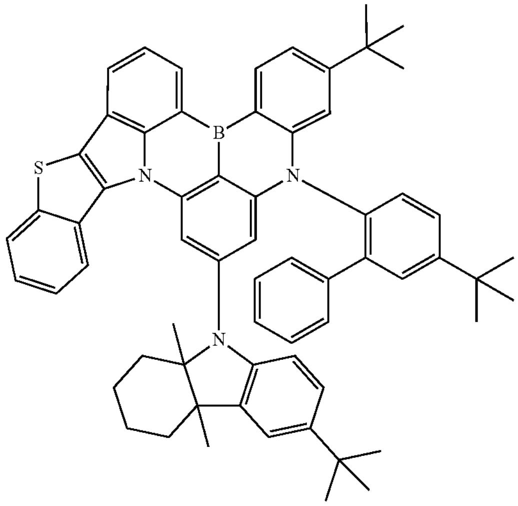
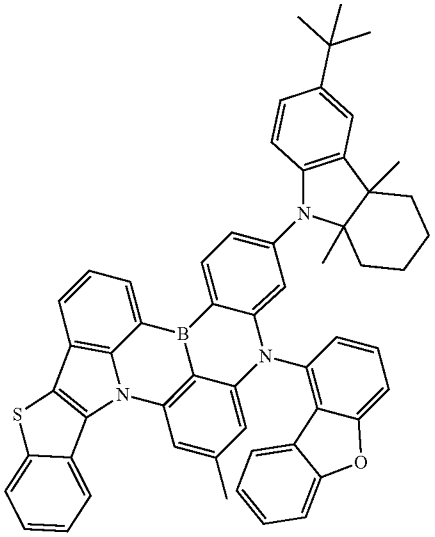
-continued
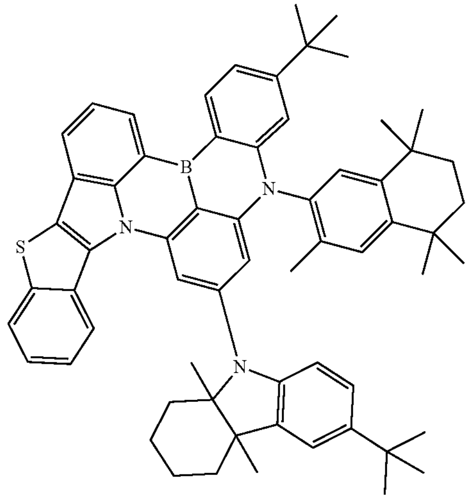

-continued
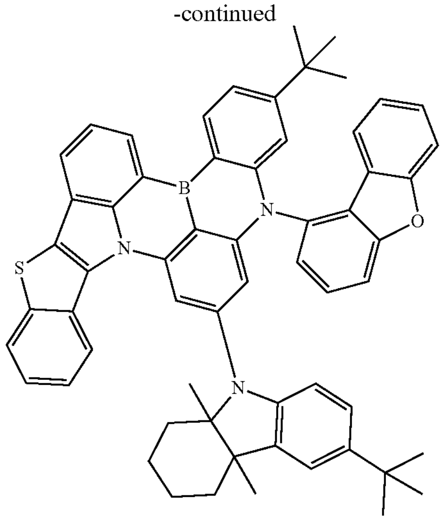
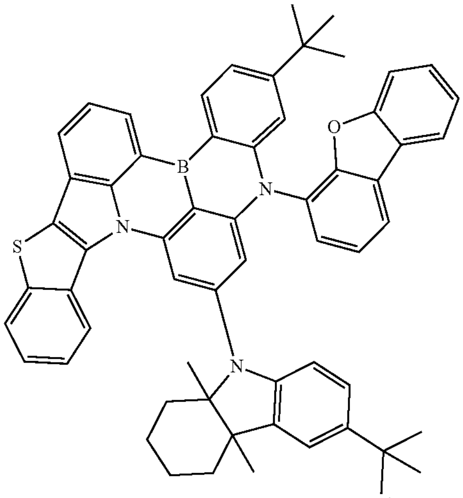
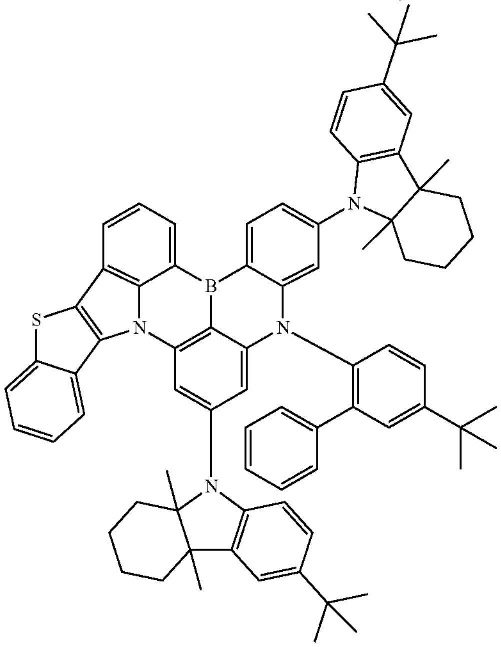
-continued
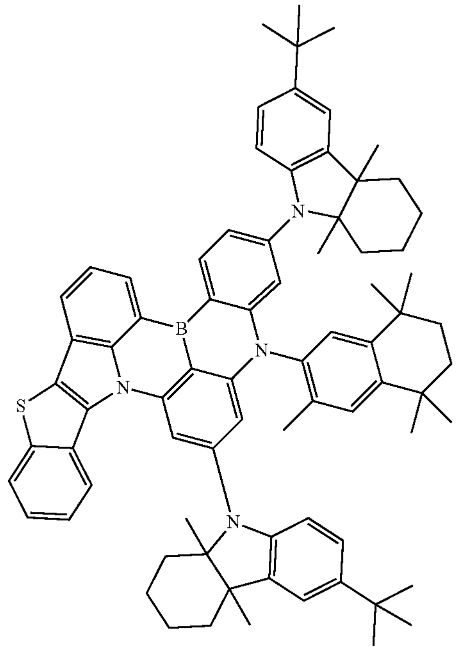
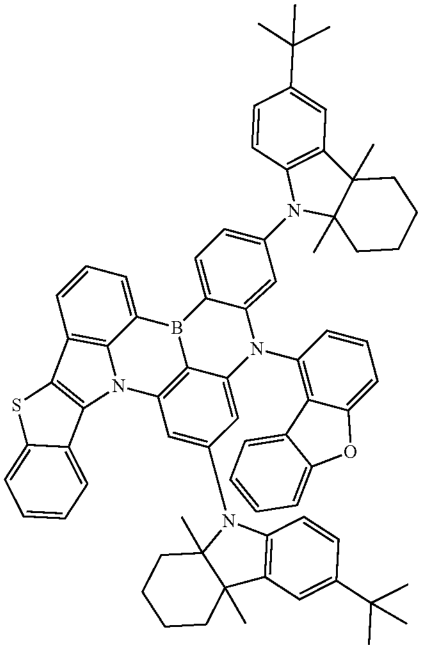

-continued
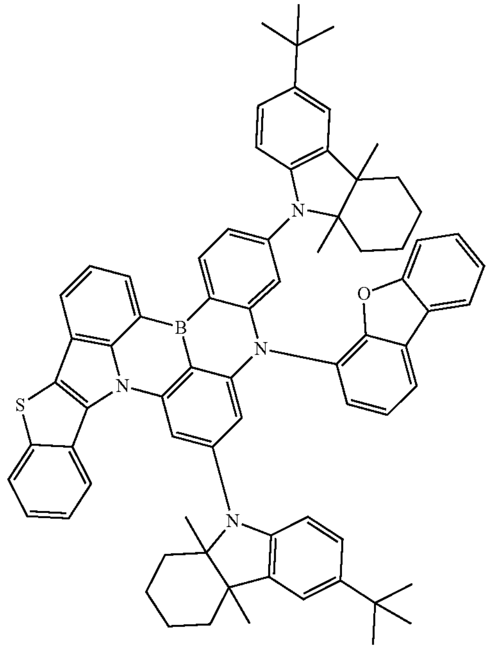
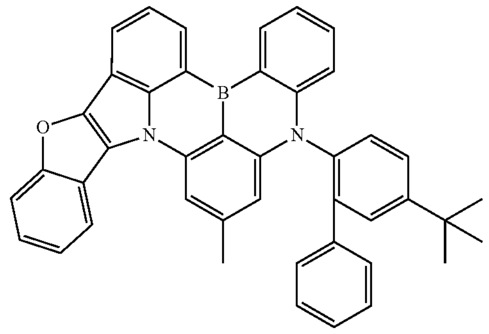
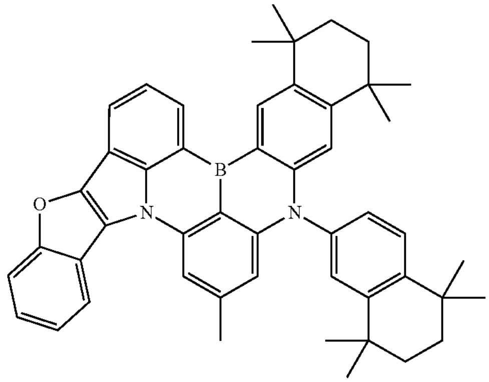
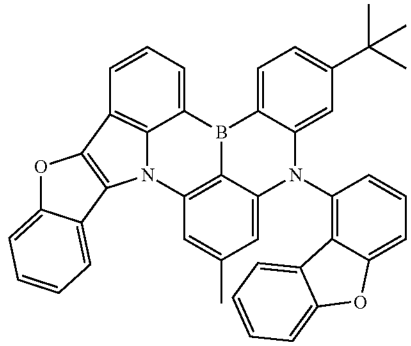
-continued
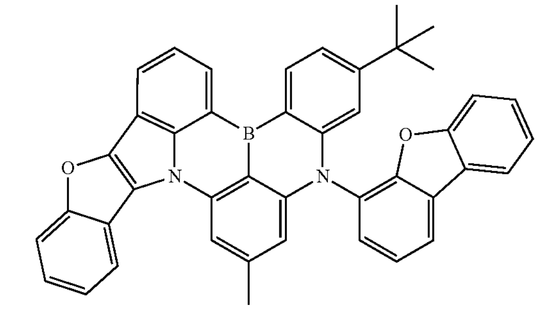
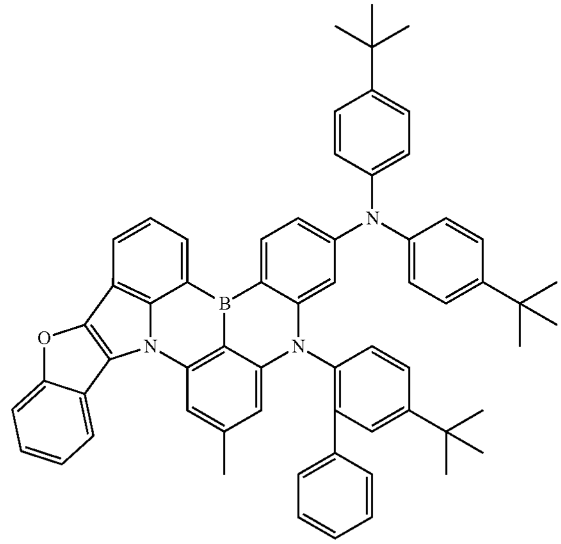
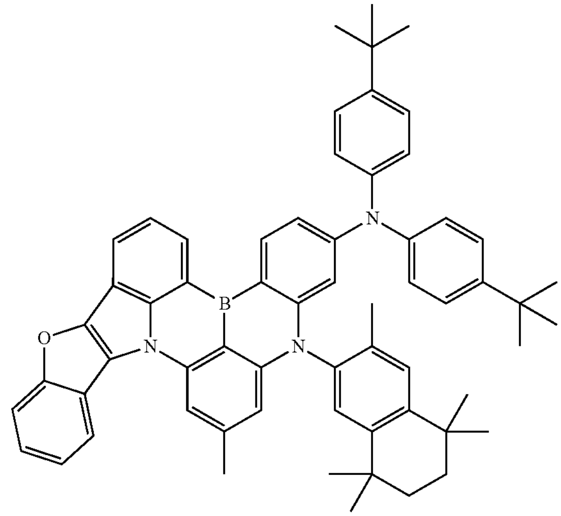

-continued
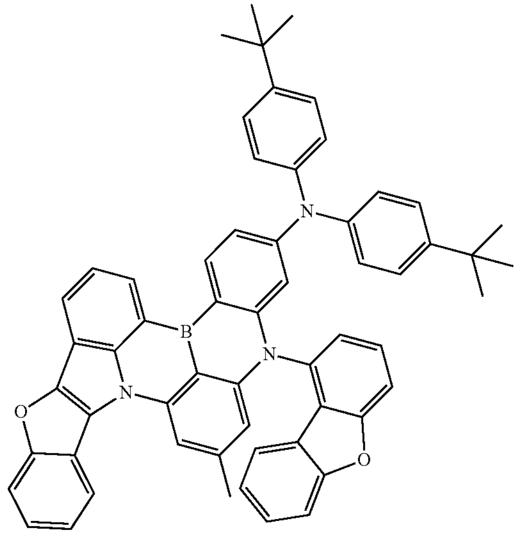
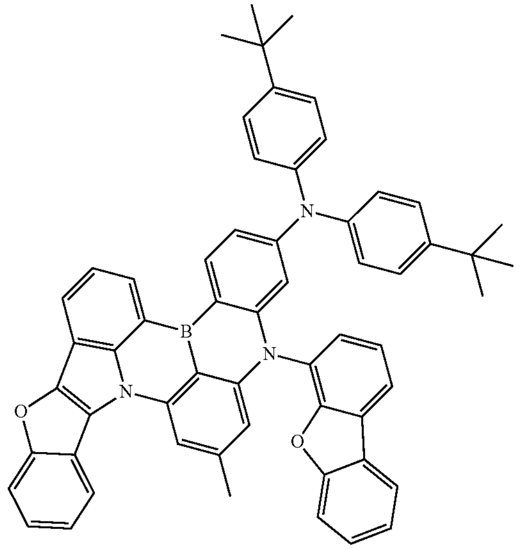
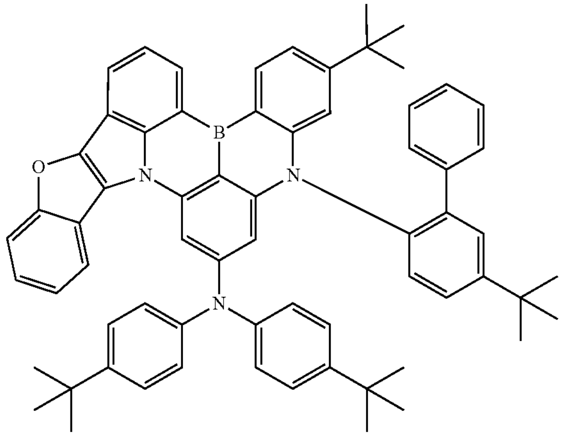
-continued
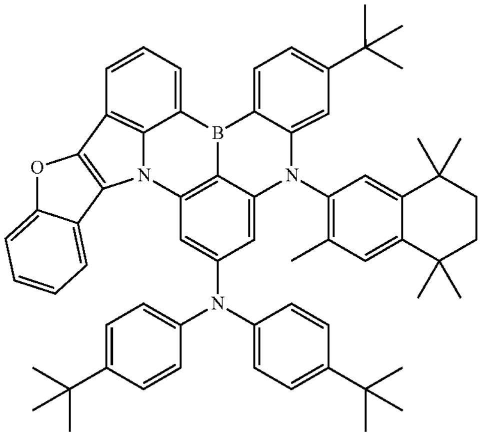
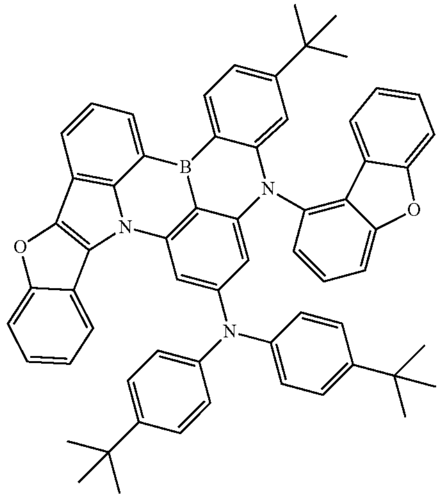
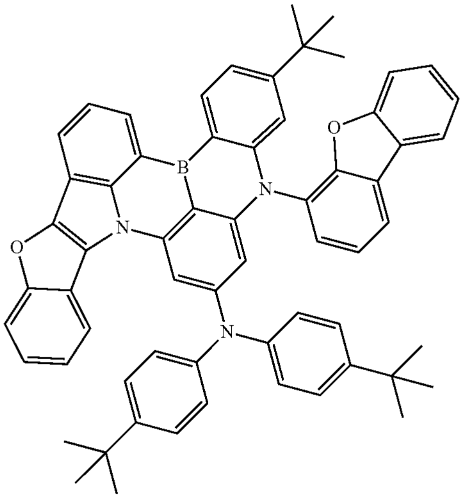

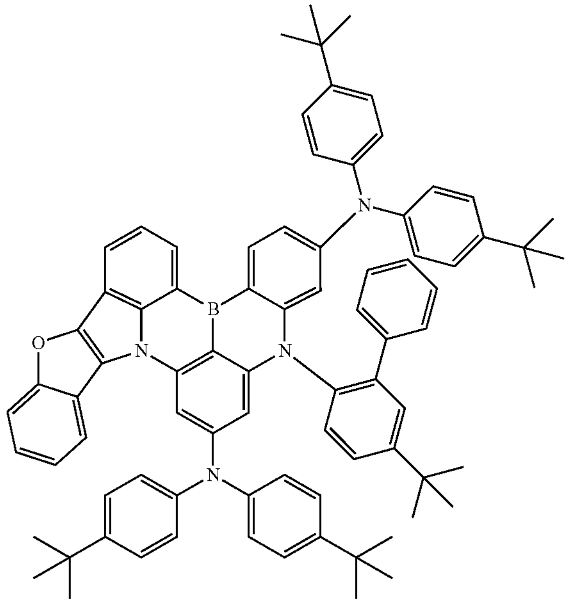
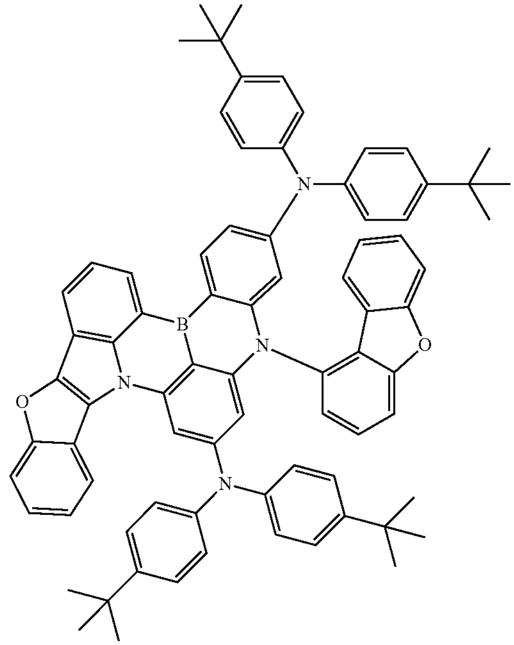
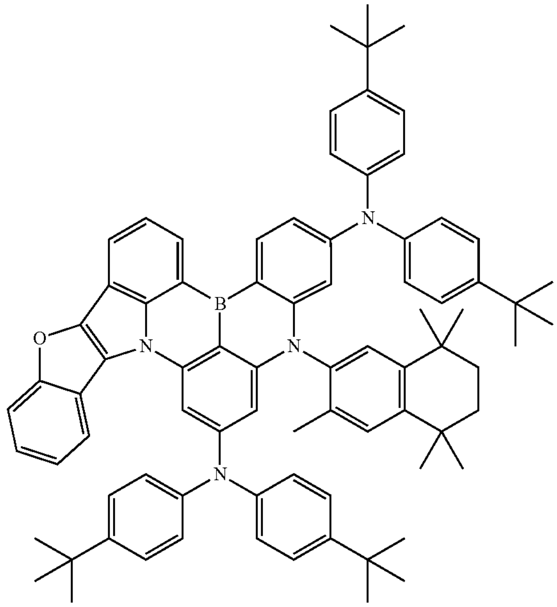
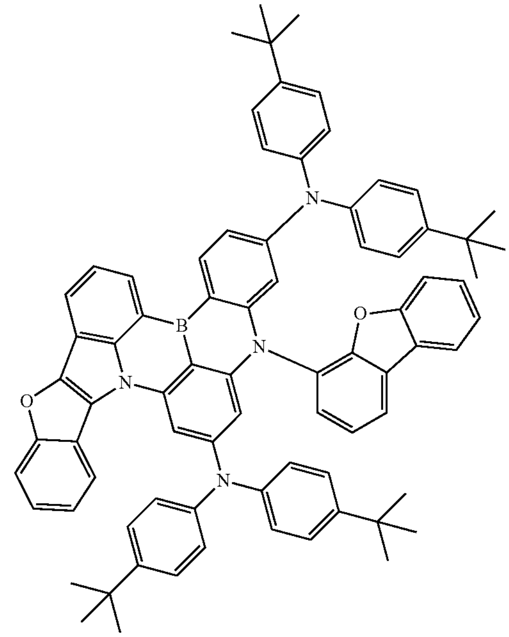

-continued
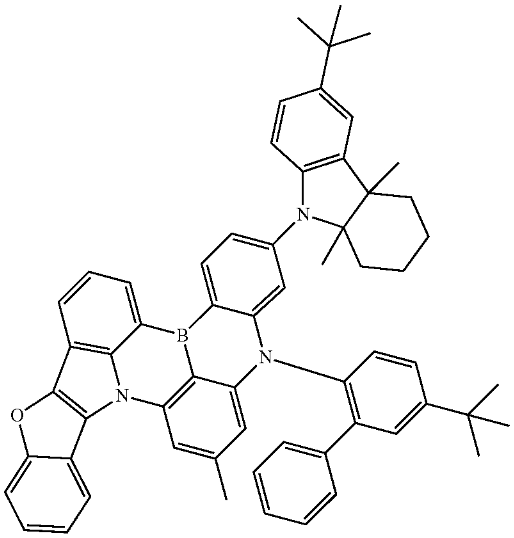
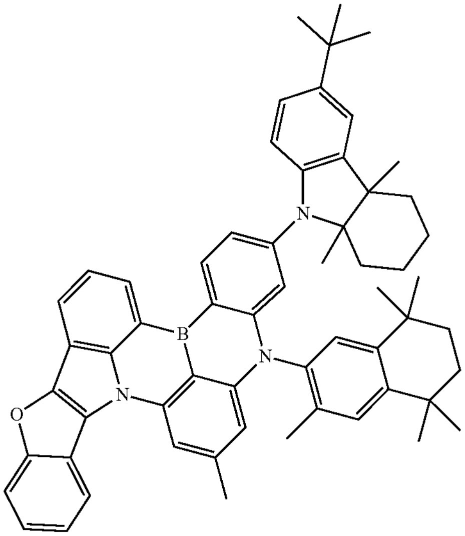
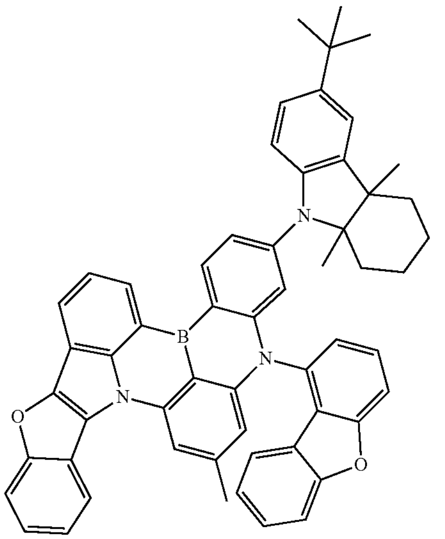
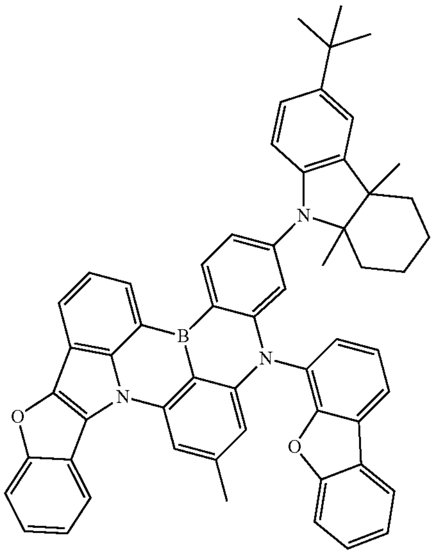
-continued
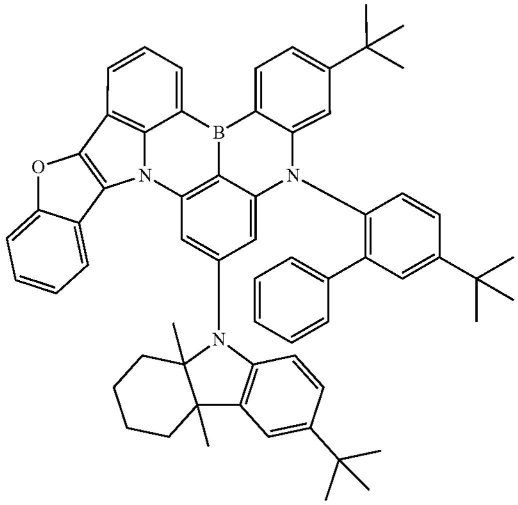
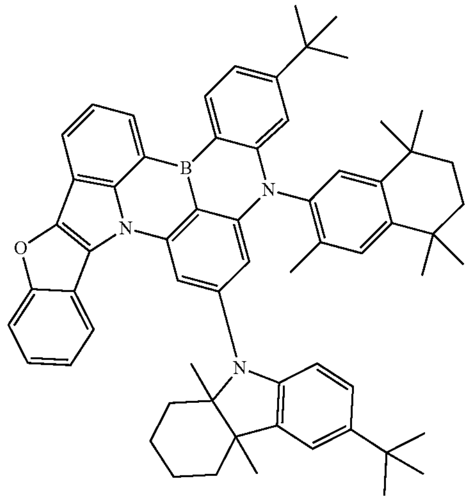

-continued
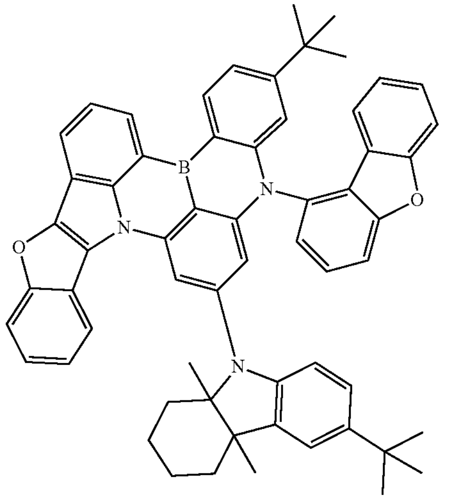
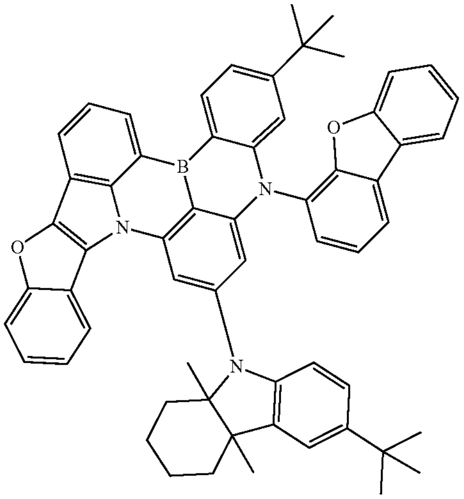
-continued
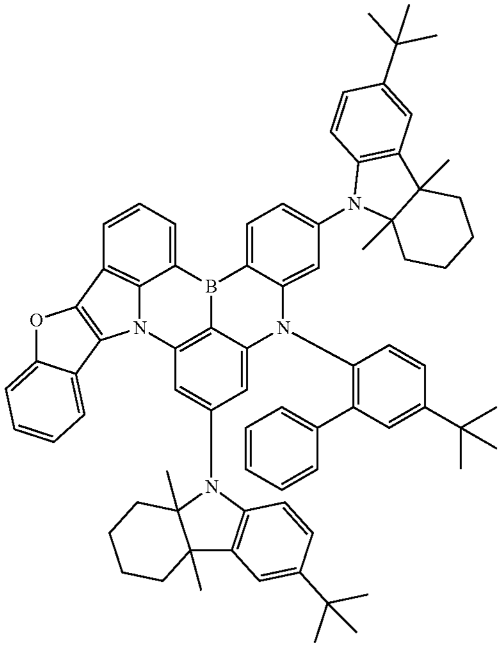
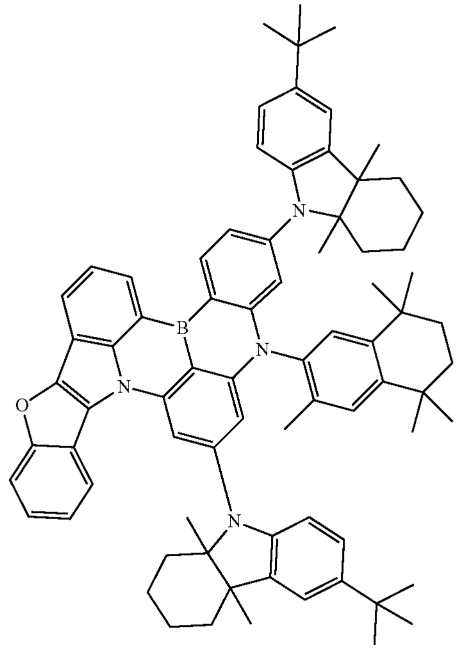
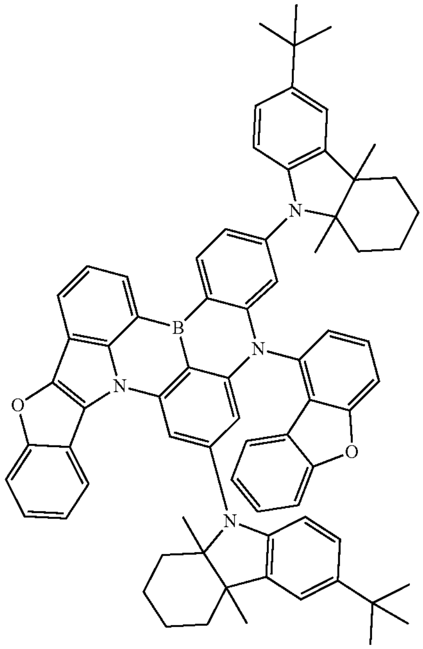

-continued
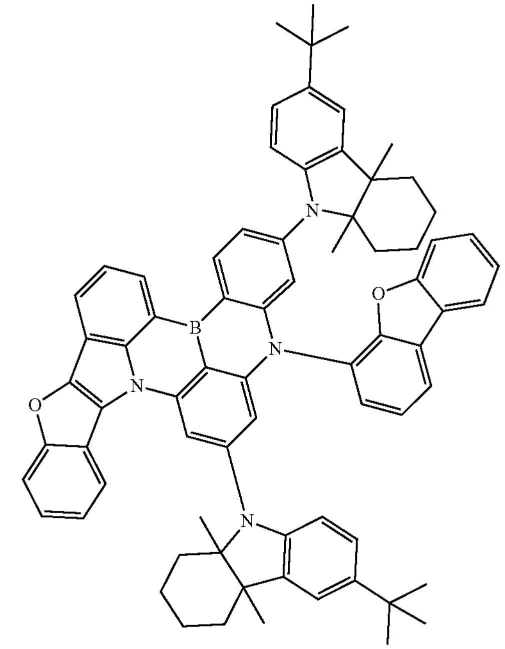
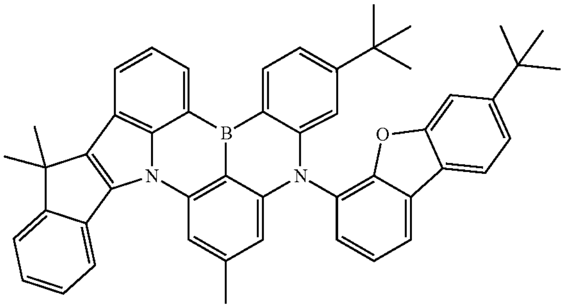
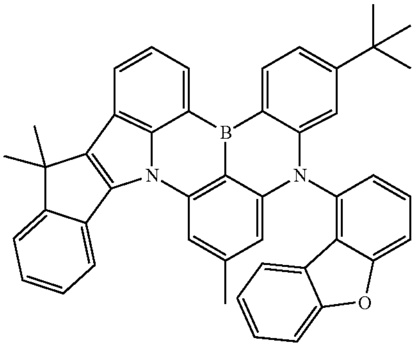
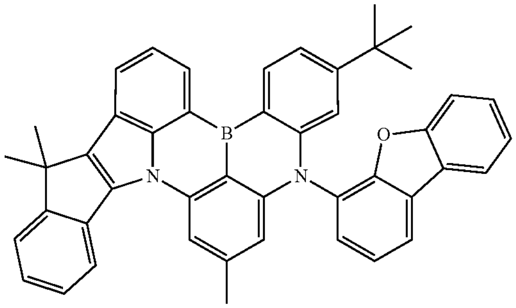
-continued
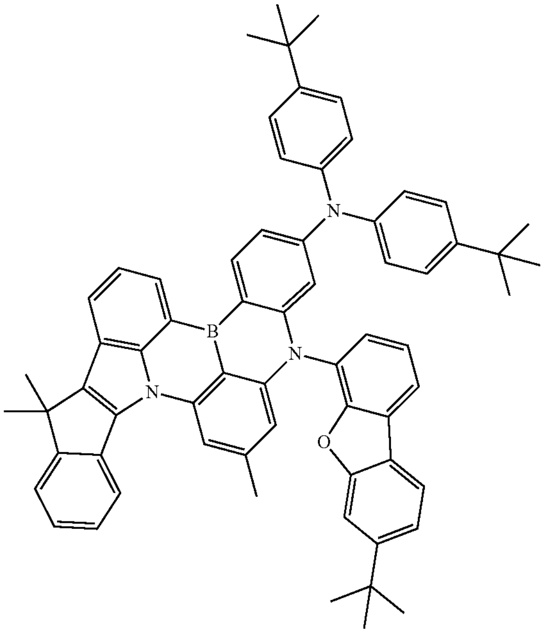
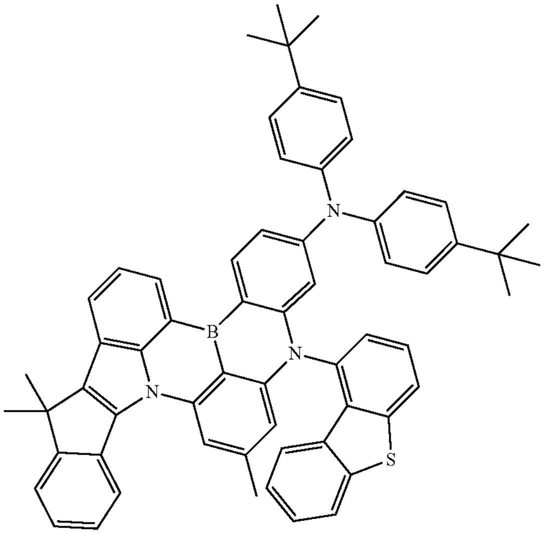
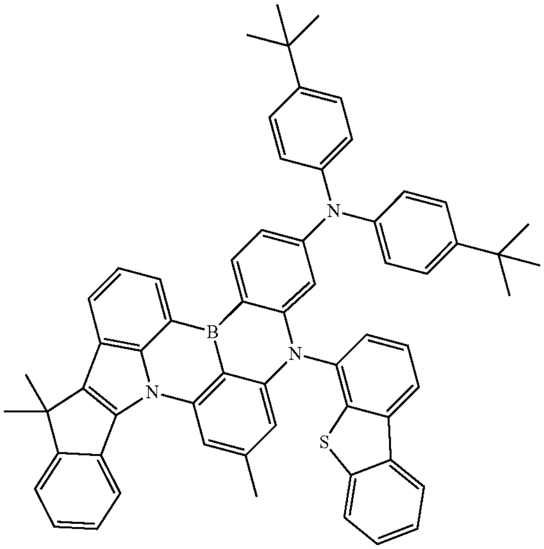

-continued
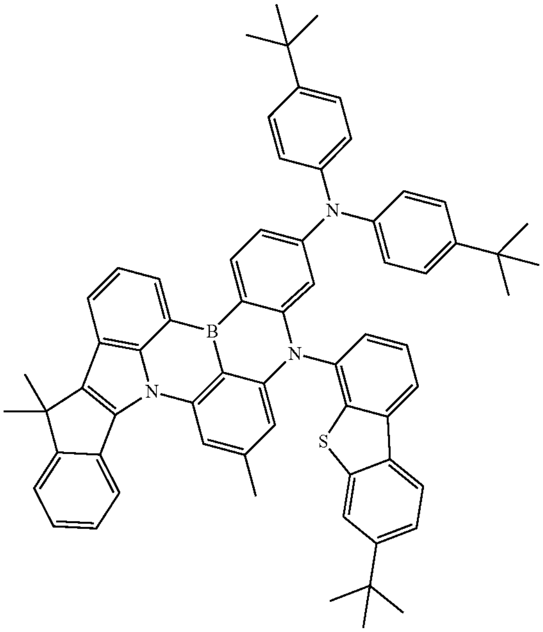
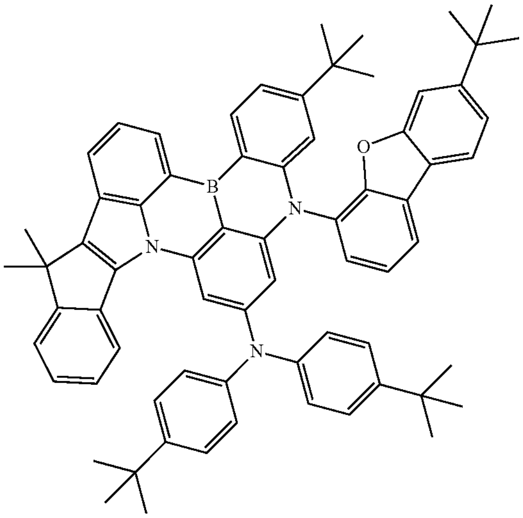
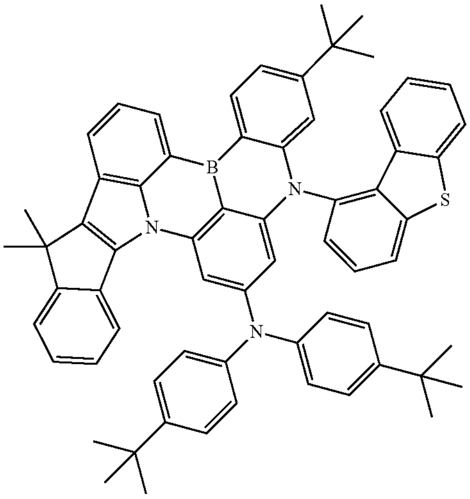
-continued
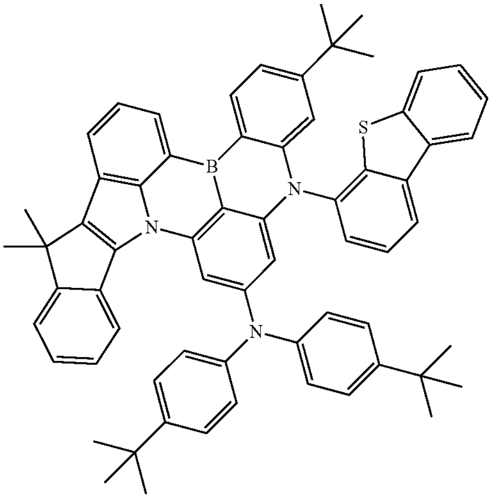
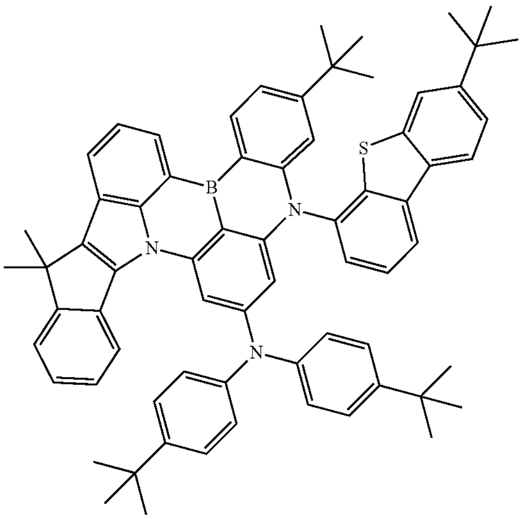
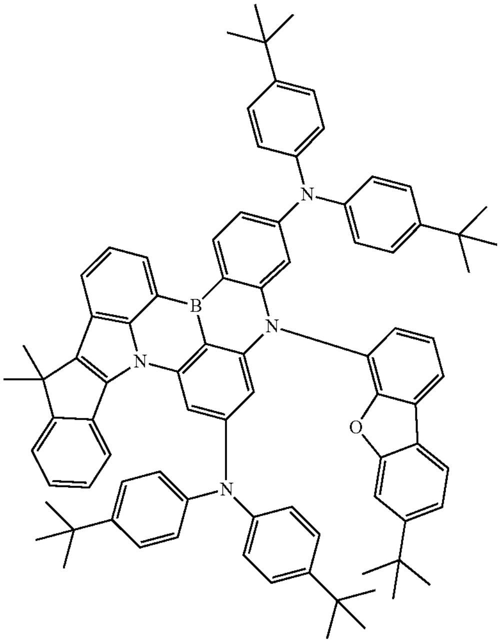

-continued
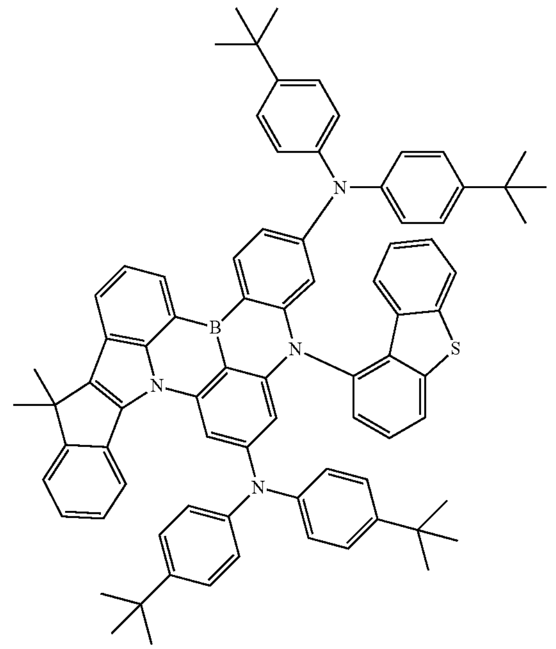
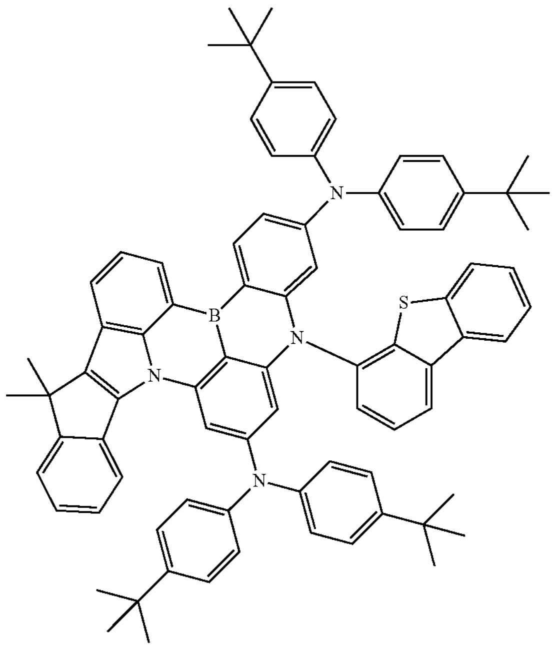
-continued
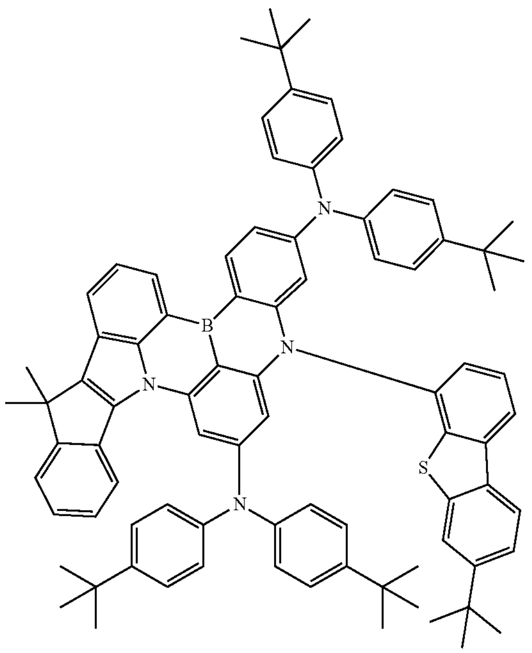
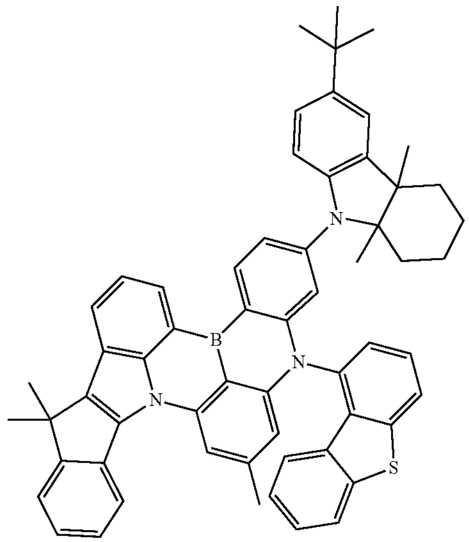

-continued
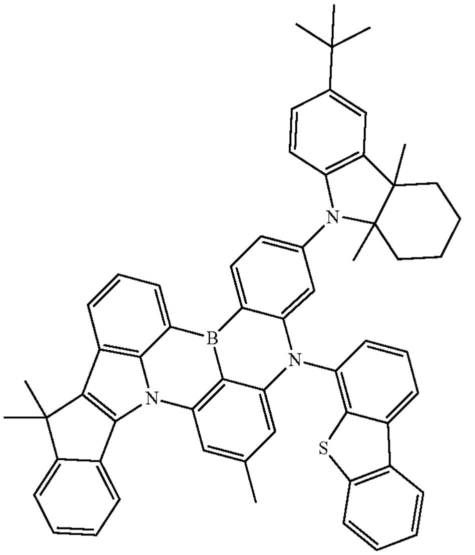
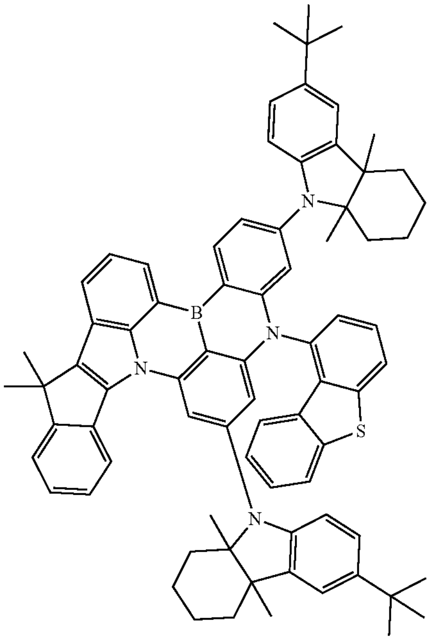
-continued
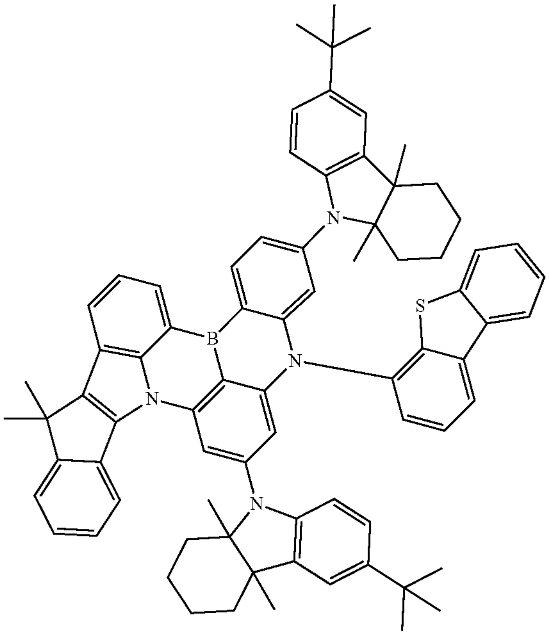
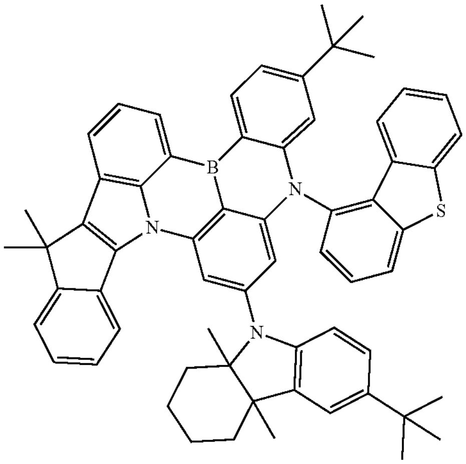
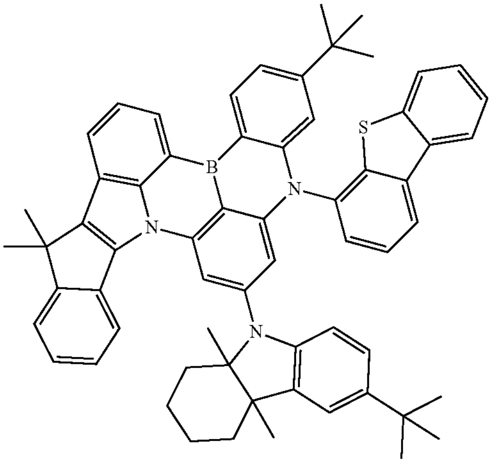

-continued
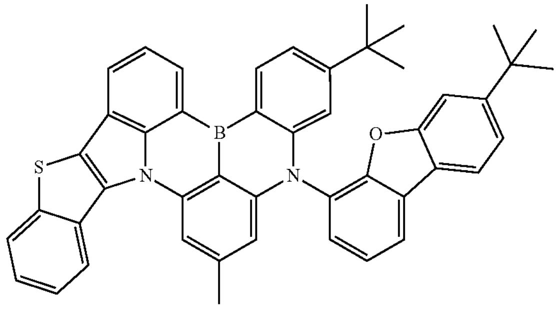
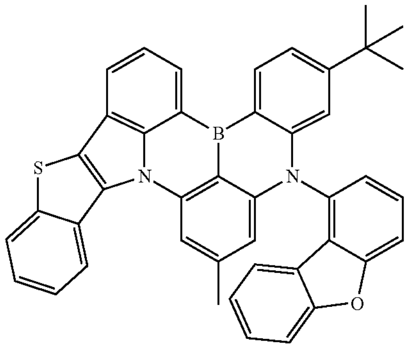
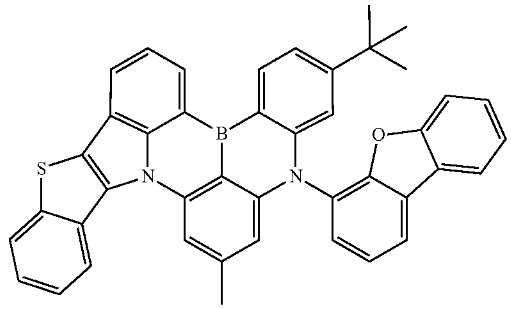
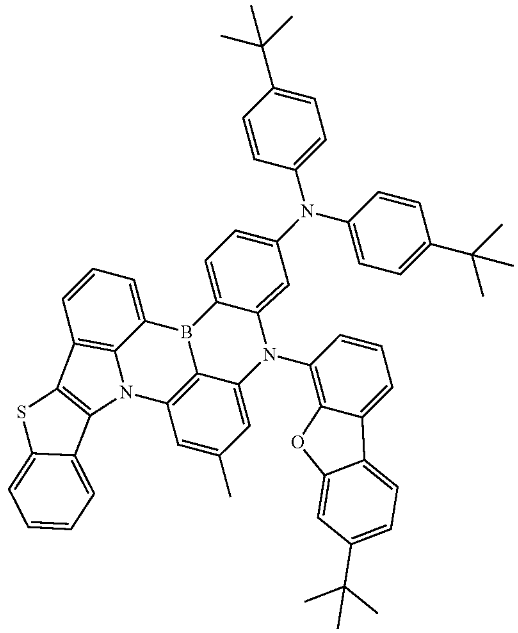
-continued
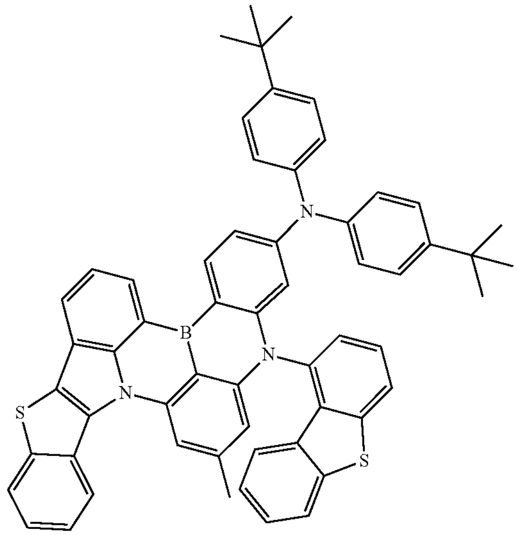
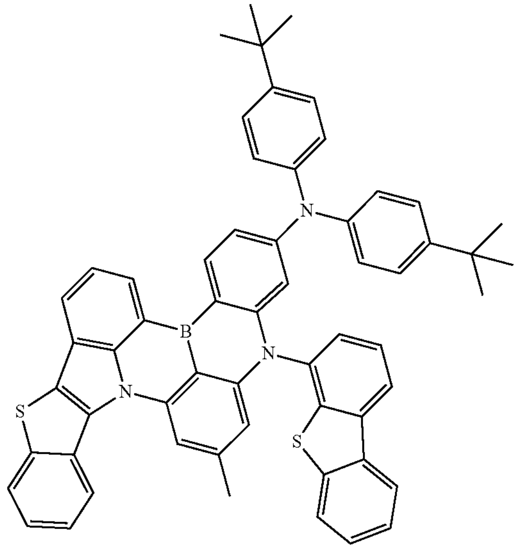
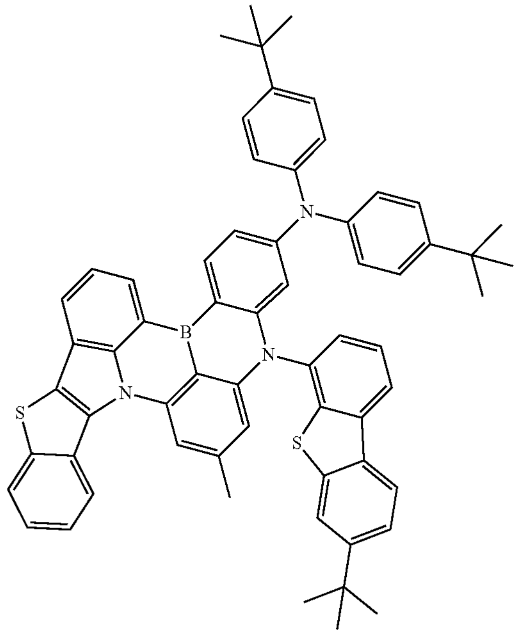

-continued
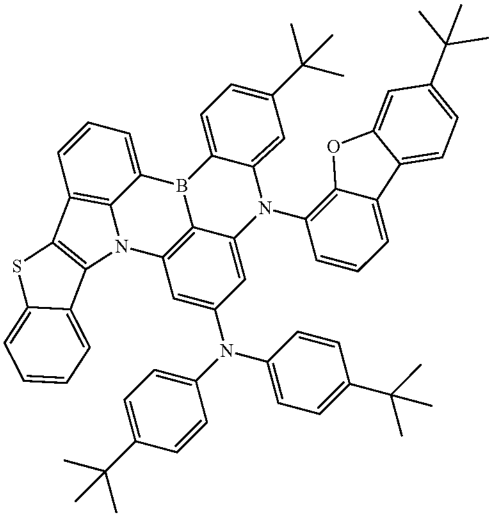
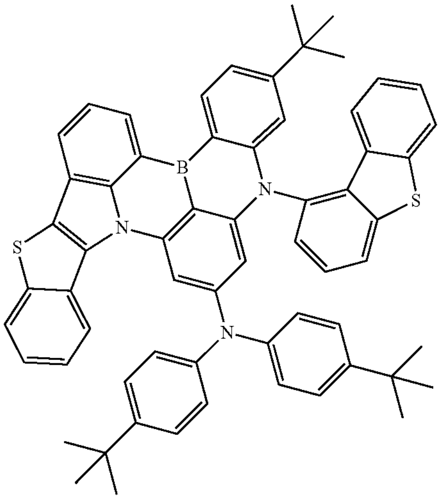
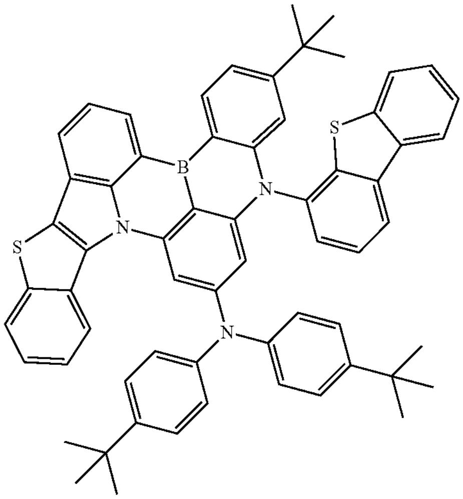
-continued
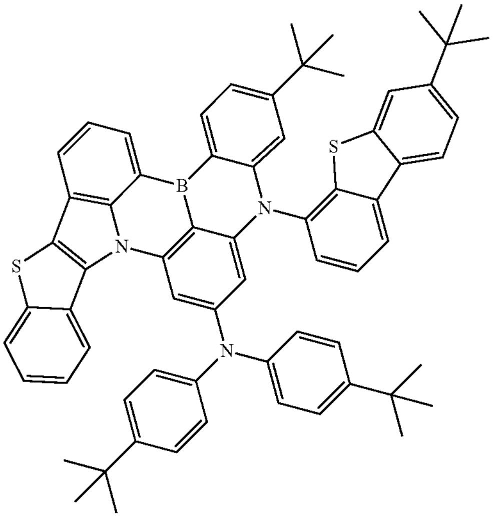
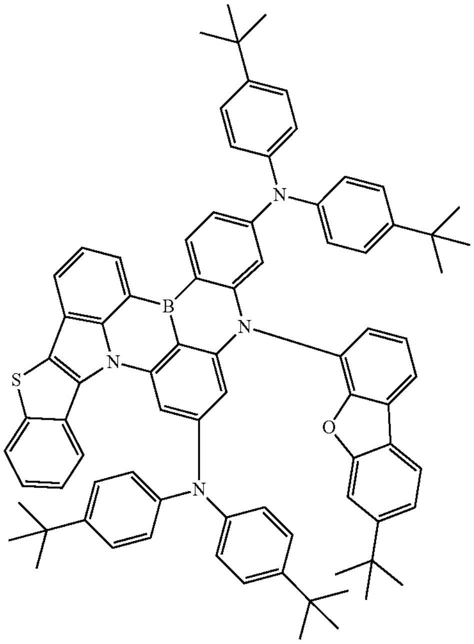

-continued
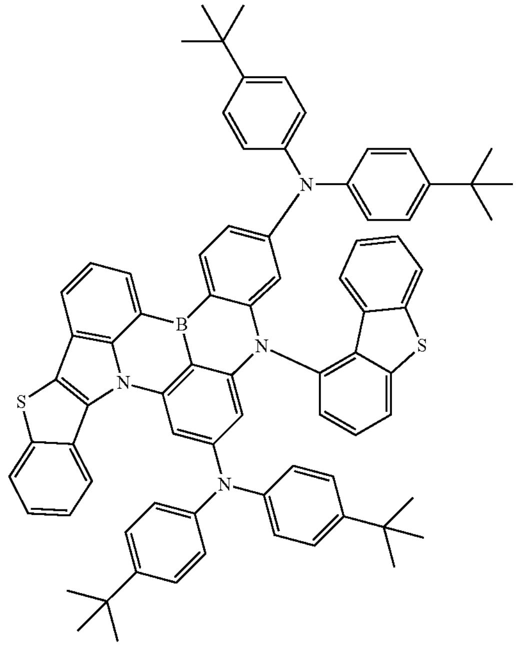
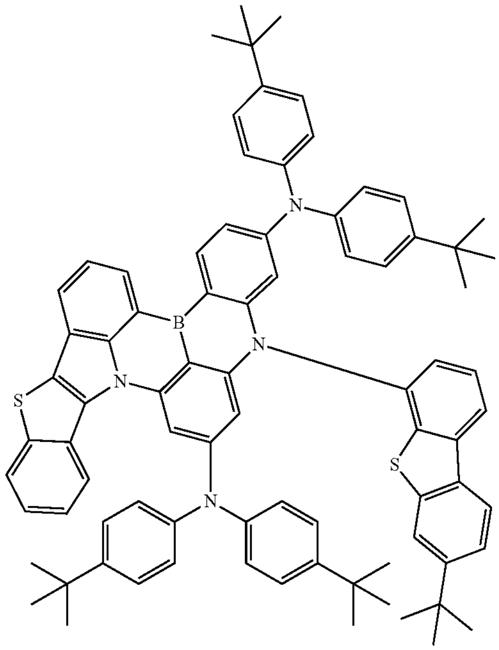
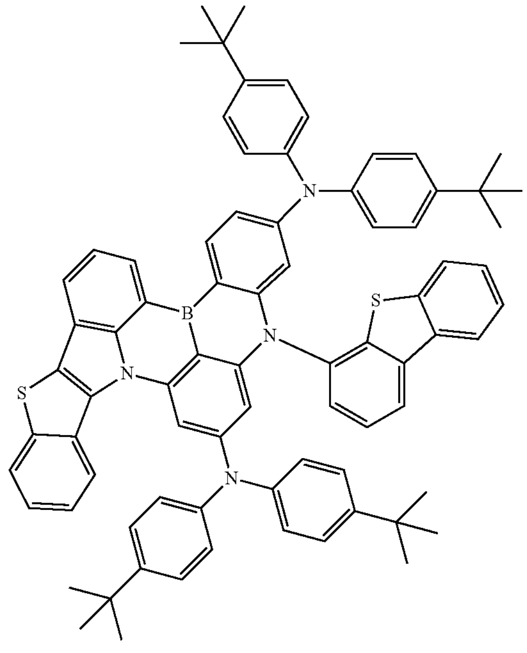
-continued
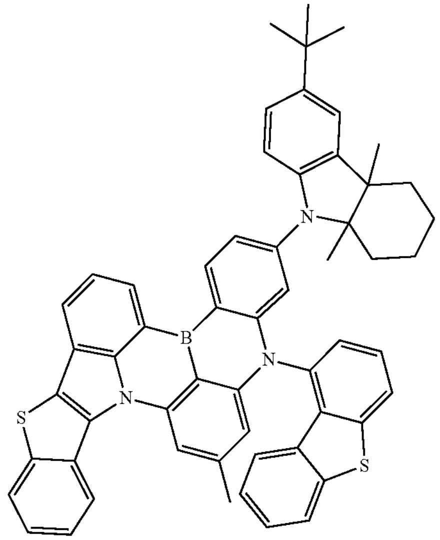

-continued
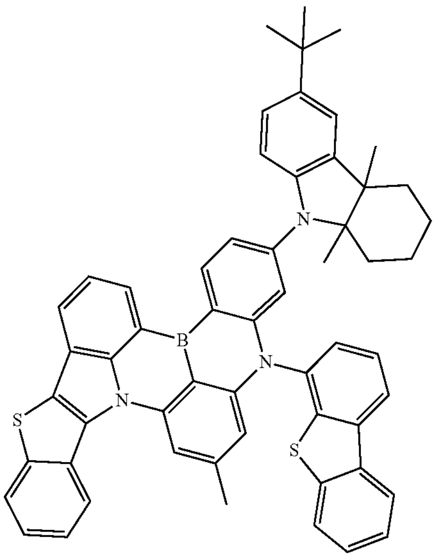
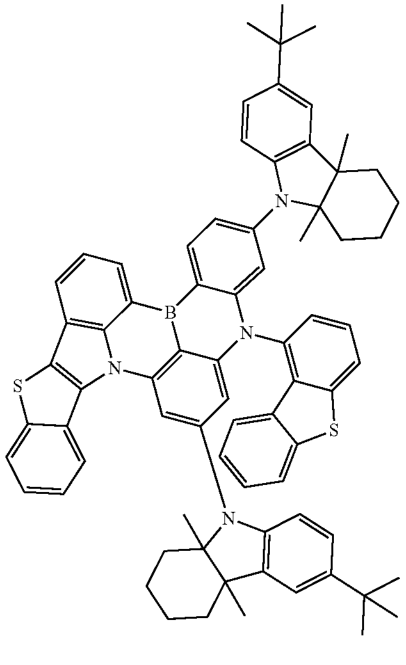
-continued
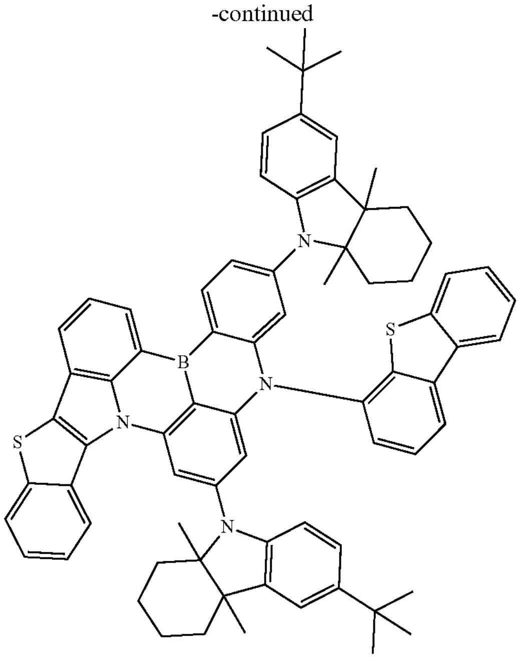
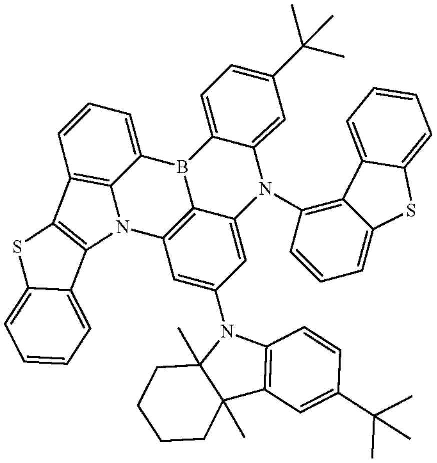
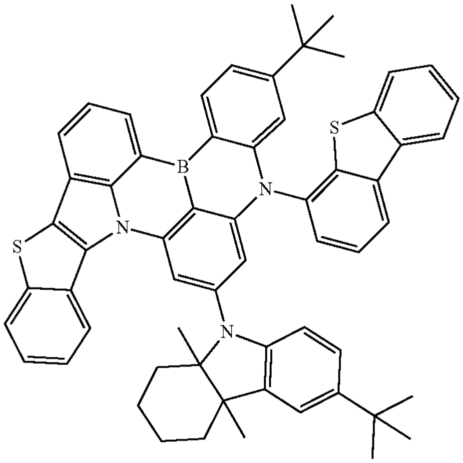

-continued
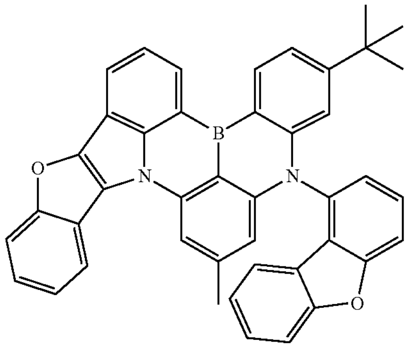
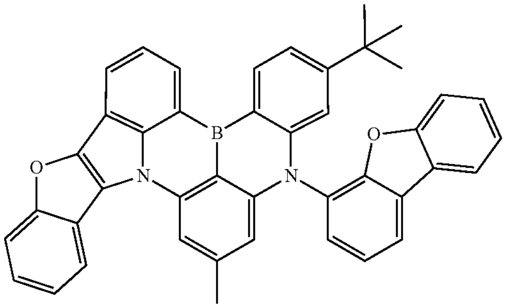
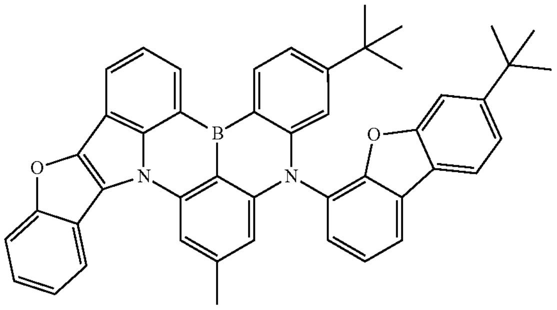
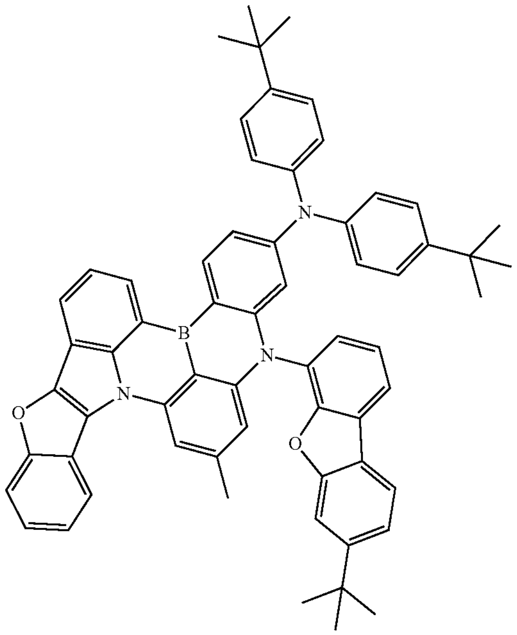
-continued
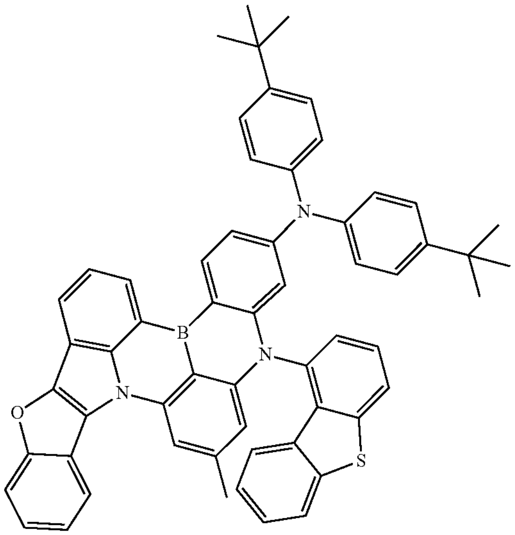
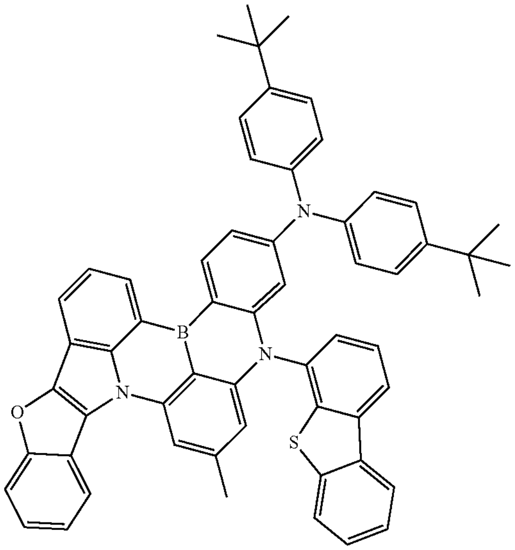
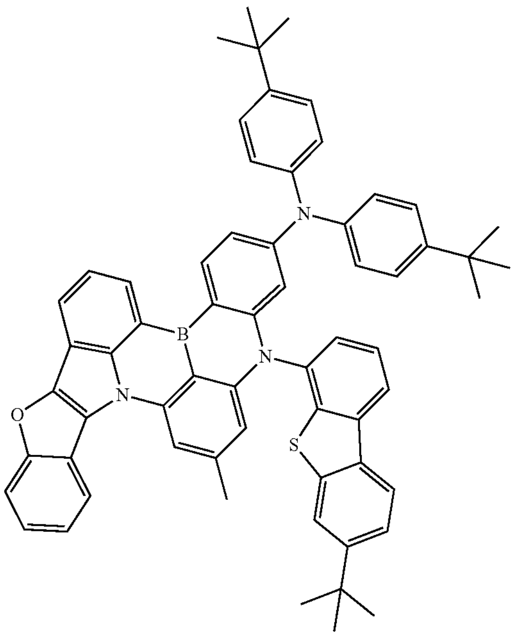

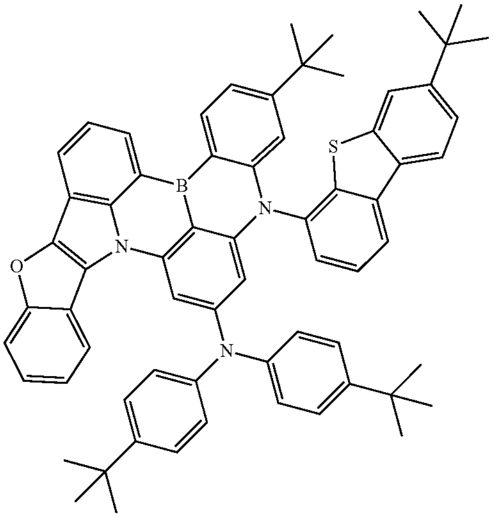
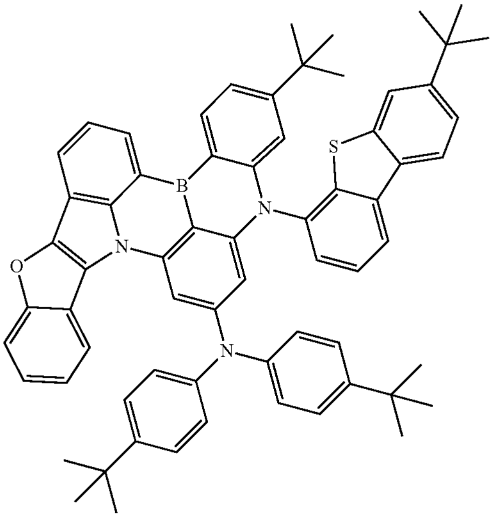
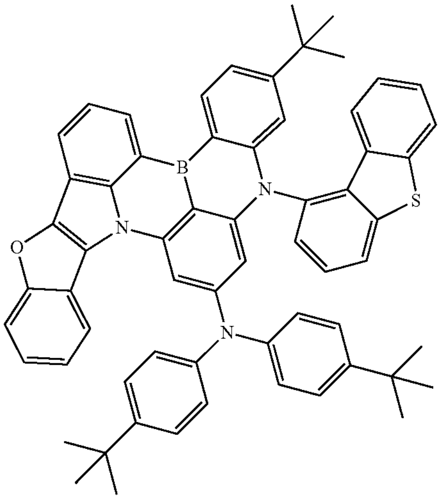
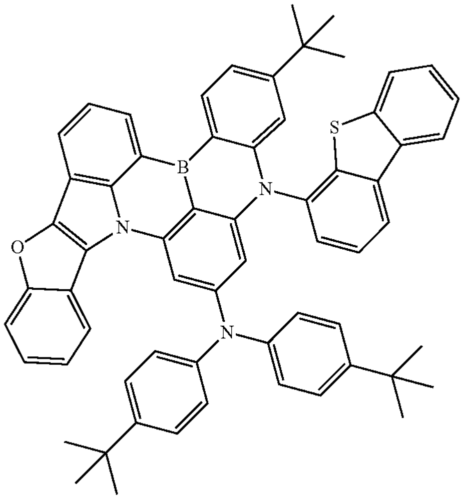
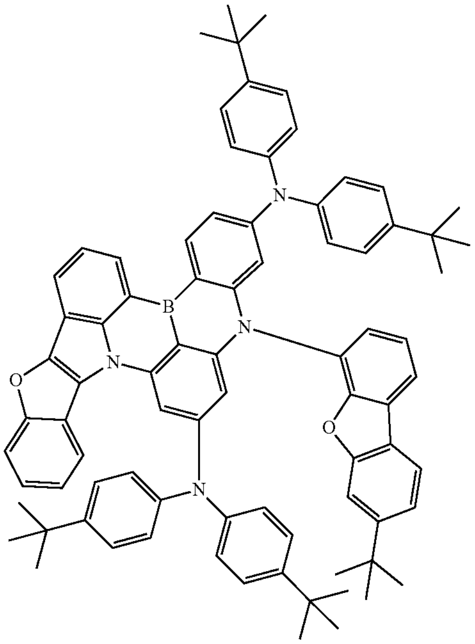

-continued
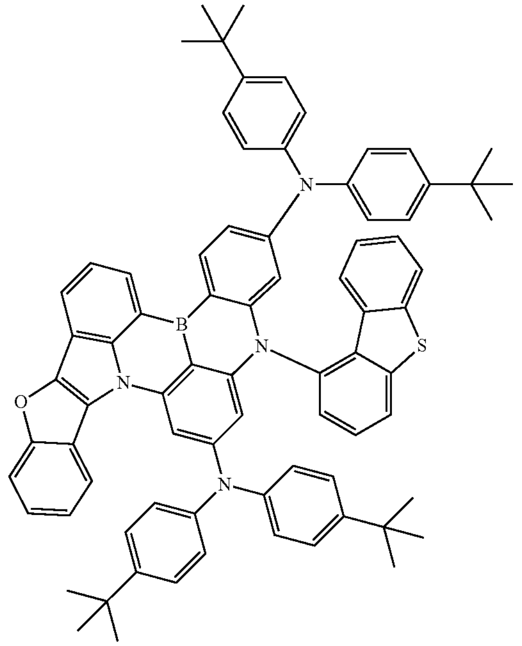
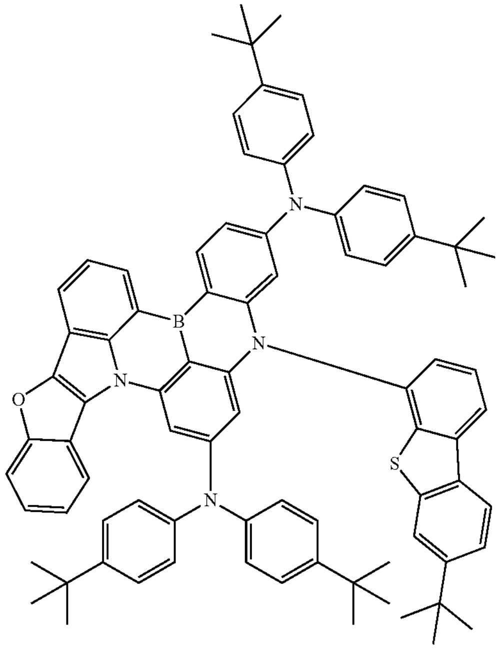
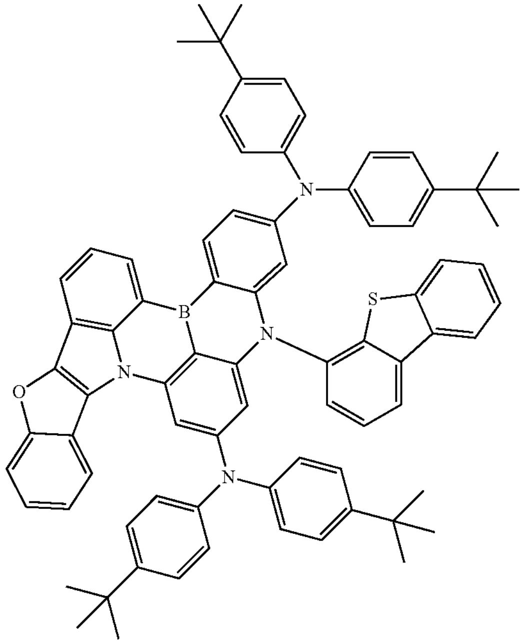
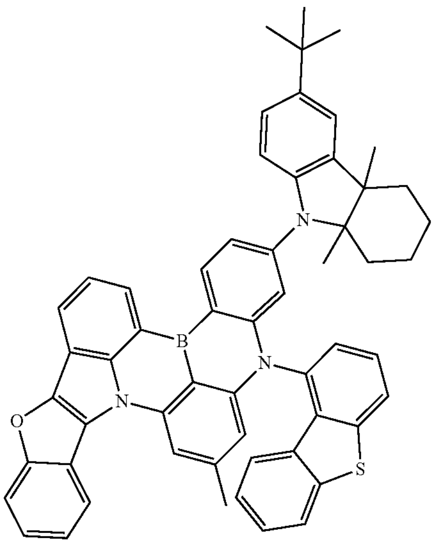

-continued
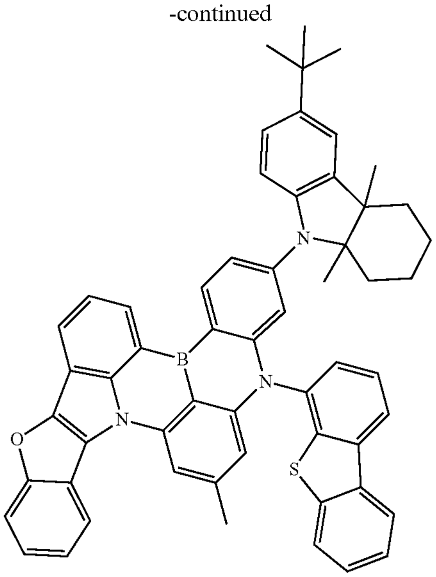
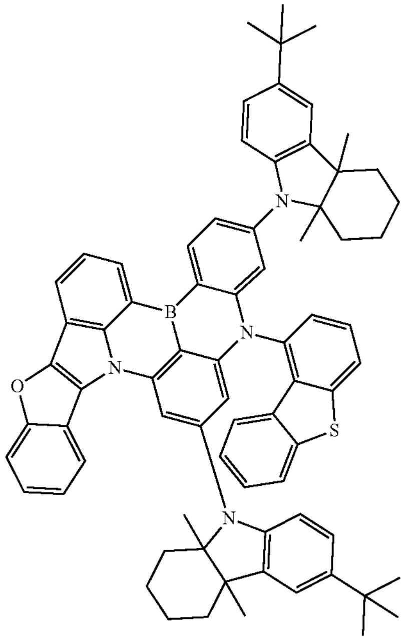
-continued
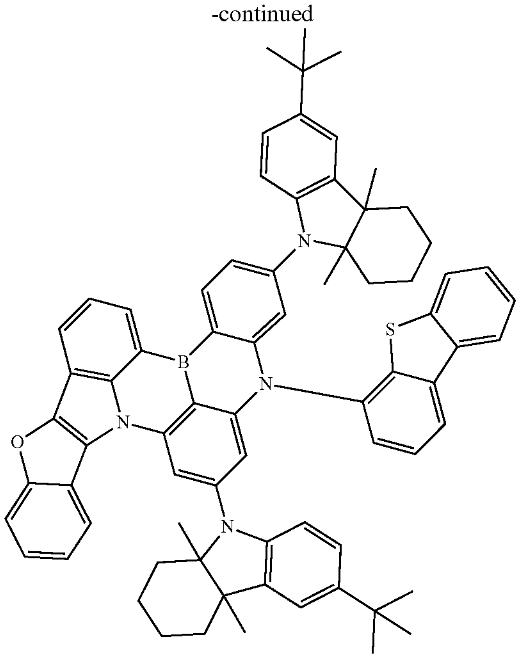
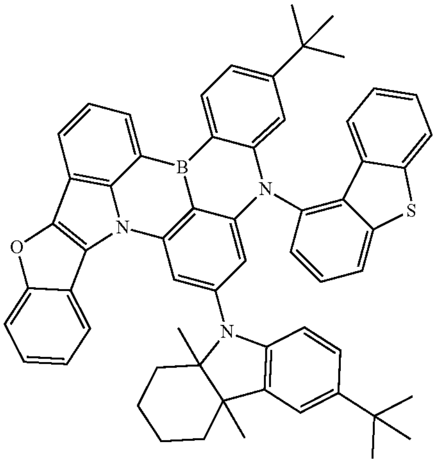
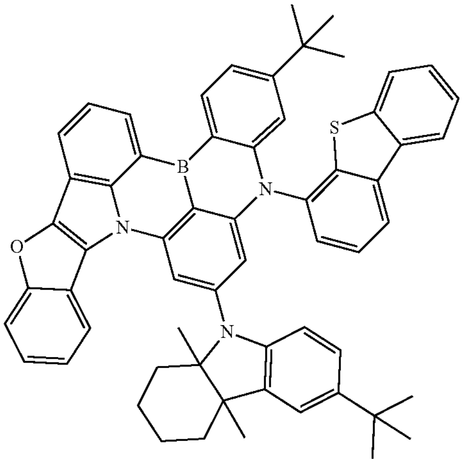

-continued
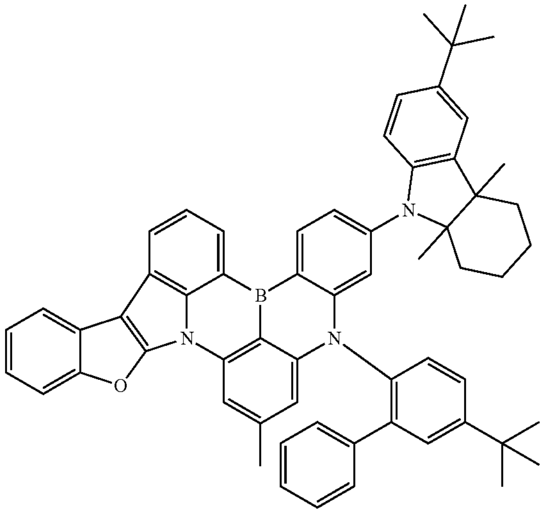
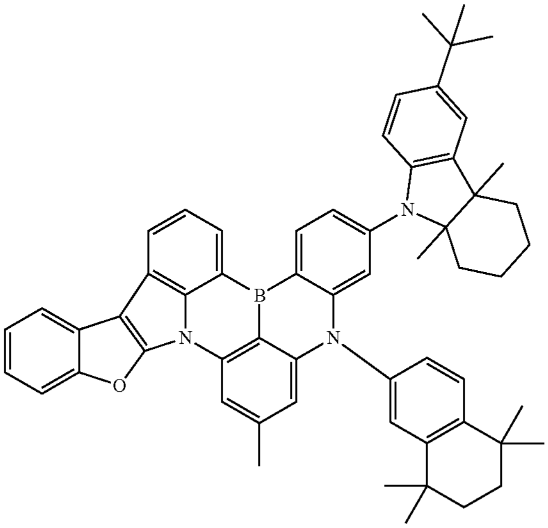
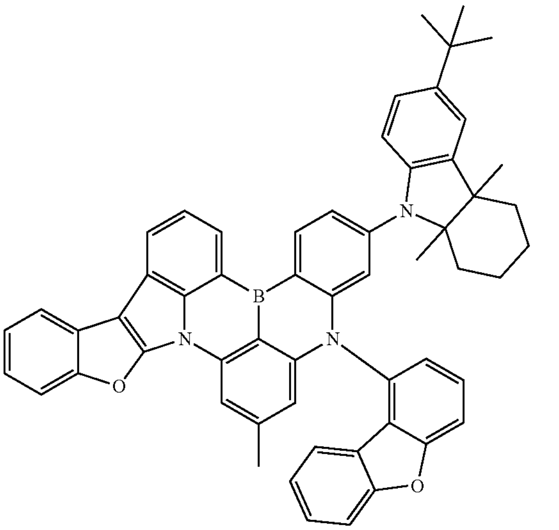
-continued
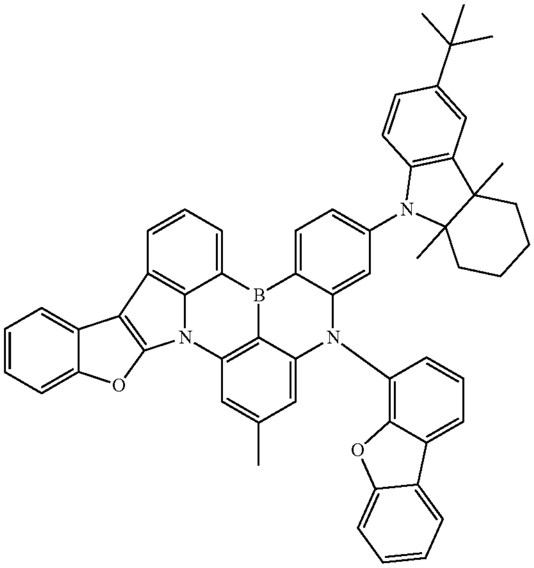
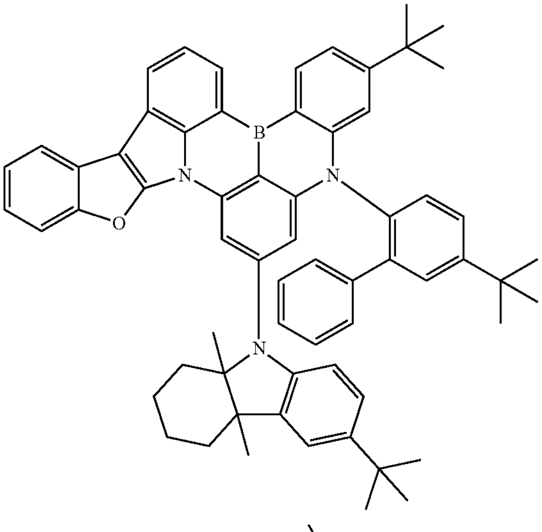
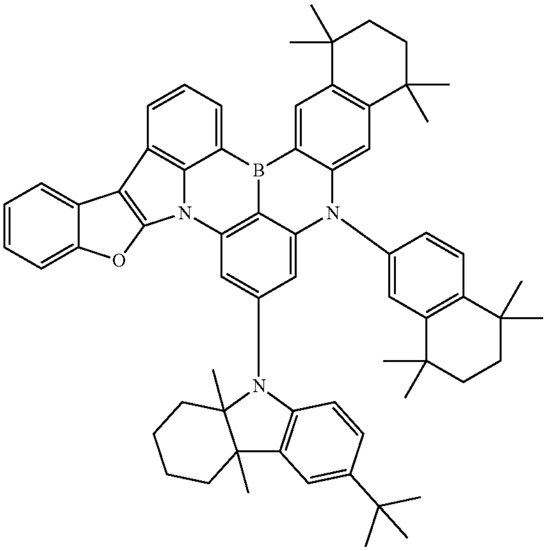

-continued
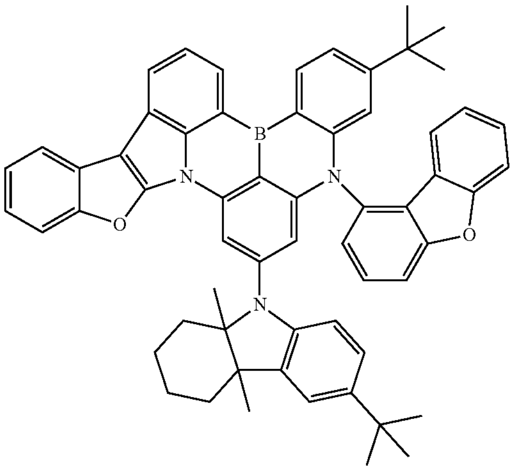
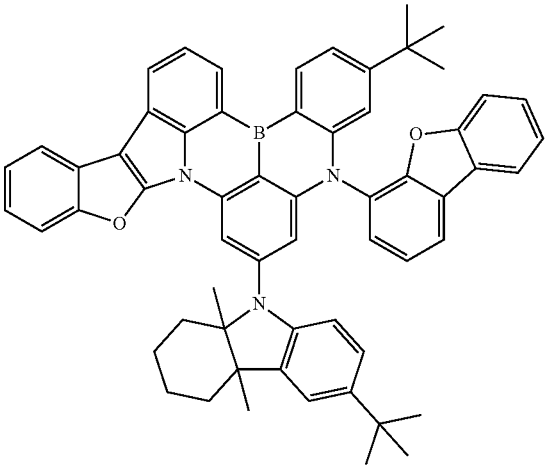
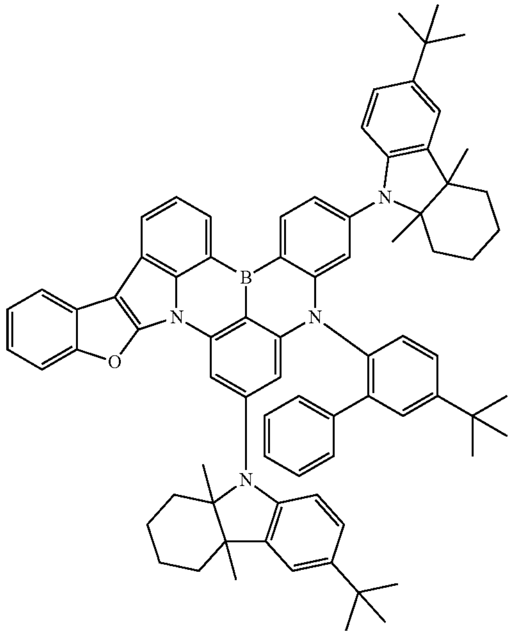
-continued
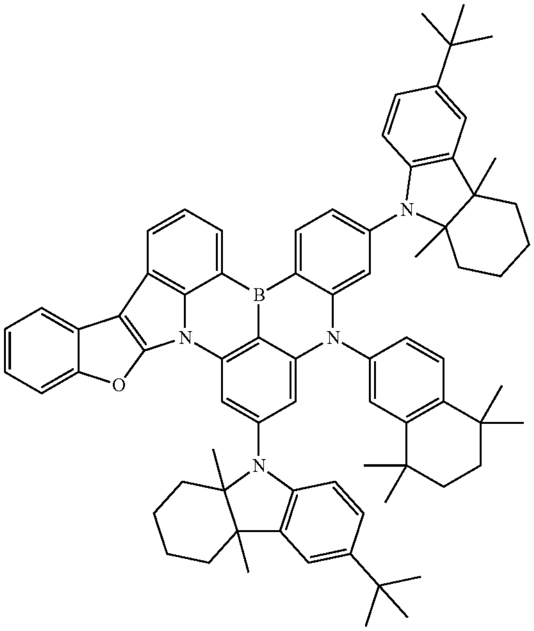
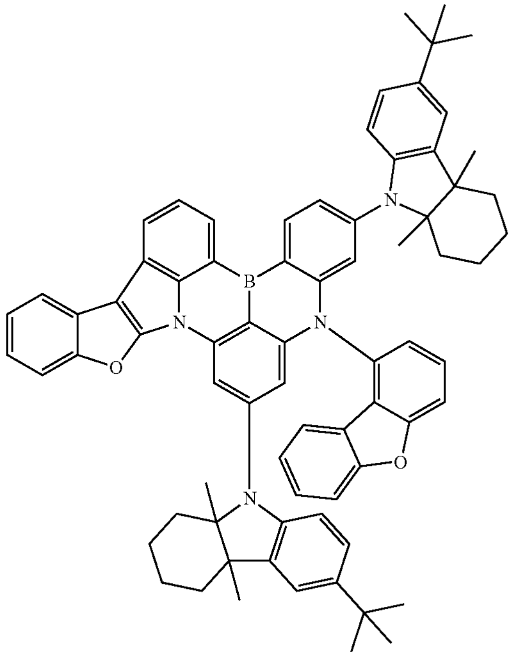

-continued
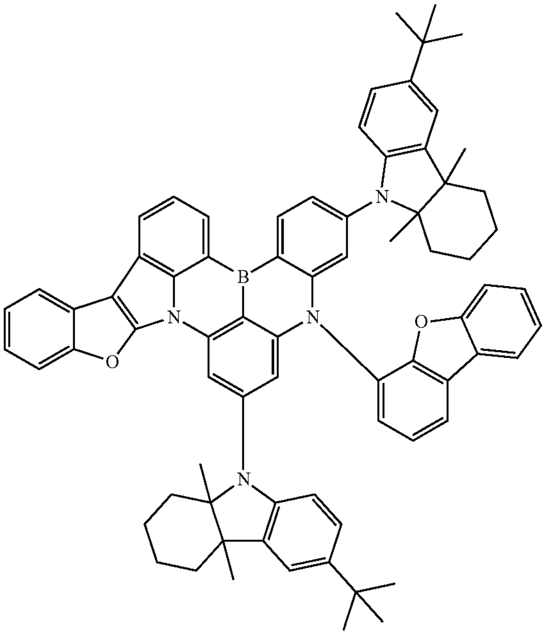
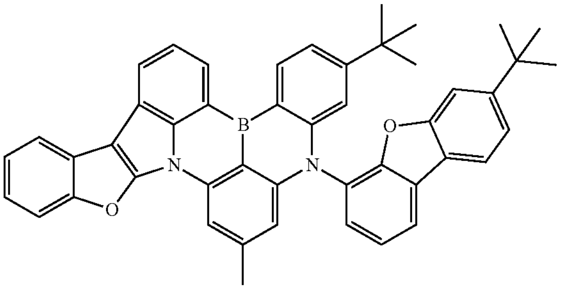
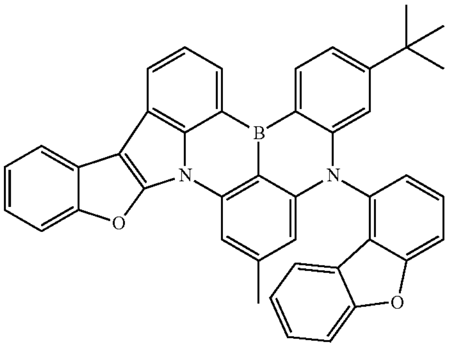
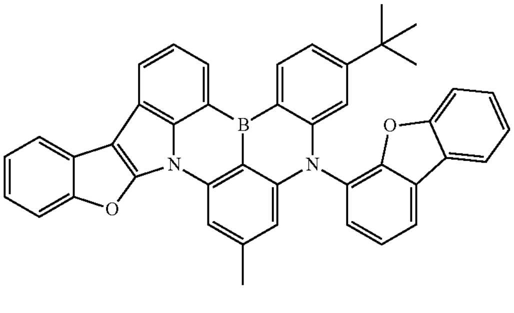
-continued
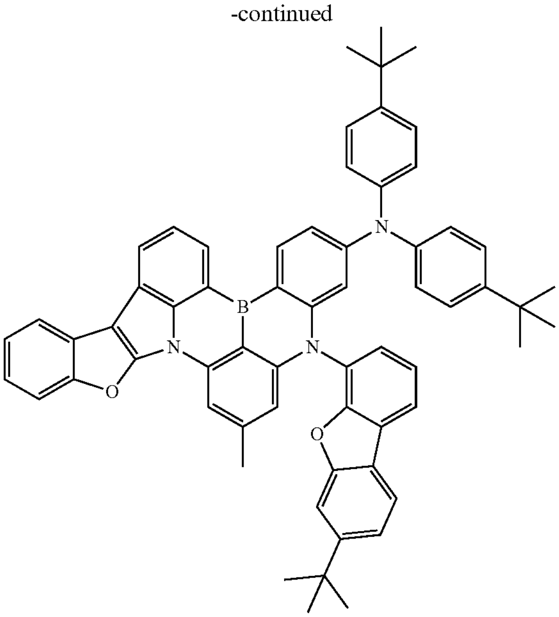
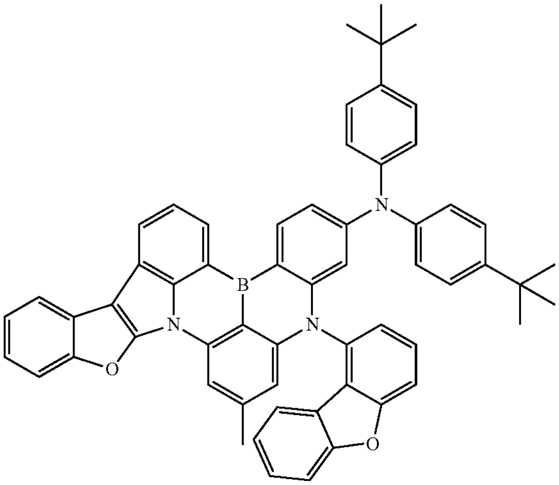
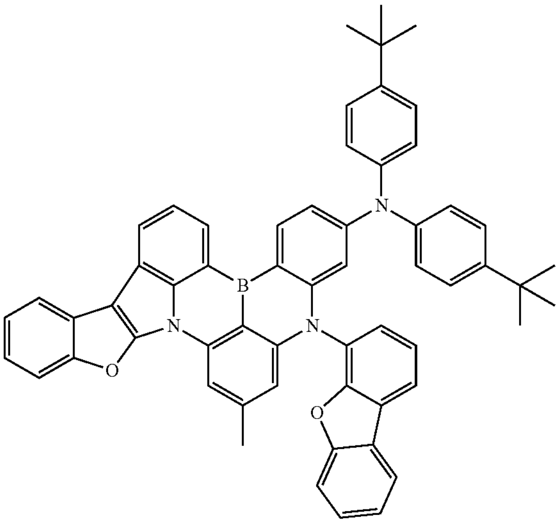

-continued
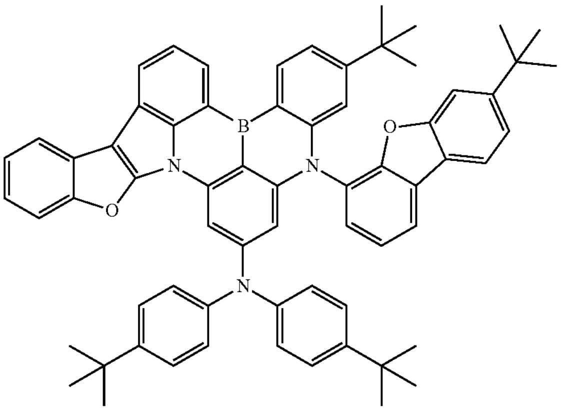
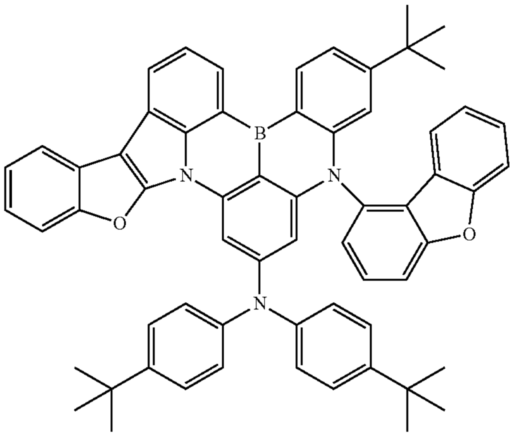
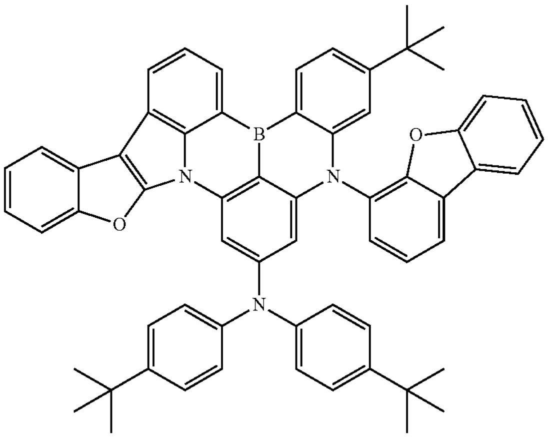
-continued
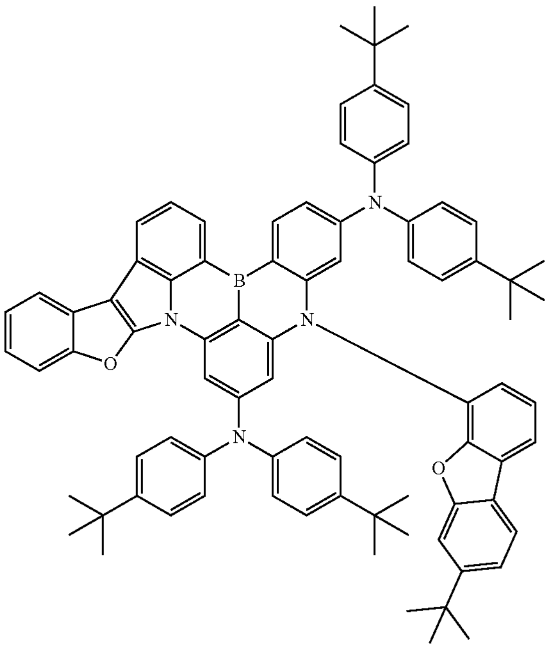
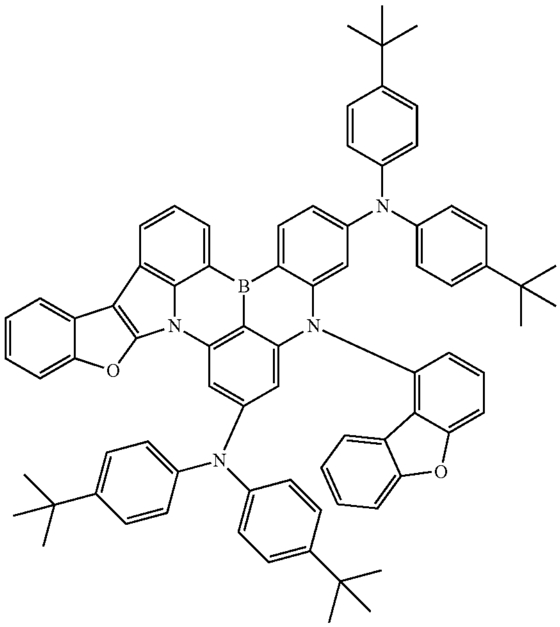

-continued
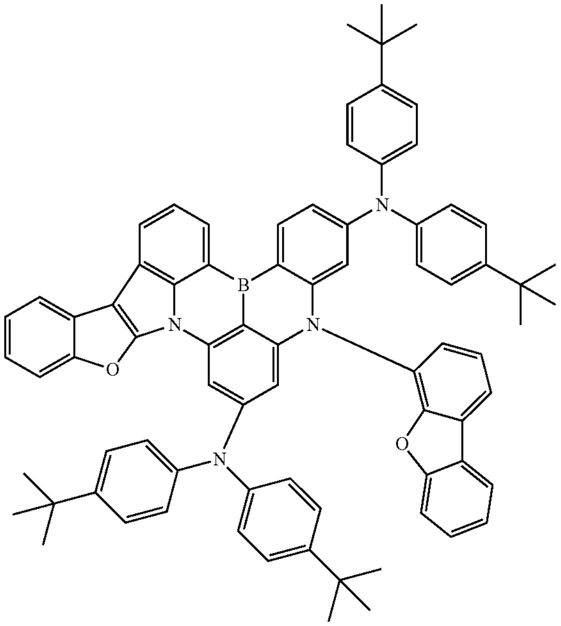 [SMILES: CC(C)(C)c1ccc(N(c2ccc(C(C)(C)C)cc2)c2ccc3c(c2)N(c2cccc4c2oc2ccccc24)c2cc(N(c4ccc(C(C)(C)C)cc4)c4ccc(C(C)(C)C)cc4)cc4c2B3c2cccc3c5c6ccccc6oc5n-4c23)cc1]
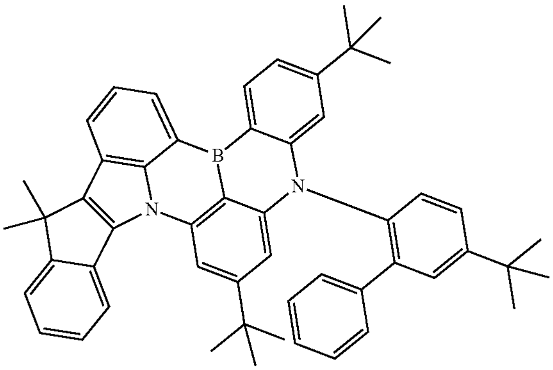
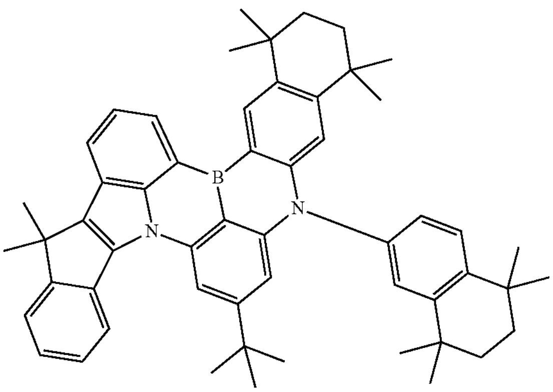
-continued
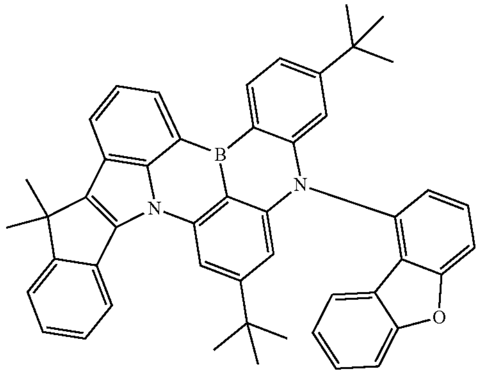
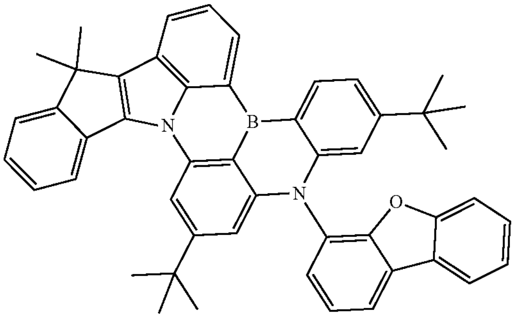
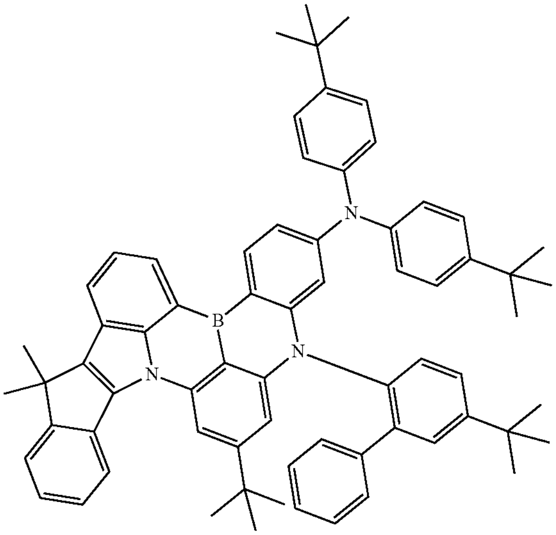

-continued
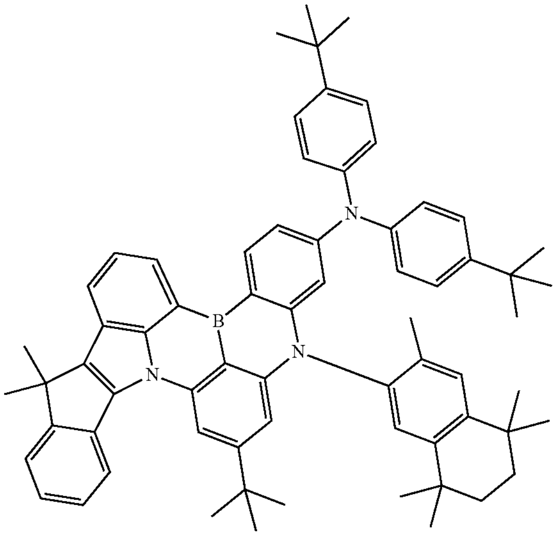
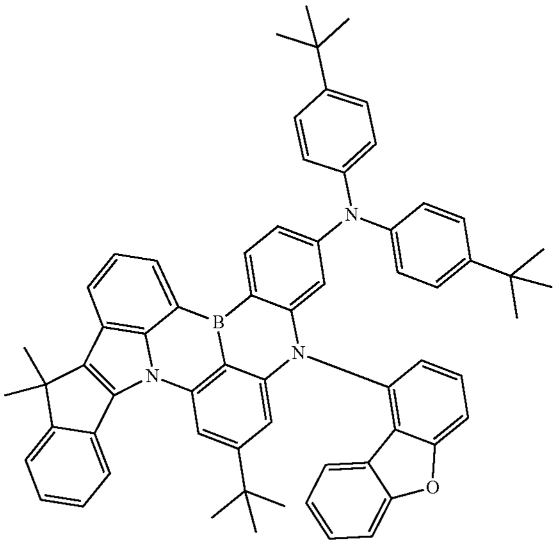
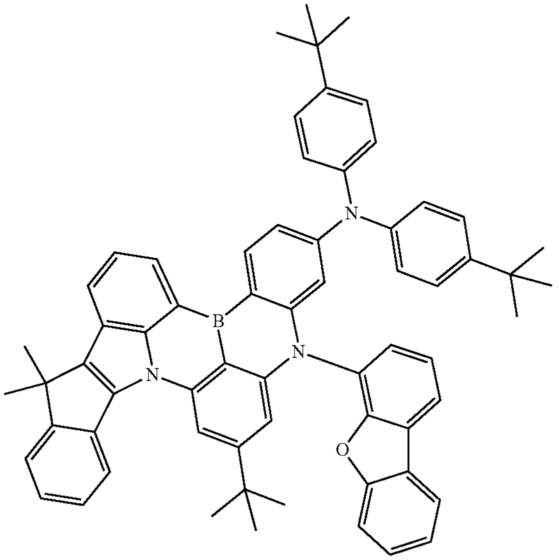 [SMILES: CC(C)(C)c1ccc(N(c2ccc(C(C)(C)C)cc2)c2ccc3c(c2)N(c2cccc4c2oc2ccccc24)c2cc(C(C)(C)C)cc4c2B3c2cccc3c5c(n-4c23)-c2ccccc2C5(C)C)cc1]
-continued
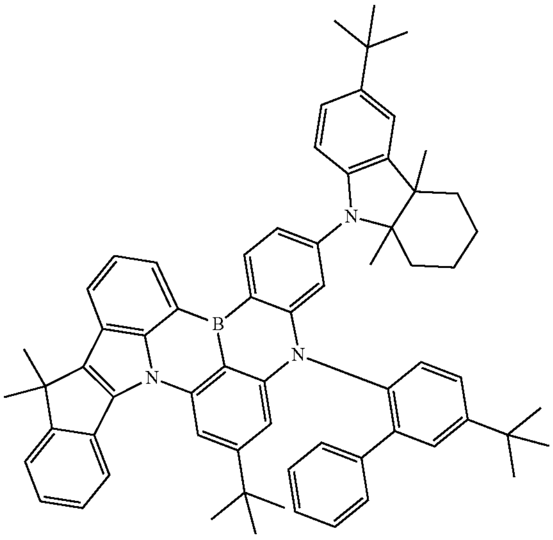
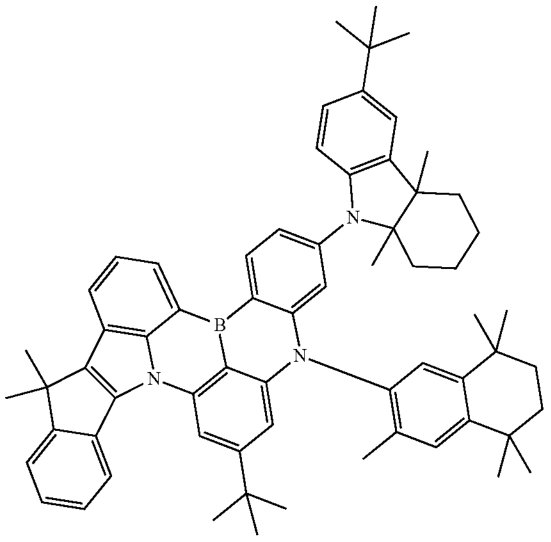
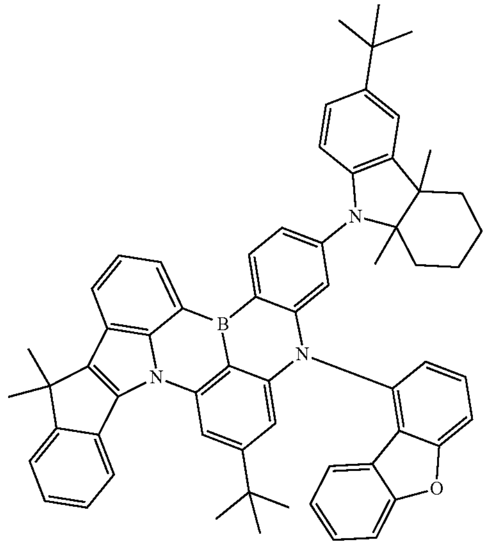

-continued
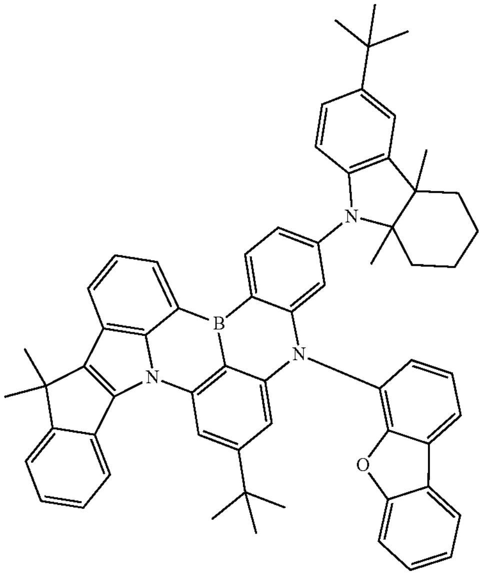 [SMILES: CC(C)(C)c1cc2c3c(c1)-n1c4c(c5cccc(c51)B3c1ccc(N3c5ccc(C(C)(C)C)cc5C5(C)CCCCC35C)cc1N2c1cccc2c1oc1ccccc12)C(C)(C)c1ccccc1-4]
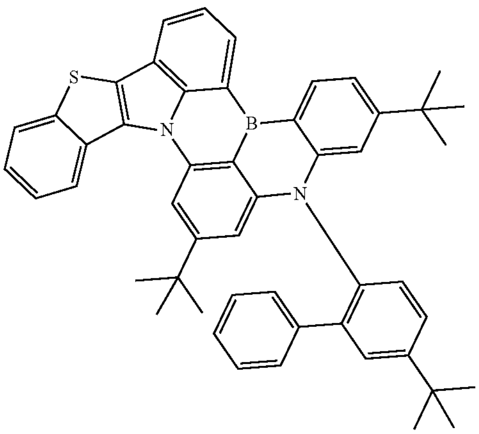
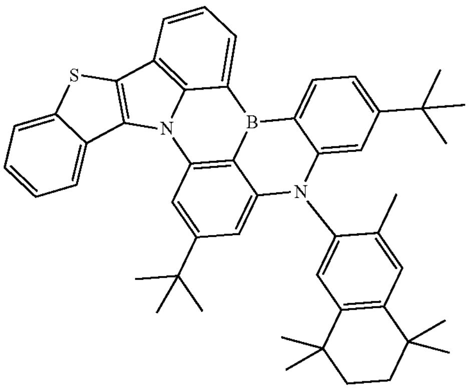
-continued
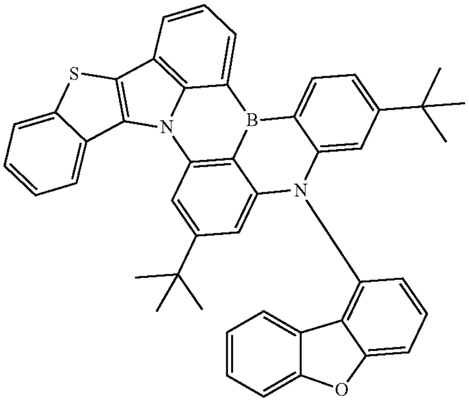
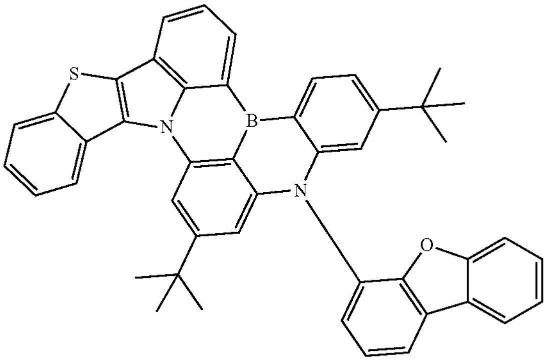
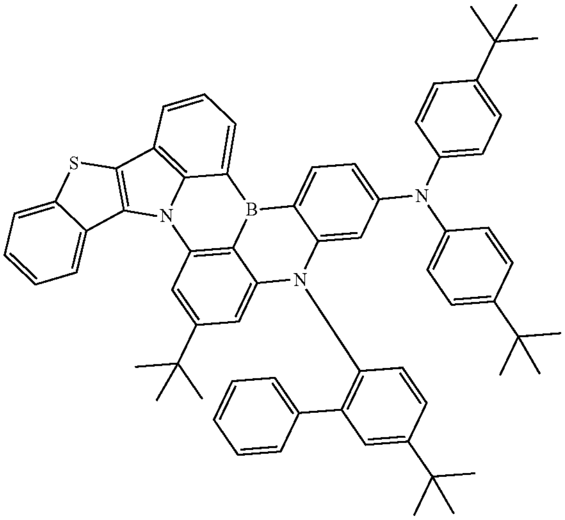

-continued
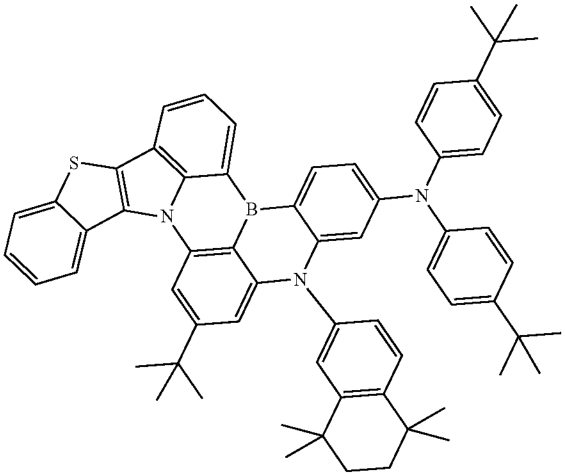
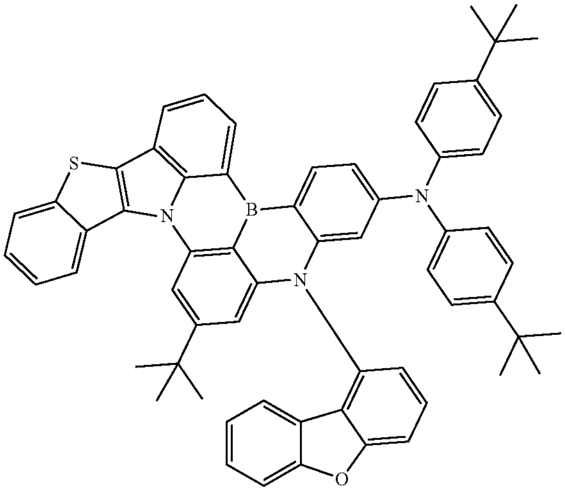
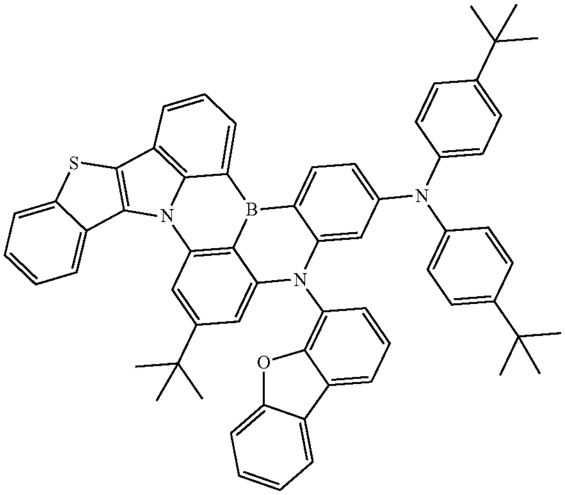
-continued
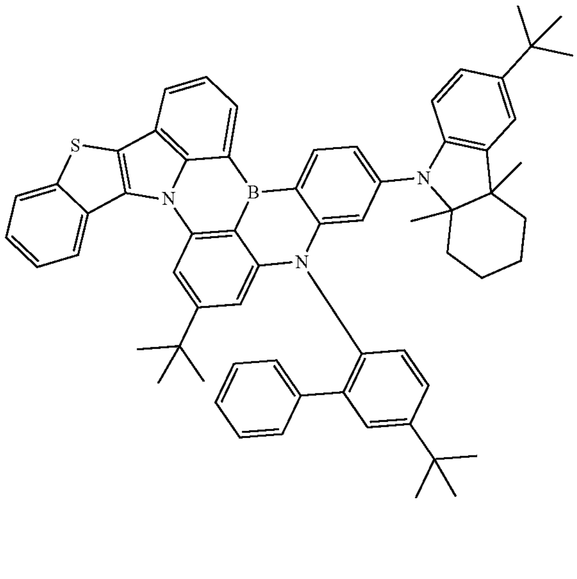
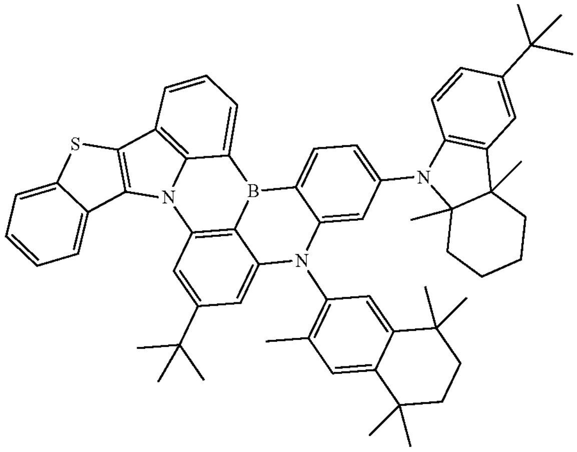
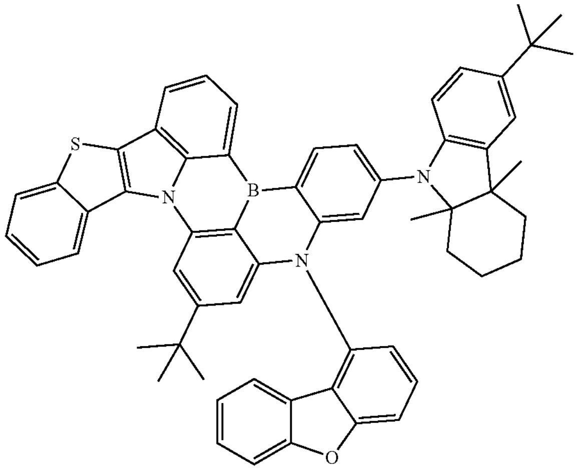

-continued
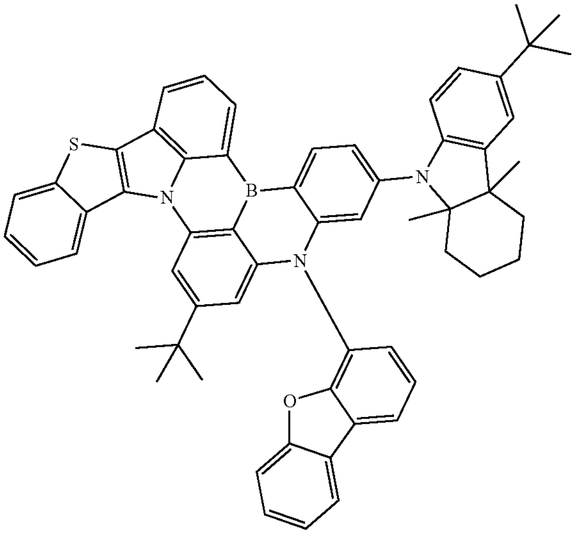
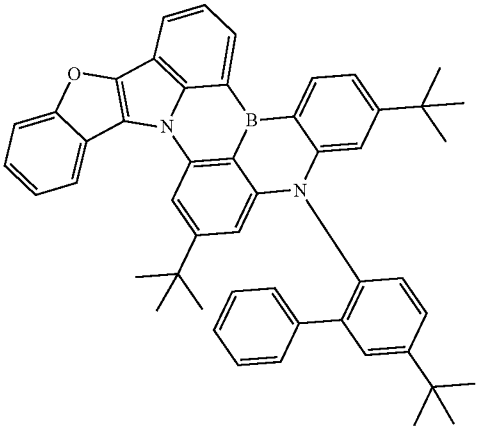
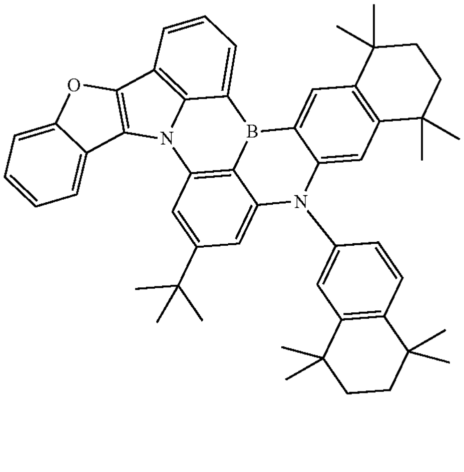
-continued
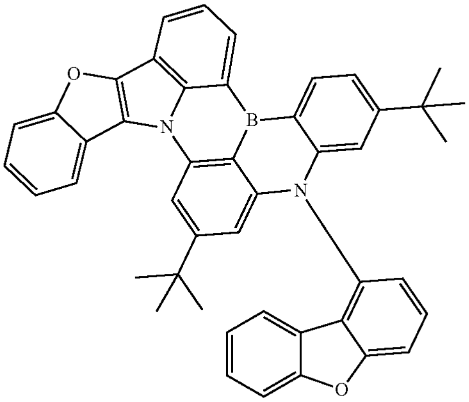
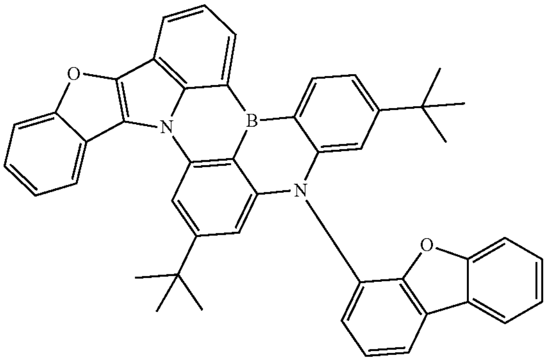
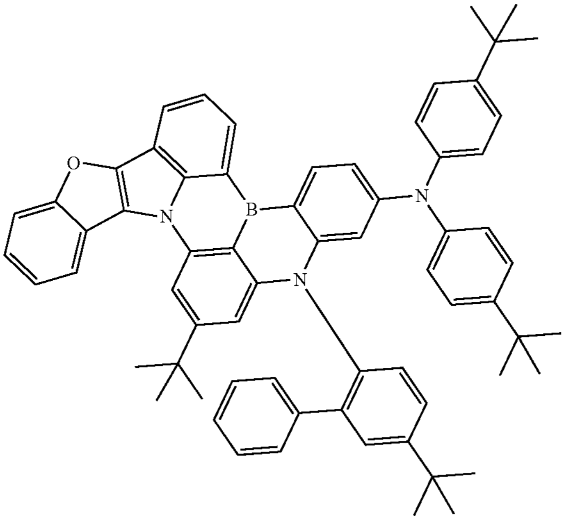

-continued
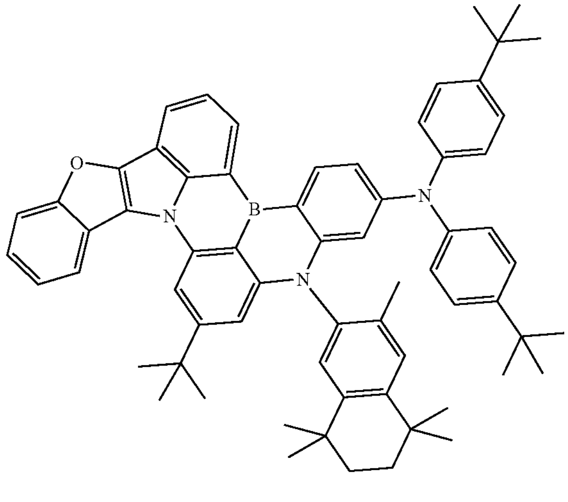
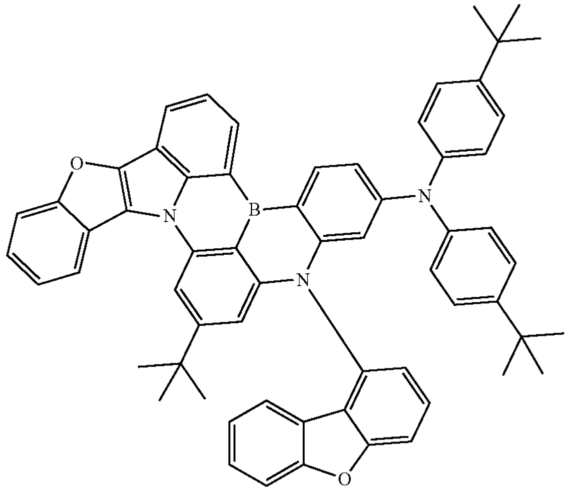
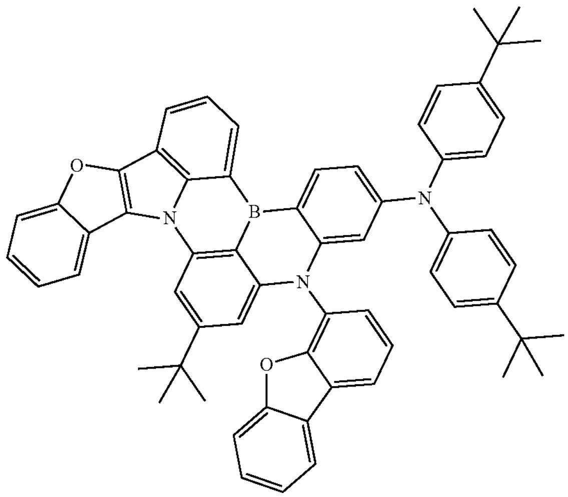
-continued
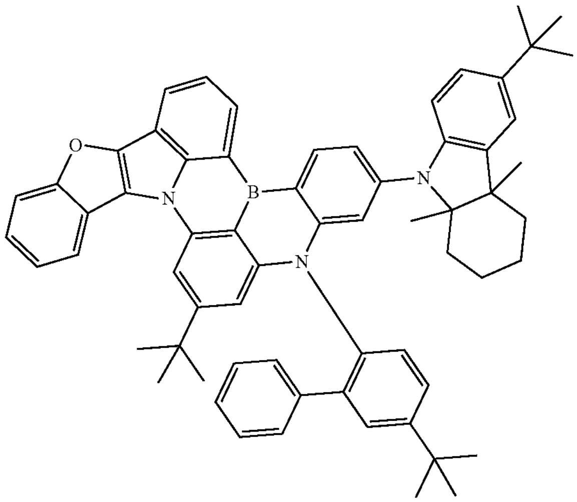
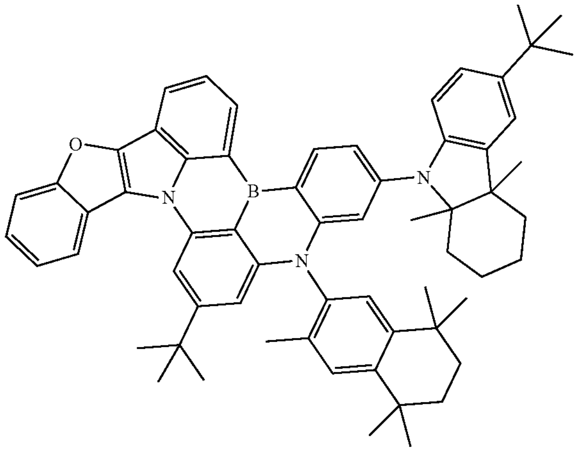
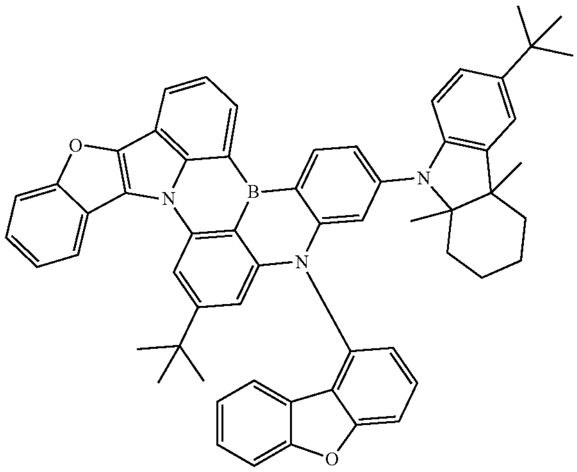

-continued
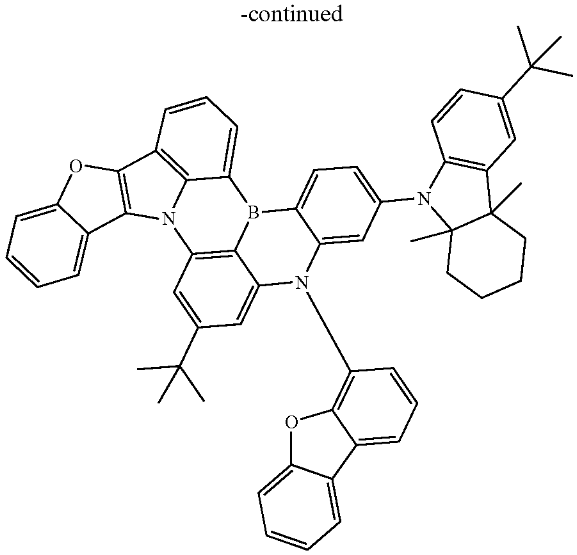
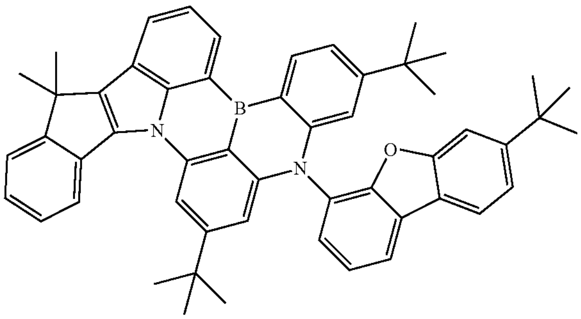
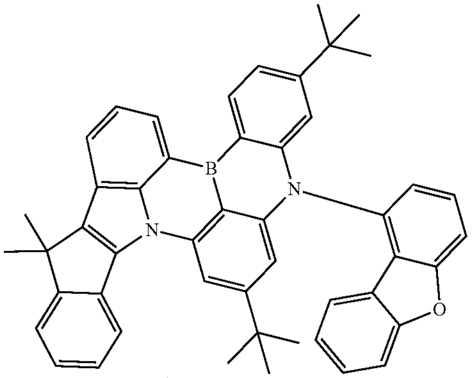
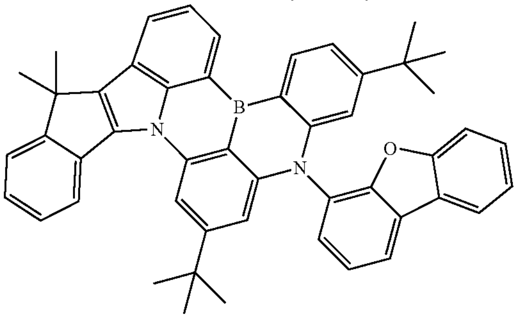
-continued
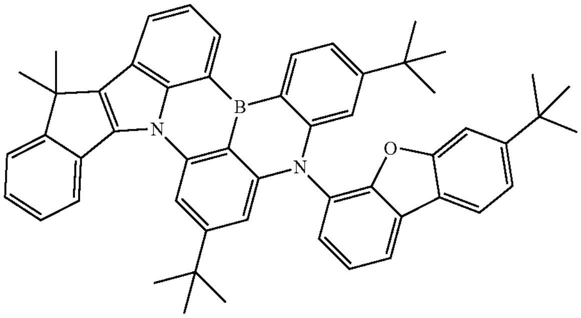
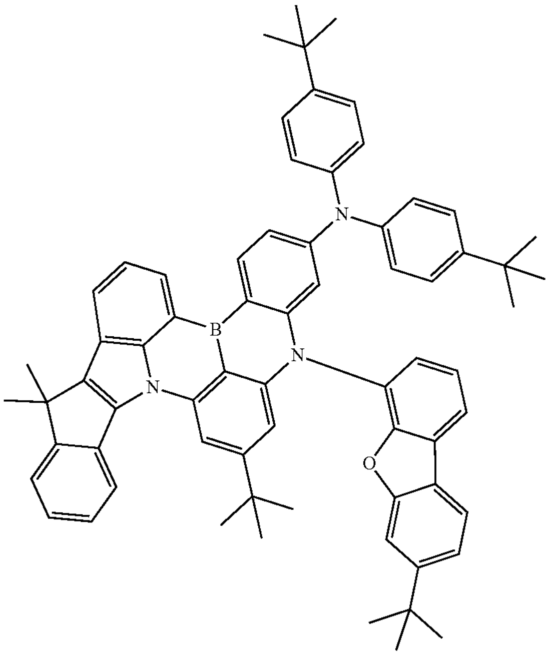
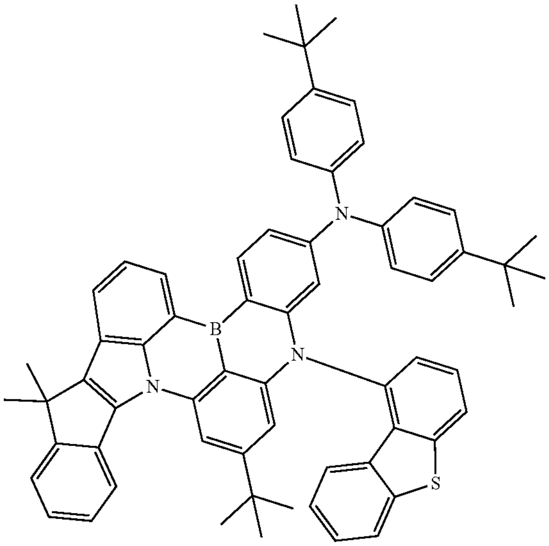

-continued
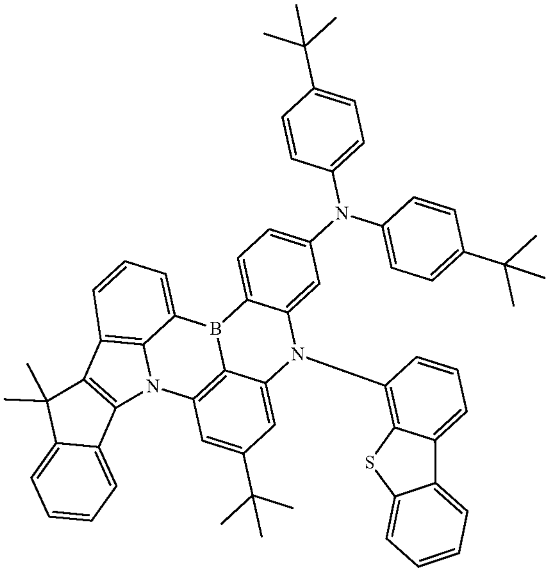
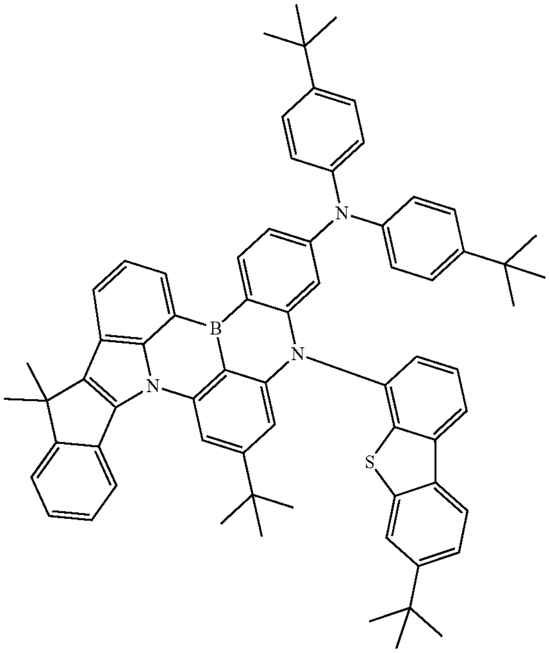
-continued
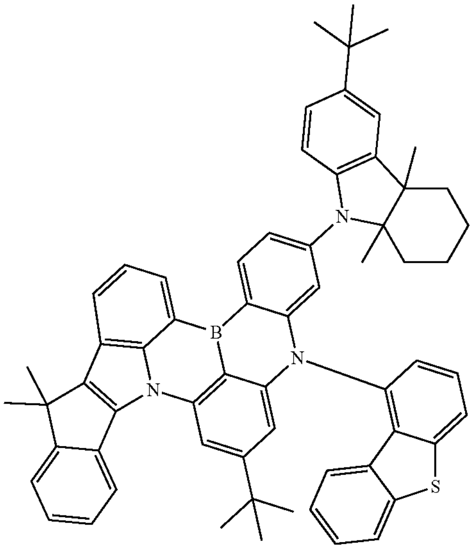
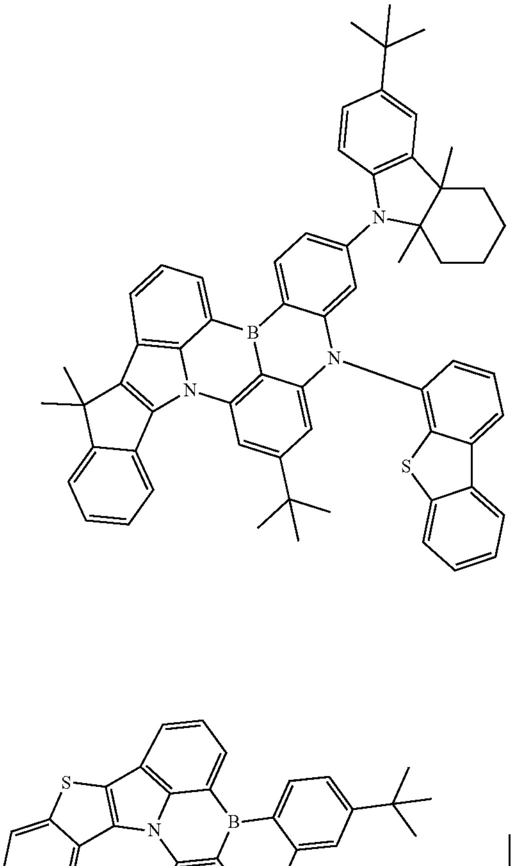
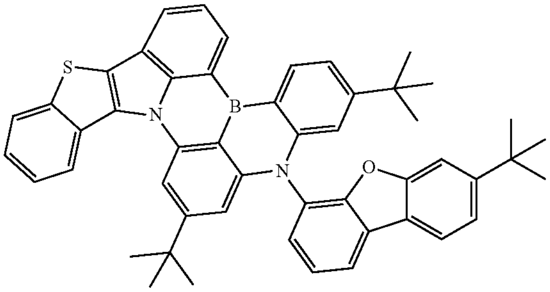

-continued
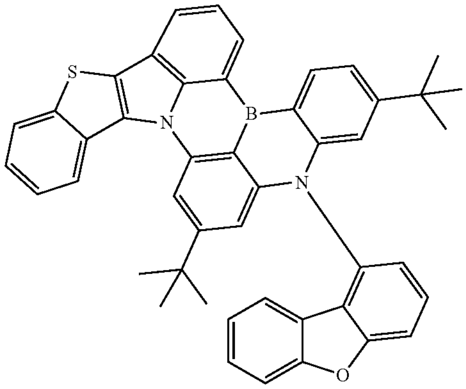
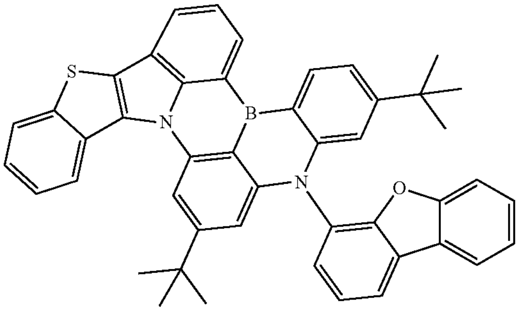
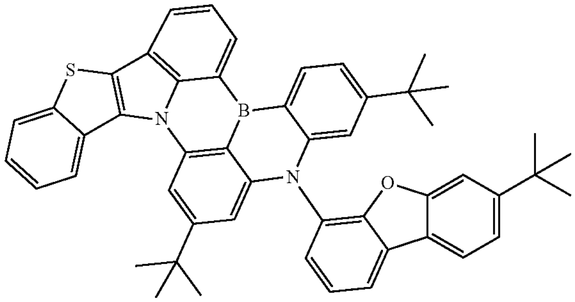
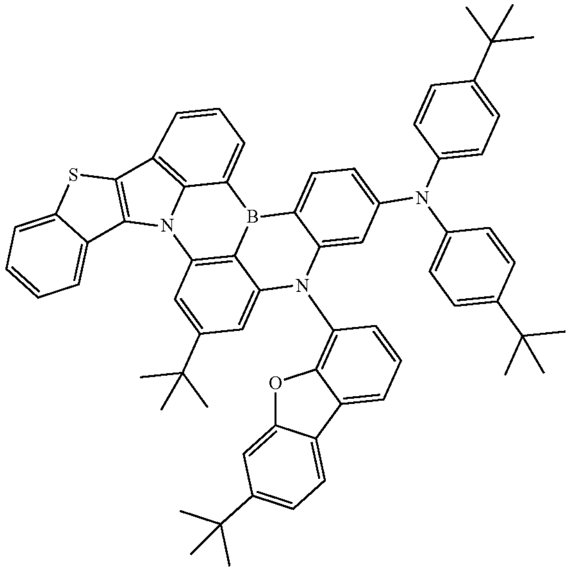
-continued
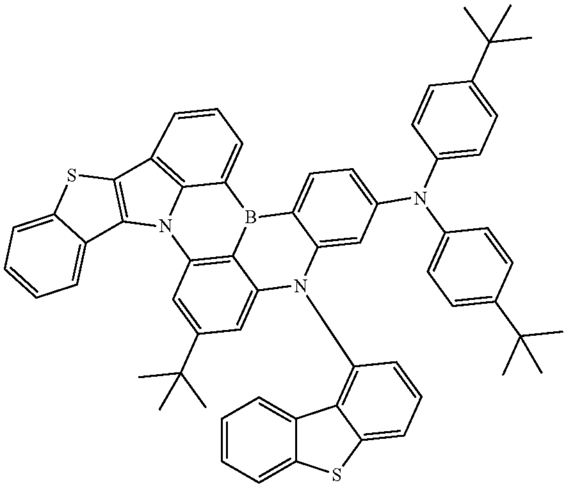
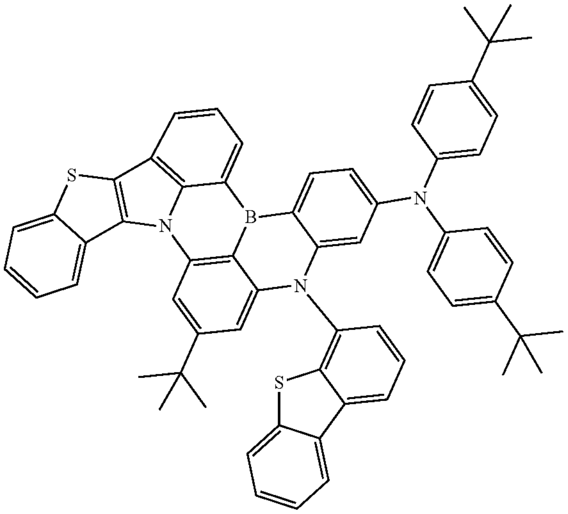
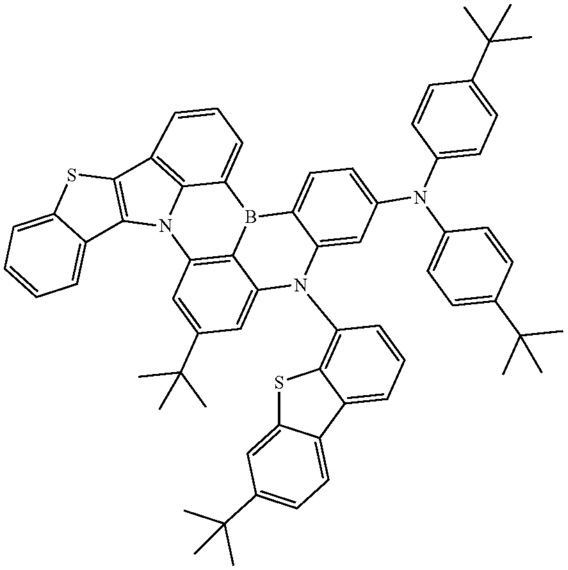

-continued
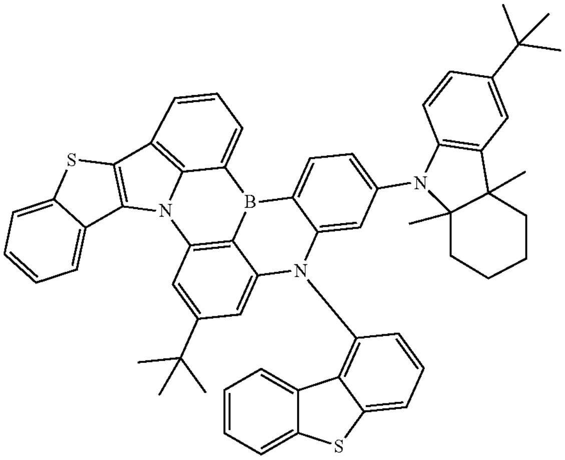
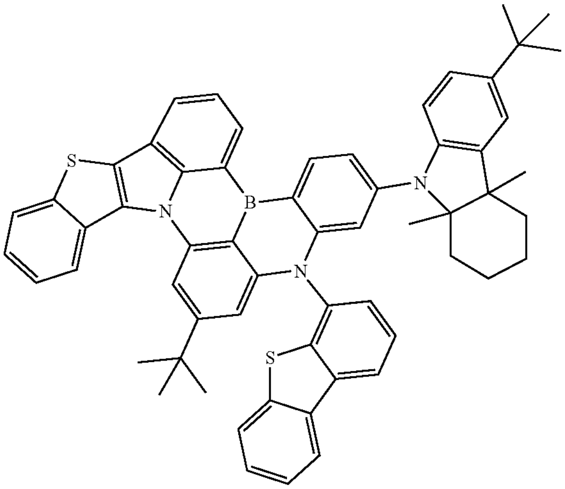
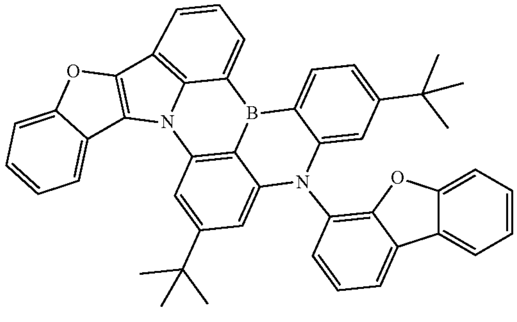
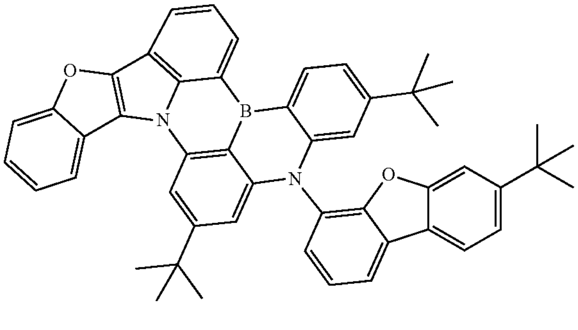
-continued
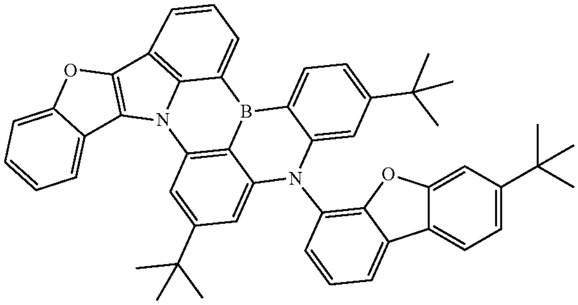
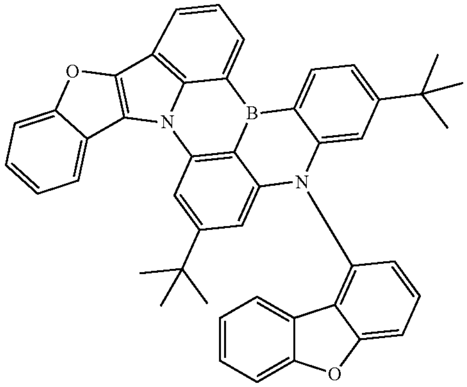
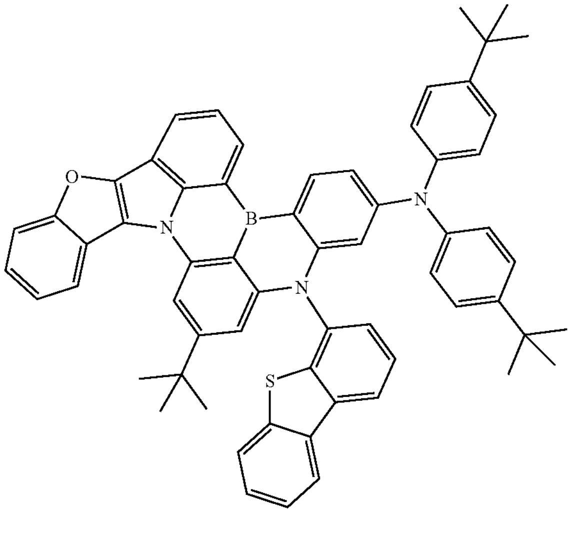

-continued
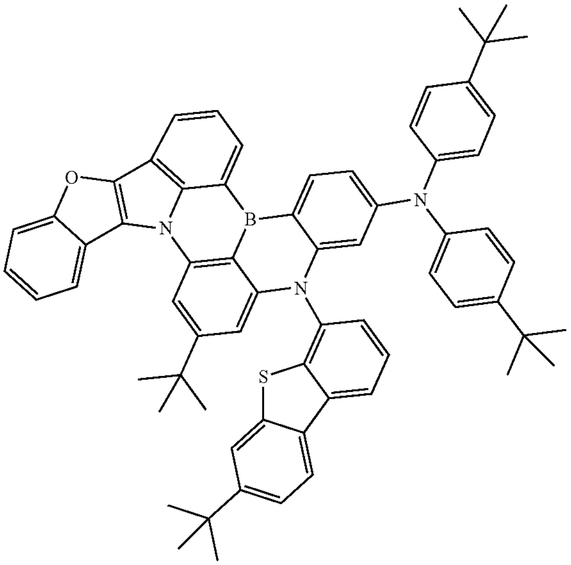
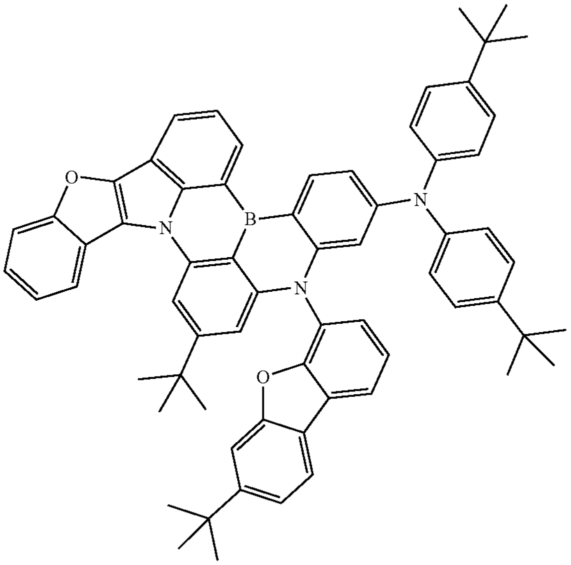
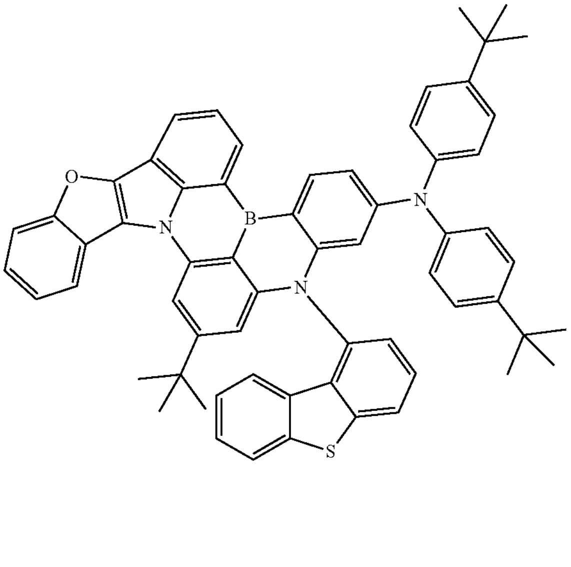
-continued
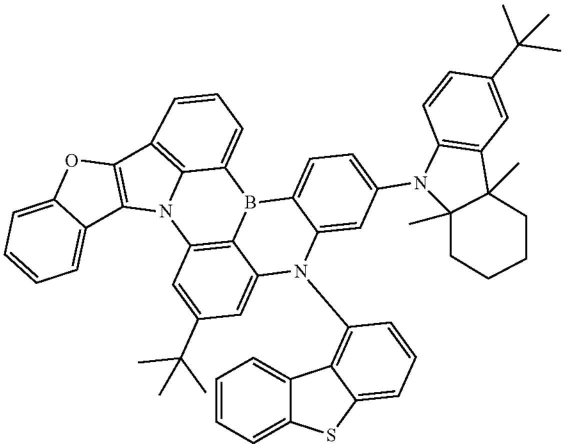
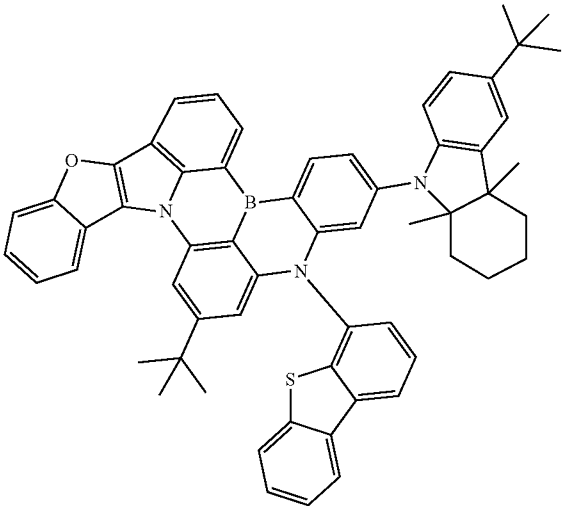
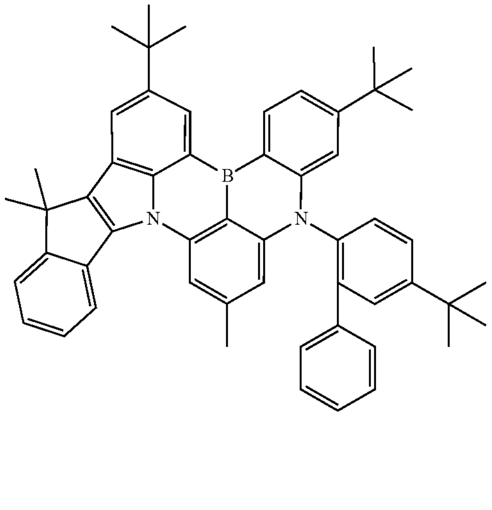

-continued
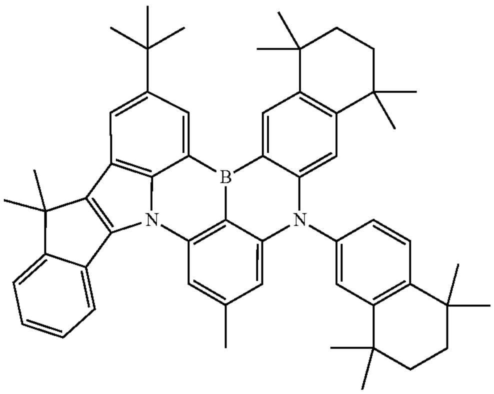
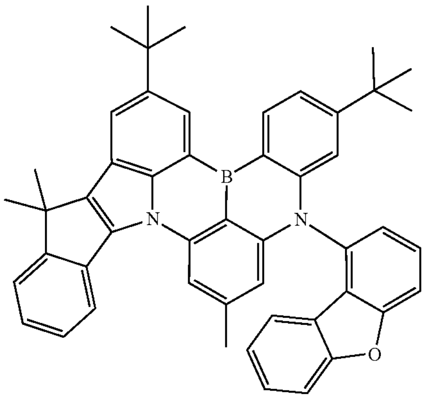
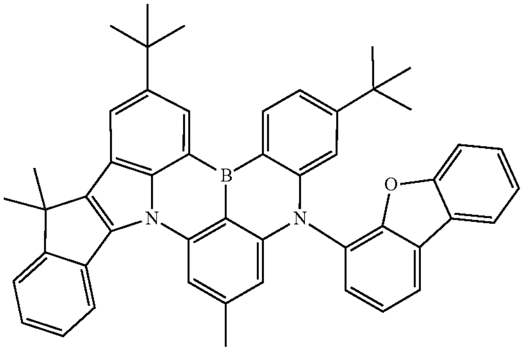
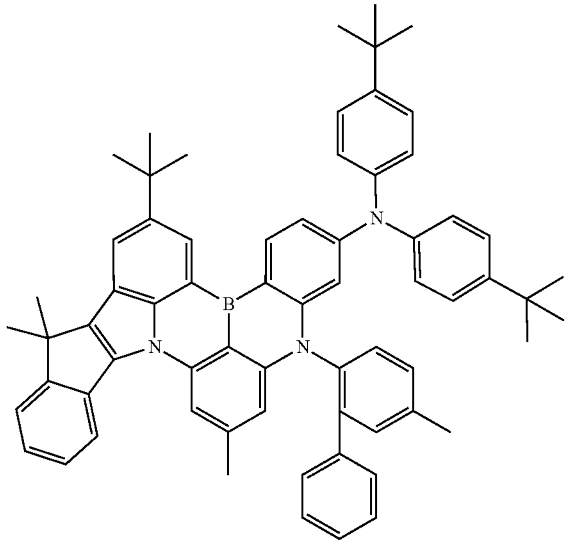
-continued
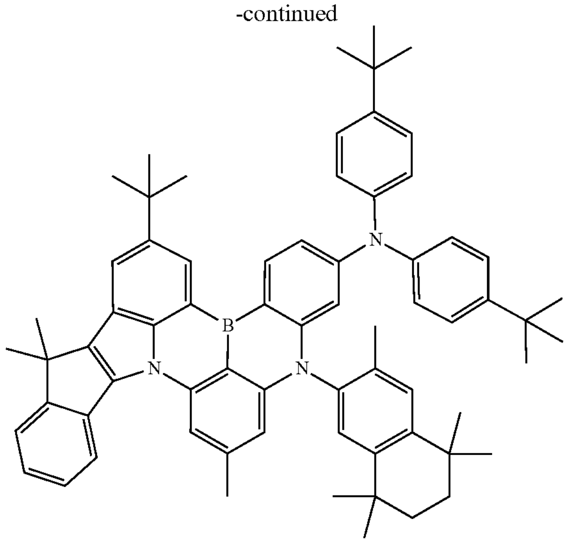
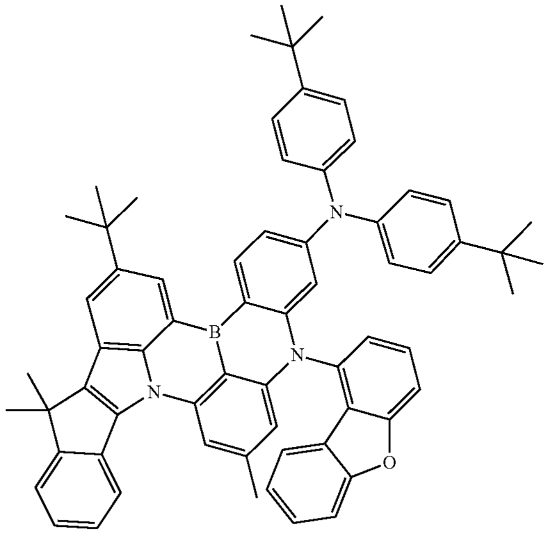
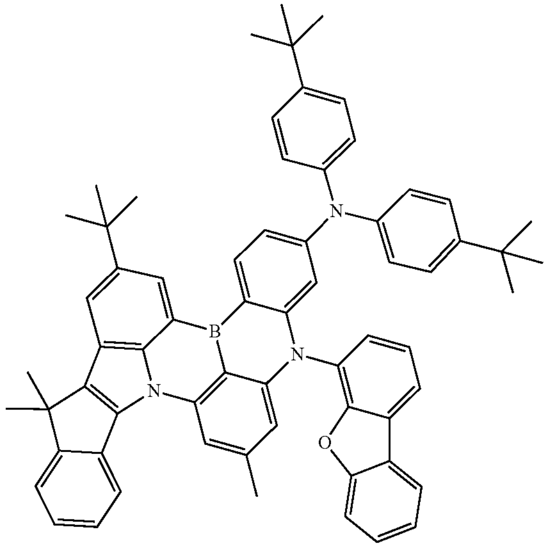

-continued
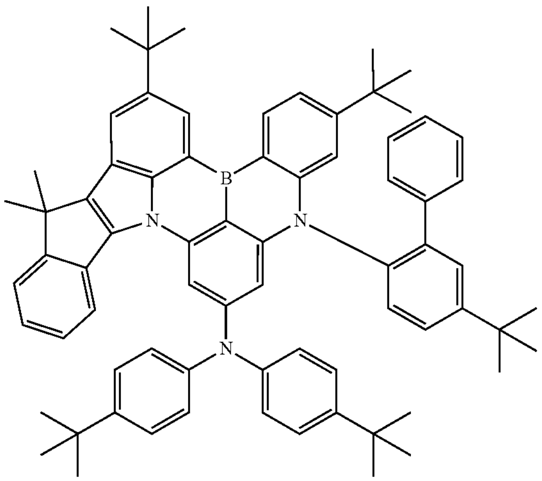
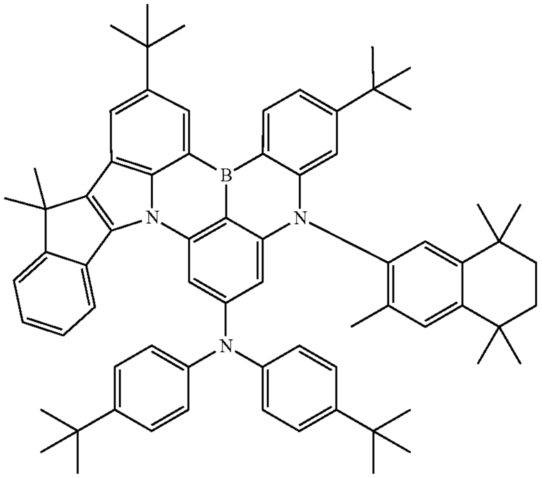
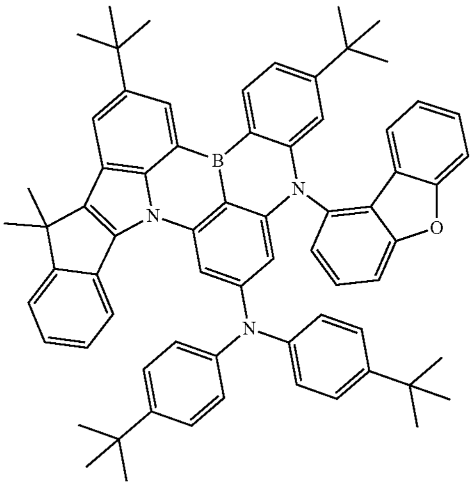
-continued
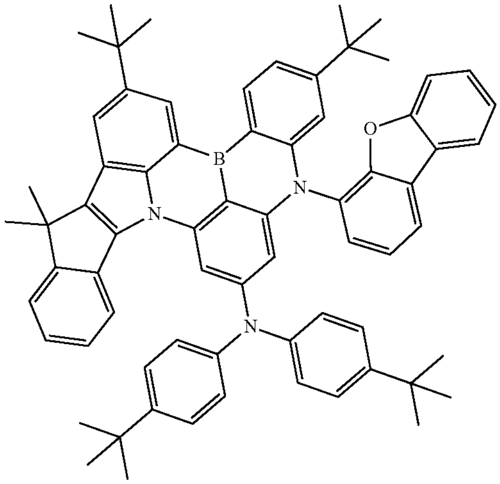
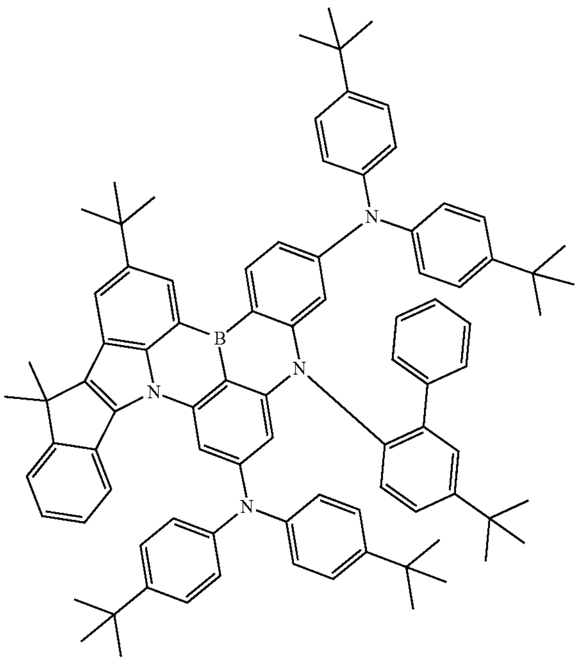

-continued
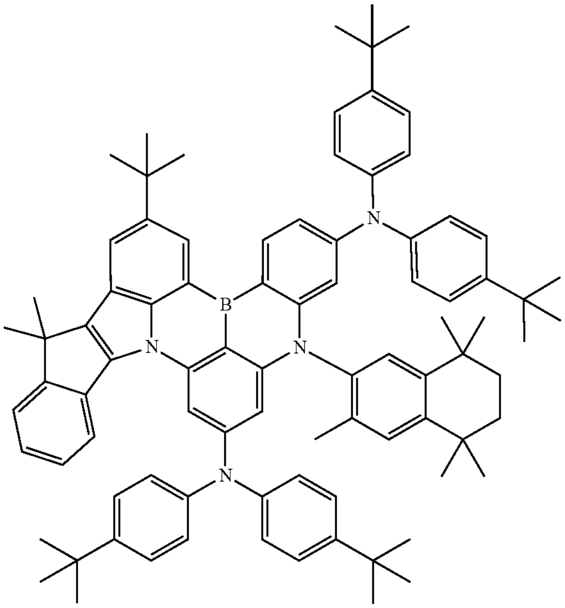
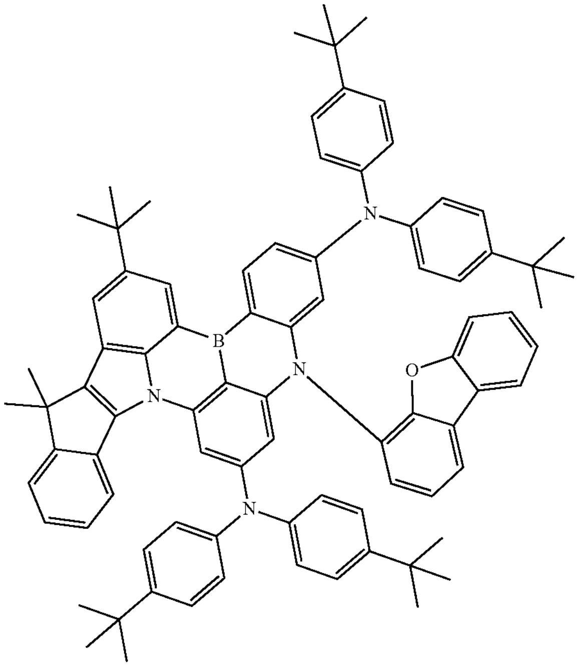
-continued
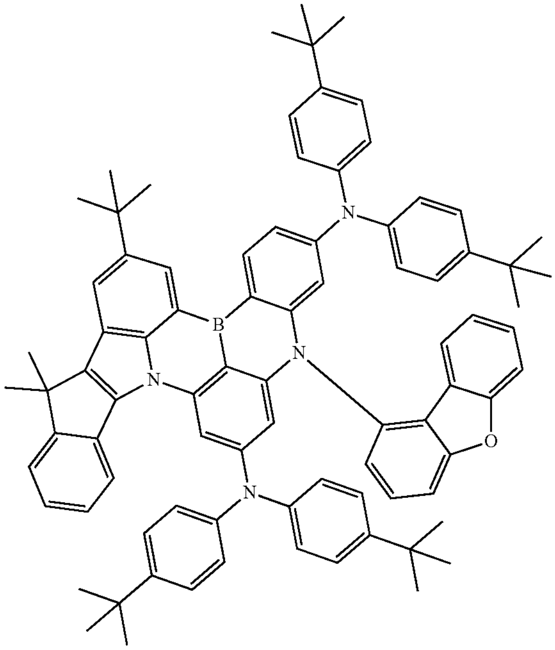
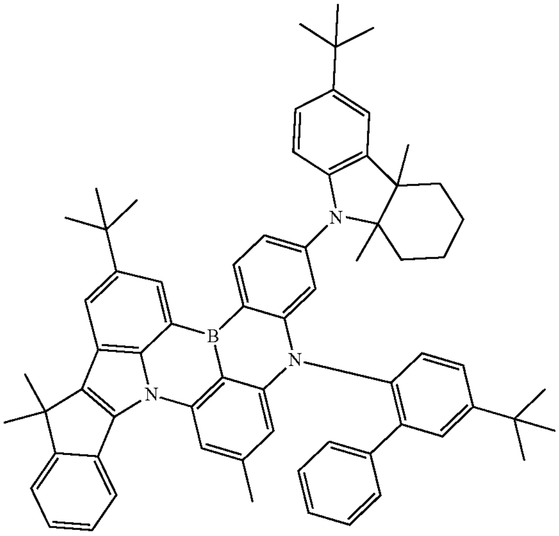

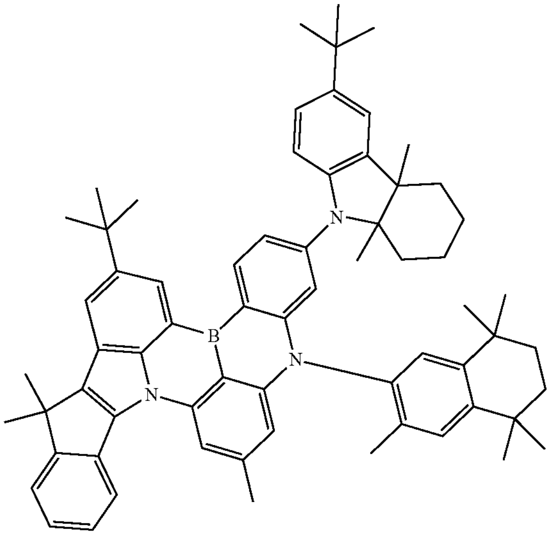
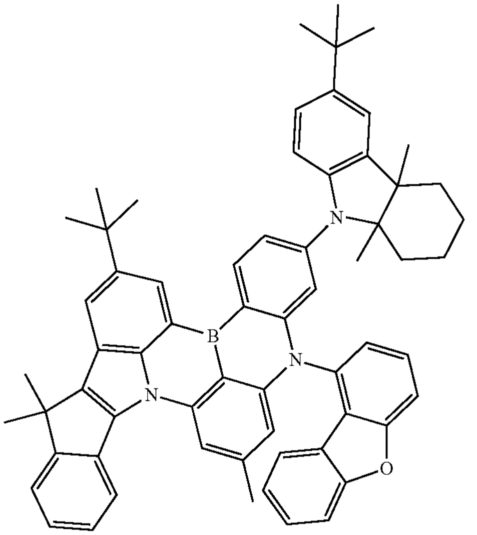
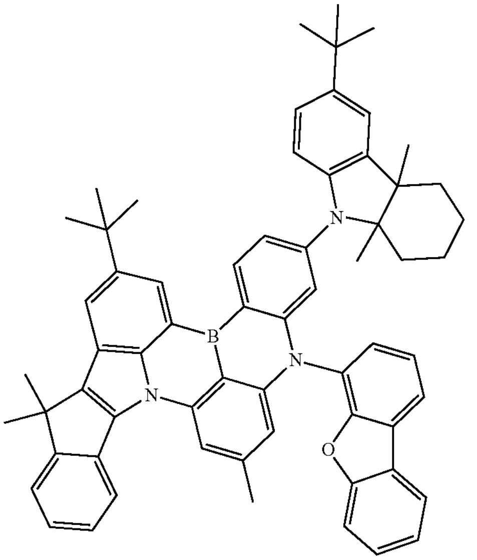
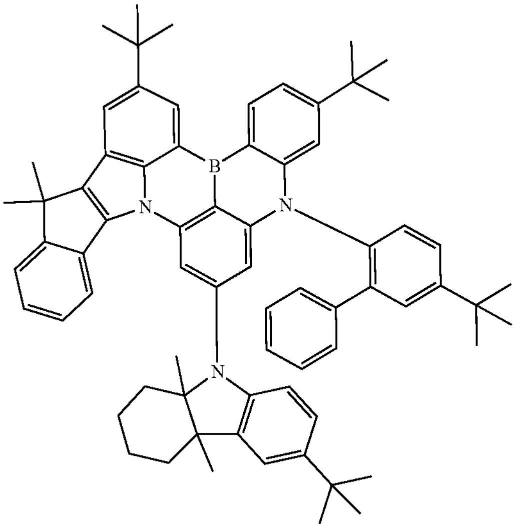
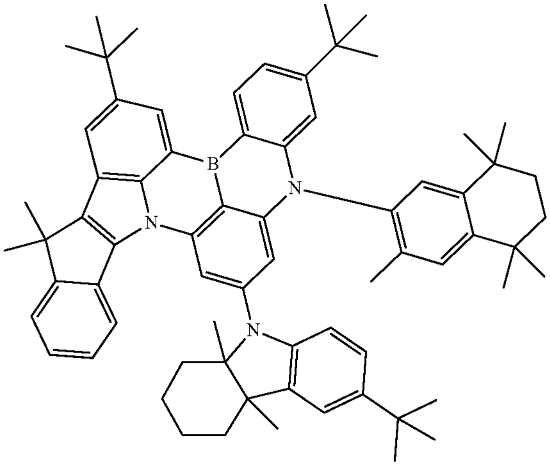
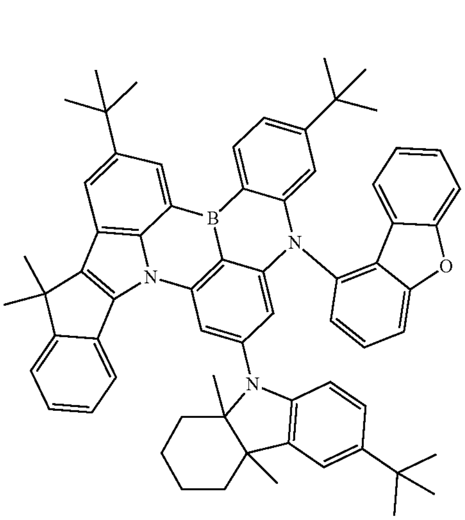

-continued
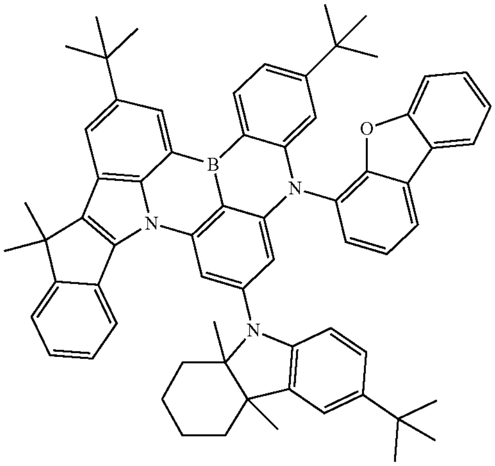
-continued
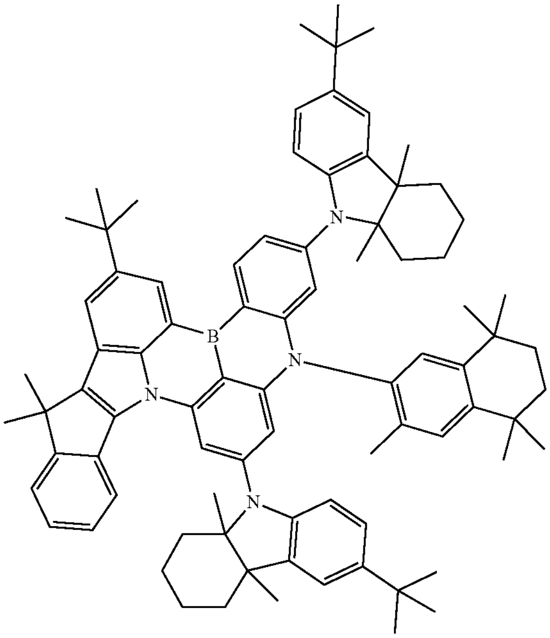
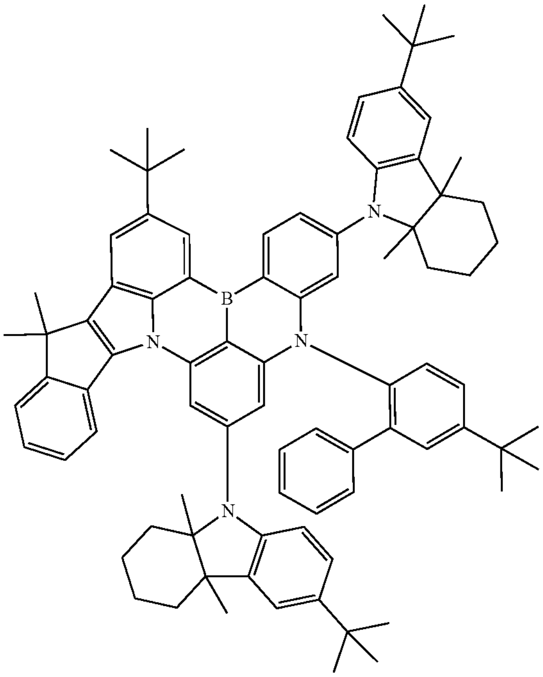
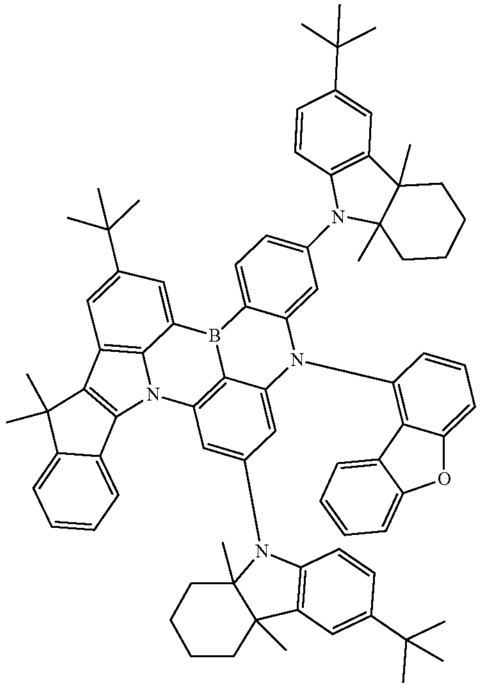

-continued
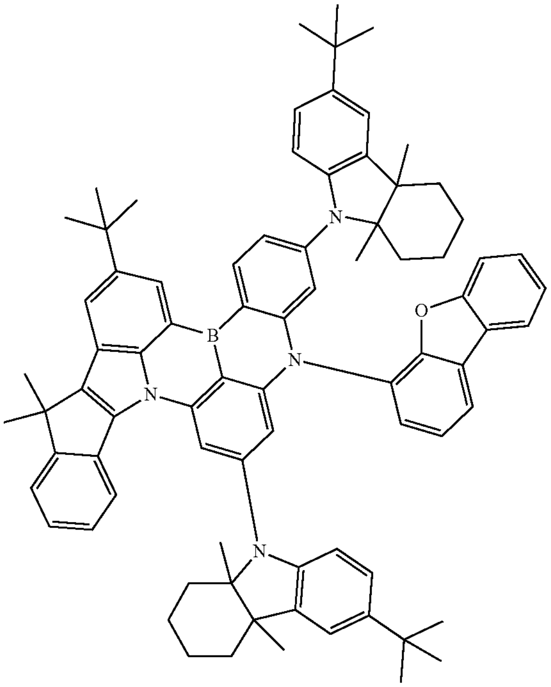
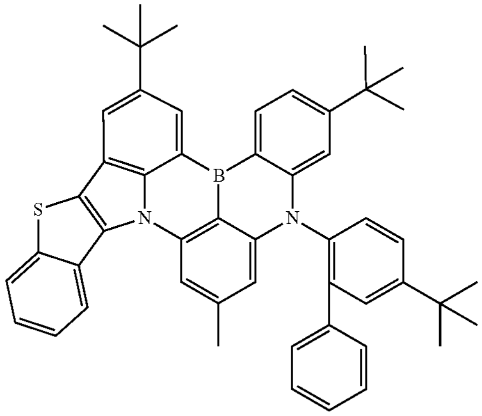
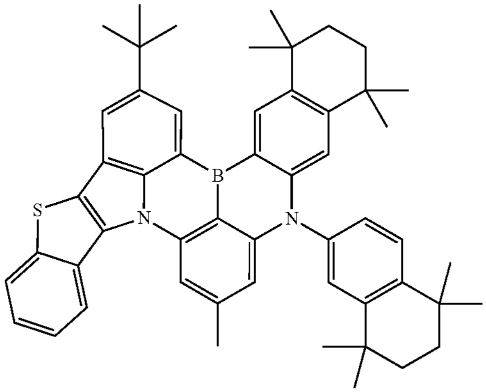
-continued
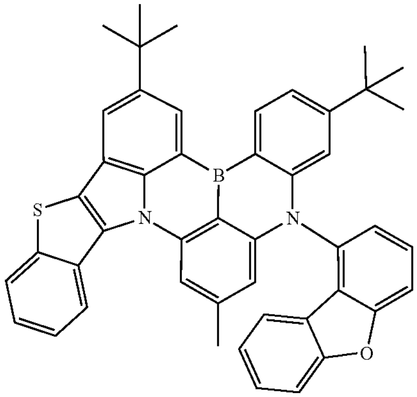
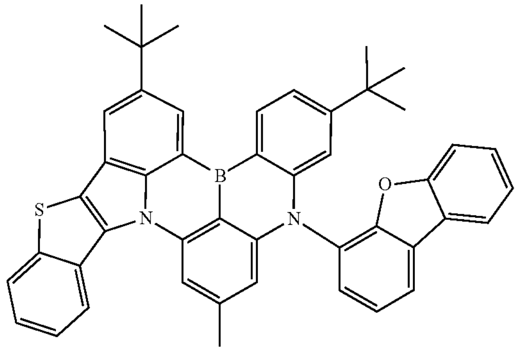
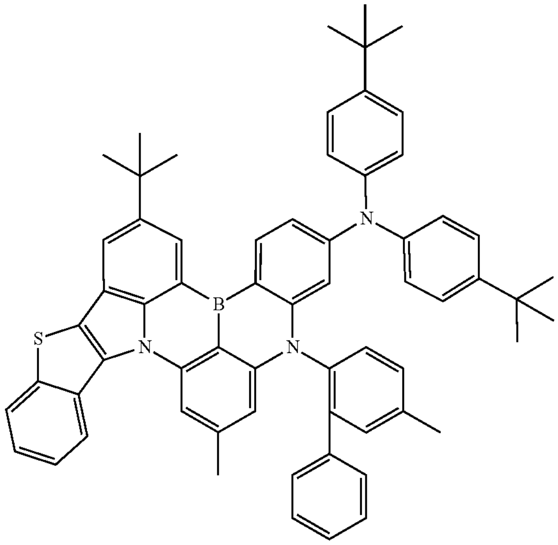

-continued
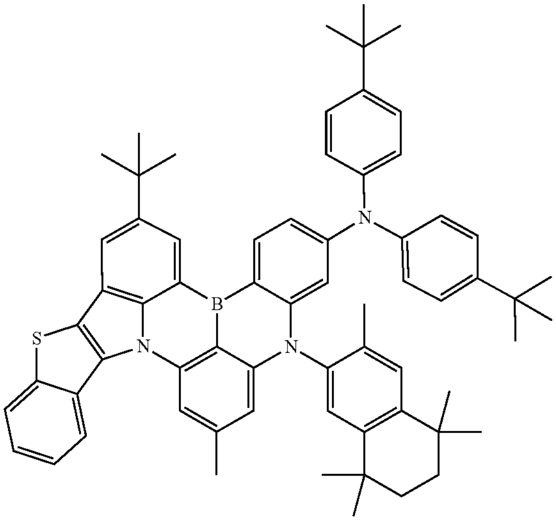
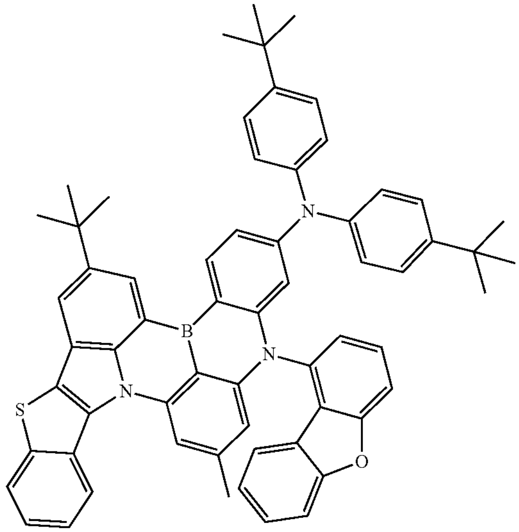
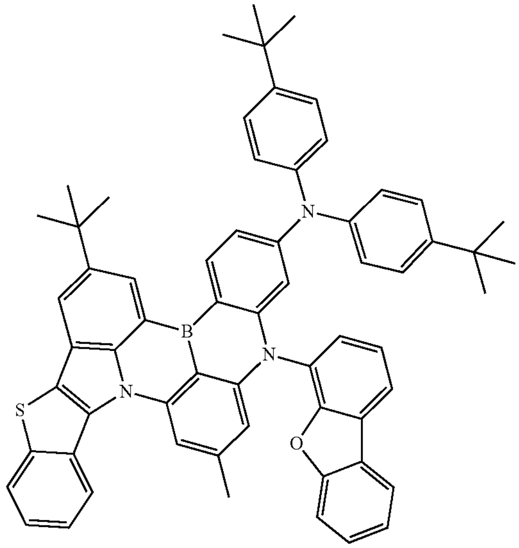
-continued
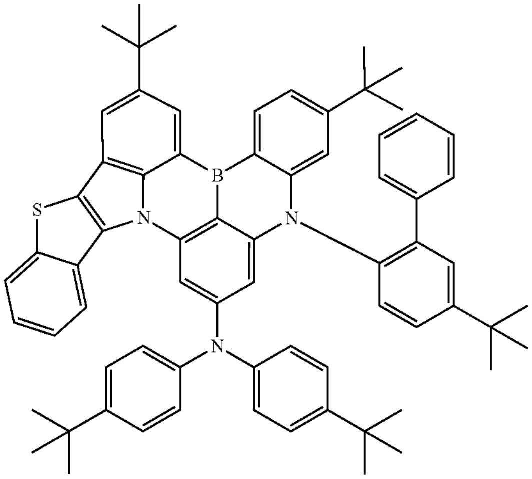
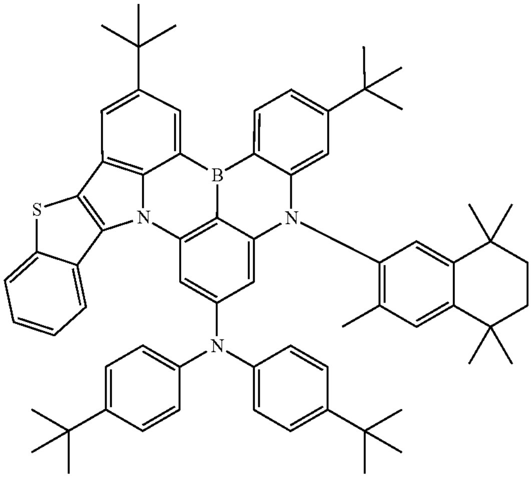
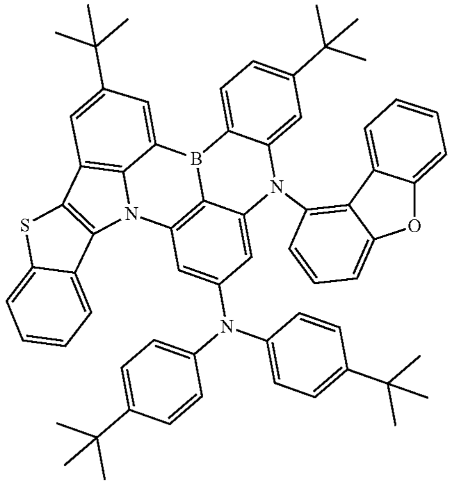

-continued
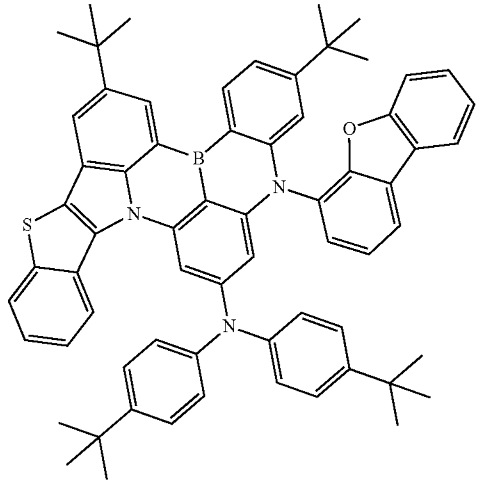
-continued
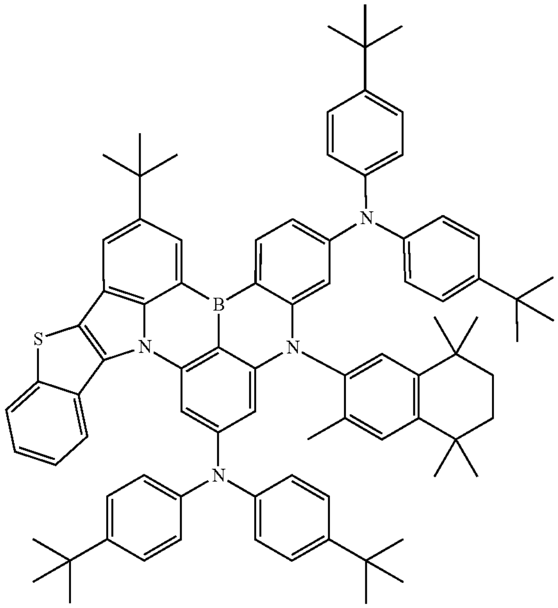
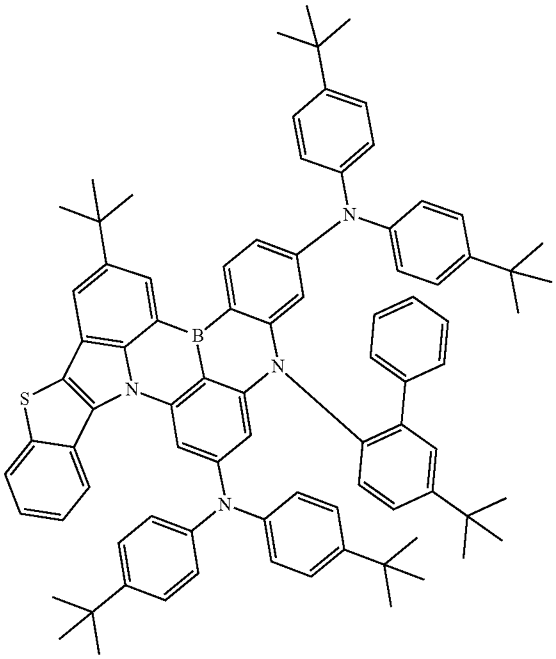
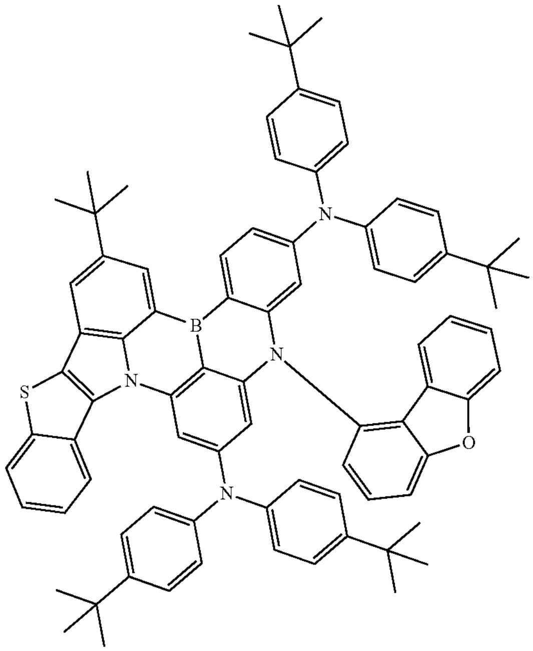

-continued
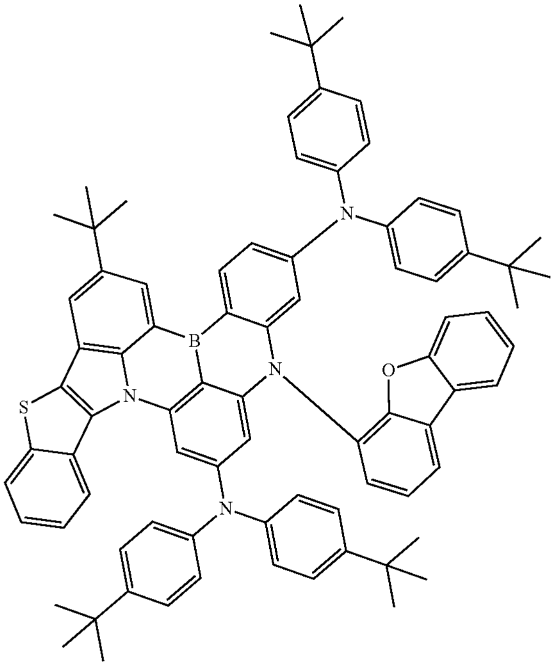
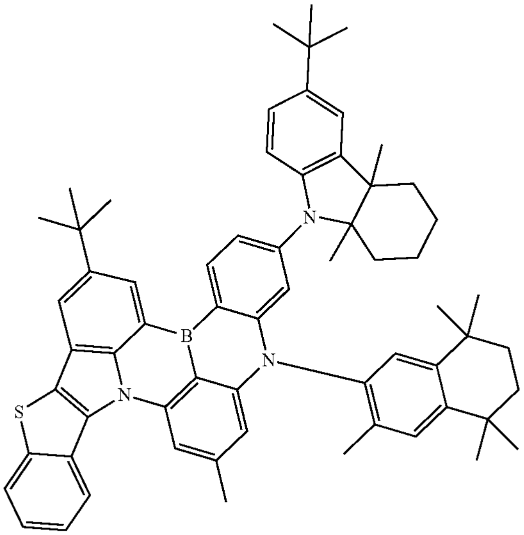
-continued
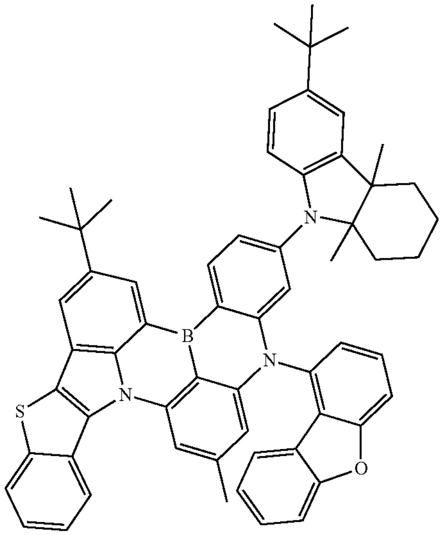
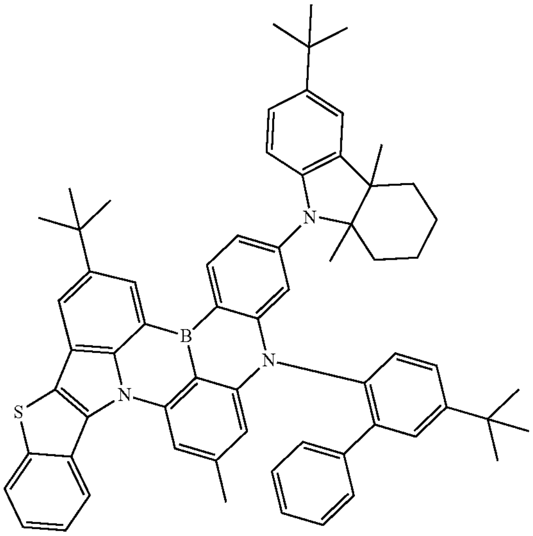
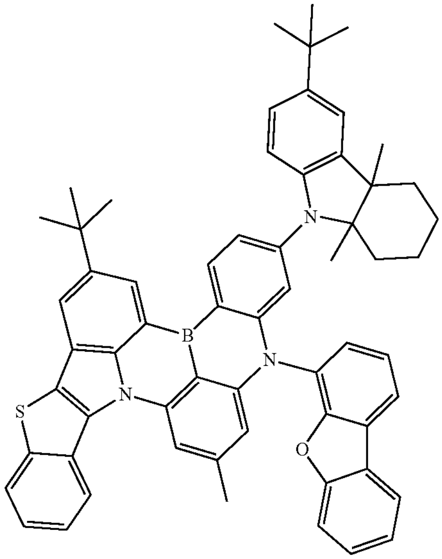

-continued
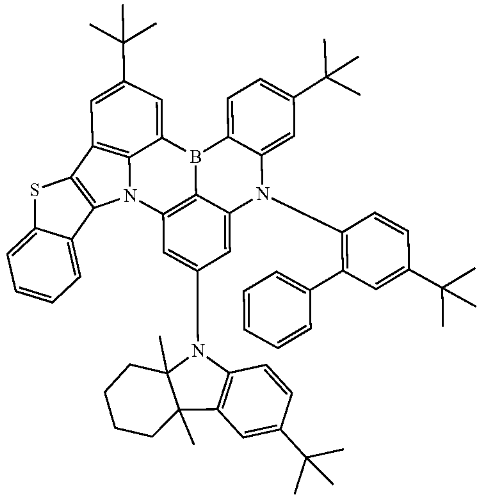
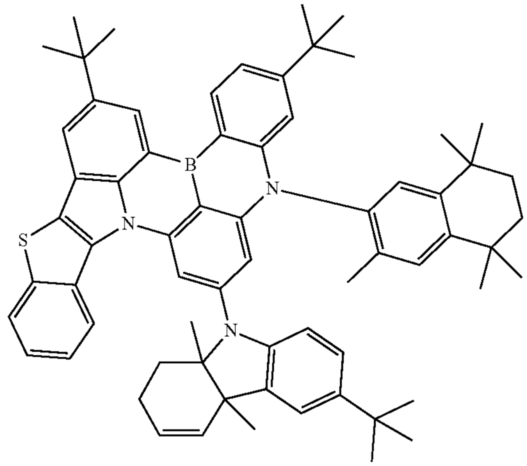
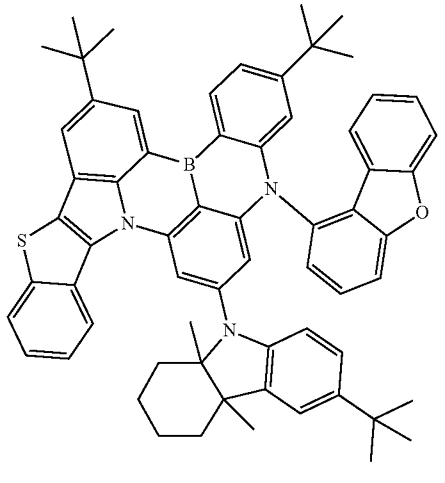
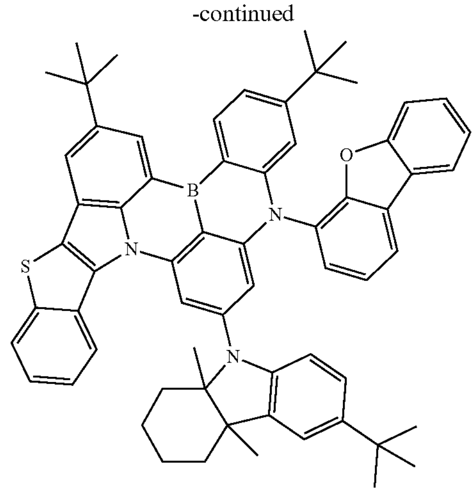
-continued
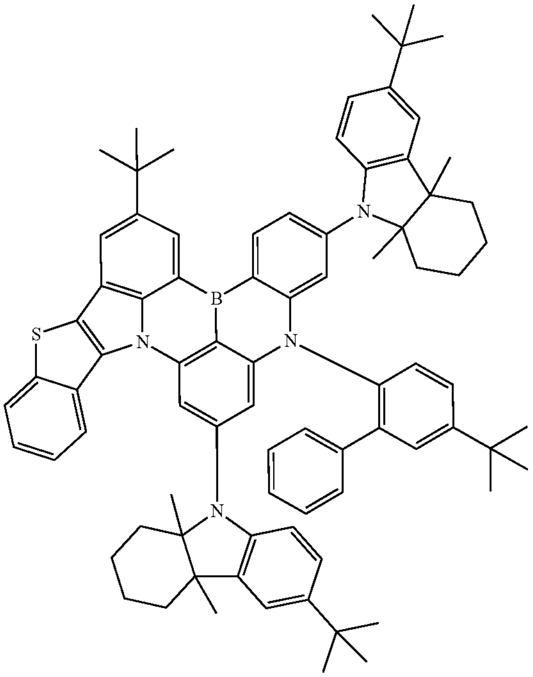

-continued
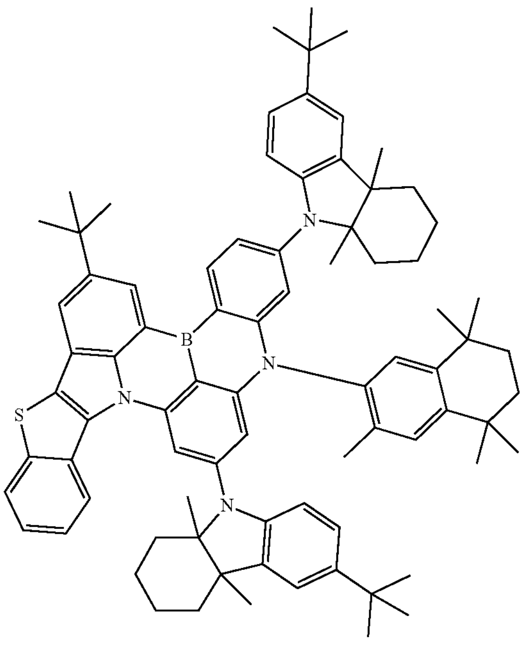
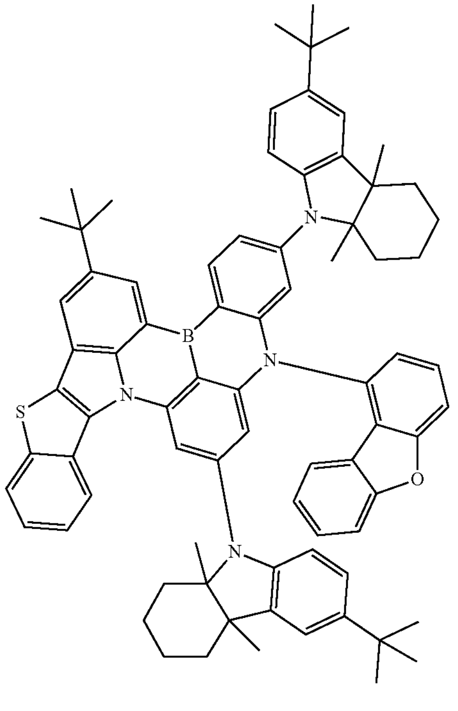
-continued
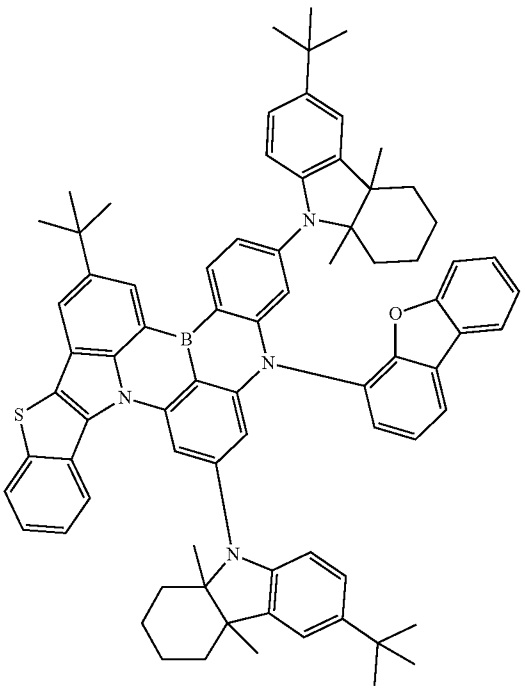
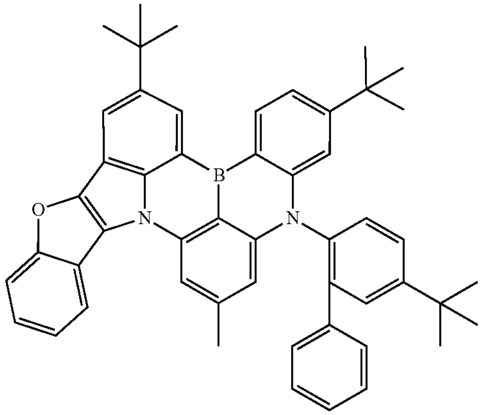
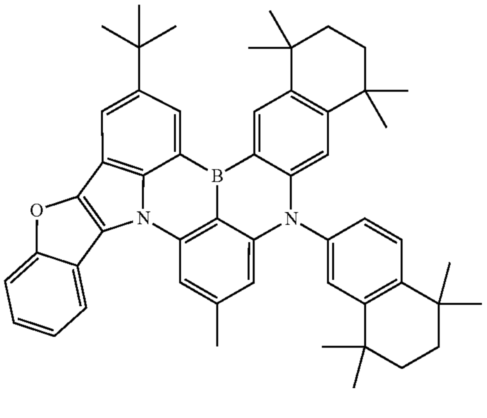

-continued
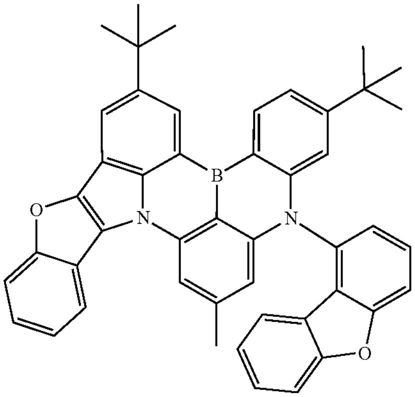
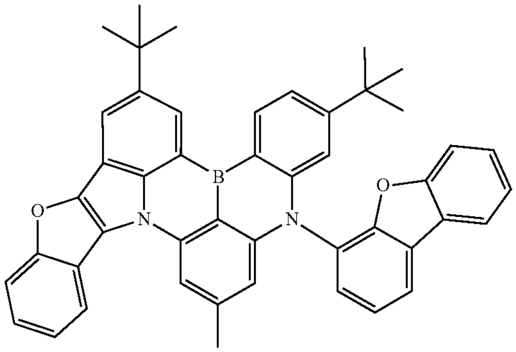
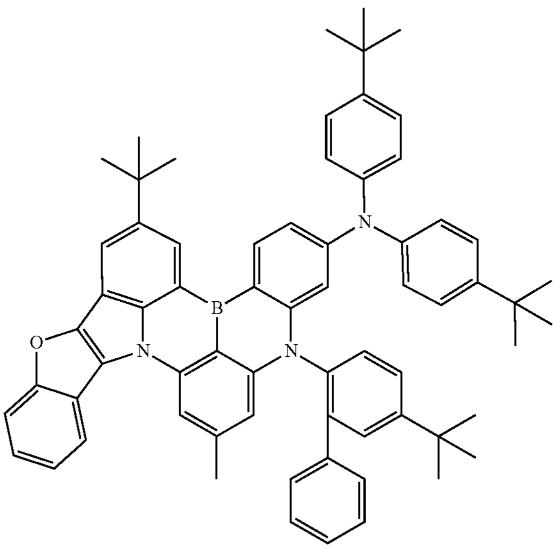
-continued
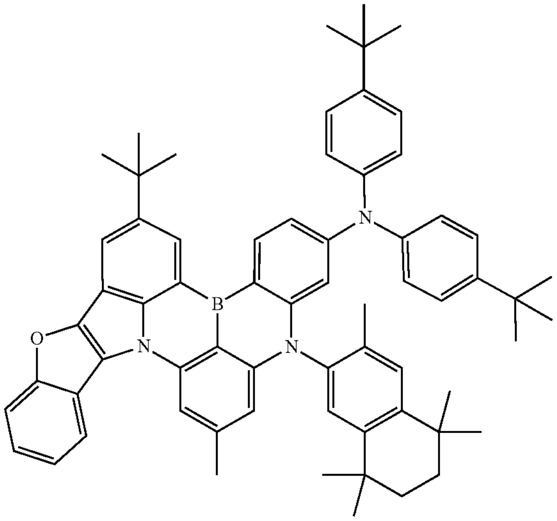
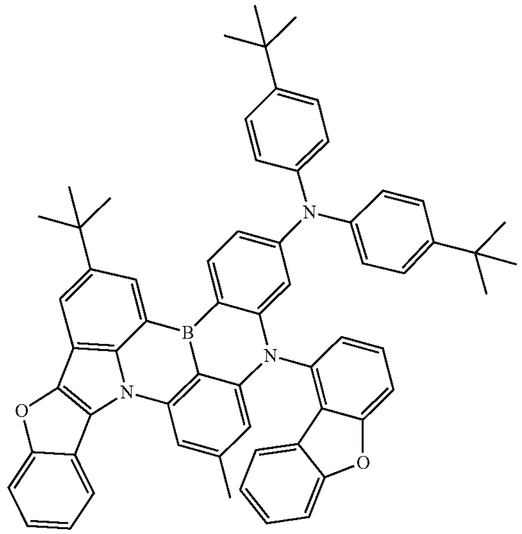
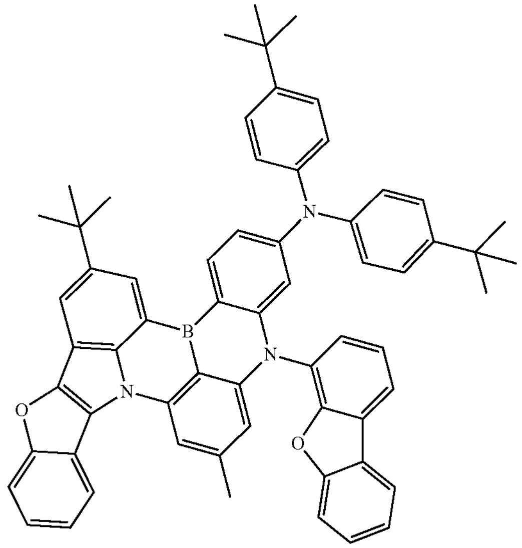

-continued
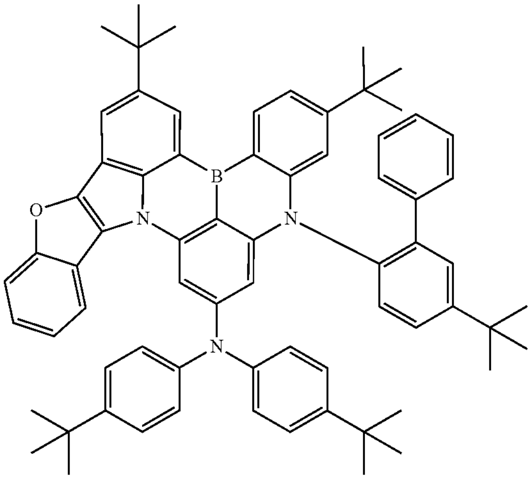
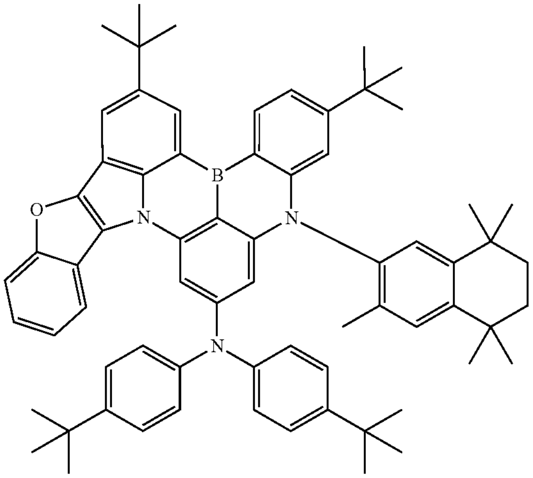
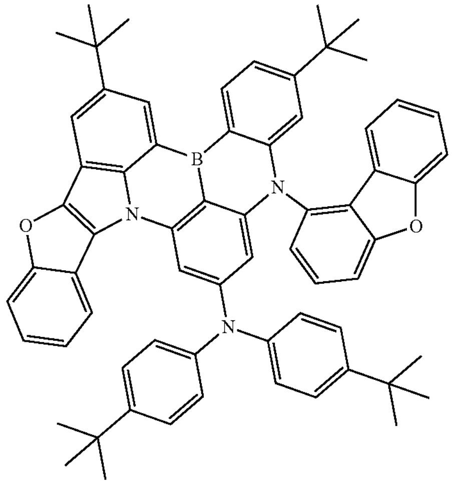
-continued
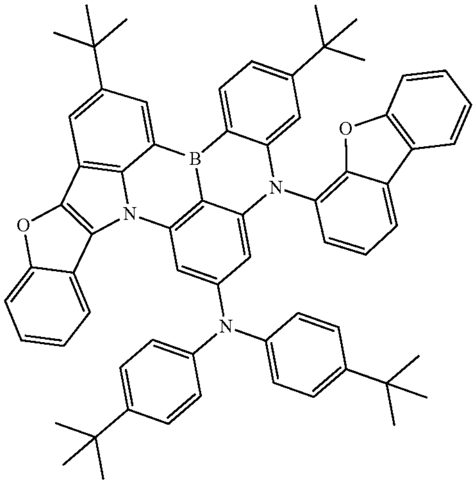
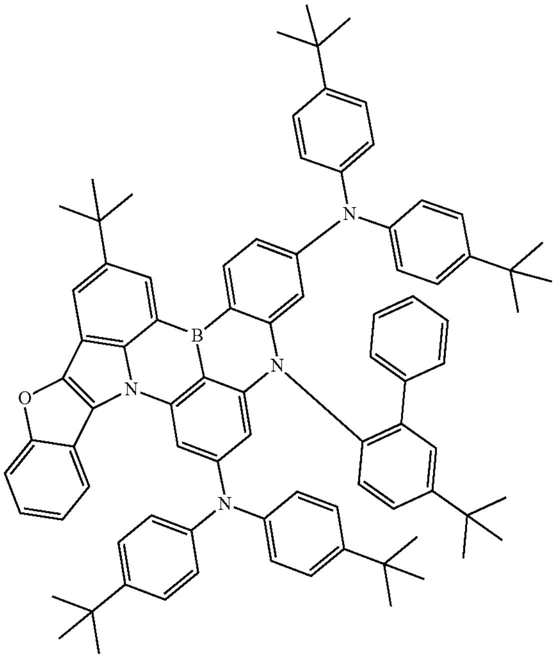

-continued
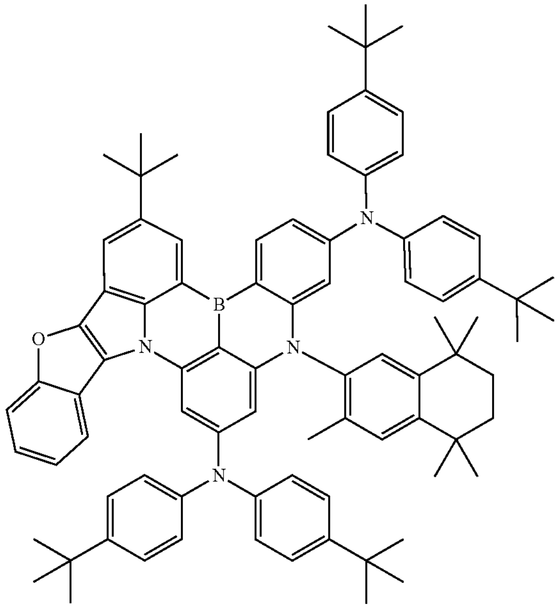
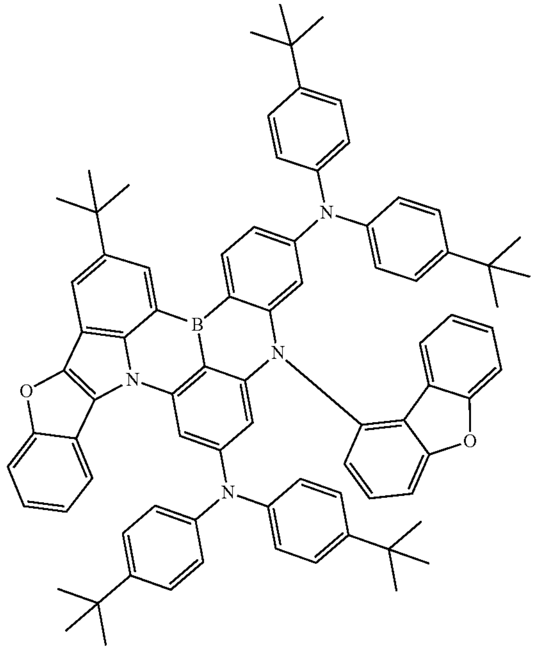
-continued
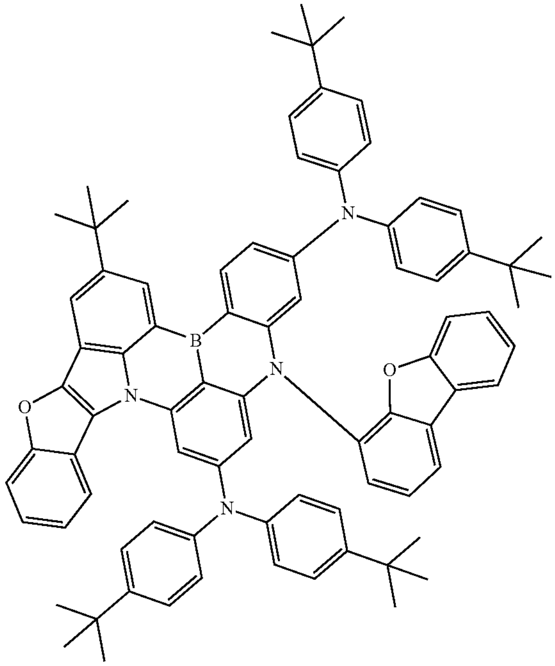
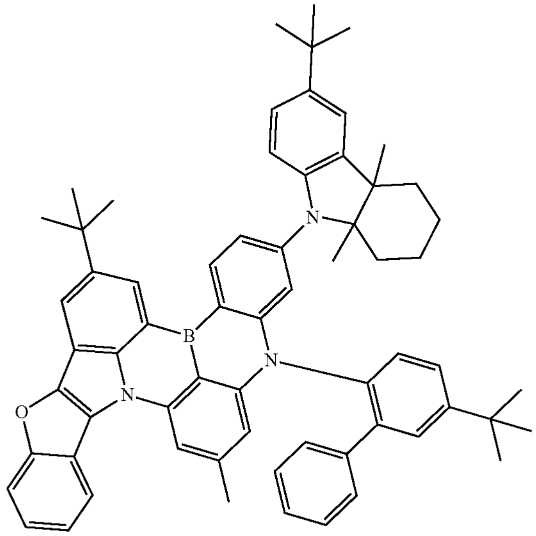

-continued
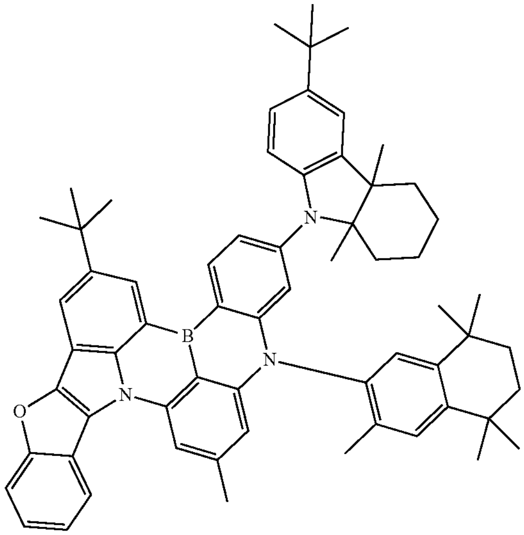
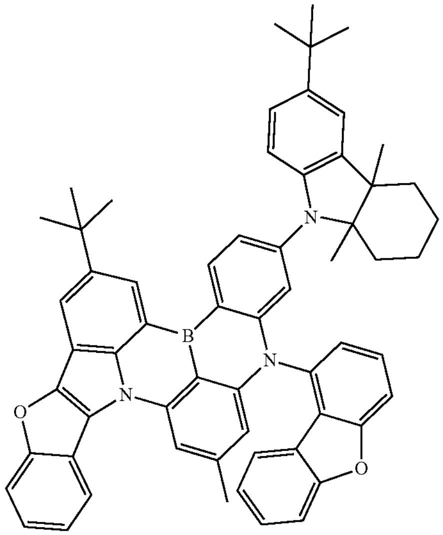
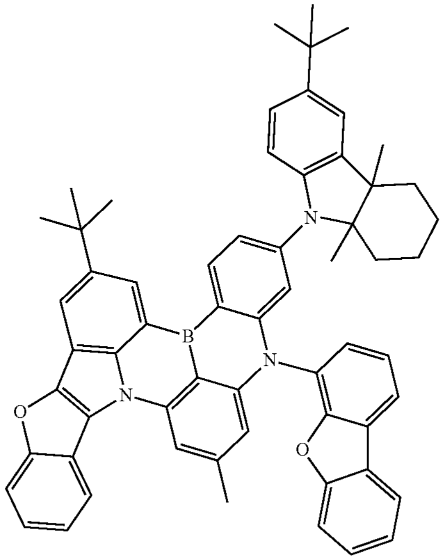
-continued
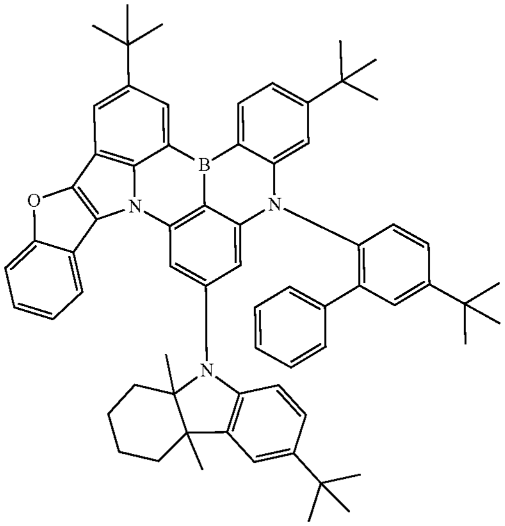
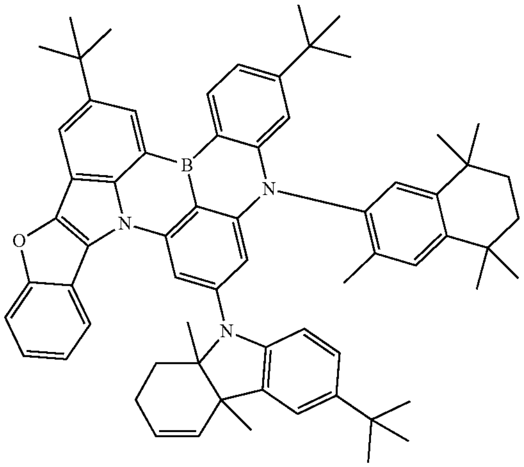
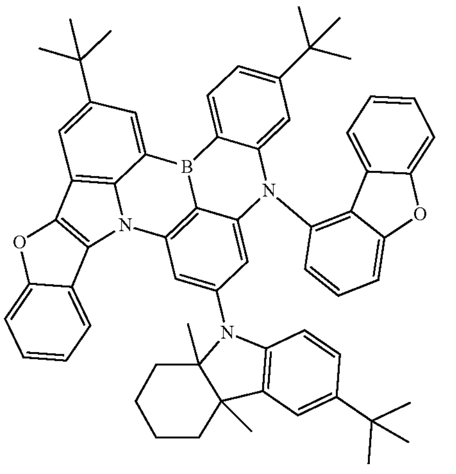

-continued
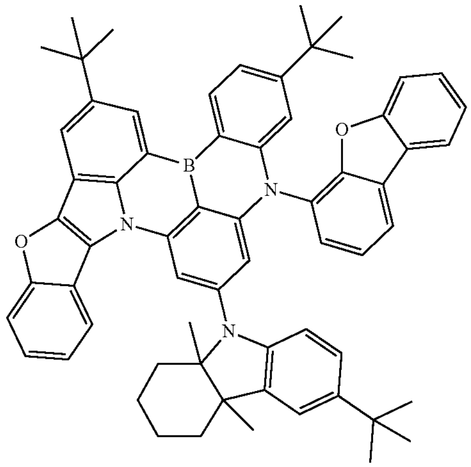
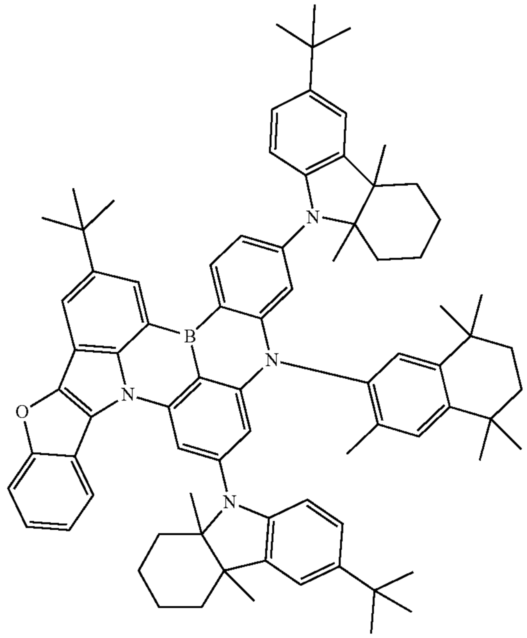
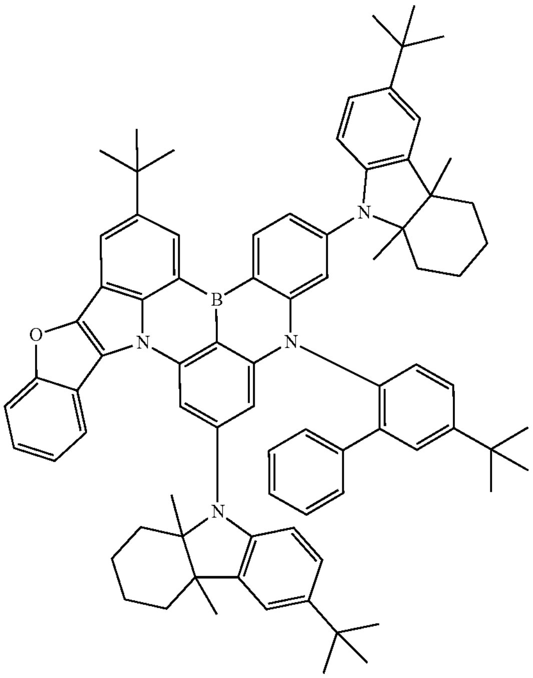
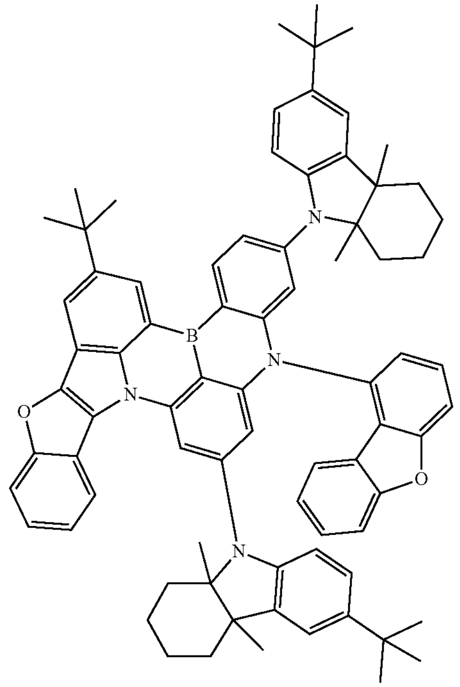

-continued
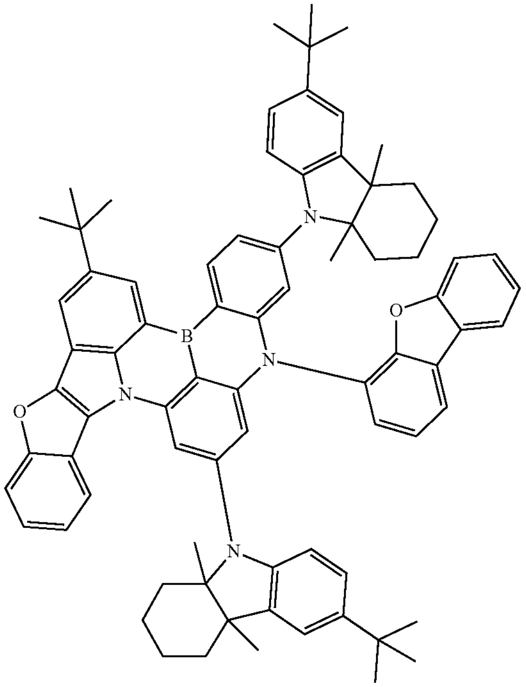
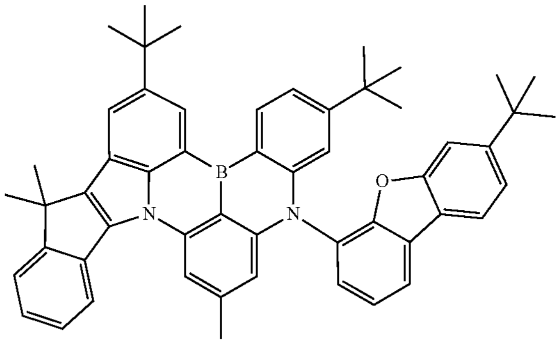
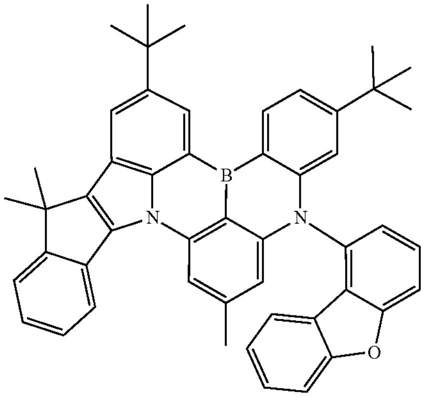
-continued
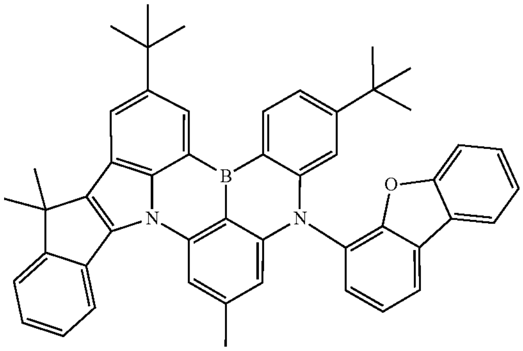
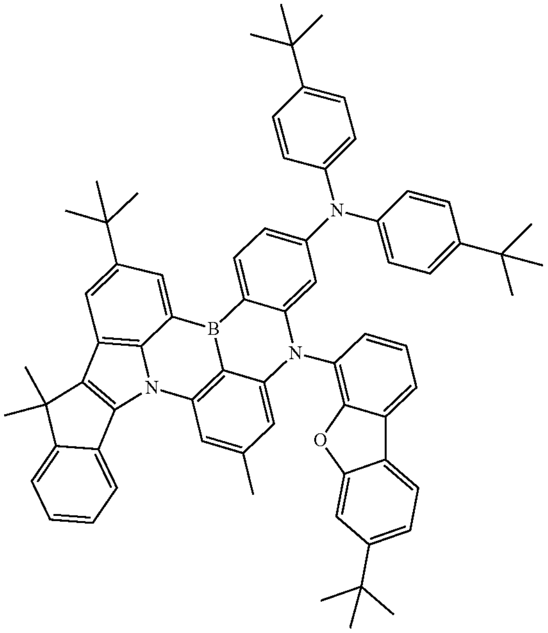
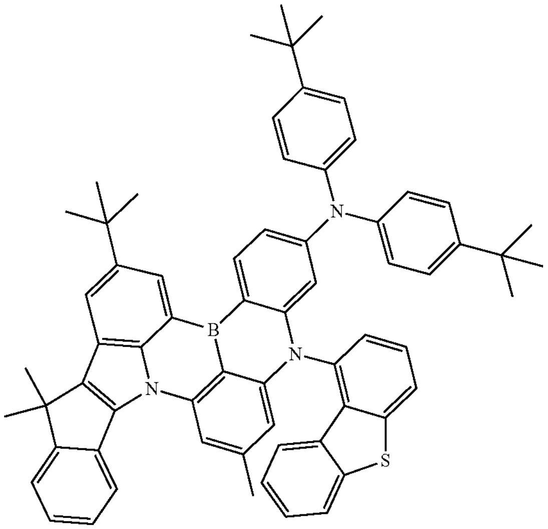

-continued
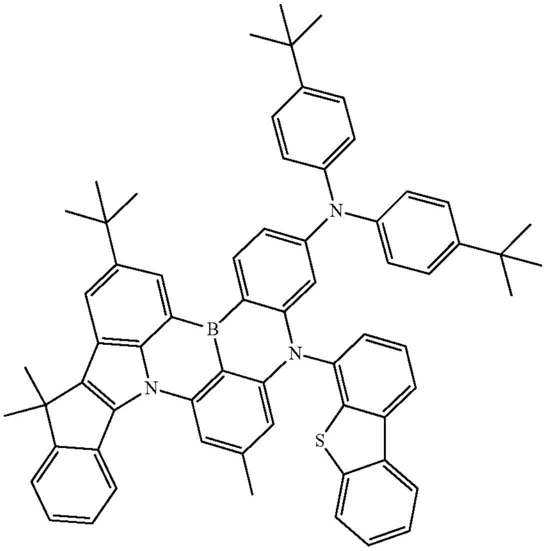
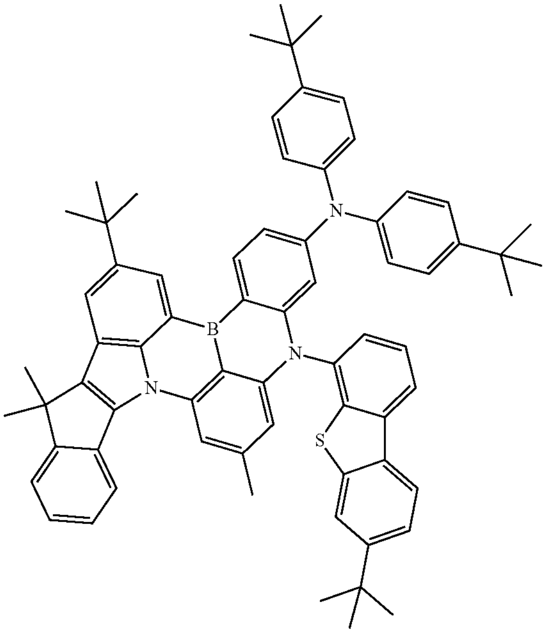
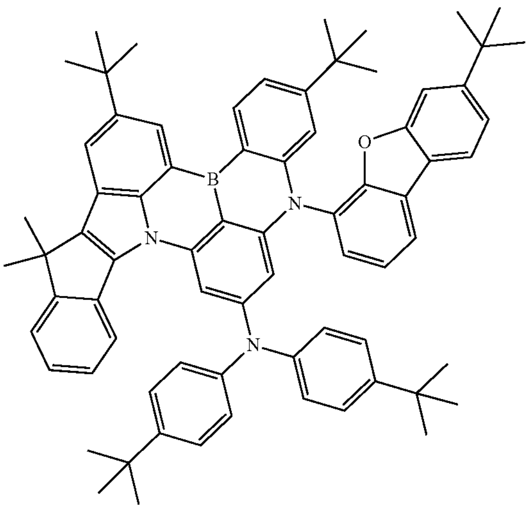
-continued
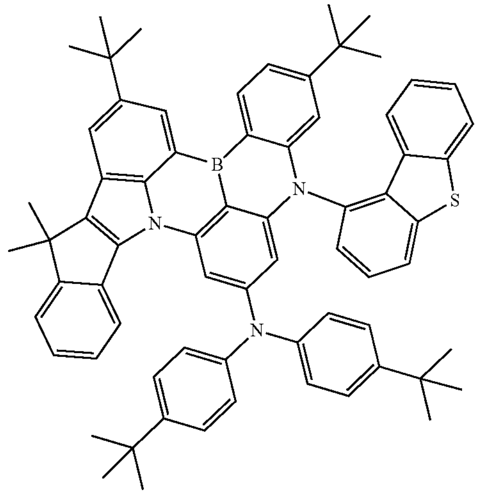
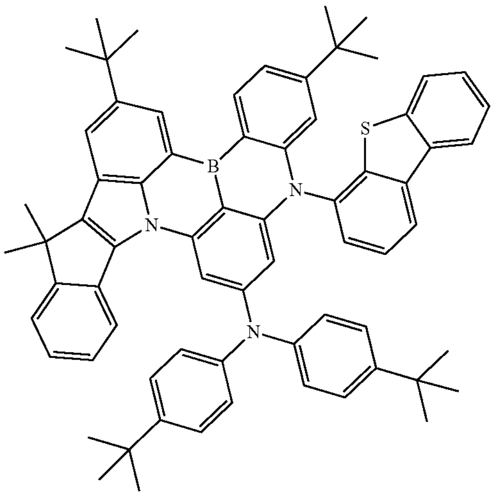
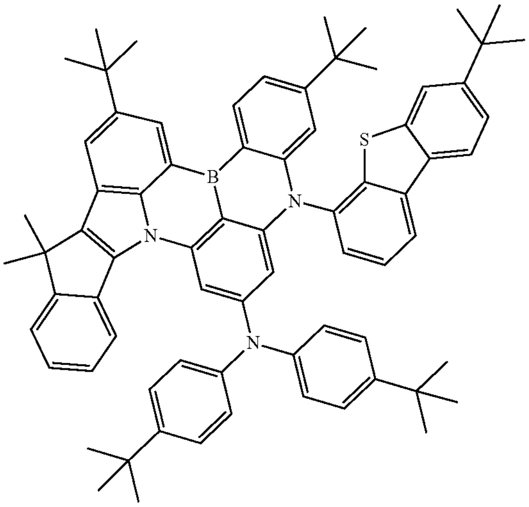

-continued
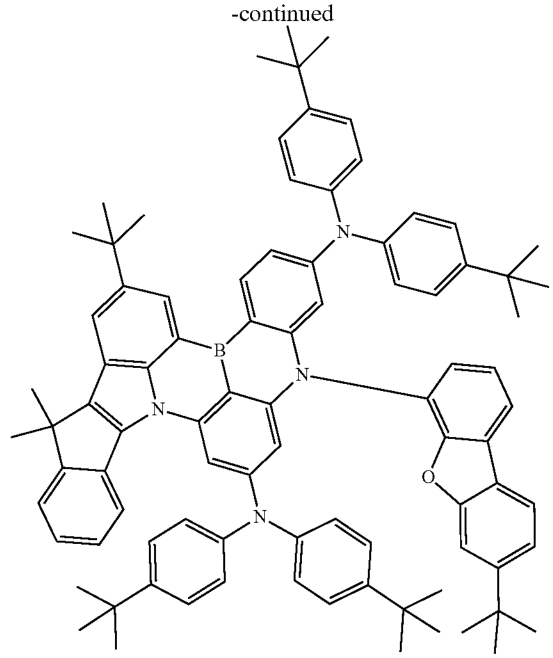
-continued
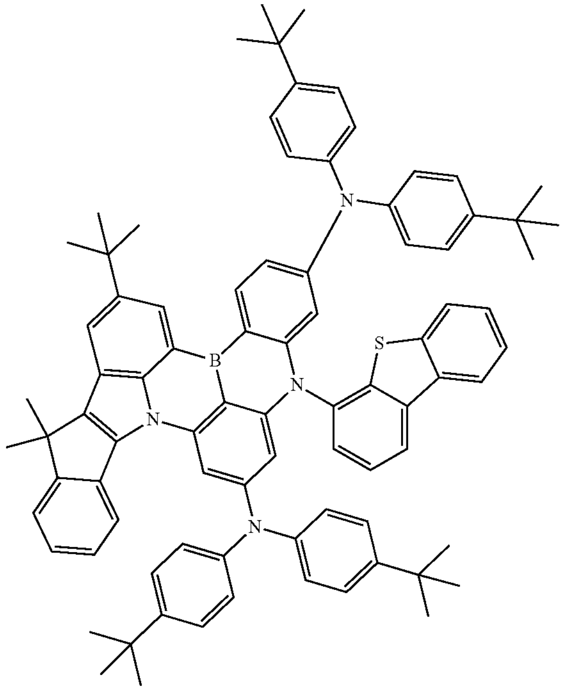
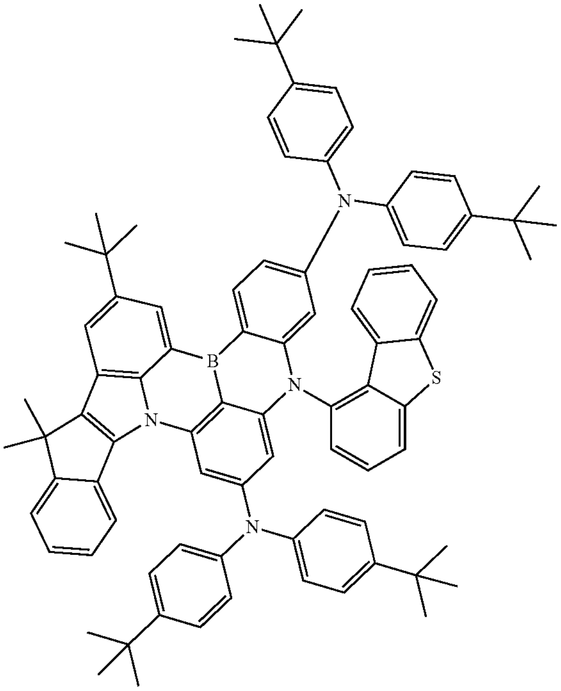
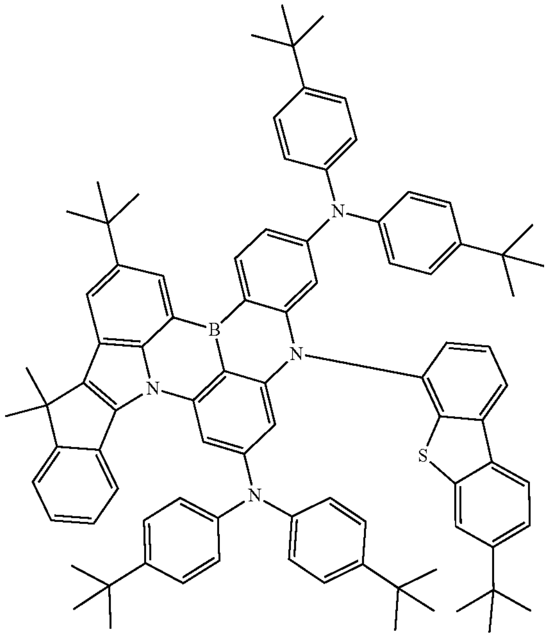

-continued
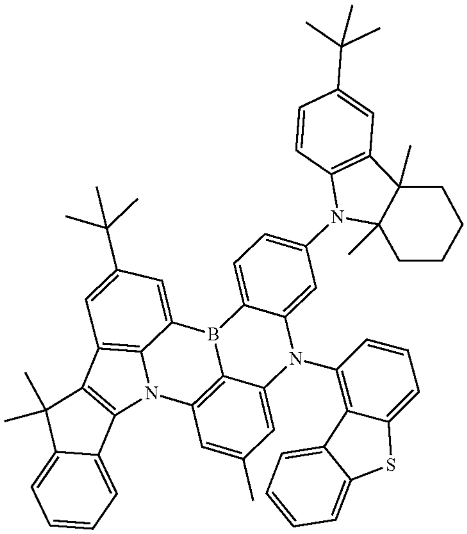
-continued
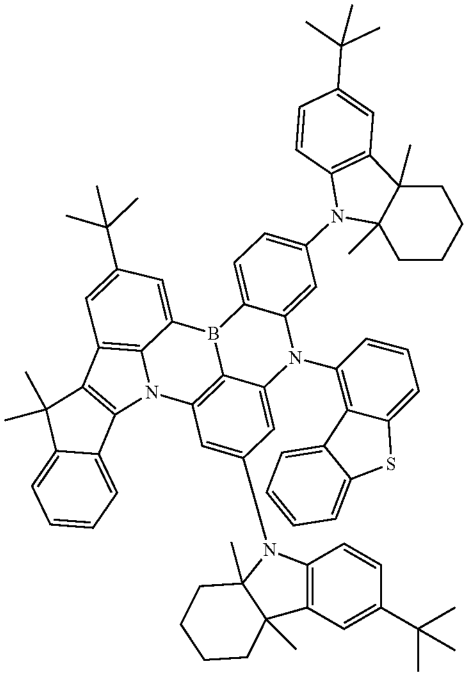
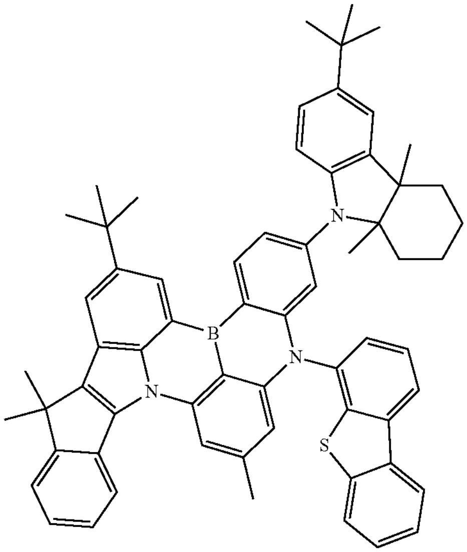
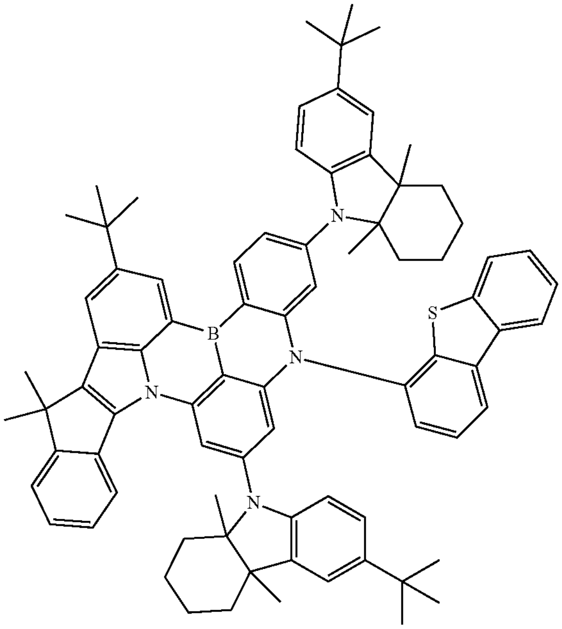

-continued
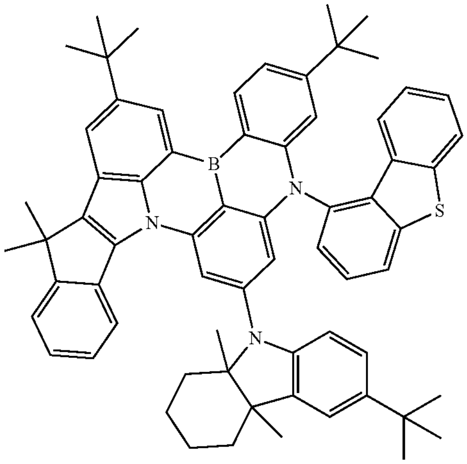
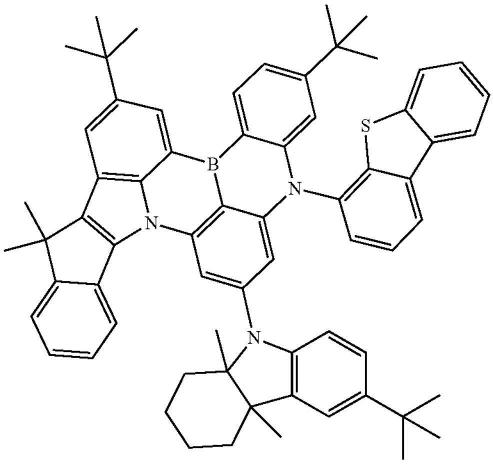
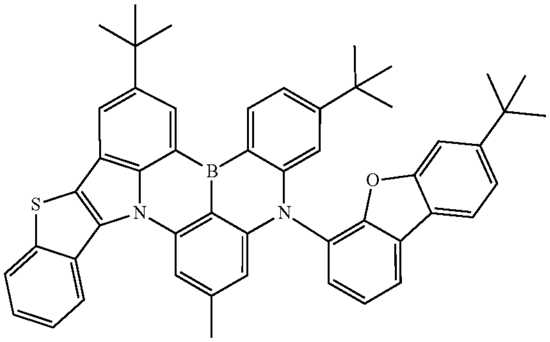
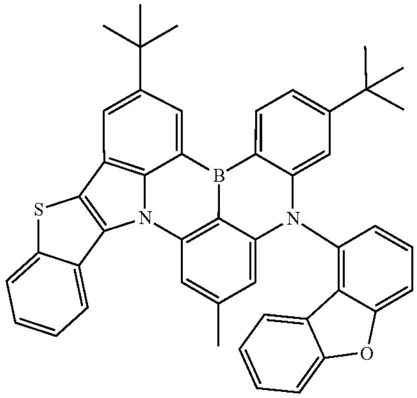
-continued
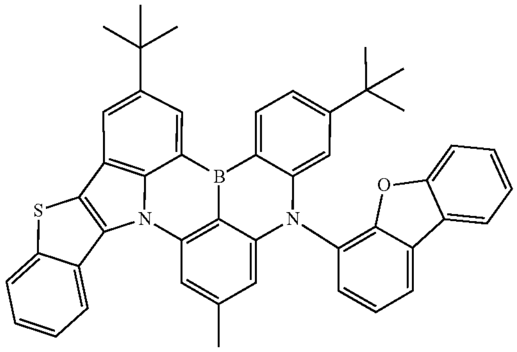
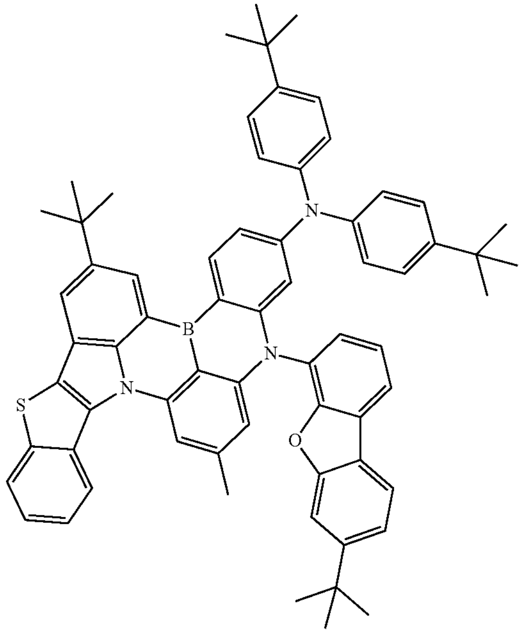
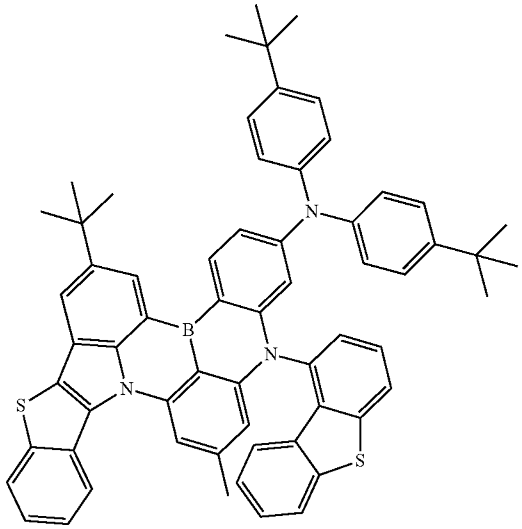

-continued
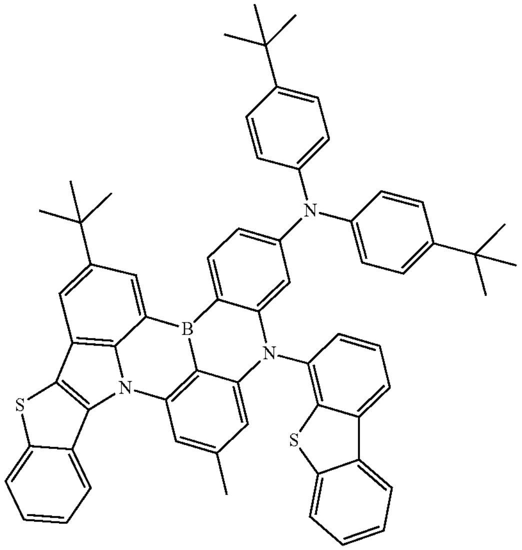
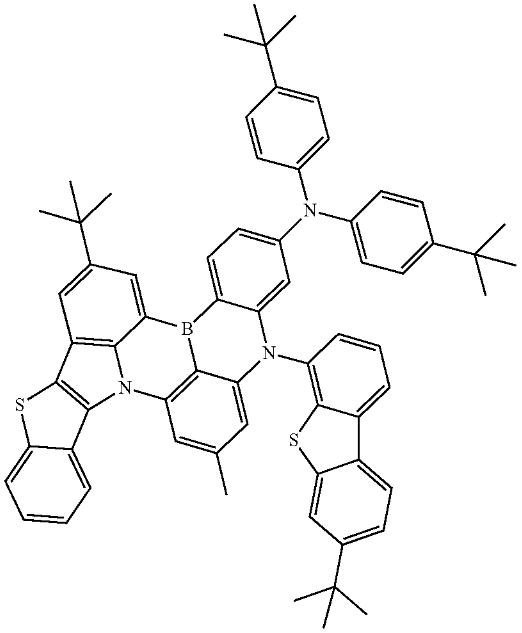
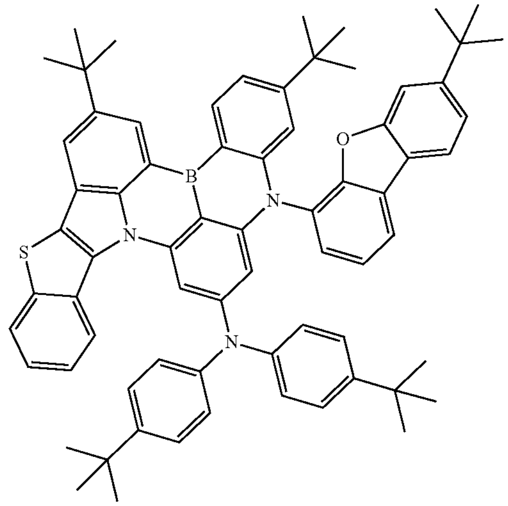
-continued
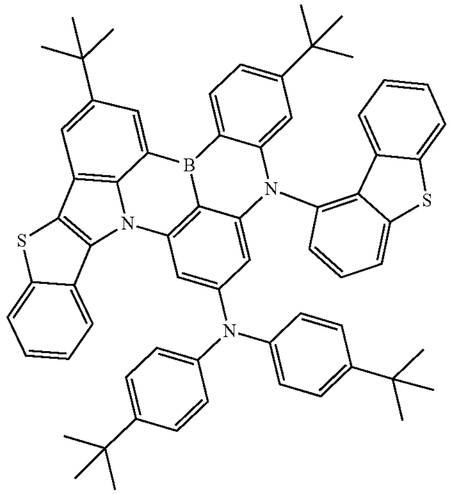
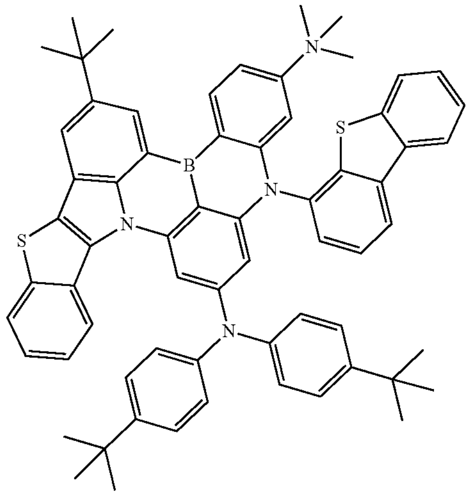
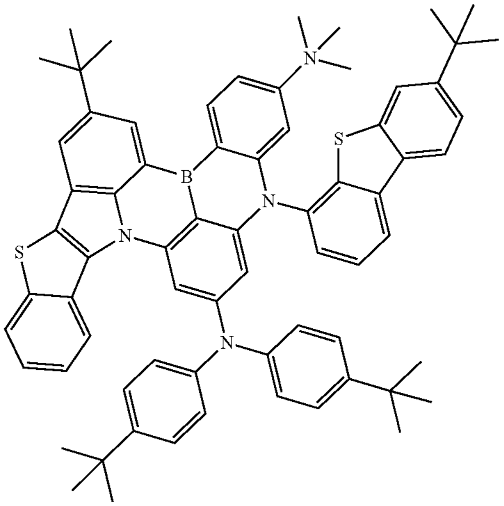

-continued
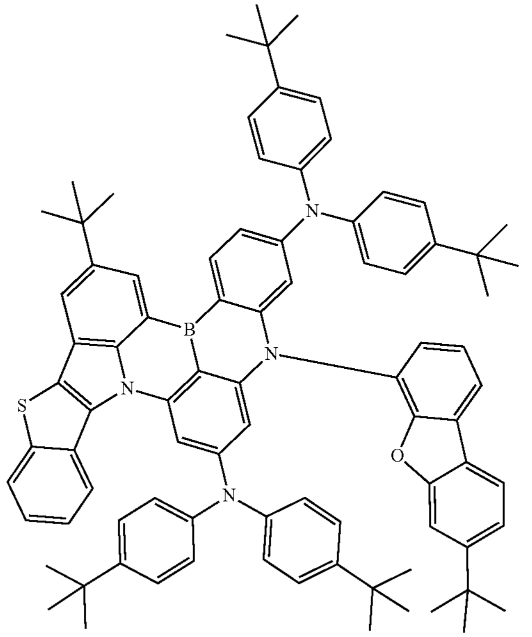
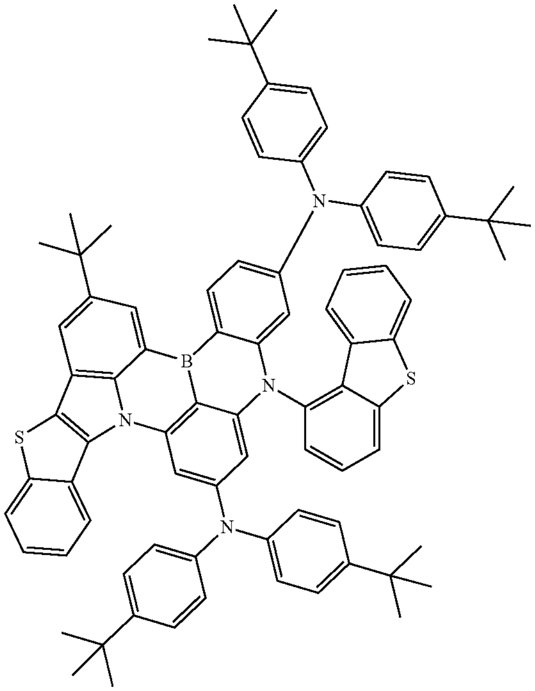
-continued
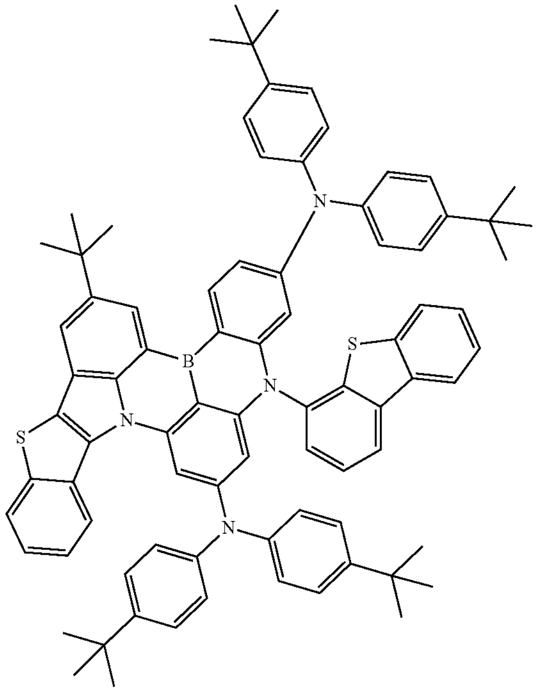
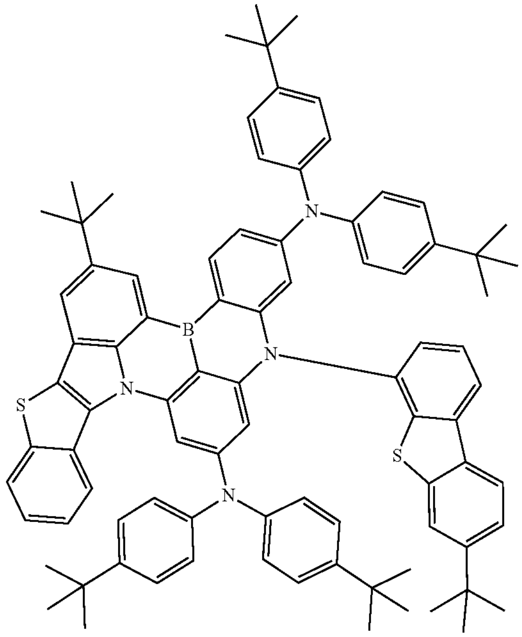

-continued
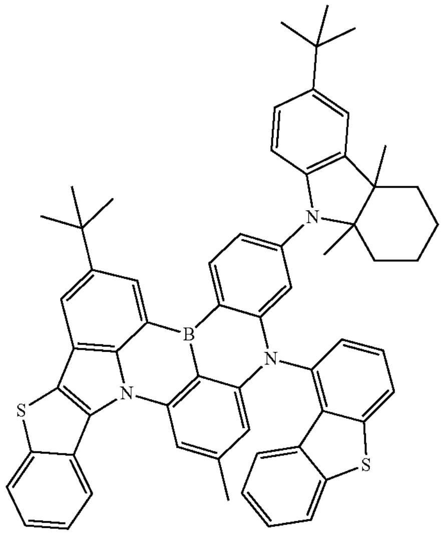
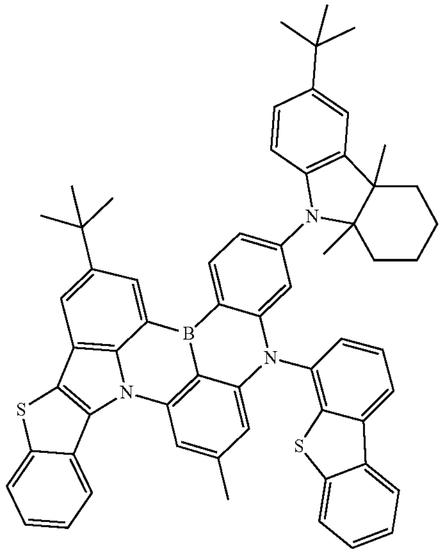
-continued
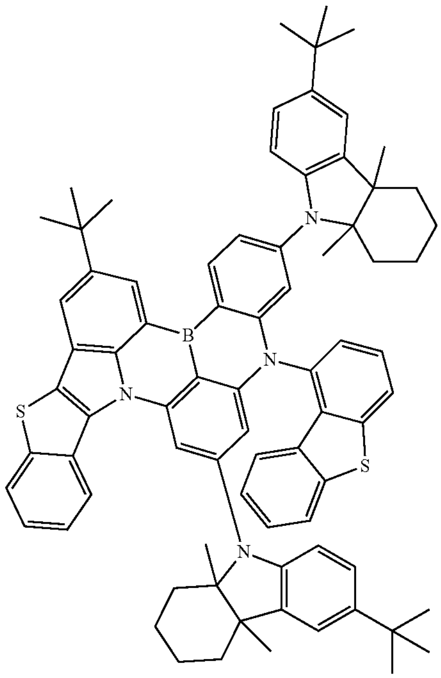
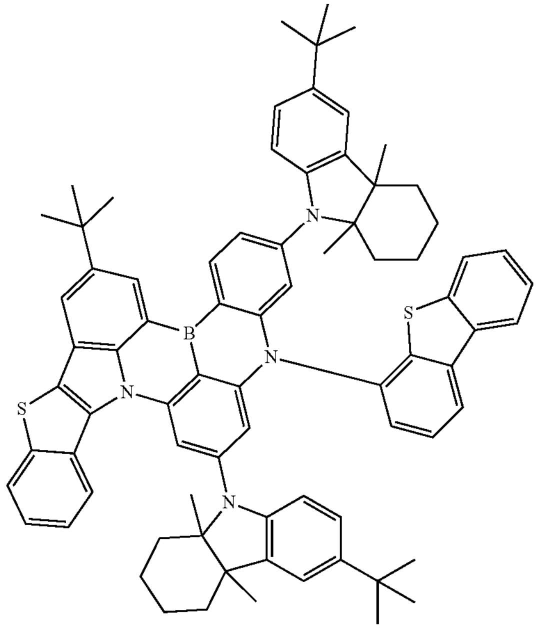

-continued
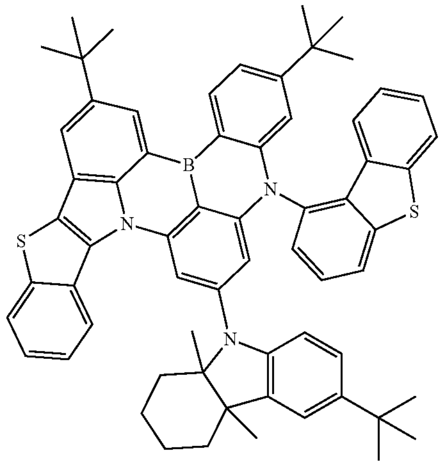
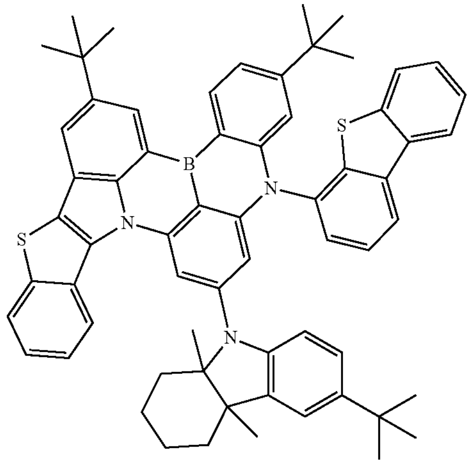
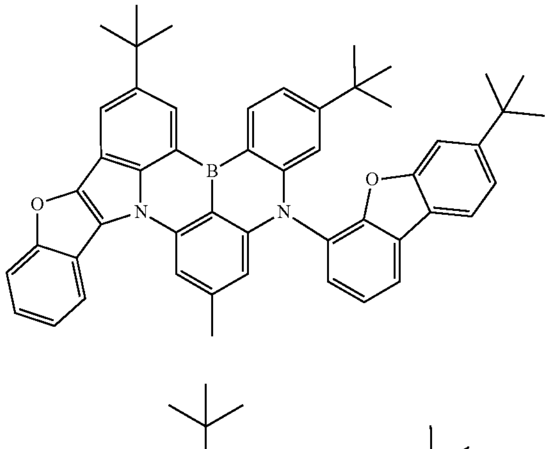
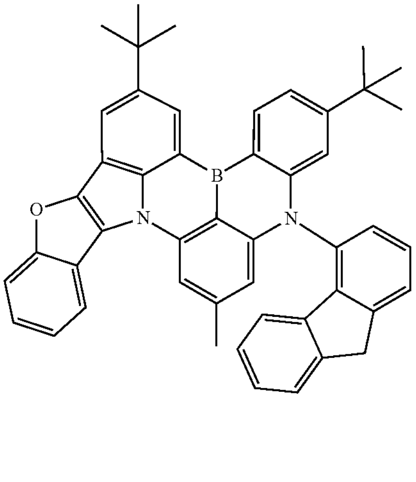
-continued
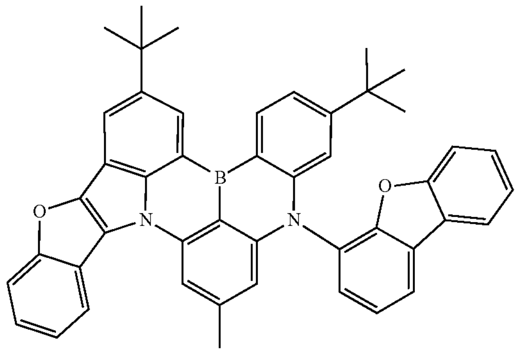
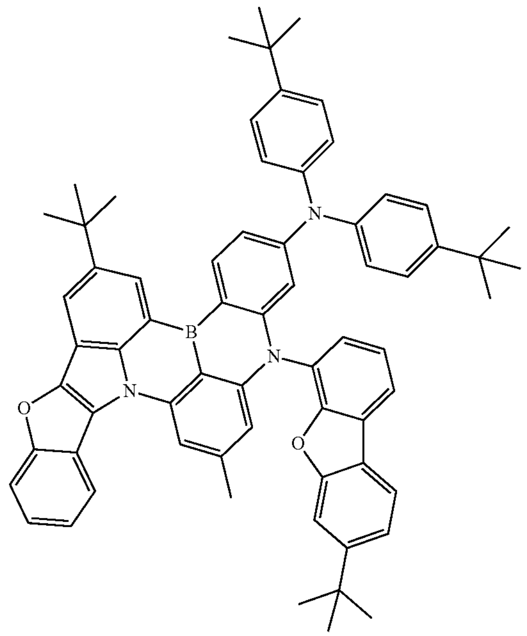
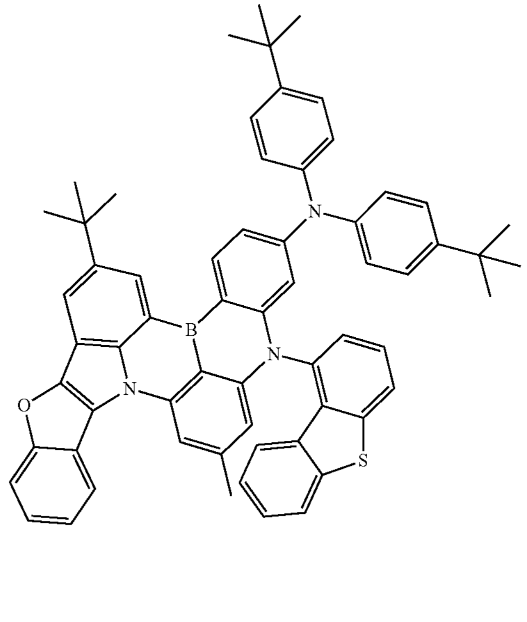

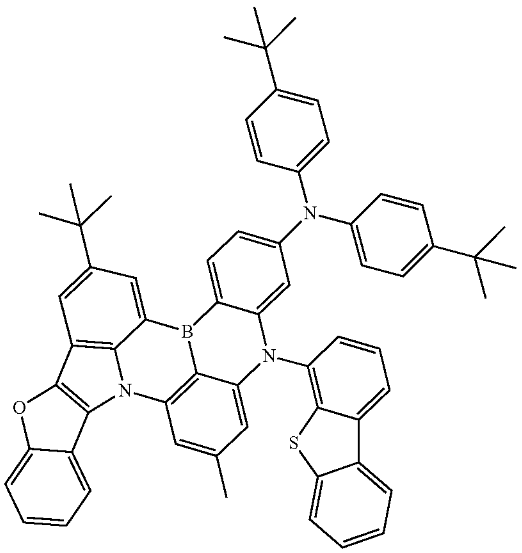
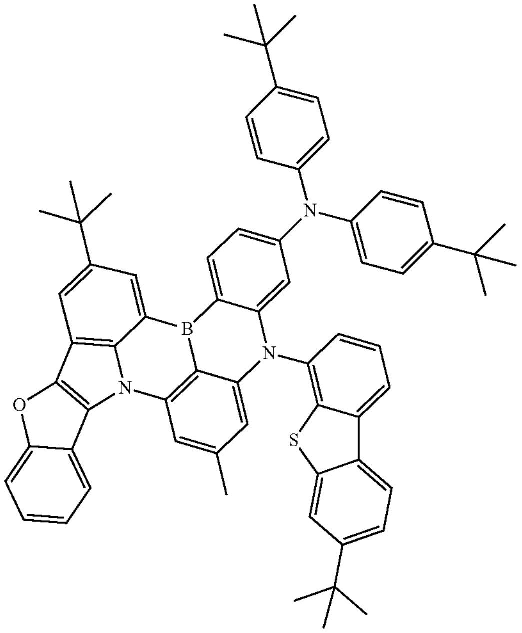
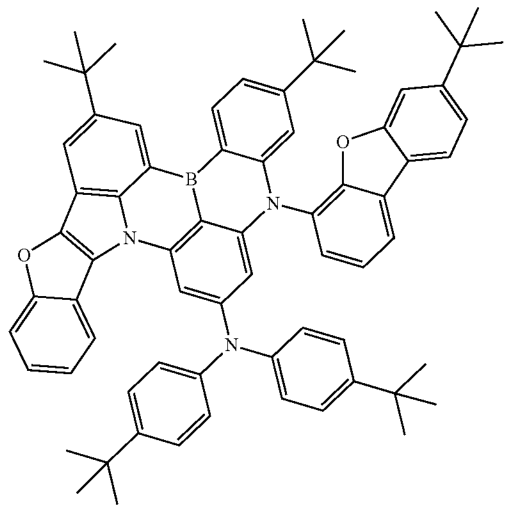
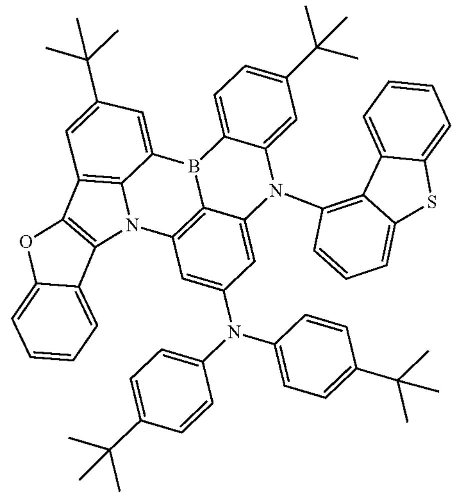
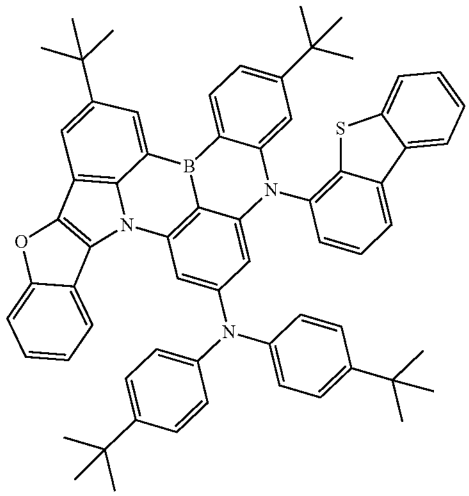
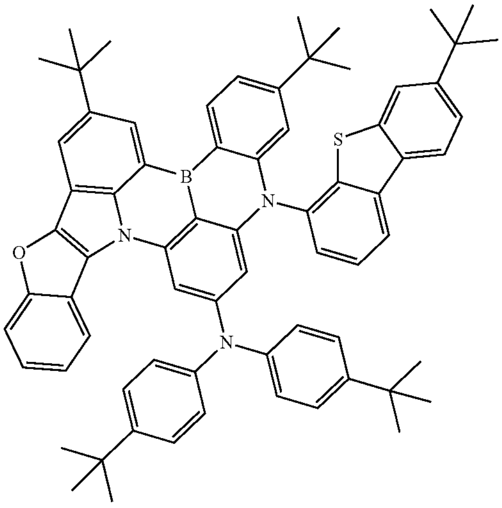

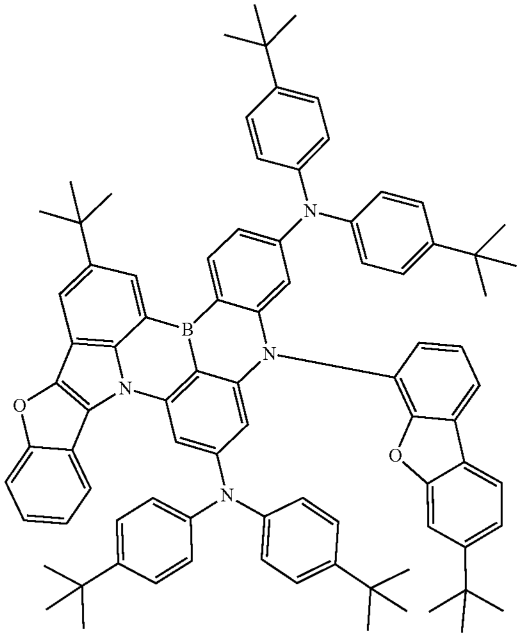
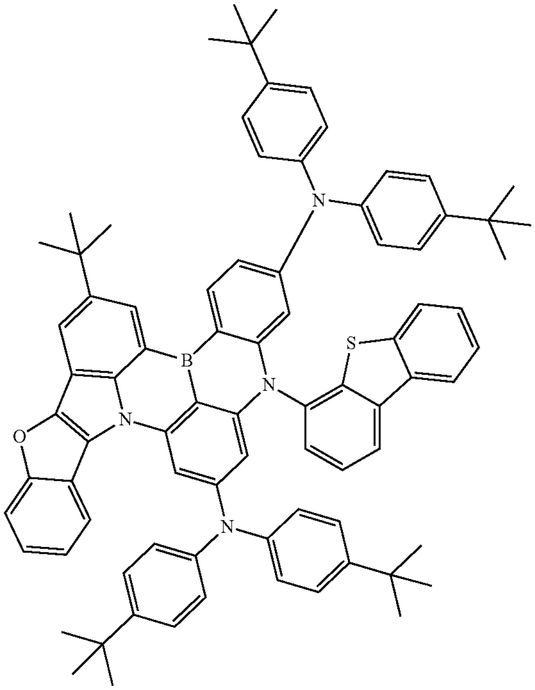
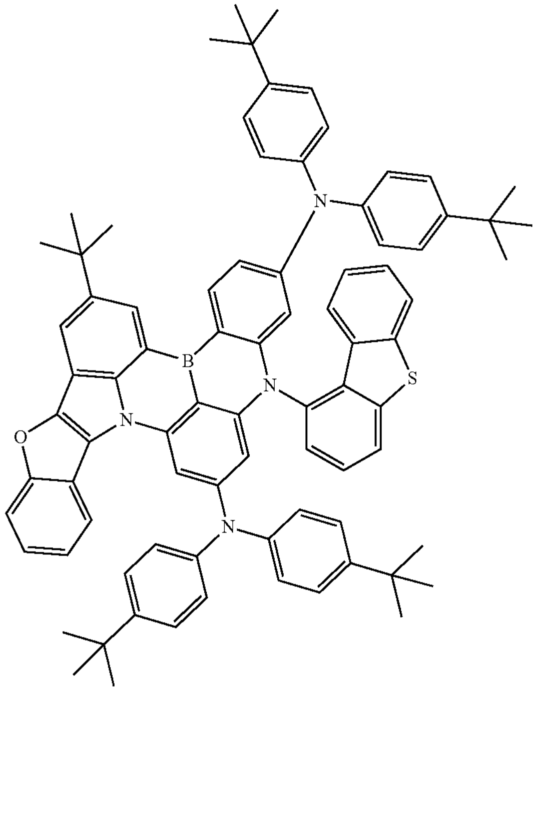
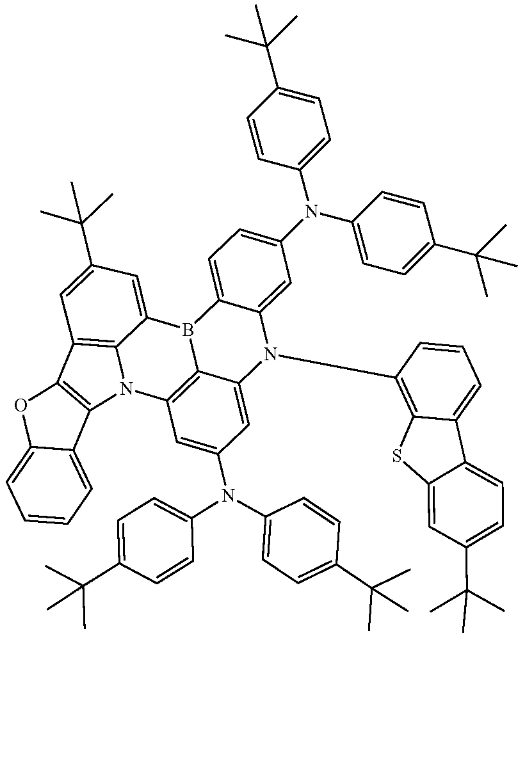

-continued
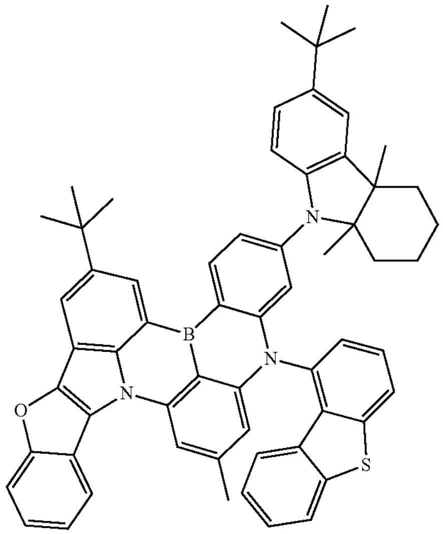
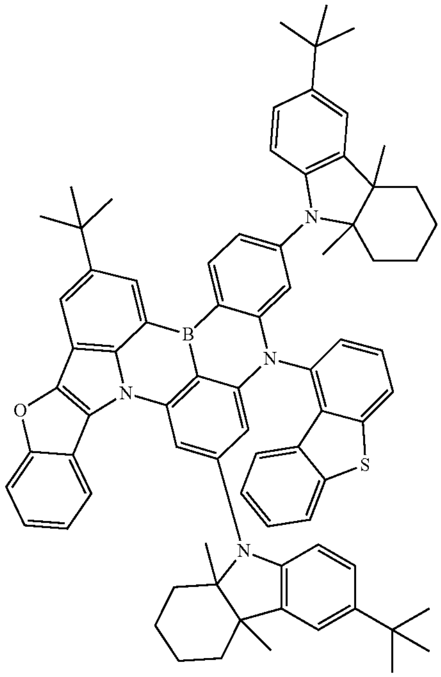
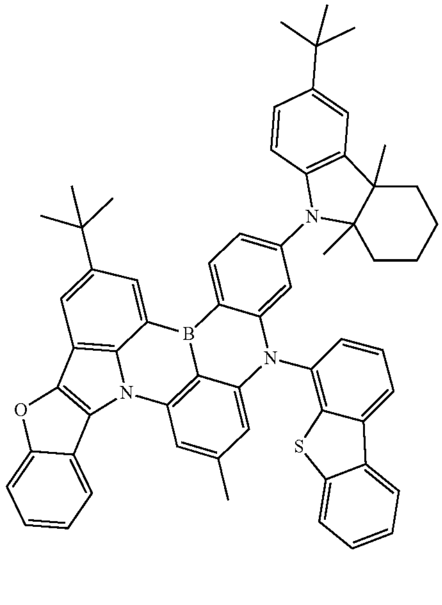
-continued
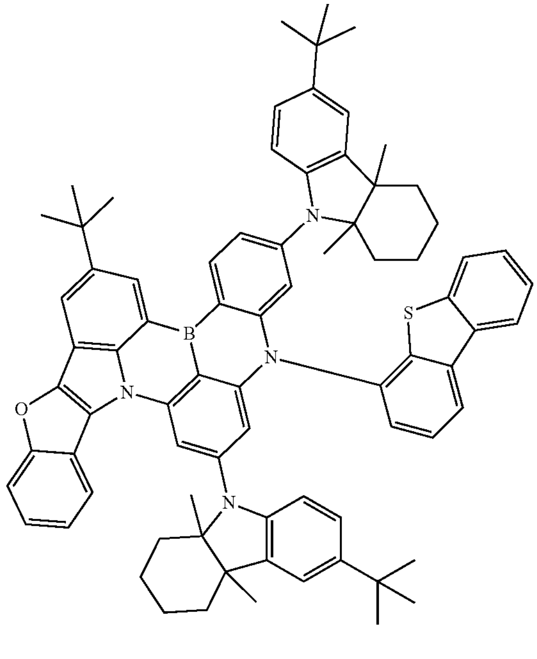

-continued
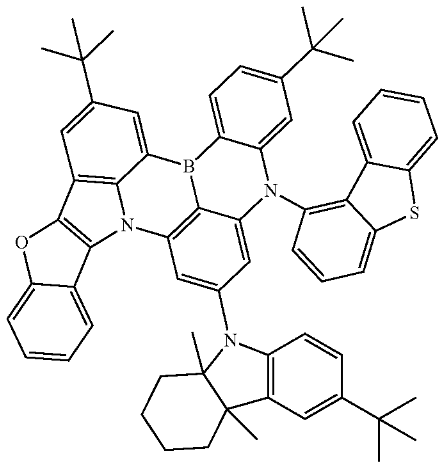
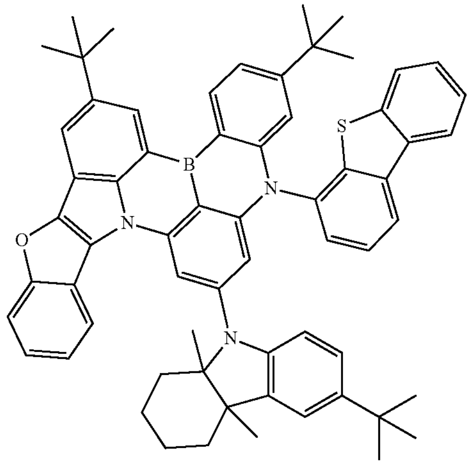
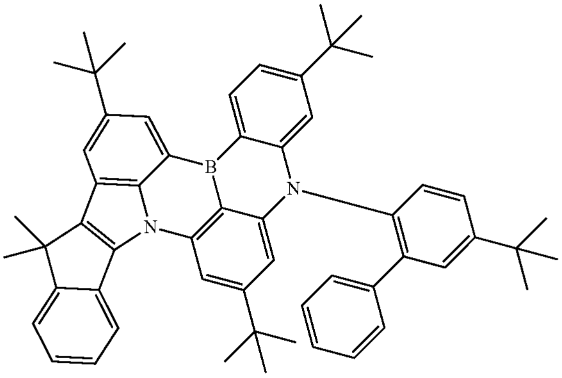
-continued
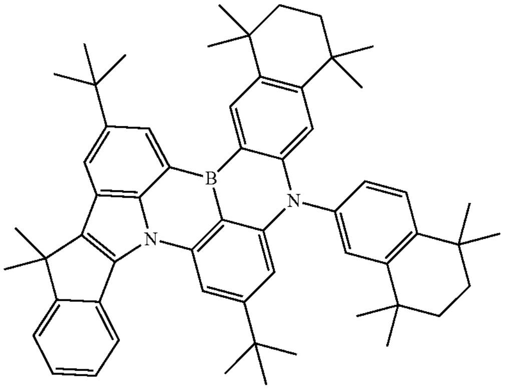
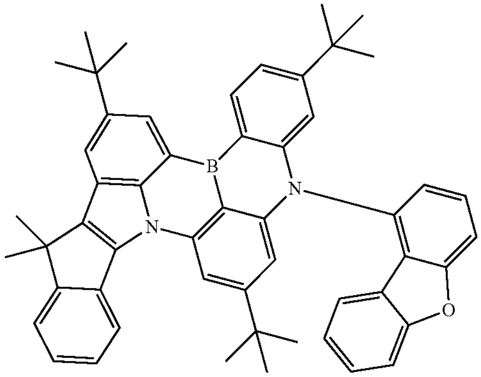
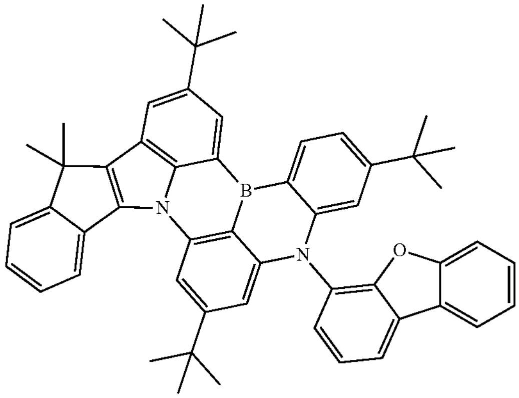
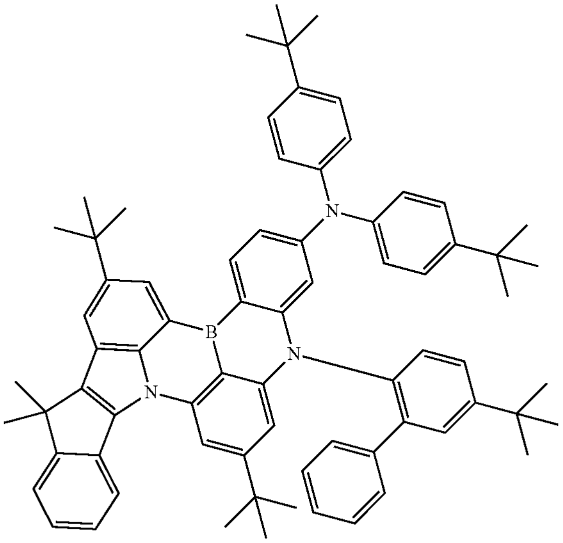

-continued
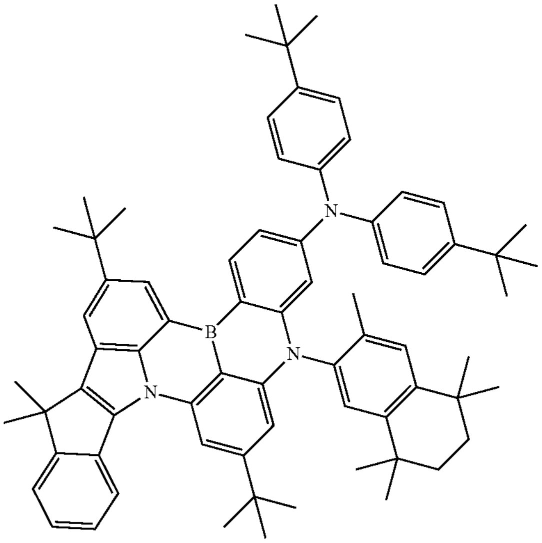
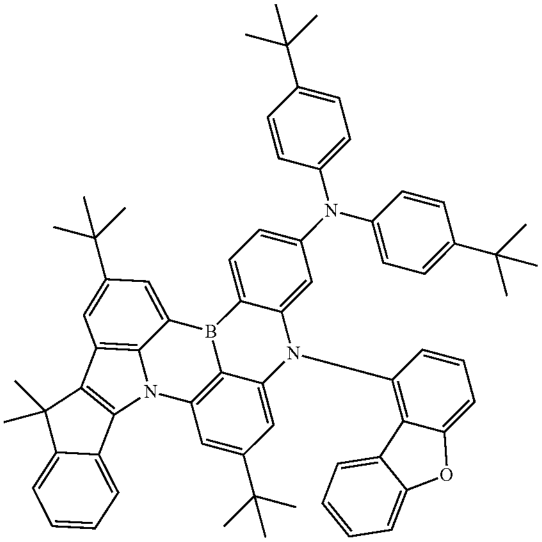
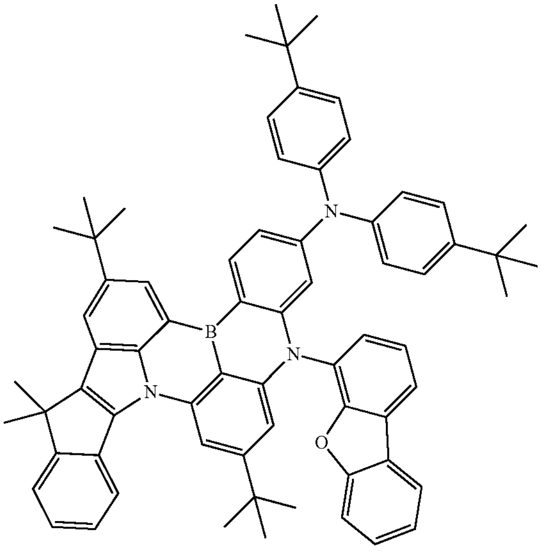 [SMILES: CC(C)(C)c1ccc(N(c2ccc(C(C)(C)C)cc2)c2ccc3c(c2)N(c2cccc4c2oc2ccccc24)c2cc(C(C)(C)C)cc4c2B3c2cc(C(C)(C)C)cc3c5c(n-4c23)-c2ccccc2C5(C)C)cc1]
-continued
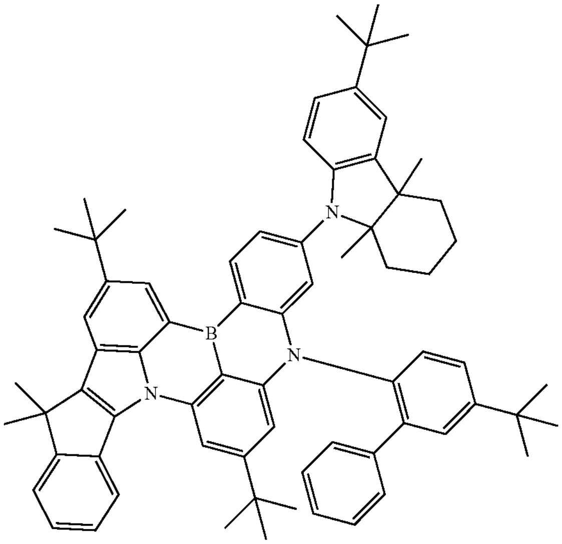
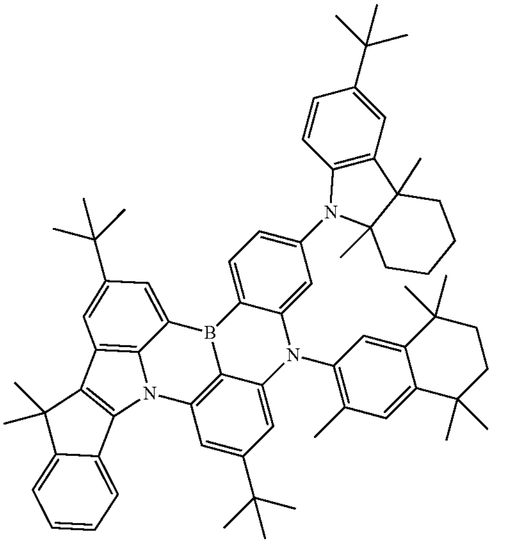
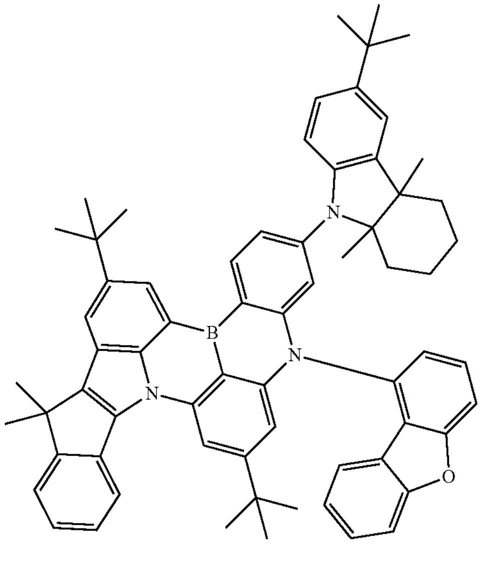

-continued
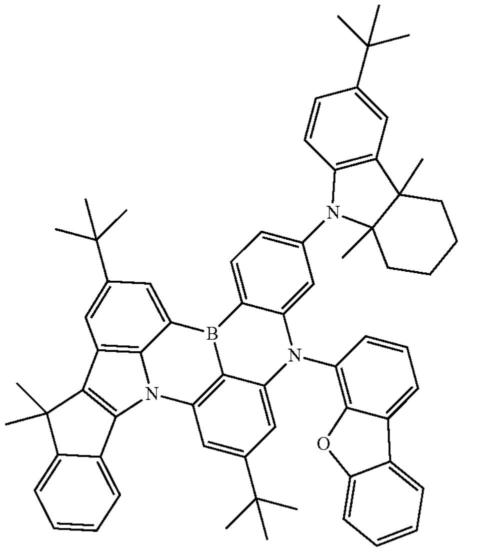 [SMILES: CC(C)(C)c1cc2c3c(c1)-n1c4c(c5cc(C(C)(C)C)cc(c51)B3c1ccc(N3c5ccc(C(C)(C)C)cc5C5(C)CCCCC35C)cc1N2c1cccc2c1oc1ccccc12)C(C)(C)c1ccccc1-4]
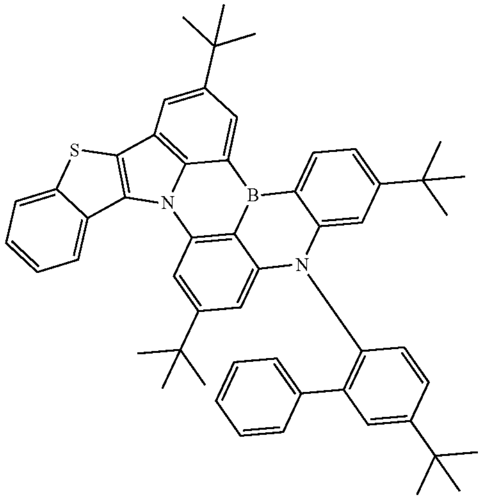
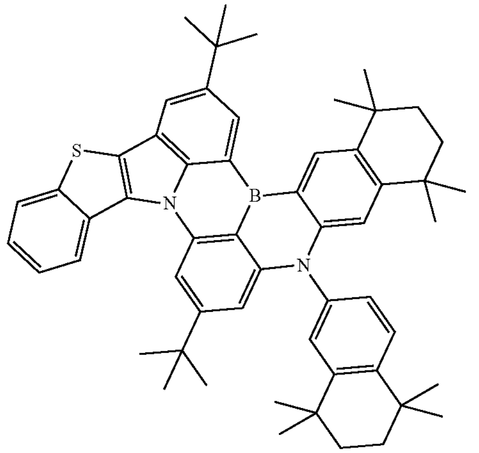
-continued
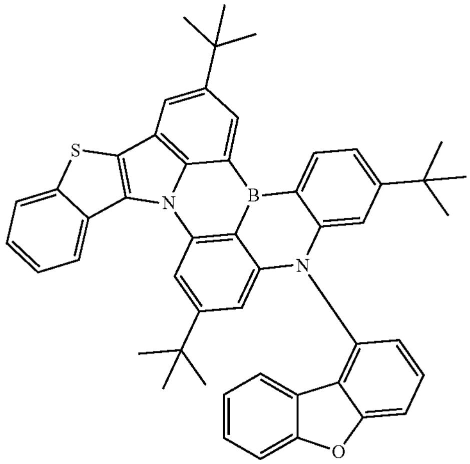
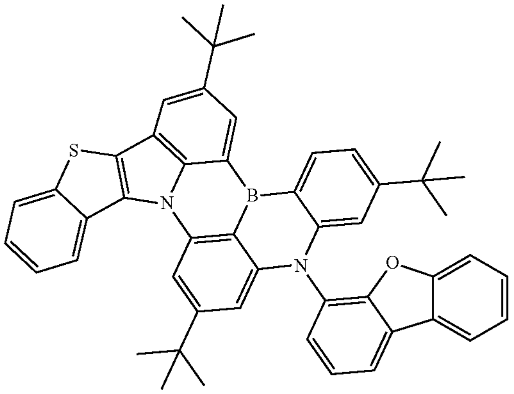
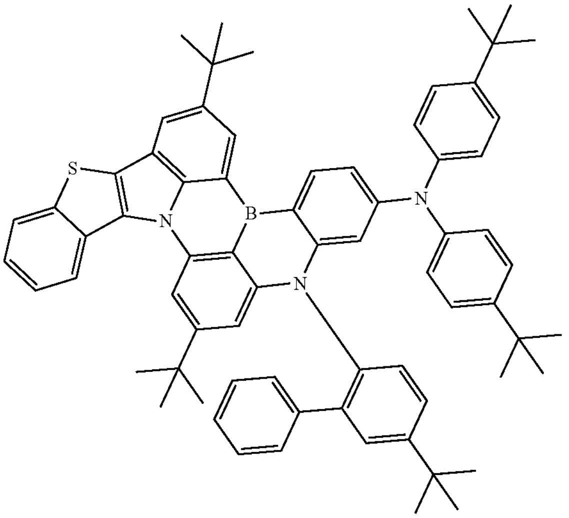

-continued
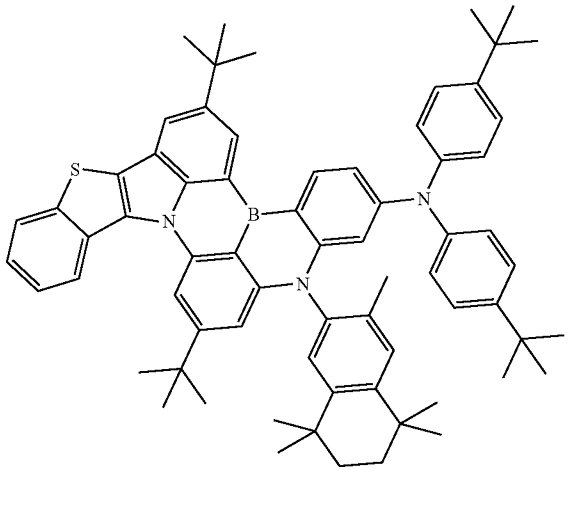
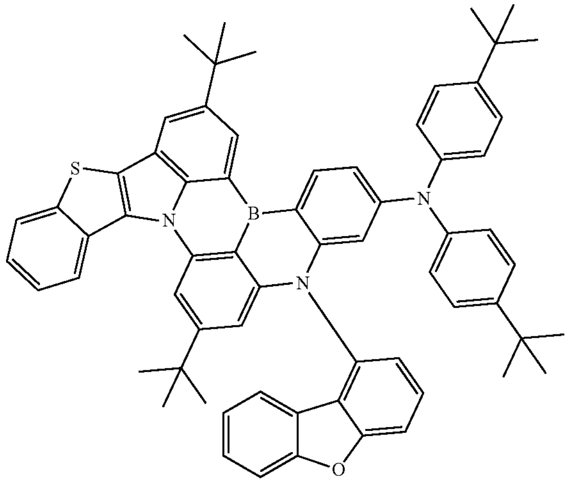
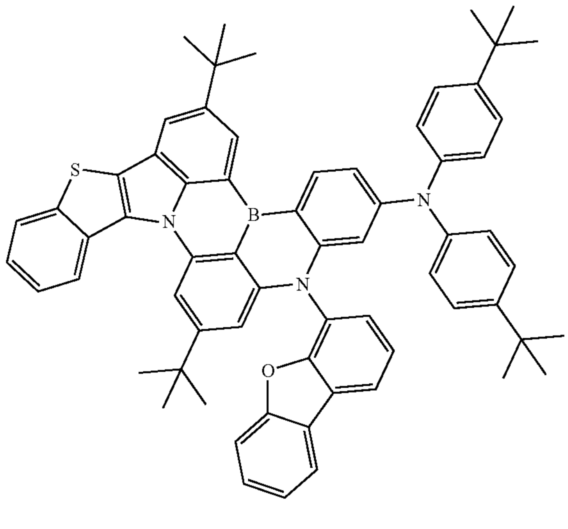 [SMILES: CC(C)(C)c1ccc(N(c2ccc(C(C)(C)C)cc2)c2ccc3c(c2)N(c2cccc4c2oc2ccccc24)c2cc(C(C)(C)C)cc4c2B3c2cc(C(C)(C)C)cc3c5sc6ccccc6c5n-4c23)cc1]
-continued
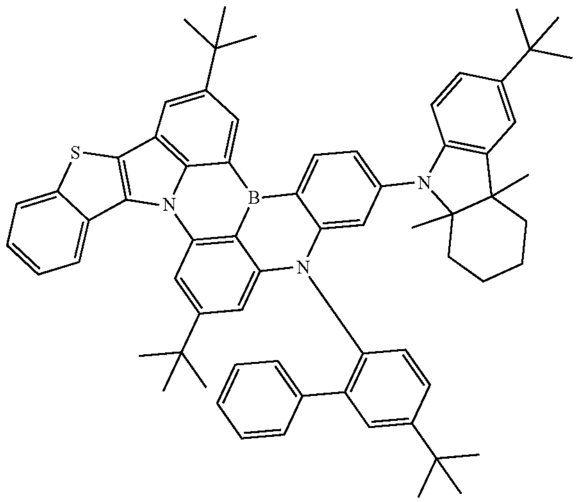
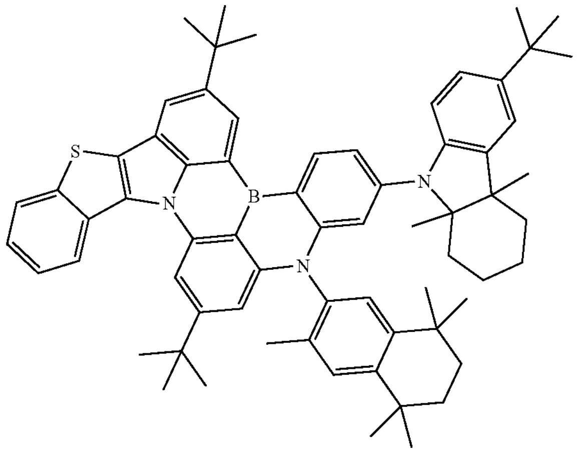
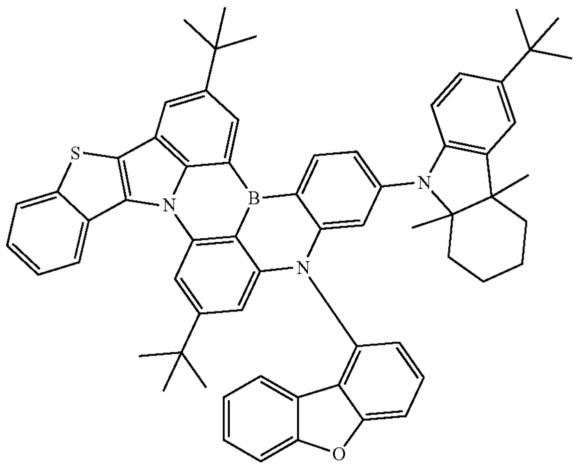

-continued
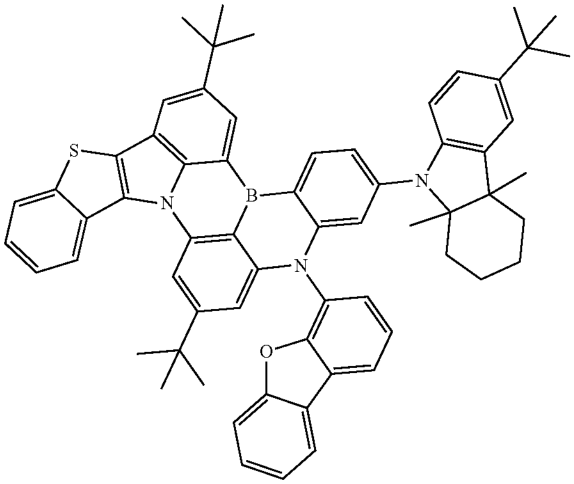 [SMILES: CC(C)(C)c1cc2c3c(c1)-n1c4c(cc(C(C)(C)C)cc4c4sc5ccccc5c41)B3c1ccc(N3c4ccc(C(C)(C)C)cc4C4(C)CCCCC34C)cc1N2c1cccc2c1oc1ccccc12]
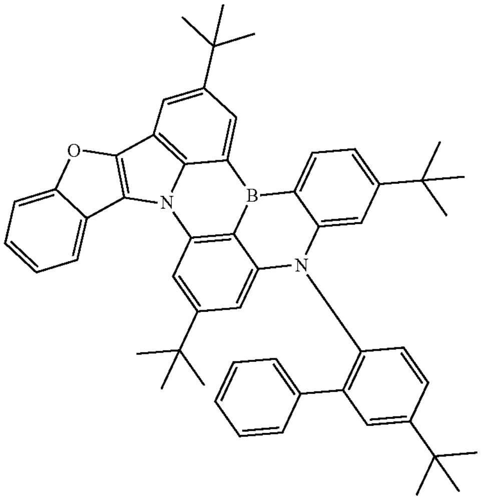
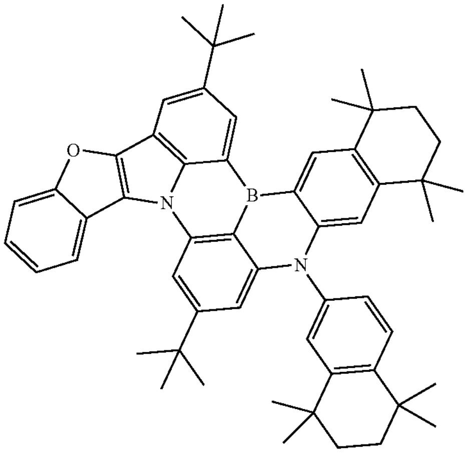
-continued
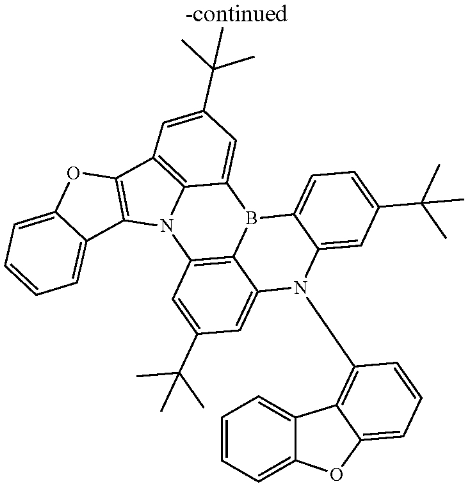
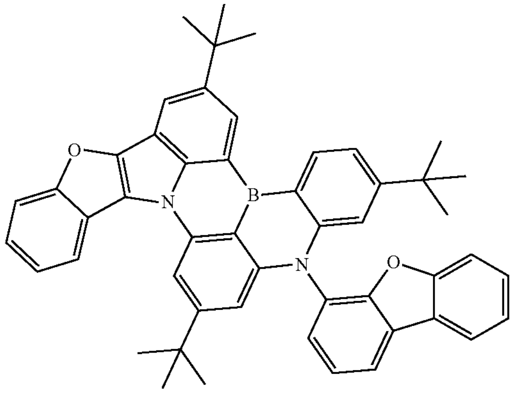 [SMILES: CC(C)(C)c1ccc2c(c1)N(c1cccc3c1oc1ccccc13)c1cc(C(C)(C)C)cc3c1B2c1cc(C(C)(C)C)cc2c4oc5ccccc5c4n-3c12]
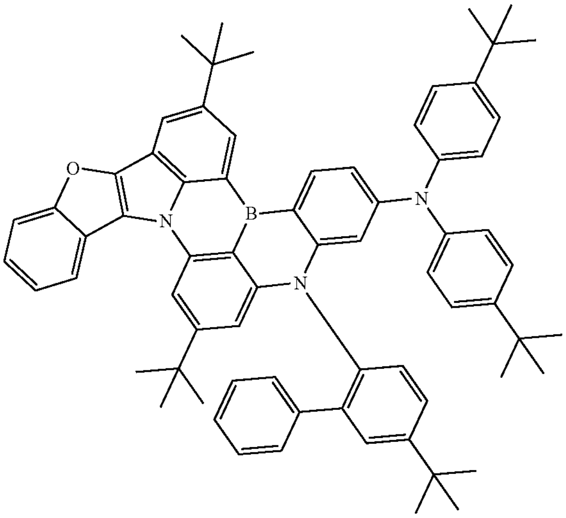

-continued
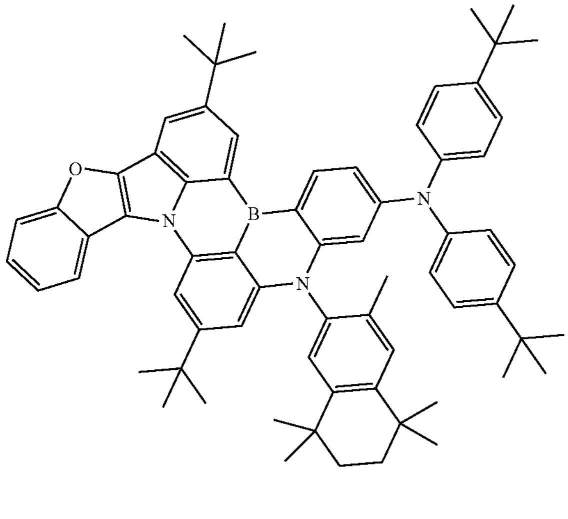
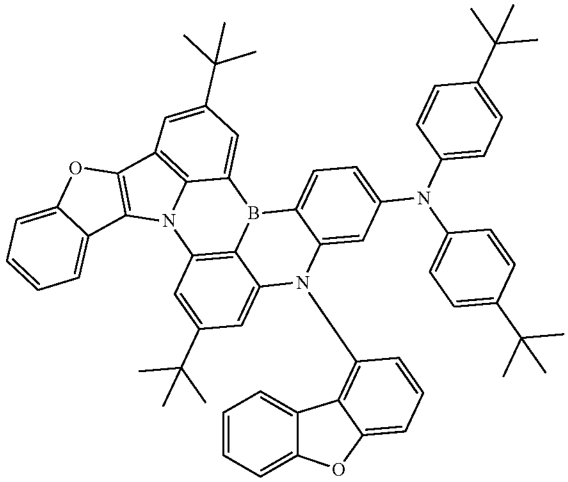
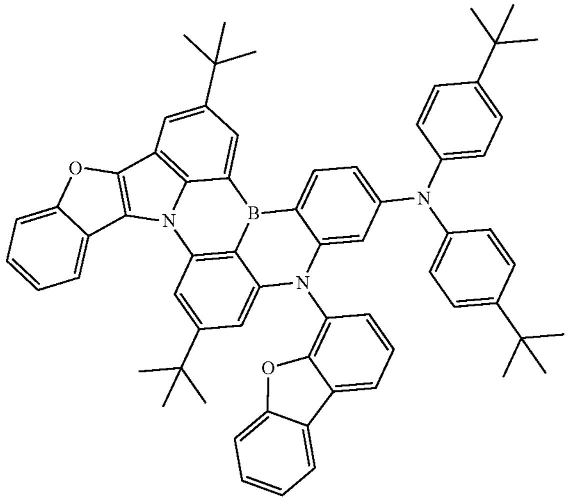 [SMILES: CC(C)(C)c1ccc(N(c2ccc(C(C)(C)C)cc2)c2ccc3c(c2)N(c2cccc4c2oc2ccccc24)c2cc(C(C)(C)C)cc4c2B3c2cc(C(C)(C)C)cc3c5oc6ccccc6c5n-4c23)cc1]
-continued
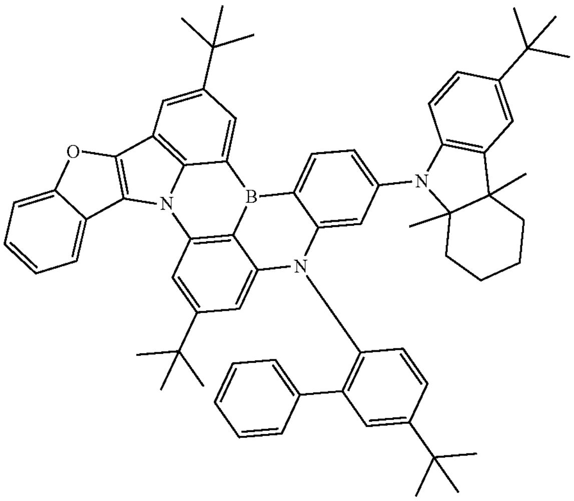
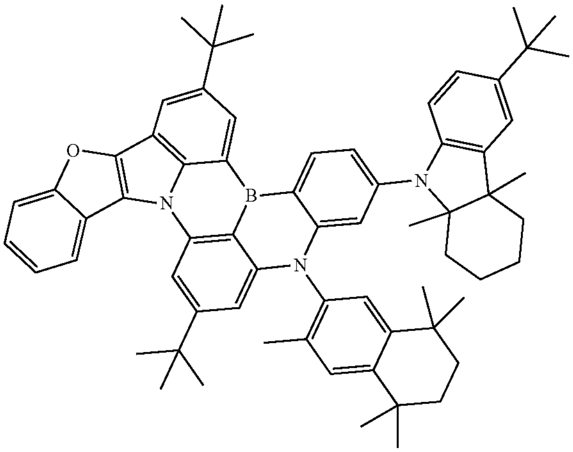
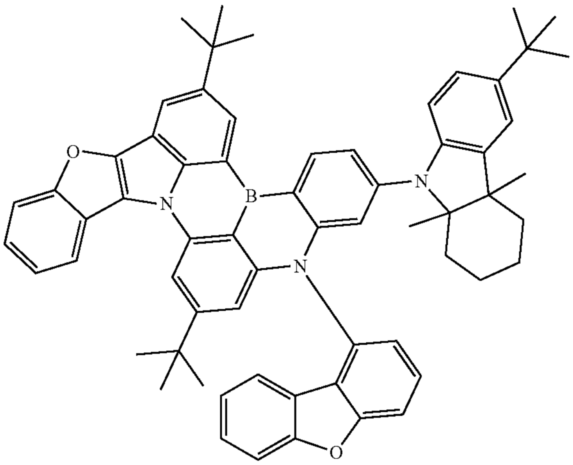

-continued
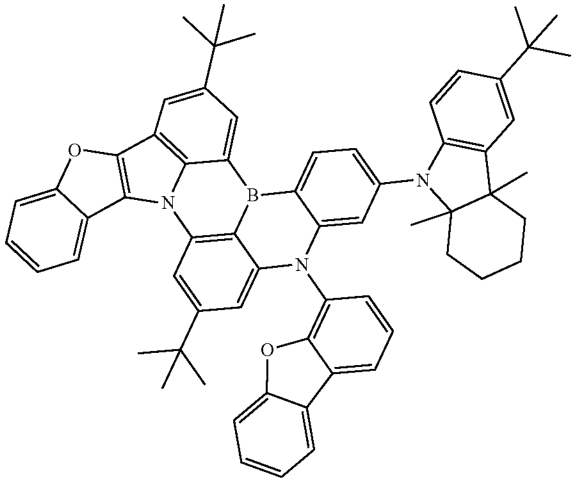 [SMILES: CC(C)(C)c1cc2c3c(c1)-n1c4c(cc(C(C)(C)C)cc4c4oc5ccccc5c41)B3c1ccc(N3c4ccc(C(C)(C)C)cc4C4(C)CCCCC34C)cc1N2c1cccc2c1oc1ccccc12]
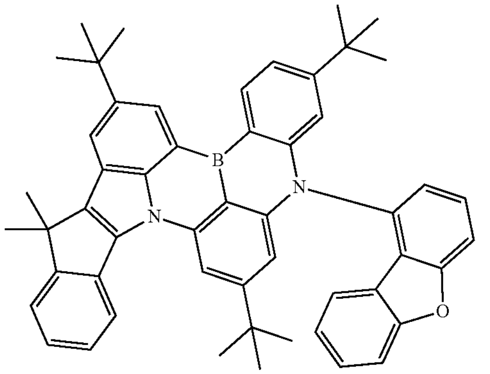
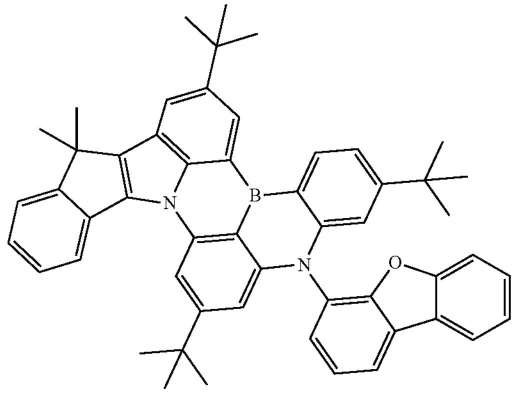
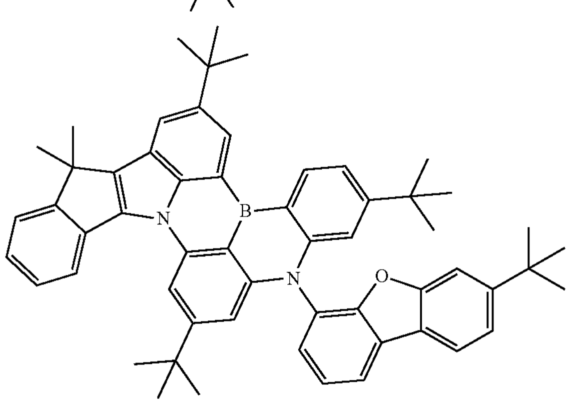
-continued
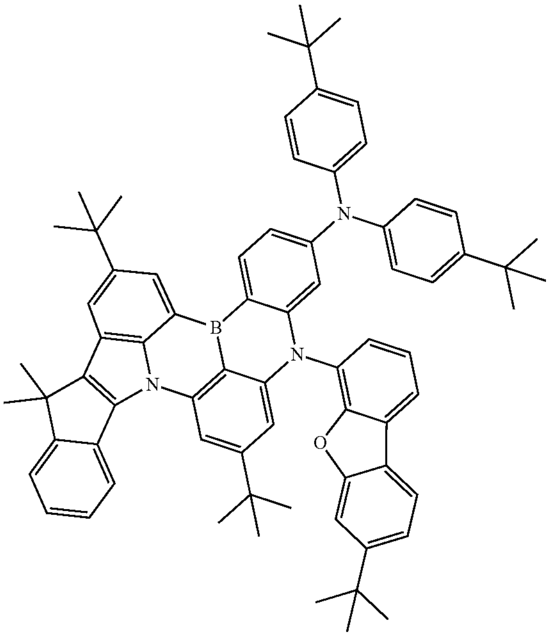 [SMILES: CC(C)(C)c1ccc(N(c2ccc(C(C)(C)C)cc2)c2ccc3c(c2)N(c2cccc4c2sc2cc(C(C)(C)C)ccc24)c2cc(C(C)(C)C)cc4c2B3c2cc(C(C)(C)C)cc3c5c(n-4c23)-c2ccccc2C5(C)C)cc1]
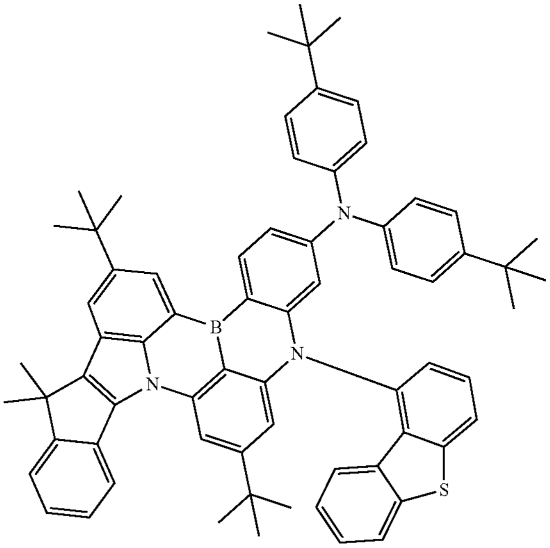

-continued
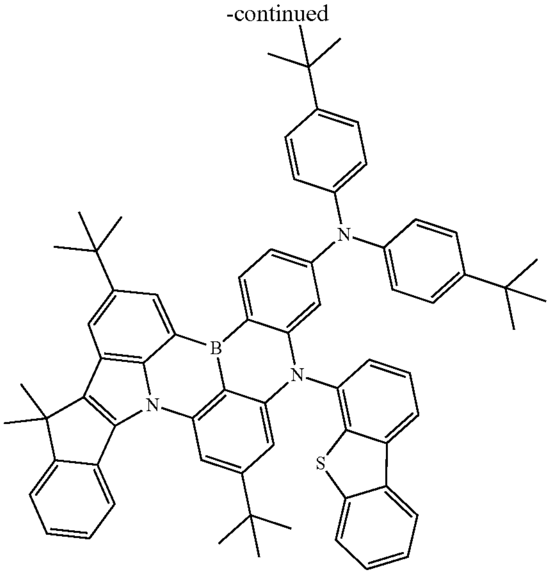
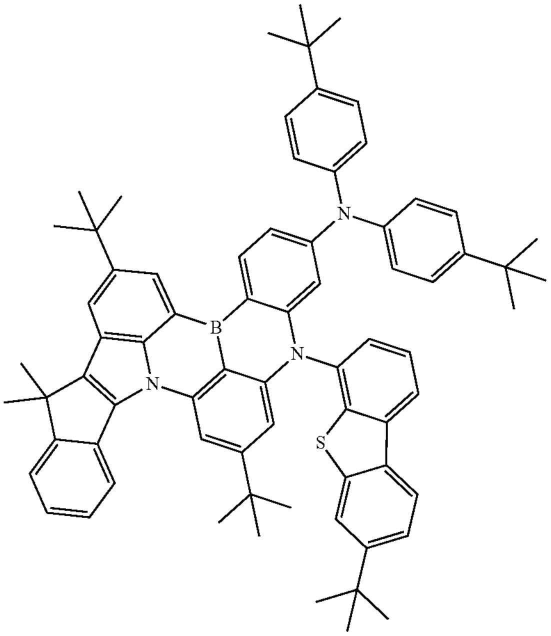
-continued
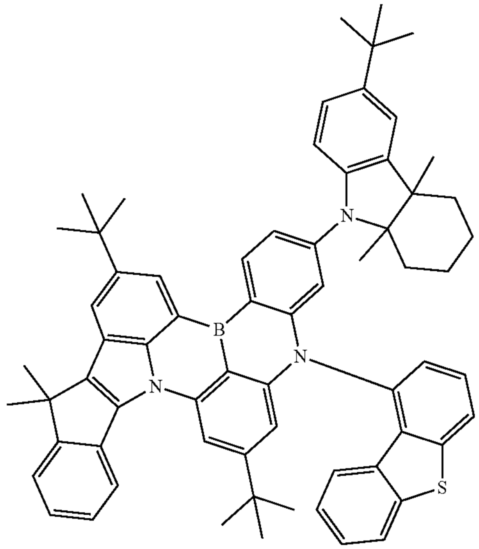
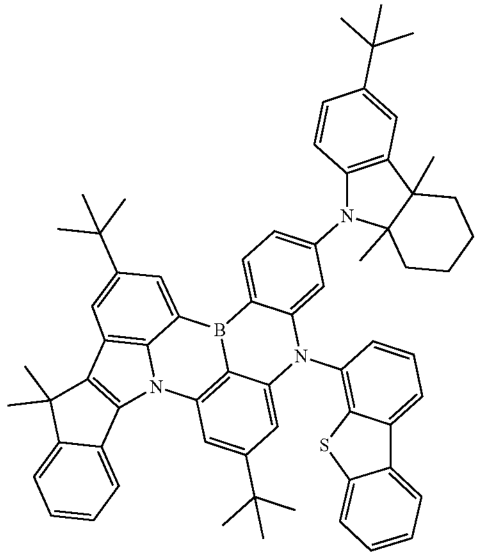
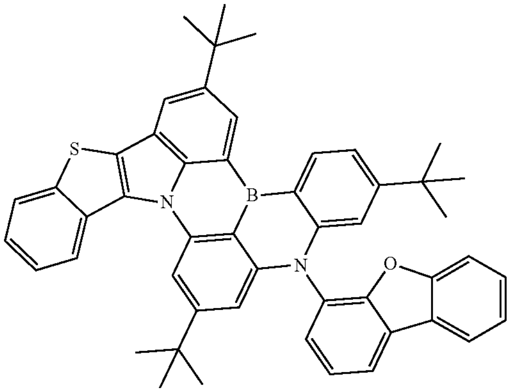

-continued
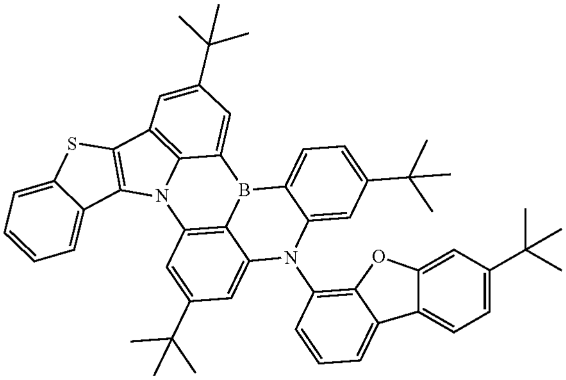
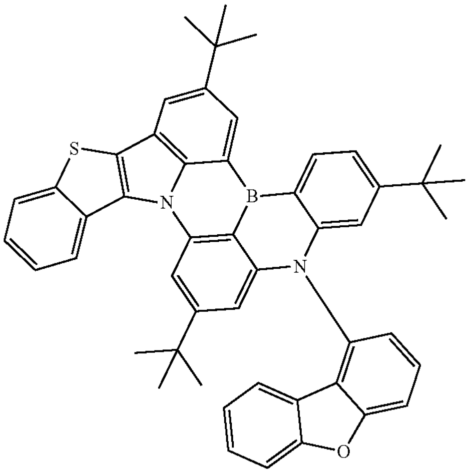
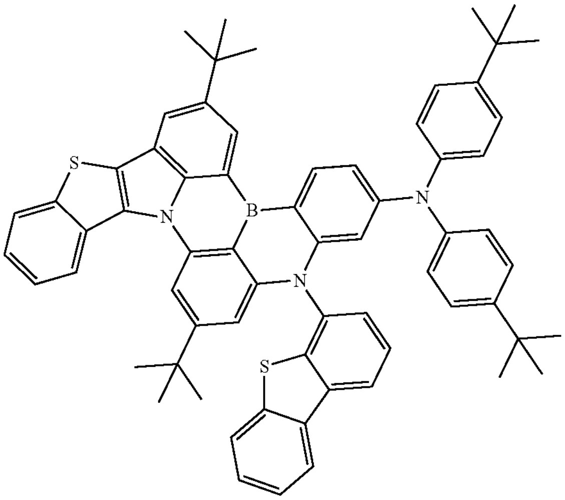
-continued
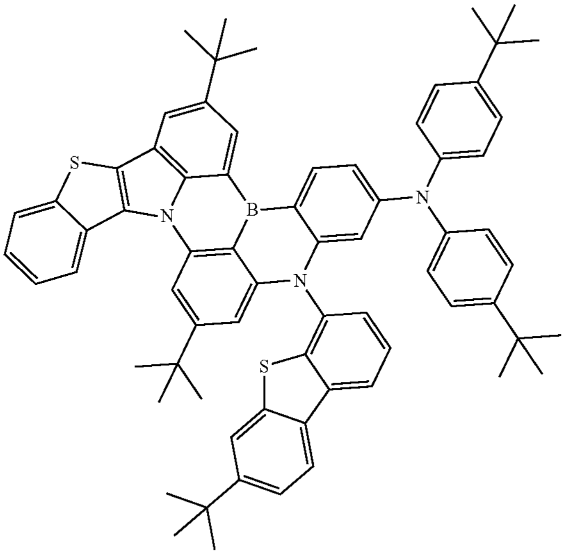
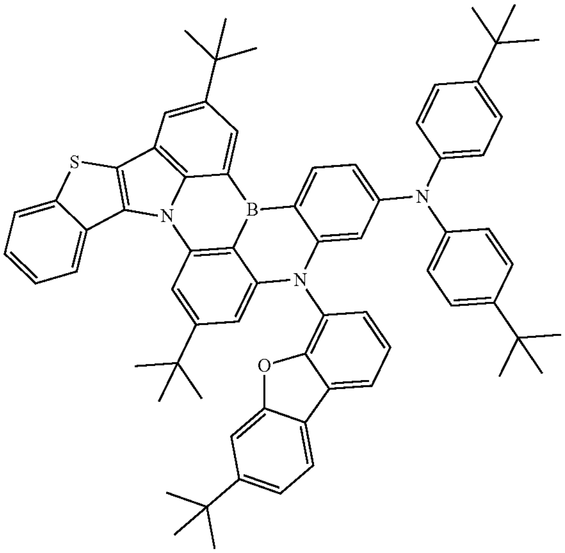
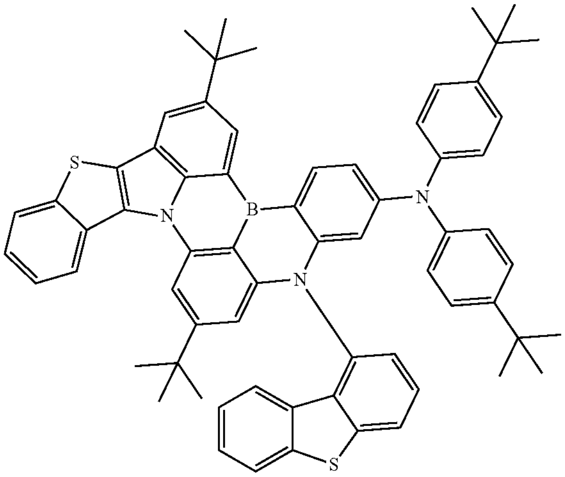

-continued
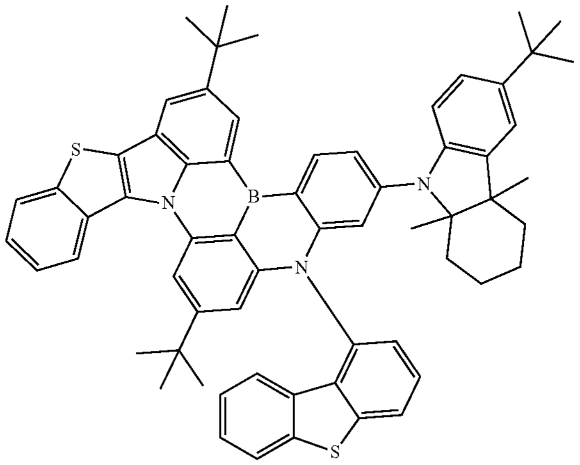
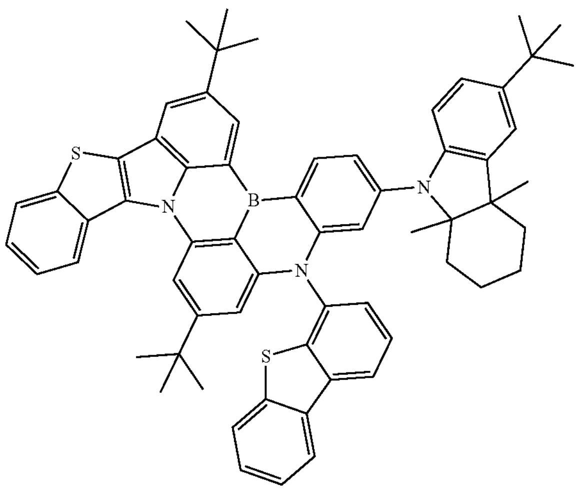 [SMILES: CC(C)(C)c1cc2c3c(c1)-n1c4c(cc(C(C)(C)C)cc4c4sc5ccccc5c41)B3c1ccc(N3c4ccc(C(C)(C)C)cc4C4(C)CCCCC34C)cc1N2c1cccc2c1sc1ccccc12]
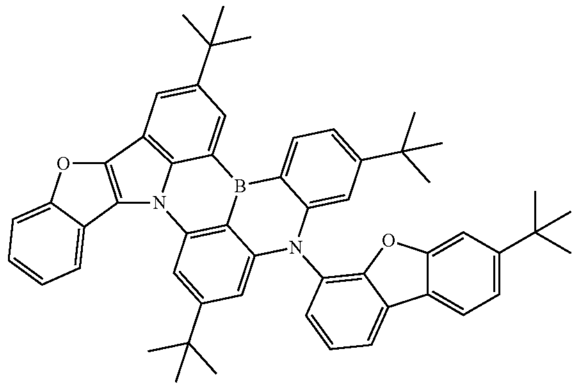
-continued
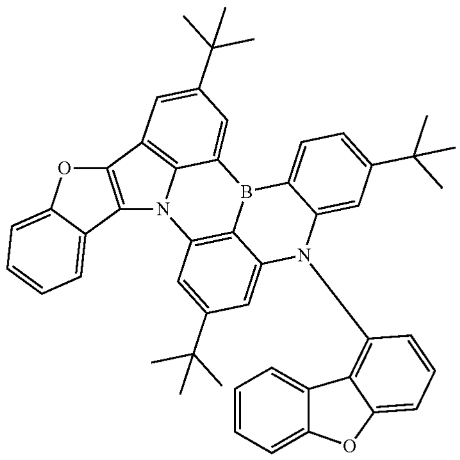
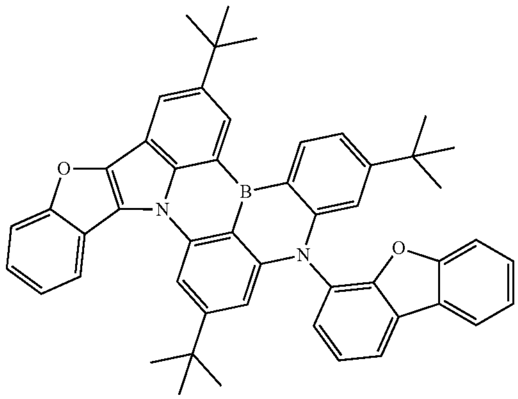
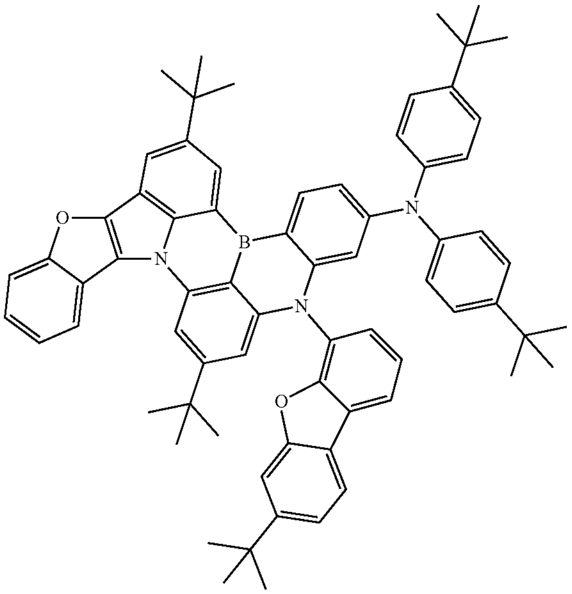

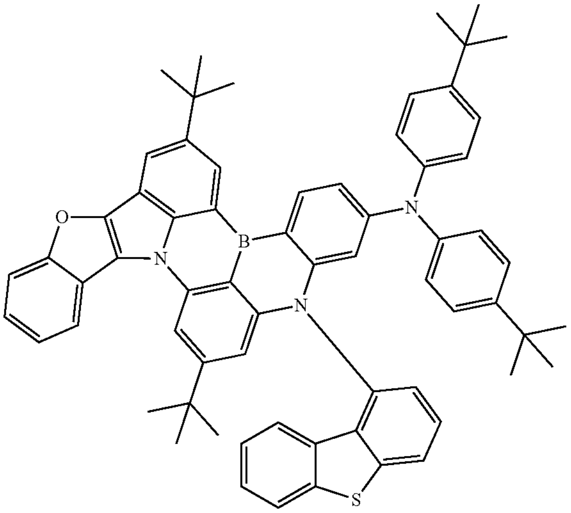
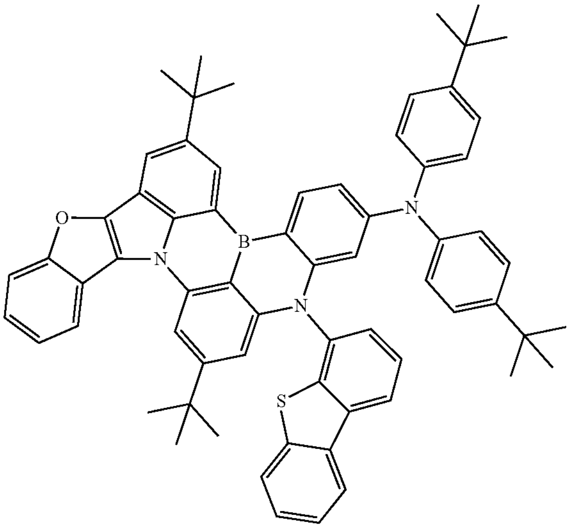
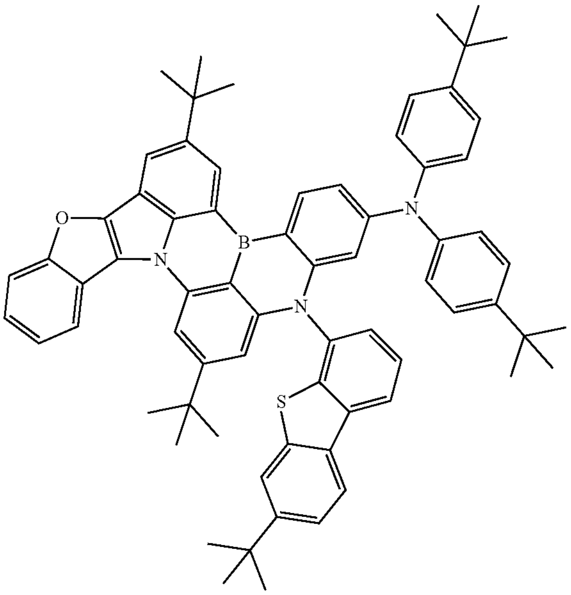 [SMILES: CC(C)(C)c1ccc(N(c2ccc(C(C)(C)C)cc2)c2ccc3c(c2)N(c2cccc4c2sc2cc(C(C)(C)C)ccc24)c2cc(C(C)(C)C)cc4c2B3c2cc(C(C)(C)C)cc3c5oc6ccccc6c5n-4c23)cc1]
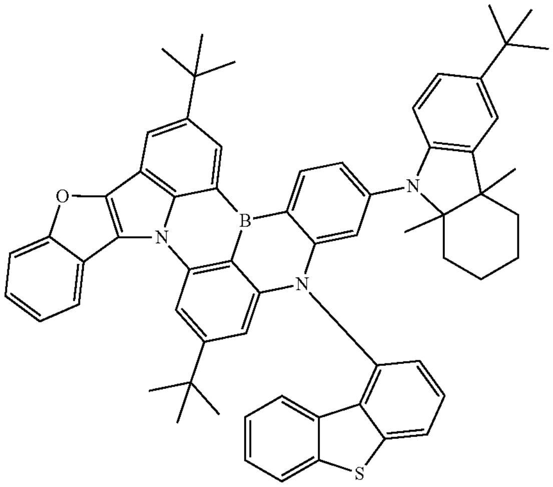
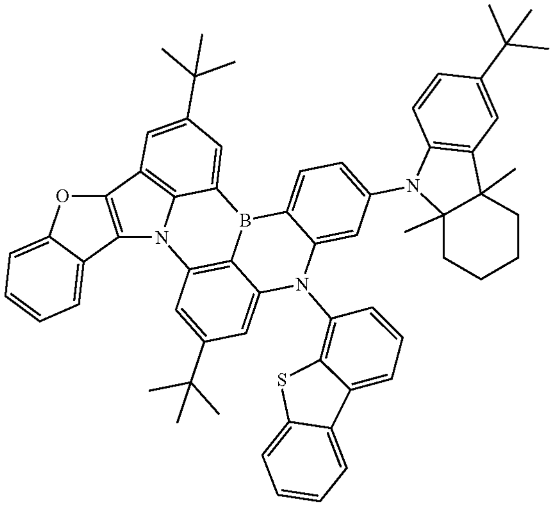
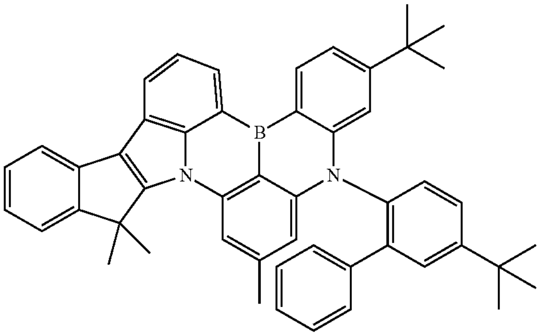
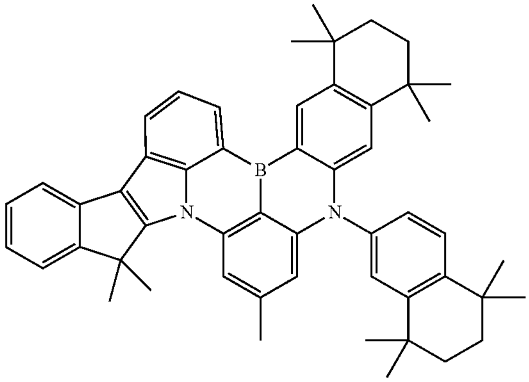

-continued
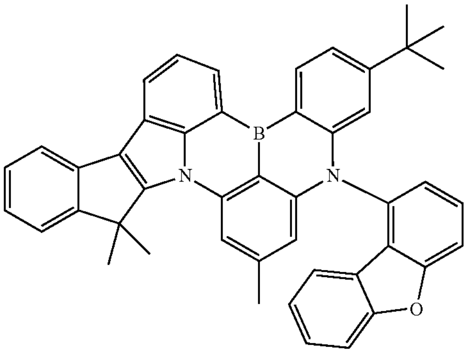
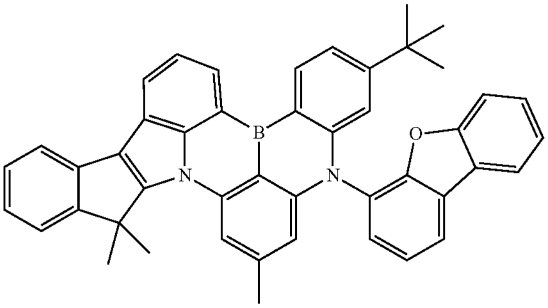
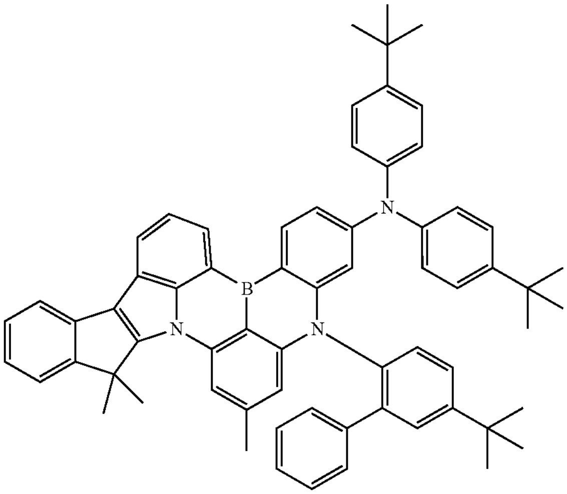
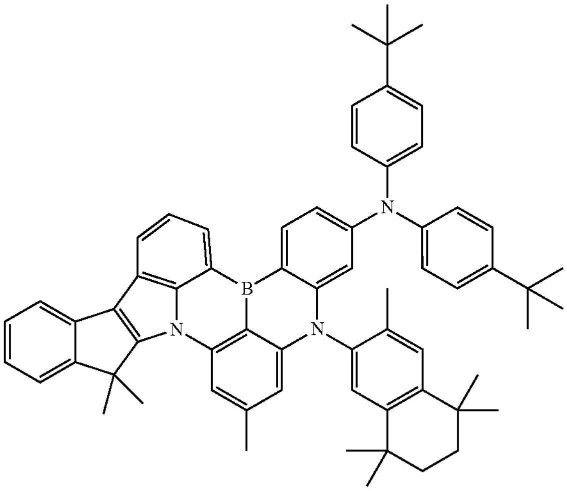
-continued
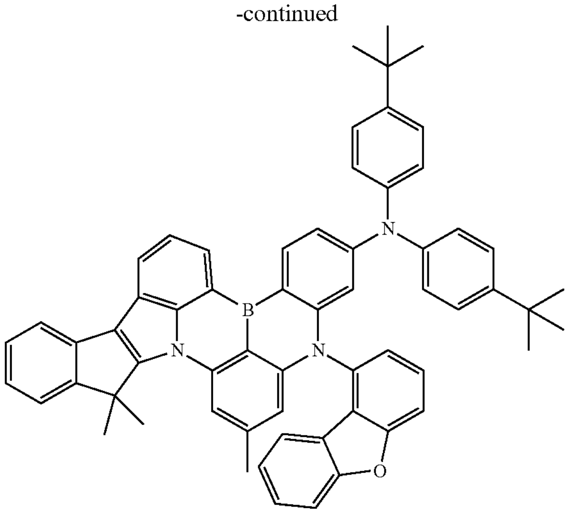
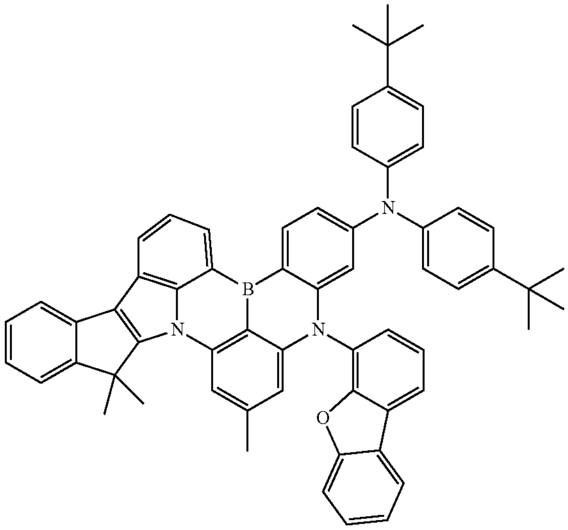 [SMILES: Cc1cc2c3c(c1)-n1c4c(c5cccc(c51)B3c1ccc(N(c3ccc(C(C)(C)C)cc3)c3ccc(C(C)(C)C)cc3)cc1N2c1cccc2c1oc1ccccc12)-c1ccccc1C4(C)C]
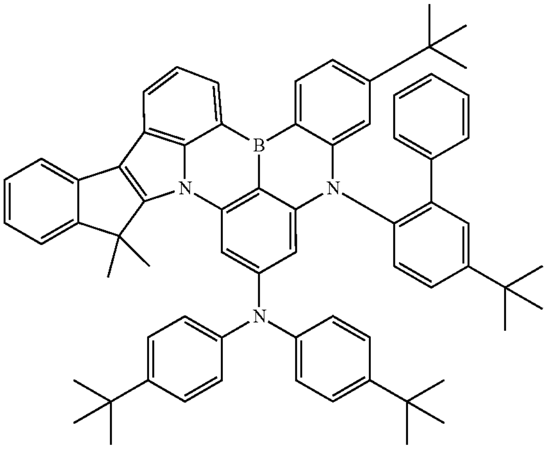

-continued
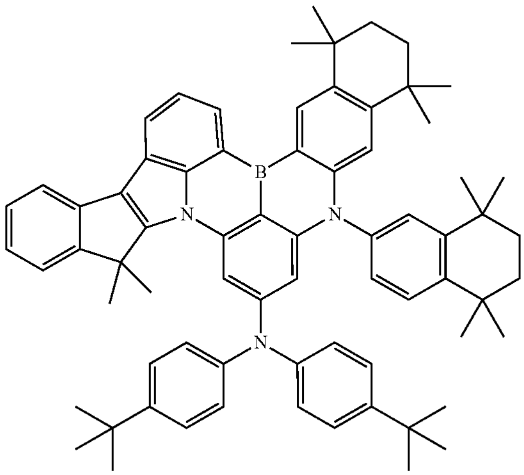
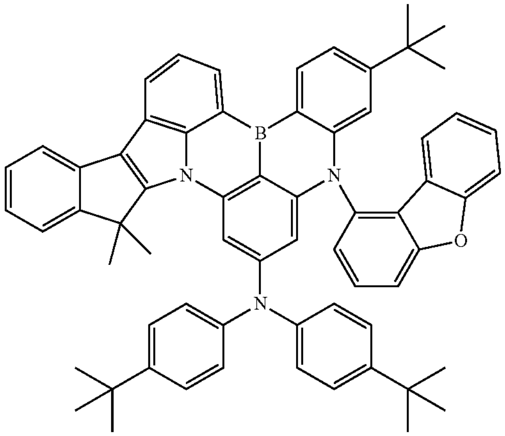
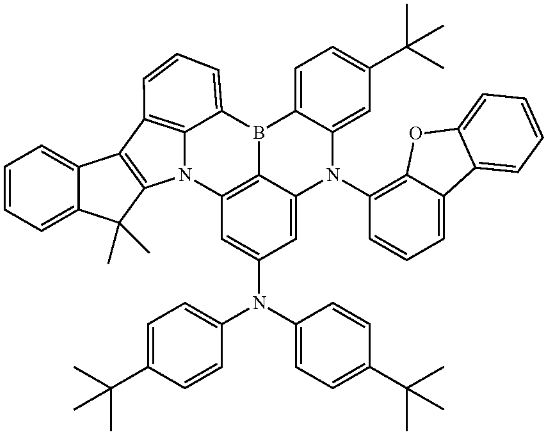 [SMILES: CC(C)(C)c1ccc(N(c2ccc(C(C)(C)C)cc2)c2cc3c4c(c2)-n2c5c(c6cccc(c62)B4c2ccc(C(C)(C)C)cc2N3c2cccc3c2oc2ccccc23)-c2ccccc2C5(C)C)cc1]
-continued
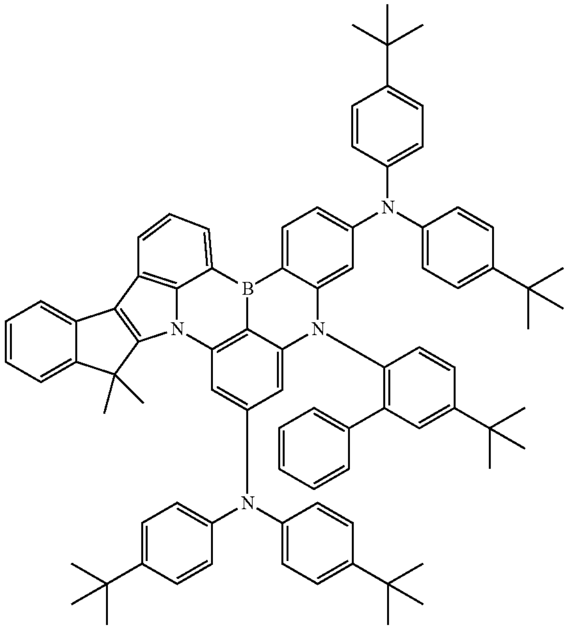
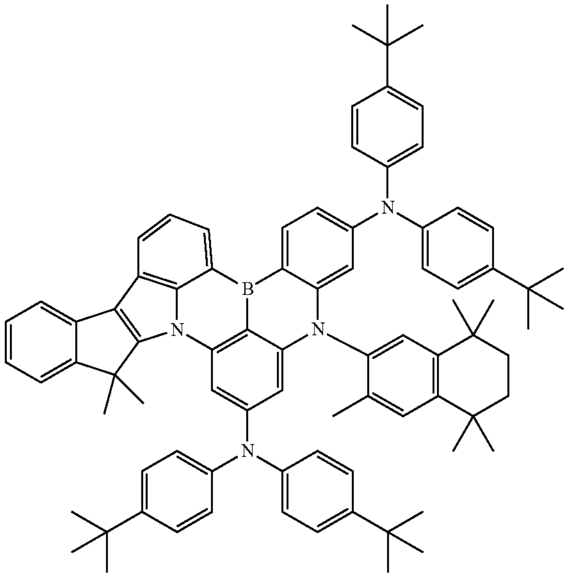

-continued
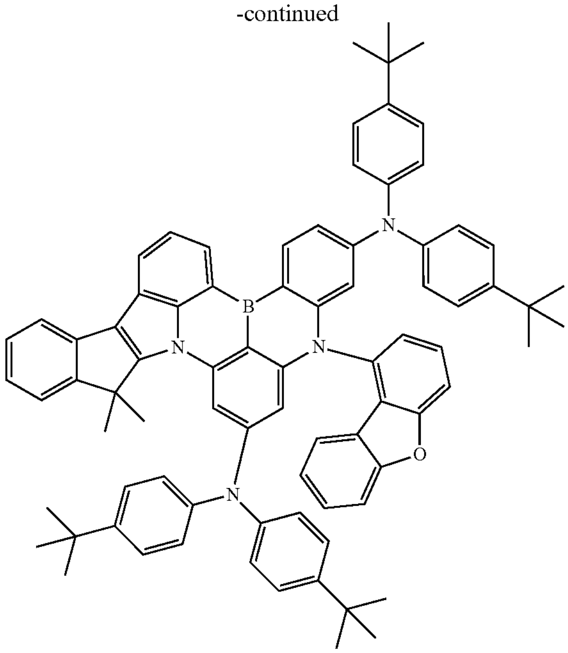
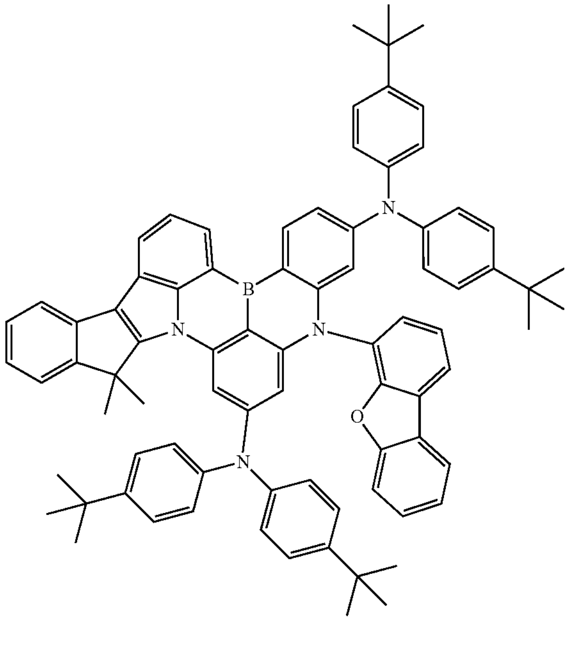 [SMILES: CC(C)(C)c1ccc(N(c2ccc(C(C)(C)C)cc2)c2ccc3c(c2)N(c2cccc4c2oc2ccccc24)c2cc(N(c4ccc(C(C)(C)C)cc4)c4ccc(C(C)(C)C)cc4)cc4c2B3c2cccc3c5c(n-4c23)C(C)(C)c2ccccc2-5)cc1]
-continued
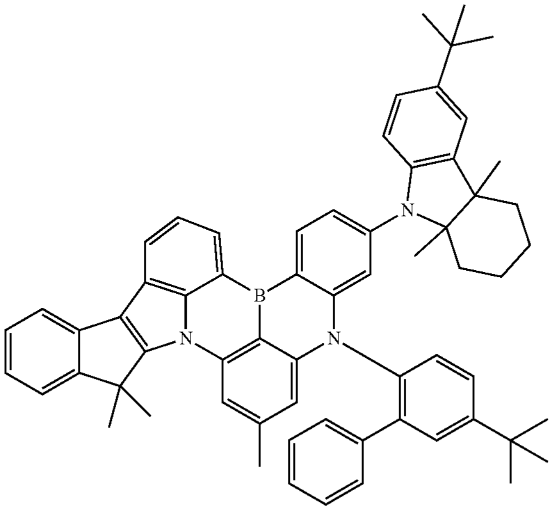
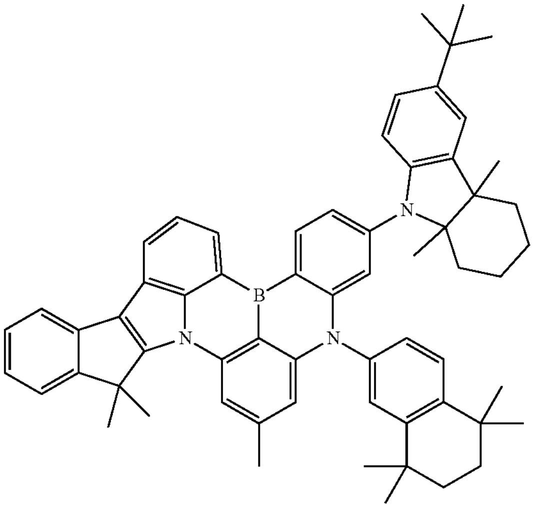
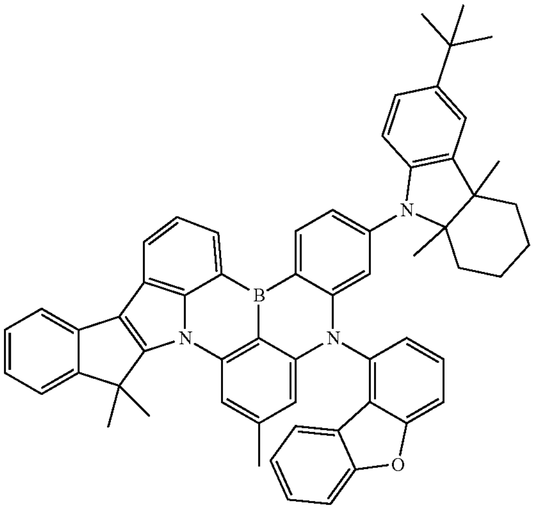

-continued
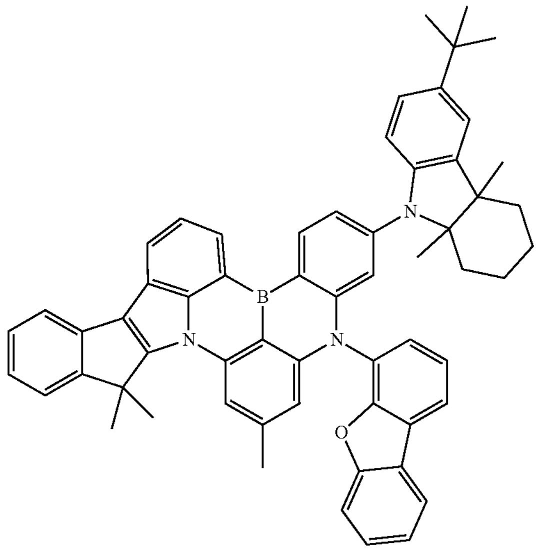 [SMILES: Cc1cc2c3c(c1)-n1c4c(c5cccc(c51)B3c1ccc(N3c5ccc(C(C)(C)C)cc5C5(C)CCCCC35C)cc1N2c1cccc2c1oc1ccccc12)-c1ccccc1C4(C)C]
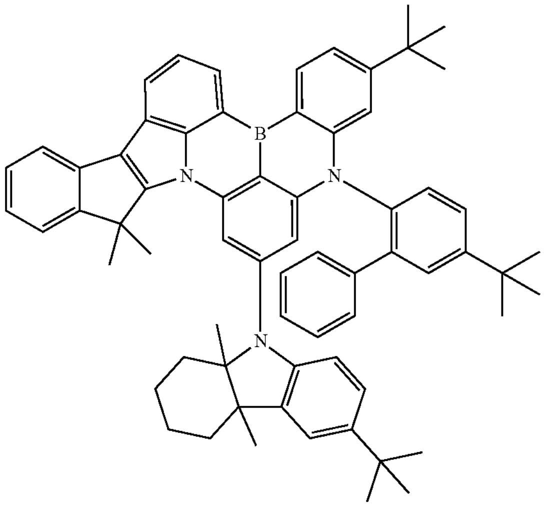
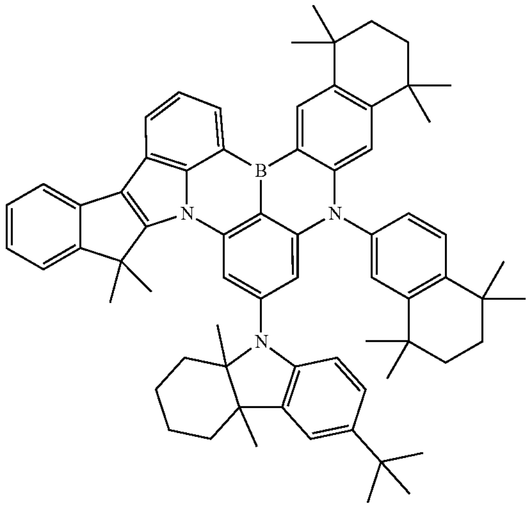
-continued
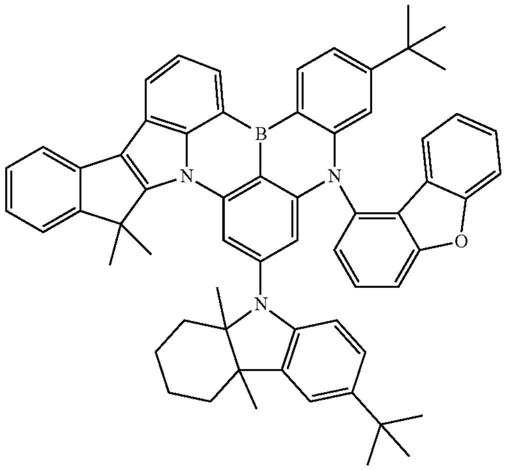
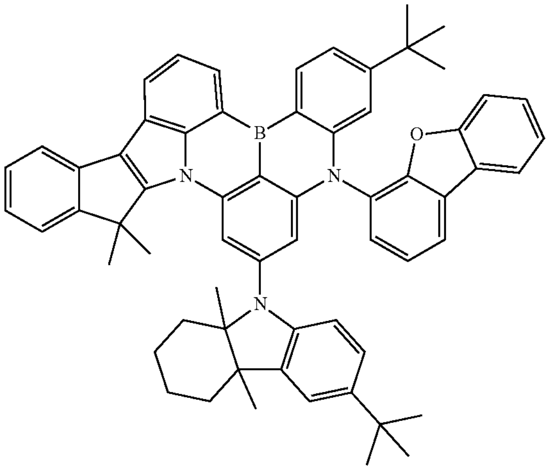 [SMILES: CC(C)(C)c1ccc2c(c1)N(c1cccc3c1oc1ccccc13)c1cc(N3c4ccc(C(C)(C)C)cc4C4(C)CCCCC34C)cc3c1B2c1cccc2c4c(n-3c12)C(C)(C)c1ccccc1-4]
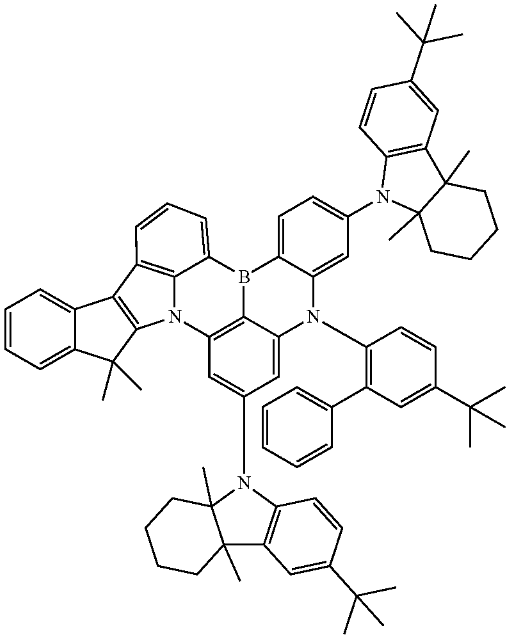

-continued
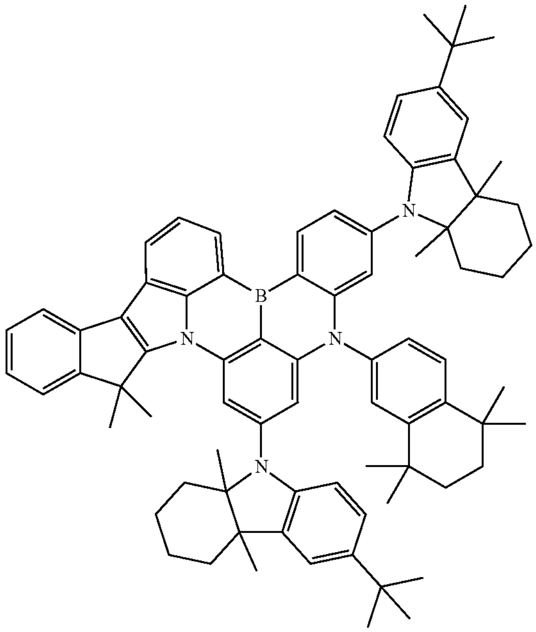
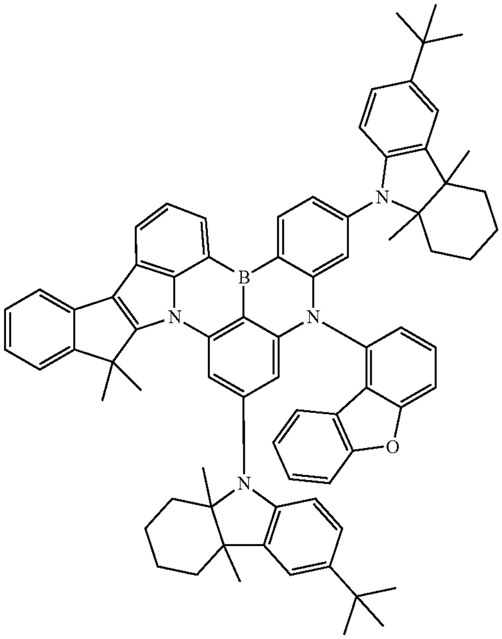
-continued
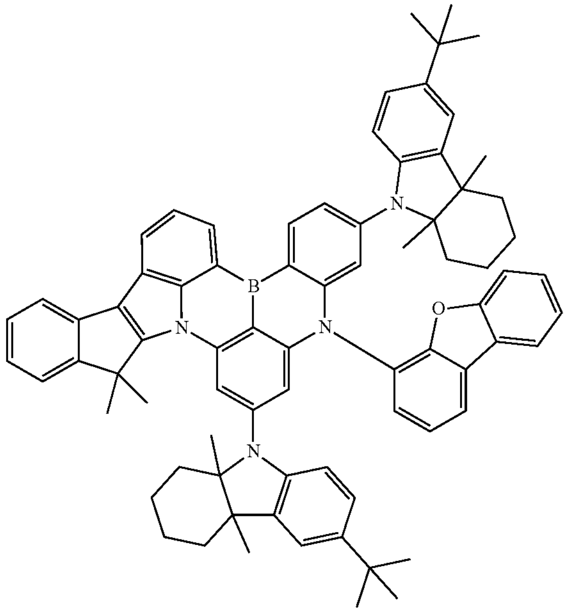 [SMILES: CC(C)(C)c1ccc2c(c1)C1(C)CCCCC1(C)N2c1ccc2c(c1)N(c1cccc3c1oc1ccccc13)c1cc(N3c4ccc(C(C)(C)C)cc4C4(C)CCCCC34C)cc3c1B2c1cccc2c4c(n-3c12)C(C)(C)c1ccccc1-4]
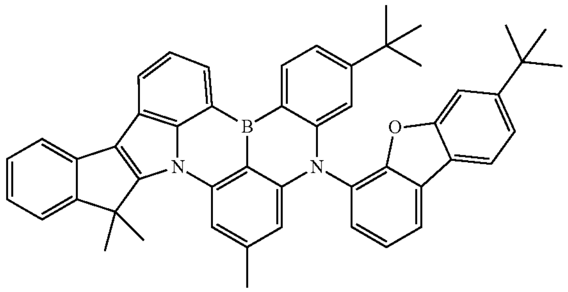
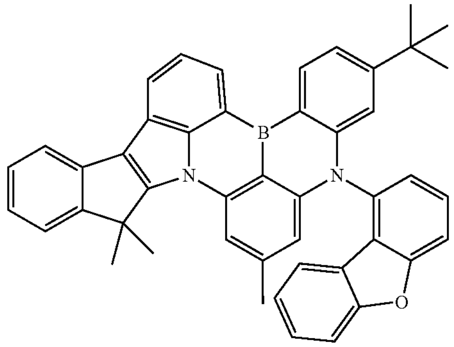
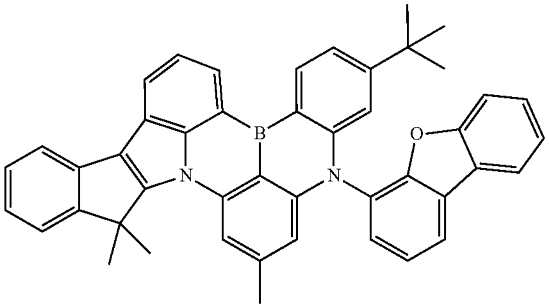

-continued
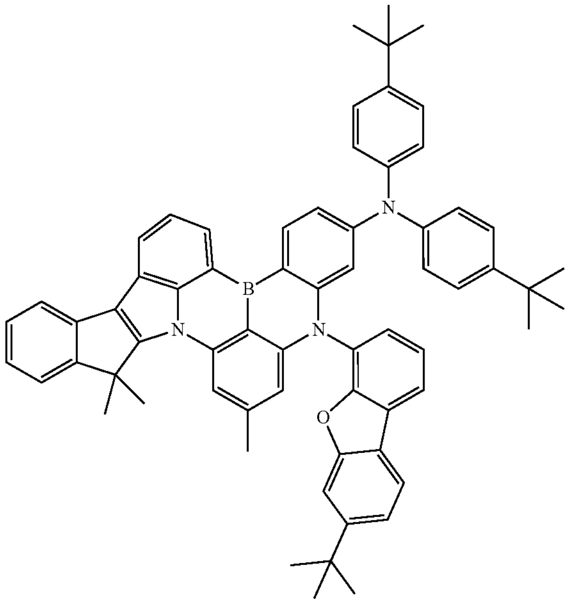
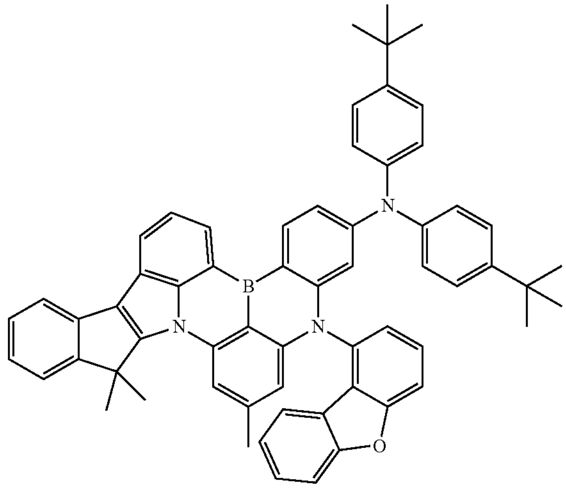
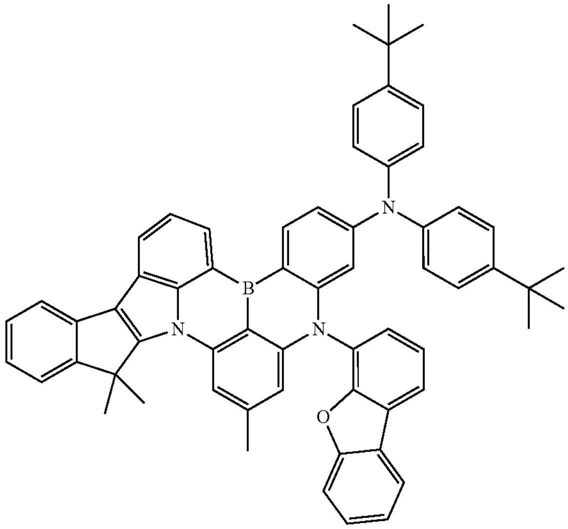
-continued
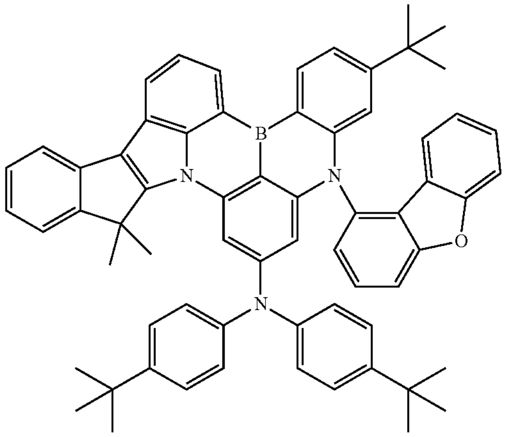
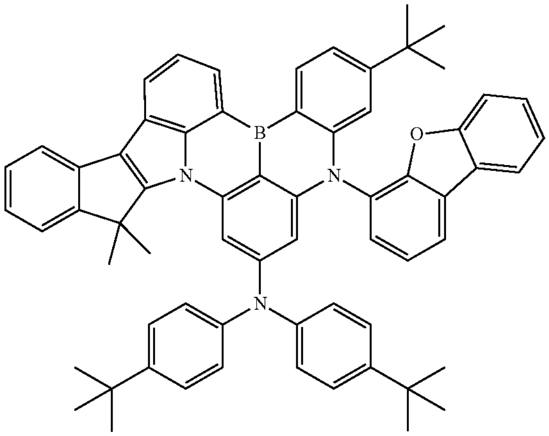
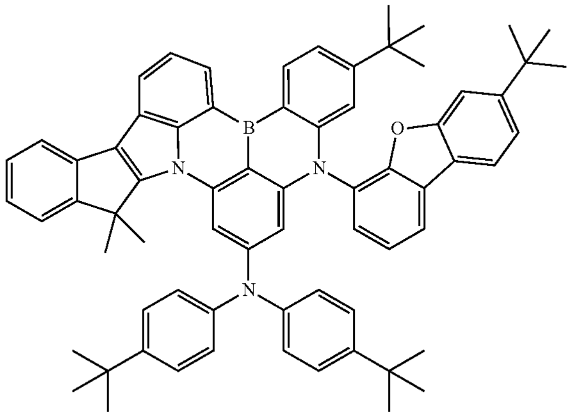

-continued
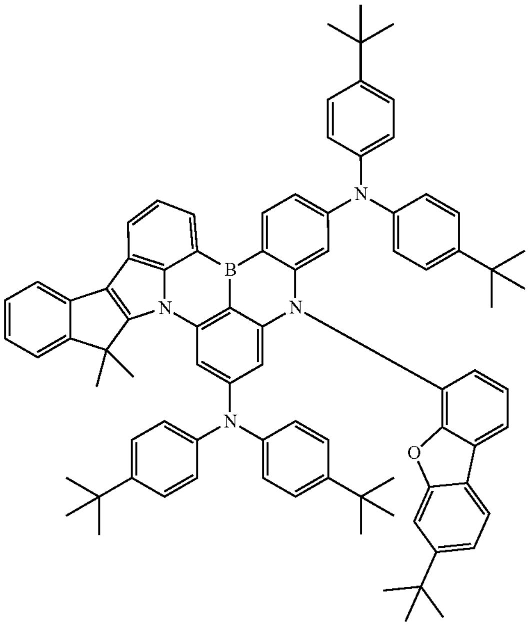
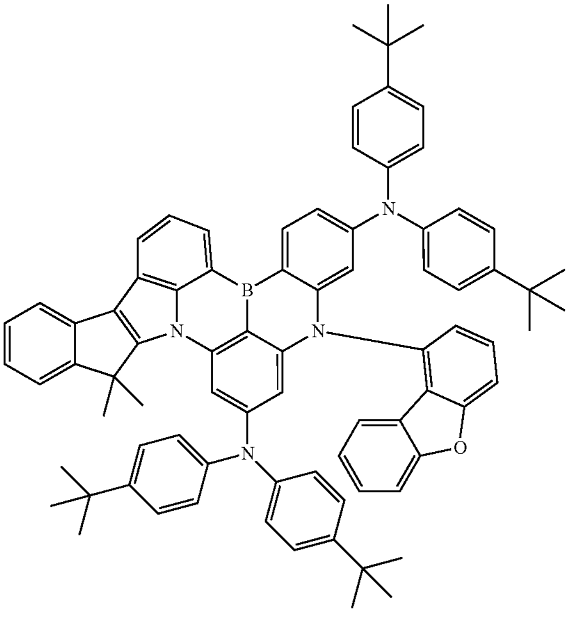
-continued
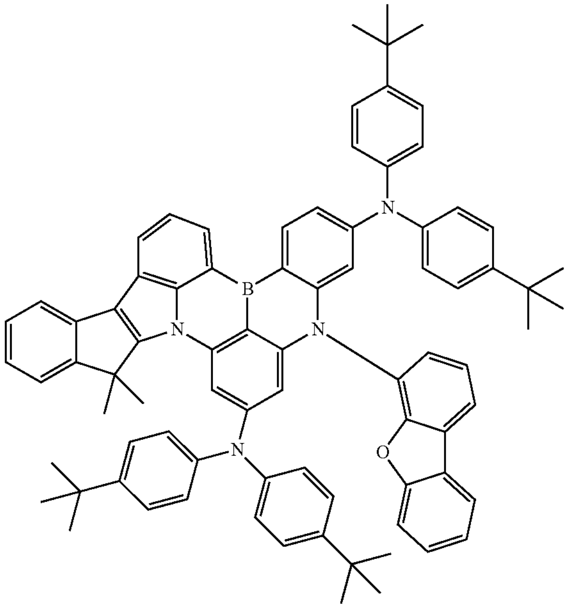
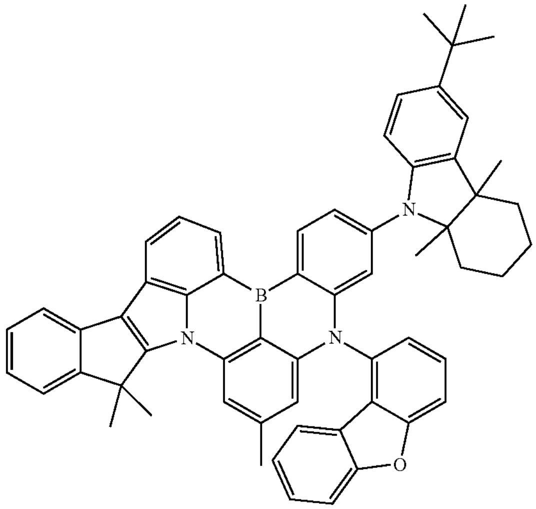
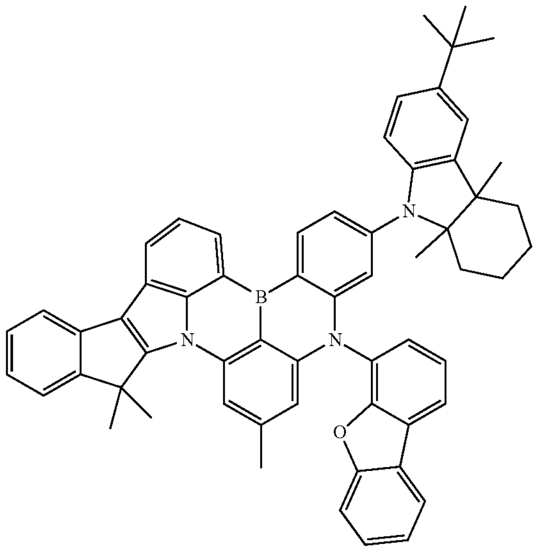

-continued
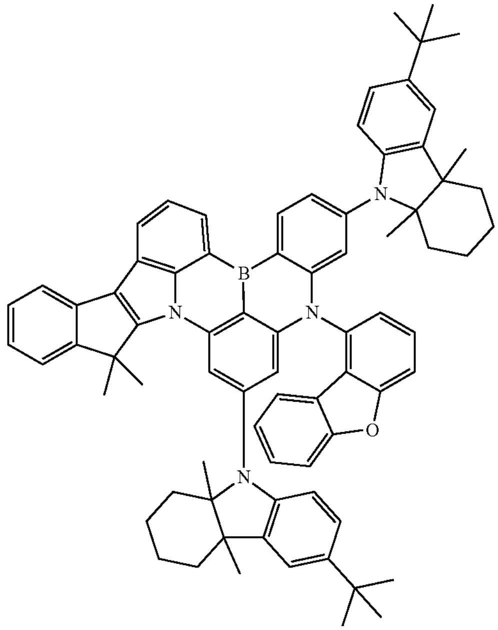
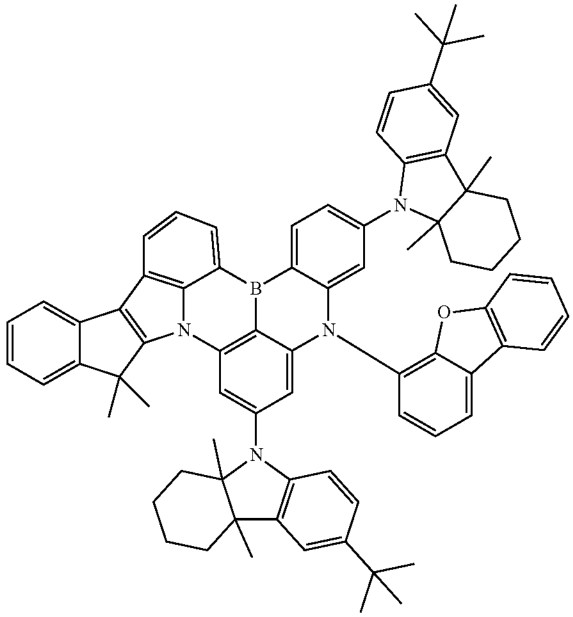 [SMILES: CC(C)(C)c1ccc2c(c1)C1(C)CCCCC1(C)N2c1ccc2c(c1)N(c1cccc3c1oc1ccccc13)c1cc(N3c4ccc(C(C)(C)C)cc4C4(C)CCCCC34C)cc3c1B2c1cccc2c4c(n-3c12)C(C)(C)c1ccccc1-4]
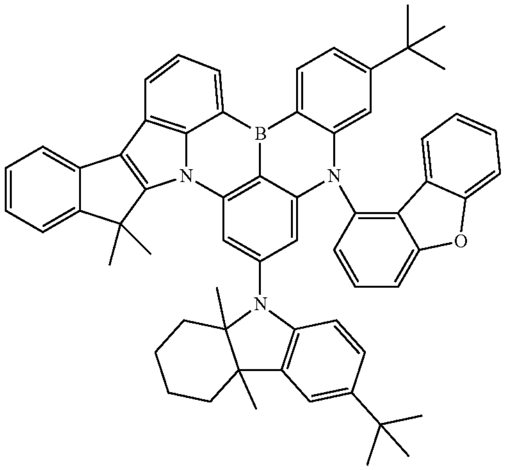
-continued
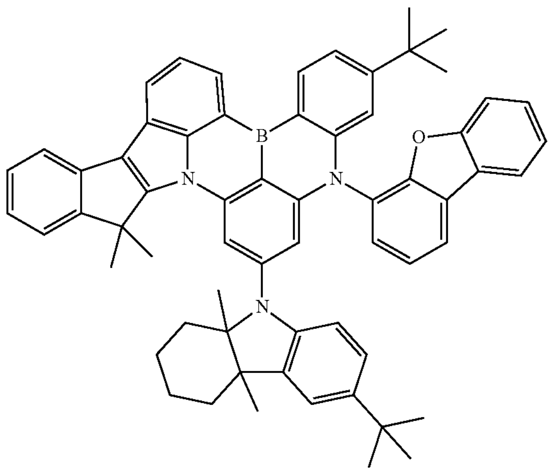
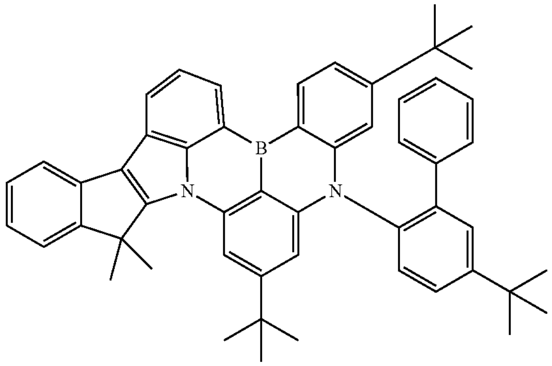
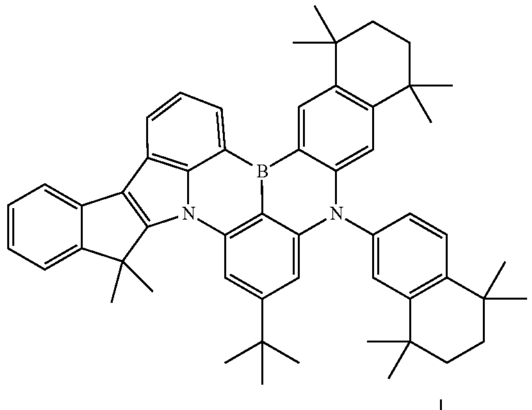
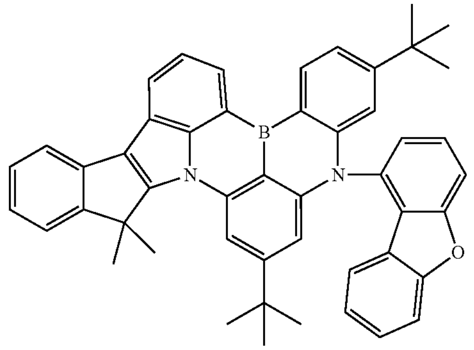

-continued
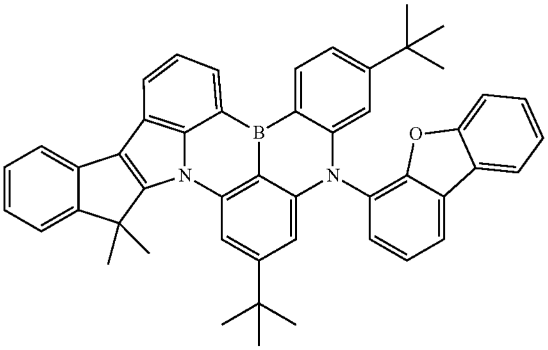
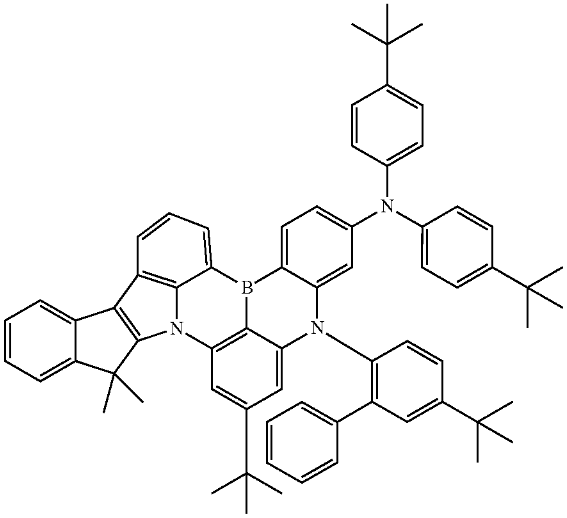
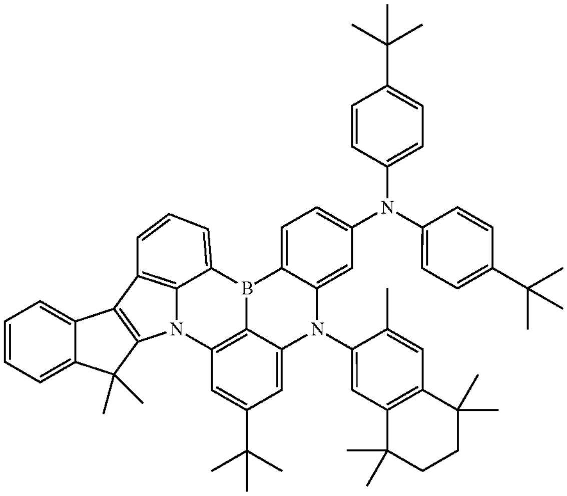
-continued
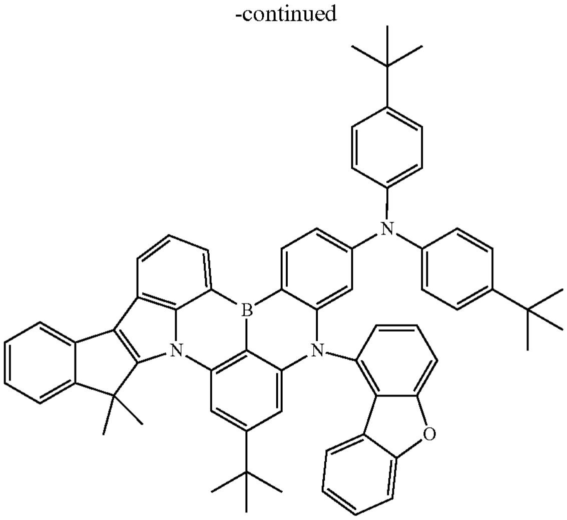
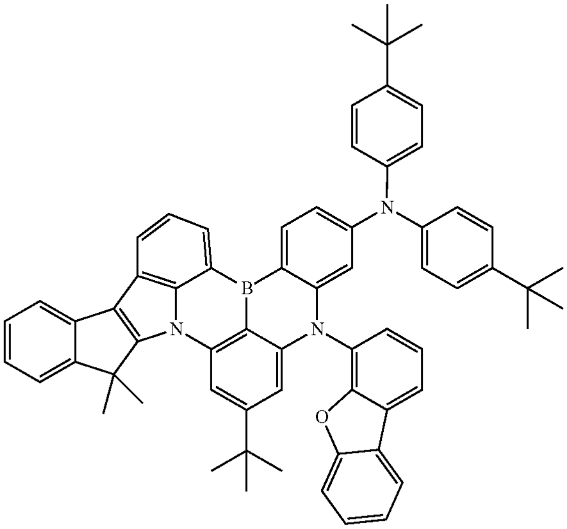 [SMILES: CC(C)(C)c1ccc(N(c2ccc(C(C)(C)C)cc2)c2ccc3c(c2)N(c2cccc4c2oc2ccccc24)c2cc(C(C)(C)C)cc4c2B3c2cccc3c5c(n-4c23)C(C)(C)c2ccccc2-5)cc1]
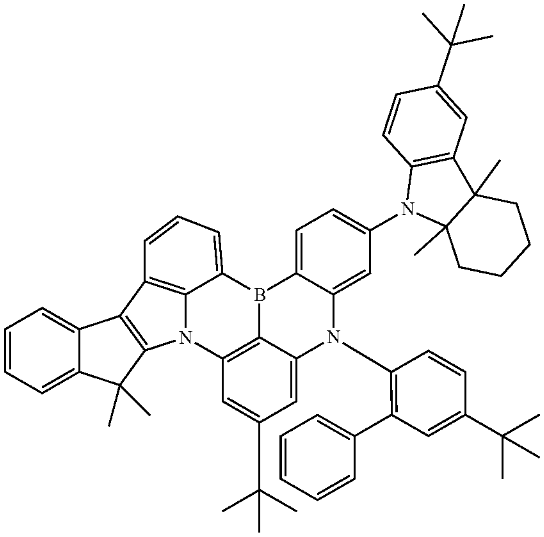

-continued
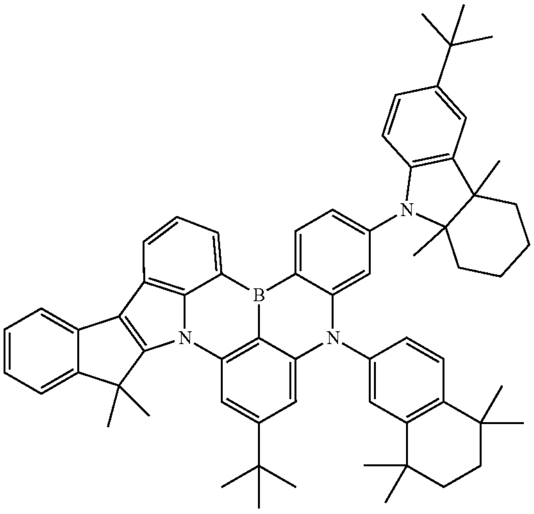
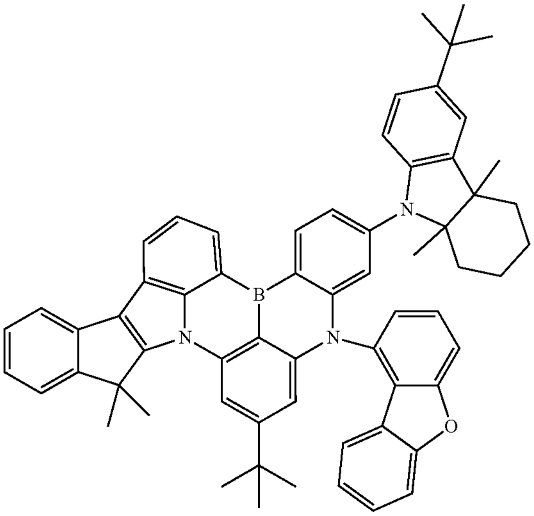
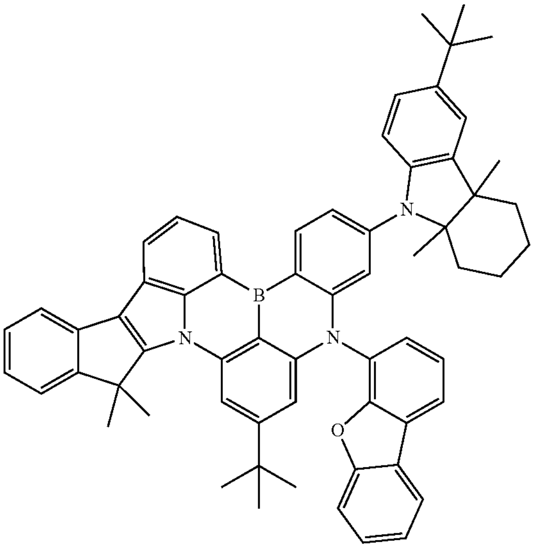 [SMILES: CC(C)(C)c1cc2c3c(c1)-n1c4c(c5cccc(c51)B3c1ccc(N3c5ccc(C(C)(C)C)cc5C5(C)CCCCC35C)cc1N2c1cccc2c1oc1ccccc12)-c1ccccc1C4(C)C]
-continued
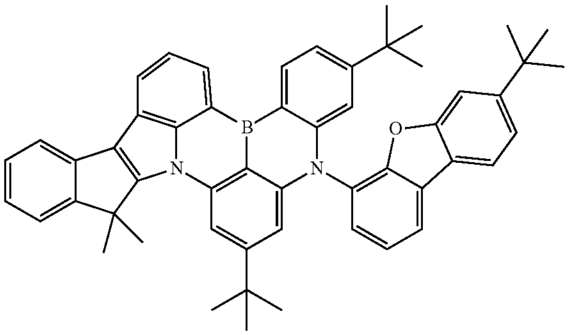
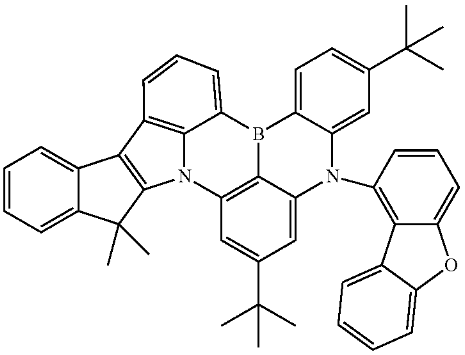
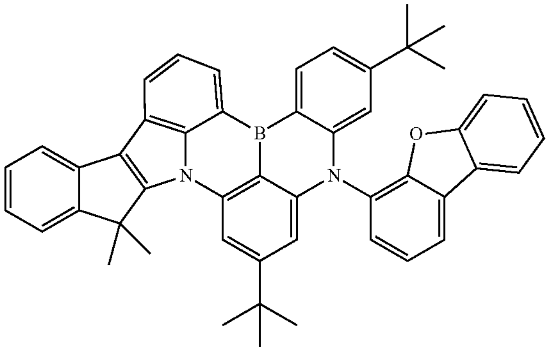
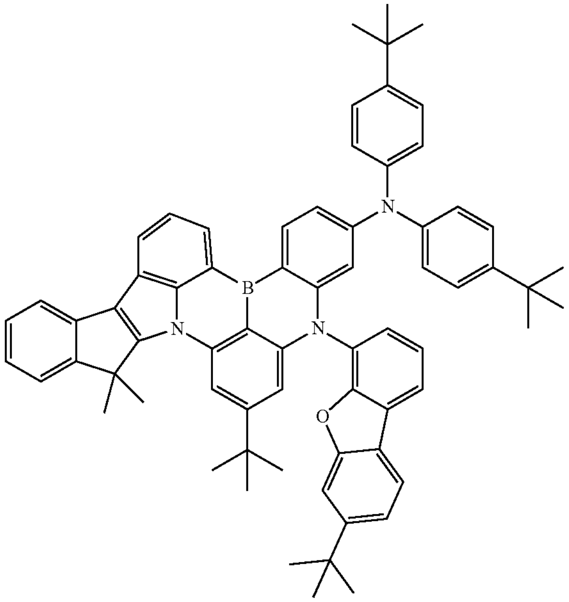

-continued
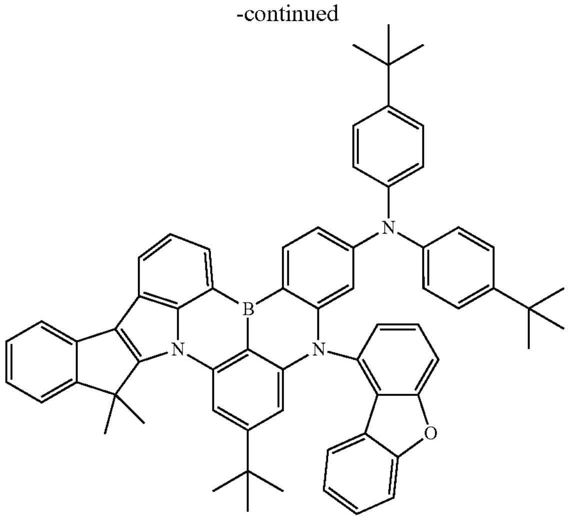
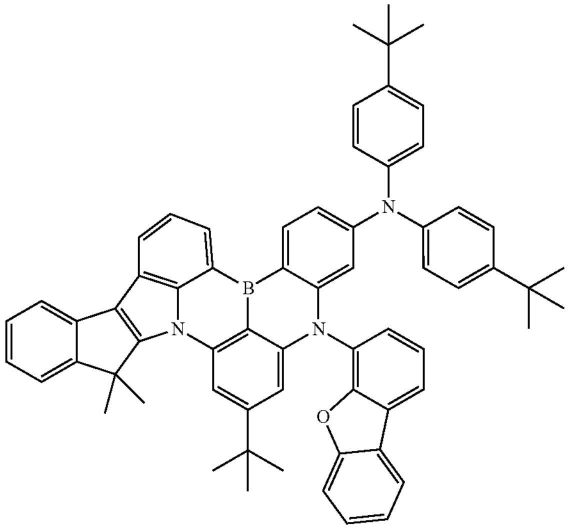
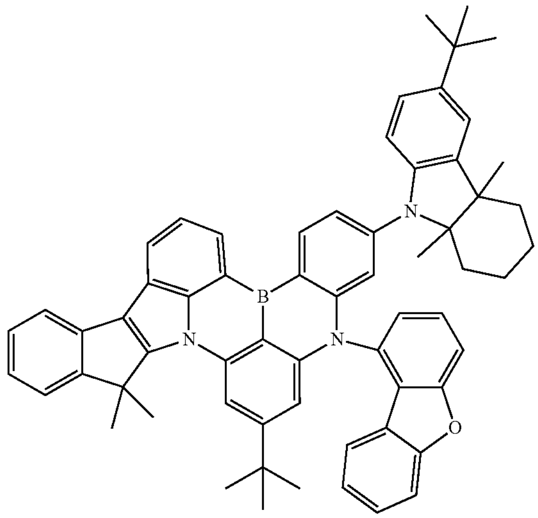
-continued
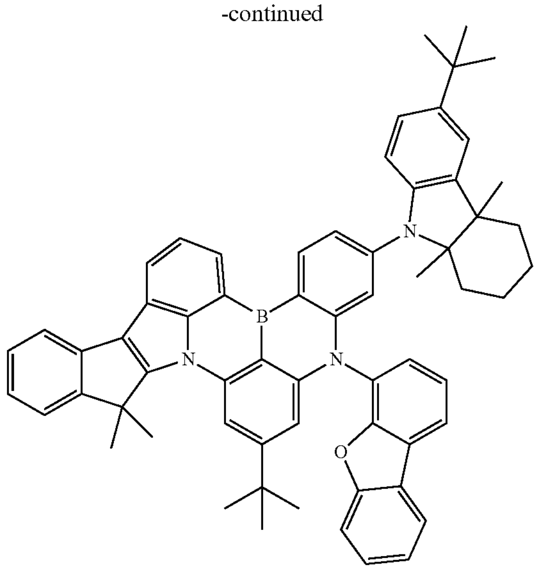
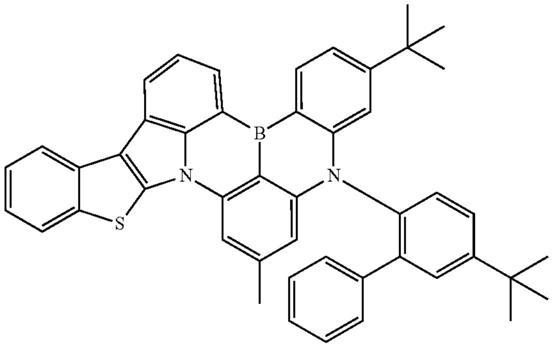
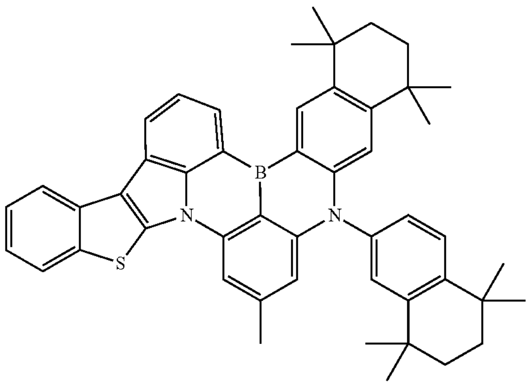
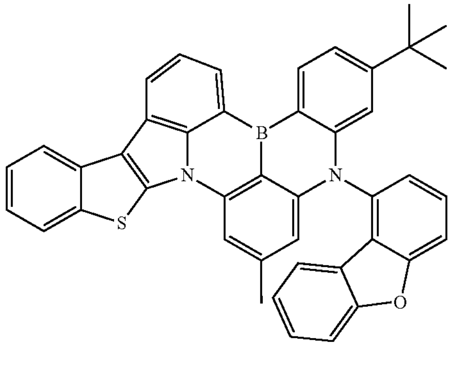

-continued
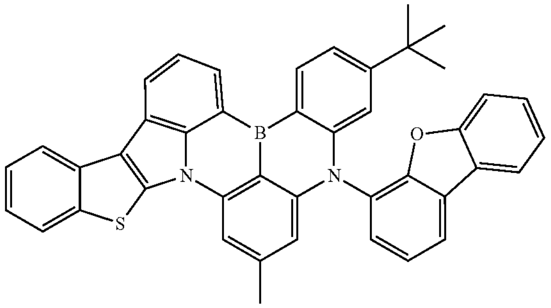
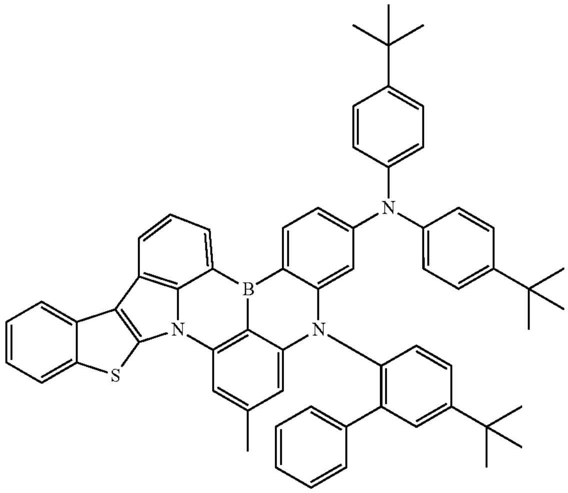
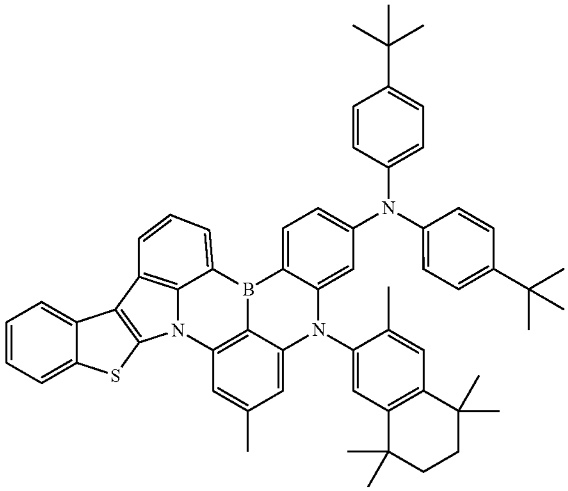
-continued
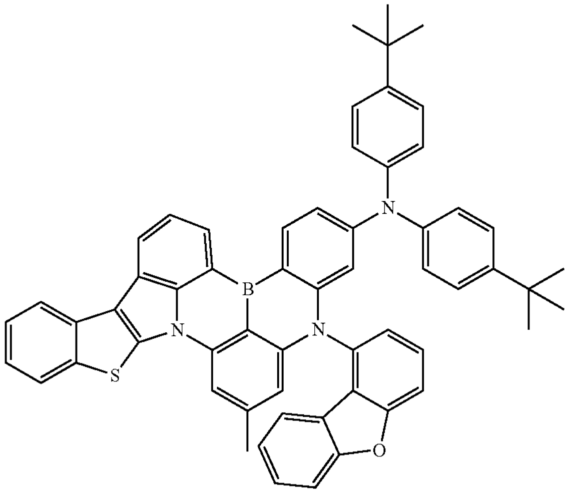
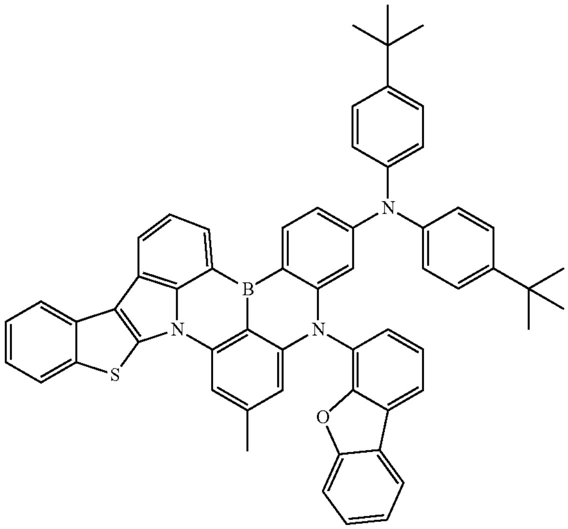 [SMILES: Cc1cc2c3c(c1)-n1c4sc5ccccc5c4c4cccc(c41)B3c1ccc(N(c3ccc(C(C)(C)C)cc3)c3ccc(C(C)(C)C)cc3)cc1N2c1cccc2c1oc1ccccc12]
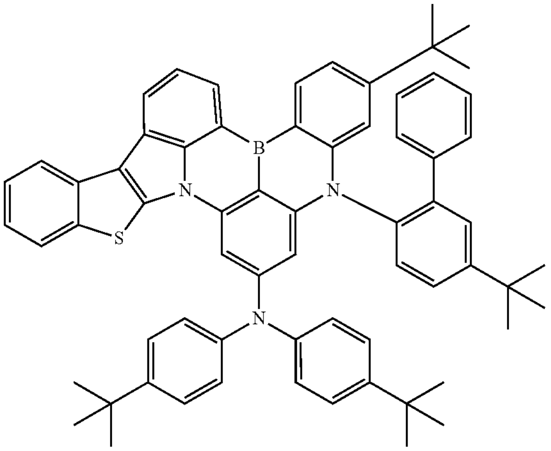

-continued
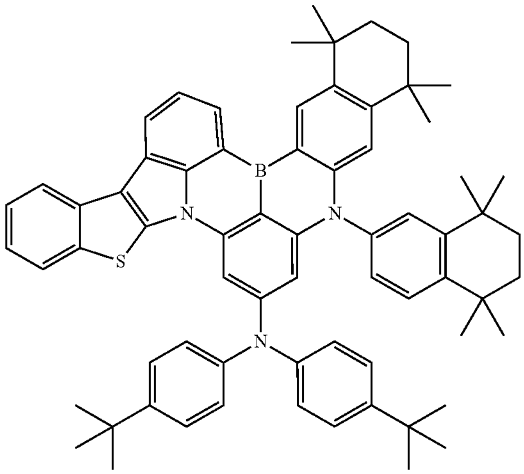
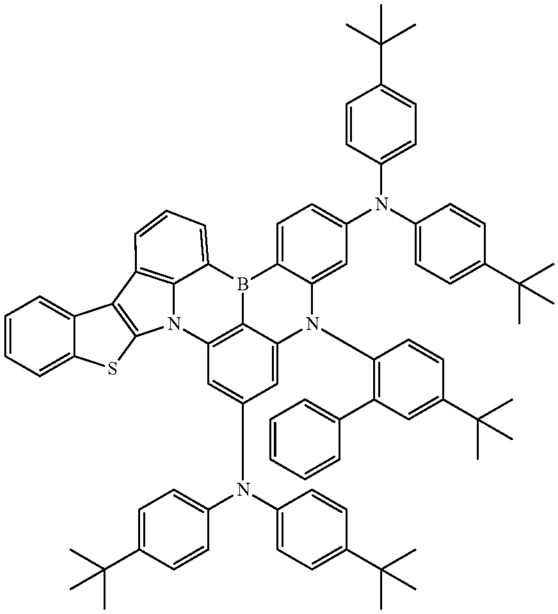
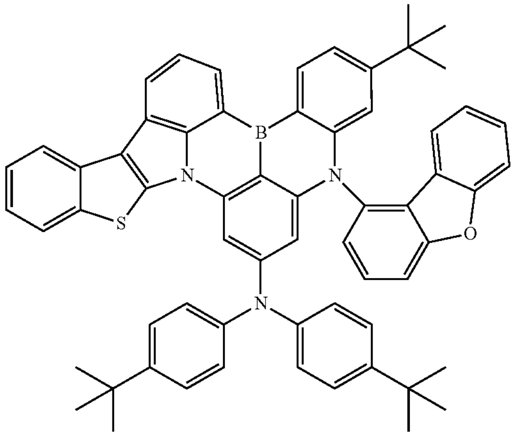
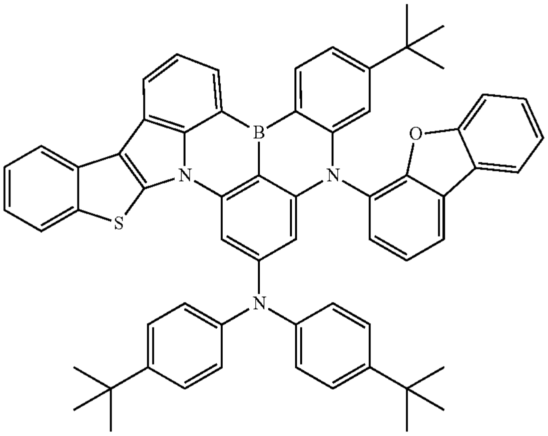
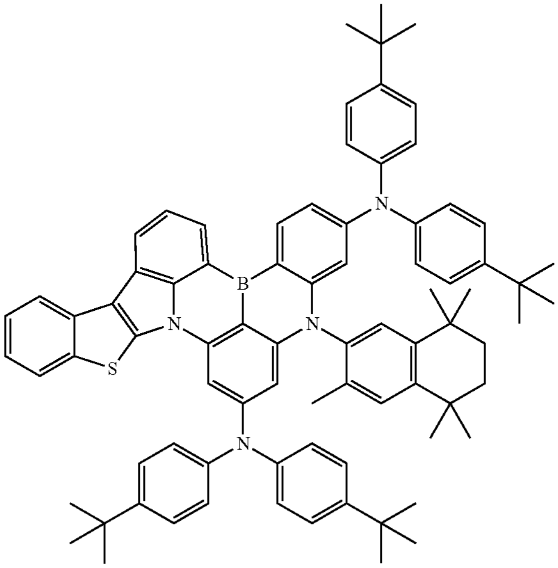

-continued
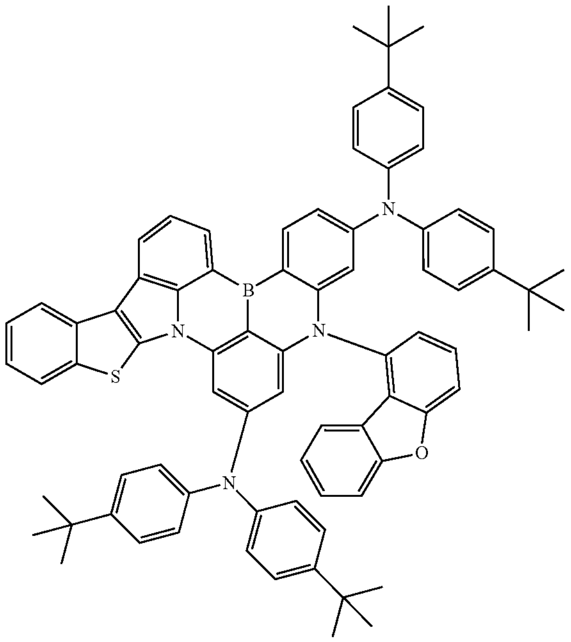
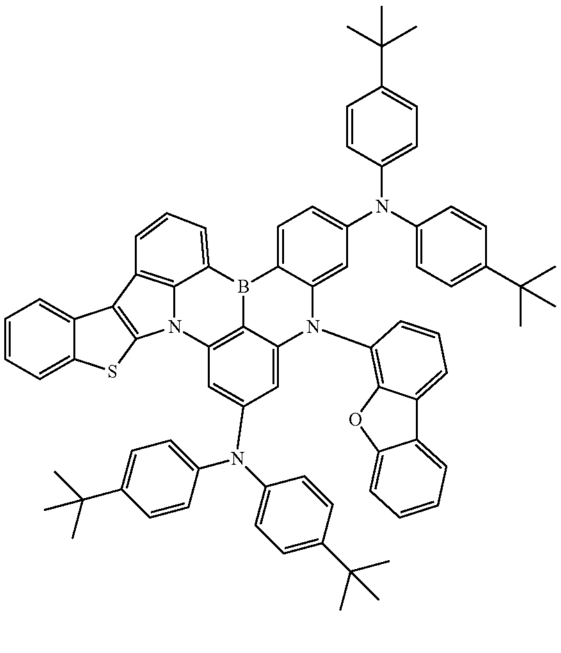 [SMILES: CC(C)(C)c1ccc(N(c2ccc(C(C)(C)C)cc2)c2ccc3c(c2)N(c2cccc4c2oc2ccccc24)c2cc(N(c4ccc(C(C)(C)C)cc4)c4ccc(C(C)(C)C)cc4)cc4c2B3c2cccc3c5c6ccccc6sc5n-4c23)cc1]
-continued
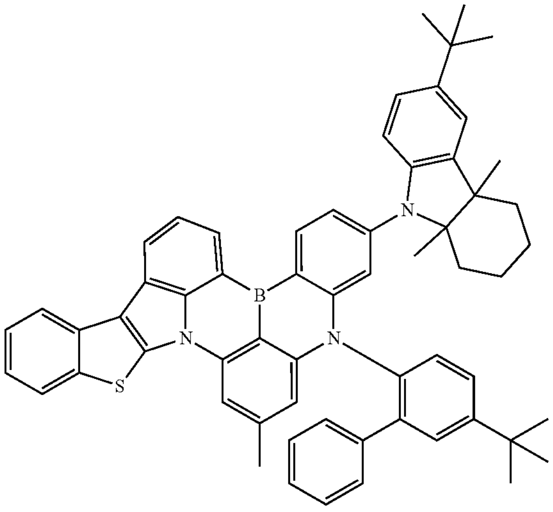
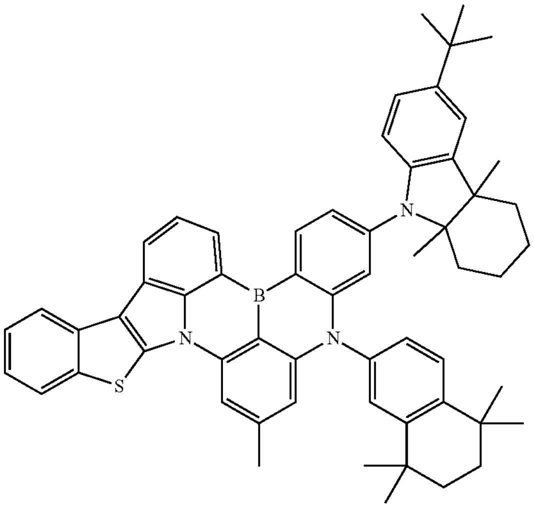
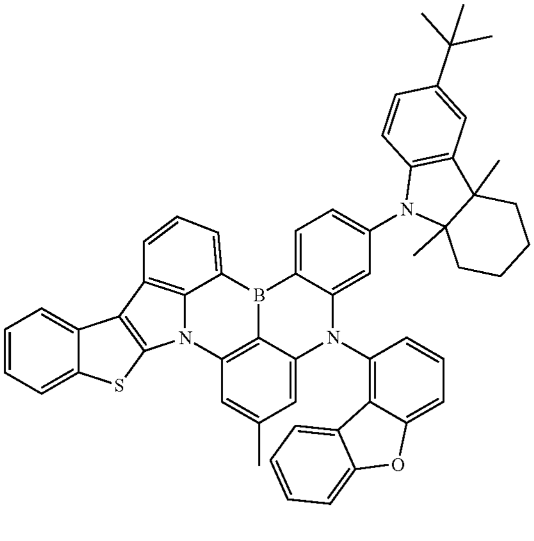

-continued
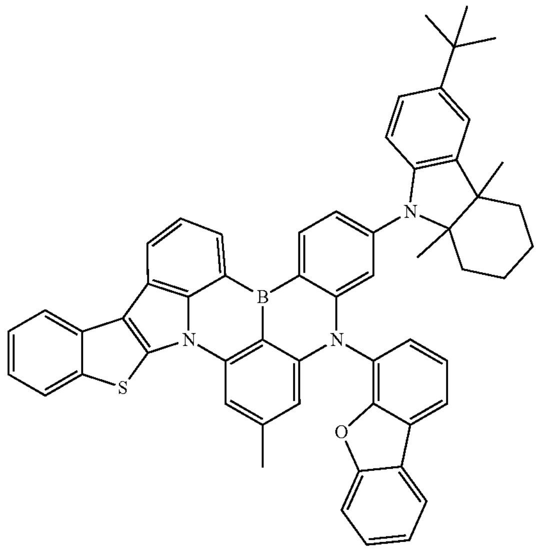 [SMILES: Cc1cc2c3c(c1)-n1c4sc5ccccc5c4c4cccc(c41)B3c1ccc(N3c4ccc(C(C)(C)C)cc4C4(C)CCCCC34C)cc1N2c1cccc2c1oc1ccccc12]
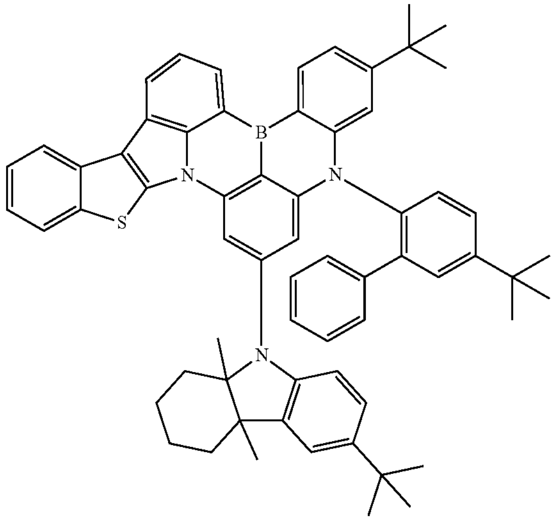
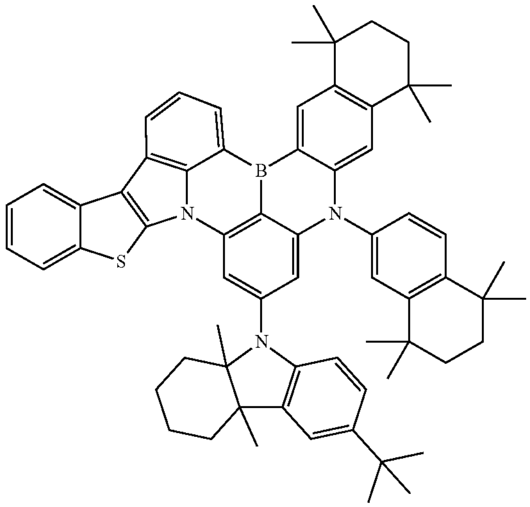
-continued
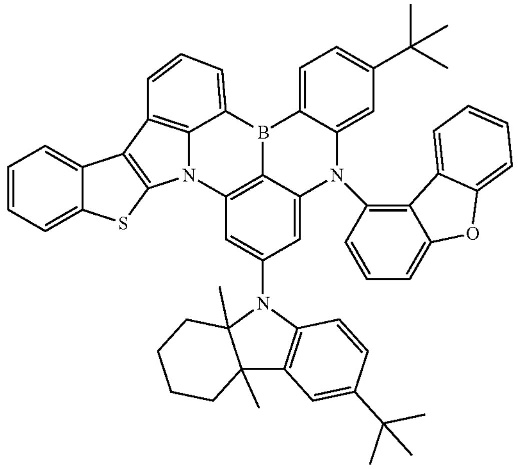
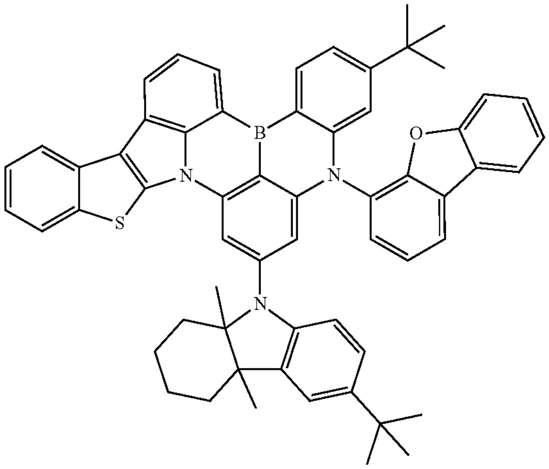 [SMILES: CC(C)(C)c1ccc2c(c1)N(c1cccc3c1oc1ccccc13)c1cc(N3c4ccc(C(C)(C)C)cc4C4(C)CCCCC34C)cc3c1B2c1cccc2c4c5ccccc5sc4n-3c12]
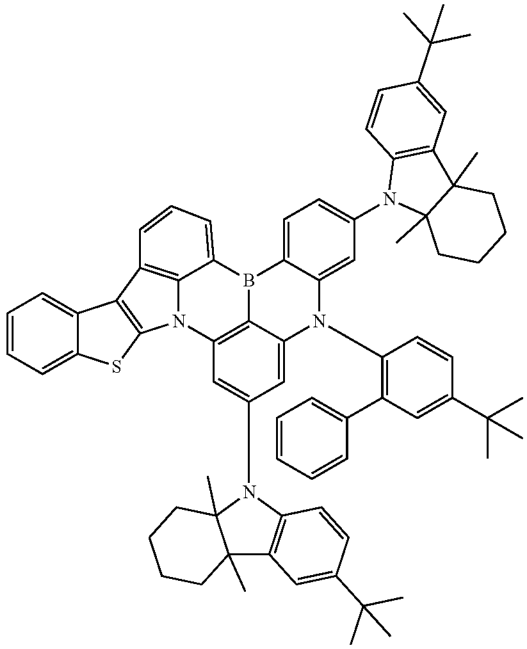

-continued
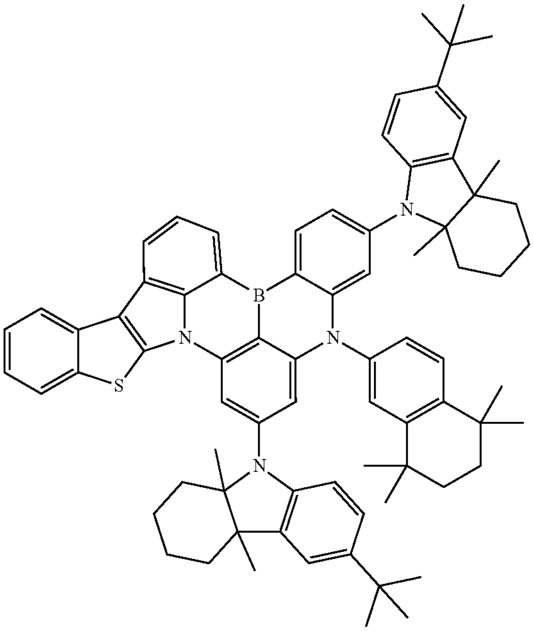
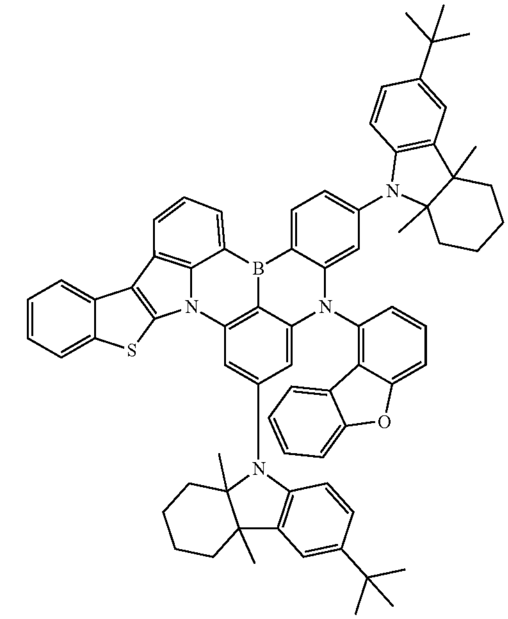
-continued
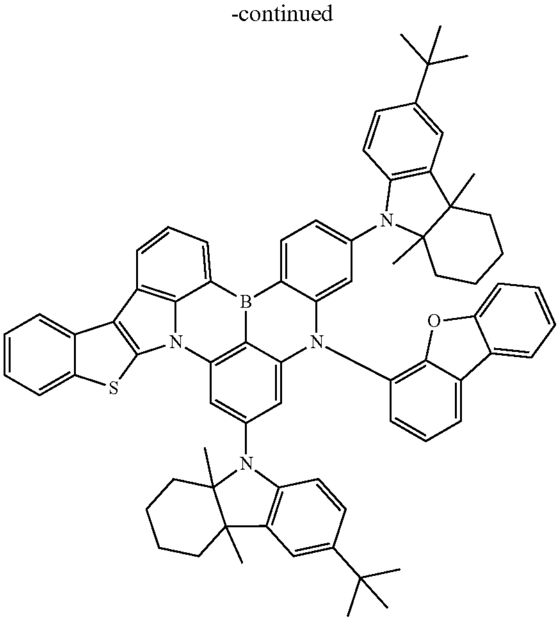
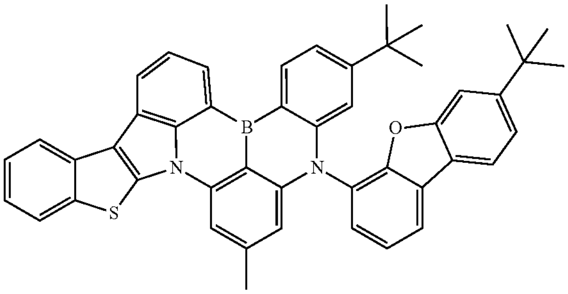
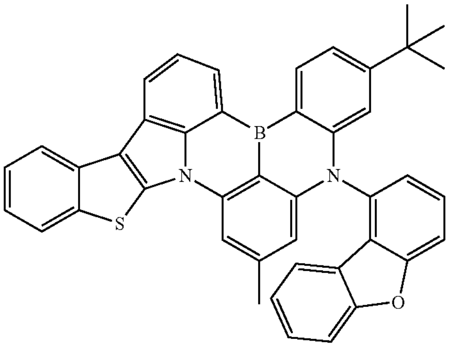
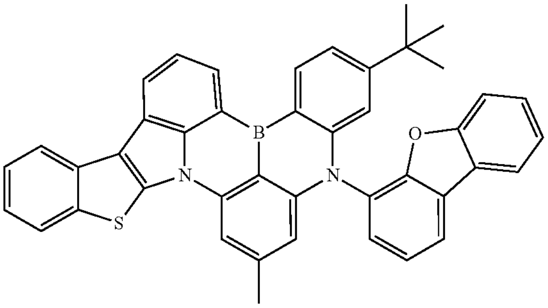

-continued
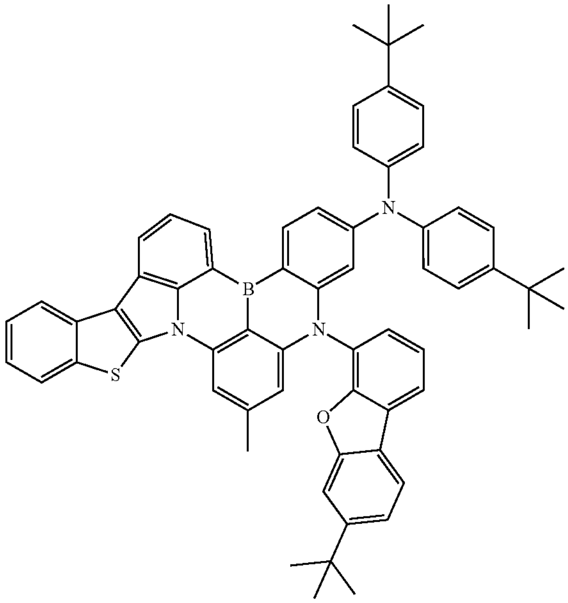
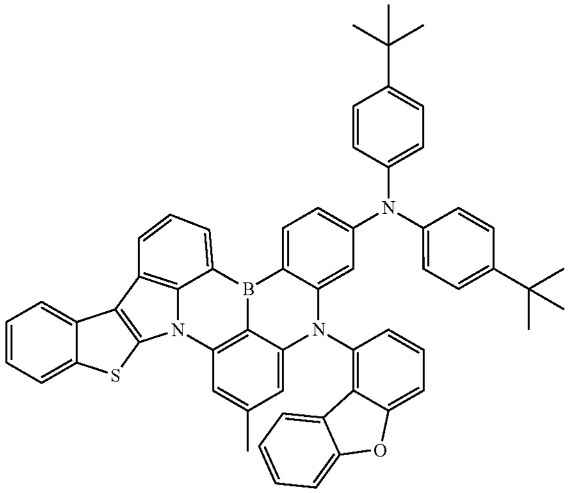
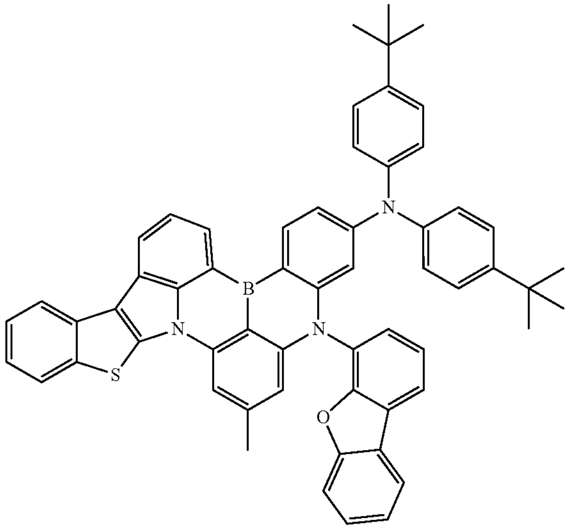
-continued
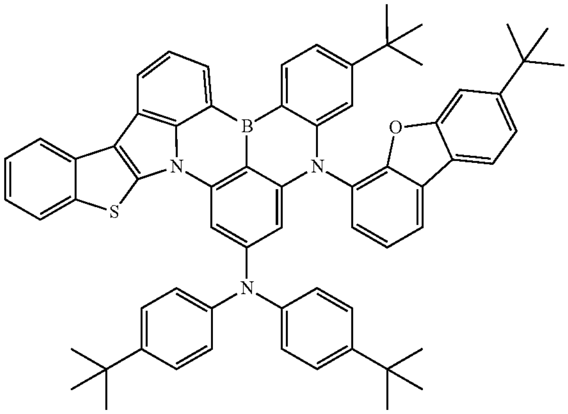
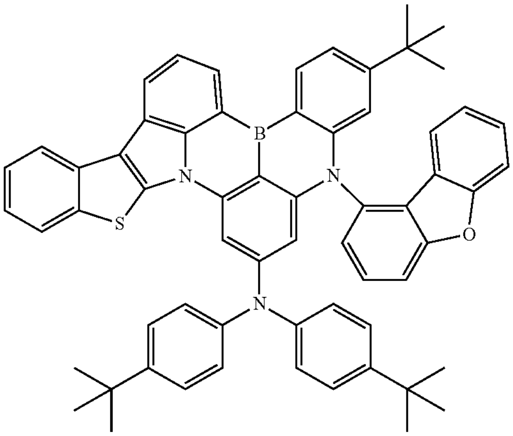
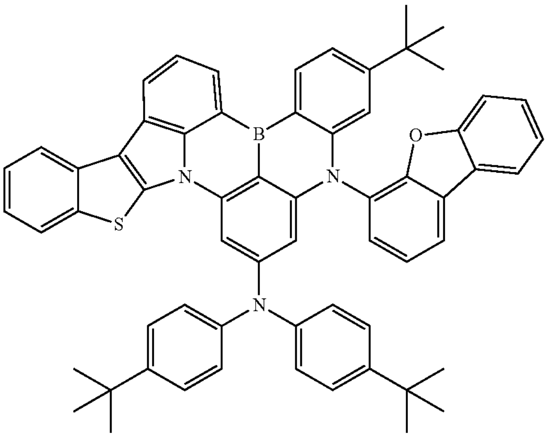

-continued
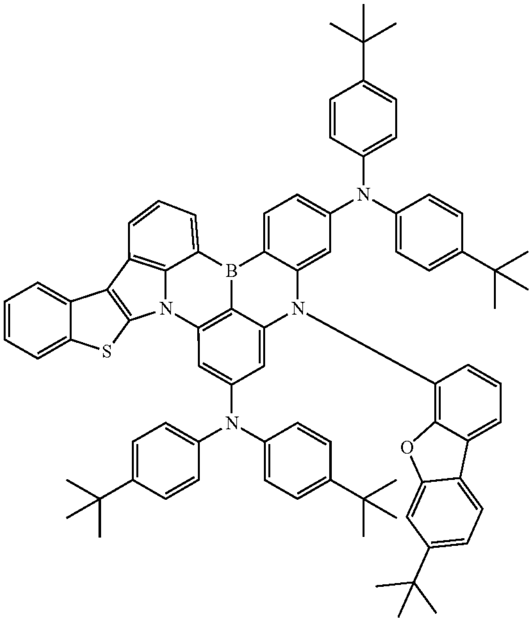
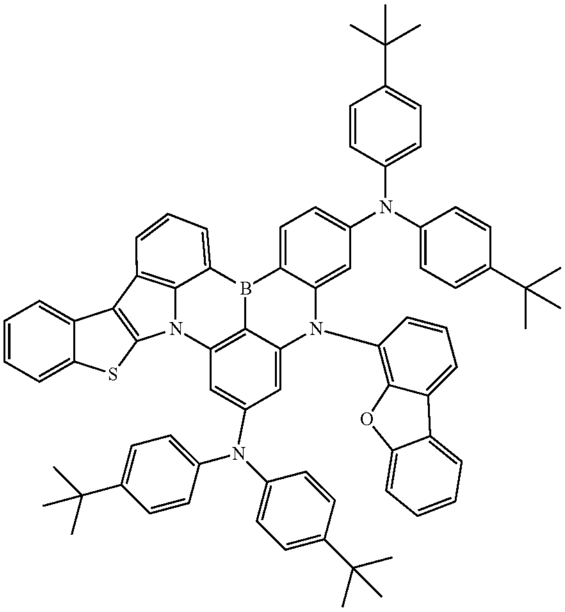 [SMILES: CC(C)(C)c1ccc(N(c2ccc(C(C)(C)C)cc2)c2ccc3c(c2)N(c2cccc4c2oc2ccccc24)c2cc(N(c4ccc(C(C)(C)C)cc4)c4ccc(C(C)(C)C)cc4)cc4c2B3c2cccc3c5c6ccccc6sc5n-4c23)cc1]
-continued
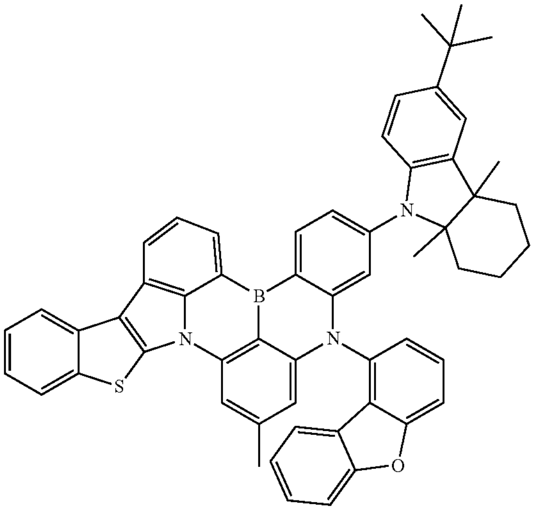
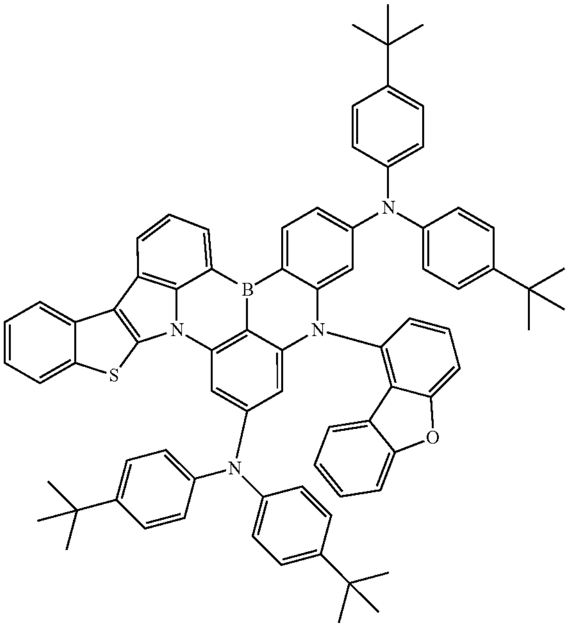
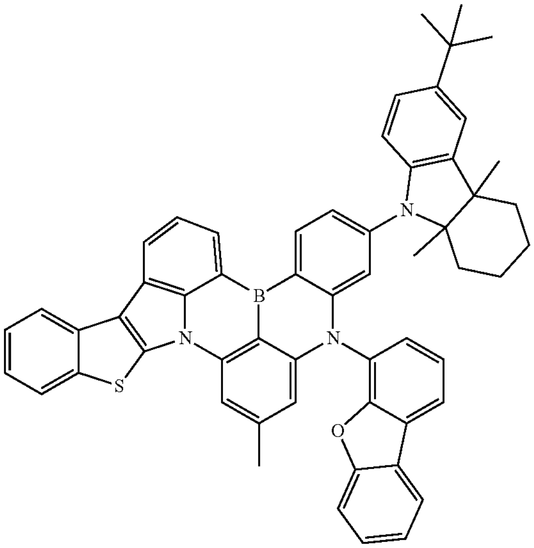

-continued
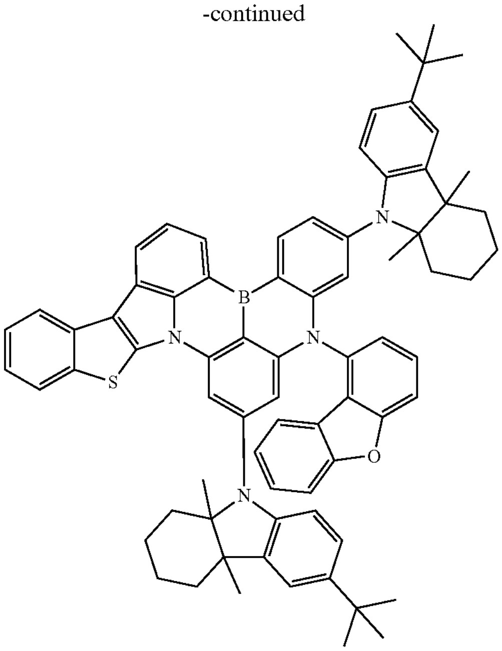
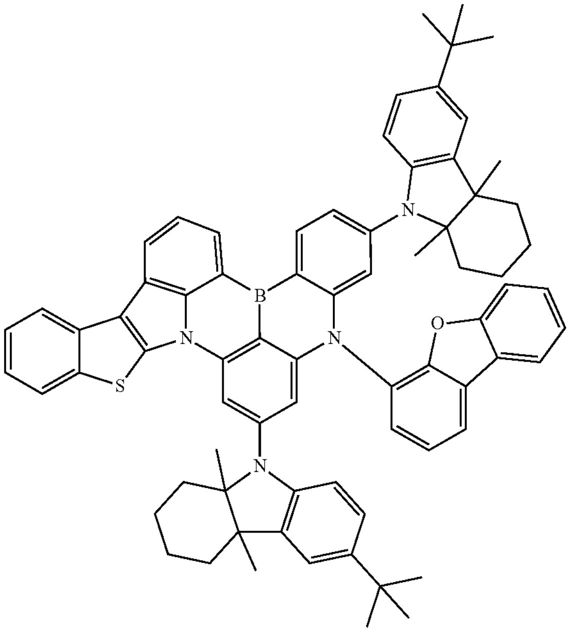 [SMILES: CC(C)(C)c1ccc2c(c1)C1(C)CCCCC1(C)N2c1ccc2c(c1)N(c1cccc3c1oc1ccccc13)c1cc(N3c4ccc(C(C)(C)C)cc4C4(C)CCCCC34C)cc3c1B2c1cccc2c4c5ccccc5sc4n-3c12]
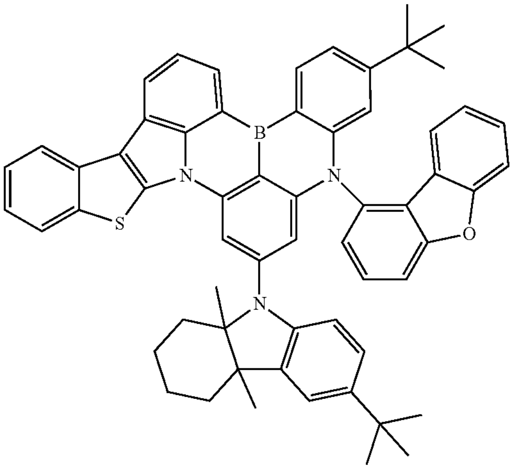
-continued
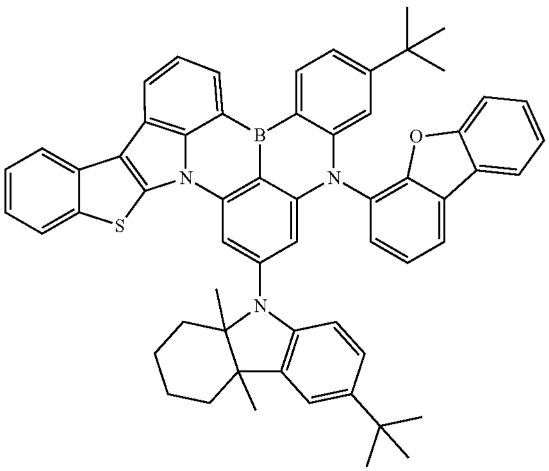
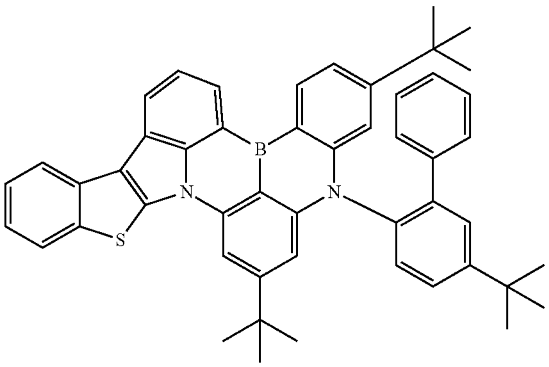
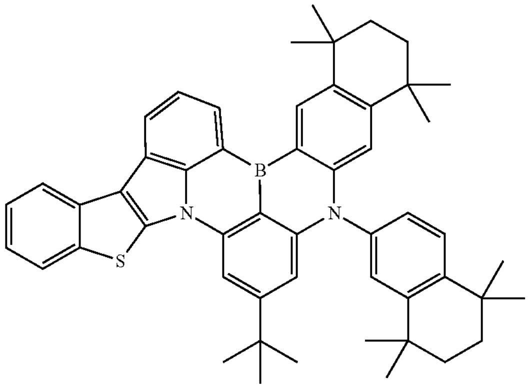
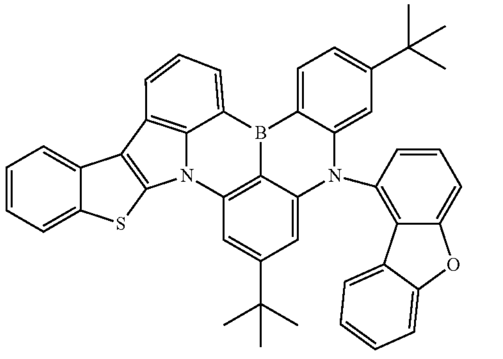

-continued
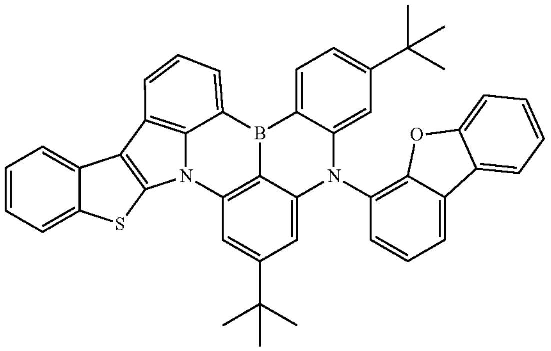
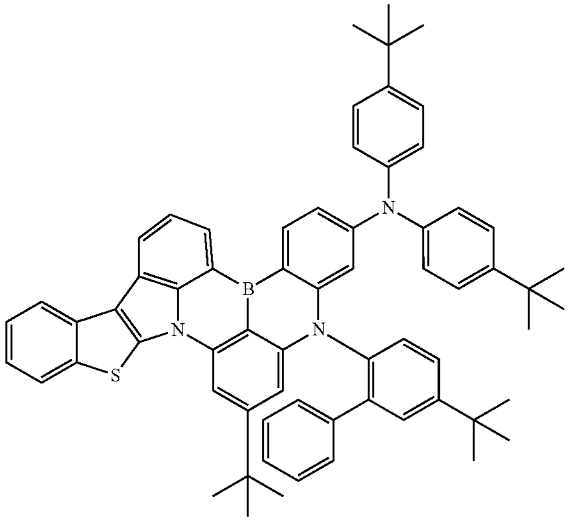
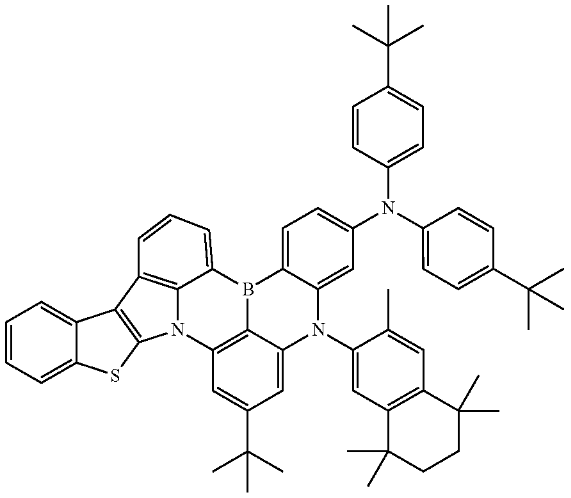
-continued
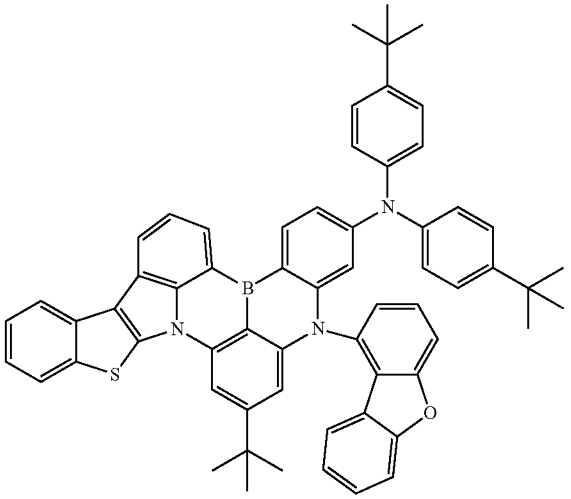
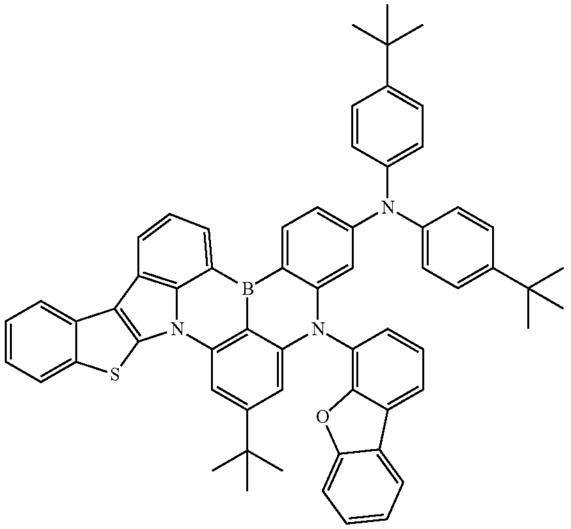 [SMILES: CC(C)(C)c1ccc(N(c2ccc(C(C)(C)C)cc2)c2ccc3c(c2)N(c2cccc4c2oc2ccccc24)c2cc(C(C)(C)C)cc4c2B3c2cccc3c5c6ccccc6sc5n-4c23)cc1]
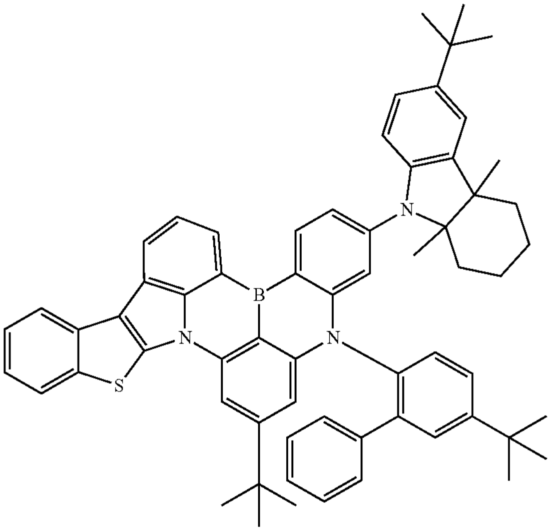

-continued
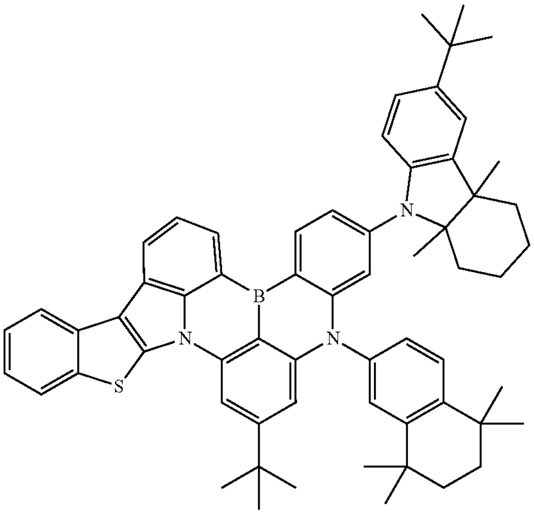
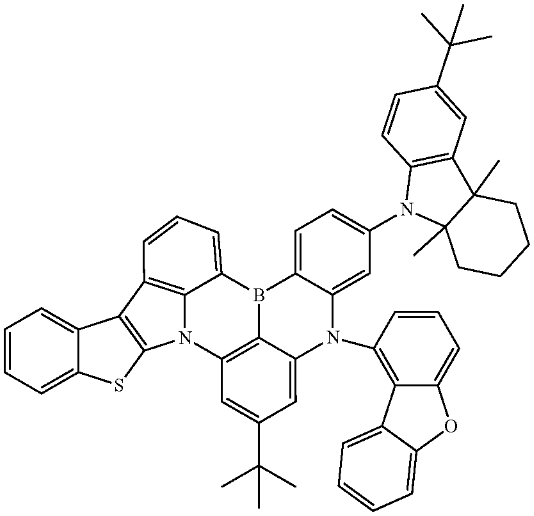
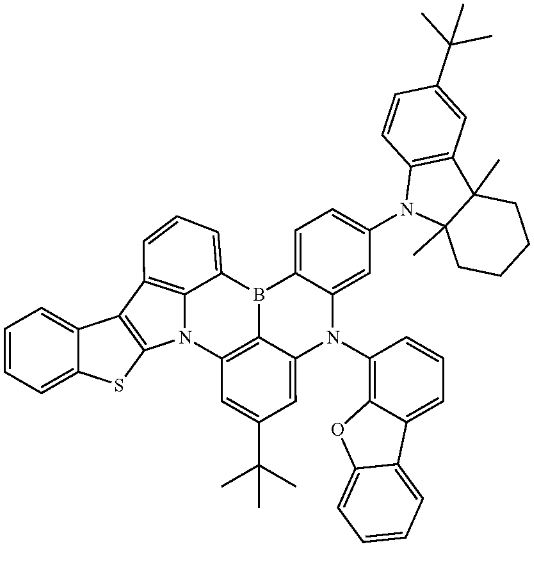
-continued
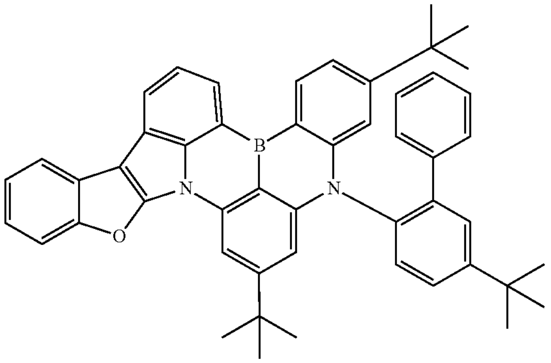
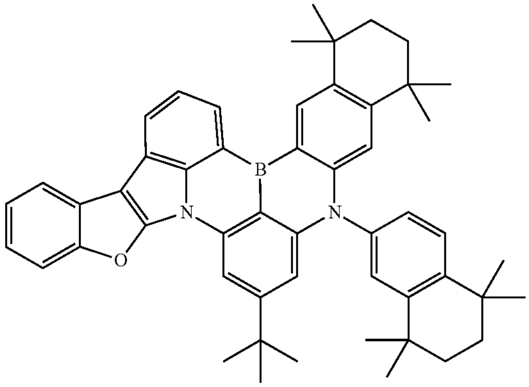
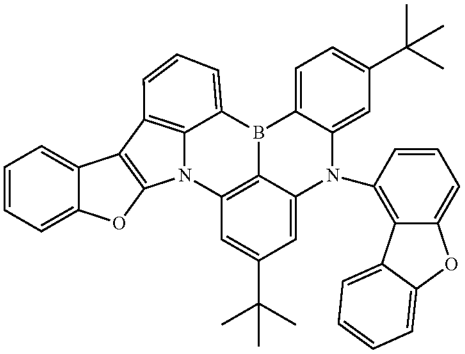
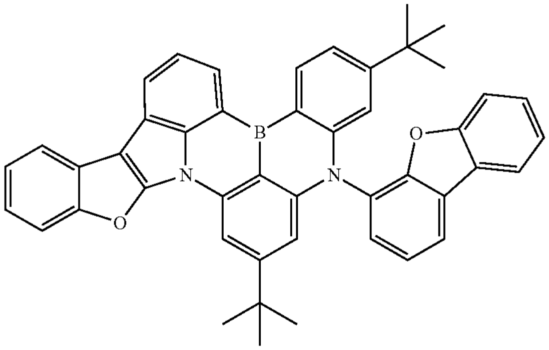

-continued
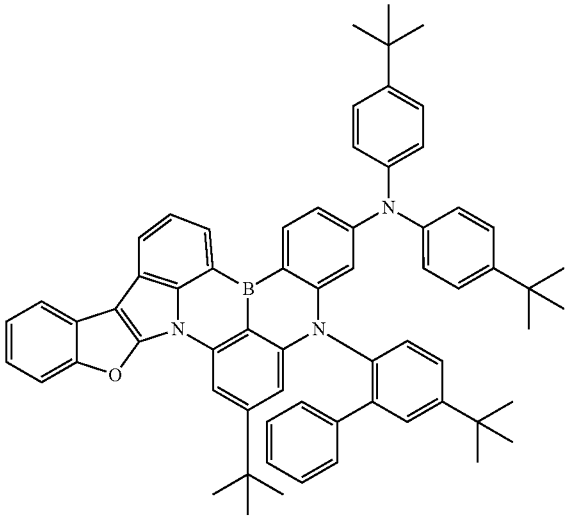
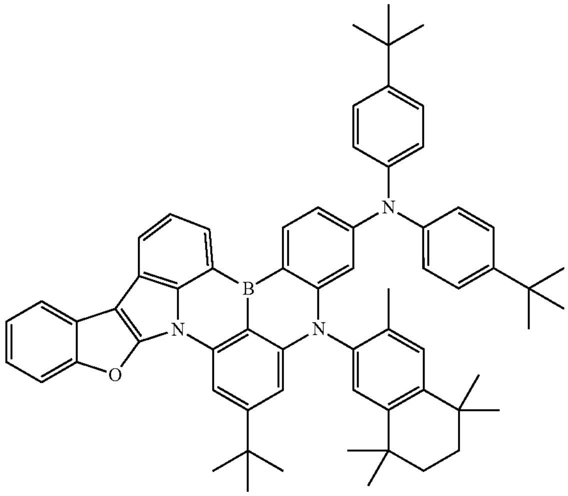
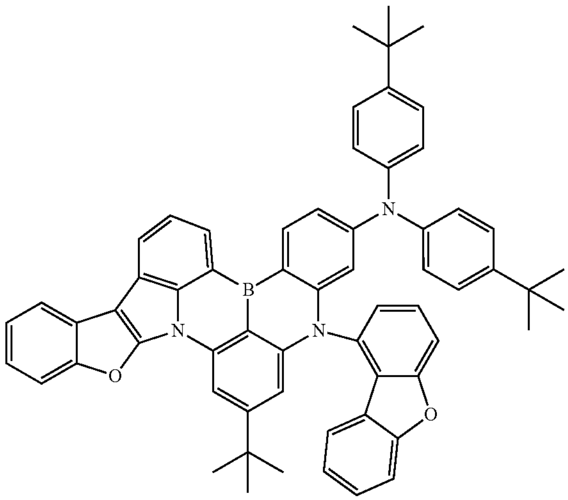
-continued
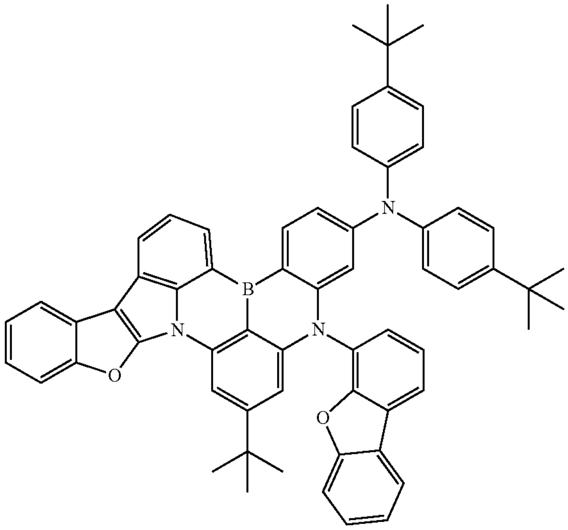
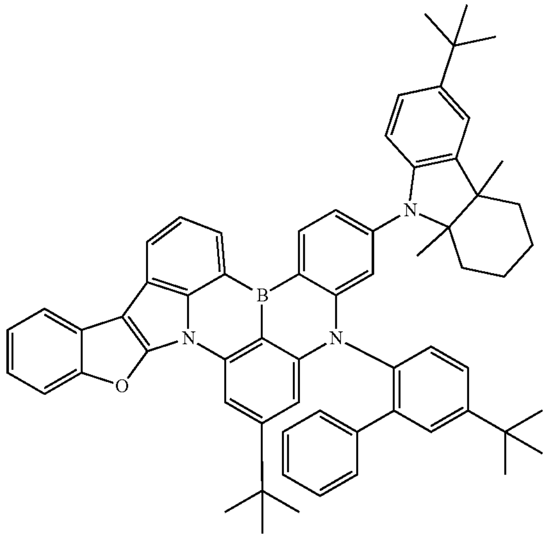
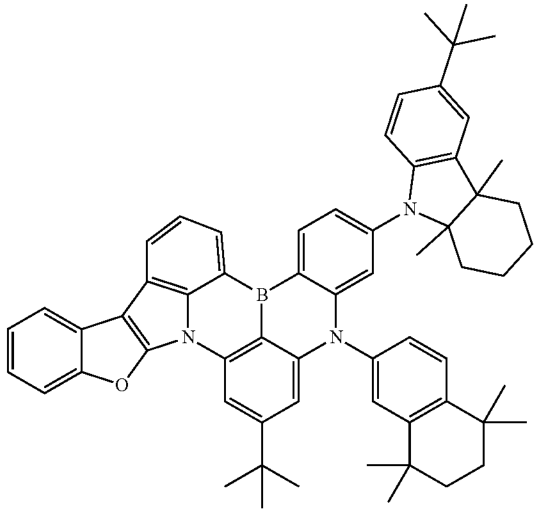

-continued
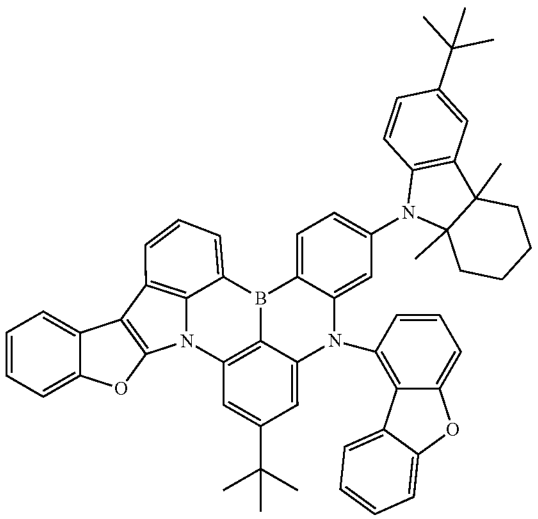
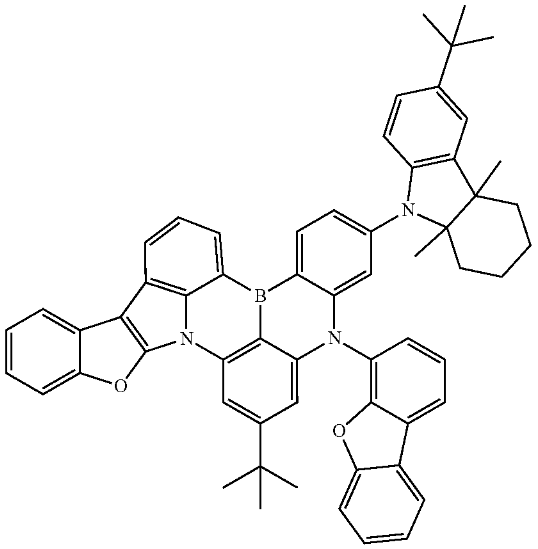 [SMILES: CC(C)(C)c1cc2c3c(c1)-n1c4sc5ccccc5c4c4cccc(c41)B3c1ccc(N3c4ccc(C(C)(C)C)cc4C4(C)CCCCC34C)cc1N2c1cccc2c1oc1ccccc12]
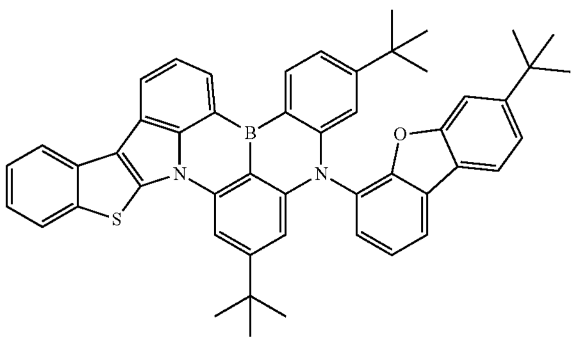
-continued
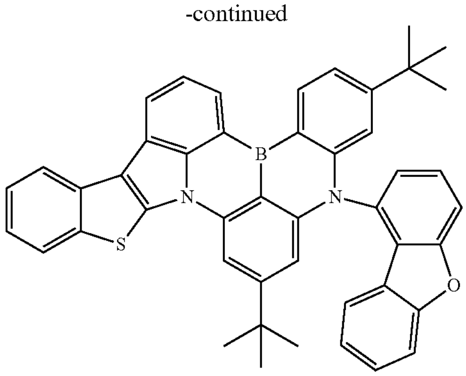
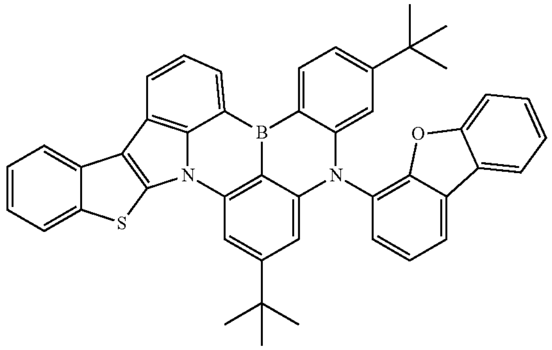
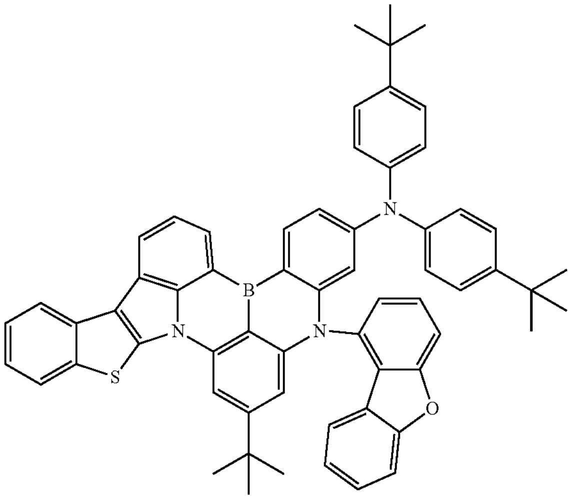
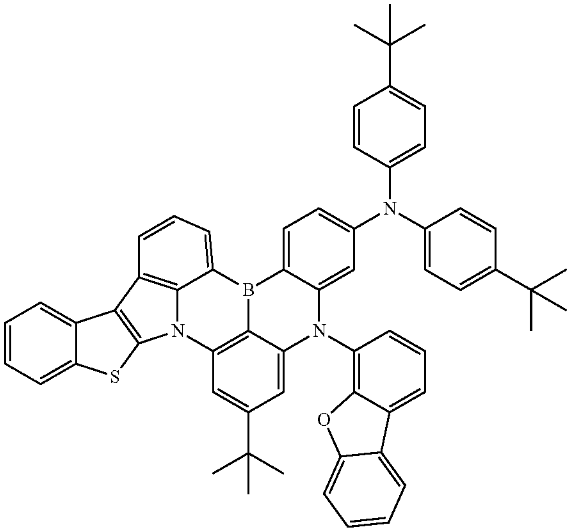

-continued
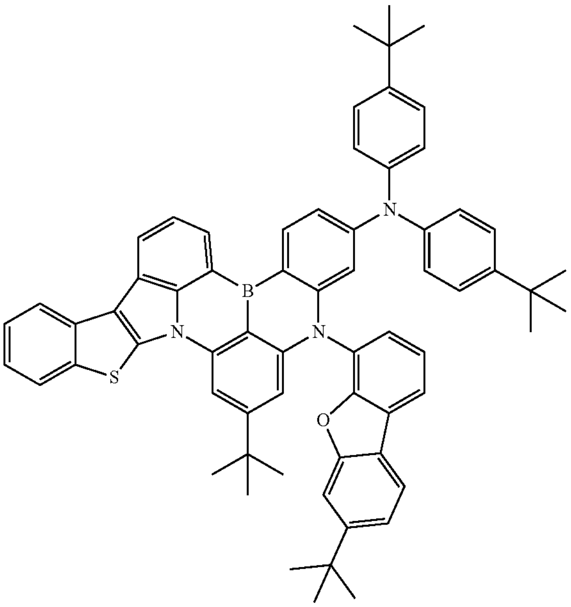
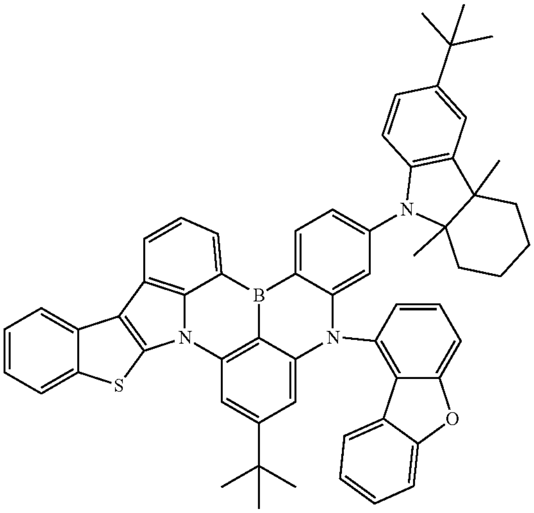
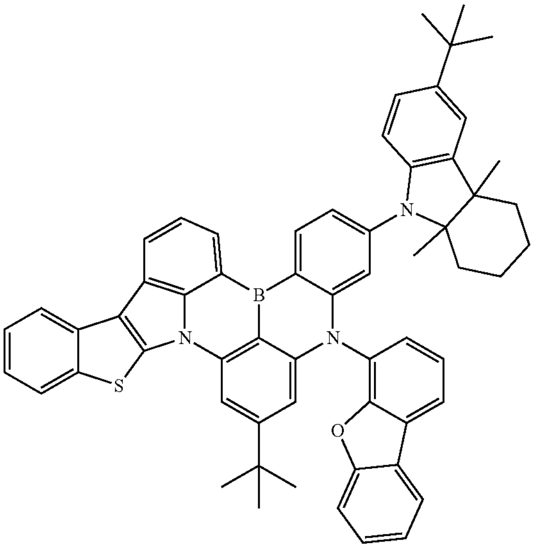
-continued
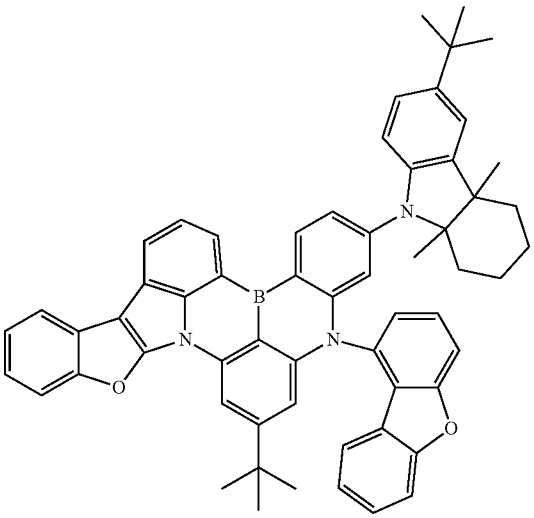
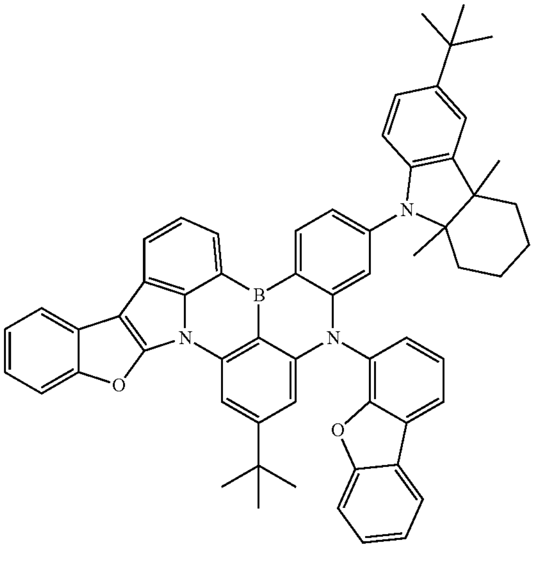
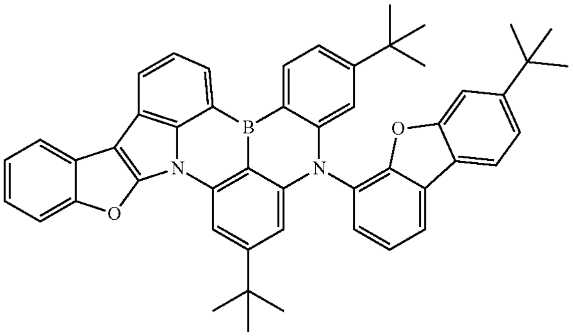

-continued
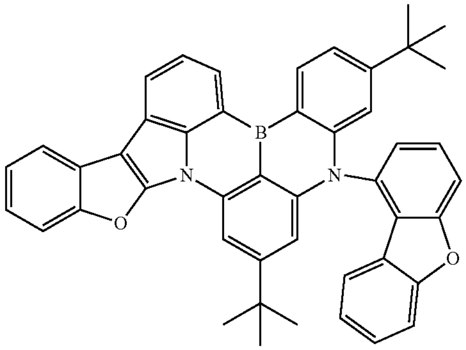
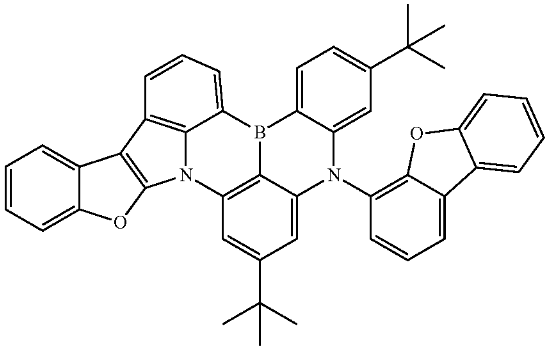
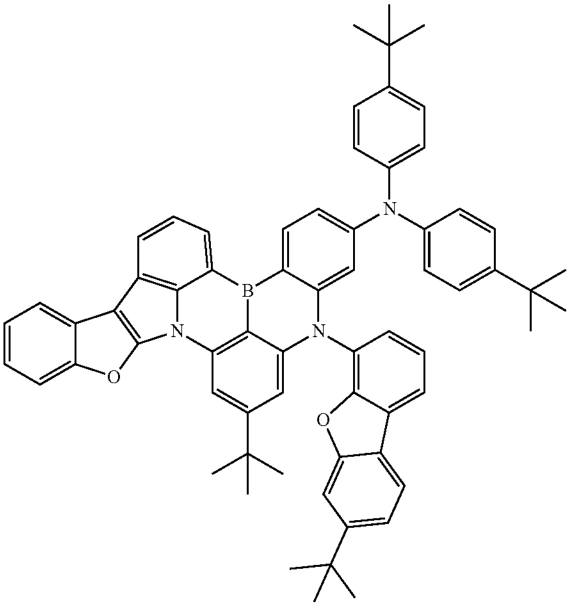
-continued
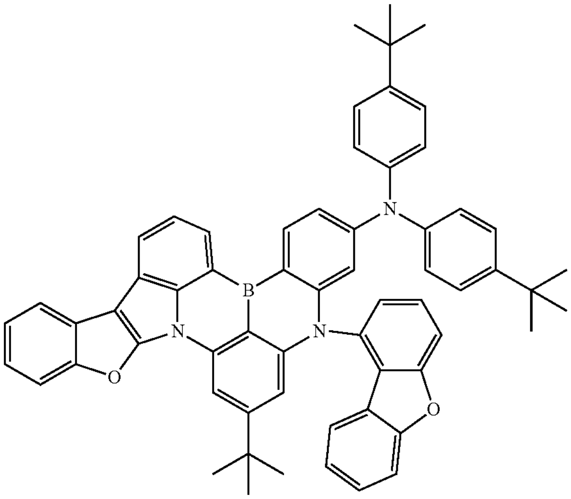
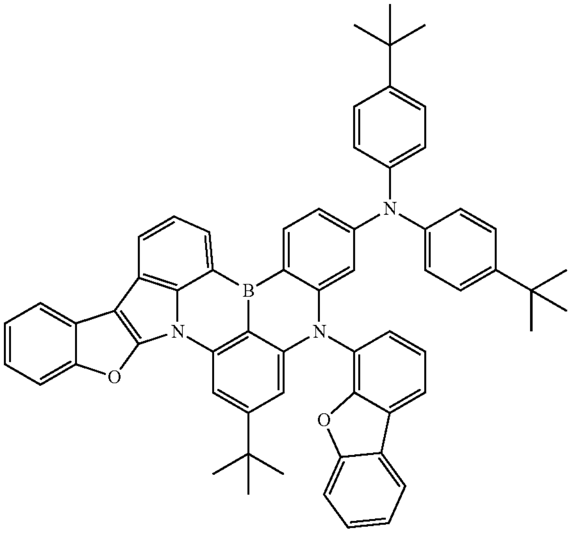 [SMILES: CC(C)(C)c1ccc(N(c2ccc(C(C)(C)C)cc2)c2ccc3c(c2)N(c2cccc4c2oc2ccccc24)c2cc(C(C)(C)C)cc4c2B3c2cccc3c5c6ccccc6oc5n-4c23)cc1]
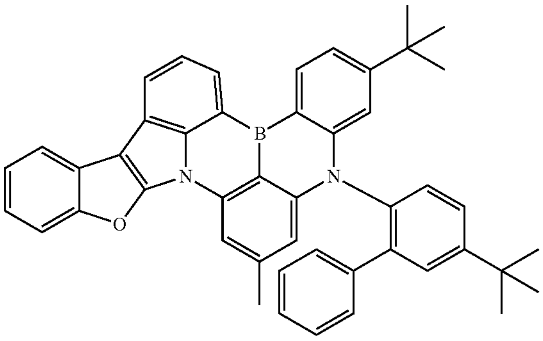

-continued
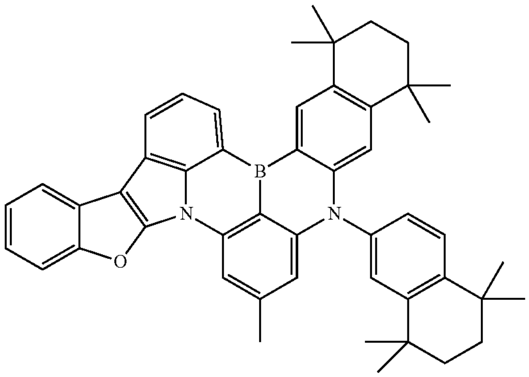
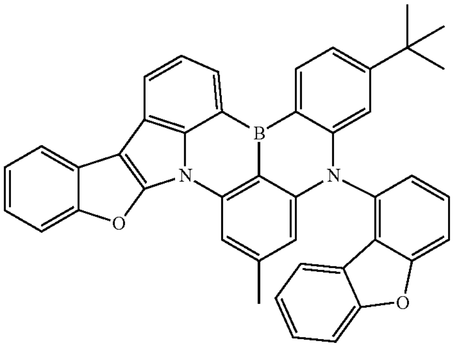
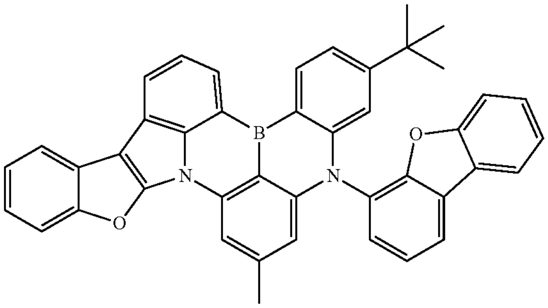
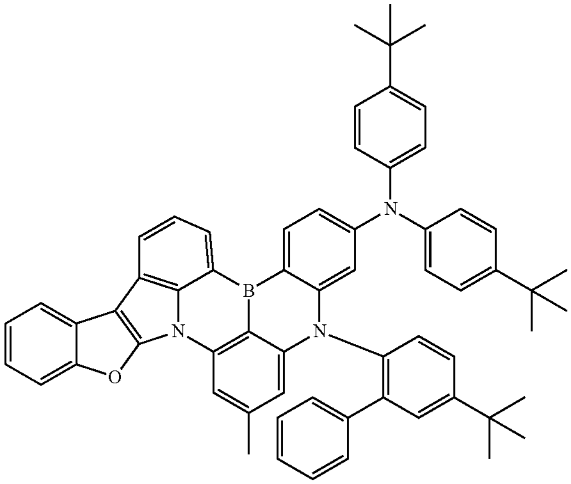
-continued
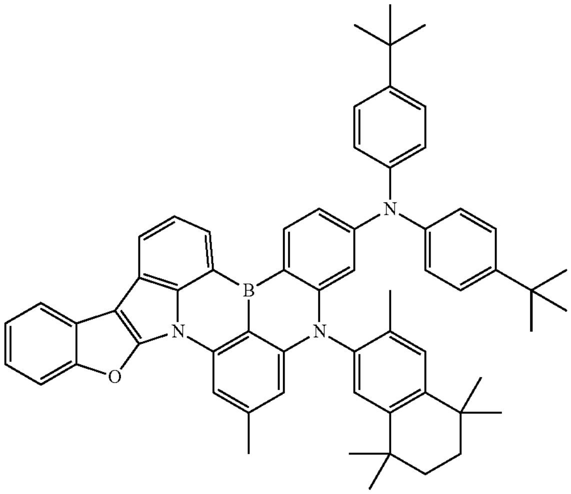
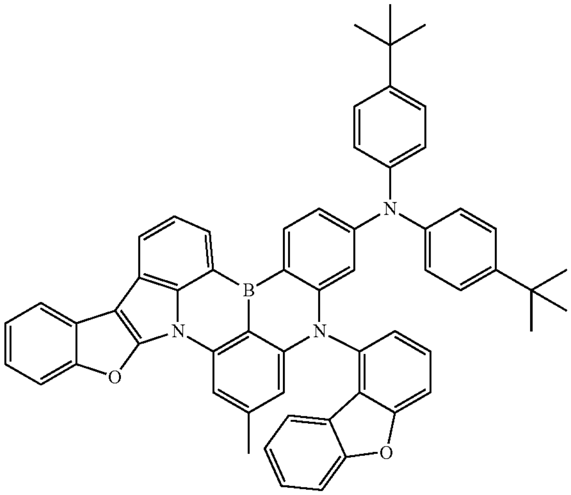
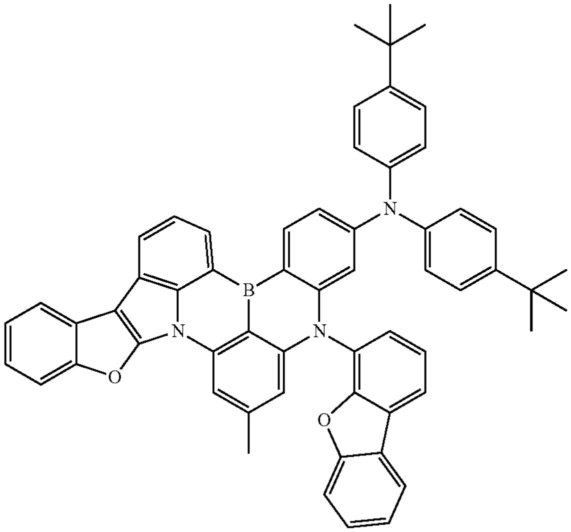

-continued
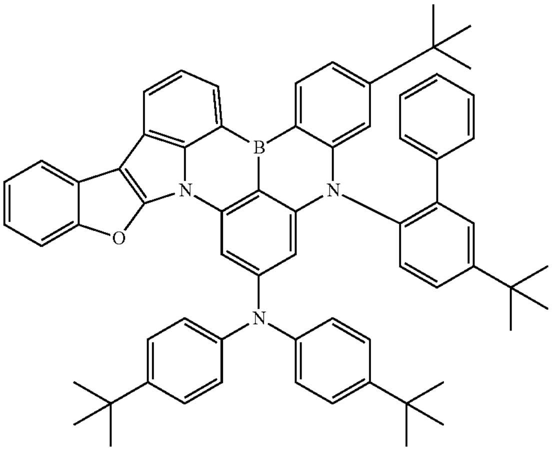
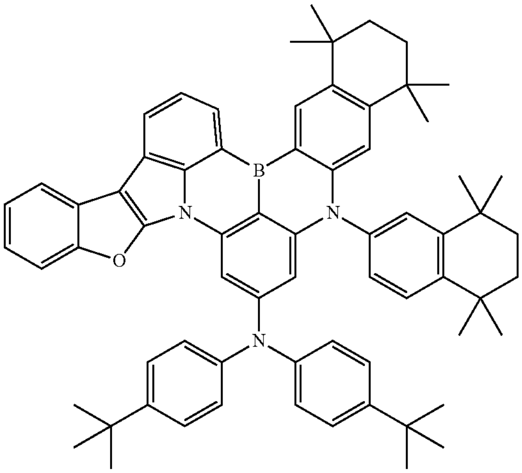
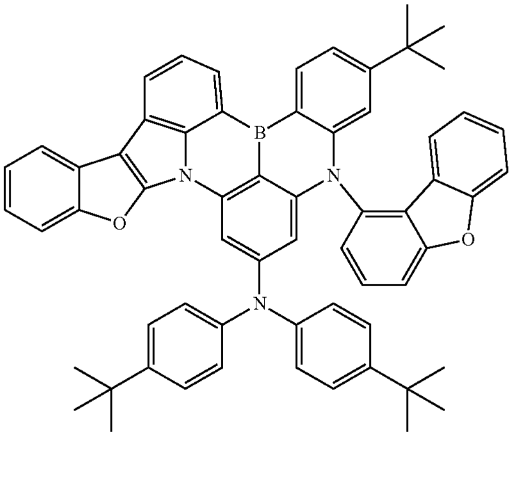
-continued
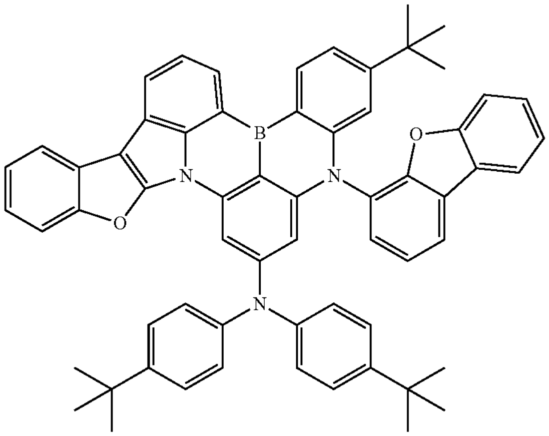
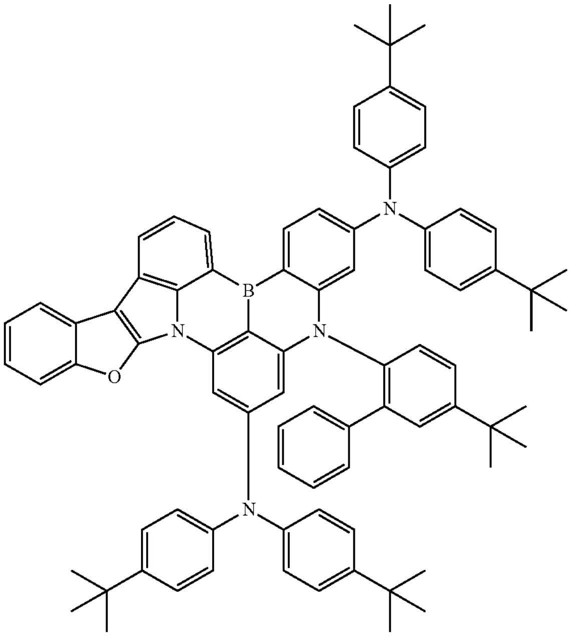
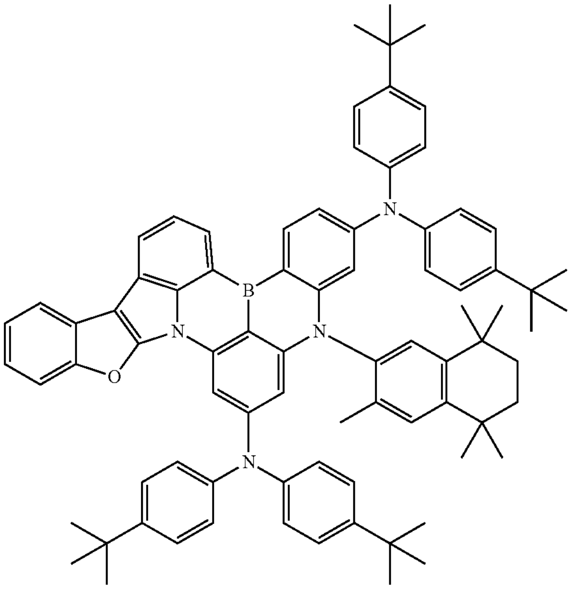

-continued
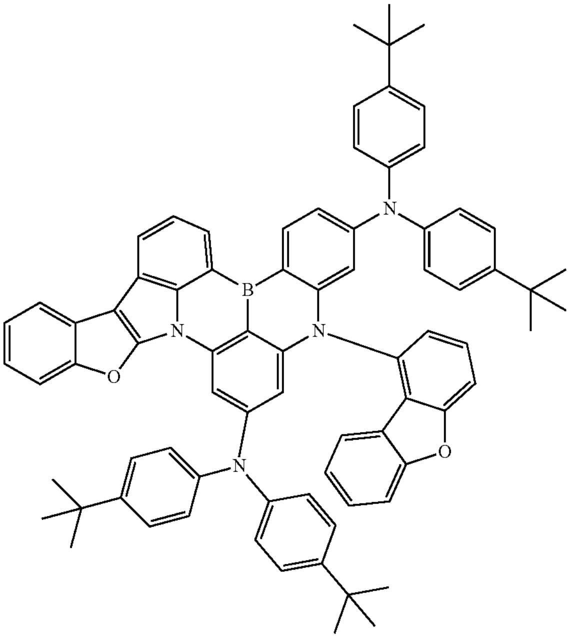
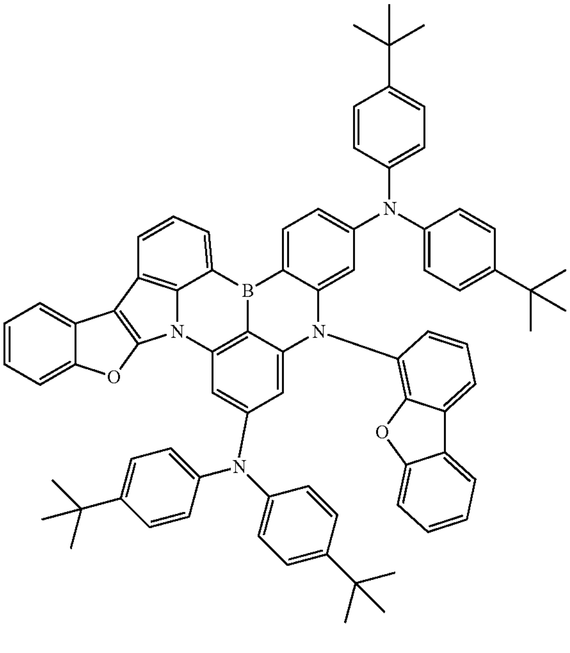
-continued
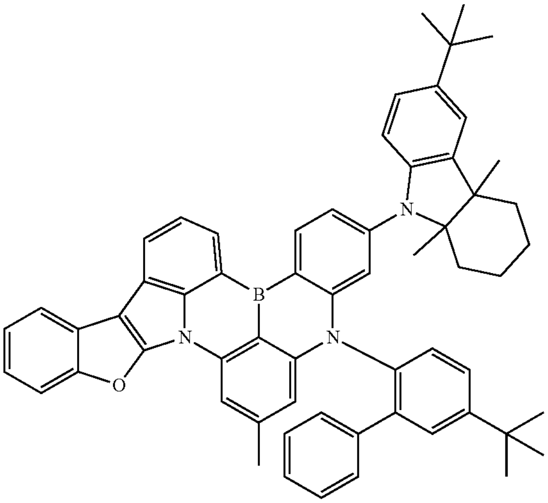
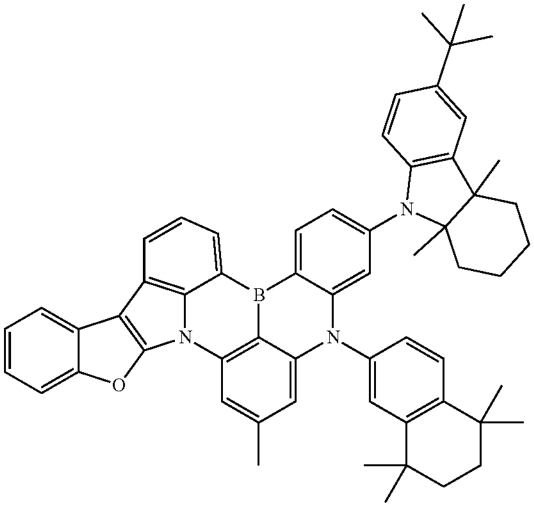
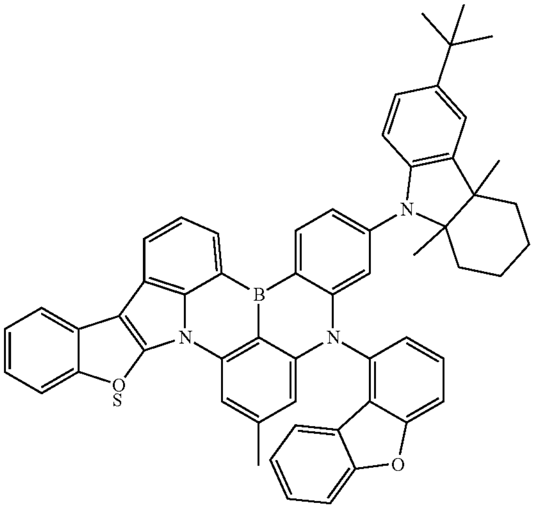

-continued
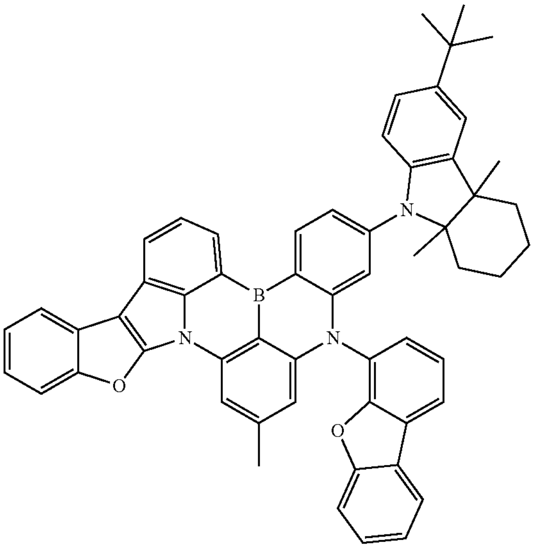
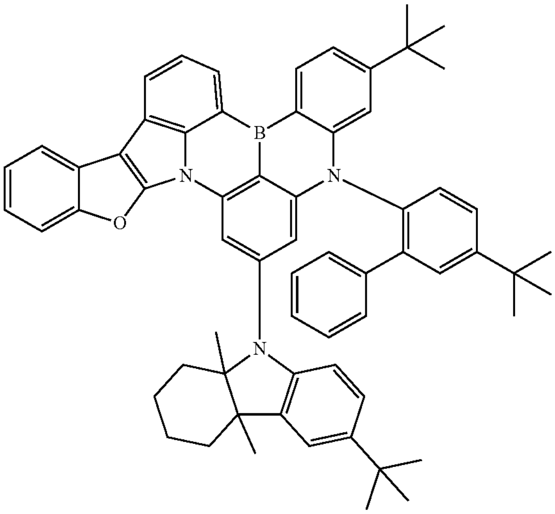
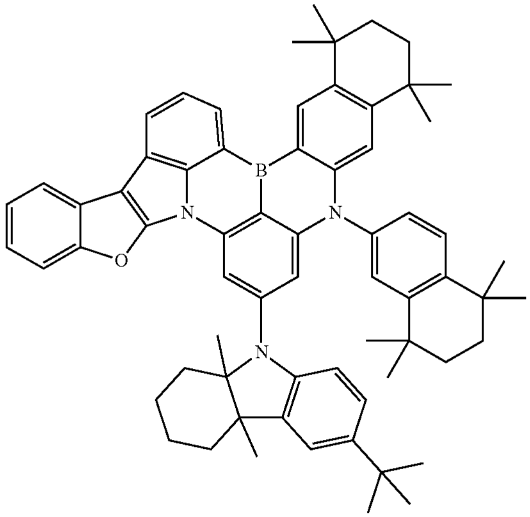
-continued
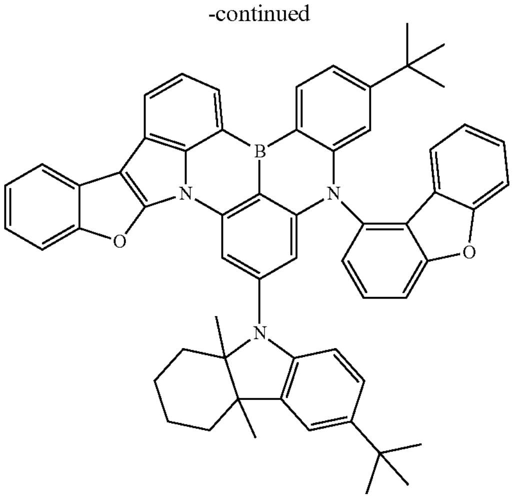
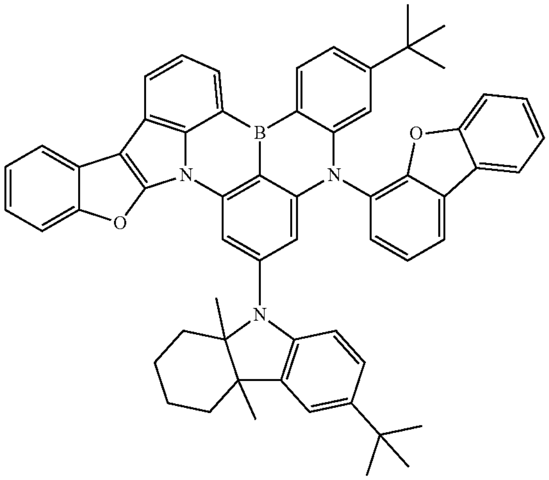
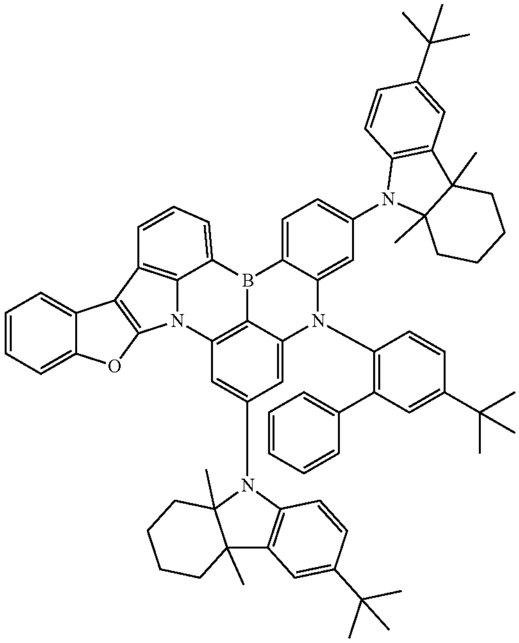

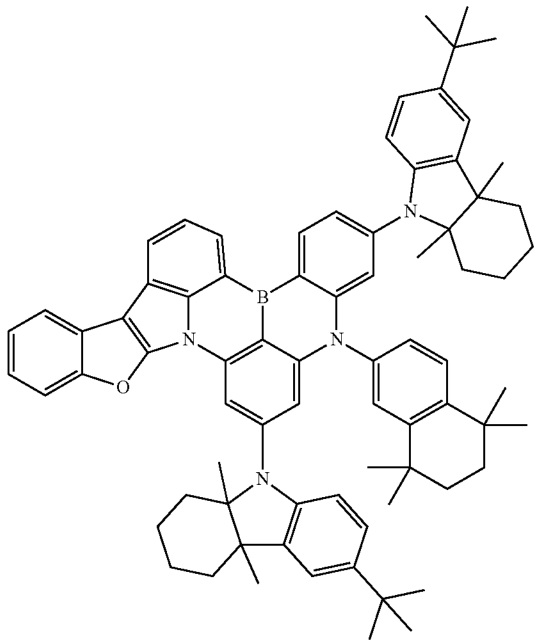
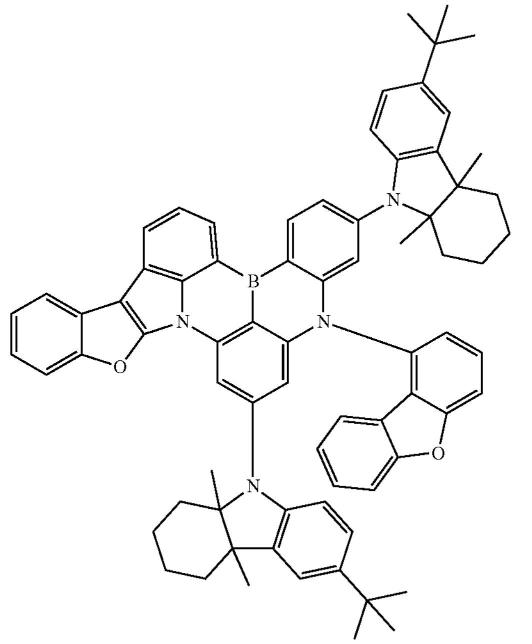
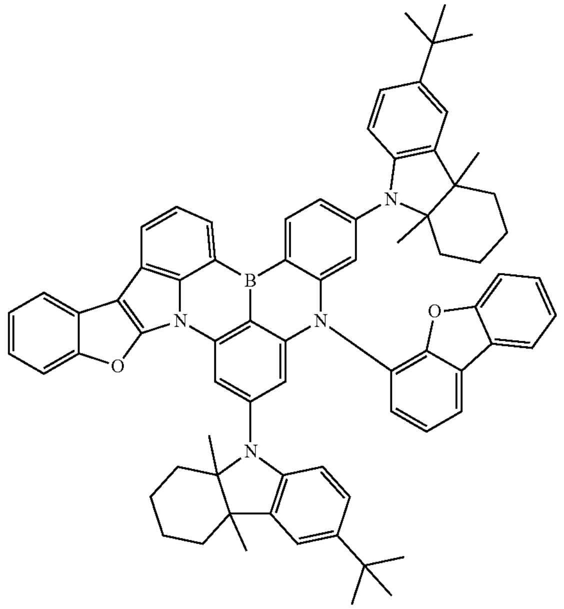
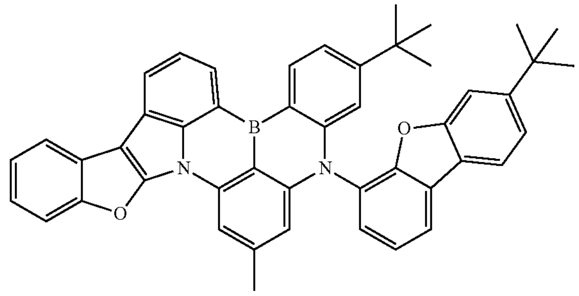
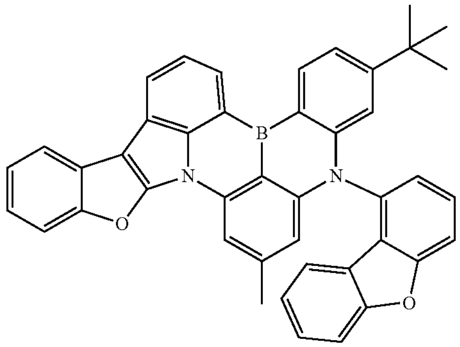
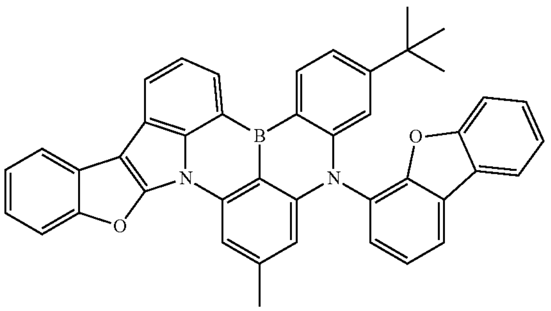

-continued
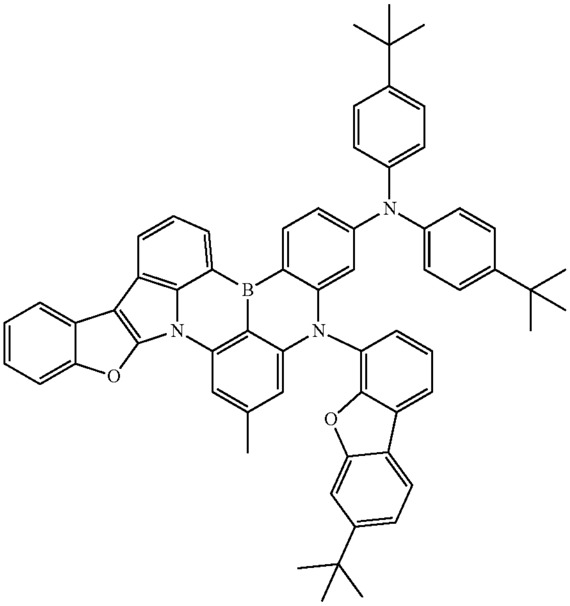
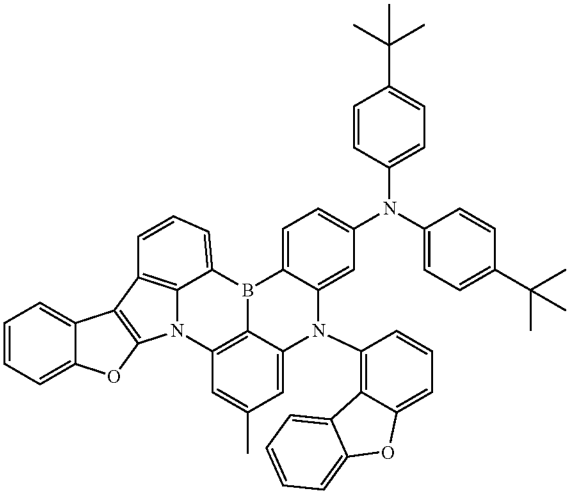
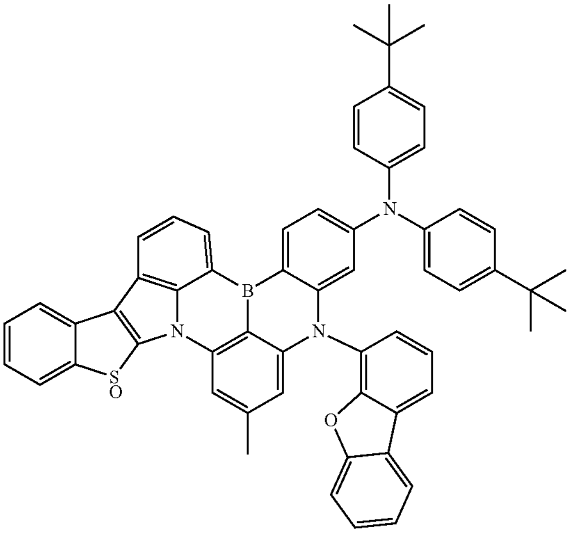
-continued
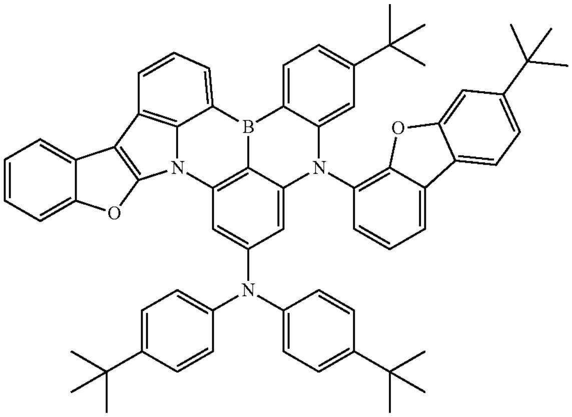
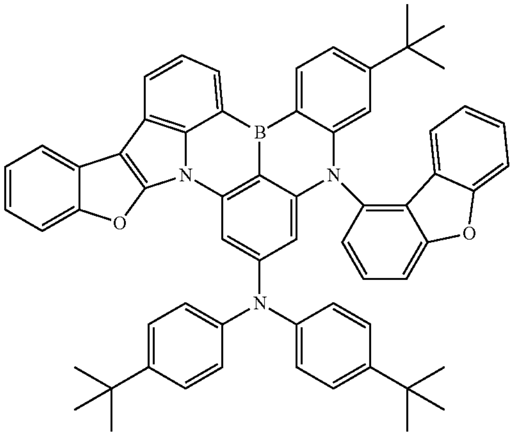
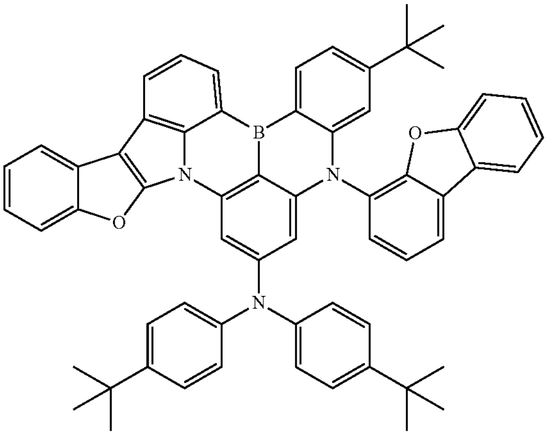

-continued
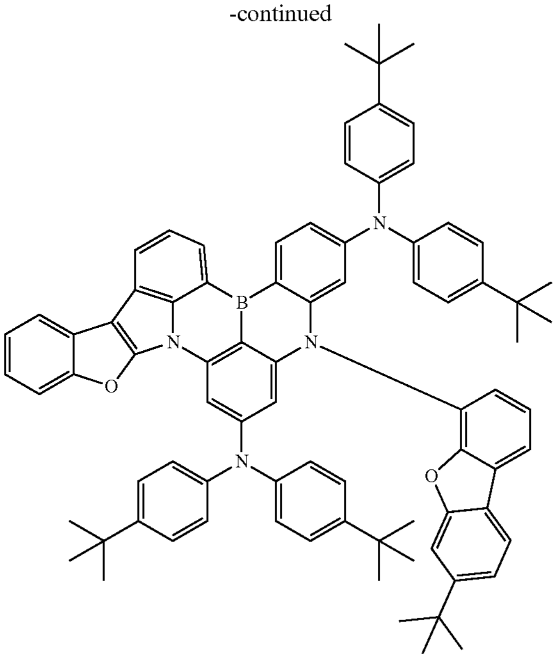
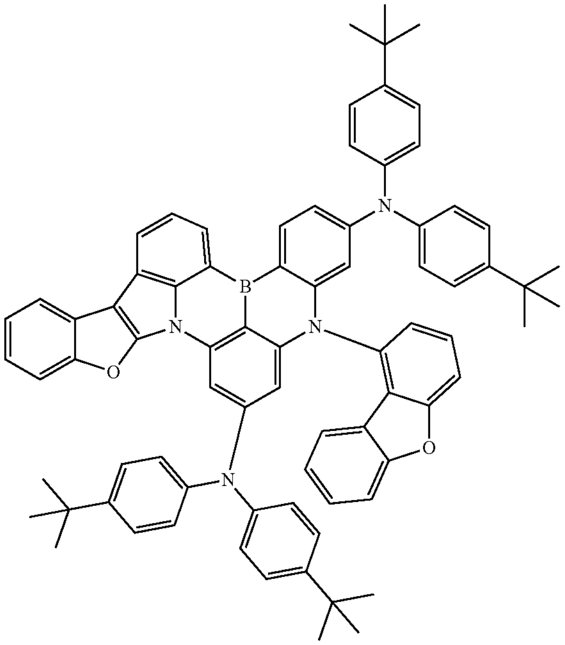
-continued
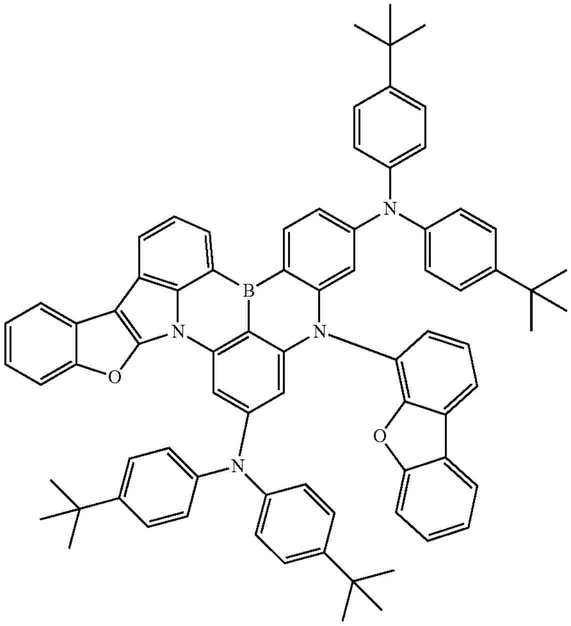
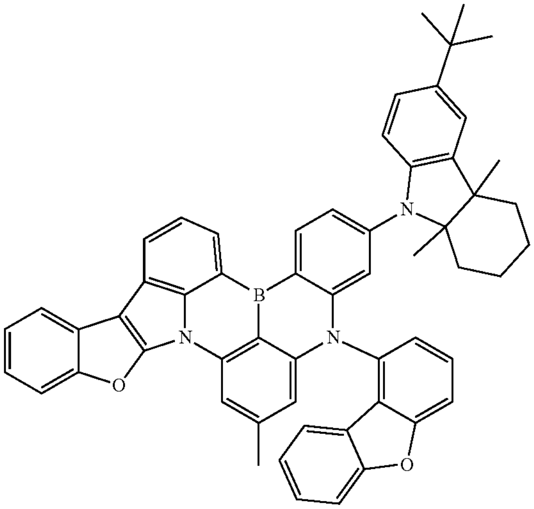
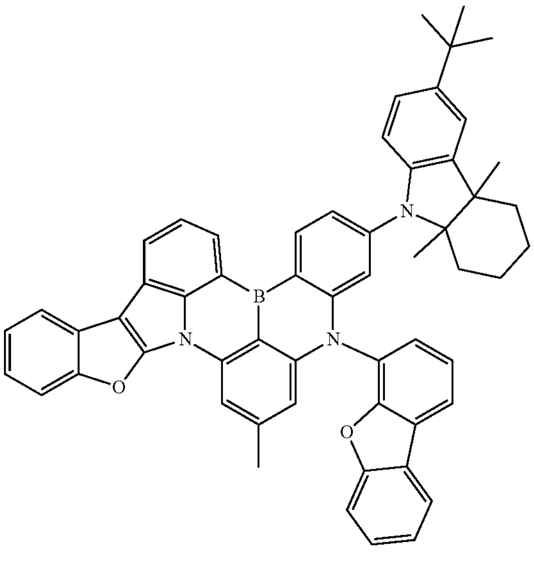

-continued
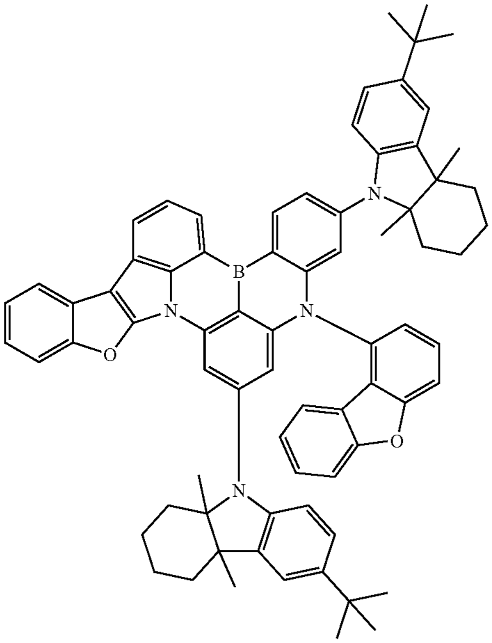
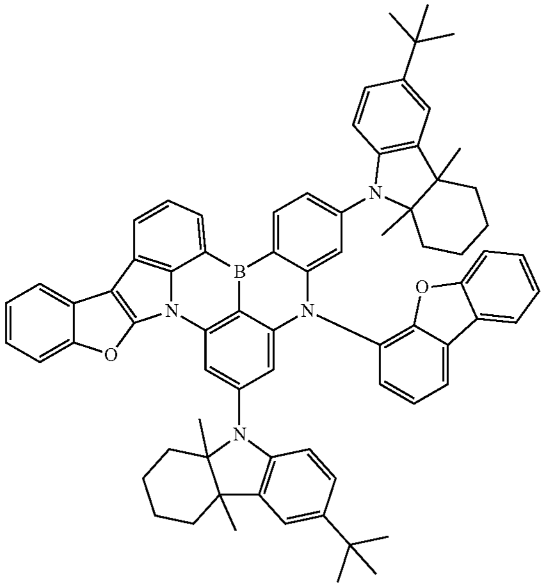
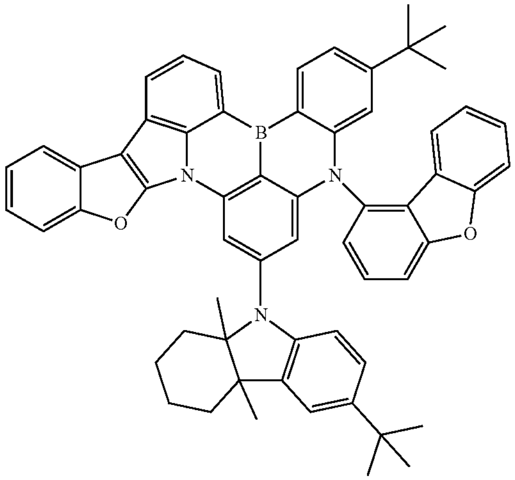
-continued
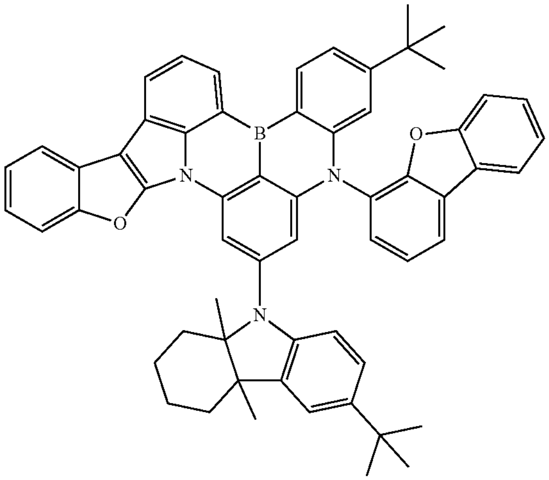
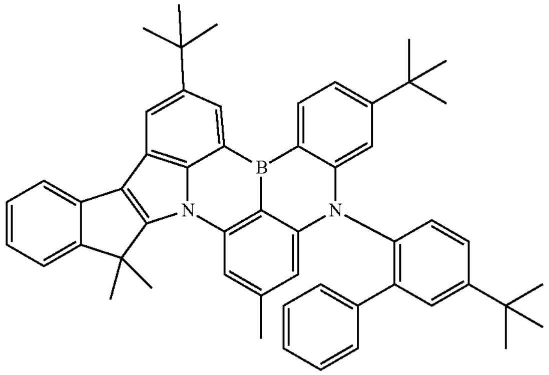
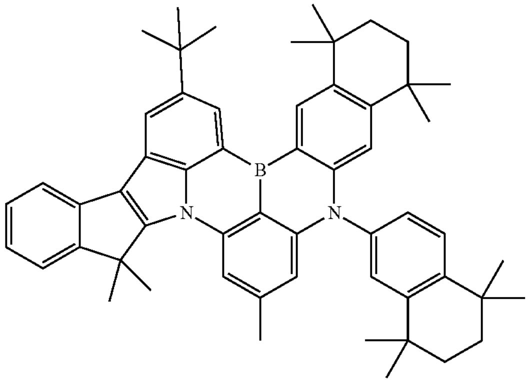
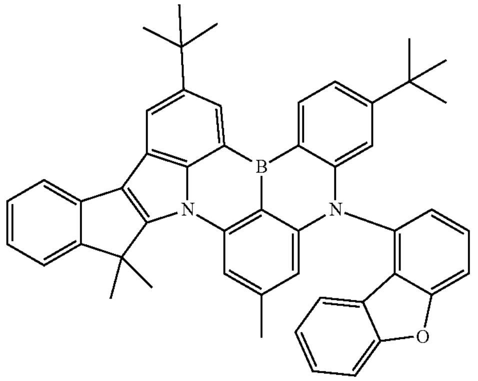

-continued
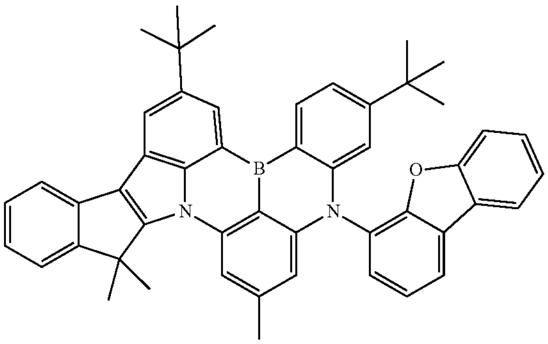
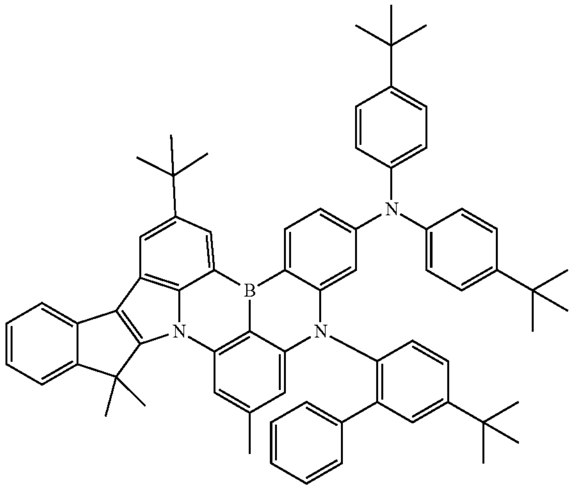
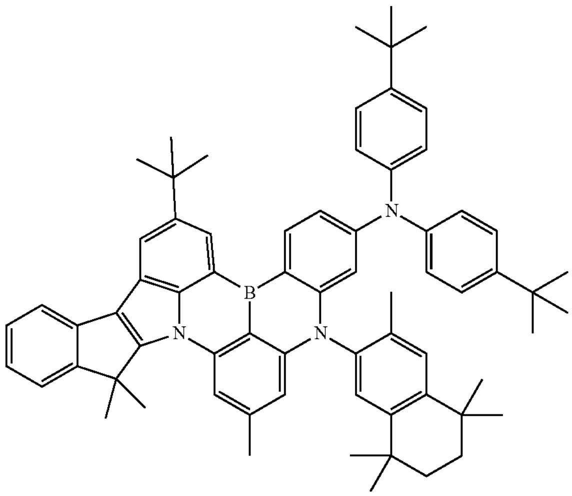
-continued
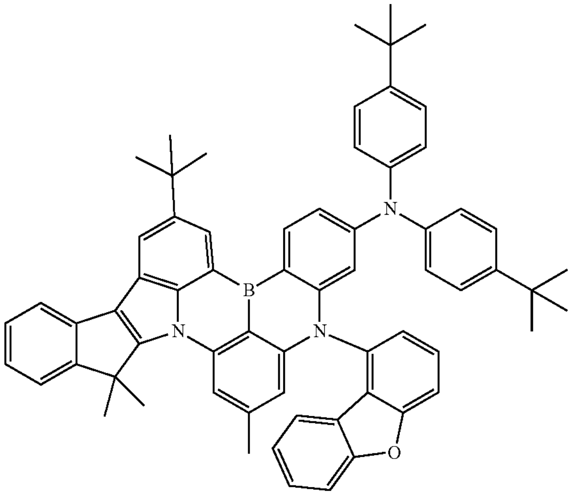
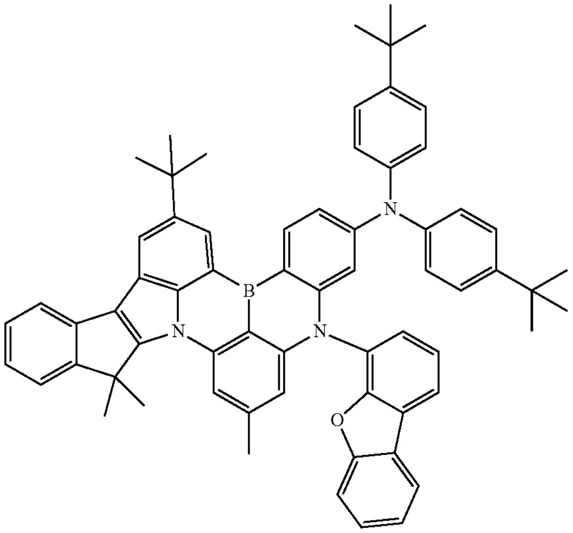
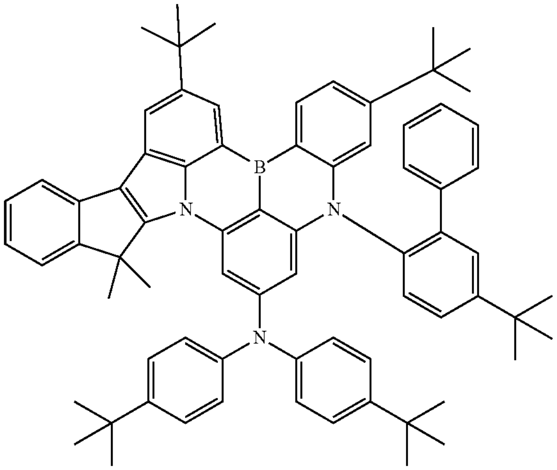

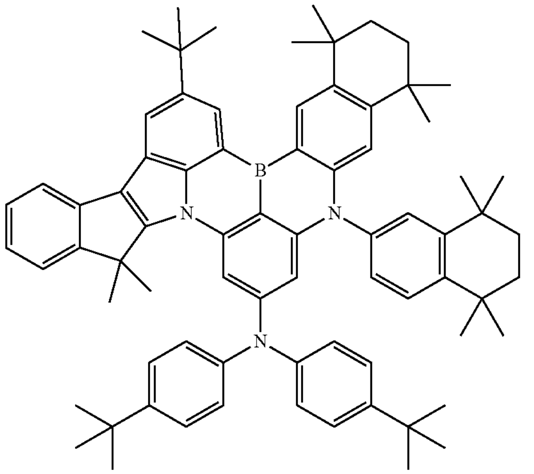
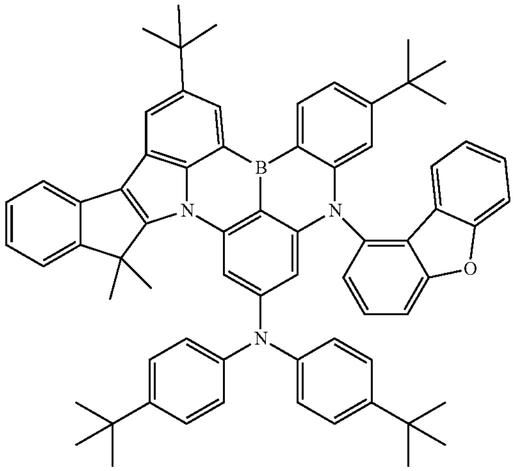
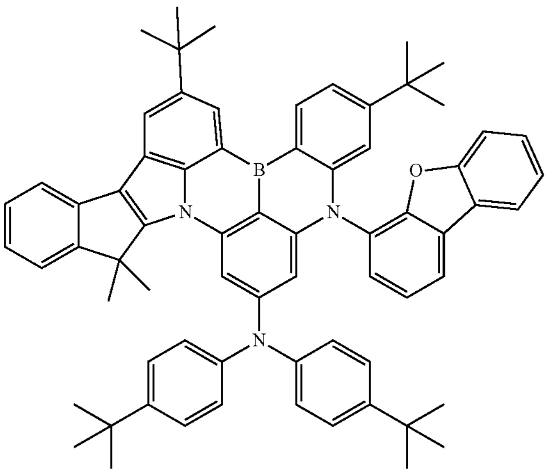
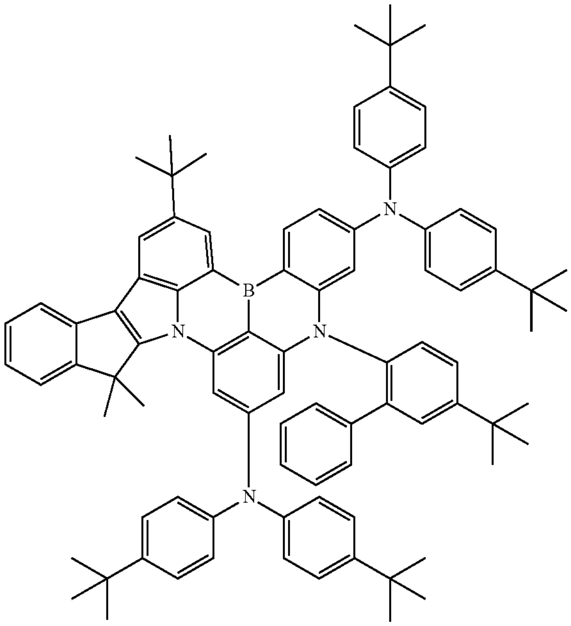
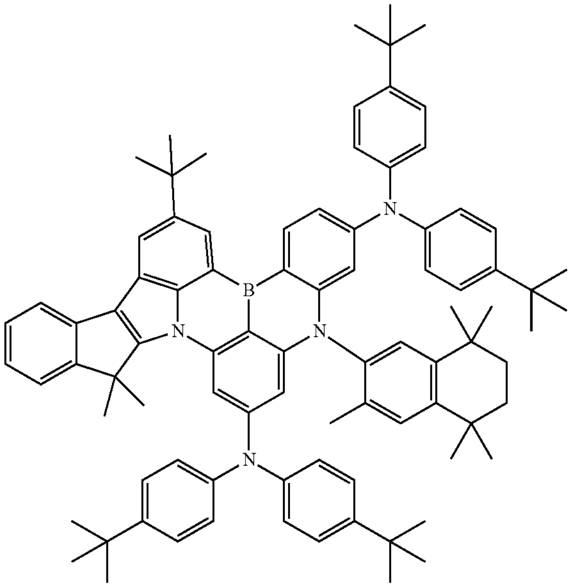

-continued
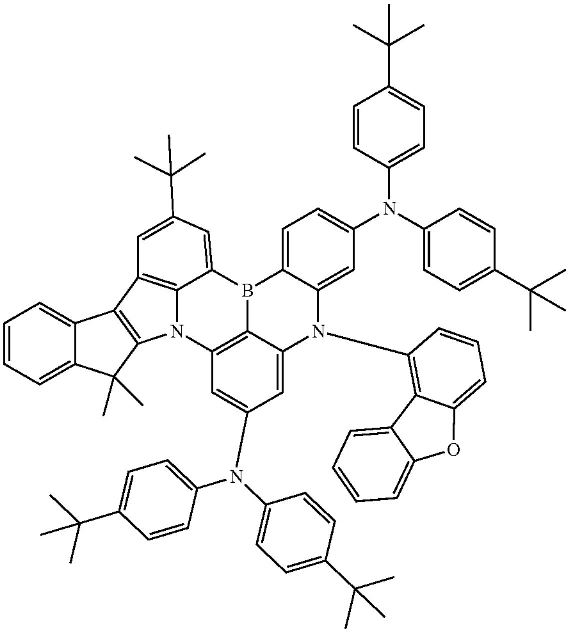
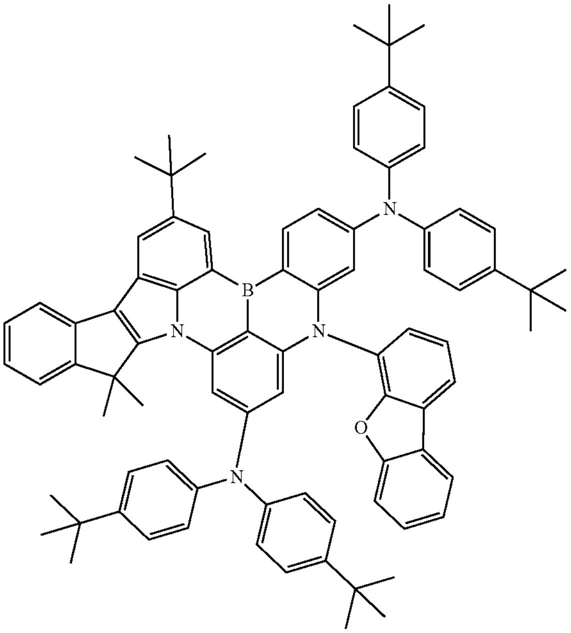
-continued
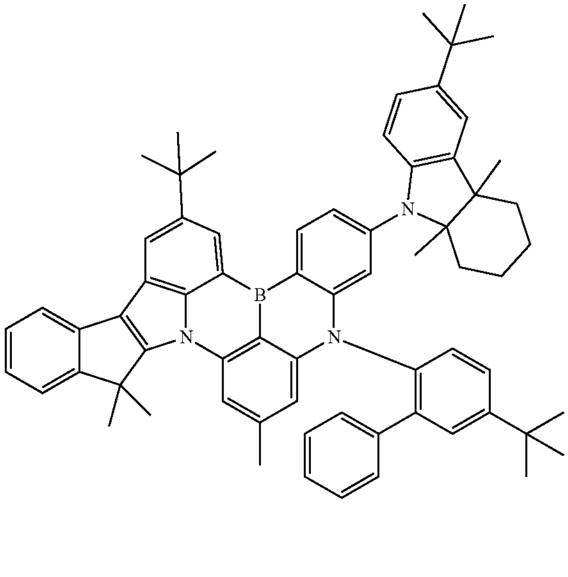
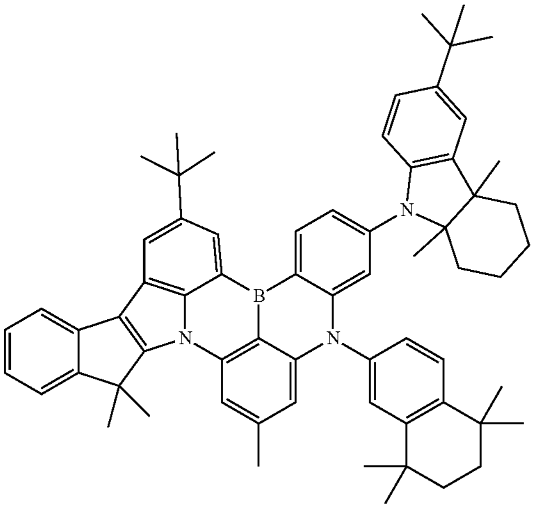
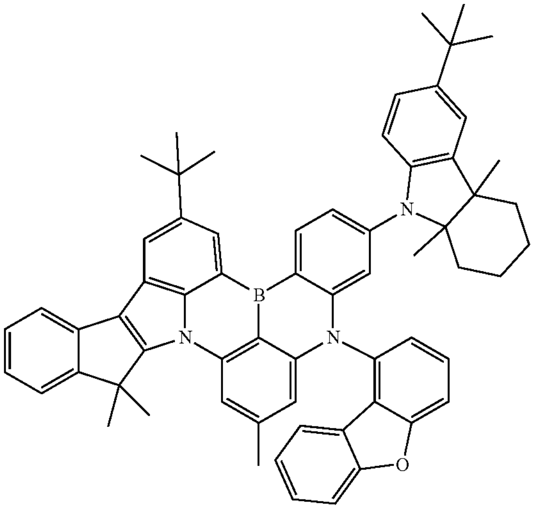

-continued
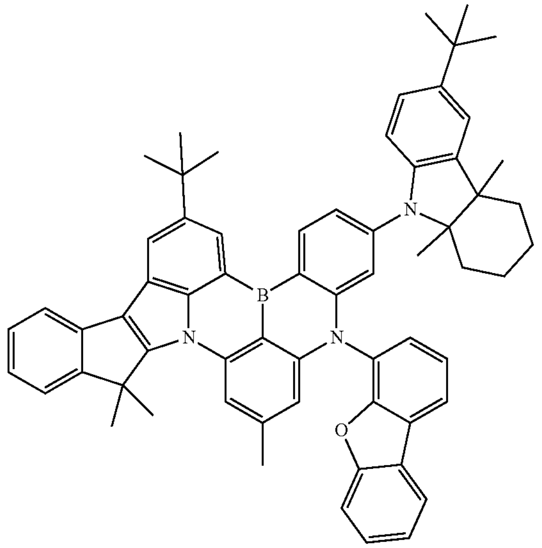
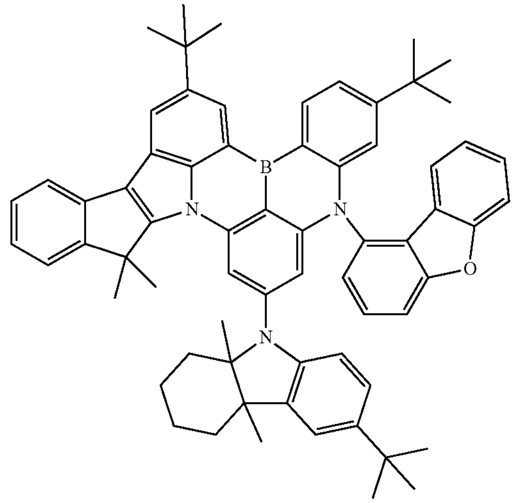
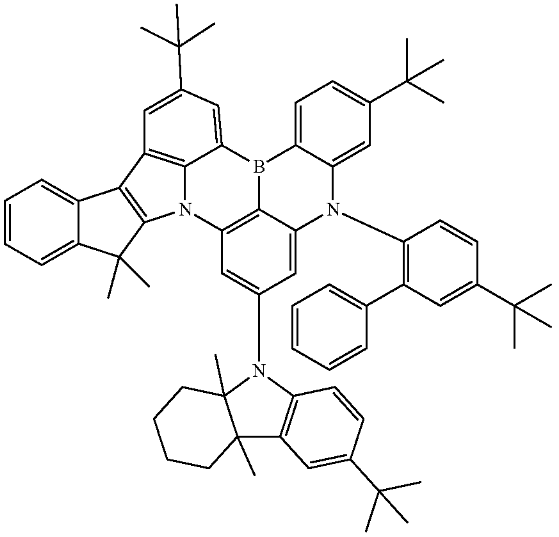
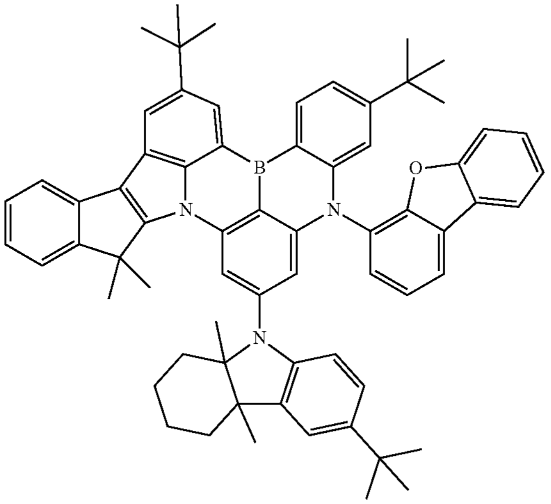
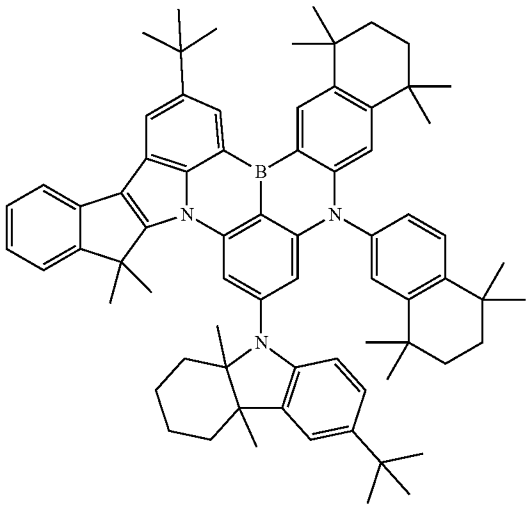
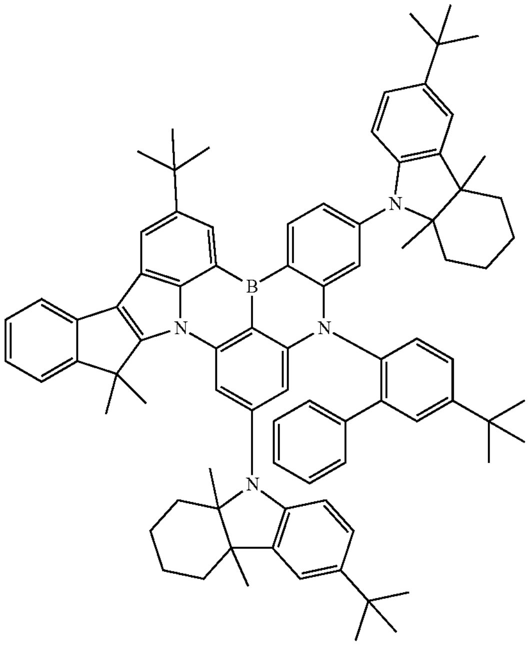

-continued
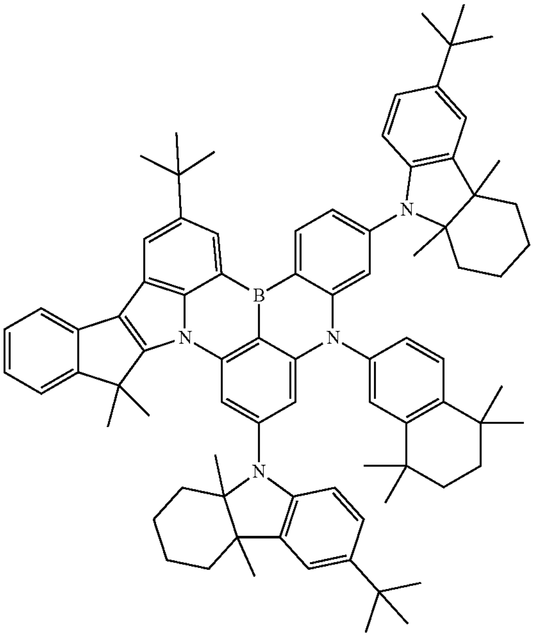
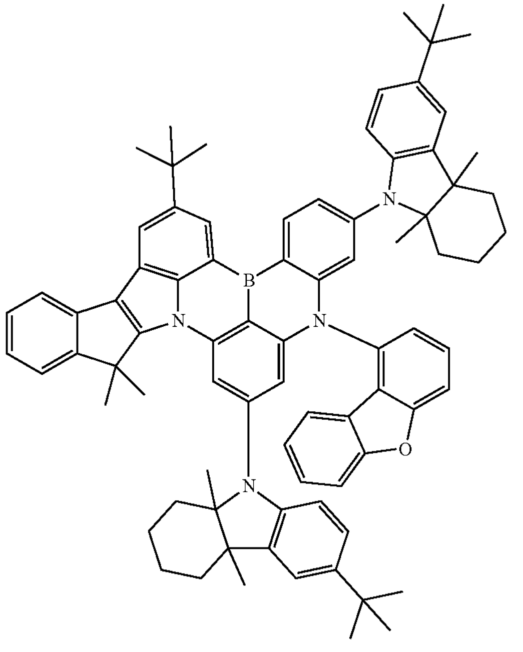
-continued
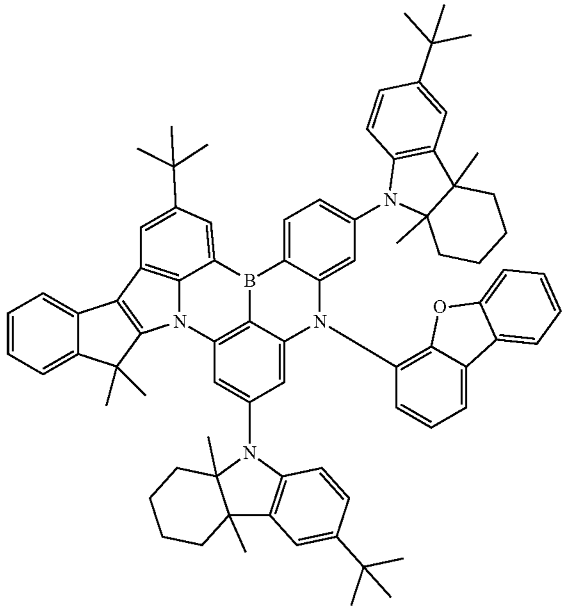
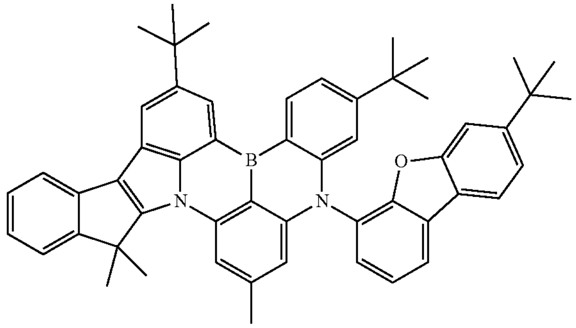
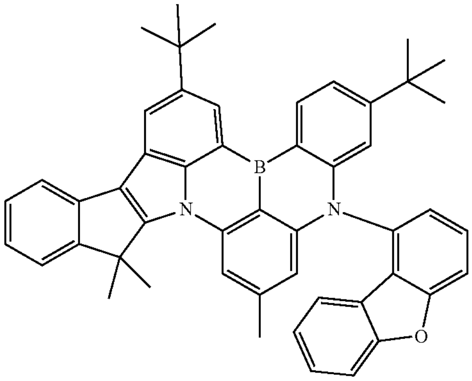
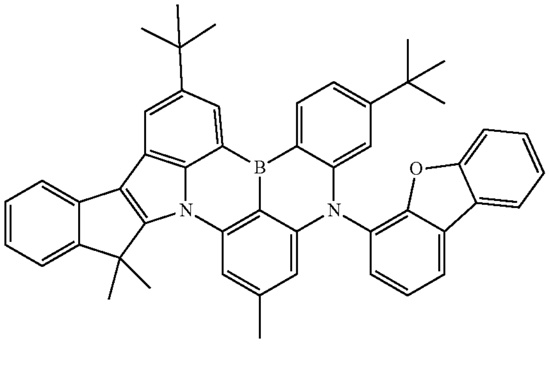

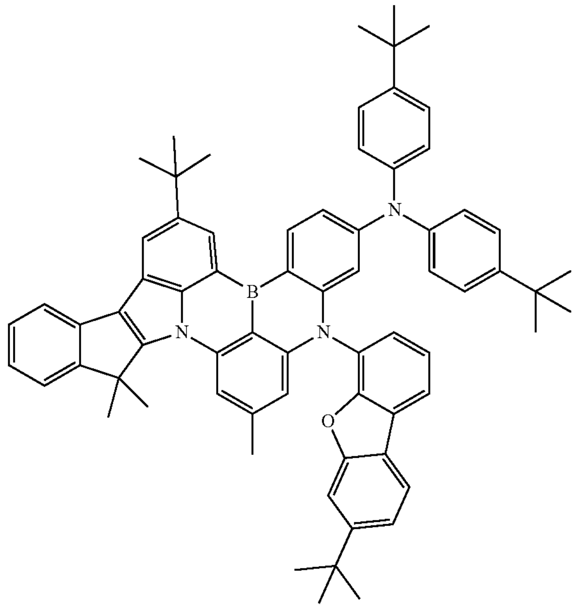
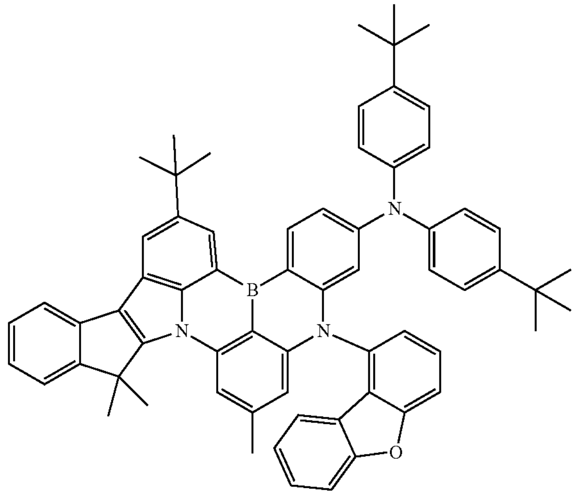
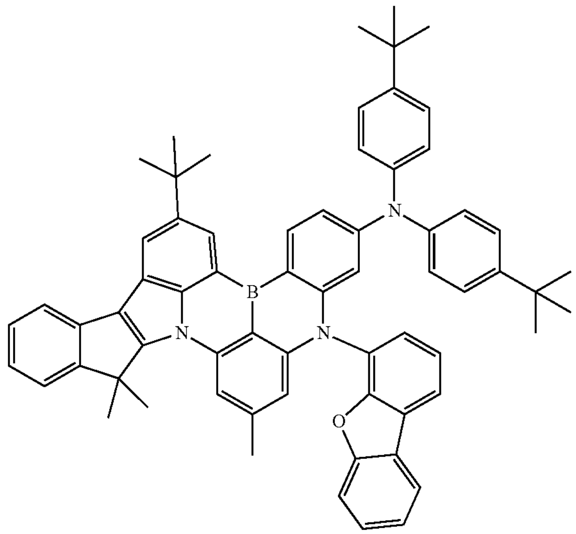
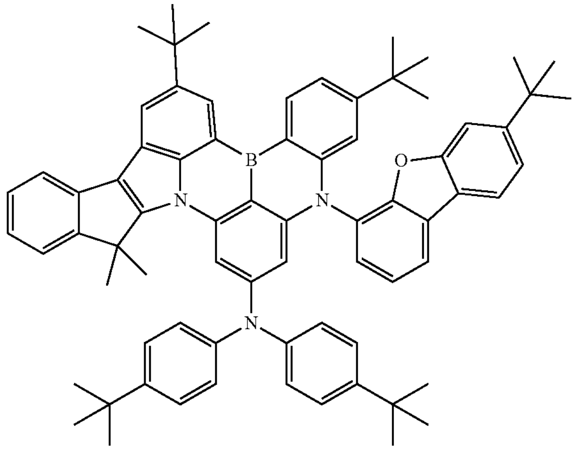
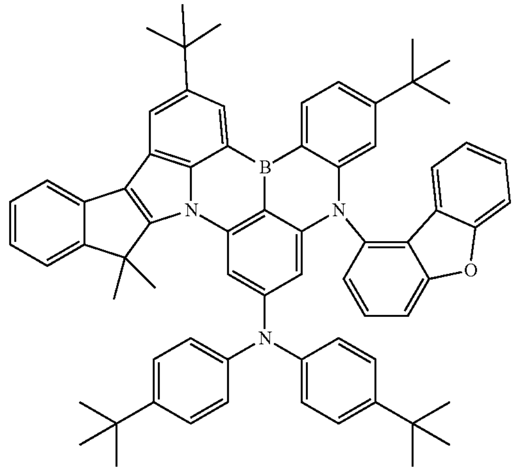
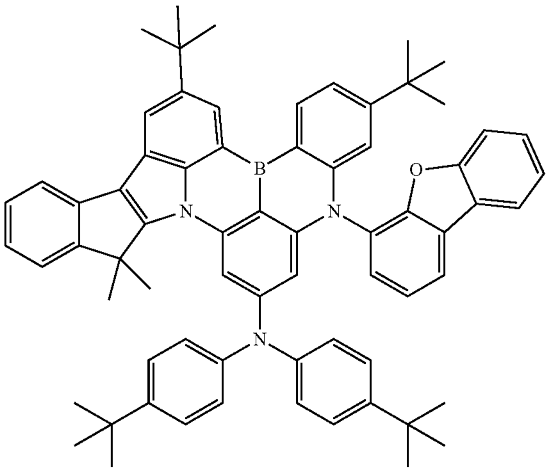

-continued
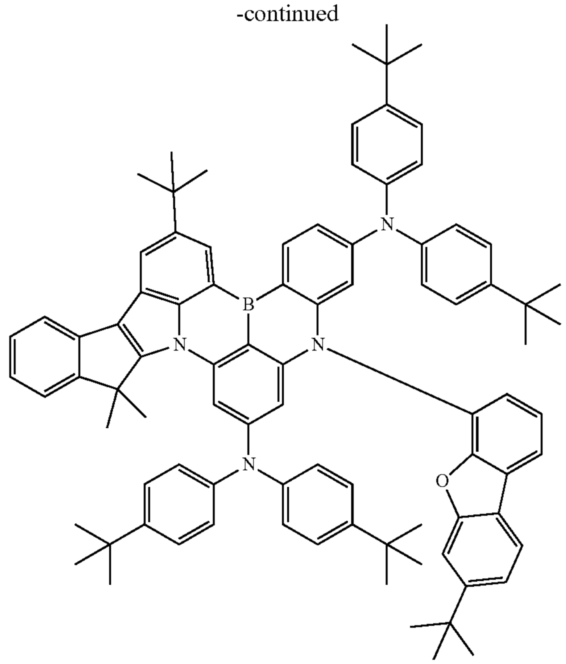
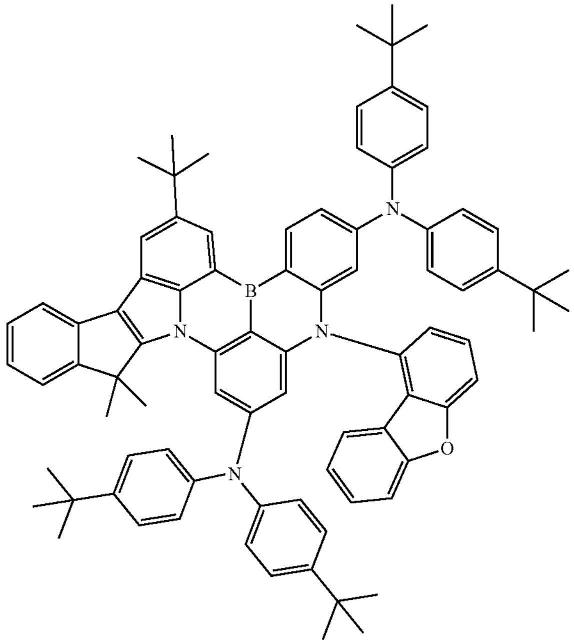
-continued
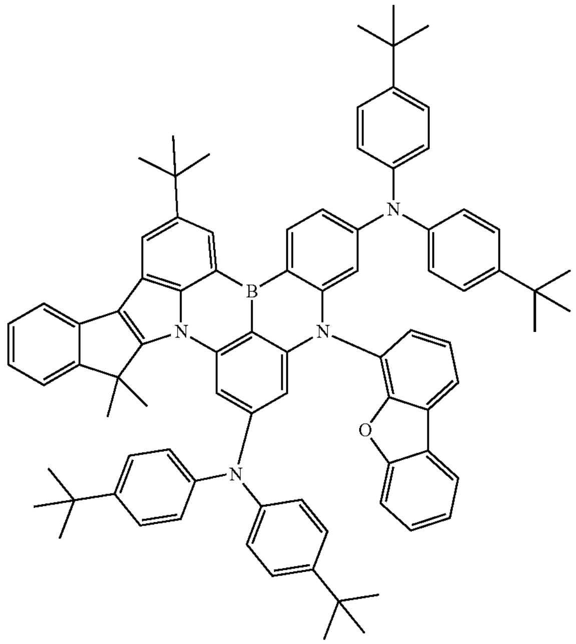
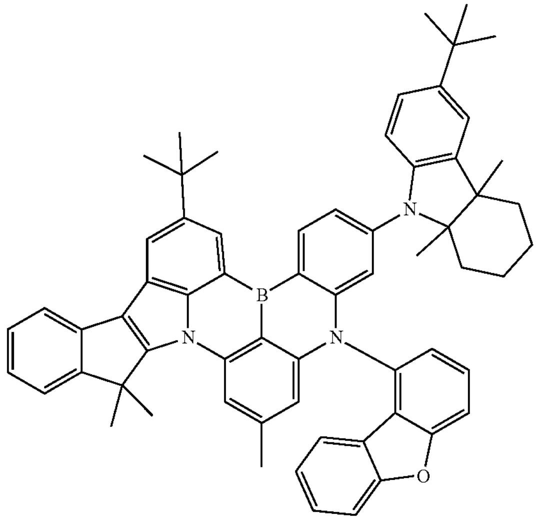
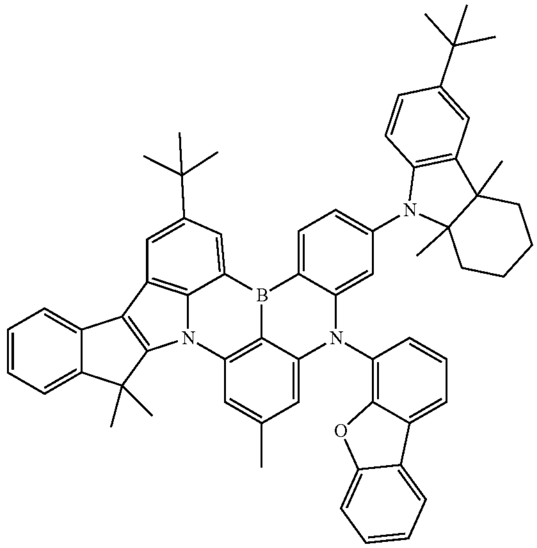

-continued
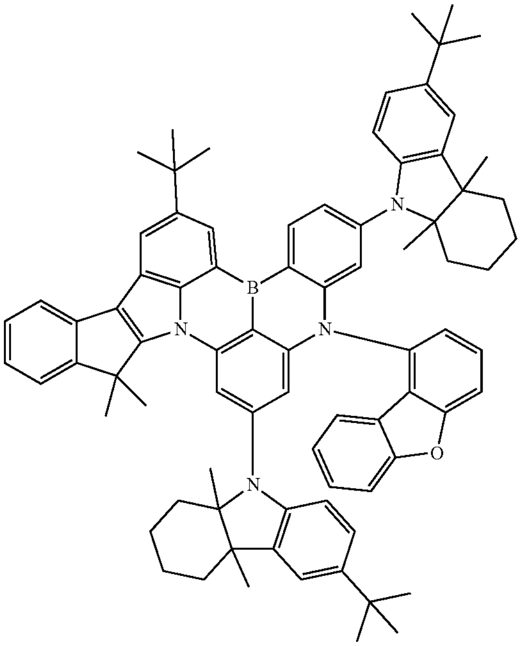
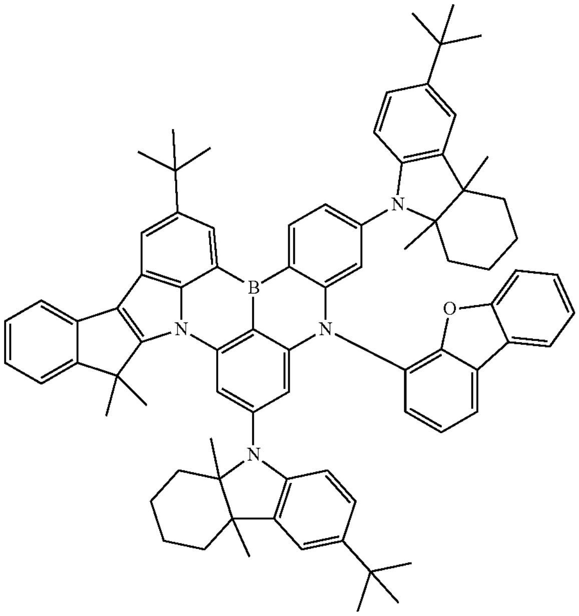
-continued
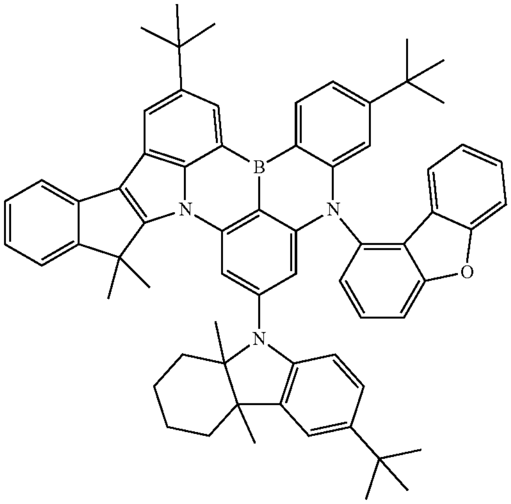
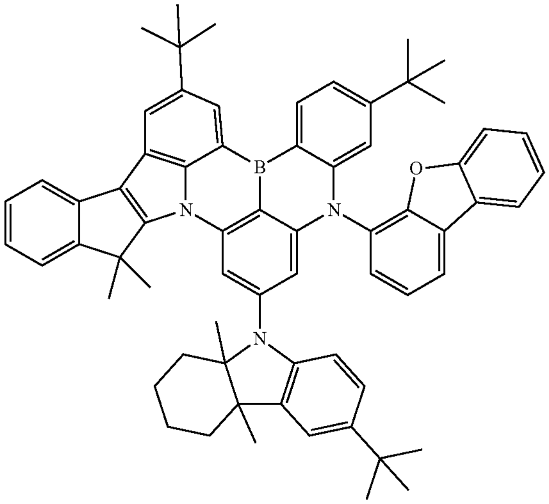
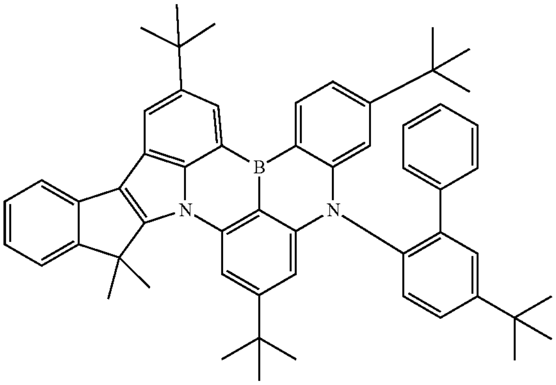

-continued
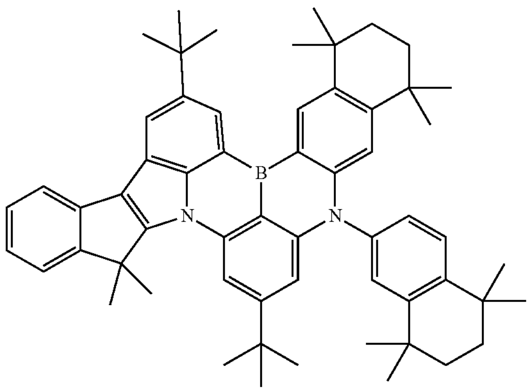
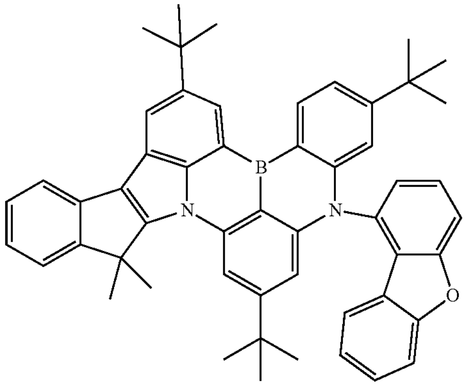
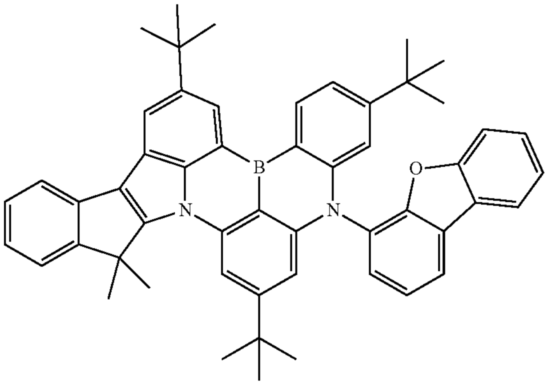
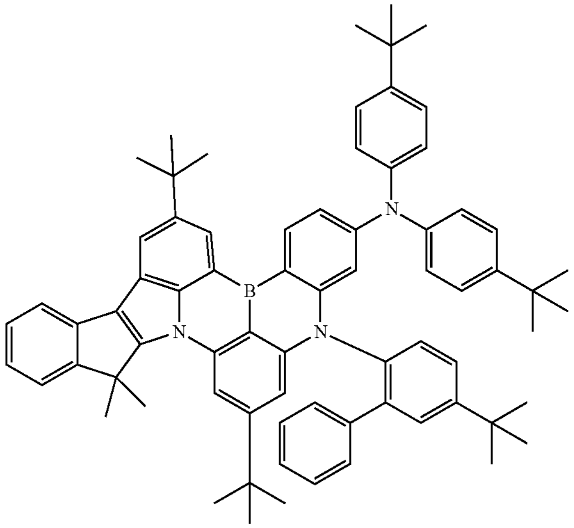
-continued
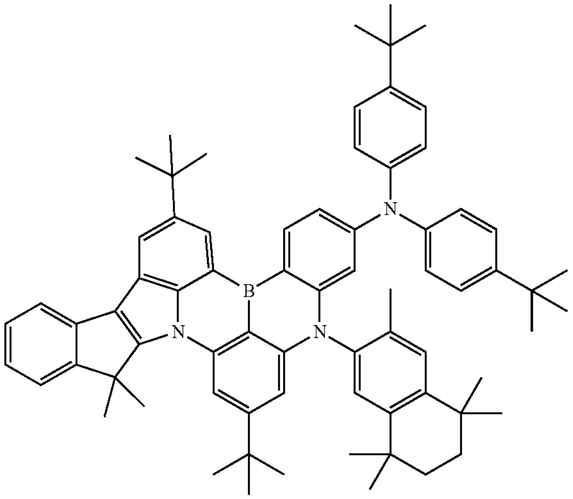
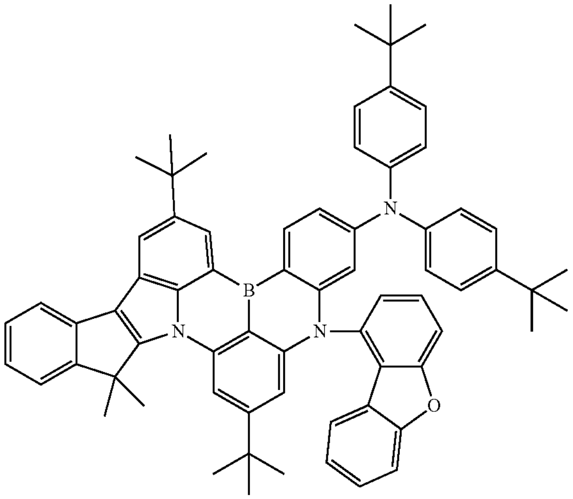
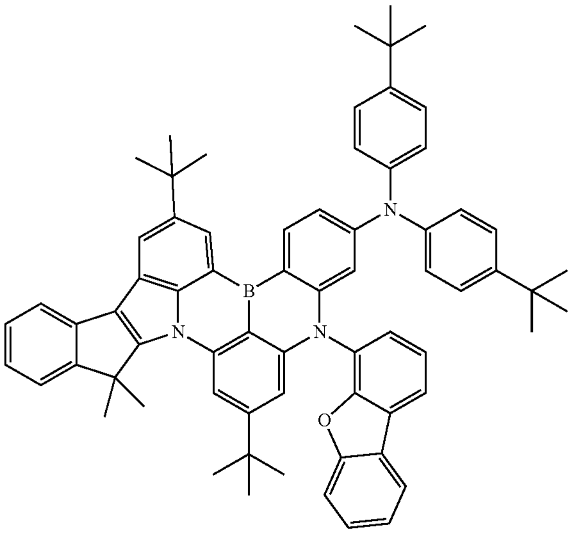

-continued
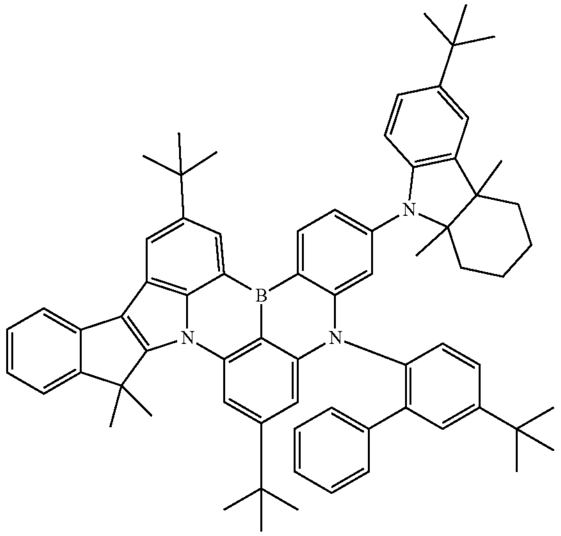
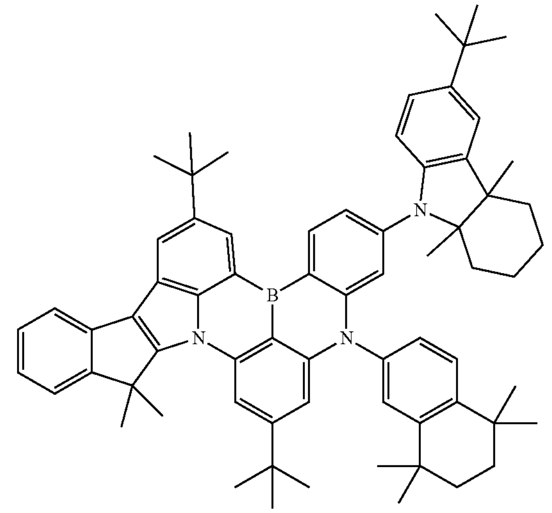
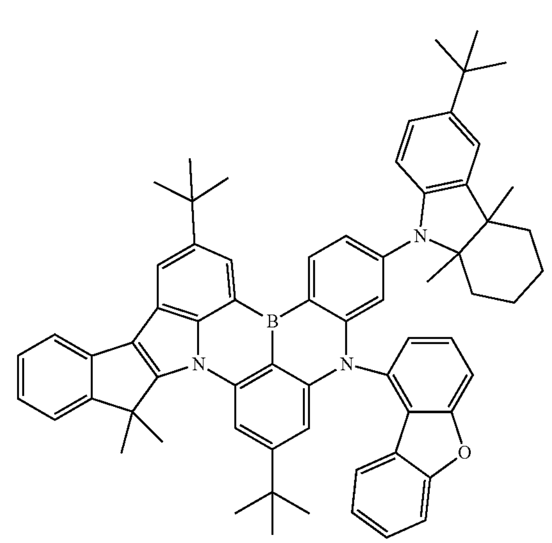
-continued
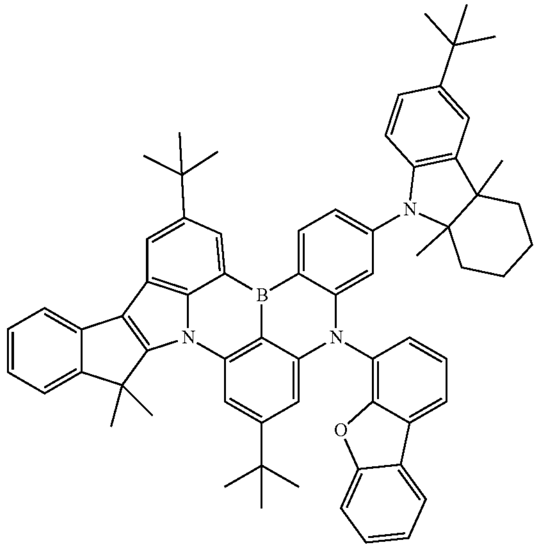
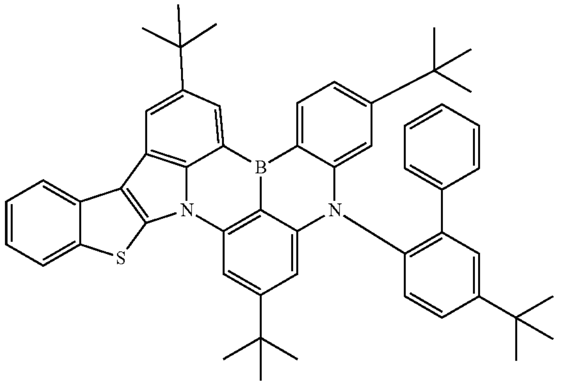
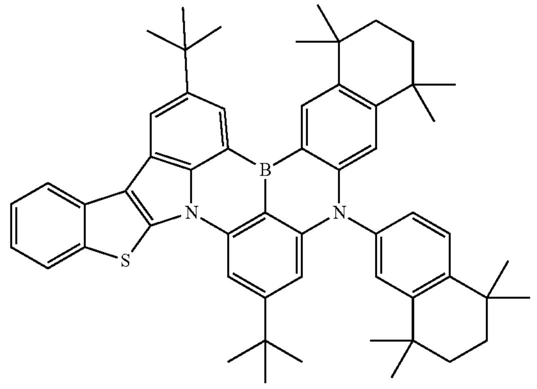
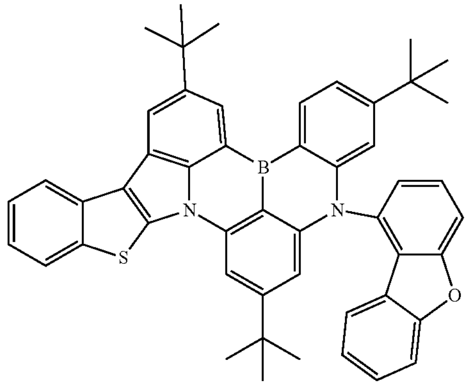

-continued
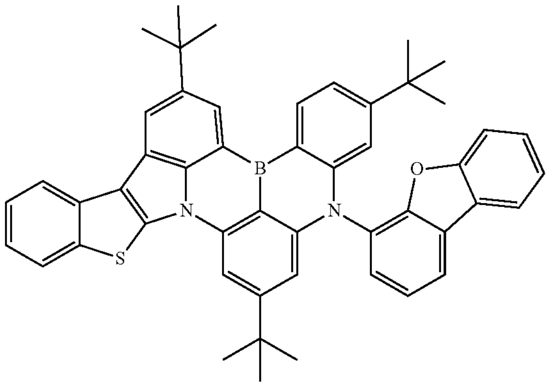
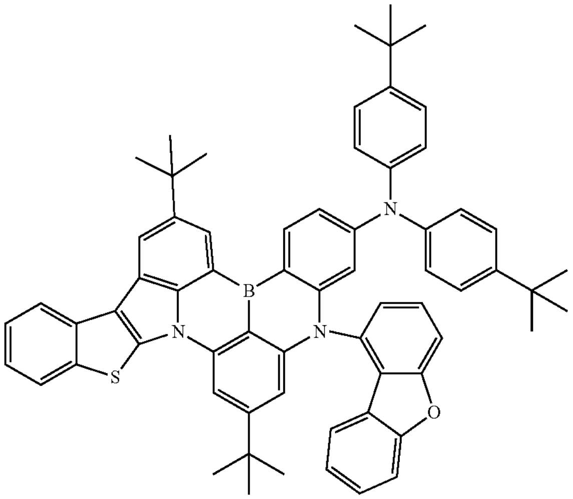
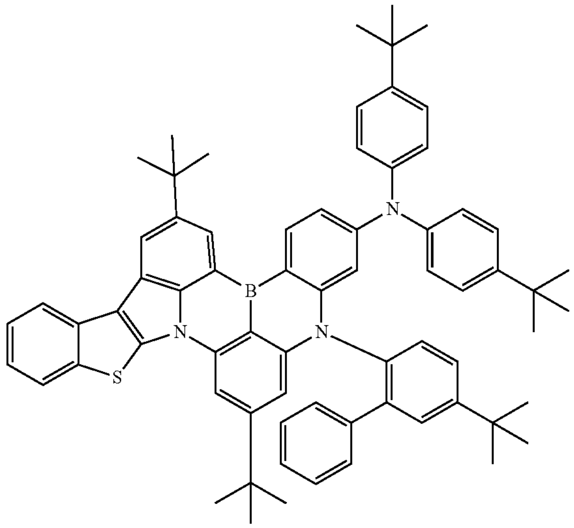
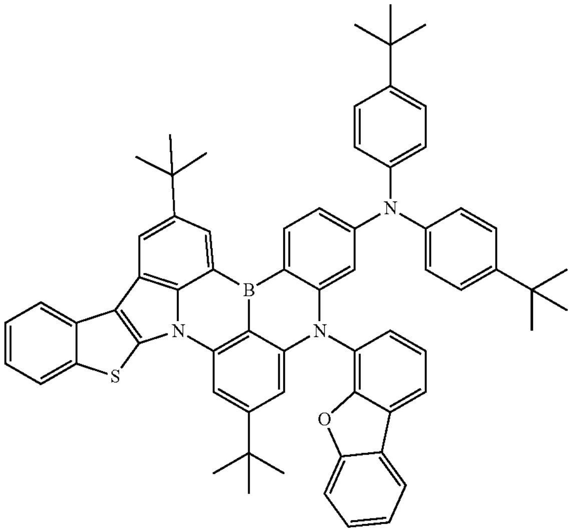
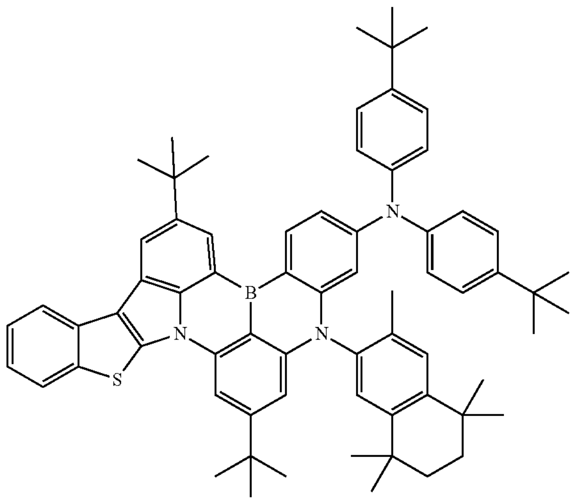
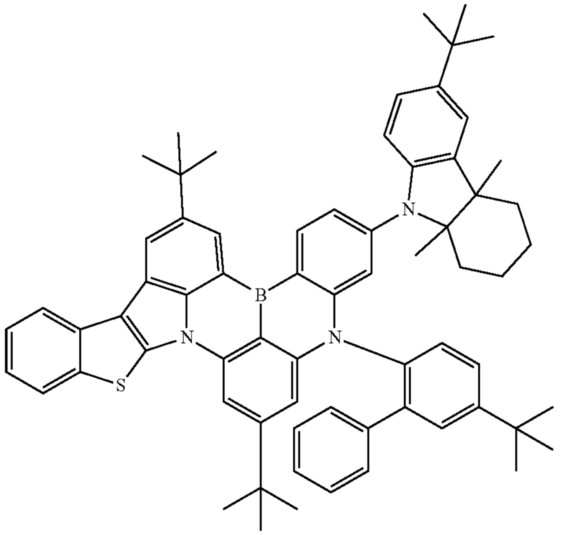

-continued
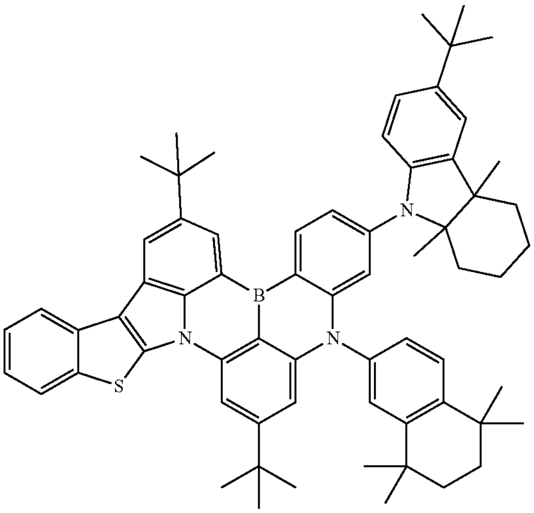
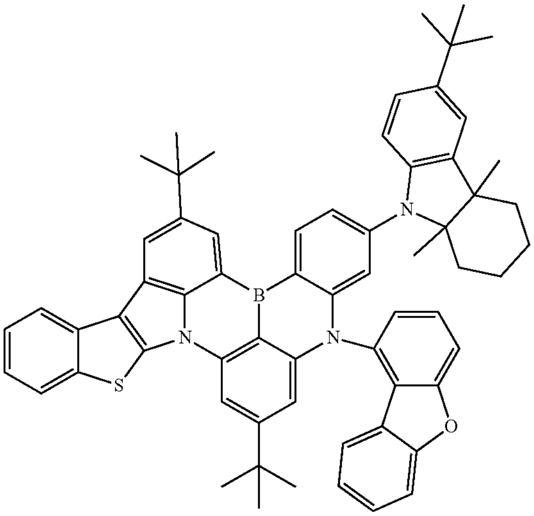
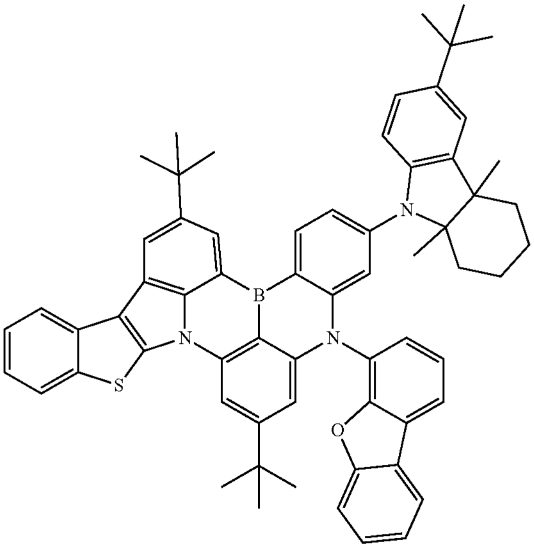
-continued
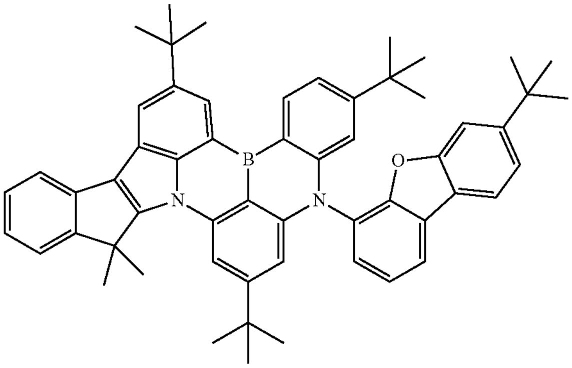
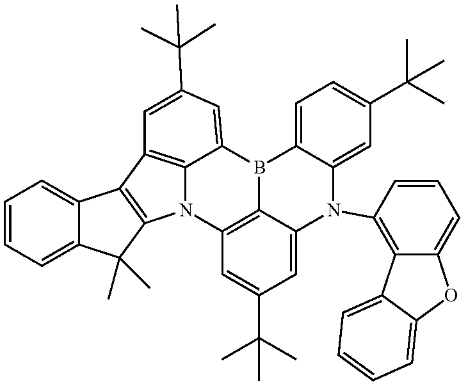
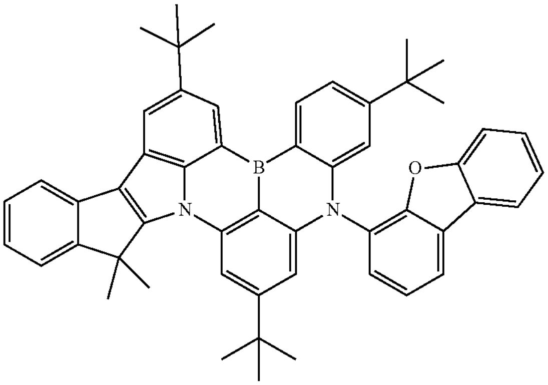

-continued
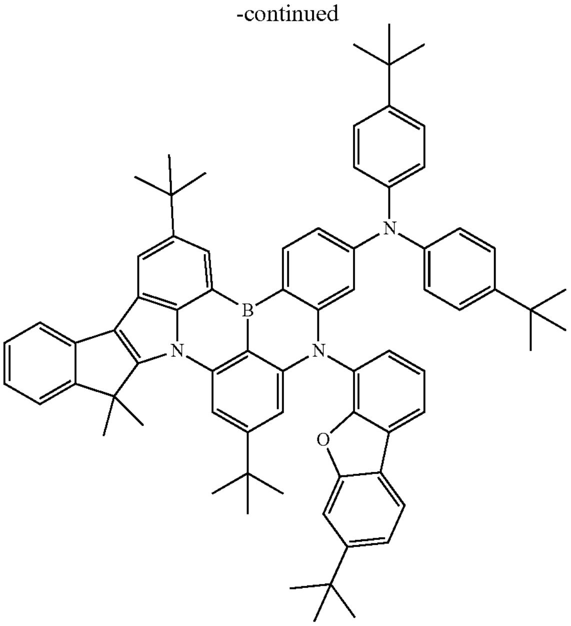
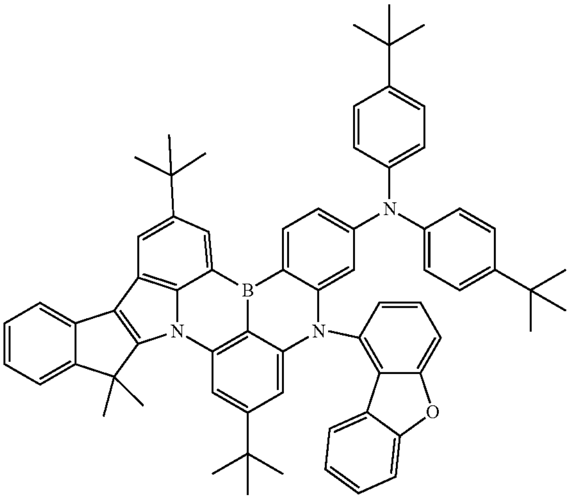
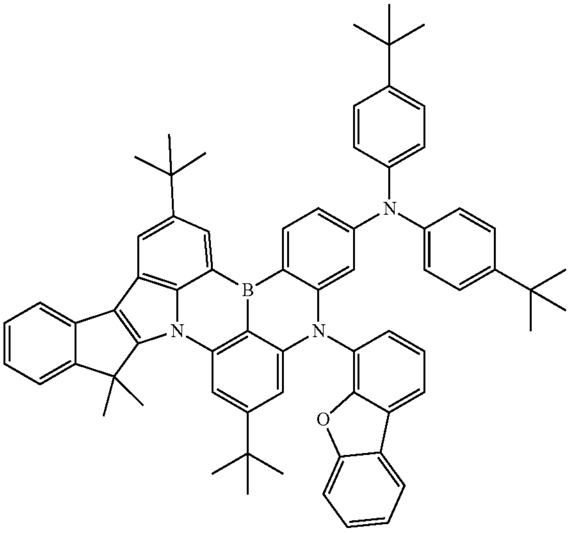
-continued
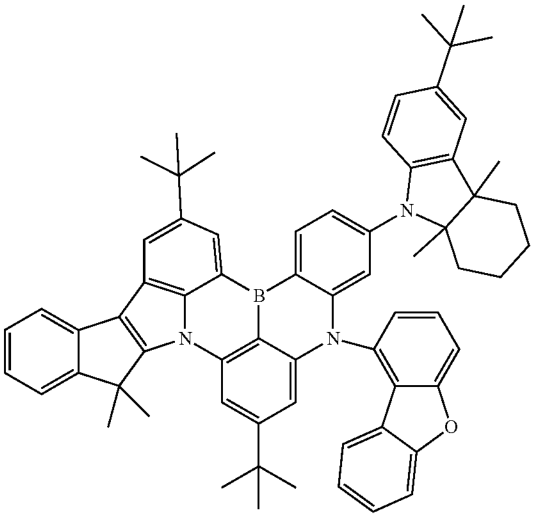
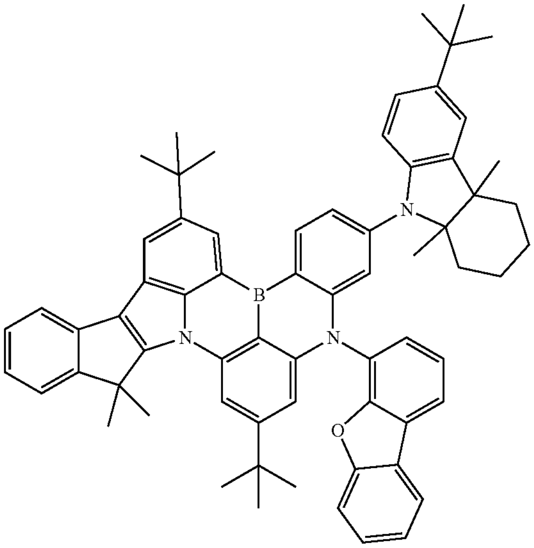
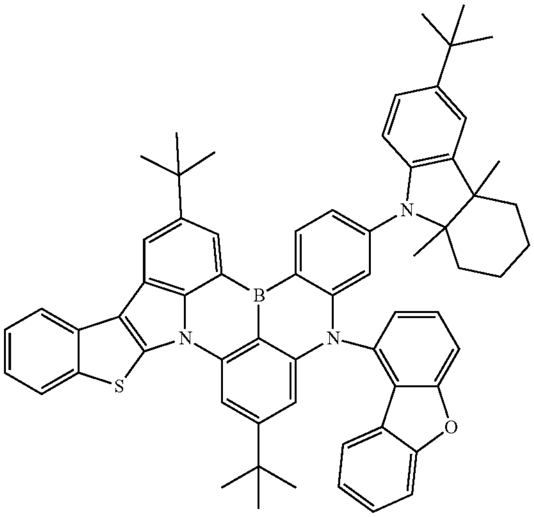

-continued
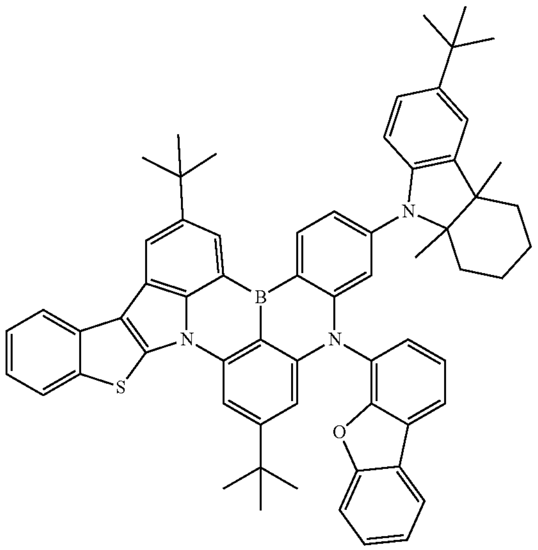
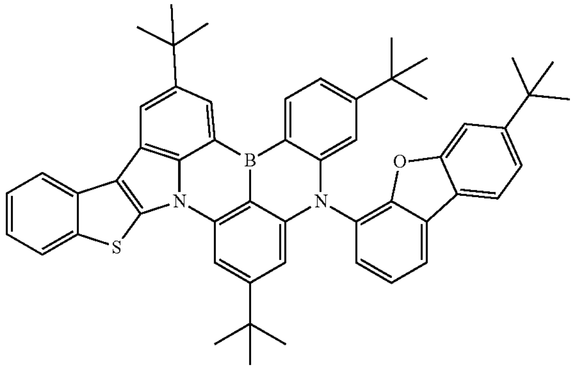
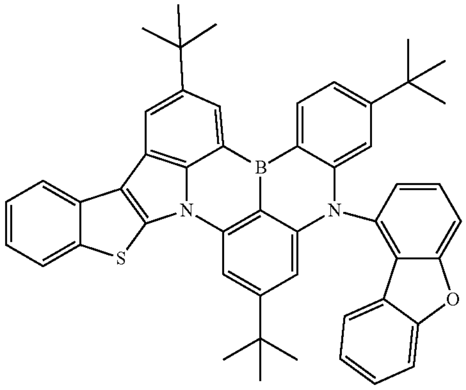
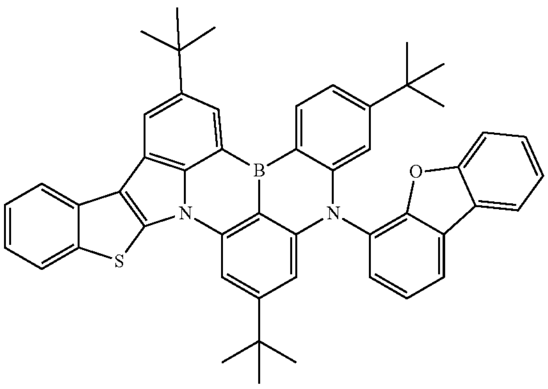
-continued
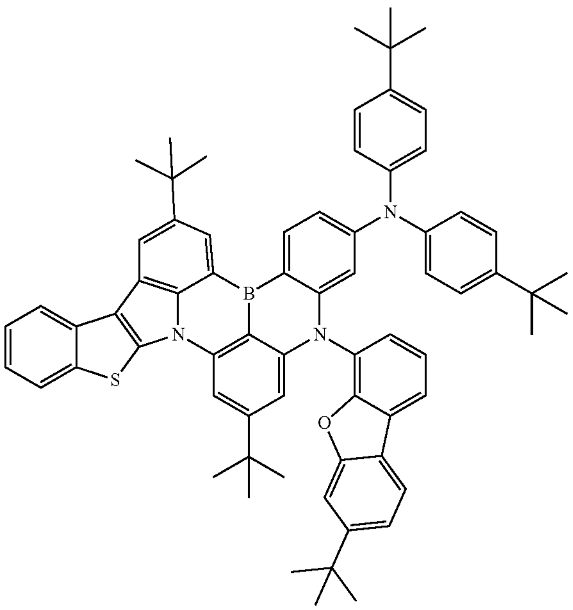
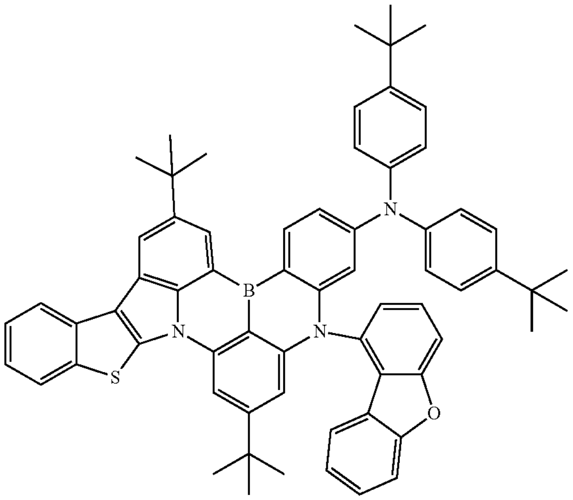
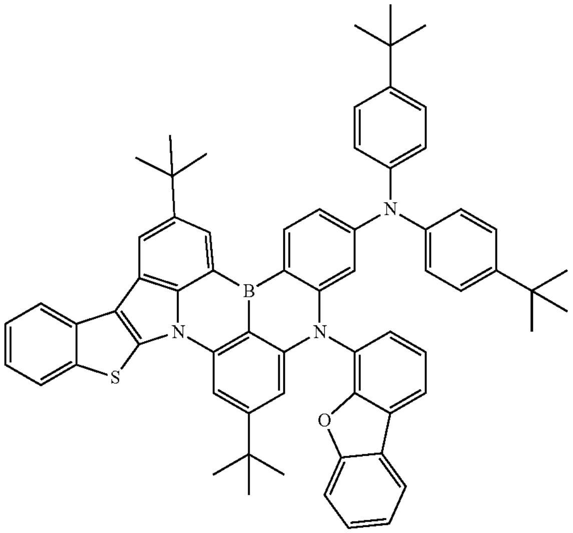

-continued
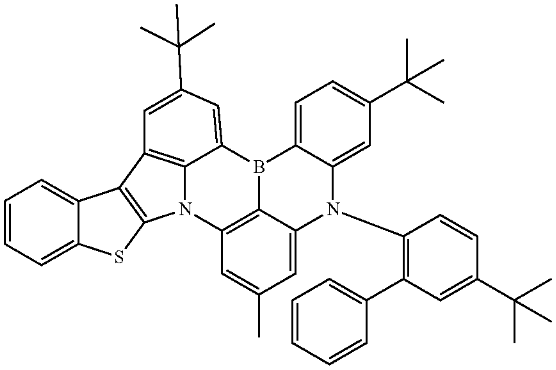
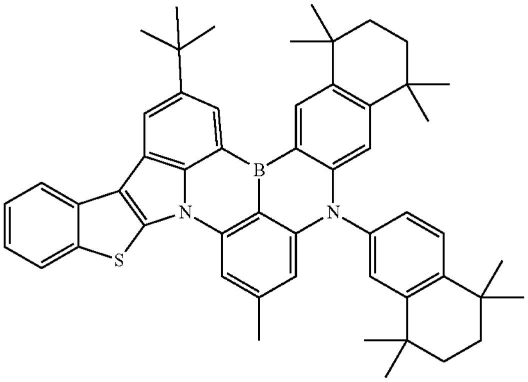
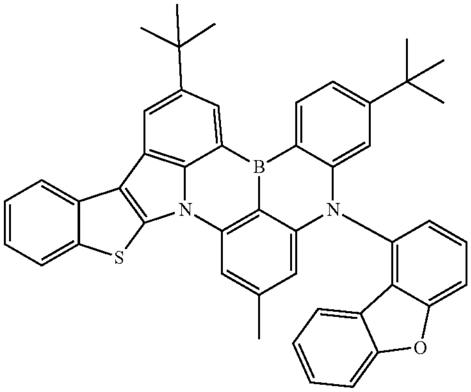
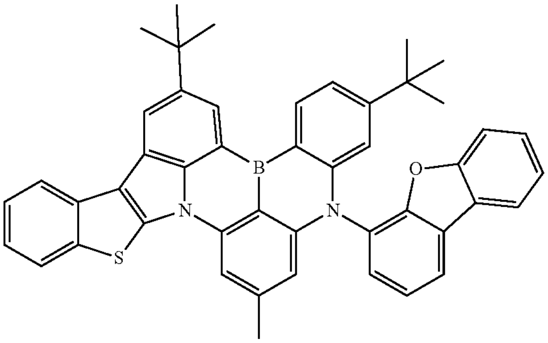
-continued
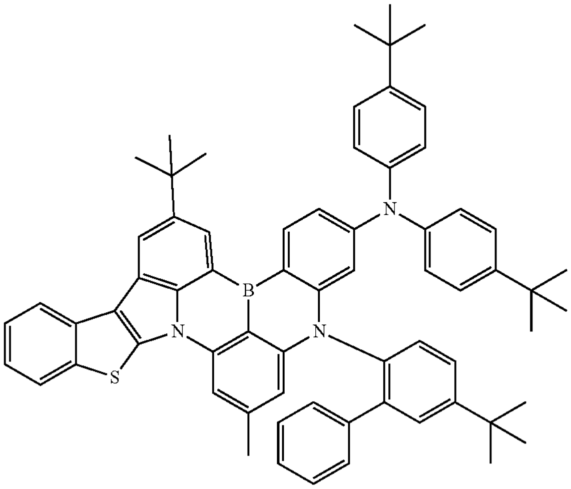
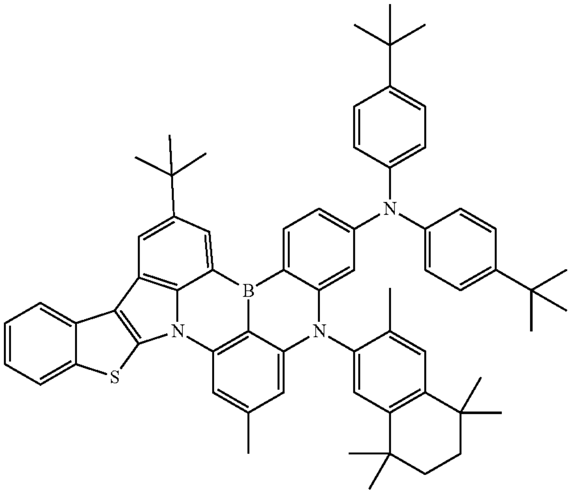
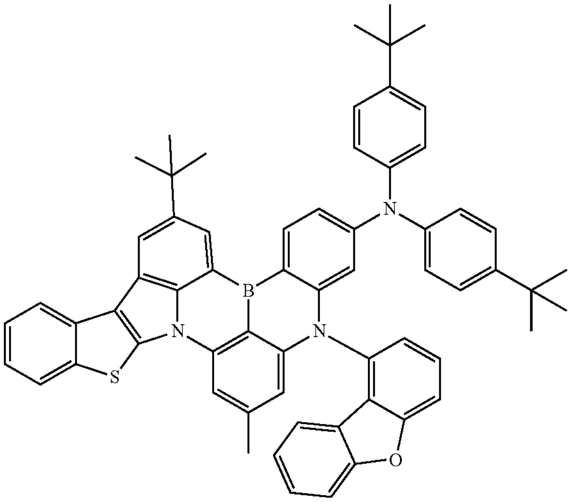

-continued
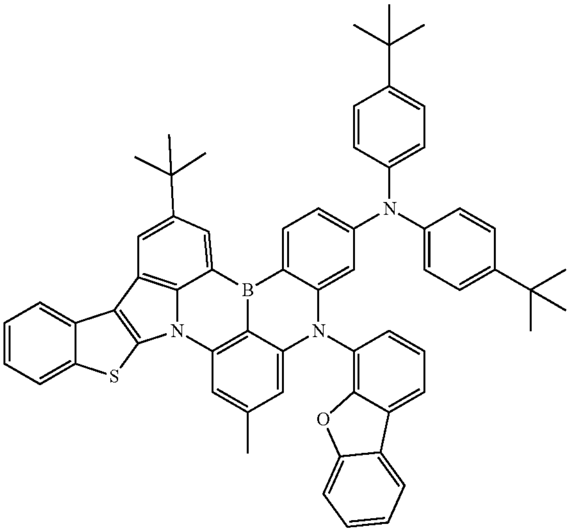
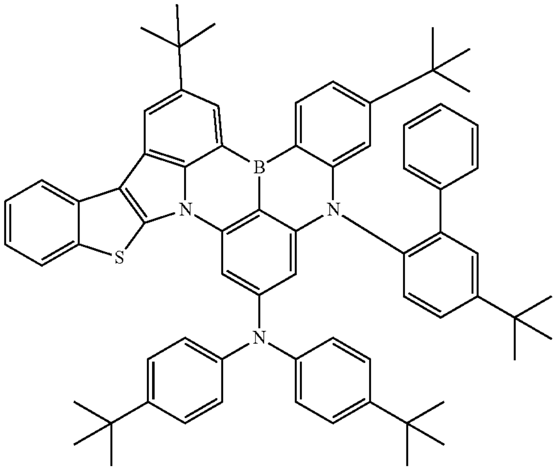
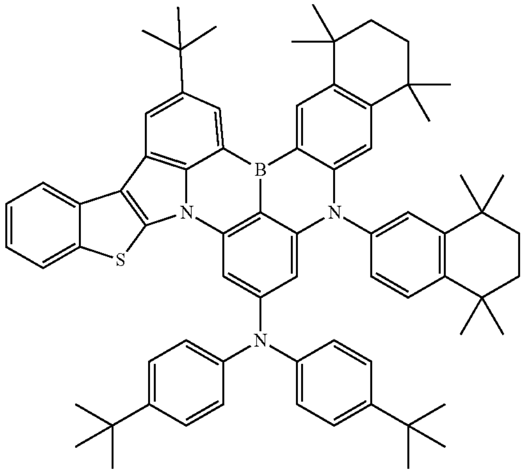
-continued
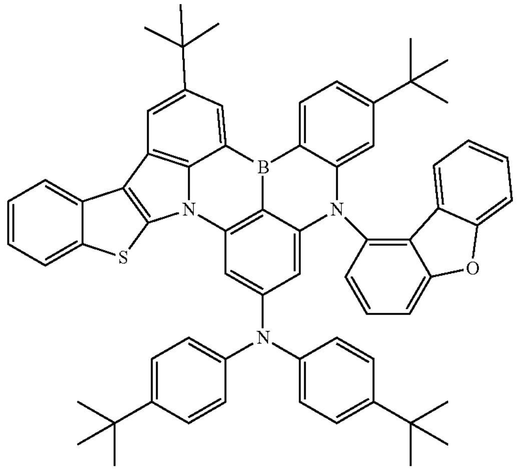
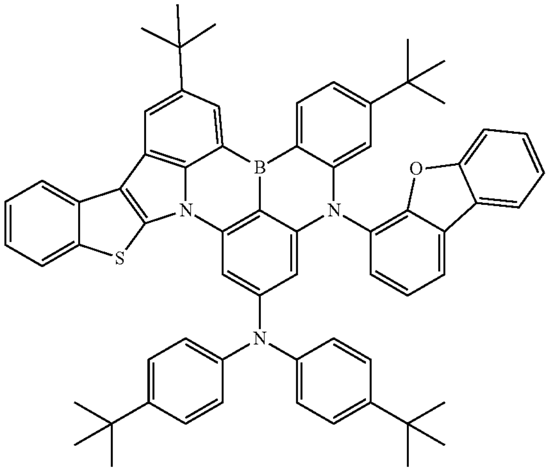
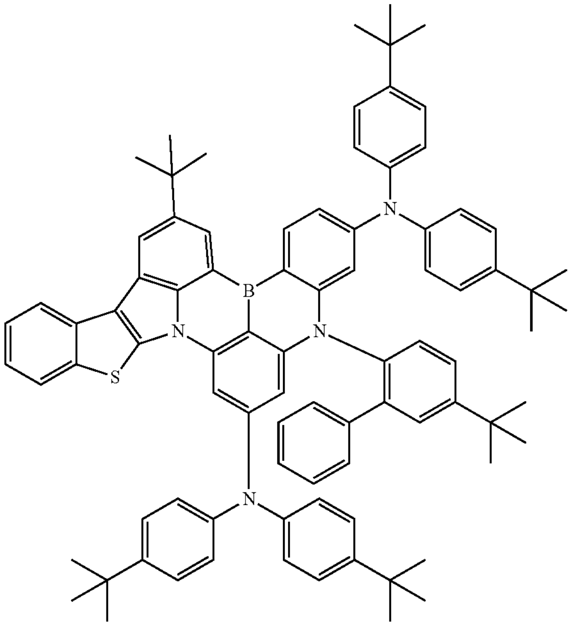

-continued
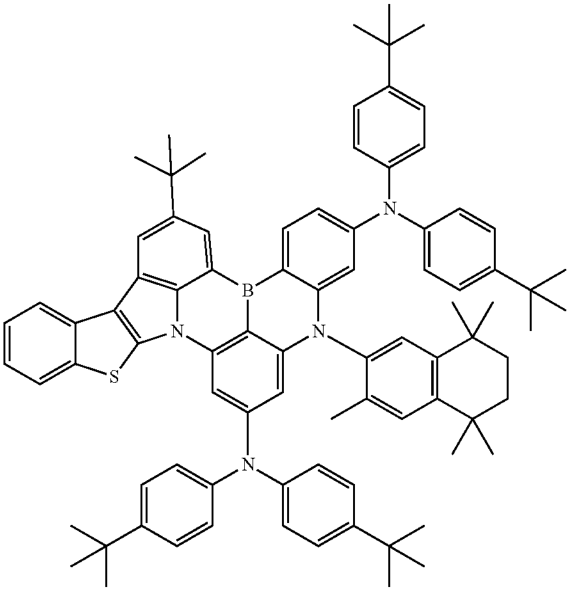
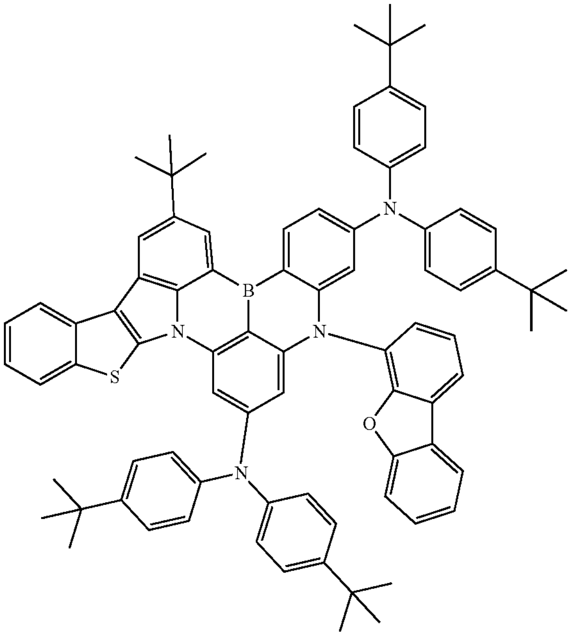
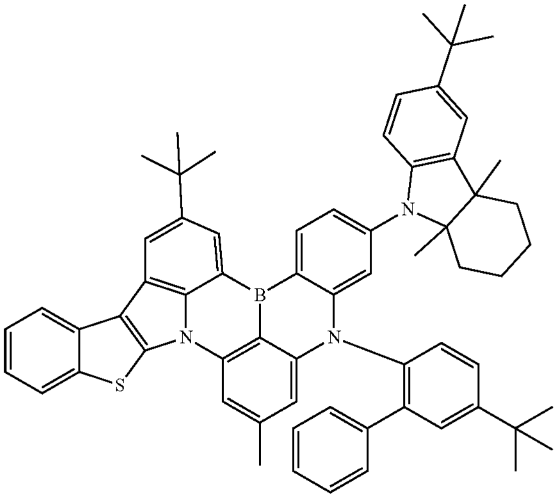
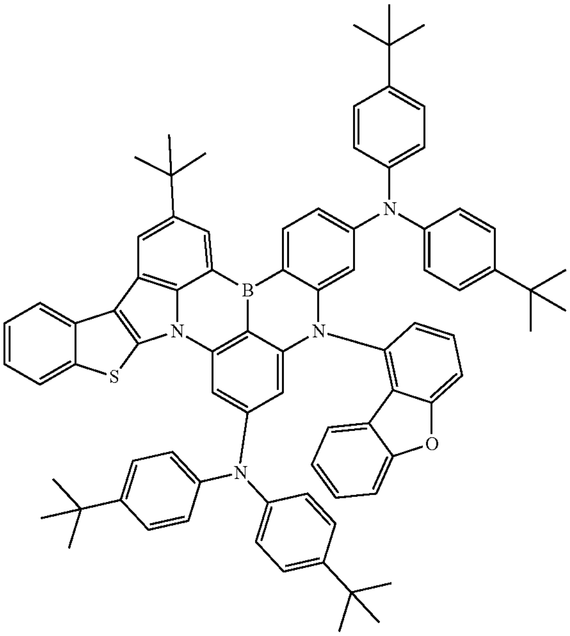
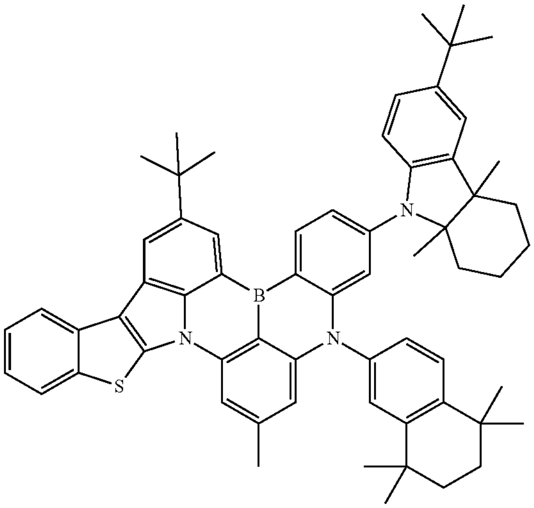

-continued
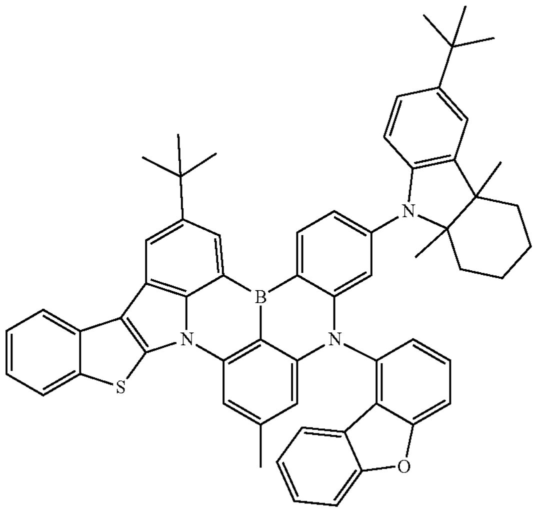
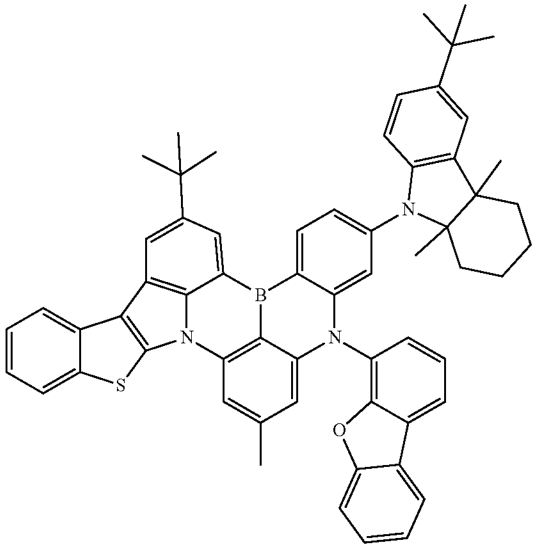
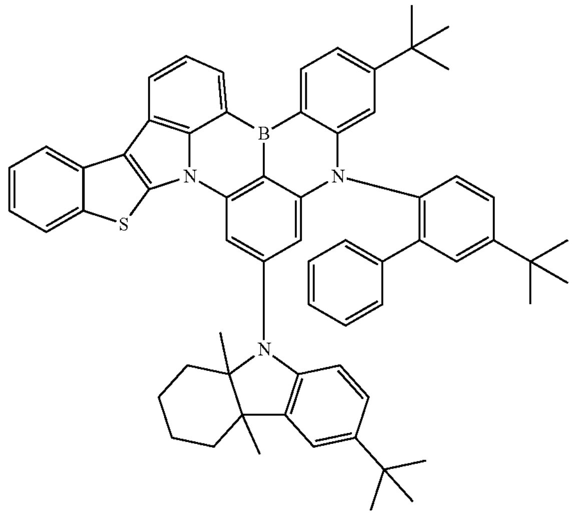
-continued
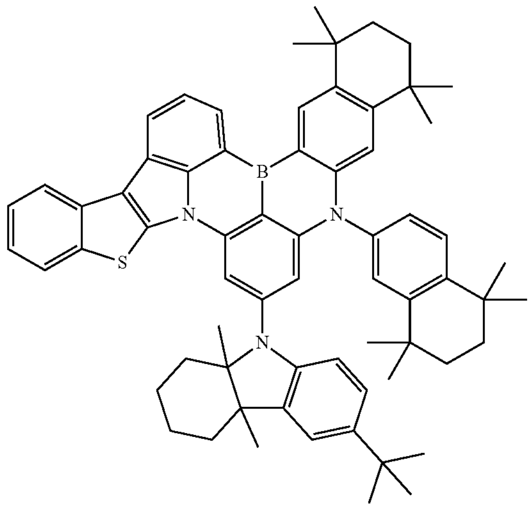
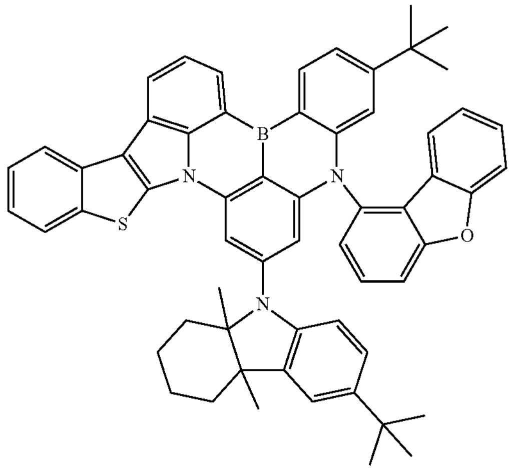
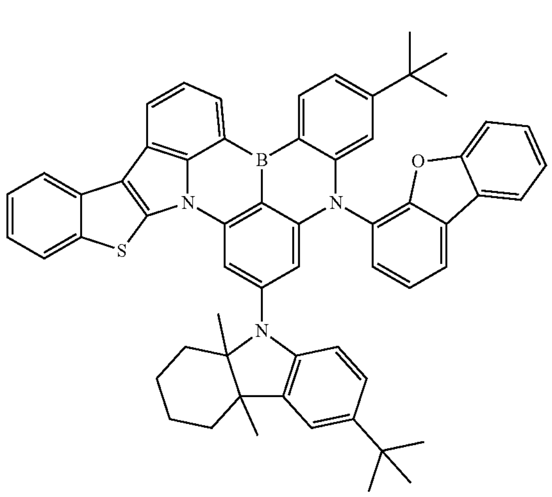

-continued
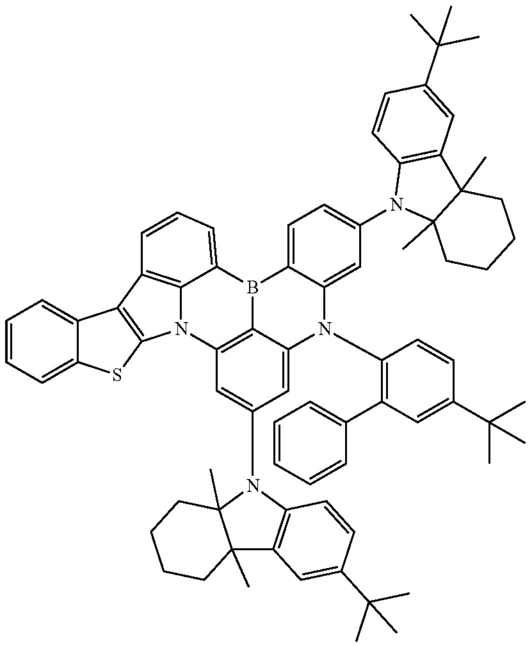
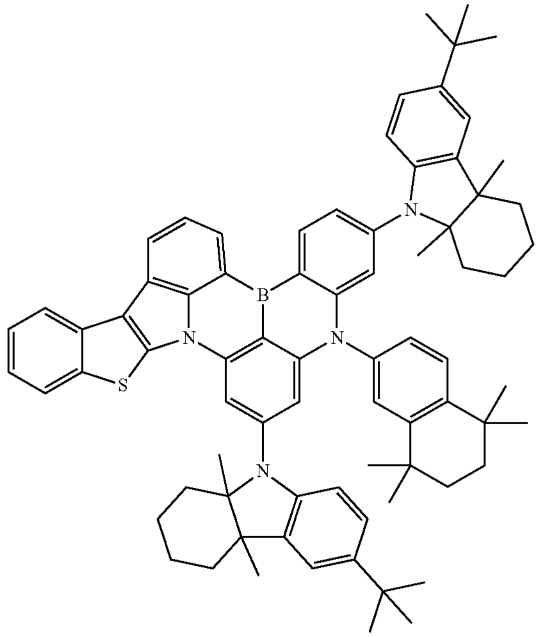
-continued
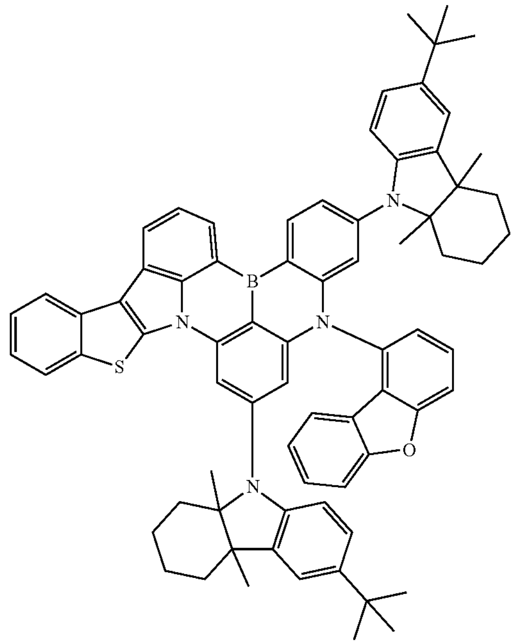
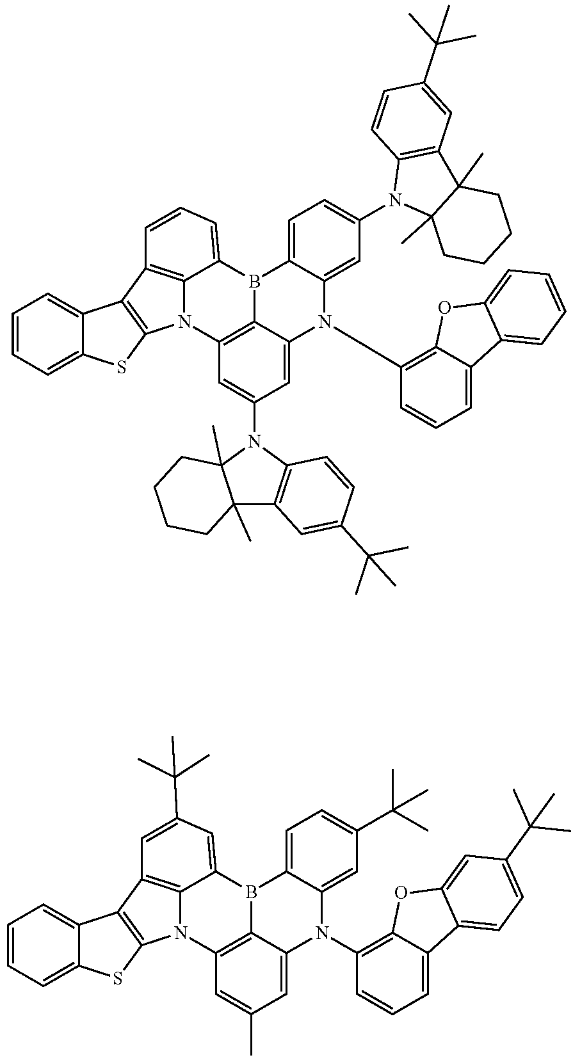

-continued
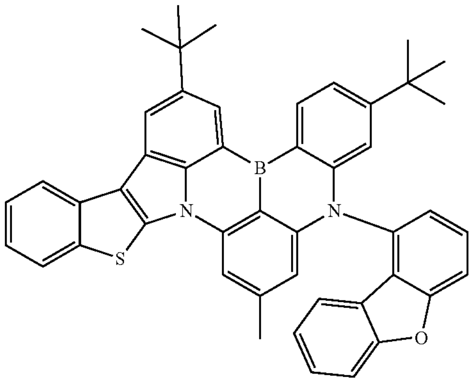
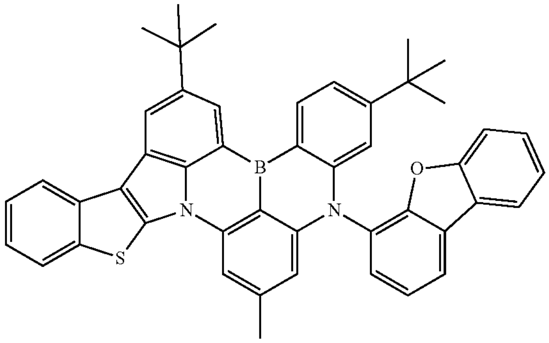
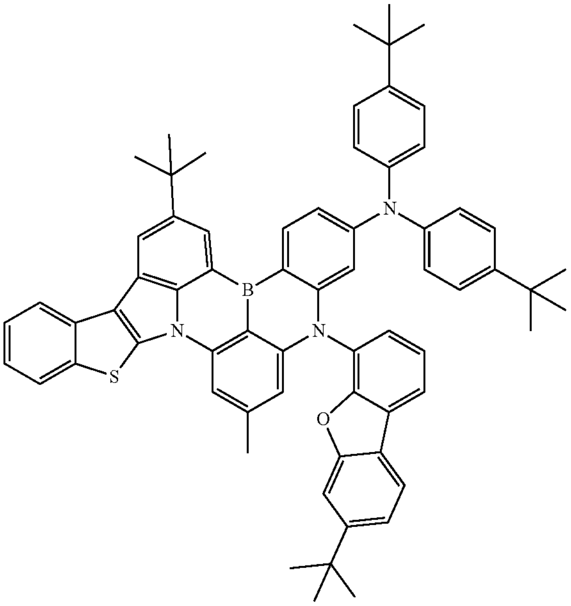
-continued
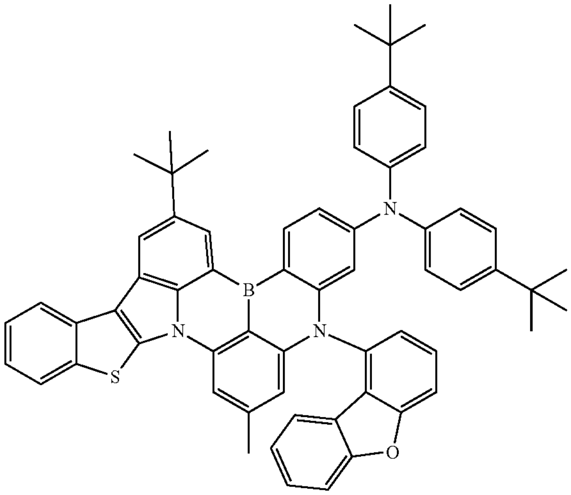
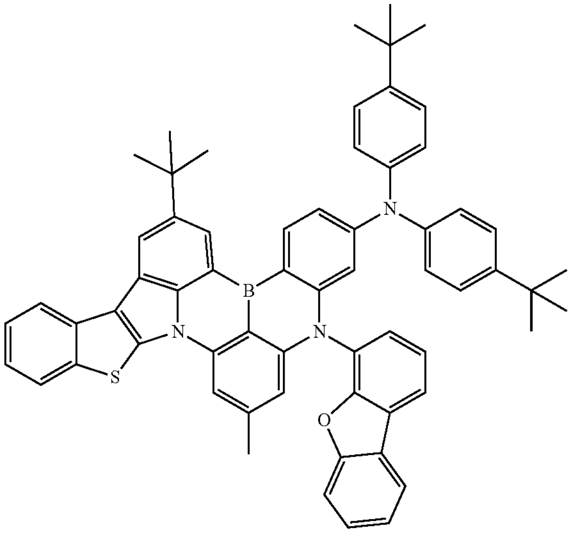
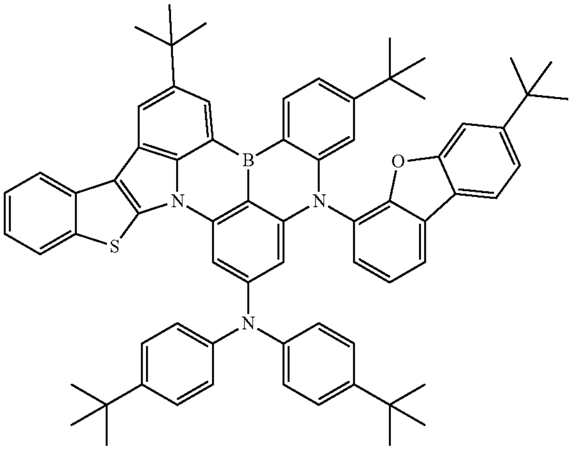

-continued
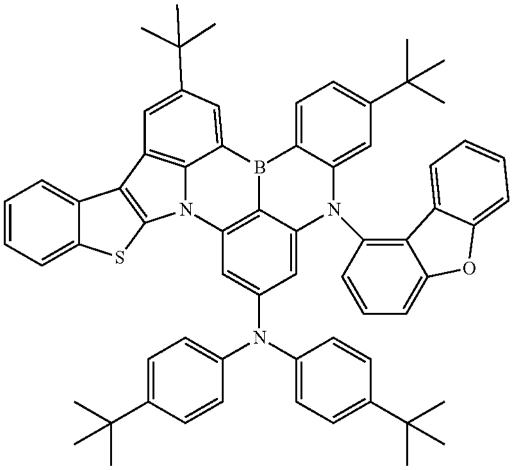
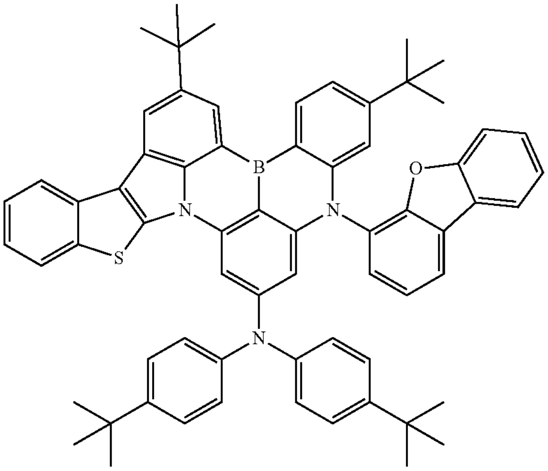
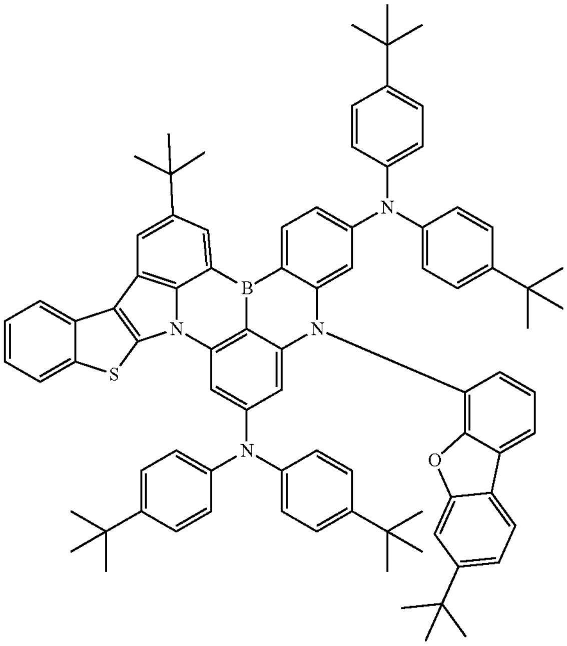
-continued
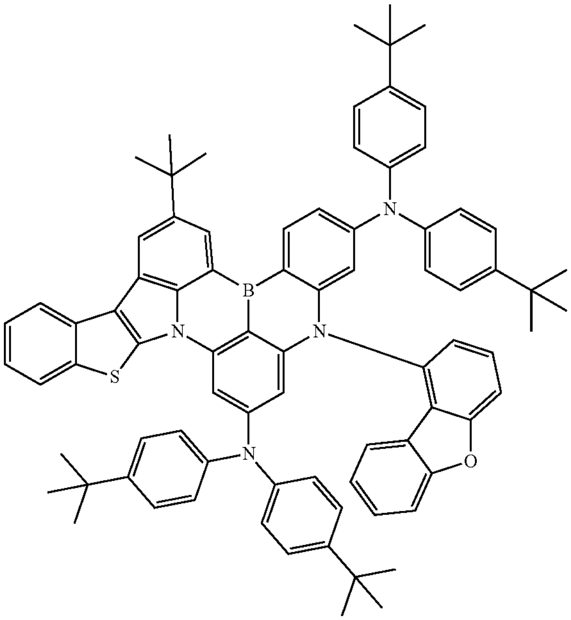
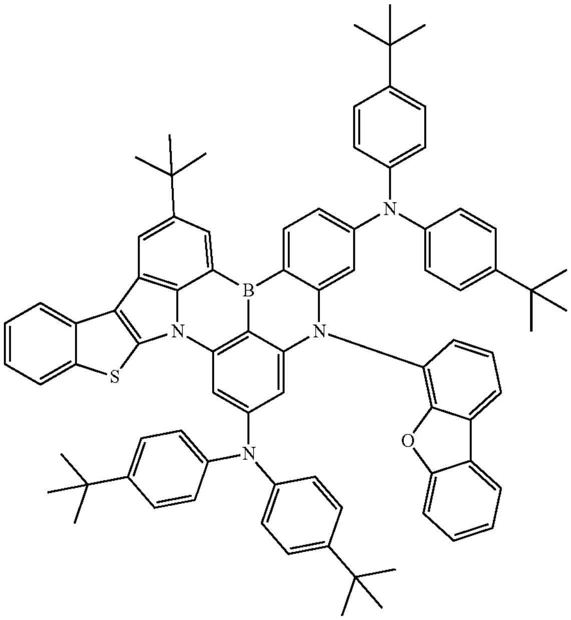

-continued
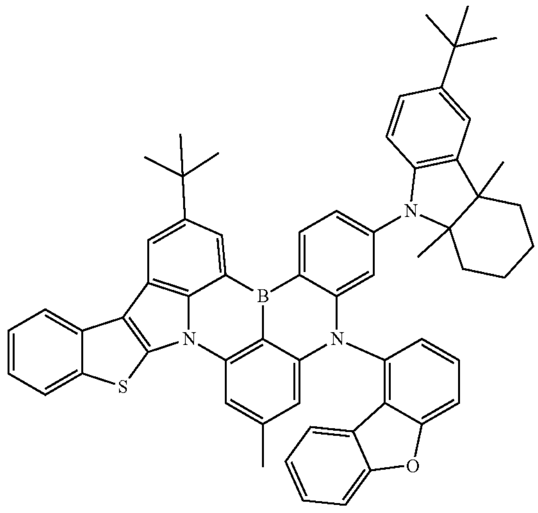
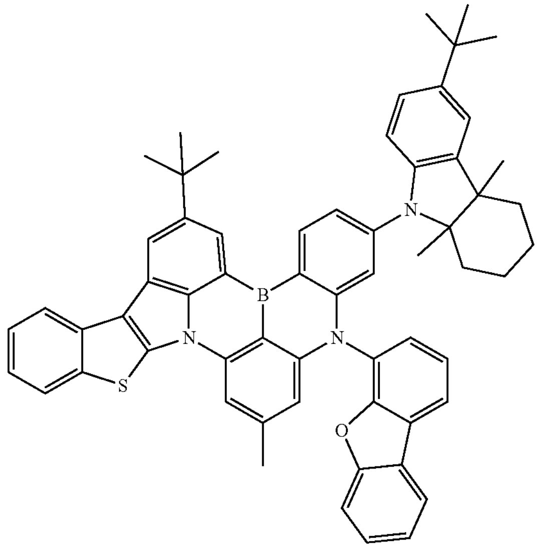
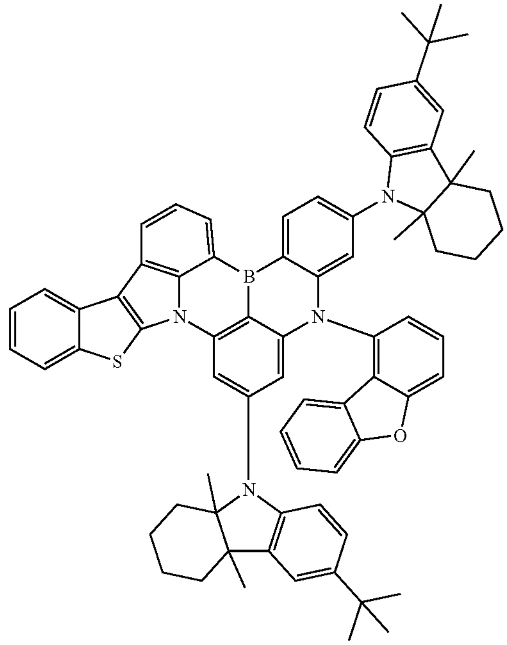
-continued
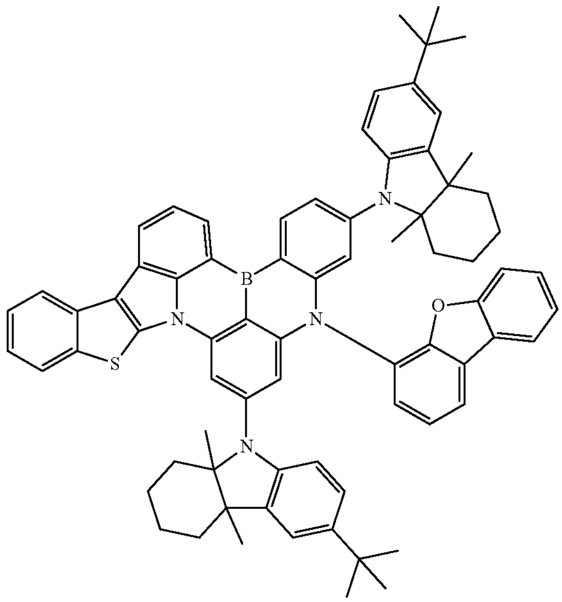
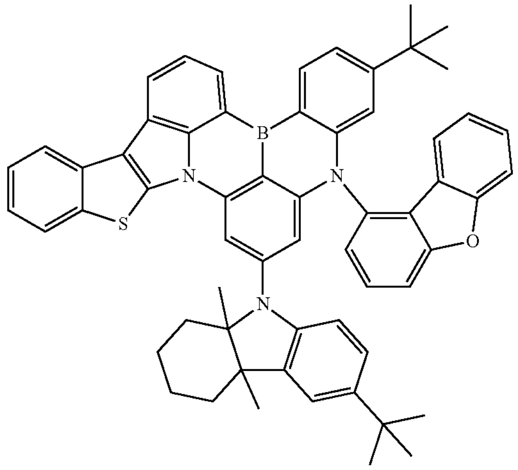
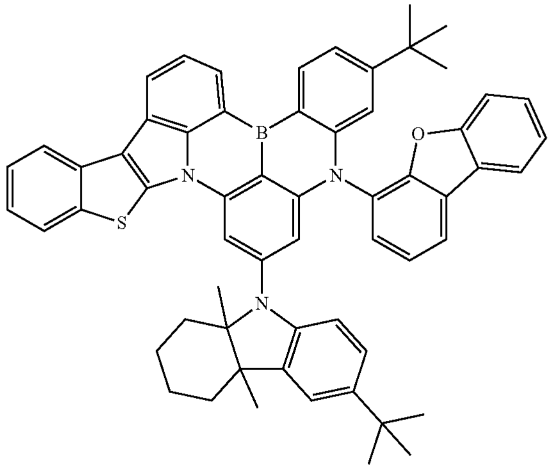

-continued
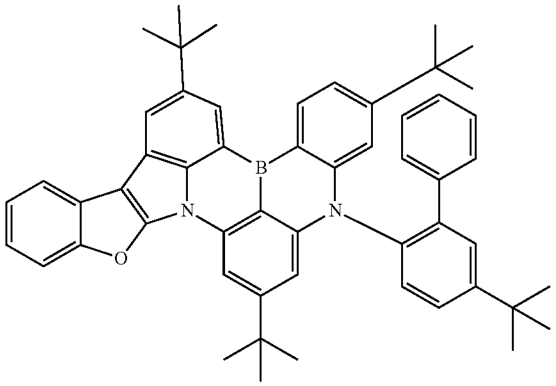
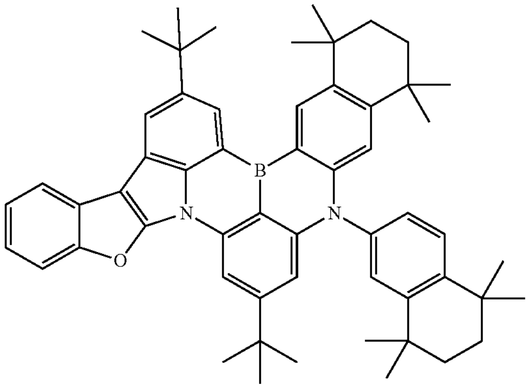
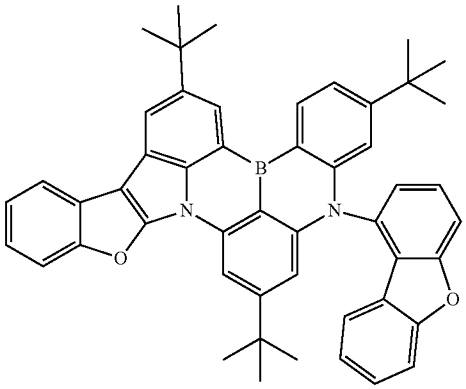
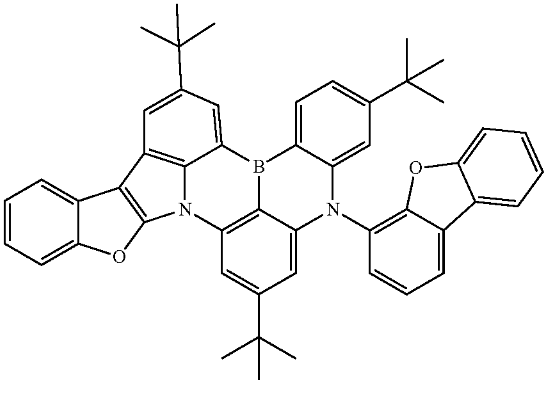
-continued
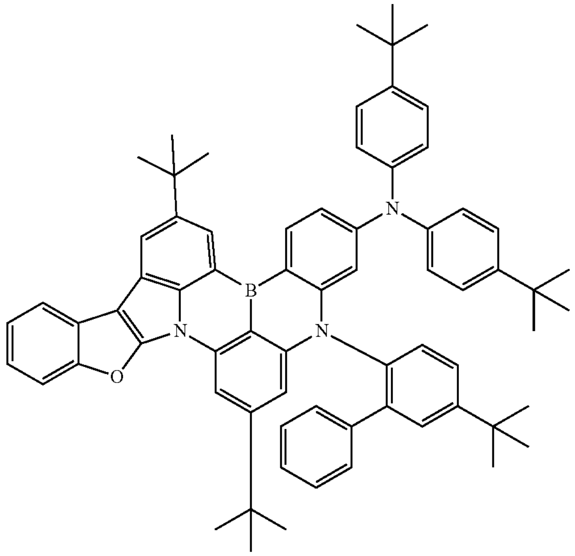
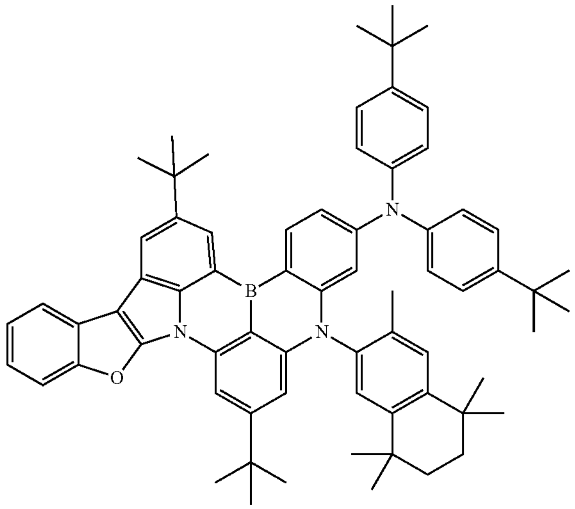
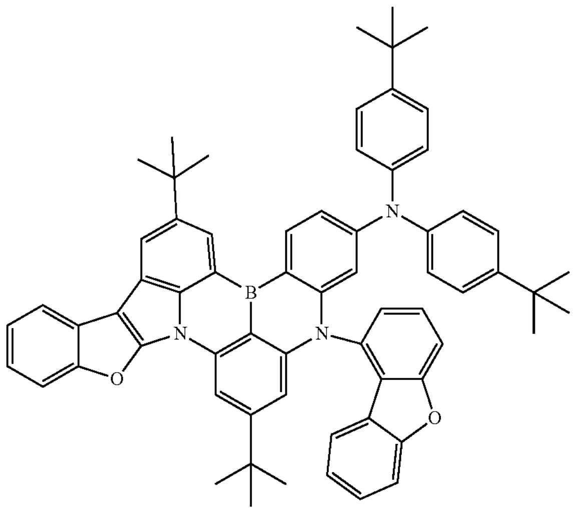

-continued
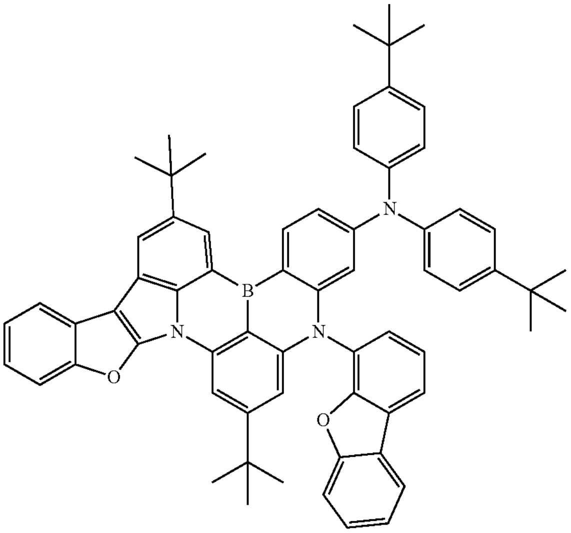
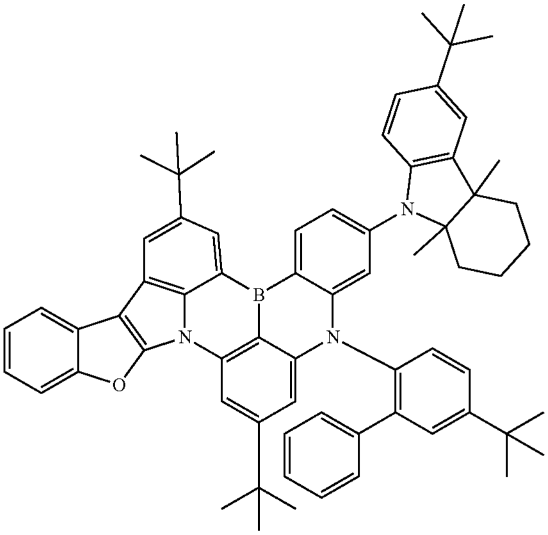
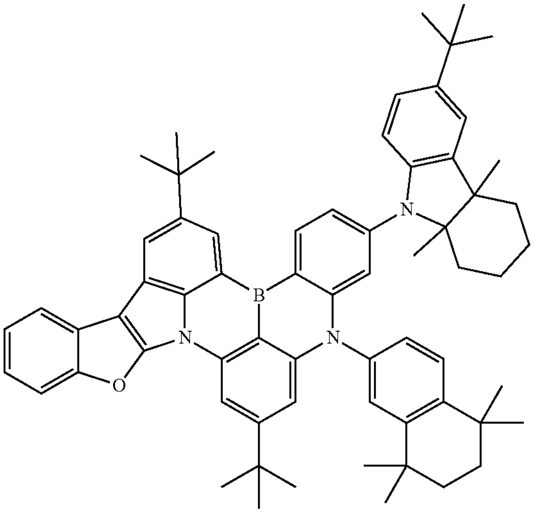
-continued
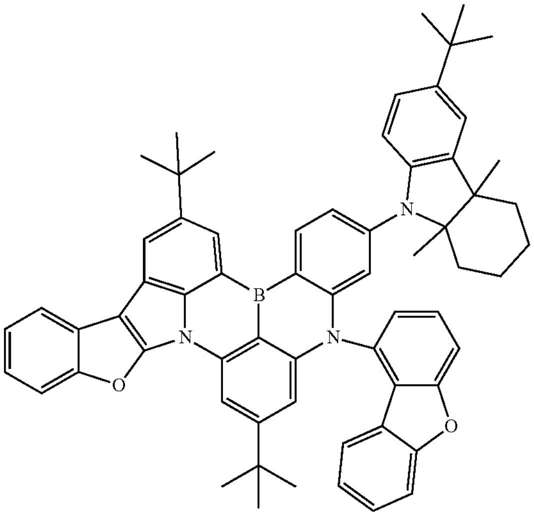
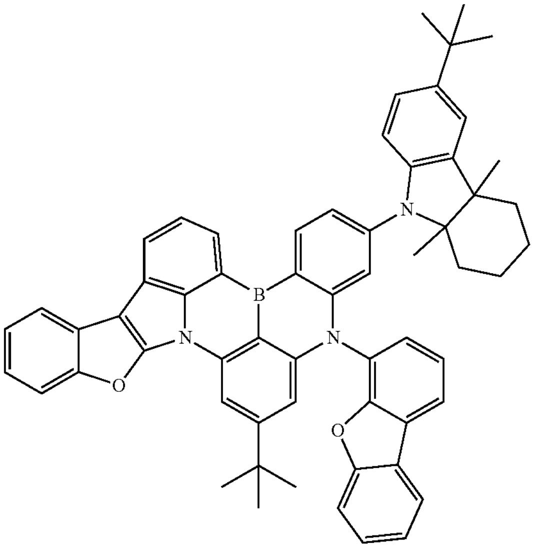 [SMILES: CC(C)(C)c1cc2c3c(c1)-n1c4oc5ccccc5c4c4cccc(c41)B3c1ccc(N3c4ccc(C(C)(C)C)cc4C4(C)CCCCC34C)cc1N2c1cccc2c1oc1ccccc12]
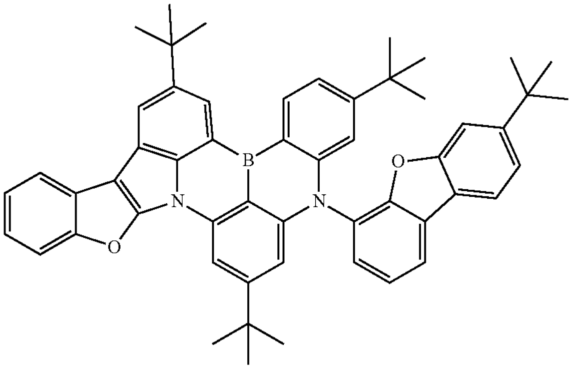

-continued
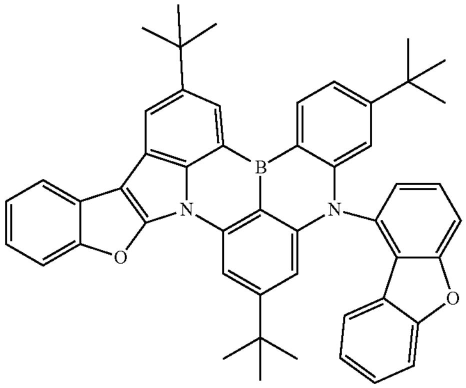
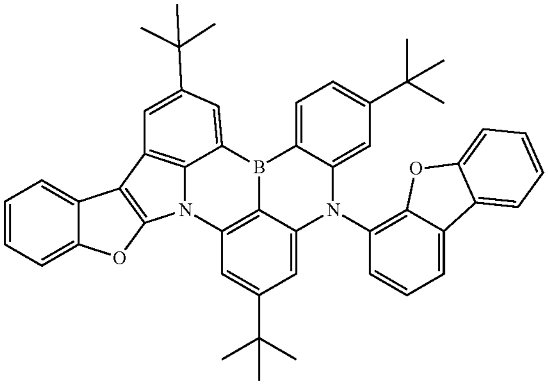
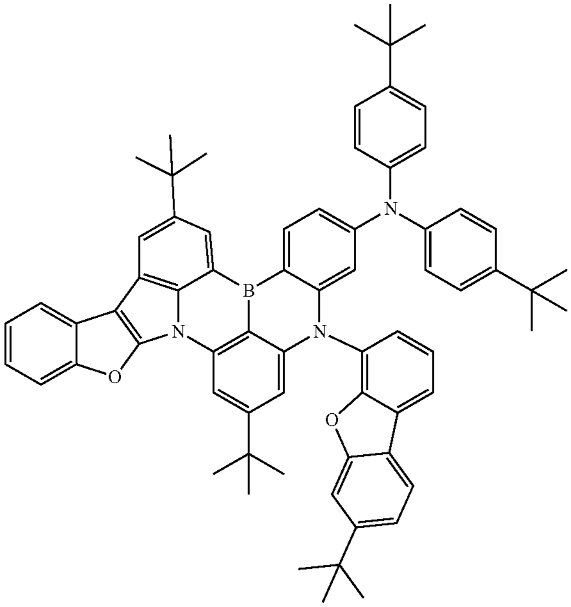
-continued
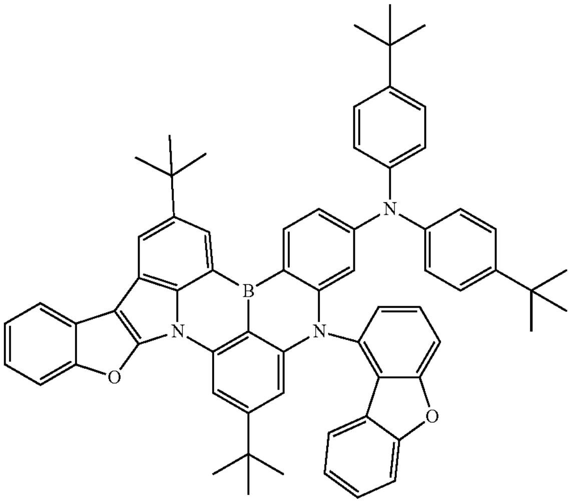
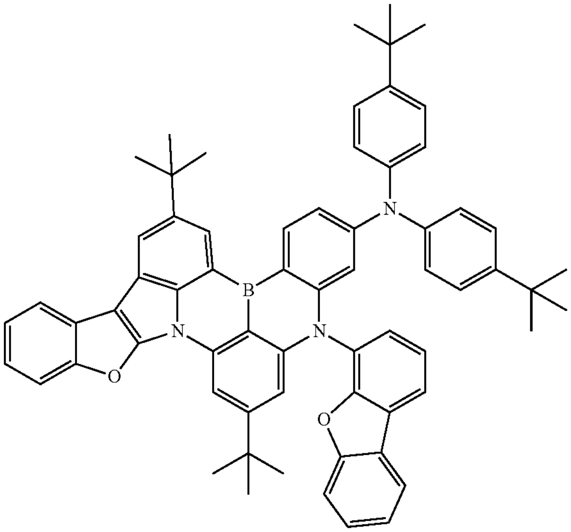
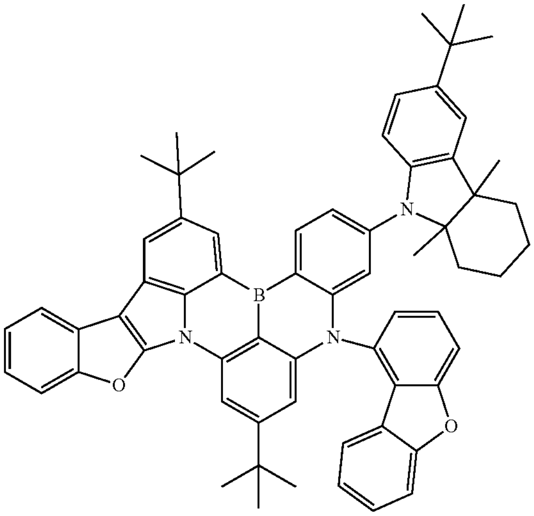

-continued
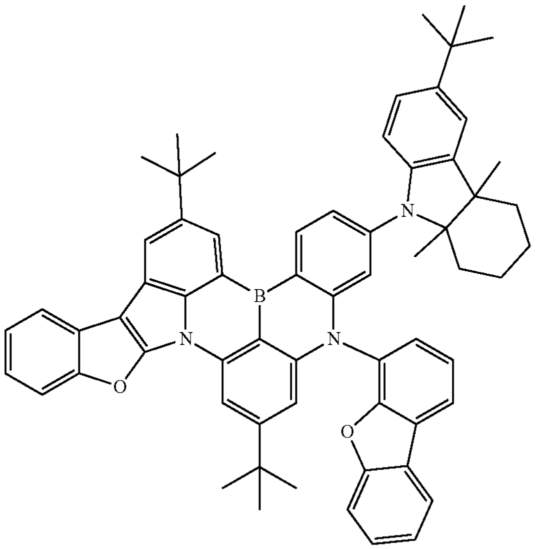
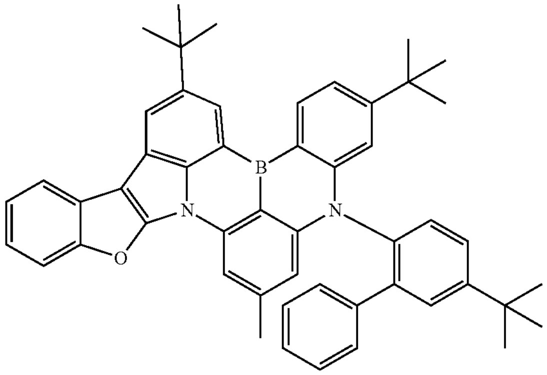
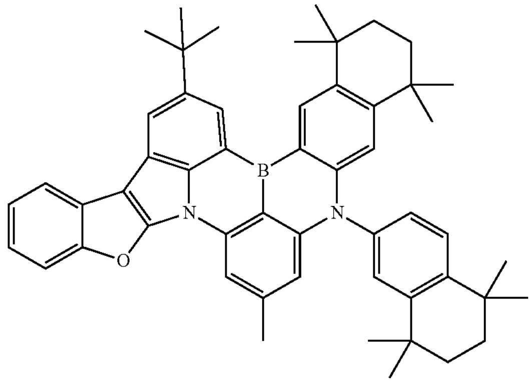
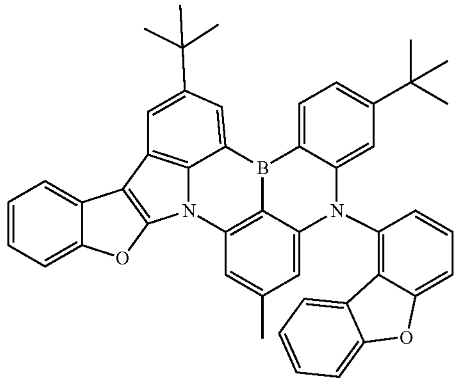
-continued
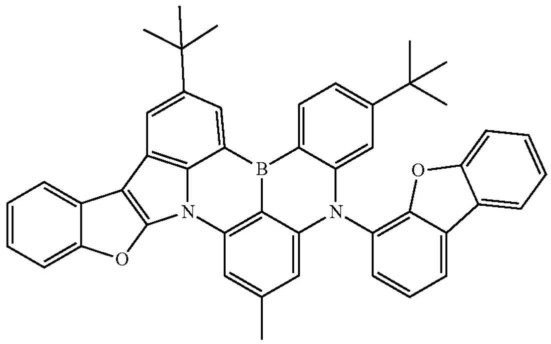
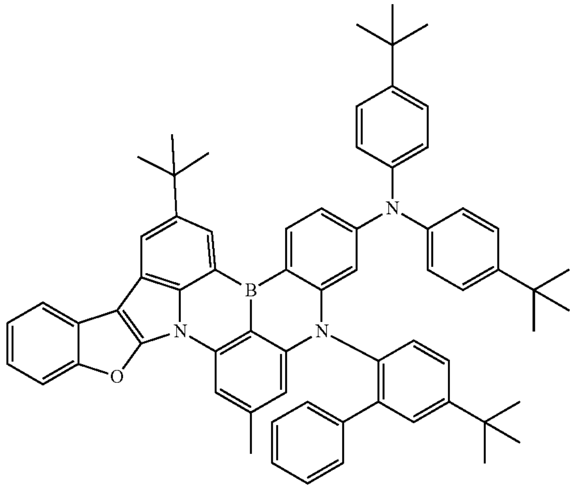
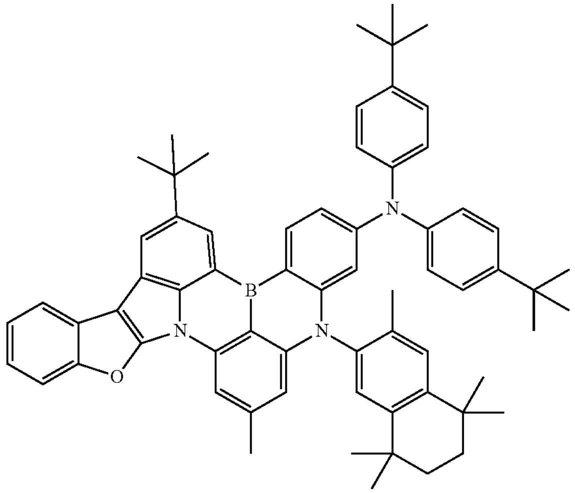

-continued
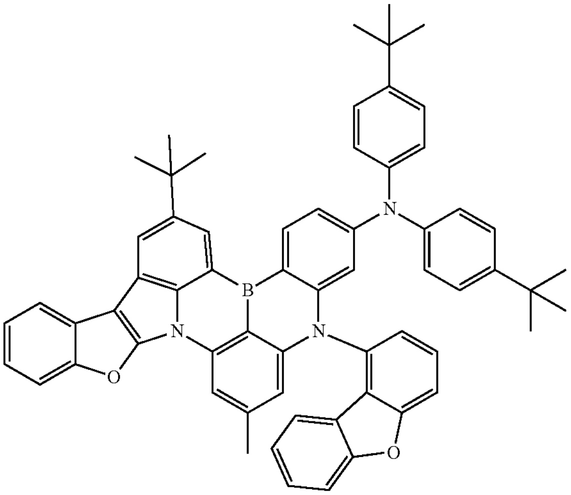
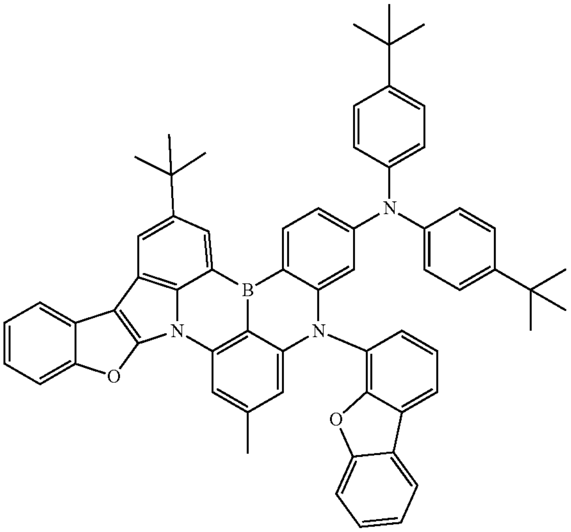
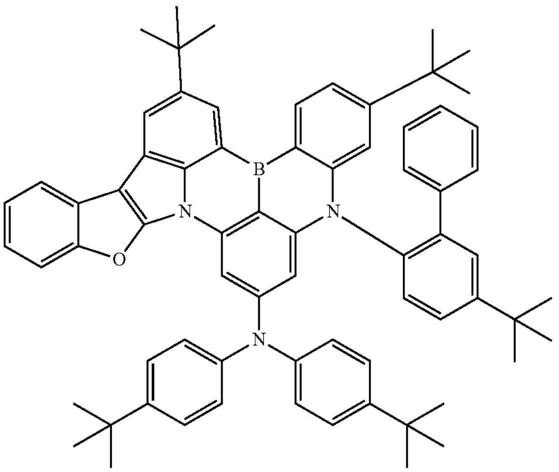
-continued
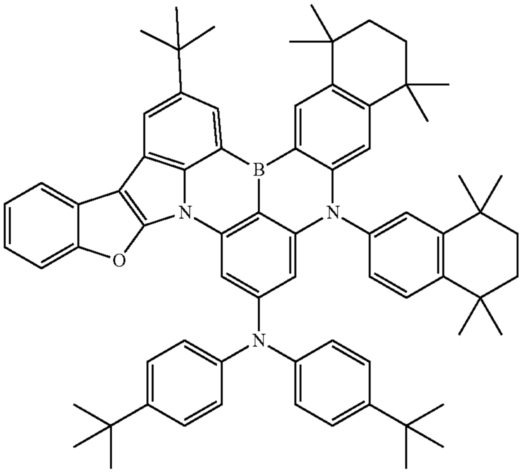
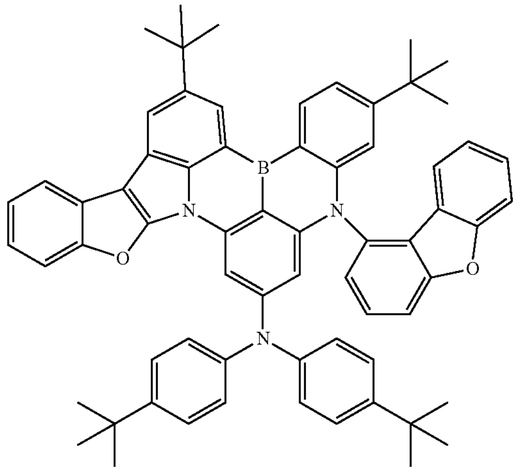
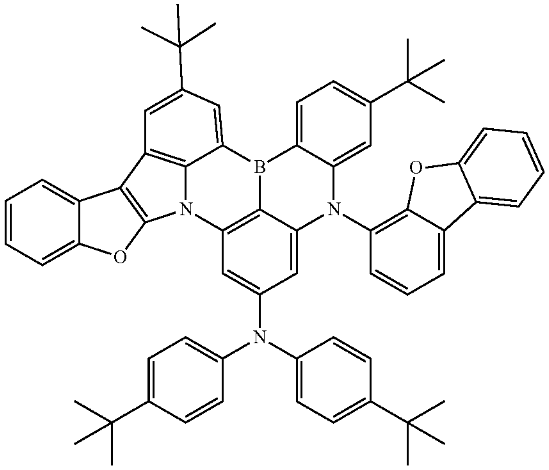

-continued
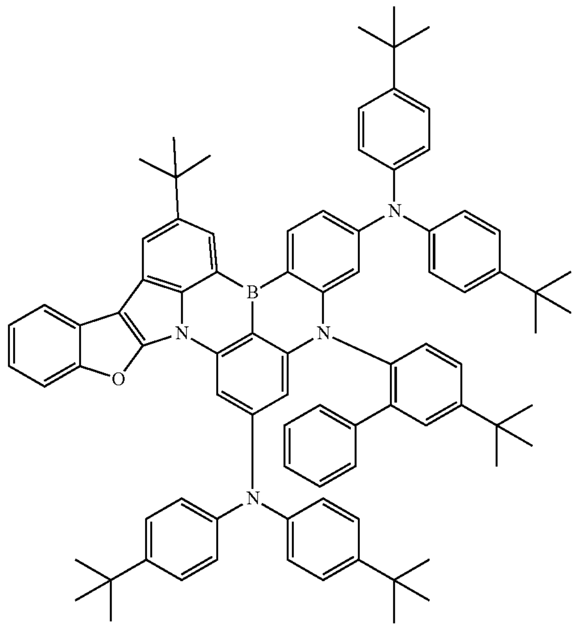
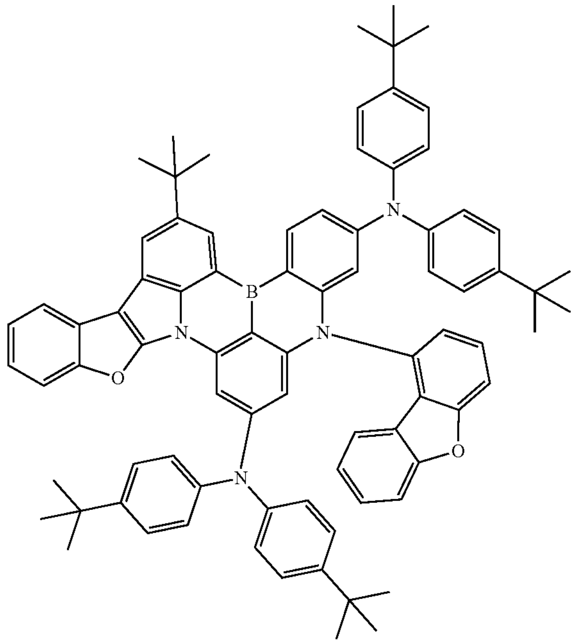
-continued
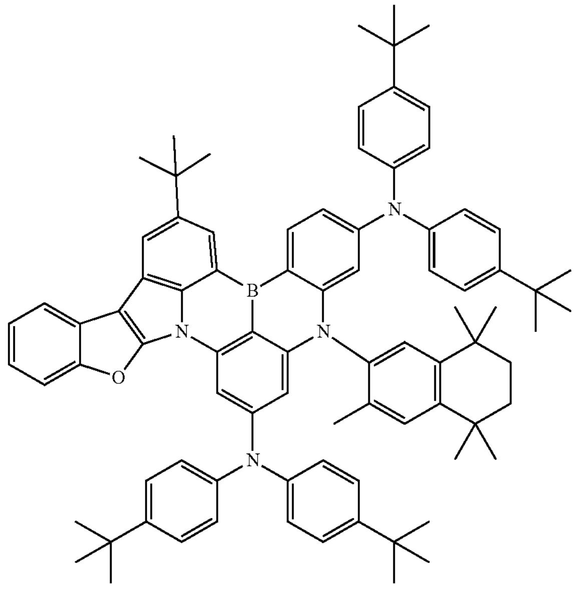
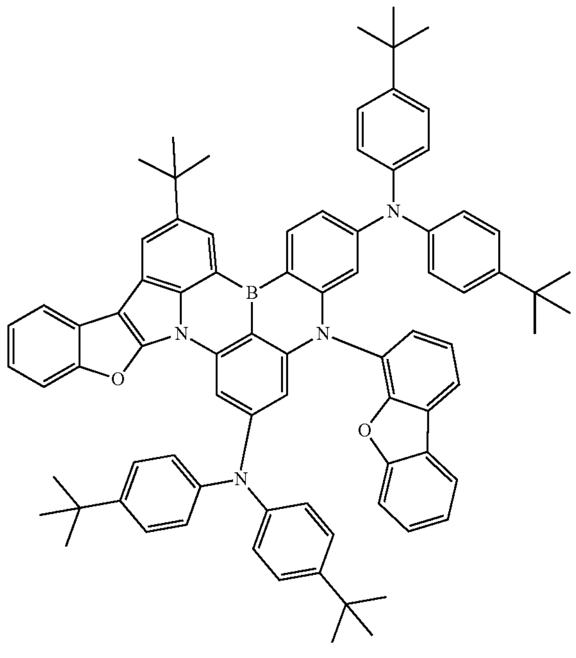

-continued
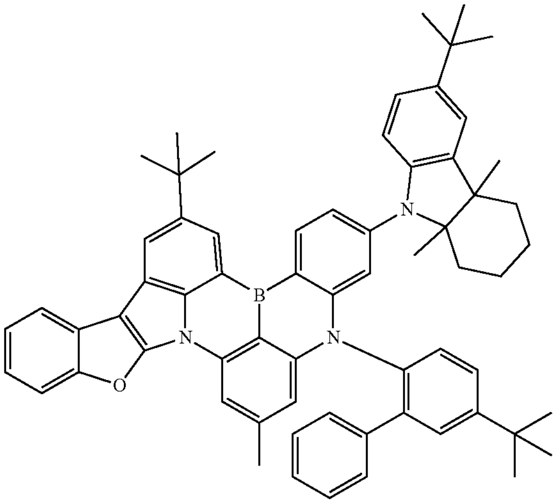
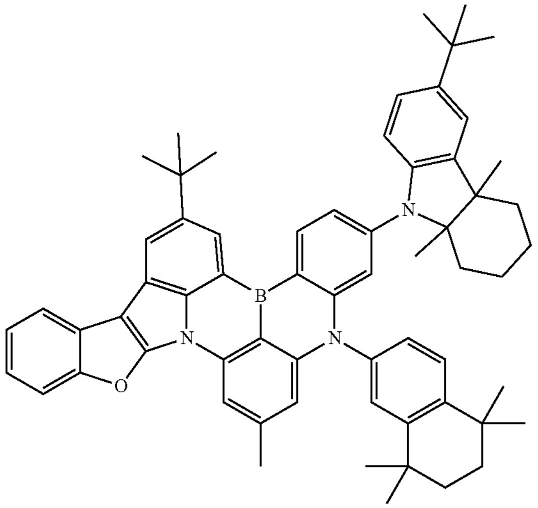
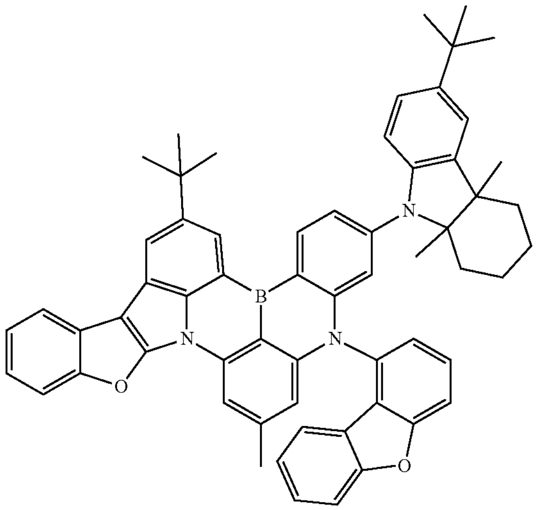
-continued
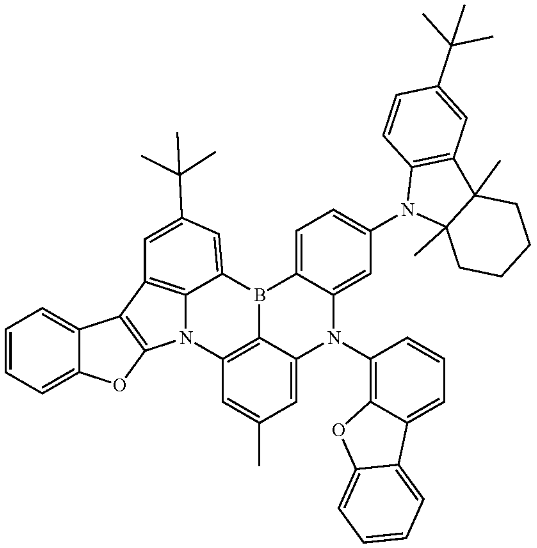
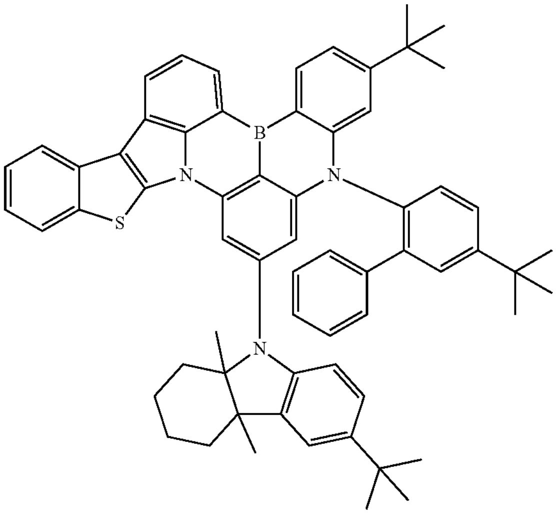
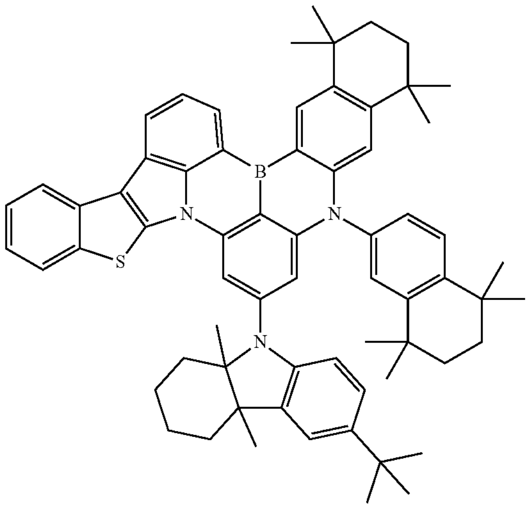

-continued
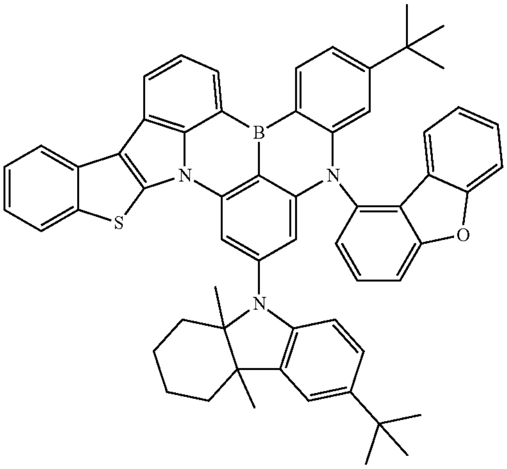
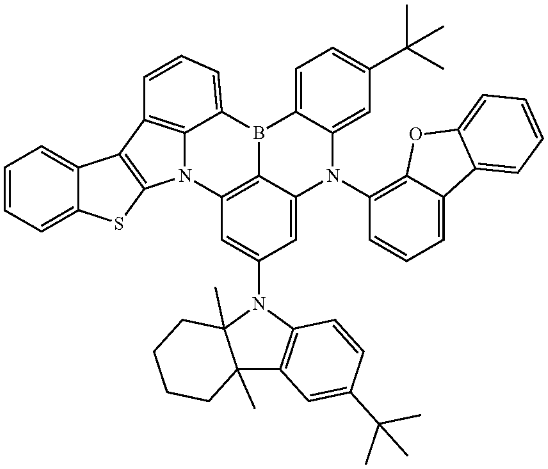
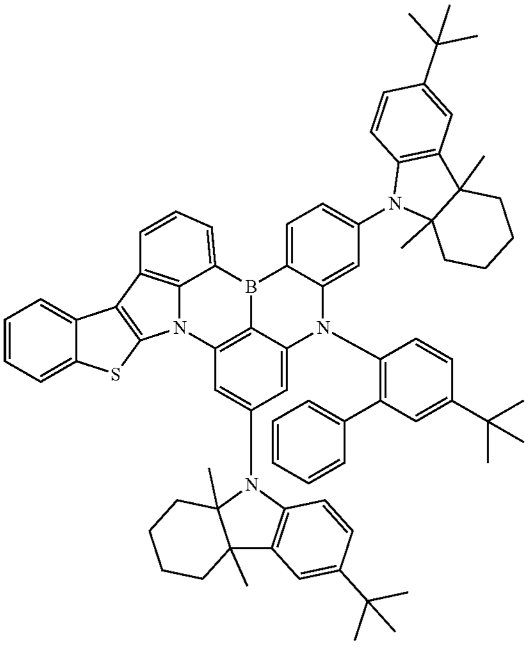
-continued
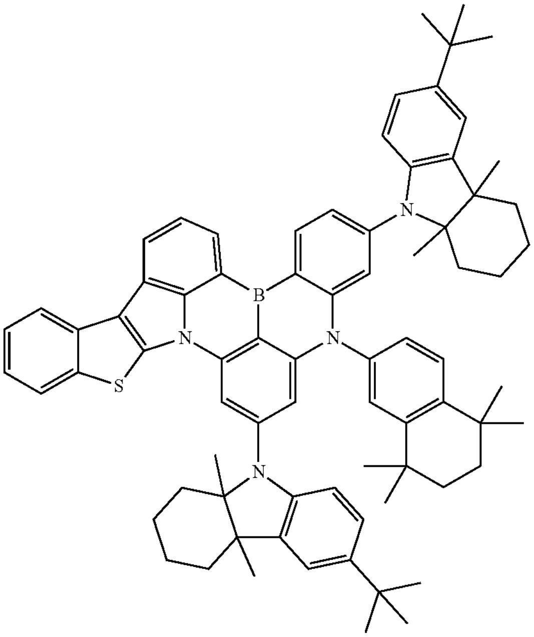
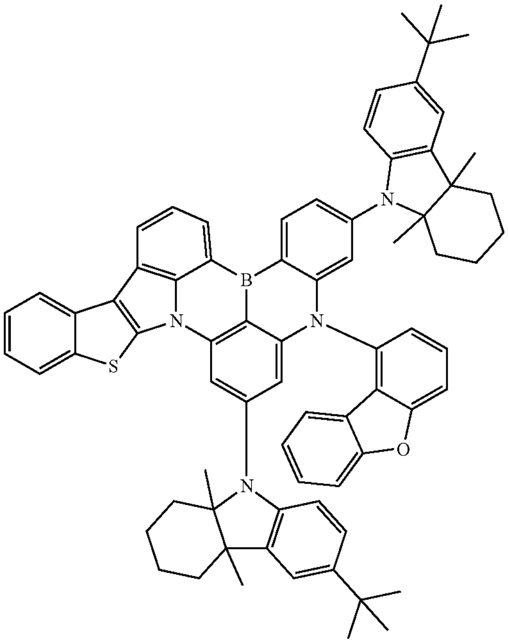

-continued
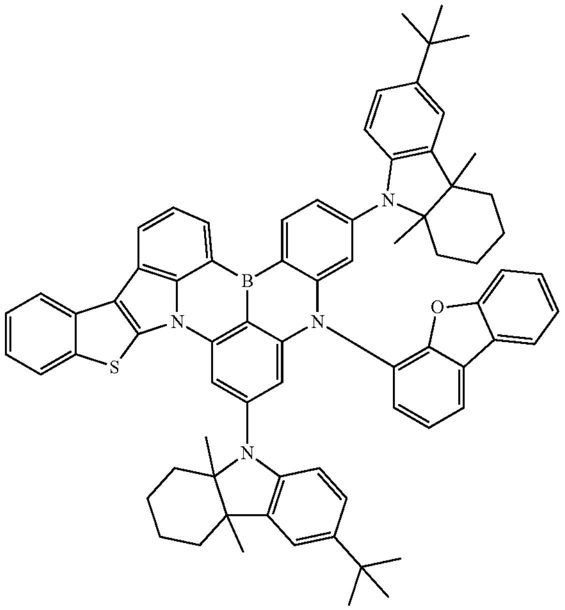
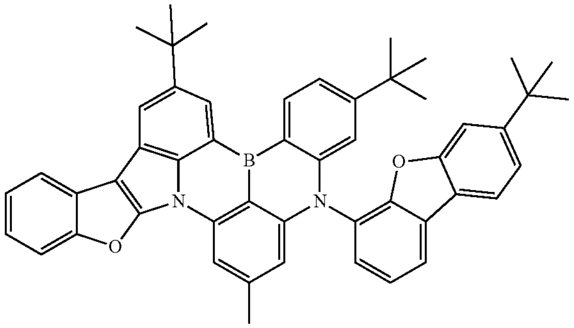
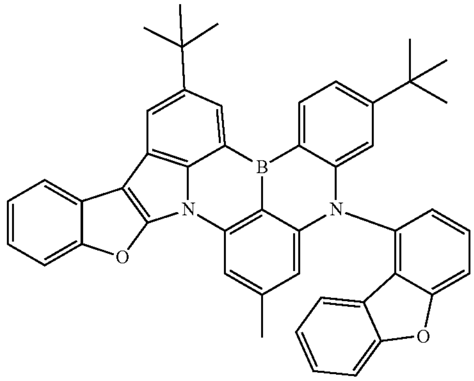
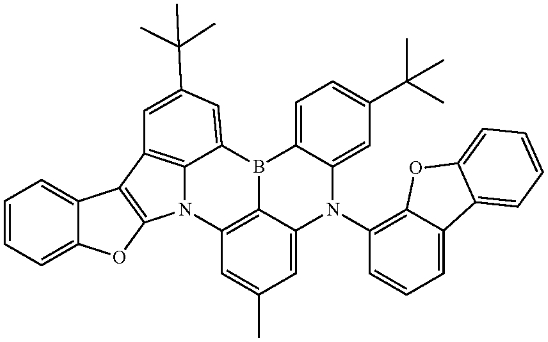
-continued
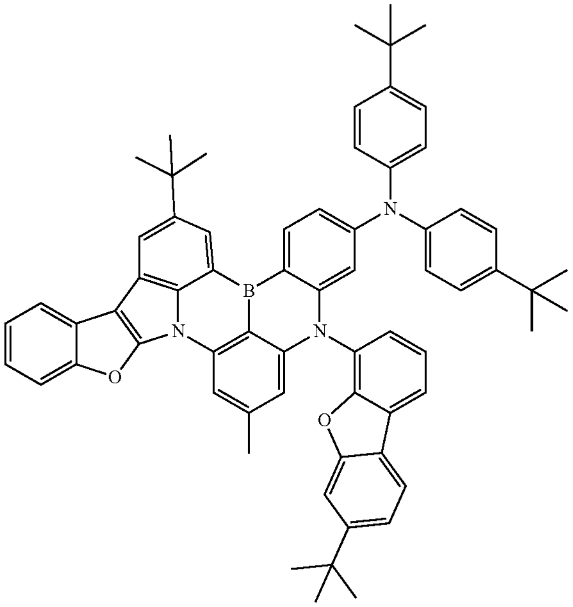
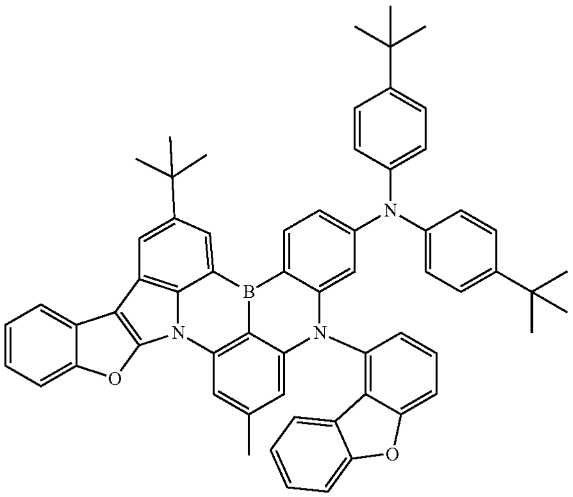
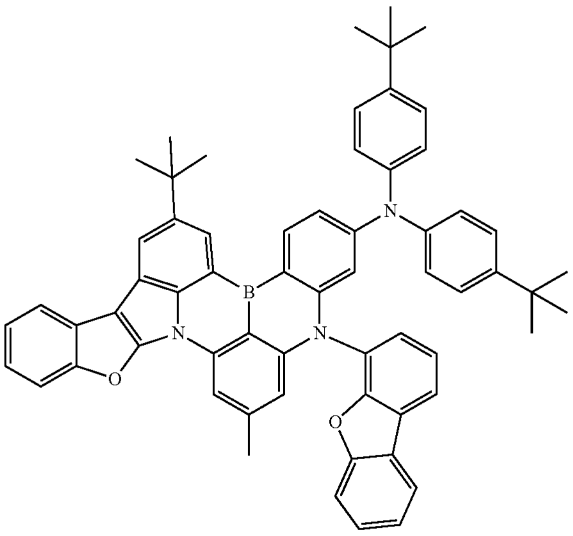

-continued
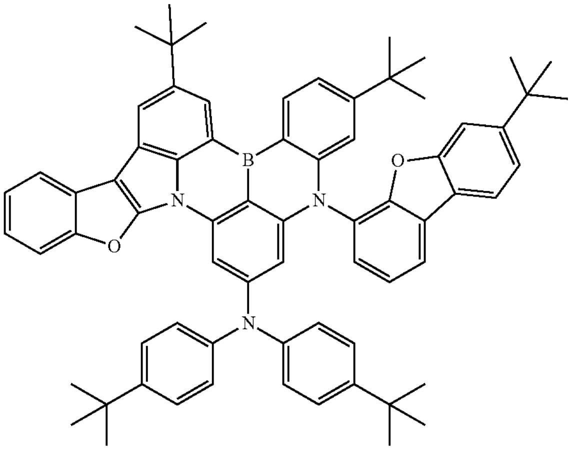
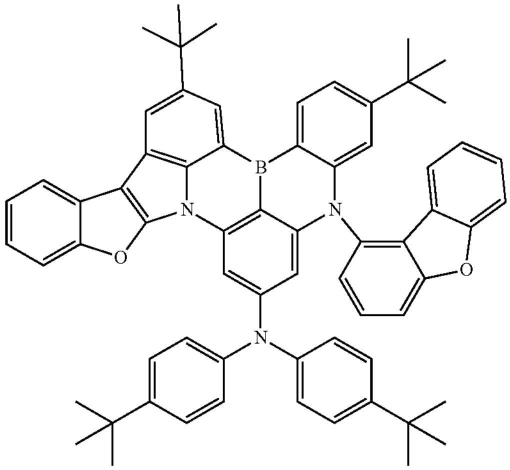
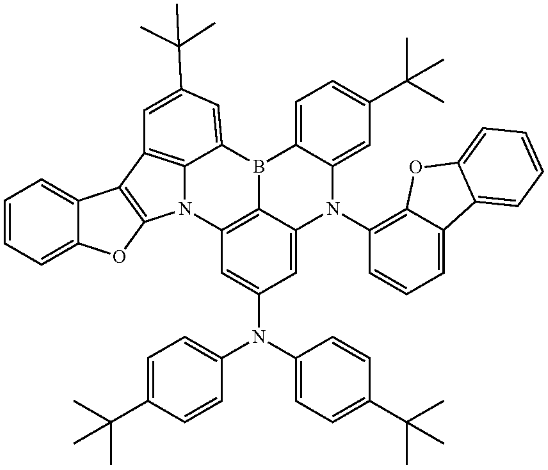
-continued
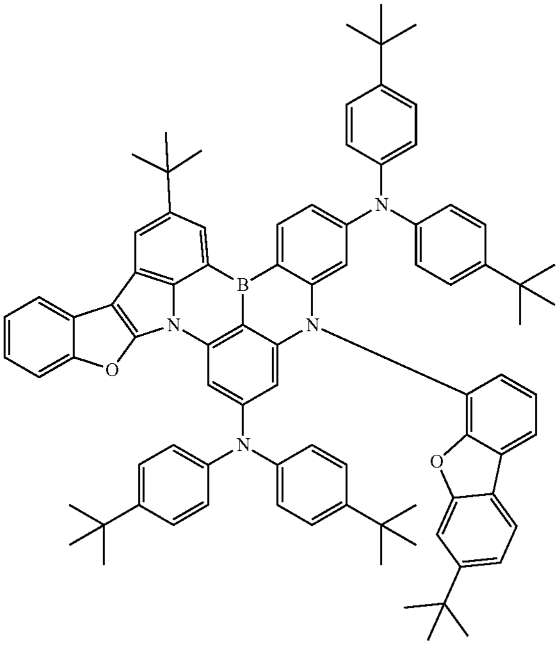
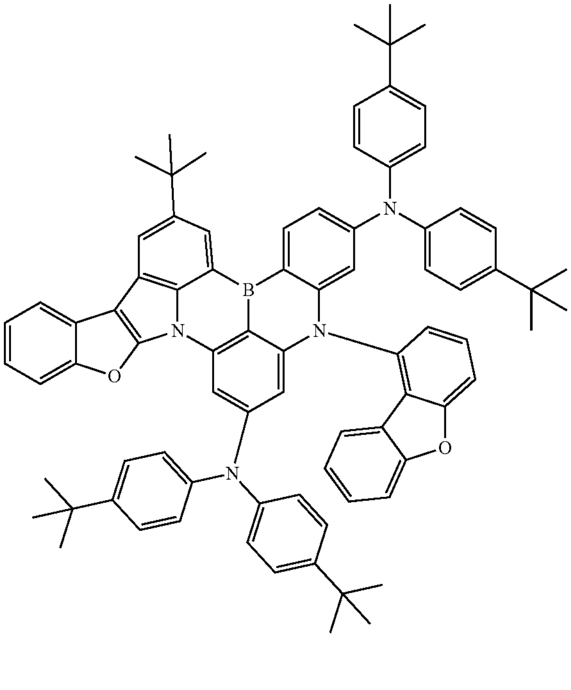

-continued
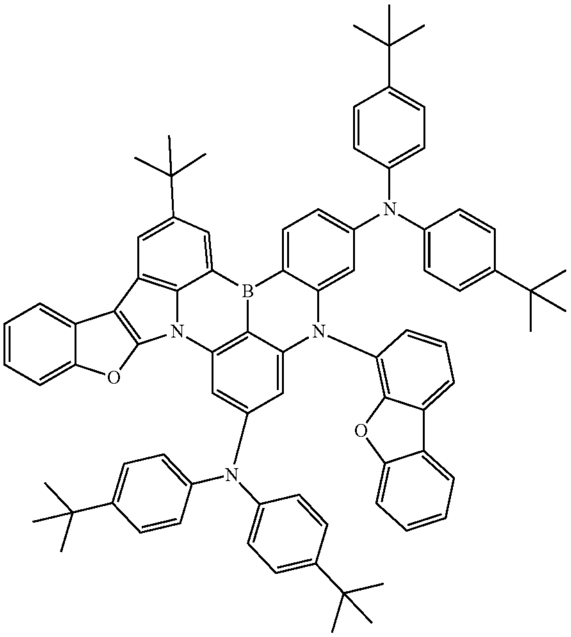
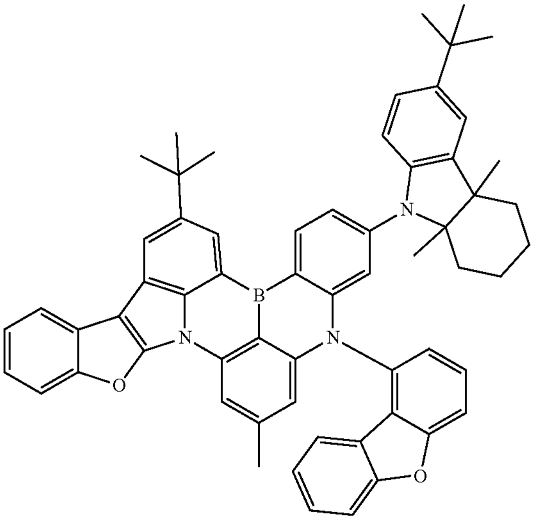
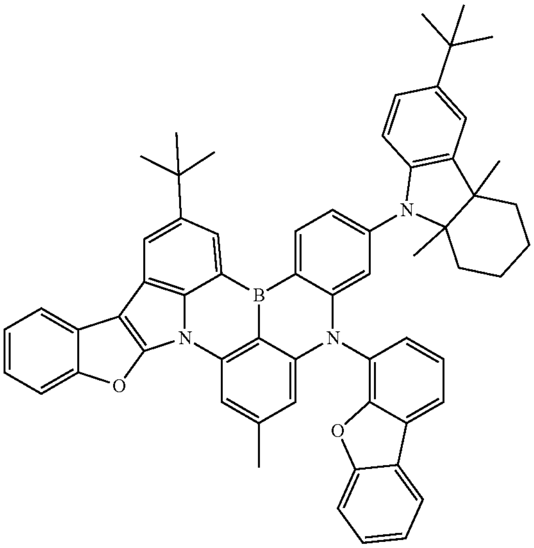
-continued
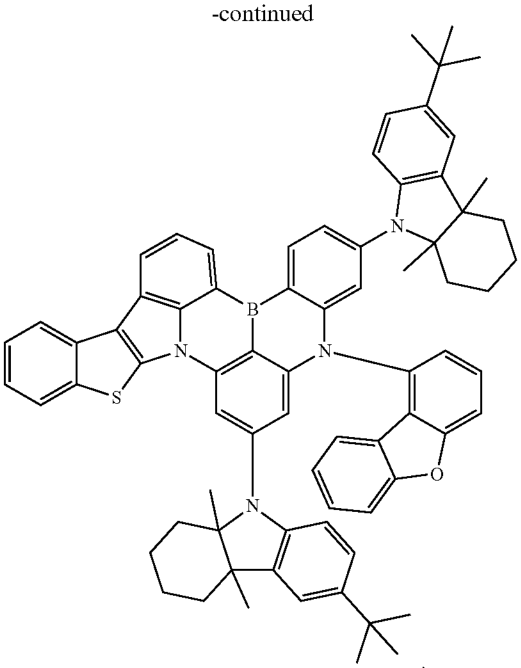
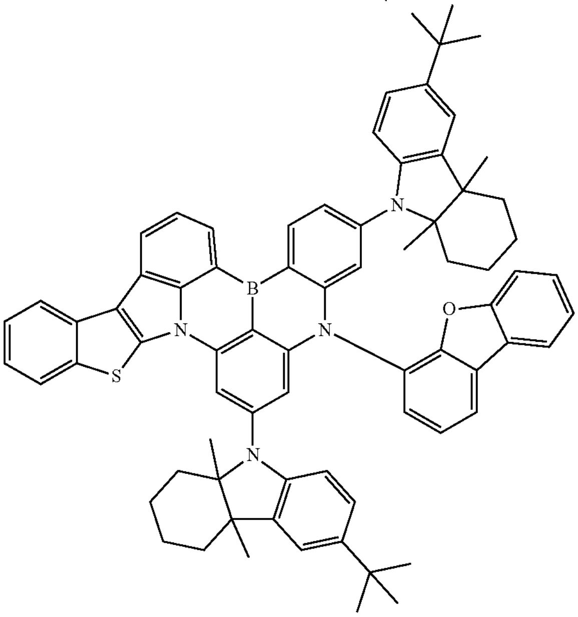 [SMILES: CC(C)(C)c1ccc2c(c1)C1(C)CCCCC1(C)N2c1ccc2c(c1)N(c1cccc3c1oc1ccccc13)c1cc(N3c4ccc(C(C)(C)C)cc4C4(C)CCCCC34C)cc3c1B2c1cccc2c4c5ccccc5sc4n-3c12]
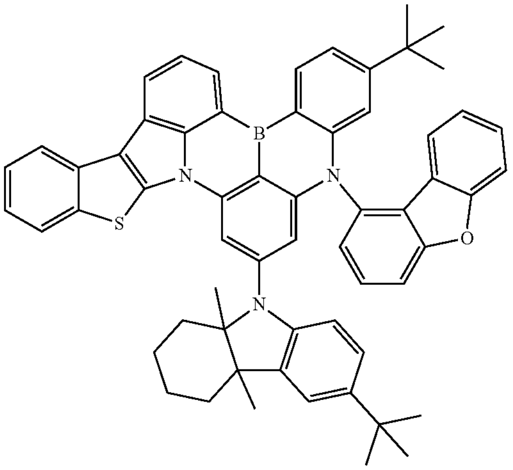

-continued
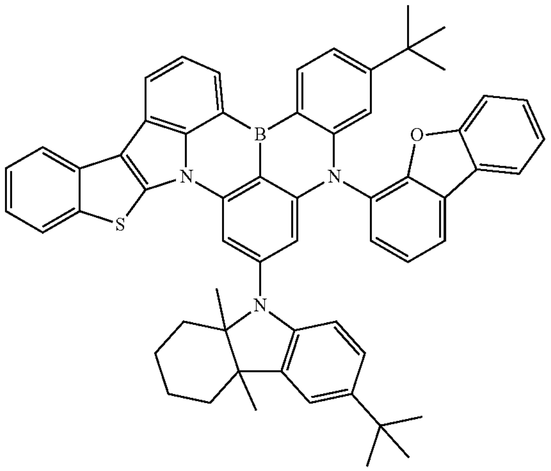
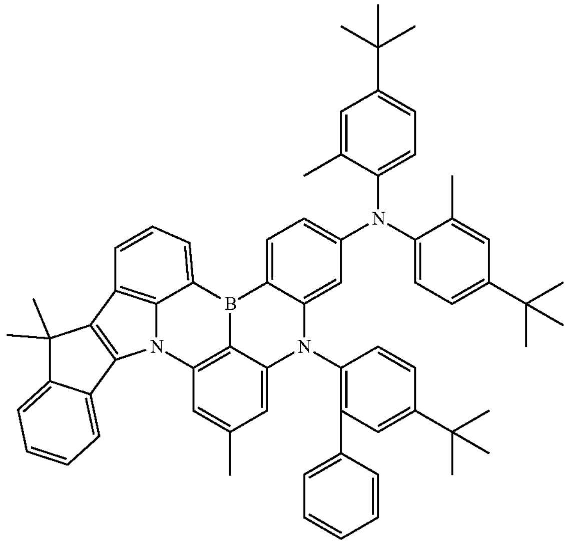
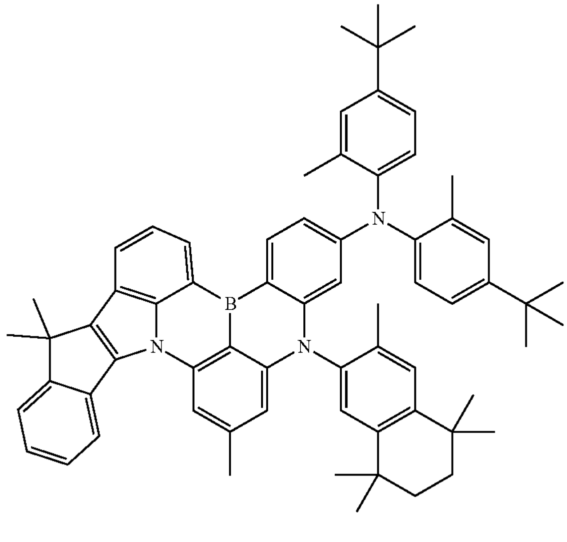
-continued
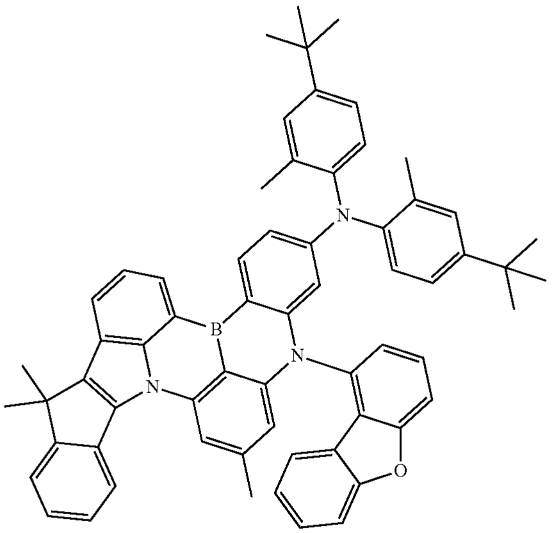
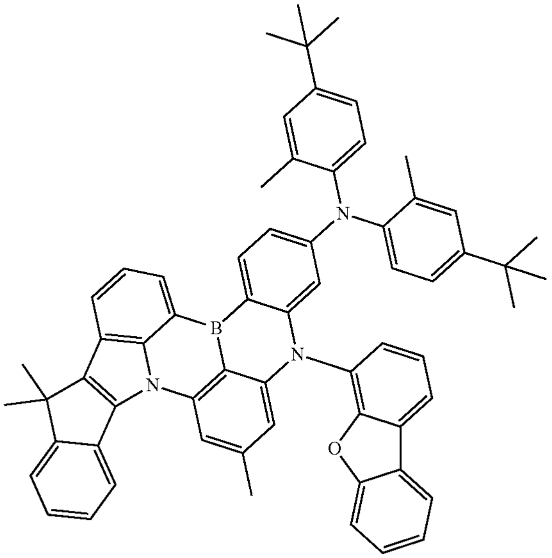
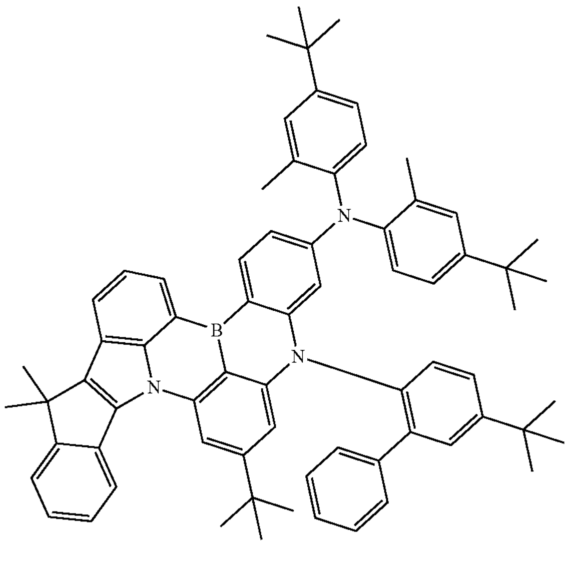

-continued
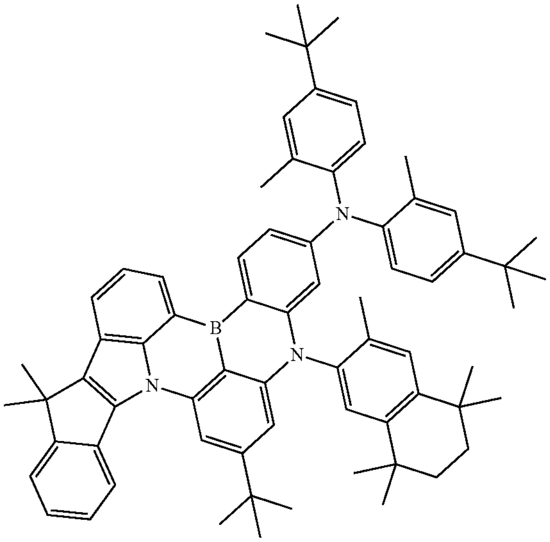
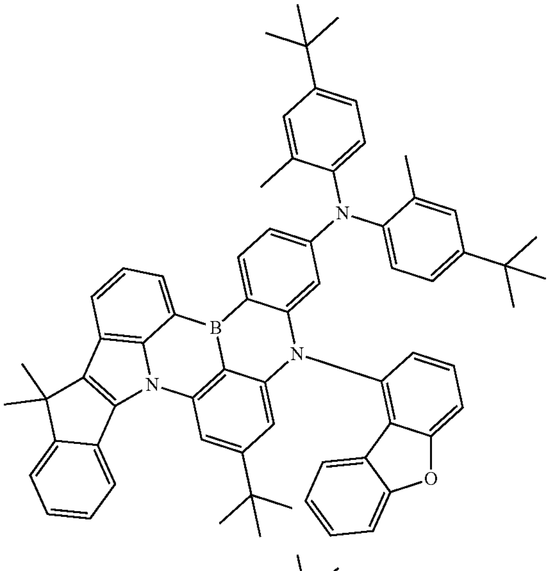
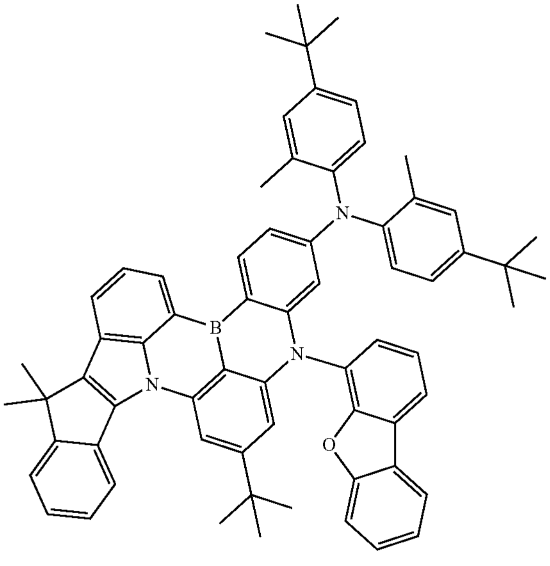
-continued
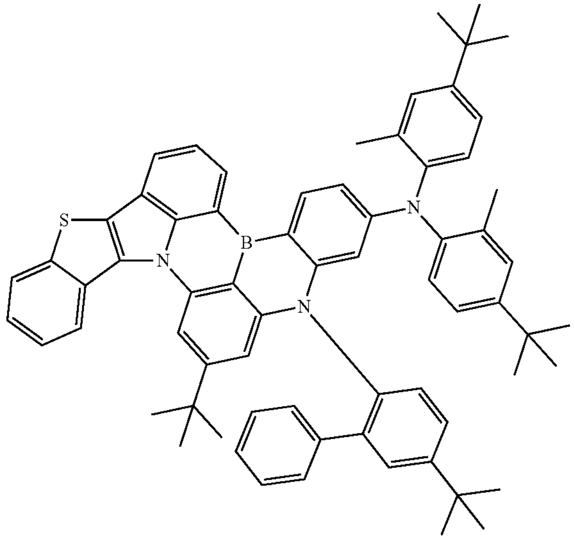
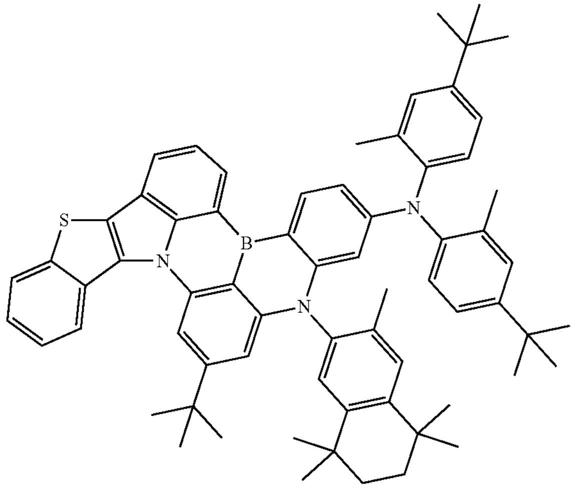
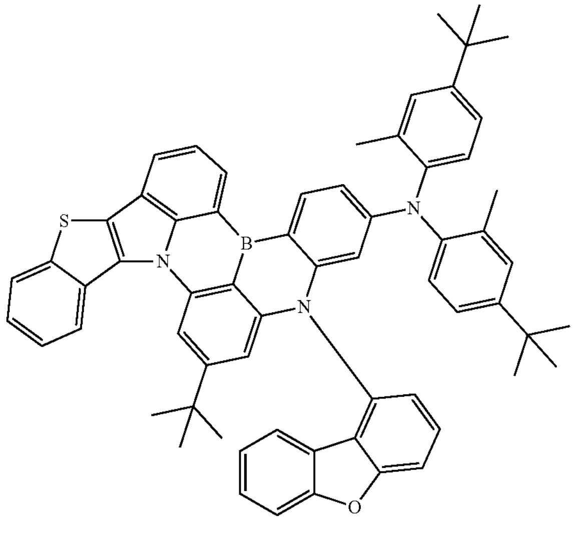

-continued
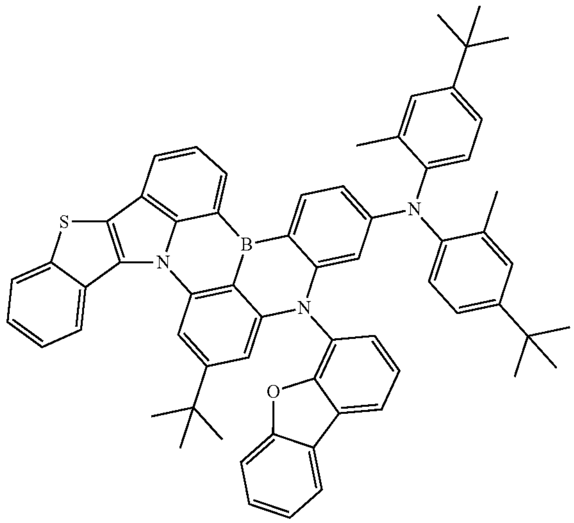
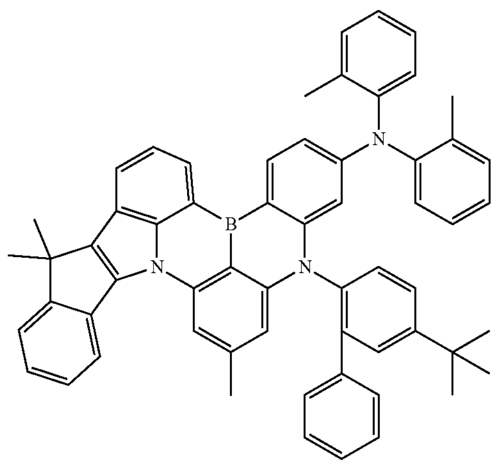
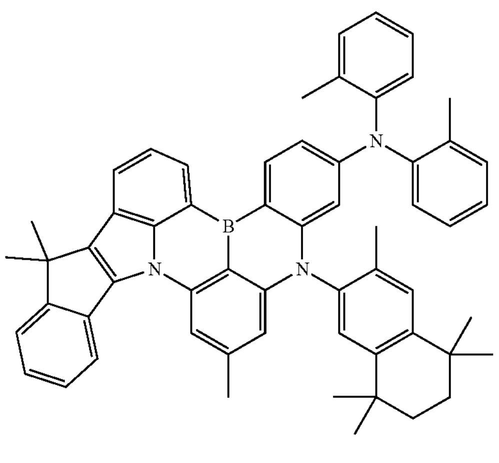
-continued
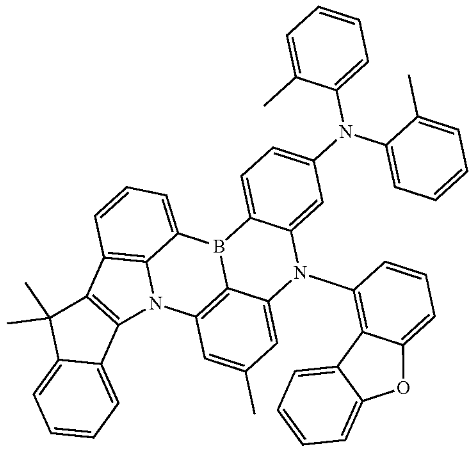
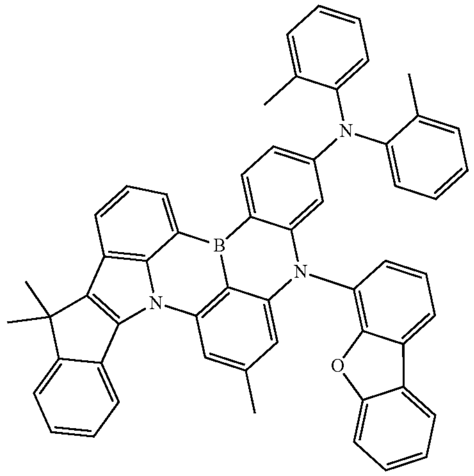
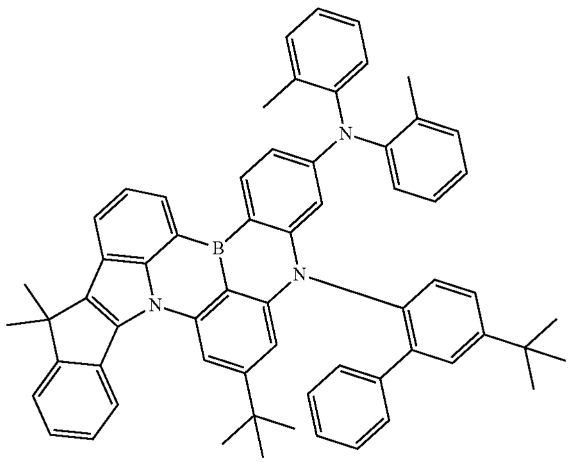

-continued
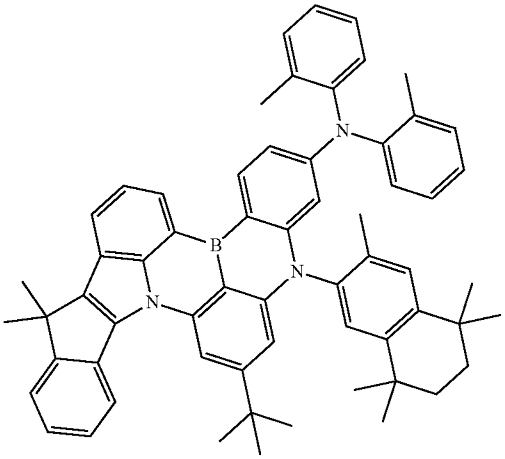
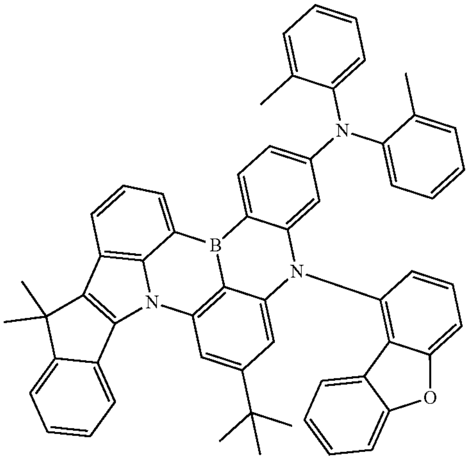
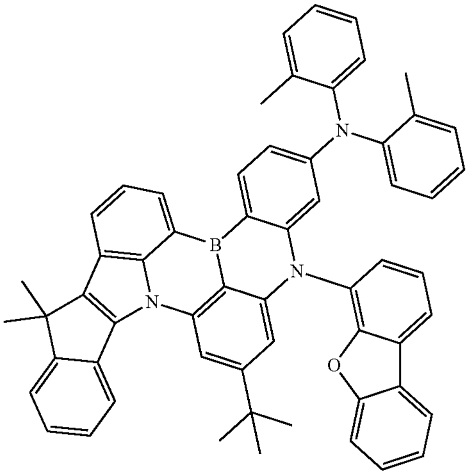
-continued
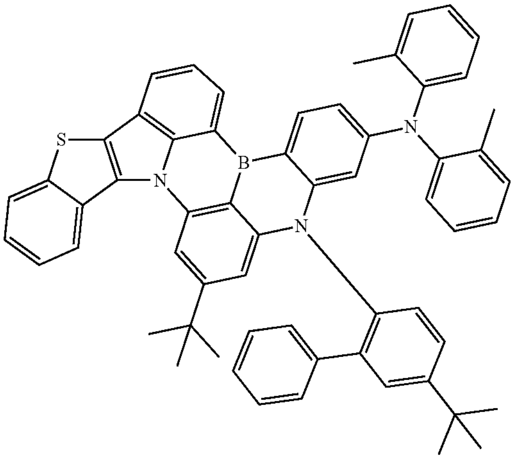
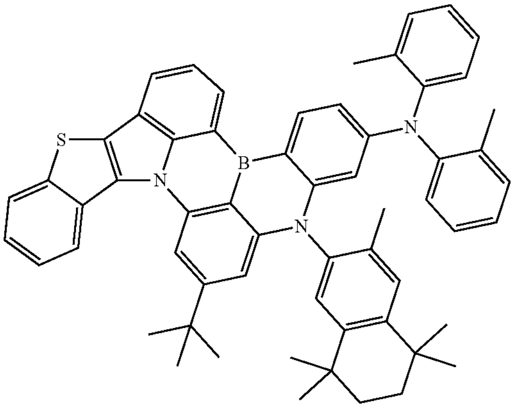
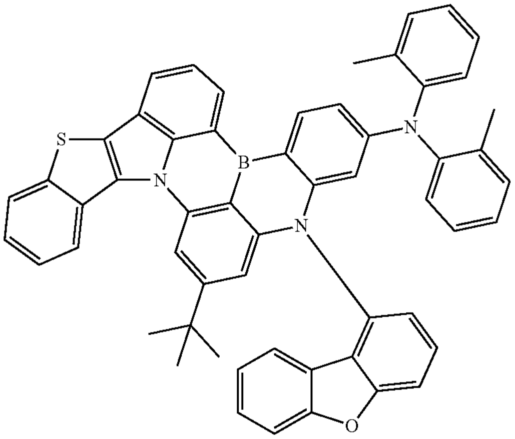

-continued
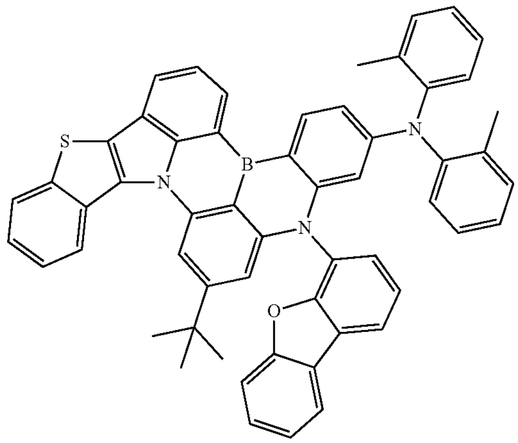
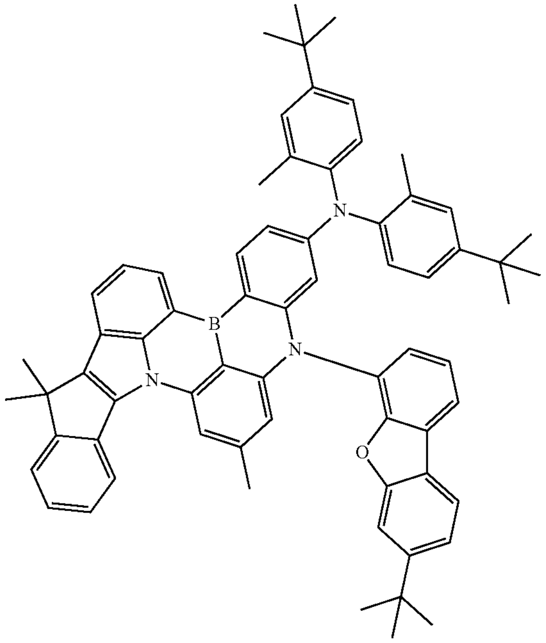
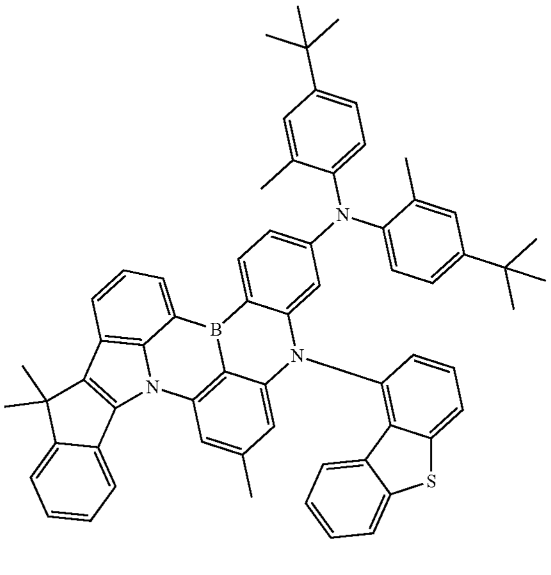
-continued
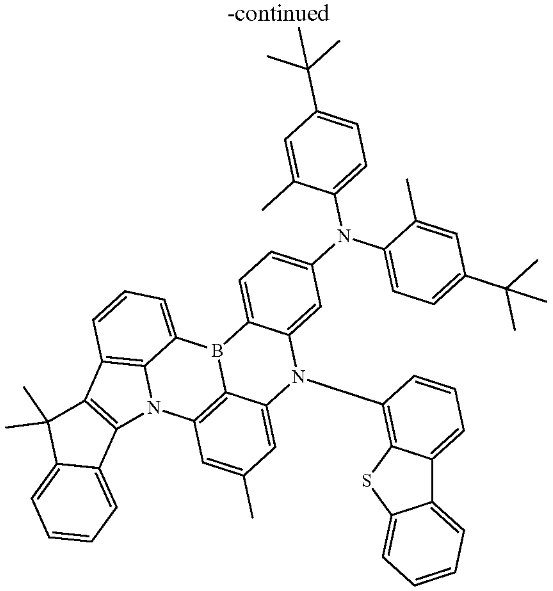
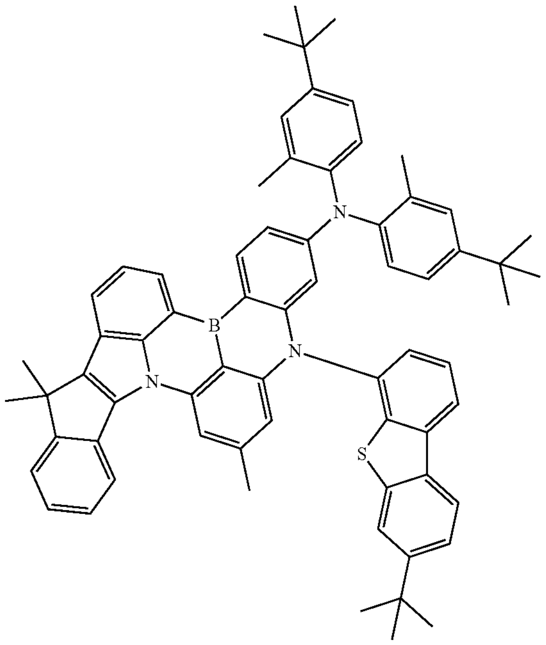

-continued
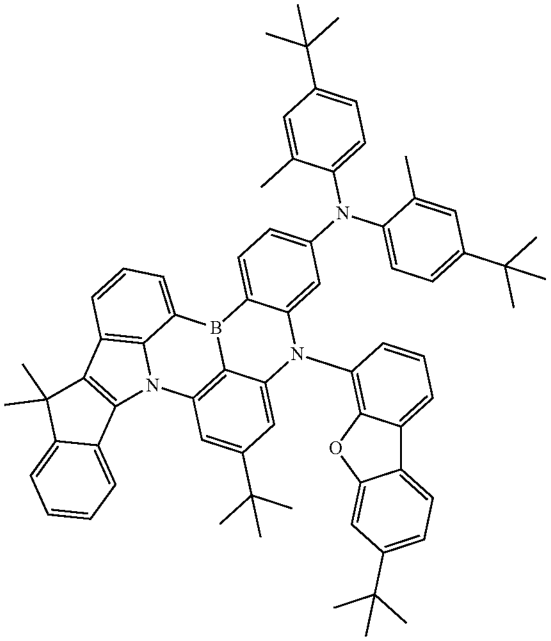
-continued
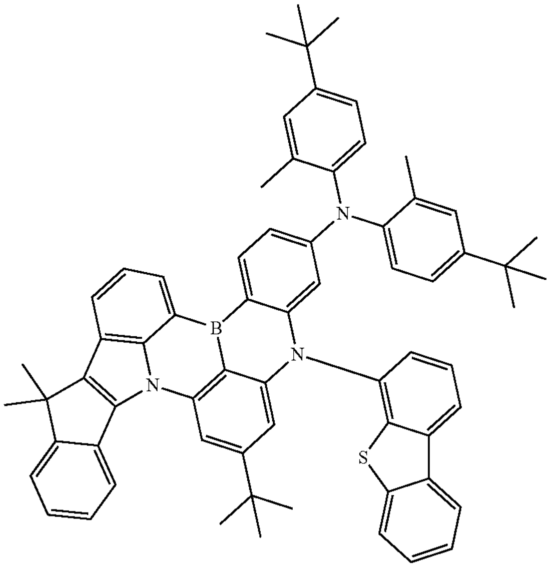
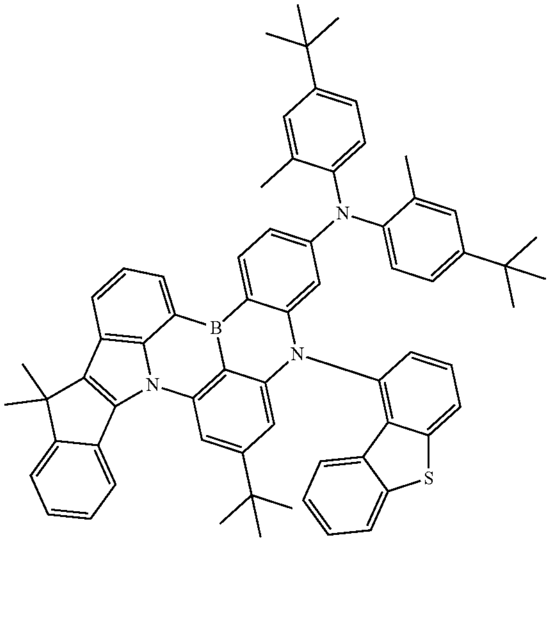
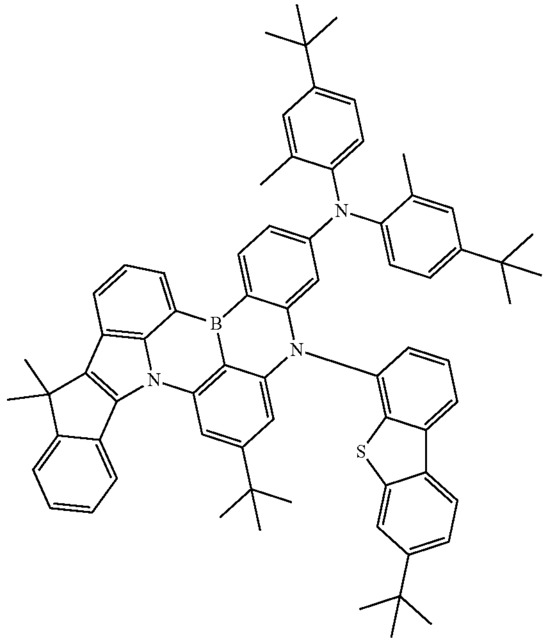

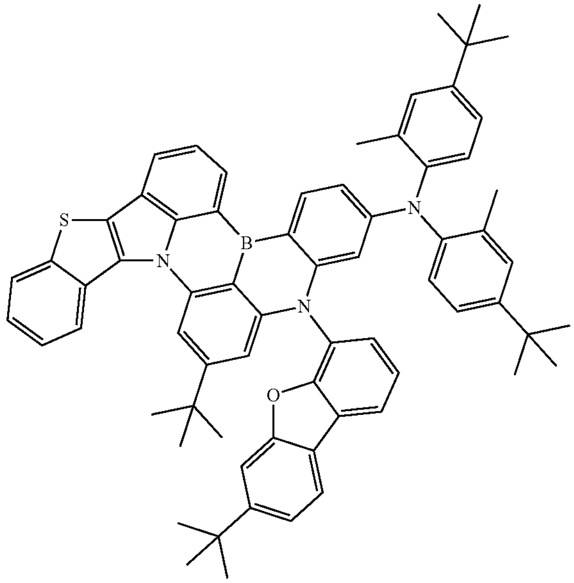
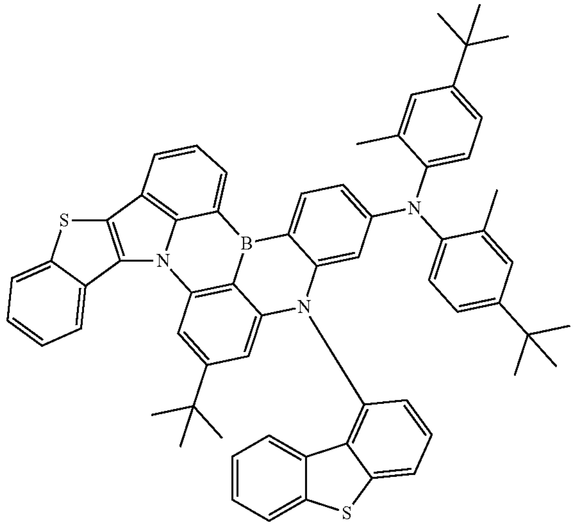
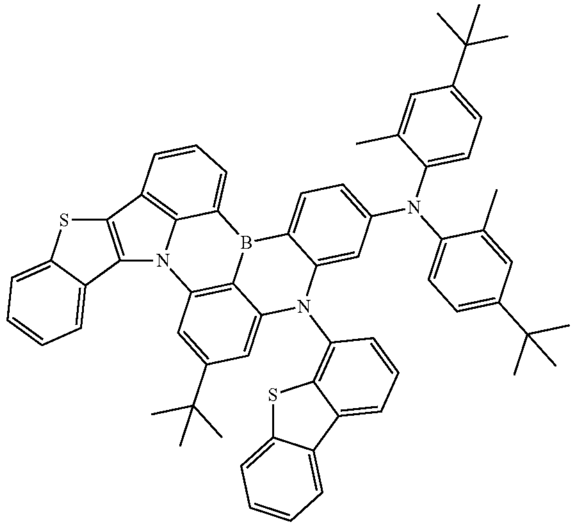
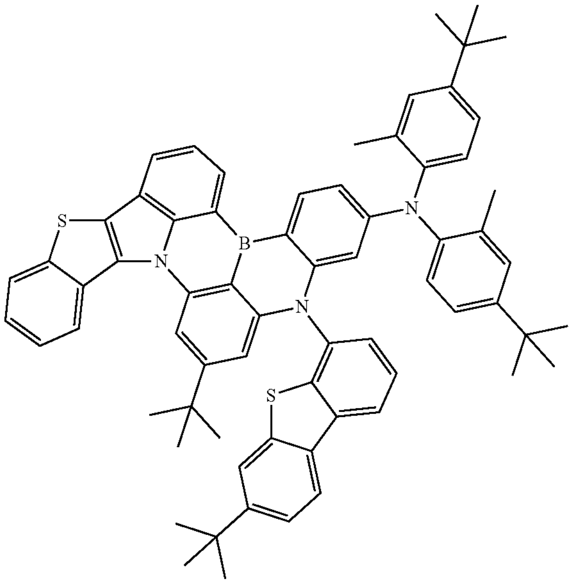
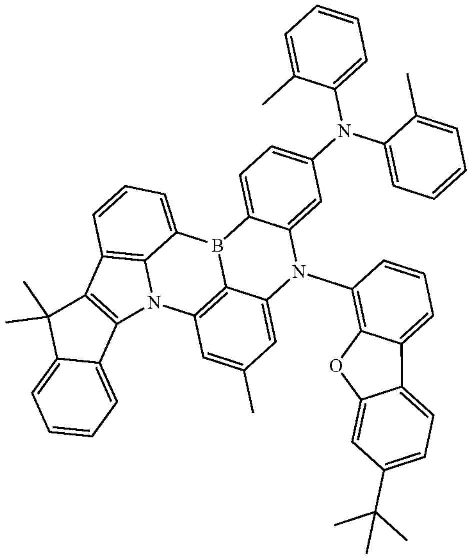
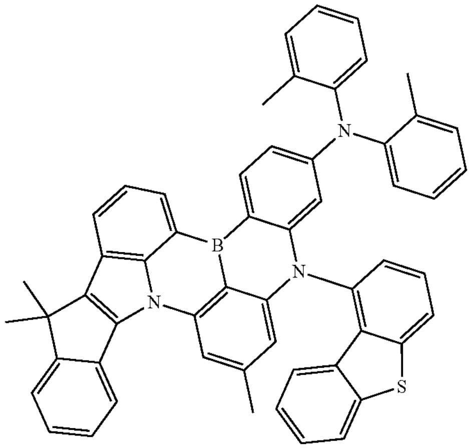

-continued
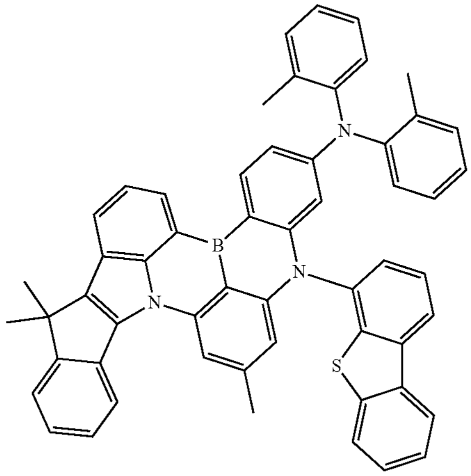
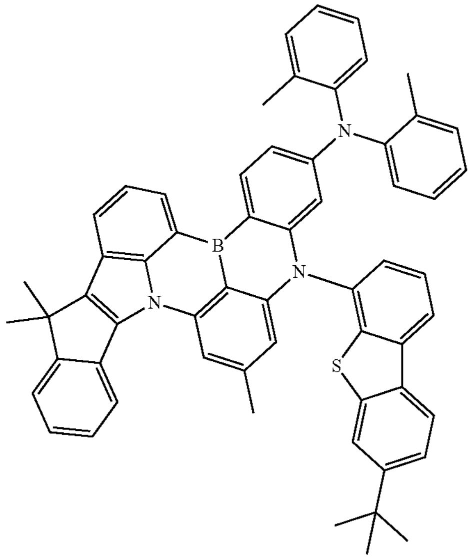
-continued
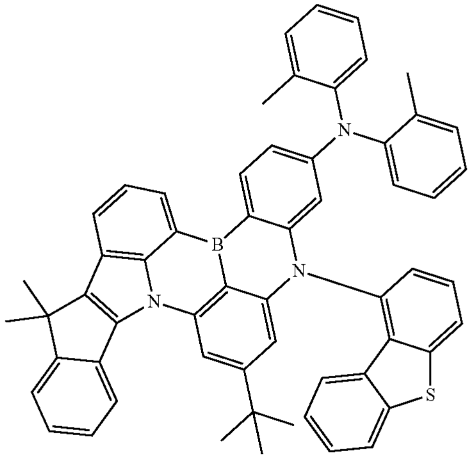
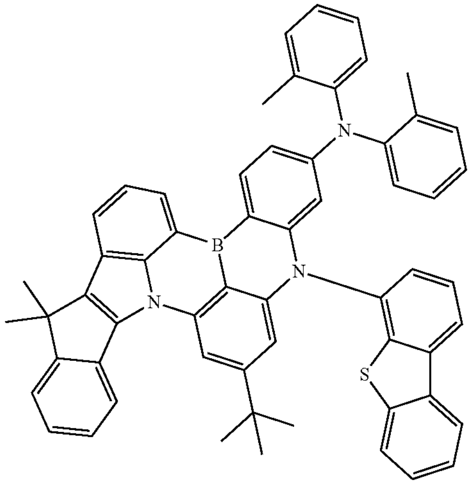
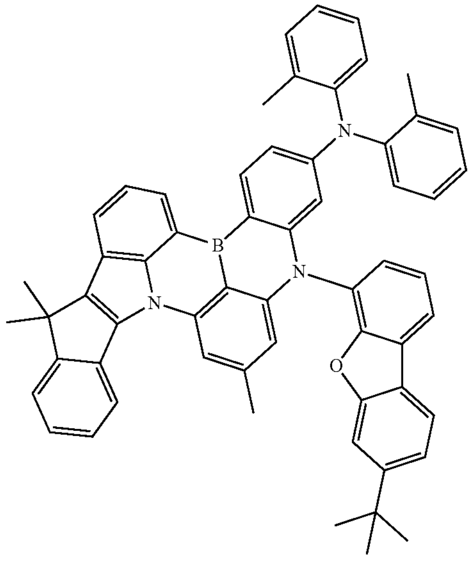
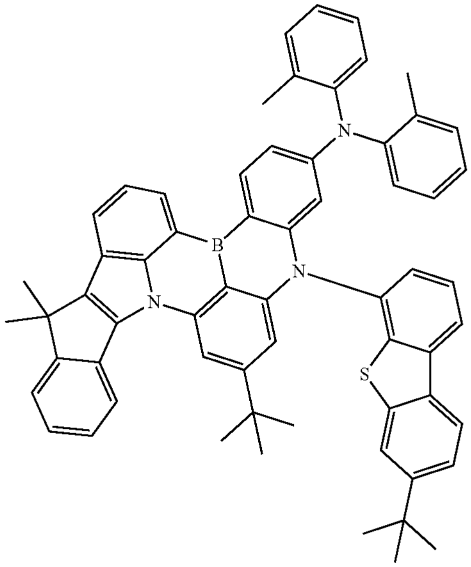

-continued
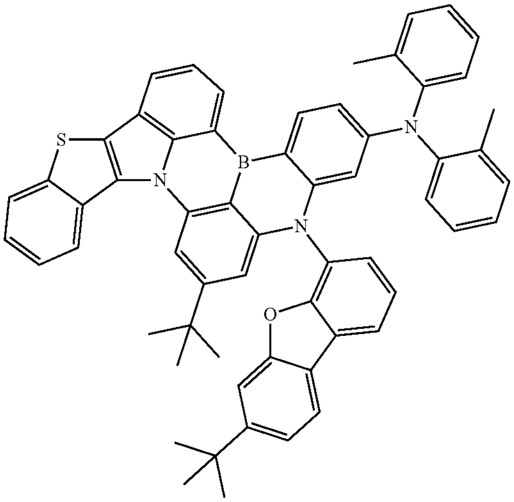
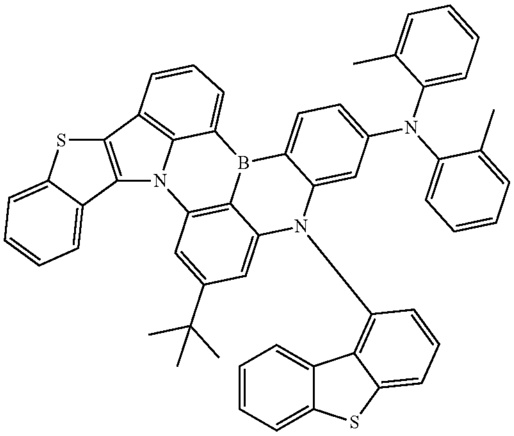
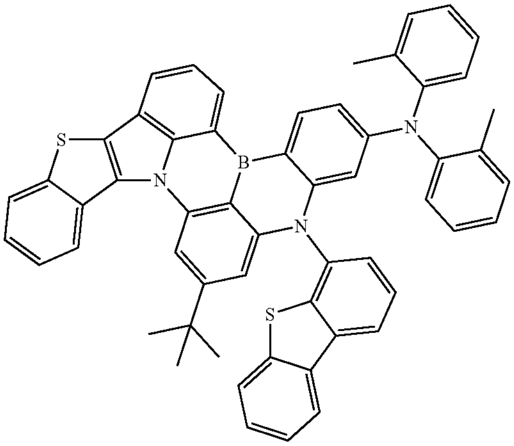
-continued
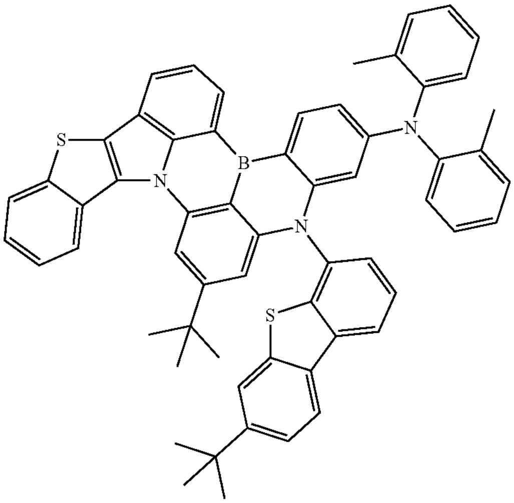
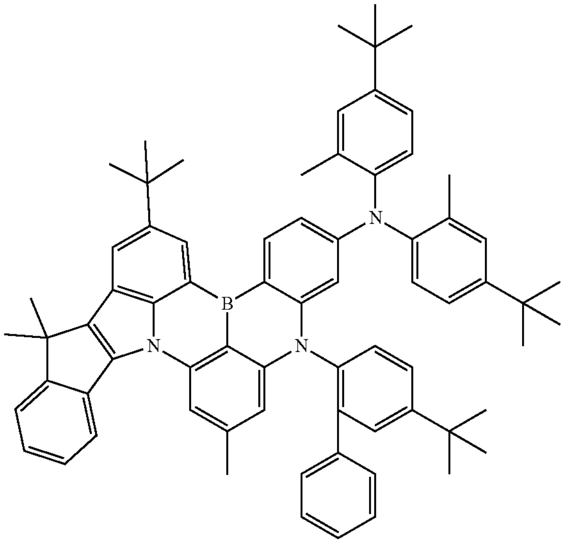
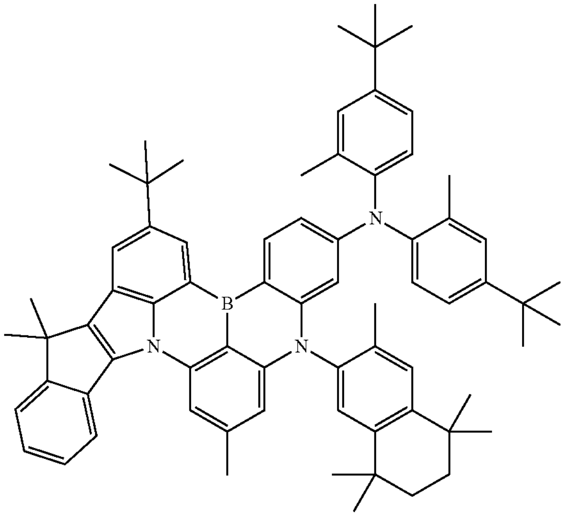

-continued
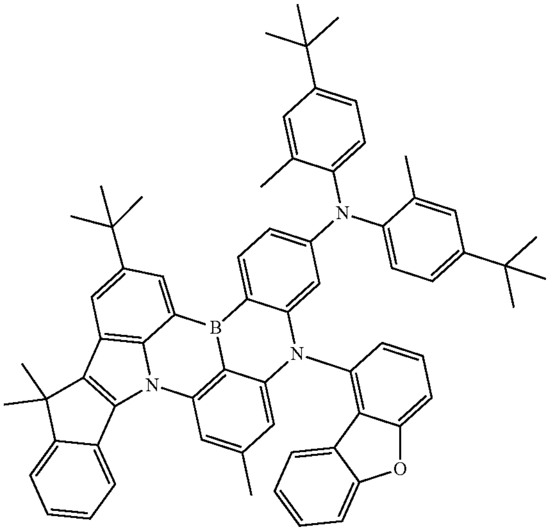
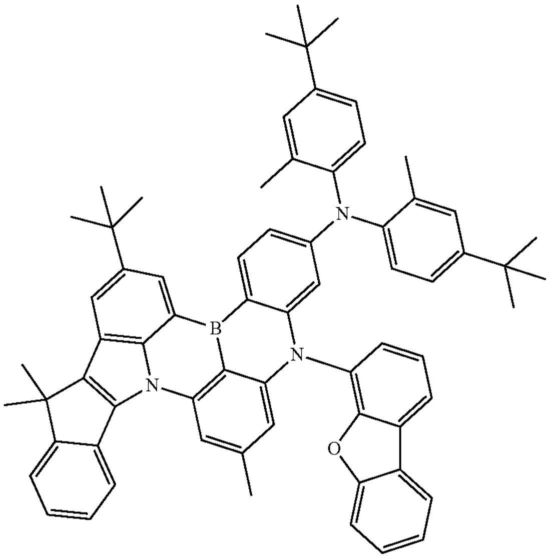
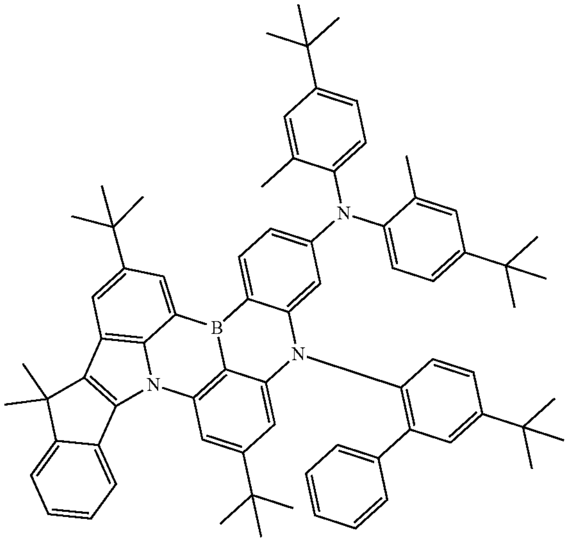
-continued
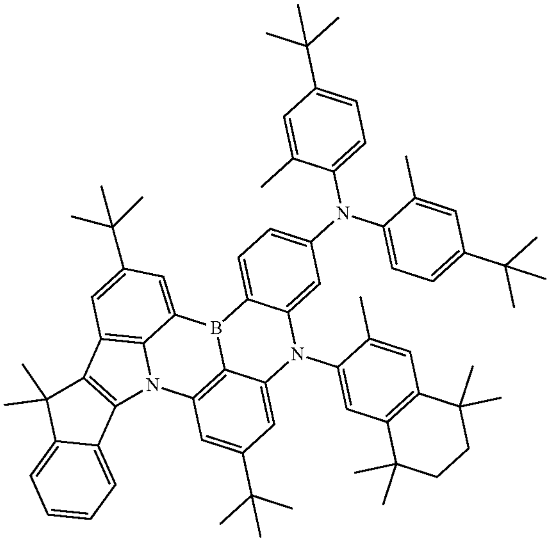
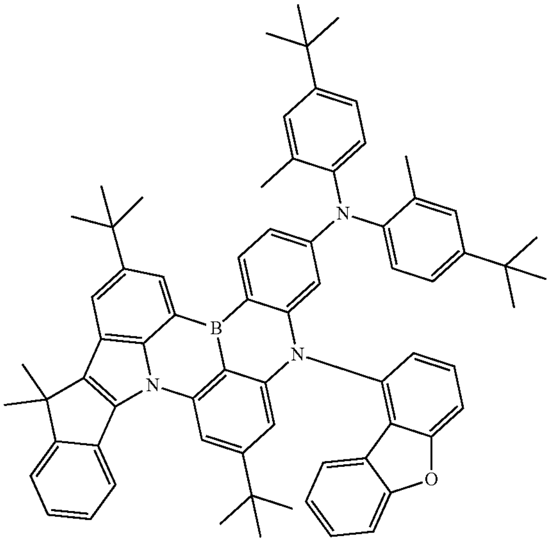
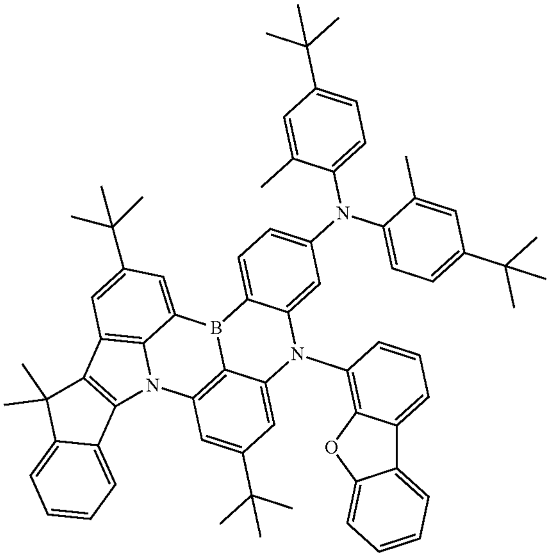

-continued
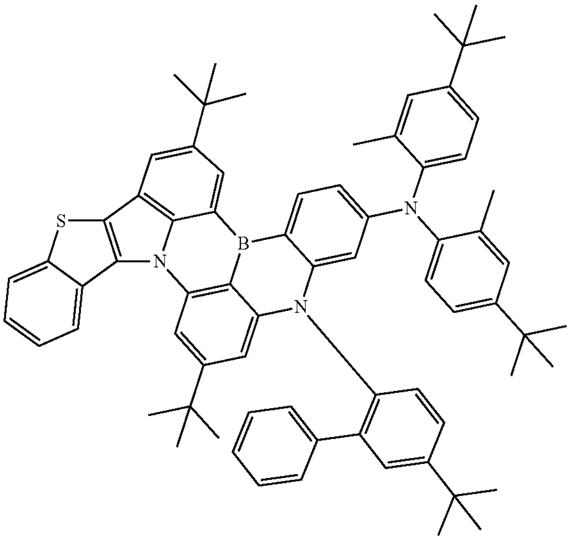
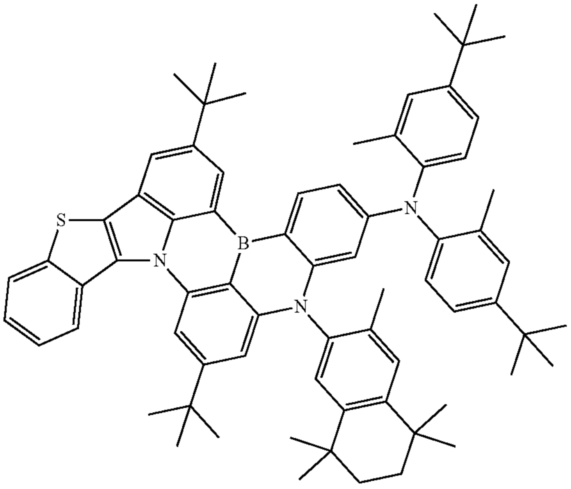
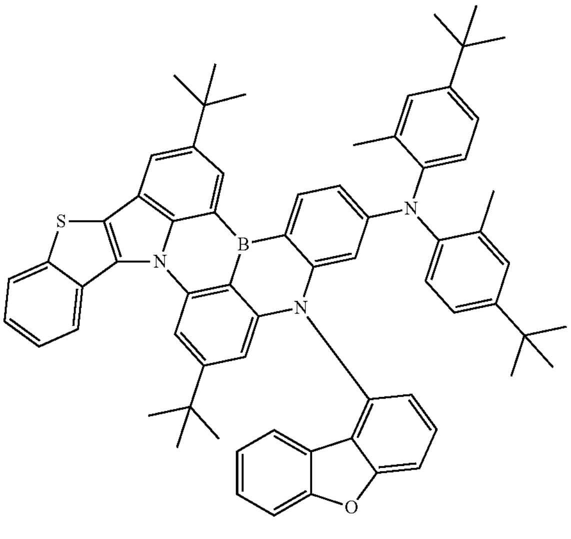
-continued
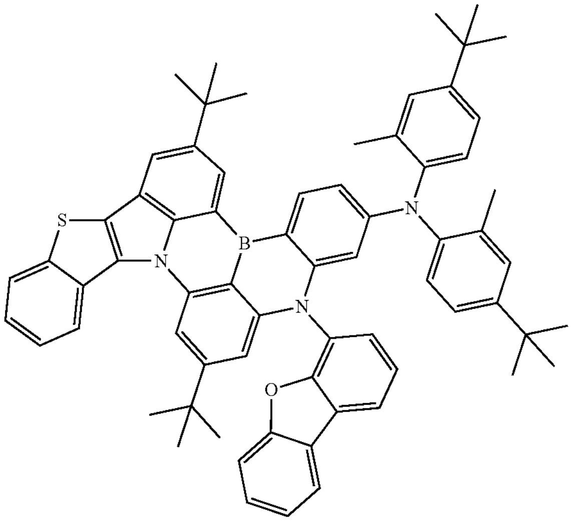
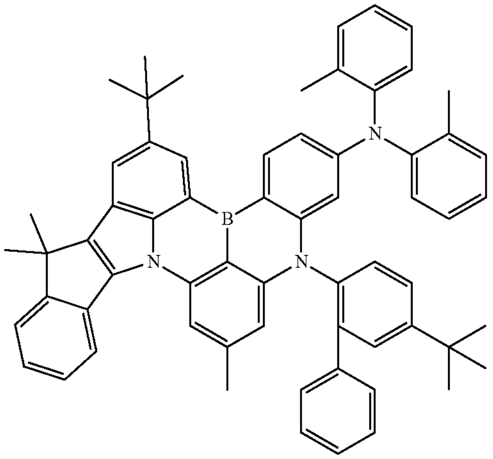
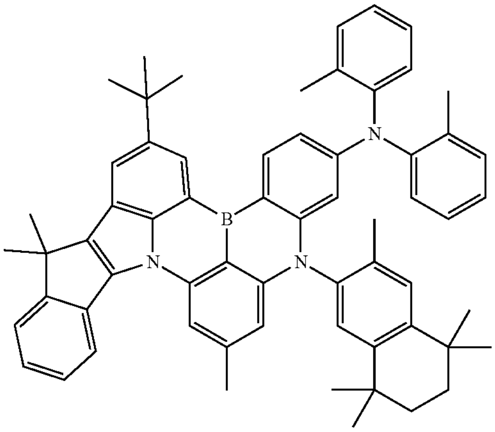

-continued
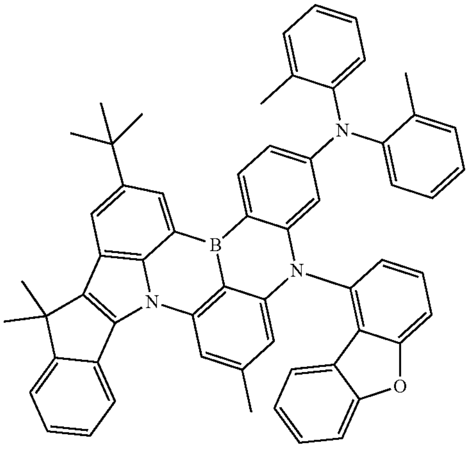
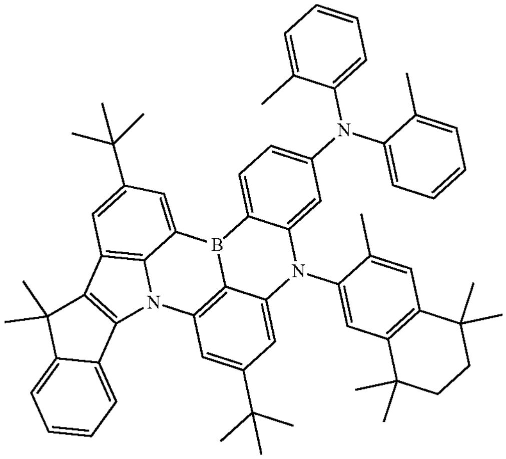
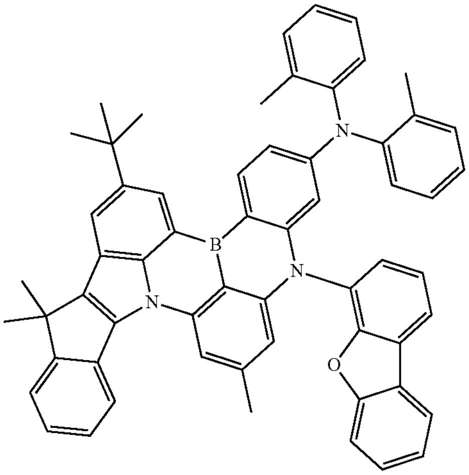
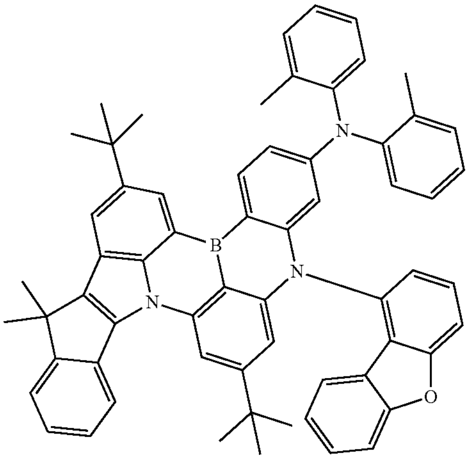
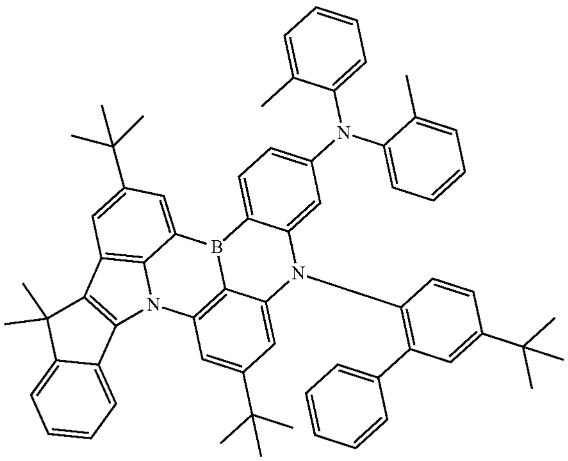
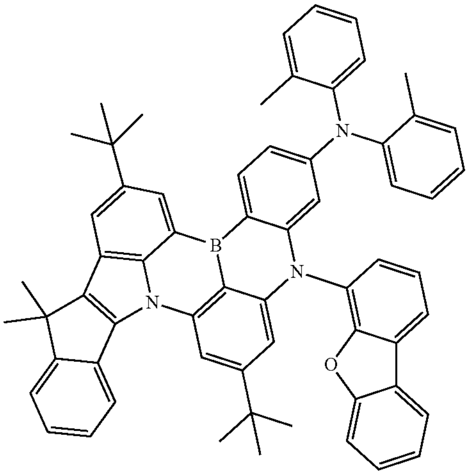

-continued
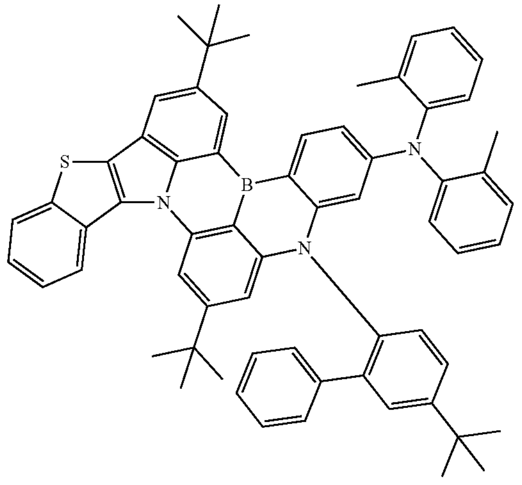
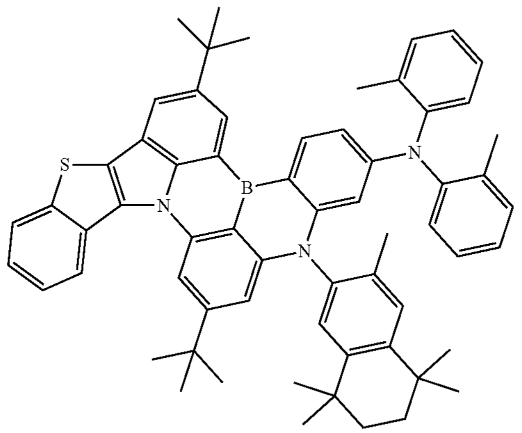
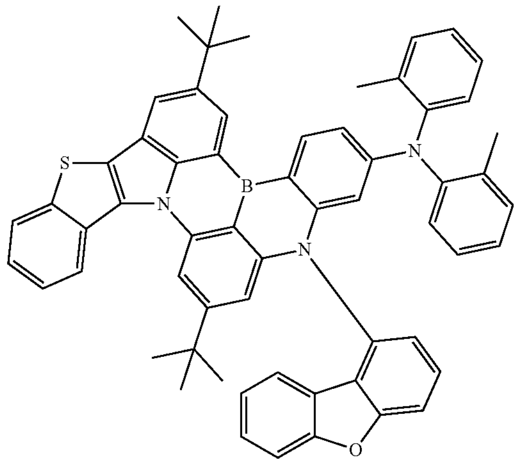
-continued
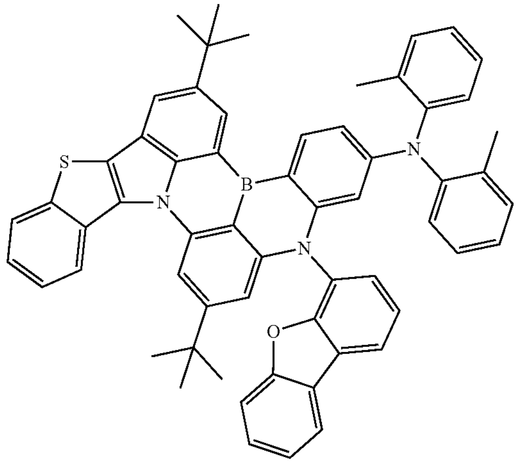
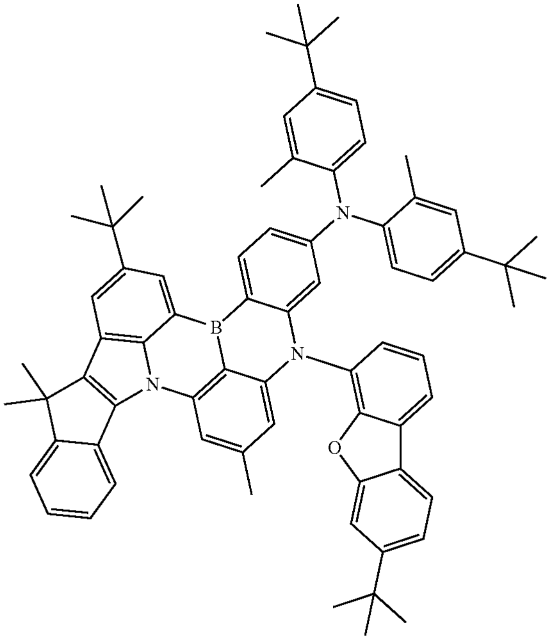
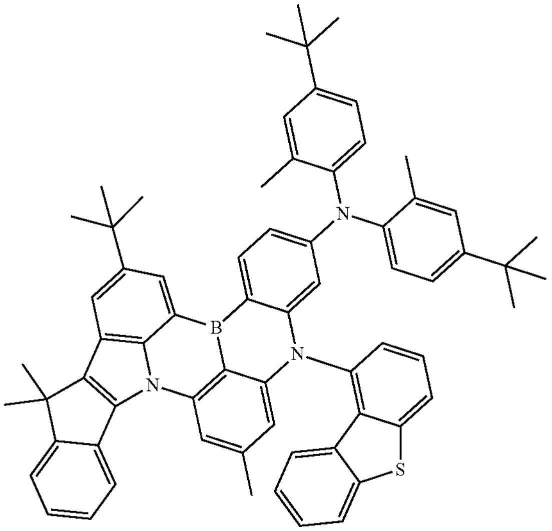

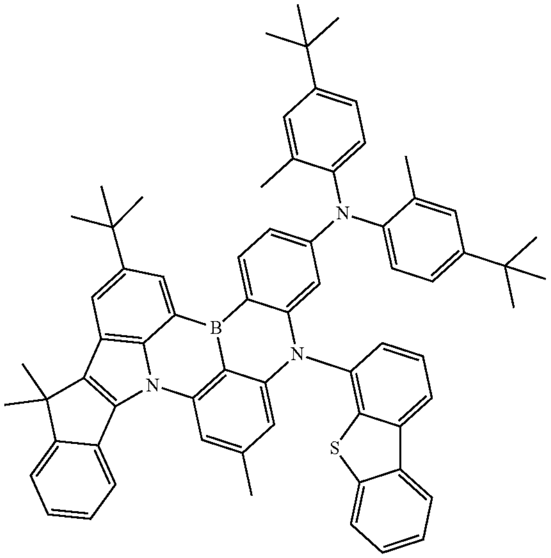
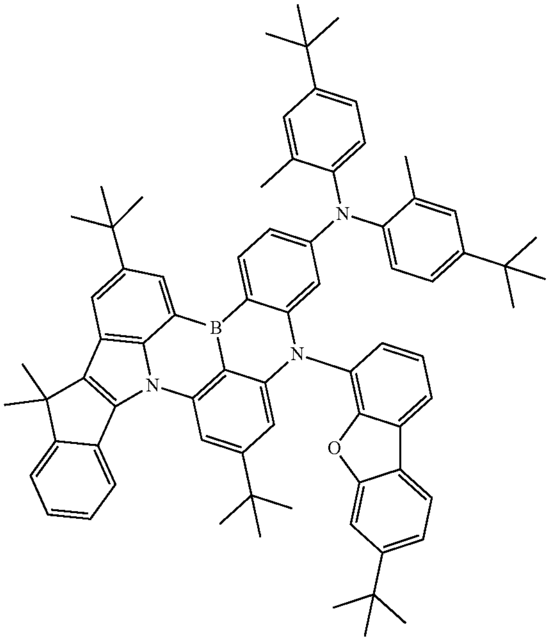
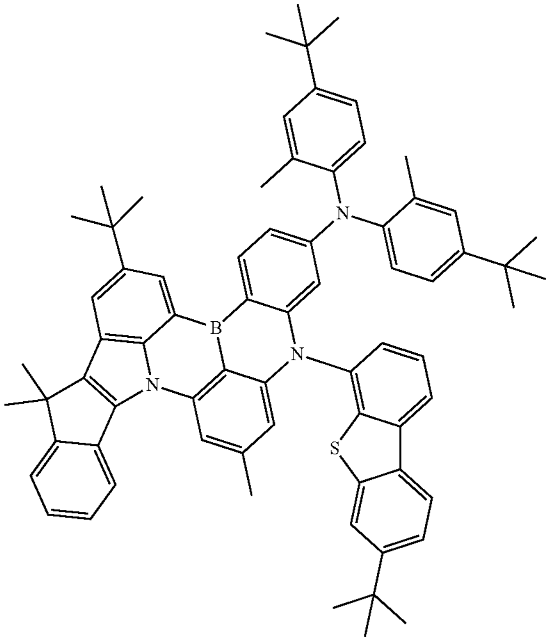
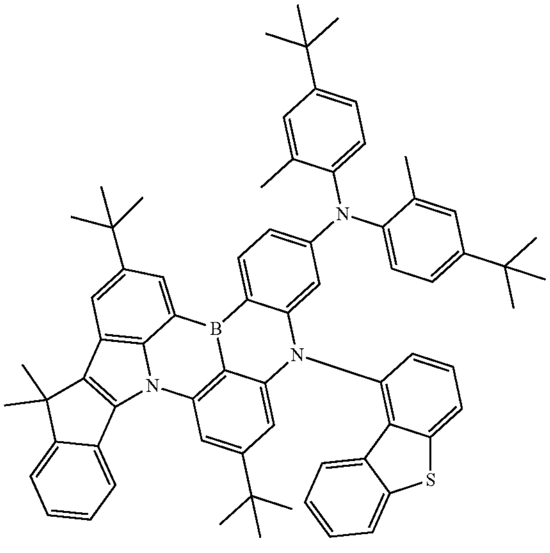

-continued
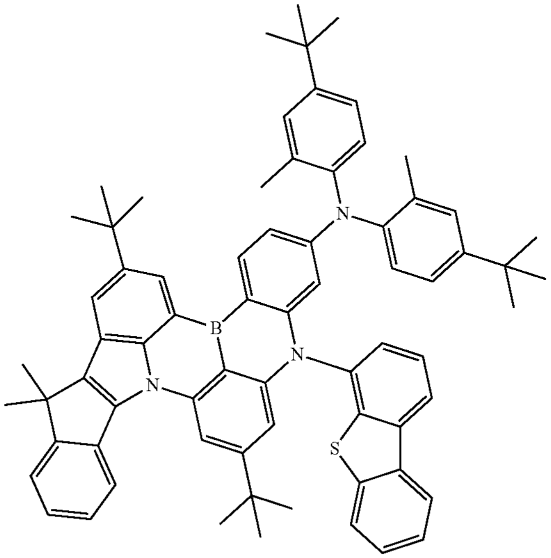
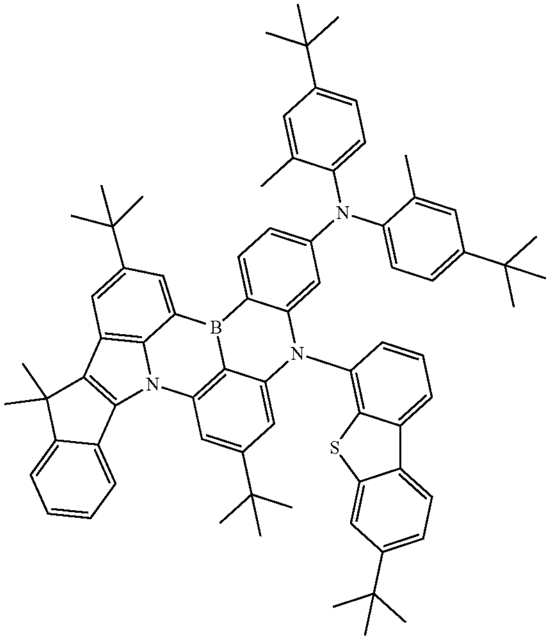
-continued
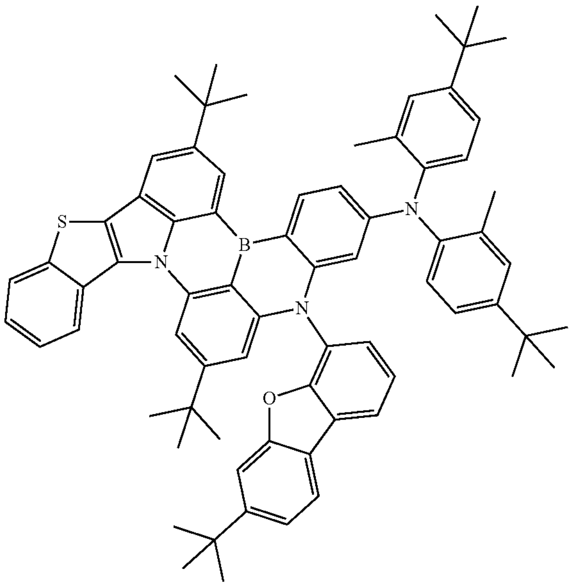
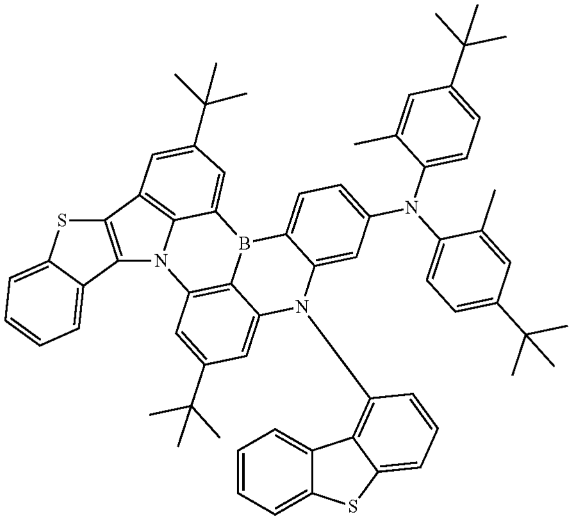
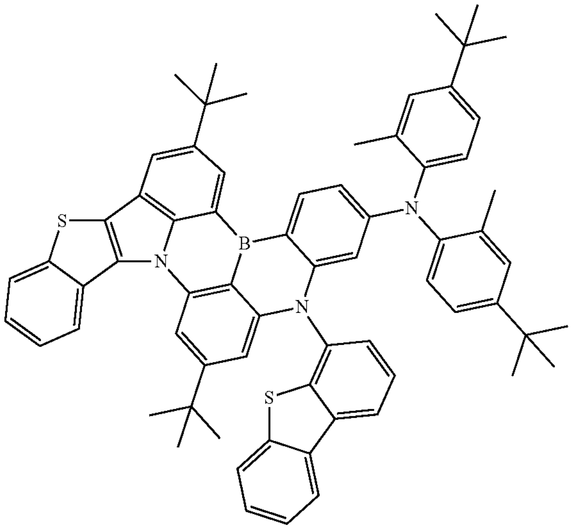

-continued
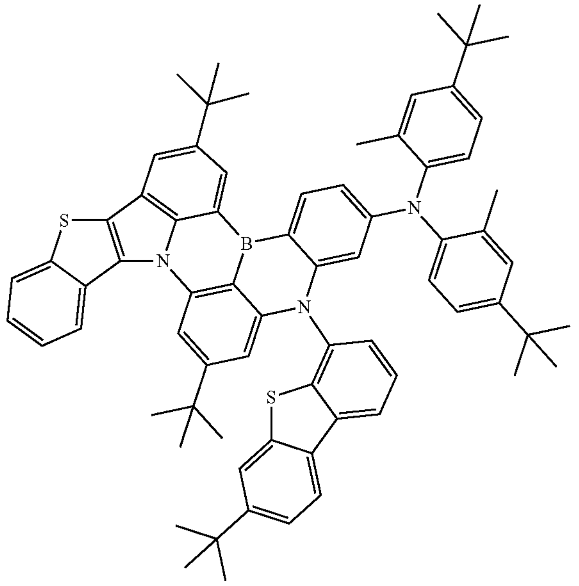
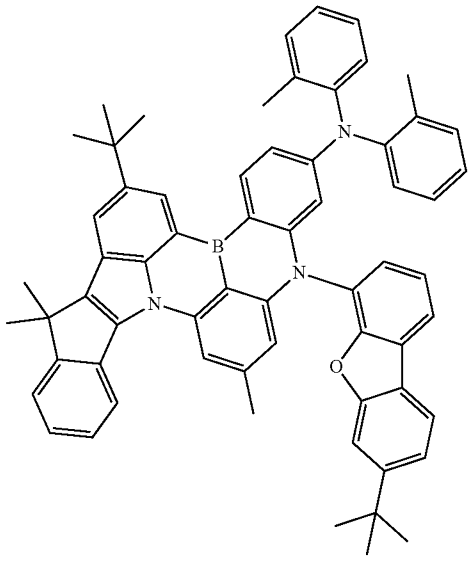
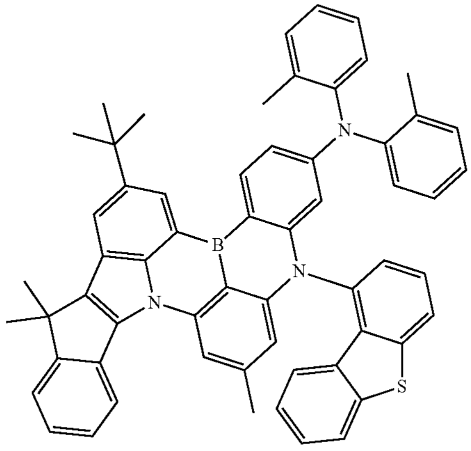
-continued
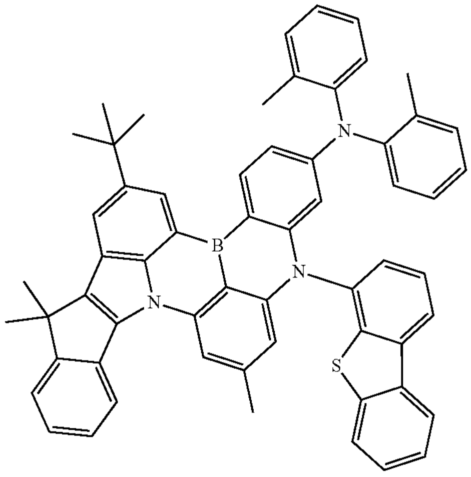
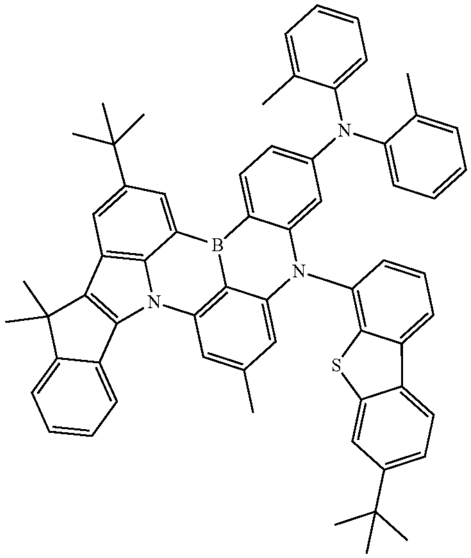
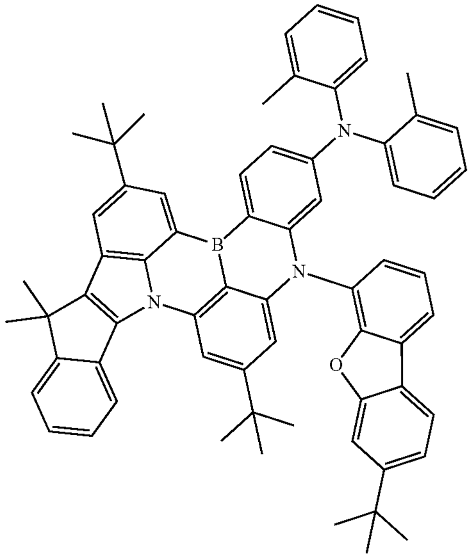

-continued
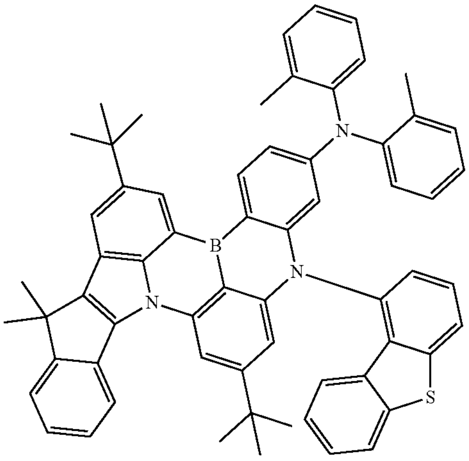
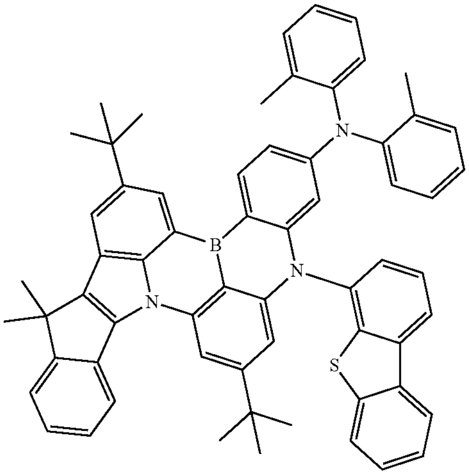
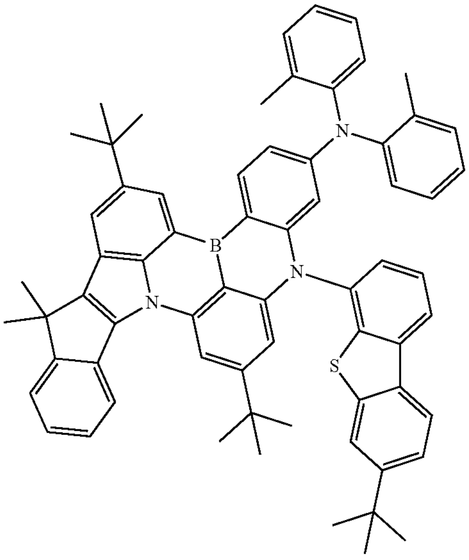
-continued
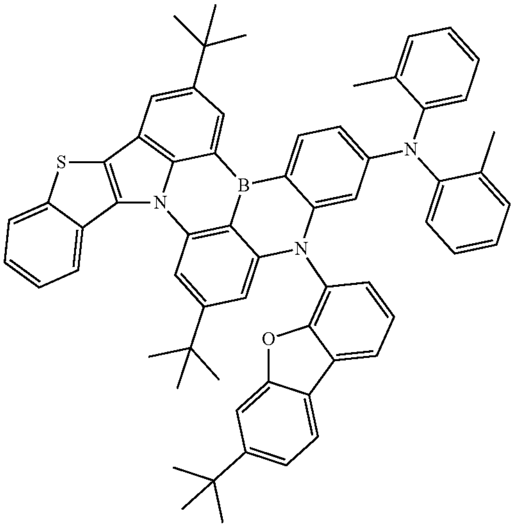
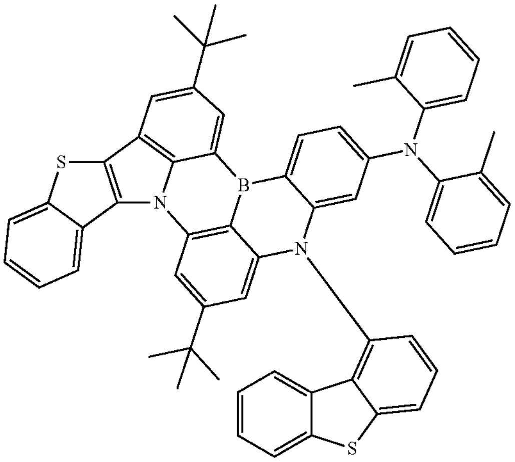
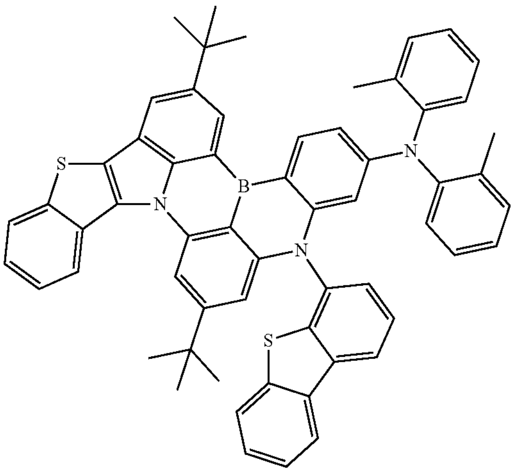

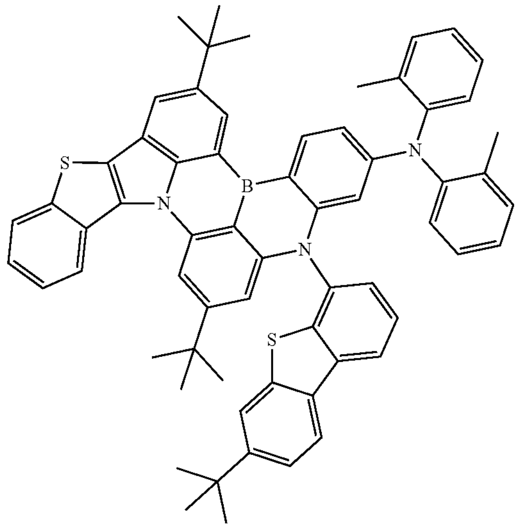
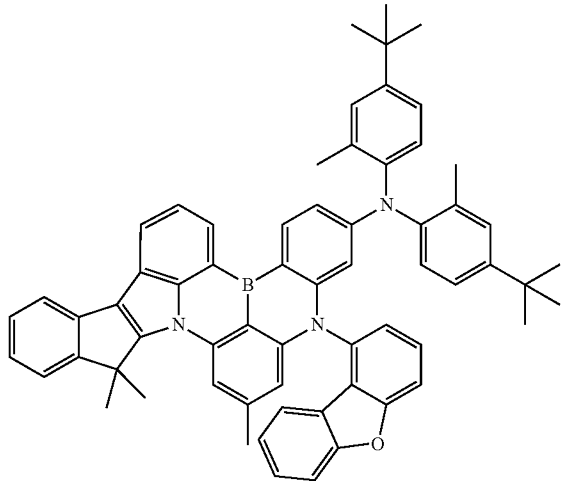
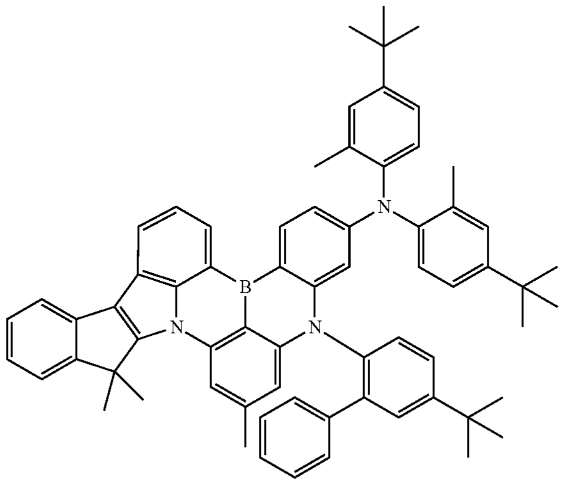
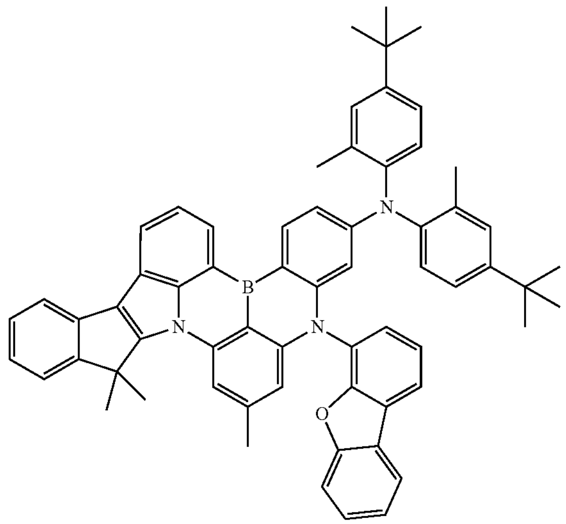
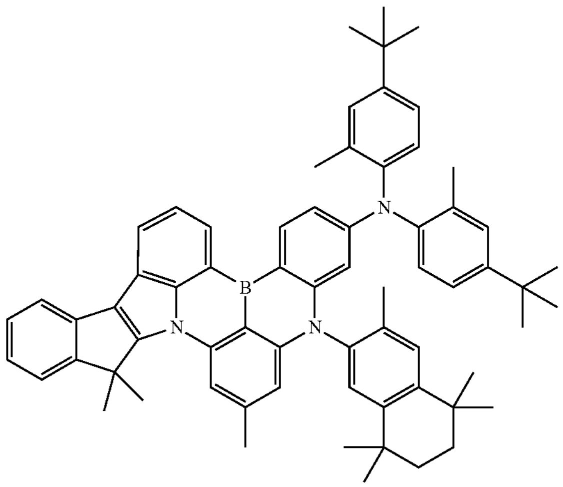
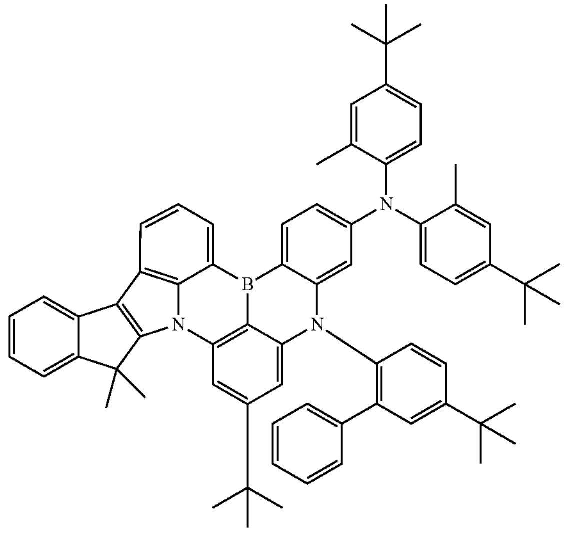

-continued
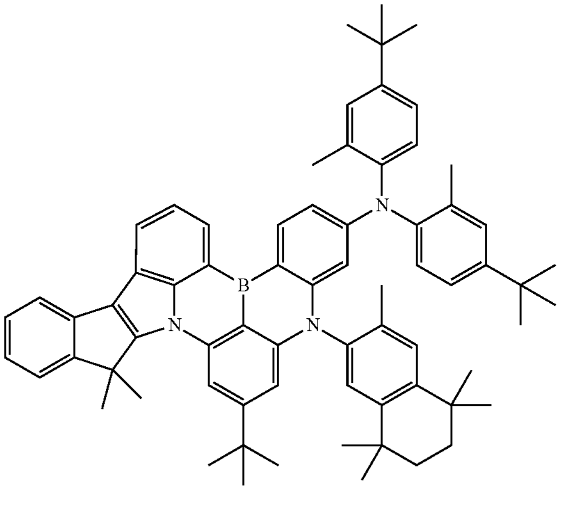
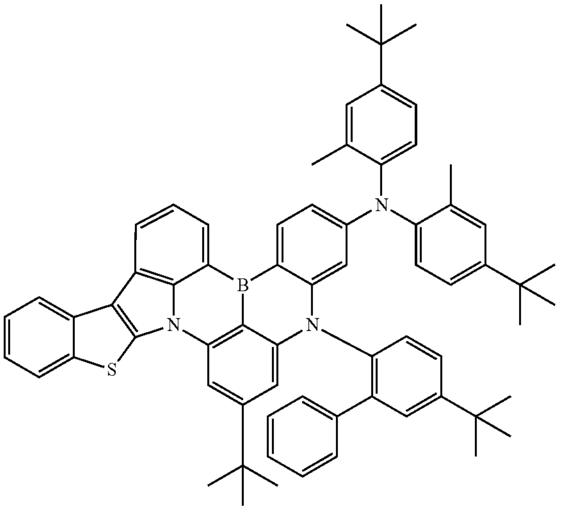
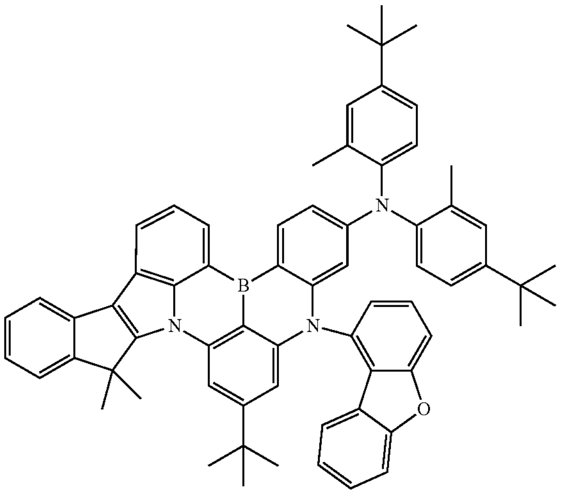
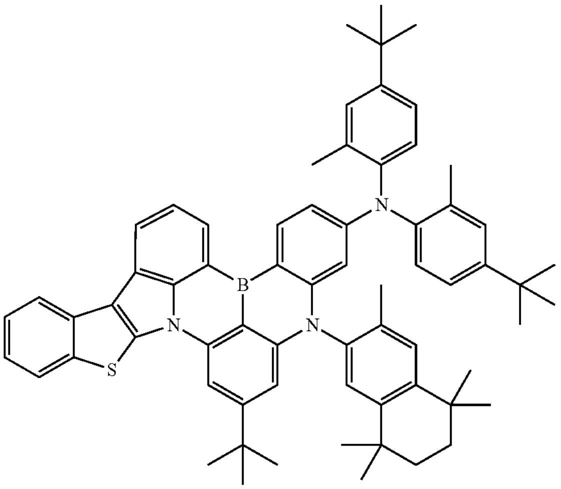
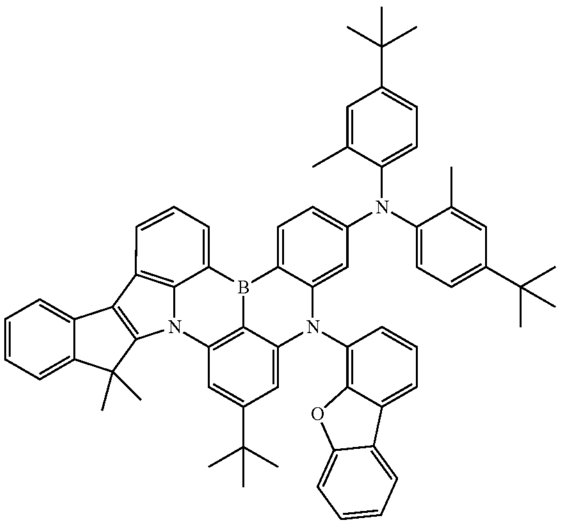
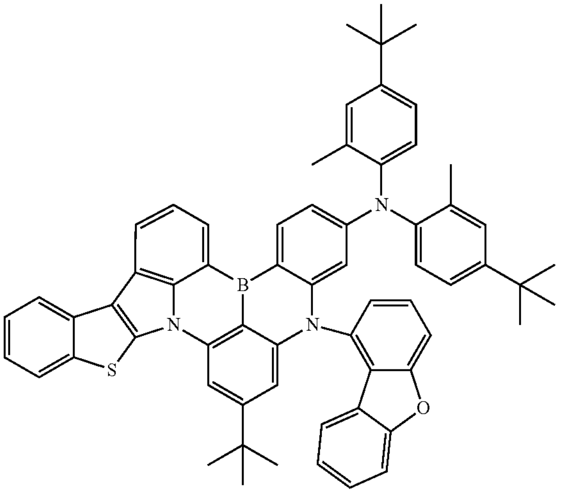
-continued -continued
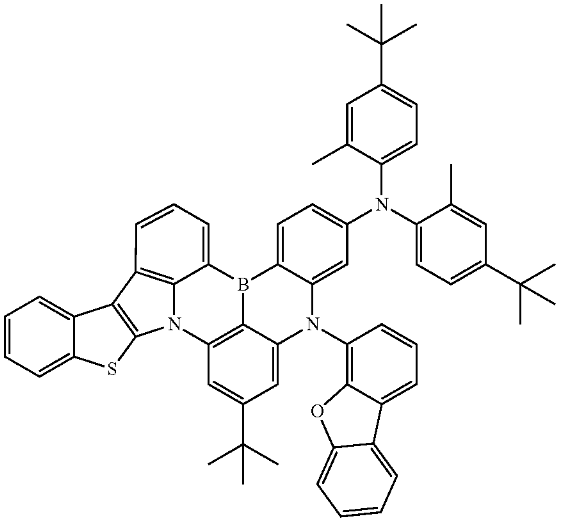
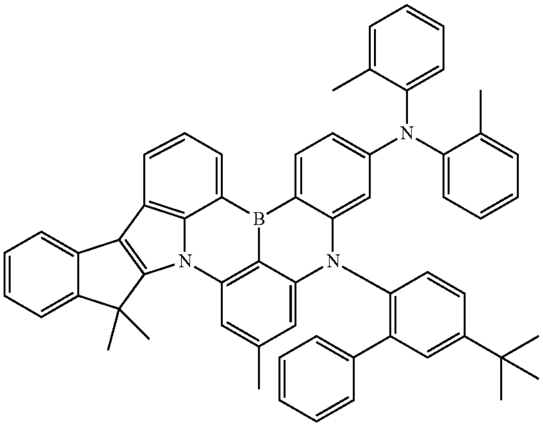
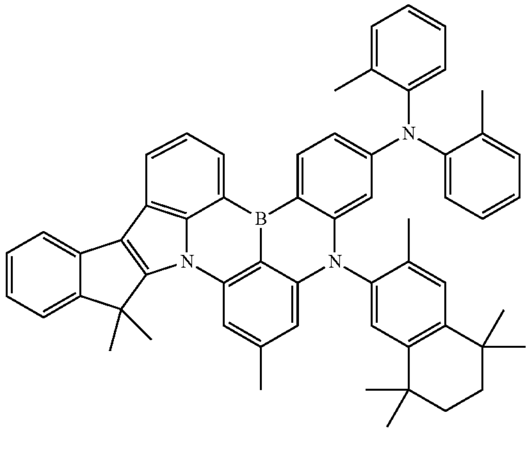
-continued
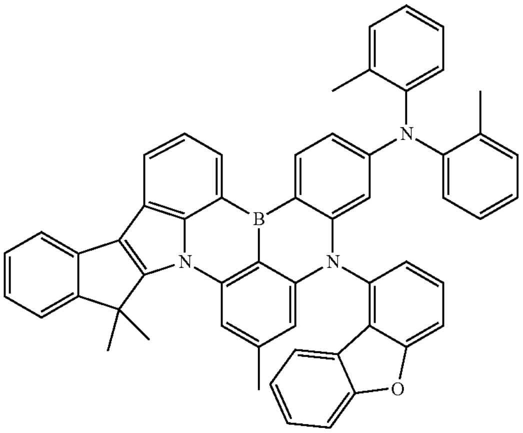
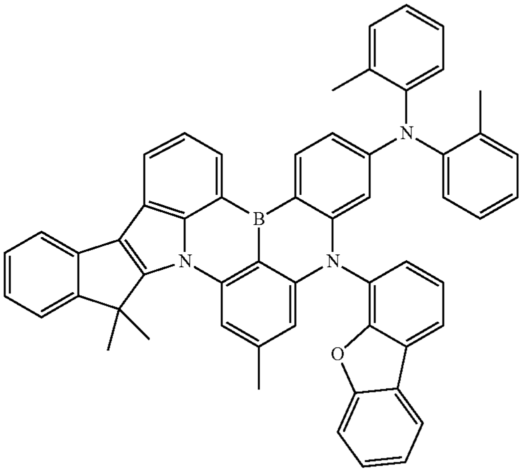
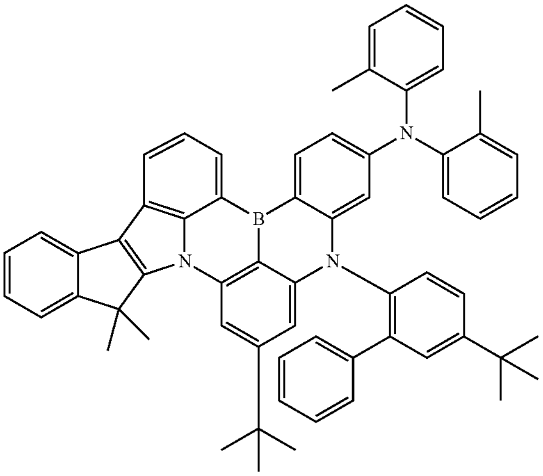

-continued
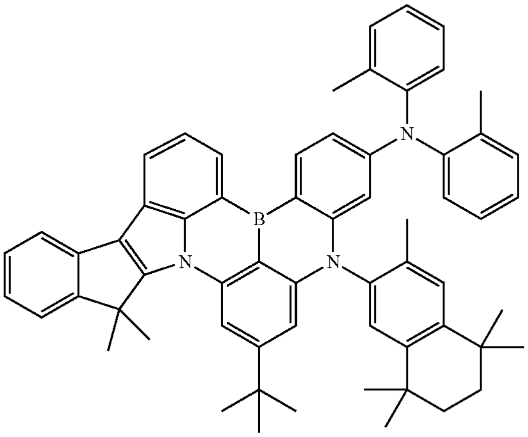
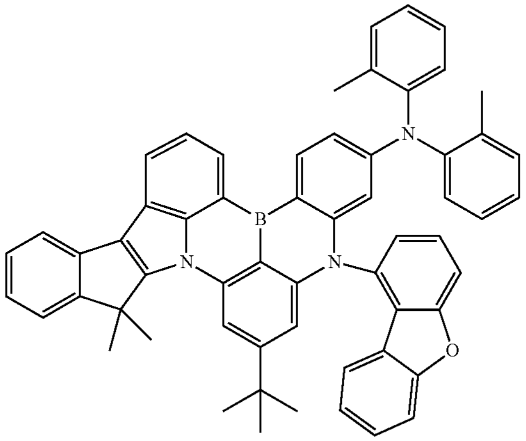
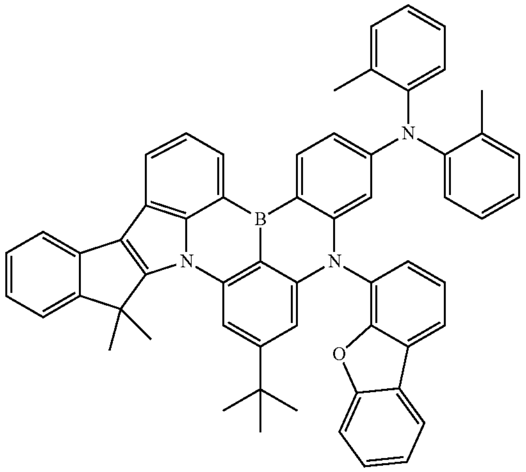
-continued
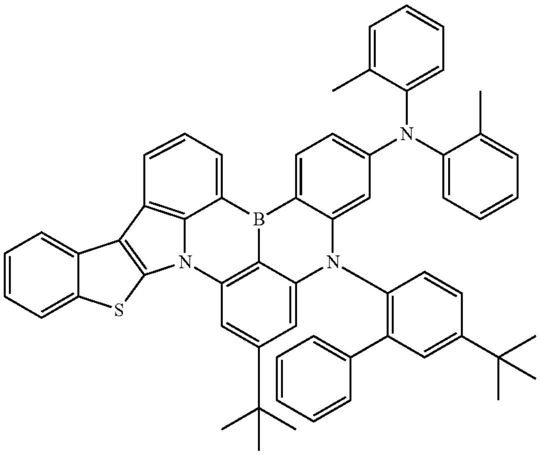
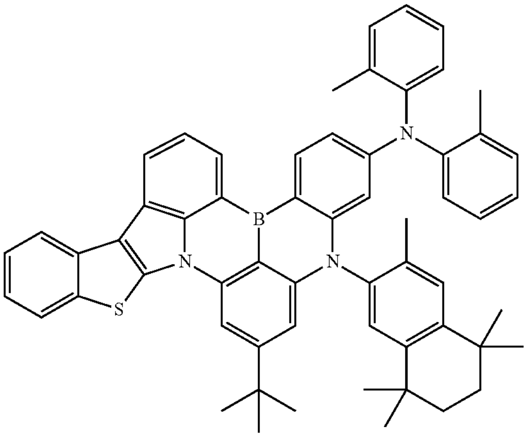
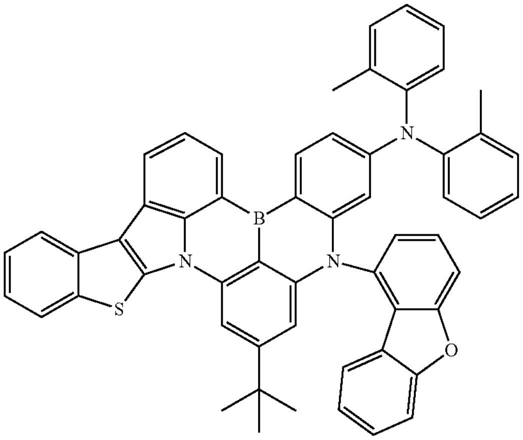

-continued
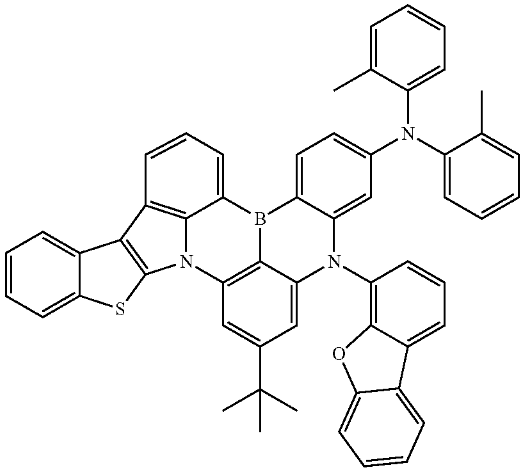
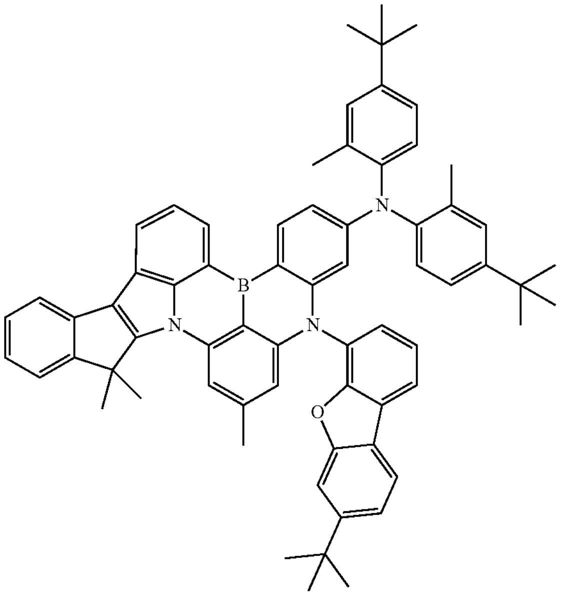
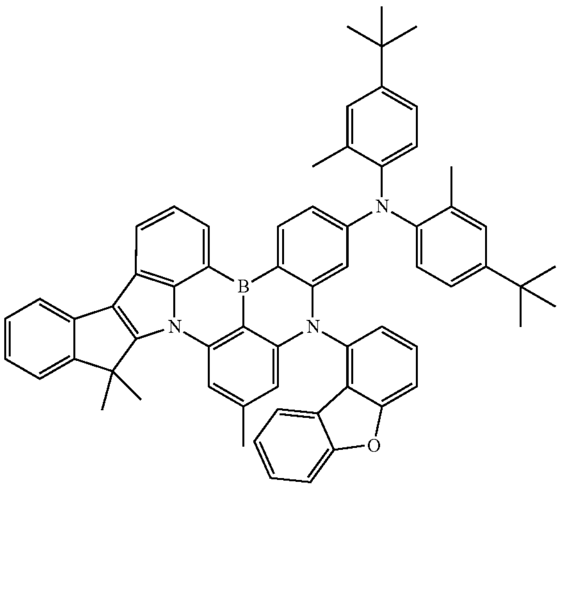
-continued
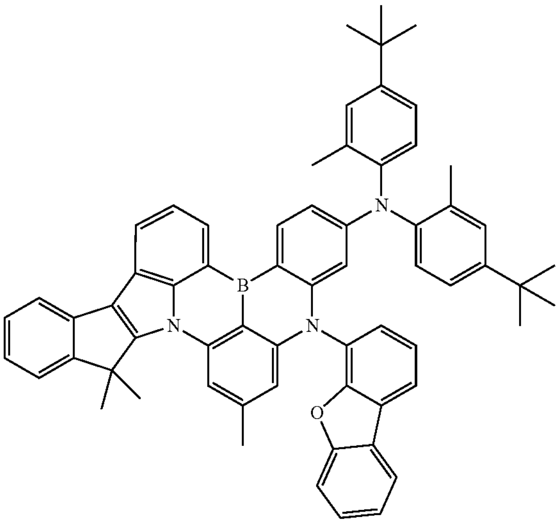
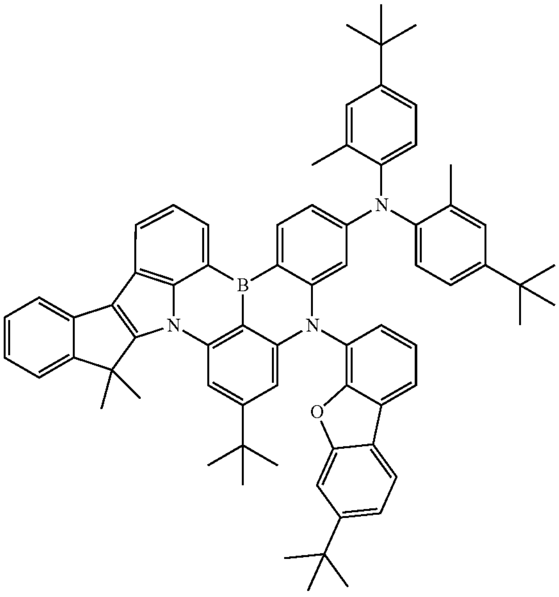
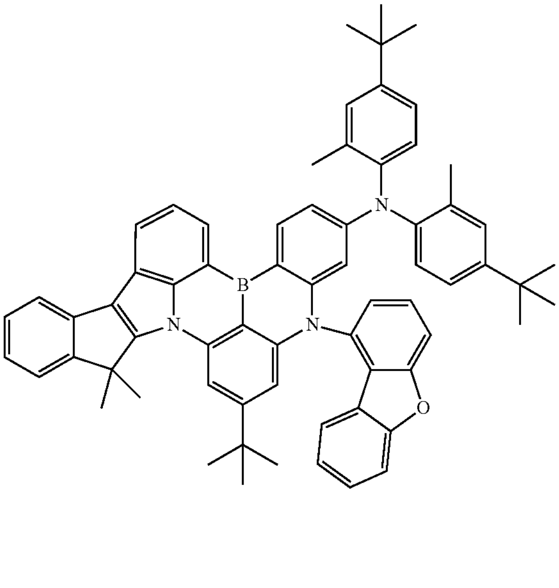

-continued
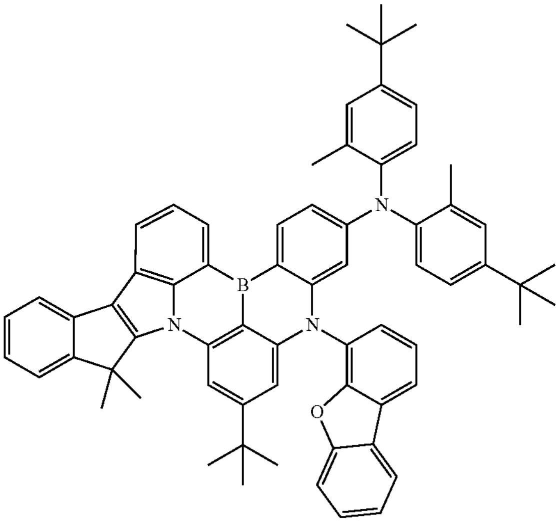
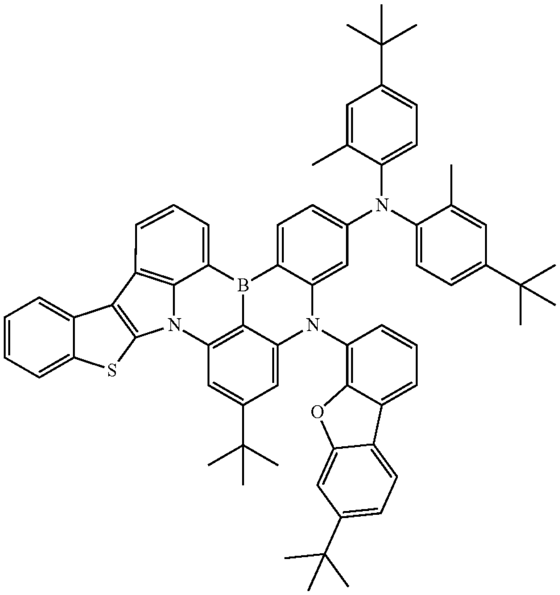
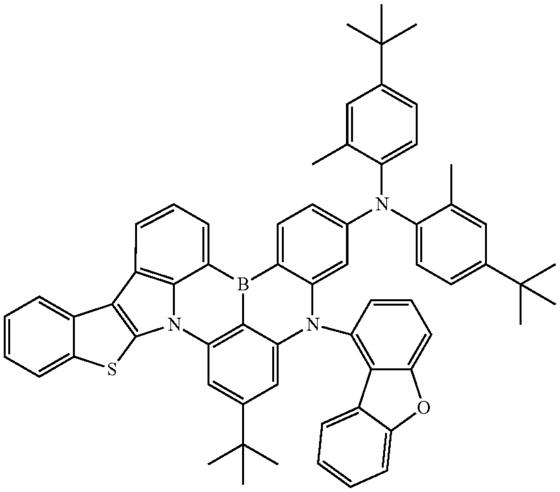
-continued
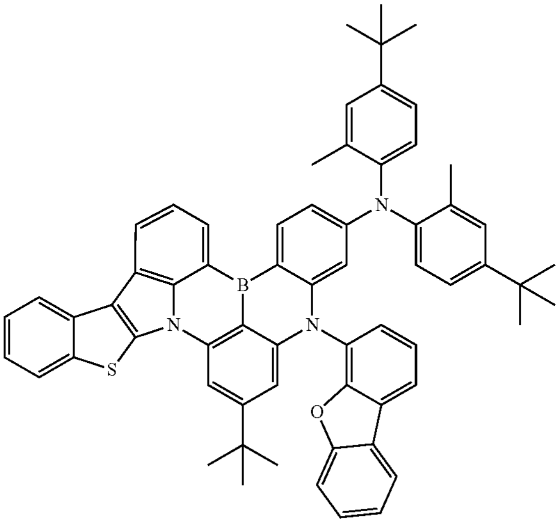
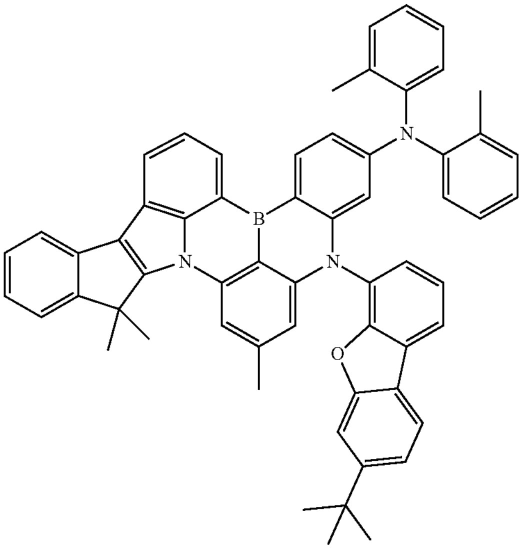
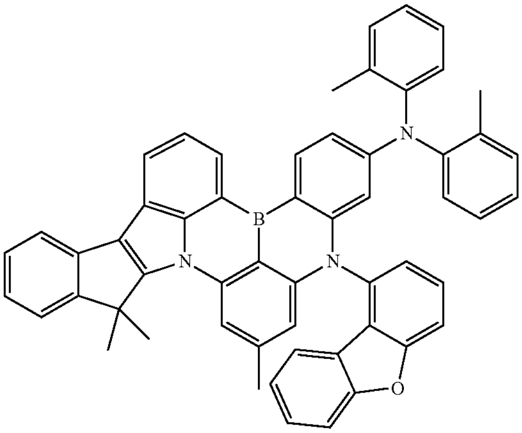

-continued
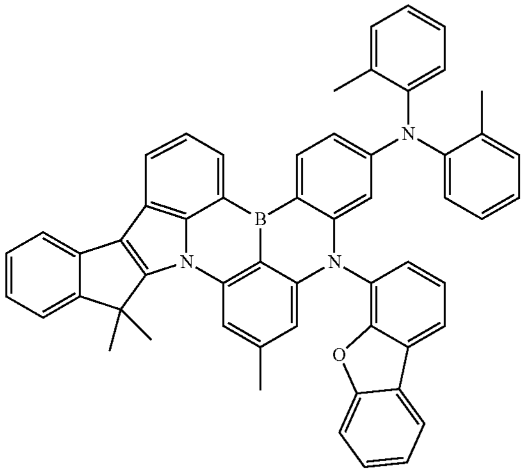
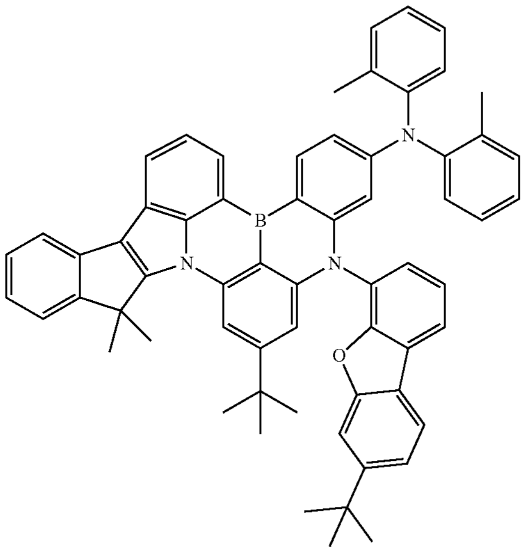
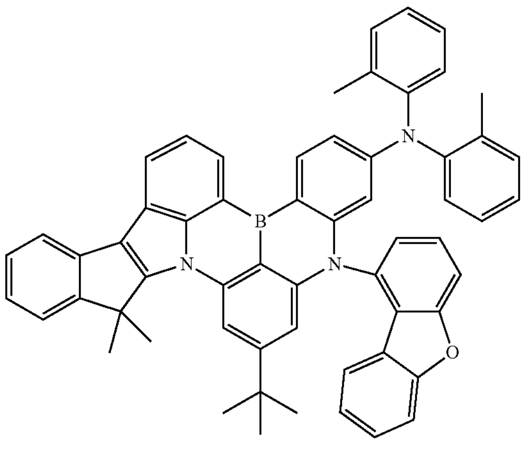
-continued
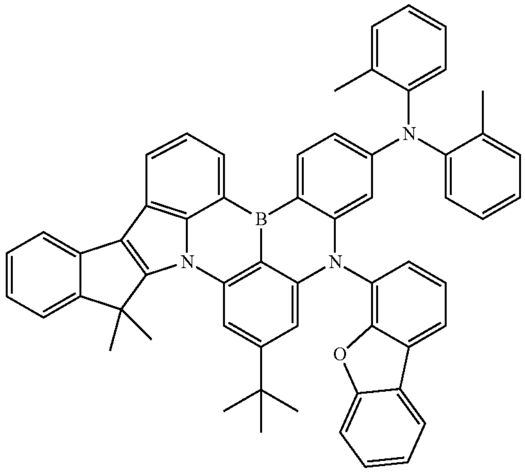
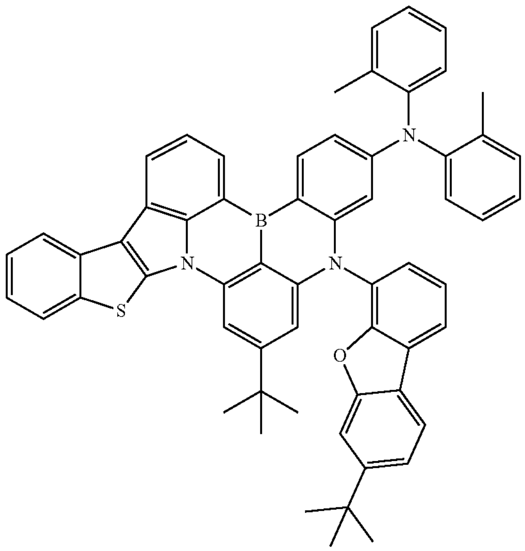
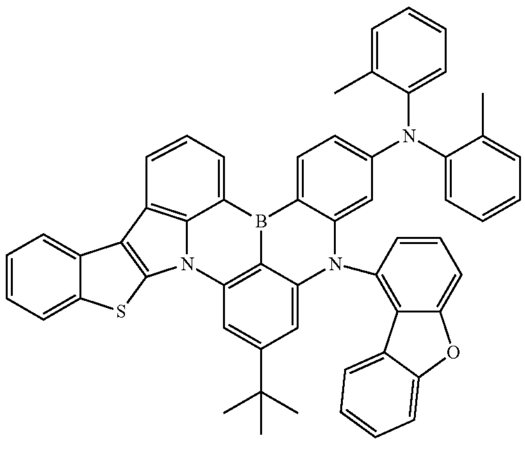

-continued
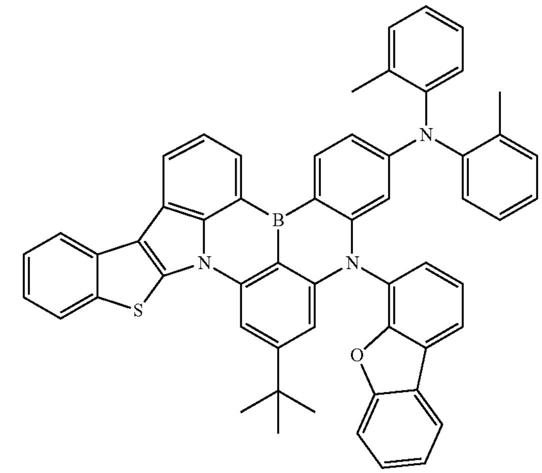
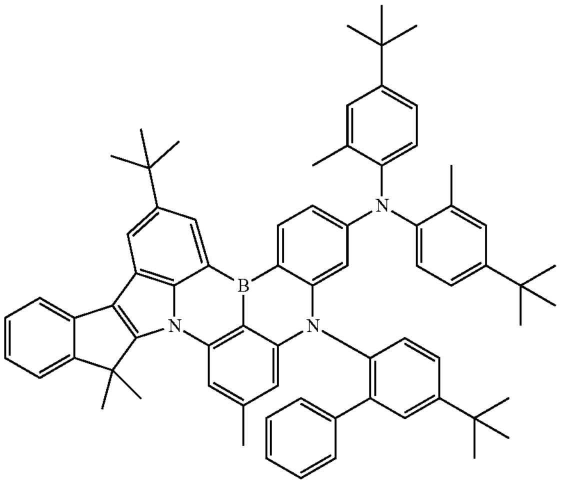
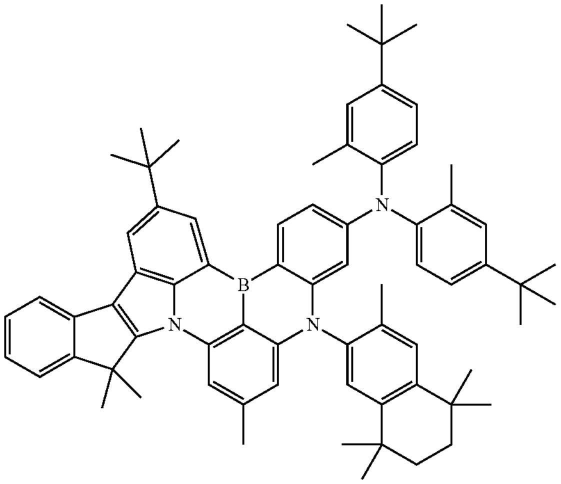
-continued
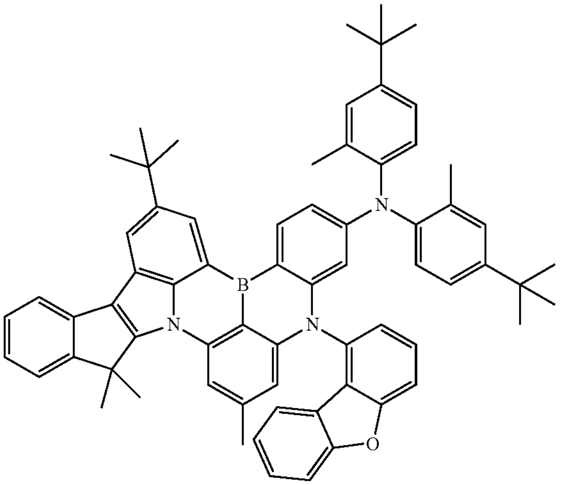
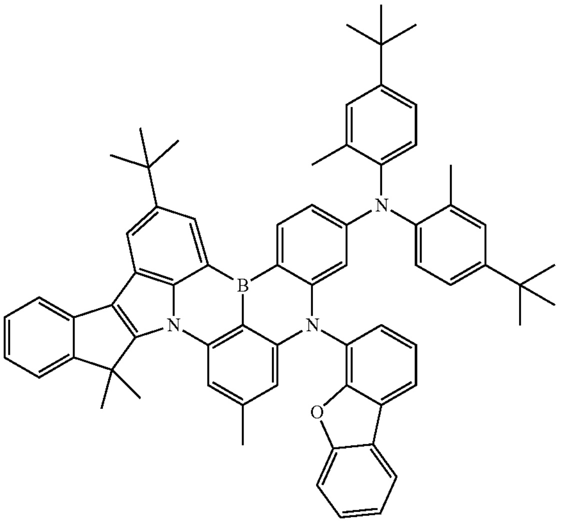
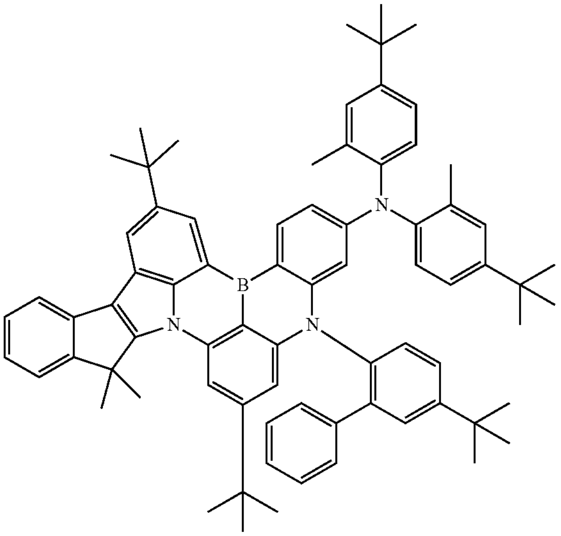

-continued
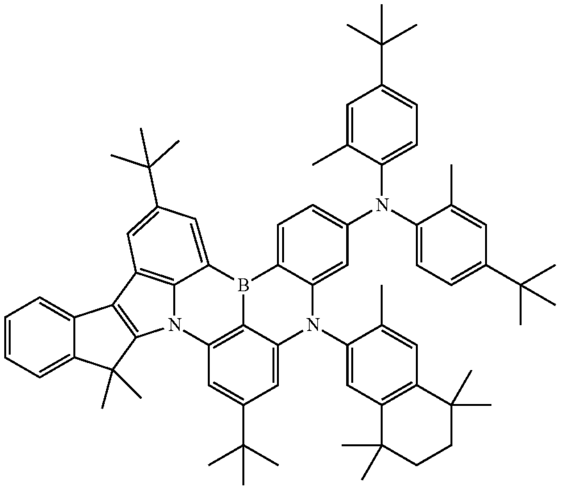
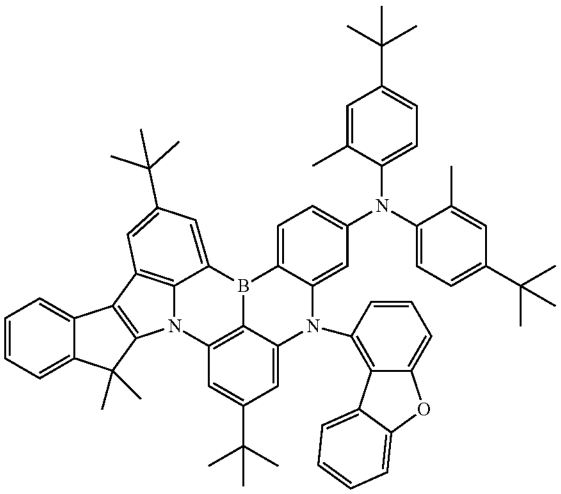
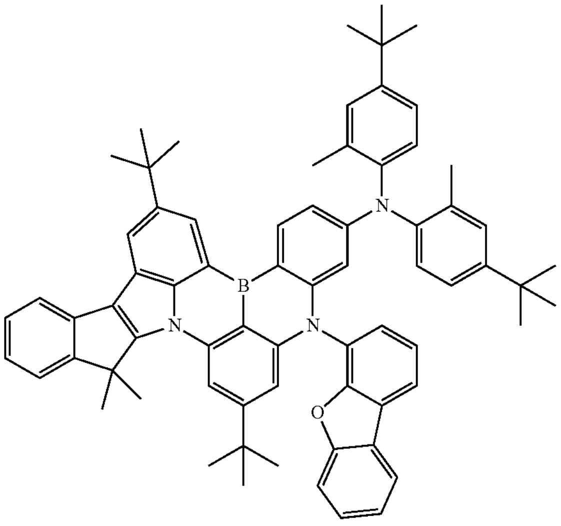
-continued
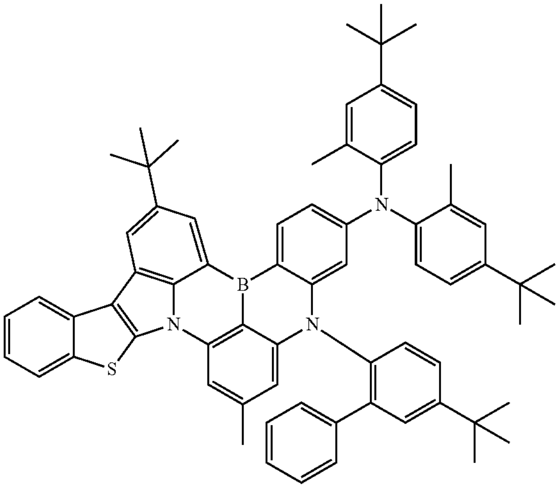
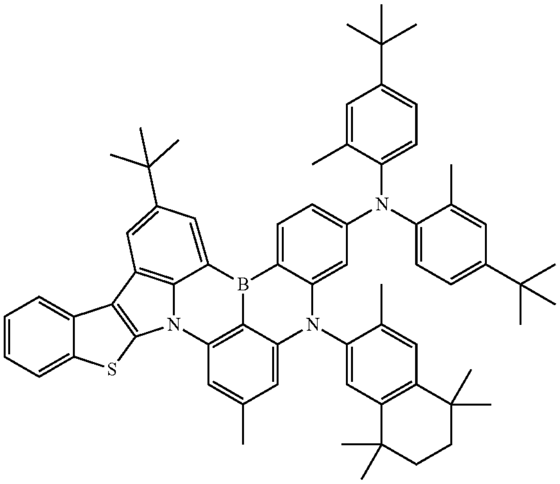
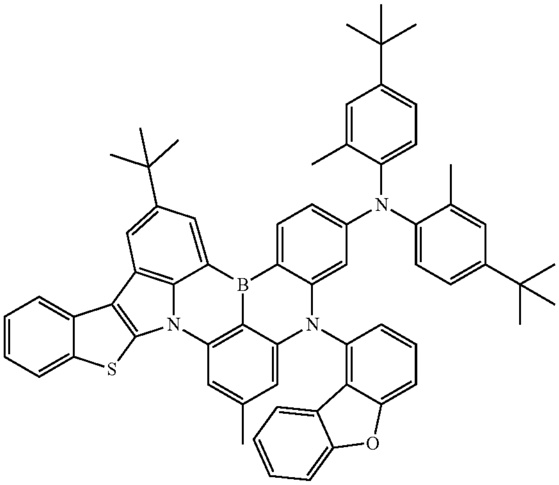

-continued
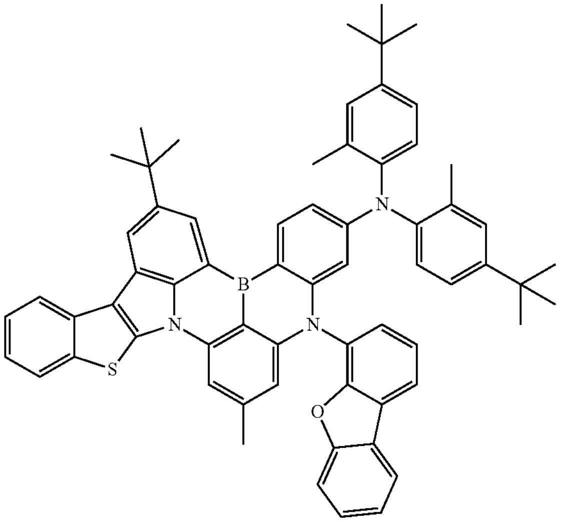
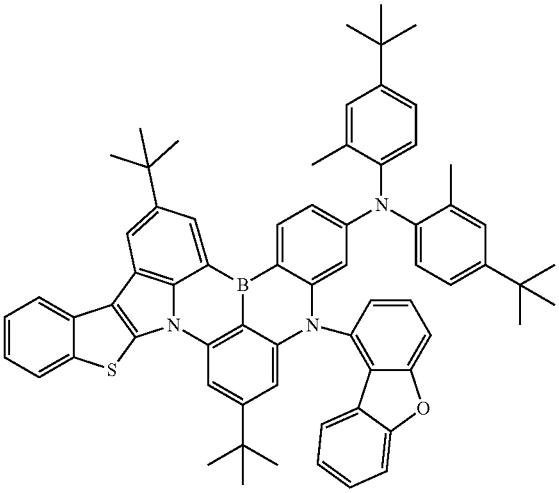
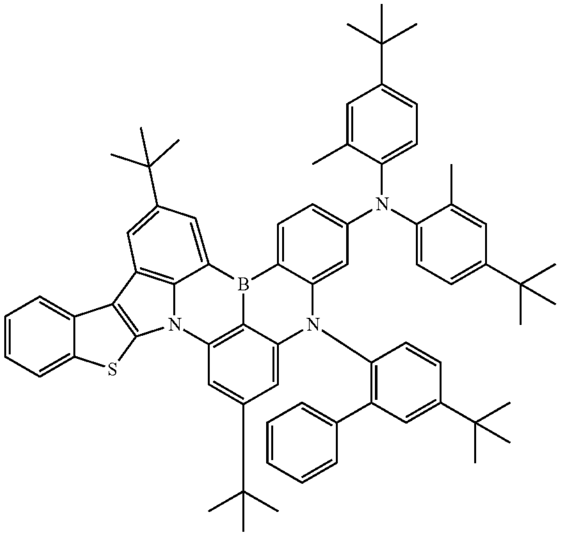
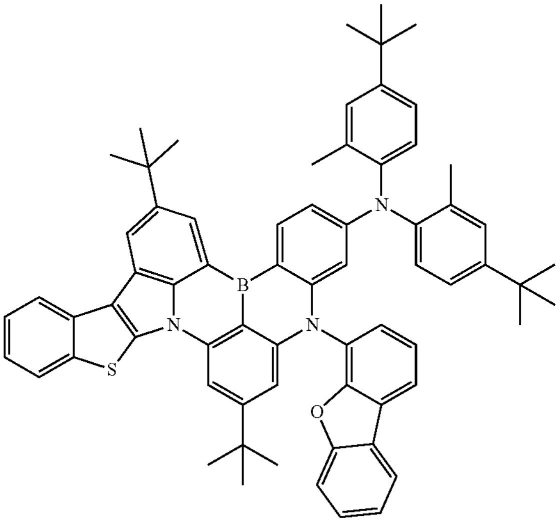
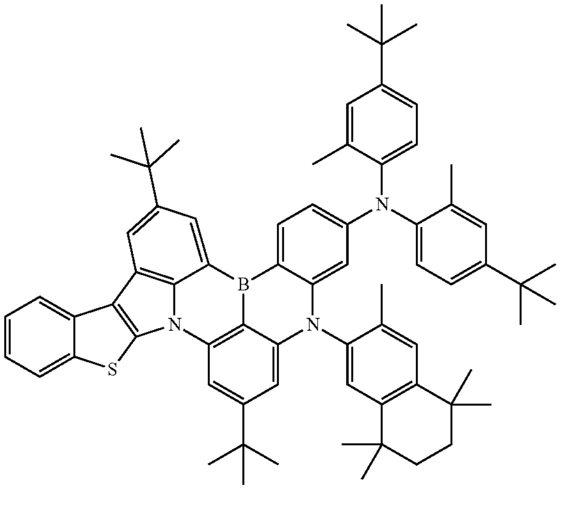
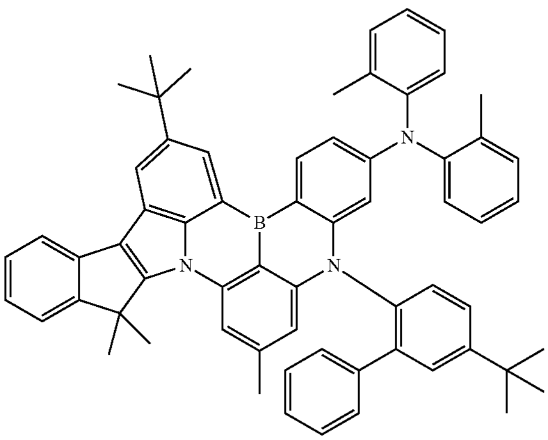
-continued

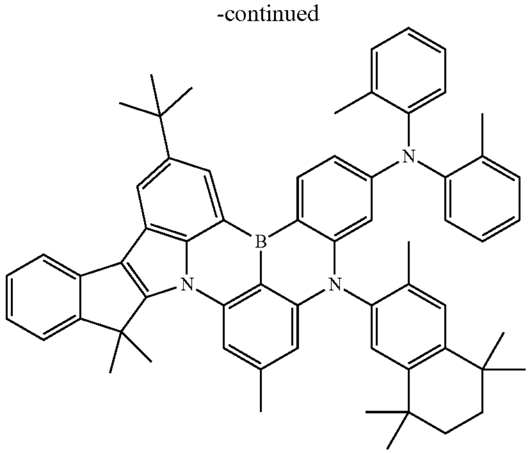
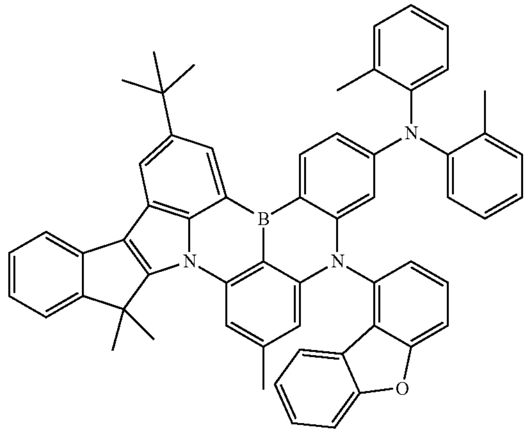
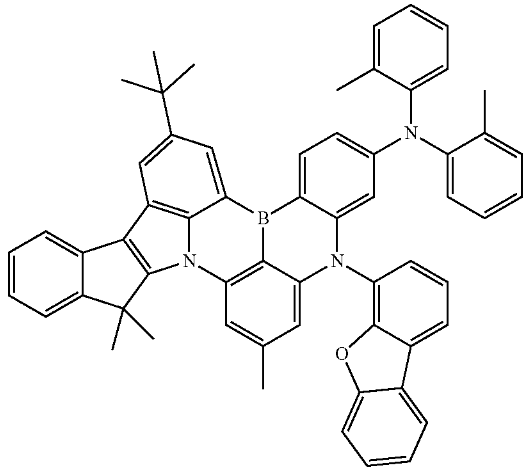
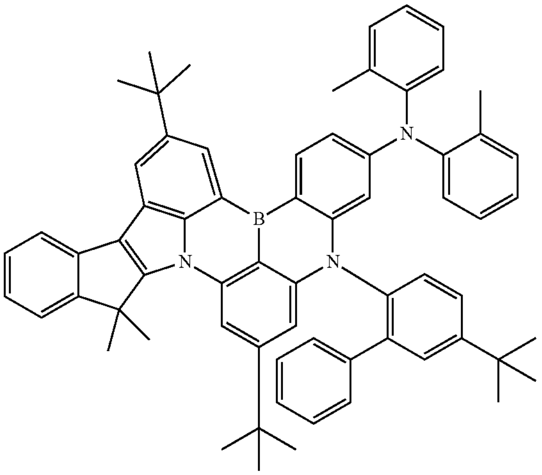
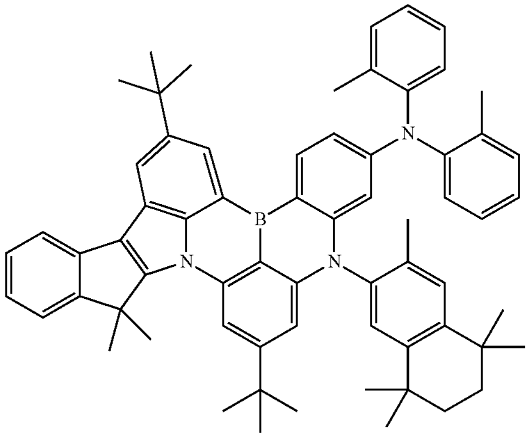
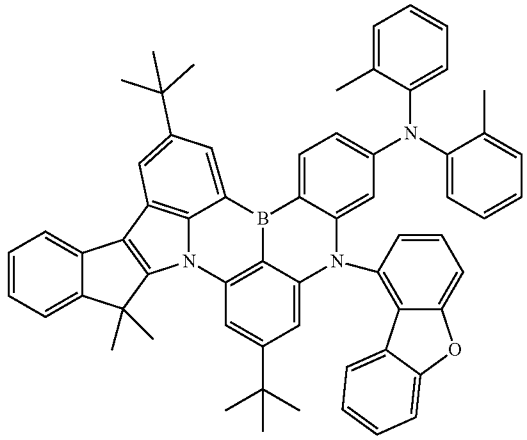

-continued
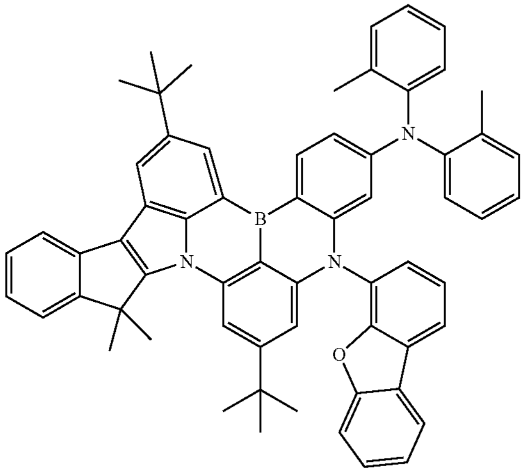
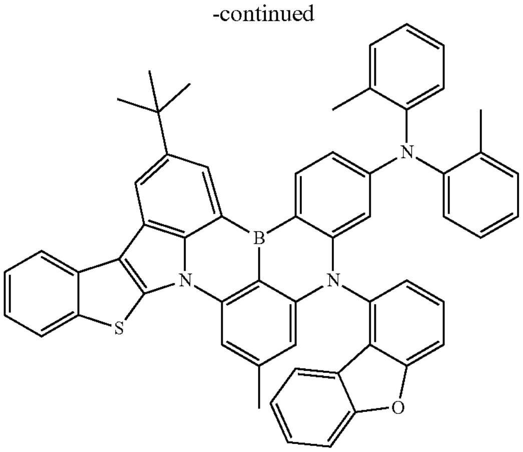
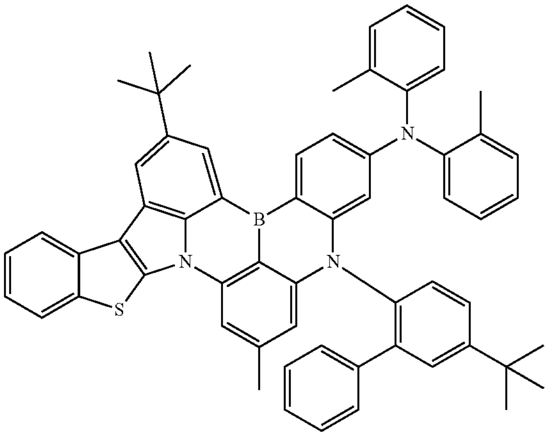
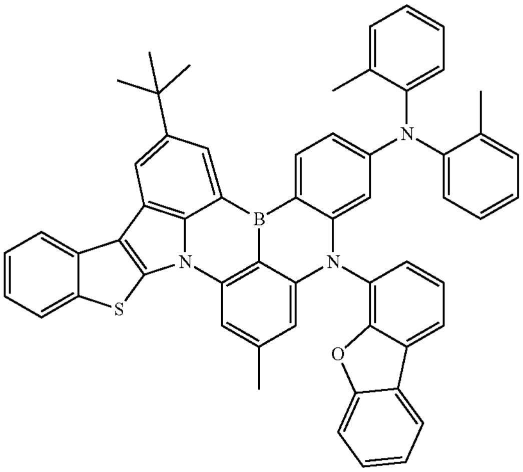
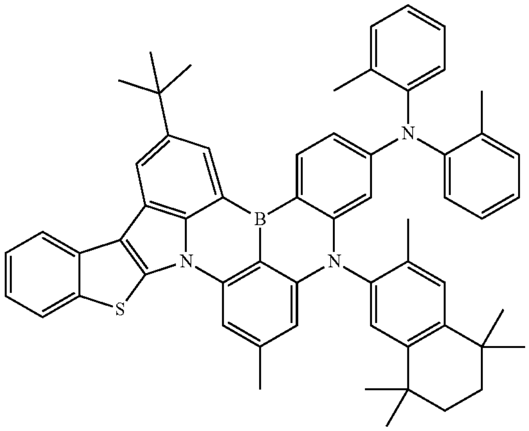
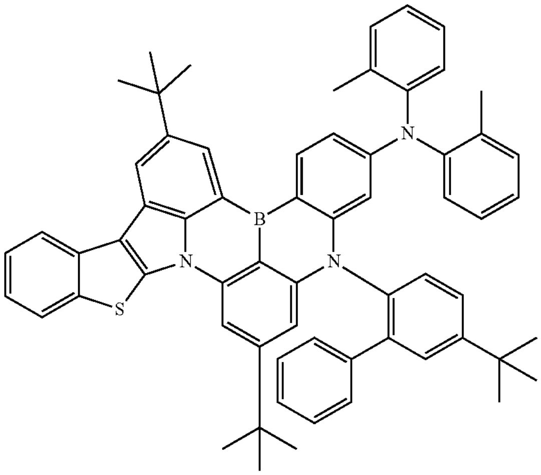
-continued -continued
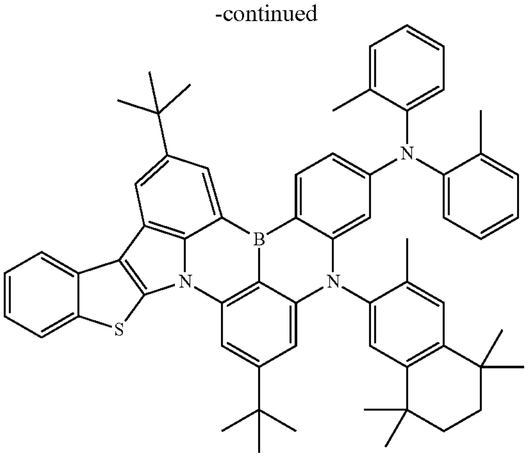
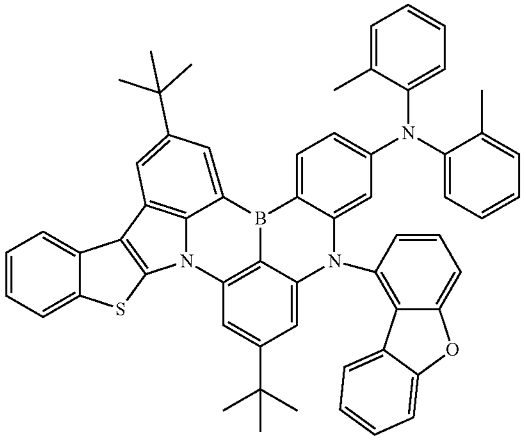
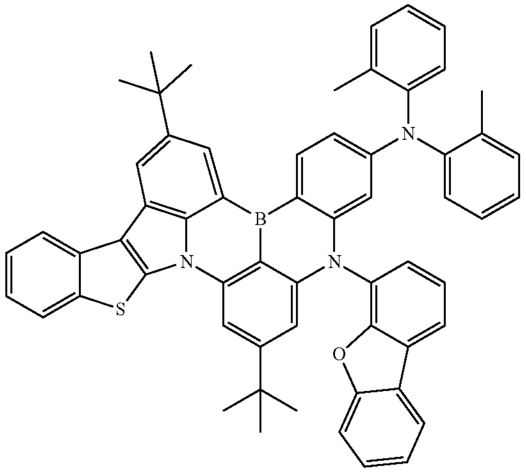
-continued
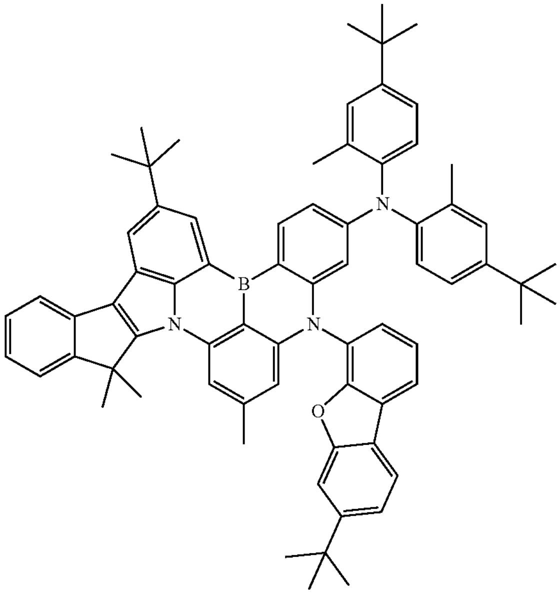
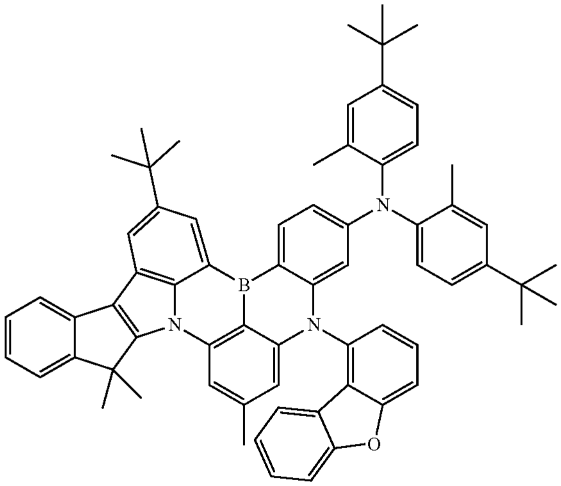
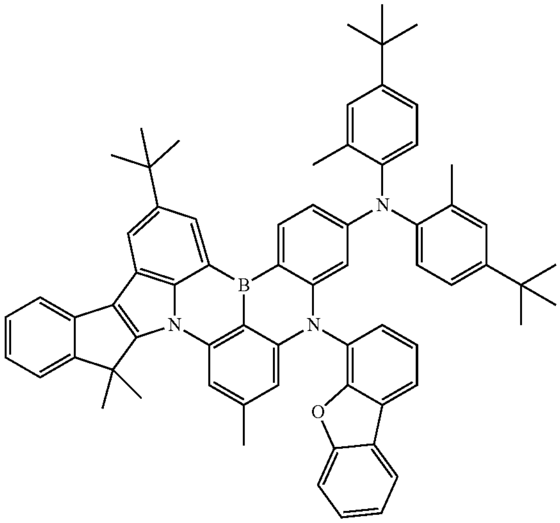

-continued
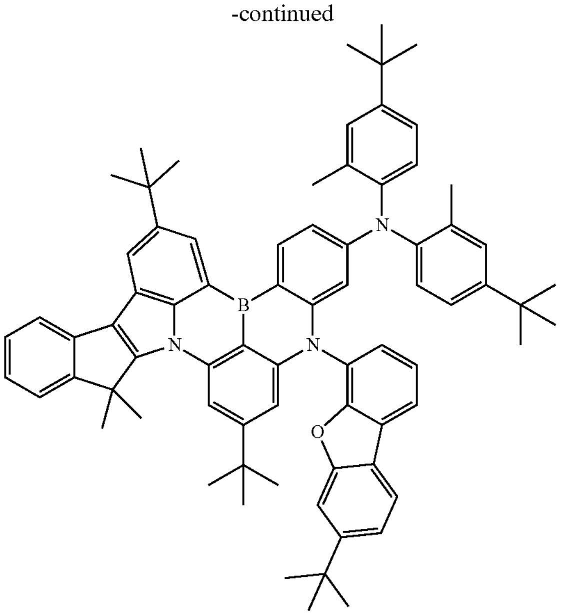
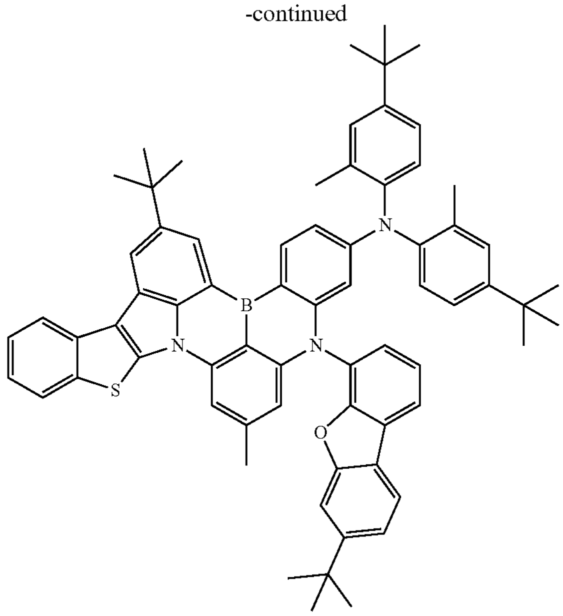
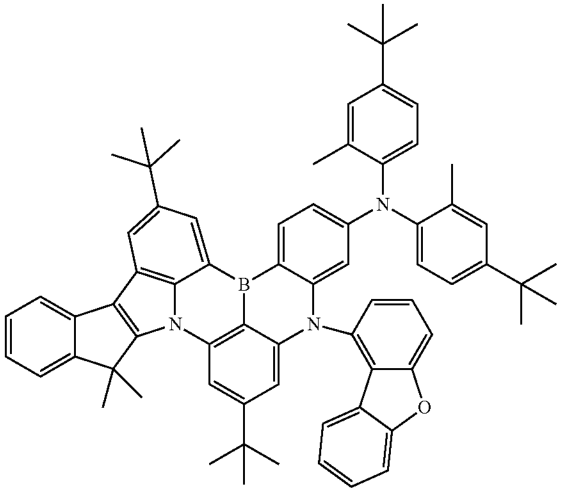
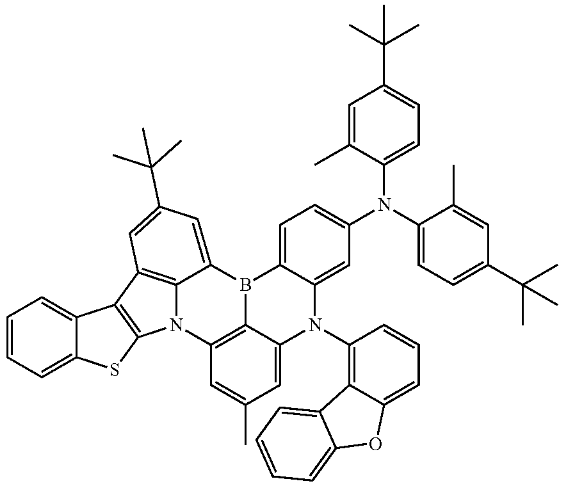
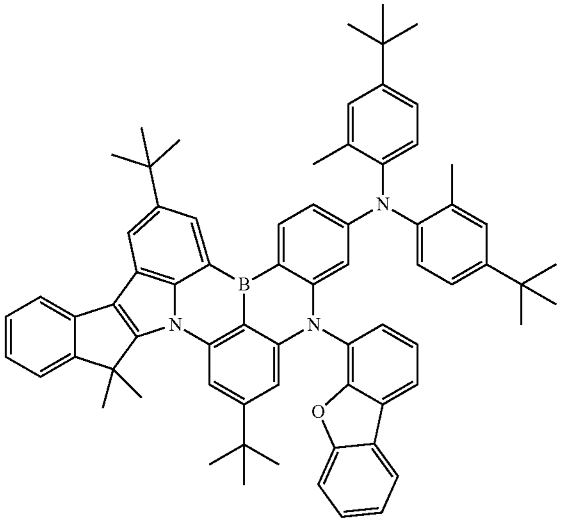
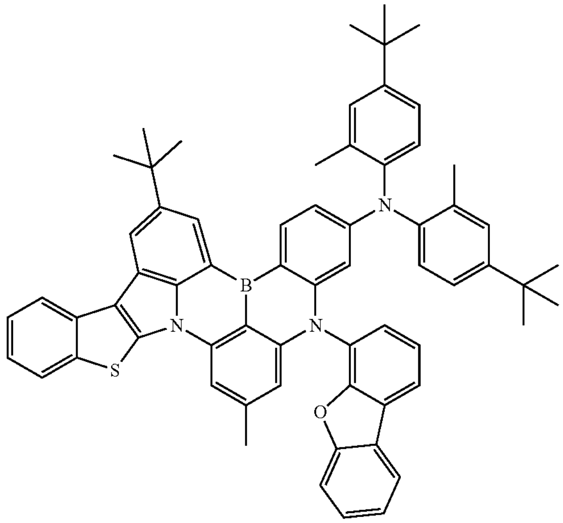
-continued -continued
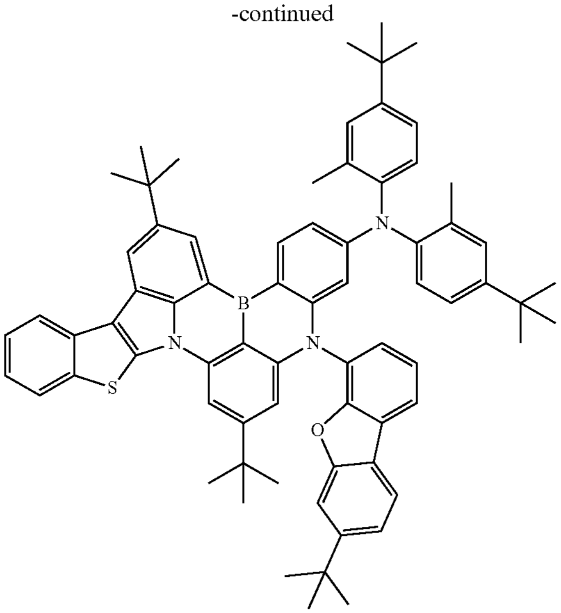
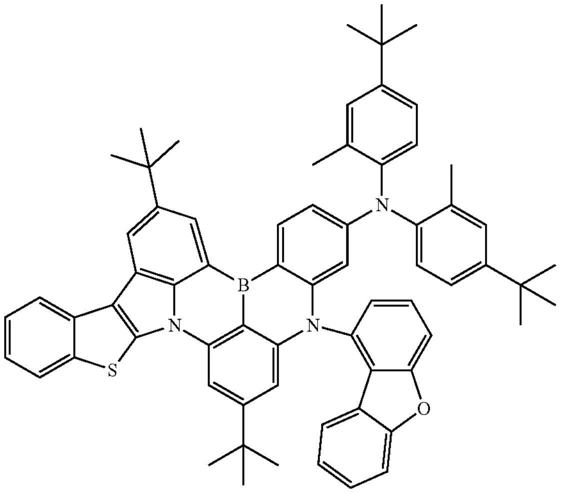
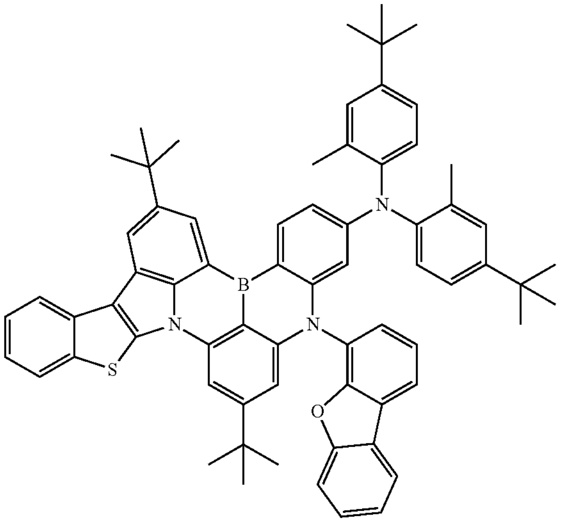
-continued
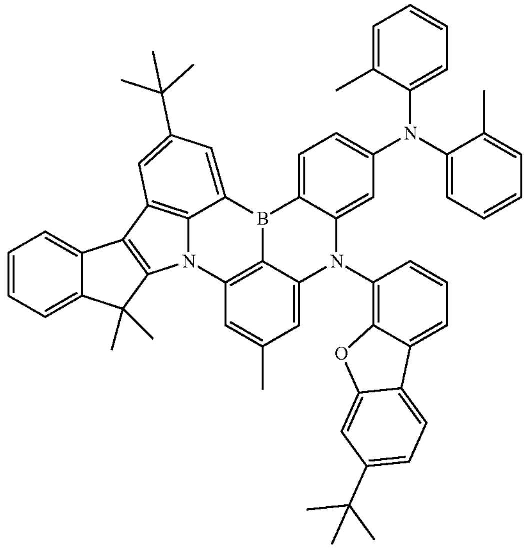
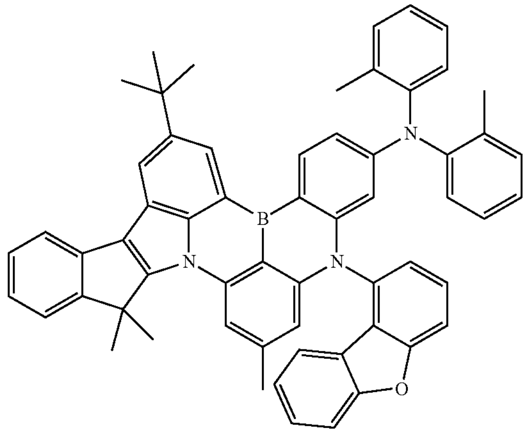
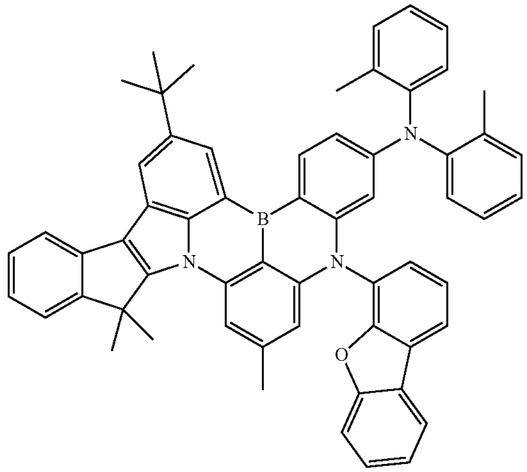

-continued
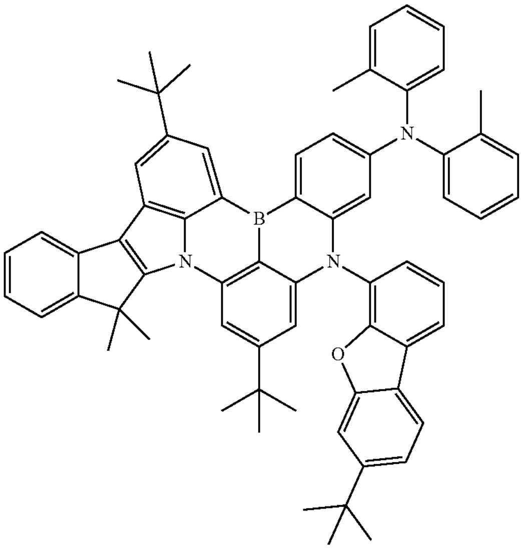
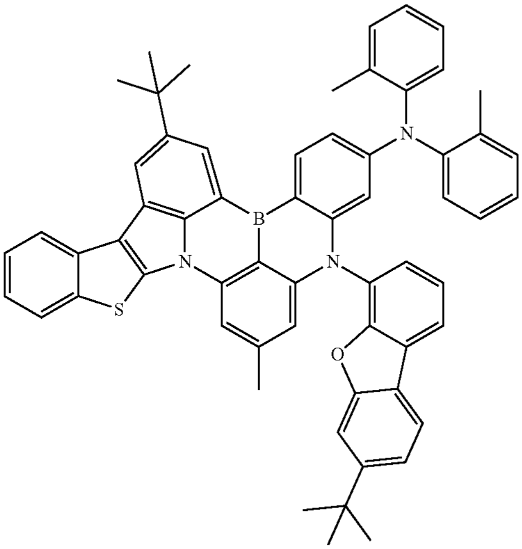
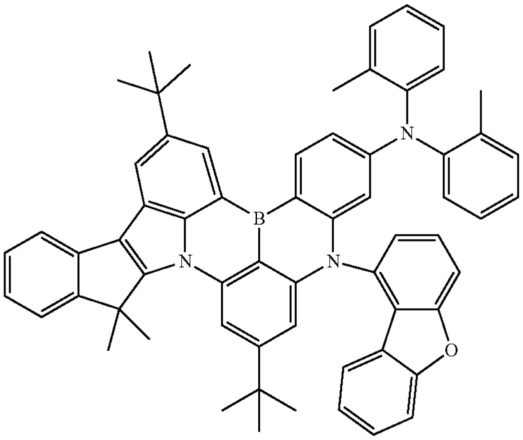
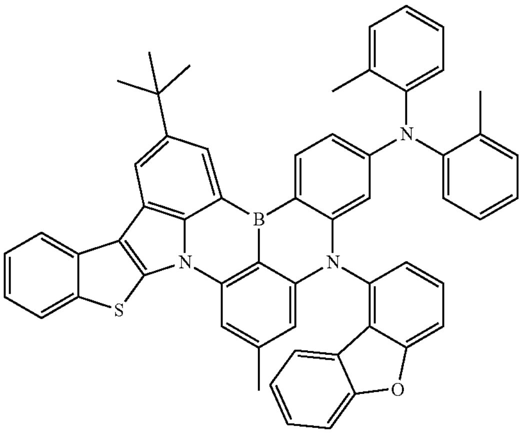
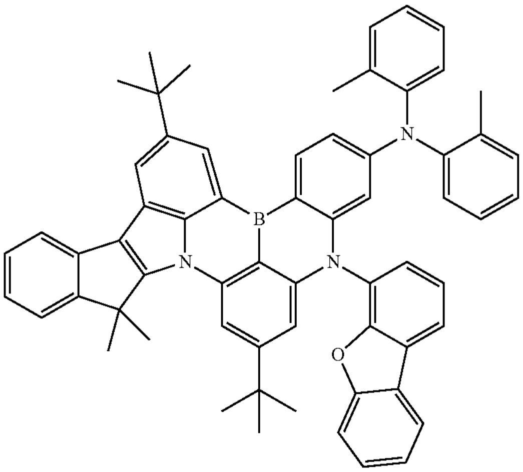
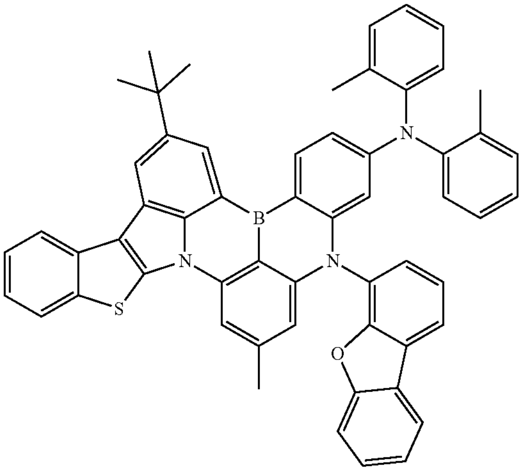

-continued
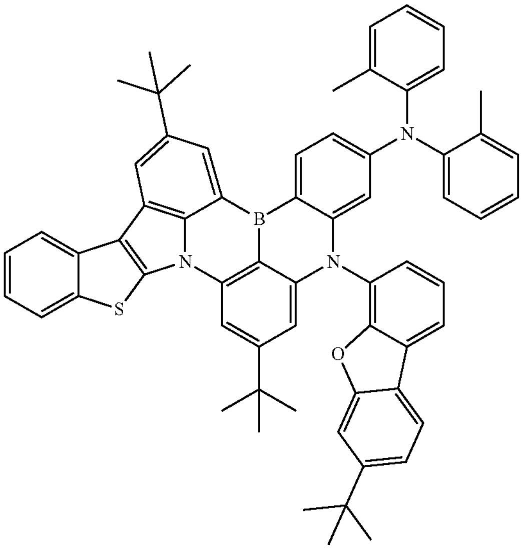
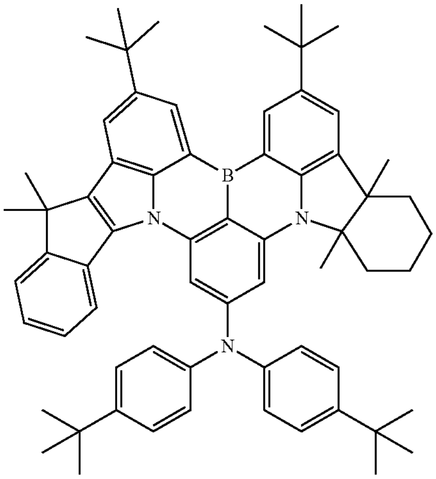
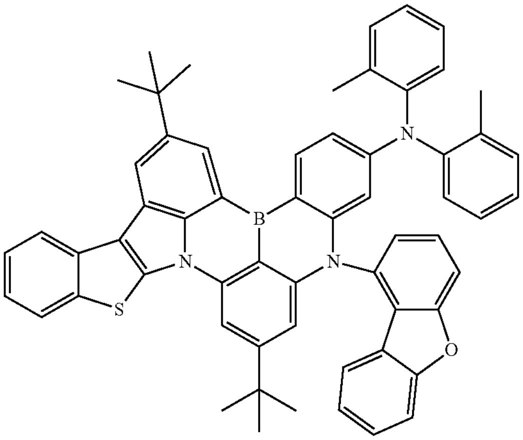
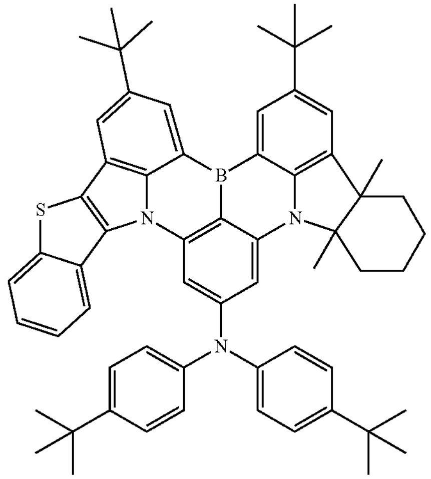
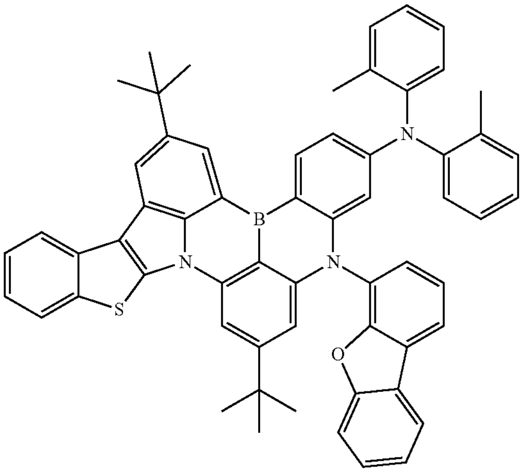
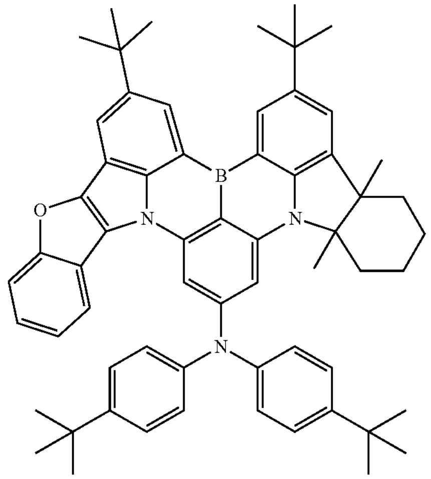
-continued -continued
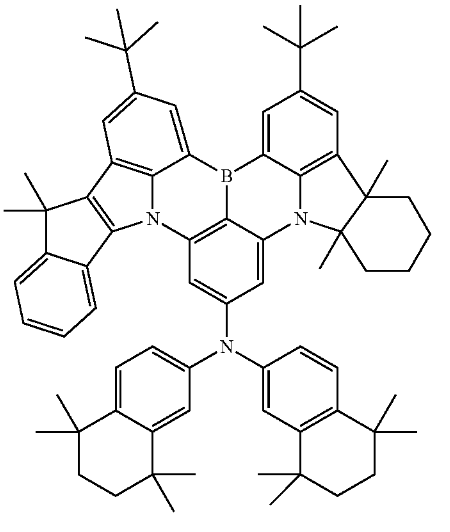
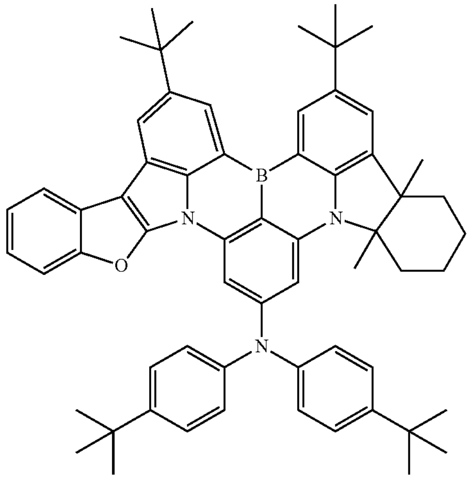
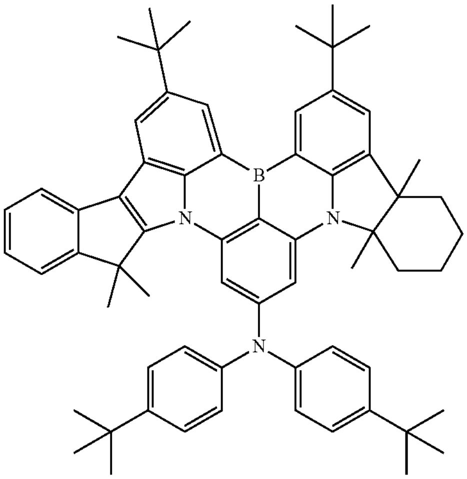
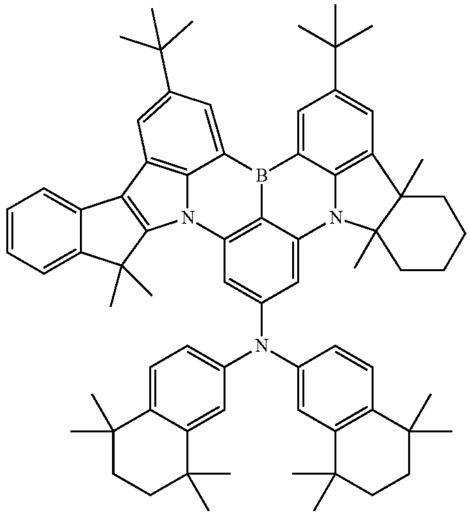
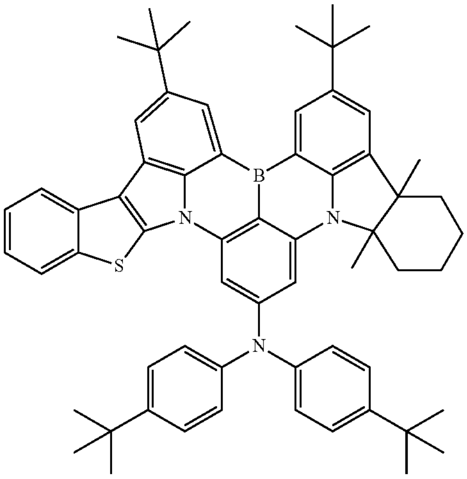
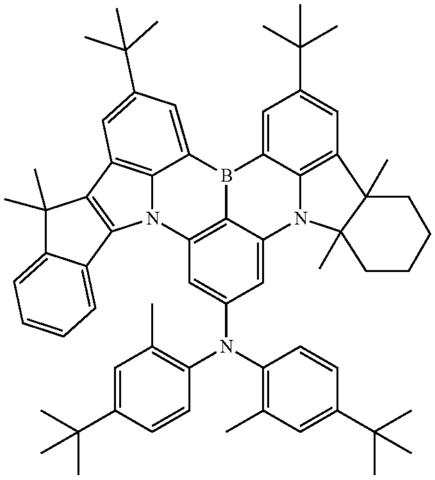

-continued
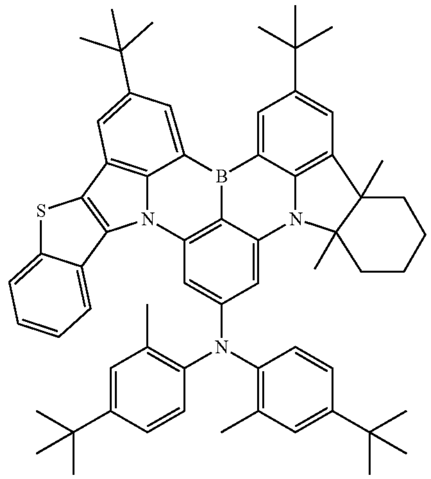
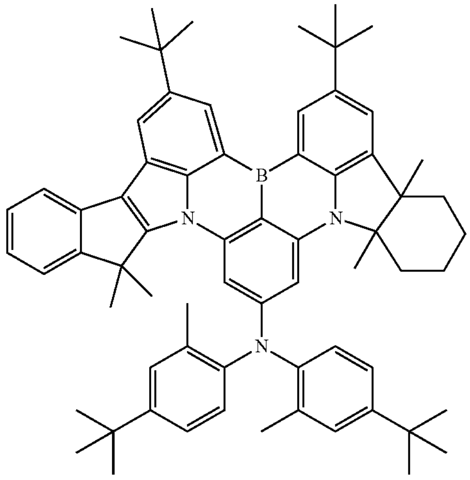
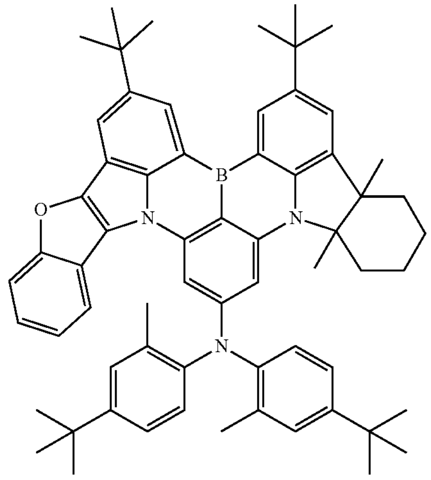
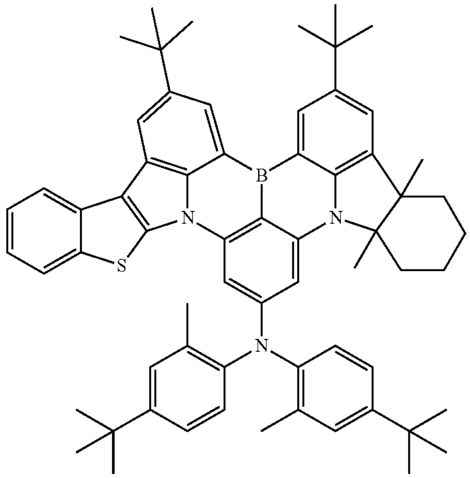
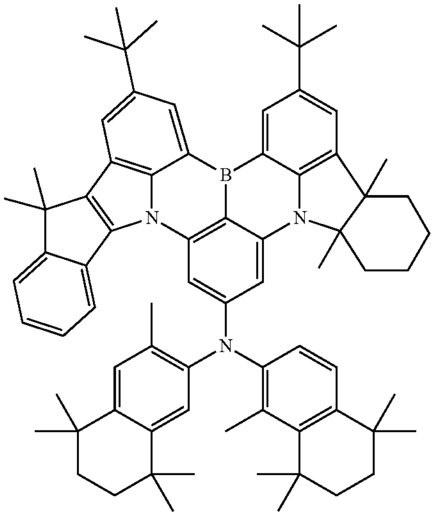
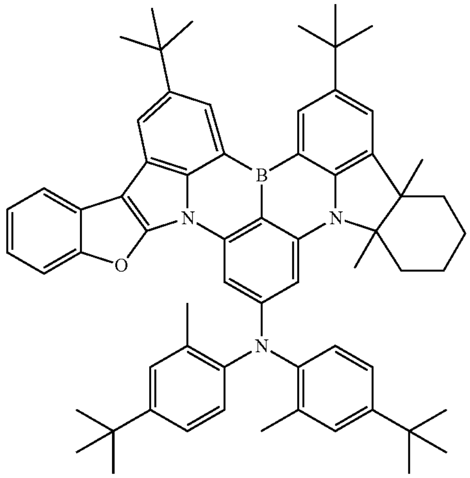

-continued
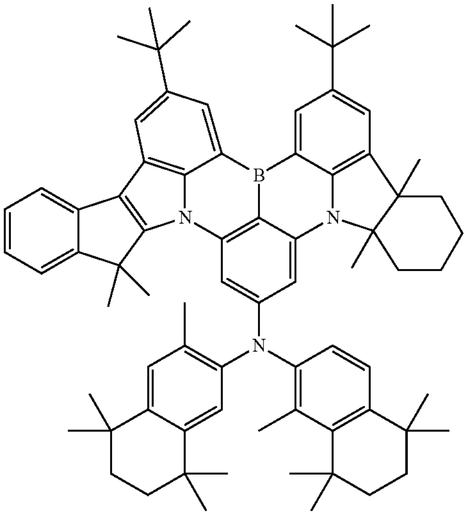
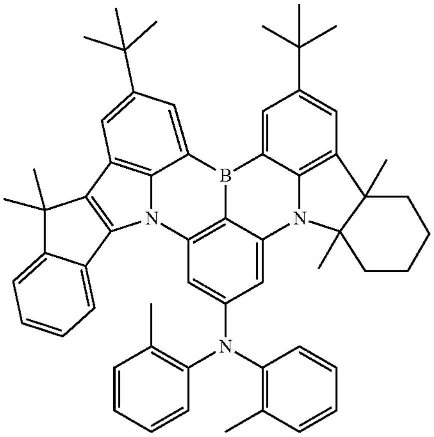
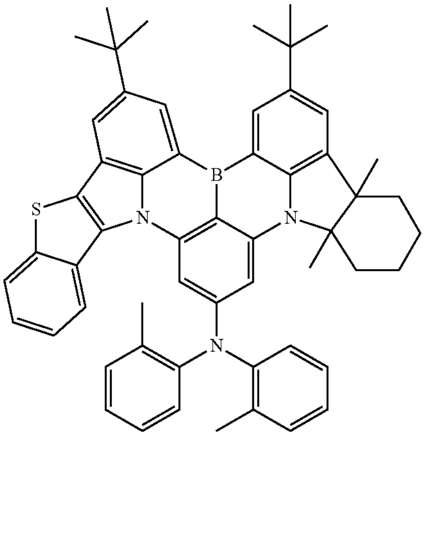
-continued
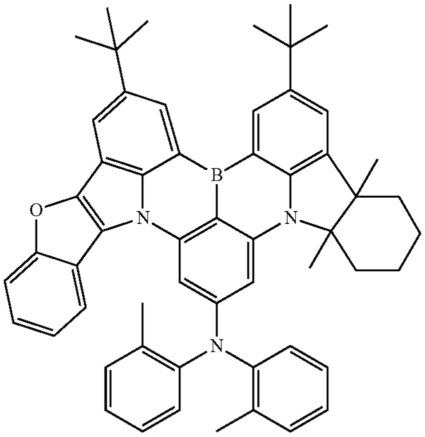
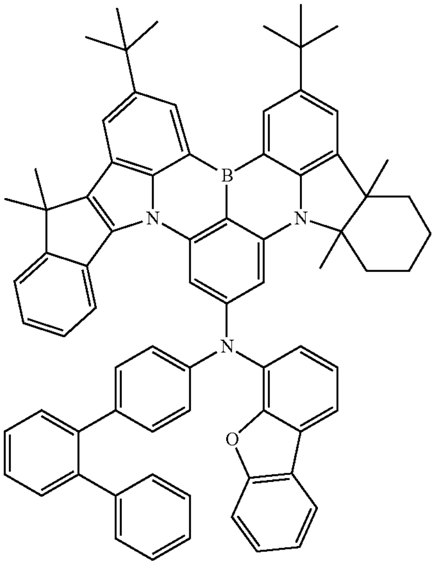
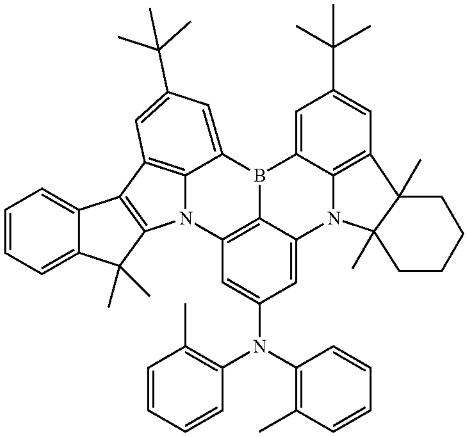

-continued
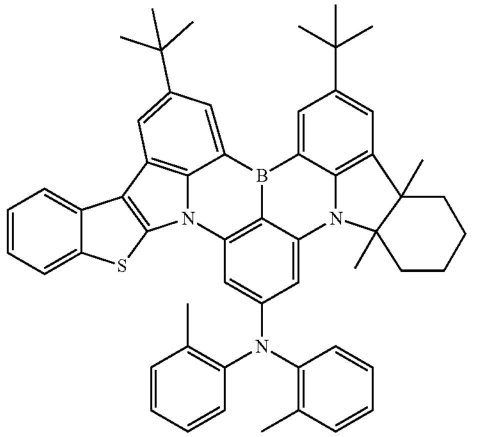
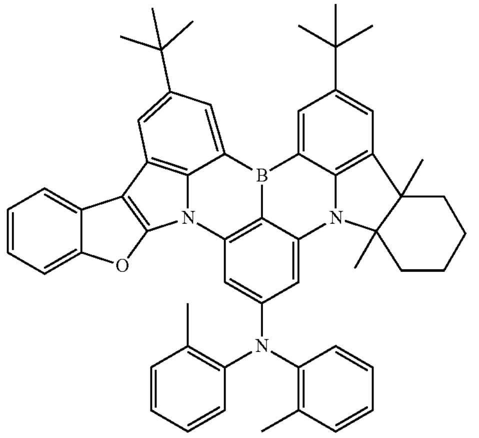
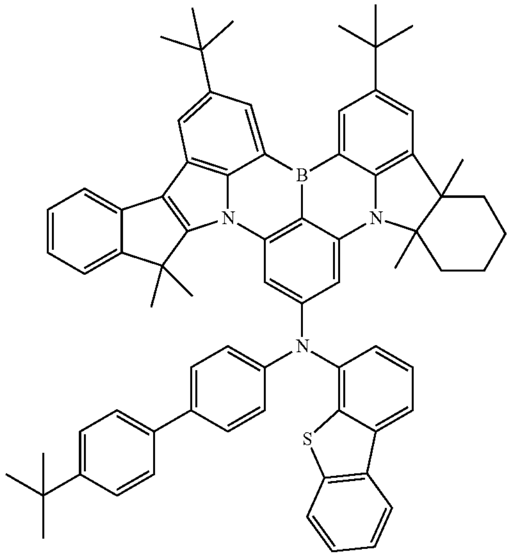
-continued
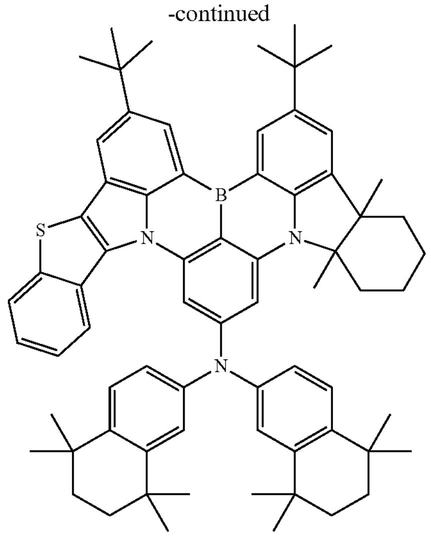
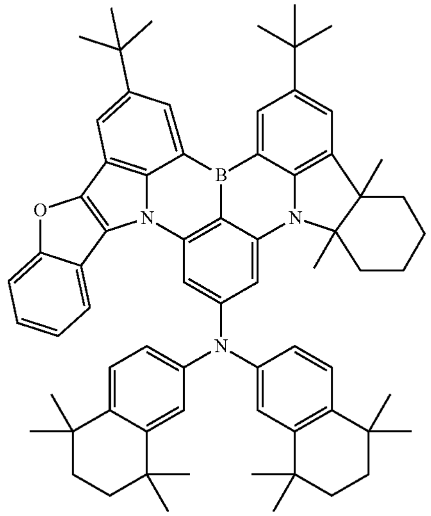
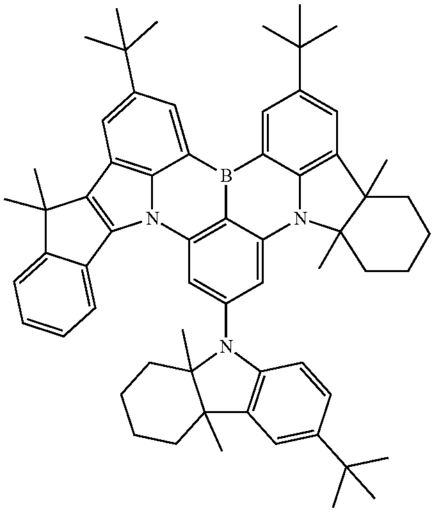

-continued
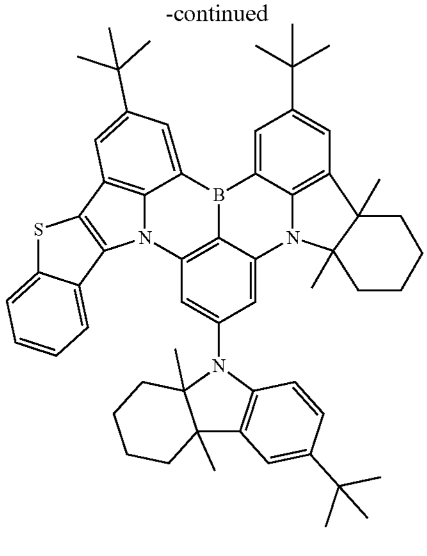
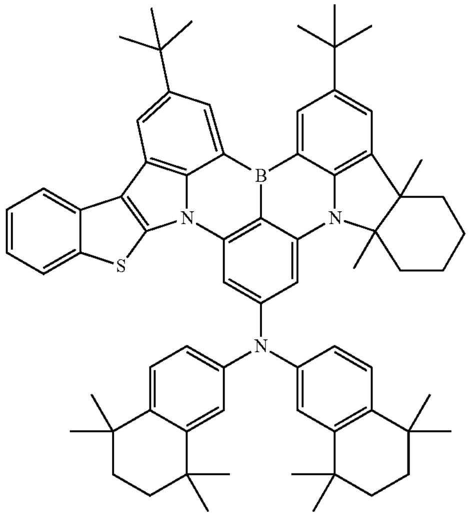
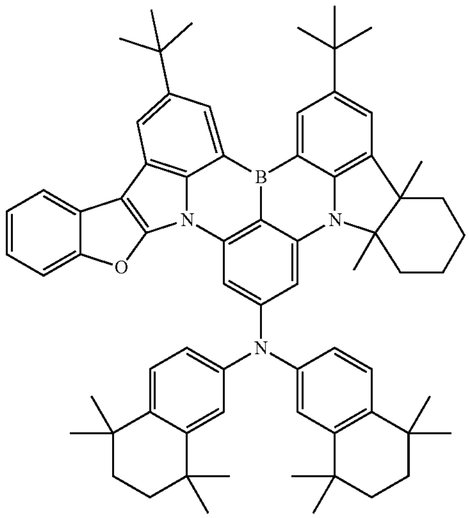
-continued
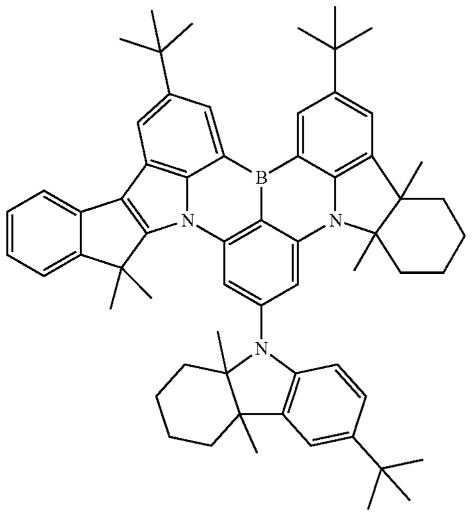
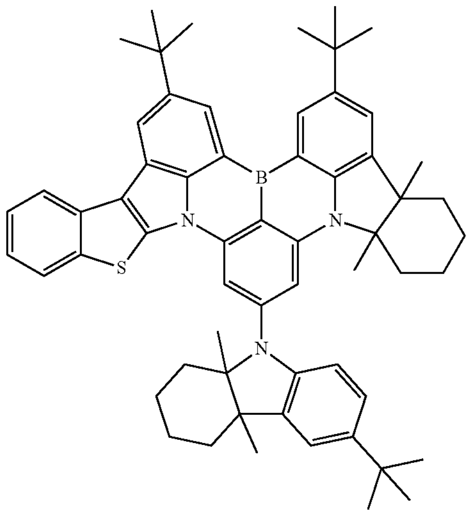
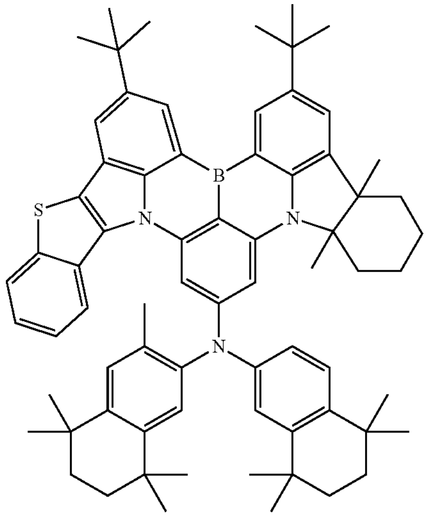

-continued
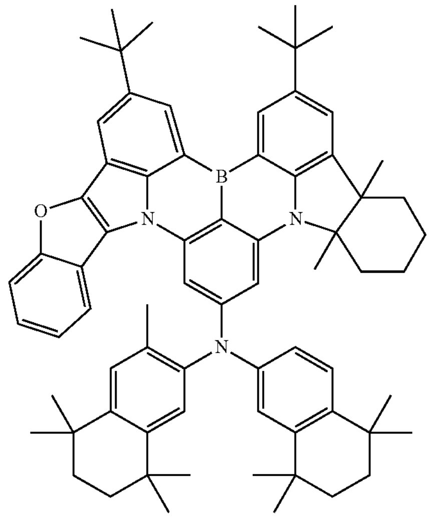
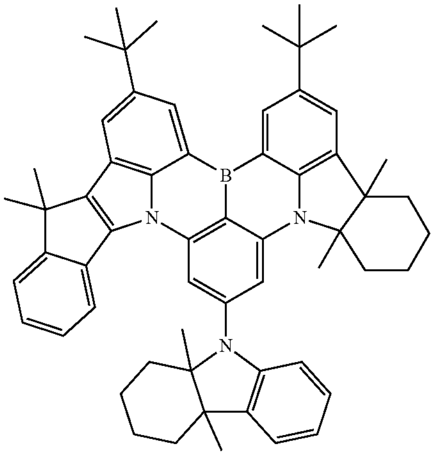
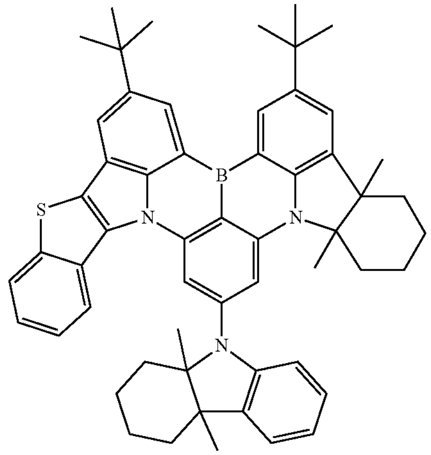
-continued
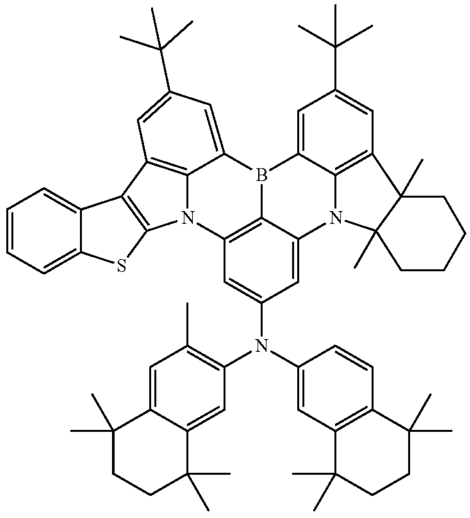
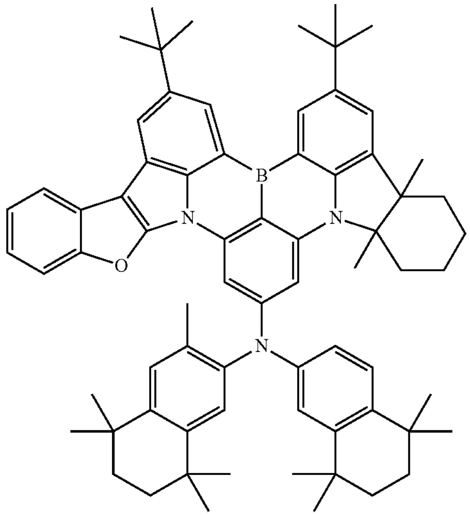
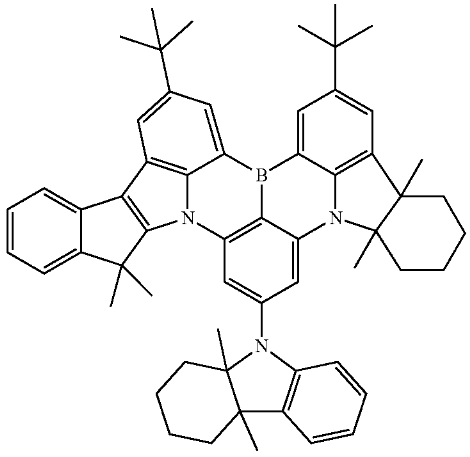

-continued
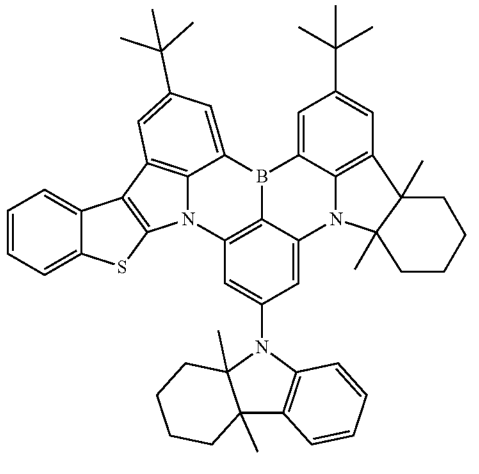
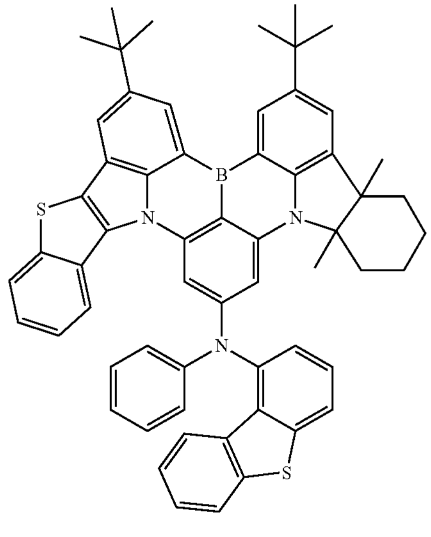
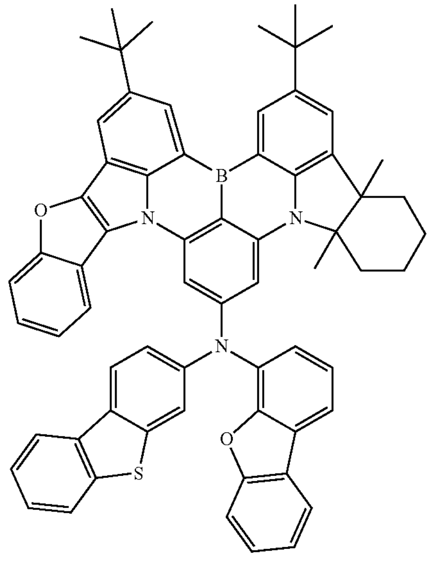
-continued
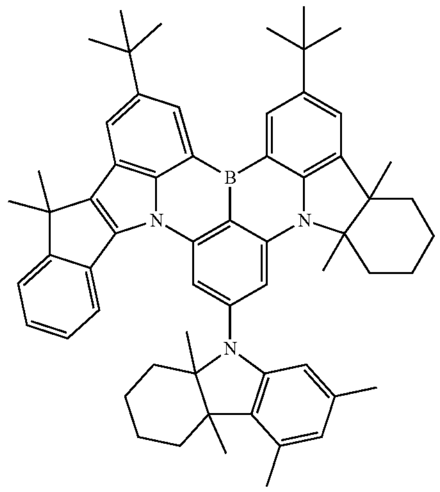
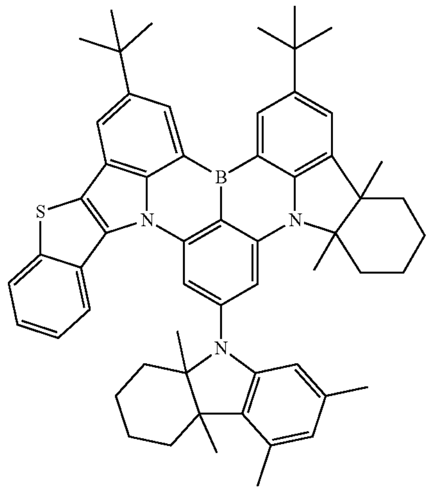
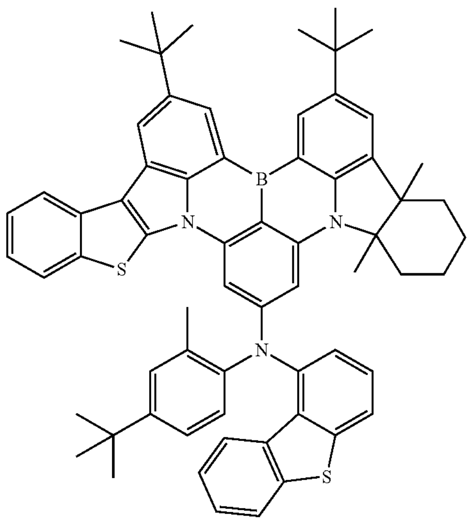

1282
-continued
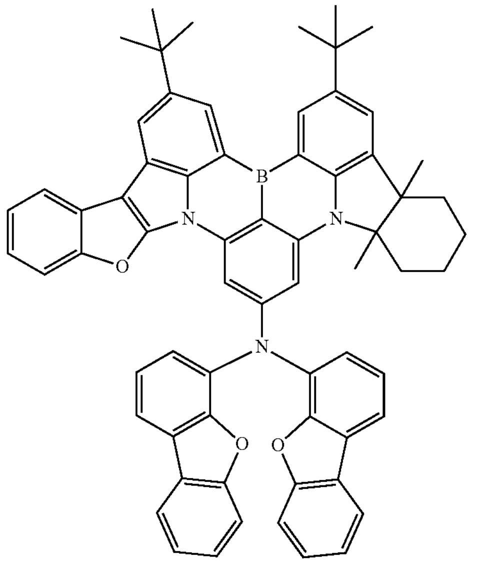
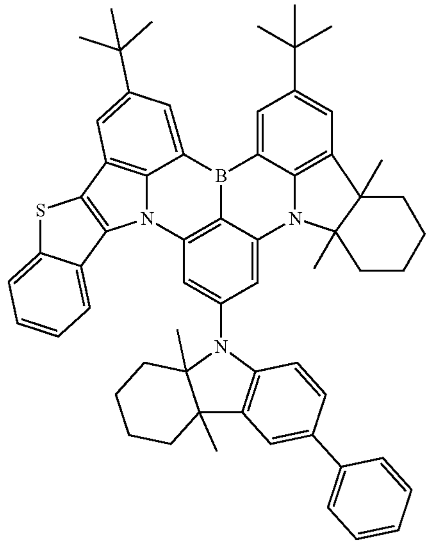
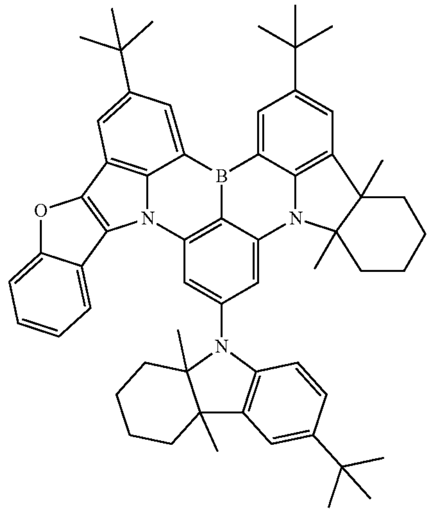
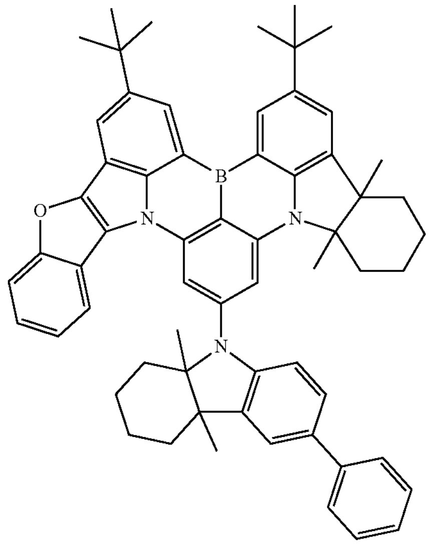
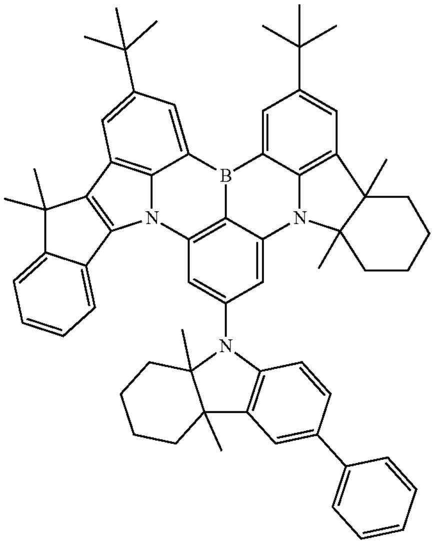
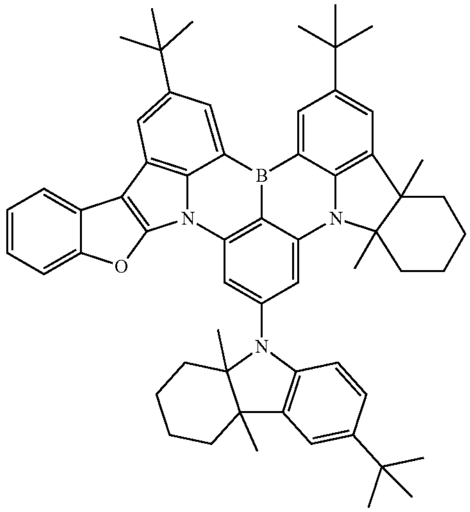

-continued
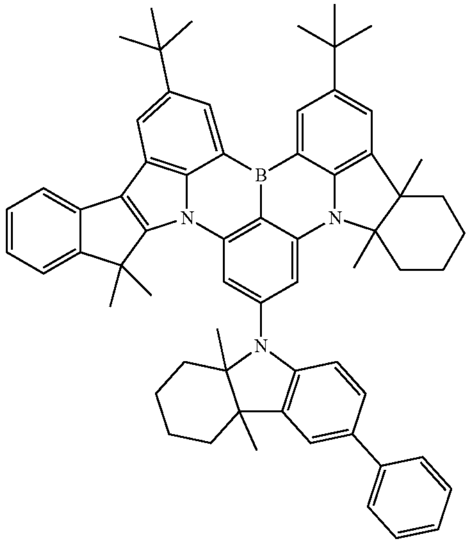
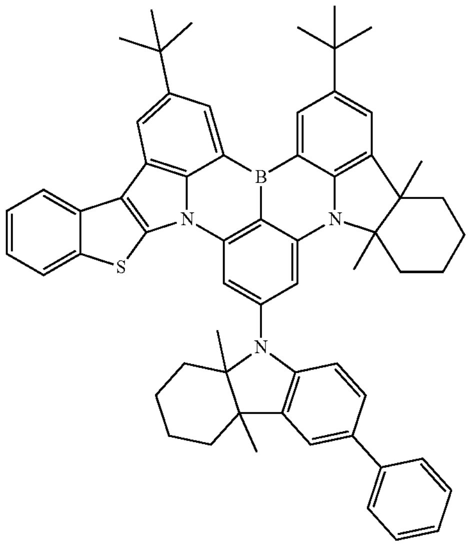
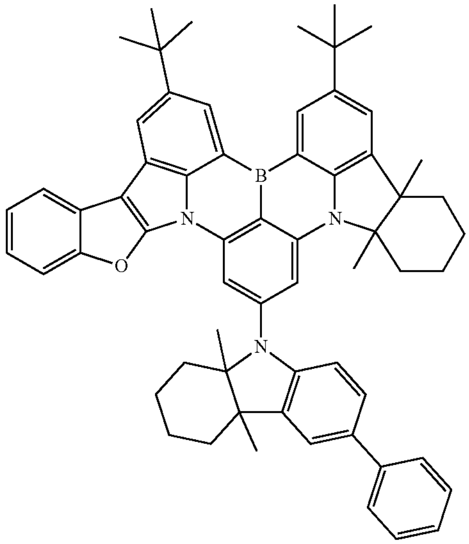
-continued
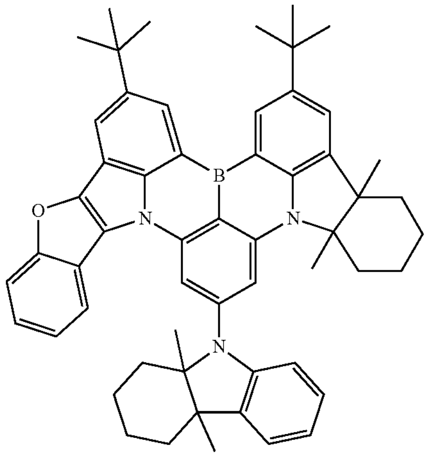
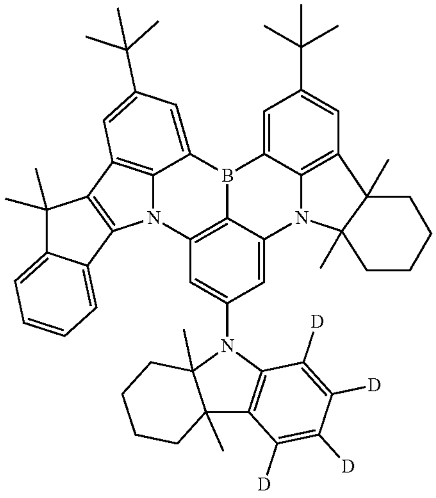
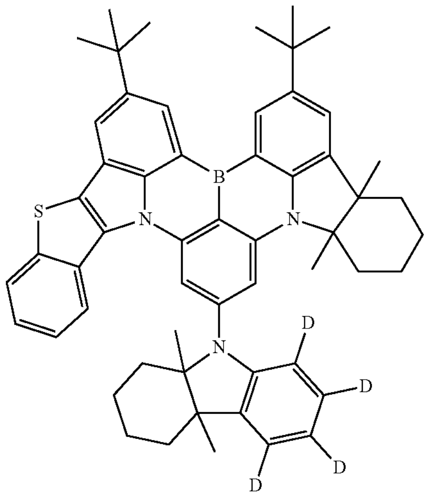

-continued
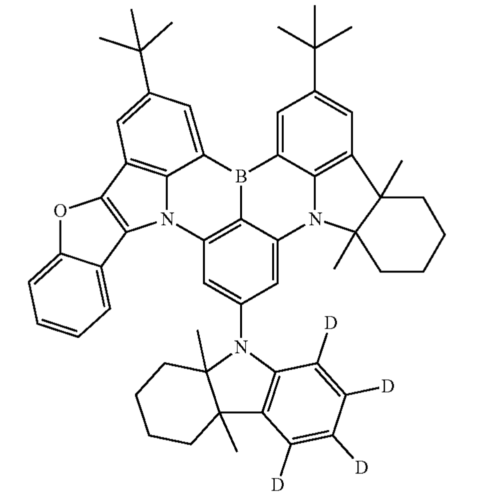
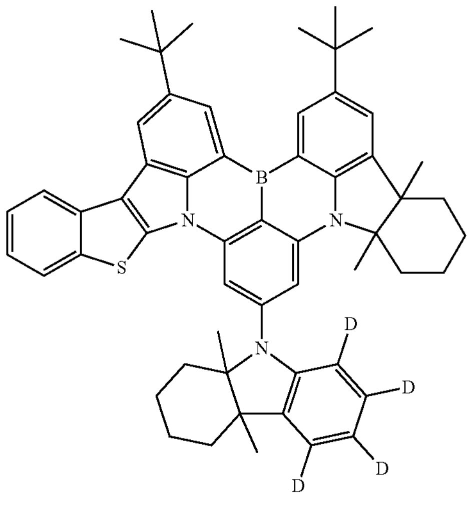
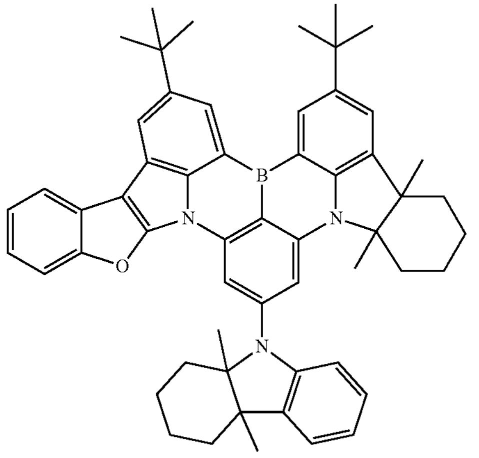
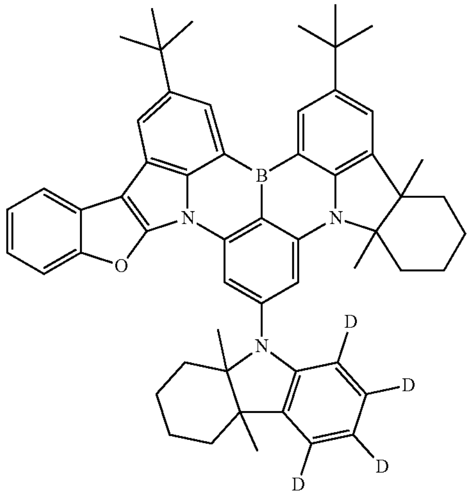
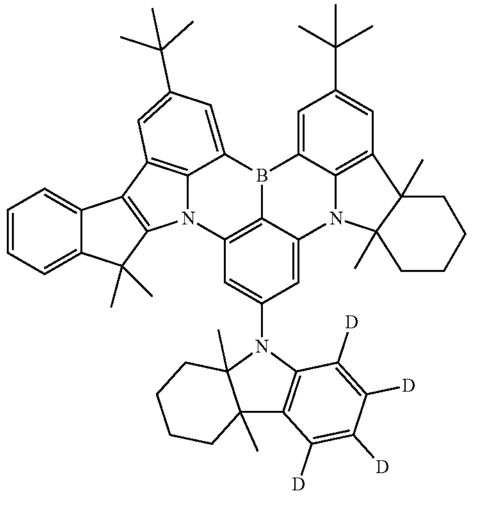
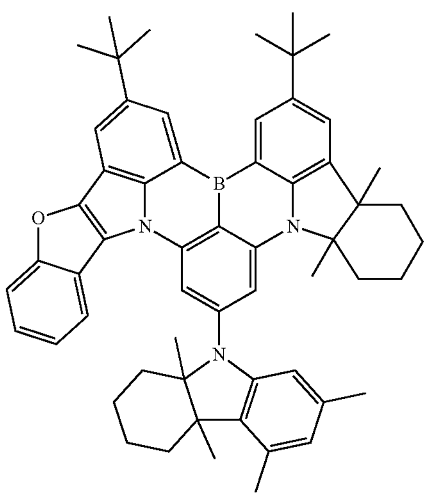
-continued -continued
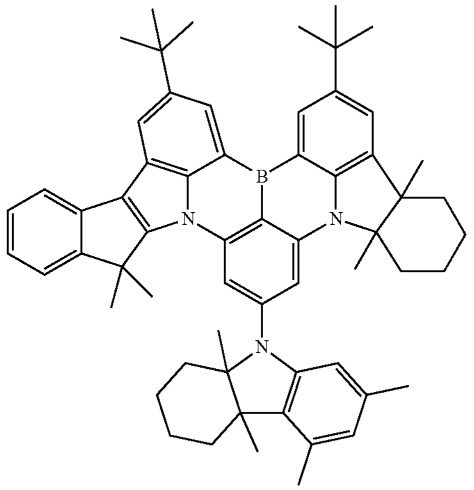
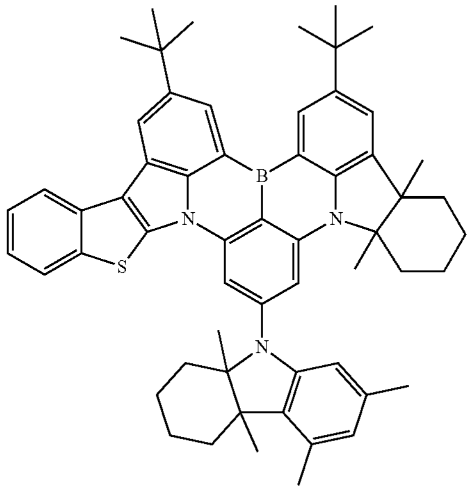
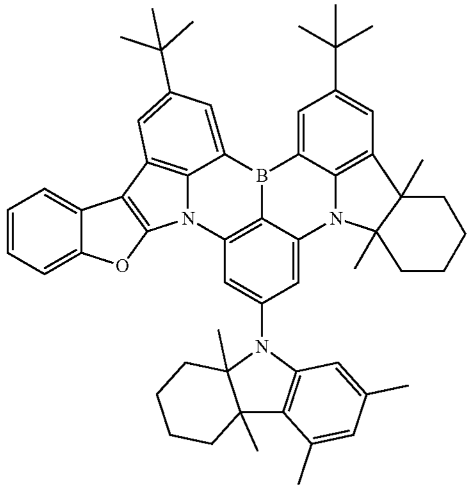
-continued
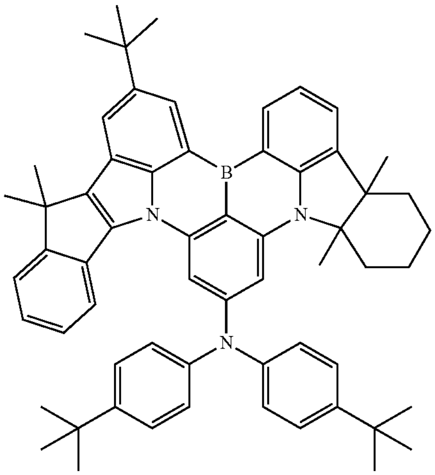
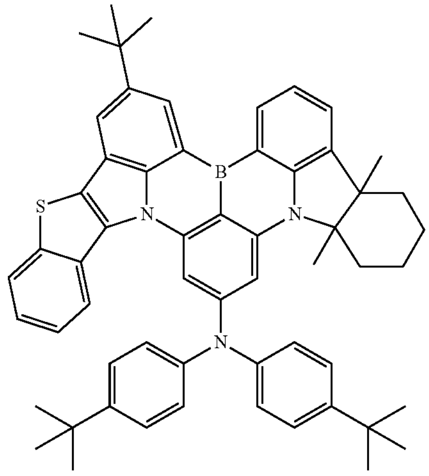
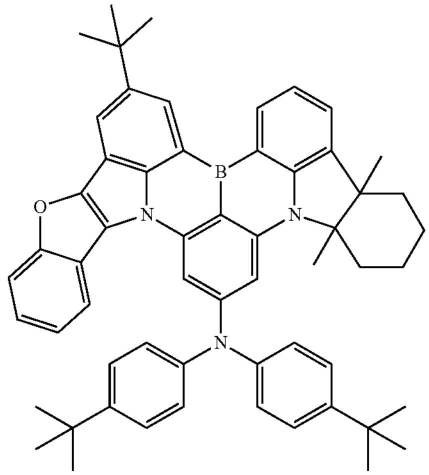

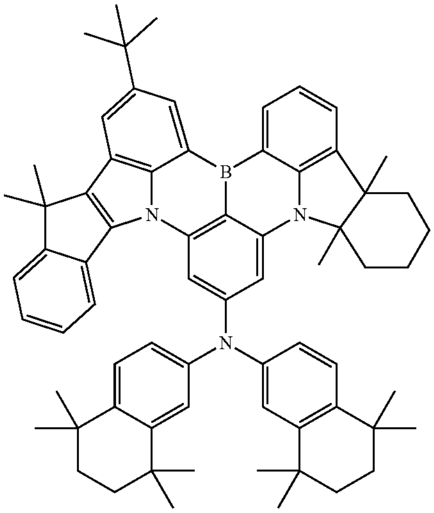
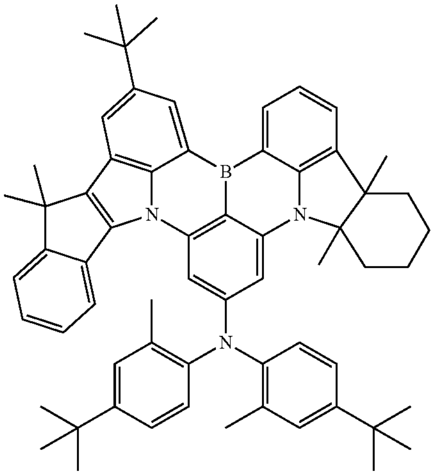
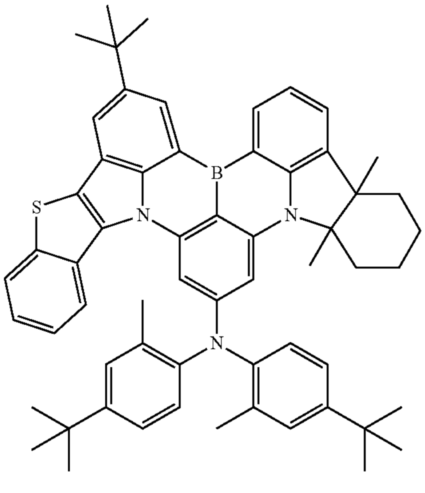
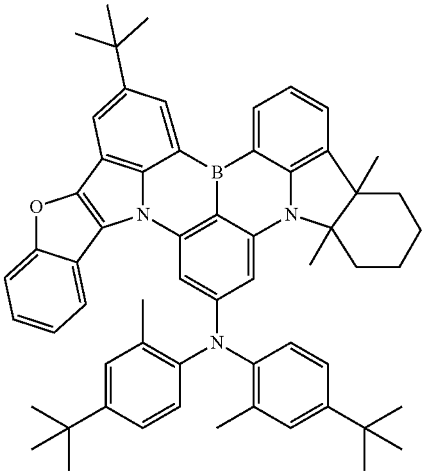
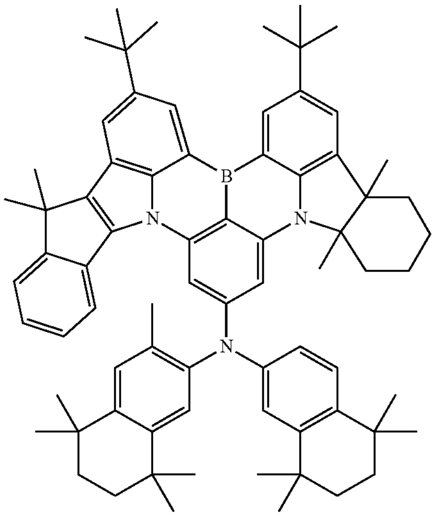
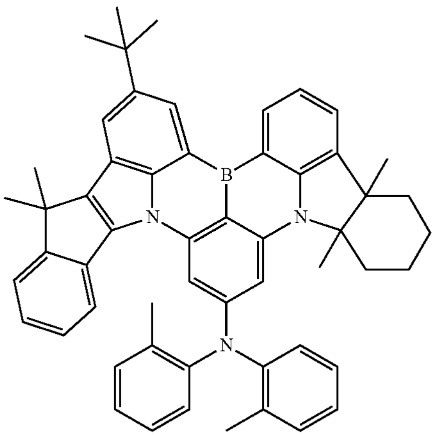

-continued
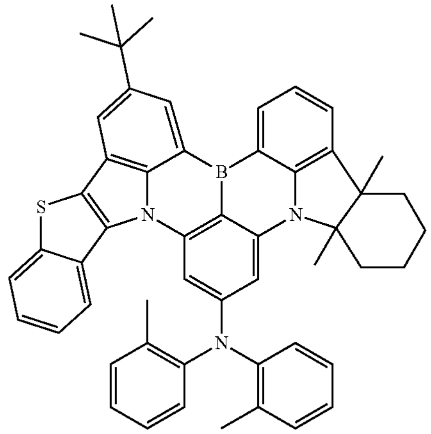
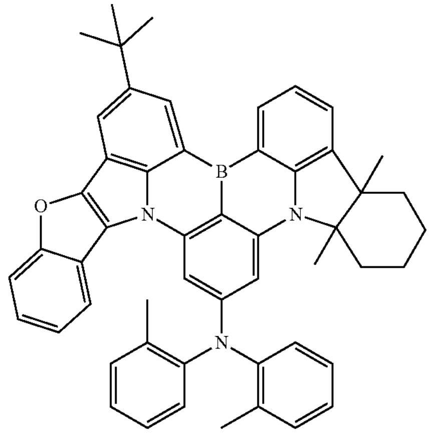
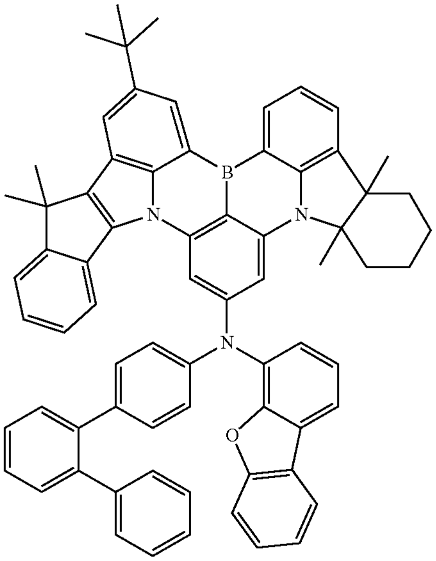
-continued
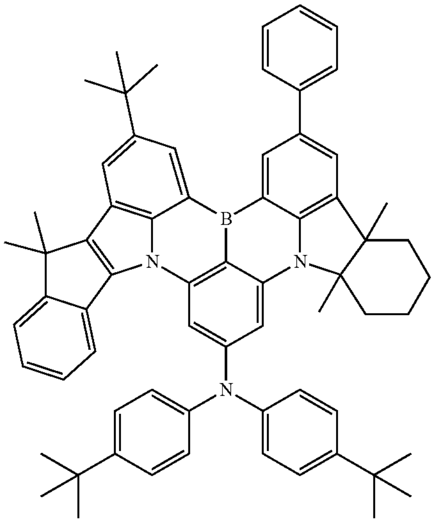
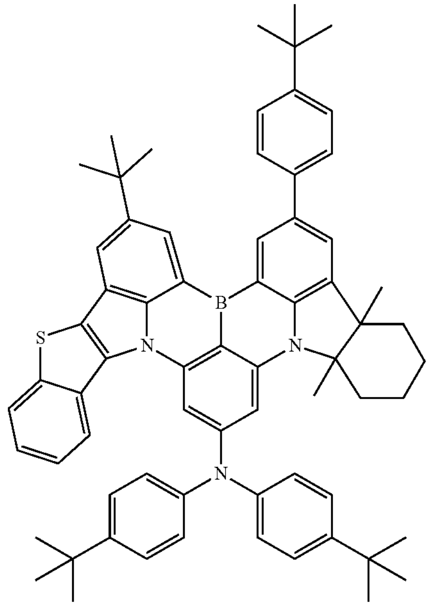
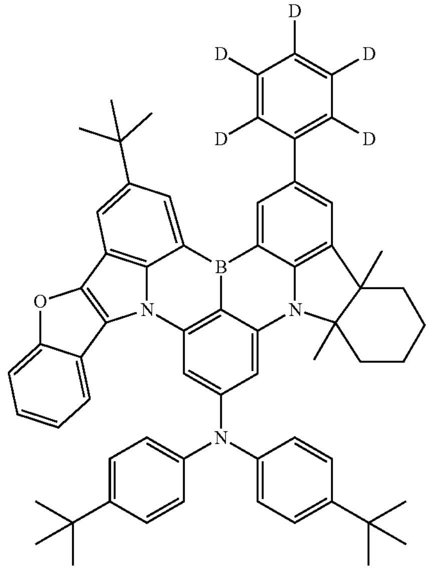

-continued
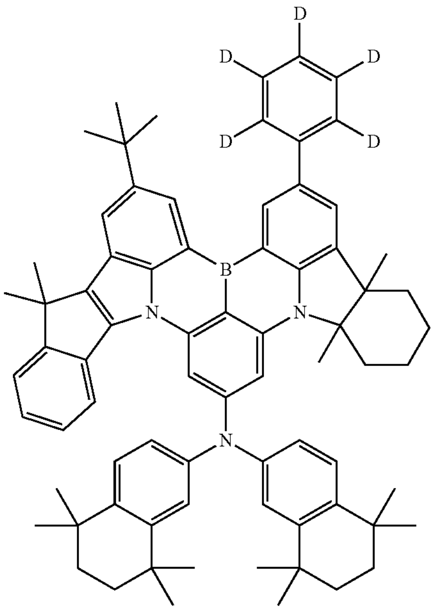
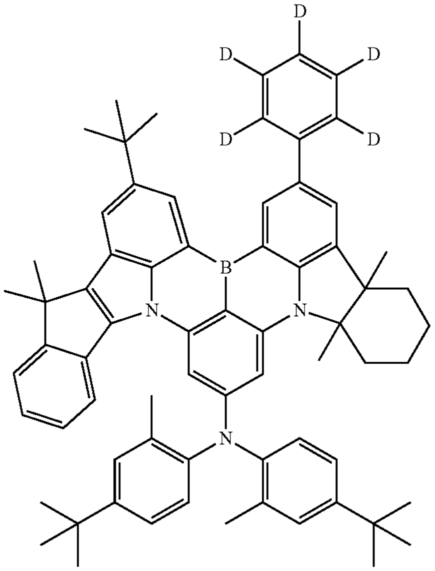
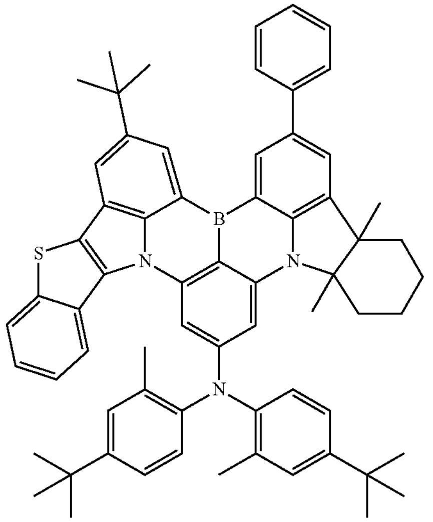
-continued
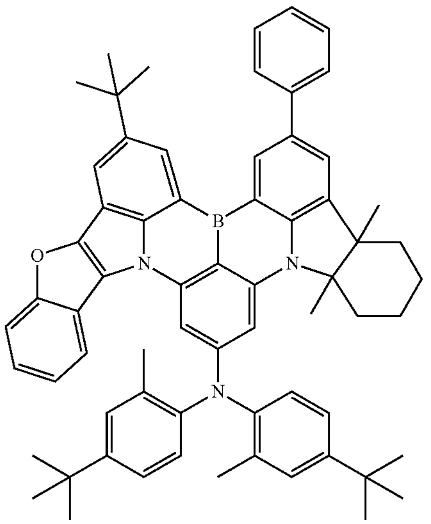
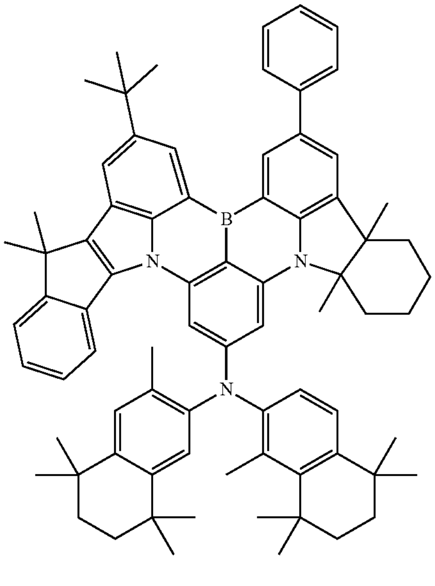
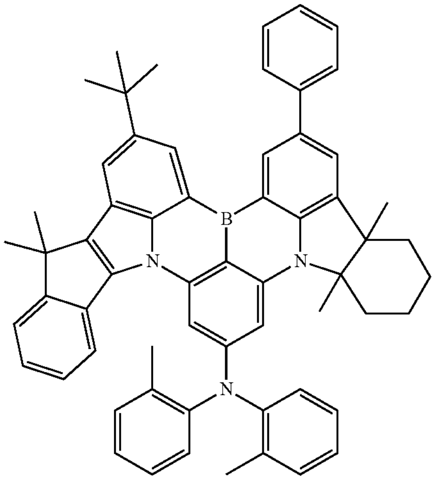

-continued
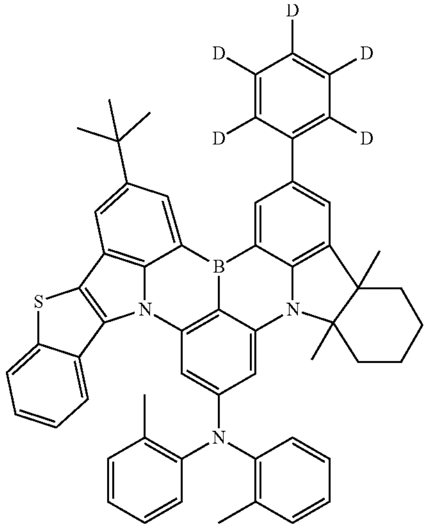
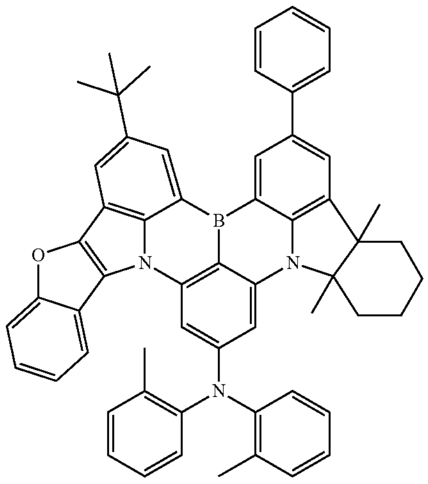
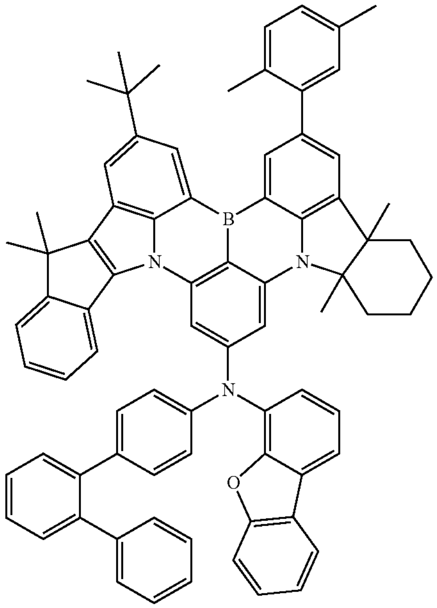
-continued
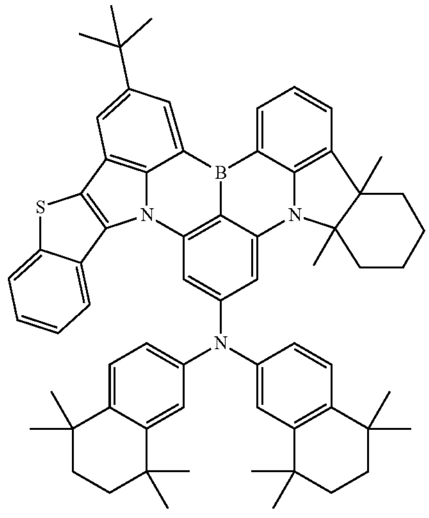
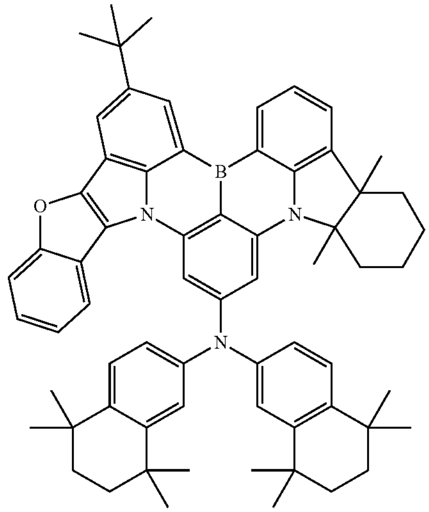
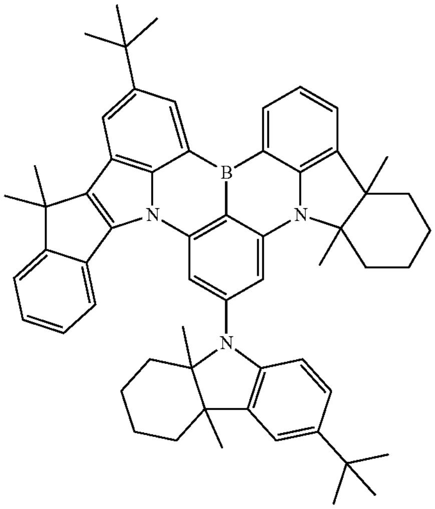

-continued
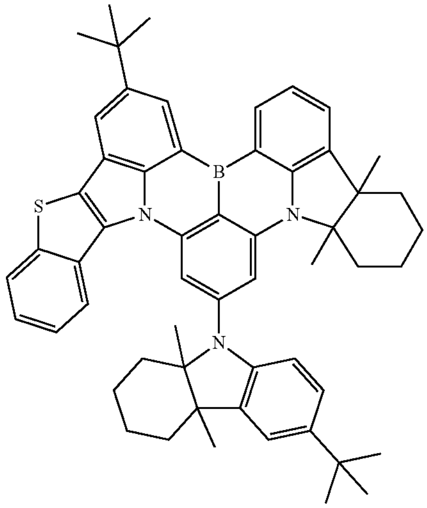
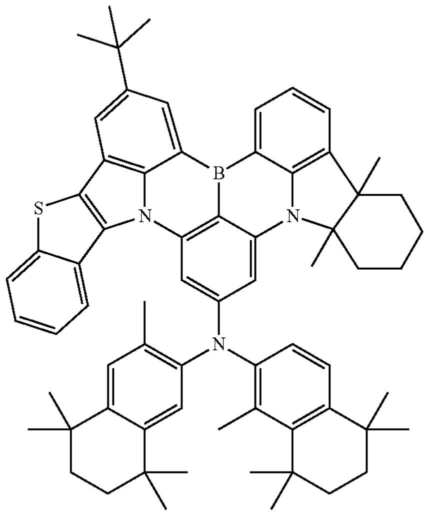
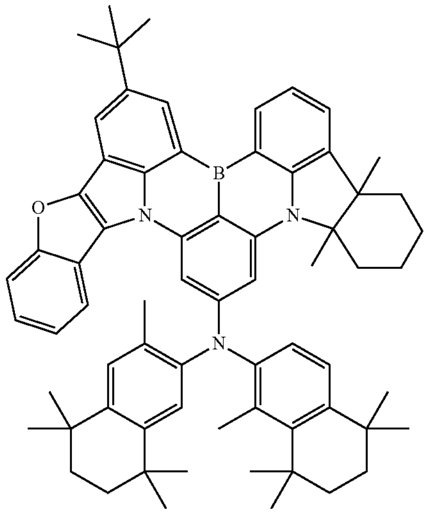
-continued
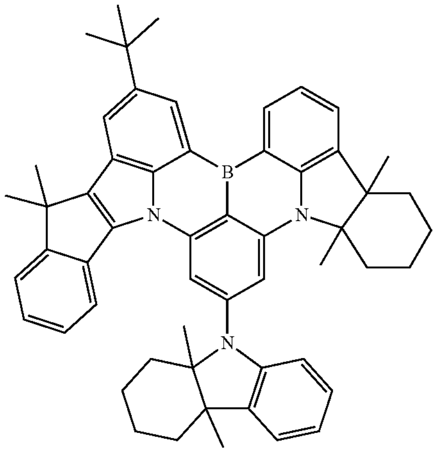
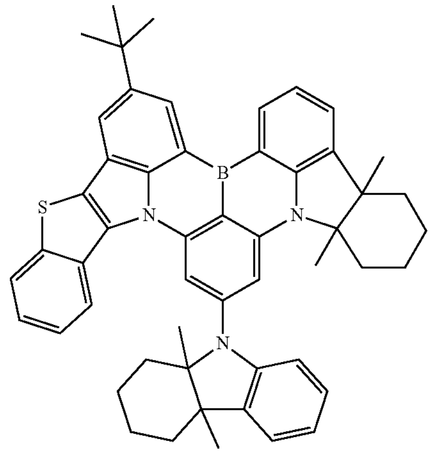
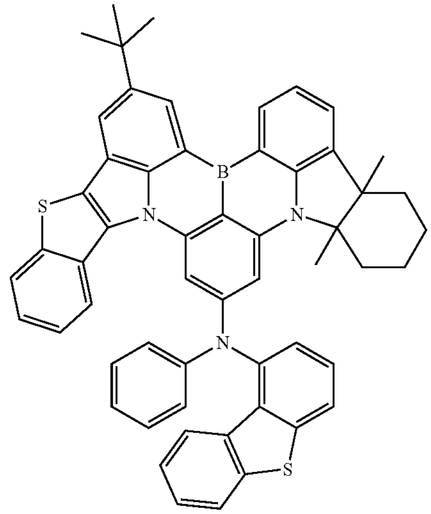

-continued
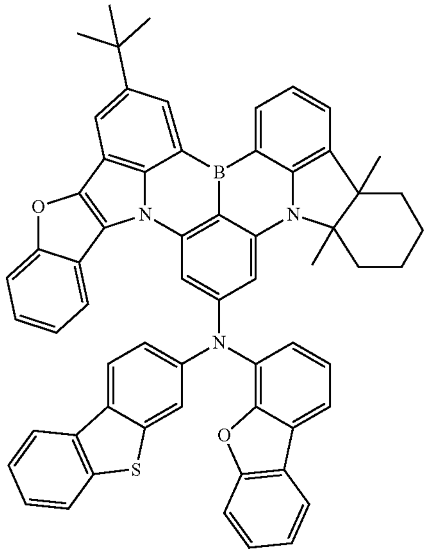
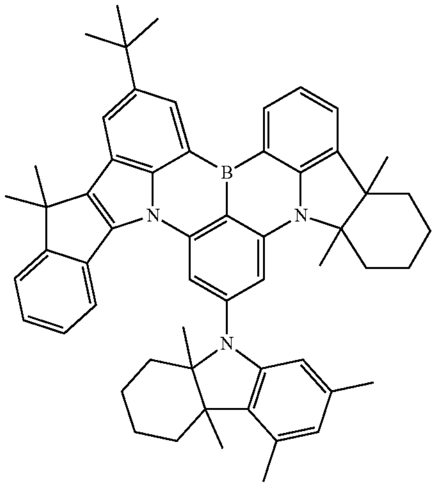
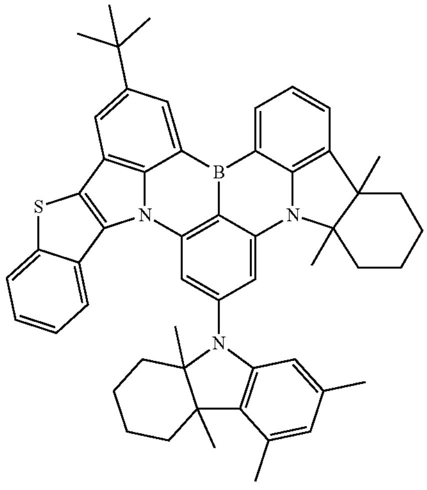
-continued
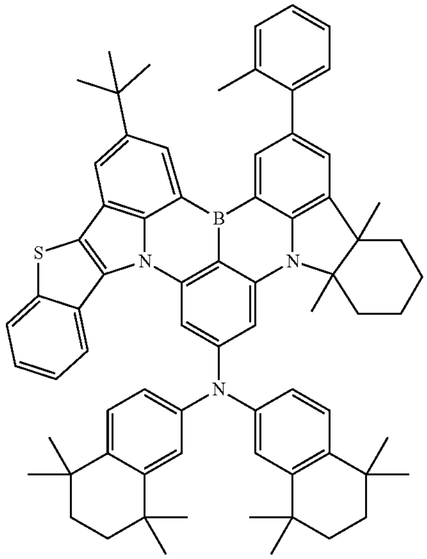
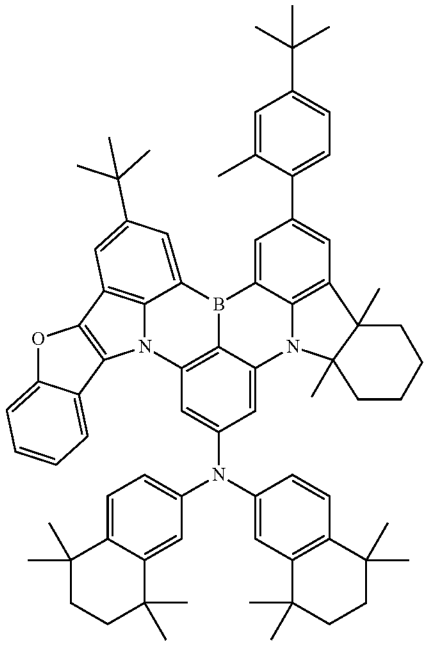

-continued
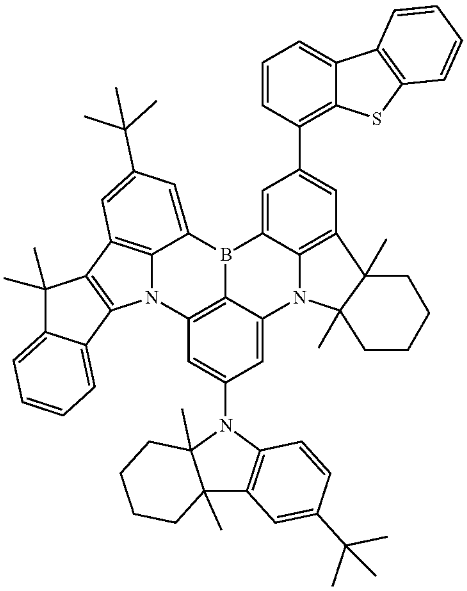
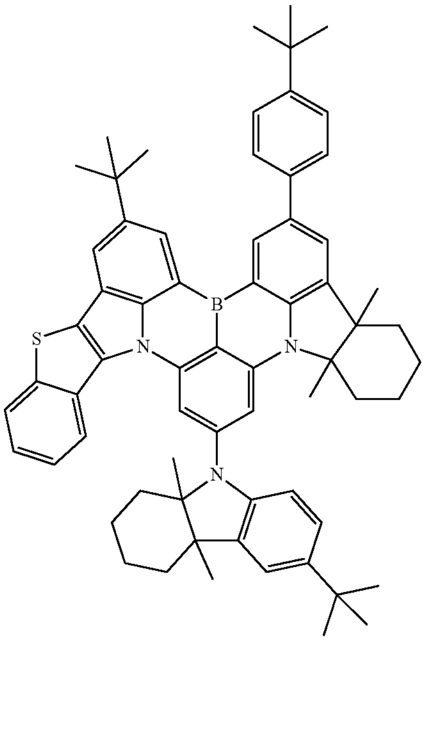
-continued
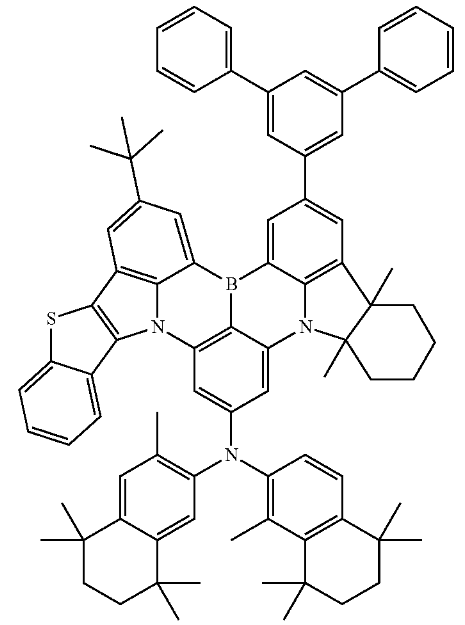
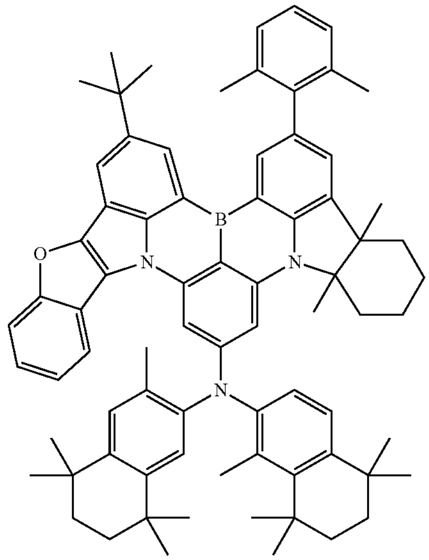
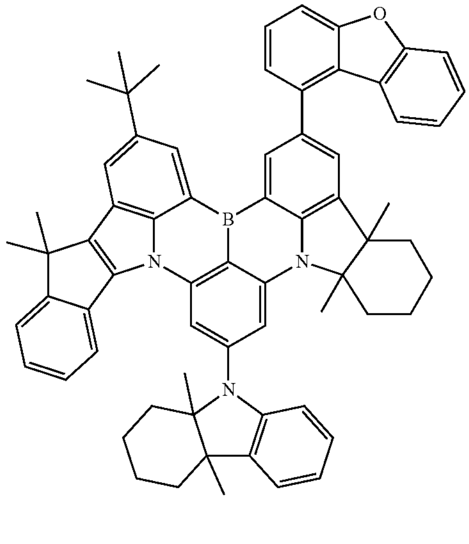

-continued
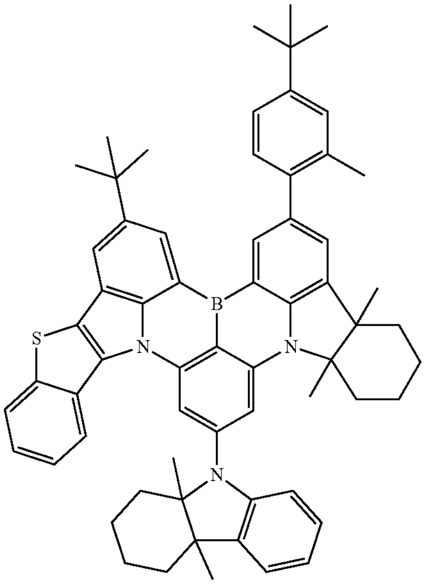
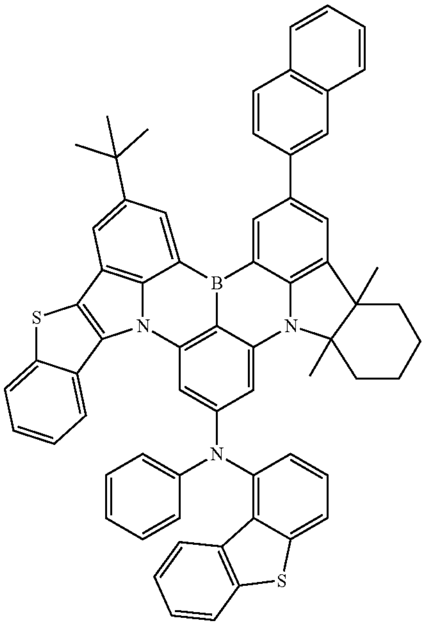
-continued
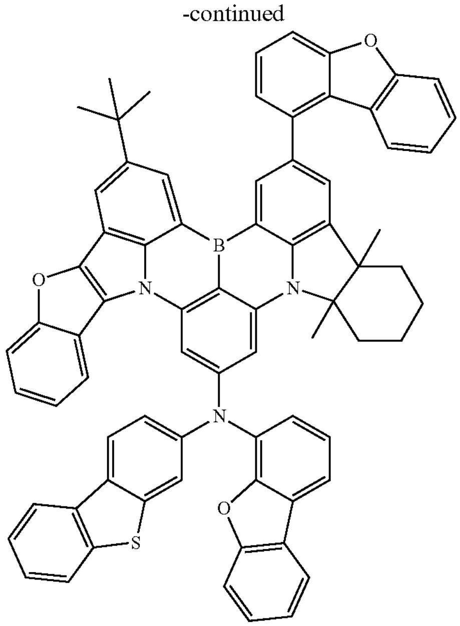
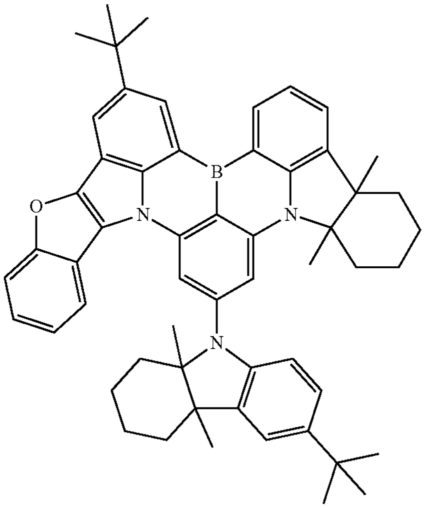
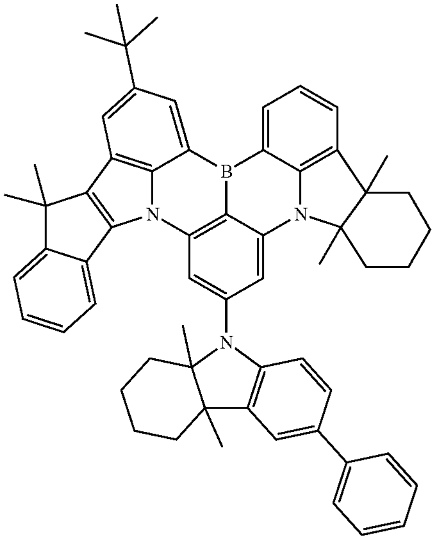

-continued
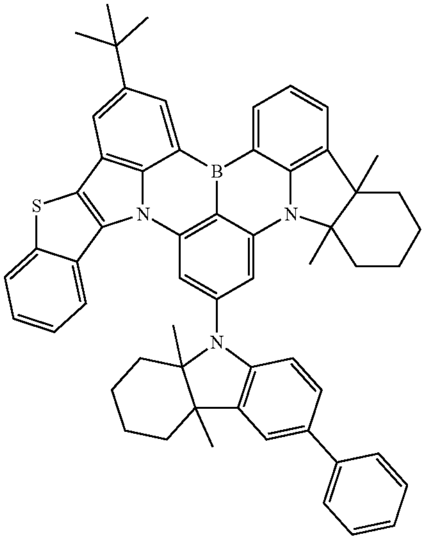
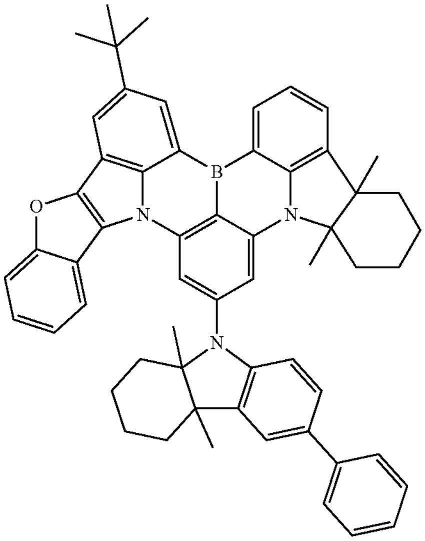
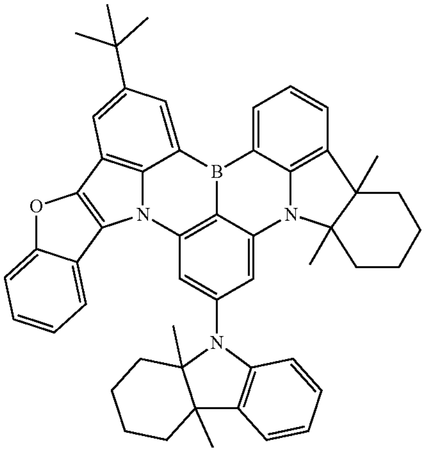
-continued
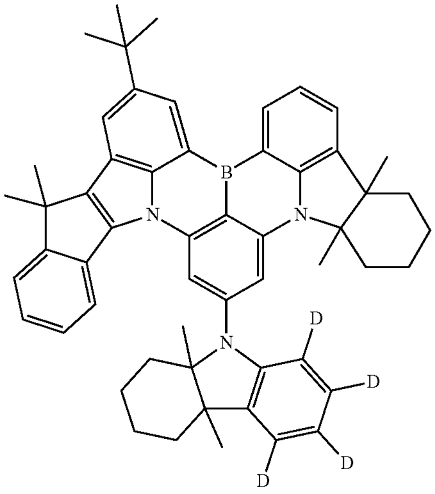
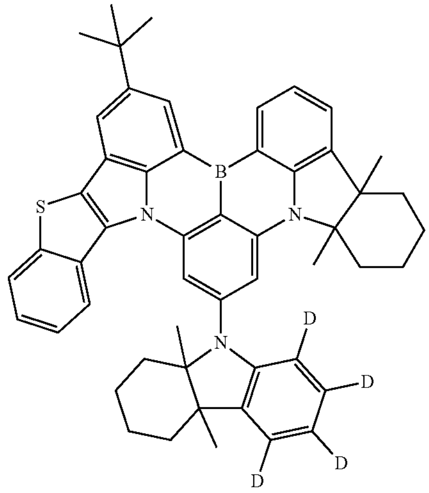
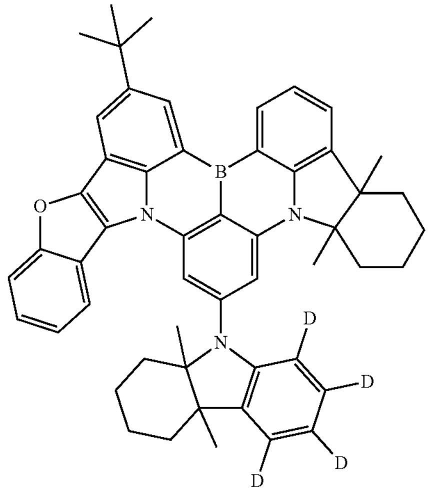

-continued
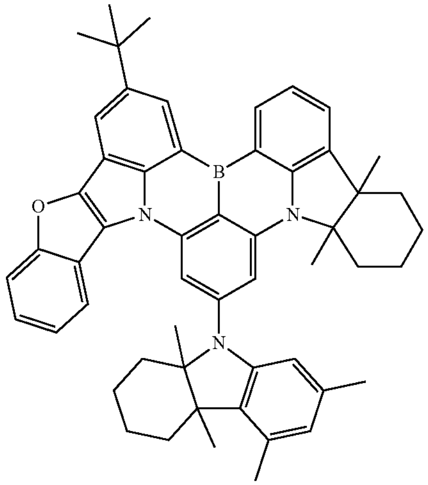
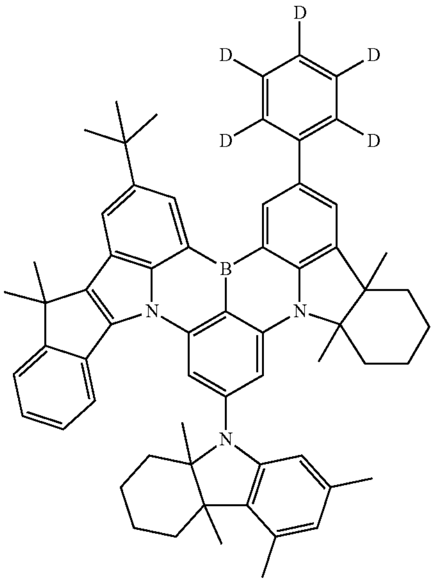
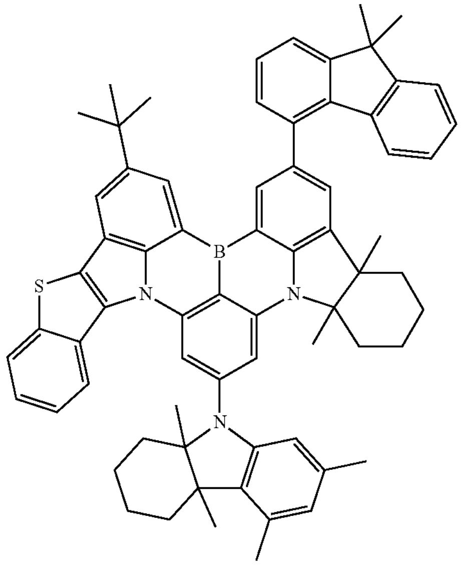
-continued
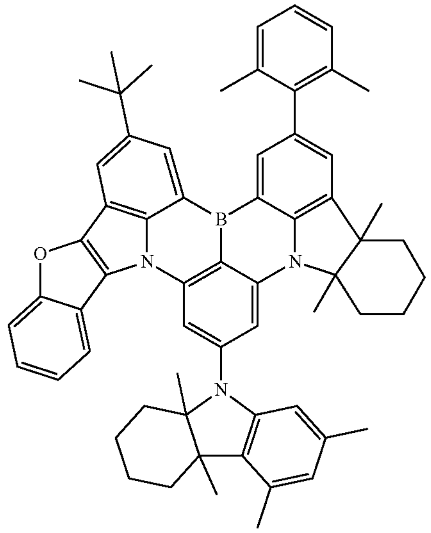
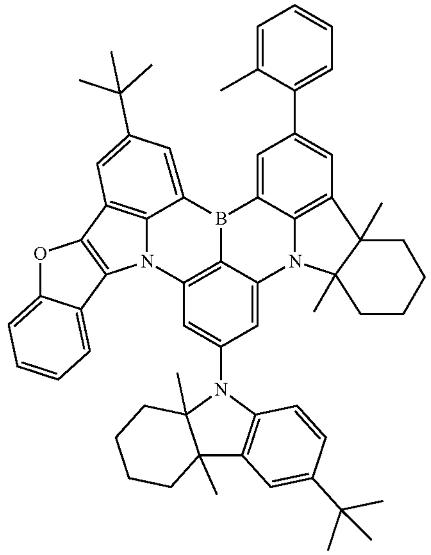
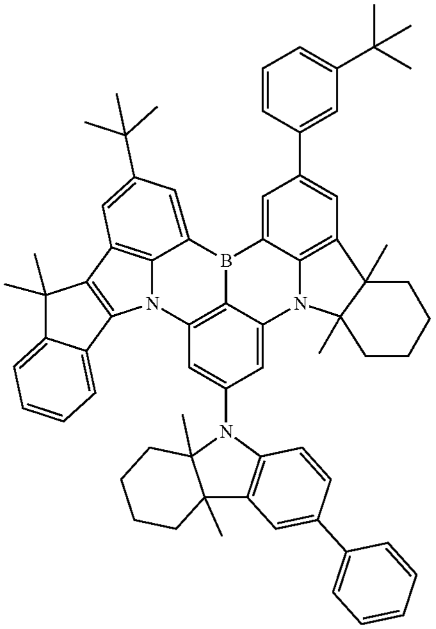

-continued
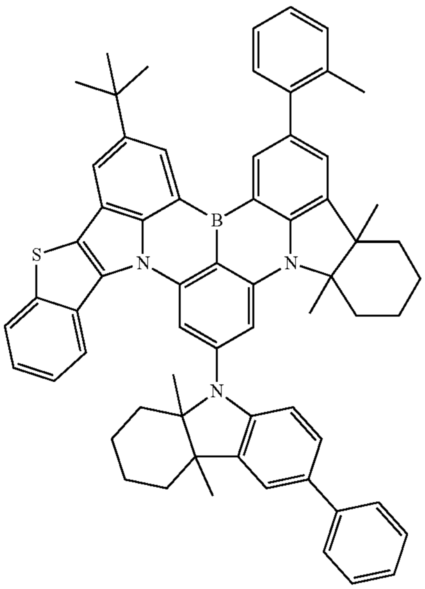
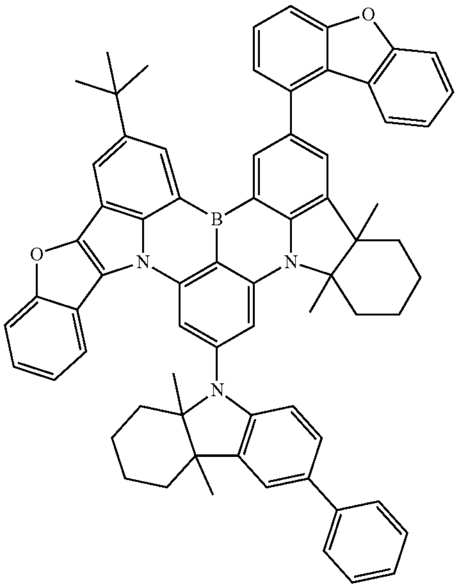
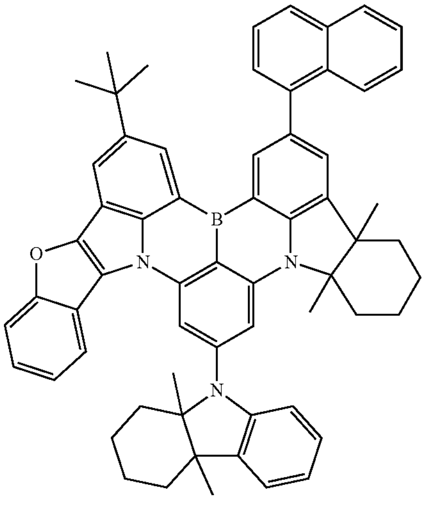
-continued
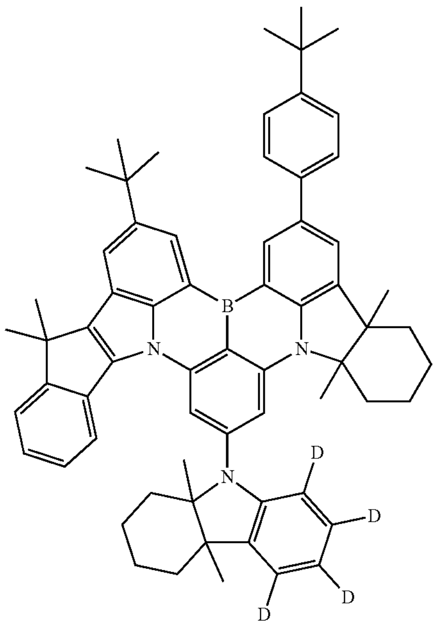
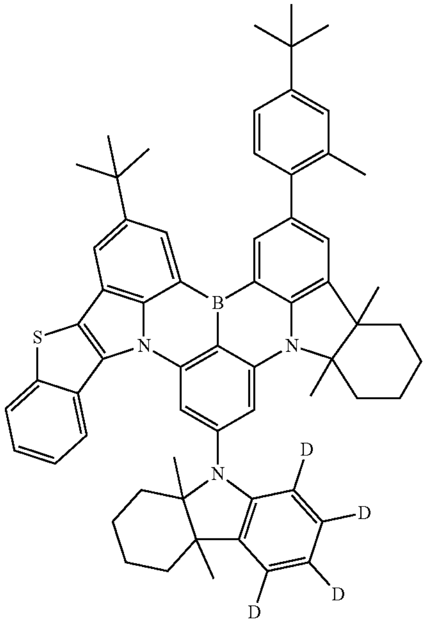

-continued
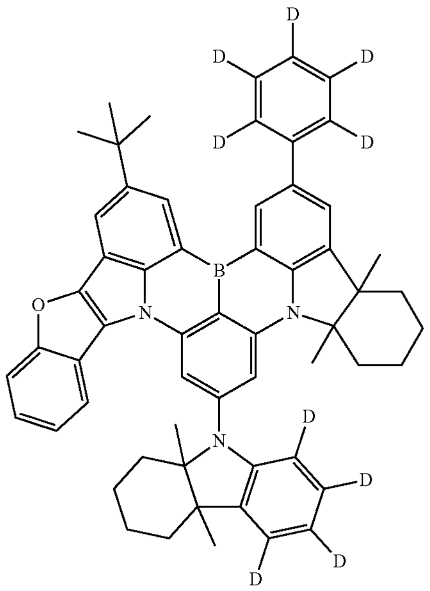
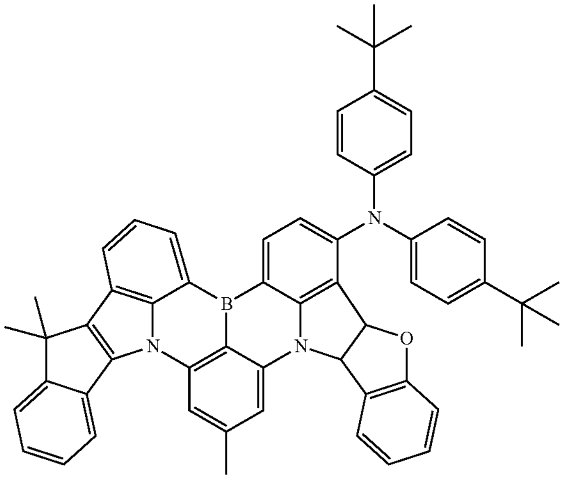
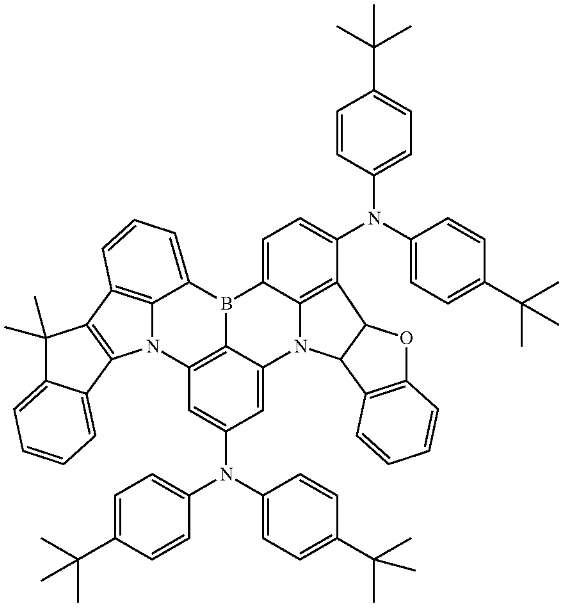
-continued
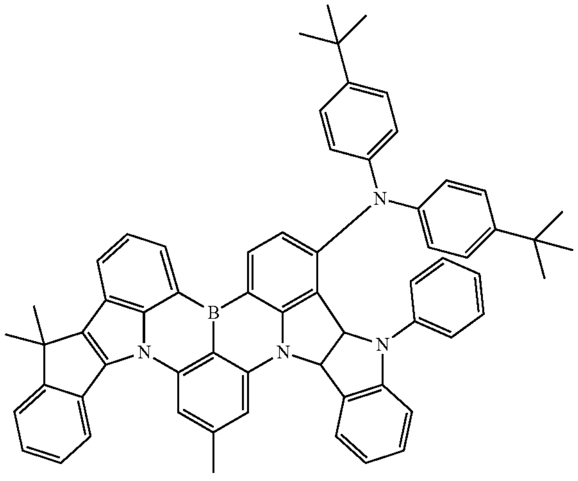
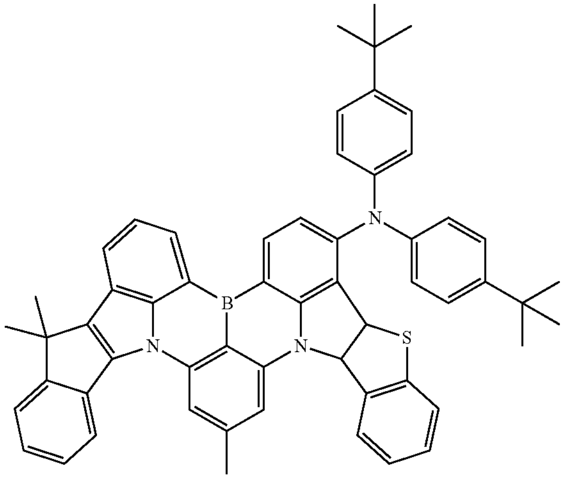
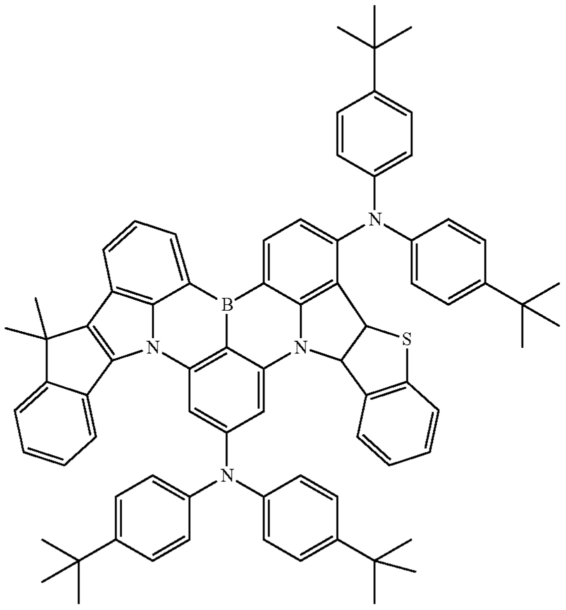

-continued

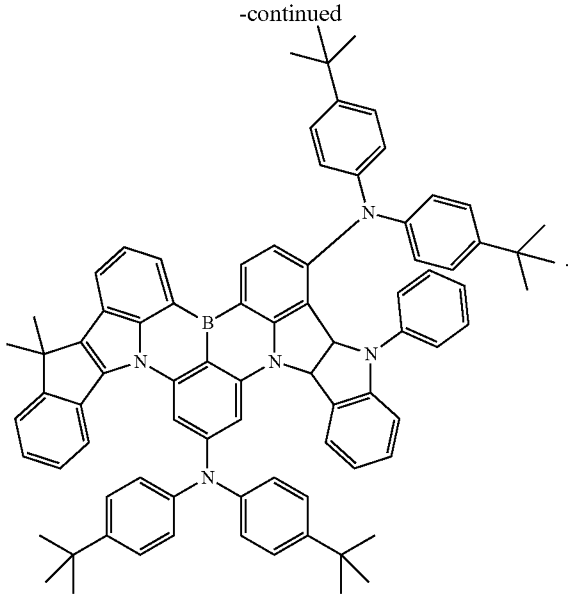

3. An organic light emitting device comprising:
a first electrode;
a second electrode provided to face the first electrode; and
one, two or more organic material layers provided between the first electrode and the second electrode,
wherein one or more layers of the organic material layer comprise the compound of claim 1.

4. The organic light emitting device of claim 3, wherein the organic material layer comprises a hole injection layer, a hole transport layer, or a hole injection and transport layer, and the hole injection layer, the hole transport layer, or the hole injection and transport layer comprises the compound.

5. The organic light emitting device of claim 3, wherein the organic material layer comprises an electron injection layer, an electron transport layer, or an electron injection and transport layer, and the electron injection layer, the electron transport layer, or the electron injection and transport layer comprises the compound.

6. The organic light emitting device of claim 3, wherein the organic material layer comprises an electron blocking layer or a hole blocking layer, and the electron blocking layer or hole blocking layer comprises the compound.

7. The organic light emitting device of claim 3, wherein the organic material layer comprises a light emitting layer, and the light emitting layer comprises the compound.

8. An organic light emitting device comprising:
a first electrode;
a second electrode provided to face the first electrode; and
one, two or more organic material layers provided between the first electrode and the second electrode,
wherein one or more layers of the organic material layer comprise the compound of claim 2.

9. The organic light emitting device of claim 8, wherein the organic material layer comprises a hole injection layer, a hole transport layer, or a hole injection and transport layer, and the hole injection layer, the hole transport layer, or the hole injection and transport layer comprises the compound.

10. The organic light emitting device of claim 8, wherein the organic material layer comprises an electron injection layer, an electron transport layer, or an electron injection and transport layer, and the electron injection layer, the electron transport layer, or the electron injection and transport layer comprises the compound.

11. The organic light emitting device of claim 8, wherein the organic material layer comprises an electron blocking layer or a hole blocking layer, and the electron blocking layer or hole blocking layer comprises the compound.

12. The organic light emitting device of claim 8, wherein the organic material layer comprises a light emitting layer, and the light emitting layer comprises the compound.

13. An organic light emitting device comprising:
a first electrode;
a second electrode provided to face the first electrode; and
one, two or more organic material layers provided between the first electrode and the second electrode,
wherein the organic material layer comprises a hole injection layer, a hole transport layer, a hole injection and transport layer, an electron injection layer, an electron transport layer, or an electron injection and transport layer, an electron blocking layer or a hole blocking layer, and the hole injection layer, the hole transport layer, the hole injection and transport layer, the electron injection layer, the electron transport layer, the electron injection and transport layer, the electron blocking layer or hole blocking layer comprises the compound of Formula 1:

<Formula 1>

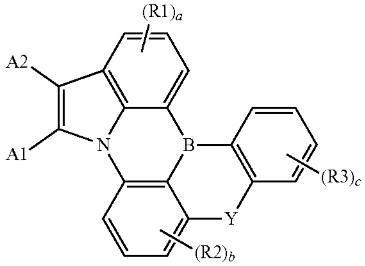

wherein in Formula 1:
Y is NR, CRxRy, O, or S;
R, Rx, and Ry are the same as or different from each other, and are each independently hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted heteroaryl group, a substituted or unsubstituted alkoxy group, a substituted or unsubstituted aryloxy group, a substituted or unsubstituted aralkyl group, a substituted or unsubstituted alkenyl group, or a substituted or unsubstituted alkynyl group, or are bonded to an adjacent group to form a substituted or unsubstituted ring;
A1 and A2 are the same as or different from each other, and are each independently hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted heteroaryl group, a substituted or unsubstituted alkoxy group, a substituted or unsubstituted aryloxy group, a substituted or unsubstituted aralkyl group, a substituted or unsubstituted alkenyl group, or a substituted or unsubstituted alkynyl group, or are bonded to each other to form a substituted or unsubstituted ring;
R1 to R3 are the same as or different from each other, and are each independently hydrogen, deuterium, a substituted or unsubstituted alkyl group, a substituted or unsubstituted cycloalkyl group, a substituted or unsubstituted aryl group, a substituted or unsubstituted silyl group, a substituted or unsubstituted heteroaryl group, a substituted or unsubstituted alkoxy group, a substituted or unsubstituted aryloxy group, a substituted or unsubstituted aralkyl group, a substituted or unsubstituted amine group, a substituted or unsubstituted alkenyl group, or a substituted or unsubstituted alkynyl group, or are bonded to an adjacent group to form a substituted or unsubstituted ring;

R3 is optionally bonded to Y to form a substituted or unsubstituted ring;

a and b are each an integer from 0 to 3;

c is an integer from 0 to 4;

when a is 2 or higher, two or more R1s are the same as or different from each other;

when b is 2 or higher, two or more R2s are the same as or different from each other; and when c is 2 or higher, two or more R3s are the same as or different from each other.

14. An organic light emitting device comprising:

a first electrode;

a second electrode provided to face the first electrode; and one, two or more organic material layers provided between the first electrode and the second electrode, wherein the organic material layer comprises a hole injection layer, a hole transport layer, a hole injection and transport layer, an electron injection layer, an electron transport layer, an electron injection and transport layer, an electron blocking layer, or a hole blocking layer, and at least one of the hole injection layer, the hole transport layer, the hole injection and transport layer, the electron injection layer, the electron transport layer, the electron injection and transport layer, the electron blocking layer, or the hole blocking layer comprises a compound selected from among the following compounds:

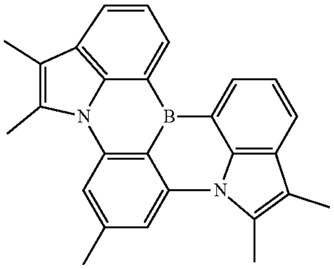

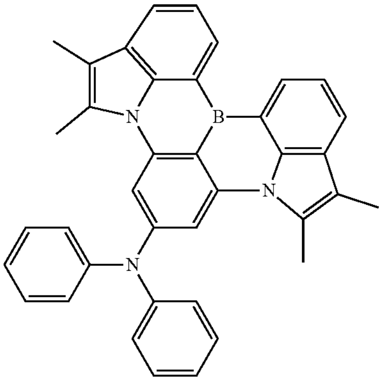

-continued

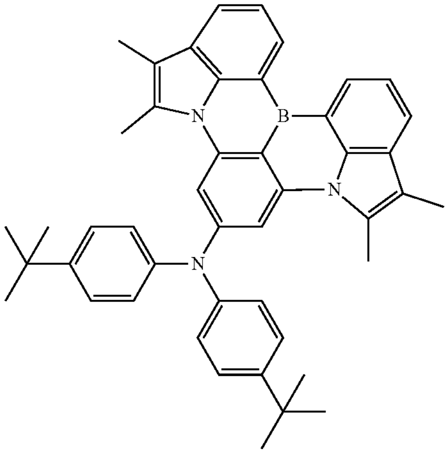

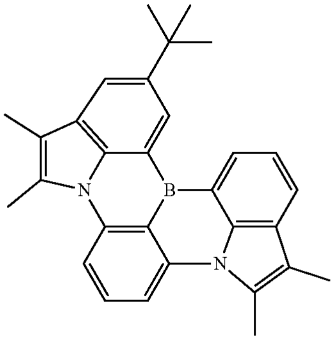

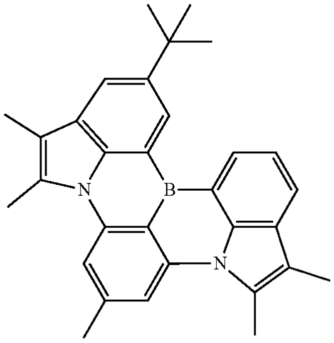

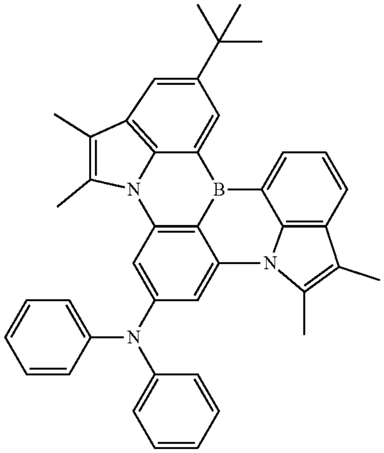

-continued
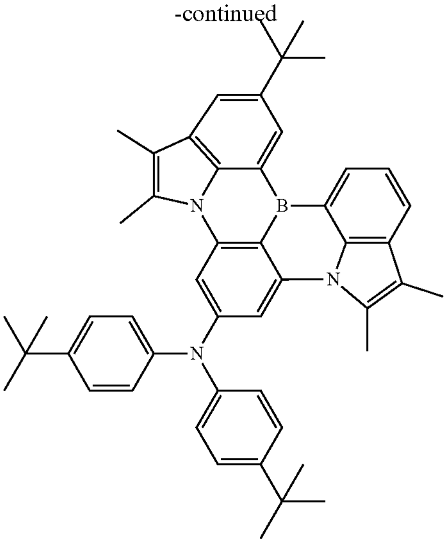
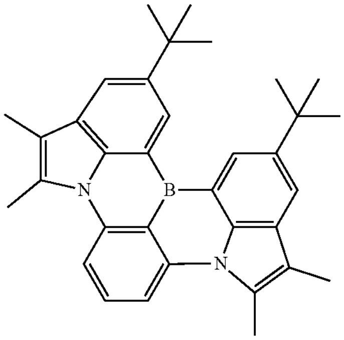
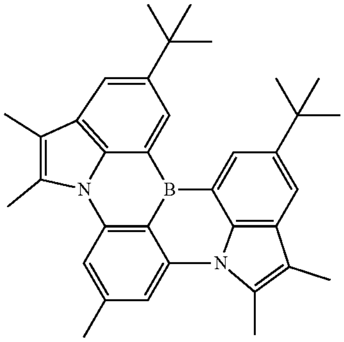
-continued
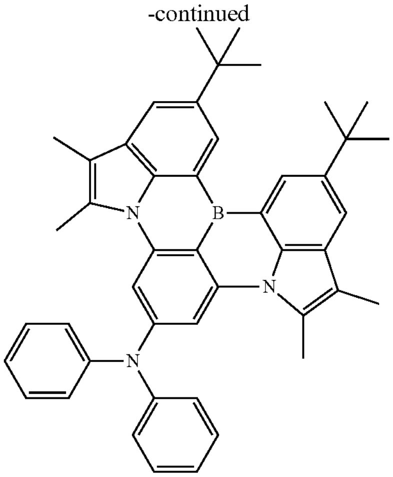
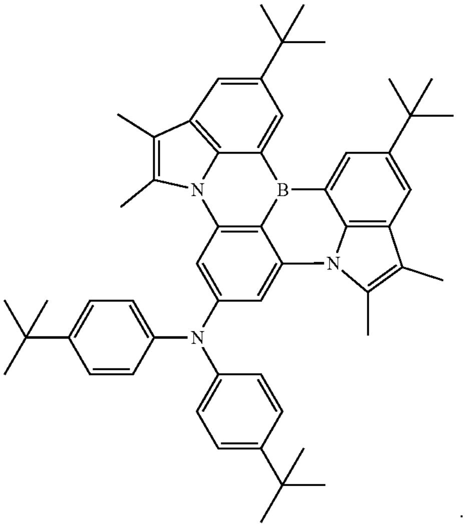
* * * * *